US011189804B2

(12) United States Patent
Boudreault et al.

(10) Patent No.: US 11,189,804 B2
(45) Date of Patent: *Nov. 30, 2021

(54) ORGANIC ELECTROLUMINESCENT MATERIALS AND DEVICES

(71) Applicant: Universal Display Corporation, Ewing, NJ (US)

(72) Inventors: Pierre-Luc T. Boudreault, Pennington, NJ (US); Mingjuan Su, Ewing, NJ (US); Harvey Wendt, Medford Lakes, NJ (US); Scott Joseph, Ewing, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/950,351

(22) Filed: Apr. 11, 2018

(65) Prior Publication Data

US 2018/0240988 A1 Aug. 23, 2018

Related U.S. Application Data

(63) Continuation-in-part of application No. 15/825,297, filed on Nov. 29, 2017, which is a
(Continued)

(51) Int. Cl.
*H01L 51/00* (2006.01)
*C09K 11/06* (2006.01)
(Continued)

(52) U.S. Cl.
CPC ...... *H01L 51/0085* (2013.01); *C07F 15/0033* (2013.01); *C09K 11/025* (2013.01);
(Continued)

(58) Field of Classification Search
CPC ............. H01L 51/0085; H01L 51/0074; H01L 51/0054; H01L 51/0067; H01L 51/0094;
(Continued)

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

CN 104804045 7/2015
EP 0650955 5/1995
(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).
(Continued)

*Primary Examiner* — Alexander C Kollias
(74) *Attorney, Agent, or Firm* — Duane Morris LLP

(57) ABSTRACT

Novel phosphorescent metal complexes containing ligands having the Formula I:

Formula I

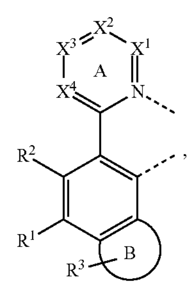

bearing either a naphthalene or other fused heterocycle moieties such as benzofuran and benzothiophene useful as
(Continued)

emitters in OLEDs and improve the device efficiency and the FWHM of the emission are disclosed.

17 Claims, 2 Drawing Sheets

Related U.S. Application Data continuation-in-part of application No. 15/706,186, filed on Sep. 15, 2017.

(60) Provisional application No. 62/403,424, filed on Oct. 3, 2016.

(51) Int. Cl.

| | |
|---|---|
| ***C09K 11/02*** | (2006.01) |
| ***C07F 15/00*** | (2006.01) |
| *H01L 51/50* | (2006.01) |
| *H01L 51/52* | (2006.01) |

(52) U.S. Cl.

CPC ............ *C09K 11/06* (2013.01); *H01L 51/009* (2013.01); *H01L 51/0054* (2013.01); *H01L 51/0058* (2013.01); *H01L 51/0067* (2013.01); *H01L 51/0074* (2013.01); *H01L 51/0094* (2013.01); *C09K 2211/1011* (2013.01); *C09K 2211/1029* (2013.01); *C09K 2211/1051* (2013.01); *C09K 2211/185* (2013.01); *H01L 51/001* (2013.01); *H01L 51/0061* (2013.01); *H01L 51/0072* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 51/524* (2013.01); *H01L 51/5206* (2013.01); *H01L 51/5221* (2013.01); *H01L 51/5259* (2013.01); *H01L 2251/558* (2013.01)

(58) Field of Classification Search

CPC ............... H01L 51/009; H01L 51/0058; H01L 51/0061; H01L 51/5016; H01L 51/5259; H01L 51/5221; H01L 51/5088; H01L 51/5092; H01L 51/5206; H01L 51/5056; H01L 51/5072; H01L 51/524; H01L 51/001; H01L 2251/558; H01L 51/0072; C07F 15/0033; C09K 11/06; C09K 11/025; C09K 2211/1011; C09K 2211/1029; C09K 2211/185; C09K 2211/1051

See application file for complete search history.

(56) References Cited

U.S. PATENT DOCUMENTS 5,247,190 A 9/1993 Friend et al.
5,703,436 A 12/1997 Forrest et al.
5,707,745 A 1/1998 Forrest et al.
5,834,893 A 11/1998 Bulovic et al.
5,844,363 A 12/1998 Gu et al.
6,013,982 A 1/2000 Thompson et al.
6,087,196 A 7/2000 Sturm et al.
6,091,195 A 7/2000 Forrest et al.
6,097,147 A 8/2000 Baldo et al.
6,278,237 B1 * 8/2001 Campos ................. H01L 27/32 313/483
6,294,398 B1 9/2001 Kim et al.
6,303,238 B1 10/2001 Thompson et al.
6,337,102 B1 1/2002 Forrest et al.
6,468,819 B1 10/2002 Kim et al.
6,528,187 B1 3/2003 Okada
6,687,266 B1 2/2004 Ma et al.
6,835,469 B2 12/2004 Kwong et al.
6,921,915 B2 7/2005 Takiguchi et al.
7,087,321 B2 8/2006 Kwong et al.
7,090,928 B2 8/2006 Thompson et al.
7,154,114 B2 12/2006 Brooks et al.
7,250,226 B2 7/2007 Tokito et al.
7,279,704 B2 10/2007 Walters et al.
7,332,232 B2 2/2008 Ma et al.
7,338,722 B2 3/2008 Thompson et al.
7,393,599 B2 7/2008 Thompson et al.
7,396,598 B2 7/2008 Takeuchi et al.
7,431,968 B1 10/2008 Shtein et al.
7,445,855 B2 11/2008 Mackenzie et al.
7,534,505 B2 5/2009 Lin et al.
10,164,199 B2 12/2018 Lin et al.
10,230,060 B2 3/2019 Kwong et al.
2002/0034656 A1 3/2002 Thompson et al.
2002/0134984 A1 9/2002 Igarashi
2002/0158242 A1 10/2002 Son et al.
2003/0068526 A1 * 4/2003 Kamatani ............ C07F 15/004 428/690
2003/0068536 A1 4/2003 Tsuboyama et al.
2003/0072964 A1 * 4/2003 Kwong ............... C07D 215/04 428/690
2003/0138657 A1 7/2003 Li et al.
2003/0152802 A1 8/2003 Tsuboyama et al.
2003/0162053 A1 8/2003 Marks et al.
2003/0175553 A1 9/2003 Thompson et al.
2003/0230980 A1 12/2003 Forrest et al.
2004/0036077 A1 2/2004 Ise
2004/0137267 A1 7/2004 Igarashi et al.
2004/0137268 A1 7/2004 Igarashi et al.
2004/0174116 A1 9/2004 Lu et al.
2004/0214038 A1 * 10/2004 Kwong ................. C09K 11/06 428/690
2005/0025993 A1 2/2005 Thompson et al.
2005/0112407 A1 5/2005 Ogasawara et al.
2005/0191519 A1 9/2005 Mishima et al.
2005/0238919 A1 10/2005 Ogasawara
2005/0244673 A1 11/2005 Satoh et al.
2005/0260441 A1 11/2005 Thompson et al.
2005/0260449 A1 11/2005 Walters et al.
2006/0008670 A1 1/2006 Lin et al.
2006/0134462 A1 6/2006 Yeh et al.
2006/0202194 A1 9/2006 Jeong et al.
2006/0240279 A1 10/2006 Adamovich et al.
2006/0251923 A1 11/2006 Lin et al.
2006/0263635 A1 11/2006 Ise
2006/0280965 A1 12/2006 Kwong et al.
2007/0190359 A1 8/2007 Knowles et al.
2007/0278938 A1 12/2007 Yabunouchi et al.
2008/0015355 A1 1/2008 Schafer et al.
2008/0018221 A1 1/2008 Egen et al.
2008/0106190 A1 5/2008 Yabunouchi et al.
2008/0124572 A1 5/2008 Mizuki et al.
2008/0220265 A1 9/2008 Xia et al.
2008/0297033 A1 12/2008 Knowles et al.
2009/0008605 A1 1/2009 Kawamura et al.
2009/0009065 A1 1/2009 Nishimura et al.
2009/0017330 A1 1/2009 Iwakuma et al.
2009/0030202 A1 1/2009 Iwakuma et al.
2009/0039776 A1 2/2009 Yamada et al.
2009/0045730 A1 2/2009 Nishimura et al.
2009/0045731 A1 2/2009 Nishimura et al.
2009/0101870 A1 4/2009 Prakash et al.
2009/0108737 A1 4/2009 Kwong et al.
2009/0115316 A1 5/2009 Zheng et al.
2009/0165846 A1 7/2009 Johannes et al.
2009/0167162 A1 7/2009 Lin et al.
2009/0179554 A1 7/2009 Kuma et al.
2010/0237334 A1 9/2010 Ma et al.
2010/0283043 A1 * 11/2010 Nishimura ............ C09K 11/06 257/40
2011/0285275 A1 11/2011 Huang et al.
2012/0068165 A1 3/2012 Hayashi
2012/0098417 A1 8/2012 Inoue et al.
2012/0280218 A1 * 11/2012 Watanabe ........... C07D 403/10 257/40
2015/0060830 A1 3/2015 Thompson et al.

(56) References Cited

U.S. PATENT DOCUMENTS

| | | | | |
|---|---|---|---|---|
| 2015/0155502 | A1* | 6/2015 | Ishibashi | H01L 51/5012 257/40 |
| 2015/0171348 | A1 | 6/2015 | Stoessel et al. | |
| 2015/0188059 | A1 | 7/2015 | Chao et al. | |
| 2015/0207082 | A1 | 7/2015 | Dyatkin et al. | |
| 2016/0233443 | A1 | 8/2016 | Stoessel et al. | |
| 2017/0025623 | A1 | 1/2017 | Namanga et al. | |
| 2018/0097179 | A1* | 4/2018 | Boudreault | C07F 15/0033 |
| 2018/0097187 | A1* | 4/2018 | Boudreault | H01L 51/0085 |
| 2018/0240988 | A1 | 8/2018 | Boudreault et al. | |
| 2019/0237683 | A1* | 8/2019 | Boudreault | C07F 15/0033 |
| 2020/0227659 | A1 | 7/2020 | Boudreault et al. | |
| 2020/0335706 | A1 | 10/2020 | Watanabe et al. | |

FOREIGN PATENT DOCUMENTS

| | | |
|---|---|---|
| EP | 1725079 | 11/2006 |
| EP | 2034538 | 3/2009 |
| JP | 200511610 | 1/2005 |
| JP | 2007123392 | 5/2007 |
| JP | 2007-254540 | 10/2007 |
| JP | 2007254297 | 10/2007 |
| JP | 2008074939 | 4/2008 |
| JP | 2010135689 | 6/2010 |
| JP | 2011051919 | 3/2011 |
| JP | 2011-166102 | 8/2011 |
| KR | 20130128322 | 11/2013 |
| KR | 20140121991 | 10/2014 |
| KR | 20160041223 | 4/2016 |
| TW | 201430103 | 8/2014 |
| TW | 201502129 | 1/2015 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 04107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2011024977 | 3/2011 |
| WO | 2012/122605 | 9/2012 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter, " Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater, 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater, 6(9):677-679 (1994).

Kwong, Raymond C. et al., "High Operational Stability of Electrophosphorescent Devices," Appl. Phys. Lett., 81(1) 162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

(56) References Cited

OTHER PUBLICATIONS

Lo Shih-Chun et al., "Blue Phosphorescence from Iridium(III) Complexes at Room Temperature," Chem. Mater., 18 (21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5"-Bis(dimesitylbory1)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSLYKE, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69 (15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Lai, S. L. et al., "Efficient white organic light-emitting devices based on phosphorescent iridium complexes" Organic Electronics, vol. 11, Issue 9, Sep. 2010, pp. 1511-1515.
Lai, S. L. et al., "Iridium(III) bis[2-(20naphthyl)pyridine] (acetylacetonate)-based yellow and white organic light-emitting devices" Journal of Materials Chemistry, 2011, 21, pp. 4983-4988.
Extended European Search Report dated Jan. 9, 2018 for corresponding EP Patent Application No. 17193570.3.
Wenjing Xiong et al: "Dinuclear platinum complexes containing aryl-isoquinoline and oxadiazole-thiol with an efficiency of over 8.8%: in-depth investigation of the relationship between their molecular structure and near-infrared electroluminescent properties in PLEDs", Journal of Materials Chemistry C, vol. 4, No. 25, Jan. 1, 2016 (Jan. 1, 2016), pp. 6007-6015, XP055670739, GB ISSN: 2050-7526, DOI: 10.1039/C6TC00825A.
Communication pursuant to Article 94(3) EPC dated Feb. 26, 2020 for corresponding European Application No. 17193570.3.
Search Report dated Nov. 11, 2020 for Corresponding ROC (Taiwan) Patent Application No. 106134036.
Richard J. Lewis, Sr., "Hawley's Condensed Chemical Dictionary, 12th Edition", John Wiley & Sons, Inc., New York p. 796 (1993).
K. R. Justin Thomas et al., Efficient Red-Emitting Cyclometalated Iridium(III) Complexes Containing Lepidine-Based Ligands, Inorganic Chemistry, vol. 40, Issue 16, pp. 5677-5685.
Li Xiao-Na et al., Theoretical study on the structure and spectral properties of Ir complexes with quinoline derivatives and acetylacetone as ligands, Chemical Journal of Chinese Universities, vol. 29, full texts.
Office Action dated Oct. 14, 2020 in corresponding PRC (Chinese) Patent Application No. 201710908461.2.
Notice of Reasons for Rejection dated Mar. 16, 2021 in corresponding Japanese Patent Application No. JP2017-187961.

* cited by examiner

ORGANIC ELECTROLUMINESCENT MATERIALS AND DEVICES

CROSS-REFERENCE TO RELATE APPLICATIONS

This application is a continuation-in-part of U.S. patent application Ser. No. 15/825,297, filed Nov. 29, 2017, which is a continuation-in-part of co-pending U.S. patent application Ser. No. 15/706,186, filed Sep. 15, 2017, that claims priority to U.S. Provisional application No. 62/403,424, filed Oct. 3, 2016, the disclosure of which is incorporated herein by reference.

FIELD

The present disclosure relates to compounds for use as phosphorescent emitters for organic electroluminescent devices, such as organic light emitting diodes (OLEDs). More specifically, the present disclosure relates to phosphorescent metal complexes containing ligands bearing either a naphthalene or other fused heterocycle moieties such as benzofuran and benzothiophene.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

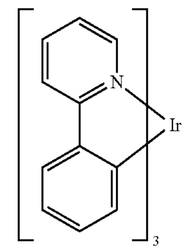

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule" and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an aspect of the present disclosure, a compound comprising a ligand $L_A$ of the Formula I:

Formula I

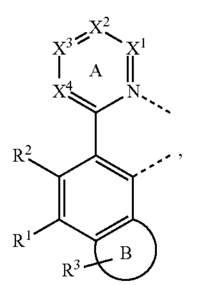

is disclosed, where Ring B represents a five- or six-membered aromatic ring; $R^3$ represents from none to the maximum possible number of substitutions; $X^1$, $X^2$, $X^3$, and $X^4$ are each independently a CR or N; wherein:

(1) at least two adjacent ones of $X^1$, $X^2$, $X^3$, and $X^4$ are CR and fused into a five or six-membered aromatic ring, or (2) at least one of $X^1$, $X^2$, $X^3$, and $X^4$ is nitrogen, or (3) both (1) and (2) are true;

wherein (a) $R^1$ is $CR^{11}R^{12}R^{13}$ or join with $R^2$ to form into a ring; or (b) $R^2$ is not hydrogen; or (c) both (a) and (b) are true;

wherein R, $R^1$, $R^2$, $R^3$, $R^{11}$, $R^{12}$, and $R^{13}$ are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; any two substituents among R, $R^1$, $R^2$, $R^3$, $R^{11}$, $R^{12}$, and $R^{13}$ are optionally joined to form into a ring; $L_A$ is coordinated to a metal M; $L_A$ is optionally linked with other ligands to comprise a tridentate, tetradentate, pentadentate, or hexadentate ligand; and M is optionally coordinated to other ligands.

According to another aspect, a formulation comprising a compound comprising the ligand $L_A$ of Formula I is disclosed.

According to another aspect, an emissive region in an OLED is disclosed where the emissive region comprises a compound comprising the ligand $L_A$ of Formula I.

According to another aspect, a first device comprising a first OLED is disclosed where the first OLED comprises an anode, a cathode, and an organic layer, disposed between the anode and the cathode, where the organic layer comprises a compound comprising the ligand $L_A$ of Formula I.

According to another aspect, a consumer product comprising the first OLED is disclosed. The first OLED comprising an anode, a cathode, an organic layer, disposed between the anode and the cathode, where the organic layer comprises a compound comprising the ligand $L_A$ of Formula I.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
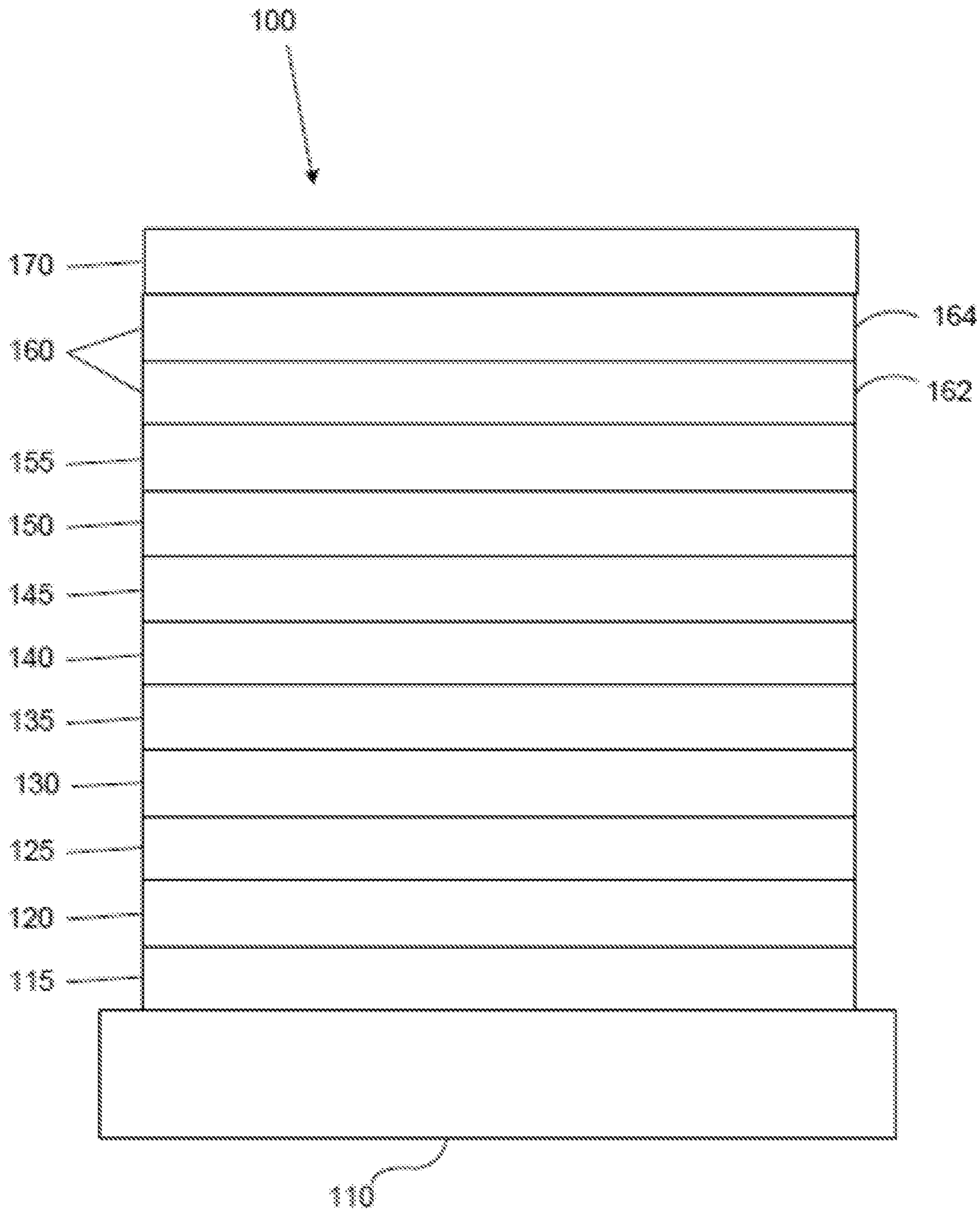
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
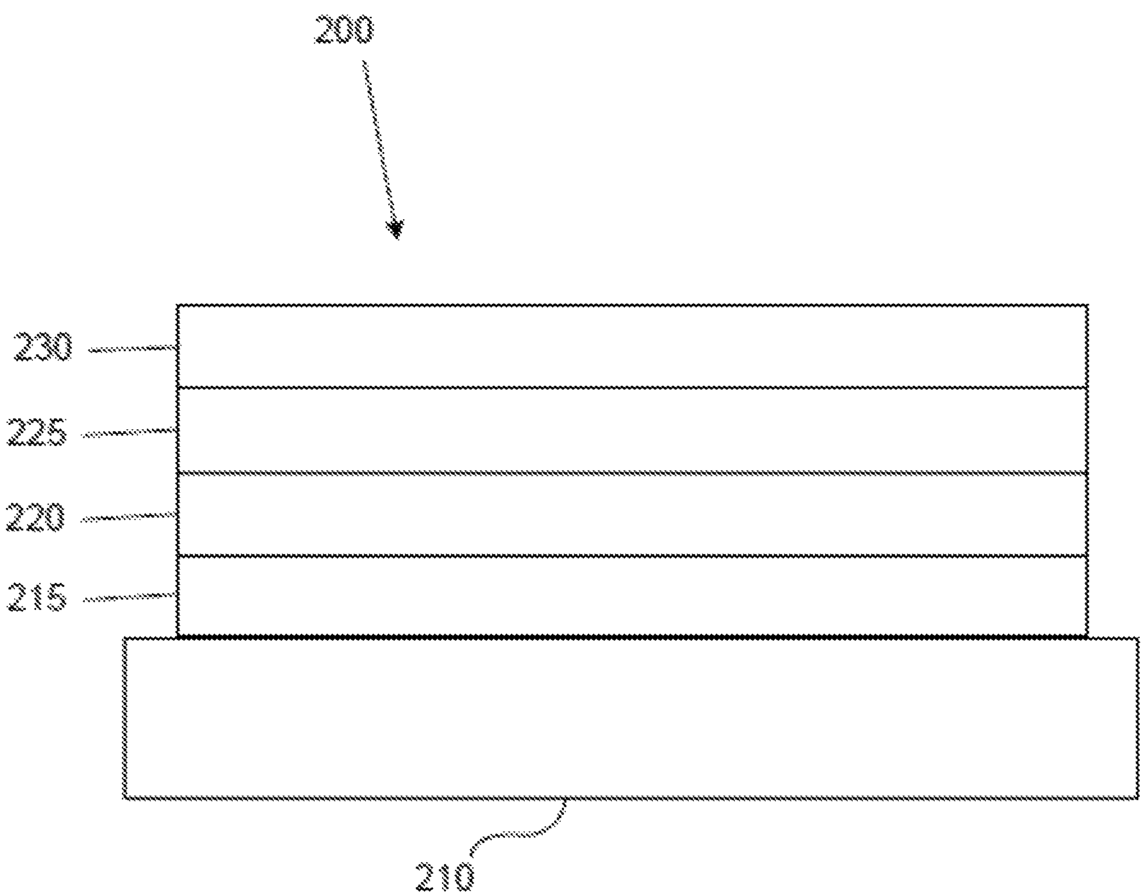
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo," "halogen," or "halide" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" as used herein contemplates cyclic alkyl radicals. Preferred cycloalkyl groups are those containing 3 to 10 ring carbon atoms and includes cyclopropyl, cyclopentyl, cyclohexyl, adamantyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Heteroaromatic cyclic radicals also means heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" as used herein contemplates single-ring hetero-aromatic groups that may include from one to five heteroatoms. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions. The maximum number of substitutions possible in a structure (for example, a particular ring or fused ring system) will depend on the number of atoms with available valencies.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

The present disclosure relates to novel ligands for metal complexes. These ligands include a naphthalene or other similar fused heterocycles. In addition, this fused unit includes a blocking side chain which is a tert-Butyl or a tert-Butyl derivative. The combination of these elements within the ligand allows to obtain only one isomer of the final cyclometallated complex. It also affords a better efficiency, a red shift in the color of the emission as well as an emission that is narrower.

The present disclosure relates to phosphorescent metal complexes containing ligands bearing either a naphthalene or other fused heterocycle moieties such as benzofuran and benzothiophene. These moieties are substituted with an aliphatic side chain on the phenyl which is linked to the Iridium atom in a way where it will block the configuration and prevent any ligation at an unwanted position. The side chain is a tert-Butyl or a derivative of tert-Butyl. In addition to afford a material with a much better purity, the addition of the tert-Butyl side chain allows better EQE (external quantum efficiency), better FWHM (Full width at half maximum) of the emission. The fused cycles at the bottom of the ligand lead to a red shift of the color of the emission while the side chain on these cycles lead to a blue shift.

According to an aspect of the present disclosure, a compound comprising a ligand $L_A$ of the Formula I

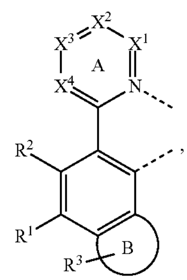

is disclosed, where Ring B represents a five- or six-membered aromatic ring; $R^3$ represents from none to the maximum possible number of substitutions;

$X^1$, $X^2$, $X^3$, and $X^4$ are each independently a CR or N; wherein:

(1) at least two adjacent ones of $X^1$, $X^2$, $X^3$, and $X^4$ are CR and fused into a five or six-membered aromatic ring, or (2) at least one of $X^1$, $X^2$, $X^3$, and $X^4$ is nitrogen, or (3) both (1) and (2) are true;

wherein (a) $R^1$ is $CR^{11}R^{12}R^{13}$ or join with $R^2$ to form into a ring; or (b) $R^2$ is not hydrogen; or (c) both (a) and (b) are true;

wherein each of R, $R^1$, $R^2$, $R^3$, $R^{11}$, $R^{12}$, and $R^{13}$ is independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

any two substituents among R, $R^1$, $R^2$, $R^3$, $R^{11}$, $R^{12}$, and $R^{13}$ are optionally joined to form into a ring;

$L_A$ is coordinated to a metal M;

$L_A$ is optionally linked with other ligands to comprise a tridentate, tetradentate, pentadentate, or hexadentate ligand; and M is optionally coordinated to other ligands.

In some embodiments, each of R, $R^1$, $R^2$, $R^3$, $R^{11}$, $R^{12}$, and $R^{13}$ is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof.

In some embodiments, each of R, $R^1$, $R^2$, $R^3$, $R^{11}$, $R^{12}$, and $R^{13}$ is independently selected from the group consisting of hydrogen, deuterium, fluorine, alkyl, cycloalkyl, and combinations thereof.

In some embodiments of the compound, M is selected from the group consisting of Ir, Rh, Re, Ru, Os, Pt, Au, and Cu. In some embodiments, M is Ir or Pt.

In some embodiments of the compound, at least one of $X^1$, $X^2$, $X^3$, and $X^4$ is nitrogen.

In some embodiments of the compound, $R^1$ is tert-butyl or substituted tert-butyl. In some embodiments of the compound, $R^1$ and $R^2$ form into an aromatic ring, which can be further substituted.

In some embodiments of the compound, Ring B is phenyl.

In some embodiments of the compound, the ligand $L_A$ is selected from the group consisting of:

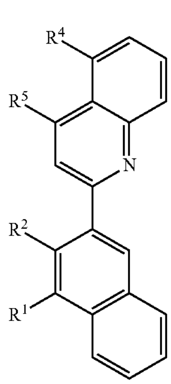

,

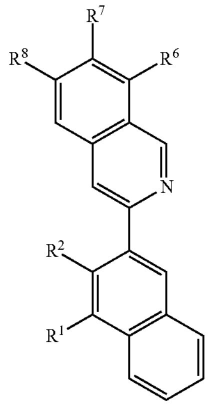

,

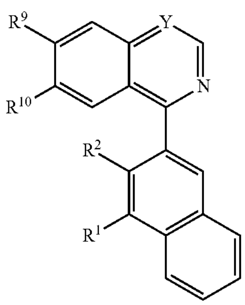

,

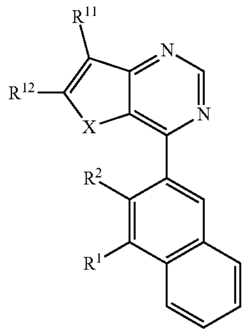

,

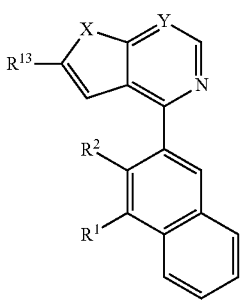

,

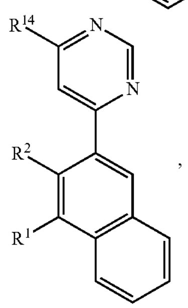

,

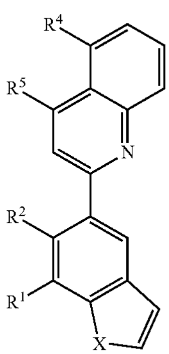

, and

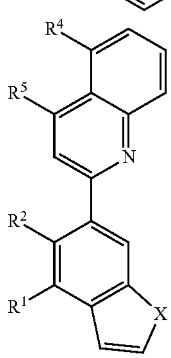

, wherein each of $R^1$, $R^2$, $R^4$, $R^5$, $R^6$, $R^7$, $R^8$, $R^9$, $R^{10}$, $R^{11}$, $R^{12}$, $R^{13}$, and $R^{14}$ is independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; wherein any two substituents are optionally joined to form into a ring. In some embodiments, each of $R^1$, $R^2$, $R^4$, $R^5$, $R^6$, $R^7$, $R^8$, $R^9$, $R^{10}$, $R^{11}$, $R^{12}$, $R^{13}$, and $R^{14}$ is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof; wherein any two substituents are optionally joined to form into a ring. In some embodiments, each of $R^1$, $R^2$, $R^4$, $R^5$, $R^6$, $R^7$, $R^8$, $R^9$, $R^{10}$, $R^{11}$, $R^{12}$, $R^{13}$, and $R^{14}$ is independently selected from the group consisting of hydrogen, deuterium, fluorine, alkyl, cycloalkyl, and combinations thereof; wherein any two substituents are optionally joined to form into a ring.

In some embodiments of the compound, the ligand $L_A$ is selected from the group consisting of $L_{A1}$ through $L_{A260}$ which are based on a structure of Formula II,

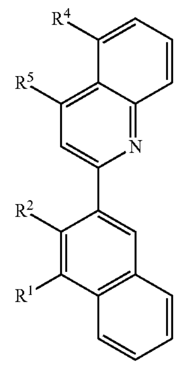

, in which $R^1$, $R^2$, $R^4$, and $R^5$ are defined as provided below:

| Ligand | $R^1$ | $R^2$ | $R^4$ | $R^5$ |
|---|---|---|---|---|
| $L_{A1}$ | $R_{B6}$ | H | H | H |
| $L_{A2}$ | $R_{B6}$ | H | $R_{B1}$ | H |
| $L_{A3}$ | $R_{B6}$ | H | $R_{B3}$ | H |
| $L_{A4}$ | $R_{B6}$ | H | $R_{B4}$ | H |
| $L_{A5}$ | $R_{B6}$ | H | $R_{B7}$ | H |
| $L_{A6}$ | $R_{B6}$ | H | $R_{B10}$ | H |
| $L_{A7}$ | $R_{B6}$ | H | $R_{A3}$ | H |
| $L_{A8}$ | $R_{B6}$ | H | $R_{A34}$ | H |
| $L_{A9}$ | $R_{B6}$ | H | H | $R_{B1}$ |
| $L_{A10}$ | $R_{B6}$ | H | H | $R_{B2}$ |
| $L_{A11}$ | $R_{B6}$ | H | H | $R_{B3}$ |
| $L_{A12}$ | $R_{B6}$ | H | H | $R_{B4}$ |
| $L_{A13}$ | $R_{B6}$ | H | H | $R_{B7}$ |
| $L_{A14}$ | $R_{B6}$ | H | H | $R_{B10}$ |
| $L_{A15}$ | $R_{B6}$ | H | H | $R_{A3}$ |
| $L_{A16}$ | $R_{B6}$ | H | H | $R_{A34}$ |
| $L_{A17}$ | $R_{B6}$ | H | $R_{B1}$ | $R_{B1}$ |
| $L_{A18}$ | $R_{B6}$ | H | $R_{B3}$ | $R_{B3}$ |
| $L_{A19}$ | $R_{B6}$ | H | $R_{B4}$ | $R_{B4}$ |
| $L_{A20}$ | $R_{B6}$ | H | $R_{B7}$ | $R_{B7}$ |
| $L_{A21}$ | $R_{B6}$ | H | $R_{B10}$ | $R_{B10}$ |
| $L_{A22}$ | $R_{B6}$ | H | $R_{A3}$ | $R_{A3}$ |
| $L_{A23}$ | $R_{B6}$ | H | $R_{A34}$ | $R_{A34}$ |
| $L_{A24}$ | $R_{B6}$ | H | $R_{B1}$ | $R_{B3}$ |
| $L_{A25}$ | $R_{B6}$ | H | $R_{B1}$ | $R_{B4}$ |
| $L_{A26}$ | $R_{B6}$ | H | $R_{B1}$ | $R_{B7}$ |
| $L_{A27}$ | $R_{B6}$ | H | $R_{B1}$ | $R_{B10}$ |
| $L_{A28}$ | $R_{B6}$ | H | $R_{B1}$ | $R_{A3}$ |
| $L_{A29}$ | $R_{B6}$ | H | $R_{B1}$ | $R_{A34}$ |
| $L_{A30}$ | $R_{B6}$ | H | $R_{B3}$ | $R_{B1}$ |
| $L_{A31}$ | $R_{B6}$ | H | $R_{B3}$ | $R_{B4}$ |
| $L_{A32}$ | $R_{B6}$ | H | $R_{B3}$ | $R_{B7}$ |
| $L_{A33}$ | $R_{B6}$ | H | $R_{B3}$ | $R_{B10}$ |
| $L_{A34}$ | $R_{B6}$ | H | $R_{B3}$ | $R_{A3}$ |
| $L_{A35}$ | $R_{B6}$ | H | $R_{B3}$ | $R_{A34}$ |
| $L_{A36}$ | $R_{B6}$ | H | $R_{B4}$ | $R_{B1}$ |
| $L_{A37}$ | $R_{B6}$ | H | $R_{B4}$ | $R_{B3}$ |
| $L_{A38}$ | $R_{B6}$ | H | $R_{B4}$ | $R_{B7}$ |

-continued

| Ligand | $R^1$ | $R^2$ | $R^4$ | $R^5$ |
|---|---|---|---|---|
| $L_{A39}$ | $R_{B6}$ | H | $R_{B4}$ | $R_{B10}$ |
| $L_{A40}$ | $R_{B6}$ | H | $R_{B4}$ | $R_{A3}$ |
| $L_{A41}$ | $R_{B6}$ | H | $R_{B4}$ | $R_{A34}$ |
| $L_{A42}$ | $R_{B6}$ | H | $R_{B7}$ | $R_{B1}$ |
| $L_{A43}$ | $R_{B6}$ | H | $R_{B7}$ | $R_{B3}$ |
| $L_{A44}$ | $R_{B6}$ | H | $R_{B7}$ | $R_{B4}$ |
| $L_{A45}$ | $R_{B6}$ | H | $R_{B7}$ | $R_{B10}$ |
| $L_{A46}$ | $R_{B6}$ | H | $R_{B7}$ | $R_{A3}$ |
| $L_{A47}$ | $R_{B6}$ | H | $R_{B7}$ | $R_{A34}$ |
| $L_{A48}$ | $R_{B6}$ | H | $R_{B10}$ | $R_{B1}$ |
| $L_{A49}$ | $R_{B6}$ | H | $R_{B10}$ | $R_{B3}$ |
| $L_{A50}$ | $R_{B6}$ | H | $R_{B10}$ | $R_{B4}$ |
| $L_{A51}$ | $R_{B6}$ | H | $R_{B10}$ | $R_{B7}$ |
| $L_{A52}$ | $R_{B6}$ | H | $R_{B10}$ | $R_{A3}$ |
| $L_{A53}$ | $R_{B6}$ | H | $R_{B10}$ | $R_{A34}$ |
| $L_{A54}$ | $R_{B6}$ | H | $R_{A3}$ | $R_{B1}$ |
| $L_{A55}$ | $R_{B6}$ | H | $R_{A3}$ | $R_{B3}$ |
| $L_{A56}$ | $R_{B6}$ | H | $R_{A3}$ | $R_{B4}$ |
| $L_{A57}$ | $R_{B6}$ | H | $R_{A3}$ | $R_{B7}$ |
| $L_{A58}$ | $R_{B6}$ | H | $R_{A3}$ | $R_{B10}$ |
| $L_{A59}$ | $R_{B6}$ | H | $R_{A3}$ | $R_{A34}$ |
| $L_{A60}$ | $R_{B6}$ | H | $R_{A34}$ | $R_{B1}$ |
| $L_{A61}$ | $R_{B6}$ | H | $R_{A34}$ | $R_{B3}$ |
| $L_{A62}$ | $R_{B6}$ | H | $R_{A34}$ | $R_{B4}$ |
| $L_{A63}$ | $R_{B6}$ | H | $R_{A34}$ | $R_{B7}$ |
| $L_{A64}$ | $R_{B6}$ | H | $R_{A34}$ | $R_{B10}$ |
| $L_{A65}$ | $R_{B6}$ | H | $R_{A34}$ | $R_{A3}$ |
| $L_{A66}$ | $R_{B8}$ | H | H | H |
| $L_{A67}$ | $R_{B8}$ | H | $R_{B1}$ | H |
| $L_{A68}$ | $R_{B8}$ | H | $R_{B3}$ | H |
| $L_{A69}$ | $R_{B8}$ | H | $R_{B4}$ | H |
| $L_{A70}$ | $R_{B8}$ | H | $R_{B7}$ | H |
| $L_{A71}$ | $R_{B8}$ | H | $R_{B10}$ | H |
| $L_{A72}$ | $R_{B8}$ | H | $R_{A3}$ | H |
| $L_{A73}$ | $R_{B8}$ | H | $R_{A34}$ | H |
| $L_{A74}$ | $R_{B8}$ | H | H | $R_{B1}$ |
| $L_{A75}$ | $R_{B8}$ | H | H | $R_{B2}$ |
| $L_{A76}$ | $R_{B8}$ | H | H | $R_{B3}$ |
| $L_{A77}$ | $R_{B8}$ | H | H | $R_{B4}$ |
| $L_{A78}$ | $R_{B8}$ | H | H | $R_{B7}$ |
| $L_{A79}$ | $R_{B8}$ | H | H | $R_{B10}$ |
| $L_{A80}$ | $R_{B8}$ | H | H | $R_{A3}$ |
| $L_{A81}$ | $R_{B8}$ | H | H | $R_{A34}$ |
| $L_{A82}$ | $R_{B8}$ | H | $R_{B1}$ | $R_{B1}$ |
| $L_{A83}$ | $R_{B8}$ | H | $R_{B3}$ | $R_{B3}$ |
| $L_{A84}$ | $R_{B8}$ | H | $R_{B4}$ | $R_{B4}$ |
| $L_{A85}$ | $R_{B8}$ | H | $R_{B7}$ | $R_{B7}$ |
| $L_{A86}$ | $R_{B8}$ | H | $R_{B10}$ | $R_{B10}$ |
| $L_{A87}$ | $R_{B8}$ | H | $R_{A3}$ | $R_{A3}$ |
| $L_{A88}$ | $R_{B8}$ | H | $R_{A34}$ | $R_{A34}$ |
| $L_{A89}$ | $R_{B8}$ | H | $R_{B1}$ | $R_{B3}$ |
| $L_{A90}$ | $R_{B8}$ | H | $R_{B1}$ | $R_{B4}$ |
| $L_{A91}$ | $R_{B8}$ | H | $R_{B1}$ | $R_{B7}$ |
| $L_{A92}$ | $R_{B8}$ | H | $R_{B1}$ | $R_{B10}$ |
| $L_{A93}$ | $R_{B8}$ | H | $R_{B1}$ | $R_{A3}$ |
| $L_{A94}$ | $R_{B8}$ | H | $R_{B1}$ | $R_{A34}$ |
| $L_{A95}$ | $R_{B8}$ | H | $R_{B3}$ | $R_{B1}$ |
| $L_{A96}$ | $R_{B8}$ | H | $R_{B3}$ | $R_{B4}$ |
| $L_{A97}$ | $R_{B8}$ | H | $R_{B3}$ | $R_{B7}$ |
| $L_{A98}$ | $R_{B8}$ | H | $R_{B3}$ | $R_{B10}$ |
| $L_{A99}$ | $R_{B8}$ | H | $R_{B3}$ | $R_{A3}$ |
| $L_{A100}$ | $R_{B8}$ | H | $R_{B3}$ | $R_{A34}$ |
| $L_{A101}$ | $R_{B8}$ | H | $R_{B4}$ | $R_{B1}$ |
| $L_{A102}$ | $R_{B8}$ | H | $R_{B4}$ | $R_{B3}$ |
| $L_{A103}$ | $R_{B8}$ | H | $R_{B4}$ | $R_{B7}$ |
| $L_{A104}$ | $R_{B8}$ | H | $R_{B4}$ | $R_{B10}$ |
| $L_{A105}$ | $R_{B8}$ | H | $R_{B4}$ | $R_{A3}$ |
| $L_{A106}$ | $R_{B8}$ | H | $R_{B4}$ | $R_{A34}$ |
| $L_{A107}$ | $R_{B8}$ | H | $R_{B7}$ | $R_{B1}$ |
| $L_{A108}$ | $R_{B8}$ | H | $R_{B7}$ | $R_{B3}$ |
| $L_{A109}$ | $R_{B8}$ | H | $R_{B7}$ | $R_{B4}$ |
| $L_{A110}$ | $R_{B8}$ | H | $R_{B7}$ | $R_{B10}$ |
| $L_{A111}$ | $R_{B8}$ | H | $R_{B7}$ | $R_{A3}$ |
| $L_{A112}$ | $R_{B8}$ | H | $R_{B7}$ | $R_{A34}$ |
| $L_{A113}$ | $R_{B8}$ | H | $R_{B10}$ | $R_{B1}$ |
| $L_{A114}$ | $R_{B8}$ | H | $R_{B10}$ | $R_{B3}$ |
| $L_{A115}$ | $R_{B8}$ | H | $R_{B10}$ | $R_{B4}$ |

-continued

| Ligand | $R^1$ | $R^2$ | $R^4$ | $R^5$ |
|---|---|---|---|---|
| $L_{A116}$ | $R_{B8}$ | H | $R_{B10}$ | $R_{B7}$ |
| $L_{A117}$ | $R_{B8}$ | H | $R_{B10}$ | $R_{A3}$ |
| $L_{A118}$ | $R_{B8}$ | H | $R_{B10}$ | $R_{A34}$ |
| $L_{A119}$ | $R_{B8}$ | H | $R_{A3}$ | $R_{B1}$ |
| $L_{A120}$ | $R_{B8}$ | H | $R_{A3}$ | $R_{B3}$ |
| $L_{A121}$ | $R_{B8}$ | H | $R_{A3}$ | $R_{B4}$ |
| $L_{A122}$ | $R_{B8}$ | H | $R_{A3}$ | $R_{B7}$ |
| $L_{A123}$ | $R_{B8}$ | H | $R_{A3}$ | $R_{B10}$ |
| $L_{A124}$ | $R_{B8}$ | H | $R_{A3}$ | $R_{A34}$ |
| $L_{A125}$ | $R_{B8}$ | H | $R_{A34}$ | $R_{B1}$ |
| $L_{A126}$ | $R_{B8}$ | H | $R_{A34}$ | $R_{B3}$ |
| $L_{A127}$ | $R_{B8}$ | H | $R_{A34}$ | $R_{B4}$ |
| $L_{A128}$ | $R_{B8}$ | H | $R_{A34}$ | $R_{B7}$ |
| $L_{A129}$ | $R_{B8}$ | H | $R_{A34}$ | $R_{B10}$ |
| $L_{A130}$ | $R_{B8}$ | H | $R_{A34}$ | $R_{A3}$ |
| $L_{A131}$ | H | $R_{B6}$ | H | H |
| $L_{A132}$ | H | $R_{B6}$ | $R_{B1}$ | H |
| $L_{A133}$ | H | $R_{B6}$ | $R_{B3}$ | H |
| $L_{A134}$ | H | $R_{B6}$ | $R_{B4}$ | H |
| $L_{A135}$ | H | $R_{B6}$ | $R_{B7}$ | H |
| $L_{A136}$ | H | $R_{B6}$ | $R_{B10}$ | H |
| $L_{A137}$ | H | $R_{B6}$ | $R_{A3}$ | H |
| $L_{A138}$ | H | $R_{B6}$ | $R_{A34}$ | H |
| $L_{A139}$ | H | $R_{B6}$ | H | $R_{B1}$ |
| $L_{A140}$ | H | $R_{B6}$ | H | $R_{B2}$ |
| $L_{A141}$ | H | $R_{B6}$ | H | $R_{B3}$ |
| $L_{A142}$ | H | $R_{B6}$ | H | $R_{B4}$ |
| $L_{A143}$ | H | $R_{B6}$ | H | $R_{B7}$ |
| $L_{A144}$ | H | $R_{B6}$ | H | $R_{B10}$ |
| $L_{A145}$ | H | $R_{B6}$ | H | $R_{A3}$ |
| $L_{A146}$ | H | $R_{B6}$ | H | $R_{A34}$ |
| $L_{A147}$ | H | $R_{B6}$ | $R_{B1}$ | $R_{B1}$ |
| $L_{A148}$ | H | $R_{B6}$ | $R_{B3}$ | $R_{B3}$ |
| $L_{A149}$ | H | $R_{B6}$ | $R_{B4}$ | $R_{B4}$ |
| $L_{A150}$ | H | $R_{B6}$ | $R_{B7}$ | $R_{B7}$ |
| $L_{A151}$ | H | $R_{B6}$ | $R_{B10}$ | $R_{B10}$ |
| $L_{A152}$ | H | $R_{B6}$ | $R_{A3}$ | $R_{A3}$ |
| $L_{A153}$ | H | $R_{B6}$ | $R_{A34}$ | $R_{A34}$ |
| $L_{A154}$ | H | $R_{B6}$ | $R_{B1}$ | $R_{B3}$ |
| $L_{A155}$ | H | $R_{B6}$ | $R_{B1}$ | $R_{B4}$ |
| $L_{A156}$ | H | $R_{B6}$ | $R_{B1}$ | $R_{B7}$ |
| $L_{A157}$ | H | $R_{B6}$ | $R_{B1}$ | $R_{B10}$ |
| $L_{A158}$ | H | $R_{B6}$ | $R_{B1}$ | $R_{A3}$ |
| $L_{A159}$ | H | $R_{B6}$ | $R_{B1}$ | $R_{A34}$ |
| $L_{A160}$ | H | $R_{B6}$ | $R_{B3}$ | $R_{B1}$ |
| $L_{A161}$ | H | $R_{B6}$ | $R_{B3}$ | $R_{B4}$ |
| $L_{A162}$ | H | $R_{B6}$ | $R_{B3}$ | $R_{B7}$ |
| $L_{A163}$ | H | $R_{B6}$ | $R_{B3}$ | $R_{B10}$ |
| $L_{A164}$ | H | $R_{B6}$ | $R_{B3}$ | $R_{A3}$ |
| $L_{A165}$ | H | $R_{B6}$ | $R_{B3}$ | $R_{A34}$ |
| $L_{A166}$ | H | $R_{B6}$ | $R_{B4}$ | $R_{B1}$ |
| $L_{A167}$ | H | $R_{B6}$ | $R_{B4}$ | $R_{B3}$ |
| $L_{A168}$ | H | $R_{B6}$ | $R_{B4}$ | $R_{B7}$ |
| $L_{A169}$ | H | $R_{B6}$ | $R_{B4}$ | $R_{B10}$ |
| $L_{A170}$ | H | $R_{B6}$ | $R_{B4}$ | $R_{A3}$ |
| $L_{A171}$ | H | $R_{B6}$ | $R_{B4}$ | $R_{A34}$ |
| $L_{A172}$ | H | $R_{B6}$ | $R_{B7}$ | $R_{B1}$ |
| $L_{A173}$ | H | $R_{B6}$ | $R_{B7}$ | $R_{B3}$ |
| $L_{A174}$ | H | $R_{B6}$ | $R_{B7}$ | $R_{B4}$ |
| $L_{A175}$ | H | $R_{B6}$ | $R_{B7}$ | $R_{B10}$ |
| $L_{A176}$ | H | $R_{B6}$ | $R_{B7}$ | $R_{A3}$ |
| $L_{A177}$ | H | $R_{B6}$ | $R_{B7}$ | $R_{A34}$ |
| $L_{A178}$ | H | $R_{B6}$ | $R_{B10}$ | $R_{B1}$ |
| $L_{A179}$ | H | $R_{B6}$ | $R_{B10}$ | $R_{B3}$ |
| $L_{A180}$ | H | $R_{B6}$ | $R_{B10}$ | $R_{B4}$ |
| $L_{A181}$ | H | $R_{B6}$ | $R_{B10}$ | $R_{B7}$ |
| $L_{A182}$ | H | $R_{B6}$ | $R_{B10}$ | $R_{A3}$ |
| $L_{A183}$ | H | $R_{B6}$ | $R_{B10}$ | $R_{A34}$ |
| $L_{A184}$ | H | $R_{B6}$ | $R_{A3}$ | $R_{B1}$ |
| $L_{A185}$ | H | $R_{B6}$ | $R_{A3}$ | $R_{B3}$ |
| $L_{A186}$ | H | $R_{B6}$ | $R_{A3}$ | $R_{B4}$ |
| $L_{A187}$ | H | $R_{B6}$ | $R_{A3}$ | $R_{B7}$ |
| $L_{A188}$ | H | $R_{B6}$ | $R_{A3}$ | $R_{B10}$ |
| $L_{A189}$ | H | $R_{B6}$ | $R_{A3}$ | $R_{A34}$ |
| $L_{A190}$ | H | $R_{B6}$ | $R_{A34}$ | $R_{B1}$ |
| $L_{A191}$ | H | $R_{B6}$ | $R_{A34}$ | $R_{B3}$ |
| $L_{A192}$ | H | $R_{B6}$ | $R_{A34}$ | $R_{B4}$ |

-continued

| Ligand | $R^1$ | $R^2$ | $R^4$ | $R^5$ |
|---|---|---|---|---|
| $L_{A193}$ | H | $R_{B6}$ | $R_{A34}$ | $R_{B7}$ |
| $L_{A194}$ | H | $R_{B6}$ | $R_{A34}$ | $R_{B10}$ |
| $L_{A195}$ | H | $R_{B6}$ | $R_{A34}$ | $R_{A3}$ |
| $L_{A196}$ | H | $R_{B8}$ | H | H |
| $L_{A197}$ | H | $R_{B8}$ | $R_{B1}$ | H |
| $L_{A198}$ | H | $R_{B8}$ | $R_{B3}$ | H |
| $L_{A199}$ | H | $R_{B8}$ | $R_{B4}$ | H |
| $L_{A200}$ | H | $R_{B8}$ | $R_{B7}$ | H |
| $L_{A201}$ | H | $R_{B8}$ | $R_{B10}$ | H |
| $L_{A202}$ | H | $R_{B8}$ | $R_{A3}$ | H |
| $L_{A203}$ | H | $R_{B8}$ | $R_{A34}$ | H |
| $L_{A204}$ | H | $R_{B8}$ | H | $R_{B1}$ |
| $L_{A205}$ | H | $R_{B8}$ | H | $R_{B2}$ |
| $L_{A206}$ | H | $R_{B8}$ | H | $R_{B3}$ |
| $L_{A207}$ | H | $R_{B8}$ | H | $R_{B4}$ |
| $L_{A208}$ | H | $R_{B8}$ | H | $R_{B7}$ |
| $L_{A209}$ | H | $R_{B8}$ | H | $R_{B10}$ |
| $L_{A210}$ | H | $R_{B8}$ | H | $R_{A3}$ |
| $L_{A211}$ | H | $R_{B8}$ | H | $R_{A34}$ |
| $L_{A212}$ | H | $R_{B8}$ | $R_{B1}$ | $R_{B1}$ |
| $L_{A213}$ | H | $R_{B8}$ | $R_{B3}$ | $R_{B3}$ |
| $L_{A214}$ | H | $R_{B8}$ | $R_{B4}$ | $R_{B4}$ |
| $L_{A215}$ | H | $R_{B8}$ | $R_{B7}$ | $R_{B7}$ |
| $L_{A216}$ | H | $R_{B8}$ | $R_{B10}$ | $R_{B10}$ |
| $L_{A217}$ | H | $R_{B8}$ | $R_{A3}$ | $R_{A3}$ |
| $L_{A218}$ | H | $R_{B8}$ | $R_{A34}$ | $R_{A34}$ |
| $L_{A219}$ | H | $R_{B8}$ | $R_{B1}$ | $R_{B3}$ |
| $L_{A220}$ | H | $R_{B8}$ | $R_{B1}$ | $R_{B4}$ |
| $L_{A221}$ | H | $R_{B8}$ | $R_{B1}$ | $R_{B7}$ |
| $L_{A222}$ | H | $R_{B8}$ | $R_{B1}$ | $R_{B10}$ |
| $L_{A223}$ | H | $R_{B8}$ | $R_{B1}$ | $R_{A3}$ |
| $L_{A224}$ | H | $R_{B8}$ | $R_{B1}$ | $R_{A34}$ |
| $L_{A225}$ | H | $R_{B8}$ | $R_{B3}$ | $R_{B1}$ |
| $L_{A226}$ | H | $R_{B8}$ | $R_{B3}$ | $R_{B4}$ |
| $L_{A227}$ | H | $R_{B8}$ | $R_{B3}$ | $R_{B7}$ |
| $L_{A228}$ | H | $R_{B8}$ | $R_{B3}$ | $R_{B10}$ |
| $L_{A229}$ | H | $R_{B8}$ | $R_{B3}$ | $R_{A3}$ |
| $L_{A230}$ | H | $R_{B8}$ | $R_{B3}$ | $R_{A34}$ |
| $L_{A231}$ | H | $R_{B8}$ | $R_{B4}$ | $R_{B1}$ |
| $L_{A232}$ | H | $R_{B8}$ | $R_{B4}$ | $R_{B3}$ |
| $L_{A233}$ | H | $R_{B8}$ | $R_{B4}$ | $R_{B7}$ |
| $L_{A234}$ | H | $R_{B8}$ | $R_{B4}$ | $R_{B10}$ |
| $L_{A235}$ | H | $R_{B8}$ | $R_{B4}$ | $R_{A3}$ |
| $L_{A236}$ | H | $R_{B8}$ | $R_{B4}$ | $R_{A34}$ |
| $L_{A237}$ | H | $R_{B8}$ | $R_{B7}$ | $R_{B1}$ |
| $L_{A238}$ | H | $R_{B8}$ | $R_{B7}$ | $R_{B3}$ |
| $L_{A239}$ | H | $R_{B8}$ | $R_{B7}$ | $R_{B4}$ |
| $L_{A240}$ | H | $R_{B8}$ | $R_{B7}$ | $R_{B10}$ |
| $L_{A241}$ | H | $R_{B8}$ | $R_{B7}$ | $R_{A3}$ |
| $L_{A242}$ | H | $R_{B8}$ | $R_{B7}$ | $R_{A34}$ |
| $L_{A243}$ | H | $R_{B8}$ | $R_{B10}$ | $R_{B1}$ |
| $L_{A244}$ | H | $R_{B8}$ | $R_{B10}$ | $R_{B3}$ |
| $L_{A245}$ | H | $R_{B8}$ | $R_{B10}$ | $R_{B4}$ |
| $L_{A246}$ | H | $R_{B8}$ | $R_{B10}$ | $R_{B7}$ |
| $L_{A247}$ | H | $R_{B8}$ | $R_{B10}$ | $R_{A3}$ |
| $L_{A248}$ | H | $R_{B8}$ | $R_{B10}$ | $R_{A34}$ |
| $L_{A249}$ | H | $R_{B8}$ | $R_{A3}$ | $R_{B1}$ |
| $L_{A250}$ | H | $R_{B8}$ | $R_{A3}$ | $R_{B3}$ |
| $L_{A251}$ | H | $R_{B8}$ | $R_{A3}$ | $R_{B4}$ |
| $L_{A252}$ | H | $R_{B8}$ | $R_{A3}$ | $R_{B7}$ |
| $L_{A253}$ | H | $R_{B8}$ | $R_{A3}$ | $R_{B10}$ |
| $L_{A254}$ | H | $R_{B8}$ | $R_{A3}$ | $R_{A34}$ |
| $L_{A255}$ | H | $R_{B8}$ | $R_{A34}$ | $R_{B1}$ |
| $L_{A256}$ | H | $R_{B8}$ | $R_{A34}$ | $R_{B3}$ |
| $L_{A257}$ | H | $R_{B8}$ | $R_{A34}$ | $R_{B4}$ |
| $L_{A258}$ | H | $R_{B8}$ | $R_{A34}$ | $R_{B7}$ |
| $L_{A259}$ | H | $R_{B8}$ | $R_{A34}$ | $R_{B10}$ |
| $L_{A260}$ | H | $R_{B8}$ | $R_{A34}$ | $R_{A3}$ |

$L_{A261}$ through $L_{A520}$ that are based on a structure of Formula III,

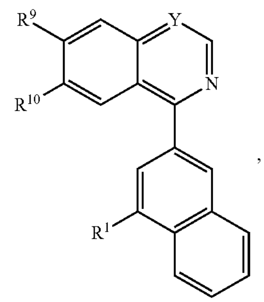

in which $R^1$, $R^9$, $R^{10}$, and Y are defined as provided below:

| Ligand | $R^1$ | $R^9$ | $R^{10}$ | Y |
|---|---|---|---|---|
| $L_{A261}$ | $R_{B6}$ | H | H | C |
| $L_{A262}$ | $R_{B6}$ | $R_{B1}$ | H | C |
| $L_{A263}$ | $R_{B6}$ | $R_{B3}$ | H | C |
| $L_{A264}$ | $R_{B6}$ | $R_{B4}$ | H | C |
| $L_{A265}$ | $R_{B6}$ | $R_{B7}$ | H | C |
| $L_{A266}$ | $R_{B6}$ | $R_{B10}$ | H | C |
| $L_{A267}$ | $R_{B6}$ | $R_{A3}$ | H | C |
| $L_{A268}$ | $R_{B6}$ | $R_{A34}$ | H | C |
| $L_{A269}$ | $R_{B6}$ | H | $R_{B1}$ | C |
| $L_{A270}$ | $R_{B6}$ | H | $R_{B2}$ | C |
| $L_{A271}$ | $R_{B6}$ | H | $R_{B3}$ | C |
| $L_{A272}$ | $R_{B6}$ | H | $R_{B4}$ | C |
| $L_{A273}$ | $R_{B6}$ | H | $R_{B7}$ | C |
| $L_{A274}$ | $R_{B6}$ | H | $R_{B10}$ | C |
| $L_{A275}$ | $R_{B6}$ | H | $R_{A3}$ | C |
| $L_{A276}$ | $R_{B6}$ | H | $R_{A34}$ | C |
| $L_{A277}$ | $R_{B6}$ | $R_{B1}$ | $R_{B1}$ | C |
| $L_{A278}$ | $R_{B6}$ | $R_{B3}$ | $R_{B3}$ | C |
| $L_{A279}$ | $R_{B6}$ | $R_{B4}$ | $R_{B4}$ | C |
| $L_{A280}$ | $R_{B6}$ | $R_{B7}$ | $R_{B7}$ | C |
| $L_{A281}$ | $R_{B6}$ | $R_{B10}$ | $R_{B10}$ | C |
| $L_{A282}$ | $R_{B6}$ | $R_{A3}$ | $R_{A3}$ | C |
| $L_{A283}$ | $R_{B6}$ | $R_{A34}$ | $R_{A34}$ | C |
| $L_{A284}$ | $R_{B6}$ | $R_{B1}$ | $R_{B3}$ | C |
| $L_{A285}$ | $R_{B6}$ | $R_{B1}$ | $R_{B4}$ | C |
| $L_{A286}$ | $R_{B6}$ | $R_{B1}$ | $R_{B7}$ | C |
| $L_{A287}$ | $R_{B6}$ | $R_{B1}$ | $R_{B10}$ | C |
| $L_{A288}$ | $R_{B6}$ | $R_{B1}$ | $R_{A3}$ | C |
| $L_{A289}$ | $R_{B6}$ | $R_{B1}$ | $R_{A34}$ | C |
| $L_{A290}$ | $R_{B6}$ | $R_{B3}$ | $R_{B1}$ | C |
| $L_{A291}$ | $R_{B6}$ | $R_{B3}$ | $R_{B4}$ | C |
| $L_{A292}$ | $R_{B6}$ | $R_{B3}$ | $R_{B7}$ | C |
| $L_{A293}$ | $R_{B6}$ | $R_{B3}$ | $R_{B10}$ | C |
| $L_{A294}$ | $R_{B6}$ | $R_{B3}$ | $R_{A3}$ | C |
| $L_{A295}$ | $R_{B6}$ | $R_{B3}$ | $R_{A34}$ | C |
| $L_{A296}$ | $R_{B6}$ | $R_{B4}$ | $R_{B1}$ | C |
| $L_{A297}$ | $R_{B6}$ | $R_{B4}$ | $R_{B3}$ | C |
| $L_{A298}$ | $R_{B6}$ | $R_{B4}$ | $R_{B7}$ | C |
| $L_{A299}$ | $R_{B6}$ | $R_{B4}$ | $R_{B10}$ | C |
| $L_{A300}$ | $R_{B6}$ | $R_{B4}$ | $R_{A3}$ | C |
| $L_{A301}$ | $R_{B6}$ | $R_{B4}$ | $R_{A34}$ | C |
| $L_{A302}$ | $R_{B6}$ | $R_{B7}$ | $R_{B1}$ | C |
| $L_{A303}$ | $R_{B6}$ | $R_{B7}$ | $R_{B3}$ | C |
| $L_{A304}$ | $R_{B6}$ | $R_{B7}$ | $R_{B4}$ | C |
| $L_{A305}$ | $R_{B6}$ | $R_{B7}$ | $R_{B10}$ | C |
| $L_{A306}$ | $R_{B6}$ | $R_{B7}$ | $R_{A3}$ | C |
| $L_{A307}$ | $R_{B6}$ | $R_{B7}$ | $R_{A34}$ | C |
| $L_{A308}$ | $R_{B6}$ | $R_{B10}$ | $R_{B1}$ | C |
| $L_{A309}$ | $R_{B6}$ | $R_{B10}$ | $R_{B3}$ | C |
| $L_{A310}$ | $R_{B6}$ | $R_{B10}$ | $R_{B4}$ | C |
| $L_{A311}$ | $R_{B6}$ | $R_{B10}$ | $R_{B7}$ | C |
| $L_{A312}$ | $R_{B6}$ | $R_{B10}$ | $R_{A3}$ | C |
| $L_{A313}$ | $R_{B6}$ | $R_{B10}$ | $R_{A34}$ | C |
| $L_{A314}$ | $R_{B6}$ | $R_{A3}$ | $R_{B1}$ | C |
| $L_{A315}$ | $R_{B6}$ | $R_{A3}$ | $R_{B3}$ | C |
| $L_{A316}$ | $R_{B6}$ | $R_{A3}$ | $R_{B4}$ | C |

-continued

| Ligand | $R^1$ | $R^9$ | $R^{10}$ | Y |
|---|---|---|---|---|
| $L_{A4317}$ | $R_{B6}$ | $R_{A3}$ | $R_{B7}$ | C |
| $L_{A4318}$ | $R_{B6}$ | $R_{A3}$ | $R_{B10}$ | C |
| $L_{A4319}$ | $R_{B6}$ | $R_{A3}$ | $R_{A34}$ | C |
| $L_{A4320}$ | $R_{B6}$ | $R_{A34}$ | $R_{B1}$ | C |
| $L_{A4321}$ | $R_{B6}$ | $R_{A34}$ | $R_{B3}$ | C |
| $L_{A4322}$ | $R_{B6}$ | $R_{A34}$ | $R_{B4}$ | C |
| $L_{A4323}$ | $R_{B6}$ | $R_{A34}$ | $R_{B7}$ | C |
| $L_{A4324}$ | $R_{B6}$ | $R_{A34}$ | $R_{B10}$ | C |
| $L_{A4325}$ | $R_{B6}$ | $R_{A34}$ | $R_{A3}$ | C |
| $L_{A4326}$ | $R_{B8}$ | H | H | C |
| $L_{A4327}$ | $R_{B8}$ | $R_{B1}$ | H | C |
| $L_{A4328}$ | $R_{B8}$ | $R_{B3}$ | H | C |
| $L_{A4329}$ | $R_{B8}$ | $R_{B4}$ | H | C |
| $L_{A4330}$ | $R_{B8}$ | $R_{B7}$ | H | C |
| $L_{A4331}$ | $R_{B8}$ | $R_{B10}$ | H | C |
| $L_{A4332}$ | $R_{B8}$ | $R_{A3}$ | H | C |
| $L_{A4333}$ | $R_{B8}$ | $R_{A34}$ | H | C |
| $L_{A4334}$ | $R_{B8}$ | H | $R_{B1}$ | C |
| $L_{A4335}$ | $R_{B8}$ | H | $R_{B2}$ | C |
| $L_{A4336}$ | $R_{B8}$ | H | $R_{B3}$ | C |
| $L_{A4337}$ | $R_{B8}$ | H | $R_{B4}$ | C |
| $L_{A4338}$ | $R_{B8}$ | H | $R_{B7}$ | C |
| $L_{A4339}$ | $R_{B8}$ | H | $R_{B10}$ | C |
| $L_{A4340}$ | $R_{B8}$ | H | $R_{A3}$ | C |
| $L_{A4341}$ | $R_{B8}$ | H | $R_{A34}$ | C |
| $L_{A4342}$ | $R_{B8}$ | $R_{B1}$ | $R_{B1}$ | C |
| $L_{A4343}$ | $R_{B8}$ | $R_{B3}$ | $R_{B3}$ | C |
| $L_{A4344}$ | $R_{B8}$ | $R_{B4}$ | $R_{B4}$ | C |
| $L_{A4345}$ | $R_{B8}$ | $R_{B7}$ | $R_{B7}$ | C |
| $L_{A4346}$ | $R_{B8}$ | $R_{B10}$ | $R_{B10}$ | C |
| $L_{A4347}$ | $R_{B8}$ | $R_{A3}$ | $R_{A3}$ | C |
| $L_{A4348}$ | $R_{B8}$ | $R_{A34}$ | $R_{A34}$ | C |
| $L_{A4349}$ | $R_{B8}$ | $R_{B1}$ | $R_{B3}$ | C |
| $L_{A4350}$ | $R_{B8}$ | $R_{B1}$ | $R_{B4}$ | C |
| $L_{A4351}$ | $R_{B8}$ | $R_{B1}$ | $R_{B7}$ | C |
| $L_{A4352}$ | $R_{B8}$ | $R_{B1}$ | $R_{B10}$ | C |
| $L_{A4353}$ | $R_{B8}$ | $R_{B1}$ | $R_{A3}$ | C |
| $L_{A4354}$ | $R_{B8}$ | $R_{B1}$ | $R_{A34}$ | C |
| $L_{A4355}$ | $R_{B8}$ | $R_{B3}$ | $R_{B1}$ | C |
| $L_{A4356}$ | $R_{B8}$ | $R_{B3}$ | $R_{B4}$ | C |
| $L_{A4357}$ | $R_{B8}$ | $R_{B3}$ | $R_{B7}$ | C |
| $L_{A4358}$ | $R_{B8}$ | $R_{B3}$ | $R_{B10}$ | C |
| $L_{A4359}$ | $R_{B8}$ | $R_{B3}$ | $R_{A3}$ | C |
| $L_{A4360}$ | $R_{B8}$ | $R_{B3}$ | $R_{A34}$ | C |
| $L_{A4361}$ | $R_{B8}$ | $R_{B4}$ | $R_{B1}$ | C |
| $L_{A4362}$ | $R_{B8}$ | $R_{B4}$ | $R_{B3}$ | C |
| $L_{A4363}$ | $R_{B8}$ | $R_{B4}$ | $R_{B7}$ | C |
| $L_{A4364}$ | $R_{B8}$ | $R_{B4}$ | $R_{B10}$ | C |
| $L_{A4365}$ | $R_{B8}$ | $R_{B4}$ | $R_{A3}$ | C |
| $L_{A4366}$ | $R_{B8}$ | $R_{B4}$ | $R_{A34}$ | C |
| $L_{A4367}$ | $R_{B8}$ | $R_{B7}$ | $R_{B1}$ | C |
| $L_{A4368}$ | $R_{B8}$ | $R_{B7}$ | $R_{B3}$ | C |
| $L_{A4369}$ | $R_{B8}$ | $R_{B7}$ | $R_{B4}$ | C |
| $L_{A4370}$ | $R_{B8}$ | $R_{B7}$ | $R_{B10}$ | C |
| $L_{A4371}$ | $R_{B8}$ | $R_{B7}$ | $R_{A3}$ | C |
| $L_{A4372}$ | $R_{B8}$ | $R_{B7}$ | $R_{A34}$ | C |
| $L_{A4373}$ | $R_{B8}$ | $R_{B10}$ | $R_{B1}$ | C |
| $L_{A4374}$ | $R_{B8}$ | $R_{B10}$ | $R_{B3}$ | C |
| $L_{A4375}$ | $R_{B8}$ | $R_{B10}$ | $R_{B4}$ | C |
| $L_{A4376}$ | $R_{B8}$ | $R_{B10}$ | $R_{B7}$ | C |
| $L_{A4377}$ | $R_{B8}$ | $R_{B10}$ | $R_{A3}$ | C |
| $L_{A4378}$ | $R_{B8}$ | $R_{B10}$ | $R_{A34}$ | C |
| $L_{A4379}$ | $R_{B8}$ | $R_{A3}$ | $R_{B1}$ | C |
| $L_{A4380}$ | $R_{B8}$ | $R_{A3}$ | $R_{B3}$ | C |
| $L_{A4381}$ | $R_{B8}$ | $R_{A3}$ | $R_{B4}$ | C |
| $L_{A4382}$ | $R_{B8}$ | $R_{A3}$ | $R_{B7}$ | C |
| $L_{A4383}$ | $R_{B8}$ | $R_{A3}$ | $R_{B10}$ | C |
| $L_{A4384}$ | $R_{B8}$ | $R_{A3}$ | $R_{A34}$ | C |
| $L_{A4385}$ | $R_{B8}$ | $R_{A34}$ | $R_{B1}$ | C |
| $L_{A4386}$ | $R_{B8}$ | $R_{A34}$ | $R_{B3}$ | C |
| $L_{A4387}$ | $R_{B8}$ | $R_{A34}$ | $R_{B4}$ | C |
| $L_{A4388}$ | $R_{B8}$ | $R_{A34}$ | $R_{B7}$ | C |
| $L_{A4389}$ | $R_{B8}$ | $R_{A34}$ | $R_{B10}$ | C |
| $L_{A4390}$ | $R_{B8}$ | $R_{A34}$ | $R_{A3}$ | C |
| $L_{A4391}$ | $R_{B6}$ | H | H | N |
| $L_{A4392}$ | $R_{B6}$ | $R_{B1}$ | H | N |
| $L_{A4393}$ | $R_{B6}$ | $R_{B3}$ | H | N |

-continued

| Ligand | $R^1$ | $R^9$ | $R^{10}$ | Y |
|---|---|---|---|---|
| $L_{A4394}$ | $R_{B6}$ | $R_{B4}$ | H | N |
| $L_{A4395}$ | $R_{B6}$ | $R_{B7}$ | H | N |
| $L_{A4396}$ | $R_{B6}$ | $R_{B10}$ | H | N |
| $L_{A4397}$ | $R_{B6}$ | $R_{A3}$ | H | N |
| $L_{A4398}$ | $R_{B6}$ | $R_{A34}$ | H | N |
| $L_{A4399}$ | $R_{B6}$ | H | $R_{B1}$ | N |
| $L_{A4400}$ | $R_{B6}$ | H | $R_{B2}$ | N |
| $L_{A4401}$ | $R_{B6}$ | H | $R_{B3}$ | N |
| $L_{A4402}$ | $R_{B6}$ | H | $R_{B4}$ | N |
| $L_{A4403}$ | $R_{B6}$ | H | $R_{B7}$ | N |
| $L_{A4404}$ | $R_{B6}$ | H | $R_{B10}$ | N |
| $L_{A4405}$ | $R_{B6}$ | H | $R_{A3}$ | N |
| $L_{A4406}$ | $R_{B6}$ | H | $R_{A34}$ | N |
| $L_{A4407}$ | $R_{B6}$ | $R_{B1}$ | $R_{B1}$ | N |
| $L_{A4408}$ | $R_{B6}$ | $R_{B3}$ | $R_{B3}$ | N |
| $L_{A4409}$ | $R_{B6}$ | $R_{B4}$ | $R_{B4}$ | N |
| $L_{A4410}$ | $R_{B6}$ | $R_{B7}$ | $R_{B7}$ | N |
| $L_{A4411}$ | $R_{B6}$ | $R_{B10}$ | $R_{B10}$ | N |
| $L_{A4412}$ | $R_{B6}$ | $R_{A3}$ | $R_{A3}$ | N |
| $L_{A4413}$ | $R_{B6}$ | $R_{A34}$ | $R_{A34}$ | N |
| $L_{A4414}$ | $R_{B6}$ | $R_{B1}$ | $R_{B3}$ | N |
| $L_{A4415}$ | $R_{B6}$ | $R_{B1}$ | $R_{B4}$ | N |
| $L_{A4416}$ | $R_{B6}$ | $R_{B1}$ | $R_{B7}$ | N |
| $L_{A4417}$ | $R_{B6}$ | $R_{B1}$ | $R_{B10}$ | N |
| $L_{A4418}$ | $R_{B6}$ | $R_{B1}$ | $R_{A3}$ | N |
| $L_{A4419}$ | $R_{B6}$ | $R_{B1}$ | $R_{A34}$ | N |
| $L_{A4420}$ | $R_{B6}$ | $R_{B3}$ | $R_{B1}$ | N |
| $L_{A4421}$ | $R_{B6}$ | $R_{B3}$ | $R_{B4}$ | N |
| $L_{A4422}$ | $R_{B6}$ | $R_{B3}$ | $R_{B7}$ | N |
| $L_{A4423}$ | $R_{B6}$ | $R_{B3}$ | $R_{B10}$ | N |
| $L_{A4424}$ | $R_{B6}$ | $R_{B3}$ | $R_{A3}$ | N |
| $L_{A4425}$ | $R_{B6}$ | $R_{B3}$ | $R_{A34}$ | N |
| $L_{A4426}$ | $R_{B6}$ | $R_{B4}$ | $R_{B1}$ | N |
| $L_{A4427}$ | $R_{B6}$ | $R_{B4}$ | $R_{B3}$ | N |
| $L_{A4428}$ | $R_{B6}$ | $R_{B4}$ | $R_{B7}$ | N |
| $L_{A4429}$ | $R_{B6}$ | $R_{B4}$ | $R_{B10}$ | N |
| $L_{A4430}$ | $R_{B6}$ | $R_{B4}$ | $R_{A3}$ | N |
| $L_{A4431}$ | $R_{B6}$ | $R_{B4}$ | $R_{A34}$ | N |
| $L_{A4432}$ | $R_{B6}$ | $R_{B7}$ | $R_{B1}$ | N |
| $L_{A4433}$ | $R_{B6}$ | $R_{B7}$ | $R_{B3}$ | N |
| $L_{A4434}$ | $R_{B6}$ | $R_{B7}$ | $R_{B4}$ | N |
| $L_{A4435}$ | $R_{B6}$ | $R_{B7}$ | $R_{B10}$ | N |
| $L_{A4436}$ | $R_{B6}$ | $R_{B7}$ | $R_{A3}$ | N |
| $L_{A4437}$ | $R_{B6}$ | $R_{B7}$ | $R_{A34}$ | N |
| $L_{A4438}$ | $R_{B6}$ | $R_{B10}$ | $R_{B1}$ | N |
| $L_{A4439}$ | $R_{B6}$ | $R_{B10}$ | $R_{B3}$ | N |
| $L_{A4440}$ | $R_{B6}$ | $R_{B10}$ | $R_{B4}$ | N |
| $L_{A4441}$ | $R_{B6}$ | $R_{B10}$ | $R_{B7}$ | N |
| $L_{A4442}$ | $R_{B6}$ | $R_{B10}$ | $R_{A3}$ | N |
| $L_{A4443}$ | $R_{B6}$ | $R_{B10}$ | $R_{A34}$ | N |
| $L_{A4444}$ | $R_{B6}$ | $R_{A3}$ | $R_{B1}$ | N |
| $L_{A4445}$ | $R_{B6}$ | $R_{A3}$ | $R_{B3}$ | N |
| $L_{A4446}$ | $R_{B6}$ | $R_{A3}$ | $R_{B4}$ | N |
| $L_{A4447}$ | $R_{B6}$ | $R_{A3}$ | $R_{B7}$ | N |
| $L_{A4448}$ | $R_{B6}$ | $R_{A3}$ | $R_{B10}$ | N |
| $L_{A4449}$ | $R_{B6}$ | $R_{A3}$ | $R_{A34}$ | N |
| $L_{A4450}$ | $R_{B6}$ | $R_{A34}$ | $R_{B1}$ | N |
| $L_{A4451}$ | $R_{B6}$ | $R_{A34}$ | $R_{B3}$ | N |
| $L_{A4452}$ | $R_{B6}$ | $R_{A34}$ | $R_{B4}$ | N |
| $L_{A4453}$ | $R_{B6}$ | $R_{A34}$ | $R_{B7}$ | N |
| $L_{A4454}$ | $R_{B6}$ | $R_{A34}$ | $R_{B10}$ | N |
| $L_{A4455}$ | $R_{B6}$ | $R_{A34}$ | $R_{A3}$ | N |
| $L_{A4456}$ | $R_{B8}$ | H | H | N |
| $L_{A4457}$ | $R_{B8}$ | $R_{B1}$ | H | N |
| $L_{A4458}$ | $R_{B8}$ | $R_{B3}$ | H | N |
| $L_{A4459}$ | $R_{B8}$ | $R_{B4}$ | H | N |
| $L_{A4460}$ | $R_{B8}$ | $R_{B7}$ | H | N |
| $L_{A4461}$ | $R_{B8}$ | $R_{B10}$ | H | N |
| $L_{A4462}$ | $R_{B8}$ | $R_{A3}$ | H | N |
| $L_{A4463}$ | $R_{B8}$ | $R_{A34}$ | H | N |
| $L_{A4464}$ | $R_{B8}$ | H | $R_{B1}$ | N |
| $L_{A4465}$ | $R_{B8}$ | H | $R_{B2}$ | N |
| $L_{A4466}$ | $R_{B8}$ | H | $R_{B3}$ | N |
| $L_{A4467}$ | $R_{B8}$ | H | $R_{B4}$ | N |
| $L_{A4468}$ | $R_{B8}$ | H | $R_{B7}$ | N |
| $L_{A4469}$ | $R_{B8}$ | H | $R_{B10}$ | N |
| $L_{A4470}$ | $R_{B8}$ | H | $R_{A3}$ | N |

-continued

| Ligand | $R^1$ | $R^9$ | $R^{10}$ | Y |
|---|---|---|---|---|
| $L_{A471}$ | $R_{B8}$ | H | $R_{A34}$ | N |
| $L_{A472}$ | $R_{B8}$ | $R_{B1}$ | $R_{B1}$ | N |
| $L_{A473}$ | $R_{B8}$ | $R_{B3}$ | $R_{B3}$ | N |
| $L_{A474}$ | $R_{B8}$ | $R_{B4}$ | $R_{B4}$ | N |
| $L_{A475}$ | $R_{B8}$ | $R_{B7}$ | $R_{B7}$ | N |
| $L_{A476}$ | $R_{B8}$ | $R_{B10}$ | $R_{B10}$ | N |
| $L_{A477}$ | $R_{B8}$ | $R_{A3}$ | $R_{A3}$ | N |
| $L_{A478}$ | $R_{B8}$ | $R_{A34}$ | $R_{A34}$ | N |
| $L_{A479}$ | $R_{B8}$ | $R_{B1}$ | $R_{B3}$ | N |
| $L_{A480}$ | $R_{B8}$ | $R_{B1}$ | $R_{B4}$ | N |
| $L_{A481}$ | $R_{B8}$ | $R_{B1}$ | $R_{B7}$ | N |
| $L_{A482}$ | $R_{B8}$ | $R_{B1}$ | $R_{B10}$ | N |
| $L_{A483}$ | $R_{B8}$ | $R_{B1}$ | $R_{A3}$ | N |
| $L_{A484}$ | $R_{B8}$ | $R_{B1}$ | $R_{A34}$ | N |
| $L_{A485}$ | $R_{B8}$ | $R_{B3}$ | $R_{B1}$ | N |
| $L_{A486}$ | $R_{B8}$ | $R_{B3}$ | $R_{B4}$ | N |
| $L_{A487}$ | $R_{B8}$ | $R_{B3}$ | $R_{B7}$ | N |
| $L_{A488}$ | $R_{B8}$ | $R_{B3}$ | $R_{B10}$ | N |
| $L_{A489}$ | $R_{B8}$ | $R_{B3}$ | $R_{A3}$ | N |
| $L_{A490}$ | $R_{B8}$ | $R_{B3}$ | $R_{A34}$ | N |
| $L_{A491}$ | $R_{B8}$ | $R_{B4}$ | $R_{B1}$ | N |
| $L_{A492}$ | $R_{B8}$ | $R_{B4}$ | $R_{B3}$ | N |
| $L_{A493}$ | $R_{B8}$ | $R_{B4}$ | $R_{B7}$ | N |
| $L_{A494}$ | $R_{B8}$ | $R_{B4}$ | $R_{B10}$ | N |
| $L_{A495}$ | $R_{B8}$ | $R_{B4}$ | $R_{A3}$ | N |
| $L_{A496}$ | $R_{B8}$ | $R_{B4}$ | $R_{A34}$ | N |
| $L_{A497}$ | $R_{B8}$ | $R_{B7}$ | $R_{B1}$ | N |
| $L_{A498}$ | $R_{B8}$ | $R_{B7}$ | $R_{B3}$ | N |
| $L_{A499}$ | $R_{B8}$ | $R_{B7}$ | $R_{B4}$ | N |
| $L_{A500}$ | $R_{B8}$ | $R_{B7}$ | $R_{B10}$ | N |
| $L_{A501}$ | $R_{B8}$ | $R_{B7}$ | $R_{A3}$ | N |
| $L_{A502}$ | $R_{B8}$ | $R_{B7}$ | $R_{A34}$ | N |
| $L_{A503}$ | $R_{B8}$ | $R_{B10}$ | $R_{B1}$ | N |
| $L_{A504}$ | $R_{B8}$ | $R_{B10}$ | $R_{B3}$ | N |
| $L_{A505}$ | $R_{B8}$ | $R_{B10}$ | $R_{B4}$ | N |
| $L_{A506}$ | $R_{B8}$ | $R_{B10}$ | $R_{B7}$ | N |
| $L_{A507}$ | $R_{B8}$ | $R_{B10}$ | $R_{A3}$ | N |
| $L_{A508}$ | $R_{B8}$ | $R_{B10}$ | $R_{A34}$ | N |
| $L_{A509}$ | $R_{B8}$ | $R_{A3}$ | $R_{B1}$ | N |
| $L_{A510}$ | $R_{B8}$ | $R_{A3}$ | $R_{B3}$ | N |
| $L_{A511}$ | $R_{B8}$ | $R_{A3}$ | $R_{B4}$ | N |
| $L_{A512}$ | $R_{B8}$ | $R_{A3}$ | $R_{B7}$ | N |
| $L_{A513}$ | $R_{B8}$ | $R_{A3}$ | $R_{B10}$ | N |
| $L_{A514}$ | $R_{B8}$ | $R_{A3}$ | $R_{A34}$ | N |
| $L_{A515}$ | $R_{B8}$ | $R_{A34}$ | $R_{B1}$ | N |
| $L_{A516}$ | $R_{B8}$ | $R_{A34}$ | $R_{B3}$ | N |
| $L_{A517}$ | $R_{B8}$ | $R_{A34}$ | $R_{B4}$ | N |
| $L_{A518}$ | $R_{B8}$ | $R_{A34}$ | $R_{B7}$ | N |
| $L_{A519}$ | $R_{B8}$ | $R_{A34}$ | $R_{B10}$ | N |
| $L_{A520}$ | $R_{B8}$ | $R_{A34}$ | $R_{A3}$ | N |

$L_{A521}$ through $L_{A780}$ that are based on a structure of Formula IV,

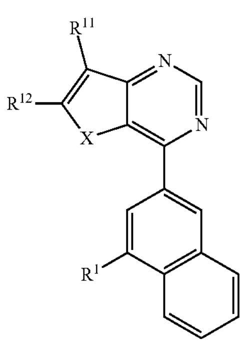

, in which $R^1$, $R^{11}$, $R^{12}$, and X are defined as provided below:

| Ligand | $R^1$ | $R^{11}$ | $R^{12}$ | X |
|---|---|---|---|---|
| $L_{A521}$ | $R_{B6}$ | H | H | S |
| $L_{A522}$ | $R_{B6}$ | $R_{B1}$ | H | S |
| $L_{A523}$ | $R_{B6}$ | $R_{B3}$ | H | S |
| $L_{A524}$ | $R_{B6}$ | $R_{B4}$ | H | S |
| $L_{A525}$ | $R_{B6}$ | $R_{B7}$ | H | S |
| $L_{A526}$ | $R_{B6}$ | $R_{B10}$ | H | S |
| $L_{A527}$ | $R_{B6}$ | $R_{A3}$ | H | S |
| $L_{A528}$ | $R_{B6}$ | $R_{A34}$ | H | S |
| $L_{A529}$ | $R_{B6}$ | H | $R_{B1}$ | S |
| $L_{A530}$ | $R_{B6}$ | H | $R_{B2}$ | S |
| $L_{A531}$ | $R_{B6}$ | H | $R_{B3}$ | S |
| $L_{A532}$ | $R_{B6}$ | H | $R_{B4}$ | S |
| $L_{A533}$ | $R_{B6}$ | H | $R_{B7}$ | S |
| $L_{A534}$ | $R_{B6}$ | H | $R_{B10}$ | S |
| $L_{A535}$ | $R_{B6}$ | H | $R_{A3}$ | S |
| $L_{A536}$ | $R_{B6}$ | H | $R_{A34}$ | S |
| $L_{A537}$ | $R_{B6}$ | $R_{B1}$ | $R_{B1}$ | S |
| $L_{A538}$ | $R_{B6}$ | $R_{B3}$ | $R_{B3}$ | S |
| $L_{A539}$ | $R_{B6}$ | $R_{B4}$ | $R_{B4}$ | S |
| $L_{A540}$ | $R_{B6}$ | $R_{B7}$ | $R_{B7}$ | S |
| $L_{A541}$ | $R_{B6}$ | $R_{B10}$ | $R_{B10}$ | S |
| $L_{A542}$ | $R_{B6}$ | $R_{A3}$ | $R_{A3}$ | S |
| $L_{A543}$ | $R_{B6}$ | $R_{A34}$ | $R_{A34}$ | S |
| $L_{A544}$ | $R_{B6}$ | $R_{B1}$ | $R_{B3}$ | S |
| $L_{A545}$ | $R_{B6}$ | $R_{B1}$ | $R_{B4}$ | S |
| $L_{A546}$ | $R_{B6}$ | $R_{B1}$ | $R_{B7}$ | S |
| $L_{A547}$ | $R_{B6}$ | $R_{B1}$ | $R_{B10}$ | S |
| $L_{A548}$ | $R_{B6}$ | $R_{B1}$ | $R_{A3}$ | S |
| $L_{A549}$ | $R_{B6}$ | $R_{B1}$ | $R_{A34}$ | S |
| $L_{A550}$ | $R_{B6}$ | $R_{B3}$ | $R_{B1}$ | S |
| $L_{A551}$ | $R_{B6}$ | $R_{B3}$ | $R_{B4}$ | S |
| $L_{A552}$ | $R_{B6}$ | $R_{B3}$ | $R_{B7}$ | S |
| $L_{A553}$ | $R_{B6}$ | $R_{B3}$ | $R_{B10}$ | S |
| $L_{A554}$ | $R_{B6}$ | $R_{B3}$ | $R_{A3}$ | S |
| $L_{A555}$ | $R_{B6}$ | $R_{B3}$ | $R_{A34}$ | S |
| $L_{A556}$ | $R_{B6}$ | $R_{B4}$ | $R_{B1}$ | S |
| $L_{A557}$ | $R_{B6}$ | $R_{B4}$ | $R_{B3}$ | S |
| $L_{A558}$ | $R_{B6}$ | $R_{B4}$ | $R_{B7}$ | S |
| $L_{A559}$ | $R_{B6}$ | $R_{B4}$ | $R_{B10}$ | S |
| $L_{A560}$ | $R_{B6}$ | $R_{B4}$ | $R_{A3}$ | S |
| $L_{A561}$ | $R_{B6}$ | $R_{B4}$ | $R_{A34}$ | S |
| $L_{A562}$ | $R_{B6}$ | $R_{B7}$ | $R_{B1}$ | S |
| $L_{A563}$ | $R_{B6}$ | $R_{B7}$ | $R_{B3}$ | S |
| $L_{A564}$ | $R_{B6}$ | $R_{B7}$ | $R_{B4}$ | S |
| $L_{A565}$ | $R_{B6}$ | $R_{B7}$ | $R_{B10}$ | S |
| $L_{A566}$ | $R_{B6}$ | $R_{B7}$ | $R_{A3}$ | S |
| $L_{A567}$ | $R_{B6}$ | $R_{B7}$ | $R_{A34}$ | S |
| $L_{A568}$ | $R_{B6}$ | $R_{B10}$ | $R_{B1}$ | S |
| $L_{A569}$ | $R_{B6}$ | $R_{B10}$ | $R_{B3}$ | S |
| $L_{A570}$ | $R_{B6}$ | $R_{B10}$ | $R_{B4}$ | S |
| $L_{A571}$ | $R_{B6}$ | $R_{B10}$ | $R_{B7}$ | S |
| $L_{A572}$ | $R_{B6}$ | $R_{B10}$ | $R_{A3}$ | S |
| $L_{A573}$ | $R_{B6}$ | $R_{B10}$ | $R_{A34}$ | S |
| $L_{A574}$ | $R_{B6}$ | $R_{A3}$ | $R_{B1}$ | S |
| $L_{A575}$ | $R_{B6}$ | $R_{A3}$ | $R_{B3}$ | S |
| $L_{A576}$ | $R_{B6}$ | $R_{A3}$ | $R_{B4}$ | S |
| $L_{A577}$ | $R_{B6}$ | $R_{A3}$ | $R_{B7}$ | S |
| $L_{A578}$ | $R_{B6}$ | $R_{A3}$ | $R_{B10}$ | S |
| $L_{A579}$ | $R_{B6}$ | $R_{A3}$ | $R_{A34}$ | S |
| $L_{A580}$ | $R_{B6}$ | $R_{A34}$ | $R_{B1}$ | S |
| $L_{A581}$ | $R_{B6}$ | $R_{A34}$ | $R_{B3}$ | S |
| $L_{A582}$ | $R_{B6}$ | $R_{A34}$ | $R_{B4}$ | S |
| $L_{A583}$ | $R_{B6}$ | $R_{A34}$ | $R_{B7}$ | S |
| $L_{A584}$ | $R_{B6}$ | $R_{A34}$ | $R_{B10}$ | S |
| $L_{A585}$ | $R_{B6}$ | $R_{A34}$ | $R_{A3}$ | S |
| $L_{A586}$ | $R_{B8}$ | H | H | S |
| $L_{A587}$ | $R_{B8}$ | $R_{B1}$ | H | S |
| $L_{A588}$ | $R_{B8}$ | $R_{B3}$ | H | S |
| $L_{A589}$ | $R_{B8}$ | $R_{B4}$ | H | S |
| $L_{A590}$ | $R_{B8}$ | $R_{B7}$ | H | S |
| $L_{A591}$ | $R_{B8}$ | $R_{B10}$ | H | S |
| $L_{A592}$ | $R_{B8}$ | $R_{A3}$ | H | S |
| $L_{A593}$ | $R_{B8}$ | $R_{A34}$ | H | S |
| $L_{A594}$ | $R_{B8}$ | H | $R_{B1}$ | S |
| $L_{A595}$ | $R_{B8}$ | H | $R_{B2}$ | S |
| $L_{A596}$ | $R_{B8}$ | H | $R_{B3}$ | S |

| Ligand | $R^1$ | $R^{11}$ | $R^{12}$ | X |
|---|---|---|---|---|
| $L_{A4597}$ | $R_{B8}$ | H | $R_{B4}$ | S |
| $L_{A4598}$ | $R_{B8}$ | H | $R_{B7}$ | S |
| $L_{A4599}$ | $R_{B8}$ | H | $R_{B10}$ | S |
| $L_{A4600}$ | $R_{B8}$ | H | $R_{A3}$ | S |
| $L_{A4601}$ | $R_{B8}$ | H | $R_{A34}$ | S |
| $L_{A4602}$ | $R_{B8}$ | $R_{B1}$ | $R_{B1}$ | S |
| $L_{A4603}$ | $R_{B8}$ | $R_{B3}$ | $R_{B3}$ | S |
| $L_{A4604}$ | $R_{B8}$ | $R_{B4}$ | $R_{B4}$ | S |
| $L_{A4605}$ | $R_{B8}$ | $R_{B7}$ | $R_{B7}$ | S |
| $L_{A4606}$ | $R_{B8}$ | $R_{B10}$ | $R_{B10}$ | S |
| $L_{A4607}$ | $R_{B8}$ | $R_{A3}$ | $R_{A3}$ | S |
| $L_{A4608}$ | $R_{B8}$ | $R_{A34}$ | $R_{A34}$ | S |
| $L_{A4609}$ | $R_{B8}$ | $R_{B1}$ | $R_{B3}$ | S |
| $L_{A4610}$ | $R_{B8}$ | $R_{B1}$ | $R_{B4}$ | S |
| $L_{A4611}$ | $R_{B8}$ | $R_{B1}$ | $R_{B7}$ | S |
| $L_{A4612}$ | $R_{B8}$ | $R_{B1}$ | $R_{B10}$ | S |
| $L_{A4613}$ | $R_{B8}$ | $R_{B1}$ | $R_{A3}$ | S |
| $L_{A4614}$ | $R_{B8}$ | $R_{B1}$ | $R_{A34}$ | S |
| $L_{A4615}$ | $R_{B8}$ | $R_{B3}$ | $R_{B1}$ | S |
| $L_{A4616}$ | $R_{B8}$ | $R_{B3}$ | $R_{B4}$ | S |
| $L_{A4617}$ | $R_{B8}$ | $R_{B3}$ | $R_{B7}$ | S |
| $L_{A4618}$ | $R_{B8}$ | $R_{B3}$ | $R_{B10}$ | S |
| $L_{A4619}$ | $R_{B8}$ | $R_{B3}$ | $R_{A3}$ | S |
| $L_{A4620}$ | $R_{B8}$ | $R_{B3}$ | $R_{A34}$ | S |
| $L_{A4621}$ | $R_{B8}$ | $R_{B4}$ | $R_{B1}$ | S |
| $L_{A4622}$ | $R_{B8}$ | $R_{B4}$ | $R_{B3}$ | S |
| $L_{A4623}$ | $R_{B8}$ | $R_{B4}$ | $R_{B7}$ | S |
| $L_{A4624}$ | $R_{B8}$ | $R_{B4}$ | $R_{B10}$ | S |
| $L_{A4625}$ | $R_{B8}$ | $R_{B4}$ | $R_{A3}$ | S |
| $L_{A4626}$ | $R_{B8}$ | $R_{B4}$ | $R_{A34}$ | S |
| $L_{A4627}$ | $R_{B8}$ | $R_{B7}$ | $R_{B1}$ | S |
| $L_{A4628}$ | $R_{B8}$ | $R_{B7}$ | $R_{B3}$ | S |
| $L_{A4629}$ | $R_{B8}$ | $R_{B7}$ | $R_{B4}$ | S |
| $L_{A4630}$ | $R_{B8}$ | $R_{B7}$ | $R_{B10}$ | S |
| $L_{A4631}$ | $R_{B8}$ | $R_{B7}$ | $R_{A3}$ | S |
| $L_{A4632}$ | $R_{B8}$ | $R_{B7}$ | $R_{A34}$ | S |
| $L_{A4633}$ | $R_{B8}$ | $R_{B10}$ | $R_{B1}$ | S |
| $L_{A4634}$ | $R_{B8}$ | $R_{B10}$ | $R_{B3}$ | S |
| $L_{A4635}$ | $R_{B8}$ | $R_{B10}$ | $R_{B4}$ | S |
| $L_{A4636}$ | $R_{B8}$ | $R_{B10}$ | $R_{B7}$ | S |
| $L_{A4637}$ | $R_{B8}$ | $R_{B10}$ | $R_{A3}$ | S |
| $L_{A4638}$ | $R_{B8}$ | $R_{B10}$ | $R_{A34}$ | S |
| $L_{A4639}$ | $R_{B8}$ | $R_{A3}$ | $R_{B1}$ | S |
| $L_{A4640}$ | $R_{B8}$ | $R_{A3}$ | $R_{B3}$ | S |
| $L_{A4641}$ | $R_{B8}$ | $R_{A3}$ | $R_{B4}$ | S |
| $L_{A4642}$ | $R_{B8}$ | $R_{A3}$ | $R_{B7}$ | S |
| $L_{A4643}$ | $R_{B8}$ | $R_{A3}$ | $R_{B10}$ | S |
| $L_{A4644}$ | $R_{B8}$ | $R_{A3}$ | $R_{A34}$ | S |
| $L_{A4645}$ | $R_{B8}$ | $R_{A34}$ | $R_{B1}$ | S |
| $L_{A4646}$ | $R_{B8}$ | $R_{A34}$ | $R_{B3}$ | S |
| $L_{A4647}$ | $R_{B8}$ | $R_{A34}$ | $R_{B4}$ | S |
| $L_{A4648}$ | $R_{B8}$ | $R_{A34}$ | $R_{B7}$ | S |
| $L_{A4649}$ | $R_{B8}$ | $R_{A34}$ | $R_{B10}$ | S |
| $L_{A4650}$ | $R_{B8}$ | $R_{A34}$ | $R_{A3}$ | S |
| $L_{A4651}$ | $R_{B6}$ | H | H | O |
| $L_{A4652}$ | $R_{B6}$ | $R_{B1}$ | H | O |
| $L_{A4653}$ | $R_{B6}$ | $R_{B3}$ | H | O |
| $L_{A4654}$ | $R_{B6}$ | $R_{B4}$ | H | O |
| $L_{A4655}$ | $R_{B6}$ | $R_{B7}$ | H | O |
| $L_{A4656}$ | $R_{B6}$ | $R_{B10}$ | H | O |
| $L_{A4657}$ | $R_{B6}$ | $R_{A3}$ | H | O |
| $L_{A4658}$ | $R_{B6}$ | $R_{A34}$ | H | O |
| $L_{A4659}$ | $R_{B6}$ | H | $R_{B1}$ | O |
| $L_{A4660}$ | $R_{B6}$ | H | $R_{B2}$ | O |
| $L_{A4661}$ | $R_{B6}$ | H | $R_{B3}$ | O |
| $L_{A4662}$ | $R_{B6}$ | H | $R_{B4}$ | O |
| $L_{A4663}$ | $R_{B6}$ | H | $R_{B7}$ | O |
| $L_{A4664}$ | $R_{B6}$ | H | $R_{B10}$ | O |
| $L_{A4665}$ | $R_{B6}$ | H | $R_{A3}$ | O |
| $L_{A4666}$ | $R_{B6}$ | H | $R_{A34}$ | O |
| $L_{A4667}$ | $R_{B6}$ | $R_{B1}$ | $R_{B1}$ | O |
| $L_{A4668}$ | $R_{B6}$ | $R_{B3}$ | $R_{B3}$ | O |
| $L_{A4669}$ | $R_{B6}$ | $R_{B4}$ | $R_{B4}$ | O |
| $L_{A4670}$ | $R_{B6}$ | $R_{B7}$ | $R_{B7}$ | O |
| $L_{A4671}$ | $R_{B6}$ | $R_{B10}$ | $R_{B10}$ | O |
| $L_{A4672}$ | $R_{B6}$ | $R_{A3}$ | $R_{A3}$ | O |
| $L_{A4673}$ | $R_{B6}$ | $R_{A34}$ | $R_{A34}$ | O |

| Ligand | $R^1$ | $R^{11}$ | $R^{12}$ | X |
|---|---|---|---|---|
| $L_{A4674}$ | $R_{B6}$ | $R_{B1}$ | $R_{B3}$ | O |
| $L_{A4675}$ | $R_{B6}$ | $R_{B1}$ | $R_{B4}$ | O |
| $L_{A4676}$ | $R_{B6}$ | $R_{B1}$ | $R_{B7}$ | O |
| $L_{A4677}$ | $R_{B6}$ | $R_{B1}$ | $R_{B10}$ | O |
| $L_{A4678}$ | $R_{B6}$ | $R_{B1}$ | $R_{A3}$ | O |
| $L_{A4679}$ | $R_{B6}$ | $R_{B1}$ | $R_{A34}$ | O |
| $L_{A4680}$ | $R_{B6}$ | $R_{B3}$ | $R_{B1}$ | O |
| $L_{A4681}$ | $R_{B6}$ | $R_{B3}$ | $R_{B4}$ | O |
| $L_{A4682}$ | $R_{B6}$ | $R_{B3}$ | $R_{B7}$ | O |
| $L_{A4683}$ | $R_{B6}$ | $R_{B3}$ | $R_{B10}$ | O |
| $L_{A4684}$ | $R_{B6}$ | $R_{B3}$ | $R_{A3}$ | O |
| $L_{A4685}$ | $R_{B6}$ | $R_{B3}$ | $R_{A34}$ | O |
| $L_{A4686}$ | $R_{B6}$ | $R_{B4}$ | $R_{B1}$ | O |
| $L_{A4687}$ | $R_{B6}$ | $R_{B4}$ | $R_{B3}$ | O |
| $L_{A4688}$ | $R_{B6}$ | $R_{B4}$ | $R_{B7}$ | O |
| $L_{A4689}$ | $R_{B6}$ | $R_{B4}$ | $R_{B10}$ | O |
| $L_{A4690}$ | $R_{B6}$ | $R_{B4}$ | $R_{A3}$ | O |
| $L_{A4691}$ | $R_{B6}$ | $R_{B4}$ | $R_{A34}$ | O |
| $L_{A4692}$ | $R_{B6}$ | $R_{B7}$ | $R_{B1}$ | O |
| $L_{A4693}$ | $R_{B6}$ | $R_{B7}$ | $R_{B3}$ | O |
| $L_{A4694}$ | $R_{B6}$ | $R_{B7}$ | $R_{B4}$ | O |
| $L_{A4695}$ | $R_{B6}$ | $R_{B7}$ | $R_{B10}$ | O |
| $L_{A4696}$ | $R_{B6}$ | $R_{B7}$ | $R_{A3}$ | O |
| $L_{A4697}$ | $R_{B6}$ | $R_{B7}$ | $R_{A34}$ | O |
| $L_{A4698}$ | $R_{B6}$ | $R_{B10}$ | $R_{B1}$ | O |
| $L_{A4699}$ | $R_{B6}$ | $R_{B10}$ | $R_{B3}$ | O |
| $L_{A4700}$ | $R_{B6}$ | $R_{B10}$ | $R_{B4}$ | O |
| $L_{A4701}$ | $R_{B6}$ | $R_{B10}$ | $R_{B7}$ | O |
| $L_{A4702}$ | $R_{B6}$ | $R_{B10}$ | $R_{A3}$ | O |
| $L_{A4703}$ | $R_{B6}$ | $R_{B10}$ | $R_{A34}$ | O |
| $L_{A4704}$ | $R_{B6}$ | $R_{A3}$ | $R_{B1}$ | O |
| $L_{A4705}$ | $R_{B6}$ | $R_{A3}$ | $R_{B3}$ | O |
| $L_{A4706}$ | $R_{B6}$ | $R_{A3}$ | $R_{B4}$ | O |
| $L_{A4707}$ | $R_{B6}$ | $R_{A3}$ | $R_{B7}$ | O |
| $L_{A4708}$ | $R_{B6}$ | $R_{A3}$ | $R_{B10}$ | O |
| $L_{A4709}$ | $R_{B6}$ | $R_{A3}$ | $R_{A34}$ | O |
| $L_{A4710}$ | $R_{B6}$ | $R_{A34}$ | $R_{B1}$ | O |
| $L_{A4711}$ | $R_{B6}$ | $R_{A34}$ | $R_{B3}$ | O |
| $L_{A4712}$ | $R_{B6}$ | $R_{A34}$ | $R_{B4}$ | O |
| $L_{A4713}$ | $R_{B6}$ | $R_{A34}$ | $R_{B7}$ | O |
| $L_{A4714}$ | $R_{B6}$ | $R_{A34}$ | $R_{B10}$ | O |
| $L_{A4715}$ | $R_{B6}$ | $R_{A34}$ | $R_{A3}$ | O |
| $L_{A4716}$ | $R_{B8}$ | H | H | O |
| $L_{A4717}$ | $R_{B8}$ | $R_{B1}$ | H | O |
| $L_{A4718}$ | $R_{B8}$ | $R_{B3}$ | H | O |
| $L_{A4719}$ | $R_{B8}$ | $R_{B4}$ | H | O |
| $L_{A4720}$ | $R_{B8}$ | $R_{B7}$ | H | O |
| $L_{A4721}$ | $R_{B8}$ | $R_{B10}$ | H | O |
| $L_{A4722}$ | $R_{B8}$ | $R_{A3}$ | H | O |
| $L_{A4723}$ | $R_{B8}$ | $R_{A34}$ | H | O |
| $L_{A4724}$ | $R_{B8}$ | H | $R_{B1}$ | O |
| $L_{A4725}$ | $R_{B8}$ | H | $R_{B2}$ | O |
| $L_{A4726}$ | $R_{B8}$ | H | $R_{B3}$ | O |
| $L_{A4727}$ | $R_{B8}$ | H | $R_{B4}$ | O |
| $L_{A4728}$ | $R_{B8}$ | H | $R_{B7}$ | O |
| $L_{A4729}$ | $R_{B8}$ | H | $R_{B10}$ | O |
| $L_{A4730}$ | $R_{B8}$ | H | $R_{A3}$ | O |
| $L_{A4731}$ | $R_{B8}$ | H | $R_{A34}$ | O |
| $L_{A4732}$ | $R_{B8}$ | $R_{B1}$ | $R_{B1}$ | O |
| $L_{A4733}$ | $R_{B8}$ | $R_{B3}$ | $R_{B3}$ | O |
| $L_{A4734}$ | $R_{B8}$ | $R_{B4}$ | $R_{B4}$ | O |
| $L_{A4735}$ | $R_{B8}$ | $R_{B7}$ | $R_{B7}$ | O |
| $L_{A4736}$ | $R_{B8}$ | $R_{B10}$ | $R_{B10}$ | O |
| $L_{A4737}$ | $R_{B8}$ | $R_{A3}$ | $R_{A3}$ | O |
| $L_{A4738}$ | $R_{B8}$ | $R_{A34}$ | $R_{A34}$ | O |
| $L_{A4739}$ | $R_{B8}$ | $R_{B1}$ | $R_{B3}$ | O |
| $L_{A4740}$ | $R_{B8}$ | $R_{B1}$ | $R_{B4}$ | O |
| $L_{A4741}$ | $R_{B8}$ | $R_{B1}$ | $R_{B7}$ | O |
| $L_{A4742}$ | $R_{B8}$ | $R_{B1}$ | $R_{B10}$ | O |
| $L_{A4743}$ | $R_{B8}$ | $R_{B1}$ | $R_{A3}$ | O |
| $L_{A4744}$ | $R_{B8}$ | $R_{B1}$ | $R_{A34}$ | O |
| $L_{A4745}$ | $R_{B8}$ | $R_{B3}$ | $R_{B1}$ | O |
| $L_{A4746}$ | $R_{B8}$ | $R_{B3}$ | $R_{B4}$ | O |
| $L_{A4747}$ | $R_{B8}$ | $R_{B3}$ | $R_{B7}$ | O |
| $L_{A4748}$ | $R_{B8}$ | $R_{B3}$ | $R_{B10}$ | O |
| $L_{A4749}$ | $R_{B8}$ | $R_{B3}$ | $R_{A3}$ | O |
| $L_{A4750}$ | $R_{B8}$ | $R_{B3}$ | $R_{A34}$ | O |

-continued

| Ligand | $R^1$ | $R^{11}$ | $R^{12}$ | X |
|---|---|---|---|---|
| $L_{A751}$ | $R_{B8}$ | $R_{B4}$ | $R_{B1}$ | O |
| $L_{A752}$ | $R_{B8}$ | $R_{B4}$ | $R_{B3}$ | O |
| $L_{A753}$ | $R_{B8}$ | $R_{B4}$ | $R_{B7}$ | O |
| $L_{A754}$ | $R_{B8}$ | $R_{B4}$ | $R_{B10}$ | O |
| $L_{A755}$ | $R_{B8}$ | $R_{B4}$ | $R_{A3}$ | O |
| $L_{A756}$ | $R_{B8}$ | $R_{B4}$ | $R_{A434}$ | O |
| $L_{A757}$ | $R_{B8}$ | $R_{B7}$ | $R_{B1}$ | O |
| $L_{A758}$ | $R_{B8}$ | $R_{B7}$ | $R_{B3}$ | O |
| $L_{A759}$ | $R_{B8}$ | $R_{B7}$ | $R_{B4}$ | O |
| $L_{A760}$ | $R_{B8}$ | $R_{B7}$ | $R_{B10}$ | O |
| $L_{A761}$ | $R_{B8}$ | $R_{B7}$ | $R_{A3}$ | O |
| $L_{A762}$ | $R_{B8}$ | $R_{B7}$ | $R_{A434}$ | O |
| $L_{A763}$ | $R_{B8}$ | $R_{B10}$ | $R_{B1}$ | O |
| $L_{A764}$ | $R_{B8}$ | $R_{B10}$ | $R_{B3}$ | O |
| $L_{A765}$ | $R_{B8}$ | $R_{B10}$ | $R_{B4}$ | O |
| $L_{A766}$ | $R_{B8}$ | $R_{B10}$ | $R_{B7}$ | O |
| $L_{A767}$ | $R_{B8}$ | $R_{B10}$ | $R_{A3}$ | O |
| $L_{A768}$ | $R_{B8}$ | $R_{B10}$ | $R_{A434}$ | O |
| $L_{A769}$ | $R_{B8}$ | $R_{A3}$ | $R_{B1}$ | O |
| $L_{A770}$ | $R_{B8}$ | $R_{A3}$ | $R_{B3}$ | O |
| $L_{A771}$ | $R_{B8}$ | $R_{A3}$ | $R_{B4}$ | O |
| $L_{A772}$ | $R_{B8}$ | $R_{A3}$ | $R_{B7}$ | O |
| $L_{A773}$ | $R_{B8}$ | $R_{A3}$ | $R_{B10}$ | O |
| $L_{A774}$ | $R_{B8}$ | $R_{A3}$ | $R_{A434}$ | O |
| $L_{A775}$ | $R_{B8}$ | $R_{A434}$ | $R_{B1}$ | O |
| $L_{A776}$ | $R_{B8}$ | $R_{A434}$ | $R_{B3}$ | O |
| $L_{A777}$ | $R_{B8}$ | $R_{A434}$ | $R_{B4}$ | O |
| $L_{A778}$ | $R_{B8}$ | $R_{A434}$ | $R_{B7}$ | O |
| $L_{A779}$ | $R_{B8}$ | $R_{A434}$ | $R_{B10}$ | O |
| $L_{A780}$ | $R_{B8}$ | $R_{A434}$ | $R_{A3}$ | O |

$L_{A781}$ through $L_{A1170}$ that are based on a structure of Formula IV,

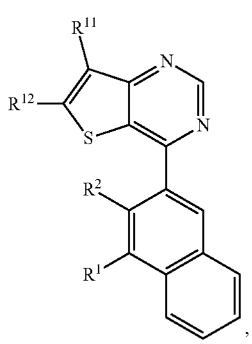

in which $R^1$, $R^2$, $R^{11}$, and $R^{12}$ are defined as provided below:

| Ligand | $R^1$ | $R^2$ | $R^{11}$ | $R^{12}$ |
|---|---|---|---|---|
| $L_{A781}$ | H | F | H | H |
| $L_{A782}$ | H | F | $R_{B1}$ | H |
| $L_{A783}$ | H | F | $R_{B3}$ | H |
| $L_{A784}$ | H | F | $R_{B4}$ | H |
| $L_{A785}$ | H | F | $R_{B7}$ | H |
| $L_{A786}$ | H | F | $R_{B10}$ | H |
| $L_{A787}$ | H | F | $R_{A3}$ | H |
| $L_{A788}$ | H | F | $R_{A434}$ | H |
| $L_{A789}$ | H | F | H | $R_{B1}$ |
| $L_{A790}$ | H | F | H | $R_{B2}$ |
| $L_{A791}$ | H | F | H | $R_{B3}$ |
| $L_{A792}$ | H | F | H | $R_{B4}$ |
| $L_{A793}$ | H | F | H | $R_{B7}$ |
| $L_{A794}$ | H | F | H | $R_{B10}$ |
| $L_{A795}$ | H | F | H | $R_{A3}$ |
| $L_{A796}$ | H | F | H | $R_{A434}$ |
| $L_{A797}$ | H | F | $R_{B1}$ | $R_{B1}$ |
| $L_{A798}$ | H | F | $R_{B3}$ | $R_{B3}$ |
| $L_{A799}$ | H | F | $R_{B4}$ | $R_{B4}$ |
| $L_{A800}$ | H | F | $R_{B7}$ | $R_{B7}$ |
| $L_{A801}$ | H | F | $R_{B10}$ | $R_{B10}$ |
| $L_{A802}$ | H | F | $R_{A3}$ | $R_{A3}$ |
| $L_{A803}$ | H | F | $R_{A434}$ | $R_{A434}$ |
| $L_{A804}$ | H | F | $R_{B1}$ | $R_{B3}$ |
| $L_{A805}$ | H | F | $R_{B1}$ | $R_{B4}$ |
| $L_{A806}$ | H | F | $R_{B1}$ | $R_{B7}$ |
| $L_{A807}$ | H | F | $R_{B1}$ | $R_{B10}$ |
| $L_{A808}$ | H | F | $R_{B1}$ | $R_{A3}$ |
| $L_{A809}$ | H | F | $R_{B1}$ | $R_{A434}$ |
| $L_{A810}$ | H | F | $R_{B3}$ | $R_{B1}$ |
| $L_{A811}$ | H | F | $R_{B3}$ | $R_{B4}$ |
| $L_{A812}$ | H | F | $R_{B3}$ | $R_{B7}$ |
| $L_{A813}$ | H | F | $R_{B3}$ | $R_{B10}$ |
| $L_{A814}$ | H | F | $R_{B3}$ | $R_{A3}$ |
| $L_{A815}$ | H | F | $R_{B3}$ | $R_{A434}$ |
| $L_{A816}$ | H | F | $R_{B4}$ | $R_{B1}$ |
| $L_{A817}$ | H | F | $R_{B4}$ | $R_{B3}$ |
| $L_{A818}$ | H | F | $R_{B4}$ | $R_{B7}$ |
| $L_{A819}$ | H | F | $R_{B4}$ | $R_{B10}$ |
| $L_{A820}$ | H | F | $R_{B4}$ | $R_{A3}$ |
| $L_{A821}$ | H | F | $R_{B4}$ | $R_{A434}$ |
| $L_{A822}$ | H | F | $R_{B7}$ | $R_{B1}$ |
| $L_{A823}$ | H | F | $R_{B7}$ | $R_{B3}$ |
| $L_{A824}$ | H | F | $R_{B7}$ | $R_{B4}$ |
| $L_{A825}$ | H | F | $R_{B7}$ | $R_{B10}$ |
| $L_{A826}$ | H | F | $R_{B7}$ | $R_{A3}$ |
| $L_{A827}$ | H | F | $R_{B7}$ | $R_{A434}$ |
| $L_{A828}$ | H | F | $R_{B10}$ | $R_{B1}$ |
| $L_{A829}$ | H | F | $R_{B10}$ | $R_{B3}$ |
| $L_{A830}$ | H | F | $R_{B10}$ | $R_{B4}$ |
| $L_{A831}$ | H | F | $R_{B10}$ | $R_{B7}$ |
| $L_{A832}$ | H | F | $R_{B10}$ | $R_{A3}$ |
| $L_{A833}$ | H | F | $R_{B10}$ | $R_{A434}$ |
| $L_{A834}$ | H | F | $R_{A3}$ | $R_{B1}$ |
| $L_{A835}$ | H | F | $R_{A3}$ | $R_{B3}$ |
| $L_{A836}$ | H | F | $R_{A3}$ | $R_{B4}$ |
| $L_{A837}$ | H | F | $R_{A3}$ | $R_{B7}$ |
| $L_{A838}$ | H | F | $R_{A3}$ | $R_{B10}$ |
| $L_{A839}$ | H | F | $R_{A3}$ | $R_{A434}$ |
| $L_{A840}$ | H | F | $R_{A434}$ | $R_{B1}$ |
| $L_{A841}$ | H | F | $R_{A434}$ | $R_{B3}$ |
| $L_{A842}$ | H | F | $R_{A434}$ | $R_{B4}$ |
| $L_{A843}$ | H | F | $R_{A434}$ | $R_{B7}$ |
| $L_{A844}$ | H | F | $R_{A434}$ | $R_{B10}$ |
| $L_{A845}$ | H | F | $R_{A434}$ | $R_{A3}$ |
| $L_{A846}$ | H | $R_{B1}$ | H | H |
| $L_{A847}$ | H | $R_{B1}$ | $R_{B1}$ | H |
| $L_{A848}$ | H | $R_{B1}$ | $R_{B3}$ | H |
| $L_{A849}$ | H | $R_{B1}$ | $R_{B4}$ | H |
| $L_{A850}$ | H | $R_{B1}$ | $R_{B7}$ | H |
| $L_{A851}$ | H | $R_{B1}$ | $R_{B10}$ | H |
| $L_{A852}$ | H | $R_{B1}$ | $R_{A3}$ | H |
| $L_{A853}$ | H | $R_{B1}$ | $R_{A434}$ | H |
| $L_{A854}$ | H | $R_{B1}$ | H | $R_{B1}$ |
| $L_{A855}$ | H | $R_{B1}$ | H | $R_{B2}$ |
| $L_{A856}$ | H | $R_{B1}$ | H | $R_{B3}$ |
| $L_{A857}$ | H | $R_{B1}$ | H | $R_{B4}$ |
| $L_{A858}$ | H | $R_{B1}$ | H | $R_{B7}$ |
| $L_{A859}$ | H | $R_{B1}$ | H | $R_{B10}$ |
| $L_{A860}$ | H | $R_{B1}$ | H | $R_{A3}$ |
| $L_{A861}$ | H | $R_{B1}$ | H | $R_{A434}$ |
| $L_{A862}$ | H | $R_{B1}$ | $R_{B1}$ | $R_{B1}$ |
| $L_{A863}$ | H | $R_{B1}$ | $R_{B3}$ | $R_{B3}$ |
| $L_{A864}$ | H | $R_{B1}$ | $R_{B4}$ | $R_{B4}$ |
| $L_{A865}$ | H | $R_{B1}$ | $R_{B7}$ | $R_{B7}$ |
| $L_{A866}$ | H | $R_{B1}$ | $R_{B10}$ | $R_{B10}$ |
| $L_{A867}$ | H | $R_{B1}$ | $R_{A3}$ | $R_{A3}$ |
| $L_{A868}$ | H | $R_{B1}$ | $R_{A434}$ | $R_{A434}$ |
| $L_{A869}$ | H | $R_{B1}$ | $R_{B1}$ | $R_{B3}$ |
| $L_{A870}$ | H | $R_{B1}$ | $R_{B1}$ | $R_{B4}$ |
| $L_{A871}$ | H | $R_{B1}$ | $R_{B1}$ | $R_{B7}$ |
| $L_{A872}$ | H | $R_{B1}$ | $R_{B1}$ | $R_{B10}$ |
| $L_{A873}$ | H | $R_{B1}$ | $R_{B1}$ | $R_{A3}$ |
| $L_{A874}$ | H | $R_{B1}$ | $R_{B1}$ | $R_{A434}$ |
| $L_{A875}$ | H | $R_{B1}$ | $R_{B3}$ | $R_{B1}$ |

-continued

| Ligand | $R^1$ | $R^2$ | $R^{11}$ | $R^{12}$ |
|---|---|---|---|---|
| $L_{A876}$ | H | $R_{B1}$ | $R_{B3}$ | $R_{B4}$ |
| $L_{A877}$ | H | $R_{B1}$ | $R_{B3}$ | $R_{B7}$ |
| $L_{A878}$ | H | $R_{B1}$ | $R_{B3}$ | $R_{B10}$ |
| $L_{A879}$ | H | $R_{B1}$ | $R_{B3}$ | $R_{A3}$ |
| $L_{A880}$ | H | $R_{B1}$ | $R_{B3}$ | $R_{A34}$ |
| $L_{A881}$ | H | $R_{B1}$ | $R_{B4}$ | $R_{B1}$ |
| $L_{A882}$ | H | $R_{B1}$ | $R_{B4}$ | $R_{B3}$ |
| $L_{A883}$ | H | $R_{B1}$ | $R_{B4}$ | $R_{B7}$ |
| $L_{A884}$ | H | $R_{B1}$ | $R_{B4}$ | $R_{B10}$ |
| $L_{A885}$ | H | $R_{B1}$ | $R_{B4}$ | $R_{A3}$ |
| $L_{A886}$ | H | $R_{B1}$ | $R_{B4}$ | $R_{A34}$ |
| $L_{A887}$ | H | $R_{B1}$ | $R_{B7}$ | $R_{B1}$ |
| $L_{A888}$ | H | $R_{B1}$ | $R_{B7}$ | $R_{B3}$ |
| $L_{A889}$ | H | $R_{B1}$ | $R_{B7}$ | $R_{B4}$ |
| $L_{A890}$ | H | $R_{B1}$ | $R_{B7}$ | $R_{B10}$ |
| $L_{A891}$ | H | $R_{B1}$ | $R_{B7}$ | $R_{A3}$ |
| $L_{A892}$ | H | $R_{B1}$ | $R_{B7}$ | $R_{A34}$ |
| $L_{A893}$ | H | $R_{B1}$ | $R_{B10}$ | $R_{B1}$ |
| $L_{A894}$ | H | $R_{B1}$ | $R_{B10}$ | $R_{B3}$ |
| $L_{A895}$ | H | $R_{B1}$ | $R_{B10}$ | $R_{B4}$ |
| $L_{A896}$ | H | $R_{B1}$ | $R_{B10}$ | $R_{B7}$ |
| $L_{A897}$ | H | $R_{B1}$ | $R_{B10}$ | $R_{A3}$ |
| $L_{A898}$ | H | $R_{B1}$ | $R_{B10}$ | $R_{A34}$ |
| $L_{A899}$ | H | $R_{B1}$ | $R_{A3}$ | $R_{B1}$ |
| $L_{A900}$ | H | $R_{B1}$ | $R_{A3}$ | $R_{B3}$ |
| $L_{A901}$ | H | $R_{B1}$ | $R_{A3}$ | $R_{B4}$ |
| $L_{A902}$ | H | $R_{B1}$ | $R_{A3}$ | $R_{B7}$ |
| $L_{A903}$ | H | $R_{B1}$ | $R_{A3}$ | $R_{B10}$ |
| $L_{A904}$ | H | $R_{B1}$ | $R_{A3}$ | $R_{A34}$ |
| $L_{A905}$ | H | $R_{B1}$ | $R_{A34}$ | $R_{B1}$ |
| $L_{A906}$ | H | $R_{B1}$ | $R_{A34}$ | $R_{B3}$ |
| $L_{A907}$ | H | $R_{B1}$ | $R_{A34}$ | $R_{B4}$ |
| $L_{A908}$ | H | $R_{B1}$ | $R_{A34}$ | $R_{B7}$ |
| $L_{A909}$ | H | $R_{B1}$ | $R_{A34}$ | $R_{B10}$ |
| $L_{A910}$ | H | $R_{B1}$ | $R_{A34}$ | $R_{A3}$ |
| $L_{A911}$ | $R_{B1}$ | F | H | H |
| $L_{A912}$ | $R_{B1}$ | F | $R_{B1}$ | H |
| $L_{A913}$ | $R_{B1}$ | F | $R_{B3}$ | H |
| $L_{A914}$ | $R_{B1}$ | F | $R_{B4}$ | H |
| $L_{A915}$ | $R_{B1}$ | F | $R_{B7}$ | H |
| $L_{A916}$ | $R_{B1}$ | F | $R_{B10}$ | H |
| $L_{A917}$ | $R_{B1}$ | F | $R_{A3}$ | H |
| $L_{A918}$ | $R_{B1}$ | F | $R_{A34}$ | H |
| $L_{A919}$ | $R_{B1}$ | F | H | $R_{B1}$ |
| $L_{A920}$ | $R_{B1}$ | F | H | $R_{B2}$ |
| $L_{A921}$ | $R_{B1}$ | F | H | $R_{B3}$ |
| $L_{A922}$ | $R_{B1}$ | F | H | $R_{B4}$ |
| $L_{A923}$ | $R_{B1}$ | F | H | $R_{B7}$ |
| $L_{A924}$ | $R_{B1}$ | F | H | $R_{B10}$ |
| $L_{A925}$ | $R_{B1}$ | F | H | $R_{A3}$ |
| $L_{A926}$ | $R_{B1}$ | F | H | $R_{A34}$ |
| $L_{A927}$ | $R_{B1}$ | F | $R_{B1}$ | $R_{B1}$ |
| $L_{A928}$ | $R_{B1}$ | F | $R_{B3}$ | $R_{B3}$ |
| $L_{A929}$ | $R_{B1}$ | F | $R_{B4}$ | $R_{B4}$ |
| $L_{A930}$ | $R_{B1}$ | F | $R_{B7}$ | $R_{B7}$ |
| $L_{A931}$ | $R_{B1}$ | F | $R_{B10}$ | $R_{B10}$ |
| $L_{A932}$ | $R_{B1}$ | F | $R_{A3}$ | $R_{A3}$ |
| $L_{A933}$ | $R_{B1}$ | F | $R_{A34}$ | $R_{A34}$ |
| $L_{A934}$ | $R_{B1}$ | F | $R_{B1}$ | $R_{B3}$ |
| $L_{A935}$ | $R_{B1}$ | F | $R_{B1}$ | $R_{B4}$ |
| $L_{A936}$ | $R_{B1}$ | F | $R_{B1}$ | $R_{B7}$ |
| $L_{A937}$ | $R_{B1}$ | F | $R_{B1}$ | $R_{B10}$ |
| $L_{A938}$ | $R_{B1}$ | F | $R_{B1}$ | $R_{A3}$ |
| $L_{A939}$ | $R_{B1}$ | F | $R_{B1}$ | $R_{A34}$ |
| $L_{A940}$ | $R_{B1}$ | F | $R_{B3}$ | $R_{B1}$ |
| $L_{A941}$ | $R_{B1}$ | F | $R_{B3}$ | $R_{B4}$ |
| $L_{A942}$ | $R_{B1}$ | F | $R_{B3}$ | $R_{B7}$ |
| $L_{A943}$ | $R_{B1}$ | F | $R_{B3}$ | $R_{B10}$ |
| $L_{A944}$ | $R_{B1}$ | F | $R_{B3}$ | $R_{A3}$ |
| $L_{A945}$ | $R_{B1}$ | F | $R_{B3}$ | $R_{A34}$ |
| $L_{A946}$ | $R_{B1}$ | F | $R_{B4}$ | $R_{B1}$ |
| $L_{A947}$ | $R_{B1}$ | F | $R_{B4}$ | $R_{B3}$ |
| $L_{A948}$ | $R_{B1}$ | F | $R_{B4}$ | $R_{B7}$ |
| $L_{A949}$ | $R_{B1}$ | F | $R_{B4}$ | $R_{B10}$ |
| $L_{A950}$ | $R_{B1}$ | F | $R_{B4}$ | $R_{A3}$ |
| $L_{A951}$ | $R_{B1}$ | F | $R_{B4}$ | $R_{A34}$ |
| $L_{A952}$ | $R_{B1}$ | F | $R_{B7}$ | $R_{B1}$ |

-continued

| Ligand | $R^1$ | $R^2$ | $R^{11}$ | $R^{12}$ |
|---|---|---|---|---|
| $L_{A953}$ | $R_{B1}$ | F | $R_{B7}$ | $R_{B3}$ |
| $L_{A954}$ | $R_{B1}$ | F | $R_{B7}$ | $R_{B4}$ |
| $L_{A955}$ | $R_{B1}$ | F | $R_{B7}$ | $R_{B10}$ |
| $L_{A956}$ | $R_{B1}$ | F | $R_{B7}$ | $R_{A3}$ |
| $L_{A957}$ | $R_{B1}$ | F | $R_{B7}$ | $R_{A34}$ |
| $L_{A958}$ | $R_{B1}$ | F | $R_{B10}$ | $R_{B1}$ |
| $L_{A959}$ | $R_{B1}$ | F | $R_{B10}$ | $R_{B3}$ |
| $L_{A960}$ | $R_{B1}$ | F | $R_{B10}$ | $R_{B4}$ |
| $L_{A961}$ | $R_{B1}$ | F | $R_{B10}$ | $R_{B7}$ |
| $L_{A962}$ | $R_{B1}$ | F | $R_{B10}$ | $R_{A3}$ |
| $L_{A963}$ | $R_{B1}$ | F | $R_{B10}$ | $R_{A34}$ |
| $L_{A964}$ | $R_{B1}$ | F | $R_{A3}$ | $R_{B1}$ |
| $L_{A965}$ | $R_{B1}$ | F | $R_{A3}$ | $R_{B3}$ |
| $L_{A966}$ | $R_{B1}$ | F | $R_{A3}$ | $R_{B4}$ |
| $L_{A967}$ | $R_{B1}$ | F | $R_{A3}$ | $R_{B7}$ |
| $L_{A968}$ | $R_{B1}$ | F | $R_{A3}$ | $R_{B10}$ |
| $L_{A969}$ | $R_{B1}$ | F | $R_{A3}$ | $R_{A34}$ |
| $L_{A970}$ | $R_{B1}$ | F | $R_{A34}$ | $R_{B1}$ |
| $L_{A971}$ | $R_{B1}$ | F | $R_{A34}$ | $R_{B3}$ |
| $L_{A972}$ | $R_{B1}$ | F | $R_{A34}$ | $R_{B4}$ |
| $L_{A973}$ | $R_{B1}$ | F | $R_{A34}$ | $R_{B7}$ |
| $L_{A974}$ | $R_{B1}$ | F | $R_{A34}$ | $R_{B10}$ |
| $L_{A975}$ | $R_{B1}$ | F | $R_{A34}$ | $R_{A3}$ |
| $L_{A976}$ | $R_{B6}$ | F | H | H |
| $L_{A977}$ | $R_{B6}$ | F | $R_{B1}$ | H |
| $L_{A978}$ | $R_{B6}$ | F | $R_{B3}$ | H |
| $L_{A979}$ | $R_{B6}$ | F | $R_{B4}$ | H |
| $L_{A980}$ | $R_{B6}$ | F | $R_{B7}$ | H |
| $L_{A981}$ | $R_{B6}$ | F | $R_{B10}$ | H |
| $L_{A982}$ | $R_{B6}$ | F | $R_{A3}$ | H |
| $L_{A983}$ | $R_{B6}$ | F | $R_{A34}$ | H |
| $L_{A984}$ | $R_{B6}$ | F | H | $R_{B1}$ |
| $L_{A985}$ | $R_{B6}$ | F | H | $R_{B2}$ |
| $L_{A986}$ | $R_{B6}$ | F | H | $R_{B3}$ |
| $L_{A987}$ | $R_{B6}$ | F | H | $R_{B4}$ |
| $L_{A988}$ | $R_{B6}$ | F | H | $R_{B7}$ |
| $L_{A989}$ | $R_{B6}$ | F | H | $R_{B10}$ |
| $L_{A990}$ | $R_{B6}$ | F | H | $R_{A3}$ |
| $L_{A991}$ | $R_{B6}$ | F | H | $R_{A34}$ |
| $L_{A992}$ | $R_{B6}$ | F | $R_{B1}$ | $R_{B1}$ |
| $L_{A993}$ | $R_{B6}$ | F | $R_{B3}$ | $R_{B3}$ |
| $L_{A994}$ | $R_{B6}$ | F | $R_{B4}$ | $R_{B4}$ |
| $L_{A995}$ | $R_{B6}$ | F | $R_{B7}$ | $R_{B7}$ |
| $L_{A996}$ | $R_{B6}$ | F | $R_{B10}$ | $R_{B10}$ |
| $L_{A997}$ | $R_{B6}$ | F | $R_{A3}$ | $R_{A3}$ |
| $L_{A998}$ | $R_{B6}$ | F | $R_{A34}$ | $R_{A34}$ |
| $L_{A999}$ | $R_{B6}$ | F | $R_{B1}$ | $R_{B3}$ |
| $L_{A1000}$ | $R_{B6}$ | F | $R_{B1}$ | $R_{B4}$ |
| $L_{A1001}$ | $R_{B6}$ | F | $R_{B1}$ | $R_{B7}$ |
| $L_{A1002}$ | $R_{B6}$ | F | $R_{B1}$ | $R_{B10}$ |
| $L_{A1003}$ | $R_{B6}$ | F | $R_{B1}$ | $R_{A3}$ |
| $L_{A1004}$ | $R_{B6}$ | F | $R_{B1}$ | $R_{A34}$ |
| $L_{A1005}$ | $R_{B6}$ | F | $R_{B3}$ | $R_{B1}$ |
| $L_{A1006}$ | $R_{B6}$ | F | $R_{B3}$ | $R_{B4}$ |
| $L_{A1007}$ | $R_{B6}$ | F | $R_{B3}$ | $R_{B7}$ |
| $L_{A1008}$ | $R_{B6}$ | F | $R_{B3}$ | $R_{B10}$ |
| $L_{A1009}$ | $R_{B6}$ | F | $R_{B3}$ | $R_{A3}$ |
| $L_{A1010}$ | $R_{B6}$ | F | $R_{B3}$ | $R_{A34}$ |
| $L_{A1011}$ | $R_{B6}$ | F | $R_{B4}$ | $R_{B1}$ |
| $L_{A1012}$ | $R_{B6}$ | F | $R_{B4}$ | $R_{B3}$ |
| $L_{A1013}$ | $R_{B6}$ | F | $R_{B4}$ | $R_{B7}$ |
| $L_{A1014}$ | $R_{B6}$ | F | $R_{B4}$ | $R_{B10}$ |
| $L_{A1015}$ | $R_{B6}$ | F | $R_{B4}$ | $R_{A3}$ |
| $L_{A1016}$ | $R_{B6}$ | F | $R_{B4}$ | $R_{A34}$ |
| $L_{A1017}$ | $R_{B6}$ | F | $R_{B7}$ | $R_{B1}$ |
| $L_{A1018}$ | $R_{B6}$ | F | $R_{B7}$ | $R_{B3}$ |
| $L_{A1019}$ | $R_{B6}$ | F | $R_{B7}$ | $R_{B4}$ |
| $L_{A1020}$ | $R_{B6}$ | F | $R_{B7}$ | $R_{B10}$ |
| $L_{A1021}$ | $R_{B6}$ | F | $R_{B7}$ | $R_{A3}$ |
| $L_{A1022}$ | $R_{B6}$ | F | $R_{B7}$ | $R_{A34}$ |
| $L_{A1023}$ | $R_{B6}$ | F | $R_{B10}$ | $R_{B1}$ |
| $L_{A1024}$ | $R_{B6}$ | F | $R_{B10}$ | $R_{B3}$ |
| $L_{A1025}$ | $R_{B6}$ | F | $R_{B10}$ | $R_{B4}$ |
| $L_{A1026}$ | $R_{B6}$ | F | $R_{B10}$ | $R_{B7}$ |
| $L_{A1027}$ | $R_{B6}$ | F | $R_{B10}$ | $R_{A3}$ |
| $L_{A1028}$ | $R_{B6}$ | F | $R_{B10}$ | $R_{A34}$ |
| $L_{A1029}$ | $R_{B6}$ | F | $R_{A3}$ | $R_{B1}$ |

-continued

| Ligand | $R^1$ | $R^2$ | $R^{11}$ | $R^{12}$ |
|---|---|---|---|---|
| $L_{A1030}$ | $R_{B6}$ | F | $R_{A3}$ | $R_{B3}$ |
| $L_{A1031}$ | $R_{B6}$ | F | $R_{A3}$ | $R_{B4}$ |
| $L_{A1032}$ | $R_{B6}$ | F | $R_{A3}$ | $R_{B7}$ |
| $L_{A1033}$ | $R_{B6}$ | F | $R_{A3}$ | $R_{B10}$ |
| $L_{A1034}$ | $R_{B6}$ | F | $R_{A3}$ | $R_{A34}$ |
| $L_{A1035}$ | $R_{B6}$ | F | $R_{A34}$ | $R_{B1}$ |
| $L_{A1036}$ | $R_{B6}$ | F | $R_{A34}$ | $R_{B3}$ |
| $L_{A1037}$ | $R_{B6}$ | F | $R_{A34}$ | $R_{B4}$ |
| $L_{A1038}$ | $R_{B6}$ | F | $R_{A34}$ | $R_{B7}$ |
| $L_{A1039}$ | $R_{B6}$ | F | $R_{A34}$ | $R_{B10}$ |
| $L_{A1040}$ | $R_{B6}$ | F | $R_{A34}$ | $R_{A3}$ |
| $L_{A1041}$ | $R_{B1}$ | $R_{B1}$ | H | H |
| $L_{A1042}$ | $R_{B1}$ | $R_{B1}$ | $R_{B1}$ | H |
| $L_{A1043}$ | $R_{B1}$ | $R_{B1}$ | $R_{B3}$ | H |
| $L_{A1044}$ | $R_{B1}$ | $R_{B1}$ | $R_{B4}$ | H |
| $L_{A1045}$ | $R_{B1}$ | $R_{B1}$ | $R_{B7}$ | H |
| $L_{A1046}$ | $R_{B1}$ | $R_{B1}$ | $R_{B10}$ | H |
| $L_{A1047}$ | $R_{B1}$ | $R_{B1}$ | $R_{A3}$ | H |
| $L_{A1048}$ | $R_{B1}$ | $R_{B1}$ | $R_{A34}$ | H |
| $L_{A1049}$ | $R_{B1}$ | $R_{B1}$ | H | $R_{B1}$ |
| $L_{A1050}$ | $R_{B1}$ | $R_{B1}$ | H | $R_{B2}$ |
| $L_{A1051}$ | $R_{B1}$ | $R_{B1}$ | H | $R_{B3}$ |
| $L_{A1052}$ | $R_{B1}$ | $R_{B1}$ | H | $R_{B4}$ |
| $L_{A1053}$ | $R_{B1}$ | $R_{B1}$ | H | $R_{B7}$ |
| $L_{A1054}$ | $R_{B1}$ | $R_{B1}$ | H | $R_{B10}$ |
| $L_{A1055}$ | $R_{B1}$ | $R_{B1}$ | H | $R_{A3}$ |
| $L_{A1056}$ | $R_{B1}$ | $R_{B1}$ | H | $R_{A34}$ |
| $L_{A1057}$ | $R_{B1}$ | $R_{B1}$ | $R_{B1}$ | $R_{B1}$ |
| $L_{A1058}$ | $R_{B1}$ | $R_{B1}$ | $R_{B3}$ | $R_{B3}$ |
| $L_{A1059}$ | $R_{B1}$ | $R_{B1}$ | $R_{B4}$ | $R_{B4}$ |
| $L_{A1060}$ | $R_{B1}$ | $R_{B1}$ | $R_{B7}$ | $R_{B7}$ |
| $L_{A1061}$ | $R_{B1}$ | $R_{B1}$ | $R_{B10}$ | $R_{B10}$ |
| $L_{A1062}$ | $R_{B1}$ | $R_{B1}$ | $R_{A3}$ | $R_{A3}$ |
| $L_{A1063}$ | $R_{B1}$ | $R_{B1}$ | $R_{A34}$ | $R_{A34}$ |
| $L_{A1064}$ | $R_{B1}$ | $R_{B1}$ | $R_{B1}$ | $R_{B3}$ |
| $L_{A1065}$ | $R_{B1}$ | $R_{B1}$ | $R_{B1}$ | $R_{B4}$ |
| $L_{A1066}$ | $R_{B1}$ | $R_{B1}$ | $R_{B1}$ | $R_{B7}$ |
| $L_{A1067}$ | $R_{B1}$ | $R_{B1}$ | $R_{B1}$ | $R_{B10}$ |
| $L_{A1068}$ | $R_{B1}$ | $R_{B1}$ | $R_{B1}$ | $R_{A3}$ |
| $L_{A1069}$ | $R_{B1}$ | $R_{B1}$ | $R_{B1}$ | $R_{A34}$ |
| $L_{A1070}$ | $R_{B1}$ | $R_{B1}$ | $R_{B3}$ | $R_{B1}$ |
| $L_{A1071}$ | $R_{B1}$ | $R_{B1}$ | $R_{B3}$ | $R_{B4}$ |
| $L_{A1072}$ | $R_{B1}$ | $R_{B1}$ | $R_{B3}$ | $R_{B7}$ |
| $L_{A1073}$ | $R_{B1}$ | $R_{B1}$ | $R_{B3}$ | $R_{B10}$ |
| $L_{A1074}$ | $R_{B1}$ | $R_{B1}$ | $R_{B3}$ | $R_{A3}$ |
| $L_{A1075}$ | $R_{B1}$ | $R_{B1}$ | $R_{B3}$ | $R_{A34}$ |
| $L_{A1076}$ | $R_{B1}$ | $R_{B1}$ | $R_{B4}$ | $R_{B1}$ |
| $L_{A1077}$ | $R_{B1}$ | $R_{B1}$ | $R_{B4}$ | $R_{B3}$ |
| $L_{A1078}$ | $R_{B1}$ | $R_{B1}$ | $R_{B4}$ | $R_{B7}$ |
| $L_{A1079}$ | $R_{B1}$ | $R_{B1}$ | $R_{B4}$ | $R_{B10}$ |
| $L_{A1080}$ | $R_{B1}$ | $R_{B1}$ | $R_{B4}$ | $R_{A3}$ |
| $L_{A1081}$ | $R_{B1}$ | $R_{B1}$ | $R_{B4}$ | $R_{A34}$ |
| $L_{A1082}$ | $R_{B1}$ | $R_{B1}$ | $R_{B7}$ | $R_{B1}$ |
| $L_{A1083}$ | $R_{B1}$ | $R_{B1}$ | $R_{B7}$ | $R_{B3}$ |
| $L_{A1084}$ | $R_{B1}$ | $R_{B1}$ | $R_{B7}$ | $R_{B4}$ |
| $L_{A1085}$ | $R_{B1}$ | $R_{B1}$ | $R_{B7}$ | $R_{B10}$ |
| $L_{A1086}$ | $R_{B1}$ | $R_{B1}$ | $R_{B7}$ | $R_{A3}$ |
| $L_{A1087}$ | $R_{B1}$ | $R_{B1}$ | $R_{B7}$ | $R_{A34}$ |
| $L_{A1088}$ | $R_{B1}$ | $R_{B1}$ | $R_{B10}$ | $R_{B1}$ |
| $L_{A1089}$ | $R_{B1}$ | $R_{B1}$ | $R_{B10}$ | $R_{B3}$ |
| $L_{A1090}$ | $R_{B1}$ | $R_{B1}$ | $R_{B10}$ | $R_{B4}$ |
| $L_{A1091}$ | $R_{B1}$ | $R_{B1}$ | $R_{B10}$ | $R_{B7}$ |
| $L_{A1092}$ | $R_{B1}$ | $R_{B1}$ | $R_{B10}$ | $R_{A3}$ |
| $L_{A1093}$ | $R_{B1}$ | $R_{B1}$ | $R_{B10}$ | $R_{A34}$ |
| $L_{A1094}$ | $R_{B1}$ | $R_{B1}$ | $R_{A3}$ | $R_{B1}$ |
| $L_{A1095}$ | $R_{B1}$ | $R_{B1}$ | $R_{A3}$ | $R_{B3}$ |
| $L_{A1096}$ | $R_{B1}$ | $R_{B1}$ | $R_{A3}$ | $R_{B4}$ |
| $L_{A1097}$ | $R_{B1}$ | $R_{B1}$ | $R_{A3}$ | $R_{B7}$ |
| $L_{A1098}$ | $R_{B1}$ | $R_{B1}$ | $R_{A3}$ | $R_{B10}$ |
| $L_{A1099}$ | $R_{B1}$ | $R_{B1}$ | $R_{A3}$ | $R_{A34}$ |
| $L_{A1100}$ | $R_{B1}$ | $R_{B1}$ | $R_{A34}$ | $R_{B1}$ |
| $L_{A1101}$ | $R_{B1}$ | $R_{B1}$ | $R_{A34}$ | $R_{B3}$ |
| $L_{A1102}$ | $R_{B1}$ | $R_{B1}$ | $R_{A34}$ | $R_{B4}$ |
| $L_{A1103}$ | $R_{B1}$ | $R_{B1}$ | $R_{A34}$ | $R_{B7}$ |
| $L_{A1104}$ | $R_{B1}$ | $R_{B1}$ | $R_{A34}$ | $R_{B10}$ |
| $L_{A1105}$ | $R_{B1}$ | $R_{B1}$ | $R_{A34}$ | $R_{A3}$ |
| $L_{A1106}$ | $R_{B6}$ | $R_{B1}$ | H | H |

-continued

| Ligand | $R^1$ | $R^2$ | $R^{11}$ | $R^{12}$ |
|---|---|---|---|---|
| $L_{A1107}$ | $R_{B6}$ | $R_{B1}$ | $R_{B1}$ | H |
| $L_{A1108}$ | $R_{B6}$ | $R_{B1}$ | $R_{B3}$ | H |
| $L_{A1109}$ | $R_{B6}$ | $R_{B1}$ | $R_{B4}$ | H |
| $L_{A1110}$ | $R_{B6}$ | $R_{B1}$ | $R_{B7}$ | H |
| $L_{A1111}$ | $R_{B6}$ | $R_{B1}$ | $R_{B10}$ | H |
| $L_{A1112}$ | $R_{B6}$ | $R_{B1}$ | $R_{A3}$ | H |
| $L_{A1113}$ | $R_{B6}$ | $R_{B1}$ | $R_{A34}$ | H |
| $L_{A1114}$ | $R_{B6}$ | $R_{B1}$ | H | $R_{B1}$ |
| $L_{A1115}$ | $R_{B6}$ | $R_{B1}$ | H | $R_{B2}$ |
| $L_{A1116}$ | $R_{B6}$ | $R_{B1}$ | H | $R_{B3}$ |
| $L_{A1117}$ | $R_{B6}$ | $R_{B1}$ | H | $R_{B4}$ |
| $L_{A1118}$ | $R_{B6}$ | $R_{B1}$ | H | $R_{B7}$ |
| $L_{A1119}$ | $R_{B6}$ | $R_{B1}$ | H | $R_{B10}$ |
| $L_{A1120}$ | $R_{B6}$ | $R_{B1}$ | H | $R_{A3}$ |
| $L_{A1121}$ | $R_{B6}$ | $R_{B1}$ | H | $R_{A34}$ |
| $L_{A1122}$ | $R_{B6}$ | $R_{B1}$ | $R_{B1}$ | $R_{B1}$ |
| $L_{A1123}$ | $R_{B6}$ | $R_{B1}$ | $R_{B3}$ | $R_{B3}$ |
| $L_{A1124}$ | $R_{B6}$ | $R_{B1}$ | $R_{B4}$ | $R_{B4}$ |
| $L_{A1125}$ | $R_{B6}$ | $R_{B1}$ | $R_{B7}$ | $R_{B7}$ |
| $L_{A1126}$ | $R_{B6}$ | $R_{B1}$ | $R_{B10}$ | $R_{B10}$ |
| $L_{A1127}$ | $R_{B6}$ | $R_{B1}$ | $R_{A3}$ | $R_{A3}$ |
| $L_{A1128}$ | $R_{B6}$ | $R_{B1}$ | $R_{A34}$ | $R_{A34}$ |
| $L_{A1129}$ | $R_{B6}$ | $R_{B1}$ | $R_{B1}$ | $R_{B3}$ |
| $L_{A1130}$ | $R_{B6}$ | $R_{B1}$ | $R_{B1}$ | $R_{B4}$ |
| $L_{A1131}$ | $R_{B6}$ | $R_{B1}$ | $R_{B1}$ | $R_{B7}$ |
| $L_{A1132}$ | $R_{B6}$ | $R_{B1}$ | $R_{B1}$ | $R_{B10}$ |
| $L_{A1133}$ | $R_{B6}$ | $R_{B1}$ | $R_{B1}$ | $R_{A3}$ |
| $L_{A1134}$ | $R_{B6}$ | $R_{B1}$ | $R_{B1}$ | $R_{A34}$ |
| $L_{A1135}$ | $R_{B6}$ | $R_{B1}$ | $R_{B3}$ | $R_{B1}$ |
| $L_{A1136}$ | $R_{B6}$ | $R_{B1}$ | $R_{B3}$ | $R_{B4}$ |
| $L_{A1137}$ | $R_{B6}$ | $R_{B1}$ | $R_{B3}$ | $R_{B7}$ |
| $L_{A1138}$ | $R_{B6}$ | $R_{B1}$ | $R_{B3}$ | $R_{B10}$ |
| $L_{A1139}$ | $R_{B6}$ | $R_{B1}$ | $R_{B3}$ | $R_{A3}$ |
| $L_{A1140}$ | $R_{B6}$ | $R_{B1}$ | $R_{B3}$ | $R_{A34}$ |
| $L_{A1141}$ | $R_{B6}$ | $R_{B1}$ | $R_{B4}$ | $R_{B1}$ |
| $L_{A1142}$ | $R_{B6}$ | $R_{B1}$ | $R_{B4}$ | $R_{B3}$ |
| $L_{A1143}$ | $R_{B6}$ | $R_{B1}$ | $R_{B4}$ | $R_{B7}$ |
| $L_{A1144}$ | $R_{B6}$ | $R_{B1}$ | $R_{B4}$ | $R_{B10}$ |
| $L_{A1145}$ | $R_{B6}$ | $R_{B1}$ | $R_{B4}$ | $R_{A3}$ |
| $L_{A1146}$ | $R_{B6}$ | $R_{B1}$ | $R_{B4}$ | $R_{A34}$ |
| $L_{A1147}$ | $R_{B6}$ | $R_{B1}$ | $R_{B7}$ | $R_{B1}$ |
| $L_{A1148}$ | $R_{B6}$ | $R_{B1}$ | $R_{B7}$ | $R_{B3}$ |
| $L_{A1149}$ | $R_{B6}$ | $R_{B1}$ | $R_{B7}$ | $R_{B4}$ |
| $L_{A1150}$ | $R_{B6}$ | $R_{B1}$ | $R_{B7}$ | $R_{B10}$ |
| $L_{A1151}$ | $R_{B6}$ | $R_{B1}$ | $R_{B7}$ | $R_{A3}$ |
| $L_{A1152}$ | $R_{B6}$ | $R_{B1}$ | $R_{B7}$ | $R_{A34}$ |
| $L_{A1153}$ | $R_{B6}$ | $R_{B1}$ | $R_{B10}$ | $R_{B1}$ |
| $L_{A1154}$ | $R_{B6}$ | $R_{B1}$ | $R_{B10}$ | $R_{B3}$ |
| $L_{A1155}$ | $R_{B6}$ | $R_{B1}$ | $R_{B10}$ | $R_{B4}$ |
| $L_{A1156}$ | $R_{B6}$ | $R_{B1}$ | $R_{B10}$ | $R_{B7}$ |
| $L_{A1157}$ | $R_{B6}$ | $R_{B1}$ | $R_{B10}$ | $R_{A3}$ |
| $L_{A1158}$ | $R_{B6}$ | $R_{B1}$ | $R_{B10}$ | $R_{A34}$ |
| $L_{A1159}$ | $R_{B6}$ | $R_{B1}$ | $R_{A3}$ | $R_{B1}$ |
| $L_{A1160}$ | $R_{B6}$ | $R_{B1}$ | $R_{A3}$ | $R_{B3}$ |
| $L_{A1161}$ | $R_{B6}$ | $R_{B1}$ | $R_{A3}$ | $R_{B4}$ |
| $L_{A1162}$ | $R_{B6}$ | $R_{B1}$ | $R_{A3}$ | $R_{B7}$ |
| $L_{A1163}$ | $R_{B6}$ | $R_{B1}$ | $R_{A3}$ | $R_{B10}$ |
| $L_{A1164}$ | $R_{B6}$ | $R_{B1}$ | $R_{A3}$ | $R_{A34}$ |
| $L_{A1165}$ | $R_{B6}$ | $R_{B1}$ | $R_{A34}$ | $R_{B1}$ |
| $L_{A1166}$ | $R_{B6}$ | $R_{B1}$ | $R_{A34}$ | $R_{B3}$ |
| $L_{A1167}$ | $R_{B6}$ | $R_{B1}$ | $R_{A34}$ | $R_{B4}$ |
| $L_{A1168}$ | $R_{B6}$ | $R_{B1}$ | $R_{A34}$ | $R_{B7}$ |
| $L_{A1169}$ | $R_{B6}$ | $R_{B1}$ | $R_{A34}$ | $R_{B10}$ |
| $L_{A1170}$ | $R_{B6}$ | $R_{B1}$ | $R_{A34}$ | $R_{A3}$ |

$L_{A1171}$ through $L_{A1266}$ that are based on a structure of Formula V,

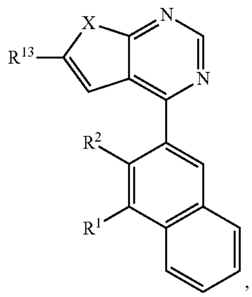

in which $R^1$, $R^2$, $R^{13}$, and X are defined as provided below:

| Ligand | $R^1$ | $R^2$ | $R^{13}$ | X |
|---|---|---|---|---|
| $L_{A1171}$ | $R_{B6}$ | H | H | S |
| $L_{A1172}$ | $R_{B6}$ | H | $R_{B1}$ | S |
| $L_{A1173}$ | $R_{B6}$ | H | $R_{B3}$ | S |
| $L_{A1174}$ | $R_{B6}$ | H | $R_{B4}$ | S |
| $L_{A1175}$ | $R_{B6}$ | H | $R_{B7}$ | S |
| $L_{A1176}$ | $R_{B6}$ | H | $R_{B10}$ | S |
| $L_{A1177}$ | $R_{B6}$ | H | $R_{A3}$ | S |
| $L_{A1178}$ | $R_{B6}$ | H | $R_{A34}$ | S |
| $L_{A1179}$ | $R_{B8}$ | H | $R_{B1}$ | S |
| $L_{A1180}$ | $R_{B8}$ | H | $R_{B2}$ | S |
| $L_{A1181}$ | $R_{B8}$ | H | $R_{B3}$ | S |
| $L_{A1182}$ | $R_{B8}$ | H | $R_{B4}$ | S |
| $L_{A1183}$ | $R_{B8}$ | H | $R_{B7}$ | S |
| $L_{A1184}$ | $R_{B8}$ | H | $R_{B10}$ | S |
| $L_{A1185}$ | $R_{B8}$ | H | $R_{A3}$ | S |
| $L_{A1186}$ | $R_{B8}$ | H | $R_{A34}$ | S |
| $L_{A1187}$ | $R_{B6}$ | F | H | S |
| $L_{A1188}$ | $R_{B6}$ | F | $R_{B1}$ | S |
| $L_{A1189}$ | $R_{B6}$ | F | $R_{B3}$ | S |
| $L_{A1190}$ | $R_{B6}$ | F | $R_{B4}$ | S |
| $L_{A1191}$ | $R_{B6}$ | F | $R_{B7}$ | S |
| $L_{A1192}$ | $R_{B6}$ | F | $R_{B10}$ | S |
| $L_{A1193}$ | $R_{B6}$ | F | $R_{A3}$ | S |
| $L_{A1194}$ | $R_{B6}$ | F | $R_{A34}$ | S |
| $L_{A1195}$ | $R_{B8}$ | F | $R_{B1}$ | S |
| $L_{A1196}$ | $R_{B8}$ | F | $R_{B2}$ | S |
| $L_{A1197}$ | $R_{B8}$ | F | $R_{B3}$ | S |
| $L_{A1198}$ | $R_{B8}$ | F | $R_{B4}$ | S |
| $L_{A1199}$ | $R_{B8}$ | F | $R_{B7}$ | S |
| $L_{A1200}$ | $R_{B8}$ | F | $R_{B10}$ | S |
| $L_{A1201}$ | $R_{B8}$ | F | $R_{A3}$ | S |
| $L_{A1202}$ | $R_{B8}$ | F | $R_{A34}$ | S |
| $L_{A1203}$ | $R_{B6}$ | $R_{B1}$ | H | S |
| $L_{A1204}$ | $R_{B6}$ | $R_{B1}$ | $R_{B1}$ | S |
| $L_{A1205}$ | $R_{B6}$ | $R_{B1}$ | $R_{B3}$ | S |
| $L_{A1206}$ | $R_{B6}$ | $R_{B1}$ | $R_{B4}$ | S |
| $L_{A1207}$ | $R_{B6}$ | $R_{B1}$ | $R_{B7}$ | S |
| $L_{A1208}$ | $R_{B6}$ | $R_{B1}$ | $R_{B10}$ | S |
| $L_{A1209}$ | $R_{B6}$ | $R_{B1}$ | $R_{A3}$ | S |
| $L_{A1210}$ | $R_{B6}$ | $R_{B1}$ | $R_{A34}$ | S |
| $L_{A1211}$ | $R_{B8}$ | $R_{B1}$ | $R_{B1}$ | S |
| $L_{A1212}$ | $R_{B8}$ | $R_{B1}$ | $R_{B2}$ | S |
| $L_{A1213}$ | $R_{B8}$ | $R_{B1}$ | $R_{B3}$ | S |
| $L_{A1214}$ | $R_{B8}$ | $R_{B1}$ | $R_{B4}$ | S |
| $L_{A1215}$ | $R_{B8}$ | $R_{B1}$ | $R_{B7}$ | S |
| $L_{A1216}$ | $R_{B8}$ | $R_{B1}$ | $R_{B10}$ | S |
| $L_{A1217}$ | $R_{B8}$ | $R_{B1}$ | $R_{A3}$ | S |
| $L_{A1218}$ | $R_{B8}$ | $R_{B1}$ | $R_{A34}$ | S |
| $L_{A1219}$ | $R_{B6}$ | H | H | O |
| $L_{A1220}$ | $R_{B6}$ | H | $R_{B1}$ | O |
| $L_{A1221}$ | $R_{B6}$ | H | $R_{B3}$ | O |
| $L_{A1222}$ | $R_{B6}$ | H | $R_{B4}$ | O |
| $L_{A1223}$ | $R_{B6}$ | H | $R_{B7}$ | O |
| $L_{A1224}$ | $R_{B6}$ | H | $R_{B10}$ | O |
| $L_{A1225}$ | $R_{B6}$ | H | $R_{A3}$ | O |
| $L_{A1226}$ | $R_{B6}$ | H | $R_{A34}$ | O |
| $L_{A1227}$ | $R_{B8}$ | H | $R_{B1}$ | O |
| $L_{A1228}$ | $R_{B8}$ | H | $R_{B2}$ | O |
| $L_{A1229}$ | $R_{B8}$ | H | $R_{B3}$ | O |
| $L_{A1230}$ | $R_{B8}$ | H | $R_{B4}$ | O |
| $L_{A1231}$ | $R_{B8}$ | H | $R_{B7}$ | O |
| $L_{A1232}$ | $R_{B8}$ | H | $R_{B10}$ | O |
| $L_{A1233}$ | $R_{B8}$ | H | $R_{A3}$ | O |
| $L_{A1234}$ | $R_{B8}$ | H | $R_{A34}$ | O |
| $L_{A1235}$ | $R_{B6}$ | F | H | O |
| $L_{A1236}$ | $R_{B6}$ | F | $R_{B1}$ | O |
| $L_{A1237}$ | $R_{B6}$ | F | $R_{B3}$ | O |
| $L_{A1238}$ | $R_{B6}$ | F | $R_{B4}$ | O |
| $L_{A1239}$ | $R_{B6}$ | F | $R_{B7}$ | O |
| $L_{A1240}$ | $R_{B6}$ | F | $R_{B10}$ | O |
| $L_{A1241}$ | $R_{B6}$ | F | $R_{A3}$ | O |
| $L_{A1242}$ | $R_{B6}$ | F | $R_{A34}$ | O |
| $L_{A1243}$ | $R_{B8}$ | F | $R_{B1}$ | O |
| $L_{A1244}$ | $R_{B8}$ | F | $R_{B2}$ | O |
| $L_{A1245}$ | $R_{B8}$ | F | $R_{B3}$ | O |
| $L_{A1246}$ | $R_{B8}$ | F | $R_{B4}$ | O |
| $L_{A1247}$ | $R_{B8}$ | F | $R_{B7}$ | O |
| $L_{A1248}$ | $R_{B8}$ | F | $R_{B10}$ | O |
| $L_{A1249}$ | $R_{B8}$ | F | $R_{A3}$ | O |
| $L_{A1250}$ | $R_{B8}$ | F | $R_{A34}$ | O |
| $L_{A1251}$ | $R_{B6}$ | $R_{B1}$ | H | O |
| $L_{A1252}$ | $R_{B6}$ | $R_{B1}$ | $R_{B1}$ | O |
| $L_{A1253}$ | $R_{B6}$ | $R_{B1}$ | $R_{B3}$ | O |
| $L_{A1254}$ | $R_{B6}$ | $R_{B1}$ | $R_{B4}$ | O |
| $L_{A1255}$ | $R_{B6}$ | $R_{B1}$ | $R_{B7}$ | O |
| $L_{A1256}$ | $R_{B6}$ | $R_{B1}$ | $R_{B10}$ | O |
| $L_{A1257}$ | $R_{B6}$ | $R_{B1}$ | $R_{A3}$ | O |
| $L_{A1258}$ | $R_{B6}$ | $R_{B1}$ | $R_{A34}$ | O |
| $L_{A1259}$ | $R_{B8}$ | $R_{B1}$ | $R_{B1}$ | O |
| $L_{A1260}$ | $R_{B8}$ | $R_{B1}$ | $R_{B2}$ | O |
| $L_{A1261}$ | $R_{B8}$ | $R_{B1}$ | $R_{B3}$ | O |
| $L_{A1262}$ | $R_{B8}$ | $R_{B1}$ | $R_{B4}$ | O |
| $L_{A1263}$ | $R_{B8}$ | $R_{B1}$ | $R_{B7}$ | O |
| $L_{A1264}$ | $R_{B8}$ | $R_{B1}$ | $R_{B10}$ | O |
| $L_{A1265}$ | $R_{B8}$ | $R_{B1}$ | $R_{A3}$ | O |
| $L_{A1266}$ | $R_{B8}$ | $R_{B1}$ | $R_{A34}$ | O |

$L_{A1267}$ through $L_{A1298}$ that are based on a structure of Formula VI,

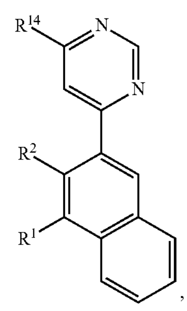

in which $R^1$, $R^2$, and $R^{14}$ are defined as provided below:

| Ligand | $R^1$ | $R^2$ | $R^{14}$ |
|---|---|---|---|
| $L_{A1267}$ | $R_{B6}$ | H | H |
| $L_{A1268}$ | $R_{B6}$ | H | $R_{B1}$ |
| $L_{A1269}$ | $R_{B6}$ | H | $R_{B3}$ |
| $L_{A1270}$ | $R_{B6}$ | H | $R_{B4}$ |
| $L_{A1271}$ | $R_{B6}$ | H | $R_{B7}$ |
| $L_{A1272}$ | $R_{B6}$ | H | $R_{B10}$ |
| $L_{A1273}$ | $R_{B6}$ | H | $R_{A3}$ |
| $L_{A1274}$ | $R_{B6}$ | H | $R_{A34}$ |
| $L_{A1275}$ | $R_{B8}$ | H | H |

-continued

| Ligand | $R^1$ | $R^2$ | $R^{14}$ |
|---|---|---|---|
| $L_{A1276}$ | $R_{B8}$ | H | $R_{B1}$ |
| $L_{A1277}$ | $R_{B8}$ | H | $R_{B3}$ |
| $L_{A1278}$ | $R_{B8}$ | H | $R_{B4}$ |
| $L_{A1279}$ | $R_{B8}$ | H | $R_{B7}$ |
| $L_{A1280}$ | $R_{B8}$ | H | $R_{B10}$ |
| $L_{A1281}$ | $R_{B8}$ | H | $R_{A3}$ |
| $L_{A1282}$ | $R_{B8}$ | H | $R_{A34}$ |
| $L_{A1283}$ | H | $R_{B6}$ | H |
| $L_{A1284}$ | H | $R_{B6}$ | $R_{B1}$ |
| $L_{A1285}$ | H | $R_{B6}$ | $R_{B3}$ |
| $L_{A1286}$ | H | $R_{B6}$ | $R_{B4}$ |
| $L_{A1287}$ | H | $R_{B6}$ | $R_{B7}$ |
| $L_{A1288}$ | H | $R_{B6}$ | $R_{B10}$ |
| $L_{A1289}$ | H | $R_{B6}$ | $R_{A3}$ |
| $L_{A1290}$ | H | $R_{B6}$ | $R_{A34}$ |
| $L_{A1291}$ | H | $R_{B8}$ | H |
| $L_{A1292}$ | H | $R_{B8}$ | $R_{B1}$ |
| $L_{A1293}$ | H | $R_{B8}$ | $R_{B3}$ |
| $L_{A1294}$ | H | $R_{B8}$ | $R_{B4}$ |
| $L_{A1295}$ | H | $R_{B8}$ | $R_{B7}$ |
| $L_{A1296}$ | H | $R_{B8}$ | $R_{B10}$ |
| $L_{A1297}$ | H | $R_{B8}$ | $R_{A3}$ |
| $L_{A1298}$ | H | $R_{B8}$ | $R_{A34}$; |

$L_{A1299}$ through $L_{A1558}$ that are based on a structure of Formula VII,

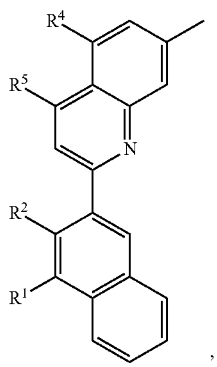

in which $R^1$, $R^2$, $R^4$, and $R^5$ are defined as provided below:

| Ligand | $R^1$ | $R^2$ | $R^4$ | $R^5$ |
|---|---|---|---|---|
| $L_{A1299}$ | $R_{B6}$ | H | H | H |
| $L_{A1300}$ | $R_{B6}$ | H | $R_{B1}$ | H |
| $L_{A1301}$ | $R_{B6}$ | H | $R_{B3}$ | H |
| $L_{A1302}$ | $R_{B6}$ | H | $R_{B4}$ | H |
| $L_{A1303}$ | $R_{B6}$ | H | $R_{B7}$ | H |
| $L_{A1304}$ | $R_{B6}$ | H | $R_{B10}$ | H |
| $L_{A1305}$ | $R_{B6}$ | H | $R_{A3}$ | H |
| $L_{A1306}$ | $R_{B6}$ | H | $R_{A34}$ | H |
| $L_{A1307}$ | $R_{B6}$ | H | H | $R_{B1}$ |
| $L_{A1308}$ | $R_{B6}$ | H | H | $R_{B12}$ |
| $L_{A1309}$ | $R_{B6}$ | H | H | $R_{B3}$ |
| $L_{A1310}$ | $R_{B6}$ | H | H | $R_{B4}$ |
| $L_{A1311}$ | $R_{B6}$ | H | H | $R_{B7}$ |
| $L_{A1312}$ | $R_{B6}$ | H | H | $R_{B10}$ |
| $L_{A1313}$ | $R_{B6}$ | H | H | $R_{A3}$ |
| $L_{A1314}$ | $R_{B6}$ | H | H | $R_{A34}$ |
| $L_{A1315}$ | $R_{B6}$ | H | $R_{B1}$ | $R_{B1}$ |
| $L_{A1316}$ | $R_{B6}$ | H | $R_{B3}$ | $R_{B3}$ |
| $L_{A1317}$ | $R_{B6}$ | H | $R_{B4}$ | $R_{B4}$ |
| $L_{A1318}$ | $R_{B6}$ | H | $R_{B7}$ | $R_{B7}$ |
| $L_{A1319}$ | $R_{B6}$ | H | $R_{B10}$ | $R_{B10}$ |
| $L_{A1320}$ | $R_{B6}$ | H | $R_{A3}$ | $R_{A3}$ |
| $L_{A1321}$ | $R_{B6}$ | H | $R_{A34}$ | $R_{A34}$ |

-continued

| Ligand | $R^1$ | $R^2$ | $R^4$ | $R^5$ |
|---|---|---|---|---|
| $L_{A1322}$ | $R_{B6}$ | H | $R_{B1}$ | $R_{B3}$ |
| $L_{A1323}$ | $R_{B6}$ | H | $R_{B1}$ | $R_{B4}$ |
| $L_{A1324}$ | $R_{B6}$ | H | $R_{B1}$ | $R_{B7}$ |
| $L_{A1325}$ | $R_{B6}$ | H | $R_{B1}$ | $R_{B10}$ |
| $L_{A1326}$ | $R_{B6}$ | H | $R_{B1}$ | $R_{A3}$ |
| $L_{A1327}$ | $R_{B6}$ | H | $R_{B1}$ | $R_{A34}$ |
| $L_{A1328}$ | $R_{B6}$ | H | $R_{B3}$ | $R_{B1}$ |
| $L_{A1329}$ | $R_{B6}$ | H | $R_{B3}$ | $R_{B4}$ |
| $L_{A1330}$ | $R_{B6}$ | H | $R_{B3}$ | $R_{B7}$ |
| $L_{A1331}$ | $R_{B6}$ | H | $R_{B3}$ | $R_{B10}$ |
| $L_{A1332}$ | $R_{B6}$ | H | $R_{B3}$ | $R_{A3}$ |
| $L_{A1333}$ | $R_{B6}$ | H | $R_{B3}$ | $R_{A34}$ |
| $L_{A1334}$ | $R_{B6}$ | H | $R_{B4}$ | $R_{B1}$ |
| $L_{A1335}$ | $R_{B6}$ | H | $R_{B4}$ | $R_{B3}$ |
| $L_{A1336}$ | $R_{B6}$ | H | $R_{B4}$ | $R_{B7}$ |
| $L_{A1337}$ | $R_{B6}$ | H | $R_{B4}$ | $R_{B10}$ |
| $L_{A1338}$ | $R_{B6}$ | H | $R_{B4}$ | $R_{A3}$ |
| $L_{A1339}$ | $R_{B6}$ | H | $R_{B4}$ | $R_{A34}$ |
| $L_{A1340}$ | $R_{B6}$ | H | $R_{B7}$ | $R_{B1}$ |
| $L_{A1341}$ | $R_{B6}$ | H | $R_{B7}$ | $R_{B3}$ |
| $L_{A1342}$ | $R_{B6}$ | H | $R_{B7}$ | $R_{B4}$ |
| $L_{A1343}$ | $R_{B6}$ | H | $R_{B7}$ | $R_{B10}$ |
| $L_{A1344}$ | $R_{B6}$ | H | $R_{B7}$ | $R_{A3}$ |
| $L_{A1345}$ | $R_{B6}$ | H | $R_{B7}$ | $R_{A34}$ |
| $L_{A1346}$ | $R_{B6}$ | H | $R_{B10}$ | $R_{B1}$ |
| $L_{A1347}$ | $R_{B6}$ | H | $R_{B10}$ | $R_{B3}$ |
| $L_{A1348}$ | $R_{B6}$ | H | $R_{B10}$ | $R_{B4}$ |
| $L_{A1349}$ | $R_{B6}$ | H | $R_{B10}$ | $R_{B7}$ |
| $L_{A1350}$ | $R_{B6}$ | H | $R_{B10}$ | $R_{A3}$ |
| $L_{A1351}$ | $R_{B6}$ | H | $R_{B10}$ | $R_{A34}$ |
| $L_{A1352}$ | $R_{B6}$ | H | $R_{A3}$ | $R_{B1}$ |
| $L_{A1353}$ | $R_{B6}$ | H | $R_{A3}$ | $R_{B3}$ |
| $L_{A1354}$ | $R_{B6}$ | H | $R_{A3}$ | $R_{B4}$ |
| $L_{A1355}$ | $R_{B6}$ | H | $R_{A3}$ | $R_{B7}$ |
| $L_{A1356}$ | $R_{B6}$ | H | $R_{A3}$ | $R_{B10}$ |
| $L_{A1357}$ | $R_{B6}$ | H | $R_{A3}$ | $R_{A34}$ |
| $L_{A1358}$ | $R_{B6}$ | H | $R_{A34}$ | $R_{B1}$ |
| $L_{A1359}$ | $R_{B6}$ | H | $R_{A34}$ | $R_{B3}$ |
| $L_{A1360}$ | $R_{B6}$ | H | $R_{A34}$ | $R_{B4}$ |
| $L_{A1361}$ | $R_{B6}$ | H | $R_{A34}$ | $R_{B7}$ |
| $L_{A1362}$ | $R_{B6}$ | H | $R_{A34}$ | $R_{B10}$ |
| $L_{A1363}$ | $R_{B6}$ | H | $R_{A34}$ | $R_{A3}$ |
| $L_{A1364}$ | $R_{B8}$ | H | H | H |
| $L_{A1365}$ | $R_{B8}$ | H | $R_{B1}$ | H |
| $L_{A1366}$ | $R_{B8}$ | H | $R_{B3}$ | H |
| $L_{A1367}$ | $R_{B8}$ | H | $R_{B4}$ | H |
| $L_{A1368}$ | $R_{B8}$ | H | $R_{B7}$ | H |
| $L_{A1369}$ | $R_{B8}$ | H | $R_{B10}$ | H |
| $L_{A1370}$ | $R_{B8}$ | H | $R_{A3}$ | H |
| $L_{A1371}$ | $R_{B8}$ | H | $R_{A34}$ | H |
| $L_{A1372}$ | $R_{B8}$ | H | H | $R_{B1}$ |
| $L_{A1373}$ | $R_{B8}$ | H | H | $R_{B2}$ |
| $L_{A1374}$ | $R_{B8}$ | H | H | $R_{B3}$ |
| $L_{A1375}$ | $R_{B8}$ | H | H | $R_{B4}$ |
| $L_{A1376}$ | $R_{B8}$ | H | H | $R_{B7}$ |
| $L_{A1377}$ | $R_{B8}$ | H | H | $R_{B10}$ |
| $L_{A1378}$ | $R_{B8}$ | H | H | $R_{A3}$ |
| $L_{A1379}$ | $R_{B8}$ | H | H | $R_{A34}$ |
| $L_{A1380}$ | $R_{B8}$ | H | $R_{B1}$ | $R_{B1}$ |
| $L_{A1381}$ | $R_{B8}$ | H | $R_{B3}$ | $R_{B3}$ |
| $L_{A1382}$ | $R_{B8}$ | H | $R_{B4}$ | $R_{B4}$ |
| $L_{A1383}$ | $R_{B8}$ | H | $R_{B7}$ | $R_{B7}$ |
| $L_{A1384}$ | $R_{B8}$ | H | $R_{B10}$ | $R_{B10}$ |
| $L_{A1385}$ | $R_{B8}$ | H | $R_{A3}$ | $R_{A3}$ |
| $L_{A1386}$ | $R_{B8}$ | H | $R_{A34}$ | $R_{A34}$ |
| $L_{A1387}$ | $R_{B8}$ | H | $R_{B1}$ | $R_{B3}$ |
| $L_{A1388}$ | $R_{B8}$ | H | $R_{B1}$ | $R_{B4}$ |
| $L_{A1389}$ | $R_{B8}$ | H | $R_{B1}$ | $R_{B7}$ |
| $L_{A1390}$ | $R_{B8}$ | H | $R_{B1}$ | $R_{B10}$ |
| $L_{A1391}$ | $R_{B8}$ | H | $R_{B1}$ | $R_{A3}$ |
| $L_{A1392}$ | $R_{B8}$ | H | $R_{B1}$ | $R_{A34}$ |
| $L_{A1393}$ | $R_{B8}$ | H | $R_{B3}$ | $R_{B1}$ |
| $L_{A1394}$ | $R_{B8}$ | H | $R_{B3}$ | $R_{B4}$ |
| $L_{A1395}$ | $R_{B8}$ | H | $R_{B3}$ | $R_{B7}$ |
| $L_{A1396}$ | $R_{B8}$ | H | $R_{B3}$ | $R_{B10}$ |
| $L_{A1397}$ | $R_{B8}$ | H | $R_{B3}$ | $R_{A3}$ |
| $L_{A1398}$ | $R_{B8}$ | H | $R_{B3}$ | $R_{A34}$ |

-continued

| Ligand | $R^1$ | $R^2$ | $R^4$ | $R^5$ |
|---|---|---|---|---|
| $L_{A1399}$ | $R_{B8}$ | H | $R_{B4}$ | $R_{B1}$ |
| $L_{A1400}$ | $R_{B8}$ | H | $R_{B4}$ | $R_{B3}$ |
| $L_{A1401}$ | $R_{B8}$ | H | $R_{B4}$ | $R_{B7}$ |
| $L_{A1402}$ | $R_{B8}$ | H | $R_{B4}$ | $R_{B10}$ |
| $L_{A1403}$ | $R_{B8}$ | H | $R_{B4}$ | $R_{A3}$ |
| $L_{A1404}$ | $R_{B8}$ | H | $R_{B4}$ | $R_{A34}$ |
| $L_{A1405}$ | $R_{B8}$ | H | $R_{B7}$ | $R_{B1}$ |
| $L_{A1406}$ | $R_{B8}$ | H | $R_{B7}$ | $R_{B3}$ |
| $L_{A1407}$ | $R_{B8}$ | H | $R_{B7}$ | $R_{B4}$ |
| $L_{A1408}$ | $R_{B8}$ | H | $R_{B7}$ | $R_{B10}$ |
| $L_{A1409}$ | $R_{B8}$ | H | $R_{B7}$ | $R_{A3}$ |
| $L_{A1410}$ | $R_{B8}$ | H | $R_{B7}$ | $R_{A34}$ |
| $L_{A1411}$ | $R_{B8}$ | H | $R_{B10}$ | $R_{B1}$ |
| $L_{A1412}$ | $R_{B8}$ | H | $R_{B10}$ | $R_{B3}$ |
| $L_{A1413}$ | $R_{B8}$ | H | $R_{B10}$ | $R_{B4}$ |
| $L_{A1414}$ | $R_{B8}$ | H | $R_{B10}$ | $R_{B7}$ |
| $L_{A1415}$ | $R_{B8}$ | H | $R_{B10}$ | $R_{A3}$ |
| $L_{A1416}$ | $R_{B8}$ | H | $R_{B10}$ | $R_{A34}$ |
| $L_{A1417}$ | $R_{B8}$ | H | $R_{A3}$ | $R_{B1}$ |
| $L_{A1418}$ | $R_{B8}$ | H | $R_{A3}$ | $R_{B3}$ |
| $L_{A1419}$ | $R_{B8}$ | H | $R_{A3}$ | $R_{B4}$ |
| $L_{A1420}$ | $R_{B8}$ | H | $R_{A3}$ | $R_{B7}$ |
| $L_{A1421}$ | $R_{B8}$ | H | $R_{A3}$ | $R_{B10}$ |
| $L_{A1422}$ | $R_{B8}$ | H | $R_{A3}$ | $R_{A34}$ |
| $L_{A1423}$ | $R_{B8}$ | H | $R_{A34}$ | $R_{B1}$ |
| $L_{A1424}$ | $R_{B8}$ | H | $R_{A34}$ | $R_{B3}$ |
| $L_{A1425}$ | $R_{B8}$ | H | $R_{A34}$ | $R_{B4}$ |
| $L_{A1426}$ | $R_{B8}$ | H | $R_{A34}$ | $R_{B7}$ |
| $L_{A1427}$ | $R_{B8}$ | H | $R_{A34}$ | $R_{B10}$ |
| $L_{A1428}$ | $R_{B8}$ | H | $R_{A34}$ | $R_{A3}$ |
| $L_{A1429}$ | H | $R_{B6}$ | H | H |
| $L_{A1430}$ | H | $R_{B6}$ | $R_{B1}$ | H |
| $L_{A1431}$ | H | $R_{B6}$ | $R_{B3}$ | H |
| $L_{A1432}$ | H | $R_{B6}$ | $R_{B4}$ | H |
| $L_{A1433}$ | H | $R_{B6}$ | $R_{B7}$ | H |
| $L_{A1434}$ | H | $R_{B6}$ | $R_{B10}$ | H |
| $L_{A1435}$ | H | $R_{B6}$ | $R_{A3}$ | H |
| $L_{A1436}$ | H | $R_{B6}$ | $R_{A34}$ | H |
| $L_{A1437}$ | H | $R_{B6}$ | H | $R_{B1}$ |
| $L_{A1438}$ | H | $R_{B6}$ | H | $R_{B2}$ |
| $L_{A1439}$ | H | $R_{B6}$ | H | $R_{B3}$ |
| $L_{A1440}$ | H | $R_{B6}$ | H | $R_{B4}$ |
| $L_{A1441}$ | H | $R_{B6}$ | H | $R_{B7}$ |
| $L_{A1442}$ | H | $R_{B6}$ | H | $R_{B10}$ |
| $L_{A1443}$ | H | $R_{B6}$ | H | $R_{A3}$ |
| $L_{A1444}$ | H | $R_{B6}$ | H | $R_{A34}$ |
| $L_{A1445}$ | H | $R_{B6}$ | $R_{B1}$ | $R_{B1}$ |
| $L_{A1446}$ | H | $R_{B6}$ | $R_{B3}$ | $R_{B3}$ |
| $L_{A1447}$ | H | $R_{B6}$ | $R_{B4}$ | $R_{B4}$ |
| $L_{A1448}$ | H | $R_{B6}$ | $R_{B7}$ | $R_{B7}$ |
| $L_{A1449}$ | H | $R_{B6}$ | $R_{B10}$ | $R_{B10}$ |
| $L_{A1450}$ | H | $R_{B6}$ | $R_{A3}$ | $R_{A3}$ |
| $L_{A1451}$ | H | $R_{B6}$ | $R_{A34}$ | $R_{A34}$ |
| $L_{A1452}$ | H | $R_{B6}$ | $R_{B1}$ | $R_{B3}$ |
| $L_{A1453}$ | H | $R_{B6}$ | $R_{B1}$ | $R_{B4}$ |
| $L_{A1454}$ | H | $R_{B6}$ | $R_{B1}$ | $R_{B7}$ |
| $L_{A1455}$ | H | $R_{B6}$ | $R_{B1}$ | $R_{B10}$ |
| $L_{A1456}$ | H | $R_{B6}$ | $R_{B1}$ | $R_{A3}$ |
| $L_{A1457}$ | H | $R_{B6}$ | $R_{B1}$ | $R_{A34}$ |
| $L_{A1458}$ | H | $R_{B6}$ | $R_{B3}$ | $R_{B1}$ |
| $L_{A1459}$ | H | $R_{B6}$ | $R_{B3}$ | $R_{B4}$ |
| $L_{A1460}$ | H | $R_{B6}$ | $R_{B3}$ | $R_{B7}$ |
| $L_{A1461}$ | H | $R_{B6}$ | $R_{B3}$ | $R_{B10}$ |
| $L_{A1462}$ | H | $R_{B6}$ | $R_{B3}$ | $R_{A3}$ |
| $L_{A1463}$ | H | $R_{B6}$ | $R_{B3}$ | $R_{A34}$ |
| $L_{A1464}$ | H | $R_{B6}$ | $R_{B4}$ | $R_{B1}$ |
| $L_{A1465}$ | H | $R_{B6}$ | $R_{B4}$ | $R_{B3}$ |
| $L_{A1466}$ | H | $R_{B6}$ | $R_{B4}$ | $R_{B7}$ |
| $L_{A1467}$ | H | $R_{B6}$ | $R_{B4}$ | $R_{B10}$ |
| $L_{A1468}$ | H | $R_{B6}$ | $R_{B4}$ | $R_{A3}$ |
| $L_{A1469}$ | H | $R_{B6}$ | $R_{B4}$ | $R_{A34}$ |
| $L_{A1470}$ | H | $R_{B6}$ | $R_{B7}$ | $R_{B1}$ |
| $L_{A1471}$ | H | $R_{B6}$ | $R_{B7}$ | $R_{B3}$ |
| $L_{A1472}$ | H | $R_{B6}$ | $R_{B7}$ | $R_{B4}$ |
| $L_{A1473}$ | H | $R_{B6}$ | $R_{B7}$ | $R_{B10}$ |
| $L_{A1474}$ | H | $R_{B6}$ | $R_{B7}$ | $R_{A3}$ |
| $L_{A1475}$ | H | $R_{B6}$ | $R_{B7}$ | $R_{A34}$ |
| $L_{A1476}$ | H | $R_{B6}$ | $R_{B10}$ | $R_{B1}$ |
| $L_{A1477}$ | H | $R_{B6}$ | $R_{B10}$ | $R_{B3}$ |
| $L_{A1478}$ | H | $R_{B6}$ | $R_{B10}$ | $R_{B4}$ |
| $L_{A1479}$ | H | $R_{B6}$ | $R_{B10}$ | $R_{B7}$ |
| $L_{A1480}$ | H | $R_{B6}$ | $R_{B10}$ | $R_{A3}$ |
| $L_{A1481}$ | H | $R_{B6}$ | $R_{B10}$ | $R_{A34}$ |
| $L_{A1482}$ | H | $R_{B6}$ | $R_{A3}$ | $R_{B1}$ |
| $L_{A1483}$ | H | $R_{B6}$ | $R_{A3}$ | $R_{B3}$ |
| $L_{A1484}$ | H | $R_{B6}$ | $R_{A3}$ | $R_{B4}$ |
| $L_{A1485}$ | H | $R_{B6}$ | $R_{A3}$ | $R_{B7}$ |
| $L_{A1486}$ | H | $R_{B6}$ | $R_{A3}$ | $R_{B10}$ |
| $L_{A1487}$ | H | $R_{B6}$ | $R_{A3}$ | $R_{A34}$ |
| $L_{A1488}$ | H | $R_{B6}$ | $R_{A34}$ | $R_{B1}$ |
| $L_{A1489}$ | H | $R_{B6}$ | $R_{A34}$ | $R_{B3}$ |
| $L_{A1490}$ | H | $R_{B6}$ | $R_{A34}$ | $R_{B4}$ |
| $L_{A1491}$ | H | $R_{B6}$ | $R_{A34}$ | $R_{B7}$ |
| $L_{A1492}$ | H | $R_{B6}$ | $R_{A34}$ | $R_{B10}$ |
| $L_{A1493}$ | H | $R_{B6}$ | $R_{A34}$ | $R_{A3}$ |
| $L_{A1494}$ | H | $R_{B8}$ | H | H |
| $L_{A1495}$ | H | $R_{B8}$ | $R_{B1}$ | H |
| $L_{A1496}$ | H | $R_{B8}$ | $R_{B3}$ | H |
| $L_{A1497}$ | H | $R_{B8}$ | $R_{B4}$ | H |
| $L_{A1498}$ | H | $R_{B8}$ | $R_{B7}$ | H |
| $L_{A1499}$ | H | $R_{B8}$ | $R_{B10}$ | H |
| $L_{A1500}$ | H | $R_{B8}$ | $R_{A3}$ | H |
| $L_{A1501}$ | H | $R_{B8}$ | $R_{A34}$ | H |
| $L_{A1502}$ | H | $R_{B8}$ | H | $R_{B1}$ |
| $L_{A1503}$ | H | $R_{B8}$ | H | $R_{B2}$ |
| $L_{A1504}$ | H | $R_{B8}$ | H | $R_{B3}$ |
| $L_{A1505}$ | H | $R_{B8}$ | H | $R_{B4}$ |
| $L_{A1506}$ | H | $R_{B8}$ | H | $R_{B7}$ |
| $L_{A1507}$ | H | $R_{B8}$ | H | $R_{B10}$ |
| $L_{A1508}$ | H | $R_{B8}$ | H | $R_{A3}$ |
| $L_{A1509}$ | H | $R_{B8}$ | H | $R_{A34}$ |
| $L_{A1510}$ | H | $R_{B8}$ | $R_{B1}$ | $R_{B1}$ |
| $L_{A1511}$ | H | $R_{B8}$ | $R_{B3}$ | $R_{B3}$ |
| $L_{A1512}$ | H | $R_{B8}$ | $R_{B4}$ | $R_{B4}$ |
| $L_{A1513}$ | H | $R_{B8}$ | $R_{B7}$ | $R_{B7}$ |
| $L_{A1514}$ | H | $R_{B8}$ | $R_{B10}$ | $R_{B10}$ |
| $L_{A1515}$ | H | $R_{B8}$ | $R_{A3}$ | $R_{A3}$ |
| $L_{A1516}$ | H | $R_{B8}$ | $R_{A34}$ | $R_{A34}$ |
| $L_{A1517}$ | H | $R_{B8}$ | $R_{B1}$ | $R_{B3}$ |
| $L_{A1518}$ | H | $R_{B8}$ | $R_{B1}$ | $R_{B4}$ |
| $L_{A1519}$ | H | $R_{B8}$ | $R_{B1}$ | $R_{B7}$ |
| $L_{A1520}$ | H | $R_{B8}$ | $R_{B1}$ | $R_{B10}$ |
| $L_{A1521}$ | H | $R_{B8}$ | $R_{B1}$ | $R_{A3}$ |
| $L_{A1522}$ | H | $R_{B8}$ | $R_{B1}$ | $R_{A34}$ |
| $L_{A1523}$ | H | $R_{B8}$ | $R_{B3}$ | $R_{B1}$ |
| $L_{A1524}$ | H | $R_{B8}$ | $R_{B3}$ | $R_{B4}$ |
| $L_{A1525}$ | H | $R_{B8}$ | $R_{B3}$ | $R_{B7}$ |
| $L_{A1526}$ | H | $R_{B8}$ | $R_{B3}$ | $R_{B10}$ |
| $L_{A1527}$ | H | $R_{B8}$ | $R_{B3}$ | $R_{A3}$ |
| $L_{A1528}$ | H | $R_{B8}$ | $R_{B3}$ | $R_{A34}$ |
| $L_{A1529}$ | H | $R_{B8}$ | $R_{B4}$ | $R_{B1}$ |
| $L_{A1530}$ | H | $R_{B8}$ | $R_{B4}$ | $R_{B3}$ |
| $L_{A1531}$ | H | $R_{B8}$ | $R_{B4}$ | $R_{B7}$ |
| $L_{A1532}$ | H | $R_{B8}$ | $R_{B4}$ | $R_{B10}$ |
| $L_{A1533}$ | H | $R_{B8}$ | $R_{B4}$ | $R_{A3}$ |
| $L_{A1534}$ | H | $R_{B8}$ | $R_{B4}$ | $R_{A34}$ |
| $L_{A1535}$ | H | $R_{B8}$ | $R_{B7}$ | $R_{B1}$ |
| $L_{A1536}$ | H | $R_{B8}$ | $R_{B7}$ | $R_{B3}$ |
| $L_{A1537}$ | H | $R_{B8}$ | $R_{B7}$ | $R_{B4}$ |
| $L_{A1538}$ | H | $R_{B8}$ | $R_{B7}$ | $R_{B10}$ |
| $L_{A1539}$ | H | $R_{B8}$ | $R_{B7}$ | $R_{A3}$ |
| $L_{A1540}$ | H | $R_{B8}$ | $R_{B7}$ | $R_{A34}$ |
| $L_{A1541}$ | H | $R_{B8}$ | $R_{B10}$ | $R_{B1}$ |
| $L_{A1542}$ | H | $R_{B8}$ | $R_{B10}$ | $R_{B3}$ |
| $L_{A1543}$ | H | $R_{B8}$ | $R_{B10}$ | $R_{B4}$ |
| $L_{A1544}$ | H | $R_{B8}$ | $R_{B10}$ | $R_{B7}$ |
| $L_{A1545}$ | H | $R_{B8}$ | $R_{B10}$ | $R_{A3}$ |
| $L_{A1546}$ | H | $R_{B8}$ | $R_{B10}$ | $R_{A34}$ |
| $L_{A1547}$ | H | $R_{B8}$ | $R_{B8}$ | $R_{B1}$ |
| $L_{A1548}$ | H | $R_{B8}$ | $R_{B8}$ | $R_{B3}$ |
| $L_{A1549}$ | H | $R_{B8}$ | $R_{B8}$ | $R_{B4}$ |
| $L_{A1550}$ | H | $R_{B8}$ | $R_{B8}$ | $R_{B7}$ |
| $L_{A1551}$ | H | $R_{B8}$ | $R_{B8}$ | $R_{B10}$ |
| $L_{A1552}$ | H | $R_{B8}$ | $R_{B8}$ | $R_{A34}$ |

-continued

| Ligand | $R^1$ | $R^2$ | $R^4$ | $R^5$ |
|---|---|---|---|---|
| $L_{A1553}$ | H | $R_{B8}$ | $R_{A34}$ | $R_{B1}$ |
| $L_{A1554}$ | H | $R_{B8}$ | $R_{A34}$ | $R_{B3}$ |
| $L_{A1555}$ | H | $R_{B8}$ | $R_{A34}$ | $R_{B4}$ |
| $L_{A1556}$ | H | $R_{B8}$ | $R_{A34}$ | $R_{B7}$ |
| $L_{A1557}$ | H | $R_{B8}$ | $R_{A34}$ | $R_{B10}$ |
| $L_{A1558}$ | H | $R_{B8}$ | $R_{A34}$ | $R_{A3}$ |

$L_{A1559}$ through $L_{A1818}$ that are based on a structure of Formula VIII,

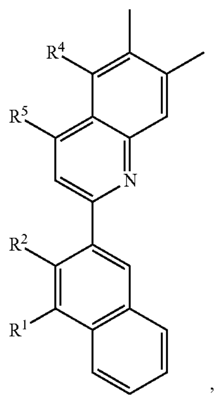

in which $R^1$, $R^2$, $R^4$, and $R^5$ are defined as provided below:

| Ligand | $R^1$ | $R^2$ | $R^4$ | $R^5$ |
|---|---|---|---|---|
| $L_{A1559}$ | $R_{B6}$ | H | H | H |
| $L_{A1560}$ | $R_{B6}$ | H | $R_{B1}$ | H |
| $L_{A1561}$ | $R_{B6}$ | H | $R_{B3}$ | H |
| $L_{A1562}$ | $R_{B6}$ | H | $R_{B4}$ | H |
| $L_{A1563}$ | $R_{B6}$ | H | $R_{B7}$ | H |
| $L_{A1564}$ | $R_{B6}$ | H | $R_{B10}$ | H |
| $L_{A1565}$ | $R_{B6}$ | H | $R_{A3}$ | H |
| $L_{A1566}$ | $R_{B6}$ | H | $R_{A34}$ | H |
| $L_{A1567}$ | $R_{B6}$ | H | H | $R_{B1}$ |
| $L_{A1568}$ | $R_{B6}$ | H | H | $R_{B2}$ |
| $L_{A1569}$ | $R_{B6}$ | H | H | $R_{B3}$ |
| $L_{A1570}$ | $R_{B6}$ | H | H | $R_{B4}$ |
| $L_{A1571}$ | $R_{B6}$ | H | H | $R_{B7}$ |
| $L_{A1572}$ | $R_{B6}$ | H | H | $R_{B10}$ |
| $L_{A1573}$ | $R_{B6}$ | H | H | $R_{A3}$ |
| $L_{A1574}$ | $R_{B6}$ | H | H | $R_{A34}$ |
| $L_{A1575}$ | $R_{B6}$ | H | $R_{B1}$ | $R_{B1}$ |
| $L_{A1576}$ | $R_{B6}$ | H | $R_{B3}$ | $R_{B3}$ |
| $L_{A1577}$ | $R_{B6}$ | H | $R_{B4}$ | $R_{B4}$ |
| $L_{A1578}$ | $R_{B6}$ | H | $R_{B7}$ | $R_{B7}$ |
| $L_{A1579}$ | $R_{B6}$ | H | $R_{B10}$ | $R_{B10}$ |
| $L_{A1580}$ | $R_{B6}$ | H | $R_{A3}$ | $R_{A3}$ |
| $L_{A1581}$ | $R_{B6}$ | H | $R_{A34}$ | $R_{A34}$ |
| $L_{A1582}$ | $R_{B6}$ | H | $R_{B1}$ | $R_{B3}$ |
| $L_{A1583}$ | $R_{B6}$ | H | $R_{B1}$ | $R_{B4}$ |
| $L_{A1584}$ | $R_{B6}$ | H | $R_{B1}$ | $R_{B7}$ |
| $L_{A1585}$ | $R_{B6}$ | H | $R_{B1}$ | $R_{B10}$ |
| $L_{A1586}$ | $R_{B6}$ | H | $R_{B1}$ | $R_{A3}$ |
| $L_{A1587}$ | $R_{B6}$ | H | $R_{B1}$ | $R_{A34}$ |
| $L_{A1588}$ | $R_{B6}$ | H | $R_{B3}$ | $R_{B1}$ |
| $L_{A1589}$ | $R_{B6}$ | H | $R_{B3}$ | $R_{B4}$ |
| $L_{A1590}$ | $R_{B6}$ | H | $R_{B3}$ | $R_{B7}$ |
| $L_{A1591}$ | $R_{B6}$ | H | $R_{B3}$ | $R_{B10}$ |
| $L_{A1592}$ | $R_{B6}$ | H | $R_{B3}$ | $R_{A3}$ |
| $L_{A1593}$ | $R_{B6}$ | H | $R_{B3}$ | $R_{A34}$ |
| $L_{A1594}$ | $R_{B6}$ | H | $R_{B4}$ | $R_{B1}$ |
| $L_{A1595}$ | $R_{B6}$ | H | $R_{B4}$ | $R_{B3}$ |
| $L_{A1596}$ | $R_{B6}$ | H | $R_{B4}$ | $R_{B7}$ |
| $L_{A1597}$ | $R_{B6}$ | H | $R_{B4}$ | $R_{B10}$ |

-continued

| Ligand | $R^1$ | $R^2$ | $R^4$ | $R^5$ |
|---|---|---|---|---|
| $L_{A1598}$ | $R_{B6}$ | H | $R_{B4}$ | $R_{A3}$ |
| $L_{A1599}$ | $R_{B6}$ | H | $R_{B4}$ | $R_{A34}$ |
| $L_{A1600}$ | $R_{B6}$ | H | $R_{B7}$ | $R_{B1}$ |
| $L_{A1601}$ | $R_{B6}$ | H | $R_{B7}$ | $R_{B3}$ |
| $L_{A1602}$ | $R_{B6}$ | H | $R_{B7}$ | $R_{B4}$ |
| $L_{A1603}$ | $R_{B6}$ | H | $R_{B7}$ | $R_{B10}$ |
| $L_{A1604}$ | $R_{B6}$ | H | $R_{B7}$ | $R_{A3}$ |
| $L_{A1605}$ | $R_{B6}$ | H | $R_{B7}$ | $R_{A34}$ |
| $L_{A1606}$ | $R_{B6}$ | H | $R_{B10}$ | $R_{B1}$ |
| $L_{A1607}$ | $R_{B6}$ | H | $R_{B10}$ | $R_{B3}$ |
| $L_{A1608}$ | $R_{B6}$ | H | $R_{B10}$ | $R_{B4}$ |
| $L_{A1609}$ | $R_{B6}$ | H | $R_{B10}$ | $R_{B7}$ |
| $L_{A1610}$ | $R_{B6}$ | H | $R_{B10}$ | $R_{A3}$ |
| $L_{A1611}$ | $R_{B6}$ | H | $R_{B10}$ | $R_{A34}$ |
| $L_{A1612}$ | $R_{B6}$ | H | $R_{A3}$ | $R_{B1}$ |
| $L_{A1613}$ | $R_{B6}$ | H | $R_{A3}$ | $R_{B3}$ |
| $L_{A1614}$ | $R_{B6}$ | H | $R_{A3}$ | $R_{B4}$ |
| $L_{A1615}$ | $R_{B6}$ | H | $R_{A3}$ | $R_{B7}$ |
| $L_{A1616}$ | $R_{B6}$ | H | $R_{A3}$ | $R_{B10}$ |
| $L_{A1617}$ | $R_{B6}$ | H | $R_{A3}$ | $R_{A34}$ |
| $L_{A1618}$ | $R_{B6}$ | H | $R_{A34}$ | $R_{B1}$ |
| $L_{A1619}$ | $R_{B6}$ | H | $R_{A34}$ | $R_{B3}$ |
| $L_{A1620}$ | $R_{B6}$ | H | $R_{A34}$ | $R_{B4}$ |
| $L_{A1621}$ | $R_{B6}$ | H | $R_{A34}$ | $R_{B7}$ |
| $L_{A1622}$ | $R_{B6}$ | H | $R_{A34}$ | $R_{B10}$ |
| $L_{A1623}$ | $R_{B6}$ | H | $R_{A34}$ | $R_{A3}$ |
| $L_{A1624}$ | $R_{B8}$ | H | H | H |
| $L_{A1625}$ | $R_{B8}$ | H | $R_{B1}$ | H |
| $L_{A1626}$ | $R_{B8}$ | H | $R_{B3}$ | H |
| $L_{A1627}$ | $R_{B8}$ | H | $R_{B4}$ | H |
| $L_{A1628}$ | $R_{B8}$ | H | $R_{B7}$ | H |
| $L_{A1629}$ | $R_{B8}$ | H | $R_{B10}$ | H |
| $L_{A1630}$ | $R_{B8}$ | H | $R_{A3}$ | H |
| $L_{A1631}$ | $R_{B8}$ | H | $R_{A34}$ | H |
| $L_{A1632}$ | $R_{B8}$ | H | H | $R_{B1}$ |
| $L_{A1633}$ | $R_{B8}$ | H | H | $R_{B2}$ |
| $L_{A1634}$ | $R_{B8}$ | H | H | $R_{B3}$ |
| $L_{A1635}$ | $R_{B8}$ | H | H | $R_{B4}$ |
| $L_{A1636}$ | $R_{B8}$ | H | H | $R_{B7}$ |
| $L_{A1637}$ | $R_{B8}$ | H | H | $R_{B10}$ |
| $L_{A1638}$ | $R_{B8}$ | H | H | $R_{A3}$ |
| $L_{A1639}$ | $R_{B8}$ | H | H | $R_{A34}$ |
| $L_{A1640}$ | $R_{B8}$ | H | $R_{B1}$ | $R_{B1}$ |
| $L_{A1641}$ | $R_{B8}$ | H | $R_{B3}$ | $R_{B3}$ |
| $L_{A1642}$ | $R_{B8}$ | H | $R_{B4}$ | $R_{B4}$ |
| $L_{A1643}$ | $R_{B8}$ | H | $R_{B7}$ | $R_{B7}$ |
| $L_{A1644}$ | $R_{B8}$ | H | $R_{B10}$ | $R_{B10}$ |
| $L_{A1645}$ | $R_{B8}$ | H | $R_{A3}$ | $R_{A3}$ |
| $L_{A1646}$ | $R_{B8}$ | H | $R_{A34}$ | $R_{A34}$ |
| $L_{A1647}$ | $R_{B8}$ | H | $R_{B1}$ | $R_{B3}$ |
| $L_{A1648}$ | $R_{B8}$ | H | $R_{B1}$ | $R_{B4}$ |
| $L_{A1649}$ | $R_{B8}$ | H | $R_{B1}$ | $R_{B7}$ |
| $L_{A1650}$ | $R_{B8}$ | H | $R_{B1}$ | $R_{B10}$ |
| $L_{A1651}$ | $R_{B8}$ | H | $R_{B1}$ | $R_{A3}$ |
| $L_{A1652}$ | $R_{B8}$ | H | $R_{B1}$ | $R_{A34}$ |
| $L_{A1653}$ | $R_{B8}$ | H | $R_{B3}$ | $R_{B1}$ |
| $L_{A1654}$ | $R_{B8}$ | H | $R_{B3}$ | $R_{B4}$ |
| $L_{A1655}$ | $R_{B8}$ | H | $R_{B3}$ | $R_{B7}$ |
| $L_{A1656}$ | $R_{B8}$ | H | $R_{B3}$ | $R_{B10}$ |
| $L_{A1657}$ | $R_{B8}$ | H | $R_{B3}$ | $R_{A3}$ |
| $L_{A1658}$ | $R_{B8}$ | H | $R_{B3}$ | $R_{A34}$ |
| $L_{A1659}$ | $R_{B8}$ | H | $R_{B4}$ | $R_{B1}$ |
| $L_{A1660}$ | $R_{B8}$ | H | $R_{B4}$ | $R_{B3}$ |
| $L_{A1661}$ | $R_{B8}$ | H | $R_{B4}$ | $R_{B7}$ |
| $L_{A1662}$ | $R_{B8}$ | H | $R_{B4}$ | $R_{B10}$ |
| $L_{A1663}$ | $R_{B8}$ | H | $R_{B4}$ | $R_{A3}$ |
| $L_{A1664}$ | $R_{B8}$ | H | $R_{B4}$ | $R_{A34}$ |
| $L_{A1665}$ | $R_{B8}$ | H | $R_{B7}$ | $R_{B1}$ |
| $L_{A1666}$ | $R_{B8}$ | H | $R_{B7}$ | $R_{B3}$ |
| $L_{A1667}$ | $R_{B8}$ | H | $R_{B7}$ | $R_{B4}$ |
| $L_{A1668}$ | $R_{B8}$ | H | $R_{B7}$ | $R_{B10}$ |
| $L_{A1669}$ | $R_{B8}$ | H | $R_{B7}$ | $R_{A3}$ |
| $L_{A1670}$ | $R_{B8}$ | H | $R_{B7}$ | $R_{A34}$ |
| $L_{A1671}$ | $R_{B8}$ | H | $R_{B10}$ | $R_{B1}$ |
| $L_{A1672}$ | $R_{B8}$ | H | $R_{B10}$ | $R_{B3}$ |
| $L_{A1673}$ | $R_{B8}$ | H | $R_{B10}$ | $R_{B4}$ |
| $L_{A1674}$ | $R_{B8}$ | H | $R_{B10}$ | $R_{B7}$ |

-continued

| Ligand | $R^1$ | $R^2$ | $R^4$ | $R^5$ |
|---|---|---|---|---|
| $L_{A1675}$ | $R_{B8}$ | H | $R_{B10}$ | $R_{A3}$ |
| $L_{A1676}$ | $R_{B8}$ | H | $R_{B10}$ | $R_{A34}$ |
| $L_{A1677}$ | $R_{B8}$ | H | $R_{A3}$ | $R_{B1}$ |
| $L_{A1678}$ | $R_{B8}$ | H | $R_{A3}$ | $R_{B3}$ |
| $L_{A1679}$ | $R_{B8}$ | H | $R_{A3}$ | $R_{B4}$ |
| $L_{A1680}$ | $R_{B8}$ | H | $R_{A3}$ | $R_{B7}$ |
| $L_{A1681}$ | $R_{B8}$ | H | $R_{A3}$ | $R_{B10}$ |
| $L_{A1682}$ | $R_{B8}$ | H | $R_{A3}$ | $R_{A34}$ |
| $L_{A1683}$ | $R_{B8}$ | H | $R_{A34}$ | $R_{B1}$ |
| $L_{A1684}$ | $R_{B8}$ | H | $R_{A34}$ | $R_{B3}$ |
| $L_{A1685}$ | $R_{B8}$ | H | $R_{A34}$ | $R_{B4}$ |
| $L_{A1686}$ | $R_{B8}$ | H | $R_{A34}$ | $R_{B7}$ |
| $L_{A1687}$ | $R_{B8}$ | H | $R_{A34}$ | $R_{B10}$ |
| $L_{A1688}$ | $R_{B8}$ | H | $R_{A34}$ | $R_{A3}$ |
| $L_{A1689}$ | H | $R_{B6}$ | H | H |
| $L_{A1690}$ | H | $R_{B6}$ | $R_{B1}$ | H |
| $L_{A1691}$ | H | $R_{B6}$ | $R_{B3}$ | H |
| $L_{A1692}$ | H | $R_{B6}$ | $R_{B4}$ | H |
| $L_{A1693}$ | H | $R_{B6}$ | $R_{B7}$ | H |
| $L_{A1694}$ | H | $R_{B6}$ | $R_{B10}$ | H |
| $L_{A1695}$ | H | $R_{B6}$ | $R_{A3}$ | H |
| $L_{A1696}$ | H | $R_{B6}$ | $R_{A34}$ | H |
| $L_{A1697}$ | H | $R_{B6}$ | H | $R_{B1}$ |
| $L_{A1698}$ | H | $R_{B6}$ | H | $R_{B2}$ |
| $L_{A1699}$ | H | $R_{B6}$ | H | $R_{B3}$ |
| $L_{A1700}$ | H | $R_{B6}$ | H | $R_{B4}$ |
| $L_{A1701}$ | H | $R_{B6}$ | H | $R_{B7}$ |
| $L_{A1702}$ | H | $R_{B6}$ | H | $R_{B10}$ |
| $L_{A1703}$ | H | $R_{B6}$ | H | $R_{A3}$ |
| $L_{A1704}$ | H | $R_{B6}$ | H | $R_{A34}$ |
| $L_{A1705}$ | H | $R_{B6}$ | $R_{B1}$ | $R_{B1}$ |
| $L_{A1706}$ | H | $R_{B6}$ | $R_{B3}$ | $R_{B3}$ |
| $L_{A1707}$ | H | $R_{B6}$ | $R_{B4}$ | $R_{B4}$ |
| $L_{A1708}$ | H | $R_{B6}$ | $R_{B7}$ | $R_{B7}$ |
| $L_{A1709}$ | H | $R_{B6}$ | $R_{B10}$ | $R_{B10}$ |
| $L_{A1710}$ | H | $R_{B6}$ | $R_{A3}$ | $R_{A3}$ |
| $L_{A1711}$ | H | $R_{B6}$ | $R_{A34}$ | $R_{A34}$ |
| $L_{A1712}$ | H | $R_{B6}$ | $R_{B1}$ | $R_{B3}$ |
| $L_{A1713}$ | H | $R_{B6}$ | $R_{B1}$ | $R_{B4}$ |
| $L_{A1714}$ | H | $R_{B6}$ | $R_{B1}$ | $R_{B7}$ |
| $L_{A1715}$ | H | $R_{B6}$ | $R_{B1}$ | $R_{B10}$ |
| $L_{A1716}$ | H | $R_{B6}$ | $R_{B1}$ | $R_{A3}$ |
| $L_{A1717}$ | H | $R_{B6}$ | $R_{B1}$ | $R_{A34}$ |
| $L_{A1718}$ | H | $R_{B6}$ | $R_{B3}$ | $R_{B1}$ |
| $L_{A1719}$ | H | $R_{B6}$ | $R_{B3}$ | $R_{B4}$ |
| $L_{A1720}$ | H | $R_{B6}$ | $R_{B3}$ | $R_{B7}$ |
| $L_{A1721}$ | H | $R_{B6}$ | $R_{B3}$ | $R_{B10}$ |
| $L_{A1722}$ | H | $R_{B6}$ | $R_{B3}$ | $R_{A3}$ |
| $L_{A1723}$ | H | $R_{B6}$ | $R_{B3}$ | $R_{A34}$ |
| $L_{A1724}$ | H | $R_{B6}$ | $R_{B4}$ | $R_{B1}$ |
| $L_{A1725}$ | H | $R_{B6}$ | $R_{B4}$ | $R_{B3}$ |
| $L_{A1726}$ | H | $R_{B6}$ | $R_{B4}$ | $R_{B7}$ |
| $L_{A1727}$ | H | $R_{B6}$ | $R_{B4}$ | $R_{B10}$ |
| $L_{A1728}$ | H | $R_{B6}$ | $R_{B4}$ | $R_{A3}$ |
| $L_{A1729}$ | H | $R_{B6}$ | $R_{B4}$ | $R_{A34}$ |
| $L_{A1730}$ | H | $R_{B6}$ | $R_{B7}$ | $R_{B1}$ |
| $L_{A1731}$ | H | $R_{B6}$ | $R_{B7}$ | $R_{B3}$ |
| $L_{A1732}$ | H | $R_{B6}$ | $R_{B7}$ | $R_{B4}$ |
| $L_{A1733}$ | H | $R_{B6}$ | $R_{B7}$ | $R_{B10}$ |
| $L_{A1734}$ | H | $R_{B6}$ | $R_{B7}$ | $R_{A3}$ |
| $L_{A1735}$ | H | $R_{B6}$ | $R_{B7}$ | $R_{A34}$ |
| $L_{A1736}$ | H | $R_{B6}$ | $R_{B10}$ | $R_{B1}$ |
| $L_{A1737}$ | H | $R_{B6}$ | $R_{B10}$ | $R_{B3}$ |
| $L_{A1738}$ | H | $R_{B6}$ | $R_{B10}$ | $R_{B4}$ |
| $L_{A1739}$ | H | $R_{B6}$ | $R_{B10}$ | $R_{B7}$ |
| $L_{A1740}$ | H | $R_{B6}$ | $R_{B10}$ | $R_{A3}$ |
| $L_{A1741}$ | H | $R_{B6}$ | $R_{B10}$ | $R_{A34}$ |
| $L_{A1742}$ | H | $R_{B6}$ | $R_{A3}$ | $R_{B1}$ |
| $L_{A1743}$ | H | $R_{B6}$ | $R_{A3}$ | $R_{B3}$ |
| $L_{A1744}$ | H | $R_{B6}$ | $R_{A3}$ | $R_{B4}$ |
| $L_{A1745}$ | H | $R_{B6}$ | $R_{A3}$ | $R_{B7}$ |
| $L_{A1746}$ | H | $R_{B6}$ | $R_{A3}$ | $R_{B10}$ |
| $L_{A1747}$ | H | $R_{B6}$ | $R_{A3}$ | $R_{A34}$ |
| $L_{A1748}$ | H | $R_{B6}$ | $R_{A34}$ | $R_{B1}$ |
| $L_{A1749}$ | H | $R_{B6}$ | $R_{A34}$ | $R_{B3}$ |
| $L_{A1750}$ | H | $R_{B6}$ | $R_{A34}$ | $R_{B4}$ |
| $L_{A1751}$ | H | $R_{B6}$ | $R_{A34}$ | $R_{B7}$ |

-continued

| Ligand | $R^1$ | $R^2$ | $R^4$ | $R^5$ |
|---|---|---|---|---|
| $L_{A1752}$ | H | $R_{B6}$ | $R_{A34}$ | $R_{B10}$ |
| $L_{A1753}$ | H | $R_{B6}$ | $R_{A34}$ | $R_{A3}$ |
| $L_{A1754}$ | H | $R_{B8}$ | H | H |
| $L_{A1755}$ | H | $R_{B8}$ | $R_{B1}$ | H |
| $L_{A1756}$ | H | $R_{B8}$ | $R_{B3}$ | H |
| $L_{A1757}$ | H | $R_{B8}$ | $R_{B4}$ | H |
| $L_{A1758}$ | H | $R_{B8}$ | $R_{B7}$ | H |
| $L_{A1759}$ | H | $R_{B8}$ | $R_{B10}$ | H |
| $L_{A1760}$ | H | $R_{B8}$ | $R_{A3}$ | H |
| $L_{A1761}$ | H | $R_{B8}$ | $R_{A34}$ | H |
| $L_{A1762}$ | H | $R_{B8}$ | H | $R_{B1}$ |
| $L_{A1763}$ | H | $R_{B8}$ | H | $R_{B2}$ |
| $L_{A1764}$ | H | $R_{B8}$ | H | $R_{B3}$ |
| $L_{A1765}$ | H | $R_{B8}$ | H | $R_{B4}$ |
| $L_{A1766}$ | H | $R_{B8}$ | H | $R_{B7}$ |
| $L_{A1767}$ | H | $R_{B8}$ | H | $R_{B10}$ |
| $L_{A1768}$ | H | $R_{B8}$ | H | $R_{A3}$ |
| $L_{A1769}$ | H | $R_{B8}$ | H | $R_{A34}$ |
| $L_{A1770}$ | H | $R_{B8}$ | $R_{B1}$ | $R_{B1}$ |
| $L_{A1771}$ | H | $R_{B8}$ | $R_{B3}$ | $R_{B3}$ |
| $L_{A1772}$ | H | $R_{B8}$ | $R_{B4}$ | $R_{B4}$ |
| $L_{A1773}$ | H | $R_{B8}$ | $R_{B7}$ | $R_{B7}$ |
| $L_{A1774}$ | H | $R_{B8}$ | $R_{B10}$ | $R_{B10}$ |
| $L_{A1775}$ | H | $R_{B8}$ | $R_{A3}$ | $R_{A3}$ |
| $L_{A1776}$ | H | $R_{B8}$ | $R_{A34}$ | $R_{A34}$ |
| $L_{A1777}$ | H | $R_{B8}$ | $R_{B1}$ | $R_{B3}$ |
| $L_{A1778}$ | H | $R_{B8}$ | $R_{B1}$ | $R_{B4}$ |
| $L_{A1779}$ | H | $R_{B8}$ | $R_{B1}$ | $R_{B7}$ |
| $L_{A1780}$ | H | $R_{B8}$ | $R_{B1}$ | $R_{B10}$ |
| $L_{A1781}$ | H | $R_{B8}$ | $R_{B1}$ | $R_{A3}$ |
| $L_{A1782}$ | H | $R_{B8}$ | $R_{B1}$ | $R_{A34}$ |
| $L_{A1783}$ | H | $R_{B8}$ | $R_{B3}$ | $R_{B1}$ |
| $L_{A1784}$ | H | $R_{B8}$ | $R_{B3}$ | $R_{B4}$ |
| $L_{A1785}$ | H | $R_{B8}$ | $R_{B3}$ | $R_{B7}$ |
| $L_{A1786}$ | H | $R_{B8}$ | $R_{B3}$ | $R_{B10}$ |
| $L_{A1787}$ | H | $R_{B8}$ | $R_{B3}$ | $R_{A3}$ |
| $L_{A1788}$ | H | $R_{B8}$ | $R_{B3}$ | $R_{A34}$ |
| $L_{A1789}$ | H | $R_{B8}$ | $R_{B4}$ | $R_{B1}$ |
| $L_{A1790}$ | H | $R_{B8}$ | $R_{B4}$ | $R_{B3}$ |
| $L_{A1791}$ | H | $R_{B8}$ | $R_{B4}$ | $R_{B7}$ |
| $L_{A1792}$ | H | $R_{B8}$ | $R_{B4}$ | $R_{B10}$ |
| $L_{A1793}$ | H | $R_{B8}$ | $R_{B4}$ | $R_{A3}$ |
| $L_{A1794}$ | H | $R_{B8}$ | $R_{B4}$ | $R_{A34}$ |
| $L_{A1795}$ | H | $R_{B8}$ | $R_{B7}$ | $R_{B1}$ |
| $L_{A1796}$ | H | $R_{B8}$ | $R_{B7}$ | $R_{B3}$ |
| $L_{A1797}$ | H | $R_{B8}$ | $R_{B7}$ | $R_{B4}$ |
| $L_{A1798}$ | H | $R_{B8}$ | $R_{B7}$ | $R_{B10}$ |
| $L_{A1799}$ | H | $R_{B8}$ | $R_{B7}$ | $R_{A3}$ |
| $L_{A1800}$ | H | $R_{B8}$ | $R_{B7}$ | $R_{A34}$ |
| $L_{A1801}$ | H | $R_{B8}$ | $R_{B10}$ | $R_{B1}$ |
| $L_{A1802}$ | H | $R_{B8}$ | $R_{B10}$ | $R_{B3}$ |
| $L_{A1803}$ | H | $R_{B8}$ | $R_{B10}$ | $R_{B4}$ |
| $L_{A1804}$ | H | $R_{B8}$ | $R_{B10}$ | $R_{B7}$ |
| $L_{A1805}$ | H | $R_{B8}$ | $R_{B10}$ | $R_{A3}$ |
| $L_{A1806}$ | H | $R_{B8}$ | $R_{B10}$ | $R_{A34}$ |
| $L_{A1807}$ | H | $R_{B8}$ | $R_{A3}$ | $R_{B1}$ |
| $L_{A1808}$ | H | $R_{B8}$ | $R_{A3}$ | $R_{B3}$ |
| $L_{A1809}$ | H | $R_{B8}$ | $R_{A3}$ | $R_{B4}$ |
| $L_{A1810}$ | H | $R_{B8}$ | $R_{A3}$ | $R_{B7}$ |
| $L_{A1811}$ | H | $R_{B8}$ | $R_{A3}$ | $R_{B10}$ |
| $L_{A1812}$ | H | $R_{B8}$ | $R_{A3}$ | $R_{A34}$ |
| $L_{A1813}$ | H | $R_{B8}$ | $R_{A34}$ | $R_{B1}$ |
| $L_{A1814}$ | H | $R_{B8}$ | $R_{A34}$ | $R_{B3}$ |
| $L_{A1815}$ | H | $R_{B8}$ | $R_{A34}$ | $R_{B4}$ |
| $L_{A1816}$ | H | $R_{B8}$ | $R_{A34}$ | $R_{B7}$ |
| $L_{A1817}$ | H | $R_{B8}$ | $R_{A34}$ | $R_{B10}$ |
| $L_{A1818}$ | H | $R_{B8}$ | $R_{A34}$ | $R_{A3}$ |

$L_{A1819}$ through $L_{A2078}$ that are based on a structure of Formula IX,

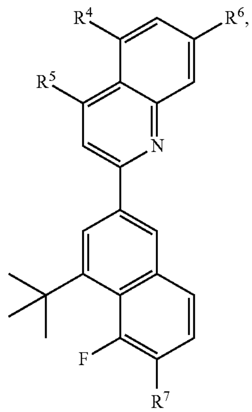

in which $R^4$, $R^5$, $R^6$, and $R^7$ are defined as provided below:

| Ligand | $R^4$ | $R^5$ | $R^6$ | $R^7$ |
|---|---|---|---|---|
| $L_{A1819}$ | H | H | H | H |
| $L_{A1820}$ | $R_{B1}$ | H | H | H |
| $L_{A1821}$ | $R_{B3}$ | H | H | H |
| $L_{A1822}$ | $R_{B4}$ | H | H | H |
| $L_{A1823}$ | $R_{B7}$ | H | H | H |
| $L_{A1824}$ | $R_{B10}$ | H | H | H |
| $L_{A1825}$ | $R_{A3}$ | H | H | H |
| $L_{A1826}$ | $R_{A34}$ | H | H | H |
| $L_{A1827}$ | H | $R_{B1}$ | H | H |
| $L_{A1828}$ | H | $R_{B2}$ | H | H |
| $L_{A1829}$ | H | $R_{B3}$ | H | H |
| $L_{A1830}$ | H | $R_{B4}$ | H | H |
| $L_{A1831}$ | H | $R_{B7}$ | H | H |
| $L_{A1832}$ | H | $R_{B10}$ | H | H |
| $L_{A1833}$ | H | $R_{A3}$ | H | H |
| $L_{A1834}$ | H | $R_{A34}$ | H | H |
| $L_{A1835}$ | $R_{B1}$ | $R_{B1}$ | H | H |
| $L_{A1836}$ | $R_{B3}$ | $R_{B3}$ | H | H |
| $L_{A1837}$ | $R_{B4}$ | $R_{B4}$ | H | H |
| $L_{A1838}$ | $R_{B7}$ | $R_{B7}$ | H | H |
| $L_{A1839}$ | $R_{B10}$ | $R_{B10}$ | H | H |
| $L_{A1840}$ | $R_{A3}$ | $R_{A3}$ | H | H |
| $L_{A1841}$ | $R_{A34}$ | $R_{A34}$ | H | H |
| $L_{A1842}$ | $R_{B1}$ | $R_{B3}$ | H | H |
| $L_{A1843}$ | $R_{B1}$ | $R_{B4}$ | H | H |
| $L_{A1844}$ | $R_{B1}$ | $R_{B7}$ | H | H |
| $L_{A1845}$ | $R_{B1}$ | $R_{B10}$ | H | H |
| $L_{A1846}$ | $R_{B1}$ | $R_{A3}$ | H | H |
| $L_{A1847}$ | $R_{B1}$ | $R_{A34}$ | H | H |
| $L_{A1848}$ | $R_{B3}$ | $R_{B1}$ | H | H |
| $L_{A1849}$ | $R_{B3}$ | $R_{B4}$ | H | H |
| $L_{A1850}$ | $R_{B3}$ | $R_{B7}$ | H | H |
| $L_{A1851}$ | $R_{B3}$ | $R_{B10}$ | H | H |
| $L_{A1852}$ | $R_{B3}$ | $R_{A3}$ | H | H |
| $L_{A1853}$ | $R_{B3}$ | $R_{A34}$ | H | H |
| $L_{A1854}$ | $R_{B4}$ | $R_{B1}$ | H | H |
| $L_{A1855}$ | $R_{B4}$ | $R_{B3}$ | H | H |
| $L_{A1856}$ | $R_{B4}$ | $R_{B7}$ | H | H |
| $L_{A1857}$ | $R_{B4}$ | $R_{B10}$ | H | H |
| $L_{A1858}$ | $R_{B4}$ | $R_{A3}$ | H | H |
| $L_{A1859}$ | $R_{B4}$ | $R_{A34}$ | H | H |
| $L_{A1860}$ | $R_{B7}$ | $R_{B1}$ | H | H |
| $L_{A1861}$ | $R_{B7}$ | $R_{B3}$ | H | H |
| $L_{A1862}$ | $R_{B7}$ | $R_{B4}$ | H | H |
| $L_{A1863}$ | $R_{B7}$ | $R_{B10}$ | H | H |
| $L_{A1864}$ | $R_{B7}$ | $R_{A3}$ | H | H |
| $L_{A1865}$ | $R_{B7}$ | $R_{A34}$ | H | H |
| $L_{A1866}$ | $R_{B10}$ | $R_{B1}$ | H | H |
| $L_{A1867}$ | $R_{B10}$ | $R_{B3}$ | H | H |
| $L_{A1868}$ | $R_{B10}$ | $R_{B4}$ | H | H |
| $L_{A1869}$ | $R_{B10}$ | $R_{B7}$ | H | H |

-continued

| Ligand | $R^4$ | $R^5$ | $R^6$ | $R^7$ |
|---|---|---|---|---|
| $L_{A1870}$ | $R_{B10}$ | $R_{A3}$ | H | H |
| $L_{A1871}$ | $R_{B10}$ | $R_{A34}$ | H | H |
| $L_{A1872}$ | $R_{A3}$ | $R_{B1}$ | H | H |
| $L_{A1873}$ | $R_{A3}$ | $R_{B3}$ | H | H |
| $L_{A1874}$ | $R_{A3}$ | $R_{B4}$ | H | H |
| $L_{A1875}$ | $R_{A3}$ | $R_{B7}$ | H | H |
| $L_{A1876}$ | $R_{A3}$ | $R_{B10}$ | H | H |
| $L_{A1877}$ | $R_{A3}$ | $R_{A34}$ | H | H |
| $L_{A1878}$ | $R_{A34}$ | $R_{B1}$ | H | H |
| $L_{A1879}$ | $R_{A34}$ | $R_{B3}$ | H | H |
| $L_{A1880}$ | $R_{A34}$ | $R_{B4}$ | H | H |
| $L_{A1881}$ | $R_{A34}$ | $R_{B7}$ | H | H |
| $L_{A1882}$ | $R_{A34}$ | $R_{B10}$ | H | H |
| $L_{A1883}$ | $R_{A34}$ | $R_{A3}$ | H | H |
| $L_{A1884}$ | H | H | H | $R_{B1}$ |
| $L_{A1885}$ | $R_{B1}$ | H | H | $R_{B1}$ |
| $L_{A1886}$ | $R_{B3}$ | H | H | $R_{B1}$ |
| $L_{A1887}$ | $R_{B4}$ | H | H | $R_{B1}$ |
| $L_{A1888}$ | $R_{B7}$ | H | H | $R_{B1}$ |
| $L_{A1889}$ | $R_{B10}$ | H | H | $R_{B1}$ |
| $L_{A1890}$ | $R_{A3}$ | H | H | $R_{B1}$ |
| $L_{A1891}$ | $R_{A34}$ | H | H | $R_{B1}$ |
| $L_{A1892}$ | H | $R_{B1}$ | H | $R_{B1}$ |
| $L_{A1893}$ | H | $R_{B2}$ | H | $R_{B1}$ |
| $L_{A1894}$ | H | $R_{B3}$ | H | $R_{B1}$ |
| $L_{A1895}$ | H | $R_{B4}$ | H | $R_{B1}$ |
| $L_{A1896}$ | H | $R_{B7}$ | H | $R_{B1}$ |
| $L_{A1897}$ | H | $R_{B10}$ | H | $R_{B1}$ |
| $L_{A1898}$ | H | $R_{A3}$ | H | $R_{B1}$ |
| $L_{A1899}$ | H | $R_{A34}$ | H | $R_{B1}$ |
| $L_{A1900}$ | $R_{B1}$ | $R_{B1}$ | H | $R_{B1}$ |
| $L_{A1901}$ | $R_{B3}$ | $R_{B3}$ | H | $R_{B1}$ |
| $L_{A1902}$ | $R_{B4}$ | $R_{B4}$ | H | $R_{B1}$ |
| $L_{A1903}$ | $R_{B7}$ | $R_{B7}$ | H | $R_{B1}$ |
| $L_{A1904}$ | $R_{B10}$ | $R_{B10}$ | H | $R_{B1}$ |
| $L_{A1905}$ | $R_{A3}$ | $R_{A3}$ | H | $R_{B1}$ |
| $L_{A1906}$ | $R_{A34}$ | $R_{A34}$ | H | $R_{B1}$ |
| $L_{A1907}$ | $R_{B1}$ | $R_{B3}$ | H | $R_{B1}$ |
| $L_{A1908}$ | $R_{B1}$ | $R_{B4}$ | H | $R_{B1}$ |
| $L_{A1909}$ | $R_{B1}$ | $R_{B7}$ | H | $R_{B1}$ |
| $L_{A1910}$ | $R_{B1}$ | $R_{B10}$ | H | $R_{B1}$ |
| $L_{A1911}$ | $R_{B1}$ | $R_{A3}$ | H | $R_{B1}$ |
| $L_{A1912}$ | $R_{B1}$ | $R_{A34}$ | H | $R_{B1}$ |
| $L_{A1913}$ | $R_{B3}$ | $R_{B1}$ | H | $R_{B1}$ |
| $L_{A1914}$ | $R_{B3}$ | $R_{B4}$ | H | $R_{B1}$ |
| $L_{A1915}$ | $R_{B3}$ | $R_{B7}$ | H | $R_{B1}$ |
| $L_{A1916}$ | $R_{B3}$ | $R_{B10}$ | H | $R_{B1}$ |
| $L_{A1917}$ | $R_{B3}$ | $R_{A3}$ | H | $R_{B1}$ |
| $L_{A1918}$ | $R_{B3}$ | $R_{A34}$ | H | $R_{B1}$ |
| $L_{A1919}$ | $R_{B4}$ | $R_{B1}$ | H | $R_{B1}$ |
| $L_{A1920}$ | $R_{B4}$ | $R_{B3}$ | H | $R_{B1}$ |
| $L_{A1921}$ | $R_{B4}$ | $R_{B7}$ | H | $R_{B1}$ |
| $L_{A1922}$ | $R_{B4}$ | $R_{B10}$ | H | $R_{B1}$ |
| $L_{A1923}$ | $R_{B4}$ | $R_{A3}$ | H | $R_{B1}$ |
| $L_{A1924}$ | $R_{B4}$ | $R_{A34}$ | H | $R_{B1}$ |
| $L_{A1925}$ | $R_{B7}$ | $R_{B1}$ | H | $R_{B1}$ |
| $L_{A1926}$ | $R_{B7}$ | $R_{B3}$ | H | $R_{B1}$ |
| $L_{A1927}$ | $R_{B7}$ | $R_{B4}$ | H | $R_{B1}$ |
| $L_{A1928}$ | $R_{B7}$ | $R_{B10}$ | H | $R_{B1}$ |
| $L_{A1929}$ | $R_{B7}$ | $R_{A3}$ | H | $R_{B1}$ |
| $L_{A1930}$ | $R_{B7}$ | $R_{A34}$ | H | $R_{B1}$ |
| $L_{A1931}$ | $R_{B10}$ | $R_{B1}$ | H | $R_{B1}$ |
| $L_{A1932}$ | $R_{B10}$ | $R_{B3}$ | H | $R_{B1}$ |
| $L_{A1933}$ | $R_{B10}$ | $R_{B4}$ | H | $R_{B1}$ |
| $L_{A1934}$ | $R_{B10}$ | $R_{B7}$ | H | $R_{B1}$ |
| $L_{A1935}$ | $R_{B10}$ | $R_{A3}$ | H | $R_{B1}$ |
| $L_{A1936}$ | $R_{B10}$ | $R_{A34}$ | H | $R_{B1}$ |
| $L_{A1937}$ | $R_{A3}$ | $R_{B1}$ | H | $R_{B1}$ |
| $L_{A1938}$ | $R_{A3}$ | $R_{B3}$ | H | $R_{B1}$ |
| $L_{A1939}$ | $R_{A3}$ | $R_{B4}$ | H | $R_{B1}$ |
| $L_{A1940}$ | $R_{A3}$ | $R_{B7}$ | H | $R_{B1}$ |
| $L_{A1941}$ | $R_{A3}$ | $R_{B10}$ | H | $R_{B1}$ |
| $L_{A1942}$ | $R_{A3}$ | $R_{A34}$ | H | $R_{B1}$ |
| $L_{A1943}$ | $R_{A34}$ | $R_{B1}$ | H | $R_{B1}$ |
| $L_{A1944}$ | $R_{A34}$ | $R_{B3}$ | H | $R_{B1}$ |
| $L_{A1945}$ | $R_{A34}$ | $R_{B4}$ | H | $R_{B1}$ |
| $L_{A1946}$ | $R_{A34}$ | $R_{B7}$ | H | $R_{B1}$ |

-continued

| Ligand | $R^4$ | $R^5$ | $R^6$ | $R^7$ |
|---|---|---|---|---|
| $L_{A1947}$ | $R_{A34}$ | $R_{B10}$ | H | $R_{B1}$ |
| $L_{A1948}$ | $R_{A34}$ | $R_{A3}$ | H | $R_{B1}$ |
| $L_{A1949}$ | H | H | $R_{B1}$ | H |
| $L_{A1950}$ | $R_{B1}$ | H | $R_{B1}$ | H |
| $L_{A1951}$ | $R_{B3}$ | H | $R_{B1}$ | H |
| $L_{A1952}$ | $R_{B4}$ | H | $R_{B1}$ | H |
| $L_{A1953}$ | $R_{B7}$ | H | $R_{B1}$ | H |
| $L_{A1954}$ | $R_{B10}$ | H | $R_{B1}$ | H |
| $L_{A1955}$ | $R_{A3}$ | H | $R_{B1}$ | H |
| $L_{A1956}$ | $R_{A34}$ | H | $R_{B1}$ | H |
| $L_{A1957}$ | H | $R_{B1}$ | $R_{B1}$ | H |
| $L_{A1958}$ | H | $R_{B2}$ | $R_{B1}$ | H |
| $L_{A1959}$ | H | $R_{B3}$ | $R_{B1}$ | H |
| $L_{A1960}$ | H | $R_{B4}$ | $R_{B1}$ | H |
| $L_{A1961}$ | H | $R_{B7}$ | $R_{B1}$ | H |
| $L_{A1962}$ | H | $R_{B10}$ | $R_{B1}$ | H |
| $L_{A1963}$ | H | $R_{A3}$ | $R_{B1}$ | H |
| $L_{A1964}$ | H | $R_{A34}$ | $R_{B1}$ | H |
| $L_{A1965}$ | $R_{B1}$ | $R_{B1}$ | $R_{B1}$ | H |
| $L_{A1966}$ | $R_{B3}$ | $R_{B3}$ | $R_{B1}$ | H |
| $L_{A1967}$ | $R_{B4}$ | $R_{B4}$ | $R_{B1}$ | H |
| $L_{A1968}$ | $R_{B7}$ | $R_{B7}$ | $R_{B1}$ | H |
| $L_{A1969}$ | $R_{B10}$ | $R_{B10}$ | $R_{B1}$ | H |
| $L_{A1970}$ | $R_{A3}$ | $R_{A3}$ | $R_{B1}$ | H |
| $L_{A1971}$ | $R_{A34}$ | $R_{A34}$ | $R_{B1}$ | H |
| $L_{A1972}$ | $R_{B1}$ | $R_{B3}$ | $R_{B1}$ | H |
| $L_{A1973}$ | $R_{B1}$ | $R_{B4}$ | $R_{B1}$ | H |
| $L_{A1974}$ | $R_{B1}$ | $R_{B7}$ | $R_{B1}$ | H |
| $L_{A1975}$ | $R_{B1}$ | $R_{B10}$ | $R_{B1}$ | H |
| $L_{A1976}$ | $R_{B1}$ | $R_{A3}$ | $R_{B1}$ | H |
| $L_{A1977}$ | $R_{B1}$ | $R_{A34}$ | $R_{B1}$ | H |
| $L_{A1978}$ | $R_{B3}$ | $R_{B1}$ | $R_{B1}$ | H |
| $L_{A1979}$ | $R_{B3}$ | $R_{B4}$ | $R_{B1}$ | H |
| $L_{A1980}$ | $R_{B3}$ | $R_{B7}$ | $R_{B1}$ | H |
| $L_{A1981}$ | $R_{B3}$ | $R_{B10}$ | $R_{B1}$ | H |
| $L_{A1982}$ | $R_{B3}$ | $R_{A3}$ | $R_{B1}$ | H |
| $L_{A1983}$ | $R_{B3}$ | $R_{A34}$ | $R_{B1}$ | H |
| $L_{A1984}$ | $R_{B4}$ | $R_{B1}$ | $R_{B1}$ | H |
| $L_{A1985}$ | $R_{B4}$ | $R_{B3}$ | $R_{B1}$ | H |
| $L_{A1986}$ | $R_{B4}$ | $R_{B7}$ | $R_{B1}$ | H |
| $L_{A1987}$ | $R_{B4}$ | $R_{B10}$ | $R_{B1}$ | H |
| $L_{A1988}$ | $R_{B4}$ | $R_{A3}$ | $R_{B1}$ | H |
| $L_{A1989}$ | $R_{B4}$ | $R_{A34}$ | $R_{B1}$ | H |
| $L_{A1990}$ | $R_{B7}$ | $R_{B1}$ | $R_{B1}$ | H |
| $L_{A1991}$ | $R_{B7}$ | $R_{B3}$ | $R_{B1}$ | H |
| $L_{A1992}$ | $R_{B7}$ | $R_{B4}$ | $R_{B1}$ | H |
| $L_{A1993}$ | $R_{B7}$ | $R_{B10}$ | $R_{B1}$ | H |
| $L_{A1994}$ | $R_{B7}$ | $R_{A3}$ | $R_{B1}$ | H |
| $L_{A1995}$ | $R_{B7}$ | $R_{A34}$ | $R_{B1}$ | H |
| $L_{A1996}$ | $R_{B10}$ | $R_{B1}$ | $R_{B1}$ | H |
| $L_{A1997}$ | $R_{B10}$ | $R_{B3}$ | $R_{B1}$ | H |
| $L_{A1998}$ | $R_{B10}$ | $R_{B4}$ | $R_{B1}$ | H |
| $L_{A1999}$ | $R_{B10}$ | $R_{B7}$ | $R_{B1}$ | H |
| $L_{A2000}$ | $R_{B10}$ | $R_{A3}$ | $R_{B1}$ | H |
| $L_{A2001}$ | $R_{B10}$ | $R_{A34}$ | $R_{B1}$ | H |
| $L_{A2002}$ | $R_{A3}$ | $R_{B1}$ | $R_{B1}$ | H |
| $L_{A2003}$ | $R_{A3}$ | $R_{B3}$ | $R_{B1}$ | H |
| $L_{A2004}$ | $R_{A3}$ | $R_{B4}$ | $R_{B1}$ | H |
| $L_{A2005}$ | $R_{A3}$ | $R_{B7}$ | $R_{B1}$ | H |
| $L_{A2006}$ | $R_{A3}$ | $R_{B10}$ | $R_{B1}$ | H |
| $L_{A2007}$ | $R_{A3}$ | $R_{A34}$ | $R_{B1}$ | H |
| $L_{A2008}$ | $R_{A34}$ | $R_{B1}$ | $R_{B1}$ | H |
| $L_{A2009}$ | $R_{A34}$ | $R_{B3}$ | $R_{B1}$ | H |
| $L_{A2010}$ | $R_{A34}$ | $R_{B4}$ | $R_{B1}$ | H |
| $L_{A2011}$ | $R_{A34}$ | $R_{B7}$ | $R_{B1}$ | H |
| $L_{A2012}$ | $R_{A34}$ | $R_{B10}$ | $R_{B1}$ | H |
| $L_{A2013}$ | $R_{A34}$ | $R_{A3}$ | $R_{B1}$ | H |
| $L_{A2014}$ | H | H | $R_{B1}$ | $R_{B1}$ |
| $L_{A2015}$ | $R_{B1}$ | H | $R_{B1}$ | $R_{B1}$ |
| $L_{A2016}$ | $R_{B3}$ | H | $R_{B1}$ | $R_{B1}$ |
| $L_{A2017}$ | $R_{B4}$ | H | $R_{B1}$ | $R_{B1}$ |
| $L_{A2018}$ | $R_{B7}$ | H | $R_{B1}$ | $R_{B1}$ |
| $L_{A2019}$ | $R_{B10}$ | H | $R_{B1}$ | $R_{B1}$ |
| $L_{A2020}$ | $R_{A3}$ | H | $R_{B1}$ | $R_{B1}$ |
| $L_{A2021}$ | $R_{A34}$ | H | $R_{B1}$ | $R_{B1}$ |
| $L_{A2022}$ | H | $R_{B1}$ | $R_{B1}$ | $R_{B1}$ |
| $L_{A2023}$ | H | $R_{B2}$ | $R_{B1}$ | $R_{B1}$ |

-continued

| Ligand | $R^4$ | $R^5$ | $R^6$ | $R^7$ |
|---|---|---|---|---|
| $L_{A2024}$ | H | $R_{B3}$ | $R_{B1}$ | $R_{B1}$ |
| $L_{A2025}$ | H | $R_{B4}$ | $R_{B1}$ | $R_{B1}$ |
| $L_{A2026}$ | H | $R_{B7}$ | $R_{B1}$ | $R_{B1}$ |
| $L_{A2027}$ | H | $R_{B10}$ | $R_{B1}$ | $R_{B1}$ |
| $L_{A2028}$ | H | $R_{A3}$ | $R_{B1}$ | $R_{B1}$ |
| $L_{A2029}$ | H | $R_{A34}$ | $R_{B1}$ | $R_{B1}$ |
| $L_{A2030}$ | $R_{B1}$ | $R_{B1}$ | $R_{B1}$ | $R_{B1}$ |
| $L_{A2031}$ | $R_{B3}$ | $R_{B3}$ | $R_{B1}$ | $R_{B1}$ |
| $L_{A2032}$ | $R_{B4}$ | $R_{B4}$ | $R_{B1}$ | $R_{B1}$ |
| $L_{A2033}$ | $R_{B7}$ | $R_{B7}$ | $R_{B1}$ | $R_{B1}$ |
| $L_{A2034}$ | $R_{B10}$ | $R_{B10}$ | $R_{B1}$ | $R_{B1}$ |
| $L_{A2035}$ | $R_{A3}$ | $R_{A3}$ | $R_{B1}$ | $R_{B1}$ |
| $L_{A2036}$ | $R_{A34}$ | $R_{A34}$ | $R_{B1}$ | $R_{B1}$ |
| $L_{A2037}$ | $R_{B1}$ | $R_{B3}$ | $R_{B1}$ | $R_{B1}$ |
| $L_{A2038}$ | $R_{B1}$ | $R_{B4}$ | $R_{B1}$ | $R_{B1}$ |
| $L_{A2039}$ | $R_{B1}$ | $R_{B7}$ | $R_{B1}$ | $R_{B1}$ |
| $L_{A2040}$ | $R_{B1}$ | $R_{B10}$ | $R_{B1}$ | $R_{B1}$ |
| $L_{A2041}$ | $R_{B1}$ | $R_{A3}$ | $R_{B1}$ | $R_{B1}$ |
| $L_{A2042}$ | $R_{B1}$ | $R_{A34}$ | $R_{B1}$ | $R_{B1}$ |
| $L_{A2043}$ | $R_{B3}$ | $R_{B1}$ | $R_{B1}$ | $R_{B1}$ |
| $L_{A2044}$ | $R_{B3}$ | $R_{B4}$ | $R_{B1}$ | $R_{B1}$ |
| $L_{A2045}$ | $R_{B3}$ | $R_{B7}$ | $R_{B1}$ | $R_{B1}$ |
| $L_{A2046}$ | $R_{B3}$ | $R_{B10}$ | $R_{B1}$ | $R_{B1}$ |
| $L_{A2047}$ | $R_{B3}$ | $R_{A3}$ | $R_{B1}$ | $R_{B1}$ |
| $L_{A2048}$ | $R_{B3}$ | $R_{A34}$ | $R_{B1}$ | $R_{B1}$ |
| $L_{A2049}$ | $R_{B4}$ | $R_{B1}$ | $R_{B1}$ | $R_{B1}$ |
| $L_{A2050}$ | $R_{B4}$ | $R_{B3}$ | $R_{B1}$ | $R_{B1}$ |
| $L_{A2051}$ | $R_{B4}$ | $R_{B7}$ | $R_{B1}$ | $R_{B1}$ |
| $L_{A2052}$ | $R_{B4}$ | $R_{B10}$ | $R_{B1}$ | $R_{B1}$ |
| $L_{A2053}$ | $R_{B4}$ | $R_{A3}$ | $R_{B1}$ | $R_{B1}$ |
| $L_{A2054}$ | $R_{B4}$ | $R_{A34}$ | $R_{B1}$ | $R_{B1}$ |
| $L_{A2055}$ | $R_{B7}$ | $R_{B1}$ | $R_{B1}$ | $R_{B1}$ |
| $L_{A2056}$ | $R_{B7}$ | $R_{B3}$ | $R_{B1}$ | $R_{B1}$ |
| $L_{A2057}$ | $R_{B7}$ | $R_{B4}$ | $R_{B1}$ | $R_{B1}$ |
| $L_{A2058}$ | $R_{B7}$ | $R_{B10}$ | $R_{B1}$ | $R_{B1}$ |
| $L_{A2059}$ | $R_{B7}$ | $R_{A3}$ | $R_{B1}$ | $R_{B1}$ |
| $L_{A2060}$ | $R_{B7}$ | $R_{A34}$ | $R_{B1}$ | $R_{B1}$ |
| $L_{A2061}$ | $R_{B10}$ | $R_{B1}$ | $R_{B1}$ | $R_{B1}$ |
| $L_{A2062}$ | $R_{B10}$ | $R_{B3}$ | $R_{B1}$ | $R_{B1}$ |
| $L_{A2063}$ | $R_{B10}$ | $R_{B4}$ | $R_{B1}$ | $R_{B1}$ |
| $L_{A2064}$ | $R_{B10}$ | $R_{B7}$ | $R_{B1}$ | $R_{B1}$ |
| $L_{A2065}$ | $R_{B10}$ | $R_{A3}$ | $R_{B1}$ | $R_{B1}$ |
| $L_{A2066}$ | $R_{B10}$ | $R_{A34}$ | $R_{B1}$ | $R_{B1}$ |
| $L_{A2067}$ | $R_{A3}$ | $R_{B1}$ | $R_{B1}$ | $R_{B1}$ |
| $L_{A2068}$ | $R_{A3}$ | $R_{B3}$ | $R_{B1}$ | $R_{B1}$ |
| $L_{A2069}$ | $R_{A3}$ | $R_{B4}$ | $R_{B1}$ | $R_{B1}$ |
| $L_{A2070}$ | $R_{A3}$ | $R_{B7}$ | $R_{B1}$ | $R_{B1}$ |
| $L_{A2071}$ | $R_{A3}$ | $R_{B10}$ | $R_{B1}$ | $R_{B1}$ |
| $L_{A2072}$ | $R_{A3}$ | $R_{A34}$ | $R_{B1}$ | $R_{B1}$ |
| $L_{A2073}$ | $R_{A34}$ | $R_{B1}$ | $R_{B1}$ | $R_{B1}$ |
| $L_{A2074}$ | $R_{A34}$ | $R_{B3}$ | $R_{B1}$ | $R_{B1}$ |
| $L_{A2075}$ | $R_{A34}$ | $R_{B4}$ | $R_{B1}$ | $R_{B1}$ |
| $L_{A2076}$ | $R_{A34}$ | $R_{B7}$ | $R_{B1}$ | $R_{B1}$ |
| $L_{A2077}$ | $R_{A34}$ | $R_{B10}$ | $R_{B1}$ | $R_{B1}$ |
| $L_{A2078}$ | $R_{A34}$ | $R_{A3}$ | $R_{B1}$ | $R_{B1}$ |

$L_{A2079}$ through $L_{A2338}$ that are based on a structure of Formula X,

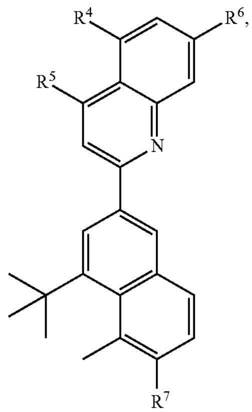

in which $R^4$, $R^5$, $R^6$, and $R^7$ are defined as provided below:

| Ligand | $R^4$ | $R^5$ | $R^6$ | $R^7$ |
|---|---|---|---|---|
| $L_{A2079}$ | H | H | H | H |
| $L_{A2080}$ | $R_{B1}$ | H | H | H |
| $L_{A2081}$ | $R_{B3}$ | H | H | H |
| $L_{A2082}$ | $R_{B4}$ | H | H | H |
| $L_{A2083}$ | $R_{B7}$ | H | H | H |
| $L_{A2084}$ | $R_{B10}$ | H | H | H |
| $L_{A2085}$ | $R_{A3}$ | H | H | H |
| $L_{A2086}$ | $R_{A34}$ | H | H | H |
| $L_{A2087}$ | H | $R_{B1}$ | H | H |
| $L_{A2088}$ | H | $R_{B2}$ | H | H |
| $L_{A2089}$ | H | $R_{B3}$ | H | H |
| $L_{A2090}$ | H | $R_{B4}$ | H | H |
| $L_{A2091}$ | H | $R_{B7}$ | H | H |
| $L_{A2092}$ | H | $R_{B10}$ | H | H |
| $L_{A2093}$ | H | $R_{A3}$ | H | H |
| $L_{A2094}$ | H | $R_{A34}$ | H | H |
| $L_{A2095}$ | $R_{B1}$ | $R_{B1}$ | H | H |
| $L_{A2096}$ | $R_{B3}$ | $R_{B3}$ | H | H |
| $L_{A2097}$ | $R_{B4}$ | $R_{B4}$ | H | H |
| $L_{A2098}$ | $R_{B7}$ | $R_{B7}$ | H | H |
| $L_{A2099}$ | $R_{B10}$ | $R_{B10}$ | H | H |
| $L_{A2100}$ | $R_{A3}$ | $R_{A3}$ | H | H |
| $L_{A2101}$ | $R_{A34}$ | $R_{A34}$ | H | H |
| $L_{A2102}$ | $R_{B1}$ | $R_{B3}$ | H | H |
| $L_{A2103}$ | $R_{B1}$ | $R_{B4}$ | H | H |
| $L_{A2104}$ | $R_{B1}$ | $R_{B7}$ | H | H |
| $L_{A2105}$ | $R_{B1}$ | $R_{B10}$ | H | H |
| $L_{A2106}$ | $R_{B1}$ | $R_{A3}$ | H | H |
| $L_{A2107}$ | $R_{B1}$ | $R_{A34}$ | H | H |
| $L_{A2108}$ | $R_{B3}$ | $R_{B1}$ | H | H |
| $L_{A2109}$ | $R_{B3}$ | $R_{B4}$ | H | H |
| $L_{A2110}$ | $R_{B3}$ | $R_{B7}$ | H | H |
| $L_{A2111}$ | $R_{B3}$ | $R_{B10}$ | H | H |
| $L_{A2112}$ | $R_{B3}$ | $R_{A3}$ | H | H |
| $L_{A2113}$ | $R_{B3}$ | $R_{A34}$ | H | H |
| $L_{A2114}$ | $R_{B4}$ | $R_{B1}$ | H | H |
| $L_{A2115}$ | $R_{B4}$ | $R_{B3}$ | H | H |
| $L_{A2116}$ | $R_{B4}$ | $R_{B7}$ | H | H |
| $L_{A2117}$ | $R_{B4}$ | $R_{B10}$ | H | H |
| $L_{A2118}$ | $R_{B4}$ | $R_{A3}$ | H | H |
| $L_{A2119}$ | $R_{B4}$ | $R_{A34}$ | H | H |
| $L_{A2120}$ | $R_{B7}$ | $R_{B1}$ | H | H |
| $L_{A2121}$ | $R_{B7}$ | $R_{B3}$ | H | H |
| $L_{A2122}$ | $R_{B7}$ | $R_{B4}$ | H | H |
| $L_{A2123}$ | $R_{B7}$ | $R_{B10}$ | H | H |
| $L_{A2124}$ | $R_{B7}$ | $R_{A3}$ | H | H |
| $L_{A2125}$ | $R_{B7}$ | $R_{A34}$ | H | H |
| $L_{A2126}$ | $R_{B10}$ | $R_{B1}$ | H | H |
| $L_{A2127}$ | $R_{B10}$ | $R_{B3}$ | H | H |
| $L_{A2128}$ | $R_{B10}$ | $R_{B4}$ | H | H |
| $L_{A2129}$ | $R_{B10}$ | $R_{B7}$ | H | H |

-continued

| Ligand | $R^4$ | $R^5$ | $R^6$ | $R^7$ |
|---|---|---|---|---|
| $L_{A2130}$ | $R_{B10}$ | $R_{A3}$ | H | H |
| $L_{A2131}$ | $R_{B10}$ | $R_{A34}$ | H | H |
| $L_{A2132}$ | $R_{A3}$ | $R_{B1}$ | H | H |
| $L_{A2133}$ | $R_{A3}$ | $R_{B3}$ | H | H |
| $L_{A2134}$ | $R_{A3}$ | $R_{B4}$ | H | H |
| $L_{A2135}$ | $R_{A3}$ | $R_{B7}$ | H | H |
| $L_{A2136}$ | $R_{A3}$ | $R_{B10}$ | H | H |
| $L_{A2137}$ | $R_{A3}$ | $R_{A34}$ | H | H |
| $L_{A2138}$ | $R_{A34}$ | $R_{B1}$ | H | H |
| $L_{A2139}$ | $R_{A34}$ | $R_{B3}$ | H | H |
| $L_{A2140}$ | $R_{A34}$ | $R_{B4}$ | H | H |
| $L_{A2141}$ | $R_{A34}$ | $R_{B7}$ | H | H |
| $L_{A2142}$ | $R_{A34}$ | $R_{B10}$ | H | H |
| $L_{A2143}$ | $R_{A34}$ | $R_{A3}$ | H | H |
| $L_{A2144}$ | H | H | H | $R_{B1}$ |
| $L_{A2145}$ | $R_{B1}$ | H | H | $R_{B1}$ |
| $L_{A2146}$ | $R_{B3}$ | H | H | $R_{B1}$ |
| $L_{A2147}$ | $R_{B4}$ | H | H | $R_{B1}$ |
| $L_{A2148}$ | $R_{B7}$ | H | H | $R_{B1}$ |
| $L_{A2149}$ | $R_{B10}$ | H | H | $R_{B1}$ |
| $L_{A2150}$ | $R_{A3}$ | H | H | $R_{B1}$ |
| $L_{A2151}$ | $R_{A34}$ | H | H | $R_{B1}$ |
| $L_{A2152}$ | H | $R_{B1}$ | H | $R_{B1}$ |
| $L_{A2153}$ | H | $R_{B2}$ | H | $R_{B1}$ |
| $L_{A2154}$ | H | $R_{B3}$ | H | $R_{B1}$ |
| $L_{A2155}$ | H | $R_{B4}$ | H | $R_{B1}$ |
| $L_{A2156}$ | H | $R_{B7}$ | H | $R_{B1}$ |
| $L_{A2157}$ | H | $R_{B10}$ | H | $R_{B1}$ |
| $L_{A2158}$ | H | $R_{A3}$ | H | $R_{B1}$ |
| $L_{A2159}$ | H | $R_{A34}$ | H | $R_{B1}$ |
| $L_{A2160}$ | $R_{B1}$ | $R_{B1}$ | H | $R_{B1}$ |
| $L_{A2161}$ | $R_{B3}$ | $R_{B3}$ | H | $R_{B1}$ |
| $L_{A2162}$ | $R_{B4}$ | $R_{B4}$ | H | $R_{B1}$ |
| $L_{A2163}$ | $R_{B7}$ | $R_{B7}$ | H | $R_{B1}$ |
| $L_{A2164}$ | $R_{B10}$ | $R_{B10}$ | H | $R_{B1}$ |
| $L_{A2165}$ | $R_{A3}$ | $R_{A3}$ | H | $R_{B1}$ |
| $L_{A2166}$ | $R_{A34}$ | $R_{A34}$ | H | $R_{B1}$ |
| $L_{A2167}$ | $R_{B1}$ | $R_{B3}$ | H | $R_{B1}$ |
| $L_{A2168}$ | $R_{B1}$ | $R_{B4}$ | H | $R_{B1}$ |
| $L_{A2169}$ | $R_{B1}$ | $R_{B7}$ | H | $R_{B1}$ |
| $L_{A2170}$ | $R_{B1}$ | $R_{B10}$ | H | $R_{B1}$ |
| $L_{A2171}$ | $R_{B1}$ | $R_{A3}$ | H | $R_{B1}$ |
| $L_{A2172}$ | $R_{B1}$ | $R_{A34}$ | H | $R_{B1}$ |
| $L_{A2173}$ | $R_{B3}$ | $R_{B1}$ | H | $R_{B1}$ |
| $L_{A2174}$ | $R_{B3}$ | $R_{B4}$ | H | $R_{B1}$ |
| $L_{A2175}$ | $R_{B3}$ | $R_{B7}$ | H | $R_{B1}$ |
| $L_{A2176}$ | $R_{B3}$ | $R_{B10}$ | H | $R_{B1}$ |
| $L_{A2177}$ | $R_{B3}$ | $R_{A3}$ | H | $R_{B1}$ |
| $L_{A2178}$ | $R_{B3}$ | $R_{A34}$ | H | $R_{B1}$ |
| $L_{A2179}$ | $R_{B4}$ | $R_{B1}$ | H | $R_{B1}$ |
| $L_{A2180}$ | $R_{B4}$ | $R_{B3}$ | H | $R_{B1}$ |
| $L_{A2181}$ | $R_{B4}$ | $R_{B7}$ | H | $R_{B1}$ |
| $L_{A2182}$ | $R_{B4}$ | $R_{B10}$ | H | $R_{B1}$ |
| $L_{A2183}$ | $R_{B4}$ | $R_{A3}$ | H | $R_{B1}$ |
| $L_{A2184}$ | $R_{B4}$ | $R_{A34}$ | H | $R_{B1}$ |
| $L_{A2185}$ | $R_{B7}$ | $R_{B1}$ | H | $R_{B1}$ |
| $L_{A2186}$ | $R_{B7}$ | $R_{B3}$ | H | $R_{B1}$ |
| $L_{A2187}$ | $R_{B7}$ | $R_{B4}$ | H | $R_{B1}$ |
| $L_{A2188}$ | $R_{B7}$ | $R_{B10}$ | H | $R_{B1}$ |
| $L_{A2189}$ | $R_{B7}$ | $R_{A3}$ | H | $R_{B1}$ |
| $L_{A2190}$ | $R_{B7}$ | $R_{A34}$ | H | $R_{B1}$ |
| $L_{A2191}$ | $R_{B10}$ | $R_{B1}$ | H | $R_{B1}$ |
| $L_{A2192}$ | $R_{B10}$ | $R_{B3}$ | H | $R_{B1}$ |
| $L_{A2193}$ | $R_{B10}$ | $R_{B4}$ | H | $R_{B1}$ |
| $L_{A2194}$ | $R_{B10}$ | $R_{B7}$ | H | $R_{B1}$ |
| $L_{A2195}$ | $R_{B10}$ | $R_{A3}$ | H | $R_{B1}$ |
| $L_{A2196}$ | $R_{B10}$ | $R_{A34}$ | H | $R_{B1}$ |
| $L_{A2197}$ | $R_{A3}$ | $R_{B1}$ | H | $R_{B1}$ |
| $L_{A2198}$ | $R_{A3}$ | $R_{B3}$ | H | $R_{B1}$ |
| $L_{A2199}$ | $R_{A3}$ | $R_{B4}$ | H | $R_{B1}$ |
| $L_{A2200}$ | $R_{A3}$ | $R_{B7}$ | H | $R_{B1}$ |
| $L_{A2201}$ | $R_{A3}$ | $R_{B10}$ | H | $R_{B1}$ |
| $L_{A2202}$ | $R_{A3}$ | $R_{A34}$ | H | $R_{B1}$ |
| $L_{A2203}$ | $R_{A34}$ | $R_{B1}$ | H | $R_{B1}$ |
| $L_{A2204}$ | $R_{A34}$ | $R_{B3}$ | H | $R_{B1}$ |
| $L_{A2205}$ | $R_{A34}$ | $R_{B4}$ | H | $R_{B1}$ |
| $L_{A2206}$ | $R_{A34}$ | $R_{B7}$ | H | $R_{B1}$ |

-continued

| Ligand | $R^4$ | $R^5$ | $R^6$ | $R^7$ |
|---|---|---|---|---|
| $L_{A2207}$ | $R_{A34}$ | $R_{B10}$ | H | $R_{B1}$ |
| $L_{A2208}$ | $R_{A34}$ | $R_{A3}$ | H | $R_{B1}$ |
| $L_{A2209}$ | H | H | $R_{B1}$ | H |
| $L_{A2210}$ | $R_{B1}$ | H | $R_{B1}$ | H |
| $L_{A2211}$ | $R_{B3}$ | H | $R_{B1}$ | H |
| $L_{A2212}$ | $R_{B4}$ | H | $R_{B1}$ | H |
| $L_{A2213}$ | $R_{B7}$ | H | $R_{B1}$ | H |
| $L_{A2214}$ | $R_{B10}$ | H | $R_{B1}$ | H |
| $L_{A2215}$ | $R_{A3}$ | H | $R_{B1}$ | H |
| $L_{A2216}$ | $R_{A34}$ | H | $R_{B1}$ | H |
| $L_{A2217}$ | H | $R_{B1}$ | $R_{B1}$ | H |
| $L_{A2218}$ | H | $R_{B2}$ | $R_{B1}$ | H |
| $L_{A2219}$ | H | $R_{B3}$ | $R_{B1}$ | H |
| $L_{A2220}$ | H | $R_{B4}$ | $R_{B1}$ | H |
| $L_{A2221}$ | H | $R_{B7}$ | $R_{B1}$ | H |
| $L_{A2222}$ | H | $R_{B10}$ | $R_{B1}$ | H |
| $L_{A2223}$ | H | $R_{A3}$ | $R_{B1}$ | H |
| $L_{A2224}$ | H | $R_{A34}$ | $R_{B1}$ | H |
| $L_{A2225}$ | $R_{B1}$ | $R_{B1}$ | $R_{B1}$ | H |
| $L_{A2226}$ | $R_{B3}$ | $R_{B3}$ | $R_{B1}$ | H |
| $L_{A2227}$ | $R_{B4}$ | $R_{B4}$ | $R_{B1}$ | H |
| $L_{A2228}$ | $R_{B7}$ | $R_{B7}$ | $R_{B1}$ | H |
| $L_{A2229}$ | $R_{B10}$ | $R_{B10}$ | $R_{B1}$ | H |
| $L_{A2230}$ | $R_{A3}$ | $R_{A3}$ | $R_{B1}$ | H |
| $L_{A2231}$ | $R_{A34}$ | $R_{A34}$ | $R_{B1}$ | H |
| $L_{A2232}$ | $R_{B1}$ | $R_{B3}$ | $R_{B1}$ | H |
| $L_{A2233}$ | $R_{B1}$ | $R_{B4}$ | $R_{B1}$ | H |
| $L_{A2234}$ | $R_{B1}$ | $R_{B7}$ | $R_{B1}$ | H |
| $L_{A2235}$ | $R_{B1}$ | $R_{B10}$ | $R_{B1}$ | H |
| $L_{A2236}$ | $R_{B1}$ | $R_{A3}$ | $R_{B1}$ | H |
| $L_{A2237}$ | $R_{B1}$ | $R_{A34}$ | $R_{B1}$ | H |
| $L_{A2238}$ | $R_{B3}$ | $R_{B1}$ | $R_{B1}$ | H |
| $L_{A2239}$ | $R_{B3}$ | $R_{B4}$ | $R_{B1}$ | H |
| $L_{A2240}$ | $R_{B3}$ | $R_{B7}$ | $R_{B1}$ | H |
| $L_{A2241}$ | $R_{B3}$ | $R_{B10}$ | $R_{B1}$ | H |
| $L_{A2242}$ | $R_{B3}$ | $R_{A3}$ | $R_{B1}$ | H |
| $L_{A2243}$ | $R_{B3}$ | $R_{A34}$ | $R_{B1}$ | H |
| $L_{A2244}$ | $R_{B4}$ | $R_{B1}$ | $R_{B1}$ | H |
| $L_{A2245}$ | $R_{B4}$ | $R_{B3}$ | $R_{B1}$ | H |
| $L_{A2246}$ | $R_{B4}$ | $R_{B7}$ | $R_{B1}$ | H |
| $L_{A2247}$ | $R_{B4}$ | $R_{B10}$ | $R_{B1}$ | H |
| $L_{A2248}$ | $R_{B4}$ | $R_{A3}$ | $R_{B1}$ | H |
| $L_{A2249}$ | $R_{B4}$ | $R_{A34}$ | $R_{B1}$ | H |
| $L_{A2250}$ | $R_{B7}$ | $R_{B1}$ | $R_{B1}$ | H |
| $L_{A2251}$ | $R_{B7}$ | $R_{B3}$ | $R_{B1}$ | H |
| $L_{A2252}$ | $R_{B7}$ | $R_{B4}$ | $R_{B1}$ | H |
| $L_{A2253}$ | $R_{B7}$ | $R_{B10}$ | $R_{B1}$ | H |
| $L_{A2254}$ | $R_{B7}$ | $R_{A3}$ | $R_{B1}$ | H |
| $L_{A2255}$ | $R_{B7}$ | $R_{A34}$ | $R_{B1}$ | H |
| $L_{A2256}$ | $R_{B10}$ | $R_{B1}$ | $R_{B1}$ | H |
| $L_{A2257}$ | $R_{B10}$ | $R_{B3}$ | $R_{B1}$ | H |
| $L_{A2258}$ | $R_{B10}$ | $R_{B4}$ | $R_{B1}$ | H |
| $L_{A2259}$ | $R_{B10}$ | $R_{B7}$ | $R_{B1}$ | H |
| $L_{A2260}$ | $R_{B10}$ | $R_{A3}$ | $R_{B1}$ | H |
| $L_{A2261}$ | $R_{B10}$ | $R_{A34}$ | $R_{B1}$ | H |
| $L_{A2262}$ | $R_{A3}$ | $R_{B1}$ | $R_{B1}$ | H |
| $L_{A2263}$ | $R_{A3}$ | $R_{B3}$ | $R_{B1}$ | H |
| $L_{A2264}$ | $R_{A3}$ | $R_{B4}$ | $R_{B1}$ | H |
| $L_{A2265}$ | $R_{A3}$ | $R_{B7}$ | $R_{B1}$ | H |
| $L_{A2266}$ | $R_{A3}$ | $R_{B10}$ | $R_{B1}$ | H |
| $L_{A2267}$ | $R_{A3}$ | $R_{A34}$ | $R_{B1}$ | H |
| $L_{A2268}$ | $R_{A34}$ | $R_{B1}$ | $R_{B1}$ | H |
| $L_{A2269}$ | $R_{A34}$ | $R_{B3}$ | $R_{B1}$ | H |
| $L_{A2270}$ | $R_{A34}$ | $R_{B4}$ | $R_{B1}$ | H |
| $L_{A2271}$ | $R_{A34}$ | $R_{B7}$ | $R_{B1}$ | H |
| $L_{A2272}$ | $R_{A34}$ | $R_{B10}$ | $R_{B1}$ | H |
| $L_{A2273}$ | $R_{A34}$ | $R_{A3}$ | $R_{B1}$ | H |
| $L_{A2274}$ | H | H | $R_{B1}$ | $R_{B1}$ |
| $L_{A2275}$ | $R_{B1}$ | H | $R_{B1}$ | $R_{B1}$ |
| $L_{A2276}$ | $R_{B3}$ | H | $R_{B1}$ | $R_{B1}$ |
| $L_{A2277}$ | $R_{B4}$ | H | $R_{B1}$ | $R_{B1}$ |
| $L_{A2278}$ | $R_{B7}$ | H | $R_{B1}$ | $R_{B1}$ |
| $L_{A2279}$ | $R_{B10}$ | H | $R_{B1}$ | $R_{B1}$ |
| $L_{A2280}$ | $R_{A3}$ | H | $R_{B1}$ | $R_{B1}$ |
| $L_{A2281}$ | $R_{A34}$ | H | $R_{B1}$ | $R_{B1}$ |
| $L_{A2282}$ | H | $R_{B1}$ | $R_{B1}$ | $R_{B1}$ |
| $L_{A2283}$ | H | $R_{B2}$ | $R_{B1}$ | $R_{B1}$ |

-continued

| Ligand | $R^4$ | $R^5$ | $R^6$ | $R^7$ |
|---|---|---|---|---|
| $L_{A2284}$ | H | $R_{B3}$ | $R_{B1}$ | $R_{B1}$ |
| $L_{A2285}$ | H | $R_{B4}$ | $R_{B1}$ | $R_{B1}$ |
| $L_{A2286}$ | H | $R_{B7}$ | $R_{B1}$ | $R_{B1}$ |
| $L_{A2287}$ | H | $R_{B10}$ | $R_{B1}$ | $R_{B1}$ |
| $L_{A2288}$ | H | $R_{A3}$ | $R_{B1}$ | $R_{B1}$ |
| $L_{A2289}$ | H | $R_{A34}$ | $R_{B1}$ | $R_{B1}$ |
| $L_{A2290}$ | $R_{B1}$ | $R_{B1}$ | $R_{B1}$ | $R_{B1}$ |
| $L_{A2291}$ | $R_{B3}$ | $R_{B3}$ | $R_{B1}$ | $R_{B1}$ |
| $L_{A2292}$ | $R_{B4}$ | $R_{B4}$ | $R_{B1}$ | $R_{B1}$ |
| $L_{A2293}$ | $R_{B7}$ | $R_{B7}$ | $R_{B1}$ | $R_{B1}$ |
| $L_{A2294}$ | $R_{B10}$ | $R_{B10}$ | $R_{B1}$ | $R_{B1}$ |
| $L_{A2295}$ | $R_{A3}$ | $R_{A3}$ | $R_{B1}$ | $R_{B1}$ |
| $L_{A2296}$ | $R_{A34}$ | $R_{A34}$ | $R_{B1}$ | $R_{B1}$ |
| $L_{A2297}$ | $R_{B1}$ | $R_{B3}$ | $R_{B1}$ | $R_{B1}$ |
| $L_{A2298}$ | $R_{B1}$ | $R_{B4}$ | $R_{B1}$ | $R_{B1}$ |
| $L_{A2299}$ | $R_{B1}$ | $R_{B7}$ | $R_{B1}$ | $R_{B1}$ |
| $L_{A2300}$ | $R_{B1}$ | $R_{B10}$ | $R_{B1}$ | $R_{B1}$ |
| $L_{A2301}$ | $R_{B1}$ | $R_{A3}$ | $R_{B1}$ | $R_{B1}$ |
| $L_{A2302}$ | $R_{B1}$ | $R_{A34}$ | $R_{B1}$ | $R_{B1}$ |
| $L_{A2303}$ | $R_{B3}$ | $R_{B1}$ | $R_{B1}$ | $R_{B1}$ |
| $L_{A2304}$ | $R_{B3}$ | $R_{B4}$ | $R_{B1}$ | $R_{B1}$ |
| $L_{A2305}$ | $R_{B3}$ | $R_{B7}$ | $R_{B1}$ | $R_{B1}$ |
| $L_{A2306}$ | $R_{B3}$ | $R_{B10}$ | $R_{B1}$ | $R_{B1}$ |
| $L_{A2307}$ | $R_{B3}$ | $R_{A3}$ | $R_{B1}$ | $R_{B1}$ |
| $L_{A2308}$ | $R_{B3}$ | $R_{A34}$ | $R_{B1}$ | $R_{B1}$ |
| $L_{A2309}$ | $R_{B4}$ | $R_{B1}$ | $R_{B1}$ | $R_{B1}$ |
| $L_{A2310}$ | $R_{B4}$ | $R_{B3}$ | $R_{B1}$ | $R_{B1}$ |
| $L_{A2311}$ | $R_{B4}$ | $R_{B7}$ | $R_{B1}$ | $R_{B1}$ |
| $L_{A2312}$ | $R_{B4}$ | $R_{B10}$ | $R_{B1}$ | $R_{B1}$ |
| $L_{A2313}$ | $R_{B4}$ | $R_{A3}$ | $R_{B1}$ | $R_{B1}$ |
| $L_{A2314}$ | $R_{B4}$ | $R_{A34}$ | $R_{B1}$ | $R_{B1}$ |
| $L_{A2315}$ | $R_{B7}$ | $R_{B1}$ | $R_{B1}$ | $R_{B1}$ |
| $L_{A2316}$ | $R_{B7}$ | $R_{B3}$ | $R_{B1}$ | $R_{B1}$ |
| $L_{A2317}$ | $R_{B7}$ | $R_{B4}$ | $R_{B1}$ | $R_{B1}$ |
| $L_{A2318}$ | $R_{B7}$ | $R_{B10}$ | $R_{B1}$ | $R_{B1}$ |
| $L_{A2319}$ | $R_{B7}$ | $R_{A3}$ | $R_{B1}$ | $R_{B1}$ |
| $L_{A2320}$ | $R_{B7}$ | $R_{A34}$ | $R_{B1}$ | $R_{B1}$ |
| $L_{A2321}$ | $R_{B10}$ | $R_{B1}$ | $R_{B1}$ | $R_{B1}$ |
| $L_{A2322}$ | $R_{B10}$ | $R_{B3}$ | $R_{B1}$ | $R_{B1}$ |
| $L_{A2323}$ | $R_{B10}$ | $R_{B4}$ | $R_{B1}$ | $R_{B1}$ |
| $L_{A2324}$ | $R_{B10}$ | $R_{B7}$ | $R_{B1}$ | $R_{B1}$ |
| $L_{A2325}$ | $R_{B10}$ | $R_{A3}$ | $R_{B1}$ | $R_{B1}$ |
| $L_{A2326}$ | $R_{B10}$ | $R_{A34}$ | $R_{B1}$ | $R_{B1}$ |
| $L_{A2327}$ | $R_{A3}$ | $R_{B1}$ | $R_{B1}$ | $R_{B1}$ |
| $L_{A2328}$ | $R_{A3}$ | $R_{B3}$ | $R_{B1}$ | $R_{B1}$ |
| $L_{A2329}$ | $R_{A3}$ | $R_{B4}$ | $R_{B1}$ | $R_{B1}$ |
| $L_{A2330}$ | $R_{A3}$ | $R_{B7}$ | $R_{B1}$ | $R_{B1}$ |
| $L_{A2331}$ | $R_{A3}$ | $R_{B10}$ | $R_{B1}$ | $R_{B1}$ |
| $L_{A2332}$ | $R_{A3}$ | $R_{A34}$ | $R_{B1}$ | $R_{B1}$ |
| $L_{A2333}$ | $R_{A34}$ | $R_{B1}$ | $R_{B1}$ | $R_{B1}$ |
| $L_{A2334}$ | $R_{A34}$ | $R_{B3}$ | $R_{B1}$ | $R_{B1}$ |
| $L_{A2335}$ | $R_{A34}$ | $R_{B4}$ | $R_{B1}$ | $R_{B1}$ |
| $L_{A2336}$ | $R_{A34}$ | $R_{B7}$ | $R_{B1}$ | $R_{B1}$ |
| $L_{A2337}$ | $R_{A34}$ | $R_{B10}$ | $R_{B1}$ | $R_{B1}$ |
| $L_{A2338}$ | $R_{A34}$ | $R_{A3}$ | $R_{B1}$ | $R_{B1}$ |

$L_{A2339}$ through $L_{A2598}$ that are based on a structure of Formula XI,

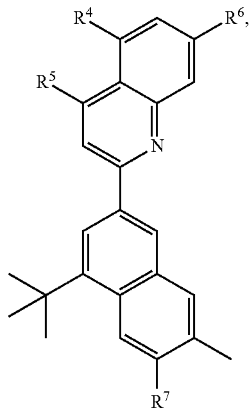

in which $R^4$, $R^5$, $R^6$, and $R^7$ are defined as provided below:

| Ligand | $R^4$ | $R^5$ | $R^6$ | $R^7$ |
|---|---|---|---|---|
| $L_{A2339}$ | H | H | H | H |
| $L_{A2340}$ | $R_{B1}$ | H | H | H |
| $L_{A2341}$ | $R_{B3}$ | H | H | H |
| $L_{A2342}$ | $R_{B4}$ | H | H | H |
| $L_{A2343}$ | $R_{B7}$ | H | H | H |
| $L_{A2344}$ | $R_{B10}$ | H | H | H |
| $L_{A2345}$ | $R_{A3}$ | H | H | H |
| $L_{A2346}$ | $R_{A34}$ | H | H | H |
| $L_{A2347}$ | H | $R_{B1}$ | H | H |
| $L_{A2348}$ | H | $R_{B2}$ | H | H |
| $L_{A2349}$ | H | $R_{B3}$ | H | H |
| $L_{A2350}$ | H | $R_{B4}$ | H | H |
| $L_{A2351}$ | H | $R_{B7}$ | H | H |
| $L_{A2352}$ | H | $R_{B10}$ | H | H |
| $L_{A2353}$ | H | $R_{A3}$ | H | H |
| $L_{A2354}$ | H | $R_{A34}$ | H | H |
| $L_{A2355}$ | $R_{B1}$ | $R_{B1}$ | H | H |
| $L_{A2356}$ | $R_{B3}$ | $R_{B3}$ | H | H |
| $L_{A2357}$ | $R_{B4}$ | $R_{B4}$ | H | H |
| $L_{A2358}$ | $R_{B7}$ | $R_{B7}$ | H | H |
| $L_{A2359}$ | $R_{B10}$ | $R_{B10}$ | H | H |
| $L_{A2360}$ | $R_{A3}$ | $R_{A3}$ | H | H |
| $L_{A2361}$ | $R_{A34}$ | $R_{A34}$ | H | H |
| $L_{A2362}$ | $R_{B1}$ | $R_{B3}$ | H | H |
| $L_{A2363}$ | $R_{B1}$ | $R_{B4}$ | H | H |
| $L_{A2364}$ | $R_{B1}$ | $R_{B7}$ | H | H |
| $L_{A2365}$ | $R_{B1}$ | $R_{B10}$ | H | H |
| $L_{A2366}$ | $R_{B1}$ | $R_{A3}$ | H | H |
| $L_{A2367}$ | $R_{B1}$ | $R_{A34}$ | H | H |
| $L_{A2368}$ | $R_{B3}$ | $R_{B1}$ | H | H |
| $L_{A2369}$ | $R_{B3}$ | $R_{B4}$ | H | H |
| $L_{A2370}$ | $R_{B3}$ | $R_{B7}$ | H | H |
| $L_{A2371}$ | $R_{B3}$ | $R_{B10}$ | H | H |
| $L_{A2372}$ | $R_{B3}$ | $R_{A3}$ | H | H |
| $L_{A2373}$ | $R_{B3}$ | $R_{A34}$ | H | H |
| $L_{A2374}$ | $R_{B4}$ | $R_{B1}$ | H | H |
| $L_{A2375}$ | $R_{B4}$ | $R_{B3}$ | H | H |
| $L_{A2376}$ | $R_{B4}$ | $R_{B7}$ | H | H |
| $L_{A2377}$ | $R_{B4}$ | $R_{B10}$ | H | H |
| $L_{A2378}$ | $R_{B4}$ | $R_{A3}$ | H | H |
| $L_{A2379}$ | $R_{B4}$ | $R_{A34}$ | H | H |
| $L_{A2380}$ | $R_{B7}$ | $R_{B1}$ | H | H |
| $L_{A2381}$ | $R_{B7}$ | $R_{B3}$ | H | H |
| $L_{A2382}$ | $R_{B7}$ | $R_{B4}$ | H | H |
| $L_{A2383}$ | $R_{B7}$ | $R_{B10}$ | H | H |
| $L_{A2384}$ | $R_{B7}$ | $R_{A3}$ | H | H |
| $L_{A2385}$ | $R_{B7}$ | $R_{A34}$ | H | H |
| $L_{A2386}$ | $R_{B10}$ | $R_{B1}$ | H | H |
| $L_{A2387}$ | $R_{B10}$ | $R_{B3}$ | H | H |
| $L_{A2388}$ | $R_{B10}$ | $R_{B4}$ | H | H |
| $L_{A2389}$ | $R_{B10}$ | $R_{B7}$ | H | H |

-continued

| Ligand | $R^4$ | $R^5$ | $R^6$ | $R^7$ |
|---|---|---|---|---|
| $L_{A2390}$ | $R_{B10}$ | $R_{A3}$ | H | H |
| $L_{A2391}$ | $R_{B10}$ | $R_{A34}$ | H | H |
| $L_{A2392}$ | $R_{A3}$ | $R_{B1}$ | H | H |
| $L_{A2393}$ | $R_{A3}$ | $R_{B3}$ | H | H |
| $L_{A2394}$ | $R_{A3}$ | $R_{B4}$ | H | H |
| $L_{A2395}$ | $R_{A3}$ | $R_{B7}$ | H | H |
| $L_{A2396}$ | $R_{A3}$ | $R_{B10}$ | H | H |
| $L_{A2397}$ | $R_{A3}$ | $R_{A34}$ | H | H |
| $L_{A2398}$ | $R_{A34}$ | $R_{B1}$ | H | H |
| $L_{A2399}$ | $R_{A34}$ | $R_{B3}$ | H | H |
| $L_{A2400}$ | $R_{A34}$ | $R_{B4}$ | H | H |
| $L_{A2401}$ | $R_{A34}$ | $R_{B7}$ | H | H |
| $L_{A2402}$ | $R_{A34}$ | $R_{B10}$ | H | H |
| $L_{A2403}$ | $R_{A34}$ | $R_{A3}$ | H | H |
| $L_{A2404}$ | H | H | H | $R_{B1}$ |
| $L_{A2405}$ | $R_{B1}$ | H | H | $R_{B1}$ |
| $L_{A2406}$ | $R_{B3}$ | H | H | $R_{B1}$ |
| $L_{A2407}$ | $R_{B4}$ | H | H | $R_{B1}$ |
| $L_{A2408}$ | $R_{B7}$ | H | H | $R_{B1}$ |
| $L_{A2409}$ | $R_{B10}$ | H | H | $R_{B1}$ |
| $L_{A2410}$ | $R_{A3}$ | H | H | $R_{B1}$ |
| $L_{A2411}$ | $R_{A34}$ | H | H | $R_{B1}$ |
| $L_{A2412}$ | H | $R_{B1}$ | H | $R_{B1}$ |
| $L_{A2413}$ | H | $R_{B2}$ | H | $R_{B1}$ |
| $L_{A2414}$ | H | $R_{B3}$ | H | $R_{B1}$ |
| $L_{A2415}$ | H | $R_{B4}$ | H | $R_{B1}$ |
| $L_{A2416}$ | H | $R_{B7}$ | H | $R_{B1}$ |
| $L_{A2417}$ | H | $R_{B10}$ | H | $R_{B1}$ |
| $L_{A2418}$ | H | $R_{A3}$ | H | $R_{B1}$ |
| $L_{A2419}$ | H | $R_{A34}$ | H | $R_{B1}$ |
| $L_{A2420}$ | $R_{B1}$ | $R_{B1}$ | H | $R_{B1}$ |
| $L_{A2421}$ | $R_{B3}$ | $R_{B3}$ | H | $R_{B1}$ |
| $L_{A2422}$ | $R_{B4}$ | $R_{B4}$ | H | $R_{B1}$ |
| $L_{A2423}$ | $R_{B7}$ | $R_{B7}$ | H | $R_{B1}$ |
| $L_{A2424}$ | $R_{B10}$ | $R_{B10}$ | H | $R_{B1}$ |
| $L_{A2425}$ | $R_{A3}$ | $R_{A3}$ | H | $R_{B1}$ |
| $L_{A2426}$ | $R_{A34}$ | $R_{A34}$ | H | $R_{B1}$ |
| $L_{A2427}$ | $R_{B1}$ | $R_{B3}$ | H | $R_{B1}$ |
| $L_{A2428}$ | $R_{B1}$ | $R_{B4}$ | H | $R_{B1}$ |
| $L_{A2429}$ | $R_{B1}$ | $R_{B7}$ | H | $R_{B1}$ |
| $L_{A2430}$ | $R_{B1}$ | $R_{B10}$ | H | $R_{B1}$ |
| $L_{A2431}$ | $R_{B1}$ | $R_{A3}$ | H | $R_{B1}$ |
| $L_{A2432}$ | $R_{B1}$ | $R_{A34}$ | H | $R_{B1}$ |
| $L_{A2433}$ | $R_{B3}$ | $R_{B1}$ | H | $R_{B1}$ |
| $L_{A2434}$ | $R_{B3}$ | $R_{B4}$ | H | $R_{B1}$ |
| $L_{A2435}$ | $R_{B3}$ | $R_{B7}$ | H | $R_{B1}$ |
| $L_{A2436}$ | $R_{B3}$ | $R_{B10}$ | H | $R_{B1}$ |
| $L_{A2437}$ | $R_{B3}$ | $R_{A3}$ | H | $R_{B1}$ |
| $L_{A2438}$ | $R_{B3}$ | $R_{A34}$ | H | $R_{B1}$ |
| $L_{A2439}$ | $R_{B4}$ | $R_{B1}$ | H | $R_{B1}$ |
| $L_{A2440}$ | $R_{B4}$ | $R_{B3}$ | H | $R_{B1}$ |
| $L_{A2441}$ | $R_{B4}$ | $R_{B7}$ | H | $R_{B1}$ |
| $L_{A2442}$ | $R_{B4}$ | $R_{B10}$ | H | $R_{B1}$ |
| $L_{A2443}$ | $R_{B4}$ | $R_{A3}$ | H | $R_{B1}$ |
| $L_{A2444}$ | $R_{B4}$ | $R_{A34}$ | H | $R_{B1}$ |
| $L_{A2445}$ | $R_{B7}$ | $R_{B1}$ | H | $R_{B1}$ |
| $L_{A2446}$ | $R_{B7}$ | $R_{B3}$ | H | $R_{B1}$ |
| $L_{A2447}$ | $R_{B7}$ | $R_{B4}$ | H | $R_{B1}$ |
| $L_{A2448}$ | $R_{B7}$ | $R_{B10}$ | H | $R_{B1}$ |
| $L_{A2449}$ | $R_{B7}$ | $R_{A3}$ | H | $R_{B1}$ |
| $L_{A2450}$ | $R_{B7}$ | $R_{A34}$ | H | $R_{B1}$ |
| $L_{A2451}$ | $R_{B10}$ | $R_{B1}$ | H | $R_{B1}$ |
| $L_{A2452}$ | $R_{B10}$ | $R_{B3}$ | H | $R_{B1}$ |
| $L_{A2453}$ | $R_{B10}$ | $R_{B4}$ | H | $R_{B1}$ |
| $L_{A2454}$ | $R_{B10}$ | $R_{B7}$ | H | $R_{B1}$ |
| $L_{A2455}$ | $R_{B10}$ | $R_{A3}$ | H | $R_{B1}$ |
| $L_{A2456}$ | $R_{B10}$ | $R_{A34}$ | H | $R_{B1}$ |
| $L_{A2457}$ | $R_{A3}$ | $R_{B1}$ | H | $R_{B1}$ |
| $L_{A2458}$ | $R_{A3}$ | $R_{B3}$ | H | $R_{B1}$ |
| $L_{A2459}$ | $R_{A3}$ | $R_{B4}$ | H | $R_{B1}$ |
| $L_{A2460}$ | $R_{A3}$ | $R_{B7}$ | H | $R_{B1}$ |
| $L_{A2461}$ | $R_{A3}$ | $R_{B10}$ | H | $R_{B1}$ |
| $L_{A2462}$ | $R_{A3}$ | $R_{A34}$ | H | $R_{B1}$ |
| $L_{A2463}$ | $R_{A34}$ | $R_{B1}$ | H | $R_{B1}$ |
| $L_{A2464}$ | $R_{A34}$ | $R_{B3}$ | H | $R_{B1}$ |
| $L_{A2465}$ | $R_{A34}$ | $R_{B4}$ | H | $R_{B1}$ |
| $L_{A2466}$ | $R_{A34}$ | $R_{B7}$ | H | $R_{B1}$ |

| Ligand | $R^4$ | $R^5$ | $R^6$ | $R^7$ |
|---|---|---|---|---|
| $L_{A2467}$ | $R_{A34}$ | $R_{B10}$ | H | $R_{B1}$ |
| $L_{A2468}$ | $R_{A34}$ | $R_{A3}$ | H | $R_{B1}$ |
| $L_{A2469}$ | H | H | $R_{B1}$ | H |
| $L_{A2470}$ | $R_{B1}$ | H | $R_{B1}$ | H |
| $L_{A2471}$ | $R_{B3}$ | H | $R_{B1}$ | H |
| $L_{A2472}$ | $R_{B4}$ | H | $R_{B1}$ | H |
| $L_{A2473}$ | $R_{B7}$ | H | $R_{B1}$ | H |
| $L_{A2474}$ | $R_{B10}$ | H | $R_{B1}$ | H |
| $L_{A2475}$ | $R_{A3}$ | H | $R_{B1}$ | H |
| $L_{A2476}$ | $R_{A34}$ | H | $R_{B1}$ | H |
| $L_{A2477}$ | H | $R_{B1}$ | $R_{B1}$ | H |
| $L_{A2478}$ | H | $R_{B2}$ | $R_{B1}$ | H |
| $L_{A2479}$ | H | $R_{B3}$ | $R_{B1}$ | H |
| $L_{A2480}$ | H | $R_{B4}$ | $R_{B1}$ | H |
| $L_{A2481}$ | H | $R_{B7}$ | $R_{B1}$ | H |
| $L_{A2482}$ | H | $R_{B10}$ | $R_{B1}$ | H |
| $L_{A2483}$ | H | $R_{A3}$ | $R_{B1}$ | H |
| $L_{A2484}$ | H | $R_{A34}$ | $R_{B1}$ | H |
| $L_{A2485}$ | $R_{B1}$ | $R_{B1}$ | $R_{B1}$ | H |
| $L_{A2486}$ | $R_{B3}$ | $R_{B3}$ | $R_{B1}$ | H |
| $L_{A2487}$ | $R_{B4}$ | $R_{B4}$ | $R_{B1}$ | H |
| $L_{A2488}$ | $R_{B7}$ | $R_{B7}$ | $R_{B1}$ | H |
| $L_{A2489}$ | $R_{B10}$ | $R_{B10}$ | $R_{B1}$ | H |
| $L_{A2490}$ | $R_{A3}$ | $R_{A3}$ | $R_{B1}$ | H |
| $L_{A2491}$ | $R_{A34}$ | $R_{A34}$ | $R_{B1}$ | H |
| $L_{A2492}$ | $R_{B1}$ | $R_{B3}$ | $R_{B1}$ | H |
| $L_{A2493}$ | $R_{B1}$ | $R_{B4}$ | $R_{B1}$ | H |
| $L_{A2494}$ | $R_{B1}$ | $R_{B7}$ | $R_{B1}$ | H |
| $L_{A2495}$ | $R_{B1}$ | $R_{B10}$ | $R_{B1}$ | H |
| $L_{A2496}$ | $R_{B1}$ | $R_{A3}$ | $R_{B1}$ | H |
| $L_{A2497}$ | $R_{B1}$ | $R_{A34}$ | $R_{B1}$ | H |
| $L_{A2498}$ | $R_{B3}$ | $R_{B1}$ | $R_{B1}$ | H |
| $L_{A2499}$ | $R_{B3}$ | $R_{B4}$ | $R_{B1}$ | H |
| $L_{A2500}$ | $R_{B3}$ | $R_{B7}$ | $R_{B1}$ | H |
| $L_{A2501}$ | $R_{B3}$ | $R_{B10}$ | $R_{B1}$ | H |
| $L_{A2502}$ | $R_{B3}$ | $R_{A3}$ | $R_{B1}$ | H |
| $L_{A2503}$ | $R_{B3}$ | $R_{A34}$ | $R_{B1}$ | H |
| $L_{A2504}$ | $R_{B4}$ | $R_{B1}$ | $R_{B1}$ | H |
| $L_{A2505}$ | $R_{B4}$ | $R_{B3}$ | $R_{B1}$ | H |
| $L_{A2506}$ | $R_{B4}$ | $R_{B7}$ | $R_{B1}$ | H |
| $L_{A2507}$ | $R_{B4}$ | $R_{B10}$ | $R_{B1}$ | H |
| $L_{A2508}$ | $R_{B4}$ | $R_{A3}$ | $R_{B1}$ | H |
| $L_{A2509}$ | $R_{B4}$ | $R_{A34}$ | $R_{B1}$ | H |
| $L_{A2510}$ | $R_{B7}$ | $R_{B1}$ | $R_{B1}$ | H |
| $L_{A2511}$ | $R_{B7}$ | $R_{B3}$ | $R_{B1}$ | H |
| $L_{A2512}$ | $R_{B7}$ | $R_{B4}$ | $R_{B1}$ | H |
| $L_{A2513}$ | $R_{B7}$ | $R_{B10}$ | $R_{B1}$ | H |
| $L_{A2514}$ | $R_{B7}$ | $R_{A3}$ | $R_{B1}$ | H |
| $L_{A2515}$ | $R_{B7}$ | $R_{A34}$ | $R_{B1}$ | H |
| $L_{A2516}$ | $R_{B10}$ | $R_{B1}$ | $R_{B1}$ | H |
| $L_{A2517}$ | $R_{B10}$ | $R_{B3}$ | $R_{B1}$ | H |
| $L_{A2518}$ | $R_{B10}$ | $R_{B4}$ | $R_{B1}$ | H |
| $L_{A2519}$ | $R_{B10}$ | $R_{B7}$ | $R_{B1}$ | H |
| $L_{A2520}$ | $R_{B10}$ | $R_{A3}$ | $R_{B1}$ | H |
| $L_{A2521}$ | $R_{B10}$ | $R_{A34}$ | $R_{B1}$ | H |
| $L_{A2522}$ | $R_{A3}$ | $R_{B1}$ | $R_{B1}$ | H |
| $L_{A2523}$ | $R_{A3}$ | $R_{B3}$ | $R_{B1}$ | H |
| $L_{A2524}$ | $R_{A3}$ | $R_{B4}$ | $R_{B1}$ | H |
| $L_{A2525}$ | $R_{A3}$ | $R_{B7}$ | $R_{B1}$ | H |
| $L_{A2526}$ | $R_{A3}$ | $R_{B10}$ | $R_{B1}$ | H |
| $L_{A2527}$ | $R_{A3}$ | $R_{A34}$ | $R_{B1}$ | H |
| $L_{A2528}$ | $R_{A34}$ | $R_{B1}$ | $R_{B1}$ | H |
| $L_{A2529}$ | $R_{A34}$ | $R_{B3}$ | $R_{B1}$ | H |
| $L_{A2530}$ | $R_{A34}$ | $R_{B4}$ | $R_{B1}$ | H |
| $L_{A2531}$ | $R_{A34}$ | $R_{B7}$ | $R_{B1}$ | H |
| $L_{A2532}$ | $R_{A34}$ | $R_{B10}$ | $R_{B1}$ | H |
| $L_{A2533}$ | $R_{A34}$ | $R_{A3}$ | $R_{B1}$ | H |
| $L_{A2534}$ | H | H | $R_{B1}$ | $R_{B1}$ |
| $L_{A2535}$ | $R_{B1}$ | H | $R_{B1}$ | $R_{B1}$ |
| $L_{A2536}$ | $R_{B3}$ | H | $R_{B1}$ | $R_{B1}$ |
| $L_{A2537}$ | $R_{B4}$ | H | $R_{B1}$ | $R_{B1}$ |
| $L_{A2538}$ | $R_{B7}$ | H | $R_{B1}$ | $R_{B1}$ |
| $L_{A2539}$ | $R_{B10}$ | H | $R_{B1}$ | $R_{B1}$ |
| $L_{A2540}$ | $R_{A3}$ | H | $R_{B1}$ | $R_{B1}$ |
| $L_{A2541}$ | $R_{A34}$ | H | $R_{B1}$ | $R_{B1}$ |
| $L_{A2542}$ | H | $R_{B1}$ | $R_{B1}$ | $R_{B1}$ |
| $L_{A2543}$ | H | $R_{B2}$ | $R_{B1}$ | $R_{B1}$ |

| Ligand | $R^4$ | $R^5$ | $R^6$ | $R^7$ |
|---|---|---|---|---|
| $L_{A2544}$ | H | $R_{B3}$ | $R_{B1}$ | $R_{B1}$ |
| $L_{A2545}$ | H | $R_{B4}$ | $R_{B1}$ | $R_{B1}$ |
| $L_{A2546}$ | H | $R_{B7}$ | $R_{B1}$ | $R_{B1}$ |
| $L_{A2547}$ | H | $R_{B10}$ | $R_{B1}$ | $R_{B1}$ |
| $L_{A2548}$ | H | $R_{A3}$ | $R_{B1}$ | $R_{B1}$ |
| $L_{A2549}$ | H | $R_{A34}$ | $R_{B1}$ | $R_{B1}$ |
| $L_{A2550}$ | $R_{B1}$ | $R_{B1}$ | $R_{B1}$ | $R_{B1}$ |
| $L_{A2551}$ | $R_{B3}$ | $R_{B3}$ | $R_{B1}$ | $R_{B1}$ |
| $L_{A2552}$ | $R_{B4}$ | $R_{B4}$ | $R_{B1}$ | $R_{B1}$ |
| $L_{A2553}$ | $R_{B7}$ | $R_{B7}$ | $R_{B1}$ | $R_{B1}$ |
| $L_{A2554}$ | $R_{B10}$ | $R_{B10}$ | $R_{B1}$ | $R_{B1}$ |
| $L_{A2555}$ | $R_{A3}$ | $R_{A3}$ | $R_{B1}$ | $R_{B1}$ |
| $L_{A2556}$ | $R_{A34}$ | $R_{A34}$ | $R_{B1}$ | $R_{B1}$ |
| $L_{A2557}$ | $R_{B1}$ | $R_{B3}$ | $R_{B1}$ | $R_{B1}$ |
| $L_{A2558}$ | $R_{B1}$ | $R_{B4}$ | $R_{B1}$ | $R_{B1}$ |
| $L_{A2559}$ | $R_{B1}$ | $R_{B7}$ | $R_{B1}$ | $R_{B1}$ |
| $L_{A2560}$ | $R_{B1}$ | $R_{B10}$ | $R_{B1}$ | $R_{B1}$ |
| $L_{A2561}$ | $R_{B1}$ | $R_{A3}$ | $R_{B1}$ | $R_{B1}$ |
| $L_{A2562}$ | $R_{B1}$ | $R_{A34}$ | $R_{B1}$ | $R_{B1}$ |
| $L_{A2563}$ | $R_{B3}$ | $R_{B1}$ | $R_{B1}$ | $R_{B1}$ |
| $L_{A2564}$ | $R_{B3}$ | $R_{B4}$ | $R_{B1}$ | $R_{B1}$ |
| $L_{A2565}$ | $R_{B3}$ | $R_{B7}$ | $R_{B1}$ | $R_{B1}$ |
| $L_{A2566}$ | $R_{B3}$ | $R_{B10}$ | $R_{B1}$ | $R_{B1}$ |
| $L_{A2567}$ | $R_{B3}$ | $R_{A3}$ | $R_{B1}$ | $R_{B1}$ |
| $L_{A2568}$ | $R_{B3}$ | $R_{A34}$ | $R_{B1}$ | $R_{B1}$ |
| $L_{A2569}$ | $R_{B4}$ | $R_{B1}$ | $R_{B1}$ | $R_{B1}$ |
| $L_{A2570}$ | $R_{B4}$ | $R_{B3}$ | $R_{B1}$ | $R_{B1}$ |
| $L_{A2571}$ | $R_{B4}$ | $R_{B7}$ | $R_{B1}$ | $R_{B1}$ |
| $L_{A2572}$ | $R_{B4}$ | $R_{B10}$ | $R_{B1}$ | $R_{B1}$ |
| $L_{A2573}$ | $R_{B4}$ | $R_{A3}$ | $R_{B1}$ | $R_{B1}$ |
| $L_{A2574}$ | $R_{B4}$ | $R_{A34}$ | $R_{B1}$ | $R_{B1}$ |
| $L_{A2575}$ | $R_{B7}$ | $R_{B1}$ | $R_{B1}$ | $R_{B1}$ |
| $L_{A2576}$ | $R_{B7}$ | $R_{B3}$ | $R_{B1}$ | $R_{B1}$ |
| $L_{A2577}$ | $R_{B7}$ | $R_{B4}$ | $R_{B1}$ | $R_{B1}$ |
| $L_{A2578}$ | $R_{B7}$ | $R_{B10}$ | $R_{B1}$ | $R_{B1}$ |
| $L_{A2579}$ | $R_{B7}$ | $R_{A3}$ | $R_{B1}$ | $R_{B1}$ |
| $L_{A2580}$ | $R_{B7}$ | $R_{A34}$ | $R_{B1}$ | $R_{B1}$ |
| $L_{A2581}$ | $R_{B10}$ | $R_{B1}$ | $R_{B1}$ | $R_{B1}$ |
| $L_{A2582}$ | $R_{B10}$ | $R_{B3}$ | $R_{B1}$ | $R_{B1}$ |
| $L_{A2583}$ | $R_{B10}$ | $R_{B4}$ | $R_{B1}$ | $R_{B1}$ |
| $L_{A2584}$ | $R_{B10}$ | $R_{B7}$ | $R_{B1}$ | $R_{B1}$ |
| $L_{A2585}$ | $R_{B10}$ | $R_{A3}$ | $R_{B1}$ | $R_{B1}$ |
| $L_{A2586}$ | $R_{B10}$ | $R_{A34}$ | $R_{B1}$ | $R_{B1}$ |
| $L_{A2587}$ | $R_{A3}$ | $R_{B1}$ | $R_{B1}$ | $R_{B1}$ |
| $L_{A2588}$ | $R_{A3}$ | $R_{B3}$ | $R_{B1}$ | $R_{B1}$ |
| $L_{A2589}$ | $R_{A3}$ | $R_{B4}$ | $R_{B1}$ | $R_{B1}$ |
| $L_{A2590}$ | $R_{A3}$ | $R_{B7}$ | $R_{B1}$ | $R_{B1}$ |
| $L_{A2591}$ | $R_{A3}$ | $R_{B10}$ | $R_{B1}$ | $R_{B1}$ |
| $L_{A2592}$ | $R_{A3}$ | $R_{A34}$ | $R_{B1}$ | $R_{B1}$ |
| $L_{A2593}$ | $R_{A34}$ | $R_{B1}$ | $R_{B1}$ | $R_{B1}$ |
| $L_{A2594}$ | $R_{A34}$ | $R_{B3}$ | $R_{B1}$ | $R_{B1}$ |
| $L_{A2595}$ | $R_{A34}$ | $R_{B4}$ | $R_{B1}$ | $R_{B1}$ |
| $L_{A2596}$ | $R_{A34}$ | $R_{B7}$ | $R_{B1}$ | $R_{B1}$ |
| $L_{A2597}$ | $R_{A34}$ | $R_{B10}$ | $R_{B1}$ | $R_{B1}$ |
| $L_{A2598}$ | $R_{A34}$ | $R_{A3}$ | $R_{B1}$ | $R_{B1}$ |

$L_{A2599}$ through $L_{A2858}$ that are based on a structure of Formula XII,

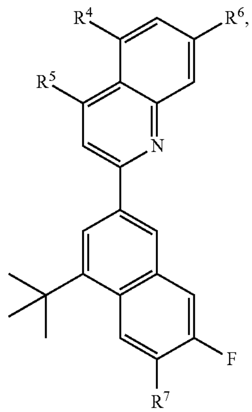

in which $R^4$, $R^5$, $R^6$, and $R^7$ are defined as provided below:

| Ligand | $R^4$ | $R^5$ | $R^6$ | $R^7$ |
|---|---|---|---|---|
| $L_{A2599}$ | H | H | H | H |
| $L_{A2600}$ | $R_{B1}$ | H | H | H |
| $L_{A2601}$ | $R_{B3}$ | H | H | H |
| $L_{A2602}$ | $R_{B4}$ | H | H | H |
| $L_{A2603}$ | $R_{B7}$ | H | H | H |
| $L_{A2604}$ | $R_{B10}$ | H | H | H |
| $L_{A2605}$ | $R_{A3}$ | H | H | H |
| $L_{A2606}$ | $R_{A434}$ | H | H | H |
| $L_{A2607}$ | H | $R_{B1}$ | H | H |
| $L_{A2608}$ | H | $R_{B2}$ | H | H |
| $L_{A2609}$ | H | $R_{B3}$ | H | H |
| $L_{A2610}$ | H | $R_{B4}$ | H | H |
| $L_{A2611}$ | H | $R_{B7}$ | H | H |
| $L_{A2612}$ | H | $R_{B10}$ | H | H |
| $L_{A2613}$ | H | $R_{A3}$ | H | H |
| $L_{A2614}$ | H | $R_{A434}$ | H | H |
| $L_{A2615}$ | $R_{B1}$ | $R_{B1}$ | H | H |
| $L_{A2616}$ | $R_{B3}$ | $R_{B3}$ | H | H |
| $L_{A2617}$ | $R_{B4}$ | $R_{B4}$ | H | H |
| $L_{A2618}$ | $R_{B7}$ | $R_{B7}$ | H | H |
| $L_{A2619}$ | $R_{B10}$ | $R_{B10}$ | H | H |
| $L_{A2620}$ | $R_{A3}$ | $R_{A3}$ | H | H |
| $L_{A2621}$ | $R_{A434}$ | $R_{A434}$ | H | H |
| $L_{A2622}$ | $R_{B1}$ | $R_{B3}$ | H | H |
| $L_{A2623}$ | $R_{B1}$ | $R_{B4}$ | H | H |
| $L_{A2624}$ | $R_{B1}$ | $R_{B7}$ | H | H |
| $L_{A2625}$ | $R_{B1}$ | $R_{B10}$ | H | H |
| $L_{A2626}$ | $R_{B1}$ | $R_{A3}$ | H | H |
| $L_{A2627}$ | $R_{B1}$ | $R_{A434}$ | H | H |
| $L_{A2628}$ | $R_{B3}$ | $R_{B1}$ | H | H |
| $L_{A2629}$ | $R_{B3}$ | $R_{B4}$ | H | H |
| $L_{A2630}$ | $R_{B3}$ | $R_{B7}$ | H | H |
| $L_{A2631}$ | $R_{B3}$ | $R_{B10}$ | H | H |
| $L_{A2632}$ | $R_{B3}$ | $R_{A3}$ | H | H |
| $L_{A2633}$ | $R_{B3}$ | $R_{A434}$ | H | H |
| $L_{A2634}$ | $R_{B4}$ | $R_{B1}$ | H | H |
| $L_{A2635}$ | $R_{B4}$ | $R_{B3}$ | H | H |
| $L_{A2636}$ | $R_{B4}$ | $R_{B7}$ | H | H |
| $L_{A2637}$ | $R_{B4}$ | $R_{B10}$ | H | H |
| $L_{A2638}$ | $R_{B4}$ | $R_{A3}$ | H | H |
| $L_{A2639}$ | $R_{B4}$ | $R_{A434}$ | H | H |
| $L_{A2640}$ | $R_{B7}$ | $R_{B1}$ | H | H |
| $L_{A2641}$ | $R_{B7}$ | $R_{B3}$ | H | H |
| $L_{A2642}$ | $R_{B7}$ | $R_{B4}$ | H | H |
| $L_{A2643}$ | $R_{B7}$ | $R_{B10}$ | H | H |
| $L_{A2644}$ | $R_{B7}$ | $R_{A3}$ | H | H |
| $L_{A2645}$ | $R_{B7}$ | $R_{A434}$ | H | H |
| $L_{A2646}$ | $R_{B10}$ | $R_{B1}$ | H | H |
| $L_{A2647}$ | $R_{B10}$ | $R_{B3}$ | H | H |
| $L_{A2648}$ | $R_{B10}$ | $R_{B4}$ | H | H |
| $L_{A2649}$ | $R_{B10}$ | $R_{B7}$ | H | H |

-continued

| Ligand | $R^4$ | $R^5$ | $R^6$ | $R^7$ |
|---|---|---|---|---|
| $L_{A2650}$ | $R_{B10}$ | $R_{A3}$ | H | H |
| $L_{A2651}$ | $R_{B10}$ | $R_{A434}$ | H | H |
| $L_{A2652}$ | $R_{A3}$ | $R_{B1}$ | H | H |
| $L_{A2653}$ | $R_{A3}$ | $R_{B3}$ | H | H |
| $L_{A2654}$ | $R_{A3}$ | $R_{B4}$ | H | H |
| $L_{A2655}$ | $R_{A3}$ | $R_{B7}$ | H | H |
| $L_{A2656}$ | $R_{A3}$ | $R_{B10}$ | H | H |
| $L_{A2657}$ | $R_{A3}$ | $R_{A434}$ | H | H |
| $L_{A2658}$ | $R_{A434}$ | $R_{B1}$ | H | H |
| $L_{A2659}$ | $R_{A434}$ | $R_{B3}$ | H | H |
| $L_{A2660}$ | $R_{A434}$ | $R_{B4}$ | H | H |
| $L_{A2661}$ | $R_{A434}$ | $R_{B7}$ | H | H |
| $L_{A2662}$ | $R_{A434}$ | $R_{B10}$ | H | H |
| $L_{A2663}$ | $R_{A434}$ | $R_{A3}$ | H | H |
| $L_{A2664}$ | H | H | H | $R_{B1}$ |
| $L_{A2665}$ | $R_{B1}$ | H | H | $R_{B1}$ |
| $L_{A2666}$ | $R_{B3}$ | H | H | $R_{B1}$ |
| $L_{A2667}$ | $R_{B4}$ | H | H | $R_{B1}$ |
| $L_{A2668}$ | $R_{B7}$ | H | H | $R_{B1}$ |
| $L_{A2669}$ | $R_{B10}$ | H | H | $R_{B1}$ |
| $L_{A2670}$ | $R_{A3}$ | H | H | $R_{B1}$ |
| $L_{A2671}$ | $R_{A434}$ | H | H | $R_{B1}$ |
| $L_{A2672}$ | H | $R_{B1}$ | H | $R_{B1}$ |
| $L_{A2673}$ | H | $R_{B2}$ | H | $R_{B1}$ |
| $L_{A2674}$ | H | $R_{B3}$ | H | $R_{B1}$ |
| $L_{A2675}$ | H | $R_{B4}$ | H | $R_{B1}$ |
| $L_{A2676}$ | H | $R_{B7}$ | H | $R_{B1}$ |
| $L_{A2677}$ | H | $R_{B10}$ | H | $R_{B1}$ |
| $L_{A2678}$ | H | $R_{A3}$ | H | $R_{B1}$ |
| $L_{A2679}$ | H | $R_{A434}$ | H | $R_{B1}$ |
| $L_{A2680}$ | $R_{B1}$ | $R_{B1}$ | H | $R_{B1}$ |
| $L_{A2681}$ | $R_{B3}$ | $R_{B3}$ | H | $R_{B1}$ |
| $L_{A2682}$ | $R_{B4}$ | $R_{B4}$ | H | $R_{B1}$ |
| $L_{A2683}$ | $R_{B7}$ | $R_{B7}$ | H | $R_{B1}$ |
| $L_{A2684}$ | $R_{B10}$ | $R_{B10}$ | H | $R_{B1}$ |
| $L_{A2685}$ | $R_{A3}$ | $R_{A3}$ | H | $R_{B1}$ |
| $L_{A2686}$ | $R_{A434}$ | $R_{A434}$ | H | $R_{B1}$ |
| $L_{A2687}$ | $R_{B1}$ | $R_{B3}$ | H | $R_{B1}$ |
| $L_{A2688}$ | $R_{B1}$ | $R_{B4}$ | H | $R_{B1}$ |
| $L_{A2689}$ | $R_{B1}$ | $R_{B7}$ | H | $R_{B1}$ |
| $L_{A2690}$ | $R_{B1}$ | $R_{B10}$ | H | $R_{B1}$ |
| $L_{A2691}$ | $R_{B1}$ | $R_{A3}$ | H | $R_{B1}$ |
| $L_{A2692}$ | $R_{B1}$ | $R_{A434}$ | H | $R_{B1}$ |
| $L_{A2693}$ | $R_{B3}$ | $R_{B1}$ | H | $R_{B1}$ |
| $L_{A2694}$ | $R_{B3}$ | $R_{B4}$ | H | $R_{B1}$ |
| $L_{A2695}$ | $R_{B3}$ | $R_{B7}$ | H | $R_{B1}$ |
| $L_{A2696}$ | $R_{B3}$ | $R_{B10}$ | H | $R_{B1}$ |
| $L_{A2697}$ | $R_{B3}$ | $R_{A3}$ | H | $R_{B1}$ |
| $L_{A2698}$ | $R_{B3}$ | $R_{A434}$ | H | $R_{B1}$ |
| $L_{A2699}$ | $R_{B4}$ | $R_{B1}$ | H | $R_{B1}$ |
| $L_{A2700}$ | $R_{B4}$ | $R_{B3}$ | H | $R_{B1}$ |
| $L_{A2701}$ | $R_{B4}$ | $R_{B7}$ | H | $R_{B1}$ |
| $L_{A2702}$ | $R_{B4}$ | $R_{B10}$ | H | $R_{B1}$ |
| $L_{A2703}$ | $R_{B4}$ | $R_{A3}$ | H | $R_{B1}$ |
| $L_{A2704}$ | $R_{B4}$ | $R_{A434}$ | H | $R_{B1}$ |
| $L_{A2705}$ | $R_{B7}$ | $R_{B1}$ | H | $R_{B1}$ |
| $L_{A2706}$ | $R_{B7}$ | $R_{B3}$ | H | $R_{B1}$ |
| $L_{A2707}$ | $R_{B7}$ | $R_{B4}$ | H | $R_{B1}$ |
| $L_{A2708}$ | $R_{B7}$ | $R_{B10}$ | H | $R_{B1}$ |
| $L_{A2709}$ | $R_{B7}$ | $R_{A3}$ | H | $R_{B1}$ |
| $L_{A2710}$ | $R_{B7}$ | $R_{A434}$ | H | $R_{B1}$ |
| $L_{A2711}$ | $R_{B10}$ | $R_{B1}$ | H | $R_{B1}$ |
| $L_{A2712}$ | $R_{B10}$ | $R_{B3}$ | H | $R_{B1}$ |
| $L_{A2713}$ | $R_{B10}$ | $R_{B4}$ | H | $R_{B1}$ |
| $L_{A2714}$ | $R_{B10}$ | $R_{B7}$ | H | $R_{B1}$ |
| $L_{A2715}$ | $R_{B10}$ | $R_{A3}$ | H | $R_{B1}$ |
| $L_{A2716}$ | $R_{B10}$ | $R_{A434}$ | H | $R_{B1}$ |
| $L_{A2717}$ | $R_{A3}$ | $R_{B1}$ | H | $R_{B1}$ |
| $L_{A2718}$ | $R_{A3}$ | $R_{B3}$ | H | $R_{B1}$ |
| $L_{A2719}$ | $R_{A3}$ | $R_{B4}$ | H | $R_{B1}$ |
| $L_{A2720}$ | $R_{A3}$ | $R_{B7}$ | H | $R_{B1}$ |
| $L_{A2721}$ | $R_{A3}$ | $R_{B10}$ | H | $R_{B1}$ |
| $L_{A2722}$ | $R_{A3}$ | $R_{A434}$ | H | $R_{B1}$ |
| $L_{A2723}$ | $R_{A434}$ | $R_{B1}$ | H | $R_{B1}$ |
| $L_{A2724}$ | $R_{A434}$ | $R_{B3}$ | H | $R_{B1}$ |
| $L_{A2725}$ | $R_{A434}$ | $R_{B4}$ | H | $R_{B1}$ |
| $L_{A2726}$ | $R_{A434}$ | $R_{B7}$ | H | $R_{B1}$ |

-continued

| Ligand | $R^4$ | $R^5$ | $R^6$ | $R^7$ |
|---|---|---|---|---|
| $L_{A2727}$ | $R_{A34}$ | $R_{B10}$ | H | $R_{B1}$ |
| $L_{A2728}$ | $R_{A34}$ | $R_{A3}$ | H | $R_{B1}$ |
| $L_{A2729}$ | H | H | $R_{B1}$ | H |
| $L_{A2730}$ | $R_{B1}$ | H | $R_{B1}$ | H |
| $L_{A2731}$ | $R_{B3}$ | H | $R_{B1}$ | H |
| $L_{A2732}$ | $R_{B4}$ | H | $R_{B1}$ | H |
| $L_{A2733}$ | $R_{B7}$ | H | $R_{B1}$ | H |
| $L_{A2734}$ | $R_{B10}$ | H | $R_{B1}$ | H |
| $L_{A2735}$ | $R_{A3}$ | H | $R_{B1}$ | H |
| $L_{A2736}$ | $R_{A34}$ | H | $R_{B1}$ | H |
| $L_{A2737}$ | H | $R_{B1}$ | $R_{B1}$ | H |
| $L_{A2738}$ | H | $R_{B2}$ | $R_{B1}$ | H |
| $L_{A2739}$ | H | $R_{B3}$ | $R_{B1}$ | H |
| $L_{A2740}$ | H | $R_{B4}$ | $R_{B1}$ | H |
| $L_{A2741}$ | H | $R_{B7}$ | $R_{B1}$ | H |
| $L_{A2742}$ | H | $R_{B10}$ | $R_{B1}$ | H |
| $L_{A2743}$ | H | $R_{A3}$ | $R_{B1}$ | H |
| $L_{A2744}$ | H | $R_{A34}$ | $R_{B1}$ | H |
| $L_{A2745}$ | $R_{B1}$ | $R_{B1}$ | $R_{B1}$ | H |
| $L_{A2746}$ | $R_{B3}$ | $R_{B3}$ | $R_{B1}$ | H |
| $L_{A2747}$ | $R_{B4}$ | $R_{B4}$ | $R_{B1}$ | H |
| $L_{A2748}$ | $R_{B7}$ | $R_{B7}$ | $R_{B1}$ | H |
| $L_{A2749}$ | $R_{B10}$ | $R_{B10}$ | $R_{B1}$ | H |
| $L_{A2750}$ | $R_{A3}$ | $R_{A3}$ | $R_{B1}$ | H |
| $L_{A2751}$ | $R_{A34}$ | $R_{A34}$ | $R_{B1}$ | H |
| $L_{A2752}$ | $R_{B1}$ | $R_{B3}$ | $R_{B1}$ | H |
| $L_{A2753}$ | $R_{B1}$ | $R_{B4}$ | $R_{B1}$ | H |
| $L_{A2754}$ | $R_{B1}$ | $R_{B7}$ | $R_{B1}$ | H |
| $L_{A2755}$ | $R_{B1}$ | $R_{B10}$ | $R_{B1}$ | H |
| $L_{A2756}$ | $R_{B1}$ | $R_{A3}$ | $R_{B1}$ | H |
| $L_{A2757}$ | $R_{B1}$ | $R_{A34}$ | $R_{B1}$ | H |
| $L_{A2758}$ | $R_{B3}$ | $R_{B1}$ | $R_{B1}$ | H |
| $L_{A2759}$ | $R_{B3}$ | $R_{B4}$ | $R_{B1}$ | H |
| $L_{A2760}$ | $R_{B3}$ | $R_{B7}$ | $R_{B1}$ | H |
| $L_{A2761}$ | $R_{B3}$ | $R_{B10}$ | $R_{B1}$ | H |
| $L_{A2762}$ | $R_{B3}$ | $R_{A3}$ | $R_{B1}$ | H |
| $L_{A2763}$ | $R_{B3}$ | $R_{A34}$ | $R_{B1}$ | H |
| $L_{A2764}$ | $R_{B4}$ | $R_{B1}$ | $R_{B1}$ | H |
| $L_{A2765}$ | $R_{B4}$ | $R_{B3}$ | $R_{B1}$ | H |
| $L_{A2766}$ | $R_{B4}$ | $R_{B7}$ | $R_{B1}$ | H |
| $L_{A2767}$ | $R_{B4}$ | $R_{B10}$ | $R_{B1}$ | H |
| $L_{A2768}$ | $R_{B4}$ | $R_{A3}$ | $R_{B1}$ | H |
| $L_{A2769}$ | $R_{B4}$ | $R_{A34}$ | $R_{B1}$ | H |
| $L_{A2770}$ | $R_{B7}$ | $R_{B1}$ | $R_{B1}$ | H |
| $L_{A2771}$ | $R_{B7}$ | $R_{B3}$ | $R_{B1}$ | H |
| $L_{A2772}$ | $R_{B7}$ | $R_{B4}$ | $R_{B1}$ | H |
| $L_{A2773}$ | $R_{B7}$ | $R_{B10}$ | $R_{B1}$ | H |
| $L_{A2774}$ | $R_{B7}$ | $R_{A3}$ | $R_{B1}$ | H |
| $L_{A2775}$ | $R_{B7}$ | $R_{A34}$ | $R_{B1}$ | H |
| $L_{A2776}$ | $R_{B10}$ | $R_{B1}$ | $R_{B1}$ | H |
| $L_{A2777}$ | $R_{B10}$ | $R_{B3}$ | $R_{B1}$ | H |
| $L_{A2778}$ | $R_{B10}$ | $R_{B4}$ | $R_{B1}$ | H |
| $L_{A2779}$ | $R_{B10}$ | $R_{B7}$ | $R_{B1}$ | H |
| $L_{A2780}$ | $R_{B10}$ | $R_{A3}$ | $R_{B1}$ | H |
| $L_{A2781}$ | $R_{B10}$ | $R_{A34}$ | $R_{B1}$ | H |
| $L_{A2782}$ | $R_{A3}$ | $R_{B1}$ | $R_{B1}$ | H |
| $L_{A2783}$ | $R_{A3}$ | $R_{B3}$ | $R_{B1}$ | H |
| $L_{A2784}$ | $R_{A3}$ | $R_{B4}$ | $R_{B1}$ | H |
| $L_{A2785}$ | $R_{A3}$ | $R_{B7}$ | $R_{B1}$ | H |
| $L_{A2786}$ | $R_{A3}$ | $R_{B10}$ | $R_{B1}$ | H |
| $L_{A2787}$ | $R_{A3}$ | $R_{A34}$ | $R_{B1}$ | H |
| $L_{A2788}$ | $R_{A34}$ | $R_{B1}$ | $R_{B1}$ | H |
| $L_{A2789}$ | $R_{A34}$ | $R_{B3}$ | $R_{B1}$ | H |
| $L_{A2790}$ | $R_{A34}$ | $R_{B4}$ | $R_{B1}$ | H |
| $L_{A2791}$ | $R_{A34}$ | $R_{B7}$ | $R_{B1}$ | H |
| $L_{A2792}$ | $R_{A34}$ | $R_{B10}$ | $R_{B1}$ | H |
| $L_{A2793}$ | $R_{A34}$ | $R_{A3}$ | $R_{B1}$ | H |
| $L_{A2794}$ | H | H | $R_{B1}$ | $R_{B1}$ |
| $L_{A2795}$ | $R_{B1}$ | H | $R_{B1}$ | $R_{B1}$ |
| $L_{A2796}$ | $R_{B3}$ | H | $R_{B1}$ | $R_{B1}$ |
| $L_{A2797}$ | $R_{B4}$ | H | $R_{B1}$ | $R_{B1}$ |
| $L_{A2798}$ | $R_{B7}$ | H | $R_{B1}$ | $R_{B1}$ |
| $L_{A2799}$ | $R_{B10}$ | H | $R_{B1}$ | $R_{B1}$ |
| $L_{A2800}$ | $R_{A3}$ | H | $R_{B1}$ | $R_{B1}$ |
| $L_{A2801}$ | $R_{A34}$ | H | $R_{B1}$ | $R_{B1}$ |
| $L_{A2802}$ | H | $R_{B1}$ | $R_{B1}$ | $R_{B1}$ |
| $L_{A2803}$ | H | $R_{B2}$ | $R_{B1}$ | $R_{B1}$ |

-continued

| Ligand | $R^4$ | $R^5$ | $R^6$ | $R^7$ |
|---|---|---|---|---|
| $L_{A2804}$ | H | $R_{B3}$ | $R_{B1}$ | $R_{B1}$ |
| $L_{A2805}$ | H | $R_{B4}$ | $R_{B1}$ | $R_{B1}$ |
| $L_{A2806}$ | H | $R_{B7}$ | $R_{B1}$ | $R_{B1}$ |
| $L_{A2807}$ | H | $R_{B10}$ | $R_{B1}$ | $R_{B1}$ |
| $L_{A2808}$ | H | $R_{A3}$ | $R_{B1}$ | $R_{B1}$ |
| $L_{A2809}$ | H | $R_{A34}$ | $R_{B1}$ | $R_{B1}$ |
| $L_{A2810}$ | $R_{B1}$ | $R_{B1}$ | $R_{B1}$ | $R_{B1}$ |
| $L_{A2811}$ | $R_{B3}$ | $R_{B3}$ | $R_{B1}$ | $R_{B1}$ |
| $L_{A2812}$ | $R_{B4}$ | $R_{B4}$ | $R_{B1}$ | $R_{B1}$ |
| $L_{A2813}$ | $R_{B7}$ | $R_{B7}$ | $R_{B1}$ | $R_{B1}$ |
| $L_{A2814}$ | $R_{B10}$ | $R_{B10}$ | $R_{B1}$ | $R_{B1}$ |
| $L_{A2815}$ | $R_{A3}$ | $R_{A3}$ | $R_{B1}$ | $R_{B1}$ |
| $L_{A2816}$ | $R_{A34}$ | $R_{A34}$ | $R_{B1}$ | $R_{B1}$ |
| $L_{A2817}$ | $R_{B1}$ | $R_{B3}$ | $R_{B1}$ | $R_{B1}$ |
| $L_{A2818}$ | $R_{B1}$ | $R_{B4}$ | $R_{B1}$ | $R_{B1}$ |
| $L_{A2819}$ | $R_{B1}$ | $R_{B7}$ | $R_{B1}$ | $R_{B1}$ |
| $L_{A2820}$ | $R_{B1}$ | $R_{B10}$ | $R_{B1}$ | $R_{B1}$ |
| $L_{A2821}$ | $R_{B1}$ | $R_{A3}$ | $R_{B1}$ | $R_{B1}$ |
| $L_{A2822}$ | $R_{B1}$ | $R_{A34}$ | $R_{B1}$ | $R_{B1}$ |
| $L_{A2823}$ | $R_{B3}$ | $R_{B1}$ | $R_{B1}$ | $R_{B1}$ |
| $L_{A2824}$ | $R_{B3}$ | $R_{B4}$ | $R_{B1}$ | $R_{B1}$ |
| $L_{A2825}$ | $R_{B3}$ | $R_{B7}$ | $R_{B1}$ | $R_{B1}$ |
| $L_{A2826}$ | $R_{B3}$ | $R_{B10}$ | $R_{B1}$ | $R_{B1}$ |
| $L_{A2827}$ | $R_{B3}$ | $R_{A3}$ | $R_{B1}$ | $R_{B1}$ |
| $L_{A2828}$ | $R_{B3}$ | $R_{A34}$ | $R_{B1}$ | $R_{B1}$ |
| $L_{A2829}$ | $R_{B4}$ | $R_{B1}$ | $R_{B1}$ | $R_{B1}$ |
| $L_{A2830}$ | $R_{B4}$ | $R_{B3}$ | $R_{B1}$ | $R_{B1}$ |
| $L_{A2831}$ | $R_{B4}$ | $R_{B7}$ | $R_{B1}$ | $R_{B1}$ |
| $L_{A2832}$ | $R_{B4}$ | $R_{B10}$ | $R_{B1}$ | $R_{B1}$ |
| $L_{A2833}$ | $R_{B4}$ | $R_{A3}$ | $R_{B1}$ | $R_{B1}$ |
| $L_{A2834}$ | $R_{B4}$ | $R_{A34}$ | $R_{B1}$ | $R_{B1}$ |
| $L_{A2835}$ | $R_{B7}$ | $R_{B1}$ | $R_{B1}$ | $R_{B1}$ |
| $L_{A2836}$ | $R_{B7}$ | $R_{B3}$ | $R_{B1}$ | $R_{B1}$ |
| $L_{A2837}$ | $R_{B7}$ | $R_{B4}$ | $R_{B1}$ | $R_{B1}$ |
| $L_{A2838}$ | $R_{B7}$ | $R_{B10}$ | $R_{B1}$ | $R_{B1}$ |
| $L_{A2839}$ | $R_{B7}$ | $R_{A3}$ | $R_{B1}$ | $R_{B1}$ |
| $L_{A2840}$ | $R_{B7}$ | $R_{A34}$ | $R_{B1}$ | $R_{B1}$ |
| $L_{A2841}$ | $R_{B10}$ | $R_{B1}$ | $R_{B1}$ | $R_{B1}$ |
| $L_{A2842}$ | $R_{B10}$ | $R_{B3}$ | $R_{B1}$ | $R_{B1}$ |
| $L_{A2843}$ | $R_{B10}$ | $R_{B4}$ | $R_{B1}$ | $R_{B1}$ |
| $L_{A2844}$ | $R_{B10}$ | $R_{B7}$ | $R_{B1}$ | $R_{B1}$ |
| $L_{A2845}$ | $R_{B10}$ | $R_{A3}$ | $R_{B1}$ | $R_{B1}$ |
| $L_{A2846}$ | $R_{B10}$ | $R_{A34}$ | $R_{B1}$ | $R_{B1}$ |
| $L_{A2847}$ | $R_{A3}$ | $R_{B1}$ | $R_{B1}$ | $R_{B1}$ |
| $L_{A2848}$ | $R_{A3}$ | $R_{B3}$ | $R_{B1}$ | $R_{B1}$ |
| $L_{A2849}$ | $R_{A3}$ | $R_{B4}$ | $R_{B1}$ | $R_{B1}$ |
| $L_{A2850}$ | $R_{A3}$ | $R_{B7}$ | $R_{B1}$ | $R_{B1}$ |
| $L_{A2851}$ | $R_{A3}$ | $R_{B10}$ | $R_{B1}$ | $R_{B1}$ |
| $L_{A2852}$ | $R_{A3}$ | $R_{A34}$ | $R_{B1}$ | $R_{B1}$ |
| $L_{A2853}$ | $R_{A34}$ | $R_{B1}$ | $R_{B1}$ | $R_{B1}$ |
| $L_{A2854}$ | $R_{A34}$ | $R_{B3}$ | $R_{B1}$ | $R_{B1}$ |
| $L_{A2855}$ | $R_{A34}$ | $R_{B4}$ | $R_{B1}$ | $R_{B1}$ |
| $L_{A2856}$ | $R_{A34}$ | $R_{B7}$ | $R_{B1}$ | $R_{B1}$ |
| $L_{A2857}$ | $R_{A34}$ | $R_{B10}$ | $R_{B1}$ | $R_{B1}$ |
| $L_{A2858}$ | $R_{A34}$ | $R_{A3}$ | $R_{B1}$ | $R_{B1}$ |

$L_{A2859}$ through $L_{A3118}$ that are based on a structure of Formula XIII,

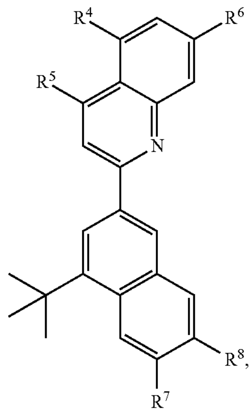

in which $R^4$, $R^5$, $R^6$, and $R^8$ are defined as provided below:

| Ligand | $R^4$ | $R^5$ | $R^6$ | $R^8$ |
|---|---|---|---|---|
| $L_{A2859}$ | H | H | H | H |
| $L_{A2860}$ | $R_{B1}$ | H | H | H |
| $L_{A2861}$ | $R_{B3}$ | H | H | H |
| $L_{A2862}$ | $R_{B4}$ | H | H | H |
| $L_{A2863}$ | $R_{B7}$ | H | H | H |
| $L_{A2864}$ | $R_{B10}$ | H | H | H |
| $L_{A2865}$ | $R_{A3}$ | H | H | H |
| $L_{A2866}$ | $R_{A34}$ | H | H | H |
| $L_{A2867}$ | H | $R_{B1}$ | H | H |
| $L_{A2868}$ | H | $R_{B2}$ | H | H |
| $L_{A2869}$ | H | $R_{B3}$ | H | H |
| $L_{A2870}$ | H | $R_{B4}$ | H | H |
| $L_{A2871}$ | H | $R_{B7}$ | H | H |
| $L_{A2872}$ | H | $R_{B10}$ | H | H |
| $L_{A2873}$ | H | $R_{A3}$ | H | H |
| $L_{A2874}$ | H | $R_{A34}$ | H | H |
| $L_{A2875}$ | $R_{B1}$ | $R_{B1}$ | H | H |
| $L_{A2876}$ | $R_{B3}$ | $R_{B3}$ | H | H |
| $L_{A2877}$ | $R_{B4}$ | $R_{B4}$ | H | H |
| $L_{A2878}$ | $R_{B7}$ | $R_{B7}$ | H | H |
| $L_{A2879}$ | $R_{B10}$ | $R_{B10}$ | H | H |
| $L_{A2880}$ | $R_{A3}$ | $R_{A3}$ | H | H |
| $L_{A2881}$ | $R_{A34}$ | $R_{A34}$ | H | H |
| $L_{A2882}$ | $R_{B1}$ | $R_{B3}$ | H | H |
| $L_{A2883}$ | $R_{B1}$ | $R_{B4}$ | H | H |
| $L_{A2884}$ | $R_{B1}$ | $R_{B7}$ | H | H |
| $L_{A2885}$ | $R_{B1}$ | $R_{B10}$ | H | H |
| $L_{A2886}$ | $R_{B1}$ | $R_{A3}$ | H | H |
| $L_{A2887}$ | $R_{B1}$ | $R_{A34}$ | H | H |
| $L_{A2888}$ | $R_{B3}$ | $R_{B1}$ | H | H |
| $L_{A2889}$ | $R_{B3}$ | $R_{B4}$ | H | H |
| $L_{A2890}$ | $R_{B3}$ | $R_{B7}$ | H | H |
| $L_{A2891}$ | $R_{B3}$ | $R_{B10}$ | H | H |
| $L_{A2892}$ | $R_{B3}$ | $R_{A3}$ | H | H |
| $L_{A2893}$ | $R_{B3}$ | $R_{A34}$ | H | H |
| $L_{A2894}$ | $R_{B4}$ | $R_{B1}$ | H | H |
| $L_{A2895}$ | $R_{B4}$ | $R_{B3}$ | H | H |
| $L_{A2896}$ | $R_{B4}$ | $R_{B7}$ | H | H |
| $L_{A2897}$ | $R_{B4}$ | $R_{B10}$ | H | H |
| $L_{A2898}$ | $R_{B4}$ | $R_{A3}$ | H | H |
| $L_{A2899}$ | $R_{B4}$ | $R_{A34}$ | H | H |
| $L_{A2900}$ | $R_{B7}$ | $R_{B1}$ | H | H |
| $L_{A2901}$ | $R_{B7}$ | $R_{B3}$ | H | H |
| $L_{A2902}$ | $R_{B7}$ | $R_{B4}$ | H | H |
| $L_{A2903}$ | $R_{B7}$ | $R_{B10}$ | H | H |
| $L_{A2904}$ | $R_{B7}$ | $R_{A3}$ | H | H |
| $L_{A2905}$ | $R_{B7}$ | $R_{A34}$ | H | H |
| $L_{A2906}$ | $R_{B10}$ | $R_{B1}$ | H | H |
| $L_{A2907}$ | $R_{B10}$ | $R_{B3}$ | H | H |
| $L_{A2908}$ | $R_{B10}$ | $R_{B4}$ | H | H |
| $L_{A2909}$ | $R_{B10}$ | $R_{B7}$ | H | H |

-continued

| Ligand | $R^4$ | $R^5$ | $R^6$ | $R^8$ |
|---|---|---|---|---|
| $L_{A2910}$ | $R_{B10}$ | $R_{A3}$ | H | H |
| $L_{A2911}$ | $R_{B10}$ | $R_{A34}$ | H | H |
| $L_{A2912}$ | $R_{A3}$ | $R_{B1}$ | H | H |
| $L_{A2913}$ | $R_{A3}$ | $R_{B3}$ | H | H |
| $L_{A2914}$ | $R_{A3}$ | $R_{B4}$ | H | H |
| $L_{A2915}$ | $R_{A3}$ | $R_{B7}$ | H | H |
| $L_{A2916}$ | $R_{A3}$ | $R_{B10}$ | H | H |
| $L_{A2917}$ | $R_{A3}$ | $R_{A34}$ | H | H |
| $L_{A2918}$ | $R_{A34}$ | $R_{B1}$ | H | H |
| $L_{A2919}$ | $R_{A34}$ | $R_{B3}$ | H | H |
| $L_{A2920}$ | $R_{A34}$ | $R_{B4}$ | H | H |
| $L_{A2921}$ | $R_{A34}$ | $R_{B7}$ | H | H |
| $L_{A2922}$ | $R_{A34}$ | $R_{B10}$ | H | H |
| $L_{A2923}$ | $R_{A34}$ | $R_{A3}$ | H | H |
| $L_{A2924}$ | H | H | H | $R_{B1}$ |
| $L_{A2925}$ | $R_{B1}$ | H | H | $R_{B1}$ |
| $L_{A2926}$ | $R_{B3}$ | H | H | $R_{B1}$ |
| $L_{A2927}$ | $R_{B4}$ | H | H | $R_{B1}$ |
| $L_{A2928}$ | $R_{B7}$ | H | H | $R_{B1}$ |
| $L_{A2929}$ | $R_{B10}$ | H | H | $R_{B1}$ |
| $L_{A2930}$ | $R_{A3}$ | H | H | $R_{B1}$ |
| $L_{A2931}$ | $R_{A34}$ | H | H | $R_{B1}$ |
| $L_{A2932}$ | H | $R_{B1}$ | H | $R_{B1}$ |
| $L_{A2933}$ | H | $R_{B2}$ | H | $R_{B1}$ |
| $L_{A2934}$ | H | $R_{B3}$ | H | $R_{B1}$ |
| $L_{A2935}$ | H | $R_{B4}$ | H | $R_{B1}$ |
| $L_{A2936}$ | H | $R_{B7}$ | H | $R_{B1}$ |
| $L_{A2937}$ | H | $R_{B10}$ | H | $R_{B1}$ |
| $L_{A2938}$ | H | $R_{A3}$ | H | $R_{B1}$ |
| $L_{A2939}$ | H | $R_{A34}$ | H | $R_{B1}$ |
| $L_{A2940}$ | $R_{B1}$ | $R_{B1}$ | H | $R_{B1}$ |
| $L_{A2941}$ | $R_{B3}$ | $R_{B3}$ | H | $R_{B1}$ |
| $L_{A2942}$ | $R_{B4}$ | $R_{B4}$ | H | $R_{B1}$ |
| $L_{A2943}$ | $R_{B7}$ | $R_{B7}$ | H | $R_{B1}$ |
| $L_{A2944}$ | $R_{B10}$ | $R_{B10}$ | H | $R_{B1}$ |
| $L_{A2945}$ | $R_{A3}$ | $R_{A3}$ | H | $R_{B1}$ |
| $L_{A2946}$ | $R_{A34}$ | $R_{A34}$ | H | $R_{B1}$ |
| $L_{A2947}$ | $R_{B1}$ | $R_{B3}$ | H | $R_{B1}$ |
| $L_{A2948}$ | $R_{B1}$ | $R_{B4}$ | H | $R_{B1}$ |
| $L_{A2949}$ | $R_{B1}$ | $R_{B7}$ | H | $R_{B1}$ |
| $L_{A2950}$ | $R_{B1}$ | $R_{B10}$ | H | $R_{B1}$ |
| $L_{A2951}$ | $R_{B1}$ | $R_{A3}$ | H | $R_{B1}$ |
| $L_{A2952}$ | $R_{B1}$ | $R_{A34}$ | H | $R_{B1}$ |
| $L_{A2953}$ | $R_{B3}$ | $R_{B1}$ | H | $R_{B1}$ |
| $L_{A2954}$ | $R_{B3}$ | $R_{B4}$ | H | $R_{B1}$ |
| $L_{A2955}$ | $R_{B3}$ | $R_{B7}$ | H | $R_{B1}$ |
| $L_{A2956}$ | $R_{B3}$ | $R_{B10}$ | H | $R_{B1}$ |
| $L_{A2957}$ | $R_{B3}$ | $R_{A3}$ | H | $R_{B1}$ |
| $L_{A2958}$ | $R_{B3}$ | $R_{A34}$ | H | $R_{B1}$ |
| $L_{A2959}$ | $R_{B4}$ | $R_{B1}$ | H | $R_{B1}$ |
| $L_{A2960}$ | $R_{B4}$ | $R_{B3}$ | H | $R_{B1}$ |
| $L_{A2961}$ | $R_{B4}$ | $R_{B7}$ | H | $R_{B1}$ |
| $L_{A2962}$ | $R_{B4}$ | $R_{B10}$ | H | $R_{B1}$ |
| $L_{A2963}$ | $R_{B4}$ | $R_{A3}$ | H | $R_{B1}$ |
| $L_{A2964}$ | $R_{B4}$ | $R_{A34}$ | H | $R_{B1}$ |
| $L_{A2965}$ | $R_{B7}$ | $R_{B1}$ | H | $R_{B1}$ |
| $L_{A2966}$ | $R_{B7}$ | $R_{B3}$ | H | $R_{B1}$ |
| $L_{A2967}$ | $R_{B7}$ | $R_{B4}$ | H | $R_{B1}$ |
| $L_{A2968}$ | $R_{B7}$ | $R_{B10}$ | H | $R_{B1}$ |
| $L_{A2969}$ | $R_{B7}$ | $R_{A3}$ | H | $R_{B1}$ |
| $L_{A2970}$ | $R_{B7}$ | $R_{A34}$ | H | $R_{B1}$ |
| $L_{A2971}$ | $R_{B10}$ | $R_{B1}$ | H | $R_{B1}$ |
| $L_{A2972}$ | $R_{B10}$ | $R_{B3}$ | H | $R_{B1}$ |
| $L_{A2973}$ | $R_{B10}$ | $R_{B4}$ | H | $R_{B1}$ |
| $L_{A2974}$ | $R_{B10}$ | $R_{B7}$ | H | $R_{B1}$ |
| $L_{A2975}$ | $R_{B10}$ | $R_{A3}$ | H | $R_{B1}$ |
| $L_{A2976}$ | $R_{B10}$ | $R_{A34}$ | H | $R_{B1}$ |
| $L_{A2977}$ | $R_{A3}$ | $R_{B1}$ | H | $R_{B1}$ |
| $L_{A2978}$ | $R_{A3}$ | $R_{B3}$ | H | $R_{B1}$ |
| $L_{A2979}$ | $R_{A3}$ | $R_{B4}$ | H | $R_{B1}$ |
| $L_{A2980}$ | $R_{A3}$ | $R_{B7}$ | H | $R_{B1}$ |
| $L_{A2981}$ | $R_{A3}$ | $R_{B10}$ | H | $R_{B1}$ |
| $L_{A2982}$ | $R_{A3}$ | $R_{A34}$ | H | $R_{B1}$ |
| $L_{A2983}$ | $R_{A34}$ | $R_{B1}$ | H | $R_{B1}$ |
| $L_{A2984}$ | $R_{A34}$ | $R_{B3}$ | H | $R_{B1}$ |
| $L_{A2985}$ | $R_{A34}$ | $R_{B4}$ | H | $R_{B1}$ |
| $L_{A2986}$ | $R_{A34}$ | $R_{B7}$ | H | $R_{B1}$ |

-continued

| Ligand | $R^4$ | $R^5$ | $R^6$ | $R^8$ |
|---|---|---|---|---|
| $L_{A2987}$ | $R_{A34}$ | $R_{B10}$ | H | $R_{B1}$ |
| $L_{A2988}$ | $R_{A34}$ | $R_{A3}$ | H | $R_{B1}$ |
| $L_{A2989}$ | H | H | $R_{B1}$ | H |
| $L_{A2990}$ | $R_{B1}$ | H | $R_{B1}$ | H |
| $L_{A2991}$ | $R_{B3}$ | H | $R_{B1}$ | H |
| $L_{A2992}$ | $R_{B4}$ | H | $R_{B1}$ | H |
| $L_{A2993}$ | $R_{B7}$ | H | $R_{B1}$ | H |
| $L_{A2994}$ | $R_{B10}$ | H | $R_{B1}$ | H |
| $L_{A2995}$ | $R_{A3}$ | H | $R_{B1}$ | H |
| $L_{A2996}$ | $R_{A34}$ | H | $R_{B1}$ | H |
| $L_{A2997}$ | H | $R_{B1}$ | $R_{B1}$ | H |
| $L_{A2998}$ | H | $R_{B2}$ | $R_{B1}$ | H |
| $L_{A2999}$ | H | $R_{B3}$ | $R_{B1}$ | H |
| $L_{A3000}$ | H | $R_{B4}$ | $R_{B1}$ | H |
| $L_{A3001}$ | H | $R_{B7}$ | $R_{B1}$ | H |
| $L_{A3002}$ | H | $R_{B10}$ | $R_{B1}$ | H |
| $L_{A3003}$ | H | $R_{A3}$ | $R_{B1}$ | H |
| $L_{A3004}$ | H | $R_{A34}$ | $R_{B1}$ | H |
| $L_{A3005}$ | $R_{B1}$ | $R_{B1}$ | $R_{B1}$ | H |
| $L_{A3006}$ | $R_{B3}$ | $R_{B3}$ | $R_{B1}$ | H |
| $L_{A3007}$ | $R_{B4}$ | $R_{B4}$ | $R_{B1}$ | H |
| $L_{A3008}$ | $R_{B7}$ | $R_{B7}$ | $R_{B1}$ | H |
| $L_{A3009}$ | $R_{B10}$ | $R_{B10}$ | $R_{B1}$ | H |
| $L_{A3010}$ | $R_{A3}$ | $R_{A3}$ | $R_{B1}$ | H |
| $L_{A3011}$ | $R_{A34}$ | $R_{A34}$ | $R_{B1}$ | H |
| $L_{A3012}$ | $R_{B1}$ | $R_{B3}$ | $R_{B1}$ | H |
| $L_{A3013}$ | $R_{B1}$ | $R_{B4}$ | $R_{B1}$ | H |
| $L_{A3014}$ | $R_{B1}$ | $R_{B7}$ | $R_{B1}$ | H |
| $L_{A3015}$ | $R_{B1}$ | $R_{B10}$ | $R_{B1}$ | H |
| $L_{A3016}$ | $R_{B1}$ | $R_{A3}$ | $R_{B1}$ | H |
| $L_{A3017}$ | $R_{B1}$ | $R_{A34}$ | $R_{B1}$ | H |
| $L_{A3018}$ | $R_{B3}$ | $R_{B1}$ | $R_{B1}$ | H |
| $L_{A3019}$ | $R_{B3}$ | $R_{B4}$ | $R_{B1}$ | H |
| $L_{A3020}$ | $R_{B3}$ | $R_{B7}$ | $R_{B1}$ | H |
| $L_{A3021}$ | $R_{B3}$ | $R_{B10}$ | $R_{B1}$ | H |
| $L_{A3022}$ | $R_{B3}$ | $R_{A3}$ | $R_{B1}$ | H |
| $L_{A3023}$ | $R_{B3}$ | $R_{A34}$ | $R_{B1}$ | H |
| $L_{A3024}$ | $R_{B4}$ | $R_{B1}$ | $R_{B1}$ | H |
| $L_{A3025}$ | $R_{B4}$ | $R_{B3}$ | $R_{B1}$ | H |
| $L_{A3026}$ | $R_{B4}$ | $R_{B7}$ | $R_{B1}$ | H |
| $L_{A3027}$ | $R_{B4}$ | $R_{B10}$ | $R_{B1}$ | H |
| $L_{A3028}$ | $R_{B4}$ | $R_{A3}$ | $R_{B1}$ | H |
| $L_{A3029}$ | $R_{B4}$ | $R_{A34}$ | $R_{B1}$ | H |
| $L_{A3030}$ | $R_{B7}$ | $R_{B1}$ | $R_{B1}$ | H |
| $L_{A3031}$ | $R_{B7}$ | $R_{B3}$ | $R_{B1}$ | H |
| $L_{A3032}$ | $R_{B7}$ | $R_{B4}$ | $R_{B1}$ | H |
| $L_{A3033}$ | $R_{B7}$ | $R_{B10}$ | $R_{B1}$ | H |
| $L_{A3034}$ | $R_{B7}$ | $R_{A3}$ | $R_{B1}$ | H |
| $L_{A3035}$ | $R_{B7}$ | $R_{A34}$ | $R_{B1}$ | H |
| $L_{A3036}$ | $R_{B10}$ | $R_{B1}$ | $R_{B1}$ | H |
| $L_{A3037}$ | $R_{B10}$ | $R_{B3}$ | $R_{B1}$ | H |
| $L_{A3038}$ | $R_{B10}$ | $R_{B4}$ | $R_{B1}$ | H |
| $L_{A3039}$ | $R_{B10}$ | $R_{B7}$ | $R_{B1}$ | H |
| $L_{A3040}$ | $R_{B10}$ | $R_{A3}$ | $R_{B1}$ | H |
| $L_{A3041}$ | $R_{B10}$ | $R_{A34}$ | $R_{B1}$ | H |
| $L_{A3042}$ | $R_{A3}$ | $R_{B1}$ | $R_{B1}$ | H |
| $L_{A3043}$ | $R_{A3}$ | $R_{B3}$ | $R_{B1}$ | H |
| $L_{A3044}$ | $R_{A3}$ | $R_{B4}$ | $R_{B1}$ | H |
| $L_{A3045}$ | $R_{A3}$ | $R_{B7}$ | $R_{B1}$ | H |
| $L_{A3046}$ | $R_{A3}$ | $R_{B10}$ | $R_{B1}$ | H |
| $L_{A3047}$ | $R_{A3}$ | $R_{A34}$ | $R_{B1}$ | H |
| $L_{A3048}$ | $R_{A34}$ | $R_{B1}$ | $R_{B1}$ | H |
| $L_{A3049}$ | $R_{A34}$ | $R_{B3}$ | $R_{B1}$ | H |
| $L_{A3050}$ | $R_{A34}$ | $R_{B4}$ | $R_{B1}$ | H |
| $L_{A3051}$ | $R_{A34}$ | $R_{B7}$ | $R_{B1}$ | H |
| $L_{A3052}$ | $R_{A34}$ | $R_{B10}$ | $R_{B1}$ | H |
| $L_{A3053}$ | $R_{A34}$ | $R_{A3}$ | $R_{B1}$ | H |
| $L_{A3054}$ | H | H | $R_{B1}$ | $R_{B1}$ |
| $L_{A3055}$ | $R_{B1}$ | H | $R_{B1}$ | $R_{B1}$ |
| $L_{A3056}$ | $R_{B3}$ | H | $R_{B1}$ | $R_{B1}$ |
| $L_{A3057}$ | $R_{B4}$ | H | $R_{B1}$ | $R_{B1}$ |
| $L_{A3058}$ | $R_{B7}$ | H | $R_{B1}$ | $R_{B1}$ |
| $L_{A3059}$ | $R_{B10}$ | H | $R_{B1}$ | $R_{B1}$ |
| $L_{A3060}$ | $R_{A3}$ | H | $R_{B1}$ | $R_{B1}$ |
| $L_{A3061}$ | $R_{A34}$ | H | $R_{B1}$ | $R_{B1}$ |
| $L_{A3062}$ | H | $R_{B1}$ | $R_{B1}$ | $R_{B1}$ |
| $L_{A3063}$ | H | $R_{B2}$ | $R_{B1}$ | $R_{B1}$ |

-continued

| Ligand | $R^4$ | $R^5$ | $R^6$ | $R^8$ |
|---|---|---|---|---|
| $L_{A3064}$ | H | $R_{B3}$ | $R_{B1}$ | $R_{B1}$ |
| $L_{A3065}$ | H | $R_{B4}$ | $R_{B1}$ | $R_{B1}$ |
| $L_{A3066}$ | H | $R_{B7}$ | $R_{B1}$ | $R_{B1}$ |
| $L_{A3067}$ | H | $R_{B10}$ | $R_{B1}$ | $R_{B1}$ |
| $L_{A3068}$ | H | $R_{A3}$ | $R_{B1}$ | $R_{B1}$ |
| $L_{A3069}$ | H | $R_{A34}$ | $R_{B1}$ | $R_{B1}$ |
| $L_{A3070}$ | $R_{B1}$ | $R_{B1}$ | $R_{B1}$ | $R_{B1}$ |
| $L_{A3071}$ | $R_{B3}$ | $R_{B3}$ | $R_{B1}$ | $R_{B1}$ |
| $L_{A3072}$ | $R_{B4}$ | $R_{B4}$ | $R_{B1}$ | $R_{B1}$ |
| $L_{A3073}$ | $R_{B7}$ | $R_{B7}$ | $R_{B1}$ | $R_{B1}$ |
| $L_{A3074}$ | $R_{B10}$ | $R_{B10}$ | $R_{B1}$ | $R_{B1}$ |
| $L_{A3075}$ | $R_{A3}$ | $R_{A3}$ | $R_{B1}$ | $R_{B1}$ |
| $L_{A3076}$ | $R_{A34}$ | $R_{A34}$ | $R_{B1}$ | $R_{B1}$ |
| $L_{A3077}$ | $R_{B1}$ | $R_{B3}$ | $R_{B1}$ | $R_{B1}$ |
| $L_{A3078}$ | $R_{B1}$ | $R_{B4}$ | $R_{B1}$ | $R_{B1}$ |
| $L_{A3079}$ | $R_{B1}$ | $R_{B7}$ | $R_{B1}$ | $R_{B1}$ |
| $L_{A3080}$ | $R_{B1}$ | $R_{B10}$ | $R_{B1}$ | $R_{B1}$ |
| $L_{A3081}$ | $R_{B1}$ | $R_{A3}$ | $R_{B1}$ | $R_{B1}$ |
| $L_{A3082}$ | $R_{B1}$ | $R_{A34}$ | $R_{B1}$ | $R_{B1}$ |
| $L_{A3083}$ | $R_{B3}$ | $R_{B1}$ | $R_{B1}$ | $R_{B1}$ |
| $L_{A3084}$ | $R_{B3}$ | $R_{B4}$ | $R_{B1}$ | $R_{B1}$ |
| $L_{A3085}$ | $R_{B3}$ | $R_{B7}$ | $R_{B1}$ | $R_{B1}$ |
| $L_{A3086}$ | $R_{B3}$ | $R_{B10}$ | $R_{B1}$ | $R_{B1}$ |
| $L_{A3087}$ | $R_{B3}$ | $R_{A3}$ | $R_{B1}$ | $R_{B1}$ |
| $L_{A3088}$ | $R_{B3}$ | $R_{A34}$ | $R_{B1}$ | $R_{B1}$ |
| $L_{A3089}$ | $R_{B4}$ | $R_{B1}$ | $R_{B1}$ | $R_{B1}$ |
| $L_{A3090}$ | $R_{B4}$ | $R_{B3}$ | $R_{B1}$ | $R_{B1}$ |
| $L_{A3091}$ | $R_{B4}$ | $R_{B7}$ | $R_{B1}$ | $R_{B1}$ |
| $L_{A3092}$ | $R_{B4}$ | $R_{B10}$ | $R_{B1}$ | $R_{B1}$ |
| $L_{A3093}$ | $R_{B4}$ | $R_{A3}$ | $R_{B1}$ | $R_{B1}$ |
| $L_{A3094}$ | $R_{B4}$ | $R_{A34}$ | $R_{B1}$ | $R_{B1}$ |
| $L_{A3095}$ | $R_{B7}$ | $R_{B1}$ | $R_{B1}$ | $R_{B1}$ |
| $L_{A3096}$ | $R_{B7}$ | $R_{B3}$ | $R_{B1}$ | $R_{B1}$ |
| $L_{A3097}$ | $R_{B7}$ | $R_{B4}$ | $R_{B1}$ | $R_{B1}$ |
| $L_{A3098}$ | $R_{B7}$ | $R_{B10}$ | $R_{B1}$ | $R_{B1}$ |
| $L_{A3099}$ | $R_{B7}$ | $R_{A3}$ | $R_{B1}$ | $R_{B1}$ |
| $L_{A3100}$ | $R_{B7}$ | $R_{A34}$ | $R_{B1}$ | $R_{B1}$ |
| $L_{A3101}$ | $R_{B10}$ | $R_{B1}$ | $R_{B1}$ | $R_{B1}$ |
| $L_{A3102}$ | $R_{B10}$ | $R_{B3}$ | $R_{B1}$ | $R_{B1}$ |
| $L_{A3103}$ | $R_{B10}$ | $R_{B4}$ | $R_{B1}$ | $R_{B1}$ |
| $L_{A3104}$ | $R_{B10}$ | $R_{B7}$ | $R_{B1}$ | $R_{B1}$ |
| $L_{A3105}$ | $R_{B10}$ | $R_{A3}$ | $R_{B1}$ | $R_{B1}$ |
| $L_{A3106}$ | $R_{B10}$ | $R_{A34}$ | $R_{B1}$ | $R_{B1}$ |
| $L_{A3107}$ | $R_{A3}$ | $R_{B1}$ | $R_{B1}$ | $R_{B1}$ |
| $L_{A3108}$ | $R_{A3}$ | $R_{B3}$ | $R_{B1}$ | $R_{B1}$ |
| $L_{A3109}$ | $R_{A3}$ | $R_{B4}$ | $R_{B1}$ | $R_{B1}$ |
| $L_{A3110}$ | $R_{A3}$ | $R_{B7}$ | $R_{B1}$ | $R_{B1}$ |
| $L_{A3111}$ | $R_{A3}$ | $R_{B10}$ | $R_{B1}$ | $R_{B1}$ |
| $L_{A3112}$ | $R_{A3}$ | $R_{A34}$ | $R_{B1}$ | $R_{B1}$ |
| $L_{A3113}$ | $R_{A34}$ | $R_{B1}$ | $R_{B1}$ | $R_{B1}$ |
| $L_{A3114}$ | $R_{A34}$ | $R_{B3}$ | $R_{B1}$ | $R_{B1}$ |
| $L_{A3115}$ | $R_{A34}$ | $R_{B4}$ | $R_{B1}$ | $R_{B1}$ |
| $L_{A3116}$ | $R_{A34}$ | $R_{B7}$ | $R_{B1}$ | $R_{B1}$ |
| $L_{A3117}$ | $R_{A34}$ | $R_{B10}$ | $R_{B1}$ | $R_{B1}$ |
| $L_{A3118}$ | $R_{A34}$ | $R_{A3}$ | $R_{B1}$ | $R_{B1}$ |

$L_{A3119}$ through $L_{A3378}$ that are based on a structure of Formula XIV,

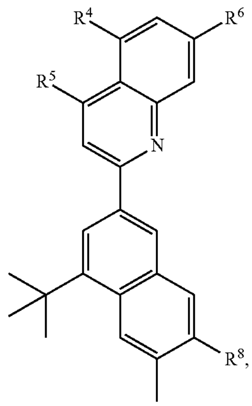

in which $R^4$, $R^5$, $R^6$, and $R^8$ are defined as provided below:

| Ligand | $R^4$ | $R^5$ | $R^6$ | $R^8$ |
|---|---|---|---|---|
| $L_{A3119}$ | H | H | H | H |
| $L_{A3120}$ | $R_{B1}$ | H | H | H |
| $L_{A3121}$ | $R_{B3}$ | H | H | H |
| $L_{A3122}$ | $R_{B4}$ | H | H | H |
| $L_{A3123}$ | $R_{B7}$ | H | H | H |
| $L_{A3124}$ | $R_{B10}$ | H | H | H |
| $L_{A3125}$ | $R_{A3}$ | H | H | H |
| $L_{A3126}$ | $R_{A34}$ | H | H | H |
| $L_{A3127}$ | H | $R_{B1}$ | H | H |
| $L_{A3128}$ | H | $R_{B2}$ | H | H |
| $L_{A3129}$ | H | $R_{B3}$ | H | H |
| $L_{A3130}$ | H | $R_{B4}$ | H | H |
| $L_{A3131}$ | H | $R_{B7}$ | H | H |
| $L_{A3132}$ | H | $R_{B10}$ | H | H |
| $L_{A3133}$ | H | $R_{A3}$ | H | H |
| $L_{A3134}$ | H | $R_{A34}$ | H | H |
| $L_{A3135}$ | $R_{B1}$ | $R_{B1}$ | H | H |
| $L_{A3136}$ | $R_{B3}$ | $R_{B3}$ | H | H |
| $L_{A3137}$ | $R_{B4}$ | $R_{B4}$ | H | H |
| $L_{A3138}$ | $R_{B7}$ | $R_{B7}$ | H | H |
| $L_{A3139}$ | $R_{B10}$ | $R_{B10}$ | H | H |
| $L_{A3140}$ | $R_{A3}$ | $R_{A3}$ | H | H |
| $L_{A3141}$ | $R_{A34}$ | $R_{A34}$ | H | H |
| $L_{A3142}$ | $R_{B1}$ | $R_{B3}$ | H | H |
| $L_{A3143}$ | $R_{B1}$ | $R_{B4}$ | H | H |
| $L_{A3144}$ | $R_{B1}$ | $R_{B7}$ | H | H |
| $L_{A3145}$ | $R_{B1}$ | $R_{B10}$ | H | H |
| $L_{A3146}$ | $R_{B1}$ | $R_{A3}$ | H | H |
| $L_{A3147}$ | $R_{B1}$ | $R_{A34}$ | H | H |
| $L_{A3148}$ | $R_{B3}$ | $R_{B1}$ | H | H |
| $L_{A3149}$ | $R_{B3}$ | $R_{B4}$ | H | H |
| $L_{A3150}$ | $R_{B3}$ | $R_{B7}$ | H | H |
| $L_{A3151}$ | $R_{B3}$ | $R_{B10}$ | H | H |
| $L_{A3152}$ | $R_{B3}$ | $R_{A3}$ | H | H |
| $L_{A3153}$ | $R_{B3}$ | $R_{A34}$ | H | H |
| $L_{A3154}$ | $R_{B4}$ | $R_{B1}$ | H | H |
| $L_{A3155}$ | $R_{B4}$ | $R_{B3}$ | H | H |
| $L_{A3156}$ | $R_{B4}$ | $R_{B7}$ | H | H |
| $L_{A3157}$ | $R_{B4}$ | $R_{B10}$ | H | H |
| $L_{A3158}$ | $R_{B4}$ | $R_{A3}$ | H | H |
| $L_{A3159}$ | $R_{B4}$ | $R_{A34}$ | H | H |
| $L_{A3160}$ | $R_{B7}$ | $R_{B1}$ | H | H |
| $L_{A3161}$ | $R_{B7}$ | $R_{B3}$ | H | H |
| $L_{A3162}$ | $R_{B7}$ | $R_{B4}$ | H | H |
| $L_{A3163}$ | $R_{B7}$ | $R_{B10}$ | H | H |
| $L_{A3164}$ | $R_{B7}$ | $R_{A3}$ | H | H |
| $L_{A3165}$ | $R_{B7}$ | $R_{A34}$ | H | H |
| $L_{A3166}$ | $R_{B10}$ | $R_{B1}$ | H | H |
| $L_{A3167}$ | $R_{B10}$ | $R_{B3}$ | H | H |
| $L_{A3168}$ | $R_{B10}$ | $R_{B4}$ | H | H |
| $L_{A3169}$ | $R_{B10}$ | $R_{B7}$ | H | H |

-continued

| Ligand | $R^4$ | $R^5$ | $R^6$ | $R^8$ |
|---|---|---|---|---|
| $L_{A3170}$ | $R_{B10}$ | $R_{A3}$ | H | H |
| $L_{A3171}$ | $R_{B10}$ | $R_{A34}$ | H | H |
| $L_{A3172}$ | $R_{A3}$ | $R_{B1}$ | H | H |
| $L_{A3173}$ | $R_{A3}$ | $R_{B3}$ | H | H |
| $L_{A3174}$ | $R_{A3}$ | $R_{B4}$ | H | H |
| $L_{A3175}$ | $R_{A3}$ | $R_{B7}$ | H | H |
| $L_{A3176}$ | $R_{A3}$ | $R_{B10}$ | H | H |
| $L_{A3177}$ | $R_{A3}$ | $R_{A34}$ | H | H |
| $L_{A3178}$ | $R_{A34}$ | $R_{B1}$ | H | H |
| $L_{A3179}$ | $R_{A34}$ | $R_{B3}$ | H | H |
| $L_{A3180}$ | $R_{A34}$ | $R_{B4}$ | H | H |
| $L_{A3181}$ | $R_{A34}$ | $R_{B7}$ | H | H |
| $L_{A3182}$ | $R_{A34}$ | $R_{B10}$ | H | H |
| $L_{A3183}$ | $R_{A34}$ | $R_{A3}$ | H | H |
| $L_{A3184}$ | H | H | H | $R_{B1}$ |
| $L_{A3185}$ | $R_{B1}$ | H | H | $R_{B1}$ |
| $L_{A3186}$ | $R_{B3}$ | H | H | $R_{B1}$ |
| $L_{A3187}$ | $R_{B4}$ | H | H | $R_{B1}$ |
| $L_{A3188}$ | $R_{B7}$ | H | H | $R_{B1}$ |
| $L_{A3189}$ | $R_{B10}$ | H | H | $R_{B1}$ |
| $L_{A3190}$ | $R_{A3}$ | H | H | $R_{B1}$ |
| $L_{A3191}$ | $R_{A34}$ | H | H | $R_{B1}$ |
| $L_{A3192}$ | H | $R_{B1}$ | H | $R_{B1}$ |
| $L_{A3193}$ | H | $R_{B2}$ | H | $R_{B1}$ |
| $L_{A3194}$ | H | $R_{B3}$ | H | $R_{B1}$ |
| $L_{A3195}$ | H | $R_{B4}$ | H | $R_{B1}$ |
| $L_{A3196}$ | H | $R_{B7}$ | H | $R_{B1}$ |
| $L_{A3197}$ | H | $R_{B10}$ | H | $R_{B1}$ |
| $L_{A3198}$ | H | $R_{A3}$ | H | $R_{B1}$ |
| $L_{A3199}$ | H | $R_{A34}$ | H | $R_{B1}$ |
| $L_{A3200}$ | $R_{B1}$ | $R_{B1}$ | H | $R_{B1}$ |
| $L_{A3201}$ | $R_{B3}$ | $R_{B3}$ | H | $R_{B1}$ |
| $L_{A3202}$ | $R_{B4}$ | $R_{B4}$ | H | $R_{B1}$ |
| $L_{A3203}$ | $R_{B7}$ | $R_{B7}$ | H | $R_{B1}$ |
| $L_{A3204}$ | $R_{B10}$ | $R_{B10}$ | H | $R_{B1}$ |
| $L_{A3205}$ | $R_{A3}$ | $R_{A3}$ | H | $R_{B1}$ |
| $L_{A3206}$ | $R_{A34}$ | $R_{A34}$ | H | $R_{B1}$ |
| $L_{A3207}$ | $R_{B1}$ | $R_{B3}$ | H | $R_{B1}$ |
| $L_{A3208}$ | $R_{B1}$ | $R_{B4}$ | H | $R_{B1}$ |
| $L_{A3209}$ | $R_{B1}$ | $R_{B7}$ | H | $R_{B1}$ |
| $L_{A3210}$ | $R_{B1}$ | $R_{B10}$ | H | $R_{B1}$ |
| $L_{A3211}$ | $R_{B1}$ | $R_{A3}$ | H | $R_{B1}$ |
| $L_{A3212}$ | $R_{B1}$ | $R_{A34}$ | H | $R_{B1}$ |
| $L_{A3213}$ | $R_{B3}$ | $R_{B1}$ | H | $R_{B1}$ |
| $L_{A3214}$ | $R_{B3}$ | $R_{B4}$ | H | $R_{B1}$ |
| $L_{A3215}$ | $R_{B3}$ | $R_{B7}$ | H | $R_{B1}$ |
| $L_{A3216}$ | $R_{B3}$ | $R_{B10}$ | H | $R_{B1}$ |
| $L_{A3217}$ | $R_{B3}$ | $R_{A3}$ | H | $R_{B1}$ |
| $L_{A3218}$ | $R_{B3}$ | $R_{A34}$ | H | $R_{B1}$ |
| $L_{A3219}$ | $R_{B4}$ | $R_{B1}$ | H | $R_{B1}$ |
| $L_{A3220}$ | $R_{B4}$ | $R_{B3}$ | H | $R_{B1}$ |
| $L_{A3221}$ | $R_{B4}$ | $R_{B7}$ | H | $R_{B1}$ |
| $L_{A3222}$ | $R_{B4}$ | $R_{B10}$ | H | $R_{B1}$ |
| $L_{A3223}$ | $R_{B4}$ | $R_{A3}$ | H | $R_{B1}$ |
| $L_{A3224}$ | $R_{B4}$ | $R_{A34}$ | H | $R_{B1}$ |
| $L_{A3225}$ | $R_{B7}$ | $R_{B1}$ | H | $R_{B1}$ |
| $L_{A3226}$ | $R_{B7}$ | $R_{B3}$ | H | $R_{B1}$ |
| $L_{A3227}$ | $R_{B7}$ | $R_{B4}$ | H | $R_{B1}$ |
| $L_{A3228}$ | $R_{B7}$ | $R_{B10}$ | H | $R_{B1}$ |
| $L_{A3229}$ | $R_{B7}$ | $R_{A3}$ | H | $R_{B1}$ |
| $L_{A3230}$ | $R_{B7}$ | $R_{A34}$ | H | $R_{B1}$ |
| $L_{A3231}$ | $R_{B10}$ | $R_{B1}$ | H | $R_{B1}$ |
| $L_{A3232}$ | $R_{B10}$ | $R_{B3}$ | H | $R_{B1}$ |
| $L_{A3233}$ | $R_{B10}$ | $R_{B4}$ | H | $R_{B1}$ |
| $L_{A3234}$ | $R_{B10}$ | $R_{B7}$ | H | $R_{B1}$ |
| $L_{A3235}$ | $R_{B10}$ | $R_{A3}$ | H | $R_{B1}$ |
| $L_{A3236}$ | $R_{B10}$ | $R_{A34}$ | H | $R_{B1}$ |
| $L_{A3237}$ | $R_{A3}$ | $R_{B1}$ | H | $R_{B1}$ |
| $L_{A3238}$ | $R_{A3}$ | $R_{B3}$ | H | $R_{B1}$ |
| $L_{A3239}$ | $R_{A3}$ | $R_{B4}$ | H | $R_{B1}$ |
| $L_{A3240}$ | $R_{A3}$ | $R_{B7}$ | H | $R_{B1}$ |
| $L_{A3241}$ | $R_{A3}$ | $R_{B10}$ | H | $R_{B1}$ |
| $L_{A3242}$ | $R_{A3}$ | $R_{A34}$ | H | $R_{B1}$ |
| $L_{A3243}$ | $R_{A34}$ | $R_{B1}$ | H | $R_{B1}$ |
| $L_{A3244}$ | $R_{A34}$ | $R_{B3}$ | H | $R_{B1}$ |
| $L_{A3245}$ | $R_{A34}$ | $R_{B4}$ | H | $R_{B1}$ |
| $L_{A3246}$ | $R_{A34}$ | $R_{B7}$ | H | $R_{B1}$ |

-continued

| Ligand | $R^4$ | $R^5$ | $R^6$ | $R^8$ |
|---|---|---|---|---|
| $L_{A3247}$ | $R_{A34}$ | $R_{B10}$ | H | $R_{B1}$ |
| $L_{A3248}$ | $R_{A34}$ | $R_{A3}$ | H | $R_{B1}$ |
| $L_{A3249}$ | H | H | $R_{B1}$ | H |
| $L_{A3250}$ | $R_{B1}$ | H | $R_{B1}$ | H |
| $L_{A3251}$ | $R_{B3}$ | H | $R_{B1}$ | H |
| $L_{A3252}$ | $R_{B4}$ | H | $R_{B1}$ | H |
| $L_{A3253}$ | $R_{B7}$ | H | $R_{B1}$ | H |
| $L_{A3254}$ | $R_{B10}$ | H | $R_{B1}$ | H |
| $L_{A3255}$ | $R_{A3}$ | H | $R_{B1}$ | H |
| $L_{A3256}$ | $R_{A34}$ | H | $R_{B1}$ | H |
| $L_{A3257}$ | H | $R_{B1}$ | $R_{B1}$ | H |
| $L_{A3258}$ | H | $R_{B2}$ | $R_{B1}$ | H |
| $L_{A3259}$ | H | $R_{B3}$ | $R_{B1}$ | H |
| $L_{A3260}$ | H | $R_{B4}$ | $R_{B1}$ | H |
| $L_{A3261}$ | H | $R_{B7}$ | $R_{B1}$ | H |
| $L_{A3262}$ | H | $R_{B10}$ | $R_{B1}$ | H |
| $L_{A3263}$ | H | $R_{A3}$ | $R_{B1}$ | H |
| $L_{A3264}$ | H | $R_{A34}$ | $R_{B1}$ | H |
| $L_{A3265}$ | $R_{B1}$ | $R_{B1}$ | $R_{B1}$ | H |
| $L_{A3266}$ | $R_{B3}$ | $R_{B3}$ | $R_{B1}$ | H |
| $L_{A3267}$ | $R_{B4}$ | $R_{B4}$ | $R_{B1}$ | H |
| $L_{A3268}$ | $R_{B7}$ | $R_{B7}$ | $R_{B1}$ | H |
| $L_{A3269}$ | $R_{B10}$ | $R_{B10}$ | $R_{B1}$ | H |
| $L_{A3270}$ | $R_{A3}$ | $R_{A3}$ | $R_{B1}$ | H |
| $L_{A3271}$ | $R_{A34}$ | $R_{A34}$ | $R_{B1}$ | H |
| $L_{A3272}$ | $R_{B1}$ | $R_{B3}$ | $R_{B1}$ | H |
| $L_{A3273}$ | $R_{B1}$ | $R_{B4}$ | $R_{B1}$ | H |
| $L_{A3274}$ | $R_{B1}$ | $R_{B7}$ | $R_{B1}$ | H |
| $L_{A3275}$ | $R_{B1}$ | $R_{B10}$ | $R_{B1}$ | H |
| $L_{A3276}$ | $R_{B1}$ | $R_{A3}$ | $R_{B1}$ | H |
| $L_{A3277}$ | $R_{B1}$ | $R_{A34}$ | $R_{B1}$ | H |
| $L_{A3278}$ | $R_{B3}$ | $R_{B1}$ | $R_{B1}$ | H |
| $L_{A3279}$ | $R_{B3}$ | $R_{B4}$ | $R_{B1}$ | H |
| $L_{A3280}$ | $R_{B3}$ | $R_{B7}$ | $R_{B1}$ | H |
| $L_{A3281}$ | $R_{B3}$ | $R_{B10}$ | $R_{B1}$ | H |
| $L_{A3282}$ | $R_{B3}$ | $R_{A3}$ | $R_{B1}$ | H |
| $L_{A3283}$ | $R_{B3}$ | $R_{A34}$ | $R_{B1}$ | H |
| $L_{A3284}$ | $R_{B4}$ | $R_{B1}$ | $R_{B1}$ | H |
| $L_{A3285}$ | $R_{B4}$ | $R_{B3}$ | $R_{B1}$ | H |
| $L_{A3286}$ | $R_{B4}$ | $R_{B7}$ | $R_{B1}$ | H |
| $L_{A3287}$ | $R_{B4}$ | $R_{B10}$ | $R_{B1}$ | H |
| $L_{A3288}$ | $R_{B4}$ | $R_{A3}$ | $R_{B1}$ | H |
| $L_{A3289}$ | $R_{B4}$ | $R_{A34}$ | $R_{B1}$ | H |
| $L_{A3290}$ | $R_{B7}$ | $R_{B1}$ | $R_{B1}$ | H |
| $L_{A3291}$ | $R_{B7}$ | $R_{B3}$ | $R_{B1}$ | H |
| $L_{A3292}$ | $R_{B7}$ | $R_{B4}$ | $R_{B1}$ | H |
| $L_{A3293}$ | $R_{B7}$ | $R_{B10}$ | $R_{B1}$ | H |
| $L_{A3294}$ | $R_{B7}$ | $R_{A3}$ | $R_{B1}$ | H |
| $L_{A3295}$ | $R_{B7}$ | $R_{A34}$ | $R_{B1}$ | H |
| $L_{A3296}$ | $R_{B10}$ | $R_{B1}$ | $R_{B1}$ | H |
| $L_{A3297}$ | $R_{B10}$ | $R_{B3}$ | $R_{B1}$ | H |
| $L_{A3298}$ | $R_{B10}$ | $R_{B4}$ | $R_{B1}$ | H |
| $L_{A3299}$ | $R_{B10}$ | $R_{B7}$ | $R_{B1}$ | H |
| $L_{A3300}$ | $R_{B10}$ | $R_{A3}$ | $R_{B1}$ | H |
| $L_{A3301}$ | $R_{B10}$ | $R_{A34}$ | $R_{B1}$ | H |
| $L_{A3302}$ | $R_{A3}$ | $R_{B1}$ | $R_{B1}$ | H |
| $L_{A3303}$ | $R_{A3}$ | $R_{B3}$ | $R_{B1}$ | H |
| $L_{A3204}$ | $R_{A3}$ | $R_{B4}$ | $R_{B1}$ | H |
| $L_{A3305}$ | $R_{A3}$ | $R_{B7}$ | $R_{B1}$ | H |
| $L_{A3306}$ | $R_{A3}$ | $R_{B10}$ | $R_{B1}$ | H |
| $L_{A3307}$ | $R_{A3}$ | $R_{A34}$ | $R_{B1}$ | H |
| $L_{A3308}$ | $R_{A34}$ | $R_{B1}$ | $R_{B1}$ | H |
| $L_{A3309}$ | $R_{A34}$ | $R_{B3}$ | $R_{B1}$ | H |
| $L_{A3310}$ | $R_{A34}$ | $R_{B4}$ | $R_{B1}$ | H |
| $L_{A3311}$ | $R_{A34}$ | $R_{B7}$ | $R_{B1}$ | H |
| $L_{A3312}$ | $R_{A34}$ | $R_{B10}$ | $R_{B1}$ | H |
| $L_{A3313}$ | $R_{A34}$ | $R_{A3}$ | $R_{B1}$ | H |
| $L_{A3314}$ | H | H | $R_{B1}$ | $R_{B7}$ |
| $L_{A3315}$ | $R_{B1}$ | H | $R_{B1}$ | $R_{B7}$ |
| $L_{A3316}$ | $R_{B3}$ | H | $R_{B1}$ | $R_{B7}$ |
| $L_{A3317}$ | $R_{B4}$ | H | $R_{B1}$ | $R_{B7}$ |
| $L_{A3318}$ | $R_{B7}$ | H | $R_{B1}$ | $R_{B7}$ |
| $L_{A3319}$ | $R_{B10}$ | H | $R_{B1}$ | $R_{B7}$ |
| $L_{A3320}$ | $R_{A3}$ | H | $R_{B1}$ | $R_{B7}$ |
| $L_{A3321}$ | $R_{A34}$ | H | $R_{B1}$ | $R_{B7}$ |
| $L_{A3322}$ | H | $R_{B1}$ | $R_{B1}$ | $R_{B7}$ |
| $L_{A3323}$ | H | $R_{B2}$ | $R_{B1}$ | $R_{B7}$ |

-continued

| Ligand | $R^4$ | $R^5$ | $R^6$ | $R^8$ |
|---|---|---|---|---|
| $L_{A3324}$ | H | $R_{B3}$ | $R_{B1}$ | $R_{B7}$ |
| $L_{A3325}$ | H | $R_{B4}$ | $R_{B1}$ | $R_{B7}$ |
| $L_{A3326}$ | H | $R_{B7}$ | $R_{B1}$ | $R_{B7}$ |
| $L_{A3327}$ | H | $R_{B10}$ | $R_{B1}$ | $R_{B7}$ |
| $L_{A3328}$ | H | $R_{A3}$ | $R_{B1}$ | $R_{B7}$ |
| $L_{A3329}$ | H | $R_{A34}$ | $R_{B1}$ | $R_{B7}$ |
| $L_{A3330}$ | $R_{B1}$ | $R_{B1}$ | $R_{B1}$ | $R_{B7}$ |
| $L_{A3331}$ | $R_{B3}$ | $R_{B3}$ | $R_{B1}$ | $R_{B7}$ |
| $L_{A3332}$ | $R_{B4}$ | $R_{B4}$ | $R_{B1}$ | $R_{B7}$ |
| $L_{A3333}$ | $R_{B7}$ | $R_{B7}$ | $R_{B1}$ | $R_{B7}$ |
| $L_{A3334}$ | $R_{B10}$ | $R_{B10}$ | $R_{B1}$ | $R_{B7}$ |
| $L_{A3335}$ | $R_{A3}$ | $R_{A3}$ | $R_{B1}$ | $R_{B7}$ |
| $L_{A3336}$ | $R_{A34}$ | $R_{A34}$ | $R_{B1}$ | $R_{B7}$ |
| $L_{A3337}$ | $R_{B1}$ | $R_{B3}$ | $R_{B1}$ | $R_{B7}$ |
| $L_{A3338}$ | $R_{B1}$ | $R_{B4}$ | $R_{B1}$ | $R_{B7}$ |
| $L_{A3339}$ | $R_{B1}$ | $R_{B7}$ | $R_{B1}$ | $R_{B7}$ |
| $L_{A3340}$ | $R_{B1}$ | $R_{B10}$ | $R_{B1}$ | $R_{B7}$ |
| $L_{A3341}$ | $R_{B1}$ | $R_{A3}$ | $R_{B1}$ | $R_{B7}$ |
| $L_{A3342}$ | $R_{B1}$ | $R_{A34}$ | $R_{B1}$ | $R_{B7}$ |
| $L_{A3343}$ | $R_{B3}$ | $R_{B1}$ | $R_{B1}$ | $R_{B7}$ |
| $L_{A3344}$ | $R_{B3}$ | $R_{B4}$ | $R_{B1}$ | $R_{B7}$ |
| $L_{A3345}$ | $R_{B3}$ | $R_{B7}$ | $R_{B1}$ | $R_{B7}$ |
| $L_{A3346}$ | $R_{B3}$ | $R_{B10}$ | $R_{B1}$ | $R_{B7}$ |
| $L_{A3347}$ | $R_{B3}$ | $R_{A3}$ | $R_{B1}$ | $R_{B7}$ |
| $L_{A3348}$ | $R_{B3}$ | $R_{A34}$ | $R_{B1}$ | $R_{B7}$ |
| $L_{A3349}$ | $R_{B4}$ | $R_{B1}$ | $R_{B1}$ | $R_{B7}$ |
| $L_{A3350}$ | $R_{B4}$ | $R_{B3}$ | $R_{B1}$ | $R_{B7}$ |
| $L_{A3351}$ | $R_{B4}$ | $R_{B7}$ | $R_{B1}$ | $R_{B7}$ |
| $L_{A3352}$ | $R_{B4}$ | $R_{B10}$ | $R_{B1}$ | $R_{B7}$ |
| $L_{A3353}$ | $R_{B4}$ | $R_{A3}$ | $R_{B1}$ | $R_{B7}$ |
| $L_{A3354}$ | $R_{B4}$ | $R_{A34}$ | $R_{B1}$ | $R_{B7}$ |
| $L_{A3355}$ | $R_{B7}$ | $R_{B1}$ | $R_{B1}$ | $R_{B7}$ |
| $L_{A3356}$ | $R_{B7}$ | $R_{B3}$ | $R_{B1}$ | $R_{B7}$ |
| $L_{A3357}$ | $R_{B7}$ | $R_{B4}$ | $R_{B1}$ | $R_{B7}$ |
| $L_{A3358}$ | $R_{B7}$ | $R_{B10}$ | $R_{B1}$ | $R_{B7}$ |
| $L_{A3359}$ | $R_{B7}$ | $R_{A3}$ | $R_{B1}$ | $R_{B7}$ |
| $L_{A3360}$ | $R_{B7}$ | $R_{A34}$ | $R_{B1}$ | $R_{B7}$ |
| $L_{A3361}$ | $R_{B10}$ | $R_{B1}$ | $R_{B1}$ | $R_{B7}$ |
| $L_{A3362}$ | $R_{B10}$ | $R_{B3}$ | $R_{B1}$ | $R_{B7}$ |
| $L_{A3363}$ | $R_{B10}$ | $R_{B4}$ | $R_{B1}$ | $R_{B7}$ |
| $L_{A3364}$ | $R_{B10}$ | $R_{B7}$ | $R_{B1}$ | $R_{B7}$ |
| $L_{A3365}$ | $R_{B10}$ | $R_{A3}$ | $R_{B1}$ | $R_{B7}$ |
| $L_{A3366}$ | $R_{B10}$ | $R_{A34}$ | $R_{B1}$ | $R_{B7}$ |
| $L_{A3367}$ | $R_{A3}$ | $R_{B1}$ | $R_{B1}$ | $R_{B7}$ |
| $L_{A3368}$ | $R_{A3}$ | $R_{B3}$ | $R_{B1}$ | $R_{B7}$ |
| $L_{A3369}$ | $R_{A3}$ | $R_{B4}$ | $R_{B1}$ | $R_{B7}$ |
| $L_{A3370}$ | $R_{A3}$ | $R_{B7}$ | $R_{B1}$ | $R_{B7}$ |
| $L_{A3371}$ | $R_{A3}$ | $R_{B10}$ | $R_{B1}$ | $R_{B7}$ |
| $L_{A3372}$ | $R_{A3}$ | $R_{A34}$ | $R_{B1}$ | $R_{B7}$ |
| $L_{A3373}$ | $R_{A34}$ | $R_{B1}$ | $R_{B1}$ | $R_{B7}$ |
| $L_{A3374}$ | $R_{A34}$ | $R_{B3}$ | $R_{B1}$ | $R_{B7}$ |
| $L_{A3375}$ | $R_{A34}$ | $R_{B4}$ | $R_{B1}$ | $R_{B7}$ |
| $L_{A3376}$ | $R_{A34}$ | $R_{B7}$ | $R_{B1}$ | $R_{B7}$ |
| $L_{A3377}$ | $R_{A34}$ | $R_{B10}$ | $R_{B1}$ | $R_{B7}$ |
| $L_{A3378}$ | $R_{A34}$ | $R_{A3}$ | $R_{B1}$ | $R_{B7}$ |

$L_{A3379}$ through $L_{A3638}$ that are based on a structure of Formula XV,

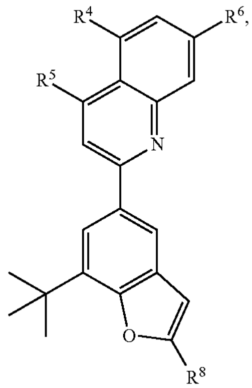

in which $R^4$, $R^5$, $R^6$, and $R^8$ are defined as provided below:

| Ligand | $R^4$ | $R^5$ | $R^6$ | $R^8$ |
|---|---|---|---|---|
| $L_{A3379}$ | H | H | H | H |
| $L_{A3380}$ | $R_{B1}$ | H | H | H |
| $L_{A3381}$ | $R_{B3}$ | H | H | H |
| $L_{A3382}$ | $R_{B4}$ | H | H | H |
| $L_{A3383}$ | $R_{B7}$ | H | H | H |
| $L_{A3384}$ | $R_{B10}$ | H | H | H |
| $L_{A3385}$ | $R_{A3}$ | H | H | H |
| $L_{A3386}$ | $R_{A34}$ | H | H | H |
| $L_{A3387}$ | H | $R_{B1}$ | H | H |
| $L_{A3388}$ | H | $R_{B2}$ | H | H |
| $L_{A3389}$ | H | $R_{B3}$ | H | H |
| $L_{A3390}$ | H | $R_{B4}$ | H | H |
| $L_{A3391}$ | H | $R_{B7}$ | H | H |
| $L_{A3392}$ | H | $R_{B10}$ | H | H |
| $L_{A3393}$ | H | $R_{A3}$ | H | H |
| $L_{A3394}$ | H | $R_{A34}$ | H | H |
| $L_{A3395}$ | $R_{B1}$ | $R_{B1}$ | H | H |
| $L_{A3396}$ | $R_{B3}$ | $R_{B3}$ | H | H |
| $L_{A3397}$ | $R_{B4}$ | $R_{B4}$ | H | H |
| $L_{A3398}$ | $R_{B7}$ | $R_{B7}$ | H | H |
| $L_{A3399}$ | $R_{B10}$ | $R_{B10}$ | H | H |
| $L_{A3400}$ | $R_{A3}$ | $R_{A3}$ | H | H |
| $L_{A3401}$ | $R_{A34}$ | $R_{A34}$ | H | H |
| $L_{A3402}$ | $R_{B1}$ | $R_{B3}$ | H | H |
| $L_{A3403}$ | $R_{B1}$ | $R_{B4}$ | H | H |
| $L_{A3404}$ | $R_{B1}$ | $R_{B7}$ | H | H |
| $L_{A3405}$ | $R_{B1}$ | $R_{B10}$ | H | H |
| $L_{A3406}$ | $R_{B1}$ | $R_{A3}$ | H | H |
| $L_{A3407}$ | $R_{B1}$ | $R_{A34}$ | H | H |
| $L_{A3408}$ | $R_{B3}$ | $R_{B1}$ | H | H |
| $L_{A3409}$ | $R_{B3}$ | $R_{B4}$ | H | H |
| $L_{A3410}$ | $R_{B3}$ | $R_{B7}$ | H | H |
| $L_{A3411}$ | $R_{B3}$ | $R_{B10}$ | H | H |
| $L_{A3412}$ | $R_{B3}$ | $R_{A3}$ | H | H |
| $L_{A3413}$ | $R_{B3}$ | $R_{A34}$ | H | H |
| $L_{A3414}$ | $R_{B4}$ | $R_{B1}$ | H | H |
| $L_{A3415}$ | $R_{B4}$ | $R_{B3}$ | H | H |
| $L_{A3416}$ | $R_{B4}$ | $R_{B7}$ | H | H |
| $L_{A3417}$ | $R_{B4}$ | $R_{B10}$ | H | H |
| $L_{A3418}$ | $R_{B4}$ | $R_{A3}$ | H | H |
| $L_{A3419}$ | $R_{B4}$ | $R_{A34}$ | H | H |
| $L_{A3420}$ | $R_{B7}$ | $R_{B1}$ | H | H |
| $L_{A3421}$ | $R_{B7}$ | $R_{B3}$ | H | H |
| $L_{A3422}$ | $R_{B7}$ | $R_{B4}$ | H | H |
| $L_{A3423}$ | $R_{B7}$ | $R_{B10}$ | H | H |
| $L_{A3424}$ | $R_{B7}$ | $R_{A3}$ | H | H |
| $L_{A3425}$ | $R_{B7}$ | $R_{A34}$ | H | H |
| $L_{A3426}$ | $R_{B10}$ | $R_{B1}$ | H | H |
| $L_{A3427}$ | $R_{B10}$ | $R_{B3}$ | H | H |
| $L_{A3428}$ | $R_{B10}$ | $R_{B4}$ | H | H |
| $L_{A3429}$ | $R_{B10}$ | $R_{B7}$ | H | H |
| $L_{A3430}$ | $R_{B10}$ | $R_{A3}$ | H | H |

-continued

| Ligand | $R^4$ | $R^5$ | $R^6$ | $R^8$ |
|---|---|---|---|---|
| $L_{A3431}$ | $R_{B10}$ | $R_{A34}$ | H | H |
| $L_{A3432}$ | $R_{A3}$ | $R_{B1}$ | H | H |
| $L_{A3433}$ | $R_{A3}$ | $R_{B3}$ | H | H |
| $L_{A3434}$ | $R_{A3}$ | $R_{B4}$ | H | H |
| $L_{A3435}$ | $R_{A3}$ | $R_{B7}$ | H | H |
| $L_{A3436}$ | $R_{A3}$ | $R_{B10}$ | H | H |
| $L_{A3437}$ | $R_{A3}$ | $R_{A34}$ | H | H |
| $L_{A3438}$ | $R_{A34}$ | $R_{B1}$ | H | H |
| $L_{A3439}$ | $R_{A34}$ | $R_{B3}$ | H | H |
| $L_{A3440}$ | $R_{A34}$ | $R_{B4}$ | H | H |
| $L_{A3441}$ | $R_{A34}$ | $R_{B7}$ | H | H |
| $L_{A3442}$ | $R_{A34}$ | $R_{B10}$ | H | H |
| $L_{A3443}$ | $R_{A34}$ | $R_{A3}$ | H | H |
| $L_{A3444}$ | H | H | H | $R_{B1}$ |
| $L_{A3445}$ | $R_{B1}$ | H | H | $R_{B1}$ |
| $L_{A3446}$ | $R_{B3}$ | H | H | $R_{B1}$ |
| $L_{A3447}$ | $R_{B4}$ | H | H | $R_{B1}$ |
| $L_{A3448}$ | $R_{B7}$ | H | H | $R_{B1}$ |
| $L_{A3449}$ | $R_{B10}$ | H | H | $R_{B1}$ |
| $L_{A3450}$ | $R_{A3}$ | H | H | $R_{B1}$ |
| $L_{A3451}$ | $R_{A34}$ | H | H | $R_{B1}$ |
| $L_{A3452}$ | H | $R_{B1}$ | H | $R_{B1}$ |
| $L_{A3453}$ | H | $R_{B2}$ | H | $R_{B1}$ |
| $L_{A3454}$ | H | $R_{B3}$ | H | $R_{B1}$ |
| $L_{A3455}$ | H | $R_{B4}$ | H | $R_{B1}$ |
| $L_{A3456}$ | H | $R_{B7}$ | H | $R_{B1}$ |
| $L_{A3457}$ | H | $R_{B10}$ | H | $R_{B1}$ |
| $L_{A3458}$ | H | $R_{A3}$ | H | $R_{B1}$ |
| $L_{A3459}$ | H | $R_{A34}$ | H | $R_{B1}$ |
| $L_{A3460}$ | $R_{B1}$ | $R_{B1}$ | H | $R_{B1}$ |
| $L_{A3461}$ | $R_{B3}$ | $R_{B3}$ | H | $R_{B1}$ |
| $L_{A3462}$ | $R_{B4}$ | $R_{B4}$ | H | $R_{B1}$ |
| $L_{A3463}$ | $R_{B7}$ | $R_{B7}$ | H | $R_{B1}$ |
| $L_{A3464}$ | $R_{B10}$ | $R_{B10}$ | H | $R_{B1}$ |
| $L_{A3465}$ | $R_{A3}$ | $R_{A3}$ | H | $R_{B1}$ |
| $L_{A3466}$ | $R_{A34}$ | $R_{A34}$ | H | $R_{B1}$ |
| $L_{A3467}$ | $R_{B1}$ | $R_{B3}$ | H | $R_{B1}$ |
| $L_{A3468}$ | $R_{B1}$ | $R_{B4}$ | H | $R_{B1}$ |
| $L_{A3469}$ | $R_{B1}$ | $R_{B7}$ | H | $R_{B1}$ |
| $L_{A3470}$ | $R_{B1}$ | $R_{B10}$ | H | $R_{B1}$ |
| $L_{A3471}$ | $R_{B1}$ | $R_{A3}$ | H | $R_{B1}$ |
| $L_{A3472}$ | $R_{B1}$ | $R_{A34}$ | H | $R_{B1}$ |
| $L_{A3473}$ | $R_{B3}$ | $R_{B1}$ | H | $R_{B1}$ |
| $L_{A3474}$ | $R_{B3}$ | $R_{B4}$ | H | $R_{B1}$ |
| $L_{A3475}$ | $R_{B3}$ | $R_{B7}$ | H | $R_{B1}$ |
| $L_{A3476}$ | $R_{B3}$ | $R_{B10}$ | H | $R_{B1}$ |
| $L_{A3477}$ | $R_{B3}$ | $R_{A3}$ | H | $R_{B1}$ |
| $L_{A3478}$ | $R_{B3}$ | $R_{A34}$ | H | $R_{B1}$ |
| $L_{A3479}$ | $R_{B4}$ | $R_{B1}$ | H | $R_{B1}$ |
| $L_{A3480}$ | $R_{B4}$ | $R_{B3}$ | H | $R_{B1}$ |
| $L_{A3481}$ | $R_{B4}$ | $R_{B7}$ | H | $R_{B1}$ |
| $L_{A3482}$ | $R_{B4}$ | $R_{B10}$ | H | $R_{B1}$ |
| $L_{A3483}$ | $R_{B4}$ | $R_{A3}$ | H | $R_{B1}$ |
| $L_{A3484}$ | $R_{B4}$ | $R_{A34}$ | H | $R_{B1}$ |
| $L_{A3485}$ | $R_{B7}$ | $R_{B1}$ | H | $R_{B1}$ |
| $L_{A3486}$ | $R_{B7}$ | $R_{B3}$ | H | $R_{B1}$ |
| $L_{A3487}$ | $R_{B7}$ | $R_{B4}$ | H | $R_{B1}$ |
| $L_{A3488}$ | $R_{B7}$ | $R_{B10}$ | H | $R_{B1}$ |
| $L_{A3489}$ | $R_{B7}$ | $R_{A3}$ | H | $R_{B1}$ |
| $L_{A3490}$ | $R_{B7}$ | $R_{A34}$ | H | $R_{B1}$ |
| $L_{A3491}$ | $R_{B10}$ | $R_{B1}$ | H | $R_{B1}$ |
| $L_{A3492}$ | $R_{B10}$ | $R_{B3}$ | H | $R_{B1}$ |
| $L_{A3493}$ | $R_{B10}$ | $R_{B4}$ | H | $R_{B1}$ |
| $L_{A3494}$ | $R_{B10}$ | $R_{B7}$ | H | $R_{B1}$ |
| $L_{A3495}$ | $R_{B10}$ | $R_{A3}$ | H | $R_{B1}$ |
| $L_{A3496}$ | $R_{B10}$ | $R_{A34}$ | H | $R_{B1}$ |
| $L_{A3497}$ | $R_{A3}$ | $R_{B1}$ | H | $R_{B1}$ |
| $L_{A3498}$ | $R_{A3}$ | $R_{B3}$ | H | $R_{B1}$ |
| $L_{A3499}$ | $R_{A3}$ | $R_{B4}$ | H | $R_{B1}$ |
| $L_{A3500}$ | $R_{A3}$ | $R_{B7}$ | H | $R_{B1}$ |
| $L_{A3501}$ | $R_{A3}$ | $R_{B10}$ | H | $R_{B1}$ |
| $L_{A3502}$ | $R_{A3}$ | $R_{A34}$ | H | $R_{B1}$ |
| $L_{A3503}$ | $R_{A34}$ | $R_{B1}$ | H | $R_{B1}$ |
| $L_{A3504}$ | $R_{A34}$ | $R_{B3}$ | H | $R_{B1}$ |
| $L_{A3505}$ | $R_{A34}$ | $R_{B4}$ | H | $R_{B1}$ |
| $L_{A3506}$ | $R_{A34}$ | $R_{B7}$ | H | $R_{B1}$ |
| $L_{A3507}$ | $R_{A34}$ | $R_{B10}$ | H | $R_{B1}$ |

-continued

| Ligand | $R^4$ | $R^5$ | $R^6$ | $R^8$ |
|---|---|---|---|---|
| $L_{A3508}$ | $R_{A34}$ | $R_{A3}$ | H | $R_{B1}$ |
| $L_{A3509}$ | H | H | $R_{B1}$ | H |
| $L_{A3510}$ | $R_{B1}$ | H | $R_{B1}$ | H |
| $L_{A3511}$ | $R_{B3}$ | H | $R_{B1}$ | H |
| $L_{A3512}$ | $R_{B4}$ | H | $R_{B1}$ | H |
| $L_{A3513}$ | $R_{B7}$ | H | $R_{B1}$ | H |
| $L_{A3514}$ | $R_{B10}$ | H | $R_{B1}$ | H |
| $L_{A3515}$ | $R_{A3}$ | H | $R_{B1}$ | H |
| $L_{A3516}$ | $R_{A34}$ | H | $R_{B1}$ | H |
| $L_{A3517}$ | H | $R_{B1}$ | $R_{B1}$ | H |
| $L_{A3518}$ | H | $R_{B2}$ | $R_{B1}$ | H |
| $L_{A3519}$ | H | $R_{B3}$ | $R_{B1}$ | H |
| $L_{A3520}$ | H | $R_{B4}$ | $R_{B1}$ | H |
| $L_{A3521}$ | H | $R_{B7}$ | $R_{B1}$ | H |
| $L_{A3522}$ | H | $R_{B10}$ | $R_{B1}$ | H |
| $L_{A3523}$ | H | $R_{A3}$ | $R_{B1}$ | H |
| $L_{A3524}$ | H | $R_{A34}$ | $R_{B1}$ | H |
| $L_{A3525}$ | $R_{B1}$ | $R_{B1}$ | $R_{B1}$ | H |
| $L_{A3526}$ | $R_{B3}$ | $R_{B3}$ | $R_{B1}$ | H |
| $L_{A3527}$ | $R_{B4}$ | $R_{B4}$ | $R_{B1}$ | H |
| $L_{A3528}$ | $R_{B7}$ | $R_{B7}$ | $R_{B1}$ | H |
| $L_{A3529}$ | $R_{B10}$ | $R_{B10}$ | $R_{B1}$ | H |
| $L_{A3530}$ | $R_{A3}$ | $R_{A3}$ | $R_{B1}$ | H |
| $L_{A3531}$ | $R_{A34}$ | $R_{A34}$ | $R_{B1}$ | H |
| $L_{A3532}$ | $R_{B1}$ | $R_{B3}$ | $R_{B1}$ | H |
| $L_{A3533}$ | $R_{B1}$ | $R_{B4}$ | $R_{B1}$ | H |
| $L_{A3534}$ | $R_{B1}$ | $R_{B7}$ | $R_{B1}$ | H |
| $L_{A3535}$ | $R_{B1}$ | $R_{B10}$ | $R_{B1}$ | H |
| $L_{A3536}$ | $R_{B1}$ | $R_{A3}$ | $R_{B1}$ | H |
| $L_{A3537}$ | $R_{B1}$ | $R_{A34}$ | $R_{B1}$ | H |
| $L_{A3538}$ | $R_{B3}$ | $R_{B1}$ | $R_{B1}$ | H |
| $L_{A3539}$ | $R_{B3}$ | $R_{B4}$ | $R_{B1}$ | H |
| $L_{A3540}$ | $R_{B3}$ | $R_{B7}$ | $R_{B1}$ | H |
| $L_{A3541}$ | $R_{B3}$ | $R_{B10}$ | $R_{B1}$ | H |
| $L_{A3542}$ | $R_{B3}$ | $R_{A3}$ | $R_{B1}$ | H |
| $L_{A3543}$ | $R_{B3}$ | $R_{A34}$ | $R_{B1}$ | H |
| $L_{A3544}$ | $R_{B4}$ | $R_{B1}$ | $R_{B1}$ | H |
| $L_{A3545}$ | $R_{B4}$ | $R_{B3}$ | $R_{B1}$ | H |
| $L_{A3546}$ | $R_{B4}$ | $R_{B7}$ | $R_{B1}$ | H |
| $L_{A3547}$ | $R_{B4}$ | $R_{B10}$ | $R_{B1}$ | H |
| $L_{A3548}$ | $R_{B4}$ | $R_{A3}$ | $R_{B1}$ | H |
| $L_{A3549}$ | $R_{B4}$ | $R_{A34}$ | $R_{B1}$ | H |
| $L_{A3550}$ | $R_{B7}$ | $R_{B1}$ | $R_{B1}$ | H |
| $L_{A3551}$ | $R_{B7}$ | $R_{B3}$ | $R_{B1}$ | H |
| $L_{A3552}$ | $R_{B7}$ | $R_{B4}$ | $R_{B1}$ | H |
| $L_{A3553}$ | $R_{B7}$ | $R_{B10}$ | $R_{B1}$ | H |
| $L_{A3554}$ | $R_{B7}$ | $R_{A3}$ | $R_{B1}$ | H |
| $L_{A3555}$ | $R_{B7}$ | $R_{A34}$ | $R_{B1}$ | H |
| $L_{A3556}$ | $R_{B10}$ | $R_{B1}$ | $R_{B1}$ | H |
| $L_{A3557}$ | $R_{B10}$ | $R_{B3}$ | $R_{B1}$ | H |
| $L_{A3558}$ | $R_{B10}$ | $R_{B4}$ | $R_{B1}$ | H |
| $L_{A3559}$ | $R_{B10}$ | $R_{B7}$ | $R_{B1}$ | H |
| $L_{A3560}$ | $R_{B10}$ | $R_{A3}$ | $R_{B1}$ | H |
| $L_{A3561}$ | $R_{B10}$ | $R_{A34}$ | $R_{B1}$ | H |
| $L_{A3562}$ | $R_{A3}$ | $R_{B1}$ | $R_{B1}$ | H |
| $L_{A3563}$ | $R_{A3}$ | $R_{B3}$ | $R_{B1}$ | H |
| $L_{A3564}$ | $R_{A3}$ | $R_{B4}$ | $R_{B1}$ | H |
| $L_{A3565}$ | $R_{A3}$ | $R_{B7}$ | $R_{B1}$ | H |
| $L_{A3566}$ | $R_{A3}$ | $R_{B10}$ | $R_{B1}$ | H |
| $L_{A3567}$ | $R_{A3}$ | $R_{A34}$ | $R_{B1}$ | H |
| $L_{A3568}$ | $R_{A34}$ | $R_{B1}$ | $R_{B1}$ | H |
| $L_{A3569}$ | $R_{A34}$ | $R_{B3}$ | $R_{B1}$ | H |
| $L_{A3570}$ | $R_{A34}$ | $R_{B4}$ | $R_{B1}$ | H |
| $L_{A3571}$ | $R_{A34}$ | $R_{B7}$ | $R_{B1}$ | H |
| $L_{A3572}$ | $R_{A34}$ | $R_{B10}$ | $R_{B1}$ | H |
| $L_{A3573}$ | $R_{A34}$ | $R_{A3}$ | $R_{B1}$ | H |
| $L_{A3574}$ | H | H | $R_{B1}$ | $R_{B1}$ |
| $L_{A3575}$ | $R_{B1}$ | H | $R_{B1}$ | $R_{B1}$ |
| $L_{A3576}$ | $R_{B3}$ | H | $R_{B1}$ | $R_{B1}$ |
| $L_{A3577}$ | $R_{B4}$ | H | $R_{B1}$ | $R_{B1}$ |
| $L_{A3578}$ | $R_{B7}$ | H | $R_{B1}$ | $R_{B1}$ |
| $L_{A3579}$ | $R_{B10}$ | H | $R_{B1}$ | $R_{B1}$ |
| $L_{A3580}$ | $R_{A3}$ | H | $R_{B1}$ | $R_{B1}$ |
| $L_{A3581}$ | $R_{A34}$ | H | $R_{B1}$ | $R_{B1}$ |
| $L_{A3582}$ | H | $R_{B1}$ | $R_{B1}$ | $R_{B1}$ |
| $L_{A3583}$ | H | $R_{B2}$ | $R_{B1}$ | $R_{B1}$ |
| $L_{A3584}$ | H | $R_{B3}$ | $R_{B1}$ | $R_{B1}$ |

-continued

| Ligand | $R^4$ | $R^5$ | $R^6$ | $R^8$ |
|---|---|---|---|---|
| $L_{A3585}$ | H | $R_{B4}$ | $R_{B1}$ | $R_{B1}$ |
| $L_{A3586}$ | H | $R_{B7}$ | $R_{B1}$ | $R_{B1}$ |
| $L_{A3587}$ | H | $R_{B10}$ | $R_{B1}$ | $R_{B1}$ |
| $L_{A3588}$ | H | $R_{A3}$ | $R_{B1}$ | $R_{B1}$ |
| $L_{A3589}$ | H | $R_{A34}$ | $R_{B1}$ | $R_{B1}$ |
| $L_{A3590}$ | $R_{B1}$ | $R_{B1}$ | $R_{B1}$ | $R_{B1}$ |
| $L_{A3591}$ | $R_{B3}$ | $R_{B3}$ | $R_{B1}$ | $R_{B1}$ |
| $L_{A3592}$ | $R_{B4}$ | $R_{B4}$ | $R_{B1}$ | $R_{B1}$ |
| $L_{A3593}$ | $R_{B7}$ | $R_{B7}$ | $R_{B1}$ | $R_{B1}$ |
| $L_{A3594}$ | $R_{B10}$ | $R_{B10}$ | $R_{B1}$ | $R_{B1}$ |
| $L_{A3595}$ | $R_{A3}$ | $R_{A3}$ | $R_{B1}$ | $R_{B1}$ |
| $L_{A3596}$ | $R_{A34}$ | $R_{A34}$ | $R_{B1}$ | $R_{B1}$ |
| $L_{A3597}$ | $R_{B1}$ | $R_{B3}$ | $R_{B1}$ | $R_{B1}$ |
| $L_{A3598}$ | $R_{B1}$ | $R_{B4}$ | $R_{B1}$ | $R_{B1}$ |
| $L_{A3599}$ | $R_{B1}$ | $R_{B7}$ | $R_{B1}$ | $R_{B1}$ |
| $L_{A3600}$ | $R_{B1}$ | $R_{B10}$ | $R_{B1}$ | $R_{B1}$ |
| $L_{A3601}$ | $R_{B1}$ | $R_{A3}$ | $R_{B1}$ | $R_{B1}$ |
| $L_{A3602}$ | $R_{B1}$ | $R_{A34}$ | $R_{B1}$ | $R_{B1}$ |
| $L_{A3603}$ | $R_{B3}$ | $R_{B1}$ | $R_{B1}$ | $R_{B1}$ |
| $L_{A3604}$ | $R_{B3}$ | $R_{B4}$ | $R_{B1}$ | $R_{B1}$ |
| $L_{A3605}$ | $R_{B3}$ | $R_{B7}$ | $R_{B1}$ | $R_{B1}$ |
| $L_{A3606}$ | $R_{B3}$ | $R_{B10}$ | $R_{B1}$ | $R_{B1}$ |
| $L_{A3607}$ | $R_{B3}$ | $R_{A3}$ | $R_{B1}$ | $R_{B1}$ |
| $L_{A3608}$ | $R_{B3}$ | $R_{A34}$ | $R_{B1}$ | $R_{B1}$ |
| $L_{A3609}$ | $R_{B4}$ | $R_{B1}$ | $R_{B1}$ | $R_{B1}$ |
| $L_{A3610}$ | $R_{B4}$ | $R_{B3}$ | $R_{B1}$ | $R_{B1}$ |
| $L_{A3611}$ | $R_{B4}$ | $R_{B7}$ | $R_{B1}$ | $R_{B1}$ |
| $L_{A3612}$ | $R_{B4}$ | $R_{B10}$ | $R_{B1}$ | $R_{B1}$ |
| $L_{A3613}$ | $R_{B4}$ | $R_{A3}$ | $R_{B1}$ | $R_{B1}$ |
| $L_{A3614}$ | $R_{B4}$ | $R_{A34}$ | $R_{B1}$ | $R_{B1}$ |
| $L_{A3615}$ | $R_{B7}$ | $R_{B1}$ | $R_{B1}$ | $R_{B1}$ |
| $L_{A3616}$ | $R_{B7}$ | $R_{B3}$ | $R_{B1}$ | $R_{B1}$ |
| $L_{A3617}$ | $R_{B7}$ | $R_{B4}$ | $R_{B1}$ | $R_{B1}$ |
| $L_{A3618}$ | $R_{B7}$ | $R_{B10}$ | $R_{B1}$ | $R_{B1}$ |
| $L_{A3619}$ | $R_{B7}$ | $R_{A3}$ | $R_{B1}$ | $R_{B1}$ |
| $L_{A3620}$ | $R_{B7}$ | $R_{A34}$ | $R_{B1}$ | $R_{B1}$ |
| $L_{A3621}$ | $R_{B10}$ | $R_{B1}$ | $R_{B1}$ | $R_{B1}$ |
| $L_{A3622}$ | $R_{B10}$ | $R_{B3}$ | $R_{B1}$ | $R_{B1}$ |
| $L_{A3623}$ | $R_{B10}$ | $R_{B4}$ | $R_{B1}$ | $R_{B1}$ |
| $L_{A3624}$ | $R_{B10}$ | $R_{B7}$ | $R_{B1}$ | $R_{B1}$ |
| $L_{A3625}$ | $R_{B10}$ | $R_{A3}$ | $R_{B1}$ | $R_{B1}$ |
| $L_{A3626}$ | $R_{B10}$ | $R_{A34}$ | $R_{B1}$ | $R_{B1}$ |
| $L_{A3627}$ | $R_{A3}$ | $R_{B1}$ | $R_{B1}$ | $R_{B1}$ |
| $L_{A3628}$ | $R_{A3}$ | $R_{B3}$ | $R_{B1}$ | $R_{B1}$ |
| $L_{A3629}$ | $R_{A3}$ | $R_{B4}$ | $R_{B1}$ | $R_{B1}$ |
| $L_{A3630}$ | $R_{A3}$ | $R_{B7}$ | $R_{B1}$ | $R_{B1}$ |
| $L_{A3631}$ | $R_{A3}$ | $R_{B10}$ | $R_{B1}$ | $R_{B1}$ |
| $L_{A3632}$ | $R_{A3}$ | $R_{A34}$ | $R_{B1}$ | $R_{B1}$ |
| $L_{A3633}$ | $R_{A34}$ | $R_{B1}$ | $R_{B1}$ | $R_{B1}$ |
| $L_{A3634}$ | $R_{A34}$ | $R_{B3}$ | $R_{B1}$ | $R_{B1}$ |
| $L_{A3635}$ | $R_{A34}$ | $R_{B4}$ | $R_{B1}$ | $R_{B1}$ |
| $L_{A3636}$ | $R_{A34}$ | $R_{B7}$ | $R_{B1}$ | $R_{B1}$ |
| $L_{A3637}$ | $R_{A34}$ | $R_{B10}$ | $R_{B1}$ | $R_{B1}$ |
| $L_{A3638}$ | $R_{A34}$ | $R_{A3}$ | $R_{B1}$ | $R_{B1}$ |

$L_{A3639}$ through $L_{A3898}$ that are based on a structure of Formula XVI,

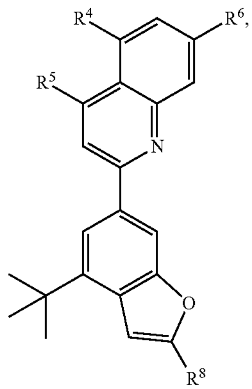

in which $R^4$, $R^5$, $R^6$, and $R^8$ are defined as provided below:

| Ligand | $R^4$ | $R^5$ | $R^6$ | $R^8$ |
|---|---|---|---|---|
| $L_{A3639}$ | H | H | H | H |
| $L_{A3640}$ | $R_{B1}$ | H | H | H |
| $L_{A3641}$ | $R_{B3}$ | H | H | H |
| $L_{A3642}$ | $R_{B4}$ | H | H | H |
| $L_{A3643}$ | $R_{B7}$ | H | H | H |
| $L_{A3644}$ | $R_{B10}$ | H | H | H |
| $L_{A3645}$ | $R_{A3}$ | H | H | H |
| $L_{A3646}$ | $R_{A34}$ | H | H | H |
| $L_{A3647}$ | H | $R_{B1}$ | H | H |
| $L_{A3648}$ | H | $R_{B2}$ | H | H |
| $L_{A3649}$ | H | $R_{B3}$ | H | H |
| $L_{A3650}$ | H | $R_{B4}$ | H | H |
| $L_{A3651}$ | H | $R_{B7}$ | H | H |
| $L_{A3652}$ | H | $R_{B10}$ | H | H |
| $L_{A3653}$ | H | $R_{A3}$ | H | H |
| $L_{A3654}$ | H | $R_{A34}$ | H | H |
| $L_{A3655}$ | $R_{B1}$ | $R_{B1}$ | H | H |
| $L_{A3656}$ | $R_{B3}$ | $R_{B3}$ | H | H |
| $L_{A3657}$ | $R_{B4}$ | $R_{B4}$ | H | H |
| $L_{A3658}$ | $R_{B7}$ | $R_{B7}$ | H | H |
| $L_{A3659}$ | $R_{B10}$ | $R_{B10}$ | H | H |
| $L_{A3660}$ | $R_{A3}$ | $R_{A3}$ | H | H |
| $L_{A3661}$ | $R_{A34}$ | $R_{A34}$ | H | H |
| $L_{A3662}$ | $R_{B1}$ | $R_{B3}$ | H | H |
| $L_{A3663}$ | $R_{B1}$ | $R_{B4}$ | H | H |
| $L_{A3664}$ | $R_{B1}$ | $R_{B7}$ | H | H |
| $L_{A3665}$ | $R_{B1}$ | $R_{B10}$ | H | H |
| $L_{A3666}$ | $R_{B1}$ | $R_{A3}$ | H | H |
| $L_{A3667}$ | $R_{B1}$ | $R_{A34}$ | H | H |
| $L_{A3668}$ | $R_{B3}$ | $R_{B1}$ | H | H |
| $L_{A3669}$ | $R_{B3}$ | $R_{B4}$ | H | H |
| $L_{A3670}$ | $R_{B3}$ | $R_{B7}$ | H | H |
| $L_{A3671}$ | $R_{B3}$ | $R_{B10}$ | H | H |
| $L_{A3672}$ | $R_{B3}$ | $R_{A3}$ | H | H |
| $L_{A3673}$ | $R_{B3}$ | $R_{A34}$ | H | H |
| $L_{A3674}$ | $R_{B4}$ | $R_{B1}$ | H | H |
| $L_{A3675}$ | $R_{B4}$ | $R_{B3}$ | H | H |
| $L_{A3676}$ | $R_{B4}$ | $R_{B7}$ | H | H |
| $L_{A3677}$ | $R_{B4}$ | $R_{B10}$ | H | H |
| $L_{A3678}$ | $R_{B4}$ | $R_{A3}$ | H | H |
| $L_{A3679}$ | $R_{B4}$ | $R_{A34}$ | H | H |
| $L_{A3680}$ | $R_{B7}$ | $R_{B1}$ | H | H |
| $L_{A3681}$ | $R_{B7}$ | $R_{B3}$ | H | H |
| $L_{A3682}$ | $R_{B7}$ | $R_{B4}$ | H | H |
| $L_{A3683}$ | $R_{B7}$ | $R_{B10}$ | H | H |
| $L_{A3684}$ | $R_{B7}$ | $R_{A3}$ | H | H |
| $L_{A3685}$ | $R_{B7}$ | $R_{A34}$ | H | H |
| $L_{A3686}$ | $R_{B10}$ | $R_{B1}$ | H | H |
| $L_{A3687}$ | $R_{B10}$ | $R_{B3}$ | H | H |
| $L_{A3688}$ | $R_{B10}$ | $R_{B4}$ | H | H |
| $L_{A3689}$ | $R_{B10}$ | $R_{B7}$ | H | H |
| $L_{A3690}$ | $R_{B10}$ | $R_{A3}$ | H | H |

-continued

| Ligand | $R^4$ | $R^5$ | $R^6$ | $R^8$ |
|---|---|---|---|---|
| $L_{A3691}$ | $R_{B10}$ | $R_{A34}$ | H | H |
| $L_{A3692}$ | $R_{A3}$ | $R_{B1}$ | H | H |
| $L_{A3693}$ | $R_{A3}$ | $R_{B3}$ | H | H |
| $L_{A3694}$ | $R_{A3}$ | $R_{B4}$ | H | H |
| $L_{A3695}$ | $R_{A3}$ | $R_{B7}$ | H | H |
| $L_{A3696}$ | $R_{A3}$ | $R_{B10}$ | H | H |
| $L_{A3697}$ | $R_{A3}$ | $R_{A34}$ | H | H |
| $L_{A3698}$ | $R_{A34}$ | $R_{B1}$ | H | H |
| $L_{A3699}$ | $R_{A34}$ | $R_{B3}$ | H | H |
| $L_{A3700}$ | $R_{A34}$ | $R_{B4}$ | H | H |
| $L_{A3701}$ | $R_{A34}$ | $R_{B7}$ | H | H |
| $L_{A3702}$ | $R_{A34}$ | $R_{B10}$ | H | H |
| $L_{A3703}$ | $R_{A34}$ | $R_{A3}$ | H | H |
| $L_{A3704}$ | H | H | H | $R_{B1}$ |
| $L_{A3705}$ | $R_{B1}$ | H | H | $R_{B1}$ |
| $L_{A3706}$ | $R_{B3}$ | H | H | $R_{B1}$ |
| $L_{A3707}$ | $R_{B4}$ | H | H | $R_{B1}$ |
| $L_{A3708}$ | $R_{B7}$ | H | H | $R_{B1}$ |
| $L_{A3709}$ | $R_{B10}$ | H | H | $R_{B1}$ |
| $L_{A3710}$ | $R_{A3}$ | H | H | $R_{B1}$ |
| $L_{A3711}$ | $R_{A34}$ | H | H | $R_{B1}$ |
| $L_{A3712}$ | H | $R_{B1}$ | H | $R_{B1}$ |
| $L_{A3713}$ | H | $R_{B2}$ | H | $R_{B1}$ |
| $L_{A3714}$ | H | $R_{B3}$ | H | $R_{B1}$ |
| $L_{A3715}$ | H | $R_{B4}$ | H | $R_{B1}$ |
| $L_{A3716}$ | H | $R_{B7}$ | H | $R_{B1}$ |
| $L_{A3717}$ | H | $R_{B10}$ | H | $R_{B1}$ |
| $L_{A3718}$ | H | $R_{A3}$ | H | $R_{B1}$ |
| $L_{A3719}$ | H | $R_{A34}$ | H | $R_{B1}$ |
| $L_{A3720}$ | $R_{B1}$ | $R_{B1}$ | H | $R_{B1}$ |
| $L_{A3721}$ | $R_{B3}$ | $R_{B3}$ | H | $R_{B1}$ |
| $L_{A3722}$ | $R_{B4}$ | $R_{B4}$ | H | $R_{B1}$ |
| $L_{A3723}$ | $R_{B7}$ | $R_{B7}$ | H | $R_{B1}$ |
| $L_{A3724}$ | $R_{B10}$ | $R_{B10}$ | H | $R_{B1}$ |
| $L_{A3725}$ | $R_{A3}$ | $R_{A3}$ | H | $R_{B1}$ |
| $L_{A3726}$ | $R_{A34}$ | $R_{A34}$ | H | $R_{B1}$ |
| $L_{A3727}$ | $R_{B1}$ | $R_{B3}$ | H | $R_{B1}$ |
| $L_{A3728}$ | $R_{B1}$ | $R_{B4}$ | H | $R_{B1}$ |
| $L_{A3729}$ | $R_{B1}$ | $R_{B7}$ | H | $R_{B1}$ |
| $L_{A3730}$ | $R_{B1}$ | $R_{B10}$ | H | $R_{B1}$ |
| $L_{A3731}$ | $R_{B1}$ | $R_{A3}$ | H | $R_{B1}$ |
| $L_{A3732}$ | $R_{B1}$ | $R_{A34}$ | H | $R_{B1}$ |
| $L_{A3733}$ | $R_{B3}$ | $R_{B1}$ | H | $R_{B1}$ |
| $L_{A3734}$ | $R_{B3}$ | $R_{B4}$ | H | $R_{B1}$ |
| $L_{A3735}$ | $R_{B3}$ | $R_{B7}$ | H | $R_{B1}$ |
| $L_{A3736}$ | $R_{B3}$ | $R_{B10}$ | H | $R_{B1}$ |
| $L_{A3737}$ | $R_{B3}$ | $R_{A3}$ | H | $R_{B1}$ |
| $L_{A3738}$ | $R_{B3}$ | $R_{A34}$ | H | $R_{B1}$ |
| $L_{A3739}$ | $R_{B4}$ | $R_{B1}$ | H | $R_{B1}$ |
| $L_{A3740}$ | $R_{B4}$ | $R_{B3}$ | H | $R_{B1}$ |
| $L_{A3741}$ | $R_{B4}$ | $R_{B7}$ | H | $R_{B1}$ |
| $L_{A3742}$ | $R_{B4}$ | $R_{B10}$ | H | $R_{B1}$ |
| $L_{A3743}$ | $R_{B4}$ | $R_{A3}$ | H | $R_{B1}$ |
| $L_{A3744}$ | $R_{B4}$ | $R_{A34}$ | H | $R_{B1}$ |
| $L_{A3745}$ | $R_{B7}$ | $R_{B1}$ | H | $R_{B1}$ |
| $L_{A3746}$ | $R_{B7}$ | $R_{B3}$ | H | $R_{B1}$ |
| $L_{A3747}$ | $R_{B7}$ | $R_{B4}$ | H | $R_{B1}$ |
| $L_{A3748}$ | $R_{B7}$ | $R_{B10}$ | H | $R_{B1}$ |
| $L_{A3749}$ | $R_{B7}$ | $R_{A3}$ | H | $R_{B1}$ |
| $L_{A3750}$ | $R_{B7}$ | $R_{A34}$ | H | $R_{B1}$ |
| $L_{A3751}$ | $R_{B10}$ | $R_{B1}$ | H | $R_{B1}$ |
| $L_{A3752}$ | $R_{B10}$ | $R_{B3}$ | H | $R_{B1}$ |
| $L_{A3753}$ | $R_{B10}$ | $R_{B4}$ | H | $R_{B1}$ |
| $L_{A3754}$ | $R_{B10}$ | $R_{B7}$ | H | $R_{B1}$ |
| $L_{A3755}$ | $R_{B10}$ | $R_{A3}$ | H | $R_{B1}$ |
| $L_{A3756}$ | $R_{B10}$ | $R_{A34}$ | H | $R_{B1}$ |
| $L_{A3757}$ | $R_{A3}$ | $R_{B1}$ | H | $R_{B1}$ |
| $L_{A3758}$ | $R_{A3}$ | $R_{B3}$ | H | $R_{B1}$ |
| $L_{A3759}$ | $R_{A3}$ | $R_{B4}$ | H | $R_{B1}$ |
| $L_{A3760}$ | $R_{A3}$ | $R_{B7}$ | H | $R_{B1}$ |
| $L_{A3761}$ | $R_{A3}$ | $R_{B10}$ | H | $R_{B1}$ |
| $L_{A3762}$ | $R_{A3}$ | $R_{A34}$ | H | $R_{B1}$ |
| $L_{A3763}$ | $R_{A34}$ | $R_{B1}$ | H | $R_{B1}$ |
| $L_{A3764}$ | $R_{A34}$ | $R_{B3}$ | H | $R_{B1}$ |
| $L_{A3765}$ | $R_{A34}$ | $R_{B4}$ | H | $R_{B1}$ |
| $L_{A3766}$ | $R_{A34}$ | $R_{B7}$ | H | $R_{B1}$ |
| $L_{A3767}$ | $R_{A34}$ | $R_{B10}$ | H | $R_{B1}$ |

-continued

| Ligand | $R^4$ | $R^5$ | $R^6$ | $R^8$ |
|---|---|---|---|---|
| $L_{A3768}$ | $R_{A34}$ | $R_{A3}$ | H | $R_{B1}$ |
| $L_{A3769}$ | H | H | $R_{B1}$ | H |
| $L_{A3770}$ | $R_{B1}$ | H | $R_{B1}$ | H |
| $L_{A3771}$ | $R_{B3}$ | H | $R_{B1}$ | H |
| $L_{A3772}$ | $R_{B4}$ | H | $R_{B1}$ | H |
| $L_{A3773}$ | $R_{B7}$ | H | $R_{B1}$ | H |
| $L_{A3774}$ | $R_{B10}$ | H | $R_{B1}$ | H |
| $L_{A3775}$ | $R_{A3}$ | H | $R_{B1}$ | H |
| $L_{A3776}$ | $R_{A34}$ | H | $R_{B1}$ | H |
| $L_{A3777}$ | H | $R_{B1}$ | $R_{B1}$ | H |
| $L_{A3778}$ | H | $R_{B2}$ | $R_{B1}$ | H |
| $L_{A3779}$ | H | $R_{B3}$ | $R_{B1}$ | H |
| $L_{A3780}$ | H | $R_{B4}$ | $R_{B1}$ | H |
| $L_{A3781}$ | H | $R_{B7}$ | $R_{B1}$ | H |
| $L_{A3782}$ | H | $R_{B10}$ | $R_{B1}$ | H |
| $L_{A3783}$ | H | $R_{A3}$ | $R_{B1}$ | H |
| $L_{A3784}$ | H | $R_{A34}$ | $R_{B1}$ | H |
| $L_{A3785}$ | $R_{B1}$ | $R_{B1}$ | $R_{B1}$ | H |
| $L_{A3786}$ | $R_{B3}$ | $R_{B3}$ | $R_{B1}$ | H |
| $L_{A3787}$ | $R_{B4}$ | $R_{B4}$ | $R_{B1}$ | H |
| $L_{A3788}$ | $R_{B7}$ | $R_{B7}$ | $R_{B1}$ | H |
| $L_{A3789}$ | $R_{B10}$ | $R_{B10}$ | $R_{B1}$ | H |
| $L_{A3790}$ | $R_{A3}$ | $R_{A3}$ | $R_{B1}$ | H |
| $L_{A3791}$ | $R_{A34}$ | $R_{A34}$ | $R_{B1}$ | H |
| $L_{A3792}$ | $R_{B1}$ | $R_{B3}$ | $R_{B1}$ | H |
| $L_{A3793}$ | $R_{B1}$ | $R_{B4}$ | $R_{B1}$ | H |
| $L_{A3794}$ | $R_{B1}$ | $R_{B7}$ | $R_{B1}$ | H |
| $L_{A3795}$ | $R_{B1}$ | $R_{B10}$ | $R_{B1}$ | H |
| $L_{A3796}$ | $R_{B1}$ | $R_{A3}$ | $R_{B1}$ | H |
| $L_{A3797}$ | $R_{B1}$ | $R_{A34}$ | $R_{B1}$ | H |
| $L_{A3798}$ | $R_{B3}$ | $R_{B1}$ | $R_{B1}$ | H |
| $L_{A3799}$ | $R_{B3}$ | $R_{B4}$ | $R_{B1}$ | H |
| $L_{A3800}$ | $R_{B3}$ | $R_{B7}$ | $R_{B1}$ | H |
| $L_{A3801}$ | $R_{B3}$ | $R_{B10}$ | $R_{B1}$ | H |
| $L_{A3802}$ | $R_{B3}$ | $R_{A3}$ | $R_{B1}$ | H |
| $L_{A3803}$ | $R_{B3}$ | $R_{A34}$ | $R_{B1}$ | H |
| $L_{A3804}$ | $R_{B4}$ | $R_{B1}$ | $R_{B1}$ | H |
| $L_{A3805}$ | $R_{B4}$ | $R_{B3}$ | $R_{B1}$ | H |
| $L_{A3806}$ | $R_{B4}$ | $R_{B7}$ | $R_{B1}$ | H |
| $L_{A3807}$ | $R_{B4}$ | $R_{B10}$ | $R_{B1}$ | H |
| $L_{A3808}$ | $R_{B4}$ | $R_{A3}$ | $R_{B1}$ | H |
| $L_{A3809}$ | $R_{B4}$ | $R_{A34}$ | $R_{B1}$ | H |
| $L_{A3810}$ | $R_{B7}$ | $R_{B1}$ | $R_{B1}$ | H |
| $L_{A3811}$ | $R_{B7}$ | $R_{B3}$ | $R_{B1}$ | H |
| $L_{A3812}$ | $R_{B7}$ | $R_{B4}$ | $R_{B1}$ | H |
| $L_{A3813}$ | $R_{B7}$ | $R_{B10}$ | $R_{B1}$ | H |
| $L_{A3814}$ | $R_{B7}$ | $R_{A3}$ | $R_{B1}$ | H |
| $L_{A3815}$ | $R_{B7}$ | $R_{A34}$ | $R_{B1}$ | H |
| $L_{A3816}$ | $R_{B10}$ | $R_{B1}$ | $R_{B1}$ | H |
| $L_{A3817}$ | $R_{B10}$ | $R_{B3}$ | $R_{B1}$ | H |
| $L_{A3818}$ | $R_{B10}$ | $R_{B4}$ | $R_{B1}$ | H |
| $L_{A3819}$ | $R_{B10}$ | $R_{B7}$ | $R_{B1}$ | H |
| $L_{A3820}$ | $R_{B10}$ | $R_{A3}$ | $R_{B1}$ | H |
| $L_{A3821}$ | $R_{B10}$ | $R_{A34}$ | $R_{B1}$ | H |
| $L_{A3822}$ | $R_{A3}$ | $R_{B1}$ | $R_{B1}$ | H |
| $L_{A3823}$ | $R_{A3}$ | $R_{B3}$ | $R_{B1}$ | H |
| $L_{A3824}$ | $R_{A3}$ | $R_{B4}$ | $R_{B1}$ | H |
| $L_{A3825}$ | $R_{A3}$ | $R_{B7}$ | $R_{B1}$ | H |
| $L_{A3826}$ | $R_{A3}$ | $R_{B10}$ | $R_{B1}$ | H |
| $L_{A3827}$ | $R_{A3}$ | $R_{A34}$ | $R_{B1}$ | H |
| $L_{A3828}$ | $R_{A34}$ | $R_{B1}$ | $R_{B1}$ | H |
| $L_{A3829}$ | $R_{A34}$ | $R_{B3}$ | $R_{B1}$ | H |
| $L_{A3830}$ | $R_{A34}$ | $R_{B4}$ | $R_{B1}$ | H |
| $L_{A3831}$ | $R_{A34}$ | $R_{B7}$ | $R_{B1}$ | H |
| $L_{A3832}$ | $R_{A34}$ | $R_{B10}$ | $R_{B1}$ | H |
| $L_{A3833}$ | $R_{A34}$ | $R_{A3}$ | $R_{B1}$ | H |
| $L_{A3834}$ | H | H | $R_{B1}$ | $R_{B1}$ |
| $L_{A3835}$ | $R_{B1}$ | H | $R_{B1}$ | $R_{B1}$ |
| $L_{A3836}$ | $R_{B3}$ | H | $R_{B1}$ | $R_{B1}$ |
| $L_{A3837}$ | $R_{B4}$ | H | $R_{B1}$ | $R_{B1}$ |
| $L_{A3838}$ | $R_{B7}$ | H | $R_{B1}$ | $R_{B1}$ |
| $L_{A3839}$ | $R_{B10}$ | H | $R_{B1}$ | $R_{B1}$ |
| $L_{A3840}$ | $R_{A3}$ | H | $R_{B1}$ | $R_{B1}$ |
| $L_{A3841}$ | $R_{A34}$ | H | $R_{B1}$ | $R_{B1}$ |
| $L_{A3842}$ | H | $R_{B1}$ | $R_{B1}$ | $R_{B1}$ |
| $L_{A3843}$ | H | $R_{B2}$ | $R_{B1}$ | $R_{B1}$ |
| $L_{A3844}$ | H | $R_{B3}$ | $R_{B1}$ | $R_{B1}$ |
| $L_{A3845}$ | H | $R_{B4}$ | $R_{B1}$ | $R_{B1}$ |
| $L_{A3846}$ | H | $R_{B7}$ | $R_{B1}$ | $R_{B1}$ |
| $L_{A3847}$ | H | $R_{B10}$ | $R_{B1}$ | $R_{B1}$ |
| $L_{A3848}$ | H | $R_{A3}$ | $R_{B1}$ | $R_{B1}$ |
| $L_{A3849}$ | H | $R_{A34}$ | $R_{B1}$ | $R_{B1}$ |
| $L_{A3850}$ | $R_{B1}$ | $R_{B1}$ | $R_{B1}$ | $R_{B1}$ |
| $L_{A3851}$ | $R_{B3}$ | $R_{B3}$ | $R_{B1}$ | $R_{B1}$ |
| $L_{A3852}$ | $R_{B4}$ | $R_{B4}$ | $R_{B1}$ | $R_{B1}$ |
| $L_{A3853}$ | $R_{B7}$ | $R_{B7}$ | $R_{B1}$ | $R_{B1}$ |
| $L_{A3854}$ | $R_{B10}$ | $R_{B10}$ | $R_{B1}$ | $R_{B1}$ |
| $L_{A3855}$ | $R_{A3}$ | $R_{A3}$ | $R_{B1}$ | $R_{B1}$ |
| $L_{A3856}$ | $R_{A34}$ | $R_{A34}$ | $R_{B1}$ | $R_{B1}$ |
| $L_{A3857}$ | $R_{B1}$ | $R_{B3}$ | $R_{B1}$ | $R_{B1}$ |
| $L_{A3858}$ | $R_{B1}$ | $R_{B4}$ | $R_{B1}$ | $R_{B1}$ |
| $L_{A3859}$ | $R_{B1}$ | $R_{B7}$ | $R_{B1}$ | $R_{B1}$ |
| $L_{A3860}$ | $R_{B1}$ | $R_{B10}$ | $R_{B1}$ | $R_{B1}$ |
| $L_{A3861}$ | $R_{B1}$ | $R_{A3}$ | $R_{B1}$ | $R_{B1}$ |
| $L_{A3862}$ | $R_{B1}$ | $R_{A34}$ | $R_{B1}$ | $R_{B1}$ |
| $L_{A3863}$ | $R_{B3}$ | $R_{B1}$ | $R_{B1}$ | $R_{B1}$ |
| $L_{A3864}$ | $R_{B3}$ | $R_{B4}$ | $R_{B1}$ | $R_{B1}$ |
| $L_{A3865}$ | $R_{B3}$ | $R_{B7}$ | $R_{B1}$ | $R_{B1}$ |
| $L_{A3866}$ | $R_{B3}$ | $R_{B10}$ | $R_{B1}$ | $R_{B1}$ |
| $L_{A3867}$ | $R_{B3}$ | $R_{A3}$ | $R_{B1}$ | $R_{B1}$ |
| $L_{A3868}$ | $R_{B3}$ | $R_{A34}$ | $R_{B1}$ | $R_{B1}$ |
| $L_{A3869}$ | $R_{B4}$ | $R_{B1}$ | $R_{B1}$ | $R_{B1}$ |
| $L_{A3870}$ | $R_{B4}$ | $R_{B3}$ | $R_{B1}$ | $R_{B1}$ |
| $L_{A3871}$ | $R_{B4}$ | $R_{B7}$ | $R_{B1}$ | $R_{B1}$ |
| $L_{A3872}$ | $R_{B4}$ | $R_{B10}$ | $R_{B1}$ | $R_{B1}$ |
| $L_{A3873}$ | $R_{B4}$ | $R_{A3}$ | $R_{B1}$ | $R_{B1}$ |
| $L_{A3874}$ | $R_{B4}$ | $R_{A34}$ | $R_{B1}$ | $R_{B1}$ |
| $L_{A3875}$ | $R_{B7}$ | $R_{B1}$ | $R_{B1}$ | $R_{B1}$ |
| $L_{A3876}$ | $R_{B7}$ | $R_{B3}$ | $R_{B1}$ | $R_{B1}$ |
| $L_{A3877}$ | $R_{B7}$ | $R_{B4}$ | $R_{B1}$ | $R_{B1}$ |
| $L_{A3878}$ | $R_{B7}$ | $R_{B10}$ | $R_{B1}$ | $R_{B1}$ |
| $L_{A3879}$ | $R_{B7}$ | $R_{A3}$ | $R_{B1}$ | $R_{B1}$ |
| $L_{A3880}$ | $R_{B7}$ | $R_{A34}$ | $R_{B1}$ | $R_{B1}$ |
| $L_{A3881}$ | $R_{B10}$ | $R_{B1}$ | $R_{B1}$ | $R_{B1}$ |
| $L_{A3882}$ | $R_{B10}$ | $R_{B3}$ | $R_{B1}$ | $R_{B1}$ |
| $L_{A3883}$ | $R_{B10}$ | $R_{B4}$ | $R_{B1}$ | $R_{B1}$ |
| $L_{A3884}$ | $R_{B10}$ | $R_{B7}$ | $R_{B1}$ | $R_{B1}$ |
| $L_{A3885}$ | $R_{B10}$ | $R_{A3}$ | $R_{B1}$ | $R_{B1}$ |
| $L_{A3886}$ | $R_{B10}$ | $R_{A34}$ | $R_{B1}$ | $R_{B1}$ |
| $L_{A3887}$ | $R_{A3}$ | $R_{B1}$ | $R_{B1}$ | $R_{B1}$ |
| $L_{A3888}$ | $R_{A3}$ | $R_{B3}$ | $R_{B1}$ | $R_{B1}$ |
| $L_{A3889}$ | $R_{A3}$ | $R_{B4}$ | $R_{B1}$ | $R_{B1}$ |
| $L_{A3890}$ | $R_{A3}$ | $R_{B7}$ | $R_{B1}$ | $R_{B1}$ |
| $L_{A3891}$ | $R_{A3}$ | $R_{B10}$ | $R_{B1}$ | $R_{B1}$ |
| $L_{A3892}$ | $R_{A3}$ | $R_{A34}$ | $R_{B1}$ | $R_{B1}$ |
| $L_{A3893}$ | $R_{A34}$ | $R_{B1}$ | $R_{B1}$ | $R_{B1}$ |
| $L_{A3894}$ | $R_{A34}$ | $R_{B3}$ | $R_{B1}$ | $R_{B1}$ |
| $L_{A3895}$ | $R_{A34}$ | $R_{B4}$ | $R_{B1}$ | $R_{B1}$ |
| $L_{A3896}$ | $R_{A34}$ | $R_{B7}$ | $R_{B1}$ | $R_{B1}$ |
| $L_{A3897}$ | $R_{A34}$ | $R_{B10}$ | $R_{B1}$ | $R_{B1}$ |
| $L_{A3898}$ | $R_{A34}$ | $R_{A3}$ | $R_{B1}$ | $R_{B1}$ |

$L_{A3899}$ through $L_{A4156}$ that are based on a structure of Formula XVII,

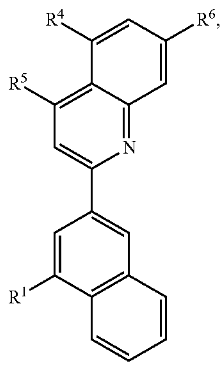

in which $R^1$, $R^4$, $R^5$, and $R^6$ are defined as provided below:

| Ligand | $R^1$ | $R^4$ | $R^5$ | $R^6$ |
|---|---|---|---|---|
| $L_{A3899}$ | $R_{B7}$ | H | H | H |
| $L_{A3900}$ | $R_{B7}$ | $R_{B1}$ | H | H |
| $L_{A3901}$ | $R_{B7}$ | $R_{B3}$ | H | H |
| $L_{A3902}$ | $R_{B7}$ | $R_{B4}$ | H | H |
| $L_{A3903}$ | $R_{B7}$ | $R_{B7}$ | H | H |
| $L_{A3904}$ | $R_{B7}$ | $R_{B10}$ | H | H |
| $L_{A3905}$ | $R_{B7}$ | $R_{A3}$ | H | H |
| $L_{A3906}$ | $R_{B7}$ | $R_{A34}$ | H | H |
| $L_{A3907}$ | $R_{B7}$ | H | $R_{B1}$ | H |
| $L_{A3908}$ | $R_{B7}$ | H | $R_{B2}$ | H |
| $L_{A3909}$ | $R_{B7}$ | H | $R_{B3}$ | H |
| $L_{A3910}$ | $R_{B7}$ | H | $R_{B4}$ | H |
| $L_{A3911}$ | $R_{B7}$ | H | $R_{B7}$ | H |
| $L_{A3912}$ | $R_{B7}$ | H | $R_{B10}$ | H |
| $L_{A3913}$ | $R_{B7}$ | H | $R_{A3}$ | H |
| $L_{A3914}$ | $R_{B7}$ | H | $R_{A34}$ | H |
| $L_{A3915}$ | $R_{B7}$ | $R_{B1}$ | $R_{B1}$ | H |
| $L_{A3916}$ | $R_{B7}$ | $R_{B3}$ | $R_{B3}$ | H |
| $L_{A3917}$ | $R_{B7}$ | $R_{B4}$ | $R_{B4}$ | H |
| $L_{A3918}$ | $R_{B7}$ | $R_{B7}$ | $R_{B7}$ | H |
| $L_{A3919}$ | $R_{B7}$ | $R_{B10}$ | $R_{B10}$ | H |
| $L_{A3920}$ | $R_{B7}$ | $R_{A3}$ | $R_{A3}$ | H |
| $L_{A3921}$ | $R_{B7}$ | $R_{A34}$ | $R_{A34}$ | H |
| $L_{A3922}$ | $R_{B7}$ | $R_{B1}$ | $R_{B3}$ | H |
| $L_{A3923}$ | $R_{B7}$ | $R_{B1}$ | $R_{B4}$ | H |
| $L_{A3924}$ | $R_{B7}$ | $R_{B1}$ | $R_{B7}$ | H |
| $L_{A3925}$ | $R_{B7}$ | $R_{B1}$ | $R_{B10}$ | H |
| $L_{A3926}$ | $R_{B7}$ | $R_{B1}$ | $R_{A3}$ | H |
| $L_{A3927}$ | $R_{B7}$ | $R_{B1}$ | $R_{A34}$ | H |
| $L_{A3928}$ | $R_{B7}$ | $R_{B3}$ | $R_{B1}$ | H |
| $L_{A3929}$ | $R_{B7}$ | $R_{B3}$ | $R_{B4}$ | H |
| $L_{A3930}$ | $R_{B7}$ | $R_{B3}$ | $R_{B7}$ | H |
| $L_{A3931}$ | $R_{B7}$ | $R_{B3}$ | $R_{B10}$ | H |
| $L_{A3932}$ | $R_{B7}$ | $R_{B3}$ | $R_{A3}$ | H |
| $L_{A3933}$ | $R_{B7}$ | $R_{B3}$ | $R_{A34}$ | H |
| $L_{A3934}$ | $R_{B7}$ | $R_{B4}$ | $R_{B1}$ | H |
| $L_{A3935}$ | $R_{B7}$ | $R_{B4}$ | $R_{B3}$ | H |
| $L_{A3936}$ | $R_{B7}$ | $R_{B4}$ | $R_{B7}$ | H |
| $L_{A3937}$ | $R_{B7}$ | $R_{B4}$ | $R_{B10}$ | H |
| $L_{A3938}$ | $R_{B7}$ | $R_{B4}$ | $R_{A3}$ | H |
| $L_{A3939}$ | $R_{B7}$ | $R_{B4}$ | $R_{A34}$ | H |
| $L_{A3940}$ | $R_{B7}$ | $R_{B7}$ | $R_{B1}$ | H |
| $L_{A3941}$ | $R_{B7}$ | $R_{B7}$ | $R_{B3}$ | H |
| $L_{A3942}$ | $R_{B7}$ | $R_{B7}$ | $R_{B4}$ | H |
| $L_{A3943}$ | $R_{B7}$ | $R_{B7}$ | $R_{B10}$ | H |
| $L_{A3944}$ | $R_{B7}$ | $R_{B7}$ | $R_{A3}$ | H |
| $L_{A3945}$ | $R_{B7}$ | $R_{B7}$ | $R_{A34}$ | H |
| $L_{A3946}$ | $R_{B7}$ | $R_{B10}$ | $R_{B1}$ | H |
| $L_{A3947}$ | $R_{B7}$ | $R_{B10}$ | $R_{B3}$ | H |
| $L_{A3948}$ | $R_{B7}$ | $R_{B10}$ | $R_{B4}$ | H |
| $L_{A3949}$ | $R_{B7}$ | $R_{B10}$ | $R_{B7}$ | H |
| $L_{A3950}$ | $R_{B7}$ | $R_{B10}$ | $R_{A3}$ | H |
| $L_{A3951}$ | $R_{B7}$ | $R_{B10}$ | $R_{A34}$ | H |
| $L_{A3952}$ | $R_{B7}$ | $R_{A3}$ | $R_{B1}$ | H |
| $L_{A3953}$ | $R_{B7}$ | $R_{A3}$ | $R_{B3}$ | H |
| $L_{A3954}$ | $R_{B7}$ | $R_{A3}$ | $R_{B4}$ | H |
| $L_{A3955}$ | $R_{B7}$ | $R_{A3}$ | $R_{B7}$ | H |
| $L_{A3956}$ | $R_{B7}$ | $R_{A3}$ | $R_{B10}$ | H |
| $L_{A3957}$ | $R_{B7}$ | $R_{A3}$ | $R_{A34}$ | H |
| $L_{A3958}$ | $R_{B7}$ | $R_{A34}$ | $R_{B1}$ | H |
| $L_{A3959}$ | $R_{B7}$ | $R_{A34}$ | $R_{B3}$ | H |
| $L_{A3960}$ | $R_{B7}$ | $R_{A34}$ | $R_{B4}$ | H |
| $L_{A3961}$ | $R_{B7}$ | $R_{A34}$ | $R_{B7}$ | H |
| $L_{A3962}$ | $R_{B7}$ | $R_{A34}$ | $R_{B10}$ | H |
| $L_{A3963}$ | $R_{B7}$ | $R_{A34}$ | $R_{A3}$ | H |
| $L_{A3964}$ | $R_{B9}$ | H | H | H |
| $L_{A3965}$ | $R_{B9}$ | $R_{B1}$ | H | H |
| $L_{A3966}$ | $R_{B9}$ | $R_{B3}$ | H | H |
| $L_{A3967}$ | $R_{B9}$ | $R_{B4}$ | H | H |
| $L_{A3968}$ | $R_{B9}$ | $R_{B7}$ | H | H |
| $L_{A3969}$ | $R_{B9}$ | $R_{B10}$ | H | H |
| $L_{A3970}$ | $R_{B9}$ | $R_{A3}$ | H | H |
| $L_{A3971}$ | $R_{B9}$ | $R_{A34}$ | H | H |
| $L_{A3972}$ | $R_{B9}$ | H | $R_{B1}$ | H |
| $L_{A3973}$ | $R_{B9}$ | H | $R_{B2}$ | H |
| $L_{A3974}$ | $R_{B9}$ | H | $R_{B3}$ | H |
| $L_{A3975}$ | $R_{B9}$ | H | $R_{B4}$ | H |
| $L_{A3976}$ | $R_{B9}$ | H | $R_{B7}$ | H |
| $L_{A3977}$ | $R_{B9}$ | H | $R_{B10}$ | H |
| $L_{A3978}$ | $R_{B9}$ | H | $R_{A3}$ | H |
| $L_{A3979}$ | $R_{B9}$ | H | $R_{A34}$ | H |
| $L_{A3980}$ | $R_{B9}$ | $R_{B1}$ | $R_{B1}$ | H |
| $L_{A3981}$ | $R_{B9}$ | $R_{B3}$ | $R_{B3}$ | H |
| $L_{A3982}$ | $R_{B9}$ | $R_{B4}$ | $R_{B4}$ | H |
| $L_{A3983}$ | $R_{B9}$ | $R_{B7}$ | $R_{B7}$ | H |
| $L_{A3984}$ | $R_{B9}$ | $R_{B10}$ | $R_{B10}$ | H |
| $L_{A3985}$ | $R_{B9}$ | $R_{A3}$ | $R_{A3}$ | H |
| $L_{A3986}$ | $R_{B9}$ | $R_{A34}$ | $R_{A34}$ | H |
| $L_{A3987}$ | $R_{B9}$ | $R_{B1}$ | $R_{B3}$ | H |
| $L_{A3988}$ | $R_{B9}$ | $R_{B1}$ | $R_{B4}$ | H |
| $L_{A3989}$ | $R_{B9}$ | $R_{B1}$ | $R_{B7}$ | H |
| $L_{A3990}$ | $R_{B9}$ | $R_{B1}$ | $R_{B10}$ | H |
| $L_{A3991}$ | $R_{B9}$ | $R_{B1}$ | $R_{A3}$ | H |
| $L_{A3992}$ | $R_{B9}$ | $R_{B1}$ | $R_{A34}$ | H |
| $L_{A3993}$ | $R_{B9}$ | $R_{B3}$ | $R_{B1}$ | H |
| $L_{A3994}$ | $R_{B9}$ | $R_{B3}$ | $R_{B4}$ | H |
| $L_{A3995}$ | $R_{B9}$ | $R_{B3}$ | $R_{B7}$ | H |
| $L_{A3996}$ | $R_{B9}$ | $R_{B3}$ | $R_{B10}$ | H |
| $L_{A3997}$ | $R_{B9}$ | $R_{B3}$ | $R_{A3}$ | H |
| $L_{A3998}$ | $R_{B9}$ | $R_{B3}$ | $R_{A34}$ | H |
| $L_{A3999}$ | $R_{B9}$ | $R_{B4}$ | $R_{B1}$ | H |
| $L_{A4000}$ | $R_{B9}$ | $R_{B4}$ | $R_{B3}$ | H |
| $L_{A4001}$ | $R_{B9}$ | $R_{B4}$ | $R_{B7}$ | H |
| $L_{A4002}$ | $R_{B9}$ | $R_{B4}$ | $R_{B10}$ | H |
| $L_{A4003}$ | $R_{B9}$ | $R_{B4}$ | $R_{A3}$ | H |
| $L_{A4004}$ | $R_{B9}$ | $R_{B4}$ | $R_{A34}$ | H |
| $L_{A4005}$ | $R_{B9}$ | $R_{B7}$ | $R_{B1}$ | H |
| $L_{A4006}$ | $R_{B9}$ | $R_{B7}$ | $R_{B3}$ | H |
| $L_{A4007}$ | $R_{B9}$ | $R_{B7}$ | $R_{B4}$ | H |
| $L_{A4008}$ | $R_{B9}$ | $R_{B7}$ | $R_{B10}$ | H |
| $L_{A4009}$ | $R_{B9}$ | $R_{B7}$ | $R_{A3}$ | H |
| $L_{A4010}$ | $R_{B9}$ | $R_{B7}$ | $R_{A34}$ | H |
| $L_{A4011}$ | $R_{B9}$ | $R_{B10}$ | $R_{B1}$ | H |
| $L_{A4012}$ | $R_{B9}$ | $R_{B10}$ | $R_{B3}$ | H |
| $L_{A4013}$ | $R_{B9}$ | $R_{B10}$ | $R_{B4}$ | H |
| $L_{A4014}$ | $R_{B9}$ | $R_{B10}$ | $R_{B7}$ | H |
| $L_{A4015}$ | $R_{B9}$ | $R_{B10}$ | $R_{A3}$ | H |
| $L_{A4016}$ | $R_{B9}$ | $R_{B10}$ | $R_{A34}$ | H |
| $L_{A4017}$ | $R_{B9}$ | $R_{A3}$ | $R_{B1}$ | H |
| $L_{A4018}$ | $R_{B9}$ | $R_{A3}$ | $R_{B3}$ | H |
| $L_{A4019}$ | $R_{B9}$ | $R_{A3}$ | $R_{B4}$ | H |
| $L_{A4020}$ | $R_{B9}$ | $R_{A3}$ | $R_{B7}$ | H |
| $L_{A4021}$ | $R_{B9}$ | $R_{A3}$ | $R_{B10}$ | H |
| $L_{A4022}$ | $R_{B9}$ | $R_{A3}$ | $R_{A34}$ | H |
| $L_{A4023}$ | $R_{B9}$ | $R_{A34}$ | $R_{B1}$ | H |
| $L_{A4024}$ | $R_{B9}$ | $R_{A34}$ | $R_{B3}$ | H |
| $L_{A4025}$ | $R_{B9}$ | $R_{A34}$ | $R_{B4}$ | H |
| $L_{A4026}$ | $R_{B9}$ | $R_{A34}$ | $R_{B7}$ | H |
| $L_{A4027}$ | $R_{B9}$ | $R_{A34}$ | $R_{B10}$ | H |
| $L_{A4028}$ | $R_{B9}$ | $R_{A34}$ | $R_{A3}$ | H |

-continued

| Ligand | $R^1$ | $R^4$ | $R^5$ | $R^6$ |
| --- | --- | --- | --- | --- |
| $L_{A4027}$ | $R_{B7}$ | H | H | $R_{B1}$ |
| $L_{A4028}$ | $R_{B7}$ | $R_{B1}$ | H | $R_{B1}$ |
| $L_{A4029}$ | $R_{B7}$ | $R_{B3}$ | H | $R_{B1}$ |
| $L_{A4030}$ | $R_{B7}$ | $R_{B4}$ | H | $R_{B1}$ |
| $L_{A4031}$ | $R_{B7}$ | $R_{B7}$ | H | $R_{B1}$ |
| $L_{A4032}$ | $R_{B7}$ | $R_{B10}$ | H | $R_{B1}$ |
| $L_{A4033}$ | $R_{B7}$ | $R_{A3}$ | H | $R_{B1}$ |
| $L_{A4034}$ | $R_{B7}$ | $R_{A34}$ | H | $R_{B1}$ |
| $L_{A4035}$ | $R_{B7}$ | H | $R_{B1}$ | $R_{B1}$ |
| $L_{A4036}$ | $R_{B7}$ | H | $R_{B2}$ | $R_{B1}$ |
| $L_{A4037}$ | $R_{B7}$ | H | $R_{B3}$ | $R_{B1}$ |
| $L_{A4038}$ | $R_{B7}$ | H | $R_{B4}$ | $R_{B1}$ |
| $L_{A4039}$ | $R_{B7}$ | H | $R_{B7}$ | $R_{B1}$ |
| $L_{A4040}$ | $R_{B7}$ | H | $R_{B10}$ | $R_{B1}$ |
| $L_{A4041}$ | $R_{B7}$ | H | $R_{A3}$ | $R_{B1}$ |
| $L_{A4042}$ | $R_{B7}$ | H | $R_{A34}$ | $R_{B1}$ |
| $L_{A4043}$ | $R_{B7}$ | $R_{B1}$ | $R_{B1}$ | $R_{B1}$ |
| $L_{A4044}$ | $R_{B7}$ | $R_{B3}$ | $R_{B3}$ | $R_{B1}$ |
| $L_{A4045}$ | $R_{B7}$ | $R_{B4}$ | $R_{B4}$ | $R_{B1}$ |
| $L_{A4046}$ | $R_{B7}$ | $R_{B7}$ | $R_{B7}$ | $R_{B1}$ |
| $L_{A4047}$ | $R_{B7}$ | $R_{B10}$ | $R_{B10}$ | $R_{B1}$ |
| $L_{A4048}$ | $R_{B7}$ | $R_{A3}$ | $R_{A3}$ | $R_{B1}$ |
| $L_{A4049}$ | $R_{B7}$ | $R_{A34}$ | $R_{A34}$ | $R_{B1}$ |
| $L_{A4050}$ | $R_{B7}$ | $R_{B1}$ | $R_{B3}$ | $R_{B1}$ |
| $L_{A4051}$ | $R_{B7}$ | $R_{B1}$ | $R_{B4}$ | $R_{B1}$ |
| $L_{A4052}$ | $R_{B7}$ | $R_{B1}$ | $R_{B7}$ | $R_{B1}$ |
| $L_{A4053}$ | $R_{B7}$ | $R_{B1}$ | $R_{B10}$ | $R_{B1}$ |
| $L_{A4054}$ | $R_{B7}$ | $R_{B1}$ | $R_{A3}$ | $R_{B1}$ |
| $L_{A4055}$ | $R_{B7}$ | $R_{B1}$ | $R_{A34}$ | $R_{B1}$ |
| $L_{A4056}$ | $R_{B7}$ | $R_{B3}$ | $R_{B1}$ | $R_{B1}$ |
| $L_{A4057}$ | $R_{B7}$ | $R_{B3}$ | $R_{B4}$ | $R_{B1}$ |
| $L_{A4058}$ | $R_{B7}$ | $R_{B3}$ | $R_{B7}$ | $R_{B1}$ |
| $L_{A4059}$ | $R_{B7}$ | $R_{B3}$ | $R_{B10}$ | $R_{B1}$ |
| $L_{A4060}$ | $R_{B7}$ | $R_{B3}$ | $R_{A3}$ | $R_{B1}$ |
| $L_{A4061}$ | $R_{B7}$ | $R_{B3}$ | $R_{A34}$ | $R_{B1}$ |
| $L_{A4062}$ | $R_{B7}$ | $R_{B4}$ | $R_{B1}$ | $R_{B1}$ |
| $L_{A4063}$ | $R_{B7}$ | $R_{B4}$ | $R_{B3}$ | $R_{B1}$ |
| $L_{A4064}$ | $R_{B7}$ | $R_{B4}$ | $R_{B7}$ | $R_{B1}$ |
| $L_{A4065}$ | $R_{B7}$ | $R_{B4}$ | $R_{B10}$ | $R_{B1}$ |
| $L_{A4066}$ | $R_{B7}$ | $R_{B4}$ | $R_{A3}$ | $R_{B1}$ |
| $L_{A4067}$ | $R_{B7}$ | $R_{B4}$ | $R_{A34}$ | $R_{B1}$ |
| $L_{A4068}$ | $R_{B7}$ | $R_{B7}$ | $R_{B1}$ | $R_{B1}$ |
| $L_{A4069}$ | $R_{B7}$ | $R_{B7}$ | $R_{B3}$ | $R_{B1}$ |
| $L_{A4070}$ | $R_{B7}$ | $R_{B7}$ | $R_{B4}$ | $R_{B1}$ |
| $L_{A4071}$ | $R_{B7}$ | $R_{B7}$ | $R_{B10}$ | $R_{B1}$ |
| $L_{A4072}$ | $R_{B7}$ | $R_{B7}$ | $R_{A3}$ | $R_{B1}$ |
| $L_{A4073}$ | $R_{B7}$ | $R_{B7}$ | $R_{A34}$ | $R_{B1}$ |
| $L_{A4074}$ | $R_{B7}$ | $R_{B10}$ | $R_{B1}$ | $R_{B1}$ |
| $L_{A4075}$ | $R_{B7}$ | $R_{B10}$ | $R_{B3}$ | $R_{B1}$ |
| $L_{A4076}$ | $R_{B7}$ | $R_{B10}$ | $R_{B4}$ | $R_{B1}$ |
| $L_{A4077}$ | $R_{B7}$ | $R_{B10}$ | $R_{B7}$ | $R_{B1}$ |
| $L_{A4078}$ | $R_{B7}$ | $R_{B10}$ | $R_{A3}$ | $R_{B1}$ |
| $L_{A4079}$ | $R_{B7}$ | $R_{B10}$ | $R_{A34}$ | $R_{B1}$ |
| $L_{A4080}$ | $R_{B7}$ | $R_{A3}$ | $R_{B1}$ | $R_{B1}$ |
| $L_{A4081}$ | $R_{B7}$ | $R_{A3}$ | $R_{B3}$ | $R_{B1}$ |
| $L_{A4082}$ | $R_{B7}$ | $R_{A3}$ | $R_{B4}$ | $R_{B1}$ |
| $L_{A4083}$ | $R_{B7}$ | $R_{A3}$ | $R_{B7}$ | $R_{B1}$ |
| $L_{A4084}$ | $R_{B7}$ | $R_{A3}$ | $R_{B10}$ | $R_{B1}$ |
| $L_{A4085}$ | $R_{B7}$ | $R_{A3}$ | $R_{A34}$ | $R_{B1}$ |
| $L_{A4086}$ | $R_{B7}$ | $R_{A34}$ | $R_{B1}$ | $R_{B1}$ |
| $L_{A4087}$ | $R_{B7}$ | $R_{A34}$ | $R_{B3}$ | $R_{B1}$ |
| $L_{A4088}$ | $R_{B7}$ | $R_{A34}$ | $R_{B4}$ | $R_{B1}$ |
| $L_{A4089}$ | $R_{B7}$ | $R_{A34}$ | $R_{B7}$ | $R_{B1}$ |
| $L_{A4090}$ | $R_{B7}$ | $R_{A34}$ | $R_{B10}$ | $R_{B1}$ |
| $L_{A4091}$ | $R_{B7}$ | $R_{A34}$ | $R_{A3}$ | $R_{B1}$ |
| $L_{A4092}$ | $R_{B9}$ | H | H | $R_{B1}$ |
| $L_{A4093}$ | $R_{B9}$ | $R_{B1}$ | H | $R_{B1}$ |
| $L_{A4094}$ | $R_{B9}$ | $R_{B3}$ | H | $R_{B1}$ |
| $L_{A4095}$ | $R_{B9}$ | $R_{B4}$ | H | $R_{B1}$ |
| $L_{A4096}$ | $R_{B9}$ | $R_{B7}$ | H | $R_{B1}$ |
| $L_{A4097}$ | $R_{B9}$ | $R_{B10}$ | H | $R_{B1}$ |
| $L_{A4098}$ | $R_{B9}$ | $R_{A3}$ | H | $R_{B1}$ |
| $L_{A4099}$ | $R_{B9}$ | $R_{A34}$ | H | $R_{B1}$ |
| $L_{A4100}$ | $R_{B9}$ | H | $R_{B1}$ | $R_{B1}$ |
| $L_{A4101}$ | $R_{B9}$ | H | $R_{B2}$ | $R_{B1}$ |
| $L_{A4102}$ | $R_{B9}$ | H | $R_{B3}$ | $R_{B1}$ |
| $L_{A4103}$ | $R_{B9}$ | H | $R_{B4}$ | $R_{B1}$ |

-continued

| Ligand | $R^1$ | $R^4$ | $R^5$ | $R^6$ |
| --- | --- | --- | --- | --- |
| $L_{A4104}$ | $R_{B9}$ | H | $R_{B7}$ | $R_{B1}$ |
| $L_{A4105}$ | $R_{B9}$ | H | $R_{B10}$ | $R_{B1}$ |
| $L_{A4106}$ | $R_{B9}$ | H | $R_{A3}$ | $R_{B1}$ |
| $L_{A4107}$ | $R_{B9}$ | H | $R_{A34}$ | $R_{B1}$ |
| $L_{A4108}$ | $R_{B9}$ | $R_{B1}$ | $R_{B1}$ | $R_{B1}$ |
| $L_{A4109}$ | $R_{B9}$ | $R_{B3}$ | $R_{B3}$ | $R_{B1}$ |
| $L_{A4110}$ | $R_{B9}$ | $R_{B4}$ | $R_{B4}$ | $R_{B1}$ |
| $L_{A4111}$ | $R_{B9}$ | $R_{B7}$ | $R_{B7}$ | $R_{B1}$ |
| $L_{A4112}$ | $R_{B9}$ | $R_{B10}$ | $R_{B10}$ | $R_{B1}$ |
| $L_{A4113}$ | $R_{B9}$ | $R_{A3}$ | $R_{A3}$ | $R_{B1}$ |
| $L_{A4114}$ | $R_{B9}$ | $R_{A34}$ | $R_{A34}$ | $R_{B1}$ |
| $L_{A4115}$ | $R_{B9}$ | $R_{B1}$ | $R_{B3}$ | $R_{B1}$ |
| $L_{A4116}$ | $R_{B9}$ | $R_{B1}$ | $R_{B4}$ | $R_{B1}$ |
| $L_{A4117}$ | $R_{B9}$ | $R_{B1}$ | $R_{B7}$ | $R_{B1}$ |
| $L_{A4118}$ | $R_{B9}$ | $R_{B1}$ | $R_{B10}$ | $R_{B1}$ |
| $L_{A4119}$ | $R_{B9}$ | $R_{B1}$ | $R_{A3}$ | $R_{B1}$ |
| $L_{A4120}$ | $R_{B9}$ | $R_{B1}$ | $R_{A34}$ | $R_{B1}$ |
| $L_{A4121}$ | $R_{B9}$ | $R_{B3}$ | $R_{B1}$ | $R_{B1}$ |
| $L_{A4122}$ | $R_{B9}$ | $R_{B3}$ | $R_{B4}$ | $R_{B1}$ |
| $L_{A4123}$ | $R_{B9}$ | $R_{B3}$ | $R_{B7}$ | $R_{B1}$ |
| $L_{A4124}$ | $R_{B9}$ | $R_{B3}$ | $R_{B10}$ | $R_{B1}$ |
| $L_{A4125}$ | $R_{B9}$ | $R_{B3}$ | $R_{A3}$ | $R_{B1}$ |
| $L_{A4126}$ | $R_{B9}$ | $R_{B3}$ | $R_{A34}$ | $R_{B1}$ |
| $L_{A4127}$ | $R_{B9}$ | $R_{B4}$ | $R_{B1}$ | $R_{B1}$ |
| $L_{A4128}$ | $R_{B9}$ | $R_{B4}$ | $R_{B3}$ | $R_{B1}$ |
| $L_{A4129}$ | $R_{B9}$ | $R_{B4}$ | $R_{B7}$ | $R_{B1}$ |
| $L_{A4130}$ | $R_{B9}$ | $R_{B4}$ | $R_{B10}$ | $R_{B1}$ |
| $L_{A4131}$ | $R_{B9}$ | $R_{B4}$ | $R_{A3}$ | $R_{B1}$ |
| $L_{A4132}$ | $R_{B9}$ | $R_{B4}$ | $R_{A34}$ | $R_{B1}$ |
| $L_{A4133}$ | $R_{B9}$ | $R_{B7}$ | $R_{B1}$ | $R_{B1}$ |
| $L_{A4134}$ | $R_{B9}$ | $R_{B7}$ | $R_{B3}$ | $R_{B1}$ |
| $L_{A4135}$ | $R_{B9}$ | $R_{B7}$ | $R_{B4}$ | $R_{B1}$ |
| $L_{A4136}$ | $R_{B9}$ | $R_{B7}$ | $R_{B10}$ | $R_{B1}$ |
| $L_{A4137}$ | $R_{B9}$ | $R_{B7}$ | $R_{A3}$ | $R_{B1}$ |
| $L_{A4138}$ | $R_{B9}$ | $R_{B7}$ | $R_{A34}$ | $R_{B1}$ |
| $L_{A4139}$ | $R_{B9}$ | $R_{B10}$ | $R_{B1}$ | $R_{B1}$ |
| $L_{A4140}$ | $R_{B9}$ | $R_{B10}$ | $R_{B3}$ | $R_{B1}$ |
| $L_{A4141}$ | $R_{B9}$ | $R_{B10}$ | $R_{B4}$ | $R_{B1}$ |
| $L_{A4142}$ | $R_{B9}$ | $R_{B10}$ | $R_{B7}$ | $R_{B1}$ |
| $L_{A4143}$ | $R_{B9}$ | $R_{B10}$ | $R_{A3}$ | $R_{B1}$ |
| $L_{A4144}$ | $R_{B9}$ | $R_{B10}$ | $R_{A34}$ | $R_{B1}$ |
| $L_{A4145}$ | $R_{B9}$ | $R_{A3}$ | $R_{B1}$ | $R_{B1}$ |
| $L_{A4146}$ | $R_{B9}$ | $R_{A3}$ | $R_{B3}$ | $R_{B1}$ |
| $L_{A4147}$ | $R_{B9}$ | $R_{A3}$ | $R_{B4}$ | $R_{B1}$ |
| $L_{A4148}$ | $R_{B9}$ | $R_{A3}$ | $R_{B7}$ | $R_{B1}$ |
| $L_{A4149}$ | $R_{B9}$ | $R_{A3}$ | $R_{B10}$ | $R_{B1}$ |
| $L_{A4150}$ | $R_{B9}$ | $R_{A3}$ | $R_{A34}$ | $R_{B1}$ |
| $L_{A4151}$ | $R_{B9}$ | $R_{A34}$ | $R_{B1}$ | $R_{B1}$ |
| $L_{A4152}$ | $R_{B9}$ | $R_{A34}$ | $R_{B3}$ | $R_{B1}$ |
| $L_{A4153}$ | $R_{B9}$ | $R_{A34}$ | $R_{B4}$ | $R_{B1}$ |
| $L_{A4154}$ | $R_{B9}$ | $R_{A34}$ | $R_{B7}$ | $R_{B1}$ |
| $L_{A4155}$ | $R_{B9}$ | $R_{A34}$ | $R_{B10}$ | $R_{B1}$ |
| $L_{A4156}$ | $R_{B9}$ | $R_{A34}$ | $R_{A3}$ | $R_{B1}$ |

$L_{A4157}$ through $L_{A4416}$ that are based on a structure of Formula XVIII,

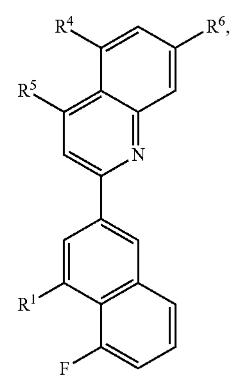

in which $R^1$, $R^4$, $R^5$, and $R^6$ are defined as provided below:

| Ligand | $R^1$ | $R^4$ | $R^5$ | $R^6$ |
|---|---|---|---|---|
| $L_{A4157}$ | $R_{B7}$ | H | H | H |
| $L_{A4158}$ | $R_{B7}$ | $R_{B1}$ | H | H |
| $L_{A4159}$ | $R_{B7}$ | $R_{B3}$ | H | H |
| $L_{A4160}$ | $R_{B7}$ | $R_{B4}$ | H | H |
| $L_{A4161}$ | $R_{B7}$ | $R_{B7}$ | H | H |
| $L_{A4162}$ | $R_{B7}$ | $R_{B10}$ | H | H |
| $L_{A4163}$ | $R_{B7}$ | $R_{A3}$ | H | H |
| $L_{A4164}$ | $R_{B7}$ | $R_{A34}$ | H | H |
| $L_{A4165}$ | $R_{B7}$ | H | $R_{B1}$ | H |
| $L_{A4166}$ | $R_{B7}$ | H | $R_{B2}$ | H |
| $L_{A4167}$ | $R_{B7}$ | H | $R_{B3}$ | H |
| $L_{A4168}$ | $R_{B7}$ | H | $R_{B4}$ | H |
| $L_{A4169}$ | $R_{B7}$ | H | $R_{B7}$ | H |
| $L_{A4170}$ | $R_{B7}$ | H | $R_{B10}$ | H |
| $L_{A4171}$ | $R_{B7}$ | H | $R_{A3}$ | H |
| $L_{A4172}$ | $R_{B7}$ | H | $R_{A34}$ | H |
| $L_{A4173}$ | $R_{B7}$ | $R_{B1}$ | $R_{B1}$ | H |
| $L_{A4174}$ | $R_{B7}$ | $R_{B3}$ | $R_{B3}$ | H |
| $L_{A4175}$ | $R_{B7}$ | $R_{B4}$ | $R_{B4}$ | H |
| $L_{A4176}$ | $R_{B7}$ | $R_{B7}$ | $R_{B7}$ | H |
| $L_{A4177}$ | $R_{B7}$ | $R_{B10}$ | $R_{B10}$ | H |
| $L_{A4178}$ | $R_{B7}$ | $R_{A3}$ | $R_{A3}$ | H |
| $L_{A4179}$ | $R_{B7}$ | $R_{A34}$ | $R_{A34}$ | H |
| $L_{A4180}$ | $R_{B7}$ | $R_{B1}$ | $R_{B3}$ | H |
| $L_{A4181}$ | $R_{B7}$ | $R_{B1}$ | $R_{B4}$ | H |
| $L_{A4182}$ | $R_{B7}$ | $R_{B1}$ | $R_{B7}$ | H |
| $L_{A4183}$ | $R_{B7}$ | $R_{B1}$ | $R_{B10}$ | H |
| $L_{A4184}$ | $R_{B7}$ | $R_{B1}$ | $R_{A3}$ | H |
| $L_{A4185}$ | $R_{B7}$ | $R_{B1}$ | $R_{A34}$ | H |
| $L_{A4186}$ | $R_{B7}$ | $R_{B3}$ | $R_{B1}$ | H |
| $L_{A4187}$ | $R_{B7}$ | $R_{B3}$ | $R_{B4}$ | H |
| $L_{A4188}$ | $R_{B7}$ | $R_{B3}$ | $R_{B7}$ | H |
| $L_{A4189}$ | $R_{B7}$ | $R_{B3}$ | $R_{B10}$ | H |
| $L_{A4190}$ | $R_{B7}$ | $R_{B3}$ | $R_{A3}$ | H |
| $L_{A4191}$ | $R_{B7}$ | $R_{B3}$ | $R_{A34}$ | H |
| $L_{A4192}$ | $R_{B7}$ | $R_{B4}$ | $R_{B1}$ | H |
| $L_{A4193}$ | $R_{B7}$ | $R_{B4}$ | $R_{B3}$ | H |
| $L_{A4194}$ | $R_{B7}$ | $R_{B4}$ | $R_{B7}$ | H |
| $L_{A4195}$ | $R_{B7}$ | $R_{B4}$ | $R_{B10}$ | H |
| $L_{A4196}$ | $R_{B7}$ | $R_{B4}$ | $R_{A3}$ | H |
| $L_{A4197}$ | $R_{B7}$ | $R_{B4}$ | $R_{A34}$ | H |
| $L_{A4198}$ | $R_{B7}$ | $R_{B7}$ | $R_{B1}$ | H |
| $L_{A4199}$ | $R_{B7}$ | $R_{B7}$ | $R_{B3}$ | H |
| $L_{A4200}$ | $R_{B7}$ | $R_{B7}$ | $R_{B4}$ | H |
| $L_{A4201}$ | $R_{B7}$ | $R_{B7}$ | $R_{B10}$ | H |
| $L_{A4202}$ | $R_{B7}$ | $R_{B7}$ | $R_{A3}$ | H |
| $L_{A4203}$ | $R_{B7}$ | $R_{B7}$ | $R_{A34}$ | H |
| $L_{A4204}$ | $R_{B7}$ | $R_{B10}$ | $R_{B1}$ | H |
| $L_{A4205}$ | $R_{B7}$ | $R_{B10}$ | $R_{B3}$ | H |
| $L_{A4206}$ | $R_{B7}$ | $R_{B10}$ | $R_{B4}$ | H |
| $L_{A4207}$ | $R_{B7}$ | $R_{B10}$ | $R_{B7}$ | H |
| $L_{A4208}$ | $R_{B7}$ | $R_{B10}$ | $R_{A3}$ | H |
| $L_{A4209}$ | $R_{B7}$ | $R_{B10}$ | $R_{A34}$ | H |
| $L_{A4210}$ | $R_{B7}$ | $R_{A3}$ | $R_{B1}$ | H |
| $L_{A4211}$ | $R_{B7}$ | $R_{A3}$ | $R_{B3}$ | H |
| $L_{A4212}$ | $R_{B7}$ | $R_{A3}$ | $R_{B4}$ | H |
| $L_{A4213}$ | $R_{B7}$ | $R_{A3}$ | $R_{B7}$ | H |
| $L_{A4214}$ | $R_{B7}$ | $R_{A3}$ | $R_{B10}$ | H |
| $L_{A4215}$ | $R_{B7}$ | $R_{A3}$ | $R_{A34}$ | H |
| $L_{A4216}$ | $R_{B7}$ | $R_{A34}$ | $R_{B1}$ | H |
| $L_{A4217}$ | $R_{B7}$ | $R_{A34}$ | $R_{B3}$ | H |
| $L_{A4218}$ | $R_{B7}$ | $R_{A34}$ | $R_{B4}$ | H |
| $L_{A4219}$ | $R_{B7}$ | $R_{A34}$ | $R_{B7}$ | H |
| $L_{A4220}$ | $R_{B7}$ | $R_{A34}$ | $R_{B10}$ | H |
| $L_{A4221}$ | $R_{B7}$ | $R_{A34}$ | $R_{A3}$ | H |
| $L_{A4222}$ | $R_{B9}$ | H | H | H |
| $L_{A4223}$ | $R_{B9}$ | $R_{B1}$ | H | H |
| $L_{A4224}$ | $R_{B9}$ | $R_{B3}$ | H | H |
| $L_{A4225}$ | $R_{B9}$ | $R_{B4}$ | H | H |
| $L_{A4226}$ | $R_{B9}$ | $R_{B7}$ | H | H |
| $L_{A4227}$ | $R_{B9}$ | $R_{B10}$ | H | H |
| $L_{A4228}$ | $R_{B9}$ | $R_{A3}$ | H | H |
| $L_{A4229}$ | $R_{B9}$ | $R_{A34}$ | H | H |
| $L_{A4230}$ | $R_{B9}$ | H | $R_{B1}$ | H |
| $L_{A4231}$ | $R_{B9}$ | H | $R_{B2}$ | H |
| $L_{A4232}$ | $R_{B9}$ | H | $R_{B3}$ | H |

-continued

| Ligand | $R^1$ | $R^4$ | $R^5$ | $R^6$ |
|---|---|---|---|---|
| $L_{A4233}$ | $R_{B9}$ | H | $R_{B4}$ | H |
| $L_{A4234}$ | $R_{B9}$ | H | $R_{B7}$ | H |
| $L_{A4235}$ | $R_{B9}$ | H | $R_{B10}$ | H |
| $L_{A4236}$ | $R_{B9}$ | H | $R_{A3}$ | H |
| $L_{A4237}$ | $R_{B9}$ | H | $R_{A34}$ | H |
| $L_{A4238}$ | $R_{B9}$ | $R_{B1}$ | $R_{B1}$ | H |
| $L_{A4239}$ | $R_{B9}$ | $R_{B3}$ | $R_{B3}$ | H |
| $L_{A4240}$ | $R_{B9}$ | $R_{B4}$ | $R_{B4}$ | H |
| $L_{A4241}$ | $R_{B9}$ | $R_{B7}$ | $R_{B7}$ | H |
| $L_{A4242}$ | $R_{B9}$ | $R_{B10}$ | $R_{B10}$ | H |
| $L_{A4243}$ | $R_{B9}$ | $R_{A3}$ | $R_{A3}$ | H |
| $L_{A4244}$ | $R_{B9}$ | $R_{A34}$ | $R_{A34}$ | H |
| $L_{A4245}$ | $R_{B9}$ | $R_{B1}$ | $R_{B3}$ | H |
| $L_{A4246}$ | $R_{B9}$ | $R_{B1}$ | $R_{B4}$ | H |
| $L_{A4247}$ | $R_{B9}$ | $R_{B1}$ | $R_{B7}$ | H |
| $L_{A4248}$ | $R_{B9}$ | $R_{B1}$ | $R_{B10}$ | H |
| $L_{A4249}$ | $R_{B9}$ | $R_{B1}$ | $R_{A3}$ | H |
| $L_{A4250}$ | $R_{B9}$ | $R_{B1}$ | $R_{A34}$ | H |
| $L_{A4251}$ | $R_{B9}$ | $R_{B3}$ | $R_{B1}$ | H |
| $L_{A4252}$ | $R_{B9}$ | $R_{B3}$ | $R_{B4}$ | H |
| $L_{A4253}$ | $R_{B9}$ | $R_{B3}$ | $R_{B7}$ | H |
| $L_{A4254}$ | $R_{B9}$ | $R_{B3}$ | $R_{B10}$ | H |
| $L_{A4255}$ | $R_{B9}$ | $R_{B3}$ | $R_{A3}$ | H |
| $L_{A4256}$ | $R_{B9}$ | $R_{B3}$ | $R_{A34}$ | H |
| $L_{A4257}$ | $R_{B9}$ | $R_{B4}$ | $R_{B1}$ | H |
| $L_{A4258}$ | $R_{B9}$ | $R_{B4}$ | $R_{B3}$ | H |
| $L_{A4259}$ | $R_{B9}$ | $R_{B4}$ | $R_{B7}$ | H |
| $L_{A4260}$ | $R_{B9}$ | $R_{B4}$ | $R_{B10}$ | H |
| $L_{A4261}$ | $R_{B9}$ | $R_{B4}$ | $R_{A3}$ | H |
| $L_{A4262}$ | $R_{B9}$ | $R_{B4}$ | $R_{A34}$ | H |
| $L_{A4263}$ | $R_{B9}$ | $R_{B7}$ | $R_{B1}$ | H |
| $L_{A4264}$ | $R_{B9}$ | $R_{B7}$ | $R_{B3}$ | H |
| $L_{A4265}$ | $R_{B9}$ | $R_{B7}$ | $R_{B4}$ | H |
| $L_{A4266}$ | $R_{B9}$ | $R_{B7}$ | $R_{B10}$ | H |
| $L_{A4267}$ | $R_{B9}$ | $R_{B7}$ | $R_{A3}$ | H |
| $L_{A4268}$ | $R_{B9}$ | $R_{B7}$ | $R_{A34}$ | H |
| $L_{A4269}$ | $R_{B9}$ | $R_{B10}$ | $R_{B1}$ | H |
| $L_{A4270}$ | $R_{B9}$ | $R_{B10}$ | $R_{B3}$ | H |
| $L_{A4271}$ | $R_{B9}$ | $R_{B10}$ | $R_{B4}$ | H |
| $L_{A4272}$ | $R_{B9}$ | $R_{B10}$ | $R_{B7}$ | H |
| $L_{A4273}$ | $R_{B9}$ | $R_{B10}$ | $R_{A3}$ | H |
| $L_{A4274}$ | $R_{B9}$ | $R_{B10}$ | $R_{A34}$ | H |
| $L_{A4275}$ | $R_{B9}$ | $R_{A3}$ | $R_{B1}$ | H |
| $L_{A4276}$ | $R_{B9}$ | $R_{A3}$ | $R_{B3}$ | H |
| $L_{A4277}$ | $R_{B9}$ | $R_{A3}$ | $R_{B4}$ | H |
| $L_{A4278}$ | $R_{B9}$ | $R_{A3}$ | $R_{B7}$ | H |
| $L_{A4279}$ | $R_{B9}$ | $R_{A3}$ | $R_{B10}$ | H |
| $L_{A4280}$ | $R_{B9}$ | $R_{A3}$ | $R_{A34}$ | H |
| $L_{A4281}$ | $R_{B9}$ | $R_{A34}$ | $R_{B1}$ | H |
| $L_{A4282}$ | $R_{B9}$ | $R_{A34}$ | $R_{B3}$ | H |
| $L_{A4283}$ | $R_{B9}$ | $R_{A34}$ | $R_{B4}$ | H |
| $L_{A4284}$ | $R_{B9}$ | $R_{A34}$ | $R_{B7}$ | H |
| $L_{A4285}$ | $R_{B9}$ | $R_{A34}$ | $R_{B10}$ | H |
| $L_{A4286}$ | $R_{B9}$ | $R_{A34}$ | $R_{A3}$ | H |
| $L_{A4287}$ | $R_{B7}$ | H | H | $R_{B1}$ |
| $L_{A4288}$ | $R_{B7}$ | $R_{B1}$ | H | $R_{B1}$ |
| $L_{A4289}$ | $R_{B7}$ | $R_{B3}$ | H | $R_{B1}$ |
| $L_{A4290}$ | $R_{B7}$ | $R_{B4}$ | H | $R_{B1}$ |
| $L_{A4291}$ | $R_{B7}$ | $R_{B7}$ | H | $R_{B1}$ |
| $L_{A4292}$ | $R_{B7}$ | $R_{B10}$ | H | $R_{B1}$ |
| $L_{A4293}$ | $R_{B7}$ | $R_{A3}$ | H | $R_{B1}$ |
| $L_{A4294}$ | $R_{B7}$ | $R_{A34}$ | H | $R_{B1}$ |
| $L_{A4295}$ | $R_{B7}$ | H | $R_{B1}$ | $R_{B1}$ |
| $L_{A4296}$ | $R_{B7}$ | H | $R_{B2}$ | $R_{B1}$ |
| $L_{A4297}$ | $R_{B7}$ | H | $R_{B3}$ | $R_{B1}$ |
| $L_{A4298}$ | $R_{B7}$ | H | $R_{B4}$ | $R_{B1}$ |
| $L_{A4299}$ | $R_{B7}$ | H | $R_{B7}$ | $R_{B1}$ |
| $L_{A4300}$ | $R_{B7}$ | H | $R_{B10}$ | $R_{B1}$ |
| $L_{A4301}$ | $R_{B7}$ | H | $R_{A3}$ | $R_{B1}$ |
| $L_{A4302}$ | $R_{B7}$ | H | $R_{A34}$ | $R_{B1}$ |
| $L_{A4303}$ | $R_{B7}$ | $R_{B1}$ | $R_{B1}$ | $R_{B1}$ |
| $L_{A4304}$ | $R_{B7}$ | $R_{B3}$ | $R_{B3}$ | $R_{B1}$ |
| $L_{A4305}$ | $R_{B7}$ | $R_{B4}$ | $R_{B4}$ | $R_{B1}$ |
| $L_{A4306}$ | $R_{B7}$ | $R_{B7}$ | $R_{B7}$ | $R_{B1}$ |
| $L_{A4307}$ | $R_{B7}$ | $R_{B10}$ | $R_{B10}$ | $R_{B1}$ |
| $L_{A4308}$ | $R_{B7}$ | $R_{A3}$ | $R_{A3}$ | $R_{B1}$ |
| $L_{A4309}$ | $R_{B7}$ | $R_{A34}$ | $R_{A34}$ | $R_{B1}$ |

-continued

| Ligand | $R^1$ | $R^4$ | $R^5$ | $R^6$ |
|---|---|---|---|---|
| $L_{A4310}$ | $R_{B7}$ | $R_{B1}$ | $R_{B3}$ | $R_{B1}$ |
| $L_{A4311}$ | $R_{B7}$ | $R_{B1}$ | $R_{B4}$ | $R_{B1}$ |
| $L_{A4312}$ | $R_{B7}$ | $R_{B1}$ | $R_{B7}$ | $R_{B1}$ |
| $L_{A4313}$ | $R_{B7}$ | $R_{B1}$ | $R_{B10}$ | $R_{B1}$ |
| $L_{A4314}$ | $R_{B7}$ | $R_{B1}$ | $R_{A3}$ | $R_{B1}$ |
| $L_{A4315}$ | $R_{B7}$ | $R_{B1}$ | $R_{A34}$ | $R_{B1}$ |
| $L_{A4316}$ | $R_{B7}$ | $R_{B3}$ | $R_{B1}$ | $R_{B1}$ |
| $L_{A4317}$ | $R_{B7}$ | $R_{B3}$ | $R_{B4}$ | $R_{B1}$ |
| $L_{A4318}$ | $R_{B7}$ | $R_{B3}$ | $R_{B7}$ | $R_{B1}$ |
| $L_{A4319}$ | $R_{B7}$ | $R_{B3}$ | $R_{B10}$ | $R_{B1}$ |
| $L_{A4320}$ | $R_{B7}$ | $R_{B3}$ | $R_{A3}$ | $R_{B1}$ |
| $L_{A4321}$ | $R_{B7}$ | $R_{B3}$ | $R_{A34}$ | $R_{B1}$ |
| $L_{A4322}$ | $R_{B7}$ | $R_{B4}$ | $R_{B1}$ | $R_{B1}$ |
| $L_{A4323}$ | $R_{B7}$ | $R_{B4}$ | $R_{B3}$ | $R_{B1}$ |
| $L_{A4324}$ | $R_{B7}$ | $R_{B4}$ | $R_{B7}$ | $R_{B1}$ |
| $L_{A4325}$ | $R_{B7}$ | $R_{B4}$ | $R_{B10}$ | $R_{B1}$ |
| $L_{A4326}$ | $R_{B7}$ | $R_{B4}$ | $R_{A3}$ | $R_{B1}$ |
| $L_{A4327}$ | $R_{B7}$ | $R_{B4}$ | $R_{A34}$ | $R_{B1}$ |
| $L_{A4328}$ | $R_{B7}$ | $R_{B7}$ | $R_{B1}$ | $R_{B1}$ |
| $L_{A4329}$ | $R_{B7}$ | $R_{B7}$ | $R_{B3}$ | $R_{B1}$ |
| $L_{A4330}$ | $R_{B7}$ | $R_{B7}$ | $R_{B4}$ | $R_{B1}$ |
| $L_{A4331}$ | $R_{B7}$ | $R_{B7}$ | $R_{B10}$ | $R_{B1}$ |
| $L_{A4332}$ | $R_{B7}$ | $R_{B7}$ | $R_{A3}$ | $R_{B1}$ |
| $L_{A4333}$ | $R_{B7}$ | $R_{B7}$ | $R_{A34}$ | $R_{B1}$ |
| $L_{A4334}$ | $R_{B7}$ | $R_{B10}$ | $R_{B1}$ | $R_{B1}$ |
| $L_{A4335}$ | $R_{B7}$ | $R_{B10}$ | $R_{B3}$ | $R_{B1}$ |
| $L_{A4336}$ | $R_{B7}$ | $R_{B10}$ | $R_{B4}$ | $R_{B1}$ |
| $L_{A4337}$ | $R_{B7}$ | $R_{B10}$ | $R_{B7}$ | $R_{B1}$ |
| $L_{A4338}$ | $R_{B7}$ | $R_{B10}$ | $R_{A3}$ | $R_{B1}$ |
| $L_{A4339}$ | $R_{B7}$ | $R_{B10}$ | $R_{A34}$ | $R_{B1}$ |
| $L_{A4340}$ | $R_{B7}$ | $R_{A3}$ | $R_{B1}$ | $R_{B1}$ |
| $L_{A4341}$ | $R_{B7}$ | $R_{A3}$ | $R_{B3}$ | $R_{B1}$ |
| $L_{A4342}$ | $R_{B7}$ | $R_{A3}$ | $R_{B4}$ | $R_{B1}$ |
| $L_{A4343}$ | $R_{B7}$ | $R_{A3}$ | $R_{B7}$ | $R_{B1}$ |
| $L_{A4344}$ | $R_{B7}$ | $R_{A3}$ | $R_{B10}$ | $R_{B1}$ |
| $L_{A4345}$ | $R_{B7}$ | $R_{A3}$ | $R_{A34}$ | $R_{B1}$ |
| $L_{A4346}$ | $R_{B7}$ | $R_{A34}$ | $R_{B1}$ | $R_{B1}$ |
| $L_{A4347}$ | $R_{B7}$ | $R_{A34}$ | $R_{B3}$ | $R_{B1}$ |
| $L_{A4348}$ | $R_{B7}$ | $R_{A34}$ | $R_{B4}$ | $R_{B1}$ |
| $L_{A4349}$ | $R_{B7}$ | $R_{A34}$ | $R_{B7}$ | $R_{B1}$ |
| $L_{A4350}$ | $R_{B7}$ | $R_{A34}$ | $R_{B10}$ | $R_{B1}$ |
| $L_{A4351}$ | $R_{B7}$ | $R_{A34}$ | $R_{A3}$ | $R_{B1}$ |
| $L_{A4352}$ | $R_{B9}$ | H | H | $R_{B1}$ |
| $L_{A4353}$ | $R_{B9}$ | $R_{B1}$ | H | $R_{B1}$ |
| $L_{A4354}$ | $R_{B9}$ | $R_{B3}$ | H | $R_{B1}$ |
| $L_{A4355}$ | $R_{B9}$ | $R_{B4}$ | H | $R_{B1}$ |
| $L_{A4356}$ | $R_{B9}$ | $R_{B7}$ | H | $R_{B1}$ |
| $L_{A4357}$ | $R_{B9}$ | $R_{B10}$ | H | $R_{B1}$ |
| $L_{A4358}$ | $R_{B9}$ | $R_{A3}$ | H | $R_{B1}$ |
| $L_{A4359}$ | $R_{B9}$ | $R_{A34}$ | H | $R_{B1}$ |
| $L_{A4360}$ | $R_{B9}$ | H | $R_{B1}$ | $R_{B1}$ |
| $L_{A4361}$ | $R_{B9}$ | H | $R_{B2}$ | $R_{B1}$ |
| $L_{A4362}$ | $R_{B9}$ | H | $R_{B3}$ | $R_{B1}$ |
| $L_{A4363}$ | $R_{B9}$ | H | $R_{B4}$ | $R_{B1}$ |
| $L_{A4364}$ | $R_{B9}$ | H | $R_{B7}$ | $R_{B1}$ |
| $L_{A4365}$ | $R_{B9}$ | H | $R_{B10}$ | $R_{B1}$ |
| $L_{A4366}$ | $R_{B9}$ | H | $R_{A3}$ | $R_{B1}$ |
| $L_{A4367}$ | $R_{B9}$ | H | $R_{A34}$ | $R_{B1}$ |
| $L_{A4368}$ | $R_{B9}$ | $R_{B1}$ | $R_{B1}$ | $R_{B1}$ |
| $L_{A4369}$ | $R_{B9}$ | $R_{B3}$ | $R_{B3}$ | $R_{B1}$ |
| $L_{A4370}$ | $R_{B9}$ | $R_{B4}$ | $R_{B4}$ | $R_{B1}$ |
| $L_{A4371}$ | $R_{B9}$ | $R_{B7}$ | $R_{B7}$ | $R_{B1}$ |
| $L_{A4372}$ | $R_{B9}$ | $R_{B10}$ | $R_{B10}$ | $R_{B1}$ |
| $L_{A4373}$ | $R_{B9}$ | $R_{A3}$ | $R_{A3}$ | $R_{B1}$ |
| $L_{A4374}$ | $R_{B9}$ | $R_{A34}$ | $R_{A34}$ | $R_{B1}$ |
| $L_{A4375}$ | $R_{B9}$ | $R_{B1}$ | $R_{B3}$ | $R_{B1}$ |
| $L_{A4376}$ | $R_{B9}$ | $R_{B1}$ | $R_{B4}$ | $R_{B1}$ |
| $L_{A4377}$ | $R_{B9}$ | $R_{B1}$ | $R_{B7}$ | $R_{B1}$ |
| $L_{A4378}$ | $R_{B9}$ | $R_{B1}$ | $R_{B10}$ | $R_{B1}$ |
| $L_{A4379}$ | $R_{B9}$ | $R_{B1}$ | $R_{A3}$ | $R_{B1}$ |
| $L_{A4380}$ | $R_{B9}$ | $R_{B1}$ | $R_{A34}$ | $R_{B1}$ |
| $L_{A4381}$ | $R_{B9}$ | $R_{B3}$ | $R_{B1}$ | $R_{B1}$ |
| $L_{A4382}$ | $R_{B9}$ | $R_{B3}$ | $R_{B4}$ | $R_{B1}$ |
| $L_{A4383}$ | $R_{B9}$ | $R_{B3}$ | $R_{B7}$ | $R_{B1}$ |
| $L_{A4384}$ | $R_{B9}$ | $R_{B3}$ | $R_{B10}$ | $R_{B1}$ |
| $L_{A4385}$ | $R_{B9}$ | $R_{B3}$ | $R_{A3}$ | $R_{B1}$ |
| $L_{A4386}$ | $R_{B9}$ | $R_{B3}$ | $R_{A34}$ | $R_{B1}$ |

-continued

| Ligand | $R^1$ | $R^4$ | $R^5$ | $R^6$ |
|---|---|---|---|---|
| $L_{A4387}$ | $R_{B9}$ | $R_{B4}$ | $R_{B1}$ | $R_{B1}$ |
| $L_{A4388}$ | $R_{B9}$ | $R_{B4}$ | $R_{B3}$ | $R_{B1}$ |
| $L_{A4389}$ | $R_{B9}$ | $R_{B4}$ | $R_{B7}$ | $R_{B1}$ |
| $L_{A4390}$ | $R_{B9}$ | $R_{B4}$ | $R_{B10}$ | $R_{B1}$ |
| $L_{A4391}$ | $R_{B9}$ | $R_{B4}$ | $R_{A3}$ | $R_{B1}$ |
| $L_{A4392}$ | $R_{B9}$ | $R_{B4}$ | $R_{A34}$ | $R_{B1}$ |
| $L_{A4393}$ | $R_{B9}$ | $R_{B7}$ | $R_{B1}$ | $R_{B1}$ |
| $L_{A4394}$ | $R_{B9}$ | $R_{B7}$ | $R_{B3}$ | $R_{B1}$ |
| $L_{A4395}$ | $R_{B9}$ | $R_{B7}$ | $R_{B4}$ | $R_{B1}$ |
| $L_{A4396}$ | $R_{B9}$ | $R_{B7}$ | $R_{B10}$ | $R_{B1}$ |
| $L_{A4397}$ | $R_{B9}$ | $R_{B7}$ | $R_{A3}$ | $R_{B1}$ |
| $L_{A4398}$ | $R_{B9}$ | $R_{B7}$ | $R_{A34}$ | $R_{B1}$ |
| $L_{A4399}$ | $R_{B9}$ | $R_{B10}$ | $R_{B1}$ | $R_{B1}$ |
| $L_{A4400}$ | $R_{B9}$ | $R_{B10}$ | $R_{B3}$ | $R_{B1}$ |
| $L_{A4401}$ | $R_{B9}$ | $R_{B10}$ | $R_{B4}$ | $R_{B1}$ |
| $L_{A4402}$ | $R_{B9}$ | $R_{B10}$ | $R_{B7}$ | $R_{B1}$ |
| $L_{A4403}$ | $R_{B9}$ | $R_{B10}$ | $R_{A3}$ | $R_{B1}$ |
| $L_{A4404}$ | $R_{B9}$ | $R_{B10}$ | $R_{A34}$ | $R_{B1}$ |
| $L_{A4405}$ | $R_{B9}$ | $R_{A3}$ | $R_{B1}$ | $R_{B1}$ |
| $L_{A4406}$ | $R_{B9}$ | $R_{A3}$ | $R_{B3}$ | $R_{B1}$ |
| $L_{A4407}$ | $R_{B9}$ | $R_{A3}$ | $R_{B4}$ | $R_{B1}$ |
| $L_{A4408}$ | $R_{B9}$ | $R_{A3}$ | $R_{B7}$ | $R_{B1}$ |
| $L_{A4409}$ | $R_{B9}$ | $R_{A3}$ | $R_{B10}$ | $R_{B1}$ |
| $L_{A4410}$ | $R_{B9}$ | $R_{A3}$ | $R_{A34}$ | $R_{B1}$ |
| $L_{A4411}$ | $R_{B9}$ | $R_{A34}$ | $R_{B1}$ | $R_{B1}$ |
| $L_{A4412}$ | $R_{B9}$ | $R_{A34}$ | $R_{B3}$ | $R_{B1}$ |
| $L_{A4413}$ | $R_{B9}$ | $R_{A34}$ | $R_{B4}$ | $R_{B1}$ |
| $L_{A4414}$ | $R_{B9}$ | $R_{A34}$ | $R_{B7}$ | $R_{B1}$ |
| $L_{A4415}$ | $R_{B9}$ | $R_{A34}$ | $R_{B10}$ | $R_{B1}$ |
| $L_{A4416}$ | $R_{B9}$ | $R_{A34}$ | $R_{A3}$ | $R_{B1}$ |

$L_{A4417}$ through $L_{A4676}$ that are based on a structure of Formula XIX,

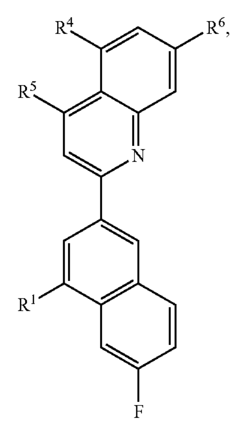

in which $R^1$, $R^4$, $R^5$, and $R^6$ are defined as provided below:

| Ligand | $R^1$ | $R^4$ | $R^5$ | $R^6$ |
|---|---|---|---|---|
| $L_{A4417}$ | $R_{B7}$ | H | H | H |
| $L_{A4418}$ | $R_{B7}$ | $R_{B1}$ | H | H |
| $L_{A4419}$ | $R_{B7}$ | $R_{B3}$ | H | H |
| $L_{A4420}$ | $R_{B7}$ | $R_{B4}$ | H | H |
| $L_{A4421}$ | $R_{B7}$ | $R_{B7}$ | H | H |
| $L_{A4422}$ | $R_{B7}$ | $R_{B10}$ | H | H |
| $L_{A4423}$ | $R_{B7}$ | $R_{A3}$ | H | H |
| $L_{A4424}$ | $R_{B7}$ | $R_{A34}$ | H | H |
| $L_{A4425}$ | $R_{B7}$ | H | $R_{B1}$ | H |
| $L_{A4426}$ | $R_{B7}$ | H | $R_{B2}$ | H |
| $L_{A4427}$ | $R_{B7}$ | H | $R_{B3}$ | H |
| $L_{A4428}$ | $R_{B7}$ | H | $R_{B4}$ | H |
| $L_{A4429}$ | $R_{B7}$ | H | $R_{B7}$ | H |
| $L_{A4430}$ | $R_{B7}$ | H | $R_{B10}$ | H |

-continued

| Ligand | $R^1$ | $R^4$ | $R^5$ | $R^6$ |
|---|---|---|---|---|
| $L_{A4431}$ | $R_{B7}$ | H | $R_{A3}$ | H |
| $L_{A4432}$ | $R_{B7}$ | H | $R_{A34}$ | H |
| $L_{A4433}$ | $R_{B7}$ | $R_{B1}$ | $R_{B1}$ | H |
| $L_{A4434}$ | $R_{B7}$ | $R_{B3}$ | $R_{B3}$ | H |
| $L_{A4435}$ | $R_{B7}$ | $R_{B4}$ | $R_{B4}$ | H |
| $L_{A4436}$ | $R_{B7}$ | $R_{B7}$ | $R_{B7}$ | H |
| $L_{A4437}$ | $R_{B7}$ | $R_{B10}$ | $R_{B10}$ | H |
| $L_{A4438}$ | $R_{B7}$ | $R_{A3}$ | $R_{A3}$ | H |
| $L_{A4439}$ | $R_{B7}$ | $R_{A34}$ | $R_{A34}$ | H |
| $L_{A4440}$ | $R_{B7}$ | $R_{B1}$ | $R_{B3}$ | H |
| $L_{A4441}$ | $R_{B7}$ | $R_{B1}$ | $R_{B4}$ | H |
| $L_{A4442}$ | $R_{B7}$ | $R_{B1}$ | $R_{B7}$ | H |
| $L_{A4443}$ | $R_{B7}$ | $R_{B1}$ | $R_{B10}$ | H |
| $L_{A4444}$ | $R_{B7}$ | $R_{B1}$ | $R_{A3}$ | H |
| $L_{A4445}$ | $R_{B7}$ | $R_{B1}$ | $R_{A34}$ | H |
| $L_{A4446}$ | $R_{B7}$ | $R_{B3}$ | $R_{B1}$ | H |
| $L_{A4447}$ | $R_{B7}$ | $R_{B3}$ | $R_{B4}$ | H |
| $L_{A4448}$ | $R_{B7}$ | $R_{B3}$ | $R_{B7}$ | H |
| $L_{A4449}$ | $R_{B7}$ | $R_{B3}$ | $R_{B10}$ | H |
| $L_{A4450}$ | $R_{B7}$ | $R_{B3}$ | $R_{A3}$ | H |
| $L_{A4451}$ | $R_{B7}$ | $R_{B3}$ | $R_{A34}$ | H |
| $L_{A4452}$ | $R_{B7}$ | $R_{B4}$ | $R_{B1}$ | H |
| $L_{A4453}$ | $R_{B7}$ | $R_{B4}$ | $R_{B3}$ | H |
| $L_{A4454}$ | $R_{B7}$ | $R_{B4}$ | $R_{B7}$ | H |
| $L_{A4455}$ | $R_{B7}$ | $R_{B4}$ | $R_{B10}$ | H |
| $L_{A4456}$ | $R_{B7}$ | $R_{B4}$ | $R_{A3}$ | H |
| $L_{A4457}$ | $R_{B7}$ | $R_{B4}$ | $R_{A34}$ | H |
| $L_{A4458}$ | $R_{B7}$ | $R_{B7}$ | $R_{B1}$ | H |
| $L_{A4459}$ | $R_{B7}$ | $R_{B7}$ | $R_{B3}$ | H |
| $L_{A4460}$ | $R_{B7}$ | $R_{B7}$ | $R_{B4}$ | H |
| $L_{A4461}$ | $R_{B7}$ | $R_{B7}$ | $R_{B10}$ | H |
| $L_{A4462}$ | $R_{B7}$ | $R_{B7}$ | $R_{A3}$ | H |
| $L_{A4463}$ | $R_{B7}$ | $R_{B7}$ | $R_{A34}$ | H |
| $L_{A4464}$ | $R_{B7}$ | $R_{B10}$ | $R_{B1}$ | H |
| $L_{A4465}$ | $R_{B7}$ | $R_{B10}$ | $R_{B3}$ | H |
| $L_{A4466}$ | $R_{B7}$ | $R_{B10}$ | $R_{B4}$ | H |
| $L_{A4467}$ | $R_{B7}$ | $R_{B10}$ | $R_{B7}$ | H |
| $L_{A4468}$ | $R_{B7}$ | $R_{B10}$ | $R_{A3}$ | H |
| $L_{A4469}$ | $R_{B7}$ | $R_{B10}$ | $R_{A34}$ | H |
| $L_{A4470}$ | $R_{B7}$ | $R_{A3}$ | $R_{B1}$ | H |
| $L_{A4471}$ | $R_{B7}$ | $R_{A3}$ | $R_{B3}$ | H |
| $L_{A4472}$ | $R_{B7}$ | $R_{A3}$ | $R_{B4}$ | H |
| $L_{A4473}$ | $R_{B7}$ | $R_{A3}$ | $R_{B7}$ | H |
| $L_{A4474}$ | $R_{B7}$ | $R_{A3}$ | $R_{B10}$ | H |
| $L_{A4475}$ | $R_{B7}$ | $R_{A3}$ | $R_{A34}$ | H |
| $L_{A4476}$ | $R_{B7}$ | $R_{A34}$ | $R_{B1}$ | H |
| $L_{A4477}$ | $R_{B7}$ | $R_{A34}$ | $R_{B3}$ | H |
| $L_{A4478}$ | $R_{B7}$ | $R_{A34}$ | $R_{B4}$ | H |
| $L_{A4479}$ | $R_{B7}$ | $R_{A34}$ | $R_{B7}$ | H |
| $L_{A4480}$ | $R_{B7}$ | $R_{A34}$ | $R_{B10}$ | H |
| $L_{A4481}$ | $R_{B7}$ | $R_{A34}$ | $R_{A3}$ | H |
| $L_{A4482}$ | $R_{B9}$ | H | H | H |
| $L_{A4483}$ | $R_{B9}$ | $R_{B1}$ | H | H |
| $L_{A4484}$ | $R_{B9}$ | $R_{B3}$ | H | H |
| $L_{A4485}$ | $R_{B9}$ | $R_{B4}$ | H | H |
| $L_{A4486}$ | $R_{B9}$ | $R_{B7}$ | H | H |
| $L_{A4487}$ | $R_{B9}$ | $R_{B10}$ | H | H |
| $L_{A4488}$ | $R_{B9}$ | $R_{A3}$ | H | H |
| $L_{A4489}$ | $R_{B9}$ | $R_{A34}$ | H | H |
| $L_{A4490}$ | $R_{B9}$ | H | $R_{B1}$ | H |
| $L_{A4491}$ | $R_{B9}$ | H | $R_{B2}$ | H |
| $L_{A4492}$ | $R_{B9}$ | H | $R_{B3}$ | H |
| $L_{A4493}$ | $R_{B9}$ | H | $R_{B4}$ | H |
| $L_{A4494}$ | $R_{B9}$ | H | $R_{B7}$ | H |
| $L_{A4495}$ | $R_{B9}$ | H | $R_{B10}$ | H |
| $L_{A4496}$ | $R_{B9}$ | H | $R_{A3}$ | H |
| $L_{A4497}$ | $R_{B9}$ | H | $R_{A34}$ | H |
| $L_{A4498}$ | $R_{B9}$ | $R_{B1}$ | $R_{B1}$ | H |
| $L_{A4499}$ | $R_{B9}$ | $R_{B3}$ | $R_{B3}$ | H |
| $L_{A4500}$ | $R_{B9}$ | $R_{B4}$ | $R_{B4}$ | H |
| $L_{A4501}$ | $R_{B9}$ | $R_{B7}$ | $R_{B7}$ | H |
| $L_{A4502}$ | $R_{B9}$ | $R_{B10}$ | $R_{B10}$ | H |
| $L_{A4503}$ | $R_{B9}$ | $R_{A3}$ | $R_{A3}$ | H |
| $L_{A4504}$ | $R_{B9}$ | $R_{A34}$ | $R_{A34}$ | H |
| $L_{A4505}$ | $R_{B9}$ | $R_{B1}$ | $R_{B3}$ | H |
| $L_{A4506}$ | $R_{B9}$ | $R_{B1}$ | $R_{B4}$ | H |
| $L_{A4507}$ | $R_{B9}$ | $R_{B1}$ | $R_{B7}$ | H |
| $L_{A4508}$ | $R_{B9}$ | $R_{B1}$ | $R_{B10}$ | H |
| $L_{A4509}$ | $R_{B9}$ | $R_{B1}$ | $R_{A3}$ | H |
| $L_{A4510}$ | $R_{B9}$ | $R_{B1}$ | $R_{A34}$ | H |
| $L_{A4511}$ | $R_{B9}$ | $R_{B3}$ | $R_{B1}$ | H |
| $L_{A4512}$ | $R_{B9}$ | $R_{B3}$ | $R_{B4}$ | H |
| $L_{A4513}$ | $R_{B9}$ | $R_{B3}$ | $R_{B7}$ | H |
| $L_{A4514}$ | $R_{B9}$ | $R_{B3}$ | $R_{B10}$ | H |
| $L_{A4515}$ | $R_{B9}$ | $R_{B3}$ | $R_{A3}$ | H |
| $L_{A4516}$ | $R_{B9}$ | $R_{B3}$ | $R_{A34}$ | H |
| $L_{A4517}$ | $R_{B9}$ | $R_{B4}$ | $R_{B1}$ | H |
| $L_{A4518}$ | $R_{B9}$ | $R_{B4}$ | $R_{B3}$ | H |
| $L_{A4519}$ | $R_{B9}$ | $R_{B4}$ | $R_{B7}$ | H |
| $L_{A4520}$ | $R_{B9}$ | $R_{B4}$ | $R_{B10}$ | H |
| $L_{A4521}$ | $R_{B9}$ | $R_{B4}$ | $R_{A3}$ | H |
| $L_{A4522}$ | $R_{B9}$ | $R_{B4}$ | $R_{A34}$ | H |
| $L_{A4523}$ | $R_{B9}$ | $R_{B7}$ | $R_{B1}$ | H |
| $L_{A4524}$ | $R_{B9}$ | $R_{B7}$ | $R_{B3}$ | H |
| $L_{A4525}$ | $R_{B9}$ | $R_{B7}$ | $R_{B4}$ | H |
| $L_{A4526}$ | $R_{B9}$ | $R_{B7}$ | $R_{B10}$ | H |
| $L_{A4527}$ | $R_{B9}$ | $R_{B7}$ | $R_{A3}$ | H |
| $L_{A4528}$ | $R_{B9}$ | $R_{B7}$ | $R_{A34}$ | H |
| $L_{A4529}$ | $R_{B9}$ | $R_{B10}$ | $R_{B1}$ | H |
| $L_{A4530}$ | $R_{B9}$ | $R_{B10}$ | $R_{B3}$ | H |
| $L_{A4531}$ | $R_{B9}$ | $R_{B10}$ | $R_{B4}$ | H |
| $L_{A4532}$ | $R_{B9}$ | $R_{B10}$ | $R_{B7}$ | H |
| $L_{A4533}$ | $R_{B9}$ | $R_{B10}$ | $R_{A3}$ | H |
| $L_{A4534}$ | $R_{B9}$ | $R_{B10}$ | $R_{A34}$ | H |
| $L_{A4535}$ | $R_{B9}$ | $R_{A3}$ | $R_{B1}$ | H |
| $L_{A4536}$ | $R_{B9}$ | $R_{A3}$ | $R_{B3}$ | H |
| $L_{A4537}$ | $R_{B9}$ | $R_{A3}$ | $R_{B4}$ | H |
| $L_{A4538}$ | $R_{B9}$ | $R_{A3}$ | $R_{B7}$ | H |
| $L_{A4539}$ | $R_{B9}$ | $R_{A3}$ | $R_{B10}$ | H |
| $L_{A4540}$ | $R_{B9}$ | $R_{A3}$ | $R_{A34}$ | H |
| $L_{A4541}$ | $R_{B9}$ | $R_{A34}$ | $R_{B1}$ | H |
| $L_{A4542}$ | $R_{B9}$ | $R_{A34}$ | $R_{B3}$ | H |
| $L_{A4543}$ | $R_{B9}$ | $R_{A34}$ | $R_{B4}$ | H |
| $L_{A4544}$ | $R_{B9}$ | $R_{A34}$ | $R_{B7}$ | H |
| $L_{A4545}$ | $R_{B9}$ | $R_{A34}$ | $R_{B10}$ | H |
| $L_{A4546}$ | $R_{B9}$ | $R_{A34}$ | $R_{A3}$ | H |
| $L_{A4547}$ | $R_{B7}$ | H | H | $R_{B1}$ |
| $L_{A4548}$ | $R_{B7}$ | $R_{B1}$ | H | $R_{B1}$ |
| $L_{A4549}$ | $R_{B7}$ | $R_{B3}$ | H | $R_{B1}$ |
| $L_{A4550}$ | $R_{B7}$ | $R_{B4}$ | H | $R_{B1}$ |
| $L_{A4551}$ | $R_{B7}$ | $R_{B7}$ | H | $R_{B1}$ |
| $L_{A4552}$ | $R_{B7}$ | $R_{B10}$ | H | $R_{B1}$ |
| $L_{A4553}$ | $R_{B7}$ | $R_{A3}$ | H | $R_{B1}$ |
| $L_{A4554}$ | $R_{B7}$ | $R_{A34}$ | H | $R_{B1}$ |
| $L_{A4555}$ | $R_{B7}$ | H | $R_{B1}$ | $R_{B1}$ |
| $L_{A4556}$ | $R_{B7}$ | H | $R_{B2}$ | $R_{B1}$ |
| $L_{A4557}$ | $R_{B7}$ | H | $R_{B3}$ | $R_{B1}$ |
| $L_{A4558}$ | $R_{B7}$ | H | $R_{B4}$ | $R_{B1}$ |
| $L_{A4559}$ | $R_{B7}$ | H | $R_{B7}$ | $R_{B1}$ |
| $L_{A4560}$ | $R_{B7}$ | H | $R_{B10}$ | $R_{B1}$ |
| $L_{A4561}$ | $R_{B7}$ | H | $R_{A3}$ | $R_{B1}$ |
| $L_{A4562}$ | $R_{B7}$ | H | $R_{A34}$ | $R_{B1}$ |
| $L_{A4563}$ | $R_{B7}$ | $R_{B1}$ | $R_{B1}$ | $R_{B1}$ |
| $L_{A4564}$ | $R_{B7}$ | $R_{B3}$ | $R_{B3}$ | $R_{B1}$ |
| $L_{A4565}$ | $R_{B7}$ | $R_{B4}$ | $R_{B4}$ | $R_{B1}$ |
| $L_{A4566}$ | $R_{B7}$ | $R_{B7}$ | $R_{B7}$ | $R_{B1}$ |
| $L_{A4567}$ | $R_{B7}$ | $R_{B10}$ | $R_{B10}$ | $R_{B1}$ |
| $L_{A4568}$ | $R_{B7}$ | $R_{A3}$ | $R_{A3}$ | $R_{B1}$ |
| $L_{A4569}$ | $R_{B7}$ | $R_{A34}$ | $R_{A34}$ | $R_{B1}$ |
| $L_{A4570}$ | $R_{B7}$ | $R_{B1}$ | $R_{B3}$ | $R_{B1}$ |
| $L_{A4571}$ | $R_{B7}$ | $R_{B1}$ | $R_{B4}$ | $R_{B1}$ |
| $L_{A4572}$ | $R_{B7}$ | $R_{B1}$ | $R_{B7}$ | $R_{B1}$ |
| $L_{A4573}$ | $R_{B7}$ | $R_{B1}$ | $R_{B10}$ | $R_{B1}$ |
| $L_{A4574}$ | $R_{B7}$ | $R_{B1}$ | $R_{A3}$ | $R_{B1}$ |
| $L_{A4575}$ | $R_{B7}$ | $R_{B1}$ | $R_{A34}$ | $R_{B1}$ |
| $L_{A4576}$ | $R_{B7}$ | $R_{B3}$ | $R_{B1}$ | $R_{B1}$ |
| $L_{A4577}$ | $R_{B7}$ | $R_{B3}$ | $R_{B4}$ | $R_{B1}$ |
| $L_{A4578}$ | $R_{B7}$ | $R_{B3}$ | $R_{B7}$ | $R_{B1}$ |
| $L_{A4579}$ | $R_{B7}$ | $R_{B3}$ | $R_{B10}$ | $R_{B1}$ |
| $L_{A4580}$ | $R_{B7}$ | $R_{B3}$ | $R_{A3}$ | $R_{B1}$ |
| $L_{A4581}$ | $R_{B7}$ | $R_{B3}$ | $R_{A34}$ | $R_{B1}$ |
| $L_{A4582}$ | $R_{B7}$ | $R_{B4}$ | $R_{B1}$ | $R_{B1}$ |
| $L_{A4583}$ | $R_{B7}$ | $R_{B4}$ | $R_{B3}$ | $R_{B1}$ |
| $L_{A4584}$ | $R_{B7}$ | $R_{B4}$ | $R_{B7}$ | $R_{B1}$ |

-continued

| Ligand | $R^1$ | $R^4$ | $R^5$ | $R^6$ |
|---|---|---|---|---|
| $L_{A4585}$ | $R_{B7}$ | $R_{B4}$ | $R_{B10}$ | $R_{B1}$ |
| $L_{A4586}$ | $R_{B7}$ | $R_{B4}$ | $R_{A3}$ | $R_{B1}$ |
| $L_{A4587}$ | $R_{B7}$ | $R_{B4}$ | $R_{A34}$ | $R_{B1}$ |
| $L_{A4588}$ | $R_{B7}$ | $R_{B7}$ | $R_{B1}$ | $R_{B1}$ |
| $L_{A4589}$ | $R_{B7}$ | $R_{B7}$ | $R_{B3}$ | $R_{B1}$ |
| $L_{A4590}$ | $R_{B7}$ | $R_{B7}$ | $R_{B4}$ | $R_{B1}$ |
| $L_{A4591}$ | $R_{B7}$ | $R_{B7}$ | $R_{B10}$ | $R_{B1}$ |
| $L_{A4592}$ | $R_{B7}$ | $R_{B7}$ | $R_{A3}$ | $R_{B1}$ |
| $L_{A4593}$ | $R_{B7}$ | $R_{B7}$ | $R_{A34}$ | $R_{B1}$ |
| $L_{A4594}$ | $R_{B7}$ | $R_{B10}$ | $R_{B1}$ | $R_{B1}$ |
| $L_{A4595}$ | $R_{B7}$ | $R_{B10}$ | $R_{B3}$ | $R_{B1}$ |
| $L_{A4596}$ | $R_{B7}$ | $R_{B10}$ | $R_{B4}$ | $R_{B1}$ |
| $L_{A4597}$ | $R_{B7}$ | $R_{B10}$ | $R_{B7}$ | $R_{B1}$ |
| $L_{A4598}$ | $R_{B7}$ | $R_{B10}$ | $R_{A3}$ | $R_{B1}$ |
| $L_{A4599}$ | $R_{B7}$ | $R_{B10}$ | $R_{A34}$ | $R_{B1}$ |
| $L_{A4600}$ | $R_{B7}$ | $R_{A3}$ | $R_{B1}$ | $R_{B1}$ |
| $L_{A4601}$ | $R_{B7}$ | $R_{A3}$ | $R_{B4}$ | $R_{B1}$ |
| $L_{A4602}$ | $R_{B7}$ | $R_{A3}$ | $R_{B3}$ | $R_{B1}$ |
| $L_{A4603}$ | $R_{B7}$ | $R_{A3}$ | $R_{B7}$ | $R_{B1}$ |
| $L_{A4604}$ | $R_{B7}$ | $R_{A3}$ | $R_{B10}$ | $R_{B1}$ |
| $L_{A4605}$ | $R_{B7}$ | $R_{A3}$ | $R_{A34}$ | $R_{B1}$ |
| $L_{A4606}$ | $R_{B7}$ | $R_{A34}$ | $R_{B1}$ | $R_{B1}$ |
| $L_{A4607}$ | $R_{B7}$ | $R_{A34}$ | $R_{B3}$ | $R_{B1}$ |
| $L_{A4608}$ | $R_{B7}$ | $R_{A34}$ | $R_{B4}$ | $R_{B1}$ |
| $L_{A4609}$ | $R_{B7}$ | $R_{A34}$ | $R_{B7}$ | $R_{B1}$ |
| $L_{A4610}$ | $R_{B7}$ | $R_{A34}$ | $R_{B10}$ | $R_{B1}$ |
| $L_{A4611}$ | $R_{B7}$ | $R_{A34}$ | $R_{A3}$ | $R_{B1}$ |
| $L_{A4612}$ | $R_{B9}$ | H | H | $R_{B1}$ |
| $L_{A4613}$ | $R_{B9}$ | $R_{B1}$ | H | $R_{B1}$ |
| $L_{A4614}$ | $R_{B9}$ | $R_{B3}$ | H | $R_{B1}$ |
| $L_{A4615}$ | $R_{B9}$ | $R_{B4}$ | H | $R_{B1}$ |
| $L_{A4616}$ | $R_{B9}$ | $R_{B7}$ | H | $R_{B1}$ |
| $L_{A4617}$ | $R_{B9}$ | $R_{B10}$ | H | $R_{B1}$ |
| $L_{A4618}$ | $R_{B9}$ | $R_{A3}$ | H | $R_{B1}$ |
| $L_{A4619}$ | $R_{B9}$ | $R_{A34}$ | H | $R_{B1}$ |
| $L_{A4620}$ | $R_{B9}$ | H | $R_{B1}$ | $R_{B1}$ |
| $L_{A4621}$ | $R_{B9}$ | H | $R_{B2}$ | $R_{B1}$ |
| $L_{A4622}$ | $R_{B9}$ | H | $R_{B3}$ | $R_{B1}$ |
| $L_{A4623}$ | $R_{B9}$ | H | $R_{B4}$ | $R_{B1}$ |
| $L_{A4624}$ | $R_{B9}$ | H | $R_{B7}$ | $R_{B1}$ |
| $L_{A4625}$ | $R_{B9}$ | H | $R_{B10}$ | $R_{B1}$ |
| $L_{A4626}$ | $R_{B9}$ | H | $R_{A3}$ | $R_{B1}$ |
| $L_{A4627}$ | $R_{B9}$ | H | $R_{A34}$ | $R_{B1}$ |
| $L_{A4628}$ | $R_{B9}$ | $R_{B1}$ | $R_{B1}$ | $R_{B1}$ |
| $L_{A4629}$ | $R_{B9}$ | $R_{B3}$ | $R_{B3}$ | $R_{B1}$ |
| $L_{A4630}$ | $R_{B9}$ | $R_{B4}$ | $R_{B4}$ | $R_{B1}$ |
| $L_{A4631}$ | $R_{B9}$ | $R_{B7}$ | $R_{B7}$ | $R_{B1}$ |
| $L_{A4632}$ | $R_{B9}$ | $R_{B10}$ | $R_{B10}$ | $R_{B1}$ |
| $L_{A4633}$ | $R_{B9}$ | $R_{A3}$ | $R_{A3}$ | $R_{B1}$ |
| $L_{A4634}$ | $R_{B9}$ | $R_{A34}$ | $R_{A34}$ | $R_{B1}$ |
| $L_{A4635}$ | $R_{B9}$ | $R_{B1}$ | $R_{B3}$ | $R_{B1}$ |
| $L_{A4636}$ | $R_{B9}$ | $R_{B1}$ | $R_{B4}$ | $R_{B1}$ |
| $L_{A4637}$ | $R_{B9}$ | $R_{B1}$ | $R_{B7}$ | $R_{B1}$ |
| $L_{A4638}$ | $R_{B9}$ | $R_{B1}$ | $R_{B10}$ | $R_{B1}$ |
| $L_{A4639}$ | $R_{B9}$ | $R_{B1}$ | $R_{A3}$ | $R_{B1}$ |
| $L_{A4640}$ | $R_{B9}$ | $R_{B1}$ | $R_{A34}$ | $R_{B1}$ |
| $L_{A4641}$ | $R_{B9}$ | $R_{B3}$ | $R_{B1}$ | $R_{B1}$ |
| $L_{A4642}$ | $R_{B9}$ | $R_{B3}$ | $R_{B4}$ | $R_{B1}$ |
| $L_{A4643}$ | $R_{B9}$ | $R_{B3}$ | $R_{B7}$ | $R_{B1}$ |
| $L_{A4644}$ | $R_{B9}$ | $R_{B3}$ | $R_{B10}$ | $R_{B1}$ |
| $L_{A4645}$ | $R_{B9}$ | $R_{B3}$ | $R_{A3}$ | $R_{B1}$ |
| $L_{A4646}$ | $R_{B9}$ | $R_{B3}$ | $R_{A34}$ | $R_{B1}$ |
| $L_{A4647}$ | $R_{B9}$ | $R_{B4}$ | $R_{B1}$ | $R_{B1}$ |
| $L_{A4648}$ | $R_{B9}$ | $R_{B4}$ | $R_{B3}$ | $R_{B1}$ |
| $L_{A4649}$ | $R_{B9}$ | $R_{B4}$ | $R_{B7}$ | $R_{B1}$ |
| $L_{A4650}$ | $R_{B9}$ | $R_{B4}$ | $R_{B10}$ | $R_{B1}$ |
| $L_{A4651}$ | $R_{B9}$ | $R_{B4}$ | $R_{A3}$ | $R_{B1}$ |
| $L_{A4652}$ | $R_{B9}$ | $R_{B4}$ | $R_{A34}$ | $R_{B1}$ |
| $L_{A4653}$ | $R_{B9}$ | $R_{B7}$ | $R_{B1}$ | $R_{B1}$ |
| $L_{A4654}$ | $R_{B9}$ | $R_{B7}$ | $R_{B3}$ | $R_{B1}$ |
| $L_{A4655}$ | $R_{B9}$ | $R_{B7}$ | $R_{B4}$ | $R_{B1}$ |
| $L_{A4656}$ | $R_{B9}$ | $R_{B7}$ | $R_{B10}$ | $R_{B1}$ |
| $L_{A4657}$ | $R_{B9}$ | $R_{B7}$ | $R_{A3}$ | $R_{B1}$ |
| $L_{A4658}$ | $R_{B9}$ | $R_{B7}$ | $R_{A34}$ | $R_{B1}$ |
| $L_{A4659}$ | $R_{B9}$ | $R_{B10}$ | $R_{B1}$ | $R_{B1}$ |
| $L_{A4660}$ | $R_{B9}$ | $R_{B10}$ | $R_{B3}$ | $R_{B1}$ |
| $L_{A4661}$ | $R_{B9}$ | $R_{B10}$ | $R_{B4}$ | $R_{B1}$ |

-continued

| Ligand | $R^1$ | $R^4$ | $R^5$ | $R^6$ |
|---|---|---|---|---|
| $L_{A4662}$ | $R_{B9}$ | $R_{B10}$ | $R_{B7}$ | $R_{B1}$ |
| $L_{A4663}$ | $R_{B9}$ | $R_{B10}$ | $R_{A3}$ | $R_{B1}$ |
| $L_{A4664}$ | $R_{B9}$ | $R_{B10}$ | $R_{A34}$ | $R_{B1}$ |
| $L_{A4665}$ | $R_{B9}$ | $R_{A3}$ | $R_{B1}$ | $R_{B1}$ |
| $L_{A4666}$ | $R_{B9}$ | $R_{A3}$ | $R_{B3}$ | $R_{B1}$ |
| $L_{A4667}$ | $R_{B9}$ | $R_{A3}$ | $R_{B4}$ | $R_{B1}$ |
| $L_{A4668}$ | $R_{B9}$ | $R_{A3}$ | $R_{B7}$ | $R_{B1}$ |
| $L_{A4669}$ | $R_{B9}$ | $R_{A3}$ | $R_{B10}$ | $R_{B1}$ |
| $L_{A4670}$ | $R_{B9}$ | $R_{A3}$ | $R_{A34}$ | $R_{B1}$ |
| $L_{A4671}$ | $R_{B9}$ | $R_{A34}$ | $R_{B1}$ | $R_{B1}$ |
| $L_{A4672}$ | $R_{B9}$ | $R_{A34}$ | $R_{B3}$ | $R_{B1}$ |
| $L_{A4673}$ | $R_{B9}$ | $R_{A34}$ | $R_{B4}$ | $R_{B1}$ |
| $L_{A4674}$ | $R_{B9}$ | $R_{A34}$ | $R_{B7}$ | $R_{B1}$ |
| $L_{A4675}$ | $R_{B9}$ | $R_{A34}$ | $R_{B10}$ | $R_{B1}$ |
| $L_{A4676}$ | $R_{B9}$ | $R_{A34}$ | $R_{A3}$ | $R_{B1}$ |

$L_{A4677}$ through $L_{A4936}$ that are based on a structure of Formula XX,

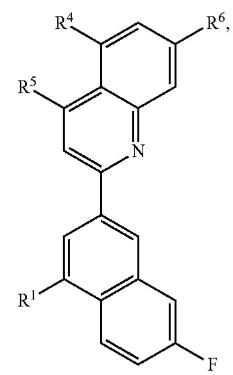

in which $R^1$, $R^4$, $R^5$, and $R^6$ are defined as provided below:

| Ligand | $R^1$ | $R^4$ | $R^5$ | $R^6$ |
|---|---|---|---|---|
| $L_{A4677}$ | $R_{B7}$ | H | H | H |
| $L_{A4678}$ | $R_{B7}$ | $R_{B1}$ | H | H |
| $L_{A4679}$ | $R_{B7}$ | $R_{B3}$ | H | H |
| $L_{A4680}$ | $R_{B7}$ | $R_{B4}$ | H | H |
| $L_{A4681}$ | $R_{B7}$ | $R_{B7}$ | H | H |
| $L_{A4682}$ | $R_{B7}$ | $R_{B10}$ | H | H |
| $L_{A4683}$ | $R_{B7}$ | $R_{A3}$ | H | H |
| $L_{A4684}$ | $R_{B7}$ | $R_{A34}$ | H | H |
| $L_{A4685}$ | $R_{B7}$ | H | $R_{B1}$ | H |
| $L_{A4686}$ | $R_{B7}$ | H | $R_{B2}$ | H |
| $L_{A4687}$ | $R_{B7}$ | H | $R_{B3}$ | H |
| $L_{A4688}$ | $R_{B7}$ | H | $R_{B4}$ | H |
| $L_{A4689}$ | $R_{B7}$ | H | $R_{B7}$ | H |
| $L_{A4690}$ | $R_{B7}$ | H | $R_{B10}$ | H |
| $L_{A4691}$ | $R_{B7}$ | H | $R_{A3}$ | H |
| $L_{A4692}$ | $R_{B7}$ | H | $R_{A34}$ | H |
| $L_{A4693}$ | $R_{B7}$ | $R_{B1}$ | $R_{B1}$ | H |
| $L_{A4694}$ | $R_{B7}$ | $R_{B3}$ | $R_{B3}$ | H |
| $L_{A4695}$ | $R_{B7}$ | $R_{B4}$ | $R_{B4}$ | H |
| $L_{A4696}$ | $R_{B7}$ | $R_{B7}$ | $R_{B7}$ | H |
| $L_{A4697}$ | $R_{B7}$ | $R_{B10}$ | $R_{B10}$ | H |
| $L_{A4698}$ | $R_{B7}$ | $R_{A3}$ | $R_{A3}$ | H |
| $L_{A4699}$ | $R_{B7}$ | $R_{A34}$ | $R_{A34}$ | H |
| $L_{A4700}$ | $R_{B7}$ | $R_{B1}$ | $R_{B3}$ | H |
| $L_{A4701}$ | $R_{B7}$ | $R_{B1}$ | $R_{B4}$ | H |
| $L_{A4702}$ | $R_{B7}$ | $R_{B1}$ | $R_{B7}$ | H |
| $L_{A4703}$ | $R_{B7}$ | $R_{B1}$ | $R_{B10}$ | H |
| $L_{A4704}$ | $R_{B7}$ | $R_{B1}$ | $R_{A3}$ | H |
| $L_{A4705}$ | $R_{B7}$ | $R_{B1}$ | $R_{A34}$ | H |
| $L_{A4706}$ | $R_{B7}$ | $R_{B3}$ | $R_{B1}$ | H |
| $L_{A4707}$ | $R_{B7}$ | $R_{B3}$ | $R_{B4}$ | H |

-continued

| Ligand | $R^1$ | $R^4$ | $R^5$ | $R^6$ |
|---|---|---|---|---|
| $L_{A4708}$ | $R_{B7}$ | $R_{B3}$ | $R_{B7}$ | H |
| $L_{A4709}$ | $R_{B7}$ | $R_{B3}$ | $R_{B10}$ | H |
| $L_{A4710}$ | $R_{B7}$ | $R_{B3}$ | $R_{A3}$ | H |
| $L_{A4711}$ | $R_{B7}$ | $R_{B3}$ | $R_{A34}$ | H |
| $L_{A4712}$ | $R_{B7}$ | $R_{B4}$ | $R_{B1}$ | H |
| $L_{A4713}$ | $R_{B7}$ | $R_{B4}$ | $R_{B3}$ | H |
| $L_{A4714}$ | $R_{B7}$ | $R_{B4}$ | $R_{B7}$ | H |
| $L_{A4715}$ | $R_{B7}$ | $R_{B4}$ | $R_{B10}$ | H |
| $L_{A4716}$ | $R_{B7}$ | $R_{B4}$ | $R_{A3}$ | H |
| $L_{A4717}$ | $R_{B7}$ | $R_{B4}$ | $R_{A34}$ | H |
| $L_{A4718}$ | $R_{B7}$ | $R_{B7}$ | $R_{B1}$ | H |
| $L_{A4719}$ | $R_{B7}$ | $R_{B7}$ | $R_{B3}$ | H |
| $L_{A4720}$ | $R_{B7}$ | $R_{B7}$ | $R_{B4}$ | H |
| $L_{A4721}$ | $R_{B7}$ | $R_{B7}$ | $R_{B10}$ | H |
| $L_{A4722}$ | $R_{B7}$ | $R_{B7}$ | $R_{A3}$ | H |
| $L_{A4723}$ | $R_{B7}$ | $R_{B7}$ | $R_{A34}$ | H |
| $L_{A4724}$ | $R_{B7}$ | $R_{B10}$ | $R_{B1}$ | H |
| $L_{A4725}$ | $R_{B7}$ | $R_{B10}$ | $R_{B3}$ | H |
| $L_{A4726}$ | $R_{B7}$ | $R_{B10}$ | $R_{B4}$ | H |
| $L_{A4727}$ | $R_{B7}$ | $R_{B10}$ | $R_{B7}$ | H |
| $L_{A4728}$ | $R_{B7}$ | $R_{B10}$ | $R_{A3}$ | H |
| $L_{A4729}$ | $R_{B7}$ | $R_{B10}$ | $R_{A34}$ | H |
| $L_{A4730}$ | $R_{B7}$ | $R_{A3}$ | $R_{B1}$ | H |
| $L_{A4731}$ | $R_{B7}$ | $R_{A3}$ | $R_{B3}$ | H |
| $L_{A4732}$ | $R_{B7}$ | $R_{A3}$ | $R_{B4}$ | H |
| $L_{A4733}$ | $R_{B7}$ | $R_{A3}$ | $R_{B7}$ | H |
| $L_{A4734}$ | $R_{B7}$ | $R_{A3}$ | $R_{B10}$ | H |
| $L_{A4735}$ | $R_{B7}$ | $R_{A3}$ | $R_{A34}$ | H |
| $L_{A4736}$ | $R_{B7}$ | $R_{A34}$ | $R_{B1}$ | H |
| $L_{A4737}$ | $R_{B7}$ | $R_{A34}$ | $R_{B3}$ | H |
| $L_{A4738}$ | $R_{B7}$ | $R_{A34}$ | $R_{B4}$ | H |
| $L_{A4739}$ | $R_{B7}$ | $R_{A34}$ | $R_{B7}$ | H |
| $L_{A4740}$ | $R_{B7}$ | $R_{A34}$ | $R_{B10}$ | H |
| $L_{A4741}$ | $R_{B7}$ | $R_{A34}$ | $R_{A3}$ | H |
| $L_{A4742}$ | $R_{B9}$ | H | H | H |
| $L_{A4743}$ | $R_{B9}$ | $R_{B1}$ | H | H |
| $L_{A4744}$ | $R_{B9}$ | $R_{B3}$ | H | H |
| $L_{A4745}$ | $R_{B9}$ | $R_{B4}$ | H | H |
| $L_{A4746}$ | $R_{B9}$ | $R_{B7}$ | H | H |
| $L_{A4747}$ | $R_{B9}$ | $R_{B10}$ | H | H |
| $L_{A4748}$ | $R_{B9}$ | $R_{A3}$ | H | H |
| $L_{A4749}$ | $R_{B9}$ | $R_{A34}$ | H | H |
| $L_{A4750}$ | $R_{B9}$ | H | $R_{B1}$ | H |
| $L_{A4751}$ | $R_{B9}$ | H | $R_{B2}$ | H |
| $L_{A4752}$ | $R_{B9}$ | H | $R_{B3}$ | H |
| $L_{A4753}$ | $R_{B9}$ | H | $R_{B4}$ | H |
| $L_{A4754}$ | $R_{B9}$ | H | $R_{B7}$ | H |
| $L_{A4755}$ | $R_{B9}$ | H | $R_{B10}$ | H |
| $L_{A4756}$ | $R_{B9}$ | H | $R_{A3}$ | H |
| $L_{A4757}$ | $R_{B9}$ | H | $R_{A34}$ | H |
| $L_{A4758}$ | $R_{B9}$ | $R_{B1}$ | $R_{B1}$ | H |
| $L_{A4759}$ | $R_{B9}$ | $R_{B3}$ | $R_{B3}$ | H |
| $L_{A4760}$ | $R_{B9}$ | $R_{B4}$ | $R_{B4}$ | H |
| $L_{A4761}$ | $R_{B9}$ | $R_{B7}$ | $R_{B7}$ | H |
| $L_{A4762}$ | $R_{B9}$ | $R_{B10}$ | $R_{B10}$ | H |
| $L_{A4763}$ | $R_{B9}$ | $R_{A3}$ | $R_{A3}$ | H |
| $L_{A4764}$ | $R_{B9}$ | $R_{A34}$ | $R_{A34}$ | H |
| $L_{A4765}$ | $R_{B9}$ | $R_{B1}$ | $R_{B3}$ | H |
| $L_{A4766}$ | $R_{B9}$ | $R_{B1}$ | $R_{B4}$ | H |
| $L_{A4767}$ | $R_{B9}$ | $R_{B1}$ | $R_{B7}$ | H |
| $L_{A4768}$ | $R_{B9}$ | $R_{B1}$ | $R_{B10}$ | H |
| $L_{A4769}$ | $R_{B9}$ | $R_{B1}$ | $R_{A3}$ | H |
| $L_{A4770}$ | $R_{B9}$ | $R_{B1}$ | $R_{A34}$ | H |
| $L_{A4771}$ | $R_{B9}$ | $R_{B3}$ | $R_{B1}$ | H |
| $L_{A4772}$ | $R_{B9}$ | $R_{B3}$ | $R_{B4}$ | H |
| $L_{A4773}$ | $R_{B9}$ | $R_{B3}$ | $R_{B7}$ | H |
| $L_{A4774}$ | $R_{B9}$ | $R_{B3}$ | $R_{B10}$ | H |
| $L_{A4775}$ | $R_{B9}$ | $R_{B3}$ | $R_{A3}$ | H |
| $L_{A4776}$ | $R_{B9}$ | $R_{B3}$ | $R_{A34}$ | H |
| $L_{A4777}$ | $R_{B9}$ | $R_{B4}$ | $R_{B1}$ | H |
| $L_{A4778}$ | $R_{B9}$ | $R_{B4}$ | $R_{B3}$ | H |
| $L_{A4779}$ | $R_{B9}$ | $R_{B4}$ | $R_{B7}$ | H |
| $L_{A4780}$ | $R_{B9}$ | $R_{B4}$ | $R_{B10}$ | H |
| $L_{A4781}$ | $R_{B9}$ | $R_{B4}$ | $R_{A3}$ | H |
| $L_{A4782}$ | $R_{B9}$ | $R_{B4}$ | $R_{A34}$ | H |
| $L_{A4783}$ | $R_{B9}$ | $R_{B7}$ | $R_{B1}$ | H |
| $L_{A4784}$ | $R_{B9}$ | $R_{B7}$ | $R_{B3}$ | H |

-continued

| Ligand | $R^1$ | $R^4$ | $R^5$ | $R^6$ |
|---|---|---|---|---|
| $L_{A4785}$ | $R_{B9}$ | $R_{B7}$ | $R_{B4}$ | H |
| $L_{A4786}$ | $R_{B9}$ | $R_{B7}$ | $R_{B10}$ | H |
| $L_{A4787}$ | $R_{B9}$ | $R_{B7}$ | $R_{A3}$ | H |
| $L_{A4788}$ | $R_{B9}$ | $R_{B7}$ | $R_{A34}$ | H |
| $L_{A4789}$ | $R_{B9}$ | $R_{B10}$ | $R_{B1}$ | H |
| $L_{A4790}$ | $R_{B9}$ | $R_{B10}$ | $R_{B3}$ | H |
| $L_{A4791}$ | $R_{B9}$ | $R_{B10}$ | $R_{B4}$ | H |
| $L_{A4792}$ | $R_{B9}$ | $R_{B10}$ | $R_{B7}$ | H |
| $L_{A4793}$ | $R_{B9}$ | $R_{B10}$ | $R_{A3}$ | H |
| $L_{A4794}$ | $R_{B9}$ | $R_{B10}$ | $R_{A34}$ | H |
| $L_{A4795}$ | $R_{B9}$ | $R_{A3}$ | $R_{B1}$ | H |
| $L_{A4796}$ | $R_{B9}$ | $R_{A3}$ | $R_{B3}$ | H |
| $L_{A4797}$ | $R_{B9}$ | $R_{A3}$ | $R_{B4}$ | H |
| $L_{A4798}$ | $R_{B9}$ | $R_{A3}$ | $R_{B7}$ | H |
| $L_{A4799}$ | $R_{B9}$ | $R_{A3}$ | $R_{B10}$ | H |
| $L_{A4800}$ | $R_{B9}$ | $R_{A3}$ | $R_{A34}$ | H |
| $L_{A4801}$ | $R_{B9}$ | $R_{A34}$ | $R_{B1}$ | H |
| $L_{A4802}$ | $R_{B9}$ | $R_{A34}$ | $R_{B3}$ | H |
| $L_{A4803}$ | $R_{B9}$ | $R_{A34}$ | $R_{B4}$ | H |
| $L_{A4804}$ | $R_{B9}$ | $R_{A34}$ | $R_{B7}$ | H |
| $L_{A4805}$ | $R_{B9}$ | $R_{A34}$ | $R_{B10}$ | H |
| $L_{A4806}$ | $R_{B9}$ | $R_{A34}$ | $R_{A3}$ | H |
| $L_{A4807}$ | $R_{B7}$ | H | H | $R_{B1}$ |
| $L_{A4808}$ | $R_{B7}$ | $R_{B1}$ | H | $R_{B1}$ |
| $L_{A4809}$ | $R_{B7}$ | $R_{B3}$ | H | $R_{B1}$ |
| $L_{A4810}$ | $R_{B7}$ | $R_{B4}$ | H | $R_{B1}$ |
| $L_{A4811}$ | $R_{B7}$ | $R_{B7}$ | H | $R_{B1}$ |
| $L_{A4812}$ | $R_{B7}$ | $R_{B10}$ | H | $R_{B1}$ |
| $L_{A4813}$ | $R_{B7}$ | $R_{A3}$ | H | $R_{B1}$ |
| $L_{A4814}$ | $R_{B7}$ | $R_{A34}$ | H | $R_{B1}$ |
| $L_{A4815}$ | $R_{B7}$ | H | $R_{B1}$ | $R_{B1}$ |
| $L_{A4816}$ | $R_{B7}$ | H | $R_{B2}$ | $R_{B1}$ |
| $L_{A4817}$ | $R_{B7}$ | H | $R_{B3}$ | $R_{B1}$ |
| $L_{A4818}$ | $R_{B7}$ | H | $R_{B4}$ | $R_{B1}$ |
| $L_{A4819}$ | $R_{B7}$ | H | $R_{B7}$ | $R_{B1}$ |
| $L_{A4820}$ | $R_{B7}$ | H | $R_{B10}$ | $R_{B1}$ |
| $L_{A4821}$ | $R_{B7}$ | H | $R_{A3}$ | $R_{B1}$ |
| $L_{A4822}$ | $R_{B7}$ | H | $R_{A34}$ | $R_{B1}$ |
| $L_{A4823}$ | $R_{B7}$ | $R_{B1}$ | $R_{B1}$ | $R_{B1}$ |
| $L_{A4824}$ | $R_{B7}$ | $R_{B3}$ | $R_{B3}$ | $R_{B1}$ |
| $L_{A4825}$ | $R_{B7}$ | $R_{B4}$ | $R_{B4}$ | $R_{B1}$ |
| $L_{A4826}$ | $R_{B7}$ | $R_{B7}$ | $R_{B7}$ | $R_{B1}$ |
| $L_{A4827}$ | $R_{B7}$ | $R_{B10}$ | $R_{B10}$ | $R_{B1}$ |
| $L_{A4828}$ | $R_{B7}$ | $R_{A3}$ | $R_{A3}$ | $R_{B1}$ |
| $L_{A4829}$ | $R_{B7}$ | $R_{A34}$ | $R_{A34}$ | $R_{B1}$ |
| $L_{A4830}$ | $R_{B7}$ | $R_{B1}$ | $R_{B3}$ | $R_{B1}$ |
| $L_{A4831}$ | $R_{B7}$ | $R_{B1}$ | $R_{B4}$ | $R_{B1}$ |
| $L_{A4832}$ | $R_{B7}$ | $R_{B1}$ | $R_{B7}$ | $R_{B1}$ |
| $L_{A4833}$ | $R_{B7}$ | $R_{B1}$ | $R_{B10}$ | $R_{B1}$ |
| $L_{A4834}$ | $R_{B7}$ | $R_{B1}$ | $R_{A3}$ | $R_{B1}$ |
| $L_{A4835}$ | $R_{B7}$ | $R_{B1}$ | $R_{A34}$ | $R_{B1}$ |
| $L_{A4836}$ | $R_{B7}$ | $R_{B3}$ | $R_{B1}$ | $R_{B1}$ |
| $L_{A4837}$ | $R_{B7}$ | $R_{B3}$ | $R_{B4}$ | $R_{B1}$ |
| $L_{A4838}$ | $R_{B7}$ | $R_{B3}$ | $R_{B7}$ | $R_{B1}$ |
| $L_{A4839}$ | $R_{B7}$ | $R_{B3}$ | $R_{B10}$ | $R_{B1}$ |
| $L_{A4840}$ | $R_{B7}$ | $R_{B3}$ | $R_{A3}$ | $R_{B1}$ |
| $L_{A4841}$ | $R_{B7}$ | $R_{B3}$ | $R_{A34}$ | $R_{B1}$ |
| $L_{A4842}$ | $R_{B7}$ | $R_{B4}$ | $R_{B1}$ | $R_{B1}$ |
| $L_{A4843}$ | $R_{B7}$ | $R_{B4}$ | $R_{B3}$ | $R_{B1}$ |
| $L_{A4844}$ | $R_{B7}$ | $R_{B4}$ | $R_{B7}$ | $R_{B1}$ |
| $L_{A4845}$ | $R_{B7}$ | $R_{B4}$ | $R_{B10}$ | $R_{B1}$ |
| $L_{A4846}$ | $R_{B7}$ | $R_{B4}$ | $R_{A3}$ | $R_{B1}$ |
| $L_{A4847}$ | $R_{B7}$ | $R_{B4}$ | $R_{A34}$ | $R_{B1}$ |
| $L_{A4848}$ | $R_{B7}$ | $R_{B7}$ | $R_{B1}$ | $R_{B1}$ |
| $L_{A4849}$ | $R_{B7}$ | $R_{B7}$ | $R_{B3}$ | $R_{B1}$ |
| $L_{A4850}$ | $R_{B7}$ | $R_{B7}$ | $R_{B4}$ | $R_{B1}$ |
| $L_{A4851}$ | $R_{B7}$ | $R_{B7}$ | $R_{B10}$ | $R_{B1}$ |
| $L_{A4852}$ | $R_{B7}$ | $R_{B7}$ | $R_{A3}$ | $R_{B1}$ |
| $L_{A4853}$ | $R_{B7}$ | $R_{B7}$ | $R_{A34}$ | $R_{B1}$ |
| $L_{A4854}$ | $R_{B7}$ | $R_{B10}$ | $R_{B1}$ | $R_{B1}$ |
| $L_{A4855}$ | $R_{B7}$ | $R_{B10}$ | $R_{B3}$ | $R_{B1}$ |
| $L_{A4856}$ | $R_{B7}$ | $R_{B10}$ | $R_{B4}$ | $R_{B1}$ |
| $L_{A4857}$ | $R_{B7}$ | $R_{B10}$ | $R_{B7}$ | $R_{B1}$ |
| $L_{A4858}$ | $R_{B7}$ | $R_{B10}$ | $R_{A3}$ | $R_{B1}$ |
| $L_{A4859}$ | $R_{B7}$ | $R_{B10}$ | $R_{A34}$ | $R_{B1}$ |
| $L_{A4860}$ | $R_{B7}$ | $R_{A3}$ | $R_{B1}$ | $R_{B1}$ |
| $L_{A4861}$ | $R_{B7}$ | $R_{A3}$ | $R_{B3}$ | $R_{B1}$ |

-continued

| Ligand | $R^1$ | $R^4$ | $R^5$ | $R^6$ |
|---|---|---|---|---|
| $L_{A4862}$ | $R_{B7}$ | $R_{A3}$ | $R_{B4}$ | $R_{B1}$ |
| $L_{A4863}$ | $R_{B7}$ | $R_{A3}$ | $R_{B7}$ | $R_{B1}$ |
| $L_{A4864}$ | $R_{B7}$ | $R_{A3}$ | $R_{B10}$ | $R_{B1}$ |
| $L_{A4865}$ | $R_{B7}$ | $R_{A3}$ | $R_{A34}$ | $R_{B1}$ |
| $L_{A4866}$ | $R_{B7}$ | $R_{A34}$ | $R_{B1}$ | $R_{B1}$ |
| $L_{A4867}$ | $R_{B7}$ | $R_{A34}$ | $R_{B3}$ | $R_{B1}$ |
| $L_{A4868}$ | $R_{B7}$ | $R_{A34}$ | $R_{B4}$ | $R_{B1}$ |
| $L_{A4869}$ | $R_{B7}$ | $R_{A34}$ | $R_{B7}$ | $R_{B1}$ |
| $L_{A4870}$ | $R_{B7}$ | $R_{A34}$ | $R_{B10}$ | $R_{B1}$ |
| $L_{A4871}$ | $R_{B7}$ | $R_{A34}$ | $R_{A3}$ | $R_{B1}$ |
| $L_{A4872}$ | $R_{B9}$ | H | H | $R_{B1}$ |
| $L_{A4873}$ | $R_{B9}$ | $R_{B1}$ | H | $R_{B1}$ |
| $L_{A4874}$ | $R_{B9}$ | $R_{B3}$ | H | $R_{B1}$ |
| $L_{A4875}$ | $R_{B9}$ | $R_{B4}$ | H | $R_{B1}$ |
| $L_{A4876}$ | $R_{B9}$ | $R_{B7}$ | H | $R_{B1}$ |
| $L_{A4877}$ | $R_{B9}$ | $R_{B10}$ | H | $R_{B1}$ |
| $L_{A4878}$ | $R_{B9}$ | $R_{A3}$ | H | $R_{B1}$ |
| $L_{A4879}$ | $R_{B9}$ | $R_{A34}$ | H | $R_{B1}$ |
| $L_{A4880}$ | $R_{B9}$ | H | $R_{B1}$ | $R_{B1}$ |
| $L_{A4881}$ | $R_{B9}$ | H | $R_{B2}$ | $R_{B1}$ |
| $L_{A4882}$ | $R_{B9}$ | H | $R_{B3}$ | $R_{B1}$ |
| $L_{A4883}$ | $R_{B9}$ | H | $R_{B4}$ | $R_{B1}$ |
| $L_{A4884}$ | $R_{B9}$ | H | $R_{B7}$ | $R_{B1}$ |
| $L_{A4885}$ | $R_{B9}$ | H | $R_{B10}$ | $R_{B1}$ |
| $L_{A4886}$ | $R_{B9}$ | H | $R_{A3}$ | $R_{B1}$ |
| $L_{A4887}$ | $R_{B9}$ | H | $R_{A34}$ | $R_{B1}$ |
| $L_{A4888}$ | $R_{B9}$ | $R_{B1}$ | $R_{B1}$ | $R_{B1}$ |
| $L_{A4889}$ | $R_{B9}$ | $R_{B3}$ | $R_{B3}$ | $R_{B1}$ |
| $L_{A4890}$ | $R_{B9}$ | $R_{B4}$ | $R_{B4}$ | $R_{B1}$ |
| $L_{A4891}$ | $R_{B9}$ | $R_{B7}$ | $R_{B7}$ | $R_{B1}$ |
| $L_{A4892}$ | $R_{B9}$ | $R_{B10}$ | $R_{B10}$ | $R_{B1}$ |
| $L_{A4893}$ | $R_{B9}$ | $R_{A3}$ | $R_{A3}$ | $R_{B1}$ |
| $L_{A4894}$ | $R_{B9}$ | $R_{A34}$ | $R_{A34}$ | $R_{B1}$ |
| $L_{A4895}$ | $R_{B9}$ | $R_{B1}$ | $R_{B3}$ | $R_{B1}$ |
| $L_{A4896}$ | $R_{B9}$ | $R_{B1}$ | $R_{B4}$ | $R_{B1}$ |
| $L_{A4897}$ | $R_{B9}$ | $R_{B1}$ | $R_{B7}$ | $R_{B1}$ |
| $L_{A4898}$ | $R_{B9}$ | $R_{B1}$ | $R_{B10}$ | $R_{B1}$ |
| $L_{A4899}$ | $R_{B9}$ | $R_{B1}$ | $R_{A3}$ | $R_{B1}$ |
| $L_{A4900}$ | $R_{B9}$ | $R_{B1}$ | $R_{A34}$ | $R_{B1}$ |
| $L_{A4901}$ | $R_{B9}$ | $R_{B3}$ | $R_{B1}$ | $R_{B1}$ |
| $L_{A4902}$ | $R_{B9}$ | $R_{B3}$ | $R_{B4}$ | $R_{B1}$ |
| $L_{A4903}$ | $R_{B9}$ | $R_{B3}$ | $R_{B7}$ | $R_{B1}$ |
| $L_{A4904}$ | $R_{B9}$ | $R_{B3}$ | $R_{B10}$ | $R_{B1}$ |
| $L_{A4905}$ | $R_{B9}$ | $R_{B3}$ | $R_{A3}$ | $R_{B1}$ |
| $L_{A4906}$ | $R_{B9}$ | $R_{B3}$ | $R_{A34}$ | $R_{B1}$ |
| $L_{A4907}$ | $R_{B9}$ | $R_{B4}$ | $R_{B1}$ | $R_{B1}$ |
| $L_{A4908}$ | $R_{B9}$ | $R_{B4}$ | $R_{B3}$ | $R_{B1}$ |
| $L_{A4909}$ | $R_{B9}$ | $R_{B4}$ | $R_{B7}$ | $R_{B1}$ |
| $L_{A4910}$ | $R_{B9}$ | $R_{B4}$ | $R_{B10}$ | $R_{B1}$ |
| $L_{A4911}$ | $R_{B9}$ | $R_{B4}$ | $R_{A3}$ | $R_{B1}$ |
| $L_{A4912}$ | $R_{B9}$ | $R_{B4}$ | $R_{A34}$ | $R_{B1}$ |
| $L_{A4913}$ | $R_{B9}$ | $R_{B7}$ | $R_{B1}$ | $R_{B1}$ |
| $L_{A4914}$ | $R_{B9}$ | $R_{B7}$ | $R_{B3}$ | $R_{B1}$ |
| $L_{A4915}$ | $R_{B9}$ | $R_{B7}$ | $R_{B4}$ | $R_{B1}$ |
| $L_{A4916}$ | $R_{B9}$ | $R_{B7}$ | $R_{B10}$ | $R_{B1}$ |
| $L_{A4917}$ | $R_{B9}$ | $R_{B7}$ | $R_{A3}$ | $R_{B1}$ |
| $L_{A4918}$ | $R_{B9}$ | $R_{B7}$ | $R_{A34}$ | $R_{B1}$ |
| $L_{A4919}$ | $R_{B9}$ | $R_{B10}$ | $R_{B1}$ | $R_{B1}$ |
| $L_{A4920}$ | $R_{B9}$ | $R_{B10}$ | $R_{B3}$ | $R_{B1}$ |
| $L_{A4921}$ | $R_{B9}$ | $R_{B10}$ | $R_{B4}$ | $R_{B1}$ |
| $L_{A4922}$ | $R_{B9}$ | $R_{B10}$ | $R_{B7}$ | $R_{B1}$ |
| $L_{A4923}$ | $R_{B9}$ | $R_{B10}$ | $R_{A3}$ | $R_{B1}$ |
| $L_{A4924}$ | $R_{B9}$ | $R_{B10}$ | $R_{A34}$ | $R_{B1}$ |
| $L_{A4925}$ | $R_{B9}$ | $R_{A3}$ | $R_{B1}$ | $R_{B1}$ |
| $L_{A4926}$ | $R_{B9}$ | $R_{A3}$ | $R_{B3}$ | $R_{B1}$ |
| $L_{A4927}$ | $R_{B9}$ | $R_{A3}$ | $R_{B4}$ | $R_{B1}$ |
| $L_{A4928}$ | $R_{B9}$ | $R_{A3}$ | $R_{B7}$ | $R_{B1}$ |
| $L_{A4929}$ | $R_{B9}$ | $R_{A3}$ | $R_{B10}$ | $R_{B1}$ |
| $L_{A4930}$ | $R_{B9}$ | $R_{A3}$ | $R_{A34}$ | $R_{B1}$ |
| $L_{A4931}$ | $R_{B9}$ | $R_{A34}$ | $R_{B1}$ | $R_{B1}$ |
| $L_{A4932}$ | $R_{B9}$ | $R_{A34}$ | $R_{B3}$ | $R_{B1}$ |
| $L_{A4933}$ | $R_{B9}$ | $R_{A34}$ | $R_{B4}$ | $R_{B1}$ |
| $L_{A4934}$ | $R_{B9}$ | $R_{A34}$ | $R_{B7}$ | $R_{B1}$ |
| $L_{A4935}$ | $R_{B9}$ | $R_{A34}$ | $R_{B10}$ | $R_{B1}$ |
| $L_{A4936}$ | $R_{B9}$ | $R_{A34}$ | $R_{A3}$ | $R_{B1}$ |

$L_{A4937}$ through $L_{A4936}$ that are based on a structure of Formula XXI,

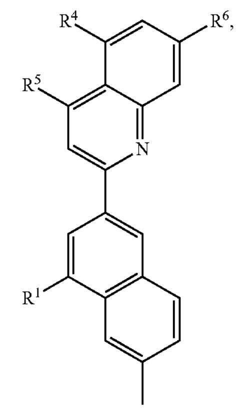

in which $R^1$, $R^4$, $R^5$, and $R^6$ are defined as provided below:

| Ligand | $R^1$ | $R^4$ | $R^5$ | $R^6$ |
|---|---|---|---|---|
| $L_{A4937}$ | $R_{B7}$ | H | H | H |
| $L_{A4938}$ | $R_{B7}$ | $R_{B1}$ | H | H |
| $L_{A4939}$ | $R_{B7}$ | $R_{B3}$ | H | H |
| $L_{A4940}$ | $R_{B7}$ | $R_{B4}$ | H | H |
| $L_{A4941}$ | $R_{B7}$ | $R_{B7}$ | H | H |
| $L_{A4942}$ | $R_{B7}$ | $R_{B10}$ | H | H |
| $L_{A4943}$ | $R_{B7}$ | $R_{A3}$ | H | H |
| $L_{A4944}$ | $R_{B7}$ | $R_{A34}$ | H | H |
| $L_{A4945}$ | $R_{B7}$ | H | $R_{B1}$ | H |
| $L_{A4946}$ | $R_{B7}$ | H | $R_{B2}$ | H |
| $L_{A4947}$ | $R_{B7}$ | H | $R_{B3}$ | H |
| $L_{A4948}$ | $R_{B7}$ | H | $R_{B4}$ | H |
| $L_{A4949}$ | $R_{B7}$ | H | $R_{B7}$ | H |
| $L_{A4950}$ | $R_{B7}$ | H | $R_{B10}$ | H |
| $L_{A4951}$ | $R_{B7}$ | H | $R_{A3}$ | H |
| $L_{A4952}$ | $R_{B7}$ | H | $R_{A34}$ | H |
| $L_{A4953}$ | $R_{B7}$ | $R_{B1}$ | $R_{B1}$ | H |
| $L_{A4954}$ | $R_{B7}$ | $R_{B3}$ | $R_{B3}$ | H |
| $L_{A4955}$ | $R_{B7}$ | $R_{B4}$ | $R_{B4}$ | H |
| $L_{A4956}$ | $R_{B7}$ | $R_{B7}$ | $R_{B7}$ | H |
| $L_{A4957}$ | $R_{B7}$ | $R_{B10}$ | $R_{B10}$ | H |
| $L_{A4958}$ | $R_{B7}$ | $R_{A3}$ | $R_{A3}$ | H |
| $L_{A4959}$ | $R_{B7}$ | $R_{A34}$ | $R_{A34}$ | H |
| $L_{A4960}$ | $R_{B7}$ | $R_{B1}$ | $R_{B3}$ | H |
| $L_{A4961}$ | $R_{B7}$ | $R_{B1}$ | $R_{B4}$ | H |
| $L_{A4962}$ | $R_{B7}$ | $R_{B1}$ | $R_{B7}$ | H |
| $L_{A4963}$ | $R_{B7}$ | $R_{B1}$ | $R_{B10}$ | H |
| $L_{A4964}$ | $R_{B7}$ | $R_{B1}$ | $R_{A3}$ | H |
| $L_{A4965}$ | $R_{B7}$ | $R_{B1}$ | $R_{A34}$ | H |
| $L_{A4966}$ | $R_{B7}$ | $R_{B3}$ | $R_{B1}$ | H |
| $L_{A4967}$ | $R_{B7}$ | $R_{B3}$ | $R_{B4}$ | H |
| $L_{A4968}$ | $R_{B7}$ | $R_{B3}$ | $R_{B7}$ | H |
| $L_{A4969}$ | $R_{B7}$ | $R_{B3}$ | $R_{B10}$ | H |
| $L_{A4970}$ | $R_{B7}$ | $R_{B3}$ | $R_{A3}$ | H |
| $L_{A4971}$ | $R_{B7}$ | $R_{B3}$ | $R_{A34}$ | H |
| $L_{A4972}$ | $R_{B7}$ | $R_{B4}$ | $R_{B1}$ | H |
| $L_{A4973}$ | $R_{B7}$ | $R_{B4}$ | $R_{B3}$ | H |
| $L_{A4974}$ | $R_{B7}$ | $R_{B4}$ | $R_{B7}$ | H |
| $L_{A4975}$ | $R_{B7}$ | $R_{B4}$ | $R_{B10}$ | H |
| $L_{A4976}$ | $R_{B7}$ | $R_{B4}$ | $R_{A3}$ | H |
| $L_{A4977}$ | $R_{B7}$ | $R_{B4}$ | $R_{A34}$ | H |
| $L_{A4978}$ | $R_{B7}$ | $R_{B7}$ | $R_{B1}$ | H |
| $L_{A4979}$ | $R_{B7}$ | $R_{B7}$ | $R_{B3}$ | H |
| $L_{A4980}$ | $R_{B7}$ | $R_{B7}$ | $R_{B4}$ | H |
| $L_{A4981}$ | $R_{B7}$ | $R_{B7}$ | $R_{B10}$ | H |
| $L_{A4982}$ | $R_{B7}$ | $R_{B7}$ | $R_{A3}$ | H |
| $L_{A4983}$ | $R_{B7}$ | $R_{B7}$ | $R_{A34}$ | H |
| $L_{A4984}$ | $R_{B7}$ | $R_{B10}$ | $R_{B1}$ | H |
| $L_{A4985}$ | $R_{B7}$ | $R_{B10}$ | $R_{B3}$ | H |
| $L_{A4986}$ | $R_{B7}$ | $R_{B10}$ | $R_{B4}$ | H |
| $L_{A4987}$ | $R_{B7}$ | $R_{B10}$ | $R_{B7}$ | H |

-continued

| Ligand | $R^1$ | $R^4$ | $R^5$ | $R^6$ |
|---|---|---|---|---|
| $L_{A44988}$ | $R_{B7}$ | $R_{B10}$ | $R_{A3}$ | H |
| $L_{A44989}$ | $R_{B7}$ | $R_{B10}$ | $R_{A34}$ | H |
| $L_{A44990}$ | $R_{B7}$ | $R_{A3}$ | $R_{B1}$ | H |
| $L_{A44991}$ | $R_{B7}$ | $R_{A3}$ | $R_{B3}$ | H |
| $L_{A44992}$ | $R_{B7}$ | $R_{A3}$ | $R_{B4}$ | H |
| $L_{A44993}$ | $R_{B7}$ | $R_{A3}$ | $R_{B7}$ | H |
| $L_{A44994}$ | $R_{B7}$ | $R_{A3}$ | $R_{B10}$ | H |
| $L_{A44995}$ | $R_{B7}$ | $R_{A3}$ | $R_{A34}$ | H |
| $L_{A44996}$ | $R_{B7}$ | $R_{A34}$ | $R_{B1}$ | H |
| $L_{A44997}$ | $R_{B7}$ | $R_{A34}$ | $R_{B3}$ | H |
| $L_{A44998}$ | $R_{B7}$ | $R_{A34}$ | $R_{B4}$ | H |
| $L_{A44999}$ | $R_{B7}$ | $R_{A34}$ | $R_{B7}$ | H |
| $L_{A45000}$ | $R_{B7}$ | $R_{A34}$ | $R_{B10}$ | H |
| $L_{A45001}$ | $R_{B7}$ | $R_{A34}$ | $R_{A3}$ | H |
| $L_{A45002}$ | $R_{B9}$ | H | H | H |
| $L_{A45003}$ | $R_{B9}$ | $R_{B1}$ | H | H |
| $L_{A45004}$ | $R_{B9}$ | $R_{B3}$ | H | H |
| $L_{A45005}$ | $R_{B9}$ | $R_{B4}$ | H | H |
| $L_{A45006}$ | $R_{B9}$ | $R_{B7}$ | H | H |
| $L_{A45007}$ | $R_{B9}$ | $R_{B10}$ | H | H |
| $L_{A45008}$ | $R_{B9}$ | $R_{A3}$ | H | H |
| $L_{A45009}$ | $R_{B9}$ | $R_{A34}$ | H | H |
| $L_{A45010}$ | $R_{B9}$ | H | $R_{B1}$ | H |
| $L_{A45011}$ | $R_{B9}$ | H | $R_{B2}$ | H |
| $L_{A45012}$ | $R_{B9}$ | H | $R_{B3}$ | H |
| $L_{A45013}$ | $R_{B9}$ | H | $R_{B4}$ | H |
| $L_{A45014}$ | $R_{B9}$ | H | $R_{B7}$ | H |
| $L_{A45015}$ | $R_{B9}$ | H | $R_{B10}$ | H |
| $L_{A45016}$ | $R_{B9}$ | H | $R_{A3}$ | H |
| $L_{A45017}$ | $R_{B9}$ | H | $R_{A34}$ | H |
| $L_{A45018}$ | $R_{B9}$ | $R_{B1}$ | $R_{B1}$ | H |
| $L_{A45019}$ | $R_{B9}$ | $R_{B3}$ | $R_{B3}$ | H |
| $L_{A45020}$ | $R_{B9}$ | $R_{B4}$ | $R_{B4}$ | H |
| $L_{A45021}$ | $R_{B9}$ | $R_{B7}$ | $R_{B7}$ | H |
| $L_{A45022}$ | $R_{B9}$ | $R_{B10}$ | $R_{B10}$ | H |
| $L_{A45023}$ | $R_{B9}$ | $R_{A3}$ | $R_{A3}$ | H |
| $L_{A45024}$ | $R_{B9}$ | $R_{A34}$ | $R_{A34}$ | H |
| $L_{A45025}$ | $R_{B9}$ | $R_{B1}$ | $R_{B3}$ | H |
| $L_{A45026}$ | $R_{B9}$ | $R_{B1}$ | $R_{B4}$ | H |
| $L_{A45027}$ | $R_{B9}$ | $R_{B1}$ | $R_{B7}$ | H |
| $L_{A45028}$ | $R_{B9}$ | $R_{B1}$ | $R_{B10}$ | H |
| $L_{A45029}$ | $R_{B9}$ | $R_{B1}$ | $R_{A3}$ | H |
| $L_{A45030}$ | $R_{B9}$ | $R_{B1}$ | $R_{A34}$ | H |
| $L_{A45031}$ | $R_{B9}$ | $R_{B3}$ | $R_{B1}$ | H |
| $L_{A45032}$ | $R_{B9}$ | $R_{B3}$ | $R_{B4}$ | H |
| $L_{A45033}$ | $R_{B9}$ | $R_{B3}$ | $R_{B7}$ | H |
| $L_{A45034}$ | $R_{B9}$ | $R_{B3}$ | $R_{B10}$ | H |
| $L_{A45035}$ | $R_{B9}$ | $R_{B3}$ | $R_{A3}$ | H |
| $L_{A45036}$ | $R_{B9}$ | $R_{B3}$ | $R_{A34}$ | H |
| $L_{A45037}$ | $R_{B9}$ | $R_{B4}$ | $R_{B1}$ | H |
| $L_{A45038}$ | $R_{B9}$ | $R_{B4}$ | $R_{B3}$ | H |
| $L_{A45039}$ | $R_{B9}$ | $R_{B4}$ | $R_{B7}$ | H |
| $L_{A45040}$ | $R_{B9}$ | $R_{B4}$ | $R_{B10}$ | H |
| $L_{A45041}$ | $R_{B9}$ | $R_{B4}$ | $R_{A3}$ | H |
| $L_{A45042}$ | $R_{B9}$ | $R_{B4}$ | $R_{A34}$ | H |
| $L_{A45043}$ | $R_{B9}$ | $R_{B7}$ | $R_{B1}$ | H |
| $L_{A45044}$ | $R_{B9}$ | $R_{B7}$ | $R_{B3}$ | H |
| $L_{A45045}$ | $R_{B9}$ | $R_{B7}$ | $R_{B4}$ | H |
| $L_{A45046}$ | $R_{B9}$ | $R_{B7}$ | $R_{B10}$ | H |
| $L_{A45047}$ | $R_{B9}$ | $R_{B7}$ | $R_{A3}$ | H |
| $L_{A45048}$ | $R_{B9}$ | $R_{B7}$ | $R_{A34}$ | H |
| $L_{A45049}$ | $R_{B9}$ | $R_{B10}$ | $R_{B1}$ | H |
| $L_{A45050}$ | $R_{B9}$ | $R_{B10}$ | $R_{B3}$ | H |
| $L_{A45051}$ | $R_{B9}$ | $R_{B10}$ | $R_{B4}$ | H |
| $L_{A45052}$ | $R_{B9}$ | $R_{B10}$ | $R_{B7}$ | H |
| $L_{A45053}$ | $R_{B9}$ | $R_{B10}$ | $R_{A3}$ | H |
| $L_{A45054}$ | $R_{B9}$ | $R_{B10}$ | $R_{A34}$ | H |
| $L_{A45055}$ | $R_{B9}$ | $R_{A3}$ | $R_{B1}$ | H |
| $L_{A45056}$ | $R_{B9}$ | $R_{A3}$ | $R_{B3}$ | H |
| $L_{A45057}$ | $R_{B9}$ | $R_{A3}$ | $R_{B4}$ | H |
| $L_{A45058}$ | $R_{B9}$ | $R_{A3}$ | $R_{B7}$ | H |
| $L_{A45059}$ | $R_{B9}$ | $R_{A3}$ | $R_{B10}$ | H |
| $L_{A45060}$ | $R_{B9}$ | $R_{A3}$ | $R_{A34}$ | H |
| $L_{A45061}$ | $R_{B9}$ | $R_{A34}$ | $R_{B1}$ | H |
| $L_{A45062}$ | $R_{B9}$ | $R_{A34}$ | $R_{B3}$ | H |
| $L_{A45063}$ | $R_{B9}$ | $R_{A34}$ | $R_{B4}$ | H |
| $L_{A45064}$ | $R_{B9}$ | $R_{A34}$ | $R_{B7}$ | H |

-continued

| Ligand | $R^1$ | $R^4$ | $R^5$ | $R^6$ |
|---|---|---|---|---|
| $L_{A45065}$ | $R_{B9}$ | $R_{A34}$ | $R_{B10}$ | H |
| $L_{A45066}$ | $R_{B9}$ | $R_{A34}$ | $R_{A3}$ | H |
| $L_{A45067}$ | $R_{B7}$ | H | H | $R_{B1}$ |
| $L_{A45068}$ | $R_{B7}$ | $R_{B1}$ | H | $R_{B1}$ |
| $L_{A45069}$ | $R_{B7}$ | $R_{B3}$ | H | $R_{B1}$ |
| $L_{A45070}$ | $R_{B7}$ | $R_{B4}$ | H | $R_{B1}$ |
| $L_{A45071}$ | $R_{B7}$ | $R_{B7}$ | H | $R_{B1}$ |
| $L_{A45072}$ | $R_{B7}$ | $R_{B10}$ | H | $R_{B1}$ |
| $L_{A45073}$ | $R_{B7}$ | $R_{A3}$ | H | $R_{B1}$ |
| $L_{A45074}$ | $R_{B7}$ | $R_{A34}$ | H | $R_{B1}$ |
| $L_{A45075}$ | $R_{B7}$ | H | $R_{B1}$ | $R_{B1}$ |
| $L_{A45076}$ | $R_{B7}$ | H | $R_{B2}$ | $R_{B1}$ |
| $L_{A45077}$ | $R_{B7}$ | H | $R_{B3}$ | $R_{B1}$ |
| $L_{A45078}$ | $R_{B7}$ | H | $R_{B4}$ | $R_{B1}$ |
| $L_{A45079}$ | $R_{B7}$ | H | $R_{B7}$ | $R_{B1}$ |
| $L_{A45080}$ | $R_{B7}$ | H | $R_{B10}$ | $R_{B1}$ |
| $L_{A45081}$ | $R_{B7}$ | H | $R_{A3}$ | $R_{B1}$ |
| $L_{A45082}$ | $R_{B7}$ | H | $R_{A34}$ | $R_{B1}$ |
| $L_{A45083}$ | $R_{B7}$ | $R_{B1}$ | $R_{B1}$ | $R_{B1}$ |
| $L_{A45084}$ | $R_{B7}$ | $R_{B3}$ | $R_{B3}$ | $R_{B1}$ |
| $L_{A45085}$ | $R_{B7}$ | $R_{B4}$ | $R_{B4}$ | $R_{B1}$ |
| $L_{A45086}$ | $R_{B7}$ | $R_{B7}$ | $R_{B7}$ | $R_{B1}$ |
| $L_{A45087}$ | $R_{B7}$ | $R_{B10}$ | $R_{B10}$ | $R_{B1}$ |
| $L_{A45088}$ | $R_{B7}$ | $R_{A3}$ | $R_{A3}$ | $R_{B1}$ |
| $L_{A45089}$ | $R_{B7}$ | $R_{A34}$ | $R_{A34}$ | $R_{B1}$ |
| $L_{A45090}$ | $R_{B7}$ | $R_{B1}$ | $R_{B3}$ | $R_{B1}$ |
| $L_{A45091}$ | $R_{B7}$ | $R_{B1}$ | $R_{B4}$ | $R_{B1}$ |
| $L_{A45092}$ | $R_{B7}$ | $R_{B1}$ | $R_{B7}$ | $R_{B1}$ |
| $L_{A45093}$ | $R_{B7}$ | $R_{B1}$ | $R_{B10}$ | $R_{B1}$ |
| $L_{A45094}$ | $R_{B7}$ | $R_{B1}$ | $R_{A3}$ | $R_{B1}$ |
| $L_{A45095}$ | $R_{B7}$ | $R_{B1}$ | $R_{A34}$ | $R_{B1}$ |
| $L_{A45096}$ | $R_{B7}$ | $R_{B3}$ | $R_{B1}$ | $R_{B1}$ |
| $L_{A45097}$ | $R_{B7}$ | $R_{B3}$ | $R_{B4}$ | $R_{B1}$ |
| $L_{A45098}$ | $R_{B7}$ | $R_{B3}$ | $R_{B7}$ | $R_{B1}$ |
| $L_{A45099}$ | $R_{B7}$ | $R_{B3}$ | $R_{B10}$ | $R_{B1}$ |
| $L_{A45100}$ | $R_{B7}$ | $R_{B3}$ | $R_{A3}$ | $R_{B1}$ |
| $L_{A45101}$ | $R_{B7}$ | $R_{B3}$ | $R_{A34}$ | $R_{B1}$ |
| $L_{A45102}$ | $R_{B7}$ | $R_{B4}$ | $R_{B1}$ | $R_{B1}$ |
| $L_{A45103}$ | $R_{B7}$ | $R_{B4}$ | $R_{B3}$ | $R_{B1}$ |
| $L_{A45104}$ | $R_{B7}$ | $R_{B4}$ | $R_{B7}$ | $R_{B1}$ |
| $L_{A45105}$ | $R_{B7}$ | $R_{B4}$ | $R_{B10}$ | $R_{B1}$ |
| $L_{A45106}$ | $R_{B7}$ | $R_{B4}$ | $R_{A3}$ | $R_{B1}$ |
| $L_{A45107}$ | $R_{B7}$ | $R_{B4}$ | $R_{A34}$ | $R_{B1}$ |
| $L_{A45108}$ | $R_{B7}$ | $R_{B7}$ | $R_{B1}$ | $R_{B1}$ |
| $L_{A45109}$ | $R_{B7}$ | $R_{B7}$ | $R_{B3}$ | $R_{B1}$ |
| $L_{A45110}$ | $R_{B7}$ | $R_{B7}$ | $R_{B4}$ | $R_{B1}$ |
| $L_{A45111}$ | $R_{B7}$ | $R_{B7}$ | $R_{B10}$ | $R_{B1}$ |
| $L_{A45112}$ | $R_{B7}$ | $R_{B7}$ | $R_{A3}$ | $R_{B1}$ |
| $L_{A45113}$ | $R_{B7}$ | $R_{B7}$ | $R_{A34}$ | $R_{B1}$ |
| $L_{A45114}$ | $R_{B7}$ | $R_{B10}$ | $R_{B1}$ | $R_{B1}$ |
| $L_{A45115}$ | $R_{B7}$ | $R_{B10}$ | $R_{B3}$ | $R_{B1}$ |
| $L_{A45116}$ | $R_{B7}$ | $R_{B10}$ | $R_{B4}$ | $R_{B1}$ |
| $L_{A45117}$ | $R_{B7}$ | $R_{B10}$ | $R_{B7}$ | $R_{B1}$ |
| $L_{A45118}$ | $R_{B7}$ | $R_{B10}$ | $R_{A3}$ | $R_{B1}$ |
| $L_{A45119}$ | $R_{B7}$ | $R_{B10}$ | $R_{A34}$ | $R_{B1}$ |
| $L_{A45120}$ | $R_{B7}$ | $R_{A3}$ | $R_{B1}$ | $R_{B1}$ |
| $L_{A45121}$ | $R_{B7}$ | $R_{A3}$ | $R_{B3}$ | $R_{B1}$ |
| $L_{A45122}$ | $R_{B7}$ | $R_{A3}$ | $R_{B4}$ | $R_{B1}$ |
| $L_{A45123}$ | $R_{B7}$ | $R_{A3}$ | $R_{B7}$ | $R_{B1}$ |
| $L_{A45124}$ | $R_{B7}$ | $R_{A3}$ | $R_{B10}$ | $R_{B1}$ |
| $L_{A45125}$ | $R_{B7}$ | $R_{A3}$ | $R_{A34}$ | $R_{B1}$ |
| $L_{A45126}$ | $R_{B7}$ | $R_{A34}$ | $R_{B1}$ | $R_{B1}$ |
| $L_{A45127}$ | $R_{B7}$ | $R_{A34}$ | $R_{B3}$ | $R_{B1}$ |
| $L_{A45128}$ | $R_{B7}$ | $R_{A34}$ | $R_{B4}$ | $R_{B1}$ |
| $L_{A45129}$ | $R_{B7}$ | $R_{A34}$ | $R_{B7}$ | $R_{B1}$ |
| $L_{A45130}$ | $R_{B7}$ | $R_{A34}$ | $R_{B10}$ | $R_{B1}$ |
| $L_{A45131}$ | $R_{B7}$ | $R_{A34}$ | $R_{A3}$ | $R_{B1}$ |
| $L_{A45132}$ | $R_{B9}$ | H | H | $R_{B1}$ |
| $L_{A45133}$ | $R_{B9}$ | $R_{B1}$ | H | $R_{B1}$ |
| $L_{A45134}$ | $R_{B9}$ | $R_{B3}$ | H | $R_{B1}$ |
| $L_{A45135}$ | $R_{B9}$ | $R_{B4}$ | H | $R_{B1}$ |
| $L_{A45136}$ | $R_{B9}$ | $R_{B7}$ | H | $R_{B1}$ |
| $L_{A45137}$ | $R_{B9}$ | $R_{B10}$ | H | $R_{B1}$ |
| $L_{A45138}$ | $R_{B9}$ | $R_{A3}$ | H | $R_{B1}$ |
| $L_{A45139}$ | $R_{B9}$ | $R_{A34}$ | H | $R_{B1}$ |
| $L_{A45140}$ | $R_{B9}$ | H | $R_{B1}$ | $R_{B1}$ |
| $L_{A45141}$ | $R_{B9}$ | H | $R_{B2}$ | $R_{B1}$ |

-continued

| Ligand | $R^1$ | $R^4$ | $R^5$ | $R^6$ |
|---|---|---|---|---|
| $L_{A5142}$ | $R_{B9}$ | H | $R_{B3}$ | $R_{B1}$ |
| $L_{A5143}$ | $R_{B9}$ | H | $R_{B4}$ | $R_{B1}$ |
| $L_{A5144}$ | $R_{B9}$ | H | $R_{B7}$ | $R_{B1}$ |
| $L_{A5145}$ | $R_{B9}$ | H | $R_{B10}$ | $R_{B1}$ |
| $L_{A5146}$ | $R_{B9}$ | H | $R_{A3}$ | $R_{B1}$ |
| $L_{A5147}$ | $R_{B9}$ | H | $R_{A34}$ | $R_{B1}$ |
| $L_{A5148}$ | $R_{B9}$ | $R_{B1}$ | $R_{B1}$ | $R_{B1}$ |
| $L_{A5149}$ | $R_{B9}$ | $R_{B3}$ | $R_{B3}$ | $R_{B1}$ |
| $L_{A5150}$ | $R_{B9}$ | $R_{B4}$ | $R_{B4}$ | $R_{B1}$ |
| $L_{A5151}$ | $R_{B9}$ | $R_{B7}$ | $R_{B7}$ | $R_{B1}$ |
| $L_{A5152}$ | $R_{B9}$ | $R_{B10}$ | $R_{B10}$ | $R_{B1}$ |
| $L_{A5133}$ | $R_{B9}$ | $R_{A3}$ | $R_{A3}$ | $R_{B1}$ |
| $L_{A5154}$ | $R_{B9}$ | $R_{A34}$ | $R_{A34}$ | $R_{B1}$ |
| $L_{A5155}$ | $R_{B9}$ | $R_{B1}$ | $R_{B3}$ | $R_{B1}$ |
| $L_{A5156}$ | $R_{B9}$ | $R_{B1}$ | $R_{B4}$ | $R_{B1}$ |
| $L_{A5157}$ | $R_{B9}$ | $R_{B1}$ | $R_{B7}$ | $R_{B1}$ |
| $L_{A5158}$ | $R_{B9}$ | $R_{B1}$ | $R_{B10}$ | $R_{B1}$ |
| $L_{A5159}$ | $R_{B9}$ | $R_{B1}$ | $R_{A3}$ | $R_{B1}$ |
| $L_{A5160}$ | $R_{B9}$ | $R_{B1}$ | $R_{A34}$ | $R_{B1}$ |
| $L_{A5161}$ | $R_{B9}$ | $R_{B3}$ | $R_{B1}$ | $R_{B1}$ |
| $L_{A5162}$ | $R_{B9}$ | $R_{B3}$ | $R_{B4}$ | $R_{B1}$ |
| $L_{A5163}$ | $R_{B9}$ | $R_{B3}$ | $R_{B7}$ | $R_{B1}$ |
| $L_{A5164}$ | $R_{B9}$ | $R_{B3}$ | $R_{B10}$ | $R_{B1}$ |
| $L_{A5165}$ | $R_{B9}$ | $R_{B3}$ | $R_{A3}$ | $R_{B1}$ |
| $L_{A5166}$ | $R_{B9}$ | $R_{B3}$ | $R_{A34}$ | $R_{B1}$ |
| $L_{A5167}$ | $R_{B9}$ | $R_{B4}$ | $R_{B1}$ | $R_{B1}$ |
| $L_{A5168}$ | $R_{B9}$ | $R_{B4}$ | $R_{B3}$ | $R_{B1}$ |
| $L_{A5169}$ | $R_{B9}$ | $R_{B4}$ | $R_{B7}$ | $R_{B1}$ |
| $L_{A5170}$ | $R_{B9}$ | $R_{B4}$ | $R_{B10}$ | $R_{B1}$ |
| $L_{A5171}$ | $R_{B9}$ | $R_{B4}$ | $R_{A3}$ | $R_{B1}$ |
| $L_{A5172}$ | $R_{B9}$ | $R_{B4}$ | $R_{A34}$ | $R_{B1}$ |
| $L_{A5173}$ | $R_{B9}$ | $R_{B7}$ | $R_{B1}$ | $R_{B1}$ |
| $L_{A5174}$ | $R_{B9}$ | $R_{B7}$ | $R_{B3}$ | $R_{B1}$ |
| $L_{A5175}$ | $R_{B9}$ | $R_{B7}$ | $R_{B4}$ | $R_{B1}$ |
| $L_{A5176}$ | $R_{B9}$ | $R_{B7}$ | $R_{B10}$ | $R_{B1}$ |
| $L_{A5177}$ | $R_{B9}$ | $R_{B7}$ | $R_{A3}$ | $R_{B1}$ |
| $L_{A5178}$ | $R_{B9}$ | $R_{B7}$ | $R_{A34}$ | $R_{B1}$ |
| $L_{A5179}$ | $R_{B9}$ | $R_{B10}$ | $R_{B1}$ | $R_{B1}$ |
| $L_{A5180}$ | $R_{B9}$ | $R_{B10}$ | $R_{B3}$ | $R_{B1}$ |
| $L_{A5181}$ | $R_{B9}$ | $R_{B10}$ | $R_{B4}$ | $R_{B1}$ |
| $L_{A5182}$ | $R_{B9}$ | $R_{B10}$ | $R_{B7}$ | $R_{B1}$ |
| $L_{A5183}$ | $R_{B9}$ | $R_{B10}$ | $R_{A3}$ | $R_{B1}$ |
| $L_{A5184}$ | $R_{B9}$ | $R_{B10}$ | $R_{A34}$ | $R_{B1}$ |
| $L_{A5185}$ | $R_{B9}$ | $R_{A3}$ | $R_{B1}$ | $R_{B1}$ |
| $L_{A5186}$ | $R_{B9}$ | $R_{A3}$ | $R_{B3}$ | $R_{B1}$ |
| $L_{A5187}$ | $R_{B9}$ | $R_{A3}$ | $R_{B4}$ | $R_{B1}$ |
| $L_{A5188}$ | $R_{B9}$ | $R_{A3}$ | $R_{B7}$ | $R_{B1}$ |
| $L_{A5189}$ | $R_{B9}$ | $R_{A3}$ | $R_{B10}$ | $R_{B1}$ |
| $L_{A5190}$ | $R_{B9}$ | $R_{A3}$ | $R_{A34}$ | $R_{B1}$ |
| $L_{A5191}$ | $R_{B9}$ | $R_{A34}$ | $R_{B1}$ | $R_{B1}$ |
| $L_{A5192}$ | $R_{B9}$ | $R_{A34}$ | $R_{B3}$ | $R_{B1}$ |
| $L_{A5193}$ | $R_{B9}$ | $R_{A34}$ | $R_{B4}$ | $R_{B1}$ |
| $L_{A5194}$ | $R_{B9}$ | $R_{A34}$ | $R_{B7}$ | $R_{B1}$ |
| $L_{A5195}$ | $R_{B9}$ | $R_{A34}$ | $R_{B10}$ | $R_{B1}$ |
| $L_{A5196}$ | $R_{B9}$ | $R_{A34}$ | $R_{A3}$ | $R_{B1}$ |

$L_{A5197}$ through $L_{A5456}$ that are based on a structure of Formula XXII,

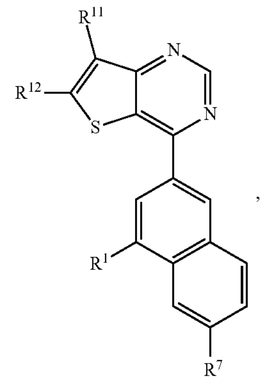

, in which $R^1$, $R^7$, $R^{11}$, and $R^{12}$ are defined as provided below:

| Ligand | $R^1$ | $R^{11}$ | $R^{12}$ | $R^7$ |
|---|---|---|---|---|
| $L_{A5197}$ | $R_{B7}$ | H | H | H |
| $L_{A5198}$ | $R_{B7}$ | $R_{B1}$ | H | H |
| $L_{A5199}$ | $R_{B7}$ | $R_{B3}$ | H | H |
| $L_{A5200}$ | $R_{B7}$ | $R_{B4}$ | H | H |
| $L_{A5201}$ | $R_{B7}$ | $R_{B7}$ | H | H |
| $L_{A5202}$ | $R_{B7}$ | $R_{B10}$ | H | H |
| $L_{A5203}$ | $R_{B7}$ | $R_{A3}$ | H | H |
| $L_{A5204}$ | $R_{B7}$ | $R_{A34}$ | H | H |
| $L_{A5205}$ | $R_{B7}$ | H | $R_{B1}$ | H |
| $L_{A5206}$ | $R_{B7}$ | H | $R_{B2}$ | H |
| $L_{A5207}$ | $R_{B7}$ | H | $R_{B3}$ | H |
| $L_{A5208}$ | $R_{B7}$ | H | $R_{B4}$ | H |
| $L_{A5209}$ | $R_{B7}$ | H | $R_{B7}$ | H |
| $L_{A5210}$ | $R_{B7}$ | H | $R_{B10}$ | H |
| $L_{A5211}$ | $R_{B7}$ | H | $R_{A3}$ | H |
| $L_{A5212}$ | $R_{B7}$ | H | $R_{A34}$ | H |
| $L_{A5213}$ | $R_{B7}$ | $R_{B1}$ | $R_{B1}$ | H |
| $L_{A5214}$ | $R_{B7}$ | $R_{B3}$ | $R_{B3}$ | H |
| $L_{A5215}$ | $R_{B7}$ | $R_{B4}$ | $R_{B4}$ | H |
| $L_{A5216}$ | $R_{B7}$ | $R_{B7}$ | $R_{B7}$ | H |
| $L_{A5217}$ | $R_{B7}$ | $R_{B10}$ | $R_{B10}$ | H |
| $L_{A5218}$ | $R_{B7}$ | $R_{A3}$ | $R_{A3}$ | H |
| $L_{A5219}$ | $R_{B7}$ | $R_{A34}$ | $R_{A34}$ | H |
| $L_{A5220}$ | $R_{B7}$ | $R_{B1}$ | $R_{B3}$ | H |
| $L_{A5221}$ | $R_{B7}$ | $R_{B1}$ | $R_{B4}$ | H |
| $L_{A5222}$ | $R_{B7}$ | $R_{B1}$ | $R_{B7}$ | H |
| $L_{A5223}$ | $R_{B7}$ | $R_{B1}$ | $R_{B10}$ | H |
| $L_{A5224}$ | $R_{B7}$ | $R_{B1}$ | $R_{A3}$ | H |
| $L_{A5225}$ | $R_{B7}$ | $R_{B1}$ | $R_{A34}$ | H |
| $L_{A5226}$ | $R_{B7}$ | $R_{B3}$ | $R_{B1}$ | H |
| $L_{A5227}$ | $R_{B7}$ | $R_{B3}$ | $R_{B4}$ | H |
| $L_{A5228}$ | $R_{B7}$ | $R_{B3}$ | $R_{B7}$ | H |
| $L_{A5229}$ | $R_{B7}$ | $R_{B3}$ | $R_{B10}$ | H |
| $L_{A5230}$ | $R_{B7}$ | $R_{B3}$ | $R_{A3}$ | H |
| $L_{A5231}$ | $R_{B7}$ | $R_{B3}$ | $R_{A34}$ | H |
| $L_{A5232}$ | $R_{B7}$ | $R_{B4}$ | $R_{B1}$ | H |
| $L_{A5233}$ | $R_{B7}$ | $R_{B4}$ | $R_{B3}$ | H |
| $L_{A5234}$ | $R_{B7}$ | $R_{B4}$ | $R_{B7}$ | H |
| $L_{A5235}$ | $R_{B7}$ | $R_{B4}$ | $R_{B10}$ | H |
| $L_{A5236}$ | $R_{B7}$ | $R_{B4}$ | $R_{A3}$ | H |
| $L_{A5237}$ | $R_{B7}$ | $R_{B4}$ | $R_{A34}$ | H |
| $L_{A5238}$ | $R_{B7}$ | $R_{B7}$ | $R_{B1}$ | H |
| $L_{A5239}$ | $R_{B7}$ | $R_{B7}$ | $R_{B3}$ | H |
| $L_{A5240}$ | $R_{B7}$ | $R_{B7}$ | $R_{B4}$ | H |
| $L_{A5241}$ | $R_{B7}$ | $R_{B7}$ | $R_{B10}$ | H |
| $L_{A5242}$ | $R_{B7}$ | $R_{B7}$ | $R_{A3}$ | H |
| $L_{A5243}$ | $R_{B7}$ | $R_{B7}$ | $R_{A34}$ | H |
| $L_{A5244}$ | $R_{B7}$ | $R_{B10}$ | $R_{B1}$ | H |
| $L_{A5245}$ | $R_{B7}$ | $R_{B10}$ | $R_{B3}$ | H |
| $L_{A5246}$ | $R_{B7}$ | $R_{B10}$ | $R_{B4}$ | H |
| $L_{A5247}$ | $R_{B7}$ | $R_{B10}$ | $R_{B7}$ | H |
| $L_{A5248}$ | $R_{B7}$ | $R_{B10}$ | $R_{A3}$ | H |

-continued

| Ligand | $R^1$ | $R^{11}$ | $R^{12}$ | $R^7$ |
|---|---|---|---|---|
| $L_{A5249}$ | $R_{B7}$ | $R_{B10}$ | $R_{A34}$ | H |
| $L_{A5250}$ | $R_{B7}$ | $R_{A3}$ | $R_{B1}$ | H |
| $L_{A5251}$ | $R_{B7}$ | $R_{A3}$ | $R_{B3}$ | H |
| $L_{A5252}$ | $R_{B7}$ | $R_{A3}$ | $R_{B4}$ | H |
| $L_{A5253}$ | $R_{B7}$ | $R_{A3}$ | $R_{B7}$ | H |
| $L_{A5254}$ | $R_{B7}$ | $R_{A3}$ | $R_{B10}$ | H |
| $L_{A5255}$ | $R_{B7}$ | $R_{A3}$ | $R_{A34}$ | H |
| $L_{A5256}$ | $R_{B7}$ | $R_{A34}$ | $R_{B1}$ | H |
| $L_{A5257}$ | $R_{B7}$ | $R_{A34}$ | $R_{B3}$ | H |
| $L_{A5258}$ | $R_{B7}$ | $R_{A34}$ | $R_{B4}$ | H |
| $L_{A5259}$ | $R_{B7}$ | $R_{A34}$ | $R_{B7}$ | H |
| $L_{A5260}$ | $R_{B7}$ | $R_{A34}$ | $R_{B10}$ | H |
| $L_{A5261}$ | $R_{B7}$ | $R_{A34}$ | $R_{A3}$ | H |
| $L_{A5262}$ | $R_{B9}$ | H | H | H |
| $L_{A5263}$ | $R_{B9}$ | $R_{B1}$ | H | H |
| $L_{A5264}$ | $R_{B9}$ | $R_{B3}$ | H | H |
| $L_{A5265}$ | $R_{B9}$ | $R_{B4}$ | H | H |
| $L_{A5266}$ | $R_{B9}$ | $R_{B7}$ | H | H |
| $L_{A5267}$ | $R_{B9}$ | $R_{B10}$ | H | H |
| $L_{A5268}$ | $R_{B9}$ | $R_{A3}$ | H | H |
| $L_{A5269}$ | $R_{B9}$ | $R_{A34}$ | H | H |
| $L_{A5270}$ | $R_{B9}$ | H | $R_{B1}$ | H |
| $L_{A5271}$ | $R_{B9}$ | H | $R_{B2}$ | H |
| $L_{A5272}$ | $R_{B9}$ | H | $R_{B3}$ | H |
| $L_{A5273}$ | $R_{B9}$ | H | $R_{B4}$ | H |
| $L_{A5274}$ | $R_{B9}$ | H | $R_{B7}$ | H |
| $L_{A5275}$ | $R_{B9}$ | H | $R_{B10}$ | H |
| $L_{A5276}$ | $R_{B9}$ | H | $R_{A3}$ | H |
| $L_{A5277}$ | $R_{B9}$ | H | $R_{A34}$ | H |
| $L_{A5278}$ | $R_{B9}$ | $R_{B1}$ | $R_{B1}$ | H |
| $L_{A5279}$ | $R_{B9}$ | $R_{B3}$ | $R_{B3}$ | H |
| $L_{A5280}$ | $R_{B9}$ | $R_{B4}$ | $R_{B4}$ | H |
| $L_{A5281}$ | $R_{B9}$ | $R_{B7}$ | $R_{B7}$ | H |
| $L_{A5282}$ | $R_{B9}$ | $R_{B10}$ | $R_{B10}$ | H |
| $L_{A5283}$ | $R_{B9}$ | $R_{A3}$ | $R_{A3}$ | H |
| $L_{A5284}$ | $R_{B9}$ | $R_{A34}$ | $R_{A34}$ | H |
| $L_{A5285}$ | $R_{B9}$ | $R_{B1}$ | $R_{B3}$ | H |
| $L_{A5286}$ | $R_{B9}$ | $R_{B1}$ | $R_{B4}$ | H |
| $L_{A5287}$ | $R_{B9}$ | $R_{B1}$ | $R_{B7}$ | H |
| $L_{A5288}$ | $R_{B9}$ | $R_{B1}$ | $R_{B10}$ | H |
| $L_{A5289}$ | $R_{B9}$ | $R_{B1}$ | $R_{A3}$ | H |
| $L_{A5290}$ | $R_{B9}$ | $R_{B1}$ | $R_{A34}$ | H |
| $L_{A5291}$ | $R_{B9}$ | $R_{B3}$ | $R_{B1}$ | H |
| $L_{A5292}$ | $R_{B9}$ | $R_{B3}$ | $R_{B4}$ | H |
| $L_{A5293}$ | $R_{B9}$ | $R_{B3}$ | $R_{B7}$ | H |
| $L_{A5294}$ | $R_{B9}$ | $R_{B3}$ | $R_{B10}$ | H |
| $L_{A5295}$ | $R_{B9}$ | $R_{B3}$ | $R_{A3}$ | H |
| $L_{A5296}$ | $R_{B9}$ | $R_{B3}$ | $R_{A34}$ | H |
| $L_{A5297}$ | $R_{B9}$ | $R_{B4}$ | $R_{B1}$ | H |
| $L_{A5298}$ | $R_{B9}$ | $R_{B4}$ | $R_{B3}$ | H |
| $L_{A5299}$ | $R_{B9}$ | $R_{B4}$ | $R_{B7}$ | H |
| $L_{A5300}$ | $R_{B9}$ | $R_{B4}$ | $R_{B10}$ | H |
| $L_{A5301}$ | $R_{B9}$ | $R_{B4}$ | $R_{A3}$ | H |
| $L_{A5302}$ | $R_{B9}$ | $R_{B4}$ | $R_{A34}$ | H |
| $L_{A5303}$ | $R_{B9}$ | $R_{B7}$ | $R_{B1}$ | H |
| $L_{A5304}$ | $R_{B9}$ | $R_{B7}$ | $R_{B3}$ | H |
| $L_{A5305}$ | $R_{B9}$ | $R_{B7}$ | $R_{B4}$ | H |
| $L_{A5306}$ | $R_{B9}$ | $R_{B7}$ | $R_{B10}$ | H |
| $L_{A5307}$ | $R_{B9}$ | $R_{B7}$ | $R_{A3}$ | H |
| $L_{A5308}$ | $R_{B9}$ | $R_{B7}$ | $R_{A34}$ | H |
| $L_{A5309}$ | $R_{B9}$ | $R_{B10}$ | $R_{B1}$ | H |
| $L_{A5310}$ | $R_{B9}$ | $R_{B10}$ | $R_{B3}$ | H |
| $L_{A5311}$ | $R_{B9}$ | $R_{B10}$ | $R_{B4}$ | H |
| $L_{A5312}$ | $R_{B9}$ | $R_{B10}$ | $R_{B7}$ | H |
| $L_{A5313}$ | $R_{B9}$ | $R_{B10}$ | $R_{A3}$ | H |
| $L_{A5314}$ | $R_{B9}$ | $R_{B10}$ | $R_{A34}$ | H |
| $L_{A5315}$ | $R_{B9}$ | $R_{A3}$ | $R_{B1}$ | H |
| $L_{A5316}$ | $R_{B9}$ | $R_{A3}$ | $R_{B3}$ | H |
| $L_{A5317}$ | $R_{B9}$ | $R_{A3}$ | $R_{B4}$ | H |
| $L_{A5318}$ | $R_{B9}$ | $R_{A3}$ | $R_{B7}$ | H |
| $L_{A5319}$ | $R_{B9}$ | $R_{A3}$ | $R_{B10}$ | H |
| $L_{A5320}$ | $R_{B9}$ | $R_{A3}$ | $R_{A34}$ | H |
| $L_{A5321}$ | $R_{B9}$ | $R_{A34}$ | $R_{B1}$ | H |
| $L_{A5322}$ | $R_{B9}$ | $R_{A34}$ | $R_{B3}$ | H |
| $L_{A5323}$ | $R_{B9}$ | $R_{A34}$ | $R_{B4}$ | H |
| $L_{A5324}$ | $R_{B9}$ | $R_{A34}$ | $R_{B7}$ | H |
| $L_{A5325}$ | $R_{B9}$ | $R_{A34}$ | $R_{B10}$ | H |

-continued

| Ligand | $R^1$ | $R^{11}$ | $R^{12}$ | $R^7$ |
|---|---|---|---|---|
| $L_{A5326}$ | $R_{B9}$ | $R_{A34}$ | $R_{A3}$ | H |
| $L_{A5327}$ | $R_{B7}$ | H | H | F |
| $L_{A5328}$ | $R_{B7}$ | $R_{B1}$ | H | F |
| $L_{A5329}$ | $R_{B7}$ | $R_{B3}$ | H | F |
| $L_{A5330}$ | $R_{B7}$ | $R_{B4}$ | H | F |
| $L_{A5331}$ | $R_{B7}$ | $R_{B7}$ | H | F |
| $L_{A5332}$ | $R_{B7}$ | $R_{B10}$ | H | F |
| $L_{A5333}$ | $R_{B7}$ | $R_{A3}$ | H | F |
| $L_{A5334}$ | $R_{B7}$ | $R_{A34}$ | H | F |
| $L_{A5335}$ | $R_{B7}$ | H | $R_{B1}$ | F |
| $L_{A5336}$ | $R_{B7}$ | H | $R_{B2}$ | F |
| $L_{A5337}$ | $R_{B7}$ | H | $R_{B3}$ | F |
| $L_{A5338}$ | $R_{B7}$ | H | $R_{B4}$ | F |
| $L_{A5339}$ | $R_{B7}$ | H | $R_{B7}$ | F |
| $L_{A5340}$ | $R_{B7}$ | H | $R_{B10}$ | F |
| $L_{A5341}$ | $R_{B7}$ | H | $R_{A3}$ | F |
| $L_{A5342}$ | $R_{B7}$ | H | $R_{A34}$ | F |
| $L_{A5343}$ | $R_{B7}$ | $R_{B1}$ | $R_{B1}$ | F |
| $L_{A5344}$ | $R_{B7}$ | $R_{B3}$ | $R_{B3}$ | F |
| $L_{A5345}$ | $R_{B7}$ | $R_{B4}$ | $R_{B4}$ | F |
| $L_{A5346}$ | $R_{B7}$ | $R_{B7}$ | $R_{B7}$ | F |
| $L_{A5347}$ | $R_{B7}$ | $R_{B10}$ | $R_{B10}$ | F |
| $L_{A5348}$ | $R_{B7}$ | $R_{A3}$ | $R_{A3}$ | F |
| $L_{A5349}$ | $R_{B7}$ | $R_{A34}$ | $R_{A34}$ | F |
| $L_{A5350}$ | $R_{B7}$ | $R_{B1}$ | $R_{B3}$ | F |
| $L_{A5351}$ | $R_{B7}$ | $R_{B1}$ | $R_{B4}$ | F |
| $L_{A5352}$ | $R_{B7}$ | $R_{B1}$ | $R_{B7}$ | F |
| $L_{A5353}$ | $R_{B7}$ | $R_{B1}$ | $R_{B10}$ | F |
| $L_{A5354}$ | $R_{B7}$ | $R_{B1}$ | $R_{A3}$ | F |
| $L_{A5355}$ | $R_{B7}$ | $R_{B1}$ | $R_{A34}$ | F |
| $L_{A5356}$ | $R_{B7}$ | $R_{B3}$ | $R_{B1}$ | F |
| $L_{A5357}$ | $R_{B7}$ | $R_{B3}$ | $R_{B4}$ | F |
| $L_{A5358}$ | $R_{B7}$ | $R_{B3}$ | $R_{B7}$ | F |
| $L_{A5359}$ | $R_{B7}$ | $R_{B3}$ | $R_{B10}$ | F |
| $L_{A5360}$ | $R_{B7}$ | $R_{B3}$ | $R_{A3}$ | F |
| $L_{A5361}$ | $R_{B7}$ | $R_{B3}$ | $R_{A34}$ | F |
| $L_{A5362}$ | $R_{B7}$ | $R_{B4}$ | $R_{B1}$ | F |
| $L_{A5363}$ | $R_{B7}$ | $R_{B4}$ | $R_{B3}$ | F |
| $L_{A5364}$ | $R_{B7}$ | $R_{B4}$ | $R_{B7}$ | F |
| $L_{A5365}$ | $R_{B7}$ | $R_{B4}$ | $R_{B10}$ | F |
| $L_{A5366}$ | $R_{B7}$ | $R_{B4}$ | $R_{A3}$ | F |
| $L_{A5367}$ | $R_{B7}$ | $R_{B4}$ | $R_{A34}$ | F |
| $L_{A5368}$ | $R_{B7}$ | $R_{B7}$ | $R_{B1}$ | F |
| $L_{A5369}$ | $R_{B7}$ | $R_{B7}$ | $R_{B3}$ | F |
| $L_{A5370}$ | $R_{B7}$ | $R_{B7}$ | $R_{B4}$ | F |
| $L_{A5371}$ | $R_{B7}$ | $R_{B7}$ | $R_{B10}$ | F |
| $L_{A5372}$ | $R_{B7}$ | $R_{B7}$ | $R_{A3}$ | F |
| $L_{A5373}$ | $R_{B7}$ | $R_{B7}$ | $R_{A34}$ | F |
| $L_{A5374}$ | $R_{B7}$ | $R_{B10}$ | $R_{B1}$ | F |
| $L_{A5375}$ | $R_{B7}$ | $R_{B10}$ | $R_{B3}$ | F |
| $L_{A5376}$ | $R_{B7}$ | $R_{B10}$ | $R_{B4}$ | F |
| $L_{A5377}$ | $R_{B7}$ | $R_{B10}$ | $R_{B7}$ | F |
| $L_{A5378}$ | $R_{B7}$ | $R_{B10}$ | $R_{A3}$ | F |
| $L_{A5379}$ | $R_{B7}$ | $R_{B10}$ | $R_{A34}$ | F |
| $L_{A5380}$ | $R_{B7}$ | $R_{A3}$ | $R_{B1}$ | F |
| $L_{A5381}$ | $R_{B7}$ | $R_{A3}$ | $R_{B3}$ | F |
| $L_{A5382}$ | $R_{B7}$ | $R_{A3}$ | $R_{B4}$ | F |
| $L_{A5383}$ | $R_{B7}$ | $R_{A3}$ | $R_{B7}$ | F |
| $L_{A5384}$ | $R_{B7}$ | $R_{A3}$ | $R_{B10}$ | F |
| $L_{A5385}$ | $R_{B7}$ | $R_{A3}$ | $R_{A34}$ | F |
| $L_{A5386}$ | $R_{B7}$ | $R_{A34}$ | $R_{B1}$ | F |
| $L_{A5387}$ | $R_{B7}$ | $R_{A34}$ | $R_{B3}$ | F |
| $L_{A5388}$ | $R_{B7}$ | $R_{A34}$ | $R_{B4}$ | F |
| $L_{A5389}$ | $R_{B7}$ | $R_{A34}$ | $R_{B7}$ | F |
| $L_{A5390}$ | $R_{B7}$ | $R_{A34}$ | $R_{B10}$ | F |
| $L_{A5391}$ | $R_{B7}$ | $R_{A34}$ | $R_{A3}$ | F |
| $L_{A5392}$ | $R_{B9}$ | H | H | F |
| $L_{A5393}$ | $R_{B9}$ | $R_{B1}$ | H | F |
| $L_{A5394}$ | $R_{B9}$ | $R_{B3}$ | H | F |
| $L_{A5395}$ | $R_{B9}$ | $R_{B4}$ | H | F |
| $L_{A5396}$ | $R_{B9}$ | $R_{B7}$ | H | F |
| $L_{A5397}$ | $R_{B9}$ | $R_{B10}$ | H | F |
| $L_{A5398}$ | $R_{B9}$ | $R_{A3}$ | H | F |
| $L_{A5399}$ | $R_{B9}$ | $R_{A34}$ | H | F |
| $L_{A5400}$ | $R_{B9}$ | H | $R_{B1}$ | F |
| $L_{A5401}$ | $R_{B9}$ | H | $R_{B2}$ | F |
| $L_{A5402}$ | $R_{B9}$ | H | $R_{B3}$ | F |

-continued

| Ligand | $R^1$ | $R^{11}$ | $R^{12}$ | $R^7$ |
|---|---|---|---|---|
| $L_{A5403}$ | $R_{B9}$ | H | $R_{B4}$ | F |
| $L_{A5404}$ | $R_{B9}$ | H | $R_{B7}$ | F |
| $L_{A5405}$ | $R_{B9}$ | H | $R_{B10}$ | F |
| $L_{A5406}$ | $R_{B9}$ | H | $R_{A3}$ | F |
| $L_{A5407}$ | $R_{B9}$ | H | $R_{A34}$ | F |
| $L_{A5408}$ | $R_{B9}$ | $R_{B1}$ | $R_{B1}$ | F |
| $L_{A5409}$ | $R_{B9}$ | $R_{B3}$ | $R_{B3}$ | F |
| $L_{A5410}$ | $R_{B9}$ | $R_{B4}$ | $R_{B4}$ | F |
| $L_{A5411}$ | $R_{B9}$ | $R_{B7}$ | $R_{B7}$ | F |
| $L_{A5412}$ | $R_{B9}$ | $R_{B10}$ | $R_{B10}$ | F |
| $L_{A5413}$ | $R_{B9}$ | $R_{A3}$ | $R_{A3}$ | F |
| $L_{A5414}$ | $R_{B9}$ | $R_{A34}$ | $R_{A34}$ | F |
| $L_{A5415}$ | $R_{B9}$ | $R_{B1}$ | $R_{B3}$ | F |
| $L_{A5416}$ | $R_{B9}$ | $R_{B1}$ | $R_{B4}$ | F |
| $L_{A5417}$ | $R_{B9}$ | $R_{B1}$ | $R_{B7}$ | F |
| $L_{A5418}$ | $R_{B9}$ | $R_{B1}$ | $R_{B10}$ | F |
| $L_{A5419}$ | $R_{B9}$ | $R_{B1}$ | $R_{A3}$ | F |
| $L_{A5420}$ | $R_{B9}$ | $R_{B1}$ | $R_{A34}$ | F |
| $L_{A5421}$ | $R_{B9}$ | $R_{B3}$ | $R_{B1}$ | F |
| $L_{A5422}$ | $R_{B9}$ | $R_{B3}$ | $R_{B4}$ | F |
| $L_{A5423}$ | $R_{B9}$ | $R_{B3}$ | $R_{B7}$ | F |
| $L_{A5424}$ | $R_{B9}$ | $R_{B3}$ | $R_{B10}$ | F |
| $L_{A5425}$ | $R_{B9}$ | $R_{B3}$ | $R_{A3}$ | F |
| $L_{A5426}$ | $R_{B9}$ | $R_{B3}$ | $R_{A34}$ | F |
| $L_{A5427}$ | $R_{B9}$ | $R_{B4}$ | $R_{B1}$ | F |
| $L_{A5428}$ | $R_{B9}$ | $R_{B4}$ | $R_{B3}$ | F |
| $L_{A5429}$ | $R_{B9}$ | $R_{B4}$ | $R_{B7}$ | F |
| $L_{A5430}$ | $R_{B9}$ | $R_{B4}$ | $R_{B10}$ | F |
| $L_{A5431}$ | $R_{B9}$ | $R_{B4}$ | $R_{A3}$ | F |
| $L_{A5432}$ | $R_{B9}$ | $R_{B4}$ | $R_{A34}$ | F |
| $L_{A5433}$ | $R_{B9}$ | $R_{B7}$ | $R_{B1}$ | F |
| $L_{A5434}$ | $R_{B9}$ | $R_{B7}$ | $R_{B3}$ | F |
| $L_{A5435}$ | $R_{B9}$ | $R_{B7}$ | $R_{B4}$ | F |
| $L_{A5436}$ | $R_{B9}$ | $R_{B7}$ | $R_{B10}$ | F |
| $L_{A5437}$ | $R_{B9}$ | $R_{B7}$ | $R_{A3}$ | F |
| $L_{A5438}$ | $R_{B9}$ | $R_{B7}$ | $R_{A34}$ | F |
| $L_{A5439}$ | $R_{B9}$ | $R_{B10}$ | $R_{B1}$ | F |
| $L_{A5440}$ | $R_{B9}$ | $R_{B10}$ | $R_{B3}$ | F |
| $L_{A5441}$ | $R_{B9}$ | $R_{B10}$ | $R_{B4}$ | F |
| $L_{A5442}$ | $R_{B9}$ | $R_{B10}$ | $R_{B7}$ | F |
| $L_{A5443}$ | $R_{B9}$ | $R_{B10}$ | $R_{A3}$ | F |
| $L_{A5444}$ | $R_{B9}$ | $R_{B10}$ | $R_{A34}$ | F |
| $L_{A5445}$ | $R_{B9}$ | $R_{A3}$ | $R_{B1}$ | F |
| $L_{A5446}$ | $R_{B9}$ | $R_{A3}$ | $R_{B3}$ | F |
| $L_{A5447}$ | $R_{B9}$ | $R_{A3}$ | $R_{B4}$ | F |
| $L_{A5448}$ | $R_{B9}$ | $R_{A3}$ | $R_{B7}$ | F |
| $L_{A5449}$ | $R_{B9}$ | $R_{A3}$ | $R_{B10}$ | F |
| $L_{A5450}$ | $R_{B9}$ | $R_{A3}$ | $R_{A34}$ | F |
| $L_{A5451}$ | $R_{B9}$ | $R_{A34}$ | $R_{B1}$ | F |
| $L_{A5452}$ | $R_{B9}$ | $R_{A34}$ | $R_{B3}$ | F |
| $L_{A5453}$ | $R_{B9}$ | $R_{A34}$ | $R_{B4}$ | F |
| $L_{A5454}$ | $R_{B9}$ | $R_{A34}$ | $R_{B7}$ | F |
| $L_{A5455}$ | $R_{B9}$ | $R_{A34}$ | $R_{B10}$ | F |
| $L_{A5456}$ | $R_{B9}$ | $R_{A34}$ | $R_{A3}$ | F |

$L_{A5457}$ through $L_{A5716}$ that are based on a structure of Formula XXIII,

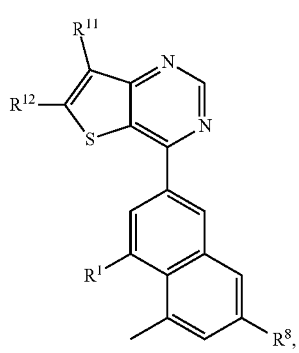

in which $R^1$, $R^8$, $R^{11}$, and $R^{12}$ are defined as provided below:

| Ligand | $R^1$ | $R^{11}$ | $R^{12}$ | $R^8$ |
|---|---|---|---|---|
| $L_{A5457}$ | $R_{B7}$ | H | H | H |
| $L_{A5458}$ | $R_{B7}$ | $R_{B1}$ | H | H |
| $L_{A5459}$ | $R_{B7}$ | $R_{B3}$ | H | H |
| $L_{A5460}$ | $R_{B7}$ | $R_{B4}$ | H | H |
| $L_{A5461}$ | $R_{B7}$ | $R_{B7}$ | H | H |
| $L_{A5462}$ | $R_{B7}$ | $R_{B10}$ | H | H |
| $L_{A5463}$ | $R_{B7}$ | $R_{A3}$ | H | H |
| $L_{A5464}$ | $R_{B7}$ | $R_{A34}$ | H | H |
| $L_{A5465}$ | $R_{B7}$ | H | $R_{B1}$ | H |
| $L_{A5466}$ | $R_{B7}$ | H | $R_{B2}$ | H |
| $L_{A5467}$ | $R_{B7}$ | H | $R_{B3}$ | H |
| $L_{A5468}$ | $R_{B7}$ | H | $R_{B4}$ | H |
| $L_{A5469}$ | $R_{B7}$ | H | $R_{B7}$ | H |
| $L_{A5470}$ | $R_{B7}$ | H | $R_{B10}$ | H |
| $L_{A5471}$ | $R_{B7}$ | H | $R_{A3}$ | H |
| $L_{A5472}$ | $R_{B7}$ | H | $R_{A34}$ | H |
| $L_{A5473}$ | $R_{B7}$ | $R_{B1}$ | $R_{B1}$ | H |
| $L_{A5474}$ | $R_{B7}$ | $R_{B3}$ | $R_{B3}$ | H |
| $L_{A5475}$ | $R_{B7}$ | $R_{B4}$ | $R_{B4}$ | H |
| $L_{A5476}$ | $R_{B7}$ | $R_{B7}$ | $R_{B7}$ | H |
| $L_{A5477}$ | $R_{B7}$ | $R_{B10}$ | $R_{B10}$ | H |
| $L_{A5478}$ | $R_{B7}$ | $R_{A3}$ | $R_{A3}$ | H |
| $L_{A5479}$ | $R_{B7}$ | $R_{A34}$ | $R_{A34}$ | H |
| $L_{A5480}$ | $R_{B7}$ | $R_{B1}$ | $R_{B3}$ | H |
| $L_{A5481}$ | $R_{B7}$ | $R_{B1}$ | $R_{B4}$ | H |
| $L_{A5482}$ | $R_{B7}$ | $R_{B1}$ | $R_{B7}$ | H |
| $L_{A5483}$ | $R_{B7}$ | $R_{B1}$ | $R_{B10}$ | H |
| $L_{A5484}$ | $R_{B7}$ | $R_{B1}$ | $R_{A3}$ | H |
| $L_{A5485}$ | $R_{B7}$ | $R_{B1}$ | $R_{A34}$ | H |
| $L_{A5486}$ | $R_{B7}$ | $R_{B3}$ | $R_{B1}$ | H |
| $L_{A5487}$ | $R_{B7}$ | $R_{B3}$ | $R_{B4}$ | H |
| $L_{A5488}$ | $R_{B7}$ | $R_{B3}$ | $R_{B7}$ | H |
| $L_{A5489}$ | $R_{B7}$ | $R_{B3}$ | $R_{B10}$ | H |
| $L_{A5490}$ | $R_{B7}$ | $R_{B3}$ | $R_{A3}$ | H |
| $L_{A5491}$ | $R_{B7}$ | $R_{B3}$ | $R_{A34}$ | H |
| $L_{A5492}$ | $R_{B7}$ | $R_{B4}$ | $R_{B1}$ | H |
| $L_{A5493}$ | $R_{B7}$ | $R_{B4}$ | $R_{B3}$ | H |
| $L_{A5494}$ | $R_{B7}$ | $R_{B4}$ | $R_{B7}$ | H |
| $L_{A5495}$ | $R_{B7}$ | $R_{B4}$ | $R_{B10}$ | H |
| $L_{A5496}$ | $R_{B7}$ | $R_{B4}$ | $R_{A3}$ | H |
| $L_{A5497}$ | $R_{B7}$ | $R_{B4}$ | $R_{A34}$ | H |
| $L_{A5498}$ | $R_{B7}$ | $R_{B7}$ | $R_{B1}$ | H |
| $L_{A5499}$ | $R_{B7}$ | $R_{B7}$ | $R_{B3}$ | H |
| $L_{A5500}$ | $R_{B7}$ | $R_{B7}$ | $R_{B4}$ | H |
| $L_{A5501}$ | $R_{B7}$ | $R_{B7}$ | $R_{B10}$ | H |
| $L_{A5502}$ | $R_{B7}$ | $R_{B7}$ | $R_{A3}$ | H |
| $L_{A5503}$ | $R_{B7}$ | $R_{B7}$ | $R_{A34}$ | H |
| $L_{A5504}$ | $R_{B7}$ | $R_{B10}$ | $R_{B1}$ | H |
| $L_{A5505}$ | $R_{B7}$ | $R_{B10}$ | $R_{B3}$ | H |
| $L_{A5506}$ | $R_{B7}$ | $R_{B10}$ | $R_{B4}$ | H |
| $L_{A5507}$ | $R_{B7}$ | $R_{B10}$ | $R_{B7}$ | H |
| $L_{A5508}$ | $R_{B7}$ | $R_{B10}$ | $R_{A3}$ | H |
| $L_{A5509}$ | $R_{B7}$ | $R_{B10}$ | $R_{A34}$ | H |
| $L_{A5510}$ | $R_{B7}$ | $R_{A3}$ | $R_{B1}$ | H |
| $L_{A5511}$ | $R_{B7}$ | $R_{A3}$ | $R_{B3}$ | H |
| $L_{A5512}$ | $R_{B7}$ | $R_{A3}$ | $R_{B4}$ | H |
| $L_{A5513}$ | $R_{B7}$ | $R_{A3}$ | $R_{B7}$ | H |
| $L_{A5514}$ | $R_{B7}$ | $R_{A3}$ | $R_{B10}$ | H |
| $L_{A5515}$ | $R_{B7}$ | $R_{A3}$ | $R_{A34}$ | H |
| $L_{A5516}$ | $R_{B7}$ | $R_{A34}$ | $R_{B1}$ | H |
| $L_{A5517}$ | $R_{B7}$ | $R_{A34}$ | $R_{B3}$ | H |
| $L_{A5518}$ | $R_{B7}$ | $R_{A34}$ | $R_{B4}$ | H |
| $L_{A5519}$ | $R_{B7}$ | $R_{A34}$ | $R_{B7}$ | H |
| $L_{A5520}$ | $R_{B7}$ | $R_{A34}$ | $R_{B10}$ | H |
| $L_{A5521}$ | $R_{B7}$ | $R_{A34}$ | $R_{A3}$ | H |
| $L_{A5522}$ | $R_{B9}$ | H | H | H |
| $L_{A5523}$ | $R_{B9}$ | $R_{B1}$ | H | H |
| $L_{A5524}$ | $R_{B9}$ | $R_{B3}$ | H | H |
| $L_{A5525}$ | $R_{B9}$ | $R_{B4}$ | H | H |
| $L_{A5526}$ | $R_{B9}$ | $R_{B7}$ | H | H |
| $L_{A5527}$ | $R_{B9}$ | $R_{B10}$ | H | H |
| $L_{A5528}$ | $R_{B9}$ | $R_{A3}$ | H | H |
| $L_{A5529}$ | $R_{B9}$ | $R_{A34}$ | H | H |
| $L_{A5530}$ | $R_{B9}$ | H | $R_{B1}$ | H |
| $L_{A5531}$ | $R_{B9}$ | H | $R_{B2}$ | H |
| $L_{A5532}$ | $R_{B9}$ | H | $R_{B3}$ | H |

-continued

| Ligand | $R^1$ | $R^{11}$ | $R^{12}$ | $R^8$ |
|---|---|---|---|---|
| $L_{A5533}$ | $R_{B9}$ | H | $R_{B4}$ | H |
| $L_{A5534}$ | $R_{B9}$ | H | $R_{B7}$ | H |
| $L_{A5535}$ | $R_{B9}$ | H | $R_{B10}$ | H |
| $L_{A5536}$ | $R_{B9}$ | H | $R_{A3}$ | H |
| $L_{A5537}$ | $R_{B9}$ | H | $R_{A34}$ | H |
| $L_{A5538}$ | $R_{B9}$ | $R_{B1}$ | $R_{B1}$ | H |
| $L_{A5539}$ | $R_{B9}$ | $R_{B3}$ | $R_{B3}$ | H |
| $L_{A5540}$ | $R_{B9}$ | $R_{B4}$ | $R_{B4}$ | H |
| $L_{A5541}$ | $R_{B9}$ | $R_{B7}$ | $R_{B7}$ | H |
| $L_{A5542}$ | $R_{B9}$ | $R_{B10}$ | $R_{B10}$ | H |
| $L_{A5543}$ | $R_{B9}$ | $R_{A3}$ | $R_{A3}$ | H |
| $L_{A5544}$ | $R_{B9}$ | $R_{A34}$ | $R_{A34}$ | H |
| $L_{A5545}$ | $R_{B9}$ | $R_{B1}$ | $R_{B3}$ | H |
| $L_{A5546}$ | $R_{B9}$ | $R_{B1}$ | $R_{B4}$ | H |
| $L_{A5547}$ | $R_{B9}$ | $R_{B1}$ | $R_{B7}$ | H |
| $L_{A5548}$ | $R_{B9}$ | $R_{B1}$ | $R_{B10}$ | H |
| $L_{A5549}$ | $R_{B9}$ | $R_{B1}$ | $R_{A3}$ | H |
| $L_{A5550}$ | $R_{B9}$ | $R_{B1}$ | $R_{A34}$ | H |
| $L_{A5551}$ | $R_{B9}$ | $R_{B3}$ | $R_{B1}$ | H |
| $L_{A5552}$ | $R_{B9}$ | $R_{B3}$ | $R_{B4}$ | H |
| $L_{A5553}$ | $R_{B9}$ | $R_{B3}$ | $R_{B7}$ | H |
| $L_{A5554}$ | $R_{B9}$ | $R_{B3}$ | $R_{B10}$ | H |
| $L_{A5555}$ | $R_{B9}$ | $R_{B3}$ | $R_{A3}$ | H |
| $L_{A5556}$ | $R_{B9}$ | $R_{B3}$ | $R_{A34}$ | H |
| $L_{A5557}$ | $R_{B9}$ | $R_{B4}$ | $R_{B1}$ | H |
| $L_{A5558}$ | $R_{B9}$ | $R_{B4}$ | $R_{B3}$ | H |
| $L_{A5559}$ | $R_{B9}$ | $R_{B4}$ | $R_{B7}$ | H |
| $L_{A5560}$ | $R_{B9}$ | $R_{B4}$ | $R_{B10}$ | H |
| $L_{A5561}$ | $R_{B9}$ | $R_{B4}$ | $R_{A3}$ | H |
| $L_{A5562}$ | $R_{B9}$ | $R_{B4}$ | $R_{A34}$ | H |
| $L_{A5563}$ | $R_{B9}$ | $R_{B7}$ | $R_{B1}$ | H |
| $L_{A5564}$ | $R_{B9}$ | $R_{B7}$ | $R_{B3}$ | H |
| $L_{A5565}$ | $R_{B9}$ | $R_{B7}$ | $R_{B4}$ | H |
| $L_{A5566}$ | $R_{B9}$ | $R_{B7}$ | $R_{B10}$ | H |
| $L_{A5567}$ | $R_{B9}$ | $R_{B7}$ | $R_{A3}$ | H |
| $L_{A5568}$ | $R_{B9}$ | $R_{B7}$ | $R_{A34}$ | H |
| $L_{A5569}$ | $R_{B9}$ | $R_{B10}$ | $R_{B1}$ | H |
| $L_{A5570}$ | $R_{B9}$ | $R_{B10}$ | $R_{B3}$ | H |
| $L_{A5571}$ | $R_{B9}$ | $R_{B10}$ | $R_{B4}$ | H |
| $L_{A5572}$ | $R_{B9}$ | $R_{B10}$ | $R_{B7}$ | H |
| $L_{A5573}$ | $R_{B9}$ | $R_{B10}$ | $R_{A3}$ | H |
| $L_{A5574}$ | $R_{B9}$ | $R_{B10}$ | $R_{A34}$ | H |
| $L_{A5575}$ | $R_{B9}$ | $R_{A3}$ | $R_{B1}$ | H |
| $L_{A5576}$ | $R_{B9}$ | $R_{A3}$ | $R_{B3}$ | H |
| $L_{A5577}$ | $R_{B9}$ | $R_{A3}$ | $R_{B4}$ | H |
| $L_{A5578}$ | $R_{B9}$ | $R_{A3}$ | $R_{B7}$ | H |
| $L_{A5579}$ | $R_{B9}$ | $R_{A3}$ | $R_{B10}$ | H |
| $L_{A5580}$ | $R_{B9}$ | $R_{A3}$ | $R_{A34}$ | H |
| $L_{A5581}$ | $R_{B9}$ | $R_{A34}$ | $R_{B1}$ | H |
| $L_{A5582}$ | $R_{B9}$ | $R_{A34}$ | $R_{B3}$ | H |
| $L_{A5583}$ | $R_{B9}$ | $R_{A34}$ | $R_{B4}$ | H |
| $L_{A5584}$ | $R_{B9}$ | $R_{A34}$ | $R_{B7}$ | H |
| $L_{A5585}$ | $R_{B9}$ | $R_{A34}$ | $R_{B10}$ | H |
| $L_{A5586}$ | $R_{B9}$ | $R_{A34}$ | $R_{A3}$ | H |
| $L_{A5587}$ | $R_{B7}$ | H | H | F |
| $L_{A5588}$ | $R_{B7}$ | $R_{B1}$ | H | F |
| $L_{A5589}$ | $R_{B7}$ | $R_{B3}$ | H | F |
| $L_{A5590}$ | $R_{B7}$ | $R_{B4}$ | H | F |
| $L_{A5591}$ | $R_{B7}$ | $R_{B7}$ | H | F |
| $L_{A5592}$ | $R_{B7}$ | $R_{B10}$ | H | F |
| $L_{A5593}$ | $R_{B7}$ | $R_{A3}$ | H | F |
| $L_{A5594}$ | $R_{B7}$ | $R_{A34}$ | H | F |
| $L_{A5595}$ | $R_{B7}$ | H | $R_{B1}$ | F |
| $L_{A5596}$ | $R_{B7}$ | H | $R_{B2}$ | F |
| $L_{A5597}$ | $R_{B7}$ | H | $R_{B3}$ | F |
| $L_{A5598}$ | $R_{B7}$ | H | $R_{B4}$ | F |
| $L_{A5599}$ | $R_{B7}$ | H | $R_{B7}$ | F |
| $L_{A5600}$ | $R_{B7}$ | H | $R_{B10}$ | F |
| $L_{A5601}$ | $R_{B7}$ | H | $R_{A3}$ | F |
| $L_{A5602}$ | $R_{B7}$ | H | $R_{A34}$ | F |
| $L_{A5603}$ | $R_{B7}$ | $R_{B1}$ | $R_{B1}$ | F |
| $L_{A5604}$ | $R_{B7}$ | $R_{B3}$ | $R_{B3}$ | F |
| $L_{A5605}$ | $R_{B7}$ | $R_{B4}$ | $R_{B4}$ | F |
| $L_{A5606}$ | $R_{B7}$ | $R_{B7}$ | $R_{B7}$ | F |
| $L_{A5607}$ | $R_{B7}$ | $R_{B10}$ | $R_{B10}$ | F |
| $L_{A5608}$ | $R_{B7}$ | $R_{A3}$ | $R_{A3}$ | F |
| $L_{A5609}$ | $R_{B7}$ | $R_{A34}$ | $R_{A34}$ | F |
| $L_{A5610}$ | $R_{B7}$ | $R_{B1}$ | $R_{B3}$ | F |
| $L_{A5611}$ | $R_{B7}$ | $R_{B1}$ | $R_{B4}$ | F |
| $L_{A5612}$ | $R_{B7}$ | $R_{B1}$ | $R_{B7}$ | F |
| $L_{A5613}$ | $R_{B7}$ | $R_{B1}$ | $R_{B10}$ | F |
| $L_{A5614}$ | $R_{B7}$ | $R_{B1}$ | $R_{A3}$ | F |
| $L_{A5615}$ | $R_{B7}$ | $R_{B1}$ | $R_{A34}$ | F |
| $L_{A5616}$ | $R_{B7}$ | $R_{B3}$ | $R_{B1}$ | F |
| $L_{A5617}$ | $R_{B7}$ | $R_{B3}$ | $R_{B4}$ | F |
| $L_{A5618}$ | $R_{B7}$ | $R_{B3}$ | $R_{B7}$ | F |
| $L_{A5619}$ | $R_{B7}$ | $R_{B3}$ | $R_{B10}$ | F |
| $L_{A5620}$ | $R_{B7}$ | $R_{B3}$ | $R_{A3}$ | F |
| $L_{A5621}$ | $R_{B7}$ | $R_{B3}$ | $R_{A34}$ | F |
| $L_{A5622}$ | $R_{B7}$ | $R_{B4}$ | $R_{B1}$ | F |
| $L_{A5623}$ | $R_{B7}$ | $R_{B4}$ | $R_{B3}$ | F |
| $L_{A5624}$ | $R_{B7}$ | $R_{B4}$ | $R_{B7}$ | F |
| $L_{A5625}$ | $R_{B7}$ | $R_{B4}$ | $R_{B10}$ | F |
| $L_{A5626}$ | $R_{B7}$ | $R_{B4}$ | $R_{A3}$ | F |
| $L_{A5627}$ | $R_{B7}$ | $R_{B4}$ | $R_{A34}$ | F |
| $L_{A5628}$ | $R_{B7}$ | $R_{B7}$ | $R_{B1}$ | F |
| $L_{A5629}$ | $R_{B7}$ | $R_{B7}$ | $R_{B3}$ | F |
| $L_{A5630}$ | $R_{B7}$ | $R_{B7}$ | $R_{B4}$ | F |
| $L_{A5631}$ | $R_{B7}$ | $R_{B7}$ | $R_{B10}$ | F |
| $L_{A5632}$ | $R_{B7}$ | $R_{B7}$ | $R_{A3}$ | F |
| $L_{A5633}$ | $R_{B7}$ | $R_{B7}$ | $R_{A34}$ | F |
| $L_{A5634}$ | $R_{B7}$ | $R_{B10}$ | $R_{B1}$ | F |
| $L_{A5635}$ | $R_{B7}$ | $R_{B10}$ | $R_{B3}$ | F |
| $L_{A5636}$ | $R_{B7}$ | $R_{B10}$ | $R_{B4}$ | F |
| $L_{A5637}$ | $R_{B7}$ | $R_{B10}$ | $R_{B7}$ | F |
| $L_{A5638}$ | $R_{B7}$ | $R_{B10}$ | $R_{A3}$ | F |
| $L_{A5639}$ | $R_{B7}$ | $R_{B10}$ | $R_{A34}$ | F |
| $L_{A5640}$ | $R_{B7}$ | $R_{A3}$ | $R_{B1}$ | F |
| $L_{A5641}$ | $R_{B7}$ | $R_{A3}$ | $R_{B3}$ | F |
| $L_{A5642}$ | $R_{B7}$ | $R_{A3}$ | $R_{B4}$ | F |
| $L_{A5643}$ | $R_{B7}$ | $R_{A3}$ | $R_{B7}$ | F |
| $L_{A5644}$ | $R_{B7}$ | $R_{A3}$ | $R_{B10}$ | F |
| $L_{A5645}$ | $R_{B7}$ | $R_{A3}$ | $R_{A34}$ | F |
| $L_{A5646}$ | $R_{B7}$ | $R_{A34}$ | $R_{B1}$ | F |
| $L_{A5647}$ | $R_{B7}$ | $R_{A34}$ | $R_{B3}$ | F |
| $L_{A5648}$ | $R_{B7}$ | $R_{A34}$ | $R_{B4}$ | F |
| $L_{A5649}$ | $R_{B7}$ | $R_{A34}$ | $R_{B7}$ | F |
| $L_{A5650}$ | $R_{B7}$ | $R_{A34}$ | $R_{B10}$ | F |
| $L_{A5651}$ | $R_{B7}$ | $R_{A34}$ | $R_{A3}$ | F |
| $L_{A5652}$ | $R_{B9}$ | H | H | F |
| $L_{A5653}$ | $R_{B9}$ | $R_{B1}$ | H | F |
| $L_{A5654}$ | $R_{B9}$ | $R_{B3}$ | H | F |
| $L_{A5655}$ | $R_{B9}$ | $R_{B4}$ | H | F |
| $L_{A5656}$ | $R_{B9}$ | $R_{B7}$ | H | F |
| $L_{A5657}$ | $R_{B9}$ | $R_{B10}$ | H | F |
| $L_{A5658}$ | $R_{B9}$ | $R_{A3}$ | H | F |
| $L_{A5659}$ | $R_{B9}$ | $R_{A34}$ | H | F |
| $L_{A5660}$ | $R_{B9}$ | H | $R_{B1}$ | F |
| $L_{A5661}$ | $R_{B9}$ | H | $R_{B2}$ | F |
| $L_{A5662}$ | $R_{B9}$ | H | $R_{B3}$ | F |
| $L_{A5663}$ | $R_{B9}$ | H | $R_{B4}$ | F |
| $L_{A5664}$ | $R_{B9}$ | H | $R_{B7}$ | F |
| $L_{A5665}$ | $R_{B9}$ | H | $R_{B10}$ | F |
| $L_{A5666}$ | $R_{B9}$ | H | $R_{A3}$ | F |
| $L_{A5667}$ | $R_{B9}$ | H | $R_{A34}$ | F |
| $L_{A5668}$ | $R_{B9}$ | $R_{B1}$ | $R_{B1}$ | F |
| $L_{A5669}$ | $R_{B9}$ | $R_{B3}$ | $R_{B3}$ | F |
| $L_{A5670}$ | $R_{B9}$ | $R_{B4}$ | $R_{B4}$ | F |
| $L_{A5671}$ | $R_{B9}$ | $R_{B7}$ | $R_{B7}$ | F |
| $L_{A5672}$ | $R_{B9}$ | $R_{B10}$ | $R_{B10}$ | F |
| $L_{A5673}$ | $R_{B9}$ | $R_{A3}$ | $R_{A3}$ | F |
| $L_{A5674}$ | $R_{B9}$ | $R_{A34}$ | $R_{A34}$ | F |
| $L_{A5675}$ | $R_{B9}$ | $R_{B1}$ | $R_{B3}$ | F |
| $L_{A5676}$ | $R_{B9}$ | $R_{B1}$ | $R_{B4}$ | F |
| $L_{A5677}$ | $R_{B9}$ | $R_{B1}$ | $R_{B7}$ | F |
| $L_{A5678}$ | $R_{B9}$ | $R_{B1}$ | $R_{B10}$ | F |
| $L_{A5679}$ | $R_{B9}$ | $R_{B1}$ | $R_{A3}$ | F |
| $L_{A5680}$ | $R_{B9}$ | $R_{B1}$ | $R_{A34}$ | F |
| $L_{A5681}$ | $R_{B9}$ | $R_{B3}$ | $R_{B1}$ | F |
| $L_{A5682}$ | $R_{B9}$ | $R_{B3}$ | $R_{B4}$ | F |
| $L_{A5683}$ | $R_{B9}$ | $R_{B3}$ | $R_{B7}$ | F |
| $L_{A5684}$ | $R_{B9}$ | $R_{B3}$ | $R_{B10}$ | F |
| $L_{A5685}$ | $R_{B9}$ | $R_{B3}$ | $R_{A3}$ | F |
| $L_{A5686}$ | $R_{B9}$ | $R_{B3}$ | $R_{A34}$ | F |

-continued

| Ligand | $R^1$ | $R^{11}$ | $R^{12}$ | $R^8$ |
|---|---|---|---|---|
| $L_{A5687}$ | $R_{B9}$ | $R_{B4}$ | $R_{B1}$ | F |
| $L_{A5688}$ | $R_{B9}$ | $R_{B4}$ | $R_{B3}$ | F |
| $L_{A5689}$ | $R_{B9}$ | $R_{B4}$ | $R_{B7}$ | F |
| $L_{A5690}$ | $R_{B9}$ | $R_{B4}$ | $R_{B10}$ | F |
| $L_{A5691}$ | $R_{B9}$ | $R_{B4}$ | $R_{A3}$ | F |
| $L_{A5692}$ | $R_{B9}$ | $R_{B4}$ | $R_{A34}$ | F |
| $L_{A5693}$ | $R_{B9}$ | $R_{B7}$ | $R_{B1}$ | F |
| $L_{A5694}$ | $R_{B9}$ | $R_{B7}$ | $R_{B3}$ | F |
| $L_{A5695}$ | $R_{B9}$ | $R_{B7}$ | $R_{B4}$ | F |
| $L_{A5696}$ | $R_{B9}$ | $R_{B7}$ | $R_{B10}$ | F |
| $L_{A5697}$ | $R_{B9}$ | $R_{B7}$ | $R_{A3}$ | F |
| $L_{A5698}$ | $R_{B9}$ | $R_{B7}$ | $R_{A34}$ | F |
| $L_{A5699}$ | $R_{B9}$ | $R_{B10}$ | $R_{B1}$ | F |
| $L_{A5700}$ | $R_{B9}$ | $R_{B10}$ | $R_{B3}$ | F |
| $L_{A5701}$ | $R_{B9}$ | $R_{B10}$ | $R_{B4}$ | F |
| $L_{A5702}$ | $R_{B9}$ | $R_{B10}$ | $R_{B7}$ | F |
| $L_{A5703}$ | $R_{B9}$ | $R_{B10}$ | $R_{A3}$ | F |
| $L_{A5704}$ | $R_{B9}$ | $R_{B10}$ | $R_{A34}$ | F |
| $L_{A5705}$ | $R_{B9}$ | $R_{A3}$ | $R_{B1}$ | F |
| $L_{A5706}$ | $R_{B9}$ | $R_{A3}$ | $R_{B3}$ | F |
| $L_{A5707}$ | $R_{B9}$ | $R_{A3}$ | $R_{B4}$ | F |
| $L_{A5708}$ | $R_{B9}$ | $R_{A3}$ | $R_{B7}$ | F |
| $L_{A5709}$ | $R_{B9}$ | $R_{A3}$ | $R_{B10}$ | F |
| $L_{A5710}$ | $R_{B9}$ | $R_{A3}$ | $R_{A34}$ | F |
| $L_{A5711}$ | $R_{B9}$ | $R_{A34}$ | $R_{B1}$ | F |
| $L_{A5712}$ | $R_{B9}$ | $R_{A34}$ | $R_{B3}$ | F |
| $L_{A5713}$ | $R_{B9}$ | $R_{A34}$ | $R_{B4}$ | F |
| $L_{A5714}$ | $R_{B9}$ | $R_{A34}$ | $R_{B7}$ | F |
| $L_{A5715}$ | $R_{B9}$ | $R_{A34}$ | $R_{B10}$ | F |
| $L_{A5716}$ | $R_{B9}$ | $R_{A34}$ | $R_{A3}$ | F |

$L_{A5717}$ through $L_{A5976}$ that are based on a structure of Formula XXIV,

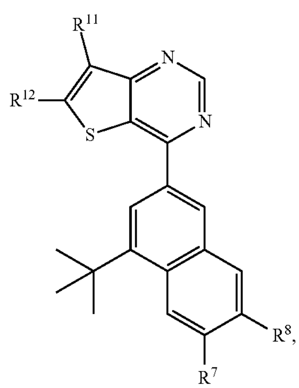

in which $R^7$, $R^8$, $R^{11}$, and $R^{12}$ are defined as provided below:

| Ligand | $R^7$ | $R^{11}$ | $R^{12}$ | $R^8$ |
|---|---|---|---|---|
| $L_{A5717}$ | $R_{B1}$ | H | H | H |
| $L_{A5718}$ | $R_{B1}$ | $R_{B1}$ | H | H |
| $L_{A5719}$ | $R_{B1}$ | $R_{B3}$ | H | H |
| $L_{A5720}$ | $R_{B1}$ | $R_{B4}$ | H | H |
| $L_{A5721}$ | $R_{B1}$ | $R_{B7}$ | H | H |
| $L_{A5722}$ | $R_{B1}$ | $R_{B10}$ | H | H |
| $L_{A5723}$ | $R_{B1}$ | $R_{A3}$ | H | H |
| $L_{A5724}$ | $R_{B1}$ | $R_{A34}$ | H | H |
| $L_{A5725}$ | $R_{B1}$ | H | $R_{B1}$ | H |
| $L_{A5726}$ | $R_{B1}$ | H | $R_{B2}$ | H |
| $L_{A5727}$ | $R_{B1}$ | H | $R_{B3}$ | H |
| $L_{A5728}$ | $R_{B1}$ | H | $R_{B4}$ | H |
| $L_{A5729}$ | $R_{B1}$ | H | $R_{B7}$ | H |
| $L_{A5730}$ | $R_{B1}$ | H | $R_{B10}$ | H |
| $L_{A5731}$ | $R_{B1}$ | H | $R_{A3}$ | H |
| $L_{A5732}$ | $R_{B1}$ | H | $R_{A34}$ | H |

-continued

| Ligand | $R^7$ | $R^{11}$ | $R^{12}$ | $R^8$ |
|---|---|---|---|---|
| $L_{A5733}$ | $R_{B1}$ | $R_{B1}$ | $R_{B1}$ | H |
| $L_{A5734}$ | $R_{B1}$ | $R_{B3}$ | $R_{B3}$ | H |
| $L_{A5735}$ | $R_{B1}$ | $R_{B4}$ | $R_{B4}$ | H |
| $L_{A5736}$ | $R_{B1}$ | $R_{B7}$ | $R_{B7}$ | H |
| $L_{A5737}$ | $R_{B1}$ | $R_{B10}$ | $R_{B10}$ | H |
| $L_{A5738}$ | $R_{B1}$ | $R_{A3}$ | $R_{A3}$ | H |
| $L_{A5739}$ | $R_{B1}$ | $R_{A34}$ | $R_{A34}$ | H |
| $L_{A5740}$ | $R_{B1}$ | $R_{B1}$ | $R_{B3}$ | H |
| $L_{A5741}$ | $R_{B1}$ | $R_{B1}$ | $R_{B4}$ | H |
| $L_{A5742}$ | $R_{B1}$ | $R_{B1}$ | $R_{B7}$ | H |
| $L_{A5743}$ | $R_{B1}$ | $R_{B1}$ | $R_{B10}$ | H |
| $L_{A5744}$ | $R_{B1}$ | $R_{B1}$ | $R_{A3}$ | H |
| $L_{A5745}$ | $R_{B1}$ | $R_{B1}$ | $R_{A34}$ | H |
| $L_{A5746}$ | $R_{B1}$ | $R_{B3}$ | $R_{B1}$ | H |
| $L_{A5747}$ | $R_{B1}$ | $R_{B3}$ | $R_{B4}$ | H |
| $L_{A5748}$ | $R_{B1}$ | $R_{B3}$ | $R_{B7}$ | H |
| $L_{A5749}$ | $R_{B1}$ | $R_{B3}$ | $R_{B10}$ | H |
| $L_{A5750}$ | $R_{B1}$ | $R_{B3}$ | $R_{A3}$ | H |
| $L_{A5751}$ | $R_{B1}$ | $R_{B3}$ | $R_{A34}$ | H |
| $L_{A5752}$ | $R_{B1}$ | $R_{B4}$ | $R_{B1}$ | H |
| $L_{A5753}$ | $R_{B1}$ | $R_{B4}$ | $R_{B3}$ | H |
| $L_{A5754}$ | $R_{B1}$ | $R_{B4}$ | $R_{B7}$ | H |
| $L_{A5755}$ | $R_{B1}$ | $R_{B4}$ | $R_{B10}$ | H |
| $L_{A5756}$ | $R_{B1}$ | $R_{B4}$ | $R_{A3}$ | H |
| $L_{A5757}$ | $R_{B1}$ | $R_{B4}$ | $R_{A34}$ | H |
| $L_{A5758}$ | $R_{B1}$ | $R_{B7}$ | $R_{B1}$ | H |
| $L_{A5759}$ | $R_{B1}$ | $R_{B7}$ | $R_{B3}$ | H |
| $L_{A5760}$ | $R_{B1}$ | $R_{B7}$ | $R_{B4}$ | H |
| $L_{A5761}$ | $R_{B1}$ | $R_{B7}$ | $R_{B10}$ | H |
| $L_{A5762}$ | $R_{B1}$ | $R_{B7}$ | $R_{A3}$ | H |
| $L_{A5763}$ | $R_{B1}$ | $R_{B7}$ | $R_{A34}$ | H |
| $L_{A5764}$ | $R_{B1}$ | $R_{B10}$ | $R_{B1}$ | H |
| $L_{A5765}$ | $R_{B1}$ | $R_{B10}$ | $R_{B3}$ | H |
| $L_{A5766}$ | $R_{B1}$ | $R_{B10}$ | $R_{B4}$ | H |
| $L_{A5767}$ | $R_{B1}$ | $R_{B10}$ | $R_{B7}$ | H |
| $L_{A5768}$ | $R_{B1}$ | $R_{B10}$ | $R_{A3}$ | H |
| $L_{A5769}$ | $R_{B1}$ | $R_{B10}$ | $R_{A34}$ | H |
| $L_{A5770}$ | $R_{B1}$ | $R_{A3}$ | $R_{B1}$ | H |
| $L_{A5771}$ | $R_{B1}$ | $R_{A3}$ | $R_{B3}$ | H |
| $L_{A5772}$ | $R_{B1}$ | $R_{A3}$ | $R_{B4}$ | H |
| $L_{A5773}$ | $R_{B1}$ | $R_{A3}$ | $R_{B7}$ | H |
| $L_{A5774}$ | $R_{B1}$ | $R_{A3}$ | $R_{B10}$ | H |
| $L_{A5775}$ | $R_{B1}$ | $R_{A3}$ | $R_{A34}$ | H |
| $L_{A5776}$ | $R_{B1}$ | $R_{A34}$ | $R_{B1}$ | H |
| $L_{A5777}$ | $R_{B1}$ | $R_{A34}$ | $R_{B3}$ | H |
| $L_{A5778}$ | $R_{B1}$ | $R_{A34}$ | $R_{B4}$ | H |
| $L_{A5779}$ | $R_{B1}$ | $R_{A34}$ | $R_{B7}$ | H |
| $L_{A5780}$ | $R_{B1}$ | $R_{A34}$ | $R_{B10}$ | H |
| $L_{A5781}$ | $R_{B1}$ | $R_{A34}$ | $R_{A3}$ | H |
| $L_{A5782}$ | F | H | H | H |
| $L_{A5783}$ | F | $R_{B1}$ | H | H |
| $L_{A5784}$ | F | $R_{B3}$ | H | H |
| $L_{A5785}$ | F | $R_{B4}$ | H | H |
| $L_{A5786}$ | F | $R_{B7}$ | H | H |
| $L_{A5787}$ | F | $R_{B10}$ | H | H |
| $L_{A5788}$ | F | $R_{A3}$ | H | H |
| $L_{A5789}$ | F | $R_{A34}$ | H | H |
| $L_{A5790}$ | F | H | $R_{B1}$ | H |
| $L_{A5791}$ | F | H | $R_{B2}$ | H |
| $L_{A5792}$ | F | H | $R_{B3}$ | H |
| $L_{A5793}$ | F | H | $R_{B4}$ | H |
| $L_{A5794}$ | F | H | $R_{B7}$ | H |
| $L_{A5795}$ | F | H | $R_{B10}$ | H |
| $L_{A5796}$ | F | H | $R_{A3}$ | H |
| $L_{A5797}$ | F | H | $R_{A34}$ | H |
| $L_{A5798}$ | F | $R_{B1}$ | $R_{B1}$ | H |
| $L_{A5799}$ | F | $R_{B3}$ | $R_{B3}$ | H |
| $L_{A5800}$ | F | $R_{B4}$ | $R_{B4}$ | H |
| $L_{A5801}$ | F | $R_{B7}$ | $R_{B7}$ | H |
| $L_{A5802}$ | F | $R_{B10}$ | $R_{B10}$ | H |
| $L_{A5803}$ | F | $R_{A3}$ | $R_{A3}$ | H |
| $L_{A5804}$ | F | $R_{A34}$ | $R_{A34}$ | H |
| $L_{A5805}$ | F | $R_{B1}$ | $R_{B3}$ | H |
| $L_{A5806}$ | F | $R_{B1}$ | $R_{B4}$ | H |
| $L_{A5807}$ | F | $R_{B1}$ | $R_{B7}$ | H |
| $L_{A5808}$ | F | $R_{B1}$ | $R_{B10}$ | H |
| $L_{A5809}$ | F | $R_{B1}$ | $R_{A3}$ | H |

-continued

| Ligand | $R^7$ | $R^{11}$ | $R^{12}$ | $R^8$ |
|---|---|---|---|---|
| $L_{45810}$ | F | $R_{B1}$ | $R_{A34}$ | H |
| $L_{45811}$ | F | $R_{B3}$ | $R_{B1}$ | H |
| $L_{45812}$ | F | $R_{B3}$ | $R_{B4}$ | H |
| $L_{45813}$ | F | $R_{B3}$ | $R_{B7}$ | H |
| $L_{45814}$ | F | $R_{B3}$ | $R_{B10}$ | H |
| $L_{45815}$ | F | $R_{B3}$ | $R_{A3}$ | H |
| $L_{45816}$ | F | $R_{B3}$ | $R_{A34}$ | H |
| $L_{45817}$ | F | $R_{B4}$ | $R_{B1}$ | H |
| $L_{45818}$ | F | $R_{B4}$ | $R_{B3}$ | H |
| $L_{45819}$ | F | $R_{B4}$ | $R_{B7}$ | H |
| $L_{45820}$ | F | $R_{B4}$ | $R_{B10}$ | H |
| $L_{45821}$ | F | $R_{B4}$ | $R_{A3}$ | H |
| $L_{45822}$ | F | $R_{B4}$ | $R_{A34}$ | H |
| $L_{45823}$ | F | $R_{B7}$ | $R_{B1}$ | H |
| $L_{45824}$ | F | $R_{B7}$ | $R_{B3}$ | H |
| $L_{45825}$ | F | $R_{B7}$ | $R_{B4}$ | H |
| $L_{45826}$ | F | $R_{B7}$ | $R_{B10}$ | H |
| $L_{45827}$ | F | $R_{B7}$ | $R_{A3}$ | H |
| $L_{45828}$ | F | $R_{B7}$ | $R_{A34}$ | H |
| $L_{45829}$ | F | $R_{B10}$ | $R_{B1}$ | H |
| $L_{45830}$ | F | $R_{B10}$ | $R_{B3}$ | H |
| $L_{45831}$ | F | $R_{B10}$ | $R_{B4}$ | H |
| $L_{45832}$ | F | $R_{B10}$ | $R_{B7}$ | H |
| $L_{45833}$ | F | $R_{B10}$ | $R_{A3}$ | H |
| $L_{45834}$ | F | $R_{B10}$ | $R_{A34}$ | H |
| $L_{45835}$ | F | $R_{A3}$ | $R_{B1}$ | H |
| $L_{45836}$ | F | $R_{A3}$ | $R_{B3}$ | H |
| $L_{45837}$ | F | $R_{A3}$ | $R_{B4}$ | H |
| $L_{45838}$ | F | $R_{A3}$ | $R_{B7}$ | H |
| $L_{45839}$ | F | $R_{A3}$ | $R_{B10}$ | H |
| $L_{45840}$ | F | $R_{A3}$ | $R_{A34}$ | H |
| $L_{45841}$ | F | $R_{A34}$ | $R_{B1}$ | H |
| $L_{45842}$ | F | $R_{A34}$ | $R_{B3}$ | H |
| $L_{45843}$ | F | $R_{A34}$ | $R_{B4}$ | H |
| $L_{45844}$ | F | $R_{A34}$ | $R_{B7}$ | H |
| $L_{45845}$ | F | $R_{A34}$ | $R_{B10}$ | H |
| $L_{45846}$ | F | $R_{A34}$ | $R_{A3}$ | H |
| $L_{45847}$ | H | H | H | $R_{B1}$ |
| $L_{45848}$ | H | $R_{B1}$ | H | $R_{B1}$ |
| $L_{45849}$ | H | $R_{B3}$ | H | $R_{B1}$ |
| $L_{45850}$ | H | $R_{B4}$ | H | $R_{B1}$ |
| $L_{45851}$ | H | $R_{B7}$ | H | $R_{B1}$ |
| $L_{45852}$ | H | $R_{B10}$ | H | $R_{B1}$ |
| $L_{45853}$ | H | $R_{A3}$ | H | $R_{B1}$ |
| $L_{45854}$ | H | $R_{A34}$ | H | $R_{B1}$ |
| $L_{45855}$ | H | H | $R_{B1}$ | $R_{B1}$ |
| $L_{45856}$ | H | H | $R_{B2}$ | $R_{B1}$ |
| $L_{45857}$ | H | H | $R_{B3}$ | $R_{B1}$ |
| $L_{45858}$ | H | H | $R_{B4}$ | $R_{B1}$ |
| $L_{45859}$ | H | H | $R_{B7}$ | $R_{B1}$ |
| $L_{45860}$ | H | H | $R_{B10}$ | $R_{B1}$ |
| $L_{45861}$ | H | H | $R_{A3}$ | $R_{B1}$ |
| $L_{45862}$ | H | H | $R_{A34}$ | $R_{B1}$ |
| $L_{45863}$ | H | $R_{B1}$ | $R_{B1}$ | $R_{B1}$ |
| $L_{45864}$ | H | $R_{B3}$ | $R_{B3}$ | $R_{B1}$ |
| $L_{45865}$ | H | $R_{B4}$ | $R_{B4}$ | $R_{B1}$ |
| $L_{45866}$ | H | $R_{B7}$ | $R_{B7}$ | $R_{B1}$ |
| $L_{45867}$ | H | $R_{B10}$ | $R_{B10}$ | $R_{B1}$ |
| $L_{45868}$ | H | $R_{A3}$ | $R_{A3}$ | $R_{B1}$ |
| $L_{45869}$ | H | $R_{A34}$ | $R_{A34}$ | $R_{B1}$ |
| $L_{45870}$ | H | $R_{B1}$ | $R_{B3}$ | $R_{B1}$ |
| $L_{45871}$ | H | $R_{B1}$ | $R_{B4}$ | $R_{B1}$ |
| $L_{45872}$ | H | $R_{B1}$ | $R_{B7}$ | $R_{B1}$ |
| $L_{45873}$ | H | $R_{B1}$ | $R_{B10}$ | $R_{B1}$ |
| $L_{45874}$ | H | $R_{B1}$ | $R_{A3}$ | $R_{B1}$ |
| $L_{45875}$ | H | $R_{B1}$ | $R_{A34}$ | $R_{B1}$ |
| $L_{45876}$ | H | $R_{B3}$ | $R_{B1}$ | $R_{B1}$ |
| $L_{45877}$ | H | $R_{B3}$ | $R_{B4}$ | $R_{B1}$ |
| $L_{45878}$ | H | $R_{B3}$ | $R_{B7}$ | $R_{B1}$ |
| $L_{45879}$ | H | $R_{B3}$ | $R_{B10}$ | $R_{B1}$ |
| $L_{45880}$ | H | $R_{B3}$ | $R_{A3}$ | $R_{B1}$ |
| $L_{45881}$ | H | $R_{B3}$ | $R_{A34}$ | $R_{B1}$ |
| $L_{45882}$ | H | $R_{B4}$ | $R_{B1}$ | $R_{B1}$ |
| $L_{45883}$ | H | $R_{B4}$ | $R_{B3}$ | $R_{B1}$ |
| $L_{45884}$ | H | $R_{B4}$ | $R_{B7}$ | $R_{B1}$ |
| $L_{45885}$ | H | $R_{B4}$ | $R_{B10}$ | $R_{B1}$ |
| $L_{45886}$ | H | $R_{B4}$ | $R_{A3}$ | $R_{B1}$ |

-continued

| Ligand | $R^7$ | $R^{11}$ | $R^{12}$ | $R^8$ |
|---|---|---|---|---|
| $L_{45887}$ | H | $R_{B4}$ | $R_{A34}$ | $R_{B1}$ |
| $L_{45888}$ | H | $R_{B7}$ | $R_{B1}$ | $R_{B1}$ |
| $L_{45889}$ | H | $R_{B7}$ | $R_{B3}$ | $R_{B1}$ |
| $L_{45890}$ | H | $R_{B7}$ | $R_{B4}$ | $R_{B1}$ |
| $L_{45891}$ | H | $R_{B7}$ | $R_{B10}$ | $R_{B1}$ |
| $L_{45892}$ | H | $R_{B7}$ | $R_{A3}$ | $R_{B1}$ |
| $L_{45893}$ | H | $R_{B7}$ | $R_{A34}$ | $R_{B1}$ |
| $L_{45894}$ | H | $R_{B10}$ | $R_{B1}$ | $R_{B1}$ |
| $L_{45895}$ | H | $R_{B10}$ | $R_{B3}$ | $R_{B1}$ |
| $L_{45896}$ | H | $R_{B10}$ | $R_{B4}$ | $R_{B1}$ |
| $L_{45897}$ | H | $R_{B10}$ | $R_{B7}$ | $R_{B1}$ |
| $L_{45898}$ | H | $R_{B10}$ | $R_{A3}$ | $R_{B1}$ |
| $L_{45899}$ | H | $R_{B10}$ | $R_{A34}$ | $R_{B1}$ |
| $L_{45900}$ | H | $R_{A3}$ | $R_{B1}$ | $R_{B1}$ |
| $L_{45901}$ | H | $R_{A3}$ | $R_{B3}$ | $R_{B1}$ |
| $L_{45902}$ | H | $R_{A3}$ | $R_{B4}$ | $R_{B1}$ |
| $L_{45903}$ | H | $R_{A3}$ | $R_{B7}$ | $R_{B1}$ |
| $L_{45904}$ | H | $R_{A3}$ | $R_{B10}$ | $R_{B1}$ |
| $L_{45905}$ | H | $R_{A3}$ | $R_{A34}$ | $R_{B1}$ |
| $L_{45906}$ | H | $R_{A34}$ | $R_{B1}$ | $R_{B1}$ |
| $L_{45907}$ | H | $R_{A34}$ | $R_{B3}$ | $R_{B1}$ |
| $L_{45908}$ | H | $R_{A34}$ | $R_{B4}$ | $R_{B1}$ |
| $L_{45909}$ | H | $R_{A34}$ | $R_{B7}$ | $R_{B1}$ |
| $L_{45910}$ | H | $R_{A34}$ | $R_{B10}$ | $R_{B1}$ |
| $L_{45911}$ | H | $R_{A34}$ | $R_{A3}$ | $R_{B1}$ |
| $L_{45912}$ | H | H | H | F |
| $L_{45913}$ | H | $R_{B1}$ | H | F |
| $L_{45914}$ | H | $R_{B3}$ | H | F |
| $L_{45915}$ | H | $R_{B4}$ | H | F |
| $L_{45916}$ | H | $R_{B7}$ | H | F |
| $L_{45917}$ | H | $R_{B10}$ | H | F |
| $L_{45918}$ | H | $R_{A3}$ | H | F |
| $L_{45919}$ | H | $R_{A34}$ | H | F |
| $L_{45920}$ | H | H | $R_{B1}$ | F |
| $L_{45921}$ | H | H | $R_{B2}$ | F |
| $L_{45922}$ | H | H | $R_{B3}$ | F |
| $L_{45923}$ | H | H | $R_{B4}$ | F |
| $L_{45924}$ | H | H | $R_{B7}$ | F |
| $L_{45925}$ | H | H | $R_{B10}$ | F |
| $L_{45926}$ | H | H | $R_{A3}$ | F |
| $L_{45927}$ | H | H | $R_{A34}$ | F |
| $L_{45928}$ | H | $R_{B1}$ | $R_{B1}$ | F |
| $L_{45929}$ | H | $R_{B3}$ | $R_{B3}$ | F |
| $L_{45930}$ | H | $R_{B4}$ | $R_{B4}$ | F |
| $L_{45931}$ | H | $R_{B7}$ | $R_{B7}$ | F |
| $L_{45932}$ | H | $R_{B10}$ | $R_{B10}$ | F |
| $L_{45933}$ | H | $R_{A3}$ | $R_{A3}$ | F |
| $L_{45934}$ | H | $R_{A34}$ | $R_{A34}$ | F |
| $L_{45935}$ | H | $R_{B1}$ | $R_{B3}$ | F |
| $L_{45936}$ | H | $R_{B1}$ | $R_{B4}$ | F |
| $L_{45937}$ | H | $R_{B1}$ | $R_{B7}$ | F |
| $L_{45938}$ | H | $R_{B1}$ | $R_{B10}$ | F |
| $L_{45939}$ | H | $R_{B1}$ | $R_{A3}$ | F |
| $L_{45940}$ | H | $R_{B1}$ | $R_{A34}$ | F |
| $L_{45941}$ | H | $R_{B3}$ | $R_{B1}$ | F |
| $L_{45942}$ | H | $R_{B3}$ | $R_{B4}$ | F |
| $L_{45943}$ | H | $R_{B3}$ | $R_{B7}$ | F |
| $L_{45944}$ | H | $R_{B3}$ | $R_{B10}$ | F |
| $L_{45945}$ | H | $R_{B3}$ | $R_{A3}$ | F |
| $L_{45946}$ | H | $R_{B3}$ | $R_{A34}$ | F |
| $L_{45947}$ | H | $R_{B4}$ | $R_{B1}$ | F |
| $L_{45948}$ | H | $R_{B4}$ | $R_{B3}$ | F |
| $L_{45949}$ | H | $R_{B4}$ | $R_{B7}$ | F |
| $L_{45950}$ | H | $R_{B4}$ | $R_{B10}$ | F |
| $L_{45951}$ | H | $R_{B4}$ | $R_{A3}$ | F |
| $L_{45952}$ | H | $R_{B4}$ | $R_{A34}$ | F |
| $L_{45953}$ | H | $R_{B7}$ | $R_{B1}$ | F |
| $L_{45954}$ | H | $R_{B7}$ | $R_{B3}$ | F |
| $L_{45955}$ | H | $R_{B7}$ | $R_{B4}$ | F |
| $L_{45956}$ | H | $R_{B7}$ | $R_{B10}$ | F |
| $L_{45957}$ | H | $R_{B7}$ | $R_{A3}$ | F |
| $L_{45958}$ | H | $R_{B7}$ | $R_{A34}$ | F |
| $L_{45959}$ | H | $R_{B10}$ | $R_{B1}$ | F |
| $L_{45960}$ | H | $R_{B10}$ | $R_{B3}$ | F |
| $L_{45961}$ | H | $R_{B10}$ | $R_{B4}$ | F |
| $L_{45962}$ | H | $R_{B10}$ | $R_{B7}$ | F |
| $L_{45963}$ | H | $R_{B10}$ | $R_{A3}$ | F |

-continued

| Ligand | $R^7$ | $R^{11}$ | $R^{12}$ | $R^8$ |
|---|---|---|---|---|
| $L_{A5964}$ | H | $R_{B10}$ | $R_{A34}$ | F |
| $L_{A5965}$ | H | $R_{A3}$ | $R_{B1}$ | F |
| $L_{A5966}$ | H | $R_{A3}$ | $R_{B3}$ | F |
| $L_{A5967}$ | H | $R_{A3}$ | $R_{B4}$ | F |
| $L_{A5968}$ | H | $R_{A3}$ | $R_{B7}$ | F |
| $L_{A5969}$ | H | $R_{A3}$ | $R_{B10}$ | F |
| $L_{A5970}$ | H | $R_{A3}$ | $R_{A34}$ | F |
| $L_{A5971}$ | H | $R_{A34}$ | $R_{B1}$ | F |
| $L_{A5972}$ | H | $R_{A34}$ | $R_{B3}$ | F |
| $L_{A5973}$ | H | $R_{A34}$ | $R_{B4}$ | F |
| $L_{A5974}$ | H | $R_{A34}$ | $R_{B7}$ | F |
| $L_{A5975}$ | H | $R_{A34}$ | $R_{B10}$ | F |
| $L_{A5976}$ | H | $R_{A34}$ | $R_{A3}$ | F |

$L_{A5977}$ through $L_{A6236}$ that are based on a structure of Formula XXV,

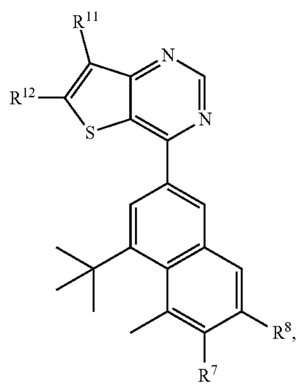

in which $R^7$, $R^8$, $R^{11}$, and $R^{12}$ are defined as provided below:

| Ligand | $R^7$ | $R^{11}$ | $R^{12}$ | $R^8$ |
|---|---|---|---|---|
| $L_{A5977}$ | $R_{B1}$ | H | H | H |
| $L_{A5978}$ | $R_{B1}$ | $R_{B1}$ | H | H |
| $L_{A5979}$ | $R_{B1}$ | $R_{B3}$ | H | H |
| $L_{A5980}$ | $R_{B1}$ | $R_{B4}$ | H | H |
| $L_{A5981}$ | $R_{B1}$ | $R_{B7}$ | H | H |
| $L_{A5982}$ | $R_{B1}$ | $R_{B10}$ | H | H |
| $L_{A5983}$ | $R_{B1}$ | $R_{A3}$ | H | H |
| $L_{A5984}$ | $R_{B1}$ | $R_{A34}$ | H | H |
| $L_{A5985}$ | $R_{B1}$ | H | $R_{B1}$ | H |
| $L_{A5986}$ | $R_{B1}$ | H | $R_{B2}$ | H |
| $L_{A5987}$ | $R_{B1}$ | H | $R_{B3}$ | H |
| $L_{A5988}$ | $R_{B1}$ | H | $R_{B4}$ | H |
| $L_{A5989}$ | $R_{B1}$ | H | $R_{B7}$ | H |
| $L_{A5990}$ | $R_{B1}$ | H | $R_{B10}$ | H |
| $L_{A5991}$ | $R_{B1}$ | H | $R_{A3}$ | H |
| $L_{A5992}$ | $R_{B1}$ | H | $R_{A34}$ | H |
| $L_{A5993}$ | $R_{B1}$ | $R_{B1}$ | $R_{B1}$ | H |
| $L_{A5994}$ | $R_{B1}$ | $R_{B3}$ | $R_{B3}$ | H |
| $L_{A5995}$ | $R_{B1}$ | $R_{B4}$ | $R_{B4}$ | H |
| $L_{A5996}$ | $R_{B1}$ | $R_{B7}$ | $R_{B7}$ | H |
| $L_{A5997}$ | $R_{B1}$ | $R_{B10}$ | $R_{B10}$ | H |
| $L_{A5998}$ | $R_{B1}$ | $R_{A3}$ | $R_{A3}$ | H |
| $L_{A5999}$ | $R_{B1}$ | $R_{A34}$ | $R_{A34}$ | H |
| $L_{A6000}$ | $R_{B1}$ | $R_{B1}$ | $R_{B3}$ | H |
| $L_{A6001}$ | $R_{B1}$ | $R_{B1}$ | $R_{B4}$ | H |
| $L_{A6002}$ | $R_{B1}$ | $R_{B1}$ | $R_{B7}$ | H |
| $L_{A6003}$ | $R_{B1}$ | $R_{B1}$ | $R_{B10}$ | H |
| $L_{A6004}$ | $R_{B1}$ | $R_{B1}$ | $R_{A3}$ | H |
| $L_{A6005}$ | $R_{B1}$ | $R_{B1}$ | $R_{A34}$ | H |
| $L_{A6006}$ | $R_{B1}$ | $R_{B3}$ | $R_{B1}$ | H |
| $L_{A6007}$ | $R_{B1}$ | $R_{B3}$ | $R_{B4}$ | H |
| $L_{A6008}$ | $R_{B1}$ | $R_{B3}$ | $R_{B7}$ | H |
| $L_{A6009}$ | $R_{B1}$ | $R_{B3}$ | $R_{B10}$ | H |
| $L_{A6010}$ | $R_{B1}$ | $R_{B3}$ | $R_{A3}$ | H |
| $L_{A6011}$ | $R_{B1}$ | $R_{B3}$ | $R_{A34}$ | H |
| $L_{A6012}$ | $R_{B1}$ | $R_{B4}$ | $R_{B1}$ | H |
| $L_{A6013}$ | $R_{B1}$ | $R_{B4}$ | $R_{B3}$ | H |
| $L_{A6014}$ | $R_{B1}$ | $R_{B4}$ | $R_{B7}$ | H |
| $L_{A6015}$ | $R_{B1}$ | $R_{B4}$ | $R_{B10}$ | H |
| $L_{A6016}$ | $R_{B1}$ | $R_{B4}$ | $R_{A3}$ | H |
| $L_{A6017}$ | $R_{B1}$ | $R_{B4}$ | $R_{A34}$ | H |
| $L_{A6018}$ | $R_{B1}$ | $R_{B7}$ | $R_{B1}$ | H |
| $L_{A6019}$ | $R_{B1}$ | $R_{B7}$ | $R_{B3}$ | H |
| $L_{A6020}$ | $R_{B1}$ | $R_{B7}$ | $R_{B4}$ | H |
| $L_{A6021}$ | $R_{B1}$ | $R_{B7}$ | $R_{B10}$ | H |
| $L_{A6022}$ | $R_{B1}$ | $R_{B7}$ | $R_{A3}$ | H |
| $L_{A6023}$ | $R_{B1}$ | $R_{B7}$ | $R_{A34}$ | H |
| $L_{A6024}$ | $R_{B1}$ | $R_{B10}$ | $R_{B1}$ | H |
| $L_{A6025}$ | $R_{B1}$ | $R_{B10}$ | $R_{B3}$ | H |
| $L_{A6026}$ | $R_{B1}$ | $R_{B10}$ | $R_{B4}$ | H |
| $L_{A6027}$ | $R_{B1}$ | $R_{B10}$ | $R_{B7}$ | H |
| $L_{A6028}$ | $R_{B1}$ | $R_{B10}$ | $R_{A3}$ | H |
| $L_{A6029}$ | $R_{B1}$ | $R_{B10}$ | $R_{A34}$ | H |
| $L_{A6030}$ | $R_{B1}$ | $R_{A3}$ | $R_{B1}$ | H |
| $L_{A6031}$ | $R_{B1}$ | $R_{A3}$ | $R_{B3}$ | H |
| $L_{A6032}$ | $R_{B1}$ | $R_{A3}$ | $R_{B4}$ | H |
| $L_{A6033}$ | $R_{B1}$ | $R_{A3}$ | $R_{B7}$ | H |
| $L_{A6034}$ | $R_{B1}$ | $R_{A3}$ | $R_{B10}$ | H |
| $L_{A6035}$ | $R_{B1}$ | $R_{A3}$ | $R_{A34}$ | H |
| $L_{A6036}$ | $R_{B1}$ | $R_{A34}$ | $R_{B1}$ | H |
| $L_{A6037}$ | $R_{B1}$ | $R_{A34}$ | $R_{B3}$ | H |
| $L_{A6038}$ | $R_{B1}$ | $R_{A34}$ | $R_{B4}$ | H |
| $L_{A6039}$ | $R_{B1}$ | $R_{A34}$ | $R_{B7}$ | H |
| $L_{A6040}$ | $R_{B1}$ | $R_{A34}$ | $R_{B10}$ | H |
| $L_{A6041}$ | $R_{B1}$ | $R_{A34}$ | $R_{A3}$ | H |
| $L_{A6042}$ | F | H | H | H |
| $L_{A6043}$ | F | $R_{B1}$ | H | H |
| $L_{A6044}$ | F | $R_{B3}$ | H | H |
| $L_{A6045}$ | F | $R_{B4}$ | H | H |
| $L_{A6046}$ | F | $R_{B7}$ | H | H |
| $L_{A6047}$ | F | $R_{B10}$ | H | H |
| $L_{A6048}$ | F | $R_{A3}$ | H | H |
| $L_{A6049}$ | F | $R_{A34}$ | H | H |
| $L_{A6050}$ | F | H | $R_{B1}$ | H |
| $L_{A6051}$ | F | H | $R_{B2}$ | H |
| $L_{A6052}$ | F | H | $R_{B3}$ | H |
| $L_{A6053}$ | F | H | $R_{B4}$ | H |
| $L_{A6054}$ | F | H | $R_{B7}$ | H |
| $L_{A6055}$ | F | H | $R_{B10}$ | H |
| $L_{A6056}$ | F | H | $R_{A3}$ | H |
| $L_{A6057}$ | F | H | $R_{A34}$ | H |
| $L_{A6058}$ | F | $R_{B1}$ | $R_{B1}$ | H |
| $L_{A6059}$ | F | $R_{B3}$ | $R_{B3}$ | H |
| $L_{A6060}$ | F | $R_{B4}$ | $R_{B4}$ | H |
| $L_{A6061}$ | F | $R_{B7}$ | $R_{B7}$ | H |
| $L_{A6062}$ | F | $R_{B10}$ | $R_{B10}$ | H |
| $L_{A6063}$ | F | $R_{A3}$ | $R_{A3}$ | H |
| $L_{A6064}$ | F | $R_{A34}$ | $R_{A34}$ | H |
| $L_{A6065}$ | F | $R_{B1}$ | $R_{B3}$ | H |
| $L_{A6066}$ | F | $R_{B1}$ | $R_{B4}$ | H |
| $L_{A6067}$ | F | $R_{B1}$ | $R_{B7}$ | H |
| $L_{A6068}$ | F | $R_{B1}$ | $R_{B10}$ | H |
| $L_{A6069}$ | F | $R_{B1}$ | $R_{A3}$ | H |
| $L_{A6070}$ | F | $R_{B1}$ | $R_{A34}$ | H |
| $L_{A6071}$ | F | $R_{B3}$ | $R_{B1}$ | H |
| $L_{A6072}$ | F | $R_{B3}$ | $R_{B4}$ | H |
| $L_{A6073}$ | F | $R_{B3}$ | $R_{B7}$ | H |
| $L_{A6074}$ | F | $R_{B3}$ | $R_{B10}$ | H |
| $L_{A6075}$ | F | $R_{B3}$ | $R_{A3}$ | H |
| $L_{A6076}$ | F | $R_{B3}$ | $R_{A34}$ | H |
| $L_{A6077}$ | F | $R_{B4}$ | $R_{B1}$ | H |
| $L_{A6078}$ | F | $R_{B4}$ | $R_{B3}$ | H |
| $L_{A6079}$ | F | $R_{B4}$ | $R_{B7}$ | H |
| $L_{A6080}$ | F | $R_{B4}$ | $R_{B10}$ | H |
| $L_{A6081}$ | F | $R_{B4}$ | $R_{A3}$ | H |
| $L_{A6082}$ | F | $R_{B4}$ | $R_{A34}$ | H |
| $L_{A6083}$ | F | $R_{B7}$ | $R_{B1}$ | H |
| $L_{A6084}$ | F | $R_{B7}$ | $R_{B3}$ | H |
| $L_{A6085}$ | F | $R_{B7}$ | $R_{B4}$ | H |
| $L_{A6086}$ | F | $R_{B7}$ | $R_{B10}$ | H |

-continued

| Ligand | $R^7$ | $R^{11}$ | $R^{12}$ | $R^8$ |
|---|---|---|---|---|
| $L_{A6087}$ | F | $R_{B7}$ | $R_{A3}$ | H |
| $L_{A6088}$ | F | $R_{B7}$ | $R_{A34}$ | H |
| $L_{A6089}$ | F | $R_{B10}$ | $R_{B1}$ | H |
| $L_{A6090}$ | F | $R_{B10}$ | $R_{B3}$ | H |
| $L_{A6091}$ | F | $R_{B10}$ | $R_{B4}$ | H |
| $L_{A6092}$ | F | $R_{B10}$ | $R_{B7}$ | H |
| $L_{A6093}$ | F | $R_{B10}$ | $R_{A3}$ | H |
| $L_{A6094}$ | F | $R_{B10}$ | $R_{A34}$ | H |
| $L_{A6095}$ | F | $R_{A3}$ | $R_{B1}$ | H |
| $L_{A6096}$ | F | $R_{A3}$ | $R_{B3}$ | H |
| $L_{A6097}$ | F | $R_{A3}$ | $R_{B4}$ | H |
| $L_{A6098}$ | F | $R_{A3}$ | $R_{B7}$ | H |
| $L_{A6099}$ | F | $R_{A3}$ | $R_{B10}$ | H |
| $L_{A6100}$ | F | $R_{A3}$ | $R_{A34}$ | H |
| $L_{A6101}$ | F | $R_{A34}$ | $R_{B1}$ | H |
| $L_{A6102}$ | F | $R_{A34}$ | $R_{B3}$ | H |
| $L_{A6103}$ | F | $R_{A34}$ | $R_{B4}$ | H |
| $L_{A6104}$ | F | $R_{A34}$ | $R_{B7}$ | H |
| $L_{A6105}$ | F | $R_{A34}$ | $R_{B10}$ | H |
| $L_{A6106}$ | F | $R_{A34}$ | $R_{A3}$ | H |
| $L_{A6107}$ | H | H | H | $R_{B1}$ |
| $L_{A6108}$ | H | $R_{B1}$ | H | $R_{B1}$ |
| $L_{A6109}$ | H | $R_{B3}$ | H | $R_{B1}$ |
| $L_{A6110}$ | H | $R_{B4}$ | H | $R_{B1}$ |
| $L_{A6111}$ | H | $R_{B7}$ | H | $R_{B1}$ |
| $L_{A6112}$ | H | $R_{B10}$ | H | $R_{B1}$ |
| $L_{A6113}$ | H | $R_{A3}$ | H | $R_{B1}$ |
| $L_{A6114}$ | H | $R_{A34}$ | H | $R_{B1}$ |
| $L_{A6115}$ | H | H | $R_{B1}$ | $R_{B1}$ |
| $L_{A6116}$ | H | H | $R_{B2}$ | $R_{B1}$ |
| $L_{A6117}$ | H | H | $R_{B3}$ | $R_{B1}$ |
| $L_{A6118}$ | H | H | $R_{B4}$ | $R_{B1}$ |
| $L_{A6119}$ | H | H | $R_{B7}$ | $R_{B1}$ |
| $L_{A6120}$ | H | H | $R_{B10}$ | $R_{B1}$ |
| $L_{A6121}$ | H | H | $R_{A3}$ | $R_{B1}$ |
| $L_{A6122}$ | H | H | $R_{A34}$ | $R_{B1}$ |
| $L_{A6123}$ | H | $R_{B1}$ | $R_{B1}$ | $R_{B1}$ |
| $L_{A6124}$ | H | $R_{B3}$ | $R_{B3}$ | $R_{B1}$ |
| $L_{A6125}$ | H | $R_{B4}$ | $R_{B4}$ | $R_{B1}$ |
| $L_{A6126}$ | H | $R_{B7}$ | $R_{B7}$ | $R_{B1}$ |
| $L_{A6127}$ | H | $R_{B10}$ | $R_{B10}$ | $R_{B1}$ |
| $L_{A6128}$ | H | $R_{A3}$ | $R_{A3}$ | $R_{B1}$ |
| $L_{A6129}$ | H | $R_{A34}$ | $R_{A34}$ | $R_{B1}$ |
| $L_{A6130}$ | H | $R_{B1}$ | $R_{B3}$ | $R_{B1}$ |
| $L_{A6131}$ | H | $R_{B1}$ | $R_{B4}$ | $R_{B1}$ |
| $L_{A6132}$ | H | $R_{B1}$ | $R_{B7}$ | $R_{B1}$ |
| $L_{A6133}$ | H | $R_{B1}$ | $R_{B10}$ | $R_{B1}$ |
| $L_{A6134}$ | H | $R_{B1}$ | $R_{A3}$ | $R_{B1}$ |
| $L_{A6135}$ | H | $R_{B1}$ | $R_{A34}$ | $R_{B1}$ |
| $L_{A6136}$ | H | $R_{B3}$ | $R_{B1}$ | $R_{B1}$ |
| $L_{A6137}$ | H | $R_{B3}$ | $R_{B4}$ | $R_{B1}$ |
| $L_{A6138}$ | H | $R_{B3}$ | $R_{B7}$ | $R_{B1}$ |
| $L_{A6139}$ | H | $R_{B3}$ | $R_{B10}$ | $R_{B1}$ |
| $L_{A6140}$ | H | $R_{B3}$ | $R_{A3}$ | $R_{B1}$ |
| $L_{A6141}$ | H | $R_{B3}$ | $R_{A34}$ | $R_{B1}$ |
| $L_{A6142}$ | H | $R_{B4}$ | $R_{B1}$ | $R_{B1}$ |
| $L_{A6143}$ | H | $R_{B4}$ | $R_{B3}$ | $R_{B1}$ |
| $L_{A6144}$ | H | $R_{B4}$ | $R_{B7}$ | $R_{B1}$ |
| $L_{A6145}$ | H | $R_{B4}$ | $R_{B10}$ | $R_{B1}$ |
| $L_{A6146}$ | H | $R_{B4}$ | $R_{A3}$ | $R_{B1}$ |
| $L_{A6147}$ | H | $R_{B4}$ | $R_{A34}$ | $R_{B1}$ |
| $L_{A6148}$ | H | $R_{B7}$ | $R_{B1}$ | $R_{B1}$ |
| $L_{A6149}$ | H | $R_{B7}$ | $R_{B3}$ | $R_{B1}$ |
| $L_{A6150}$ | H | $R_{B7}$ | $R_{B4}$ | $R_{B1}$ |
| $L_{A6151}$ | H | $R_{B7}$ | $R_{B10}$ | $R_{B1}$ |
| $L_{A6152}$ | H | $R_{B7}$ | $R_{A3}$ | $R_{B1}$ |
| $L_{A6153}$ | H | $R_{B7}$ | $R_{A34}$ | $R_{B1}$ |
| $L_{A6154}$ | H | $R_{B10}$ | $R_{B1}$ | $R_{B1}$ |
| $L_{A6155}$ | H | $R_{B10}$ | $R_{B3}$ | $R_{B1}$ |
| $L_{A6156}$ | H | $R_{B10}$ | $R_{B4}$ | $R_{B1}$ |
| $L_{A6157}$ | H | $R_{B10}$ | $R_{B7}$ | $R_{B1}$ |
| $L_{A6158}$ | H | $R_{B10}$ | $R_{A3}$ | $R_{B1}$ |
| $L_{A6159}$ | H | $R_{B10}$ | $R_{A34}$ | $R_{B1}$ |
| $L_{A6160}$ | H | $R_{A3}$ | $R_{B1}$ | $R_{B1}$ |
| $L_{A6161}$ | H | $R_{A3}$ | $R_{B3}$ | $R_{B1}$ |
| $L_{A6162}$ | H | $R_{A3}$ | $R_{B4}$ | $R_{B1}$ |
| $L_{A6163}$ | H | $R_{A3}$ | $R_{B7}$ | $R_{B1}$ |

-continued

| Ligand | $R^7$ | $R^{11}$ | $R^{12}$ | $R^8$ |
|---|---|---|---|---|
| $L_{A6164}$ | H | $R_{A3}$ | $R_{B10}$ | $R_{B1}$ |
| $L_{A6165}$ | H | $R_{A3}$ | $R_{A34}$ | $R_{B1}$ |
| $L_{A6166}$ | H | $R_{A34}$ | $R_{B1}$ | $R_{B1}$ |
| $L_{A6167}$ | H | $R_{A34}$ | $R_{B3}$ | $R_{B1}$ |
| $L_{A6168}$ | H | $R_{A34}$ | $R_{B4}$ | $R_{B1}$ |
| $L_{A6169}$ | H | $R_{A34}$ | $R_{B7}$ | $R_{B1}$ |
| $L_{A6170}$ | H | $R_{A34}$ | $R_{B10}$ | $R_{B1}$ |
| $L_{A6171}$ | H | $R_{A34}$ | $R_{A3}$ | $R_{B1}$ |
| $L_{A6172}$ | H | H | H | F |
| $L_{A6173}$ | H | $R_{B1}$ | H | F |
| $L_{A6174}$ | H | $R_{B3}$ | H | F |
| $L_{A6175}$ | H | $R_{B4}$ | H | F |
| $L_{A6176}$ | H | $R_{B7}$ | H | F |
| $L_{A6177}$ | H | $R_{B10}$ | H | F |
| $L_{A6178}$ | H | $R_{A3}$ | H | F |
| $L_{A6179}$ | H | $R_{A34}$ | H | F |
| $L_{A6180}$ | H | H | $R_{B1}$ | F |
| $L_{A6181}$ | H | H | $R_{B2}$ | F |
| $L_{A6182}$ | H | H | $R_{B3}$ | F |
| $L_{A6183}$ | H | H | $R_{B4}$ | F |
| $L_{A6184}$ | H | H | $R_{B7}$ | F |
| $L_{A6185}$ | H | H | $R_{B10}$ | F |
| $L_{A6186}$ | H | H | $R_{A3}$ | F |
| $L_{A6187}$ | H | H | $R_{A34}$ | F |
| $L_{A6188}$ | H | $R_{B1}$ | $R_{B1}$ | F |
| $L_{A6189}$ | H | $R_{B3}$ | $R_{B3}$ | F |
| $L_{A6190}$ | H | $R_{B4}$ | $R_{B4}$ | F |
| $L_{A6191}$ | H | $R_{B7}$ | $R_{B7}$ | F |
| $L_{A6192}$ | H | $R_{B10}$ | $R_{B10}$ | F |
| $L_{A6193}$ | H | $R_{A3}$ | $R_{A3}$ | F |
| $L_{A6194}$ | H | $R_{A34}$ | $R_{A34}$ | F |
| $L_{A6195}$ | H | $R_{B1}$ | $R_{B3}$ | F |
| $L_{A6196}$ | H | $R_{B1}$ | $R_{B4}$ | F |
| $L_{A6197}$ | H | $R_{B1}$ | $R_{B7}$ | F |
| $L_{A6198}$ | H | $R_{B1}$ | $R_{B10}$ | F |
| $L_{A6199}$ | H | $R_{B1}$ | $R_{A3}$ | F |
| $L_{A6200}$ | H | $R_{B1}$ | $R_{A34}$ | F |
| $L_{A6201}$ | H | $R_{B3}$ | $R_{B1}$ | F |
| $L_{A6202}$ | H | $R_{B3}$ | $R_{B4}$ | F |
| $L_{A6203}$ | H | $R_{B3}$ | $R_{B7}$ | F |
| $L_{A6204}$ | H | $R_{B3}$ | $R_{B10}$ | F |
| $L_{A6205}$ | H | $R_{B3}$ | $R_{A3}$ | F |
| $L_{A6206}$ | H | $R_{B3}$ | $R_{A34}$ | F |
| $L_{A6207}$ | H | $R_{B4}$ | $R_{B1}$ | F |
| $L_{A6208}$ | H | $R_{B4}$ | $R_{B3}$ | F |
| $L_{A6209}$ | H | $R_{B4}$ | $R_{B7}$ | F |
| $L_{A6210}$ | H | $R_{B4}$ | $R_{B10}$ | F |
| $L_{A6211}$ | H | $R_{B4}$ | $R_{A3}$ | F |
| $L_{A6212}$ | H | $R_{B4}$ | $R_{A34}$ | F |
| $L_{A6213}$ | H | $R_{B7}$ | $R_{B1}$ | F |
| $L_{A6214}$ | H | $R_{B7}$ | $R_{B3}$ | F |
| $L_{A6215}$ | H | $R_{B7}$ | $R_{B4}$ | F |
| $L_{A6216}$ | H | $R_{B7}$ | $R_{B10}$ | F |
| $L_{A6217}$ | H | $R_{B7}$ | $R_{A3}$ | F |
| $L_{A6218}$ | H | $R_{B7}$ | $R_{A34}$ | F |
| $L_{A6219}$ | H | $R_{B10}$ | $R_{B1}$ | F |
| $L_{A6220}$ | H | $R_{B10}$ | $R_{B3}$ | F |
| $L_{A6221}$ | H | $R_{B10}$ | $R_{B4}$ | F |
| $L_{A6222}$ | H | $R_{B10}$ | $R_{B7}$ | F |
| $L_{A6223}$ | H | $R_{B10}$ | $R_{A3}$ | F |
| $L_{A6224}$ | H | $R_{B10}$ | $R_{A34}$ | F |
| $L_{A6225}$ | H | $R_{A3}$ | $R_{B1}$ | F |
| $L_{A6226}$ | H | $R_{A3}$ | $R_{B3}$ | F |
| $L_{A6227}$ | H | $R_{A3}$ | $R_{B4}$ | F |
| $L_{A6228}$ | H | $R_{A3}$ | $R_{B7}$ | F |
| $L_{A6229}$ | H | $R_{A3}$ | $R_{B10}$ | F |
| $L_{A6230}$ | H | $R_{A3}$ | $R_{A34}$ | F |
| $L_{A6231}$ | H | $R_{A34}$ | $R_{B1}$ | F |
| $L_{A6232}$ | H | $R_{A34}$ | $R_{B3}$ | F |
| $L_{A6233}$ | H | $R_{A34}$ | $R_{B4}$ | F |
| $L_{A6234}$ | H | $R_{A34}$ | $R_{B7}$ | F |
| $L_{A6235}$ | H | $R_{A34}$ | $R_{B10}$ | F |
| $L_{A6236}$ | H | $R_{A34}$ | $R_{A3}$ | F |

$L_{A6237}$ through $L_{A6496}$ that are based on a structure of Formula XXVI,

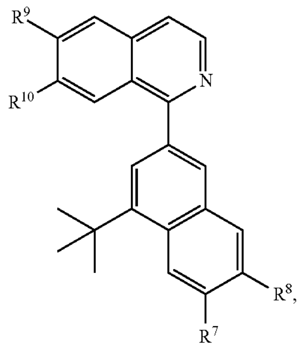

in which $R^7$, $R^8$, $R^9$, and $R^{10}$ are defined as provided below:

| Ligand | $R^7$ | $R^8$ | $R^9$ | $R^{10}$ |
|---|---|---|---|---|
| $L_{A6237}$ | $R_{B1}$ | H | H | H |
| $L_{A6238}$ | $R_{B1}$ | H | $R_{B1}$ | H |
| $L_{A6239}$ | $R_{B1}$ | H | $R_{B3}$ | H |
| $L_{A6240}$ | $R_{B1}$ | H | $R_{B4}$ | H |
| $L_{A6241}$ | $R_{B1}$ | H | $R_{B7}$ | H |
| $L_{A6242}$ | $R_{B1}$ | H | $R_{B10}$ | H |
| $L_{A6243}$ | $R_{B1}$ | H | $R_{A3}$ | H |
| $L_{A6244}$ | $R_{B1}$ | H | $R_{A34}$ | H |
| $L_{A6245}$ | $R_{B1}$ | H | H | $R_{B1}$ |
| $L_{A6246}$ | $R_{B1}$ | H | H | $R_{B2}$ |
| $L_{A6247}$ | $R_{B1}$ | H | H | $R_{B3}$ |
| $L_{A6248}$ | $R_{B1}$ | H | H | $R_{B4}$ |
| $L_{A6249}$ | $R_{B1}$ | H | H | $R_{B7}$ |
| $L_{A6250}$ | $R_{B1}$ | H | H | $R_{B10}$ |
| $L_{A6251}$ | $R_{B1}$ | H | H | $R_{A3}$ |
| $L_{A6252}$ | $R_{B1}$ | H | H | $R_{A34}$ |
| $L_{A6253}$ | $R_{B1}$ | H | $R_{B1}$ | $R_{B1}$ |
| $L_{A6254}$ | $R_{B1}$ | H | $R_{B3}$ | $R_{B3}$ |
| $L_{A6255}$ | $R_{B1}$ | H | $R_{B4}$ | $R_{B4}$ |
| $L_{A6256}$ | $R_{B1}$ | H | $R_{B7}$ | $R_{B7}$ |
| $L_{A6257}$ | $R_{B1}$ | H | $R_{B10}$ | $R_{B10}$ |
| $L_{A6258}$ | $R_{B1}$ | H | $R_{A3}$ | $R_{A3}$ |
| $L_{A6259}$ | $R_{B1}$ | H | $R_{A34}$ | $R_{A34}$ |
| $L_{A6260}$ | $R_{B1}$ | H | $R_{B1}$ | $R_{B3}$ |
| $L_{A6261}$ | $R_{B1}$ | H | $R_{B1}$ | $R_{B4}$ |
| $L_{A6262}$ | $R_{B1}$ | H | $R_{B1}$ | $R_{B7}$ |
| $L_{A6263}$ | $R_{B1}$ | H | $R_{B1}$ | $R_{B10}$ |
| $L_{A6264}$ | $R_{B1}$ | H | $R_{B1}$ | $R_{A3}$ |
| $L_{A6265}$ | $R_{B1}$ | H | $R_{B1}$ | $R_{A34}$ |
| $L_{A6266}$ | $R_{B1}$ | H | $R_{B3}$ | $R_{B1}$ |
| $L_{A6267}$ | $R_{B1}$ | H | $R_{B3}$ | $R_{B4}$ |
| $L_{A6268}$ | $R_{B1}$ | H | $R_{B3}$ | $R_{B7}$ |
| $L_{A6269}$ | $R_{B1}$ | H | $R_{B3}$ | $R_{B10}$ |
| $L_{A6270}$ | $R_{B1}$ | H | $R_{B3}$ | $R_{A3}$ |
| $L_{A6271}$ | $R_{B1}$ | H | $R_{B3}$ | $R_{A34}$ |
| $L_{A6272}$ | $R_{B1}$ | H | $R_{B4}$ | $R_{B1}$ |
| $L_{A6273}$ | $R_{B1}$ | H | $R_{B4}$ | $R_{B3}$ |
| $L_{A6274}$ | $R_{B1}$ | H | $R_{B4}$ | $R_{B7}$ |
| $L_{A6275}$ | $R_{B1}$ | H | $R_{B4}$ | $R_{B10}$ |
| $L_{A6276}$ | $R_{B1}$ | H | $R_{B4}$ | $R_{A3}$ |
| $L_{A6277}$ | $R_{B1}$ | H | $R_{B4}$ | $R_{A34}$ |
| $L_{A6278}$ | $R_{B1}$ | H | $R_{B7}$ | $R_{B1}$ |
| $L_{A6279}$ | $R_{B1}$ | H | $R_{B7}$ | $R_{B3}$ |
| $L_{A6280}$ | $R_{B1}$ | H | $R_{B7}$ | $R_{B4}$ |
| $L_{A6281}$ | $R_{B1}$ | H | $R_{B7}$ | $R_{B10}$ |
| $L_{A6282}$ | $R_{B1}$ | H | $R_{B7}$ | $R_{A3}$ |
| $L_{A6283}$ | $R_{B1}$ | H | $R_{B7}$ | $R_{A34}$ |
| $L_{A6284}$ | $R_{B1}$ | H | $R_{B10}$ | $R_{B1}$ |
| $L_{A6285}$ | $R_{B1}$ | H | $R_{B10}$ | $R_{B3}$ |
| $L_{A6286}$ | $R_{B1}$ | H | $R_{B10}$ | $R_{B4}$ |
| $L_{A6287}$ | $R_{B1}$ | H | $R_{B10}$ | $R_{B7}$ |
| $L_{A6288}$ | $R_{B1}$ | H | $R_{B10}$ | $R_{A3}$ |
| $L_{A6289}$ | $R_{B1}$ | H | $R_{B10}$ | $R_{A34}$ |
| $L_{A6290}$ | $R_{B1}$ | H | $R_{A3}$ | $R_{B1}$ |

-continued

| Ligand | $R^7$ | $R^8$ | $R^9$ | $R^{10}$ |
|---|---|---|---|---|
| $L_{A6291}$ | $R_{B1}$ | H | $R_{A3}$ | $R_{B3}$ |
| $L_{A6292}$ | $R_{B1}$ | H | $R_{A3}$ | $R_{B4}$ |
| $L_{A6293}$ | $R_{B1}$ | H | $R_{A3}$ | $R_{B7}$ |
| $L_{A6294}$ | $R_{B1}$ | H | $R_{A3}$ | $R_{B10}$ |
| $L_{A6295}$ | $R_{B1}$ | H | $R_{A3}$ | $R_{A34}$ |
| $L_{A6296}$ | $R_{B1}$ | H | $R_{A34}$ | $R_{B1}$ |
| $L_{A6297}$ | $R_{B1}$ | H | $R_{A34}$ | $R_{B3}$ |
| $L_{A6298}$ | $R_{B1}$ | H | $R_{A34}$ | $R_{B4}$ |
| $L_{A6299}$ | $R_{B1}$ | H | $R_{A34}$ | $R_{B7}$ |
| $L_{A6300}$ | $R_{B1}$ | H | $R_{A34}$ | $R_{B10}$ |
| $L_{A6301}$ | $R_{B1}$ | H | $R_{A34}$ | $R_{A3}$ |
| $L_{A6302}$ | F | H | H | H |
| $L_{A6303}$ | F | H | $R_{B1}$ | H |
| $L_{A6304}$ | F | H | $R_{B3}$ | H |
| $L_{A6305}$ | F | H | $R_{B4}$ | H |
| $L_{A6306}$ | F | H | $R_{B7}$ | H |
| $L_{A6307}$ | F | H | $R_{B10}$ | H |
| $L_{A6308}$ | F | H | $R_{A3}$ | H |
| $L_{A6309}$ | F | H | $R_{A34}$ | H |
| $L_{A6310}$ | F | H | H | $R_{B1}$ |
| $L_{A6311}$ | F | H | H | $R_{B2}$ |
| $L_{A6312}$ | F | H | H | $R_{B3}$ |
| $L_{A6313}$ | F | H | H | $R_{B4}$ |
| $L_{A6314}$ | F | H | H | $R_{B7}$ |
| $L_{A6315}$ | F | H | H | $R_{B10}$ |
| $L_{A6316}$ | F | H | H | $R_{A3}$ |
| $L_{A6317}$ | F | H | H | $R_{A34}$ |
| $L_{A6318}$ | F | H | $R_{B1}$ | $R_{B1}$ |
| $L_{A6319}$ | F | H | $R_{B3}$ | $R_{B3}$ |
| $L_{A6320}$ | F | H | $R_{B4}$ | $R_{B4}$ |
| $L_{A6321}$ | F | H | $R_{B7}$ | $R_{B7}$ |
| $L_{A6322}$ | F | H | $R_{B10}$ | $R_{B10}$ |
| $L_{A6323}$ | F | H | $R_{A3}$ | $R_{A3}$ |
| $L_{A6324}$ | F | H | $R_{A34}$ | $R_{A34}$ |
| $L_{A6325}$ | F | H | $R_{B1}$ | $R_{B3}$ |
| $L_{A6326}$ | F | H | $R_{B1}$ | $R_{B4}$ |
| $L_{A6327}$ | F | H | $R_{B1}$ | $R_{B7}$ |
| $L_{A6328}$ | F | H | $R_{B1}$ | $R_{B10}$ |
| $L_{A6329}$ | F | H | $R_{B1}$ | $R_{A3}$ |
| $L_{A6330}$ | F | H | $R_{B1}$ | $R_{A34}$ |
| $L_{A6331}$ | F | H | $R_{B3}$ | $R_{B1}$ |
| $L_{A6332}$ | F | H | $R_{B3}$ | $R_{B4}$ |
| $L_{A6333}$ | F | H | $R_{B3}$ | $R_{B7}$ |
| $L_{A6334}$ | F | H | $R_{B3}$ | $R_{B10}$ |
| $L_{A6335}$ | F | H | $R_{B3}$ | $R_{A3}$ |
| $L_{A6336}$ | F | H | $R_{B3}$ | $R_{A34}$ |
| $L_{A6337}$ | F | H | $R_{B4}$ | $R_{B1}$ |
| $L_{A6338}$ | F | H | $R_{B4}$ | $R_{B3}$ |
| $L_{A6339}$ | F | H | $R_{B4}$ | $R_{B7}$ |
| $L_{A6340}$ | F | H | $R_{B4}$ | $R_{B10}$ |
| $L_{A6341}$ | F | H | $R_{B4}$ | $R_{A3}$ |
| $L_{A6342}$ | F | H | $R_{B4}$ | $R_{A34}$ |
| $L_{A6343}$ | F | H | $R_{B7}$ | $R_{B1}$ |
| $L_{A6344}$ | F | H | $R_{B7}$ | $R_{B3}$ |
| $L_{A6345}$ | F | H | $R_{B7}$ | $R_{B4}$ |
| $L_{A6346}$ | F | H | $R_{B7}$ | $R_{B10}$ |
| $L_{A6347}$ | F | H | $R_{B7}$ | $R_{A3}$ |
| $L_{A6348}$ | F | H | $R_{B7}$ | $R_{A34}$ |
| $L_{A6349}$ | F | H | $R_{B10}$ | $R_{B1}$ |
| $L_{A6350}$ | F | H | $R_{B10}$ | $R_{B3}$ |
| $L_{A6351}$ | F | H | $R_{B10}$ | $R_{B4}$ |
| $L_{A6352}$ | F | H | $R_{B10}$ | $R_{B7}$ |
| $L_{A6353}$ | F | H | $R_{B10}$ | $R_{A3}$ |
| $L_{A6354}$ | F | H | $R_{B10}$ | $R_{A34}$ |
| $L_{A6355}$ | F | H | $R_{A3}$ | $R_{B1}$ |
| $L_{A6356}$ | F | H | $R_{A3}$ | $R_{B3}$ |
| $L_{A6357}$ | F | H | $R_{A3}$ | $R_{B4}$ |
| $L_{A6358}$ | F | H | $R_{A3}$ | $R_{B7}$ |
| $L_{A6359}$ | F | H | $R_{A3}$ | $R_{B10}$ |
| $L_{A6360}$ | F | H | $R_{A3}$ | $R_{A34}$ |
| $L_{A6361}$ | F | H | $R_{A34}$ | $R_{B1}$ |
| $L_{A6362}$ | F | H | $R_{A34}$ | $R_{B3}$ |
| $L_{A6363}$ | F | H | $R_{A34}$ | $R_{B4}$ |
| $L_{A6364}$ | F | H | $R_{A34}$ | $R_{B7}$ |
| $L_{A6365}$ | F | H | $R_{A34}$ | $R_{B10}$ |
| $L_{A6366}$ | F | H | $R_{A34}$ | $R_{A3}$ |
| $L_{A6367}$ | H | $R_{B1}$ | H | H |

-continued

| Ligand | $R^7$ | $R^8$ | $R^9$ | $R^{10}$ |
|---|---|---|---|---|
| $L_{A6368}$ | H | $R_{B1}$ | $R_{B1}$ | H |
| $L_{A6369}$ | H | $R_{B1}$ | $R_{B3}$ | H |
| $L_{A6370}$ | H | $R_{B1}$ | $R_{B4}$ | H |
| $L_{A6371}$ | H | $R_{B1}$ | $R_{B7}$ | H |
| $L_{A6372}$ | H | $R_{B1}$ | $R_{B10}$ | H |
| $L_{A6373}$ | H | $R_{B1}$ | $R_{A3}$ | H |
| $L_{A6374}$ | H | $R_{B1}$ | $R_{A34}$ | H |
| $L_{A6375}$ | H | $R_{B1}$ | H | $R_{B1}$ |
| $L_{A6376}$ | H | $R_{B1}$ | H | $R_{B2}$ |
| $L_{A6377}$ | H | $R_{B1}$ | H | $R_{B3}$ |
| $L_{A6378}$ | H | $R_{B1}$ | H | $R_{B4}$ |
| $L_{A6379}$ | H | $R_{B1}$ | H | $R_{B7}$ |
| $L_{A6380}$ | H | $R_{B1}$ | H | $R_{B10}$ |
| $L_{A6381}$ | H | $R_{B1}$ | H | $R_{A3}$ |
| $L_{A6382}$ | H | $R_{B1}$ | H | $R_{A34}$ |
| $L_{A6383}$ | H | $R_{B1}$ | $R_{B1}$ | $R_{B1}$ |
| $L_{A6384}$ | H | $R_{B1}$ | $R_{B3}$ | $R_{B3}$ |
| $L_{A6385}$ | H | $R_{B1}$ | $R_{B4}$ | $R_{B4}$ |
| $L_{A6386}$ | H | $R_{B1}$ | $R_{B7}$ | $R_{B7}$ |
| $L_{A6387}$ | H | $R_{B1}$ | $R_{B10}$ | $R_{B10}$ |
| $L_{A6388}$ | H | $R_{B1}$ | $R_{A3}$ | $R_{A3}$ |
| $L_{A6389}$ | H | $R_{B1}$ | $R_{A34}$ | $R_{A34}$ |
| $L_{A6390}$ | H | $R_{B1}$ | $R_{B1}$ | $R_{B3}$ |
| $L_{A6391}$ | H | $R_{B1}$ | $R_{B1}$ | $R_{B4}$ |
| $L_{A6392}$ | H | $R_{B1}$ | $R_{B1}$ | $R_{B7}$ |
| $L_{A6393}$ | H | $R_{B1}$ | $R_{B1}$ | $R_{B10}$ |
| $L_{A6394}$ | H | $R_{B1}$ | $R_{B1}$ | $R_{A3}$ |
| $L_{A6395}$ | H | $R_{B1}$ | $R_{B1}$ | $R_{A34}$ |
| $L_{A6396}$ | H | $R_{B1}$ | $R_{B3}$ | $R_{B1}$ |
| $L_{A6397}$ | H | $R_{B1}$ | $R_{B3}$ | $R_{B4}$ |
| $L_{A6398}$ | H | $R_{B1}$ | $R_{B3}$ | $R_{B7}$ |
| $L_{A6399}$ | H | $R_{B1}$ | $R_{B3}$ | $R_{B10}$ |
| $L_{A6400}$ | H | $R_{B1}$ | $R_{B3}$ | $R_{A3}$ |
| $L_{A6401}$ | H | $R_{B1}$ | $R_{B3}$ | $R_{A34}$ |
| $L_{A6402}$ | H | $R_{B1}$ | $R_{B4}$ | $R_{B1}$ |
| $L_{A6403}$ | H | $R_{B1}$ | $R_{B4}$ | $R_{B3}$ |
| $L_{A6404}$ | H | $R_{B1}$ | $R_{B4}$ | $R_{B7}$ |
| $L_{A6405}$ | H | $R_{B1}$ | $R_{B4}$ | $R_{B10}$ |
| $L_{A6406}$ | H | $R_{B1}$ | $R_{B4}$ | $R_{A3}$ |
| $L_{A6407}$ | H | $R_{B1}$ | $R_{B4}$ | $R_{A34}$ |
| $L_{A6408}$ | H | $R_{B1}$ | $R_{B7}$ | $R_{B1}$ |
| $L_{A6409}$ | H | $R_{B1}$ | $R_{B7}$ | $R_{B3}$ |
| $L_{A6410}$ | H | $R_{B1}$ | $R_{B7}$ | $R_{B4}$ |
| $L_{A6411}$ | H | $R_{B1}$ | $R_{B7}$ | $R_{B10}$ |
| $L_{A6412}$ | H | $R_{B1}$ | $R_{B7}$ | $R_{A3}$ |
| $L_{A6413}$ | H | $R_{B1}$ | $R_{B7}$ | $R_{A34}$ |
| $L_{A6414}$ | H | $R_{B1}$ | $R_{B10}$ | $R_{B1}$ |
| $L_{A6415}$ | H | $R_{B1}$ | $R_{B10}$ | $R_{B3}$ |
| $L_{A6416}$ | H | $R_{B1}$ | $R_{B10}$ | $R_{B4}$ |
| $L_{A6417}$ | H | $R_{B1}$ | $R_{B10}$ | $R_{B7}$ |
| $L_{A6418}$ | H | $R_{B1}$ | $R_{B10}$ | $R_{A3}$ |
| $L_{A6419}$ | H | $R_{B1}$ | $R_{B10}$ | $R_{A34}$ |
| $L_{A6420}$ | H | $R_{B1}$ | $R_{A3}$ | $R_{B1}$ |
| $L_{A6421}$ | H | $R_{B1}$ | $R_{A3}$ | $R_{B3}$ |
| $L_{A6422}$ | H | $R_{B1}$ | $R_{A3}$ | $R_{B4}$ |
| $L_{A6423}$ | H | $R_{B1}$ | $R_{A3}$ | $R_{B7}$ |
| $L_{A6424}$ | H | $R_{B1}$ | $R_{A3}$ | $R_{B10}$ |
| $L_{A6425}$ | H | $R_{B1}$ | $R_{A3}$ | $R_{A34}$ |
| $L_{A6426}$ | H | $R_{B1}$ | $R_{A34}$ | $R_{B1}$ |
| $L_{A6427}$ | H | $R_{B1}$ | $R_{A34}$ | $R_{B3}$ |
| $L_{A6428}$ | H | $R_{B1}$ | $R_{A34}$ | $R_{B4}$ |
| $L_{A6429}$ | H | $R_{B1}$ | $R_{A34}$ | $R_{B7}$ |
| $L_{A6430}$ | H | $R_{B1}$ | $R_{A34}$ | $R_{B10}$ |
| $L_{A6431}$ | H | $R_{B1}$ | $R_{A34}$ | $R_{A3}$ |
| $L_{A6432}$ | H | F | H | H |
| $L_{A6433}$ | H | F | $R_{B1}$ | H |
| $L_{A6434}$ | H | F | $R_{B3}$ | H |
| $L_{A6435}$ | H | F | $R_{B4}$ | H |
| $L_{A6436}$ | H | F | $R_{B7}$ | H |
| $L_{A6437}$ | H | F | $R_{B10}$ | H |
| $L_{A6438}$ | H | F | $R_{A3}$ | H |
| $L_{A6439}$ | H | F | $R_{A34}$ | H |
| $L_{A6440}$ | H | F | H | $R_{B1}$ |
| $L_{A6441}$ | H | F | H | $R_{B2}$ |
| $L_{A6442}$ | H | F | H | $R_{B3}$ |
| $L_{A6443}$ | H | F | H | $R_{B4}$ |
| $L_{A6444}$ | H | F | H | $R_{B7}$ |

-continued

| Ligand | $R^7$ | $R^8$ | $R^9$ | $R^{10}$ |
|---|---|---|---|---|
| $L_{A6445}$ | H | F | H | $R_{B10}$ |
| $L_{A6446}$ | H | F | H | $R_{A3}$ |
| $L_{A6447}$ | H | F | H | $R_{A34}$ |
| $L_{A6448}$ | H | F | $R_{B1}$ | $R_{B1}$ |
| $L_{A6449}$ | H | F | $R_{B3}$ | $R_{B3}$ |
| $L_{A6450}$ | H | F | $R_{B4}$ | $R_{B4}$ |
| $L_{A6451}$ | H | F | $R_{B7}$ | $R_{B7}$ |
| $L_{A6452}$ | H | F | $R_{B10}$ | $R_{B10}$ |
| $L_{A6453}$ | H | F | $R_{A3}$ | $R_{A3}$ |
| $L_{A6454}$ | H | F | $R_{A34}$ | $R_{A34}$ |
| $L_{A6455}$ | H | F | $R_{B1}$ | $R_{B3}$ |
| $L_{A6456}$ | H | F | $R_{B1}$ | $R_{B4}$ |
| $L_{A6457}$ | H | F | $R_{B1}$ | $R_{B7}$ |
| $L_{A6458}$ | H | F | $R_{B1}$ | $R_{B10}$ |
| $L_{A6459}$ | H | F | $R_{B1}$ | $R_{A3}$ |
| $L_{A6460}$ | H | F | $R_{B1}$ | $R_{A34}$ |
| $L_{A6461}$ | H | F | $R_{B3}$ | $R_{B1}$ |
| $L_{A6462}$ | H | F | $R_{B3}$ | $R_{B4}$ |
| $L_{A6463}$ | H | F | $R_{B3}$ | $R_{B7}$ |
| $L_{A6464}$ | H | F | $R_{B3}$ | $R_{B10}$ |
| $L_{A6465}$ | H | F | $R_{B3}$ | $R_{A3}$ |
| $L_{A6466}$ | H | F | $R_{B3}$ | $R_{A34}$ |
| $L_{A6467}$ | H | F | $R_{B4}$ | $R_{B1}$ |
| $L_{A6468}$ | H | F | $R_{B4}$ | $R_{B3}$ |
| $L_{A6469}$ | H | F | $R_{B4}$ | $R_{B7}$ |
| $L_{A6470}$ | H | F | $R_{B4}$ | $R_{B10}$ |
| $L_{A6471}$ | H | F | $R_{B4}$ | $R_{A3}$ |
| $L_{A6472}$ | H | F | $R_{B4}$ | $R_{A34}$ |
| $L_{A6473}$ | H | F | $R_{B7}$ | $R_{B1}$ |
| $L_{A6474}$ | H | F | $R_{B7}$ | $R_{B3}$ |
| $L_{A6475}$ | H | F | $R_{B7}$ | $R_{B4}$ |
| $L_{A6476}$ | H | F | $R_{B7}$ | $R_{B10}$ |
| $L_{A6477}$ | H | F | $R_{B7}$ | $R_{A3}$ |
| $L_{A6478}$ | H | F | $R_{B7}$ | $R_{A34}$ |
| $L_{A6479}$ | H | F | $R_{B10}$ | $R_{B1}$ |
| $L_{A6480}$ | H | F | $R_{B10}$ | $R_{B3}$ |
| $L_{A6481}$ | H | F | $R_{B10}$ | $R_{B4}$ |
| $L_{A6482}$ | H | F | $R_{B10}$ | $R_{B7}$ |
| $L_{A6483}$ | H | F | $R_{B10}$ | $R_{A3}$ |
| $L_{A6484}$ | H | F | $R_{B10}$ | $R_{A34}$ |
| $L_{A6485}$ | H | F | $R_{A3}$ | $R_{B1}$ |
| $L_{A6486}$ | H | F | $R_{A3}$ | $R_{B3}$ |
| $L_{A6487}$ | H | F | $R_{A3}$ | $R_{B4}$ |
| $L_{A6488}$ | H | F | $R_{A3}$ | $R_{B7}$ |
| $L_{A6489}$ | H | F | $R_{A3}$ | $R_{B10}$ |
| $L_{A6490}$ | H | F | $R_{A3}$ | $R_{A34}$ |
| $L_{A6491}$ | H | F | $R_{A34}$ | $R_{B1}$ |
| $L_{A6492}$ | H | F | $R_{A34}$ | $R_{B3}$ |
| $L_{A6493}$ | H | F | $R_{A34}$ | $R_{B4}$ |
| $L_{A6494}$ | H | F | $R_{A34}$ | $R_{B7}$ |
| $L_{A6495}$ | H | F | $R_{A34}$ | $R_{B10}$ |
| $L_{A6496}$ | H | F | $R_{A34}$ | $R_{A3}$ |

$L_{A6497}$ through $L_{A6756}$ that are based on a structure of Formula XXVI,

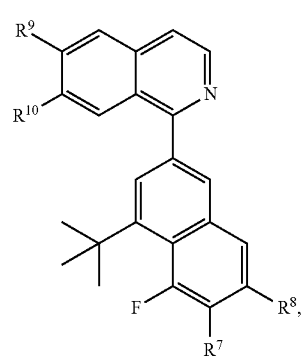

in which $R^7$, $R^8$, $R^9$, and $R^{10}$ are defined as provided below:

| Ligand | $R^7$ | $R^8$ | $R^9$ | $R^{10}$ |
|---|---|---|---|---|
| $L_{A46497}$ | $R_{B1}$ | H | H | H |
| $L_{A46498}$ | $R_{B1}$ | H | $R_{B1}$ | H |
| $L_{A46499}$ | $R_{B1}$ | H | $R_{B3}$ | H |
| $L_{A46500}$ | $R_{B1}$ | H | $R_{B4}$ | H |
| $L_{A46501}$ | $R_{B1}$ | H | $R_{B7}$ | H |
| $L_{A46502}$ | $R_{B1}$ | H | $R_{B10}$ | H |
| $L_{A46503}$ | $R_{B1}$ | H | $R_{A3}$ | H |
| $L_{A46504}$ | $R_{B1}$ | H | $R_{A34}$ | H |
| $L_{A46505}$ | $R_{B1}$ | H | H | $R_{B1}$ |
| $L_{A46506}$ | $R_{B1}$ | H | H | $R_{B2}$ |
| $L_{A46507}$ | $R_{B1}$ | H | H | $R_{B3}$ |
| $L_{A46508}$ | $R_{B1}$ | H | H | $R_{B4}$ |
| $L_{A46509}$ | $R_{B1}$ | H | H | $R_{B7}$ |
| $L_{A46510}$ | $R_{B1}$ | H | H | $R_{B10}$ |
| $L_{A46511}$ | $R_{B1}$ | H | H | $R_{A3}$ |
| $L_{A46512}$ | $R_{B1}$ | H | H | $R_{A34}$ |
| $L_{A46513}$ | $R_{B1}$ | H | $R_{B1}$ | $R_{B1}$ |
| $L_{A46514}$ | $R_{B1}$ | H | $R_{B3}$ | $R_{B3}$ |
| $L_{A46515}$ | $R_{B1}$ | H | $R_{B4}$ | $R_{B4}$ |
| $L_{A46516}$ | $R_{B1}$ | H | $R_{B7}$ | $R_{B7}$ |
| $L_{A46517}$ | $R_{B1}$ | H | $R_{B10}$ | $R_{B10}$ |
| $L_{A46518}$ | $R_{B1}$ | H | $R_{A3}$ | $R_{A3}$ |
| $L_{A46519}$ | $R_{B1}$ | H | $R_{A34}$ | $R_{A34}$ |
| $L_{A46520}$ | $R_{B1}$ | H | $R_{B1}$ | $R_{B3}$ |
| $L_{A46521}$ | $R_{B1}$ | H | $R_{B1}$ | $R_{B4}$ |
| $L_{A46522}$ | $R_{B1}$ | H | $R_{B1}$ | $R_{B7}$ |
| $L_{A46523}$ | $R_{B1}$ | H | $R_{B1}$ | $R_{B10}$ |
| $L_{A46524}$ | $R_{B1}$ | H | $R_{B1}$ | $R_{A3}$ |
| $L_{A46525}$ | $R_{B1}$ | H | $R_{B1}$ | $R_{A34}$ |
| $L_{A46526}$ | $R_{B1}$ | H | $R_{B3}$ | $R_{B1}$ |
| $L_{A46527}$ | $R_{B1}$ | H | $R_{B3}$ | $R_{B4}$ |
| $L_{A46528}$ | $R_{B1}$ | H | $R_{B3}$ | $R_{B7}$ |
| $L_{A46529}$ | $R_{B1}$ | H | $R_{B3}$ | $R_{B10}$ |
| $L_{A46530}$ | $R_{B1}$ | H | $R_{B3}$ | $R_{A3}$ |
| $L_{A46531}$ | $R_{B1}$ | H | $R_{B3}$ | $R_{A34}$ |
| $L_{A46532}$ | $R_{B1}$ | H | $R_{B4}$ | $R_{B1}$ |
| $L_{A46533}$ | $R_{B1}$ | H | $R_{B4}$ | $R_{B3}$ |
| $L_{A46534}$ | $R_{B1}$ | H | $R_{B4}$ | $R_{B7}$ |
| $L_{A46535}$ | $R_{B1}$ | H | $R_{B4}$ | $R_{B10}$ |
| $L_{A46536}$ | $R_{B1}$ | H | $R_{B4}$ | $R_{A3}$ |
| $L_{A46537}$ | $R_{B1}$ | H | $R_{B4}$ | $R_{A34}$ |
| $L_{A46538}$ | $R_{B1}$ | H | $R_{B7}$ | $R_{B1}$ |
| $L_{A46539}$ | $R_{B1}$ | H | $R_{B7}$ | $R_{B3}$ |
| $L_{A46540}$ | $R_{B1}$ | H | $R_{B7}$ | $R_{B4}$ |
| $L_{A46541}$ | $R_{B1}$ | H | $R_{B7}$ | $R_{B10}$ |
| $L_{A46542}$ | $R_{B1}$ | H | $R_{B7}$ | $R_{A3}$ |
| $L_{A46543}$ | $R_{B1}$ | H | $R_{B7}$ | $R_{A34}$ |
| $L_{A46544}$ | $R_{B1}$ | H | $R_{B10}$ | $R_{B1}$ |
| $L_{A46545}$ | $R_{B1}$ | H | $R_{B10}$ | $R_{B3}$ |
| $L_{A46546}$ | $R_{B1}$ | H | $R_{B10}$ | $R_{B4}$ |
| $L_{A46547}$ | $R_{B1}$ | H | $R_{B10}$ | $R_{B7}$ |
| $L_{A46548}$ | $R_{B1}$ | H | $R_{B10}$ | $R_{A3}$ |
| $L_{A46549}$ | $R_{B1}$ | H | $R_{B10}$ | $R_{A34}$ |
| $L_{A46550}$ | $R_{B1}$ | H | $R_{A3}$ | $R_{B1}$ |
| $L_{A46551}$ | $R_{B1}$ | H | $R_{A3}$ | $R_{B3}$ |
| $L_{A46552}$ | $R_{B1}$ | H | $R_{A3}$ | $R_{B4}$ |
| $L_{A46553}$ | $R_{B1}$ | H | $R_{A3}$ | $R_{B7}$ |
| $L_{A46554}$ | $R_{B1}$ | H | $R_{A3}$ | $R_{B10}$ |
| $L_{A46555}$ | $R_{B1}$ | H | $R_{A3}$ | $R_{A34}$ |
| $L_{A46556}$ | $R_{B1}$ | H | $R_{A34}$ | $R_{B1}$ |
| $L_{A46557}$ | $R_{B1}$ | H | $R_{A34}$ | $R_{B3}$ |
| $L_{A46558}$ | $R_{B1}$ | H | $R_{A34}$ | $R_{B4}$ |
| $L_{A46559}$ | $R_{B1}$ | H | $R_{A34}$ | $R_{B7}$ |
| $L_{A46560}$ | $R_{B1}$ | H | $R_{A34}$ | $R_{B10}$ |
| $L_{A46561}$ | $R_{B1}$ | H | $R_{A34}$ | $R_{A3}$ |
| $L_{A46562}$ | F | H | H | H |
| $L_{A46563}$ | F | H | $R_{B1}$ | H |
| $L_{A46564}$ | F | H | $R_{B3}$ | H |
| $L_{A46565}$ | F | H | $R_{B4}$ | H |
| $L_{A46566}$ | F | H | $R_{B7}$ | H |
| $L_{A46567}$ | F | H | $R_{B10}$ | H |
| $L_{A46568}$ | F | H | $R_{A3}$ | H |
| $L_{A46569}$ | F | H | $R_{A34}$ | H |
| $L_{A46570}$ | F | H | H | $R_{B1}$ |
| $L_{A46571}$ | F | H | H | $R_{B2}$ |
| $L_{A46572}$ | F | H | H | $R_{B3}$ |

-continued

| Ligand | $R^7$ | $R^8$ | $R^9$ | $R^{10}$ |
|---|---|---|---|---|
| $L_{A46573}$ | F | H | H | $R_{B4}$ |
| $L_{A46574}$ | F | H | H | $R_{B7}$ |
| $L_{A46575}$ | F | H | H | $R_{B10}$ |
| $L_{A46576}$ | F | H | H | $R_{A3}$ |
| $L_{A46577}$ | F | H | H | $R_{A34}$ |
| $L_{A46578}$ | F | H | $R_{B1}$ | $R_{B1}$ |
| $L_{A46579}$ | F | H | $R_{B3}$ | $R_{B3}$ |
| $L_{A46580}$ | F | H | $R_{B4}$ | $R_{B4}$ |
| $L_{A46581}$ | F | H | $R_{B7}$ | $R_{B7}$ |
| $L_{A46582}$ | F | H | $R_{B10}$ | $R_{B10}$ |
| $L_{A46583}$ | F | H | $R_{A3}$ | $R_{A3}$ |
| $L_{A46584}$ | F | H | $R_{A34}$ | $R_{A34}$ |
| $L_{A46585}$ | F | H | $R_{B1}$ | $R_{B3}$ |
| $L_{A46586}$ | F | H | $R_{B1}$ | $R_{B4}$ |
| $L_{A46587}$ | F | H | $R_{B1}$ | $R_{B7}$ |
| $L_{A46588}$ | F | H | $R_{B1}$ | $R_{B10}$ |
| $L_{A46589}$ | F | H | $R_{B1}$ | $R_{A3}$ |
| $L_{A46590}$ | F | H | $R_{B1}$ | $R_{A34}$ |
| $L_{A46591}$ | F | H | $R_{B3}$ | $R_{B1}$ |
| $L_{A46592}$ | F | H | $R_{B3}$ | $R_{B4}$ |
| $L_{A46593}$ | F | H | $R_{B3}$ | $R_{B7}$ |
| $L_{A46594}$ | F | H | $R_{B3}$ | $R_{B10}$ |
| $L_{A46595}$ | F | H | $R_{B3}$ | $R_{A3}$ |
| $L_{A46596}$ | F | H | $R_{B3}$ | $R_{A34}$ |
| $L_{A46597}$ | F | H | $R_{B4}$ | $R_{B1}$ |
| $L_{A46598}$ | F | H | $R_{B4}$ | $R_{B3}$ |
| $L_{A46599}$ | F | H | $R_{B4}$ | $R_{B7}$ |
| $L_{A46600}$ | F | H | $R_{B4}$ | $R_{B10}$ |
| $L_{A46601}$ | F | H | $R_{B4}$ | $R_{A3}$ |
| $L_{A46602}$ | F | H | $R_{B4}$ | $R_{A34}$ |
| $L_{A46603}$ | F | H | $R_{B7}$ | $R_{B1}$ |
| $L_{A46604}$ | F | H | $R_{B7}$ | $R_{B3}$ |
| $L_{A46605}$ | F | H | $R_{B7}$ | $R_{B4}$ |
| $L_{A46606}$ | F | H | $R_{B7}$ | $R_{B10}$ |
| $L_{A46607}$ | F | H | $R_{B7}$ | $R_{A3}$ |
| $L_{A46608}$ | F | H | $R_{B7}$ | $R_{A34}$ |
| $L_{A46609}$ | F | H | $R_{B10}$ | $R_{B1}$ |
| $L_{A46610}$ | F | H | $R_{B10}$ | $R_{B3}$ |
| $L_{A46611}$ | F | H | $R_{B10}$ | $R_{B4}$ |
| $L_{A46612}$ | F | H | $R_{B10}$ | $R_{B7}$ |
| $L_{A46613}$ | F | H | $R_{B10}$ | $R_{A3}$ |
| $L_{A46614}$ | F | H | $R_{B10}$ | $R_{A34}$ |
| $L_{A46615}$ | F | H | $R_{A3}$ | $R_{B1}$ |
| $L_{A46616}$ | F | H | $R_{A3}$ | $R_{B3}$ |
| $L_{A46617}$ | F | H | $R_{A3}$ | $R_{B4}$ |
| $L_{A46618}$ | F | H | $R_{A3}$ | $R_{B7}$ |
| $L_{A46619}$ | F | H | $R_{A3}$ | $R_{B10}$ |
| $L_{A46620}$ | F | H | $R_{A3}$ | $R_{A34}$ |
| $L_{A46621}$ | F | H | $R_{A34}$ | $R_{B1}$ |
| $L_{A46622}$ | F | H | $R_{A34}$ | $R_{B3}$ |
| $L_{A46623}$ | F | H | $R_{A34}$ | $R_{B4}$ |
| $L_{A46624}$ | F | H | $R_{A34}$ | $R_{B7}$ |
| $L_{A46625}$ | F | H | $R_{A34}$ | $R_{B10}$ |
| $L_{A46626}$ | F | H | $R_{A34}$ | $R_{A3}$ |
| $L_{A46627}$ | H | $R_{B1}$ | H | H |
| $L_{A46628}$ | H | $R_{B1}$ | $R_{B1}$ | H |
| $L_{A46629}$ | H | $R_{B1}$ | $R_{B3}$ | H |
| $L_{A46630}$ | H | $R_{B1}$ | $R_{B4}$ | H |
| $L_{A46631}$ | H | $R_{B1}$ | $R_{B7}$ | H |
| $L_{A46632}$ | H | $R_{B1}$ | $R_{B10}$ | H |
| $L_{A46633}$ | H | $R_{B1}$ | $R_{A3}$ | H |
| $L_{A46634}$ | H | $R_{B1}$ | $R_{A34}$ | H |
| $L_{A46635}$ | H | $R_{B1}$ | H | $R_{B1}$ |
| $L_{A46636}$ | H | $R_{B1}$ | H | $R_{B2}$ |
| $L_{A46637}$ | H | $R_{B1}$ | H | $R_{B3}$ |
| $L_{A46638}$ | H | $R_{B1}$ | H | $R_{B4}$ |
| $L_{A46639}$ | H | $R_{B1}$ | H | $R_{B7}$ |
| $L_{A46640}$ | H | $R_{B1}$ | H | $R_{B10}$ |
| $L_{A46641}$ | H | $R_{B1}$ | H | $R_{A3}$ |
| $L_{A46642}$ | H | $R_{B1}$ | H | $R_{A34}$ |
| $L_{A46643}$ | H | $R_{B1}$ | $R_{B1}$ | $R_{B1}$ |
| $L_{A46644}$ | H | $R_{B1}$ | $R_{B3}$ | $R_{B3}$ |
| $L_{A46645}$ | H | $R_{B1}$ | $R_{B4}$ | $R_{B4}$ |
| $L_{A46646}$ | H | $R_{B1}$ | $R_{B7}$ | $R_{B7}$ |
| $L_{A46647}$ | H | $R_{B1}$ | $R_{B10}$ | $R_{B10}$ |
| $L_{A46648}$ | H | $R_{B1}$ | $R_{A3}$ | $R_{A3}$ |
| $L_{A46649}$ | H | $R_{B1}$ | $R_{A34}$ | $R_{A34}$ |

-continued

| Ligand | $R^7$ | $R^8$ | $R^9$ | $R^{10}$ |
|---|---|---|---|---|
| $L_{A6650}$ | H | $R_{B1}$ | $R_{B1}$ | $R_{B3}$ |
| $L_{A6651}$ | H | $R_{B1}$ | $R_{B1}$ | $R_{B4}$ |
| $L_{A6652}$ | H | $R_{B1}$ | $R_{B1}$ | $R_{B7}$ |
| $L_{A6653}$ | H | $R_{B1}$ | $R_{B1}$ | $R_{B10}$ |
| $L_{A6654}$ | H | $R_{B1}$ | $R_{B1}$ | $R_{A3}$ |
| $L_{A6655}$ | H | $R_{B1}$ | $R_{B1}$ | $R_{A34}$ |
| $L_{A6656}$ | H | $R_{B1}$ | $R_{B3}$ | $R_{B1}$ |
| $L_{A6657}$ | H | $R_{B1}$ | $R_{B3}$ | $R_{B4}$ |
| $L_{A6658}$ | H | $R_{B1}$ | $R_{B3}$ | $R_{B7}$ |
| $L_{A6659}$ | H | $R_{B1}$ | $R_{B3}$ | $R_{B10}$ |
| $L_{A6660}$ | H | $R_{B1}$ | $R_{B3}$ | $R_{A3}$ |
| $L_{A6661}$ | H | $R_{B1}$ | $R_{B3}$ | $R_{A34}$ |
| $L_{A6662}$ | H | $R_{B1}$ | $R_{B4}$ | $R_{B1}$ |
| $L_{A6663}$ | H | $R_{B1}$ | $R_{B4}$ | $R_{B3}$ |
| $L_{A6664}$ | H | $R_{B1}$ | $R_{B4}$ | $R_{B7}$ |
| $L_{A6665}$ | H | $R_{B1}$ | $R_{B4}$ | $R_{B10}$ |
| $L_{A6666}$ | H | $R_{B1}$ | $R_{B4}$ | $R_{A3}$ |
| $L_{A6667}$ | H | $R_{B1}$ | $R_{B4}$ | $R_{A34}$ |
| $L_{A6668}$ | H | $R_{B1}$ | $R_{B7}$ | $R_{B1}$ |
| $L_{A6669}$ | H | $R_{B1}$ | $R_{B7}$ | $R_{B3}$ |
| $L_{A6670}$ | H | $R_{B1}$ | $R_{B7}$ | $R_{B4}$ |
| $L_{A6671}$ | H | $R_{B1}$ | $R_{B7}$ | $R_{B10}$ |
| $L_{A6672}$ | H | $R_{B1}$ | $R_{B7}$ | $R_{A3}$ |
| $L_{A6673}$ | H | $R_{B1}$ | $R_{B7}$ | $R_{A34}$ |
| $L_{A6674}$ | H | $R_{B1}$ | $R_{B10}$ | $R_{B1}$ |
| $L_{A6675}$ | H | $R_{B1}$ | $R_{B10}$ | $R_{B3}$ |
| $L_{A6676}$ | H | $R_{B1}$ | $R_{B10}$ | $R_{B4}$ |
| $L_{A6677}$ | H | $R_{B1}$ | $R_{B10}$ | $R_{B7}$ |
| $L_{A6678}$ | H | $R_{B1}$ | $R_{B10}$ | $R_{A3}$ |
| $L_{A6679}$ | H | $R_{B1}$ | $R_{B10}$ | $R_{A34}$ |
| $L_{A6680}$ | H | $R_{B1}$ | $R_{A3}$ | $R_{B1}$ |
| $L_{A6681}$ | H | $R_{B1}$ | $R_{A3}$ | $R_{B3}$ |
| $L_{A6682}$ | H | $R_{B1}$ | $R_{A3}$ | $R_{B4}$ |
| $L_{A6683}$ | H | $R_{B1}$ | $R_{A3}$ | $R_{B7}$ |
| $L_{A6684}$ | H | $R_{B1}$ | $R_{A3}$ | $R_{B10}$ |
| $L_{A6685}$ | H | $R_{B1}$ | $R_{A3}$ | $R_{A34}$ |
| $L_{A6686}$ | H | $R_{B1}$ | $R_{A34}$ | $R_{B1}$ |
| $L_{A6687}$ | H | $R_{B1}$ | $R_{A34}$ | $R_{B3}$ |
| $L_{A6688}$ | H | $R_{B1}$ | $R_{A34}$ | $R_{B4}$ |
| $L_{A6689}$ | H | $R_{B1}$ | $R_{A34}$ | $R_{B7}$ |
| $L_{A6690}$ | H | $R_{B1}$ | $R_{A34}$ | $R_{B10}$ |
| $L_{A6691}$ | H | $R_{B1}$ | $R_{A34}$ | $R_{A3}$ |
| $L_{A6692}$ | H | F | H | H |
| $L_{A6693}$ | H | F | $R_{B1}$ | H |
| $L_{A6694}$ | H | F | $R_{B3}$ | H |
| $L_{A6695}$ | H | F | $R_{B4}$ | H |
| $L_{A6696}$ | H | F | $R_{B7}$ | H |
| $L_{A6697}$ | H | F | $R_{B10}$ | H |
| $L_{A6698}$ | H | F | $R_{A3}$ | H |
| $L_{A6699}$ | H | F | $R_{A34}$ | H |
| $L_{A6700}$ | H | F | H | $R_{B1}$ |
| $L_{A6701}$ | H | F | H | $R_{B2}$ |
| $L_{A6702}$ | H | F | H | $R_{B3}$ |
| $L_{A6703}$ | H | F | H | $R_{B4}$ |
| $L_{A6704}$ | H | F | H | $R_{B7}$ |
| $L_{A6705}$ | H | F | H | $R_{B10}$ |
| $L_{A6706}$ | H | F | H | $R_{A3}$ |
| $L_{A6707}$ | H | F | H | $R_{A34}$ |
| $L_{A6708}$ | H | F | $R_{B1}$ | $R_{B1}$ |
| $L_{A6709}$ | H | F | $R_{B3}$ | $R_{B3}$ |
| $L_{A6710}$ | H | F | $R_{B4}$ | $R_{B4}$ |
| $L_{A6711}$ | H | F | $R_{B7}$ | $R_{B7}$ |
| $L_{A6712}$ | H | F | $R_{B10}$ | $R_{B10}$ |
| $L_{A6713}$ | H | F | $R_{A3}$ | $R_{A3}$ |
| $L_{A6714}$ | H | F | $R_{A34}$ | $R_{A34}$ |
| $L_{A6715}$ | H | F | $R_{B1}$ | $R_{B3}$ |
| $L_{A6716}$ | H | F | $R_{B1}$ | $R_{B4}$ |
| $L_{A6717}$ | H | F | $R_{B1}$ | $R_{B7}$ |
| $L_{A6718}$ | H | F | $R_{B1}$ | $R_{B10}$ |
| $L_{A6719}$ | H | F | $R_{B1}$ | $R_{A3}$ |
| $L_{A6720}$ | H | F | $R_{B1}$ | $R_{A34}$ |
| $L_{A6721}$ | H | F | $R_{B3}$ | $R_{B1}$ |
| $L_{A6722}$ | H | F | $R_{B3}$ | $R_{B4}$ |
| $L_{A6723}$ | H | F | $R_{B3}$ | $R_{B7}$ |
| $L_{A6724}$ | H | F | $R_{B3}$ | $R_{B10}$ |
| $L_{A6725}$ | H | F | $R_{B3}$ | $R_{A3}$ |
| $L_{A6726}$ | H | F | $R_{B3}$ | $R_{A34}$ |
| $L_{A6727}$ | H | F | $R_{B4}$ | $R_{B1}$ |
| $L_{A6728}$ | H | F | $R_{B4}$ | $R_{B3}$ |
| $L_{A6729}$ | H | F | $R_{B4}$ | $R_{B7}$ |
| $L_{A6730}$ | H | F | $R_{B4}$ | $R_{B10}$ |
| $L_{A6731}$ | H | F | $R_{B4}$ | $R_{A3}$ |
| $L_{A6732}$ | H | F | $R_{B4}$ | $R_{A34}$ |
| $L_{A6733}$ | H | F | $R_{B7}$ | $R_{B1}$ |
| $L_{A6734}$ | H | F | $R_{B7}$ | $R_{B3}$ |
| $L_{A6735}$ | H | F | $R_{B7}$ | $R_{B4}$ |
| $L_{A6736}$ | H | F | $R_{B7}$ | $R_{B10}$ |
| $L_{A6737}$ | H | F | $R_{B7}$ | $R_{A3}$ |
| $L_{A6738}$ | H | F | $R_{B7}$ | $R_{A34}$ |
| $L_{A6739}$ | H | F | $R_{B10}$ | $R_{B1}$ |
| $L_{A6740}$ | H | F | $R_{B10}$ | $R_{B3}$ |
| $L_{A6741}$ | H | F | $R_{B10}$ | $R_{B4}$ |
| $L_{A6742}$ | H | F | $R_{B10}$ | $R_{B7}$ |
| $L_{A6743}$ | H | F | $R_{B10}$ | $R_{A3}$ |
| $L_{A6744}$ | H | F | $R_{B10}$ | $R_{A34}$ |
| $L_{A6745}$ | H | F | $R_{A3}$ | $R_{B1}$ |
| $L_{A6746}$ | H | F | $R_{A3}$ | $R_{B3}$ |
| $L_{A6747}$ | H | F | $R_{A3}$ | $R_{B4}$ |
| $L_{A6748}$ | H | F | $R_{A3}$ | $R_{B7}$ |
| $L_{A6749}$ | H | F | $R_{A3}$ | $R_{B10}$ |
| $L_{A6750}$ | H | F | $R_{A3}$ | $R_{A34}$ |
| $L_{A6751}$ | H | F | $R_{A34}$ | $R_{B1}$ |
| $L_{A6752}$ | H | F | $R_{A34}$ | $R_{B3}$ |
| $L_{A6753}$ | H | F | $R_{A34}$ | $R_{B4}$ |
| $L_{A6754}$ | H | F | $R_{A34}$ | $R_{B7}$ |
| $L_{A6755}$ | H | F | $R_{A34}$ | $R_{B10}$ |
| $L_{A6756}$ | H | F | $R_{A34}$ | $R_{A3}$ |

wherein $R_{B1}$ to $R_{B25}$ have the following structures:

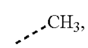

$R_{B1}$

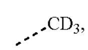

$R_{B2}$

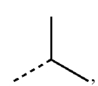
$R_{B3}$

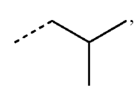
$R_{B4}$

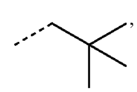
$R_{B5}$

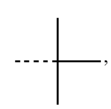
$R_{B6}$

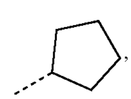
$R_{B7}$

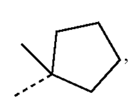
$R_{B8}$

-continued
$R_{B9}$
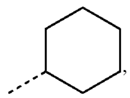
$R_{B10}$
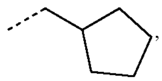
$R_{B11}$
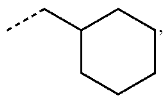
$R_{B12}$
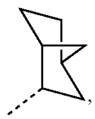
$R_{B13}$
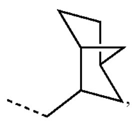
$R_{B14}$
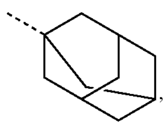
$R_{B15}$
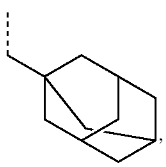
$R_{B16}$
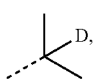
$R_{B17}$
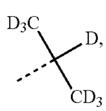
$R_{B18}$
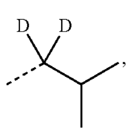
$R_{B19}$
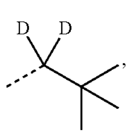
$R_{B20}$
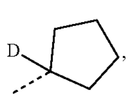
$R_{B21}$
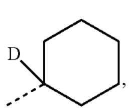
-continued
$R_{B22}$
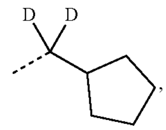
$R_{B23}$
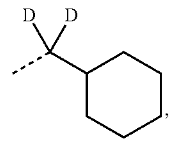
$R_{B24}$
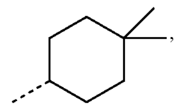
and
$R_{B25}$
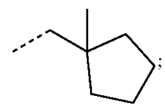
wherein $R_{A1}$ to $R_{A53}$ have the following structures:
$R_{A1}$
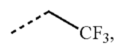
$R_{A2}$
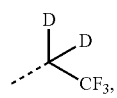
$R_{A3}$
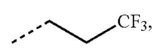
$R_{A4}$
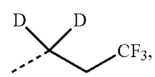
$R_{A5}$
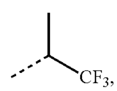
$R_{A6}$
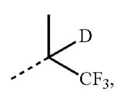
$R_{A7}$
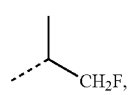
$R_{A8}$
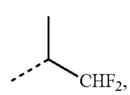
$R_{A9}$
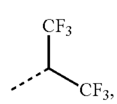
$R_{A10}$
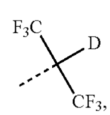

-continued
$R_{A11}$
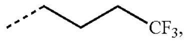
$R_{A12}$
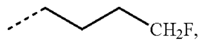
$R_{A13}$
$R_{A14}$
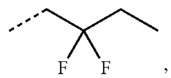
$R_{A15}$
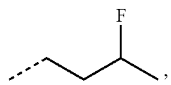
$R_{A16}$
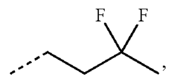
$R_{A17}$
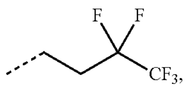
$R_{A18}$
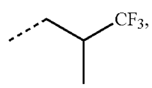
$R_{A19}$
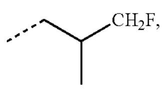
$R_{A20}$
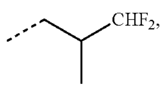
$R_{A21}$
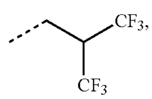
$R_{A22}$
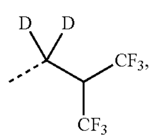
$R_{A23}$
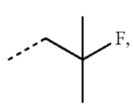
$R_{A24}$
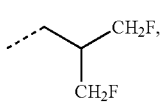
$R_{A25}$
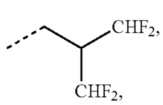
$R_{A26}$
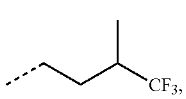
-continued
$R_{A27}$
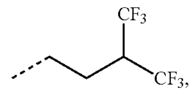
$R_{A28}$
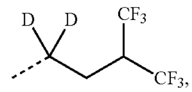
$R_{A29}$
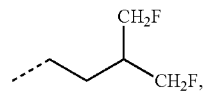
$R_{A30}$
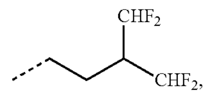
$R_{A31}$
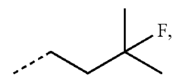
$R_{A32}$
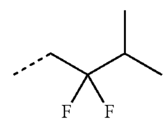
$R_{A33}$
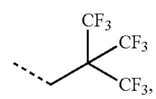
$R_{A34}$
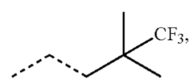
$R_{A35}$
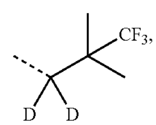
$R_{A36}$
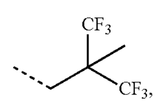
$R_{A37}$
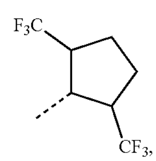
$R_{A38}$
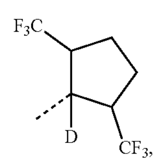
$R_{A39}$
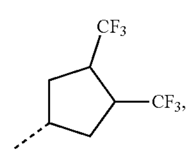

-continued $R_{A40}$

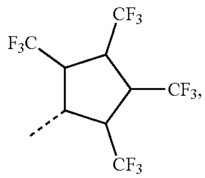

$R_{A41}$

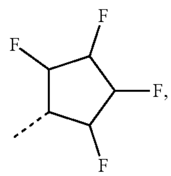

$R_{A42}$

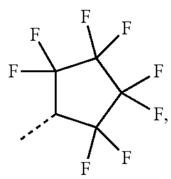

$R_{A43}$

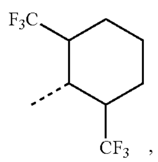

$R_{A44}$

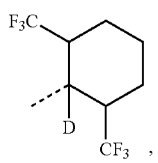

$R_{A45}$

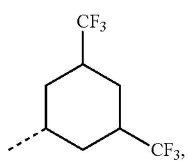

$R_{A46}$

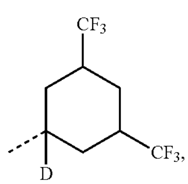

$R_{A47}$

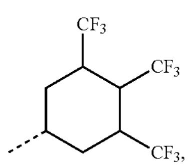

$R_{A48}$

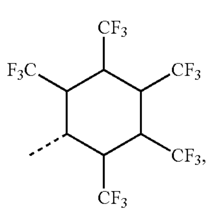

-continued $R_{A49}$

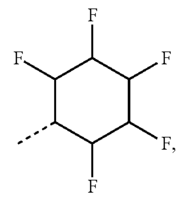

$R_{A50}$

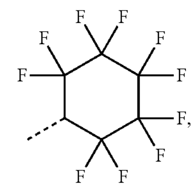

$R_{A51}$

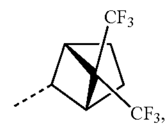

$R_{A52}$

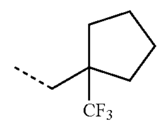

, and $R_{A53}$

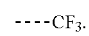

In some embodiments of the compound, the compound has formula $(L_A)_nIr(L_B)_{3-n}$; wherein $L_B$ is a bidentate ligand; and n is 1, 2, or 3.

In some embodiments of the compound, $L_B$ is selected from the group consisting of: $L_{B1}$ through $L_{B1260}$ are based on a structure of Formula XXVII,

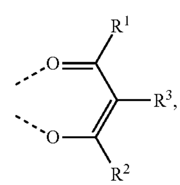

in which $R^1$, $R^2$, and $R^3$ are defined as:

| Ligand | $R^1$ | $R^2$ | $R^3$ |
| --- | --- | --- | --- |
| $L_{B1}$ | $R^{D1}$ | $R^{D1}$ | H |
| $L_{B2}$ | $R^{D2}$ | $R^{D2}$ | H |
| $L_{B3}$ | $R^{D3}$ | $R^{D3}$ | H |
| $L_{B4}$ | $R^{D4}$ | $R^{D4}$ | H |
| $L_{B5}$ | $R^{D5}$ | $R^{D5}$ | H |
| $L_{B6}$ | $R^{D6}$ | $R^{D6}$ | H |
| $L_{B7}$ | $R^{D7}$ | $R^{D7}$ | H |
| $L_{B8}$ | $R^{D8}$ | $R^{D8}$ | H |
| $L_{B9}$ | $R^{D9}$ | $R^{D9}$ | H |
| $L_{B10}$ | $R^{D10}$ | $R^{D10}$ | H |
| $L_{B11}$ | $R^{D11}$ | $R^{D11}$ | H |
| $L_{B12}$ | $R^{D12}$ | $R^{D12}$ | H |
| $L_{B13}$ | $R^{D13}$ | $R^{D13}$ | H |
| $L_{B14}$ | $R^{D14}$ | $R^{D14}$ | H |
| $L_{B15}$ | $R^{D15}$ | $R^{D15}$ | H |
| $L_{B16}$ | $R^{D16}$ | $R^{D16}$ | H |
| $L_{B17}$ | $R^{D17}$ | $R^{D17}$ | H |
| $L_{B18}$ | $R^{D18}$ | $R^{D18}$ | H |

| Ligand | $R^1$ | $R^2$ | $R^3$ |
|---|---|---|---|
| $L_{B19}$ | $R^{D19}$ | $R^{D19}$ | H |
| $L_{B20}$ | $R^{D20}$ | $R^{D20}$ | H |
| $L_{B21}$ | $R^{D21}$ | $R^{D21}$ | H |
| $L_{B22}$ | $R^{D22}$ | $R^{D22}$ | H |
| $L_{B23}$ | $R^{D23}$ | $R^{D23}$ | H |
| $L_{B24}$ | $R^{D24}$ | $R^{D24}$ | H |
| $L_{B25}$ | $R^{D25}$ | $R^{D25}$ | H |
| $L_{B26}$ | $R^{D26}$ | $R^{D26}$ | H |
| $L_{B27}$ | $R^{D27}$ | $R^{D27}$ | H |
| $L_{B28}$ | $R^{D28}$ | $R^{D28}$ | H |
| $L_{B29}$ | $R^{D29}$ | $R^{D29}$ | H |
| $L_{B30}$ | $R^{D30}$ | $R^{D30}$ | H |
| $L_{B31}$ | $R^{D31}$ | $R^{D31}$ | H |
| $L_{B32}$ | $R^{D32}$ | $R^{D32}$ | H |
| $L_{B33}$ | $R^{D33}$ | $R^{D33}$ | H |
| $L_{B34}$ | $R^{D34}$ | $R^{D34}$ | H |
| $L_{B35}$ | $R^{D35}$ | $R^{D35}$ | H |
| $L_{B36}$ | $R^{D40}$ | $R^{D40}$ | H |
| $L_{B37}$ | $R^{D41}$ | $R^{D41}$ | H |
| $L_{B38}$ | $R^{D42}$ | $R^{D42}$ | H |
| $L_{B39}$ | $R^{D64}$ | $R^{D64}$ | H |
| $L_{B40}$ | $R^{D66}$ | $R^{D66}$ | H |
| $L_{B41}$ | $R^{D68}$ | $R^{D68}$ | H |
| $L_{B42}$ | $R^{D76}$ | $R^{D76}$ | H |
| $L_{B43}$ | $R^{D1}$ | $R^{D2}$ | H |
| $L_{B44}$ | $R^{D1}$ | $R^{D3}$ | H |
| $L_{B45}$ | $R^{D1}$ | $R^{D4}$ | H |
| $L_{B46}$ | $R^{D1}$ | $R^{D5}$ | H |
| $L_{B47}$ | $R^{D1}$ | $R^{D6}$ | H |
| $L_{B48}$ | $R^{D1}$ | $R^{D7}$ | H |
| $L_{B49}$ | $R^{D1}$ | $R^{D8}$ | H |
| $L_{B50}$ | $R^{D1}$ | $R^{D9}$ | H |
| $L_{B51}$ | $R^{D1}$ | $R^{D10}$ | H |
| $L_{B52}$ | $R^{D1}$ | $R^{D11}$ | H |
| $L_{B53}$ | $R^{D1}$ | $R^{D12}$ | H |
| $L_{B54}$ | $R^{D1}$ | $R^{D13}$ | H |
| $L_{B55}$ | $R^{D1}$ | $R^{D14}$ | H |
| $L_{B56}$ | $R^{D1}$ | $R^{D15}$ | H |
| $L_{B57}$ | $R^{D1}$ | $R^{D16}$ | H |
| $L_{B58}$ | $R^{D1}$ | $R^{D17}$ | H |
| $L_{B59}$ | $R^{D1}$ | $R^{D18}$ | H |
| $L_{B60}$ | $R^{D1}$ | $R^{D19}$ | H |
| $L_{B61}$ | $R^{D1}$ | $R^{D20}$ | H |
| $L_{B62}$ | $R^{D1}$ | $R^{D21}$ | H |
| $L_{B63}$ | $R^{D1}$ | $R^{D22}$ | H |
| $L_{B64}$ | $R^{D1}$ | $R^{D23}$ | H |
| $L_{B65}$ | $R^{D1}$ | $R^{D24}$ | H |
| $L_{B66}$ | $R^{D1}$ | $R^{D25}$ | H |
| $L_{B67}$ | $R^{D1}$ | $R^{D26}$ | H |
| $L_{B68}$ | $R^{D1}$ | $R^{D27}$ | H |
| $L_{B69}$ | $R^{D1}$ | $R^{D28}$ | H |
| $L_{B70}$ | $R^{D1}$ | $R^{D29}$ | H |
| $L_{B71}$ | $R^{D1}$ | $R^{D30}$ | H |
| $L_{B72}$ | $R^{D1}$ | $R^{D31}$ | H |
| $L_{B73}$ | $R^{D1}$ | $R^{D32}$ | H |
| $L_{B74}$ | $R^{D1}$ | $R^{D33}$ | H |
| $L_{B75}$ | $R^{D1}$ | $R^{D34}$ | H |
| $L_{B76}$ | $R^{D1}$ | $R^{D35}$ | H |
| $L_{B77}$ | $R^{D1}$ | $R^{D40}$ | H |
| $L_{B78}$ | $R^{D1}$ | $R^{D41}$ | H |
| $L_{B79}$ | $R^{D1}$ | $R^{D42}$ | H |
| $L_{B80}$ | $R^{D1}$ | $R^{D64}$ | H |
| $L_{B81}$ | $R^{D1}$ | $R^{D66}$ | H |
| $L_{B82}$ | $R^{D1}$ | $R^{D68}$ | H |
| $L_{B83}$ | $R^{D1}$ | $R^{D76}$ | H |
| $L_{B84}$ | $R^{D2}$ | $R^{D1}$ | H |
| $L_{B85}$ | $R^{D2}$ | $R^{D3}$ | H |
| $L_{B86}$ | $R^{D2}$ | $R^{D4}$ | H |
| $L_{B87}$ | $R^{D2}$ | $R^{D5}$ | H |
| $L_{B88}$ | $R^{D2}$ | $R^{D6}$ | H |
| $L_{B89}$ | $R^{D2}$ | $R^{D7}$ | H |
| $L_{B90}$ | $R^{D2}$ | $R^{D8}$ | H |
| $L_{B91}$ | $R^{D2}$ | $R^{D9}$ | H |
| $L_{B92}$ | $R^{D2}$ | $R^{D10}$ | H |
| $L_{B93}$ | $R^{D2}$ | $R^{D11}$ | H |
| $L_{B94}$ | $R^{D2}$ | $R^{D12}$ | H |
| $L_{B95}$ | $R^{D2}$ | $R^{D13}$ | H |

| Ligand | $R^1$ | $R^2$ | $R^3$ |
|---|---|---|---|
| $L_{B96}$ | $R^{D2}$ | $R^{D14}$ | H |
| $L_{B97}$ | $R^{D2}$ | $R^{D15}$ | H |
| $L_{B98}$ | $R^{D2}$ | $R^{D16}$ | H |
| $L_{B99}$ | $R^{D2}$ | $R^{D17}$ | H |
| $L_{B100}$ | $R^{D2}$ | $R^{D18}$ | H |
| $L_{B101}$ | $R^{D2}$ | $R^{D19}$ | H |
| $L_{B102}$ | $R^{D2}$ | $R^{D20}$ | H |
| $L_{B103}$ | $R^{D2}$ | $R^{D21}$ | H |
| $L_{B104}$ | $R^{D2}$ | $R^{D22}$ | H |
| $L_{B105}$ | $R^{D2}$ | $R^{D23}$ | H |
| $L_{B106}$ | $R^{D2}$ | $R^{D24}$ | H |
| $L_{B107}$ | $R^{D2}$ | $R^{D25}$ | H |
| $L_{B108}$ | $R^{D2}$ | $R^{D26}$ | H |
| $L_{B109}$ | $R^{D2}$ | $R^{D27}$ | H |
| $L_{B110}$ | $R^{D2}$ | $R^{D28}$ | H |
| $L_{B111}$ | $R^{D2}$ | $R^{D29}$ | H |
| $L_{B112}$ | $R^{D2}$ | $R^{D30}$ | H |
| $L_{B113}$ | $R^{D2}$ | $R^{D31}$ | H |
| $L_{B114}$ | $R^{D2}$ | $R^{D32}$ | H |
| $L_{B115}$ | $R^{D2}$ | $R^{D33}$ | H |
| $L_{B116}$ | $R^{D2}$ | $R^{D34}$ | H |
| $L_{B117}$ | $R^{D2}$ | $R^{D35}$ | H |
| $L_{B118}$ | $R^{D2}$ | $R^{D40}$ | H |
| $L_{B119}$ | $R^{D2}$ | $R^{D41}$ | H |
| $L_{B120}$ | $R^{D2}$ | $R^{D42}$ | H |
| $L_{B121}$ | $R^{D2}$ | $R^{D64}$ | H |
| $L_{B122}$ | $R^{D2}$ | $R^{D66}$ | H |
| $L_{B123}$ | $R^{D2}$ | $R^{D68}$ | H |
| $L_{B124}$ | $R^{D2}$ | $R^{D76}$ | H |
| $L_{B125}$ | $R^{D3}$ | $R^{D4}$ | H |
| $L_{B126}$ | $R^{D3}$ | $R^{D5}$ | H |
| $L_{B127}$ | $R^{D3}$ | $R^{D6}$ | H |
| $L_{B128}$ | $R^{D3}$ | $R^{D7}$ | H |
| $L_{B129}$ | $R^{D3}$ | $R^{D8}$ | H |
| $L_{B130}$ | $R^{D3}$ | $R^{D9}$ | H |
| $L_{B131}$ | $R^{D3}$ | $R^{D10}$ | H |
| $L_{B132}$ | $R^{D3}$ | $R^{D11}$ | H |
| $L_{B133}$ | $R^{D3}$ | $R^{D12}$ | H |
| $L_{B134}$ | $R^{D3}$ | $R^{D13}$ | H |
| $L_{B135}$ | $R^{D3}$ | $R^{D14}$ | H |
| $L_{B136}$ | $R^{D3}$ | $R^{D15}$ | H |
| $L_{B137}$ | $R^{D3}$ | $R^{D16}$ | H |
| $L_{B138}$ | $R^{D3}$ | $R^{D17}$ | H |
| $L_{B139}$ | $R^{D3}$ | $R^{D18}$ | H |
| $L_{B140}$ | $R^{D3}$ | $R^{D19}$ | H |
| $L_{B141}$ | $R^{D3}$ | $R^{D20}$ | H |
| $L_{B142}$ | $R^{D3}$ | $R^{D21}$ | H |
| $L_{B143}$ | $R^{D3}$ | $R^{D22}$ | H |
| $L_{B144}$ | $R^{D3}$ | $R^{D23}$ | H |
| $L_{B145}$ | $R^{D3}$ | $R^{D24}$ | H |
| $L_{B146}$ | $R^{D3}$ | $R^{D25}$ | H |
| $L_{B147}$ | $R^{D3}$ | $R^{D26}$ | H |
| $L_{B148}$ | $R^{D3}$ | $R^{D27}$ | H |
| $L_{B149}$ | $R^{D3}$ | $R^{D28}$ | H |
| $L_{B150}$ | $R^{D3}$ | $R^{D29}$ | H |
| $L_{B151}$ | $R^{D3}$ | $R^{D30}$ | H |
| $L_{B152}$ | $R^{D3}$ | $R^{D31}$ | H |
| $L_{B153}$ | $R^{D3}$ | $R^{D32}$ | H |
| $L_{B154}$ | $R^{D3}$ | $R^{D33}$ | H |
| $L_{B155}$ | $R^{D3}$ | $R^{D34}$ | H |
| $L_{B156}$ | $R^{D3}$ | $R^{D35}$ | H |
| $L_{B157}$ | $R^{D3}$ | $R^{D40}$ | H |
| $L_{B158}$ | $R^{D3}$ | $R^{D41}$ | H |
| $L_{B159}$ | $R^{D3}$ | $R^{D42}$ | H |
| $L_{B160}$ | $R^{D3}$ | $R^{D64}$ | H |
| $L_{B161}$ | $R^{D3}$ | $R^{D66}$ | H |
| $L_{B162}$ | $R^{D3}$ | $R^{D68}$ | H |
| $L_{B163}$ | $R^{D3}$ | $R^{D76}$ | H |
| $L_{B164}$ | $R^{D4}$ | $R^{D5}$ | H |
| $L_{B165}$ | $R^{D4}$ | $R^{D6}$ | H |
| $L_{B166}$ | $R^{D4}$ | $R^{D7}$ | H |
| $L_{B167}$ | $R^{D4}$ | $R^{D8}$ | H |
| $L_{B168}$ | $R^{D4}$ | $R^{D9}$ | H |
| $L_{B169}$ | $R^{D4}$ | $R^{D10}$ | H |
| $L_{B170}$ | $R^{D4}$ | $R^{D11}$ | H |
| $L_{B171}$ | $R^{D4}$ | $R^{D12}$ | H |
| $L_{B172}$ | $R^{D4}$ | $R^{D13}$ | H |

-continued

| Ligand | $R^1$ | $R^2$ | $R^3$ |
|---|---|---|---|
| $L_{B173}$ | $R^{D4}$ | $R^{D14}$ | H |
| $L_{B174}$ | $R^{D4}$ | $R^{D15}$ | H |
| $L_{B175}$ | $R^{D4}$ | $R^{D16}$ | H |
| $L_{B176}$ | $R^{D4}$ | $R^{D17}$ | H |
| $L_{B177}$ | $R^{D4}$ | $R^{D18}$ | H |
| $L_{B178}$ | $R^{D4}$ | $R^{D19}$ | H |
| $L_{B179}$ | $R^{D4}$ | $R^{D20}$ | H |
| $L_{B180}$ | $R^{D4}$ | $R^{D21}$ | H |
| $L_{B181}$ | $R^{D4}$ | $R^{D22}$ | H |
| $L_{B182}$ | $R^{D4}$ | $R^{D23}$ | H |
| $L_{B183}$ | $R^{D4}$ | $R^{D24}$ | H |
| $L_{B184}$ | $R^{D4}$ | $R^{D25}$ | H |
| $L_{B185}$ | $R^{D4}$ | $R^{D26}$ | H |
| $L_{B186}$ | $R^{D4}$ | $R^{D27}$ | H |
| $L_{B187}$ | $R^{D4}$ | $R^{D28}$ | H |
| $L_{B188}$ | $R^{D4}$ | $R^{D29}$ | H |
| $L_{B189}$ | $R^{D4}$ | $R^{D30}$ | H |
| $L_{B190}$ | $R^{D4}$ | $R^{D31}$ | H |
| $L_{B191}$ | $R^{D4}$ | $R^{D32}$ | H |
| $L_{B192}$ | $R^{D4}$ | $R^{D33}$ | H |
| $L_{B193}$ | $R^{D4}$ | $R^{D34}$ | H |
| $L_{B194}$ | $R^{D4}$ | $R^{D35}$ | H |
| $L_{B195}$ | $R^{D4}$ | $R^{D40}$ | H |
| $L_{B196}$ | $R^{D4}$ | $R^{D41}$ | H |
| $L_{B197}$ | $R^{D4}$ | $R^{D42}$ | H |
| $L_{B198}$ | $R^{D4}$ | $R^{D64}$ | H |
| $L_{B199}$ | $R^{D4}$ | $R^{D66}$ | H |
| $L_{B200}$ | $R^{D4}$ | $R^{D68}$ | H |
| $L_{B201}$ | $R^{D4}$ | $R^{D76}$ | H |
| $L_{B202}$ | $R^{D4}$ | $R^{D1}$ | H |
| $L_{B203}$ | $R^{D7}$ | $R^{D5}$ | H |
| $L_{B204}$ | $R^{D7}$ | $R^{D6}$ | H |
| $L_{B205}$ | $R^{D7}$ | $R^{D8}$ | H |
| $L_{B206}$ | $R^{D7}$ | $R^{D9}$ | H |
| $L_{B207}$ | $R^{D7}$ | $R^{D10}$ | H |
| $L_{B208}$ | $R^{D7}$ | $R^{D11}$ | H |
| $L_{B209}$ | $R^{D7}$ | $R^{D12}$ | H |
| $L_{B210}$ | $R^{D7}$ | $R^{D13}$ | H |
| $L_{B211}$ | $R^{D7}$ | $R^{D14}$ | H |
| $L_{B212}$ | $R^{D7}$ | $R^{D15}$ | H |
| $L_{B213}$ | $R^{D7}$ | $R^{D16}$ | H |
| $L_{B214}$ | $R^{D7}$ | $R^{D17}$ | H |
| $L_{B215}$ | $R^{D7}$ | $R^{D18}$ | H |
| $L_{B216}$ | $R^{D7}$ | $R^{D19}$ | H |
| $L_{B217}$ | $R^{D7}$ | $R^{D20}$ | H |
| $L_{B218}$ | $R^{D7}$ | $R^{D21}$ | H |
| $L_{B219}$ | $R^{D7}$ | $R^{D22}$ | H |
| $L_{B220}$ | $R^{D7}$ | $R^{D23}$ | H |
| $L_{B221}$ | $R^{D7}$ | $R^{D24}$ | H |
| $L_{B222}$ | $R^{D7}$ | $R^{D25}$ | H |
| $L_{B223}$ | $R^{D7}$ | $R^{D26}$ | H |
| $L_{B224}$ | $R^{D7}$ | $R^{D27}$ | H |
| $L_{B225}$ | $R^{D7}$ | $R^{D28}$ | H |
| $L_{B226}$ | $R^{D7}$ | $R^{D29}$ | H |
| $L_{B227}$ | $R^{D7}$ | $R^{D30}$ | H |
| $L_{B228}$ | $R^{D7}$ | $R^{D31}$ | H |
| $L_{B229}$ | $R^{D7}$ | $R^{D32}$ | H |
| $L_{B230}$ | $R^{D7}$ | $R^{D33}$ | H |
| $L_{B231}$ | $R^{D7}$ | $R^{D34}$ | H |
| $L_{B232}$ | $R^{D7}$ | $R^{D35}$ | H |
| $L_{B233}$ | $R^{D7}$ | $R^{D40}$ | H |
| $L_{B234}$ | $R^{D7}$ | $R^{D41}$ | H |
| $L_{B235}$ | $R^{D7}$ | $R^{D42}$ | H |
| $L_{B236}$ | $R^{D7}$ | $R^{D64}$ | H |
| $L_{B237}$ | $R^{D7}$ | $R^{D66}$ | H |
| $L_{B238}$ | $R^{D7}$ | $R^{D68}$ | H |
| $L_{B239}$ | $R^{D7}$ | $R^{D76}$ | H |
| $L_{B240}$ | $R^{D8}$ | $R^{D5}$ | H |
| $L_{B241}$ | $R^{D8}$ | $R^{D6}$ | H |
| $L_{B242}$ | $R^{D8}$ | $R^{D9}$ | H |
| $L_{B243}$ | $R^{D8}$ | $R^{D10}$ | H |
| $L_{B244}$ | $R^{D8}$ | $R^{D11}$ | H |
| $L_{B245}$ | $R^{D8}$ | $R^{D12}$ | H |
| $L_{B246}$ | $R^{D8}$ | $R^{D13}$ | H |
| $L_{B247}$ | $R^{D8}$ | $R^{D14}$ | H |
| $L_{B248}$ | $R^{D8}$ | $R^{D15}$ | H |
| $L_{B249}$ | $R^{D8}$ | $R^{D16}$ | H |

-continued

| Ligand | $R^1$ | $R^2$ | $R^3$ |
|---|---|---|---|
| $L_{B250}$ | $R^{D8}$ | $R^{D17}$ | H |
| $L_{B251}$ | $R^{D8}$ | $R^{D18}$ | H |
| $L_{B252}$ | $R^{D8}$ | $R^{D19}$ | H |
| $L_{B253}$ | $R^{D8}$ | $R^{D20}$ | H |
| $L_{B254}$ | $R^{D8}$ | $R^{D21}$ | H |
| $L_{B255}$ | $R^{D8}$ | $R^{D22}$ | H |
| $L_{B256}$ | $R^{D8}$ | $R^{D23}$ | H |
| $L_{B257}$ | $R^{D8}$ | $R^{D24}$ | H |
| $L_{B258}$ | $R^{D8}$ | $R^{D25}$ | H |
| $L_{B259}$ | $R^{D8}$ | $R^{D26}$ | H |
| $L_{B260}$ | $R^{D8}$ | $R^{D27}$ | H |
| $L_{B261}$ | $R^{D8}$ | $R^{D28}$ | H |
| $L_{B262}$ | $R^{D8}$ | $R^{D29}$ | H |
| $L_{B263}$ | $R^{D8}$ | $R^{D30}$ | H |
| $L_{B264}$ | $R^{D8}$ | $R^{D31}$ | H |
| $L_{B265}$ | $R^{D8}$ | $R^{D32}$ | H |
| $L_{B266}$ | $R^{D8}$ | $R^{D33}$ | H |
| $L_{B267}$ | $R^{D8}$ | $R^{D34}$ | H |
| $L_{B268}$ | $R^{D8}$ | $R^{D35}$ | H |
| $L_{B269}$ | $R^{D8}$ | $R^{D40}$ | H |
| $L_{B270}$ | $R^{D8}$ | $R^{D41}$ | H |
| $L_{B271}$ | $R^{D8}$ | $R^{D42}$ | H |
| $L_{B272}$ | $R^{D8}$ | $R^{D64}$ | H |
| $L_{B273}$ | $R^{D8}$ | $R^{D66}$ | H |
| $L_{B274}$ | $R^{D8}$ | $R^{D68}$ | H |
| $L_{B275}$ | $R^{D8}$ | $R^{D76}$ | H |
| $L_{B276}$ | $R^{D11}$ | $R^{D5}$ | H |
| $L_{B277}$ | $R^{D11}$ | $R^{D6}$ | H |
| $L_{B278}$ | $R^{D11}$ | $R^{D9}$ | H |
| $L_{B279}$ | $R^{D11}$ | $R^{D10}$ | H |
| $L_{B280}$ | $R^{D11}$ | $R^{D12}$ | H |
| $L_{B281}$ | $R^{D11}$ | $R^{D13}$ | H |
| $L_{B282}$ | $R^{D11}$ | $R^{D14}$ | H |
| $L_{B283}$ | $R^{D11}$ | $R^{D15}$ | H |
| $L_{B284}$ | $R^{D11}$ | $R^{D16}$ | H |
| $L_{B285}$ | $R^{D11}$ | $R^{D17}$ | H |
| $L_{B286}$ | $R^{D11}$ | $R^{D18}$ | H |
| $L_{B287}$ | $R^{D11}$ | $R^{D19}$ | H |
| $L_{B288}$ | $R^{D11}$ | $R^{D20}$ | H |
| $L_{B289}$ | $R^{D11}$ | $R^{D21}$ | H |
| $L_{B290}$ | $R^{D11}$ | $R^{D22}$ | H |
| $L_{B291}$ | $R^{D11}$ | $R^{D23}$ | H |
| $L_{B292}$ | $R^{D11}$ | $R^{D24}$ | H |
| $L_{B293}$ | $R^{D11}$ | $R^{D25}$ | H |
| $L_{B294}$ | $R^{D11}$ | $R^{D26}$ | H |
| $L_{B295}$ | $R^{D11}$ | $R^{D27}$ | H |
| $L_{B296}$ | $R^{D11}$ | $R^{D28}$ | H |
| $L_{B297}$ | $R^{D11}$ | $R^{D29}$ | H |
| $L_{B298}$ | $R^{D11}$ | $R^{D30}$ | H |
| $L_{B299}$ | $R^{D11}$ | $R^{D31}$ | H |
| $L_{B300}$ | $R^{D11}$ | $R^{D32}$ | H |
| $L_{B301}$ | $R^{D11}$ | $R^{D33}$ | H |
| $L_{B302}$ | $R^{D11}$ | $R^{D34}$ | H |
| $L_{B303}$ | $R^{D11}$ | $R^{D35}$ | H |
| $L_{B304}$ | $R^{D11}$ | $R^{D40}$ | H |
| $L_{B305}$ | $R^{D11}$ | $R^{D41}$ | H |
| $L_{B306}$ | $R^{D11}$ | $R^{D42}$ | H |
| $L_{B307}$ | $R^{D11}$ | $R^{D64}$ | H |
| $L_{B308}$ | $R^{D11}$ | $R^{D66}$ | H |
| $L_{B309}$ | $R^{D11}$ | $R^{D68}$ | H |
| $L_{B310}$ | $R^{D11}$ | $R^{D76}$ | H |
| $L_{B311}$ | $R^{D13}$ | $R^{D5}$ | H |
| $L_{B312}$ | $R^{D13}$ | $R^{D6}$ | H |
| $L_{B313}$ | $R^{D13}$ | $R^{D9}$ | H |
| $L_{B314}$ | $R^{D13}$ | $R^{D10}$ | H |
| $L_{B315}$ | $R^{D13}$ | $R^{D12}$ | H |
| $L_{B316}$ | $R^{D13}$ | $R^{D14}$ | H |
| $L_{B317}$ | $R^{D13}$ | $R^{D15}$ | H |
| $L_{B318}$ | $R^{D13}$ | $R^{D16}$ | H |
| $L_{B319}$ | $R^{D13}$ | $R^{D17}$ | H |
| $L_{B320}$ | $R^{D13}$ | $R^{D18}$ | H |
| $L_{B321}$ | $R^{D13}$ | $R^{D19}$ | H |
| $L_{B322}$ | $R^{D13}$ | $R^{D20}$ | H |
| $L_{B323}$ | $R^{D13}$ | $R^{D21}$ | H |
| $L_{B324}$ | $R^{D13}$ | $R^{D22}$ | H |
| $L_{B325}$ | $R^{D13}$ | $R^{D23}$ | H |
| $L_{B326}$ | $R^{D13}$ | $R^{D24}$ | H |

-continued

| Ligand | $R^1$ | $R^2$ | $R^3$ |
|---|---|---|---|
| $L_{B327}$ | $R^{D13}$ | $R^{D25}$ | H |
| $L_{B328}$ | $R^{D13}$ | $R^{D26}$ | H |
| $L_{B329}$ | $R^{D13}$ | $R^{D27}$ | H |
| $L_{B330}$ | $R^{D13}$ | $R^{D28}$ | H |
| $L_{B331}$ | $R^{D13}$ | $R^{D29}$ | H |
| $L_{B332}$ | $R^{D13}$ | $R^{D30}$ | H |
| $L_{B333}$ | $R^{D13}$ | $R^{D31}$ | H |
| $L_{B334}$ | $R^{D13}$ | $R^{D32}$ | H |
| $L_{B335}$ | $R^{D13}$ | $R^{D33}$ | H |
| $L_{B336}$ | $R^{D13}$ | $R^{D34}$ | H |
| $L_{B337}$ | $R^{D13}$ | $R^{D35}$ | H |
| $L_{B338}$ | $R^{D13}$ | $R^{D40}$ | H |
| $L_{B339}$ | $R^{D13}$ | $R^{D41}$ | H |
| $L_{B340}$ | $R^{D13}$ | $R^{D42}$ | H |
| $L_{B341}$ | $R^{D13}$ | $R^{D64}$ | H |
| $L_{B342}$ | $R^{D13}$ | $R^{D66}$ | H |
| $L_{B343}$ | $R^{D13}$ | $R^{D68}$ | H |
| $L_{B344}$ | $R^{D13}$ | $R^{D76}$ | H |
| $L_{B345}$ | $R^{D14}$ | $R^{D5}$ | H |
| $L_{B346}$ | $R^{D14}$ | $R^{D6}$ | H |
| $L_{B347}$ | $R^{D14}$ | $R^{D9}$ | H |
| $L_{B348}$ | $R^{D14}$ | $R^{D10}$ | H |
| $L_{B349}$ | $R^{D14}$ | $R^{D12}$ | H |
| $L_{B350}$ | $R^{D14}$ | $R^{D15}$ | H |
| $L_{B351}$ | $R^{D14}$ | $R^{D16}$ | H |
| $L_{B352}$ | $R^{D14}$ | $R^{D17}$ | H |
| $L_{B353}$ | $R^{D14}$ | $R^{D18}$ | H |
| $L_{B354}$ | $R^{D14}$ | $R^{D19}$ | H |
| $L_{B355}$ | $R^{D14}$ | $R^{D20}$ | H |
| $L_{B356}$ | $R^{D14}$ | $R^{D21}$ | H |
| $L_{B357}$ | $R^{D14}$ | $R^{D22}$ | H |
| $L_{B358}$ | $R^{D14}$ | $R^{D23}$ | H |
| $L_{B359}$ | $R^{D14}$ | $R^{D24}$ | H |
| $L_{B360}$ | $R^{D14}$ | $R^{D25}$ | H |
| $L_{B361}$ | $R^{D14}$ | $R^{D26}$ | H |
| $L_{B362}$ | $R^{D14}$ | $R^{D27}$ | H |
| $L_{B363}$ | $R^{D14}$ | $R^{D28}$ | H |
| $L_{B364}$ | $R^{D14}$ | $R^{D29}$ | H |
| $L_{B365}$ | $R^{D14}$ | $R^{D30}$ | H |
| $L_{B366}$ | $R^{D14}$ | $R^{D31}$ | H |
| $L_{B367}$ | $R^{D14}$ | $R^{D32}$ | H |
| $L_{B368}$ | $R^{D14}$ | $R^{D33}$ | H |
| $L_{B369}$ | $R^{D14}$ | $R^{D34}$ | H |
| $L_{B370}$ | $R^{D14}$ | $R^{D35}$ | H |
| $L_{B371}$ | $R^{D14}$ | $R^{D40}$ | H |
| $L_{B372}$ | $R^{D14}$ | $R^{D41}$ | H |
| $L_{B373}$ | $R^{D14}$ | $R^{D42}$ | H |
| $L_{B374}$ | $R^{D14}$ | $R^{D64}$ | H |
| $L_{B375}$ | $R^{D14}$ | $R^{D66}$ | H |
| $L_{B376}$ | $R^{D14}$ | $R^{D68}$ | H |
| $L_{B377}$ | $R^{D14}$ | $R^{D76}$ | H |
| $L_{B378}$ | $R^{D22}$ | $R^{D5}$ | H |
| $L_{B379}$ | $R^{D22}$ | $R^{D6}$ | H |
| $L_{B380}$ | $R^{D22}$ | $R^{D9}$ | H |
| $L_{B381}$ | $R^{D22}$ | $R^{D10}$ | H |
| $L_{B382}$ | $R^{D22}$ | $R^{D12}$ | H |
| $L_{B383}$ | $R^{D22}$ | $R^{D15}$ | H |
| $L_{B384}$ | $R^{D22}$ | $R^{D16}$ | H |
| $L_{B385}$ | $R^{D22}$ | $R^{D17}$ | H |
| $L_{B386}$ | $R^{D22}$ | $R^{D18}$ | H |
| $L_{B387}$ | $R^{D22}$ | $R^{D19}$ | H |
| $L_{B388}$ | $R^{D22}$ | $R^{D20}$ | H |
| $L_{B389}$ | $R^{D22}$ | $R^{D21}$ | H |
| $L_{B390}$ | $R^{D22}$ | $R^{D23}$ | H |
| $L_{B391}$ | $R^{D22}$ | $R^{D24}$ | H |
| $L_{B392}$ | $R^{D22}$ | $R^{D25}$ | H |
| $L_{B393}$ | $R^{D22}$ | $R^{D26}$ | H |
| $L_{B394}$ | $R^{D22}$ | $R^{D27}$ | H |
| $L_{B395}$ | $R^{D22}$ | $R^{D28}$ | H |
| $L_{B396}$ | $R^{D22}$ | $R^{D29}$ | H |
| $L_{B397}$ | $R^{D22}$ | $R^{D30}$ | H |
| $L_{B398}$ | $R^{D22}$ | $R^{D31}$ | H |
| $L_{B399}$ | $R^{D22}$ | $R^{D32}$ | H |
| $L_{B400}$ | $R^{D22}$ | $R^{D33}$ | H |
| $L_{B401}$ | $R^{D22}$ | $R^{D34}$ | H |
| $L_{B402}$ | $R^{D22}$ | $R^{D35}$ | H |
| $L_{B403}$ | $R^{D22}$ | $R^{D40}$ | H |

-continued

| Ligand | $R^1$ | $R^2$ | $R^3$ |
|---|---|---|---|
| $L_{B404}$ | $R^{D22}$ | $R^{D41}$ | H |
| $L_{B405}$ | $R^{D22}$ | $R^{D42}$ | H |
| $L_{B406}$ | $R^{D22}$ | $R^{D64}$ | H |
| $L_{B407}$ | $R^{D22}$ | $R^{D66}$ | H |
| $L_{B408}$ | $R^{D22}$ | $R^{D68}$ | H |
| $L_{B409}$ | $R^{D22}$ | $R^{D76}$ | H |
| $L_{B410}$ | $R^{D26}$ | $R^{D5}$ | H |
| $L_{B411}$ | $R^{D26}$ | $R^{D6}$ | H |
| $L_{B412}$ | $R^{D26}$ | $R^{D9}$ | H |
| $L_{B413}$ | $R^{D26}$ | $R^{D10}$ | H |
| $L_{B414}$ | $R^{D26}$ | $R^{D12}$ | H |
| $L_{B415}$ | $R^{D26}$ | $R^{D15}$ | H |
| $L_{B416}$ | $R^{D26}$ | $R^{D16}$ | H |
| $L_{B417}$ | $R^{D26}$ | $R^{D17}$ | H |
| $L_{B418}$ | $R^{D26}$ | $R^{D18}$ | H |
| $L_{B419}$ | $R^{D26}$ | $R^{D19}$ | H |
| $L_{B420}$ | $R^{D26}$ | $R^{D20}$ | H |
| $L_{B421}$ | $R^{D26}$ | $R^{D21}$ | H |
| $L_{B422}$ | $R^{D26}$ | $R^{D23}$ | H |
| $L_{B423}$ | $R^{D26}$ | $R^{D24}$ | H |
| $L_{B424}$ | $R^{D26}$ | $R^{D25}$ | H |
| $L_{B425}$ | $R^{D26}$ | $R^{D27}$ | H |
| $L_{B426}$ | $R^{D26}$ | $R^{D28}$ | H |
| $L_{B427}$ | $R^{D26}$ | $R^{D29}$ | H |
| $L_{B428}$ | $R^{D26}$ | $R^{D30}$ | H |
| $L_{B429}$ | $R^{D26}$ | $R^{D31}$ | H |
| $L_{B430}$ | $R^{D26}$ | $R^{D32}$ | H |
| $L_{B431}$ | $R^{D26}$ | $R^{D33}$ | H |
| $L_{B432}$ | $R^{D26}$ | $R^{D34}$ | H |
| $L_{B433}$ | $R^{D26}$ | $R^{D35}$ | H |
| $L_{B434}$ | $R^{D26}$ | $R^{D40}$ | H |
| $L_{B435}$ | $R^{D26}$ | $R^{D41}$ | H |
| $L_{B436}$ | $R^{D26}$ | $R^{D42}$ | H |
| $L_{B437}$ | $R^{D26}$ | $R^{D64}$ | H |
| $L_{B438}$ | $R^{D26}$ | $R^{D66}$ | H |
| $L_{B439}$ | $R^{D26}$ | $R^{D68}$ | H |
| $L_{B440}$ | $R^{D26}$ | $R^{D76}$ | H |
| $L_{B441}$ | $R^{D35}$ | $R^{D5}$ | H |
| $L_{B442}$ | $R^{D35}$ | $R^{D6}$ | H |
| $L_{B443}$ | $R^{D35}$ | $R^{D9}$ | H |
| $L_{B444}$ | $R^{D35}$ | $R^{D10}$ | H |
| $L_{B445}$ | $R^{D35}$ | $R^{D12}$ | H |
| $L_{B446}$ | $R^{D35}$ | $R^{D15}$ | H |
| $L_{B447}$ | $R^{D35}$ | $R^{D16}$ | H |
| $L_{B448}$ | $R^{D35}$ | $R^{D17}$ | H |
| $L_{B449}$ | $R^{D35}$ | $R^{D18}$ | H |
| $L_{B450}$ | $R^{D35}$ | $R^{D19}$ | H |
| $L_{B451}$ | $R^{D35}$ | $R^{D20}$ | H |
| $L_{B452}$ | $R^{D35}$ | $R^{D21}$ | H |
| $L_{B453}$ | $R^{D35}$ | $R^{D23}$ | H |
| $L_{B454}$ | $R^{D35}$ | $R^{D24}$ | H |
| $L_{B455}$ | $R^{D35}$ | $R^{D25}$ | H |
| $L_{B456}$ | $R^{D35}$ | $R^{D27}$ | H |
| $L_{B457}$ | $R^{D35}$ | $R^{D28}$ | H |
| $L_{B458}$ | $R^{D35}$ | $R^{D29}$ | H |
| $L_{B459}$ | $R^{D35}$ | $R^{D30}$ | H |
| $L_{B460}$ | $R^{D35}$ | $R^{D31}$ | H |
| $L_{B461}$ | $R^{D35}$ | $R^{D32}$ | H |
| $L_{B462}$ | $R^{D35}$ | $R^{D33}$ | H |
| $L_{B463}$ | $R^{D35}$ | $R^{D34}$ | H |
| $L_{B464}$ | $R^{D35}$ | $R^{D40}$ | H |
| $L_{B465}$ | $R^{D35}$ | $R^{D41}$ | H |
| $L_{B466}$ | $R^{D35}$ | $R^{D42}$ | H |
| $L_{B467}$ | $R^{D35}$ | $R^{D64}$ | H |
| $L_{B468}$ | $R^{D35}$ | $R^{D66}$ | H |
| $L_{B469}$ | $R^{D35}$ | $R^{D68}$ | H |
| $L_{B470}$ | $R^{D35}$ | $R^{D76}$ | H |
| $L_{B471}$ | $R^{D40}$ | $R^{D5}$ | H |
| $L_{B472}$ | $R^{D40}$ | $R^{D6}$ | H |
| $L_{B473}$ | $R^{D40}$ | $R^{D9}$ | H |
| $L_{B474}$ | $R^{D40}$ | $R^{D10}$ | H |
| $L_{B475}$ | $R^{D40}$ | $R^{D12}$ | H |
| $L_{B476}$ | $R^{D40}$ | $R^{D15}$ | H |
| $L_{B477}$ | $R^{D40}$ | $R^{D16}$ | H |
| $L_{B478}$ | $R^{D40}$ | $R^{D17}$ | H |
| $L_{B479}$ | $R^{D40}$ | $R^{D18}$ | H |
| $L_{B480}$ | $R^{D40}$ | $R^{D19}$ | H |

| Ligand | $R^1$ | $R^2$ | $R^3$ |
|---|---|---|---|
| $L_{B481}$ | $R^{D40}$ | $R^{D20}$ | H |
| $L_{B482}$ | $R^{D40}$ | $R^{D21}$ | H |
| $L_{B483}$ | $R^{D40}$ | $R^{D23}$ | H |
| $L_{B484}$ | $R^{D40}$ | $R^{D24}$ | H |
| $L_{B485}$ | $R^{D40}$ | $R^{D25}$ | H |
| $L_{B486}$ | $R^{D40}$ | $R^{D27}$ | H |
| $L_{B487}$ | $R^{D40}$ | $R^{D28}$ | H |
| $L_{B488}$ | $R^{D40}$ | $R^{D29}$ | H |
| $L_{B489}$ | $R^{D40}$ | $R^{D30}$ | H |
| $L_{B490}$ | $R^{D40}$ | $R^{D31}$ | H |
| $L_{B491}$ | $R^{D40}$ | $R^{D32}$ | H |
| $L_{B492}$ | $R^{D40}$ | $R^{D33}$ | H |
| $L_{B493}$ | $R^{D40}$ | $R^{D34}$ | H |
| $L_{B494}$ | $R^{D40}$ | $R^{D41}$ | H |
| $L_{B495}$ | $R^{D40}$ | $R^{D42}$ | H |
| $L_{B496}$ | $R^{D40}$ | $R^{D64}$ | H |
| $L_{B497}$ | $R^{D40}$ | $R^{D66}$ | H |
| $L_{B498}$ | $R^{D40}$ | $R^{D68}$ | H |
| $L_{B499}$ | $R^{D40}$ | $R^{D76}$ | H |
| $L_{B500}$ | $R^{D41}$ | $R^{D5}$ | H |
| $L_{B501}$ | $R^{D41}$ | $R^{D6}$ | H |
| $L_{B502}$ | $R^{D41}$ | $R^{D9}$ | H |
| $L_{B503}$ | $R^{D41}$ | $R^{D10}$ | H |
| $L_{B504}$ | $R^{D41}$ | $R^{D12}$ | H |
| $L_{B505}$ | $R^{D41}$ | $R^{D15}$ | H |
| $L_{B506}$ | $R^{D41}$ | $R^{D16}$ | H |
| $L_{B507}$ | $R^{D41}$ | $R^{D17}$ | H |
| $L_{B508}$ | $R^{D41}$ | $R^{D18}$ | H |
| $L_{B509}$ | $R^{D41}$ | $R^{D19}$ | H |
| $L_{B510}$ | $R^{D41}$ | $R^{D20}$ | H |
| $L_{B511}$ | $R^{D41}$ | $R^{D21}$ | H |
| $L_{B512}$ | $R^{D41}$ | $R^{D23}$ | H |
| $L_{B513}$ | $R^{D41}$ | $R^{D24}$ | H |
| $L_{B514}$ | $R^{D41}$ | $R^{D25}$ | H |
| $L_{B515}$ | $R^{D41}$ | $R^{D27}$ | H |
| $L_{B516}$ | $R^{D41}$ | $R^{D28}$ | H |
| $L_{B517}$ | $R^{D41}$ | $R^{D29}$ | H |
| $L_{B518}$ | $R^{D41}$ | $R^{D30}$ | H |
| $L_{B519}$ | $R^{D41}$ | $R^{D31}$ | H |
| $L_{B520}$ | $R^{D41}$ | $R^{D32}$ | H |
| $L_{B521}$ | $R^{D41}$ | $R^{D33}$ | H |
| $L_{B522}$ | $R^{D41}$ | $R^{D34}$ | H |
| $L_{B523}$ | $R^{D41}$ | $R^{D42}$ | H |
| $L_{B524}$ | $R^{D41}$ | $R^{D64}$ | H |
| $L_{B525}$ | $R^{D41}$ | $R^{D66}$ | H |
| $L_{B526}$ | $R^{D41}$ | $R^{D68}$ | H |
| $L_{B527}$ | $R^{D41}$ | $R^{D76}$ | H |
| $L_{B528}$ | $R^{D64}$ | $R^{D5}$ | H |
| $L_{B529}$ | $R^{D64}$ | $R^{D6}$ | H |
| $L_{B530}$ | $R^{D64}$ | $R^{D9}$ | H |
| $L_{B531}$ | $R^{D64}$ | $R^{D10}$ | H |
| $L_{B532}$ | $R^{D64}$ | $R^{D12}$ | H |
| $L_{B533}$ | $R^{D64}$ | $R^{D15}$ | H |
| $L_{B534}$ | $R^{D64}$ | $R^{D16}$ | H |
| $L_{B535}$ | $R^{D64}$ | $R^{D17}$ | H |
| $L_{B536}$ | $R^{D64}$ | $R^{D18}$ | H |
| $L_{B537}$ | $R^{D64}$ | $R^{D19}$ | H |
| $L_{B538}$ | $R^{D64}$ | $R^{D20}$ | H |
| $L_{B539}$ | $R^{D64}$ | $R^{D21}$ | H |
| $L_{B540}$ | $R^{D64}$ | $R^{D23}$ | H |
| $L_{B541}$ | $R^{D64}$ | $R^{D24}$ | H |
| $L_{B542}$ | $R^{D64}$ | $R^{D25}$ | H |
| $L_{B543}$ | $R^{D64}$ | $R^{D27}$ | H |
| $L_{B544}$ | $R^{D64}$ | $R^{D28}$ | H |
| $L_{B545}$ | $R^{D64}$ | $R^{D29}$ | H |
| $L_{B546}$ | $R^{D64}$ | $R^{D30}$ | H |
| $L_{B547}$ | $R^{D64}$ | $R^{D31}$ | H |
| $L_{B548}$ | $R^{D64}$ | $R^{D32}$ | H |
| $L_{B549}$ | $R^{D64}$ | $R^{D33}$ | H |
| $L_{B550}$ | $R^{D64}$ | $R^{D34}$ | H |
| $L_{B551}$ | $R^{D64}$ | $R^{D42}$ | H |
| $L_{B552}$ | $R^{D64}$ | $R^{D64}$ | H |
| $L_{B553}$ | $R^{D64}$ | $R^{D66}$ | H |
| $L_{B554}$ | $R^{D64}$ | $R^{D68}$ | H |
| $L_{B555}$ | $R^{D64}$ | $R^{D76}$ | H |
| $L_{B556}$ | $R^{D66}$ | $R^{D5}$ | H |
| $L_{B557}$ | $R^{D66}$ | $R^{D6}$ | H |

| Ligand | $R^1$ | $R^2$ | $R^3$ |
|---|---|---|---|
| $L_{B558}$ | $R^{D66}$ | $R^{D9}$ | H |
| $L_{B559}$ | $R^{D66}$ | $R^{D10}$ | H |
| $L_{B560}$ | $R^{D66}$ | $R^{D12}$ | H |
| $L_{B561}$ | $R^{D66}$ | $R^{D15}$ | H |
| $L_{B562}$ | $R^{D66}$ | $R^{D16}$ | H |
| $L_{B563}$ | $R^{D66}$ | $R^{D17}$ | H |
| $L_{B564}$ | $R^{D66}$ | $R^{D18}$ | H |
| $L_{B565}$ | $R^{D66}$ | $R^{D19}$ | H |
| $L_{B566}$ | $R^{D66}$ | $R^{D20}$ | H |
| $L_{B567}$ | $R^{D66}$ | $R^{D21}$ | H |
| $L_{B568}$ | $R^{D66}$ | $R^{D23}$ | H |
| $L_{B569}$ | $R^{D66}$ | $R^{D24}$ | H |
| $L_{B570}$ | $R^{D66}$ | $R^{D25}$ | H |
| $L_{B571}$ | $R^{D66}$ | $R^{D27}$ | H |
| $L_{B572}$ | $R^{D66}$ | $R^{D28}$ | H |
| $L_{B573}$ | $R^{D66}$ | $R^{D29}$ | H |
| $L_{B574}$ | $R^{D66}$ | $R^{D30}$ | H |
| $L_{B575}$ | $R^{D66}$ | $R^{D31}$ | H |
| $L_{B576}$ | $R^{D66}$ | $R^{D32}$ | H |
| $L_{B577}$ | $R^{D66}$ | $R^{D33}$ | H |
| $L_{B578}$ | $R^{D66}$ | $R^{D34}$ | H |
| $L_{B579}$ | $R^{D66}$ | $R^{D42}$ | H |
| $L_{B580}$ | $R^{D66}$ | $R^{D68}$ | H |
| $L_{B581}$ | $R^{D66}$ | $R^{D76}$ | H |
| $L_{B582}$ | $R^{D68}$ | $R^{D5}$ | H |
| $L_{B583}$ | $R^{D68}$ | $R^{D6}$ | H |
| $L_{B584}$ | $R^{D68}$ | $R^{D9}$ | H |
| $L_{B585}$ | $R^{D68}$ | $R^{D10}$ | H |
| $L_{B586}$ | $R^{D68}$ | $R^{D12}$ | H |
| $L_{B587}$ | $R^{D68}$ | $R^{D15}$ | H |
| $L_{B588}$ | $R^{D68}$ | $R^{D16}$ | H |
| $L_{B589}$ | $R^{D68}$ | $R^{D17}$ | H |
| $L_{B590}$ | $R^{D68}$ | $R^{D18}$ | H |
| $L_{B591}$ | $R^{D68}$ | $R^{D19}$ | H |
| $L_{B592}$ | $R^{D68}$ | $R^{D20}$ | H |
| $L_{B593}$ | $R^{D68}$ | $R^{D21}$ | H |
| $L_{B594}$ | $R^{D68}$ | $R^{D23}$ | H |
| $L_{B595}$ | $R^{D68}$ | $R^{D24}$ | H |
| $L_{B596}$ | $R^{D68}$ | $R^{D25}$ | H |
| $L_{B597}$ | $R^{D68}$ | $R^{D27}$ | H |
| $L_{B598}$ | $R^{D68}$ | $R^{D28}$ | H |
| $L_{B599}$ | $R^{D68}$ | $R^{D29}$ | H |
| $L_{B600}$ | $R^{D68}$ | $R^{D30}$ | H |
| $L_{B601}$ | $R^{D68}$ | $R^{D31}$ | H |
| $L_{B602}$ | $R^{D68}$ | $R^{D32}$ | H |
| $L_{B603}$ | $R^{D68}$ | $R^{D33}$ | H |
| $L_{B604}$ | $R^{D68}$ | $R^{D34}$ | H |
| $L_{B605}$ | $R^{D68}$ | $R^{D42}$ | H |
| $L_{B606}$ | $R^{D68}$ | $R^{D76}$ | H |
| $L_{B607}$ | $R^{D76}$ | $R^{D5}$ | H |
| $L_{B608}$ | $R^{D76}$ | $R^{D6}$ | H |
| $L_{B609}$ | $R^{D76}$ | $R^{D9}$ | H |
| $L_{B610}$ | $R^{D76}$ | $R^{D10}$ | H |
| $L_{B611}$ | $R^{D76}$ | $R^{D12}$ | H |
| $L_{B612}$ | $R^{D76}$ | $R^{D15}$ | H |
| $L_{B613}$ | $R^{D76}$ | $R^{D16}$ | H |
| $L_{B614}$ | $R^{D76}$ | $R^{D17}$ | H |
| $L_{B615}$ | $R^{D76}$ | $R^{D18}$ | H |
| $L_{B616}$ | $R^{D76}$ | $R^{D19}$ | H |
| $L_{B617}$ | $R^{D76}$ | $R^{D20}$ | H |
| $L_{B618}$ | $R^{D76}$ | $R^{D21}$ | H |
| $L_{B619}$ | $R^{D76}$ | $R^{D23}$ | H |
| $L_{B620}$ | $R^{D76}$ | $R^{D24}$ | H |
| $L_{B621}$ | $R^{D76}$ | $R^{D25}$ | H |
| $L_{B622}$ | $R^{D76}$ | $R^{D27}$ | H |
| $L_{B623}$ | $R^{D76}$ | $R^{D28}$ | H |
| $L_{B624}$ | $R^{D76}$ | $R^{D29}$ | H |
| $L_{B625}$ | $R^{D76}$ | $R^{D30}$ | H |
| $L_{B626}$ | $R^{D76}$ | $R^{D31}$ | H |
| $L_{B627}$ | $R^{D76}$ | $R^{D32}$ | H |
| $L_{B628}$ | $R^{D76}$ | $R^{D33}$ | H |
| $L_{B629}$ | $R^{D76}$ | $R^{D34}$ | H |
| $L_{B630}$ | $R^{D76}$ | $R^{D42}$ | H |
| $L_{B631}$ | $R^{D1}$ | $R^{D1}$ | $R^{D1}$ |
| $L_{B632}$ | $R^{D2}$ | $R^{D2}$ | $R^{D1}$ |
| $L_{B633}$ | $R^{D3}$ | $R^{D3}$ | $R^{D1}$ |
| $L_{B634}$ | $R^{D4}$ | $R^{D4}$ | $R^{D1}$ |

-continued

| Ligand | $R^1$ | $R^2$ | $R^3$ |
|---|---|---|---|
| $L_{B635}$ | $R^{D5}$ | $R^{D5}$ | $R^{D1}$ |
| $L_{B636}$ | $R^{D6}$ | $R^{D6}$ | $R^{D1}$ |
| $L_{B637}$ | $R^{D7}$ | $R^{D7}$ | $R^{D1}$ |
| $L_{B638}$ | $R^{D8}$ | $R^{D8}$ | $R^{D1}$ |
| $L_{B639}$ | $R^{D9}$ | $R^{D9}$ | $R^{D1}$ |
| $L_{B640}$ | $R^{D10}$ | $R^{D10}$ | $R^{D1}$ |
| $L_{B641}$ | $R^{D11}$ | $R^{D11}$ | $R^{D1}$ |
| $L_{B642}$ | $R^{D12}$ | $R^{D12}$ | $R^{D1}$ |
| $L_{B643}$ | $R^{D13}$ | $R^{D13}$ | $R^{D1}$ |
| $L_{B644}$ | $R^{D14}$ | $R^{D14}$ | $R^{D1}$ |
| $L_{B645}$ | $R^{D15}$ | $R^{D15}$ | $R^{D1}$ |
| $L_{B646}$ | $R^{D16}$ | $R^{D16}$ | $R^{D1}$ |
| $L_{B647}$ | $R^{D17}$ | $R^{D17}$ | $R^{D1}$ |
| $L_{B648}$ | $R^{D18}$ | $R^{D18}$ | $R^{D1}$ |
| $L_{B649}$ | $R^{D19}$ | $R^{D19}$ | $R^{D1}$ |
| $L_{B650}$ | $R^{D20}$ | $R^{D20}$ | $R^{D1}$ |
| $L_{B651}$ | $R^{D21}$ | $R^{D21}$ | $R^{D1}$ |
| $L_{B652}$ | $R^{D22}$ | $R^{D22}$ | $R^{D1}$ |
| $L_{B653}$ | $R^{D23}$ | $R^{D23}$ | $R^{D1}$ |
| $L_{B654}$ | $R^{D24}$ | $R^{D24}$ | $R^{D1}$ |
| $L_{B655}$ | $R^{D25}$ | $R^{D25}$ | $R^{D1}$ |
| $L_{B656}$ | $R^{D26}$ | $R^{D26}$ | $R^{D1}$ |
| $L_{B657}$ | $R^{D27}$ | $R^{D27}$ | $R^{D1}$ |
| $L_{B658}$ | $R^{D28}$ | $R^{D28}$ | $R^{D1}$ |
| $L_{B659}$ | $R^{D29}$ | $R^{D29}$ | $R^{D1}$ |
| $L_{B660}$ | $R^{D30}$ | $R^{D30}$ | $R^{D1}$ |
| $L_{B661}$ | $R^{D31}$ | $R^{D31}$ | $R^{D1}$ |
| $L_{B662}$ | $R^{D32}$ | $R^{D32}$ | $R^{D1}$ |
| $L_{B663}$ | $R^{D33}$ | $R^{D33}$ | $R^{D1}$ |
| $L_{B664}$ | $R^{D34}$ | $R^{D34}$ | $R^{D1}$ |
| $L_{B665}$ | $R^{D35}$ | $R^{D35}$ | $R^{D1}$ |
| $L_{B666}$ | $R^{D40}$ | $R^{D40}$ | $R^{D1}$ |
| $L_{B667}$ | $R^{D41}$ | $R^{D41}$ | $R^{D1}$ |
| $L_{B668}$ | $R^{D42}$ | $R^{D42}$ | $R^{D1}$ |
| $L_{B669}$ | $R^{D64}$ | $R^{D64}$ | $R^{D1}$ |
| $L_{B670}$ | $R^{D66}$ | $R^{D66}$ | $R^{D1}$ |
| $L_{B671}$ | $R^{D68}$ | $R^{D68}$ | $R^{D1}$ |
| $L_{B672}$ | $R^{D76}$ | $R^{D76}$ | $R^{D1}$ |
| $L_{B673}$ | $R^{D1}$ | $R^{D2}$ | $R^{D1}$ |
| $L_{B674}$ | $R^{D1}$ | $R^{D3}$ | $R^{D1}$ |
| $L_{B675}$ | $R^{D1}$ | $R^{D4}$ | $R^{D1}$ |
| $L_{B676}$ | $R^{D1}$ | $R^{D5}$ | $R^{D1}$ |
| $L_{B677}$ | $R^{D1}$ | $R^{D6}$ | $R^{D1}$ |
| $L_{B678}$ | $R^{D1}$ | $R^{D7}$ | $R^{D1}$ |
| $L_{B679}$ | $R^{D1}$ | $R^{D8}$ | $R^{D1}$ |
| $L_{B680}$ | $R^{D1}$ | $R^{D9}$ | $R^{D1}$ |
| $L_{B681}$ | $R^{D1}$ | $R^{D10}$ | $R^{D1}$ |
| $L_{B682}$ | $R^{D1}$ | $R^{D11}$ | $R^{D1}$ |
| $L_{B683}$ | $R^{D1}$ | $R^{D12}$ | $R^{D1}$ |
| $L_{B684}$ | $R^{D1}$ | $R^{D13}$ | $R^{D1}$ |
| $L_{B685}$ | $R^{D1}$ | $R^{D14}$ | $R^{D1}$ |
| $L_{B686}$ | $R^{D1}$ | $R^{D15}$ | $R^{D1}$ |
| $L_{B687}$ | $R^{D1}$ | $R^{D16}$ | $R^{D1}$ |
| $L_{B688}$ | $R^{D1}$ | $R^{D17}$ | $R^{D1}$ |
| $L_{B689}$ | $R^{D1}$ | $R^{D18}$ | $R^{D1}$ |
| $L_{B690}$ | $R^{D1}$ | $R^{D19}$ | $R^{D1}$ |
| $L_{B691}$ | $R^{D1}$ | $R^{D20}$ | $R^{D1}$ |
| $L_{B692}$ | $R^{D1}$ | $R^{D21}$ | $R^{D1}$ |
| $L_{B693}$ | $R^{D1}$ | $R^{D22}$ | $R^{D1}$ |
| $L_{B694}$ | $R^{D1}$ | $R^{D23}$ | $R^{D1}$ |
| $L_{B695}$ | $R^{D1}$ | $R^{D24}$ | $R^{D1}$ |
| $L_{B696}$ | $R^{D1}$ | $R^{D25}$ | $R^{D1}$ |
| $L_{B697}$ | $R^{D1}$ | $R^{D26}$ | $R^{D1}$ |
| $L_{B698}$ | $R^{D1}$ | $R^{D27}$ | $R^{D1}$ |
| $L_{B699}$ | $R^{D1}$ | $R^{D28}$ | $R^{D1}$ |
| $L_{B700}$ | $R^{D1}$ | $R^{D29}$ | $R^{D1}$ |
| $L_{B701}$ | $R^{D1}$ | $R^{D30}$ | $R^{D1}$ |
| $L_{B702}$ | $R^{D1}$ | $R^{D31}$ | $R^{D1}$ |
| $L_{B703}$ | $R^{D1}$ | $R^{D32}$ | $R^{D1}$ |
| $L_{B704}$ | $R^{D1}$ | $R^{D33}$ | $R^{D1}$ |
| $L_{B705}$ | $R^{D1}$ | $R^{D34}$ | $R^{D1}$ |
| $L_{B706}$ | $R^{D1}$ | $R^{D35}$ | $R^{D1}$ |
| $L_{B707}$ | $R^{D1}$ | $R^{D40}$ | $R^{D1}$ |
| $L_{B708}$ | $R^{D1}$ | $R^{D41}$ | $R^{D1}$ |
| $L_{B709}$ | $R^{D1}$ | $R^{D42}$ | $R^{D1}$ |
| $L_{B710}$ | $R^{D1}$ | $R^{D64}$ | $R^{D1}$ |
| $L_{B711}$ | $R^{D1}$ | $R^{D66}$ | $R^{D1}$ |

-continued

| Ligand | $R^1$ | $R^2$ | $R^3$ |
|---|---|---|---|
| $L_{B712}$ | $R^{D1}$ | $R^{D68}$ | $R^{D1}$ |
| $L_{B713}$ | $R^{D1}$ | $R^{D76}$ | $R^{D1}$ |
| $L_{B714}$ | $R^{D2}$ | $R^{D1}$ | $R^{D1}$ |
| $L_{B715}$ | $R^{D2}$ | $R^{D3}$ | $R^{D1}$ |
| $L_{B716}$ | $R^{D2}$ | $R^{D4}$ | $R^{D1}$ |
| $L_{B717}$ | $R^{D2}$ | $R^{D5}$ | $R^{D1}$ |
| $L_{B718}$ | $R^{D2}$ | $R^{D6}$ | $R^{D1}$ |
| $L_{B719}$ | $R^{D2}$ | $R^{D7}$ | $R^{D1}$ |
| $L_{B720}$ | $R^{D2}$ | $R^{D8}$ | $R^{D1}$ |
| $L_{B721}$ | $R^{D2}$ | $R^{D9}$ | $R^{D1}$ |
| $L_{B722}$ | $R^{D2}$ | $R^{D10}$ | $R^{D1}$ |
| $L_{B723}$ | $R^{D2}$ | $R^{D11}$ | $R^{D1}$ |
| $L_{B724}$ | $R^{D2}$ | $R^{D12}$ | $R^{D1}$ |
| $L_{B725}$ | $R^{D2}$ | $R^{D13}$ | $R^{D1}$ |
| $L_{B726}$ | $R^{D2}$ | $R^{D14}$ | $R^{D1}$ |
| $L_{B727}$ | $R^{D2}$ | $R^{D15}$ | $R^{D1}$ |
| $L_{B728}$ | $R^{D2}$ | $R^{D16}$ | $R^{D1}$ |
| $L_{B729}$ | $R^{D2}$ | $R^{D17}$ | $R^{D1}$ |
| $L_{B730}$ | $R^{D2}$ | $R^{D18}$ | $R^{D1}$ |
| $L_{B731}$ | $R^{D2}$ | $R^{D19}$ | $R^{D1}$ |
| $L_{B732}$ | $R^{D2}$ | $R^{D20}$ | $R^{D1}$ |
| $L_{B733}$ | $R^{D2}$ | $R^{D21}$ | $R^{D1}$ |
| $L_{B734}$ | $R^{D2}$ | $R^{D22}$ | $R^{D1}$ |
| $L_{B735}$ | $R^{D2}$ | $R^{D23}$ | $R^{D1}$ |
| $L_{B736}$ | $R^{D2}$ | $R^{D24}$ | $R^{D1}$ |
| $L_{B737}$ | $R^{D2}$ | $R^{D25}$ | $R^{D1}$ |
| $L_{B738}$ | $R^{D2}$ | $R^{D26}$ | $R^{D1}$ |
| $L_{B739}$ | $R^{D2}$ | $R^{D27}$ | $R^{D1}$ |
| $L_{B740}$ | $R^{D2}$ | $R^{D28}$ | $R^{D1}$ |
| $L_{B741}$ | $R^{D2}$ | $R^{D29}$ | $R^{D1}$ |
| $L_{B742}$ | $R^{D2}$ | $R^{D30}$ | $R^{D1}$ |
| $L_{B743}$ | $R^{D2}$ | $R^{D31}$ | $R^{D1}$ |
| $L_{B744}$ | $R^{D2}$ | $R^{D32}$ | $R^{D1}$ |
| $L_{B745}$ | $R^{D2}$ | $R^{D33}$ | $R^{D1}$ |
| $L_{B746}$ | $R^{D2}$ | $R^{D34}$ | $R^{D1}$ |
| $L_{B747}$ | $R^{D2}$ | $R^{D35}$ | $R^{D1}$ |
| $L_{B748}$ | $R^{D2}$ | $R^{D40}$ | $R^{D1}$ |
| $L_{B749}$ | $R^{D2}$ | $R^{D41}$ | $R^{D1}$ |
| $L_{B750}$ | $R^{D2}$ | $R^{D42}$ | $R^{D1}$ |
| $L_{B751}$ | $R^{D2}$ | $R^{D64}$ | $R^{D1}$ |
| $L_{B752}$ | $R^{D2}$ | $R^{D66}$ | $R^{D1}$ |
| $L_{B753}$ | $R^{D2}$ | $R^{D68}$ | $R^{D1}$ |
| $L_{B754}$ | $R^{D2}$ | $R^{D76}$ | $R^{D1}$ |
| $L_{B755}$ | $R^{D3}$ | $R^{D4}$ | $R^{D1}$ |
| $L_{B756}$ | $R^{D3}$ | $R^{D5}$ | $R^{D1}$ |
| $L_{B757}$ | $R^{D3}$ | $R^{D6}$ | $R^{D1}$ |
| $L_{B758}$ | $R^{D3}$ | $R^{D7}$ | $R^{D1}$ |
| $L_{B759}$ | $R^{D3}$ | $R^{D8}$ | $R^{D1}$ |
| $L_{B760}$ | $R^{D3}$ | $R^{D9}$ | $R^{D1}$ |
| $L_{B761}$ | $R^{D3}$ | $R^{D10}$ | $R^{D1}$ |
| $L_{B762}$ | $R^{D3}$ | $R^{D11}$ | $R^{D1}$ |
| $L_{B763}$ | $R^{D3}$ | $R^{D12}$ | $R^{D1}$ |
| $L_{B764}$ | $R^{D3}$ | $R^{D13}$ | $R^{D1}$ |
| $L_{B765}$ | $R^{D3}$ | $R^{D14}$ | $R^{D1}$ |
| $L_{B766}$ | $R^{D3}$ | $R^{D15}$ | $R^{D1}$ |
| $L_{B767}$ | $R^{D3}$ | $R^{D16}$ | $R^{D1}$ |
| $L_{B768}$ | $R^{D3}$ | $R^{D17}$ | $R^{D1}$ |
| $L_{B769}$ | $R^{D3}$ | $R^{D18}$ | $R^{D1}$ |
| $L_{B770}$ | $R^{D3}$ | $R^{D19}$ | $R^{D1}$ |
| $L_{B771}$ | $R^{D3}$ | $R^{D20}$ | $R^{D1}$ |
| $L_{B772}$ | $R^{D3}$ | $R^{D21}$ | $R^{D1}$ |
| $L_{B773}$ | $R^{D3}$ | $R^{D22}$ | $R^{D1}$ |
| $L_{B774}$ | $R^{D3}$ | $R^{D23}$ | $R^{D1}$ |
| $L_{B775}$ | $R^{D3}$ | $R^{D24}$ | $R^{D1}$ |
| $L_{B776}$ | $R^{D3}$ | $R^{D25}$ | $R^{D1}$ |
| $L_{B777}$ | $R^{D3}$ | $R^{D26}$ | $R^{D1}$ |
| $L_{B778}$ | $R^{D3}$ | $R^{D27}$ | $R^{D1}$ |
| $L_{B779}$ | $R^{D3}$ | $R^{D28}$ | $R^{D1}$ |
| $L_{B780}$ | $R^{D3}$ | $R^{D29}$ | $R^{D1}$ |
| $L_{B781}$ | $R^{D3}$ | $R^{D30}$ | $R^{D1}$ |
| $L_{B782}$ | $R^{D3}$ | $R^{D31}$ | $R^{D1}$ |
| $L_{B783}$ | $R^{D3}$ | $R^{D32}$ | $R^{D1}$ |
| $L_{B784}$ | $R^{D3}$ | $R^{D33}$ | $R^{D1}$ |
| $L_{B785}$ | $R^{D3}$ | $R^{D34}$ | $R^{D1}$ |
| $L_{B786}$ | $R^{D3}$ | $R^{D35}$ | $R^{D1}$ |
| $L_{B787}$ | $R^{D3}$ | $R^{D40}$ | $R^{D1}$ |
| $L_{B788}$ | $R^{D3}$ | $R^{D41}$ | $R^{D1}$ |

-continued

| Ligand | $R^1$ | $R^2$ | $R^3$ |
|---|---|---|---|
| $L_{B789}$ | $R^{D3}$ | $R^{D42}$ | $R^{D1}$ |
| $L_{B790}$ | $R^{D3}$ | $R^{D64}$ | $R^{D1}$ |
| $L_{B791}$ | $R^{D3}$ | $R^{D66}$ | $R^{D1}$ |
| $L_{B792}$ | $R^{D3}$ | $R^{D68}$ | $R^{D1}$ |
| $L_{B793}$ | $R^{D3}$ | $R^{D76}$ | $R^{D1}$ |
| $L_{B794}$ | $R^{D4}$ | $R^{D5}$ | $R^{D1}$ |
| $L_{B795}$ | $R^{D4}$ | $R^{D6}$ | $R^{D1}$ |
| $L_{B796}$ | $R^{D4}$ | $R^{D7}$ | $R^{D1}$ |
| $L_{B797}$ | $R^{D4}$ | $R^{D8}$ | $R^{D1}$ |
| $L_{B798}$ | $R^{D4}$ | $R^{D9}$ | $R^{D1}$ |
| $L_{B799}$ | $R^{D4}$ | $R^{D10}$ | $R^{D1}$ |
| $L_{B800}$ | $R^{D4}$ | $R^{D11}$ | $R^{D1}$ |
| $L_{B801}$ | $R^{D4}$ | $R^{D12}$ | $R^{D1}$ |
| $L_{B802}$ | $R^{D4}$ | $R^{D13}$ | $R^{D1}$ |
| $L_{B803}$ | $R^{D4}$ | $R^{D14}$ | $R^{D1}$ |
| $L_{B804}$ | $R^{D4}$ | $R^{D15}$ | $R^{D1}$ |
| $L_{B805}$ | $R^{D4}$ | $R^{D16}$ | $R^{D1}$ |
| $L_{B806}$ | $R^{D4}$ | $R^{D17}$ | $R^{D1}$ |
| $L_{B807}$ | $R^{D4}$ | $R^{D18}$ | $R^{D1}$ |
| $L_{B808}$ | $R^{D4}$ | $R^{D19}$ | $R^{D1}$ |
| $L_{B809}$ | $R^{D4}$ | $R^{D20}$ | $R^{D1}$ |
| $L_{B810}$ | $R^{D4}$ | $R^{D21}$ | $R^{D1}$ |
| $L_{B811}$ | $R^{D4}$ | $R^{D22}$ | $R^{D1}$ |
| $L_{B812}$ | $R^{D4}$ | $R^{D23}$ | $R^{D1}$ |
| $L_{B813}$ | $R^{D4}$ | $R^{D24}$ | $R^{D1}$ |
| $L_{B814}$ | $R^{D4}$ | $R^{D25}$ | $R^{D1}$ |
| $L_{B815}$ | $R^{D4}$ | $R^{D26}$ | $R^{D1}$ |
| $L_{B816}$ | $R^{D4}$ | $R^{D27}$ | $R^{D1}$ |
| $L_{B817}$ | $R^{D4}$ | $R^{D28}$ | $R^{D1}$ |
| $L_{B818}$ | $R^{D4}$ | $R^{D29}$ | $R^{D1}$ |
| $L_{B819}$ | $R^{D4}$ | $R^{D30}$ | $R^{D1}$ |
| $L_{B820}$ | $R^{D4}$ | $R^{D31}$ | $R^{D1}$ |
| $L_{B821}$ | $R^{D4}$ | $R^{D32}$ | $R^{D1}$ |
| $L_{B822}$ | $R^{D4}$ | $R^{D33}$ | $R^{D1}$ |
| $L_{B823}$ | $R^{D4}$ | $R^{D34}$ | $R^{D1}$ |
| $L_{B824}$ | $R^{D4}$ | $R^{D35}$ | $R^{D1}$ |
| $L_{B825}$ | $R^{D4}$ | $R^{D40}$ | $R^{D1}$ |
| $L_{B826}$ | $R^{D4}$ | $R^{D41}$ | $R^{D1}$ |
| $L_{B827}$ | $R^{D4}$ | $R^{D42}$ | $R^{D1}$ |
| $L_{B828}$ | $R^{D4}$ | $R^{D64}$ | $R^{D1}$ |
| $L_{B829}$ | $R^{D4}$ | $R^{D66}$ | $R^{D1}$ |
| $L_{B830}$ | $R^{D4}$ | $R^{D68}$ | $R^{D1}$ |
| $L_{B831}$ | $R^{D4}$ | $R^{D76}$ | $R^{D1}$ |
| $L_{B832}$ | $R^{D4}$ | $R^{D1}$ | $R^{D1}$ |
| $L_{B833}$ | $R^{D7}$ | $R^{D5}$ | $R^{D1}$ |
| $L_{B834}$ | $R^{D7}$ | $R^{D6}$ | $R^{D1}$ |
| $L_{B835}$ | $R^{D7}$ | $R^{D8}$ | $R^{D1}$ |
| $L_{B836}$ | $R^{D7}$ | $R^{D9}$ | $R^{D1}$ |
| $L_{B837}$ | $R^{D7}$ | $R^{D10}$ | $R^{D1}$ |
| $L_{B838}$ | $R^{D7}$ | $R^{D11}$ | $R^{D1}$ |
| $L_{B839}$ | $R^{D7}$ | $R^{D12}$ | $R^{D1}$ |
| $L_{B840}$ | $R^{D7}$ | $R^{D13}$ | $R^{D1}$ |
| $L_{B841}$ | $R^{D7}$ | $R^{D14}$ | $R^{D1}$ |
| $L_{B842}$ | $R^{D7}$ | $R^{D15}$ | $R^{D1}$ |
| $L_{B843}$ | $R^{D7}$ | $R^{D16}$ | $R^{D1}$ |
| $L_{B844}$ | $R^{D7}$ | $R^{D17}$ | $R^{D1}$ |
| $L_{B845}$ | $R^{D7}$ | $R^{D18}$ | $R^{D1}$ |
| $L_{B846}$ | $R^{D7}$ | $R^{D19}$ | $R^{D1}$ |
| $L_{B847}$ | $R^{D7}$ | $R^{D20}$ | $R^{D1}$ |
| $L_{B848}$ | $R^{D7}$ | $R^{D21}$ | $R^{D1}$ |
| $L_{B849}$ | $R^{D7}$ | $R^{D22}$ | $R^{D1}$ |
| $L_{B850}$ | $R^{D7}$ | $R^{D23}$ | $R^{D1}$ |
| $L_{B851}$ | $R^{D7}$ | $R^{D24}$ | $R^{D1}$ |
| $L_{B852}$ | $R^{D7}$ | $R^{D25}$ | $R^{D1}$ |
| $L_{B853}$ | $R^{D7}$ | $R^{D26}$ | $R^{D1}$ |
| $L_{B854}$ | $R^{D7}$ | $R^{D27}$ | $R^{D1}$ |
| $L_{B855}$ | $R^{D7}$ | $R^{D28}$ | $R^{D1}$ |
| $L_{B856}$ | $R^{D7}$ | $R^{D29}$ | $R^{D1}$ |
| $L_{B857}$ | $R^{D7}$ | $R^{D30}$ | $R^{D1}$ |
| $L_{B858}$ | $R^{D7}$ | $R^{D31}$ | $R^{D1}$ |
| $L_{B859}$ | $R^{D7}$ | $R^{D32}$ | $R^{D1}$ |
| $L_{B860}$ | $R^{D7}$ | $R^{D33}$ | $R^{D1}$ |
| $L_{B861}$ | $R^{D7}$ | $R^{D34}$ | $R^{D1}$ |
| $L_{B862}$ | $R^{D7}$ | $R^{D35}$ | $R^{D1}$ |
| $L_{B863}$ | $R^{D7}$ | $R^{D40}$ | $R^{D1}$ |
| $L_{B864}$ | $R^{D7}$ | $R^{D41}$ | $R^{D1}$ |
| $L_{B865}$ | $R^{D7}$ | $R^{D42}$ | $R^{D1}$ |

-continued

| Ligand | $R^1$ | $R^2$ | $R^3$ |
|---|---|---|---|
| $L_{B866}$ | $R^{D7}$ | $R^{D64}$ | $R^{D1}$ |
| $L_{B867}$ | $R^{D7}$ | $R^{D66}$ | $R^{D1}$ |
| $L_{B868}$ | $R^{D7}$ | $R^{D68}$ | $R^{D1}$ |
| $L_{B869}$ | $R^{D7}$ | $R^{D76}$ | $R^{D1}$ |
| $L_{B870}$ | $R^{D8}$ | $R^{D5}$ | $R^{D1}$ |
| $L_{B871}$ | $R^{D8}$ | $R^{D6}$ | $R^{D1}$ |
| $L_{B872}$ | $R^{D8}$ | $R^{D9}$ | $R^{D1}$ |
| $L_{B873}$ | $R^{D8}$ | $R^{D10}$ | $R^{D1}$ |
| $L_{B874}$ | $R^{D8}$ | $R^{D11}$ | $R^{D1}$ |
| $L_{B875}$ | $R^{D8}$ | $R^{D12}$ | $R^{D1}$ |
| $L_{B876}$ | $R^{D8}$ | $R^{D13}$ | $R^{D1}$ |
| $L_{B877}$ | $R^{D8}$ | $R^{D14}$ | $R^{D1}$ |
| $L_{B878}$ | $R^{D8}$ | $R^{D15}$ | $R^{D1}$ |
| $L_{B879}$ | $R^{D8}$ | $R^{D16}$ | $R^{D1}$ |
| $L_{B880}$ | $R^{D8}$ | $R^{D17}$ | $R^{D1}$ |
| $L_{B881}$ | $R^{D8}$ | $R^{D18}$ | $R^{D1}$ |
| $L_{B882}$ | $R^{D8}$ | $R^{D19}$ | $R^{D1}$ |
| $L_{B883}$ | $R^{D8}$ | $R^{D20}$ | $R^{D1}$ |
| $L_{B884}$ | $R^{D8}$ | $R^{D21}$ | $R^{D1}$ |
| $L_{B885}$ | $R^{D8}$ | $R^{D22}$ | $R^{D1}$ |
| $L_{B886}$ | $R^{D8}$ | $R^{D23}$ | $R^{D1}$ |
| $L_{B887}$ | $R^{D8}$ | $R^{D24}$ | $R^{D1}$ |
| $L_{B888}$ | $R^{D8}$ | $R^{D25}$ | $R^{D1}$ |
| $L_{B889}$ | $R^{D8}$ | $R^{D26}$ | $R^{D1}$ |
| $L_{B890}$ | $R^{D8}$ | $R^{D27}$ | $R^{D1}$ |
| $L_{B891}$ | $R^{D8}$ | $R^{D28}$ | $R^{D1}$ |
| $L_{B892}$ | $R^{D8}$ | $R^{D29}$ | $R^{D1}$ |
| $L_{B893}$ | $R^{D8}$ | $R^{D30}$ | $R^{D1}$ |
| $L_{B894}$ | $R^{D8}$ | $R^{D31}$ | $R^{D1}$ |
| $L_{B895}$ | $R^{D8}$ | $R^{D32}$ | $R^{D1}$ |
| $L_{B896}$ | $R^{D8}$ | $R^{D33}$ | $R^{D1}$ |
| $L_{B897}$ | $R^{D8}$ | $R^{D34}$ | $R^{D1}$ |
| $L_{B898}$ | $R^{D8}$ | $R^{D35}$ | $R^{D1}$ |
| $L_{B899}$ | $R^{D8}$ | $R^{D40}$ | $R^{D1}$ |
| $L_{B900}$ | $R^{D8}$ | $R^{D41}$ | $R^{D1}$ |
| $L_{B901}$ | $R^{D8}$ | $R^{D42}$ | $R^{D1}$ |
| $L_{B902}$ | $R^{D8}$ | $R^{D64}$ | $R^{D1}$ |
| $L_{B903}$ | $R^{D8}$ | $R^{D66}$ | $R^{D1}$ |
| $L_{B904}$ | $R^{D8}$ | $R^{D68}$ | $R^{D1}$ |
| $L_{B905}$ | $R^{D8}$ | $R^{D76}$ | $R^{D1}$ |
| $L_{B906}$ | $R^{D11}$ | $R^{D5}$ | $R^{D1}$ |
| $L_{B907}$ | $R^{D11}$ | $R^{D6}$ | $R^{D1}$ |
| $L_{B908}$ | $R^{D11}$ | $R^{D9}$ | $R^{D1}$ |
| $L_{B909}$ | $R^{D11}$ | $R^{D10}$ | $R^{D1}$ |
| $L_{B910}$ | $R^{D11}$ | $R^{D12}$ | $R^{D1}$ |
| $L_{B911}$ | $R^{D11}$ | $R^{D13}$ | $R^{D1}$ |
| $L_{B912}$ | $R^{D11}$ | $R^{D14}$ | $R^{D1}$ |
| $L_{B913}$ | $R^{D11}$ | $R^{D15}$ | $R^{D1}$ |
| $L_{B914}$ | $R^{D11}$ | $R^{D16}$ | $R^{D1}$ |
| $L_{B915}$ | $R^{D11}$ | $R^{D17}$ | $R^{D1}$ |
| $L_{B916}$ | $R^{D11}$ | $R^{D18}$ | $R^{D1}$ |
| $L_{B917}$ | $R^{D11}$ | $R^{D19}$ | $R^{D1}$ |
| $L_{B918}$ | $R^{D11}$ | $R^{D20}$ | $R^{D1}$ |
| $L_{B919}$ | $R^{D11}$ | $R^{D21}$ | $R^{D1}$ |
| $L_{B920}$ | $R^{D11}$ | $R^{D22}$ | $R^{D1}$ |
| $L_{B921}$ | $R^{D11}$ | $R^{D23}$ | $R^{D1}$ |
| $L_{B922}$ | $R^{D11}$ | $R^{D24}$ | $R^{D1}$ |
| $L_{B923}$ | $R^{D11}$ | $R^{D25}$ | $R^{D1}$ |
| $L_{B924}$ | $R^{D11}$ | $R^{D26}$ | $R^{D1}$ |
| $L_{B925}$ | $R^{D11}$ | $R^{D27}$ | $R^{D1}$ |
| $L_{B926}$ | $R^{D11}$ | $R^{D28}$ | $R^{D1}$ |
| $L_{B927}$ | $R^{D11}$ | $R^{D29}$ | $R^{D1}$ |
| $L_{B928}$ | $R^{D11}$ | $R^{D30}$ | $R^{D1}$ |
| $L_{B929}$ | $R^{D11}$ | $R^{D31}$ | $R^{D1}$ |
| $L_{B930}$ | $R^{D11}$ | $R^{D32}$ | $R^{D1}$ |
| $L_{B931}$ | $R^{D11}$ | $R^{D33}$ | $R^{D1}$ |
| $L_{B932}$ | $R^{D11}$ | $R^{D34}$ | $R^{D1}$ |
| $L_{B933}$ | $R^{D11}$ | $R^{D35}$ | $R^{D1}$ |
| $L_{B934}$ | $R^{D11}$ | $R^{D40}$ | $R^{D1}$ |
| $L_{B935}$ | $R^{D11}$ | $R^{D41}$ | $R^{D1}$ |
| $L_{B936}$ | $R^{D11}$ | $R^{D42}$ | $R^{D1}$ |
| $L_{B937}$ | $R^{D11}$ | $R^{D64}$ | $R^{D1}$ |
| $L_{B938}$ | $R^{D11}$ | $R^{D66}$ | $R^{D1}$ |
| $L_{B939}$ | $R^{D11}$ | $R^{D68}$ | $R^{D1}$ |
| $L_{B940}$ | $R^{D11}$ | $R^{D76}$ | $R^{D1}$ |
| $L_{B941}$ | $R^{D13}$ | $R^{D5}$ | $R^{D1}$ |
| $L_{B942}$ | $R^{D13}$ | $R^{D6}$ | $R^{D1}$ |

-continued

| Ligand | $R^1$ | $R^2$ | $R^3$ |
|---|---|---|---|
| $L_{B943}$ | $R^{D13}$ | $R^{D9}$ | $R^{D1}$ |
| $L_{B944}$ | $R^{D13}$ | $R^{D10}$ | $R^{D1}$ |
| $L_{B945}$ | $R^{D13}$ | $R^{D12}$ | $R^{D1}$ |
| $L_{B946}$ | $R^{D13}$ | $R^{D14}$ | $R^{D1}$ |
| $L_{B947}$ | $R^{D13}$ | $R^{D15}$ | $R^{D1}$ |
| $L_{B948}$ | $R^{D13}$ | $R^{D16}$ | $R^{D1}$ |
| $L_{B949}$ | $R^{D13}$ | $R^{D17}$ | $R^{D1}$ |
| $L_{B950}$ | $R^{D13}$ | $R^{D18}$ | $R^{D1}$ |
| $L_{B951}$ | $R^{D13}$ | $R^{D19}$ | $R^{D1}$ |
| $L_{B952}$ | $R^{D13}$ | $R^{D20}$ | $R^{D1}$ |
| $L_{B953}$ | $R^{D13}$ | $R^{D21}$ | $R^{D1}$ |
| $L_{B954}$ | $R^{D13}$ | $R^{D22}$ | $R^{D1}$ |
| $L_{B955}$ | $R^{D13}$ | $R^{D23}$ | $R^{D1}$ |
| $L_{B956}$ | $R^{D13}$ | $R^{D24}$ | $R^{D1}$ |
| $L_{B957}$ | $R^{D13}$ | $R^{D25}$ | $R^{D1}$ |
| $L_{B958}$ | $R^{D13}$ | $R^{D26}$ | $R^{D1}$ |
| $L_{B959}$ | $R^{D13}$ | $R^{D27}$ | $R^{D1}$ |
| $L_{B960}$ | $R^{D13}$ | $R^{D28}$ | $R^{D1}$ |
| $L_{B961}$ | $R^{D13}$ | $R^{D29}$ | $R^{D1}$ |
| $L_{B962}$ | $R^{D13}$ | $R^{D30}$ | $R^{D1}$ |
| $L_{B963}$ | $R^{D13}$ | $R^{D31}$ | $R^{D1}$ |
| $L_{B964}$ | $R^{D13}$ | $R^{D32}$ | $R^{D1}$ |
| $L_{B965}$ | $R^{D13}$ | $R^{D33}$ | $R^{D1}$ |
| $L_{B966}$ | $R^{D13}$ | $R^{D34}$ | $R^{D1}$ |
| $L_{B967}$ | $R^{D13}$ | $R^{D35}$ | $R^{D1}$ |
| $L_{B968}$ | $R^{D13}$ | $R^{D40}$ | $R^{D1}$ |
| $L_{B969}$ | $R^{D13}$ | $R^{D41}$ | $R^{D1}$ |
| $L_{B970}$ | $R^{D13}$ | $R^{D42}$ | $R^{D1}$ |
| $L_{B971}$ | $R^{D13}$ | $R^{D64}$ | $R^{D1}$ |
| $L_{B972}$ | $R^{D13}$ | $R^{D66}$ | $R^{D1}$ |
| $L_{B973}$ | $R^{D13}$ | $R^{D68}$ | $R^{D1}$ |
| $L_{B974}$ | $R^{D13}$ | $R^{D76}$ | $R^{D1}$ |
| $L_{B975}$ | $R^{D14}$ | $R^{D5}$ | $R^{D1}$ |
| $L_{B976}$ | $R^{D14}$ | $R^{D6}$ | $R^{D1}$ |
| $L_{B977}$ | $R^{D14}$ | $R^{D9}$ | $R^{D1}$ |
| $L_{B978}$ | $R^{D14}$ | $R^{D10}$ | $R^{D1}$ |
| $L_{B979}$ | $R^{D14}$ | $R^{D12}$ | $R^{D1}$ |
| $L_{B980}$ | $R^{D14}$ | $R^{D15}$ | $R^{D1}$ |
| $L_{B981}$ | $R^{D14}$ | $R^{D16}$ | $R^{D1}$ |
| $L_{B982}$ | $R^{D14}$ | $R^{D17}$ | $R^{D1}$ |
| $L_{B983}$ | $R^{D14}$ | $R^{D18}$ | $R^{D1}$ |
| $L_{B984}$ | $R^{D14}$ | $R^{D19}$ | $R^{D1}$ |
| $L_{B985}$ | $R^{D14}$ | $R^{D20}$ | $R^{D1}$ |
| $L_{B986}$ | $R^{D14}$ | $R^{D21}$ | $R^{D1}$ |
| $L_{B987}$ | $R^{D14}$ | $R^{D22}$ | $R^{D1}$ |
| $L_{B988}$ | $R^{D14}$ | $R^{D23}$ | $R^{D1}$ |
| $L_{B989}$ | $R^{D14}$ | $R^{D24}$ | $R^{D1}$ |
| $L_{B990}$ | $R^{D14}$ | $R^{D25}$ | $R^{D1}$ |
| $L_{B991}$ | $R^{D14}$ | $R^{D26}$ | $R^{D1}$ |
| $L_{B992}$ | $R^{D14}$ | $R^{D27}$ | $R^{D1}$ |
| $L_{B993}$ | $R^{D14}$ | $R^{D28}$ | $R^{D1}$ |
| $L_{B994}$ | $R^{D14}$ | $R^{D29}$ | $R^{D1}$ |
| $L_{B995}$ | $R^{D14}$ | $R^{D30}$ | $R^{D1}$ |
| $L_{B996}$ | $R^{D14}$ | $R^{D31}$ | $R^{D1}$ |
| $L_{B997}$ | $R^{D14}$ | $R^{D32}$ | $R^{D1}$ |
| $L_{B998}$ | $R^{D14}$ | $R^{D33}$ | $R^{D1}$ |
| $L_{B999}$ | $R^{D14}$ | $R^{D34}$ | $R^{D1}$ |
| $L_{B1000}$ | $R^{D14}$ | $R^{D35}$ | $R^{D1}$ |
| $L_{B1001}$ | $R^{D14}$ | $R^{D40}$ | $R^{D1}$ |
| $L_{B1002}$ | $R^{D14}$ | $R^{D41}$ | $R^{D1}$ |
| $L_{B1003}$ | $R^{D14}$ | $R^{D42}$ | $R^{D1}$ |
| $L_{B1004}$ | $R^{D14}$ | $R^{D64}$ | $R^{D1}$ |
| $L_{B1005}$ | $R^{D14}$ | $R^{D66}$ | $R^{D1}$ |
| $L_{B1006}$ | $R^{D14}$ | $R^{D68}$ | $R^{D1}$ |
| $L_{B1007}$ | $R^{D14}$ | $R^{D76}$ | $R^{D1}$ |
| $L_{B1008}$ | $R^{D22}$ | $R^{D5}$ | $R^{D1}$ |
| $L_{B1009}$ | $R^{D22}$ | $R^{D6}$ | $R^{D1}$ |
| $L_{B1010}$ | $R^{D22}$ | $R^{D9}$ | $R^{D1}$ |
| $L_{B1011}$ | $R^{D22}$ | $R^{D10}$ | $R^{D1}$ |
| $L_{B1012}$ | $R^{D22}$ | $R^{D12}$ | $R^{D1}$ |
| $L_{B1013}$ | $R^{D22}$ | $R^{D15}$ | $R^{D1}$ |
| $L_{B1014}$ | $R^{D22}$ | $R^{D16}$ | $R^{D1}$ |
| $L_{B1015}$ | $R^{D22}$ | $R^{D17}$ | $R^{D1}$ |
| $L_{B1016}$ | $R^{D22}$ | $R^{D18}$ | $R^{D1}$ |
| $L_{B1017}$ | $R^{D22}$ | $R^{D19}$ | $R^{D1}$ |
| $L_{B1018}$ | $R^{D22}$ | $R^{D20}$ | $R^{D1}$ |
| $L_{B1019}$ | $R^{D22}$ | $R^{D21}$ | $R^{D1}$ |
| $L_{B1020}$ | $R^{D22}$ | $R^{D23}$ | $R^{D1}$ |
| $L_{B1021}$ | $R^{D22}$ | $R^{D24}$ | $R^{D1}$ |
| $L_{B1022}$ | $R^{D22}$ | $R^{D25}$ | $R^{D1}$ |
| $L_{B1023}$ | $R^{D22}$ | $R^{D26}$ | $R^{D1}$ |
| $L_{B1024}$ | $R^{D22}$ | $R^{D27}$ | $R^{D1}$ |
| $L_{B1025}$ | $R^{D22}$ | $R^{D28}$ | $R^{D1}$ |
| $L_{B1026}$ | $R^{D22}$ | $R^{D29}$ | $R^{D1}$ |
| $L_{B1027}$ | $R^{D22}$ | $R^{D30}$ | $R^{D1}$ |
| $L_{B1028}$ | $R^{D22}$ | $R^{D31}$ | $R^{D1}$ |
| $L_{B1029}$ | $R^{D22}$ | $R^{D32}$ | $R^{D1}$ |
| $L_{B1030}$ | $R^{D22}$ | $R^{D33}$ | $R^{D1}$ |
| $L_{B1031}$ | $R^{D22}$ | $R^{D34}$ | $R^{D1}$ |
| $L_{B1032}$ | $R^{D22}$ | $R^{D35}$ | $R^{D1}$ |
| $L_{B1033}$ | $R^{D22}$ | $R^{D40}$ | $R^{D1}$ |
| $L_{B1034}$ | $R^{D22}$ | $R^{D41}$ | $R^{D1}$ |
| $L_{B1035}$ | $R^{D22}$ | $R^{D42}$ | $R^{D1}$ |
| $L_{B1036}$ | $R^{D22}$ | $R^{D64}$ | $R^{D1}$ |
| $L_{B1037}$ | $R^{D22}$ | $R^{D66}$ | $R^{D1}$ |
| $L_{B1038}$ | $R^{D22}$ | $R^{D68}$ | $R^{D1}$ |
| $L_{B1039}$ | $R^{D22}$ | $R^{D76}$ | $R^{D1}$ |
| $L_{B1040}$ | $R^{D26}$ | $R^{D5}$ | $R^{D1}$ |
| $L_{B1041}$ | $R^{D26}$ | $R^{D6}$ | $R^{D1}$ |
| $L_{B1042}$ | $R^{D26}$ | $R^{D9}$ | $R^{D1}$ |
| $L_{B1043}$ | $R^{D26}$ | $R^{D10}$ | $R^{D1}$ |
| $L_{B1044}$ | $R^{D26}$ | $R^{D12}$ | $R^{D1}$ |
| $L_{B1045}$ | $R^{D26}$ | $R^{D15}$ | $R^{D1}$ |
| $L_{B1046}$ | $R^{D26}$ | $R^{D16}$ | $R^{D1}$ |
| $L_{B1047}$ | $R^{D26}$ | $R^{D17}$ | $R^{D1}$ |
| $L_{B1048}$ | $R^{D26}$ | $R^{D18}$ | $R^{D1}$ |
| $L_{B1049}$ | $R^{D26}$ | $R^{D19}$ | $R^{D1}$ |
| $L_{B1050}$ | $R^{D26}$ | $R^{D20}$ | $R^{D1}$ |
| $L_{B1051}$ | $R^{D26}$ | $R^{D21}$ | $R^{D1}$ |
| $L_{B1052}$ | $R^{D26}$ | $R^{D23}$ | $R^{D1}$ |
| $L_{B1053}$ | $R^{D26}$ | $R^{D24}$ | $R^{D1}$ |
| $L_{B1054}$ | $R^{D26}$ | $R^{D25}$ | $R^{D1}$ |
| $L_{B1055}$ | $R^{D26}$ | $R^{D27}$ | $R^{D1}$ |
| $L_{B1056}$ | $R^{D26}$ | $R^{D28}$ | $R^{D1}$ |
| $L_{B1057}$ | $R^{D26}$ | $R^{D29}$ | $R^{D1}$ |
| $L_{B1058}$ | $R^{D26}$ | $R^{D30}$ | $R^{D1}$ |
| $L_{B1059}$ | $R^{D26}$ | $R^{D31}$ | $R^{D1}$ |
| $L_{B1060}$ | $R^{D26}$ | $R^{D32}$ | $R^{D1}$ |
| $L_{B1061}$ | $R^{D26}$ | $R^{D33}$ | $R^{D1}$ |
| $L_{B1062}$ | $R^{D26}$ | $R^{D34}$ | $R^{D1}$ |
| $L_{B1063}$ | $R^{D26}$ | $R^{D35}$ | $R^{D1}$ |
| $L_{B1064}$ | $R^{D26}$ | $R^{D40}$ | $R^{D1}$ |
| $L_{B1065}$ | $R^{D26}$ | $R^{D41}$ | $R^{D1}$ |
| $L_{B1066}$ | $R^{D26}$ | $R^{D42}$ | $R^{D1}$ |
| $L_{B1067}$ | $R^{D26}$ | $R^{D64}$ | $R^{D1}$ |
| $L_{B1068}$ | $R^{D26}$ | $R^{D66}$ | $R^{D1}$ |
| $L_{B1069}$ | $R^{D26}$ | $R^{D68}$ | $R^{D1}$ |
| $L_{B1070}$ | $R^{D26}$ | $R^{D76}$ | $R^{D1}$ |
| $L_{B1071}$ | $R^{D35}$ | $R^{D5}$ | $R^{D1}$ |
| $L_{B1072}$ | $R^{D35}$ | $R^{D6}$ | $R^{D1}$ |
| $L_{B1073}$ | $R^{D35}$ | $R^{D9}$ | $R^{D1}$ |
| $L_{B1074}$ | $R^{D35}$ | $R^{D10}$ | $R^{D1}$ |
| $L_{B1075}$ | $R^{D35}$ | $R^{D12}$ | $R^{D1}$ |
| $L_{B1076}$ | $R^{D35}$ | $R^{D15}$ | $R^{D1}$ |
| $L_{B1077}$ | $R^{D35}$ | $R^{D16}$ | $R^{D1}$ |
| $L_{B1078}$ | $R^{D35}$ | $R^{D17}$ | $R^{D1}$ |
| $L_{B1079}$ | $R^{D35}$ | $R^{D18}$ | $R^{D1}$ |
| $L_{B1080}$ | $R^{D35}$ | $R^{D19}$ | $R^{D1}$ |
| $L_{B1081}$ | $R^{D35}$ | $R^{D20}$ | $R^{D1}$ |
| $L_{B1082}$ | $R^{D35}$ | $R^{D21}$ | $R^{D1}$ |
| $L_{B1083}$ | $R^{D35}$ | $R^{D23}$ | $R^{D1}$ |
| $L_{B1084}$ | $R^{D35}$ | $R^{D24}$ | $R^{D1}$ |
| $L_{B1085}$ | $R^{D35}$ | $R^{D25}$ | $R^{D1}$ |
| $L_{B1086}$ | $R^{D35}$ | $R^{D27}$ | $R^{D1}$ |
| $L_{B1087}$ | $R^{D35}$ | $R^{D28}$ | $R^{D1}$ |
| $L_{B1088}$ | $R^{D35}$ | $R^{D29}$ | $R^{D1}$ |
| $L_{B1089}$ | $R^{D35}$ | $R^{D30}$ | $R^{D1}$ |
| $L_{B1090}$ | $R^{D35}$ | $R^{D31}$ | $R^{D1}$ |
| $L_{B1091}$ | $R^{D35}$ | $R^{D32}$ | $R^{D1}$ |
| $L_{B1092}$ | $R^{D35}$ | $R^{D33}$ | $R^{D1}$ |
| $L_{B1093}$ | $R^{D35}$ | $R^{D34}$ | $R^{D1}$ |
| $L_{B1094}$ | $R^{D35}$ | $R^{D40}$ | $R^{D1}$ |
| $L_{B1095}$ | $R^{D35}$ | $R^{D41}$ | $R^{D1}$ |
| $L_{B1096}$ | $R^{D35}$ | $R^{D42}$ | $R^{D1}$ |

-continued

| Ligand | $R^1$ | $R^2$ | $R^3$ |
|---|---|---|---|
| $L_{B1097}$ | $R^{D35}$ | $R^{D64}$ | $R^{D1}$ |
| $L_{B1098}$ | $R^{D35}$ | $R^{D66}$ | $R^{D1}$ |
| $L_{B1099}$ | $R^{D35}$ | $R^{D68}$ | $R^{D1}$ |
| $L_{B1100}$ | $R^{D35}$ | $R^{D76}$ | $R^{D1}$ |
| $L_{B1101}$ | $R^{D40}$ | $R^{D5}$ | $R^{D1}$ |
| $L_{B1102}$ | $R^{D40}$ | $R^{D6}$ | $R^{D1}$ |
| $L_{B1103}$ | $R^{D40}$ | $R^{D9}$ | $R^{D1}$ |
| $L_{B1104}$ | $R^{D40}$ | $R^{D10}$ | $R^{D1}$ |
| $L_{B1105}$ | $R^{D40}$ | $R^{D12}$ | $R^{D1}$ |
| $L_{B1106}$ | $R^{D40}$ | $R^{D15}$ | $R^{D1}$ |
| $L_{B1107}$ | $R^{D40}$ | $R^{D16}$ | $R^{D1}$ |
| $L_{B1108}$ | $R^{D40}$ | $R^{D17}$ | $R^{D1}$ |
| $L_{B1109}$ | $R^{D40}$ | $R^{D18}$ | $R^{D1}$ |
| $L_{B1110}$ | $R^{D40}$ | $R^{D19}$ | $R^{D1}$ |
| $L_{B1111}$ | $R^{D40}$ | $R^{D20}$ | $R^{D1}$ |
| $L_{B1112}$ | $R^{D40}$ | $R^{D21}$ | $R^{D1}$ |
| $L_{B1113}$ | $R^{D40}$ | $R^{D23}$ | $R^{D1}$ |
| $L_{B1114}$ | $R^{D40}$ | $R^{D24}$ | $R^{D1}$ |
| $L_{B1115}$ | $R^{D40}$ | $R^{D25}$ | $R^{D1}$ |
| $L_{B1116}$ | $R^{D40}$ | $R^{D27}$ | $R^{D1}$ |
| $L_{B1117}$ | $R^{D40}$ | $R^{D28}$ | $R^{D1}$ |
| $L_{B1118}$ | $R^{D40}$ | $R^{D29}$ | $R^{D1}$ |
| $L_{B1119}$ | $R^{D40}$ | $R^{D30}$ | $R^{D1}$ |
| $L_{B1120}$ | $R^{D40}$ | $R^{D31}$ | $R^{D1}$ |
| $L_{B1121}$ | $R^{D40}$ | $R^{D32}$ | $R^{D1}$ |
| $L_{B1122}$ | $R^{D40}$ | $R^{D33}$ | $R^{D1}$ |
| $L_{B1123}$ | $R^{D40}$ | $R^{D34}$ | $R^{D1}$ |
| $L_{B1124}$ | $R^{D40}$ | $R^{D41}$ | $R^{D1}$ |
| $L_{B1125}$ | $R^{D40}$ | $R^{D42}$ | $R^{D1}$ |
| $L_{B1126}$ | $R^{D40}$ | $R^{D64}$ | $R^{D1}$ |
| $L_{B1127}$ | $R^{D40}$ | $R^{D66}$ | $R^{D1}$ |
| $L_{B1128}$ | $R^{D40}$ | $R^{D68}$ | $R^{D1}$ |
| $L_{B1129}$ | $R^{D40}$ | $R^{D76}$ | $R^{D1}$ |
| $L_{B1130}$ | $R^{D41}$ | $R^{D5}$ | $R^{D1}$ |
| $L_{B1131}$ | $R^{D41}$ | $R^{D6}$ | $R^{D1}$ |
| $L_{B1132}$ | $R^{D41}$ | $R^{D9}$ | $R^{D1}$ |
| $L_{B1133}$ | $R^{D41}$ | $R^{D10}$ | $R^{D1}$ |
| $L_{B1134}$ | $R^{D41}$ | $R^{D12}$ | $R^{D1}$ |
| $L_{B1135}$ | $R^{D41}$ | $R^{D15}$ | $R^{D1}$ |
| $L_{B1136}$ | $R^{D41}$ | $R^{D16}$ | $R^{D1}$ |
| $L_{B1137}$ | $R^{D41}$ | $R^{D17}$ | $R^{D1}$ |
| $L_{B1138}$ | $R^{D41}$ | $R^{D18}$ | $R^{D1}$ |
| $L_{B1139}$ | $R^{D41}$ | $R^{D19}$ | $R^{D1}$ |
| $L_{B1140}$ | $R^{D41}$ | $R^{D20}$ | $R^{D1}$ |
| $L_{B1141}$ | $R^{D41}$ | $R^{D21}$ | $R^{D1}$ |
| $L_{B1142}$ | $R^{D41}$ | $R^{D23}$ | $R^{D1}$ |
| $L_{B1143}$ | $R^{D41}$ | $R^{D24}$ | $R^{D1}$ |
| $L_{B1144}$ | $R^{D41}$ | $R^{D25}$ | $R^{D1}$ |
| $L_{B1145}$ | $R^{D41}$ | $R^{D27}$ | $R^{D1}$ |
| $L_{B1146}$ | $R^{D41}$ | $R^{D28}$ | $R^{D1}$ |
| $L_{B1147}$ | $R^{D41}$ | $R^{D29}$ | $R^{D1}$ |
| $L_{B1148}$ | $R^{D41}$ | $R^{D30}$ | $R^{D1}$ |
| $L_{B1149}$ | $R^{D41}$ | $R^{D31}$ | $R^{D1}$ |
| $L_{B1150}$ | $R^{D41}$ | $R^{D32}$ | $R^{D1}$ |
| $L_{B1151}$ | $R^{D41}$ | $R^{D33}$ | $R^{D1}$ |
| $L_{B1152}$ | $R^{D41}$ | $R^{D34}$ | $R^{D1}$ |
| $L_{B1153}$ | $R^{D41}$ | $R^{D42}$ | $R^{D1}$ |
| $L_{B1154}$ | $R^{D41}$ | $R^{D64}$ | $R^{D1}$ |
| $L_{B1155}$ | $R^{D41}$ | $R^{D66}$ | $R^{D1}$ |
| $L_{B1156}$ | $R^{D41}$ | $R^{D68}$ | $R^{D1}$ |
| $L_{B1157}$ | $R^{D41}$ | $R^{D76}$ | $R^{D1}$ |
| $L_{B1158}$ | $R^{D64}$ | $R^{D5}$ | $R^{D1}$ |
| $L_{B1159}$ | $R^{D64}$ | $R^{D6}$ | $R^{D1}$ |
| $L_{B1160}$ | $R^{D64}$ | $R^{D9}$ | $R^{D1}$ |
| $L_{B1161}$ | $R^{D64}$ | $R^{D10}$ | $R^{D1}$ |
| $L_{B1162}$ | $R^{D64}$ | $R^{D12}$ | $R^{D1}$ |
| $L_{B1163}$ | $R^{D64}$ | $R^{D15}$ | $R^{D1}$ |
| $L_{B1164}$ | $R^{D64}$ | $R^{D16}$ | $R^{D1}$ |
| $L_{B1165}$ | $R^{D64}$ | $R^{D17}$ | $R^{D1}$ |
| $L_{B1166}$ | $R^{D64}$ | $R^{D18}$ | $R^{D1}$ |
| $L_{B1167}$ | $R^{D64}$ | $R^{D19}$ | $R^{D1}$ |
| $L_{B1168}$ | $R^{D64}$ | $R^{D20}$ | $R^{D1}$ |
| $L_{B1169}$ | $R^{D64}$ | $R^{D21}$ | $R^{D1}$ |
| $L_{B1170}$ | $R^{D64}$ | $R^{D23}$ | $R^{D1}$ |
| $L_{B1171}$ | $R^{D64}$ | $R^{D24}$ | $R^{D1}$ |
| $L_{B1172}$ | $R^{D64}$ | $R^{D25}$ | $R^{D1}$ |
| $L_{B1173}$ | $R^{D64}$ | $R^{D27}$ | $R^{D1}$ |

-continued

| Ligand | $R^1$ | $R^2$ | $R^3$ |
|---|---|---|---|
| $L_{B1174}$ | $R^{D64}$ | $R^{D28}$ | $R^{D1}$ |
| $L_{B1175}$ | $R^{D64}$ | $R^{D29}$ | $R^{D1}$ |
| $L_{B1176}$ | $R^{D64}$ | $R^{D30}$ | $R^{D1}$ |
| $L_{B1177}$ | $R^{D64}$ | $R^{D31}$ | $R^{D1}$ |
| $L_{B1178}$ | $R^{D64}$ | $R^{D32}$ | $R^{D1}$ |
| $L_{B1179}$ | $R^{D64}$ | $R^{D33}$ | $R^{D1}$ |
| $L_{B1180}$ | $R^{D64}$ | $R^{D34}$ | $R^{D1}$ |
| $L_{B1181}$ | $R^{D64}$ | $R^{D42}$ | $R^{D1}$ |
| $L_{B1182}$ | $R^{D64}$ | $R^{D64}$ | $R^{D1}$ |
| $L_{B1183}$ | $R^{D64}$ | $R^{D66}$ | $R^{D1}$ |
| $L_{B1184}$ | $R^{D64}$ | $R^{D68}$ | $R^{D1}$ |
| $L_{B1185}$ | $R^{D64}$ | $R^{D76}$ | $R^{D1}$ |
| $L_{B1186}$ | $R^{D66}$ | $R^{D5}$ | $R^{D1}$ |
| $L_{B1187}$ | $R^{D66}$ | $R^{D6}$ | $R^{D1}$ |
| $L_{B1188}$ | $R^{D66}$ | $R^{D9}$ | $R^{D1}$ |
| $L_{B1189}$ | $R^{D66}$ | $R^{D10}$ | $R^{D1}$ |
| $L_{B1190}$ | $R^{D66}$ | $R^{D12}$ | $R^{D1}$ |
| $L_{B1191}$ | $R^{D66}$ | $R^{D15}$ | $R^{D1}$ |
| $L_{B1192}$ | $R^{D66}$ | $R^{D16}$ | $R^{D1}$ |
| $L_{B1193}$ | $R^{D66}$ | $R^{D17}$ | $R^{D1}$ |
| $L_{B1194}$ | $R^{D66}$ | $R^{D18}$ | $R^{D1}$ |
| $L_{B1195}$ | $R^{D66}$ | $R^{D19}$ | $R^{D1}$ |
| $L_{B1196}$ | $R^{D66}$ | $R^{D20}$ | $R^{D1}$ |
| $L_{B1197}$ | $R^{D66}$ | $R^{D21}$ | $R^{D1}$ |
| $L_{B1198}$ | $R^{D66}$ | $R^{D23}$ | $R^{D1}$ |
| $L_{B1199}$ | $R^{D66}$ | $R^{D24}$ | $R^{D1}$ |
| $L_{B1200}$ | $R^{D66}$ | $R^{D25}$ | $R^{D1}$ |
| $L_{B1201}$ | $R^{D66}$ | $R^{D27}$ | $R^{D1}$ |
| $L_{B1202}$ | $R^{D66}$ | $R^{D28}$ | $R^{D1}$ |
| $L_{B1203}$ | $R^{D66}$ | $R^{D29}$ | $R^{D1}$ |
| $L_{B1204}$ | $R^{D66}$ | $R^{D30}$ | $R^{D1}$ |
| $L_{B1205}$ | $R^{D66}$ | $R^{D31}$ | $R^{D1}$ |
| $L_{B1206}$ | $R^{D66}$ | $R^{D32}$ | $R^{D1}$ |
| $L_{B1207}$ | $R^{D66}$ | $R^{D33}$ | $R^{D1}$ |
| $L_{B1208}$ | $R^{D66}$ | $R^{D34}$ | $R^{D1}$ |
| $L_{B1209}$ | $R^{D66}$ | $R^{D42}$ | $R^{D1}$ |
| $L_{B1210}$ | $R^{D66}$ | $R^{D68}$ | $R^{D1}$ |
| $L_{B1211}$ | $R^{D66}$ | $R^{D76}$ | $R^{D1}$ |
| $L_{B1212}$ | $R^{D68}$ | $R^{D5}$ | $R^{D1}$ |
| $L_{B1213}$ | $R^{D68}$ | $R^{D6}$ | $R^{D1}$ |
| $L_{B1214}$ | $R^{D68}$ | $R^{D9}$ | $R^{D1}$ |
| $L_{B1215}$ | $R^{D68}$ | $R^{D10}$ | $R^{D1}$ |
| $L_{B1216}$ | $R^{D68}$ | $R^{D12}$ | $R^{D1}$ |
| $L_{B1217}$ | $R^{D68}$ | $R^{D15}$ | $R^{D1}$ |
| $L_{B1218}$ | $R^{D68}$ | $R^{D16}$ | $R^{D1}$ |
| $L_{B1219}$ | $R^{D68}$ | $R^{D17}$ | $R^{D1}$ |
| $L_{B1220}$ | $R^{D68}$ | $R^{D18}$ | $R^{D1}$ |
| $L_{B1221}$ | $R^{D68}$ | $R^{D19}$ | $R^{D1}$ |
| $L_{B1222}$ | $R^{D68}$ | $R^{D20}$ | $R^{D1}$ |
| $L_{B1223}$ | $R^{D68}$ | $R^{D21}$ | $R^{D1}$ |
| $L_{B1224}$ | $R^{D68}$ | $R^{D23}$ | $R^{D1}$ |
| $L_{B1225}$ | $R^{D68}$ | $R^{D24}$ | $R^{D1}$ |
| $L_{B1226}$ | $R^{D68}$ | $R^{D25}$ | $R^{D1}$ |
| $L_{B1227}$ | $R^{D68}$ | $R^{D27}$ | $R^{D1}$ |
| $L_{B1228}$ | $R^{D68}$ | $R^{D28}$ | $R^{D1}$ |
| $L_{B1229}$ | $R^{D68}$ | $R^{D29}$ | $R^{D1}$ |
| $L_{B1230}$ | $R^{D68}$ | $R^{D30}$ | $R^{D1}$ |
| $L_{B1231}$ | $R^{D68}$ | $R^{D31}$ | $R^{D1}$ |
| $L_{B1232}$ | $R^{D68}$ | $R^{D32}$ | $R^{D1}$ |
| $L_{B1233}$ | $R^{D68}$ | $R^{D33}$ | $R^{D1}$ |
| $L_{B1234}$ | $R^{D68}$ | $R^{D34}$ | $R^{D1}$ |
| $L_{B1235}$ | $R^{D68}$ | $R^{D42}$ | $R^{D1}$ |
| $L_{B1236}$ | $R^{D68}$ | $R^{D76}$ | $R^{D1}$ |
| $L_{B1237}$ | $R^{D76}$ | $R^{D5}$ | $R^{D1}$ |
| $L_{B1238}$ | $R^{D76}$ | $R^{D6}$ | $R^{D1}$ |
| $L_{B1239}$ | $R^{D76}$ | $R^{D9}$ | $R^{D1}$ |
| $L_{B1240}$ | $R^{D76}$ | $R^{D10}$ | $R^{D1}$ |
| $L_{B1241}$ | $R^{D76}$ | $R^{D12}$ | $R^{D1}$ |
| $L_{B1242}$ | $R^{D76}$ | $R^{D15}$ | $R^{D1}$ |
| $L_{B1243}$ | $R^{D76}$ | $R^{D16}$ | $R^{D1}$ |
| $L_{B1244}$ | $R^{D76}$ | $R^{D17}$ | $R^{D1}$ |
| $L_{B1245}$ | $R^{D76}$ | $R^{D18}$ | $R^{D1}$ |
| $L_{B1246}$ | $R^{D76}$ | $R^{D19}$ | $R^{D1}$ |
| $L_{B1247}$ | $R^{D76}$ | $R^{D20}$ | $R^{D1}$ |
| $L_{B1248}$ | $R^{D76}$ | $R^{D21}$ | $R^{D1}$ |
| $L_{B1249}$ | $R^{D76}$ | $R^{D23}$ | $R^{D1}$ |
| $L_{B1250}$ | $R^{D76}$ | $R^{D24}$ | $R^{D1}$ |

-continued

| Ligand | $R^1$ | $R^2$ | $R^3$ |
|---|---|---|---|
| $L_{B1251}$ | $R^{D76}$ | $R^{D25}$ | $R^{D1}$ |
| $L_{B1252}$ | $R^{D76}$ | $R^{D27}$ | $R^{D1}$ |
| $L_{B1253}$ | $R^{D76}$ | $R^{D28}$ | $R^{D1}$ |
| $L_{B1254}$ | $R^{D76}$ | $R^{D29}$ | $R^{D1}$ |
| $L_{B1255}$ | $R^{D76}$ | $R^{D30}$ | $R^{D1}$ |
| $L_{B1256}$ | $R^{D76}$ | $R^{D31}$ | $R^{D1}$ |
| $L_{B1257}$ | $R^{D76}$ | $R^{D32}$ | $R^{D1}$ |
| $L_{B1258}$ | $R^{D76}$ | $R^{D33}$ | $R^{D1}$ |
| $L_{B1259}$ | $R^{D76}$ | $R^{D34}$ | $R^{D1}$ |
| $L_{B1260}$ | $R^{D76}$ | $R^{D42}$ | $R^{D1}$ |

wherein $R^{D1}$ to $R^{D81}$ has the following structures:

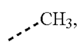

$R^{D1}$

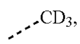

$R^{D2}$

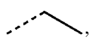
$R^{D3}$

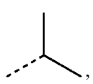
$R^{D4}$

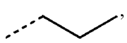
$R^{D5}$

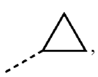
$R^{D6}$

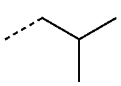
$R^{D7}$

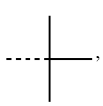
$R^{D8}$

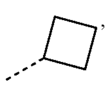
$R^{D9}$

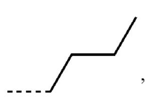
$R^{D10}$

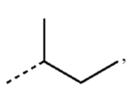
$R^{D11}$

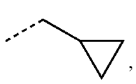
$R^{D12}$

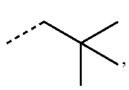
$R^{D13}$

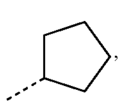
$R^{D14}$

-continued

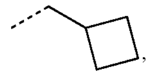
$R^{D15}$

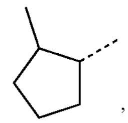
$R^{D16}$

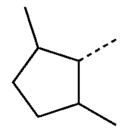
$R^{D17}$

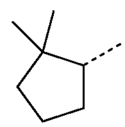
$R^{D18}$

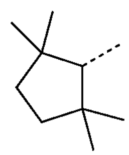
$R^{D19}$

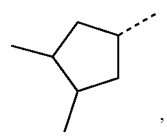
$R^{D20}$

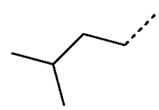
$R^{D21}$

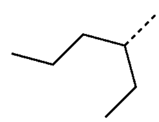
$R^{D22}$

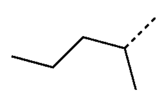
$R^{D23}$

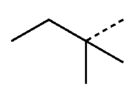
$R^{D24}$

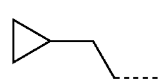
$R^{D25}$

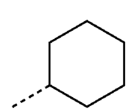
$R^{D26}$

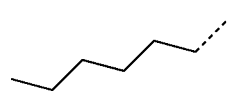
$R^{D27}$

-continued
$R^{D28}$
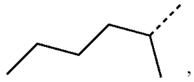
$R^{D29}$
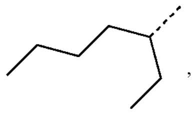
$R^{D30}$
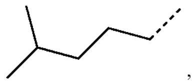
$R^{D31}$
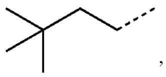
$R^{D32}$
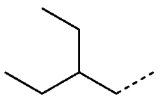
$R^{D33}$
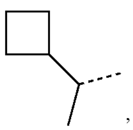
$R^{D34}$
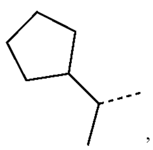
$R^{D35}$
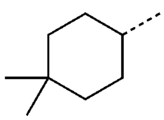
$R^{D36}$
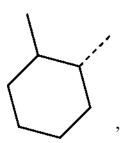
$R^{D37}$
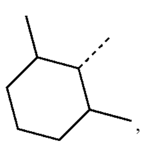
$R^{D38}$
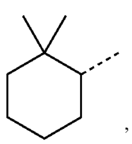
$R^{D39}$
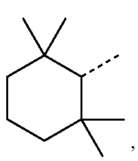
-continued
$R^{D40}$
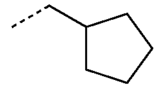
$R^{D41}$
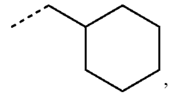
$R^{D42}$
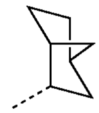
$R^{D43}$
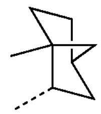
$R^{D44}$
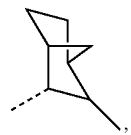
$R^{D45}$
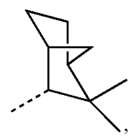
$R^{D46}$
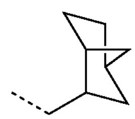
$R^{D47}$
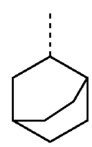
$R^{D48}$
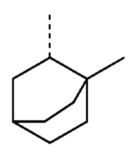
$R^{D49}$
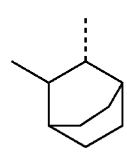
$R^{D50}$
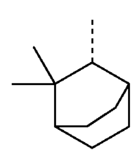

-continued
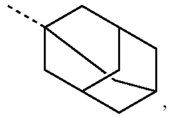
$R^{D51}$
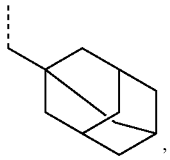
$R^{D52}$
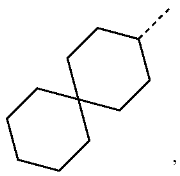
$R^{D53}$
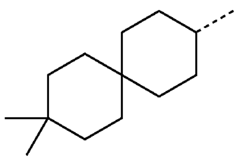
$R^{D54}$
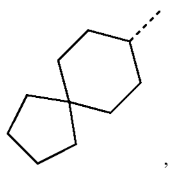
$R^{D55}$
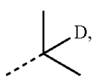
$R^{D56}$
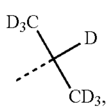
$R^{D57}$
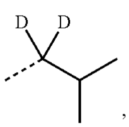
$R^{D58}$
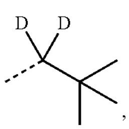
$R^{D59}$
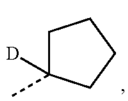
$R^{D60}$
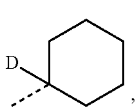
$R^{D61}$
-continued
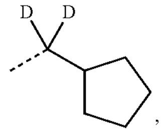
$R^{D62}$
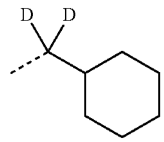
$R^{D63}$
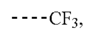
$R^{D64}$
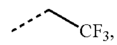
$R^{D65}$
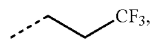
$R^{D66}$
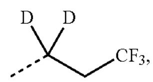
$R^{D67}$
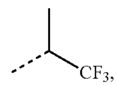
$R^{D68}$
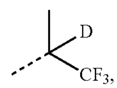
$R^{D69}$
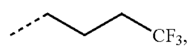
$R^{D70}$
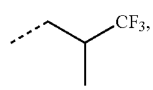
$R^{D71}$
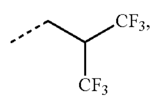
$R^{D72}$
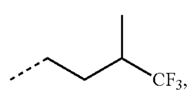
$R^{D73}$
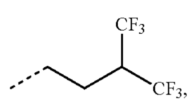
$R^{D74}$
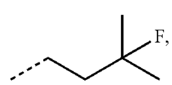
$R^{D75}$
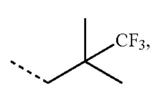
$R^{D76}$
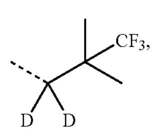
$R^{D77}$ -continued $R^{D78}$

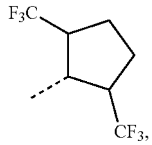

$R^{D79}$

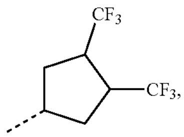

$R^{D80}$

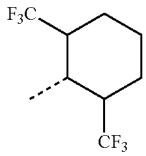

, and $R^{D81}$

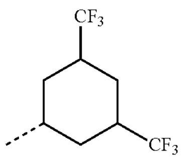

In some embodiments of the compound having the formula $Ir(L_A)_2(L_B)$ where $L_A$ is selected from $L_{A1}$ to $L_{A6756}$, the compound is selected from the group consisting of Compound 1 through Compound 8,512,560; where each Compound x has the formula $Ir(L_{Ak})_2(L_{Bj})$;

wherein x=6756j+k−6756, k is an integer from 1 to 6756, and j is an integer from 1 to 1260; and wherein $L_{B1}$ through $L_{B1260}$ are defined as follows:

$L_{B1}$ through $L_{B1260}$ are based on a structure of Formula XXVII,

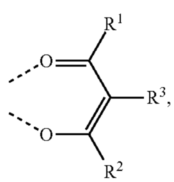

in which $R^1$, $R^2$, and $R^3$ are defined as:

| Ligand | $R^1$ | $R^2$ | $R^3$ |
|---|---|---|---|
| $L_{B1}$ | $R^{D1}$ | $R^{D1}$ | H |
| $L_{B2}$ | $R^{D2}$ | $R^{D2}$ | H |
| $L_{B3}$ | $R^{D3}$ | $R^{D3}$ | H |
| $L_{B4}$ | $R^{D4}$ | $R^{D4}$ | H |
| $L_{B5}$ | $R^{D5}$ | $R^{D5}$ | H |
| $L_{B6}$ | $R^{D6}$ | $R^{D6}$ | H |
| $L_{B7}$ | $R^{D7}$ | $R^{D7}$ | H |
| $L_{B8}$ | $R^{D8}$ | $R^{D8}$ | H |
| $L_{B9}$ | $R^{D9}$ | $R^{D9}$ | H |
| $L_{B10}$ | $R^{D10}$ | $R^{D10}$ | H |
| $L_{B11}$ | $R^{D11}$ | $R^{D11}$ | H |
| $L_{B12}$ | $R^{D12}$ | $R^{D12}$ | H |
| $L_{B13}$ | $R^{D13}$ | $R^{D13}$ | H |
| $L_{B14}$ | $R^{D14}$ | $R^{D14}$ | H |
| $L_{B15}$ | $R^{D15}$ | $R^{D15}$ | H |
| $L_{B16}$ | $R^{D16}$ | $R^{D16}$ | H |
| $L_{B17}$ | $R^{D17}$ | $R^{D17}$ | H |
| $L_{B18}$ | $R^{D18}$ | $R^{D18}$ | H |
| $L_{B19}$ | $R^{D19}$ | $R^{D19}$ | H |
| $L_{B20}$ | $R^{D20}$ | $R^{D20}$ | H |
| $L_{B21}$ | $R^{D21}$ | $R^{D21}$ | H |
| $L_{B22}$ | $R^{D22}$ | $R^{D22}$ | H |
| $L_{B23}$ | $R^{D23}$ | $R^{D23}$ | H |
| $L_{B24}$ | $R^{D24}$ | $R^{D24}$ | H |
| $L_{B25}$ | $R^{D25}$ | $R^{D25}$ | H |
| $L_{B26}$ | $R^{D26}$ | $R^{D26}$ | H |
| $L_{B27}$ | $R^{D27}$ | $R^{D27}$ | H |
| $L_{B28}$ | $R^{D28}$ | $R^{D28}$ | H |
| $L_{B29}$ | $R^{D29}$ | $R^{D29}$ | H |
| $L_{B30}$ | $R^{D30}$ | $R^{D30}$ | H |
| $L_{B31}$ | $R^{D31}$ | $R^{D31}$ | H |
| $L_{B32}$ | $R^{D32}$ | $R^{D32}$ | H |
| $L_{B33}$ | $R^{D33}$ | $R^{D33}$ | H |
| $L_{B34}$ | $R^{D34}$ | $R^{D34}$ | H |
| $L_{B35}$ | $R^{D35}$ | $R^{D35}$ | H |
| $L_{B36}$ | $R^{D40}$ | $R^{D40}$ | H |
| $L_{B37}$ | $R^{D41}$ | $R^{D41}$ | H |
| $L_{B38}$ | $R^{D42}$ | $R^{D42}$ | H |
| $L_{B39}$ | $R^{D64}$ | $R^{D64}$ | H |
| $L_{B40}$ | $R^{D66}$ | $R^{D66}$ | H |
| $L_{B41}$ | $R^{D68}$ | $R^{D68}$ | H |
| $L_{B42}$ | $R^{D76}$ | $R^{D76}$ | H |
| $L_{B43}$ | $R^{D1}$ | $R^{D2}$ | H |
| $L_{B44}$ | $R^{D1}$ | $R^{D3}$ | H |
| $L_{B45}$ | $R^{D1}$ | $R^{D4}$ | H |
| $L_{B46}$ | $R^{D1}$ | $R^{D5}$ | H |
| $L_{B47}$ | $R^{D1}$ | $R^{D6}$ | H |
| $L_{B48}$ | $R^{D1}$ | $R^{D7}$ | H |
| $L_{B49}$ | $R^{D1}$ | $R^{D8}$ | H |
| $L_{B50}$ | $R^{D1}$ | $R^{D9}$ | H |
| $L_{B51}$ | $R^{D1}$ | $R^{D10}$ | H |
| $L_{B52}$ | $R^{D1}$ | $R^{D11}$ | H |
| $L_{B53}$ | $R^{D1}$ | $R^{D12}$ | H |
| $L_{B54}$ | $R^{D1}$ | $R^{D13}$ | H |
| $L_{B55}$ | $R^{D1}$ | $R^{D14}$ | H |
| $L_{B56}$ | $R^{D1}$ | $R^{D15}$ | H |
| $L_{B57}$ | $R^{D1}$ | $R^{D16}$ | H |
| $L_{B58}$ | $R^{D1}$ | $R^{D17}$ | H |
| $L_{B59}$ | $R^{D1}$ | $R^{D18}$ | H |
| $L_{B60}$ | $R^{D1}$ | $R^{D19}$ | H |
| $L_{B61}$ | $R^{D1}$ | $R^{D20}$ | H |
| $L_{B62}$ | $R^{D1}$ | $R^{D21}$ | H |
| $L_{B63}$ | $R^{D1}$ | $R^{D22}$ | H |
| $L_{B64}$ | $R^{D1}$ | $R^{D23}$ | H |
| $L_{B65}$ | $R^{D1}$ | $R^{D24}$ | H |
| $L_{B66}$ | $R^{D1}$ | $R^{D25}$ | H |
| $L_{B67}$ | $R^{D1}$ | $R^{D26}$ | H |
| $L_{B68}$ | $R^{D1}$ | $R^{D27}$ | H |
| $L_{B69}$ | $R^{D1}$ | $R^{D28}$ | H |
| $L_{B70}$ | $R^{D1}$ | $R^{D29}$ | H |
| $L_{B71}$ | $R^{D1}$ | $R^{D30}$ | H |
| $L_{B72}$ | $R^{D1}$ | $R^{D31}$ | H |
| $L_{B73}$ | $R^{D1}$ | $R^{D32}$ | H |
| $L_{B74}$ | $R^{D1}$ | $R^{D33}$ | H |
| $L_{B75}$ | $R^{D1}$ | $R^{D34}$ | H |
| $L_{B76}$ | $R^{D1}$ | $R^{D35}$ | H |
| $L_{B77}$ | $R^{D1}$ | $R^{D40}$ | H |
| $L_{B78}$ | $R^{D1}$ | $R^{D41}$ | H |
| $L_{B79}$ | $R^{D1}$ | $R^{D42}$ | H |
| $L_{B80}$ | $R^{D1}$ | $R^{D64}$ | H |
| $L_{B81}$ | $R^{D1}$ | $R^{D66}$ | H |
| $L_{B82}$ | $R^{D1}$ | $R^{D68}$ | H |
| $L_{B83}$ | $R^{D1}$ | $R^{D76}$ | H |
| $L_{B84}$ | $R^{D2}$ | $R^{D1}$ | H |
| $L_{B85}$ | $R^{D2}$ | $R^{D3}$ | H |
| $L_{B86}$ | $R^{D2}$ | $R^{D4}$ | H |
| $L_{B87}$ | $R^{D2}$ | $R^{D5}$ | H |
| $L_{B88}$ | $R^{D2}$ | $R^{D6}$ | H |
| $L_{B89}$ | $R^{D2}$ | $R^{D7}$ | H |
| $L_{B90}$ | $R^{D2}$ | $R^{D8}$ | H |
| $L_{B91}$ | $R^{D2}$ | $R^{D9}$ | H |
| $L_{B92}$ | $R^{D2}$ | $R^{D10}$ | H |
| $L_{B93}$ | $R^{D2}$ | $R^{D11}$ | H |

-continued

| Ligand | $R^1$ | $R^2$ | $R^3$ |
| --- | --- | --- | --- |
| $L_{B94}$ | $R^{D2}$ | $R^{D12}$ | H |
| $L_{B95}$ | $R^{D2}$ | $R^{D13}$ | H |
| $L_{B96}$ | $R^{D2}$ | $R^{D14}$ | H |
| $L_{B97}$ | $R^{D2}$ | $R^{D15}$ | H |
| $L_{B98}$ | $R^{D2}$ | $R^{D16}$ | H |
| $L_{B99}$ | $R^{D2}$ | $R^{D17}$ | H |
| $L_{B100}$ | $R^{D2}$ | $R^{D18}$ | H |
| $L_{B101}$ | $R^{D2}$ | $R^{D19}$ | H |
| $L_{B102}$ | $R^{D2}$ | $R^{D20}$ | H |
| $L_{B103}$ | $R^{D2}$ | $R^{D21}$ | H |
| $L_{B104}$ | $R^{D2}$ | $R^{D22}$ | H |
| $L_{B105}$ | $R^{D2}$ | $R^{D23}$ | H |
| $L_{B106}$ | $R^{D2}$ | $R^{D24}$ | H |
| $L_{B107}$ | $R^{D2}$ | $R^{D25}$ | H |
| $L_{B108}$ | $R^{D2}$ | $R^{D26}$ | H |
| $L_{B109}$ | $R^{D2}$ | $R^{D27}$ | H |
| $L_{B110}$ | $R^{D2}$ | $R^{D28}$ | H |
| $L_{B111}$ | $R^{D2}$ | $R^{D29}$ | H |
| $L_{B112}$ | $R^{D2}$ | $R^{D30}$ | H |
| $L_{B113}$ | $R^{D2}$ | $R^{D31}$ | H |
| $L_{B114}$ | $R^{D2}$ | $R^{D32}$ | H |
| $L_{B115}$ | $R^{D2}$ | $R^{D33}$ | H |
| $L_{B116}$ | $R^{D2}$ | $R^{D34}$ | H |
| $L_{B117}$ | $R^{D2}$ | $R^{D35}$ | H |
| $L_{B118}$ | $R^{D2}$ | $R^{D40}$ | H |
| $L_{B119}$ | $R^{D2}$ | $R^{D41}$ | H |
| $L_{B120}$ | $R^{D2}$ | $R^{D42}$ | H |
| $L_{B121}$ | $R^{D2}$ | $R^{D64}$ | H |
| $L_{B122}$ | $R^{D2}$ | $R^{D66}$ | H |
| $L_{B123}$ | $R^{D2}$ | $R^{D68}$ | H |
| $L_{B124}$ | $R^{D2}$ | $R^{D76}$ | H |
| $L_{B125}$ | $R^{D3}$ | $R^{D4}$ | H |
| $L_{B126}$ | $R^{D3}$ | $R^{D5}$ | H |
| $L_{B127}$ | $R^{D3}$ | $R^{D6}$ | H |
| $L_{B128}$ | $R^{D3}$ | $R^{D7}$ | H |
| $L_{B129}$ | $R^{D3}$ | $R^{D8}$ | H |
| $L_{B130}$ | $R^{D3}$ | $R^{D9}$ | H |
| $L_{B131}$ | $R^{D3}$ | $R^{D10}$ | H |
| $L_{B132}$ | $R^{D3}$ | $R^{D11}$ | H |
| $L_{B133}$ | $R^{D3}$ | $R^{D12}$ | H |
| $L_{B134}$ | $R^{D3}$ | $R^{D13}$ | H |
| $L_{B135}$ | $R^{D3}$ | $R^{D14}$ | H |
| $L_{B136}$ | $R^{D3}$ | $R^{D15}$ | H |
| $L_{B137}$ | $R^{D3}$ | $R^{D16}$ | H |
| $L_{B138}$ | $R^{D3}$ | $R^{D17}$ | H |
| $L_{B139}$ | $R^{D3}$ | $R^{D18}$ | H |
| $L_{B140}$ | $R^{D3}$ | $R^{D19}$ | H |
| $L_{B141}$ | $R^{D3}$ | $R^{D20}$ | H |
| $L_{B142}$ | $R^{D3}$ | $R^{D21}$ | H |
| $L_{B143}$ | $R^{D3}$ | $R^{D22}$ | H |
| $L_{B144}$ | $R^{D3}$ | $R^{D23}$ | H |
| $L_{B145}$ | $R^{D3}$ | $R^{D24}$ | H |
| $L_{B146}$ | $R^{D3}$ | $R^{D25}$ | H |
| $L_{B147}$ | $R^{D3}$ | $R^{D26}$ | H |
| $L_{B148}$ | $R^{D3}$ | $R^{D27}$ | H |
| $L_{B149}$ | $R^{D3}$ | $R^{D28}$ | H |
| $L_{B150}$ | $R^{D3}$ | $R^{D29}$ | H |
| $L_{B151}$ | $R^{D3}$ | $R^{D30}$ | H |
| $L_{B152}$ | $R^{D3}$ | $R^{D31}$ | H |
| $L_{B153}$ | $R^{D3}$ | $R^{D32}$ | H |
| $L_{B154}$ | $R^{D3}$ | $R^{D33}$ | H |
| $L_{B155}$ | $R^{D3}$ | $R^{D34}$ | H |
| $L_{B156}$ | $R^{D3}$ | $R^{D35}$ | H |
| $L_{B157}$ | $R^{D3}$ | $R^{D40}$ | H |
| $L_{B158}$ | $R^{D3}$ | $R^{D41}$ | H |
| $L_{B159}$ | $R^{D3}$ | $R^{D42}$ | H |
| $L_{B160}$ | $R^{D3}$ | $R^{D64}$ | H |
| $L_{B161}$ | $R^{D3}$ | $R^{D66}$ | H |
| $L_{B162}$ | $R^{D3}$ | $R^{D68}$ | H |
| $L_{B163}$ | $R^{D3}$ | $R^{D76}$ | H |
| $L_{B164}$ | $R^{D4}$ | $R^{D5}$ | H |
| $L_{B165}$ | $R^{D4}$ | $R^{D6}$ | H |
| $L_{B166}$ | $R^{D4}$ | $R^{D7}$ | H |
| $L_{B167}$ | $R^{D4}$ | $R^{D8}$ | H |
| $L_{B168}$ | $R^{D4}$ | $R^{D9}$ | H |
| $L_{B169}$ | $R^{D4}$ | $R^{D10}$ | H |
| $L_{B170}$ | $R^{D4}$ | $R^{D11}$ | H |

-continued

| Ligand | $R^1$ | $R^2$ | $R^3$ |
| --- | --- | --- | --- |
| $L_{B171}$ | $R^{D4}$ | $R^{D12}$ | H |
| $L_{B172}$ | $R^{D4}$ | $R^{D13}$ | H |
| $L_{B173}$ | $R^{D4}$ | $R^{D14}$ | H |
| $L_{B174}$ | $R^{D4}$ | $R^{D15}$ | H |
| $L_{B175}$ | $R^{D4}$ | $R^{D16}$ | H |
| $L_{B176}$ | $R^{D4}$ | $R^{D17}$ | H |
| $L_{B177}$ | $R^{D4}$ | $R^{D18}$ | H |
| $L_{B178}$ | $R^{D4}$ | $R^{D19}$ | H |
| $L_{B179}$ | $R^{D4}$ | $R^{D20}$ | H |
| $L_{B180}$ | $R^{D4}$ | $R^{D21}$ | H |
| $L_{B181}$ | $R^{D4}$ | $R^{D22}$ | H |
| $L_{B182}$ | $R^{D4}$ | $R^{D23}$ | H |
| $L_{B183}$ | $R^{D4}$ | $R^{D24}$ | H |
| $L_{B184}$ | $R^{D4}$ | $R^{D25}$ | H |
| $L_{B185}$ | $R^{D4}$ | $R^{D26}$ | H |
| $L_{B186}$ | $R^{D4}$ | $R^{D27}$ | H |
| $L_{B187}$ | $R^{D4}$ | $R^{D28}$ | H |
| $L_{B188}$ | $R^{D4}$ | $R^{D29}$ | H |
| $L_{B189}$ | $R^{D4}$ | $R^{D30}$ | H |
| $L_{B190}$ | $R^{D4}$ | $R^{D31}$ | H |
| $L_{B191}$ | $R^{D4}$ | $R^{D32}$ | H |
| $L_{B192}$ | $R^{D4}$ | $R^{D33}$ | H |
| $L_{B193}$ | $R^{D4}$ | $R^{D34}$ | H |
| $L_{B194}$ | $R^{D4}$ | $R^{D35}$ | H |
| $L_{B195}$ | $R^{D4}$ | $R^{D40}$ | H |
| $L_{B196}$ | $R^{D4}$ | $R^{D41}$ | H |
| $L_{B197}$ | $R^{D4}$ | $R^{D42}$ | H |
| $L_{B198}$ | $R^{D4}$ | $R^{D64}$ | H |
| $L_{B199}$ | $R^{D4}$ | $R^{D66}$ | H |
| $L_{B200}$ | $R^{D4}$ | $R^{D68}$ | H |
| $L_{B201}$ | $R^{D4}$ | $R^{D76}$ | H |
| $L_{B202}$ | $R^{D4}$ | $R^{D1}$ | H |
| $L_{B203}$ | $R^{D7}$ | $R^{D5}$ | H |
| $L_{B204}$ | $R^{D7}$ | $R^{D6}$ | H |
| $L_{B205}$ | $R^{D7}$ | $R^{D8}$ | H |
| $L_{B206}$ | $R^{D7}$ | $R^{D9}$ | H |
| $L_{B207}$ | $R^{D7}$ | $R^{D10}$ | H |
| $L_{B208}$ | $R^{D7}$ | $R^{D11}$ | H |
| $L_{B209}$ | $R^{D7}$ | $R^{D12}$ | H |
| $L_{B210}$ | $R^{D7}$ | $R^{D13}$ | H |
| $L_{B211}$ | $R^{D7}$ | $R^{D14}$ | H |
| $L_{B212}$ | $R^{D7}$ | $R^{D15}$ | H |
| $L_{B213}$ | $R^{D7}$ | $R^{D16}$ | H |
| $L_{B214}$ | $R^{D7}$ | $R^{D17}$ | H |
| $L_{B215}$ | $R^{D7}$ | $R^{D18}$ | H |
| $L_{B216}$ | $R^{D7}$ | $R^{D19}$ | H |
| $L_{B217}$ | $R^{D7}$ | $R^{D20}$ | H |
| $L_{B218}$ | $R^{D7}$ | $R^{D21}$ | H |
| $L_{B219}$ | $R^{D7}$ | $R^{D22}$ | H |
| $L_{B220}$ | $R^{D7}$ | $R^{D23}$ | H |
| $L_{B221}$ | $R^{D7}$ | $R^{D24}$ | H |
| $L_{B222}$ | $R^{D7}$ | $R^{D25}$ | H |
| $L_{B223}$ | $R^{D7}$ | $R^{D26}$ | H |
| $L_{B224}$ | $R^{D7}$ | $R^{D27}$ | H |
| $L_{B225}$ | $R^{D7}$ | $R^{D28}$ | H |
| $L_{B226}$ | $R^{D7}$ | $R^{D29}$ | H |
| $L_{B227}$ | $R^{D7}$ | $R^{D30}$ | H |
| $L_{B228}$ | $R^{D7}$ | $R^{D31}$ | H |
| $L_{B229}$ | $R^{D7}$ | $R^{D32}$ | H |
| $L_{B230}$ | $R^{D7}$ | $R^{D33}$ | H |
| $L_{B231}$ | $R^{D7}$ | $R^{D34}$ | H |
| $L_{B232}$ | $R^{D7}$ | $R^{D35}$ | H |
| $L_{B233}$ | $R^{D7}$ | $R^{D40}$ | H |
| $L_{B234}$ | $R^{D7}$ | $R^{D41}$ | H |
| $L_{B235}$ | $R^{D7}$ | $R^{D42}$ | H |
| $L_{B236}$ | $R^{D7}$ | $R^{D64}$ | H |
| $L_{B237}$ | $R^{D7}$ | $R^{D66}$ | H |
| $L_{B238}$ | $R^{D7}$ | $R^{D68}$ | H |
| $L_{B239}$ | $R^{D7}$ | $R^{D76}$ | H |
| $L_{B240}$ | $R^{D8}$ | $R^{D5}$ | H |
| $L_{B241}$ | $R^{D8}$ | $R^{D6}$ | H |
| $L_{B242}$ | $R^{D8}$ | $R^{D9}$ | H |
| $L_{B243}$ | $R^{D8}$ | $R^{D10}$ | H |
| $L_{B244}$ | $R^{D8}$ | $R^{D11}$ | H |
| $L_{B245}$ | $R^{D8}$ | $R^{D12}$ | H |
| $L_{B246}$ | $R^{D8}$ | $R^{D13}$ | H |
| $L_{B247}$ | $R^{D8}$ | $R^{D14}$ | H |

-continued

| Ligand | $R^1$ | $R^2$ | $R^3$ |
|---|---|---|---|
| $L_{B248}$ | $R^{D8}$ | $R^{D15}$ | H |
| $L_{B249}$ | $R^{D8}$ | $R^{D16}$ | H |
| $L_{B250}$ | $R^{D8}$ | $R^{D17}$ | H |
| $L_{B251}$ | $R^{D8}$ | $R^{D18}$ | H |
| $L_{B252}$ | $R^{D8}$ | $R^{D19}$ | H |
| $L_{B253}$ | $R^{D8}$ | $R^{D20}$ | H |
| $L_{B254}$ | $R^{D8}$ | $R^{D21}$ | H |
| $L_{B255}$ | $R^{D8}$ | $R^{D22}$ | H |
| $L_{B256}$ | $R^{D8}$ | $R^{D23}$ | H |
| $L_{B257}$ | $R^{D8}$ | $R^{D24}$ | H |
| $L_{B258}$ | $R^{D8}$ | $R^{D25}$ | H |
| $L_{B259}$ | $R^{D8}$ | $R^{D26}$ | H |
| $L_{B260}$ | $R^{D8}$ | $R^{D27}$ | H |
| $L_{B261}$ | $R^{D8}$ | $R^{D28}$ | H |
| $L_{B262}$ | $R^{D8}$ | $R^{D29}$ | H |
| $L_{B263}$ | $R^{D8}$ | $R^{D30}$ | H |
| $L_{B264}$ | $R^{D8}$ | $R^{D31}$ | H |
| $L_{B265}$ | $R^{D8}$ | $R^{D32}$ | H |
| $L_{B266}$ | $R^{D8}$ | $R^{D33}$ | H |
| $L_{B267}$ | $R^{D8}$ | $R^{D34}$ | H |
| $L_{B268}$ | $R^{D8}$ | $R^{D35}$ | H |
| $L_{B269}$ | $R^{D8}$ | $R^{D40}$ | H |
| $L_{B270}$ | $R^{D8}$ | $R^{D41}$ | H |
| $L_{B271}$ | $R^{D8}$ | $R^{D42}$ | H |
| $L_{B272}$ | $R^{D8}$ | $R^{D64}$ | H |
| $L_{B273}$ | $R^{D8}$ | $R^{D66}$ | H |
| $L_{B274}$ | $R^{D8}$ | $R^{D68}$ | H |
| $L_{B275}$ | $R^{D8}$ | $R^{D76}$ | H |
| $L_{B276}$ | $R^{D11}$ | $R^{D5}$ | H |
| $L_{B277}$ | $R^{D11}$ | $R^{D6}$ | H |
| $L_{B278}$ | $R^{D11}$ | $R^{D9}$ | H |
| $L_{B279}$ | $R^{D11}$ | $R^{D10}$ | H |
| $L_{B280}$ | $R^{D11}$ | $R^{D12}$ | H |
| $L_{B281}$ | $R^{D11}$ | $R^{D13}$ | H |
| $L_{B282}$ | $R^{D11}$ | $R^{D14}$ | H |
| $L_{B283}$ | $R^{D11}$ | $R^{D15}$ | H |
| $L_{B284}$ | $R^{D11}$ | $R^{D16}$ | H |
| $L_{B285}$ | $R^{D11}$ | $R^{D17}$ | H |
| $L_{B286}$ | $R^{D11}$ | $R^{D18}$ | H |
| $L_{B287}$ | $R^{D11}$ | $R^{D19}$ | H |
| $L_{B288}$ | $R^{D11}$ | $R^{D20}$ | H |
| $L_{B289}$ | $R^{D11}$ | $R^{D21}$ | H |
| $L_{B290}$ | $R^{D11}$ | $R^{D22}$ | H |
| $L_{B291}$ | $R^{D11}$ | $R^{D23}$ | H |
| $L_{B292}$ | $R^{D11}$ | $R^{D24}$ | H |
| $L_{B293}$ | $R^{D11}$ | $R^{D25}$ | H |
| $L_{B294}$ | $R^{D11}$ | $R^{D26}$ | H |
| $L_{B295}$ | $R^{D11}$ | $R^{D27}$ | H |
| $L_{B296}$ | $R^{D11}$ | $R^{D28}$ | H |
| $L_{B297}$ | $R^{D11}$ | $R^{D29}$ | H |
| $L_{B298}$ | $R^{D11}$ | $R^{D30}$ | H |
| $L_{B299}$ | $R^{D11}$ | $R^{D31}$ | H |
| $L_{B300}$ | $R^{D11}$ | $R^{D32}$ | H |
| $L_{B301}$ | $R^{D11}$ | $R^{D33}$ | H |
| $L_{B302}$ | $R^{D11}$ | $R^{D34}$ | H |
| $L_{B303}$ | $R^{D11}$ | $R^{D35}$ | H |
| $L_{B304}$ | $R^{D11}$ | $R^{D40}$ | H |
| $L_{B305}$ | $R^{D11}$ | $R^{D41}$ | H |
| $L_{B306}$ | $R^{D11}$ | $R^{D42}$ | H |
| $L_{B307}$ | $R^{D11}$ | $R^{D64}$ | H |
| $L_{B308}$ | $R^{D11}$ | $R^{D66}$ | H |
| $L_{B309}$ | $R^{D11}$ | $R^{D68}$ | H |
| $L_{B310}$ | $R^{D11}$ | $R^{D76}$ | H |
| $L_{B311}$ | $R^{D13}$ | $R^{D5}$ | H |
| $L_{B312}$ | $R^{D13}$ | $R^{D6}$ | H |
| $L_{B313}$ | $R^{D13}$ | $R^{D9}$ | H |
| $L_{B314}$ | $R^{D13}$ | $R^{D10}$ | H |
| $L_{B315}$ | $R^{D13}$ | $R^{D12}$ | H |
| $L_{B316}$ | $R^{D13}$ | $R^{D14}$ | H |
| $L_{B317}$ | $R^{D13}$ | $R^{D15}$ | H |
| $L_{B318}$ | $R^{D13}$ | $R^{D16}$ | H |
| $L_{B319}$ | $R^{D13}$ | $R^{D17}$ | H |
| $L_{B320}$ | $R^{D13}$ | $R^{D18}$ | H |
| $L_{B321}$ | $R^{D13}$ | $R^{D19}$ | H |
| $L_{B322}$ | $R^{D13}$ | $R^{D20}$ | H |
| $L_{B323}$ | $R^{D13}$ | $R^{D21}$ | H |
| $L_{B324}$ | $R^{D13}$ | $R^{D22}$ | H |

-continued

| Ligand | $R^1$ | $R^2$ | $R^3$ |
|---|---|---|---|
| $L_{B325}$ | $R^{D13}$ | $R^{D23}$ | H |
| $L_{B326}$ | $R^{D13}$ | $R^{D24}$ | H |
| $L_{B327}$ | $R^{D13}$ | $R^{D25}$ | H |
| $L_{B328}$ | $R^{D13}$ | $R^{D26}$ | H |
| $L_{B329}$ | $R^{D13}$ | $R^{D27}$ | H |
| $L_{B330}$ | $R^{D13}$ | $R^{D28}$ | H |
| $L_{B331}$ | $R^{D13}$ | $R^{D29}$ | H |
| $L_{B332}$ | $R^{D13}$ | $R^{D30}$ | H |
| $L_{B333}$ | $R^{D13}$ | $R^{D31}$ | H |
| $L_{B334}$ | $R^{D13}$ | $R^{D32}$ | H |
| $L_{B335}$ | $R^{D13}$ | $R^{D33}$ | H |
| $L_{B336}$ | $R^{D13}$ | $R^{D34}$ | H |
| $L_{B337}$ | $R^{D13}$ | $R^{D35}$ | H |
| $L_{B338}$ | $R^{D13}$ | $R^{D40}$ | H |
| $L_{B339}$ | $R^{D13}$ | $R^{D41}$ | H |
| $L_{B340}$ | $R^{D13}$ | $R^{D42}$ | H |
| $L_{B341}$ | $R^{D13}$ | $R^{D64}$ | H |
| $L_{B342}$ | $R^{D13}$ | $R^{D66}$ | H |
| $L_{B343}$ | $R^{D13}$ | $R^{D68}$ | H |
| $L_{B344}$ | $R^{D13}$ | $R^{D76}$ | H |
| $L_{B345}$ | $R^{D14}$ | $R^{D5}$ | H |
| $L_{B346}$ | $R^{D14}$ | $R^{D6}$ | H |
| $L_{B347}$ | $R^{D14}$ | $R^{D9}$ | H |
| $L_{B348}$ | $R^{D14}$ | $R^{D10}$ | H |
| $L_{B349}$ | $R^{D14}$ | $R^{D12}$ | H |
| $L_{B350}$ | $R^{D14}$ | $R^{D15}$ | H |
| $L_{B351}$ | $R^{D14}$ | $R^{D16}$ | H |
| $L_{B352}$ | $R^{D14}$ | $R^{D17}$ | H |
| $L_{B353}$ | $R^{D14}$ | $R^{D18}$ | H |
| $L_{B354}$ | $R^{D14}$ | $R^{D19}$ | H |
| $L_{B355}$ | $R^{D14}$ | $R^{D20}$ | H |
| $L_{B356}$ | $R^{D14}$ | $R^{D21}$ | H |
| $L_{B357}$ | $R^{D14}$ | $R^{D22}$ | H |
| $L_{B358}$ | $R^{D14}$ | $R^{D23}$ | H |
| $L_{B359}$ | $R^{D14}$ | $R^{D24}$ | H |
| $L_{B360}$ | $R^{D14}$ | $R^{D25}$ | H |
| $L_{B361}$ | $R^{D14}$ | $R^{D26}$ | H |
| $L_{B362}$ | $R^{D14}$ | $R^{D27}$ | H |
| $L_{B363}$ | $R^{D14}$ | $R^{D28}$ | H |
| $L_{B364}$ | $R^{D14}$ | $R^{D29}$ | H |
| $L_{B365}$ | $R^{D14}$ | $R^{D30}$ | H |
| $L_{B366}$ | $R^{D14}$ | $R^{D31}$ | H |
| $L_{B367}$ | $R^{D14}$ | $R^{D32}$ | H |
| $L_{B368}$ | $R^{D14}$ | $R^{D33}$ | H |
| $L_{B369}$ | $R^{D14}$ | $R^{D34}$ | H |
| $L_{B370}$ | $R^{D14}$ | $R^{D35}$ | H |
| $L_{B371}$ | $R^{D14}$ | $R^{D40}$ | H |
| $L_{B372}$ | $R^{D14}$ | $R^{D41}$ | H |
| $L_{B373}$ | $R^{D14}$ | $R^{D42}$ | H |
| $L_{B374}$ | $R^{D14}$ | $R^{D64}$ | H |
| $L_{B375}$ | $R^{D14}$ | $R^{D66}$ | H |
| $L_{B376}$ | $R^{D14}$ | $R^{D68}$ | H |
| $L_{B377}$ | $R^{D14}$ | $R^{D76}$ | H |
| $L_{B378}$ | $R^{D22}$ | $R^{D5}$ | H |
| $L_{B379}$ | $R^{D22}$ | $R^{D6}$ | H |
| $L_{B380}$ | $R^{D22}$ | $R^{D9}$ | H |
| $L_{B381}$ | $R^{D22}$ | $R^{D10}$ | H |
| $L_{B382}$ | $R^{D22}$ | $R^{D12}$ | H |
| $L_{B383}$ | $R^{D22}$ | $R^{D15}$ | H |
| $L_{B384}$ | $R^{D22}$ | $R^{D16}$ | H |
| $L_{B385}$ | $R^{D22}$ | $R^{D17}$ | H |
| $L_{B386}$ | $R^{D22}$ | $R^{D18}$ | H |
| $L_{B387}$ | $R^{D22}$ | $R^{D19}$ | H |
| $L_{B388}$ | $R^{D22}$ | $R^{D20}$ | H |
| $L_{B389}$ | $R^{D22}$ | $R^{D21}$ | H |
| $L_{B390}$ | $R^{D22}$ | $R^{D23}$ | H |
| $L_{B391}$ | $R^{D22}$ | $R^{D24}$ | H |
| $L_{B392}$ | $R^{D22}$ | $R^{D25}$ | H |
| $L_{B393}$ | $R^{D22}$ | $R^{D26}$ | H |
| $L_{B394}$ | $R^{D22}$ | $R^{D27}$ | H |
| $L_{B395}$ | $R^{D22}$ | $R^{D28}$ | H |
| $L_{B396}$ | $R^{D22}$ | $R^{D29}$ | H |
| $L_{B397}$ | $R^{D22}$ | $R^{D30}$ | H |
| $L_{B398}$ | $R^{D22}$ | $R^{D31}$ | H |
| $L_{B399}$ | $R^{D22}$ | $R^{D32}$ | H |
| $L_{B400}$ | $R^{D22}$ | $R^{D33}$ | H |
| $L_{B401}$ | $R^{D22}$ | $R^{D34}$ | H |

-continued

| Ligand | $R^1$ | $R^2$ | $R^3$ |
|---|---|---|---|
| $L_{B402}$ | $R^{D22}$ | $R^{D35}$ | H |
| $L_{B403}$ | $R^{D22}$ | $R^{D40}$ | H |
| $L_{B404}$ | $R^{D22}$ | $R^{D41}$ | H |
| $L_{B405}$ | $R^{D22}$ | $R^{D42}$ | H |
| $L_{B406}$ | $R^{D22}$ | $R^{D64}$ | H |
| $L_{B407}$ | $R^{D22}$ | $R^{D66}$ | H |
| $L_{B408}$ | $R^{D22}$ | $R^{D68}$ | H |
| $L_{B409}$ | $R^{D22}$ | $R^{D76}$ | H |
| $L_{B410}$ | $R^{D26}$ | $R^{D5}$ | H |
| $L_{B411}$ | $R^{D26}$ | $R^{D6}$ | H |
| $L_{B412}$ | $R^{D26}$ | $R^{D9}$ | H |
| $L_{B413}$ | $R^{D26}$ | $R^{D10}$ | H |
| $L_{B414}$ | $R^{D26}$ | $R^{D12}$ | H |
| $L_{B415}$ | $R^{D26}$ | $R^{D15}$ | H |
| $L_{B416}$ | $R^{D26}$ | $R^{D16}$ | H |
| $L_{B417}$ | $R^{D26}$ | $R^{D17}$ | H |
| $L_{B418}$ | $R^{D26}$ | $R^{D18}$ | H |
| $L_{B419}$ | $R^{D26}$ | $R^{D19}$ | H |
| $L_{B420}$ | $R^{D26}$ | $R^{D20}$ | H |
| $L_{B421}$ | $R^{D26}$ | $R^{D21}$ | H |
| $L_{B422}$ | $R^{D26}$ | $R^{D23}$ | H |
| $L_{B423}$ | $R^{D26}$ | $R^{D24}$ | H |
| $L_{B424}$ | $R^{D26}$ | $R^{D25}$ | H |
| $L_{B425}$ | $R^{D26}$ | $R^{D27}$ | H |
| $L_{B426}$ | $R^{D26}$ | $R^{D28}$ | H |
| $L_{B427}$ | $R^{D26}$ | $R^{D29}$ | H |
| $L_{B428}$ | $R^{D26}$ | $R^{D30}$ | H |
| $L_{B429}$ | $R^{D26}$ | $R^{D31}$ | H |
| $L_{B430}$ | $R^{D26}$ | $R^{D32}$ | H |
| $L_{B431}$ | $R^{D26}$ | $R^{D33}$ | H |
| $L_{B432}$ | $R^{D26}$ | $R^{D34}$ | H |
| $L_{B433}$ | $R^{D26}$ | $R^{D35}$ | H |
| $L_{B434}$ | $R^{D26}$ | $R^{D40}$ | H |
| $L_{B435}$ | $R^{D26}$ | $R^{D41}$ | H |
| $L_{B436}$ | $R^{D26}$ | $R^{D42}$ | H |
| $L_{B437}$ | $R^{D26}$ | $R^{D64}$ | H |
| $L_{B438}$ | $R^{D26}$ | $R^{D66}$ | H |
| $L_{B439}$ | $R^{D26}$ | $R^{D68}$ | H |
| $L_{B440}$ | $R^{D26}$ | $R^{D76}$ | H |
| $L_{B441}$ | $R^{D35}$ | $R^{D5}$ | H |
| $L_{B442}$ | $R^{D35}$ | $R^{D6}$ | H |
| $L_{B443}$ | $R^{D35}$ | $R^{D9}$ | H |
| $L_{B444}$ | $R^{D35}$ | $R^{D10}$ | H |
| $L_{B445}$ | $R^{D35}$ | $R^{D12}$ | H |
| $L_{B446}$ | $R^{D35}$ | $R^{D15}$ | H |
| $L_{B447}$ | $R^{D35}$ | $R^{D16}$ | H |
| $L_{B448}$ | $R^{D35}$ | $R^{D17}$ | H |
| $L_{B449}$ | $R^{D35}$ | $R^{D18}$ | H |
| $L_{B450}$ | $R^{D35}$ | $R^{D19}$ | H |
| $L_{B451}$ | $R^{D35}$ | $R^{D20}$ | H |
| $L_{B452}$ | $R^{D35}$ | $R^{D21}$ | H |
| $L_{B453}$ | $R^{D35}$ | $R^{D23}$ | H |
| $L_{B454}$ | $R^{D35}$ | $R^{D24}$ | H |
| $L_{B455}$ | $R^{D35}$ | $R^{D25}$ | H |
| $L_{B456}$ | $R^{D35}$ | $R^{D27}$ | H |
| $L_{B457}$ | $R^{D35}$ | $R^{D28}$ | H |
| $L_{B458}$ | $R^{D35}$ | $R^{D29}$ | H |
| $L_{B459}$ | $R^{D35}$ | $R^{D30}$ | H |
| $L_{B460}$ | $R^{D35}$ | $R^{D31}$ | H |
| $L_{B461}$ | $R^{D35}$ | $R^{D32}$ | H |
| $L_{B462}$ | $R^{D35}$ | $R^{D33}$ | H |
| $L_{B463}$ | $R^{D35}$ | $R^{D34}$ | H |
| $L_{B464}$ | $R^{D35}$ | $R^{D40}$ | H |
| $L_{B465}$ | $R^{D35}$ | $R^{D41}$ | H |
| $L_{B466}$ | $R^{D35}$ | $R^{D42}$ | H |
| $L_{B467}$ | $R^{D35}$ | $R^{D64}$ | H |
| $L_{B468}$ | $R^{D35}$ | $R^{D66}$ | H |
| $L_{B469}$ | $R^{D35}$ | $R^{D68}$ | H |
| $L_{B470}$ | $R^{D35}$ | $R^{D76}$ | H |
| $L_{B471}$ | $R^{D40}$ | $R^{D5}$ | H |
| $L_{B472}$ | $R^{D40}$ | $R^{D6}$ | H |
| $L_{B473}$ | $R^{D40}$ | $R^{D9}$ | H |
| $L_{B474}$ | $R^{D40}$ | $R^{D10}$ | H |
| $L_{B475}$ | $R^{D40}$ | $R^{D12}$ | H |
| $L_{B476}$ | $R^{D40}$ | $R^{D15}$ | H |
| $L_{B477}$ | $R^{D40}$ | $R^{D16}$ | H |
| $L_{B478}$ | $R^{D40}$ | $R^{D17}$ | H |

-continued

| Ligand | $R^1$ | $R^2$ | $R^3$ |
|---|---|---|---|
| $L_{B479}$ | $R^{D40}$ | $R^{D18}$ | H |
| $L_{B480}$ | $R^{D40}$ | $R^{D19}$ | H |
| $L_{B481}$ | $R^{D40}$ | $R^{D20}$ | H |
| $L_{B482}$ | $R^{D40}$ | $R^{D21}$ | H |
| $L_{B483}$ | $R^{D40}$ | $R^{D23}$ | H |
| $L_{B484}$ | $R^{D40}$ | $R^{D24}$ | H |
| $L_{B485}$ | $R^{D40}$ | $R^{D25}$ | H |
| $L_{B486}$ | $R^{D40}$ | $R^{D27}$ | H |
| $L_{B487}$ | $R^{D40}$ | $R^{D28}$ | H |
| $L_{B488}$ | $R^{D40}$ | $R^{D29}$ | H |
| $L_{B489}$ | $R^{D40}$ | $R^{D30}$ | H |
| $L_{B490}$ | $R^{D40}$ | $R^{D31}$ | H |
| $L_{B491}$ | $R^{D40}$ | $R^{D32}$ | H |
| $L_{B492}$ | $R^{D40}$ | $R^{D33}$ | H |
| $L_{B493}$ | $R^{D40}$ | $R^{D34}$ | H |
| $L_{B494}$ | $R^{D40}$ | $R^{D41}$ | H |
| $L_{B495}$ | $R^{D40}$ | $R^{D42}$ | H |
| $L_{B496}$ | $R^{D40}$ | $R^{D64}$ | H |
| $L_{B497}$ | $R^{D40}$ | $R^{D66}$ | H |
| $L_{B498}$ | $R^{D40}$ | $R^{D68}$ | H |
| $L_{B499}$ | $R^{D40}$ | $R^{D76}$ | H |
| $L_{B500}$ | $R^{D41}$ | $R^{D5}$ | H |
| $L_{B501}$ | $R^{D41}$ | $R^{D6}$ | H |
| $L_{B502}$ | $R^{D41}$ | $R^{D9}$ | H |
| $L_{B503}$ | $R^{D41}$ | $R^{D10}$ | H |
| $L_{B504}$ | $R^{D41}$ | $R^{D12}$ | H |
| $L_{B505}$ | $R^{D41}$ | $R^{D15}$ | H |
| $L_{B506}$ | $R^{D41}$ | $R^{D16}$ | H |
| $L_{B507}$ | $R^{D41}$ | $R^{D17}$ | H |
| $L_{B508}$ | $R^{D41}$ | $R^{D18}$ | H |
| $L_{B509}$ | $R^{D41}$ | $R^{D19}$ | H |
| $L_{B510}$ | $R^{D41}$ | $R^{D20}$ | H |
| $L_{B511}$ | $R^{D41}$ | $R^{D21}$ | H |
| $L_{B512}$ | $R^{D41}$ | $R^{D23}$ | H |
| $L_{B513}$ | $R^{D41}$ | $R^{D24}$ | H |
| $L_{B514}$ | $R^{D41}$ | $R^{D25}$ | H |
| $L_{B515}$ | $R^{D41}$ | $R^{D27}$ | H |
| $L_{B516}$ | $R^{D41}$ | $R^{D28}$ | H |
| $L_{B517}$ | $R^{D41}$ | $R^{D29}$ | H |
| $L_{B518}$ | $R^{D41}$ | $R^{D30}$ | H |
| $L_{B519}$ | $R^{D41}$ | $R^{D31}$ | H |
| $L_{B520}$ | $R^{D41}$ | $R^{D32}$ | H |
| $L_{B521}$ | $R^{D41}$ | $R^{D33}$ | H |
| $L_{B522}$ | $R^{D41}$ | $R^{D34}$ | H |
| $L_{B523}$ | $R^{D41}$ | $R^{D42}$ | H |
| $L_{B524}$ | $R^{D41}$ | $R^{D64}$ | H |
| $L_{B525}$ | $R^{D41}$ | $R^{D66}$ | H |
| $L_{B526}$ | $R^{D41}$ | $R^{D68}$ | H |
| $L_{B527}$ | $R^{D41}$ | $R^{D76}$ | H |
| $L_{B528}$ | $R^{D64}$ | $R^{D5}$ | H |
| $L_{B529}$ | $R^{D64}$ | $R^{D6}$ | H |
| $L_{B530}$ | $R^{D64}$ | $R^{D9}$ | H |
| $L_{B531}$ | $R^{D64}$ | $R^{D10}$ | H |
| $L_{B532}$ | $R^{D64}$ | $R^{D12}$ | H |
| $L_{B533}$ | $R^{D64}$ | $R^{D15}$ | H |
| $L_{B534}$ | $R^{D64}$ | $R^{D16}$ | H |
| $L_{B535}$ | $R^{D64}$ | $R^{D17}$ | H |
| $L_{B536}$ | $R^{D64}$ | $R^{D18}$ | H |
| $L_{B537}$ | $R^{D64}$ | $R^{D19}$ | H |
| $L_{B538}$ | $R^{D64}$ | $R^{D20}$ | H |
| $L_{B539}$ | $R^{D64}$ | $R^{D21}$ | H |
| $L_{B540}$ | $R^{D64}$ | $R^{D23}$ | H |
| $L_{B541}$ | $R^{D64}$ | $R^{D24}$ | H |
| $L_{B542}$ | $R^{D64}$ | $R^{D25}$ | H |
| $L_{B543}$ | $R^{D64}$ | $R^{D27}$ | H |
| $L_{B544}$ | $R^{D64}$ | $R^{D28}$ | H |
| $L_{B545}$ | $R^{D64}$ | $R^{D29}$ | H |
| $L_{B546}$ | $R^{D64}$ | $R^{D30}$ | H |
| $L_{B547}$ | $R^{D64}$ | $R^{D31}$ | H |
| $L_{B548}$ | $R^{D64}$ | $R^{D32}$ | H |
| $L_{B549}$ | $R^{D64}$ | $R^{D33}$ | H |
| $L_{B550}$ | $R^{D64}$ | $R^{D34}$ | H |
| $L_{B551}$ | $R^{D64}$ | $R^{D42}$ | H |
| $L_{B552}$ | $R^{D64}$ | $R^{D64}$ | H |
| $L_{B553}$ | $R^{D64}$ | $R^{D66}$ | H |
| $L_{B554}$ | $R^{D64}$ | $R^{D68}$ | H |
| $L_{B555}$ | $R^{D64}$ | $R^{D76}$ | H |

-continued

| Ligand | $R^1$ | $R^2$ | $R^3$ |
| --- | --- | --- | --- |
| $L_{B556}$ | $R^{D66}$ | $R^{D5}$ | H |
| $L_{B557}$ | $R^{D66}$ | $R^{D6}$ | H |
| $L_{B558}$ | $R^{D66}$ | $R^{D9}$ | H |
| $L_{B559}$ | $R^{D66}$ | $R^{D10}$ | H |
| $L_{B560}$ | $R^{D66}$ | $R^{D12}$ | H |
| $L_{B561}$ | $R^{D66}$ | $R^{D15}$ | H |
| $L_{B562}$ | $R^{D66}$ | $R^{D16}$ | H |
| $L_{B563}$ | $R^{D66}$ | $R^{D17}$ | H |
| $L_{B564}$ | $R^{D66}$ | $R^{D18}$ | H |
| $L_{B565}$ | $R^{D66}$ | $R^{D19}$ | H |
| $L_{B566}$ | $R^{D66}$ | $R^{D20}$ | H |
| $L_{B567}$ | $R^{D66}$ | $R^{D21}$ | H |
| $L_{B568}$ | $R^{D66}$ | $R^{D23}$ | H |
| $L_{B569}$ | $R^{D66}$ | $R^{D24}$ | H |
| $L_{B570}$ | $R^{D66}$ | $R^{D25}$ | H |
| $L_{B571}$ | $R^{D66}$ | $R^{D27}$ | H |
| $L_{B572}$ | $R^{D66}$ | $R^{D28}$ | H |
| $L_{B573}$ | $R^{D66}$ | $R^{D29}$ | H |
| $L_{B574}$ | $R^{D66}$ | $R^{D30}$ | H |
| $L_{B575}$ | $R^{D66}$ | $R^{D31}$ | H |
| $L_{B576}$ | $R^{D66}$ | $R^{D32}$ | H |
| $L_{B577}$ | $R^{D66}$ | $R^{D33}$ | H |
| $L_{B578}$ | $R^{D66}$ | $R^{D34}$ | H |
| $L_{B579}$ | $R^{D66}$ | $R^{D42}$ | H |
| $L_{B580}$ | $R^{D66}$ | $R^{D68}$ | H |
| $L_{B581}$ | $R^{D66}$ | $R^{D76}$ | H |
| $L_{B582}$ | $R^{D68}$ | $R^{D5}$ | H |
| $L_{B583}$ | $R^{D68}$ | $R^{D6}$ | H |
| $L_{B584}$ | $R^{D68}$ | $R^{D9}$ | H |
| $L_{B585}$ | $R^{D68}$ | $R^{D10}$ | H |
| $L_{B586}$ | $R^{D68}$ | $R^{D12}$ | H |
| $L_{B587}$ | $R^{D68}$ | $R^{D15}$ | H |
| $L_{B588}$ | $R^{D68}$ | $R^{D16}$ | H |
| $L_{B589}$ | $R^{D68}$ | $R^{D17}$ | H |
| $L_{B590}$ | $R^{D68}$ | $R^{D18}$ | H |
| $L_{B591}$ | $R^{D68}$ | $R^{D19}$ | H |
| $L_{B592}$ | $R^{D68}$ | $R^{D20}$ | H |
| $L_{B593}$ | $R^{D68}$ | $R^{D21}$ | H |
| $L_{B594}$ | $R^{D68}$ | $R^{D23}$ | H |
| $L_{B595}$ | $R^{D68}$ | $R^{D24}$ | H |
| $L_{B596}$ | $R^{D68}$ | $R^{D25}$ | H |
| $L_{B597}$ | $R^{D68}$ | $R^{D27}$ | H |
| $L_{B598}$ | $R^{D68}$ | $R^{D28}$ | H |
| $L_{B599}$ | $R^{D68}$ | $R^{D29}$ | H |
| $L_{B600}$ | $R^{D68}$ | $R^{D30}$ | H |
| $L_{B601}$ | $R^{D68}$ | $R^{D31}$ | H |
| $L_{B602}$ | $R^{D68}$ | $R^{D32}$ | H |
| $L_{B603}$ | $R^{D68}$ | $R^{D33}$ | H |
| $L_{B604}$ | $R^{D68}$ | $R^{D34}$ | H |
| $L_{B605}$ | $R^{D68}$ | $R^{D42}$ | H |
| $L_{B606}$ | $R^{D68}$ | $R^{D76}$ | H |
| $L_{B607}$ | $R^{D76}$ | $R^{D5}$ | H |
| $L_{B608}$ | $R^{D76}$ | $R^{D6}$ | H |
| $L_{B609}$ | $R^{D76}$ | $R^{D9}$ | H |
| $L_{B610}$ | $R^{D76}$ | $R^{D10}$ | H |
| $L_{B611}$ | $R^{D76}$ | $R^{D12}$ | H |
| $L_{B612}$ | $R^{D76}$ | $R^{D15}$ | H |
| $L_{B613}$ | $R^{D76}$ | $R^{D16}$ | H |
| $L_{B614}$ | $R^{D76}$ | $R^{D17}$ | H |
| $L_{B615}$ | $R^{D76}$ | $R^{D18}$ | H |
| $L_{B616}$ | $R^{D76}$ | $R^{D19}$ | H |
| $L_{B617}$ | $R^{D76}$ | $R^{D20}$ | H |
| $L_{B618}$ | $R^{D76}$ | $R^{D21}$ | H |
| $L_{B619}$ | $R^{D76}$ | $R^{D23}$ | H |
| $L_{B620}$ | $R^{D76}$ | $R^{D24}$ | H |
| $L_{B621}$ | $R^{D76}$ | $R^{D25}$ | H |
| $L_{B622}$ | $R^{D76}$ | $R^{D27}$ | H |
| $L_{B623}$ | $R^{D76}$ | $R^{D28}$ | H |
| $L_{B624}$ | $R^{D76}$ | $R^{D29}$ | H |
| $L_{B625}$ | $R^{D76}$ | $R^{D30}$ | H |
| $L_{B626}$ | $R^{D76}$ | $R^{D31}$ | H |
| $L_{B627}$ | $R^{D76}$ | $R^{D32}$ | H |
| $L_{B628}$ | $R^{D76}$ | $R^{D33}$ | H |
| $L_{B629}$ | $R^{D76}$ | $R^{D34}$ | H |
| $L_{B630}$ | $R^{D76}$ | $R^{D42}$ | H |
| $L_{B631}$ | $R^{D1}$ | $R^{D1}$ | $R^{D1}$ |
| $L_{B632}$ | $R^{D2}$ | $R^{D2}$ | $R^{D1}$ |

-continued

| Ligand | $R^1$ | $R^2$ | $R^3$ |
| --- | --- | --- | --- |
| $L_{B633}$ | $R^{D3}$ | $R^{D3}$ | $R^{D1}$ |
| $L_{B634}$ | $R^{D4}$ | $R^{D4}$ | $R^{D1}$ |
| $L_{B635}$ | $R^{D5}$ | $R^{D5}$ | $R^{D1}$ |
| $L_{B636}$ | $R^{D6}$ | $R^{D6}$ | $R^{D1}$ |
| $L_{B637}$ | $R^{D7}$ | $R^{D7}$ | $R^{D1}$ |
| $L_{B638}$ | $R^{D8}$ | $R^{D8}$ | $R^{D1}$ |
| $L_{B639}$ | $R^{D9}$ | $R^{D9}$ | $R^{D1}$ |
| $L_{B640}$ | $R^{D10}$ | $R^{D10}$ | $R^{D1}$ |
| $L_{B641}$ | $R^{D11}$ | $R^{D11}$ | $R^{D1}$ |
| $L_{B642}$ | $R^{D12}$ | $R^{D12}$ | $R^{D1}$ |
| $L_{B643}$ | $R^{D13}$ | $R^{D13}$ | $R^{D1}$ |
| $L_{B644}$ | $R^{D14}$ | $R^{D14}$ | $R^{D1}$ |
| $L_{B645}$ | $R^{D15}$ | $R^{D15}$ | $R^{D1}$ |
| $L_{B646}$ | $R^{D16}$ | $R^{D16}$ | $R^{D1}$ |
| $L_{B647}$ | $R^{D17}$ | $R^{D17}$ | $R^{D1}$ |
| $L_{B648}$ | $R^{D18}$ | $R^{D18}$ | $R^{D1}$ |
| $L_{B649}$ | $R^{D19}$ | $R^{D19}$ | $R^{D1}$ |
| $L_{B650}$ | $R^{D20}$ | $R^{D20}$ | $R^{D1}$ |
| $L_{B651}$ | $R^{D21}$ | $R^{D21}$ | $R^{D1}$ |
| $L_{B652}$ | $R^{D22}$ | $R^{D22}$ | $R^{D1}$ |
| $L_{B653}$ | $R^{D23}$ | $R^{D23}$ | $R^{D1}$ |
| $L_{B654}$ | $R^{D24}$ | $R^{D24}$ | $R^{D1}$ |
| $L_{B655}$ | $R^{D25}$ | $R^{D25}$ | $R^{D1}$ |
| $L_{B656}$ | $R^{D26}$ | $R^{D26}$ | $R^{D1}$ |
| $L_{B657}$ | $R^{D27}$ | $R^{D27}$ | $R^{D1}$ |
| $L_{B658}$ | $R^{D28}$ | $R^{D28}$ | $R^{D1}$ |
| $L_{B659}$ | $R^{D29}$ | $R^{D29}$ | $R^{D1}$ |
| $L_{B660}$ | $R^{D30}$ | $R^{D30}$ | $R^{D1}$ |
| $L_{B661}$ | $R^{D31}$ | $R^{D31}$ | $R^{D1}$ |
| $L_{B662}$ | $R^{D32}$ | $R^{D32}$ | $R^{D1}$ |
| $L_{B663}$ | $R^{D33}$ | $R^{D33}$ | $R^{D1}$ |
| $L_{B664}$ | $R^{D34}$ | $R^{D34}$ | $R^{D1}$ |
| $L_{B665}$ | $R^{D35}$ | $R^{D35}$ | $R^{D1}$ |
| $L_{B666}$ | $R^{D40}$ | $R^{D40}$ | $R^{D1}$ |
| $L_{B667}$ | $R^{D41}$ | $R^{D41}$ | $R^{D1}$ |
| $L_{B668}$ | $R^{D42}$ | $R^{D42}$ | $R^{D1}$ |
| $L_{B669}$ | $R^{D64}$ | $R^{D64}$ | $R^{D1}$ |
| $L_{B670}$ | $R^{D66}$ | $R^{D66}$ | $R^{D1}$ |
| $L_{B671}$ | $R^{D68}$ | $R^{D68}$ | $R^{D1}$ |
| $L_{B672}$ | $R^{D76}$ | $R^{D76}$ | $R^{D1}$ |
| $L_{B673}$ | $R^{D1}$ | $R^{D2}$ | $R^{D1}$ |
| $L_{B674}$ | $R^{D1}$ | $R^{D3}$ | $R^{D1}$ |
| $L_{B675}$ | $R^{D1}$ | $R^{D4}$ | $R^{D1}$ |
| $L_{B676}$ | $R^{D1}$ | $R^{D5}$ | $R^{D1}$ |
| $L_{B677}$ | $R^{D1}$ | $R^{D6}$ | $R^{D1}$ |
| $L_{B678}$ | $R^{D1}$ | $R^{D7}$ | $R^{D1}$ |
| $L_{B679}$ | $R^{D1}$ | $R^{D8}$ | $R^{D1}$ |
| $L_{B680}$ | $R^{D1}$ | $R^{D9}$ | $R^{D1}$ |
| $L_{B681}$ | $R^{D1}$ | $R^{D10}$ | $R^{D1}$ |
| $L_{B682}$ | $R^{D1}$ | $R^{D11}$ | $R^{D1}$ |
| $L_{B683}$ | $R^{D1}$ | $R^{D12}$ | $R^{D1}$ |
| $L_{B684}$ | $R^{D1}$ | $R^{D13}$ | $R^{D1}$ |
| $L_{B685}$ | $R^{D1}$ | $R^{D14}$ | $R^{D1}$ |
| $L_{B686}$ | $R^{D1}$ | $R^{D15}$ | $R^{D1}$ |
| $L_{B687}$ | $R^{D1}$ | $R^{D16}$ | $R^{D1}$ |
| $L_{B688}$ | $R^{D1}$ | $R^{D17}$ | $R^{D1}$ |
| $L_{B689}$ | $R^{D1}$ | $R^{D18}$ | $R^{D1}$ |
| $L_{B690}$ | $R^{D1}$ | $R^{D19}$ | $R^{D1}$ |
| $L_{B691}$ | $R^{D1}$ | $R^{D20}$ | $R^{D1}$ |
| $L_{B692}$ | $R^{D1}$ | $R^{D21}$ | $R^{D1}$ |
| $L_{B693}$ | $R^{D1}$ | $R^{D22}$ | $R^{D1}$ |
| $L_{B694}$ | $R^{D1}$ | $R^{D23}$ | $R^{D1}$ |
| $L_{B695}$ | $R^{D1}$ | $R^{D24}$ | $R^{D1}$ |
| $L_{B696}$ | $R^{D1}$ | $R^{D25}$ | $R^{D1}$ |
| $L_{B697}$ | $R^{D1}$ | $R^{D26}$ | $R^{D1}$ |
| $L_{B698}$ | $R^{D1}$ | $R^{D27}$ | $R^{D1}$ |
| $L_{B699}$ | $R^{D1}$ | $R^{D28}$ | $R^{D1}$ |
| $L_{B700}$ | $R^{D1}$ | $R^{D29}$ | $R^{D1}$ |
| $L_{B701}$ | $R^{D1}$ | $R^{D30}$ | $R^{D1}$ |
| $L_{B702}$ | $R^{D1}$ | $R^{D31}$ | $R^{D1}$ |
| $L_{B703}$ | $R^{D1}$ | $R^{D32}$ | $R^{D1}$ |
| $L_{B704}$ | $R^{D1}$ | $R^{D33}$ | $R^{D1}$ |
| $L_{B705}$ | $R^{D1}$ | $R^{D34}$ | $R^{D1}$ |
| $L_{B706}$ | $R^{D1}$ | $R^{D35}$ | $R^{D1}$ |
| $L_{B707}$ | $R^{D1}$ | $R^{D40}$ | $R^{D1}$ |
| $L_{B708}$ | $R^{D1}$ | $R^{D41}$ | $R^{D1}$ |
| $L_{B709}$ | $R^{D1}$ | $R^{D42}$ | $R^{D1}$ |

| Ligand | $R^1$ | $R^2$ | $R^3$ |
|---|---|---|---|
| $L_{B710}$ | $R^{D1}$ | $R^{D64}$ | $R^{D1}$ |
| $L_{B711}$ | $R^{D1}$ | $R^{D66}$ | $R^{D1}$ |
| $L_{B712}$ | $R^{D1}$ | $R^{D68}$ | $R^{D1}$ |
| $L_{B713}$ | $R^{D1}$ | $R^{D76}$ | $R^{D1}$ |
| $L_{B714}$ | $R^{D2}$ | $R^{D1}$ | $R^{D1}$ |
| $L_{B715}$ | $R^{D2}$ | $R^{D3}$ | $R^{D1}$ |
| $L_{B716}$ | $R^{D2}$ | $R^{D4}$ | $R^{D1}$ |
| $L_{B717}$ | $R^{D2}$ | $R^{D5}$ | $R^{D1}$ |
| $L_{B718}$ | $R^{D2}$ | $R^{D6}$ | $R^{D1}$ |
| $L_{B719}$ | $R^{D2}$ | $R^{D7}$ | $R^{D1}$ |
| $L_{B720}$ | $R^{D2}$ | $R^{D8}$ | $R^{D1}$ |
| $L_{B721}$ | $R^{D2}$ | $R^{D9}$ | $R^{D1}$ |
| $L_{B722}$ | $R^{D2}$ | $R^{D10}$ | $R^{D1}$ |
| $L_{B723}$ | $R^{D2}$ | $R^{D11}$ | $R^{D1}$ |
| $L_{B724}$ | $R^{D2}$ | $R^{D12}$ | $R^{D1}$ |
| $L_{B725}$ | $R^{D2}$ | $R^{D13}$ | $R^{D1}$ |
| $L_{B726}$ | $R^{D2}$ | $R^{D14}$ | $R^{D1}$ |
| $L_{B727}$ | $R^{D2}$ | $R^{D15}$ | $R^{D1}$ |
| $L_{B728}$ | $R^{D2}$ | $R^{D16}$ | $R^{D1}$ |
| $L_{B729}$ | $R^{D2}$ | $R^{D17}$ | $R^{D1}$ |
| $L_{B730}$ | $R^{D2}$ | $R^{D18}$ | $R^{D1}$ |
| $L_{B731}$ | $R^{D2}$ | $R^{D19}$ | $R^{D1}$ |
| $L_{B732}$ | $R^{D2}$ | $R^{D20}$ | $R^{D1}$ |
| $L_{B733}$ | $R^{D2}$ | $R^{D21}$ | $R^{D1}$ |
| $L_{B734}$ | $R^{D2}$ | $R^{D22}$ | $R^{D1}$ |
| $L_{B735}$ | $R^{D2}$ | $R^{D23}$ | $R^{D1}$ |
| $L_{B736}$ | $R^{D2}$ | $R^{D24}$ | $R^{D1}$ |
| $L_{B737}$ | $R^{D2}$ | $R^{D25}$ | $R^{D1}$ |
| $L_{B738}$ | $R^{D2}$ | $R^{D26}$ | $R^{D1}$ |
| $L_{B739}$ | $R^{D2}$ | $R^{D27}$ | $R^{D1}$ |
| $L_{B740}$ | $R^{D2}$ | $R^{D28}$ | $R^{D1}$ |
| $L_{B741}$ | $R^{D2}$ | $R^{D29}$ | $R^{D1}$ |
| $L_{B742}$ | $R^{D2}$ | $R^{D30}$ | $R^{D1}$ |
| $L_{B743}$ | $R^{D2}$ | $R^{D31}$ | $R^{D1}$ |
| $L_{B744}$ | $R^{D2}$ | $R^{D32}$ | $R^{D1}$ |
| $L_{B745}$ | $R^{D2}$ | $R^{D33}$ | $R^{D1}$ |
| $L_{B746}$ | $R^{D2}$ | $R^{D34}$ | $R^{D1}$ |
| $L_{B747}$ | $R^{D2}$ | $R^{D35}$ | $R^{D1}$ |
| $L_{B748}$ | $R^{D2}$ | $R^{D40}$ | $R^{D1}$ |
| $L_{B749}$ | $R^{D2}$ | $R^{D41}$ | $R^{D1}$ |
| $L_{B750}$ | $R^{D2}$ | $R^{D42}$ | $R^{D1}$ |
| $L_{B751}$ | $R^{D2}$ | $R^{D64}$ | $R^{D1}$ |
| $L_{B752}$ | $R^{D2}$ | $R^{D66}$ | $R^{D1}$ |
| $L_{B753}$ | $R^{D2}$ | $R^{D68}$ | $R^{D1}$ |
| $L_{B754}$ | $R^{D2}$ | $R^{D76}$ | $R^{D1}$ |
| $L_{B755}$ | $R^{D3}$ | $R^{D4}$ | $R^{D1}$ |
| $L_{B756}$ | $R^{D3}$ | $R^{D5}$ | $R^{D1}$ |
| $L_{B757}$ | $R^{D3}$ | $R^{D6}$ | $R^{D1}$ |
| $L_{B758}$ | $R^{D3}$ | $R^{D7}$ | $R^{D1}$ |
| $L_{B759}$ | $R^{D3}$ | $R^{D8}$ | $R^{D1}$ |
| $L_{B760}$ | $R^{D3}$ | $R^{D9}$ | $R^{D1}$ |
| $L_{B761}$ | $R^{D3}$ | $R^{D10}$ | $R^{D1}$ |
| $L_{B762}$ | $R^{D3}$ | $R^{D11}$ | $R^{D1}$ |
| $L_{B763}$ | $R^{D3}$ | $R^{D12}$ | $R^{D1}$ |
| $L_{B764}$ | $R^{D3}$ | $R^{D13}$ | $R^{D1}$ |
| $L_{B765}$ | $R^{D3}$ | $R^{D14}$ | $R^{D1}$ |
| $L_{B766}$ | $R^{D3}$ | $R^{D15}$ | $R^{D1}$ |
| $L_{B767}$ | $R^{D3}$ | $R^{D16}$ | $R^{D1}$ |
| $L_{B768}$ | $R^{D3}$ | $R^{D17}$ | $R^{D1}$ |
| $L_{B769}$ | $R^{D3}$ | $R^{D18}$ | $R^{D1}$ |
| $L_{B770}$ | $R^{D3}$ | $R^{D19}$ | $R^{D1}$ |
| $L_{B771}$ | $R^{D3}$ | $R^{D20}$ | $R^{D1}$ |
| $L_{B772}$ | $R^{D3}$ | $R^{D21}$ | $R^{D1}$ |
| $L_{B773}$ | $R^{D3}$ | $R^{D22}$ | $R^{D1}$ |
| $L_{B774}$ | $R^{D3}$ | $R^{D23}$ | $R^{D1}$ |
| $L_{B775}$ | $R^{D3}$ | $R^{D24}$ | $R^{D1}$ |
| $L_{B776}$ | $R^{D3}$ | $R^{D25}$ | $R^{D1}$ |
| $L_{B777}$ | $R^{D3}$ | $R^{D26}$ | $R^{D1}$ |
| $L_{B778}$ | $R^{D3}$ | $R^{D27}$ | $R^{D1}$ |
| $L_{B779}$ | $R^{D3}$ | $R^{D28}$ | $R^{D1}$ |
| $L_{B780}$ | $R^{D3}$ | $R^{D29}$ | $R^{D1}$ |
| $L_{B781}$ | $R^{D3}$ | $R^{D30}$ | $R^{D1}$ |
| $L_{B782}$ | $R^{D3}$ | $R^{D31}$ | $R^{D1}$ |
| $L_{B783}$ | $R^{D3}$ | $R^{D32}$ | $R^{D1}$ |
| $L_{B784}$ | $R^{D3}$ | $R^{D33}$ | $R^{D1}$ |
| $L_{B785}$ | $R^{D3}$ | $R^{D34}$ | $R^{D1}$ |
| $L_{B786}$ | $R^{D3}$ | $R^{D35}$ | $R^{D1}$ |
| $L_{B787}$ | $R^{D3}$ | $R^{D40}$ | $R^{D1}$ |
| $L_{B788}$ | $R^{D3}$ | $R^{D41}$ | $R^{D1}$ |
| $L_{B789}$ | $R^{D3}$ | $R^{D42}$ | $R^{D1}$ |
| $L_{B790}$ | $R^{D3}$ | $R^{D64}$ | $R^{D1}$ |
| $L_{B791}$ | $R^{D3}$ | $R^{D66}$ | $R^{D1}$ |
| $L_{B792}$ | $R^{D3}$ | $R^{D68}$ | $R^{D1}$ |
| $L_{B793}$ | $R^{D3}$ | $R^{D76}$ | $R^{D1}$ |
| $L_{B794}$ | $R^{D4}$ | $R^{D5}$ | $R^{D1}$ |
| $L_{B795}$ | $R^{D4}$ | $R^{D6}$ | $R^{D1}$ |
| $L_{B796}$ | $R^{D4}$ | $R^{D7}$ | $R^{D1}$ |
| $L_{B797}$ | $R^{D4}$ | $R^{D8}$ | $R^{D1}$ |
| $L_{B798}$ | $R^{D4}$ | $R^{D9}$ | $R^{D1}$ |
| $L_{B799}$ | $R^{D4}$ | $R^{D10}$ | $R^{D1}$ |
| $L_{B800}$ | $R^{D4}$ | $R^{D11}$ | $R^{D1}$ |
| $L_{B801}$ | $R^{D4}$ | $R^{D12}$ | $R^{D1}$ |
| $L_{B802}$ | $R^{D4}$ | $R^{D13}$ | $R^{D1}$ |
| $L_{B803}$ | $R^{D4}$ | $R^{D14}$ | $R^{D1}$ |
| $L_{B804}$ | $R^{D4}$ | $R^{D15}$ | $R^{D1}$ |
| $L_{B805}$ | $R^{D4}$ | $R^{D16}$ | $R^{D1}$ |
| $L_{B806}$ | $R^{D4}$ | $R^{D17}$ | $R^{D1}$ |
| $L_{B807}$ | $R^{D4}$ | $R^{D18}$ | $R^{D1}$ |
| $L_{B808}$ | $R^{D4}$ | $R^{D19}$ | $R^{D1}$ |
| $L_{B809}$ | $R^{D4}$ | $R^{D20}$ | $R^{D1}$ |
| $L_{B810}$ | $R^{D4}$ | $R^{D21}$ | $R^{D1}$ |
| $L_{B811}$ | $R^{D4}$ | $R^{D22}$ | $R^{D1}$ |
| $L_{B812}$ | $R^{D4}$ | $R^{D23}$ | $R^{D1}$ |
| $L_{B813}$ | $R^{D4}$ | $R^{D24}$ | $R^{D1}$ |
| $L_{B814}$ | $R^{D4}$ | $R^{D25}$ | $R^{D1}$ |
| $L_{B815}$ | $R^{D4}$ | $R^{D26}$ | $R^{D1}$ |
| $L_{B816}$ | $R^{D4}$ | $R^{D27}$ | $R^{D1}$ |
| $L_{B817}$ | $R^{D4}$ | $R^{D28}$ | $R^{D1}$ |
| $L_{B818}$ | $R^{D4}$ | $R^{D29}$ | $R^{D1}$ |
| $L_{B819}$ | $R^{D4}$ | $R^{D30}$ | $R^{D1}$ |
| $L_{B820}$ | $R^{D4}$ | $R^{D31}$ | $R^{D1}$ |
| $L_{B821}$ | $R^{D4}$ | $R^{D32}$ | $R^{D1}$ |
| $L_{B822}$ | $R^{D4}$ | $R^{D33}$ | $R^{D1}$ |
| $L_{B823}$ | $R^{D4}$ | $R^{D34}$ | $R^{D1}$ |
| $L_{B824}$ | $R^{D4}$ | $R^{D35}$ | $R^{D1}$ |
| $L_{B825}$ | $R^{D4}$ | $R^{D40}$ | $R^{D1}$ |
| $L_{B826}$ | $R^{D4}$ | $R^{D41}$ | $R^{D1}$ |
| $L_{B827}$ | $R^{D4}$ | $R^{D42}$ | $R^{D1}$ |
| $L_{B828}$ | $R^{D4}$ | $R^{D64}$ | $R^{D1}$ |
| $L_{B829}$ | $R^{D4}$ | $R^{D66}$ | $R^{D1}$ |
| $L_{B830}$ | $R^{D4}$ | $R^{D68}$ | $R^{D1}$ |
| $L_{B831}$ | $R^{D4}$ | $R^{D76}$ | $R^{D1}$ |
| $L_{B832}$ | $R^{D4}$ | $R^{D1}$ | $R^{D1}$ |
| $L_{B833}$ | $R^{D7}$ | $R^{D5}$ | $R^{D1}$ |
| $L_{B834}$ | $R^{D7}$ | $R^{D6}$ | $R^{D1}$ |
| $L_{B835}$ | $R^{D7}$ | $R^{D8}$ | $R^{D1}$ |
| $L_{B836}$ | $R^{D7}$ | $R^{D9}$ | $R^{D1}$ |
| $L_{B837}$ | $R^{D7}$ | $R^{D10}$ | $R^{D1}$ |
| $L_{B838}$ | $R^{D7}$ | $R^{D11}$ | $R^{D1}$ |
| $L_{B839}$ | $R^{D7}$ | $R^{D12}$ | $R^{D1}$ |
| $L_{B840}$ | $R^{D7}$ | $R^{D13}$ | $R^{D1}$ |
| $L_{B841}$ | $R^{D7}$ | $R^{D14}$ | $R^{D1}$ |
| $L_{B842}$ | $R^{D7}$ | $R^{D15}$ | $R^{D1}$ |
| $L_{B843}$ | $R^{D7}$ | $R^{D16}$ | $R^{D1}$ |
| $L_{B844}$ | $R^{D7}$ | $R^{D17}$ | $R^{D1}$ |
| $L_{B845}$ | $R^{D7}$ | $R^{D18}$ | $R^{D1}$ |
| $L_{B846}$ | $R^{D7}$ | $R^{D19}$ | $R^{D1}$ |
| $L_{B847}$ | $R^{D7}$ | $R^{D20}$ | $R^{D1}$ |
| $L_{B848}$ | $R^{D7}$ | $R^{D21}$ | $R^{D1}$ |
| $L_{B849}$ | $R^{D7}$ | $R^{D22}$ | $R^{D1}$ |
| $L_{B850}$ | $R^{D7}$ | $R^{D23}$ | $R^{D1}$ |
| $L_{B851}$ | $R^{D7}$ | $R^{D24}$ | $R^{D1}$ |
| $L_{B852}$ | $R^{D7}$ | $R^{D25}$ | $R^{D1}$ |
| $L_{B853}$ | $R^{D7}$ | $R^{D26}$ | $R^{D1}$ |
| $L_{B854}$ | $R^{D7}$ | $R^{D27}$ | $R^{D1}$ |
| $L_{B855}$ | $R^{D7}$ | $R^{D28}$ | $R^{D1}$ |
| $L_{B856}$ | $R^{D7}$ | $R^{D29}$ | $R^{D1}$ |
| $L_{B857}$ | $R^{D7}$ | $R^{D30}$ | $R^{D1}$ |
| $L_{B858}$ | $R^{D7}$ | $R^{D31}$ | $R^{D1}$ |
| $L_{B859}$ | $R^{D7}$ | $R^{D32}$ | $R^{D1}$ |
| $L_{B860}$ | $R^{D7}$ | $R^{D33}$ | $R^{D1}$ |
| $L_{B861}$ | $R^{D7}$ | $R^{D34}$ | $R^{D1}$ |
| $L_{B862}$ | $R^{D7}$ | $R^{D35}$ | $R^{D1}$ |
| $L_{B863}$ | $R^{D7}$ | $R^{D40}$ | $R^{D1}$ |

-continued

| Ligand | $R^1$ | $R^2$ | $R^3$ |
|---|---|---|---|
| $L_{B864}$ | $R^{D7}$ | $R^{D41}$ | $R^{D1}$ |
| $L_{B865}$ | $R^{D7}$ | $R^{D42}$ | $R^{D1}$ |
| $L_{B866}$ | $R^{D7}$ | $R^{D64}$ | $R^{D1}$ |
| $L_{B867}$ | $R^{D7}$ | $R^{D66}$ | $R^{D1}$ |
| $L_{B868}$ | $R^{D7}$ | $R^{D68}$ | $R^{D1}$ |
| $L_{B869}$ | $R^{D7}$ | $R^{D76}$ | $R^{D1}$ |
| $L_{B870}$ | $R^{D8}$ | $R^{D5}$ | $R^{D1}$ |
| $L_{B871}$ | $R^{D8}$ | $R^{D6}$ | $R^{D1}$ |
| $L_{B872}$ | $R^{D8}$ | $R^{D9}$ | $R^{D1}$ |
| $L_{B873}$ | $R^{D8}$ | $R^{D10}$ | $R^{D1}$ |
| $L_{B874}$ | $R^{D8}$ | $R^{D11}$ | $R^{D1}$ |
| $L_{B875}$ | $R^{D8}$ | $R^{D12}$ | $R^{D1}$ |
| $L_{B876}$ | $R^{D8}$ | $R^{D13}$ | $R^{D1}$ |
| $L_{B877}$ | $R^{D8}$ | $R^{D14}$ | $R^{D1}$ |
| $L_{B878}$ | $R^{D8}$ | $R^{D15}$ | $R^{D1}$ |
| $L_{B879}$ | $R^{D8}$ | $R^{D16}$ | $R^{D1}$ |
| $L_{B880}$ | $R^{D8}$ | $R^{D17}$ | $R^{D1}$ |
| $L_{B881}$ | $R^{D8}$ | $R^{D18}$ | $R^{D1}$ |
| $L_{B882}$ | $R^{D8}$ | $R^{D19}$ | $R^{D1}$ |
| $L_{B883}$ | $R^{D8}$ | $R^{D20}$ | $R^{D1}$ |
| $L_{B884}$ | $R^{D8}$ | $R^{D21}$ | $R^{D1}$ |
| $L_{B885}$ | $R^{D8}$ | $R^{D22}$ | $R^{D1}$ |
| $L_{B886}$ | $R^{D8}$ | $R^{D23}$ | $R^{D1}$ |
| $L_{B887}$ | $R^{D8}$ | $R^{D24}$ | $R^{D1}$ |
| $L_{B888}$ | $R^{D8}$ | $R^{D25}$ | $R^{D1}$ |
| $L_{B889}$ | $R^{D8}$ | $R^{D26}$ | $R^{D1}$ |
| $L_{B890}$ | $R^{D8}$ | $R^{D27}$ | $R^{D1}$ |
| $L_{B891}$ | $R^{D8}$ | $R^{D28}$ | $R^{D1}$ |
| $L_{B892}$ | $R^{D8}$ | $R^{D29}$ | $R^{D1}$ |
| $L_{B893}$ | $R^{D8}$ | $R^{D30}$ | $R^{D1}$ |
| $L_{B894}$ | $R^{D8}$ | $R^{D31}$ | $R^{D1}$ |
| $L_{B895}$ | $R^{D8}$ | $R^{D32}$ | $R^{D1}$ |
| $L_{B896}$ | $R^{D8}$ | $R^{D33}$ | $R^{D1}$ |
| $L_{B897}$ | $R^{D8}$ | $R^{D34}$ | $R^{D1}$ |
| $L_{B898}$ | $R^{D8}$ | $R^{D35}$ | $R^{D1}$ |
| $L_{B899}$ | $R^{D8}$ | $R^{D40}$ | $R^{D1}$ |
| $L_{B900}$ | $R^{D8}$ | $R^{D41}$ | $R^{D1}$ |
| $L_{B901}$ | $R^{D8}$ | $R^{D42}$ | $R^{D1}$ |
| $L_{B902}$ | $R^{D8}$ | $R^{D64}$ | $R^{D1}$ |
| $L_{B903}$ | $R^{D8}$ | $R^{D66}$ | $R^{D1}$ |
| $L_{B904}$ | $R^{D8}$ | $R^{D68}$ | $R^{D1}$ |
| $L_{B905}$ | $R^{D8}$ | $R^{D76}$ | $R^{D1}$ |
| $L_{B906}$ | $R^{D11}$ | $R^{D5}$ | $R^{D1}$ |
| $L_{B907}$ | $R^{D11}$ | $R^{D6}$ | $R^{D1}$ |
| $L_{B908}$ | $R^{D11}$ | $R^{D9}$ | $R^{D1}$ |
| $L_{B909}$ | $R^{D11}$ | $R^{D10}$ | $R^{D1}$ |
| $L_{B910}$ | $R^{D11}$ | $R^{D12}$ | $R^{D1}$ |
| $L_{B911}$ | $R^{D11}$ | $R^{D13}$ | $R^{D1}$ |
| $L_{B912}$ | $R^{D11}$ | $R^{D14}$ | $R^{D1}$ |
| $L_{B913}$ | $R^{D11}$ | $R^{D15}$ | $R^{D1}$ |
| $L_{B914}$ | $R^{D11}$ | $R^{D16}$ | $R^{D1}$ |
| $L_{B915}$ | $R^{D11}$ | $R^{D17}$ | $R^{D1}$ |
| $L_{B916}$ | $R^{D11}$ | $R^{D18}$ | $R^{D1}$ |
| $L_{B917}$ | $R^{D11}$ | $R^{D19}$ | $R^{D1}$ |
| $L_{B918}$ | $R^{D11}$ | $R^{D20}$ | $R^{D1}$ |
| $L_{B919}$ | $R^{D11}$ | $R^{D21}$ | $R^{D1}$ |
| $L_{B920}$ | $R^{D11}$ | $R^{D22}$ | $R^{D1}$ |
| $L_{B921}$ | $R^{D11}$ | $R^{D23}$ | $R^{D1}$ |
| $L_{B922}$ | $R^{D11}$ | $R^{D24}$ | $R^{D1}$ |
| $L_{B923}$ | $R^{D11}$ | $R^{D25}$ | $R^{D1}$ |
| $L_{B924}$ | $R^{D11}$ | $R^{D26}$ | $R^{D1}$ |
| $L_{B925}$ | $R^{D11}$ | $R^{D27}$ | $R^{D1}$ |
| $L_{B926}$ | $R^{D11}$ | $R^{D28}$ | $R^{D1}$ |
| $L_{B927}$ | $R^{D11}$ | $R^{D29}$ | $R^{D1}$ |
| $L_{B928}$ | $R^{D11}$ | $R^{D30}$ | $R^{D1}$ |
| $L_{B929}$ | $R^{D11}$ | $R^{D31}$ | $R^{D1}$ |
| $L_{B930}$ | $R^{D11}$ | $R^{D32}$ | $R^{D1}$ |
| $L_{B931}$ | $R^{D11}$ | $R^{D33}$ | $R^{D1}$ |
| $L_{B932}$ | $R^{D11}$ | $R^{D34}$ | $R^{D1}$ |
| $L_{B933}$ | $R^{D11}$ | $R^{D35}$ | $R^{D1}$ |
| $L_{B934}$ | $R^{D11}$ | $R^{D40}$ | $R^{D1}$ |
| $L_{B935}$ | $R^{D11}$ | $R^{D41}$ | $R^{D1}$ |
| $L_{B936}$ | $R^{D11}$ | $R^{D42}$ | $R^{D1}$ |
| $L_{B937}$ | $R^{D11}$ | $R^{D64}$ | $R^{D1}$ |
| $L_{B938}$ | $R^{D11}$ | $R^{D66}$ | $R^{D1}$ |
| $L_{B939}$ | $R^{D11}$ | $R^{D68}$ | $R^{D1}$ |
| $L_{B940}$ | $R^{D11}$ | $R^{D76}$ | $R^{D1}$ |

-continued

| Ligand | $R^1$ | $R^2$ | $R^3$ |
|---|---|---|---|
| $L_{B941}$ | $R^{D13}$ | $R^{D5}$ | $R^{D1}$ |
| $L_{B942}$ | $R^{D13}$ | $R^{D6}$ | $R^{D1}$ |
| $L_{B943}$ | $R^{D13}$ | $R^{D9}$ | $R^{D1}$ |
| $L_{B944}$ | $R^{D13}$ | $R^{D10}$ | $R^{D1}$ |
| $L_{B945}$ | $R^{D13}$ | $R^{D12}$ | $R^{D1}$ |
| $L_{B946}$ | $R^{D13}$ | $R^{D14}$ | $R^{D1}$ |
| $L_{B947}$ | $R^{D13}$ | $R^{D15}$ | $R^{D1}$ |
| $L_{B948}$ | $R^{D13}$ | $R^{D16}$ | $R^{D1}$ |
| $L_{B949}$ | $R^{D13}$ | $R^{D17}$ | $R^{D1}$ |
| $L_{B950}$ | $R^{D13}$ | $R^{D18}$ | $R^{D1}$ |
| $L_{B951}$ | $R^{D13}$ | $R^{D19}$ | $R^{D1}$ |
| $L_{B952}$ | $R^{D13}$ | $R^{D20}$ | $R^{D1}$ |
| $L_{B953}$ | $R^{D13}$ | $R^{D21}$ | $R^{D1}$ |
| $L_{B954}$ | $R^{D13}$ | $R^{D22}$ | $R^{D1}$ |
| $L_{B955}$ | $R^{D13}$ | $R^{D23}$ | $R^{D1}$ |
| $L_{B956}$ | $R^{D13}$ | $R^{D24}$ | $R^{D1}$ |
| $L_{B957}$ | $R^{D13}$ | $R^{D25}$ | $R^{D1}$ |
| $L_{B958}$ | $R^{D13}$ | $R^{D26}$ | $R^{D1}$ |
| $L_{B959}$ | $R^{D13}$ | $R^{D27}$ | $R^{D1}$ |
| $L_{B960}$ | $R^{D13}$ | $R^{D28}$ | $R^{D1}$ |
| $L_{B961}$ | $R^{D13}$ | $R^{D29}$ | $R^{D1}$ |
| $L_{B962}$ | $R^{D13}$ | $R^{D30}$ | $R^{D1}$ |
| $L_{B963}$ | $R^{D13}$ | $R^{D31}$ | $R^{D1}$ |
| $L_{B964}$ | $R^{D13}$ | $R^{D32}$ | $R^{D1}$ |
| $L_{B965}$ | $R^{D13}$ | $R^{D33}$ | $R^{D1}$ |
| $L_{B966}$ | $R^{D13}$ | $R^{D34}$ | $R^{D1}$ |
| $L_{B967}$ | $R^{D13}$ | $R^{D35}$ | $R^{D1}$ |
| $L_{B968}$ | $R^{D13}$ | $R^{D40}$ | $R^{D1}$ |
| $L_{B969}$ | $R^{D13}$ | $R^{D41}$ | $R^{D1}$ |
| $L_{B970}$ | $R^{D13}$ | $R^{D42}$ | $R^{D1}$ |
| $L_{B971}$ | $R^{D13}$ | $R^{D64}$ | $R^{D1}$ |
| $L_{B972}$ | $R^{D13}$ | $R^{D66}$ | $R^{D1}$ |
| $L_{B973}$ | $R^{D13}$ | $R^{D68}$ | $R^{D1}$ |
| $L_{B974}$ | $R^{D13}$ | $R^{D76}$ | $R^{D1}$ |
| $L_{B975}$ | $R^{D14}$ | $R^{D5}$ | $R^{D1}$ |
| $L_{B976}$ | $R^{D14}$ | $R^{D6}$ | $R^{D1}$ |
| $L_{B977}$ | $R^{D14}$ | $R^{D9}$ | $R^{D1}$ |
| $L_{B978}$ | $R^{D14}$ | $R^{D10}$ | $R^{D1}$ |
| $L_{B979}$ | $R^{D14}$ | $R^{D12}$ | $R^{D1}$ |
| $L_{B980}$ | $R^{D14}$ | $R^{D15}$ | $R^{D1}$ |
| $L_{B981}$ | $R^{D14}$ | $R^{D16}$ | $R^{D1}$ |
| $L_{B982}$ | $R^{D14}$ | $R^{D17}$ | $R^{D1}$ |
| $L_{B983}$ | $R^{D14}$ | $R^{D18}$ | $R^{D1}$ |
| $L_{B984}$ | $R^{D14}$ | $R^{D19}$ | $R^{D1}$ |
| $L_{B985}$ | $R^{D14}$ | $R^{D20}$ | $R^{D1}$ |
| $L_{B986}$ | $R^{D14}$ | $R^{D21}$ | $R^{D1}$ |
| $L_{B987}$ | $R^{D14}$ | $R^{D22}$ | $R^{D1}$ |
| $L_{B988}$ | $R^{D14}$ | $R^{D23}$ | $R^{D1}$ |
| $L_{B989}$ | $R^{D14}$ | $R^{D24}$ | $R^{D1}$ |
| $L_{B990}$ | $R^{D14}$ | $R^{D25}$ | $R^{D1}$ |
| $L_{B991}$ | $R^{D14}$ | $R^{D26}$ | $R^{D1}$ |
| $L_{B992}$ | $R^{D14}$ | $R^{D27}$ | $R^{D1}$ |
| $L_{B993}$ | $R^{D14}$ | $R^{D28}$ | $R^{D1}$ |
| $L_{B994}$ | $R^{D14}$ | $R^{D29}$ | $R^{D1}$ |
| $L_{B995}$ | $R^{D14}$ | $R^{D30}$ | $R^{D1}$ |
| $L_{B996}$ | $R^{D14}$ | $R^{D31}$ | $R^{D1}$ |
| $L_{B997}$ | $R^{D14}$ | $R^{D32}$ | $R^{D1}$ |
| $L_{B998}$ | $R^{D14}$ | $R^{D33}$ | $R^{D1}$ |
| $L_{B999}$ | $R^{D14}$ | $R^{D34}$ | $R^{D1}$ |
| $L_{B1000}$ | $R^{D14}$ | $R^{D35}$ | $R^{D1}$ |
| $L_{B1001}$ | $R^{D14}$ | $R^{D40}$ | $R^{D1}$ |
| $L_{B1002}$ | $R^{D14}$ | $R^{D41}$ | $R^{D1}$ |
| $L_{B1003}$ | $R^{D14}$ | $R^{D42}$ | $R^{D1}$ |
| $L_{B1004}$ | $R^{D14}$ | $R^{D64}$ | $R^{D1}$ |
| $L_{B1005}$ | $R^{D14}$ | $R^{D66}$ | $R^{D1}$ |
| $L_{B1006}$ | $R^{D14}$ | $R^{D68}$ | $R^{D1}$ |
| $L_{B1007}$ | $R^{D14}$ | $R^{D76}$ | $R^{D1}$ |
| $L_{B1008}$ | $R^{D22}$ | $R^{D5}$ | $R^{D1}$ |
| $L_{B1009}$ | $R^{D22}$ | $R^{D6}$ | $R^{D1}$ |
| $L_{B1010}$ | $R^{D22}$ | $R^{D9}$ | $R^{D1}$ |
| $L_{B1011}$ | $R^{D22}$ | $R^{D10}$ | $R^{D1}$ |
| $L_{B1012}$ | $R^{D22}$ | $R^{D12}$ | $R^{D1}$ |
| $L_{B1013}$ | $R^{D22}$ | $R^{D15}$ | $R^{D1}$ |
| $L_{B1014}$ | $R^{D22}$ | $R^{D16}$ | $R^{D1}$ |
| $L_{B1015}$ | $R^{D22}$ | $R^{D17}$ | $R^{D1}$ |
| $L_{B1016}$ | $R^{D22}$ | $R^{D18}$ | $R^{D1}$ |
| $L_{B1017}$ | $R^{D22}$ | $R^{D19}$ | $R^{D1}$ |

-continued

| Ligand | $R^1$ | $R^2$ | $R^3$ |
|---|---|---|---|
| $L_{B1018}$ | $R^{D22}$ | $R^{D20}$ | $R^{D1}$ |
| $L_{B1019}$ | $R^{D22}$ | $R^{D21}$ | $R^{D1}$ |
| $L_{B1020}$ | $R^{D22}$ | $R^{D23}$ | $R^{D1}$ |
| $L_{B1021}$ | $R^{D22}$ | $R^{D24}$ | $R^{D1}$ |
| $L_{B1022}$ | $R^{D22}$ | $R^{D25}$ | $R^{D1}$ |
| $L_{B1023}$ | $R^{D22}$ | $R^{D26}$ | $R^{D1}$ |
| $L_{B1024}$ | $R^{D22}$ | $R^{D27}$ | $R^{D1}$ |
| $L_{B1025}$ | $R^{D22}$ | $R^{D28}$ | $R^{D1}$ |
| $L_{B1026}$ | $R^{D22}$ | $R^{D29}$ | $R^{D1}$ |
| $L_{B1027}$ | $R^{D22}$ | $R^{D30}$ | $R^{D1}$ |
| $L_{B1028}$ | $R^{D22}$ | $R^{D31}$ | $R^{D1}$ |
| $L_{B1029}$ | $R^{D22}$ | $R^{D32}$ | $R^{D1}$ |
| $L_{B1030}$ | $R^{D22}$ | $R^{D33}$ | $R^{D1}$ |
| $L_{B1031}$ | $R^{D22}$ | $R^{D34}$ | $R^{D1}$ |
| $L_{B1032}$ | $R^{D22}$ | $R^{D35}$ | $R^{D1}$ |
| $L_{B1033}$ | $R^{D22}$ | $R^{D40}$ | $R^{D1}$ |
| $L_{B1034}$ | $R^{D22}$ | $R^{D41}$ | $R^{D1}$ |
| $L_{B1035}$ | $R^{D22}$ | $R^{D42}$ | $R^{D1}$ |
| $L_{B1036}$ | $R^{D22}$ | $R^{D64}$ | $R^{D1}$ |
| $L_{B1037}$ | $R^{D22}$ | $R^{D66}$ | $R^{D1}$ |
| $L_{B1038}$ | $R^{D22}$ | $R^{D68}$ | $R^{D1}$ |
| $L_{B1039}$ | $R^{D22}$ | $R^{D76}$ | $R^{D1}$ |
| $L_{B1040}$ | $R^{D26}$ | $R^{D5}$ | $R^{D1}$ |
| $L_{B1041}$ | $R^{D26}$ | $R^{D6}$ | $R^{D1}$ |
| $L_{B1042}$ | $R^{D26}$ | $R^{D9}$ | $R^{D1}$ |
| $L_{B1043}$ | $R^{D26}$ | $R^{D10}$ | $R^{D1}$ |
| $L_{B1044}$ | $R^{D26}$ | $R^{D12}$ | $R^{D1}$ |
| $L_{B1045}$ | $R^{D26}$ | $R^{D15}$ | $R^{D1}$ |
| $L_{B1046}$ | $R^{D26}$ | $R^{D16}$ | $R^{D1}$ |
| $L_{B1047}$ | $R^{D26}$ | $R^{D17}$ | $R^{D1}$ |
| $L_{B1048}$ | $R^{D26}$ | $R^{D18}$ | $R^{D1}$ |
| $L_{B1049}$ | $R^{D26}$ | $R^{D19}$ | $R^{D1}$ |
| $L_{B1050}$ | $R^{D26}$ | $R^{D20}$ | $R^{D1}$ |
| $L_{B1051}$ | $R^{D26}$ | $R^{D21}$ | $R^{D1}$ |
| $L_{B1052}$ | $R^{D26}$ | $R^{D23}$ | $R^{D1}$ |
| $L_{B1053}$ | $R^{D26}$ | $R^{D24}$ | $R^{D1}$ |
| $L_{B1054}$ | $R^{D26}$ | $R^{D25}$ | $R^{D1}$ |
| $L_{B1055}$ | $R^{D26}$ | $R^{D27}$ | $R^{D1}$ |
| $L_{B1056}$ | $R^{D26}$ | $R^{D28}$ | $R^{D1}$ |
| $L_{B1057}$ | $R^{D26}$ | $R^{D29}$ | $R^{D1}$ |
| $L_{B1058}$ | $R^{D26}$ | $R^{D30}$ | $R^{D1}$ |
| $L_{B1059}$ | $R^{D26}$ | $R^{D31}$ | $R^{D1}$ |
| $L_{B1060}$ | $R^{D26}$ | $R^{D32}$ | $R^{D1}$ |
| $L_{B1061}$ | $R^{D26}$ | $R^{D33}$ | $R^{D1}$ |
| $L_{B1062}$ | $R^{D26}$ | $R^{D34}$ | $R^{D1}$ |
| $L_{B1063}$ | $R^{D26}$ | $R^{D35}$ | $R^{D1}$ |
| $L_{B1064}$ | $R^{D26}$ | $R^{D40}$ | $R^{D1}$ |
| $L_{B1065}$ | $R^{D26}$ | $R^{D41}$ | $R^{D1}$ |
| $L_{B1066}$ | $R^{D26}$ | $R^{D42}$ | $R^{D1}$ |
| $L_{B1067}$ | $R^{D26}$ | $R^{D64}$ | $R^{D1}$ |
| $L_{B1068}$ | $R^{D26}$ | $R^{D66}$ | $R^{D1}$ |
| $L_{B1069}$ | $R^{D26}$ | $R^{D68}$ | $R^{D1}$ |
| $L_{B1070}$ | $R^{D26}$ | $R^{D76}$ | $R^{D1}$ |
| $L_{B1071}$ | $R^{D35}$ | $R^{D5}$ | $R^{D1}$ |
| $L_{B1072}$ | $R^{D35}$ | $R^{D6}$ | $R^{D1}$ |
| $L_{B1073}$ | $R^{D35}$ | $R^{D9}$ | $R^{D1}$ |
| $L_{B1074}$ | $R^{D35}$ | $R^{D10}$ | $R^{D1}$ |
| $L_{B1075}$ | $R^{D35}$ | $R^{D12}$ | $R^{D1}$ |
| $L_{B1076}$ | $R^{D35}$ | $R^{D15}$ | $R^{D1}$ |
| $L_{B1077}$ | $R^{D35}$ | $R^{D16}$ | $R^{D1}$ |
| $L_{B1078}$ | $R^{D35}$ | $R^{D17}$ | $R^{D1}$ |
| $L_{B1079}$ | $R^{D35}$ | $R^{D18}$ | $R^{D1}$ |
| $L_{B1080}$ | $R^{D35}$ | $R^{D19}$ | $R^{D1}$ |
| $L_{B1081}$ | $R^{D35}$ | $R^{D20}$ | $R^{D1}$ |
| $L_{B1082}$ | $R^{D35}$ | $R^{D21}$ | $R^{D1}$ |
| $L_{B1083}$ | $R^{D35}$ | $R^{D23}$ | $R^{D1}$ |
| $L_{B1084}$ | $R^{D35}$ | $R^{D24}$ | $R^{D1}$ |
| $L_{B1085}$ | $R^{D35}$ | $R^{D25}$ | $R^{D1}$ |
| $L_{B1086}$ | $R^{D35}$ | $R^{D27}$ | $R^{D1}$ |
| $L_{B1087}$ | $R^{D35}$ | $R^{D28}$ | $R^{D1}$ |
| $L_{B1088}$ | $R^{D35}$ | $R^{D29}$ | $R^{D1}$ |
| $L_{B1089}$ | $R^{D35}$ | $R^{D30}$ | $R^{D1}$ |
| $L_{B1090}$ | $R^{D35}$ | $R^{D31}$ | $R^{D1}$ |
| $L_{B1091}$ | $R^{D35}$ | $R^{D32}$ | $R^{D1}$ |
| $L_{B1092}$ | $R^{D35}$ | $R^{D33}$ | $R^{D1}$ |
| $L_{B1093}$ | $R^{D35}$ | $R^{D34}$ | $R^{D1}$ |
| $L_{B1094}$ | $R^{D35}$ | $R^{D40}$ | $R^{D1}$ |

-continued

| Ligand | $R^1$ | $R^2$ | $R^3$ |
|---|---|---|---|
| $L_{B1095}$ | $R^{D35}$ | $R^{D41}$ | $R^{D1}$ |
| $L_{B1096}$ | $R^{D35}$ | $R^{D42}$ | $R^{D1}$ |
| $L_{B1097}$ | $R^{D35}$ | $R^{D64}$ | $R^{D1}$ |
| $L_{B1098}$ | $R^{D35}$ | $R^{D66}$ | $R^{D1}$ |
| $L_{B1099}$ | $R^{D35}$ | $R^{D68}$ | $R^{D1}$ |
| $L_{B1100}$ | $R^{D35}$ | $R^{D76}$ | $R^{D1}$ |
| $L_{B1101}$ | $R^{D40}$ | $R^{D5}$ | $R^{D1}$ |
| $L_{B1102}$ | $R^{D40}$ | $R^{D6}$ | $R^{D1}$ |
| $L_{B1103}$ | $R^{D40}$ | $R^{D9}$ | $R^{D1}$ |
| $L_{B1104}$ | $R^{D40}$ | $R^{D10}$ | $R^{D1}$ |
| $L_{B1105}$ | $R^{D40}$ | $R^{D12}$ | $R^{D1}$ |
| $L_{B1106}$ | $R^{D40}$ | $R^{D15}$ | $R^{D1}$ |
| $L_{B1107}$ | $R^{D40}$ | $R^{D16}$ | $R^{D1}$ |
| $L_{B1108}$ | $R^{D40}$ | $R^{D17}$ | $R^{D1}$ |
| $L_{B1109}$ | $R^{D40}$ | $R^{D18}$ | $R^{D1}$ |
| $L_{B1110}$ | $R^{D40}$ | $R^{D19}$ | $R^{D1}$ |
| $L_{B1111}$ | $R^{D40}$ | $R^{D20}$ | $R^{D1}$ |
| $L_{B1112}$ | $R^{D40}$ | $R^{D21}$ | $R^{D1}$ |
| $L_{B1113}$ | $R^{D40}$ | $R^{D23}$ | $R^{D1}$ |
| $L_{B1114}$ | $R^{D40}$ | $R^{D24}$ | $R^{D1}$ |
| $L_{B1115}$ | $R^{D40}$ | $R^{D25}$ | $R^{D1}$ |
| $L_{B1116}$ | $R^{D40}$ | $R^{D27}$ | $R^{D1}$ |
| $L_{B1117}$ | $R^{D40}$ | $R^{D28}$ | $R^{D1}$ |
| $L_{B1118}$ | $R^{D40}$ | $R^{D29}$ | $R^{D1}$ |
| $L_{B1119}$ | $R^{D40}$ | $R^{D30}$ | $R^{D1}$ |
| $L_{B1120}$ | $R^{D40}$ | $R^{D31}$ | $R^{D1}$ |
| $L_{B1121}$ | $R^{D40}$ | $R^{D32}$ | $R^{D1}$ |
| $L_{B1122}$ | $R^{D40}$ | $R^{D33}$ | $R^{D1}$ |
| $L_{B1123}$ | $R^{D40}$ | $R^{D34}$ | $R^{D1}$ |
| $L_{B1124}$ | $R^{D40}$ | $R^{D41}$ | $R^{D1}$ |
| $L_{B1125}$ | $R^{D40}$ | $R^{D42}$ | $R^{D1}$ |
| $L_{B1126}$ | $R^{D40}$ | $R^{D64}$ | $R^{D1}$ |
| $L_{B1127}$ | $R^{D40}$ | $R^{D66}$ | $R^{D1}$ |
| $L_{B1128}$ | $R^{D40}$ | $R^{D68}$ | $R^{D1}$ |
| $L_{B1129}$ | $R^{D40}$ | $R^{D76}$ | $R^{D1}$ |
| $L_{B1130}$ | $R^{D41}$ | $R^{D5}$ | $R^{D1}$ |
| $L_{B1131}$ | $R^{D41}$ | $R^{D6}$ | $R^{D1}$ |
| $L_{B1132}$ | $R^{D41}$ | $R^{D9}$ | $R^{D1}$ |
| $L_{B1133}$ | $R^{D41}$ | $R^{D10}$ | $R^{D1}$ |
| $L_{B1134}$ | $R^{D41}$ | $R^{D12}$ | $R^{D1}$ |
| $L_{B1135}$ | $R^{D41}$ | $R^{D15}$ | $R^{D1}$ |
| $L_{B1136}$ | $R^{D41}$ | $R^{D16}$ | $R^{D1}$ |
| $L_{B1137}$ | $R^{D41}$ | $R^{D17}$ | $R^{D1}$ |
| $L_{B1138}$ | $R^{D41}$ | $R^{D18}$ | $R^{D1}$ |
| $L_{B1139}$ | $R^{D41}$ | $R^{D19}$ | $R^{D1}$ |
| $L_{B1140}$ | $R^{D41}$ | $R^{D20}$ | $R^{D1}$ |
| $L_{B1141}$ | $R^{D41}$ | $R^{D21}$ | $R^{D1}$ |
| $L_{B1142}$ | $R^{D41}$ | $R^{D23}$ | $R^{D1}$ |
| $L_{B1143}$ | $R^{D41}$ | $R^{D24}$ | $R^{D1}$ |
| $L_{B1144}$ | $R^{D41}$ | $R^{D25}$ | $R^{D1}$ |
| $L_{B1145}$ | $R^{D41}$ | $R^{D27}$ | $R^{D1}$ |
| $L_{B1146}$ | $R^{D41}$ | $R^{D28}$ | $R^{D1}$ |
| $L_{B1147}$ | $R^{D41}$ | $R^{D29}$ | $R^{D1}$ |
| $L_{B1148}$ | $R^{D41}$ | $R^{D30}$ | $R^{D1}$ |
| $L_{B1149}$ | $R^{D41}$ | $R^{D31}$ | $R^{D1}$ |
| $L_{B1150}$ | $R^{D41}$ | $R^{D32}$ | $R^{D1}$ |
| $L_{B1151}$ | $R^{D41}$ | $R^{D33}$ | $R^{D1}$ |
| $L_{B1152}$ | $R^{D41}$ | $R^{D34}$ | $R^{D1}$ |
| $L_{B1153}$ | $R^{D41}$ | $R^{D42}$ | $R^{D1}$ |
| $L_{B1154}$ | $R^{D41}$ | $R^{D64}$ | $R^{D1}$ |
| $L_{B1155}$ | $R^{D41}$ | $R^{D66}$ | $R^{D1}$ |
| $L_{B1156}$ | $R^{D41}$ | $R^{D68}$ | $R^{D1}$ |
| $L_{B1157}$ | $R^{D41}$ | $R^{D76}$ | $R^{D1}$ |
| $L_{B1158}$ | $R^{D64}$ | $R^{D5}$ | $R^{D1}$ |
| $L_{B1159}$ | $R^{D64}$ | $R^{D6}$ | $R^{D1}$ |
| $L_{B1160}$ | $R^{D64}$ | $R^{D9}$ | $R^{D1}$ |
| $L_{B1161}$ | $R^{D64}$ | $R^{D10}$ | $R^{D1}$ |
| $L_{B1162}$ | $R^{D64}$ | $R^{D12}$ | $R^{D1}$ |
| $L_{B1163}$ | $R^{D64}$ | $R^{D15}$ | $R^{D1}$ |
| $L_{B1164}$ | $R^{D64}$ | $R^{D16}$ | $R^{D1}$ |
| $L_{B1165}$ | $R^{D64}$ | $R^{D17}$ | $R^{D1}$ |
| $L_{B1166}$ | $R^{D64}$ | $R^{D18}$ | $R^{D1}$ |
| $L_{B1167}$ | $R^{D64}$ | $R^{D19}$ | $R^{D1}$ |
| $L_{B1168}$ | $R^{D64}$ | $R^{D20}$ | $R^{D1}$ |
| $L_{B1169}$ | $R^{D64}$ | $R^{D21}$ | $R^{D1}$ |
| $L_{B1170}$ | $R^{D64}$ | $R^{D23}$ | $R^{D1}$ |
| $L_{B1171}$ | $R^{D64}$ | $R^{D24}$ | $R^{D1}$ |

-continued

| Ligand | $R^1$ | $R^2$ | $R^3$ |
|---|---|---|---|
| $L_{B1172}$ | $R^{D64}$ | $R^{D25}$ | $R^{D1}$ |
| $L_{B1173}$ | $R^{D64}$ | $R^{D27}$ | $R^{D1}$ |
| $L_{B1174}$ | $R^{D64}$ | $R^{D28}$ | $R^{D1}$ |
| $L_{B1175}$ | $R^{D64}$ | $R^{D29}$ | $R^{D1}$ |
| $L_{B1176}$ | $R^{D64}$ | $R^{D30}$ | $R^{D1}$ |
| $L_{B1177}$ | $R^{D64}$ | $R^{D31}$ | $R^{D1}$ |
| $L_{B1178}$ | $R^{D64}$ | $R^{D32}$ | $R^{D1}$ |
| $L_{B1179}$ | $R^{D64}$ | $R^{D33}$ | $R^{D1}$ |
| $L_{B1180}$ | $R^{D64}$ | $R^{D34}$ | $R^{D1}$ |
| $L_{B1181}$ | $R^{D64}$ | $R^{D42}$ | $R^{D1}$ |
| $L_{B1182}$ | $R^{D64}$ | $R^{D64}$ | $R^{D1}$ |
| $L_{B1183}$ | $R^{D64}$ | $R^{D66}$ | $R^{D1}$ |
| $L_{B1184}$ | $R^{D64}$ | $R^{D68}$ | $R^{D1}$ |
| $L_{B1185}$ | $R^{D64}$ | $R^{D76}$ | $R^{D1}$ |
| $L_{B1186}$ | $R^{D66}$ | $R^{D5}$ | $R^{D1}$ |
| $L_{B1187}$ | $R^{D66}$ | $R^{D6}$ | $R^{D1}$ |
| $L_{B1188}$ | $R^{D66}$ | $R^{D9}$ | $R^{D1}$ |
| $L_{B1189}$ | $R^{D66}$ | $R^{D10}$ | $R^{D1}$ |
| $L_{B1190}$ | $R^{D66}$ | $R^{D12}$ | $R^{D1}$ |
| $L_{B1191}$ | $R^{D66}$ | $R^{D15}$ | $R^{D1}$ |
| $L_{B1192}$ | $R^{D66}$ | $R^{D16}$ | $R^{D1}$ |
| $L_{B1193}$ | $R^{D66}$ | $R^{D17}$ | $R^{D1}$ |
| $L_{B1194}$ | $R^{D66}$ | $R^{D18}$ | $R^{D1}$ |
| $L_{B1195}$ | $R^{D66}$ | $R^{D19}$ | $R^{D1}$ |
| $L_{B1196}$ | $R^{D66}$ | $R^{D20}$ | $R^{D1}$ |
| $L_{B1197}$ | $R^{D66}$ | $R^{D21}$ | $R^{D1}$ |
| $L_{B1198}$ | $R^{D66}$ | $R^{D23}$ | $R^{D1}$ |
| $L_{B1199}$ | $R^{D66}$ | $R^{D24}$ | $R^{D1}$ |
| $L_{B1200}$ | $R^{D66}$ | $R^{D25}$ | $R^{D1}$ |
| $L_{B1201}$ | $R^{D66}$ | $R^{D27}$ | $R^{D1}$ |
| $L_{B1202}$ | $R^{D66}$ | $R^{D28}$ | $R^{D1}$ |
| $L_{B1203}$ | $R^{D66}$ | $R^{D29}$ | $R^{D1}$ |
| $L_{B1204}$ | $R^{D66}$ | $R^{D30}$ | $R^{D1}$ |
| $L_{B1205}$ | $R^{D66}$ | $R^{D31}$ | $R^{D1}$ |
| $L_{B1206}$ | $R^{D66}$ | $R^{D32}$ | $R^{D1}$ |
| $L_{B1207}$ | $R^{D66}$ | $R^{D33}$ | $R^{D1}$ |
| $L_{B1208}$ | $R^{D66}$ | $R^{D34}$ | $R^{D1}$ |
| $L_{B1209}$ | $R^{D66}$ | $R^{D42}$ | $R^{D1}$ |
| $L_{B1210}$ | $R^{D66}$ | $R^{D68}$ | $R^{D1}$ |
| $L_{B1211}$ | $R^{D66}$ | $R^{D76}$ | $R^{D1}$ |
| $L_{B1212}$ | $R^{D68}$ | $R^{D5}$ | $R^{D1}$ |
| $L_{B1213}$ | $R^{D68}$ | $R^{D6}$ | $R^{D1}$ |
| $L_{B1214}$ | $R^{D68}$ | $R^{D9}$ | $R^{D1}$ |
| $L_{B1215}$ | $R^{D68}$ | $R^{D10}$ | $R^{D1}$ |
| $L_{B1216}$ | $R^{D68}$ | $R^{D12}$ | $R^{D1}$ |
| $L_{B1217}$ | $R^{D68}$ | $R^{D15}$ | $R^{D1}$ |
| $L_{B1218}$ | $R^{D68}$ | $R^{D16}$ | $R^{D1}$ |
| $L_{B1219}$ | $R^{D68}$ | $R^{D17}$ | $R^{D1}$ |
| $L_{B1220}$ | $R^{D68}$ | $R^{D18}$ | $R^{D1}$ |
| $L_{B1221}$ | $R^{D68}$ | $R^{D19}$ | $R^{D1}$ |
| $L_{B1222}$ | $R^{D68}$ | $R^{D20}$ | $R^{D1}$ |
| $L_{B1223}$ | $R^{D68}$ | $R^{D21}$ | $R^{D1}$ |
| $L_{B1224}$ | $R^{D68}$ | $R^{D23}$ | $R^{D1}$ |
| $L_{B1225}$ | $R^{D68}$ | $R^{D24}$ | $R^{D1}$ |
| $L_{B1226}$ | $R^{D68}$ | $R^{D25}$ | $R^{D1}$ |
| $L_{B1227}$ | $R^{D68}$ | $R^{D27}$ | $R^{D1}$ |
| $L_{B1228}$ | $R^{D68}$ | $R^{D28}$ | $R^{D1}$ |
| $L_{B1229}$ | $R^{D68}$ | $R^{D29}$ | $R^{D1}$ |
| $L_{B1230}$ | $R^{D68}$ | $R^{D30}$ | $R^{D1}$ |
| $L_{B1231}$ | $R^{D68}$ | $R^{D31}$ | $R^{D1}$ |
| $L_{B1232}$ | $R^{D68}$ | $R^{D32}$ | $R^{D1}$ |
| $L_{B1233}$ | $R^{D68}$ | $R^{D33}$ | $R^{D1}$ |
| $L_{B1234}$ | $R^{D68}$ | $R^{D34}$ | $R^{D1}$ |
| $L_{B1235}$ | $R^{D68}$ | $R^{D42}$ | $R^{D1}$ |
| $L_{B1236}$ | $R^{D68}$ | $R^{D76}$ | $R^{D1}$ |
| $L_{B1237}$ | $R^{D76}$ | $R^{D5}$ | $R^{D1}$ |
| $L_{B1238}$ | $R^{D76}$ | $R^{D6}$ | $R^{D1}$ |
| $L_{B1239}$ | $R^{D76}$ | $R^{D9}$ | $R^{D1}$ |
| $L_{B1240}$ | $R^{D76}$ | $R^{D10}$ | $R^{D1}$ |
| $L_{B1241}$ | $R^{D76}$ | $R^{D12}$ | $R^{D1}$ |
| $L_{B1242}$ | $R^{D76}$ | $R^{D15}$ | $R^{D1}$ |
| $L_{B1243}$ | $R^{D76}$ | $R^{D16}$ | $R^{D1}$ |
| $L_{B1244}$ | $R^{D76}$ | $R^{D17}$ | $R^{D1}$ |
| $L_{B1245}$ | $R^{D76}$ | $R^{D18}$ | $R^{D1}$ |
| $L_{B1246}$ | $R^{D76}$ | $R^{D19}$ | $R^{D1}$ |
| $L_{B1247}$ | $R^{D76}$ | $R^{D20}$ | $R^{D1}$ |
| $L_{B1248}$ | $R^{D76}$ | $R^{D21}$ | $R^{D1}$ |
| $L_{B1249}$ | $R^{D76}$ | $R^{D23}$ | $R^{D1}$ |
| $L_{B1250}$ | $R^{D76}$ | $R^{D24}$ | $R^{D1}$ |
| $L_{B1251}$ | $R^{D76}$ | $R^{D25}$ | $R^{D1}$ |
| $L_{B1252}$ | $R^{D76}$ | $R^{D27}$ | $R^{D1}$ |
| $L_{B1253}$ | $R^{D76}$ | $R^{D28}$ | $R^{D1}$ |
| $L_{B1254}$ | $R^{D76}$ | $R^{D29}$ | $R^{D1}$ |
| $L_{B1255}$ | $R^{D76}$ | $R^{D30}$ | $R^{D1}$ |
| $L_{B1256}$ | $R^{D76}$ | $R^{D31}$ | $R^{D1}$ |
| $L_{B1257}$ | $R^{D76}$ | $R^{D32}$ | $R^{D1}$ |
| $L_{B1258}$ | $R^{D76}$ | $R^{D33}$ | $R^{D1}$ |
| $L_{B1259}$ | $R^{D76}$ | $R^{D34}$ | $R^{D1}$ |
| $L_{B1260}$ | $R^{D76}$ | $R^{D42}$ | $R^{D1}$ |

wherein $R^{D1}$ to $R^{D81}$ has the following structures:

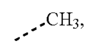

$R^{D1}$

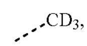

$R^{D2}$

$R^{D3}$

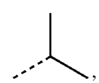
$R^{D4}$

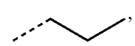
$R^{D5}$

$R^{D6}$

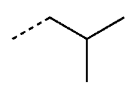
$R^{D7}$

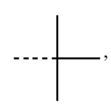
$R^{D8}$

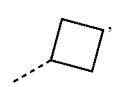
$R^{D9}$

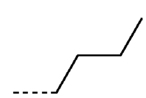
$R^{D10}$

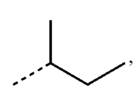
$R^{D11}$

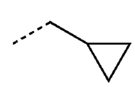
$R^{D12}$

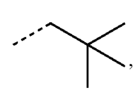
$R^{D13}$

-continued
$R^{D14}$
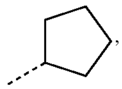
$R^{D15}$
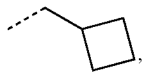
$R^{D16}$
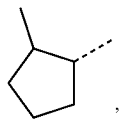
$R^{D17}$
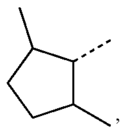
$R^{D18}$
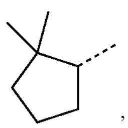
$R^{D19}$
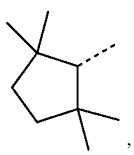
$R^{D20}$
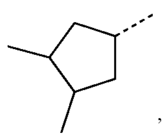
$R^{D21}$
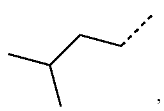
$R^{D22}$
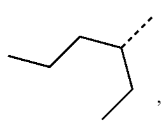
$R^{D23}$
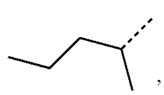
$R^{D24}$
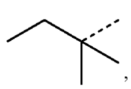
$R^{D25}$
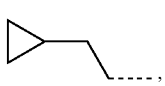
$R^{D26}$
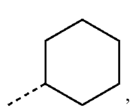
-continued
$R^{D27}$
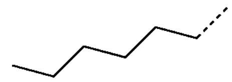
$R^{D28}$
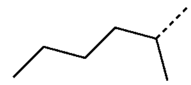
$R^{D29}$
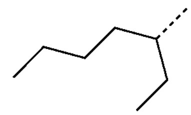
$R^{D30}$
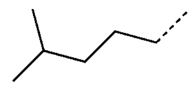
$R^{D31}$
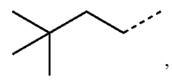
$R^{D32}$
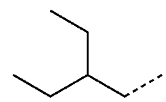
$R^{D33}$
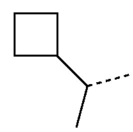
$R^{D34}$
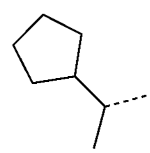
$R^{D35}$
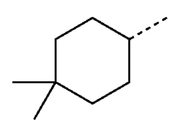
$R^{D36}$
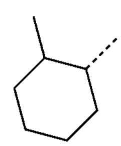
$R^{D37}$
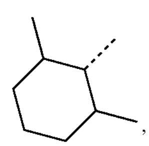
$R^{D38}$
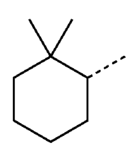

-continued
$R^{D39}$
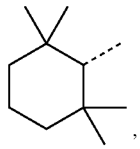
$R^{D40}$
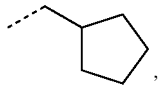
$R^{D41}$
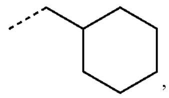
$R^{D42}$
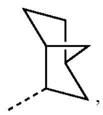
$R^{D43}$
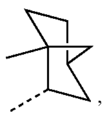
$R^{D44}$
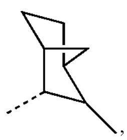
$R^{D45}$
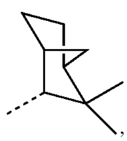
$R^{D46}$
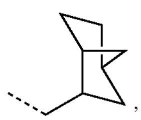
$R^{D47}$
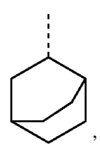
$R^{D48}$
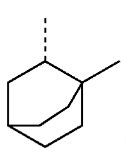
$R^{D49}$
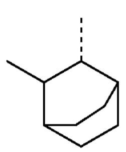
-continued
$R^{D50}$
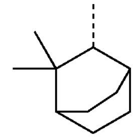
$R^{D51}$
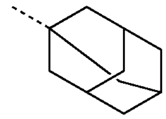
$R^{D52}$
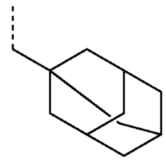
$R^{D53}$
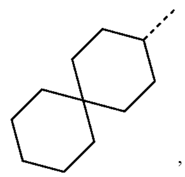
$R^{D54}$
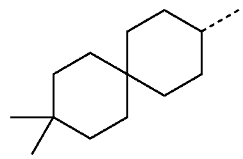
$R^{D55}$
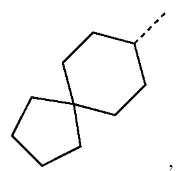
$R^{D56}$
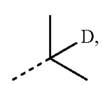
$R^{D57}$
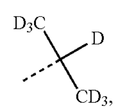
$R^{D58}$
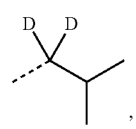
$R^{D59}$
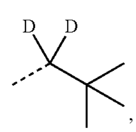
$R^{D60}$
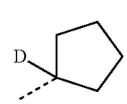

-continued $R^{D61}$

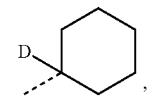

$R^{D62}$

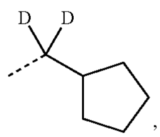

$R^{D63}$

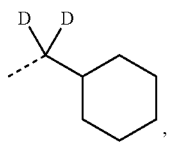

$R^{D64}$

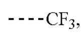

$R^{D65}$

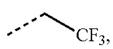

$R^{D66}$

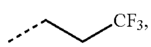

$R^{D67}$

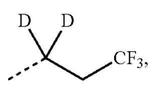

$R^{D68}$

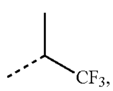

$R^{D69}$

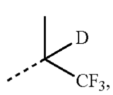

$R^{D70}$

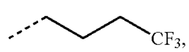

$R^{D71}$

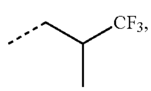

$R^{D72}$

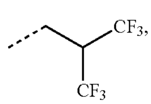

$R^{D73}$

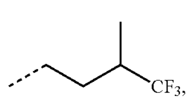

$R^{D74}$

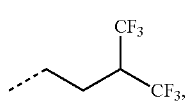

$R^{D75}$

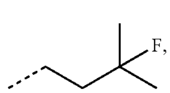

$R^{D76}$

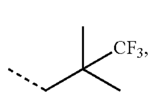

-continued $R^{D77}$

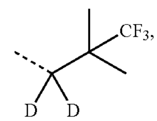

$R^{D78}$

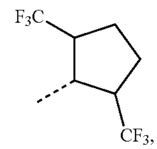

$R^{D79}$

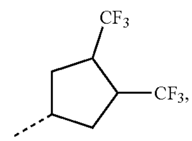

$R^{D80}$

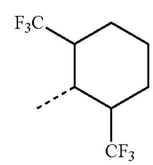

, and $R^{D81}$

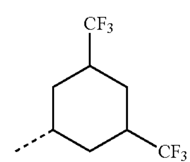

According to another aspect, a formulation comprising the compound comprising a ligand $L_A$ of Formula I is disclosed.

According to another aspect, a first device comprising a first OLED is disclosed. The first OLED comprising: an anode; a cathode; and an organic layer, disposed between the anode and the cathode, comprising a compound comprising a ligand $L_A$ of Formula I:

Formula I

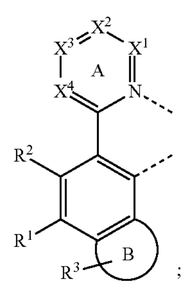

;

where Ring B represents a five- or six-membered aromatic ring;

$R^3$ represents from none to the maximum number of substitutions; $X^1$, $X^2$, $X^3$, and $X^4$ are each independently a CR or N; wherein:

(1) at least two adjacent ones of $X^1$, $X^2$, $X^3$, and $X^4$ are CR and fused into a five or six-membered aromatic ring, or (2) at least one of $X^1$, $X^2$, $X^3$, and $X^4$ is nitrogen, or (3) both (1) and (2) are true;

wherein (a) $R^1$ is $CR^{11}R^{12}R^{13}$ or join with $R^2$ to form into a ring; or (b) $R^2$ is not hydrogen; or (c) both (a) and (b) are true;

wherein R, $R^2$, $R^3$, $R^{11}$, $R^{12}$, and $R^{13}$ are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

any two substituents among R, $R^1$, $R^2$, $R^3$, $R^{11}$, $R^{12}$, and $R^{13}$ are optionally joined to form into a ring;

$L_A$ is coordinated to a metal M;

$L_A$ is optionally linked with other ligands to comprise a tridentate, tetradentate, pentadentate, or hexadentate ligand; and M is optionally coordinated to other ligands.

In some embodiments of the first device, the organic layer further comprises a host, wherein host comprises at least one chemical group selected from the group consisting of carbazole, dibenzothiophene, dibenzofuran, dibenzoselenophene, azacarbazole, aza-dibenzothiophene, aza-dibenzofuran, and aza-dibenzoselenophene.

In some embodiments of the first device, the organic layer further comprises a host, wherein the host is selected from the Host Group A defined above.

In some embodiments of the first device, wherein the organic layer further comprises a host, wherein the host comprises a metal complex.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

According to another aspect, an emissive region in an OLED is disclosed where the emissive region comprising a compound comprising a ligand $L_A$ of Formula I:

Formula I

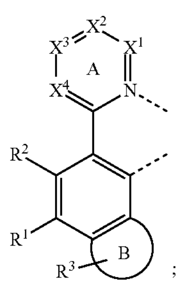

;

where Ring B represents a five- or six-membered aromatic ring;

$R^3$ represents from none to the maximum possible number of substitutions;

$X^1$, $X^2$, $X^3$, and $X^4$ are each independently a CR or N; wherein:

(1) at least two adjacent ones of $X^1$, $X^2$, $X^3$, and $X^4$ are CR and fused into a five or six-membered aromatic ring, or (2) at least one of $X^1$, $X^2$, $X^3$, and $X^4$ is nitrogen, or (3) both (1) and (2) are true;

wherein (a) $R^1$ is $CR^{11}R^{12}R^{13}$ or join with $R^2$ to form into a ring; or (b) $R^2$ is not hydrogen; or (c) both (a) and (b) are true;

wherein R, $R^1$, $R^2$, $R^3$, $R^{11}$, $R^{12}$, and $R^{13}$ are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

any two substituents among R, $R^1$, $R^2$, $R^3$, $R^{11}$, $R^{12}$, and $R^{13}$ are optionally joined to form into a ring;

$L_A$ is coordinated to a metal M;

$L_A$ is optionally linked with other ligands to comprise a tridentate, tetradentate, pentadentate, or hexadentate ligand; and M is optionally coordinated to other ligands.

In some embodiments of the emissive region, the compound is an emissive dopant or a non-emissive dopant.

In some embodiments of the emissive region, the emissive region further comprises a host, wherein the host comprises at least one selected from the group consisting of metal complex, triphenylene, carbazole, dibenzothiophene, dibenzofuran, dibenzoselenophene, aza-triphenylene, azacarbazole, aza-dibenzothiophene, aza-dibenzofuran, and aza-dibenzoselenophene.

In some embodiments of the emissive region, wherein the emissive region further comprises a host, wherein the host is selected from the following Host Group A consisting of:

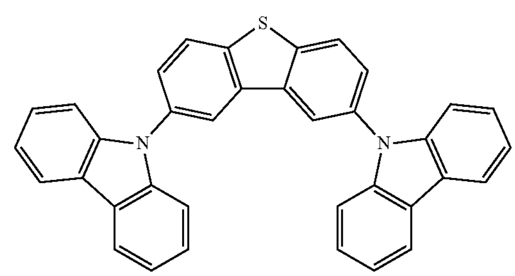

,

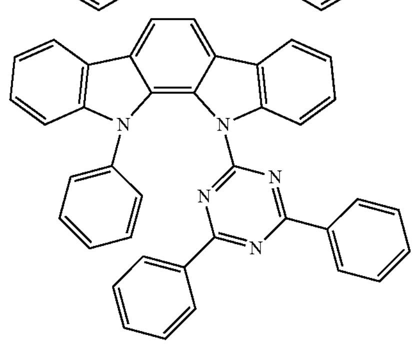

,

-continued
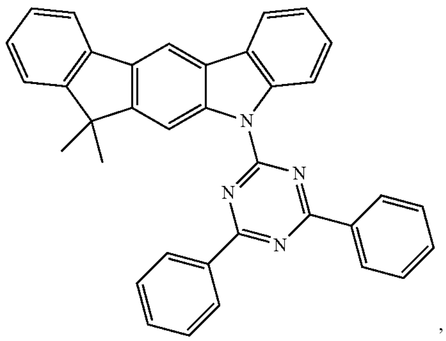
,
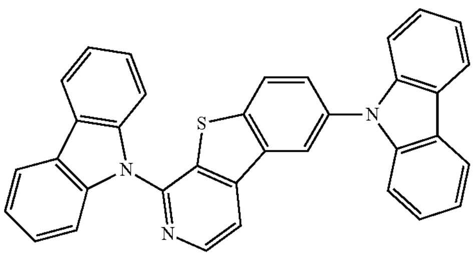
,
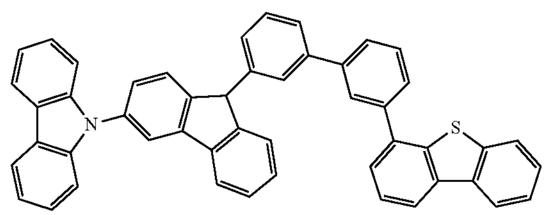
,
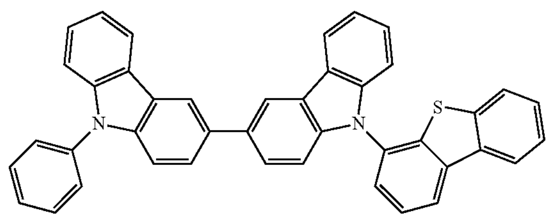
,
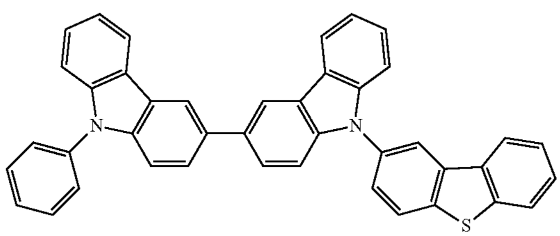
,
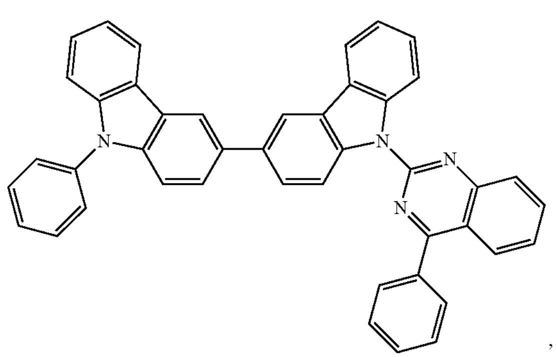
,
-continued
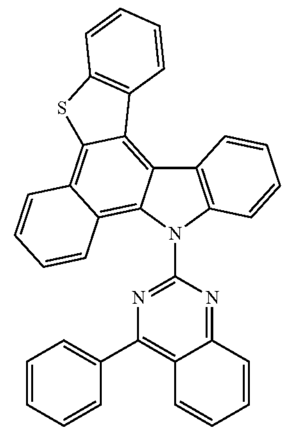
,
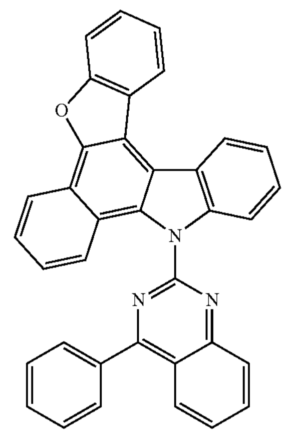
,
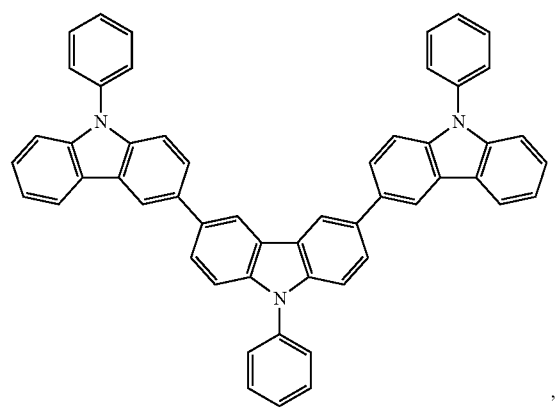
,
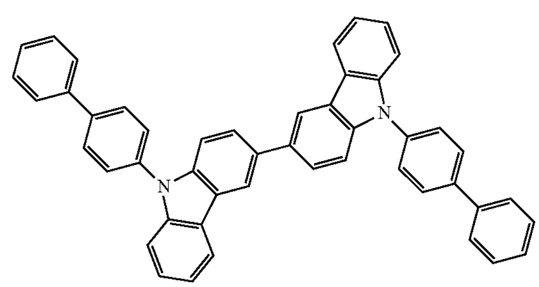
, -continued

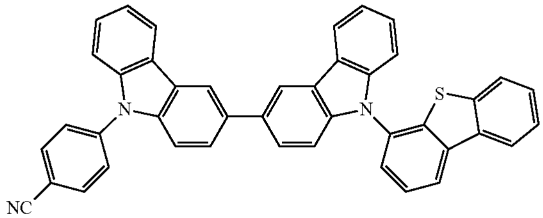
,

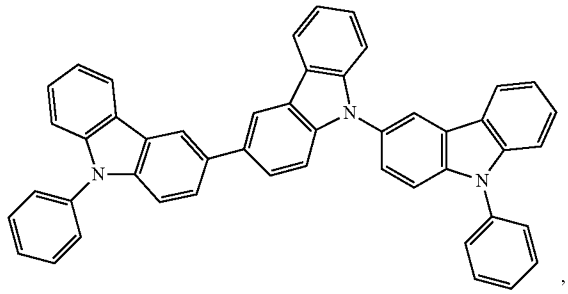
,

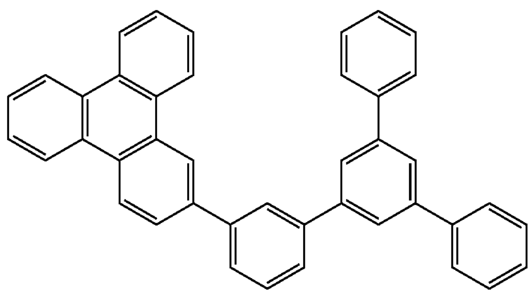
,

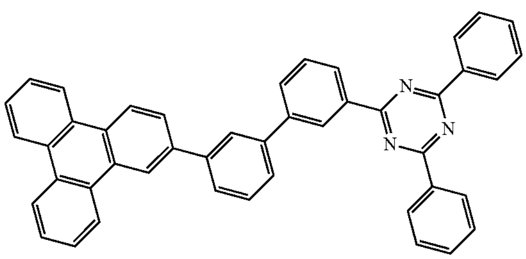
,

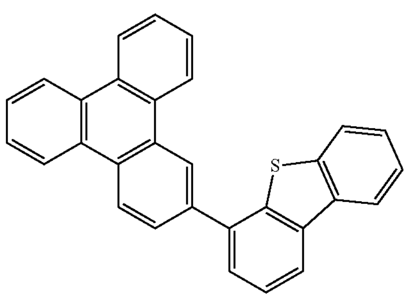
,

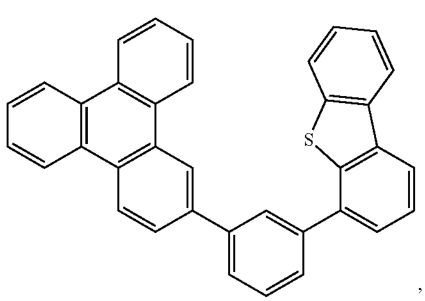
,

-continued

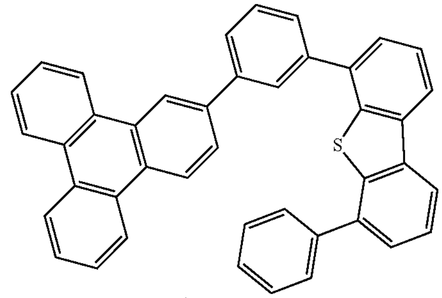
,

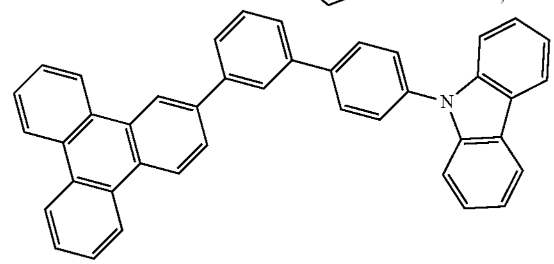
,

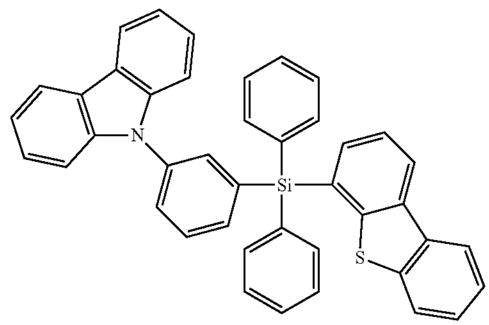
,

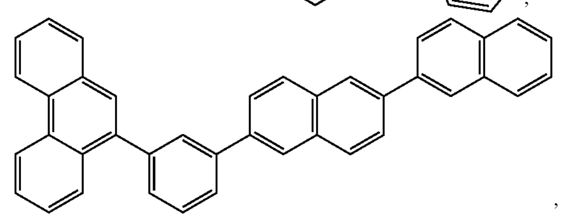
, and combinations thereof.

According to another aspect, a consumer product comprising the OLED that includes the compound of the present disclosure in the organic layer of the OLED is disclosed.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1$-$Ar_2$, and $C_nH_{2n}{-}Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

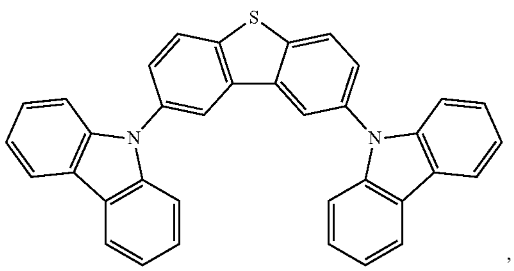
,

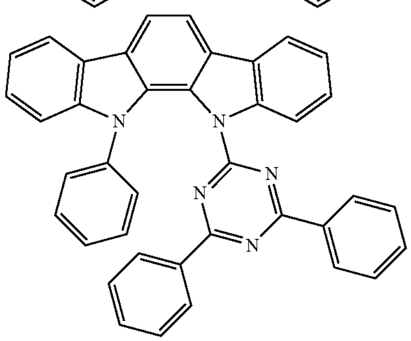
,

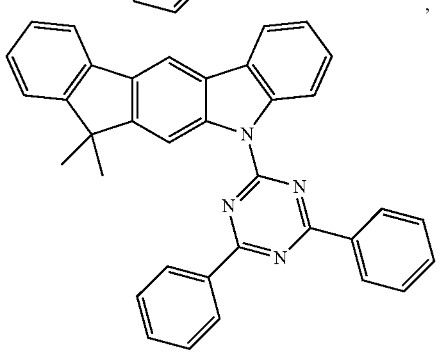
,

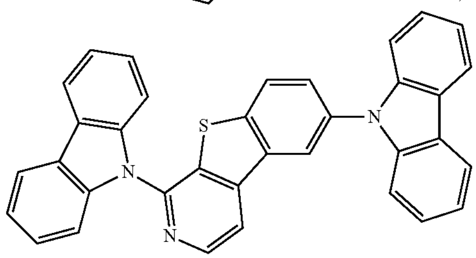
,

-continued

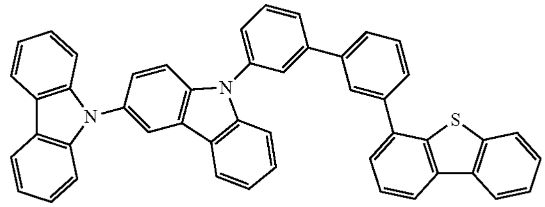
,

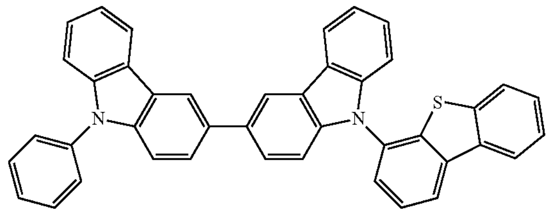
,

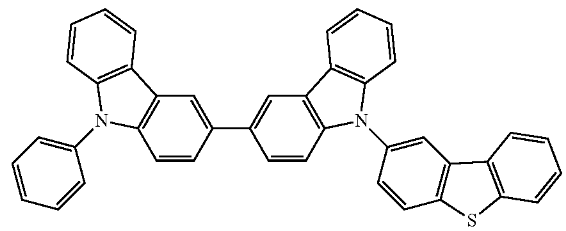
,

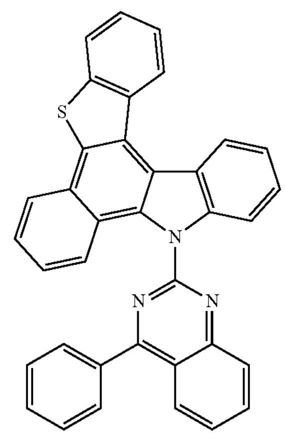
,

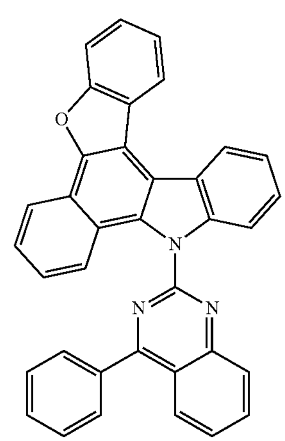
,

-continued
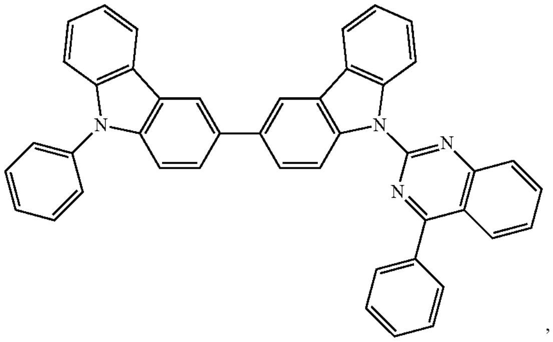
,
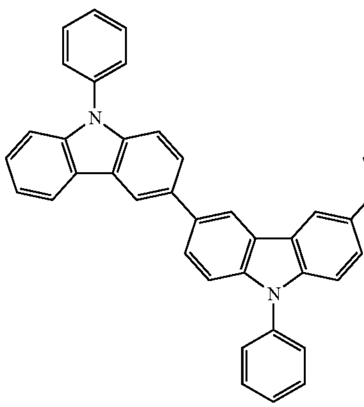
,
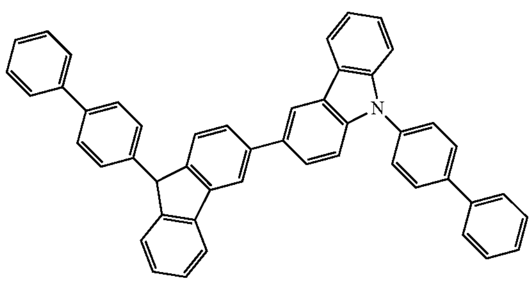
,
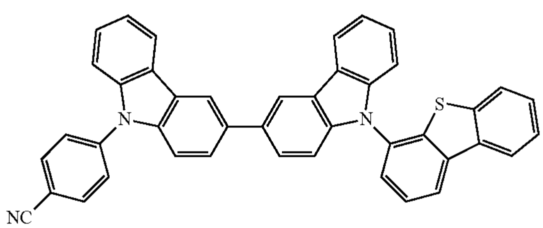
,
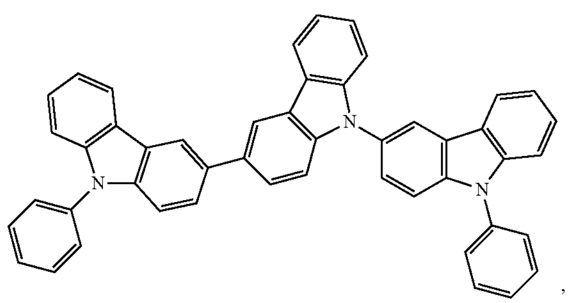
,
-continued
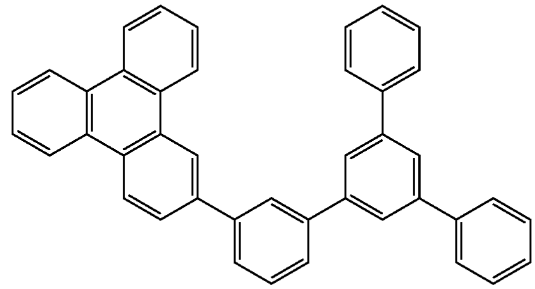
,
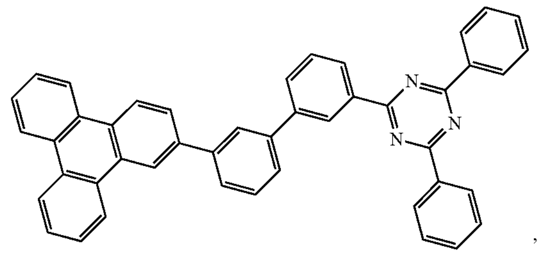
,
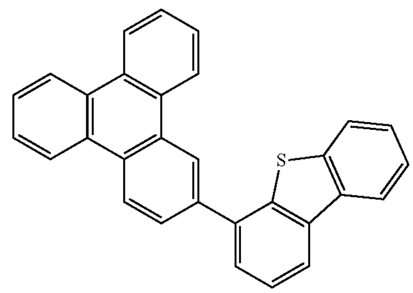
,
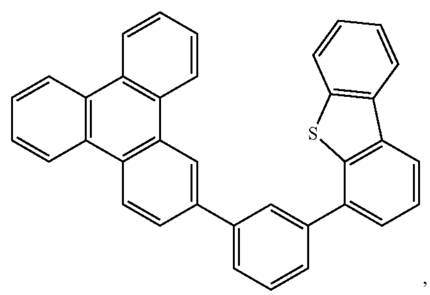
,
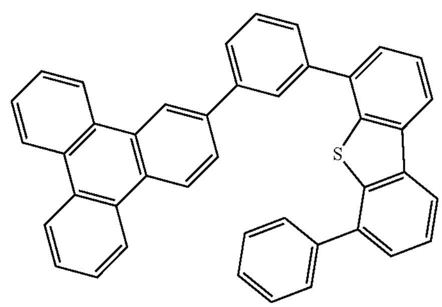
,
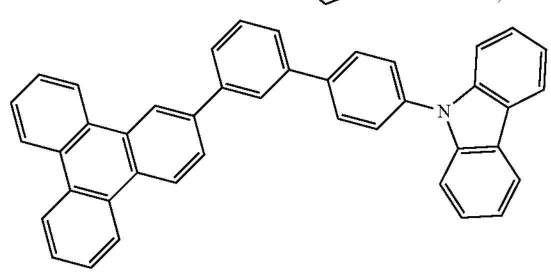
, -continued

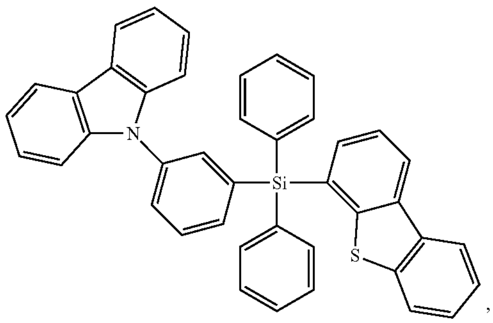

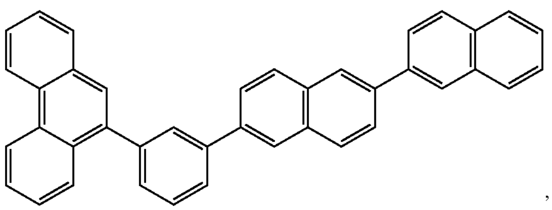

and combinations thereof. Additional information on possible hosts is provided below.

In yet another aspect of the present disclosure, a formulation that comprises the novel compound disclosed herein is described. The formulation can include one or more components selected from the group consisting of a solvent, a host, a hole injection material, hole transport material, and an electron transport layer material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804 and US2012146012.

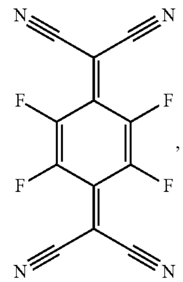

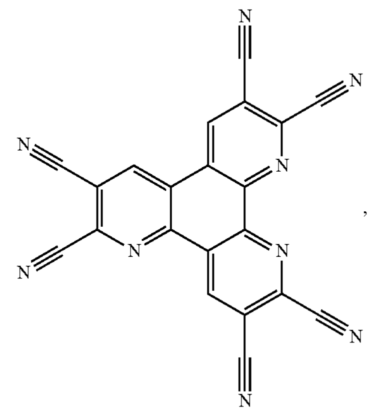

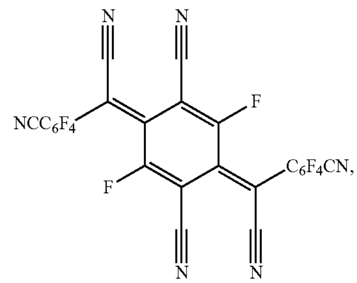

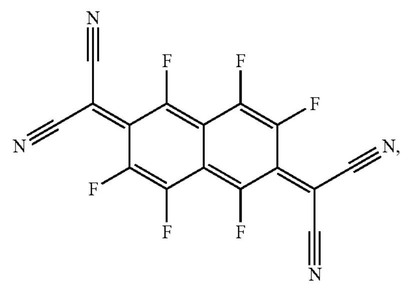

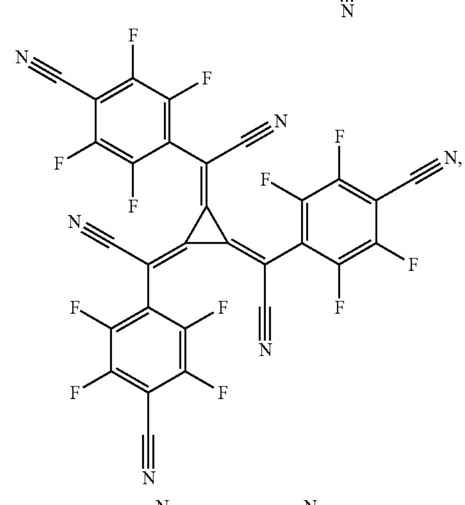

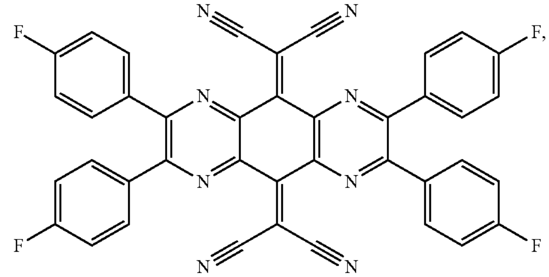

-continued

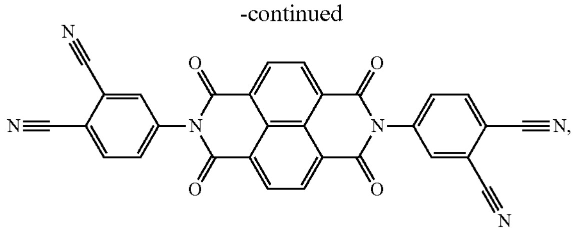

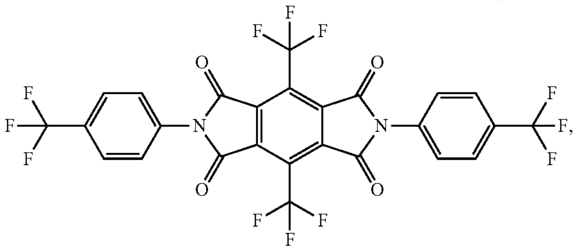

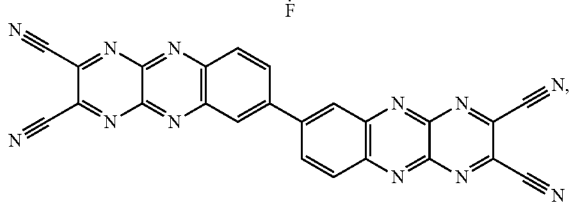

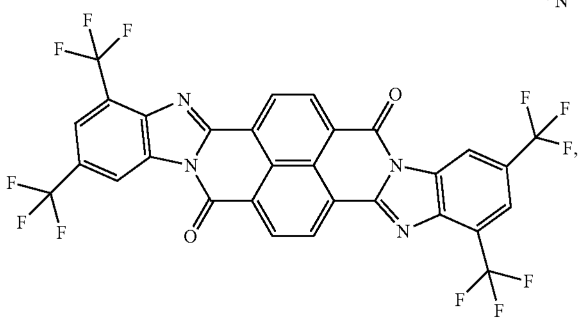

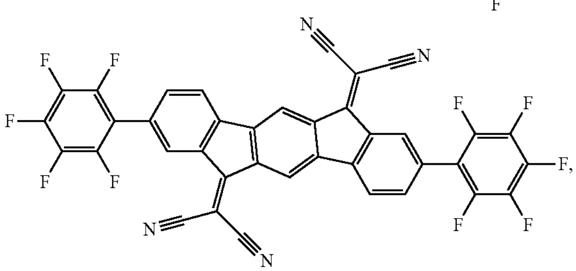

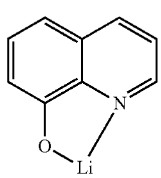

, and

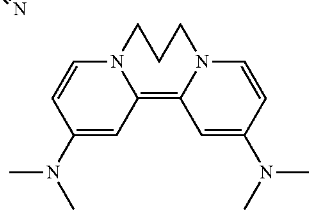

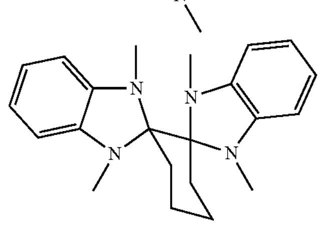

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

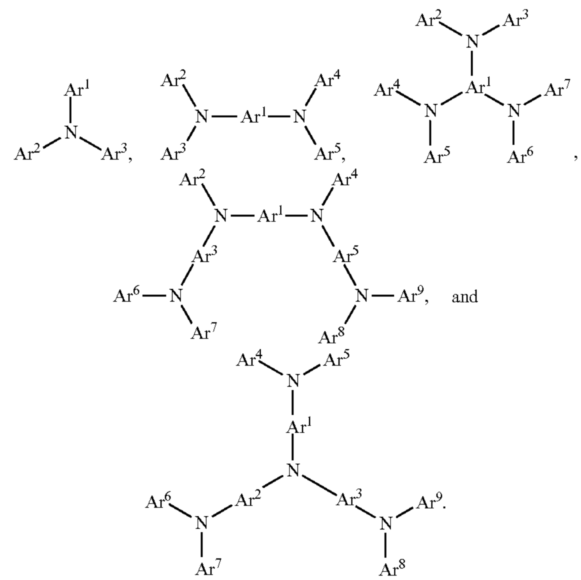

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

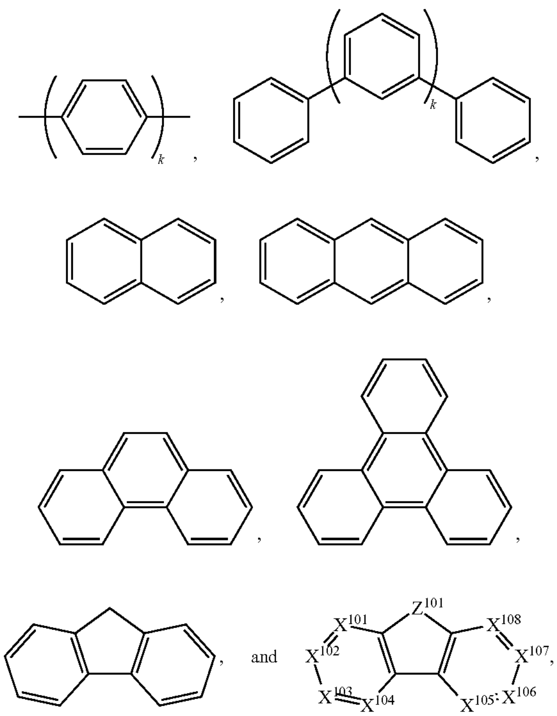

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

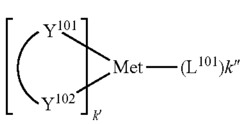

wherein Met is a metal, which can have an atomic weight greater than 40; $(Y^{101}\text{-}Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}\text{-}Y^{102})$ is a 2-phenylpyridine derivative. In another aspect, $(Y^{101}\text{-}Y^{102})$ is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

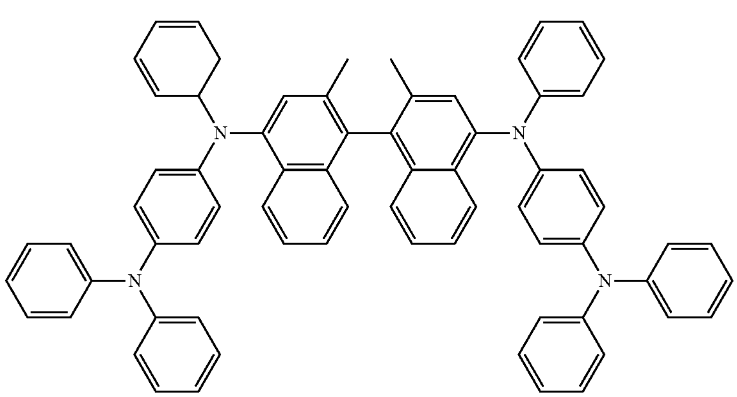

,

-continued
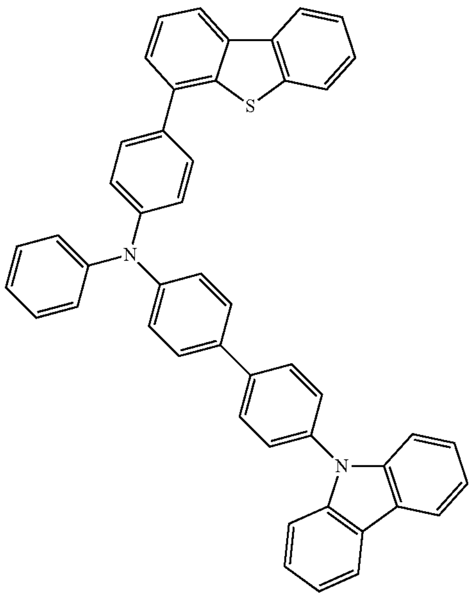
,
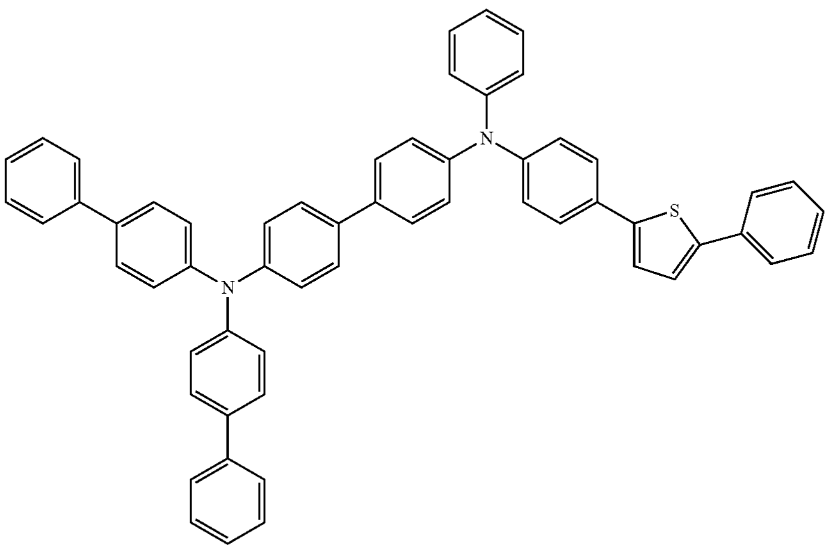
,
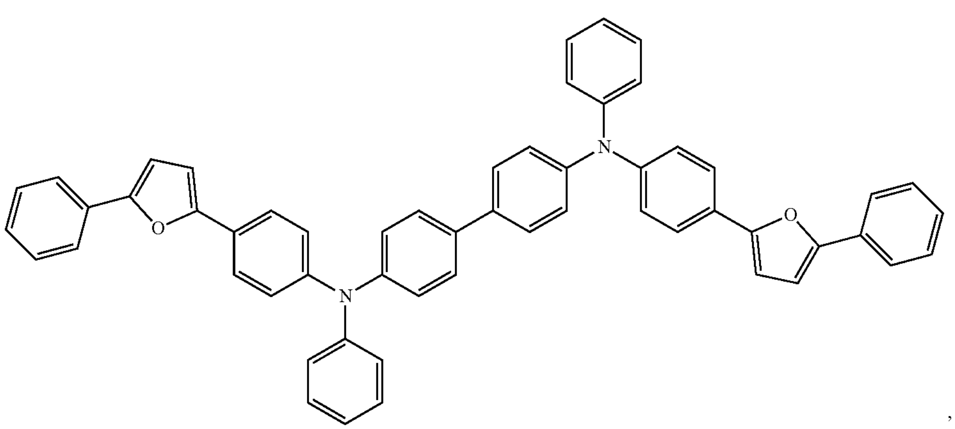
,

-continued
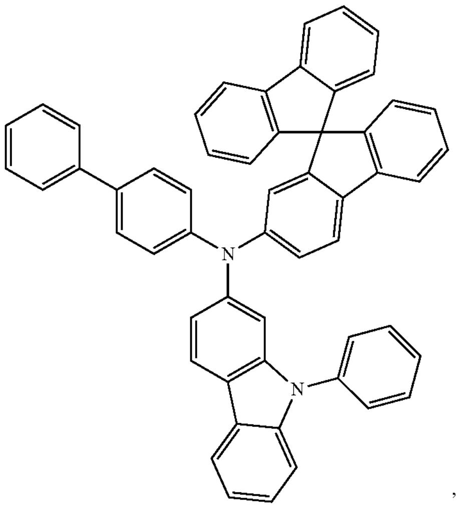
,
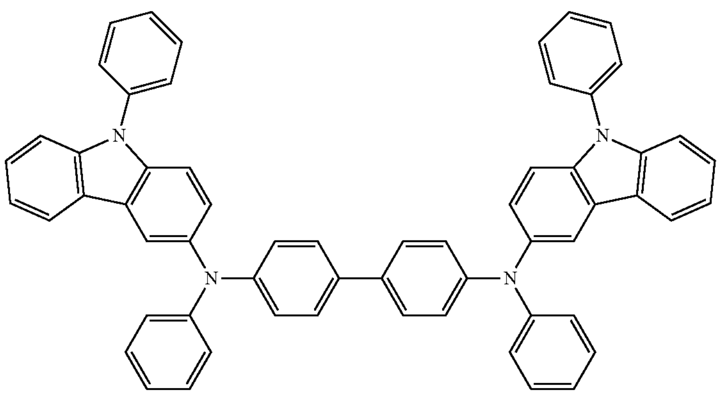
,
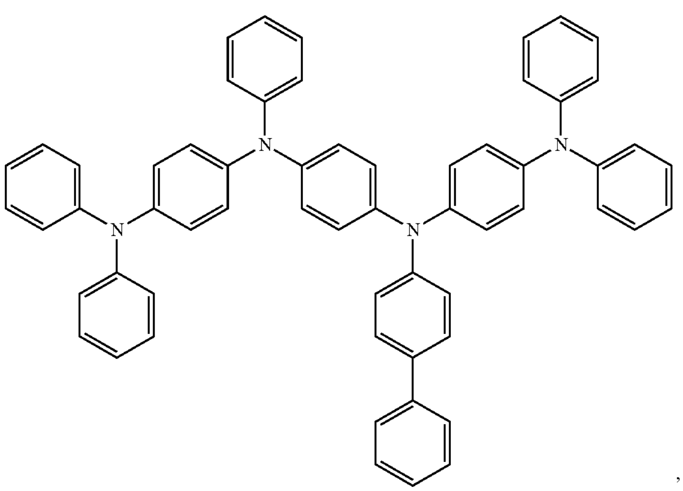
,

-continued
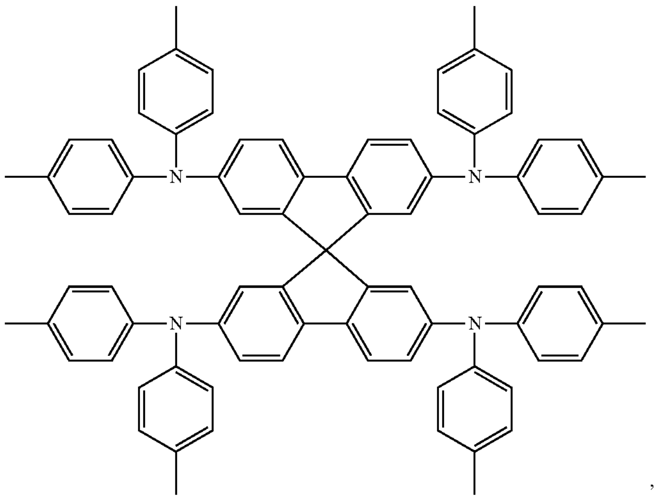
,
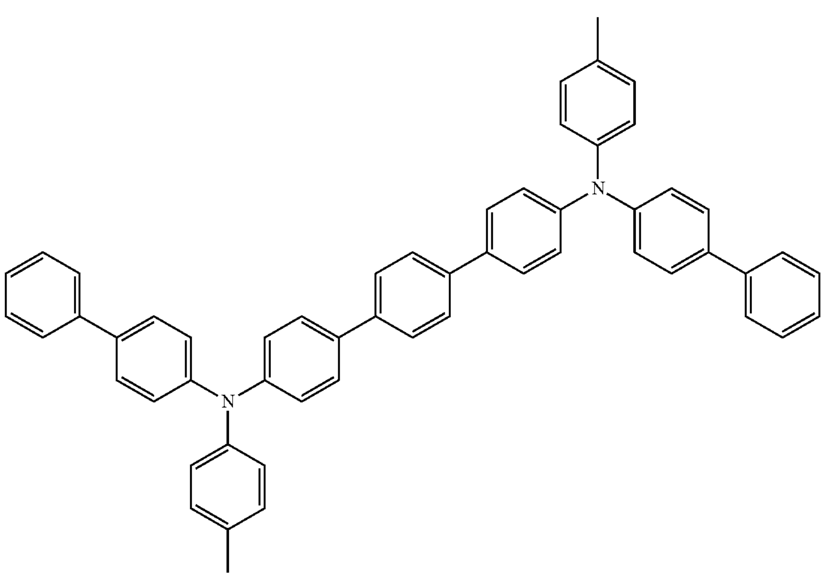
,

-continued
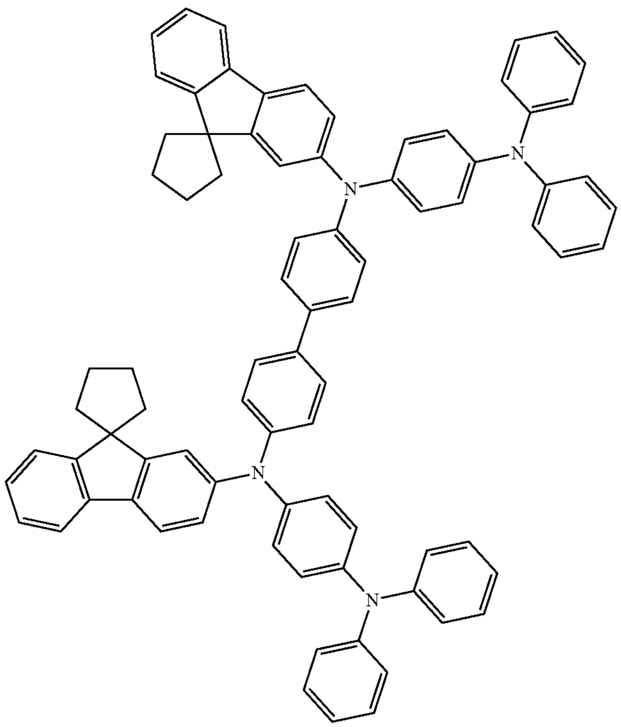
,
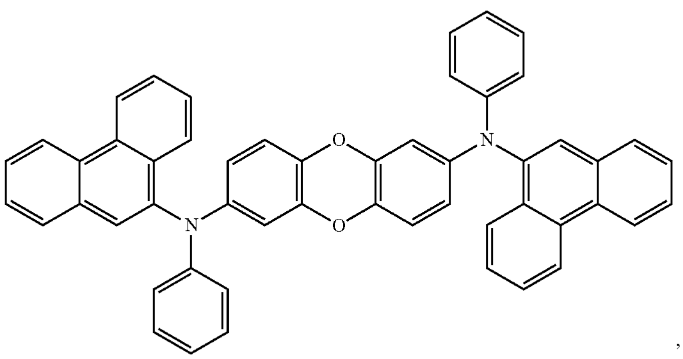
,
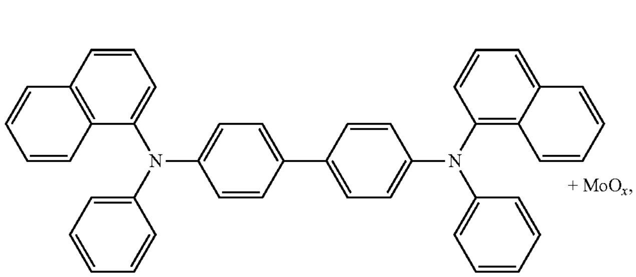
+ $MoO_x$,

-continued
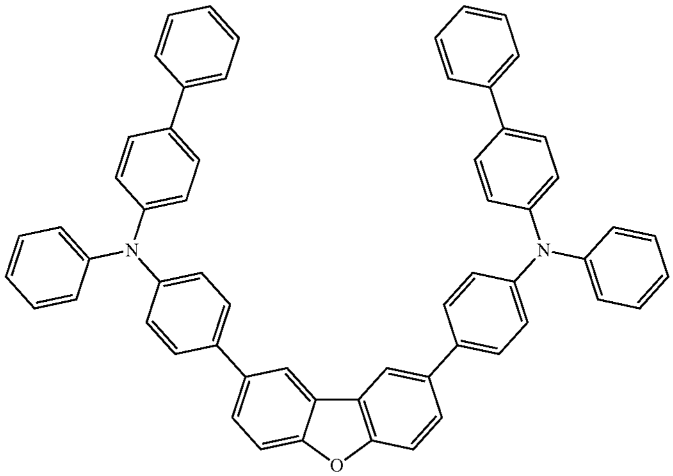
,
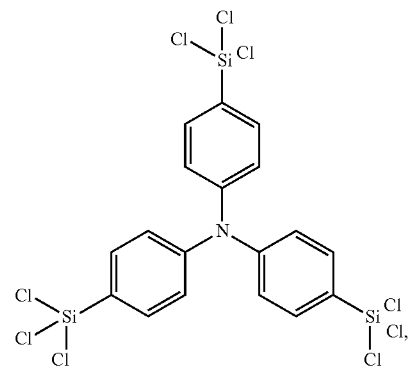
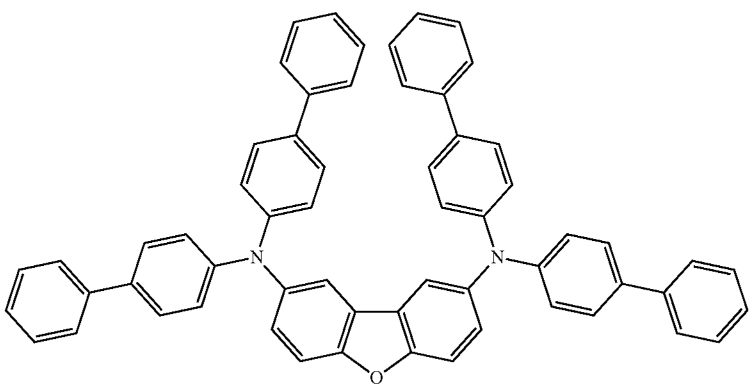
,
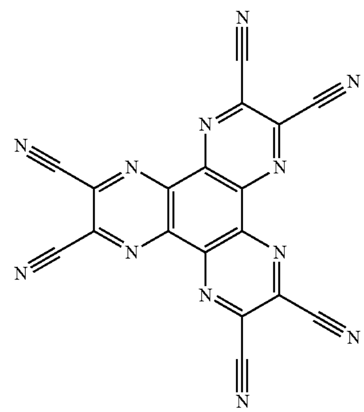
,
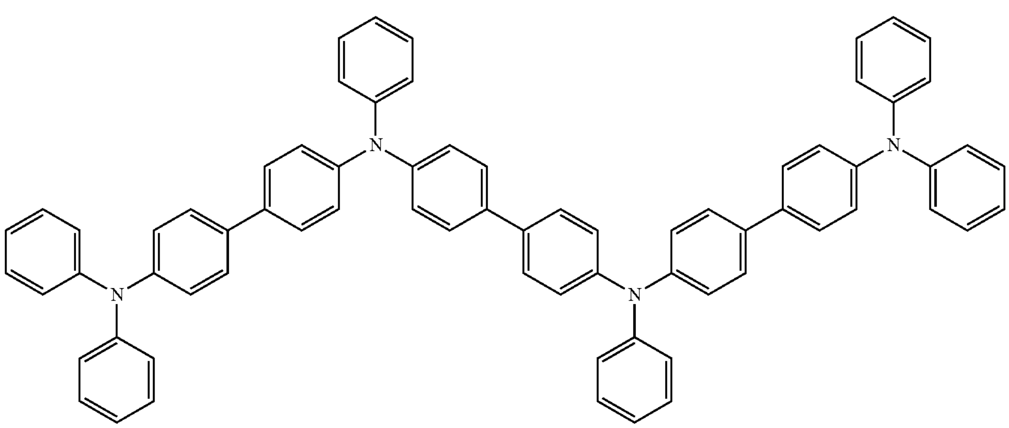
,

-continued
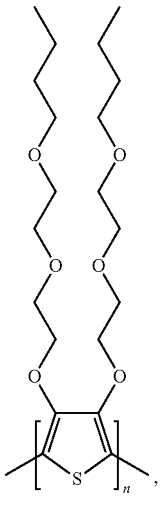
,
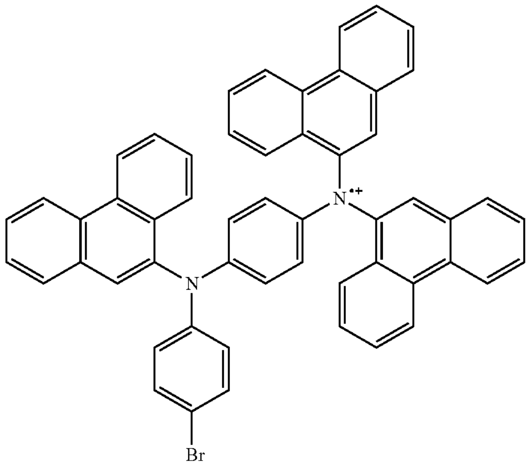
,
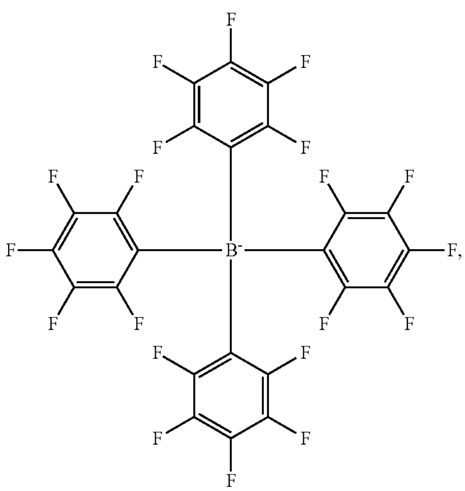
,
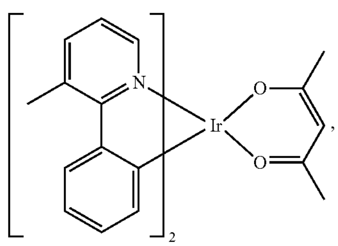
,
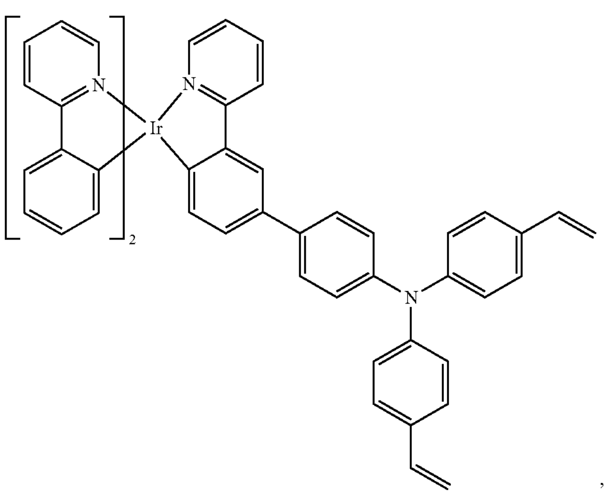
, -continued
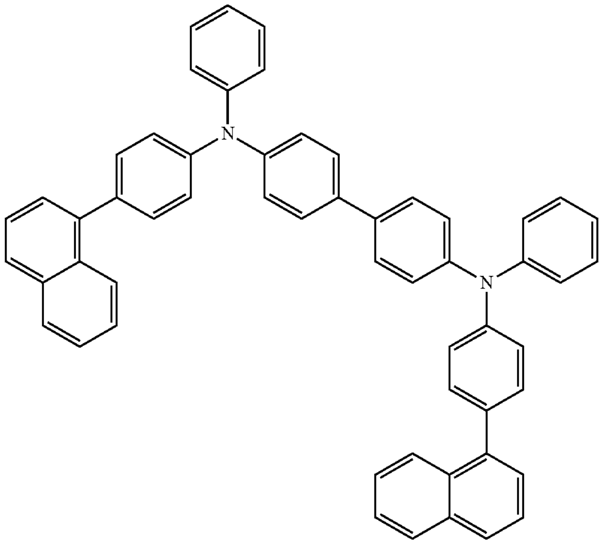
,
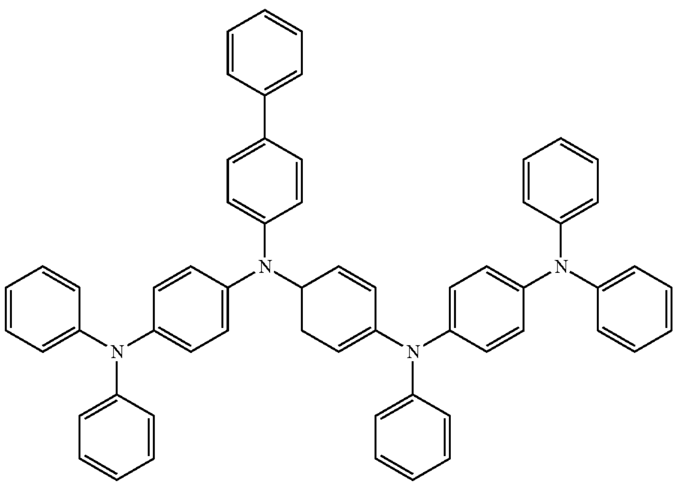
,
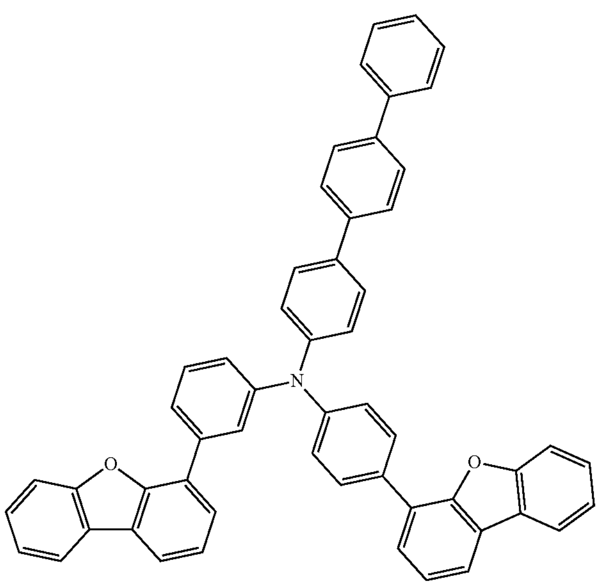
, -continued
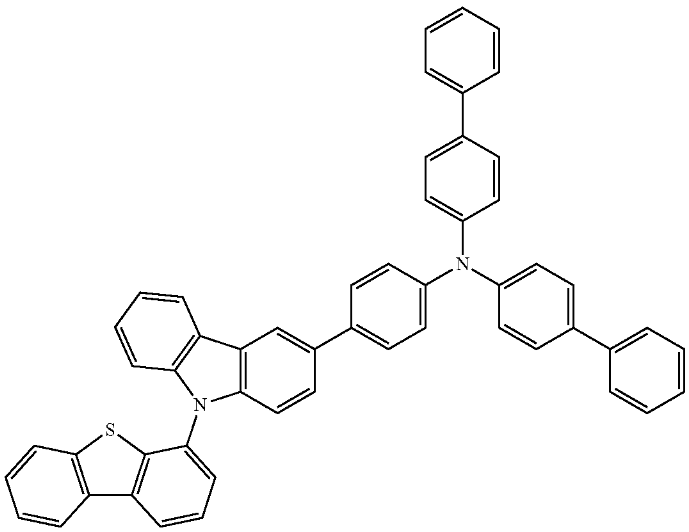
,
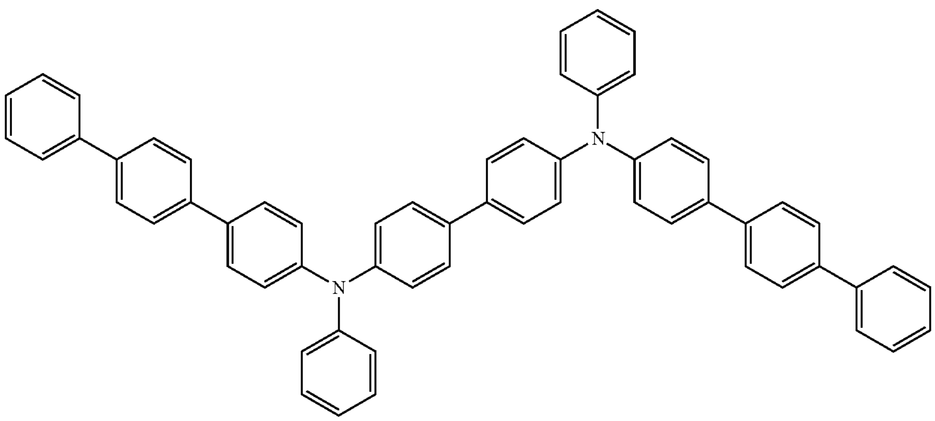
,
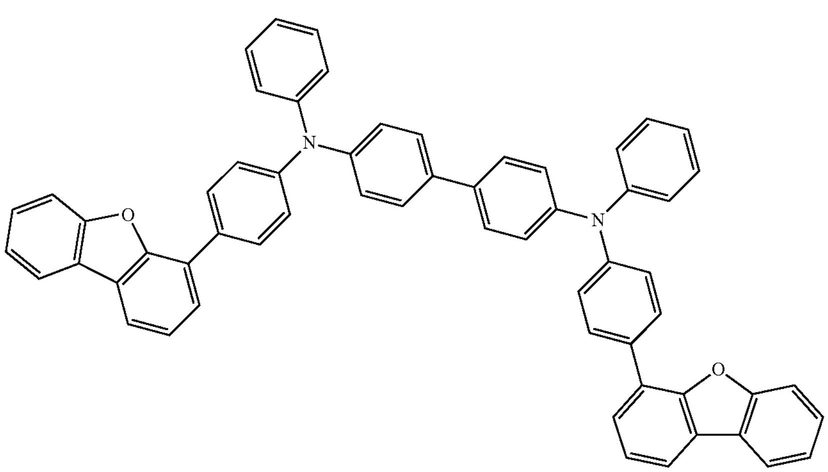
, -continued
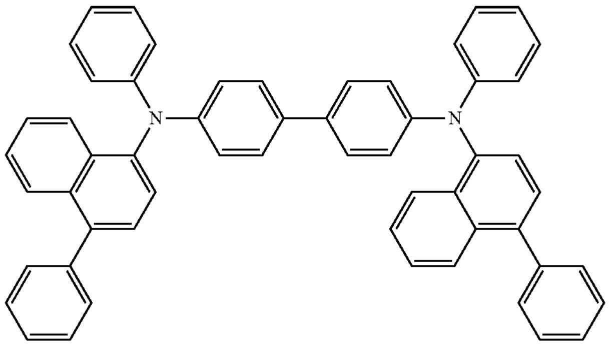
,
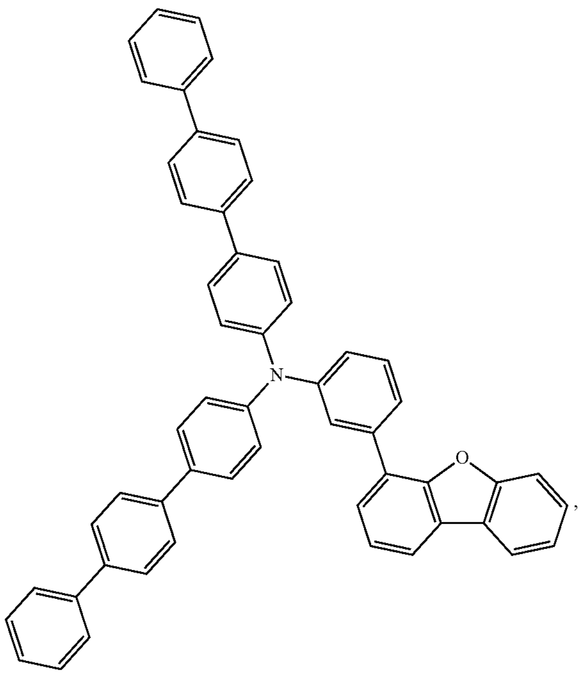
,
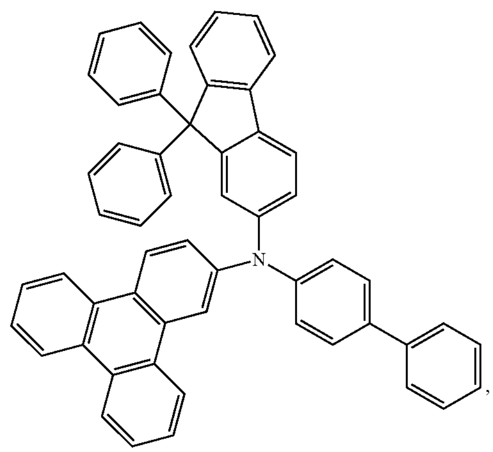
,
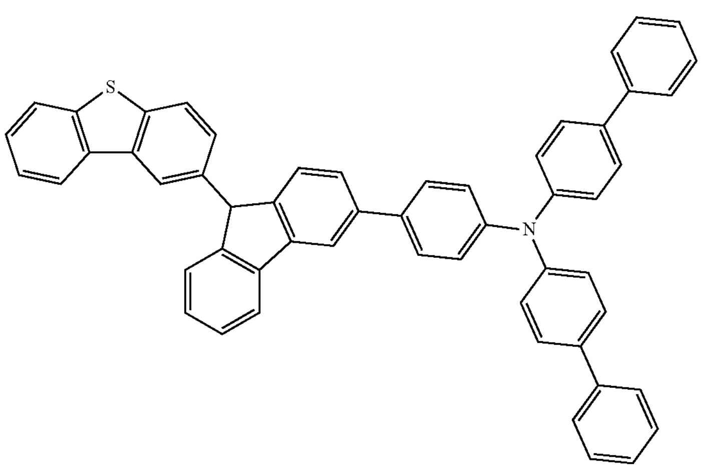
, -continued
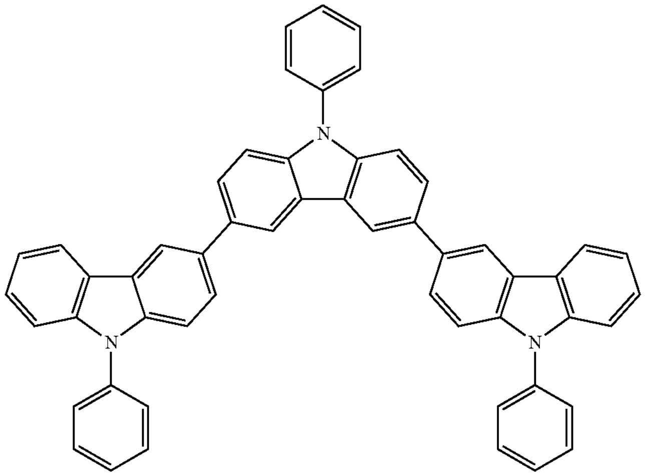
,
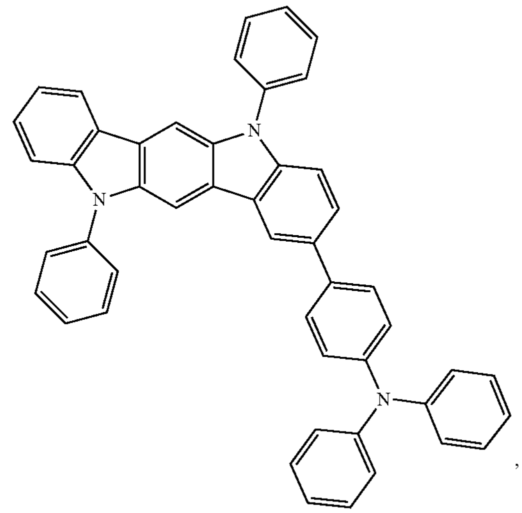
,
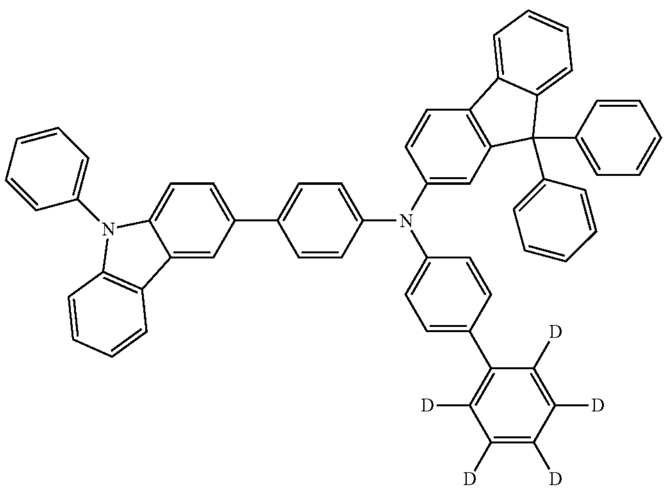
,
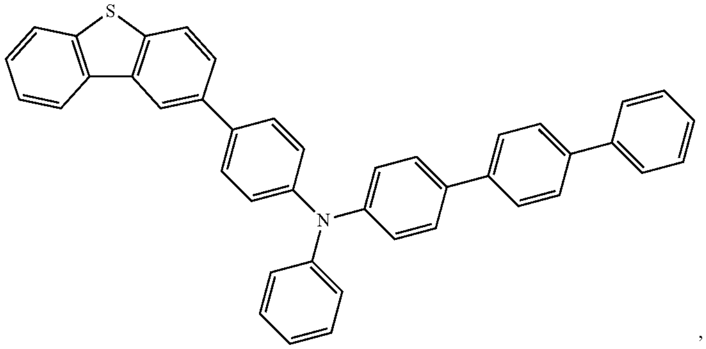
, -continued
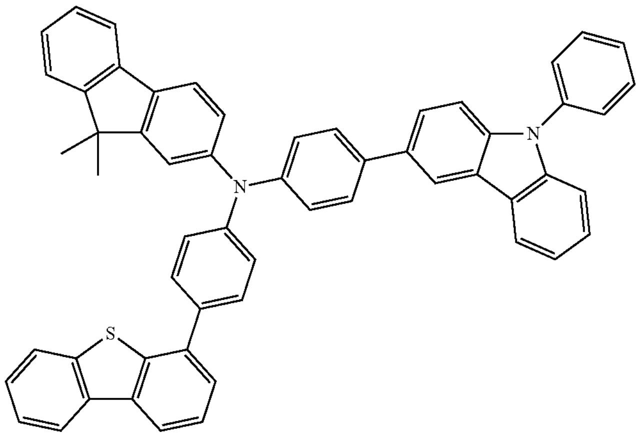
,
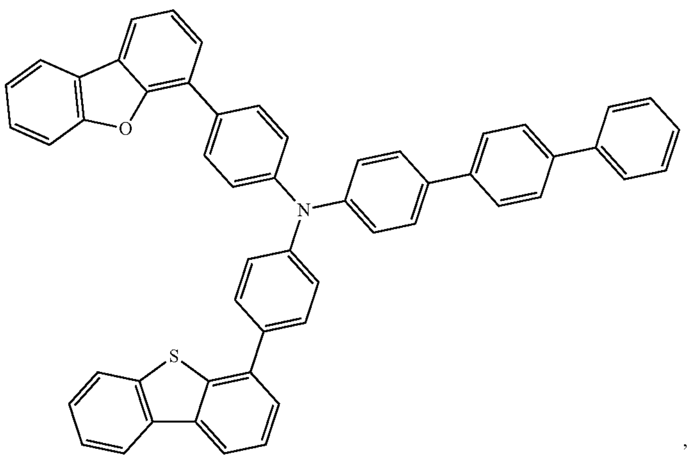
,
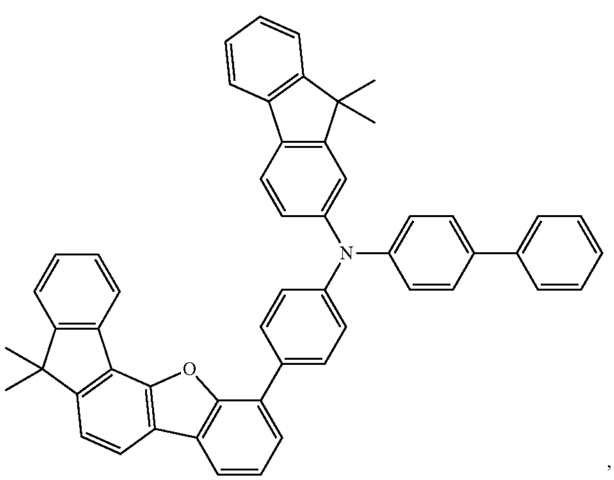
,
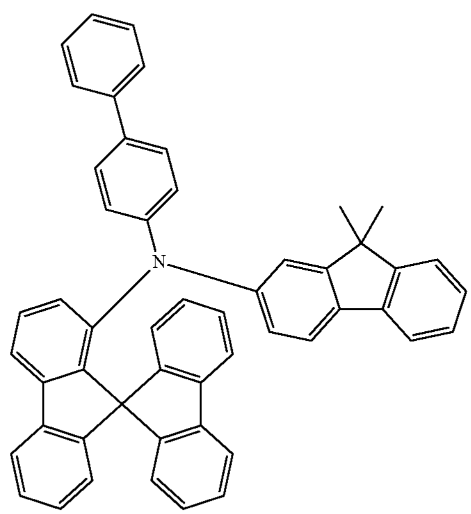
, -continued
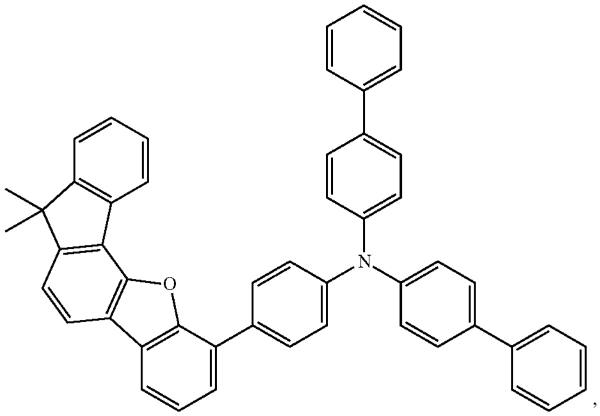
,
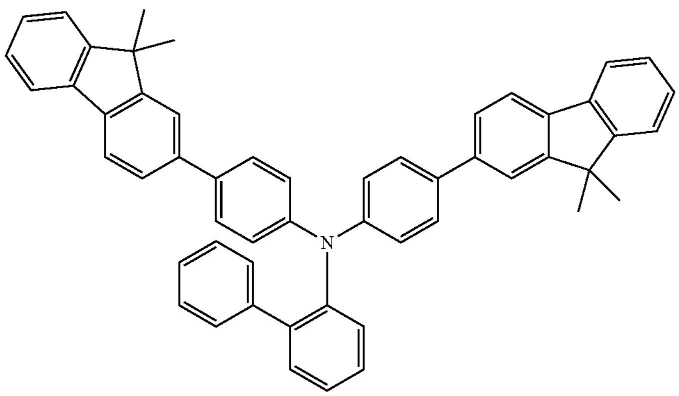
,
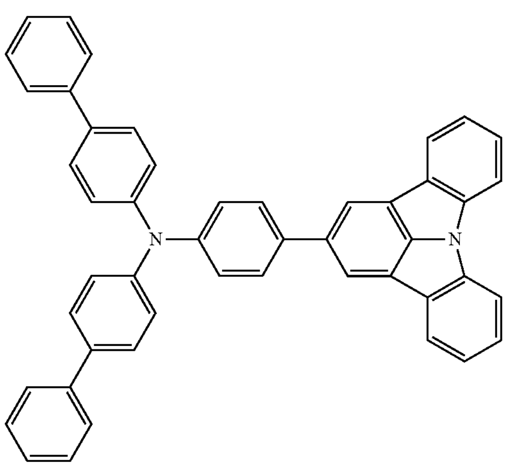
,
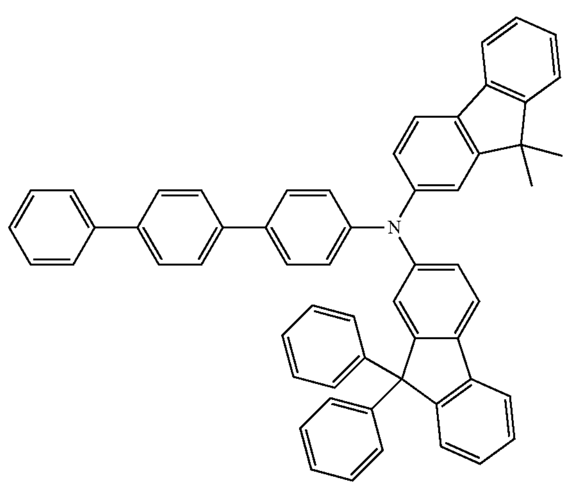
, -continued
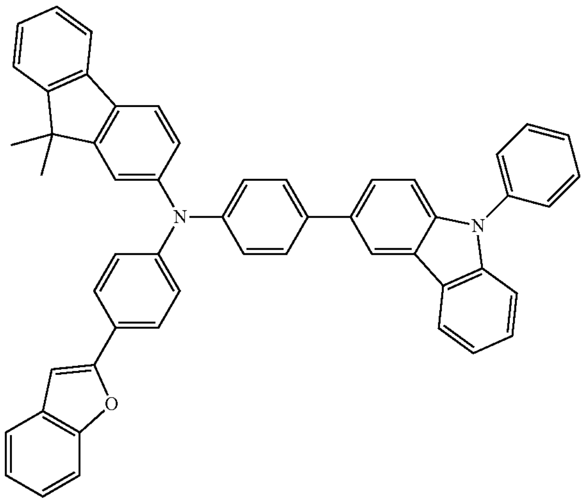
,
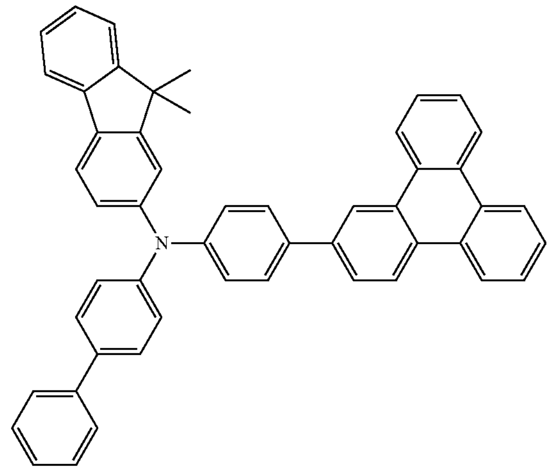
,
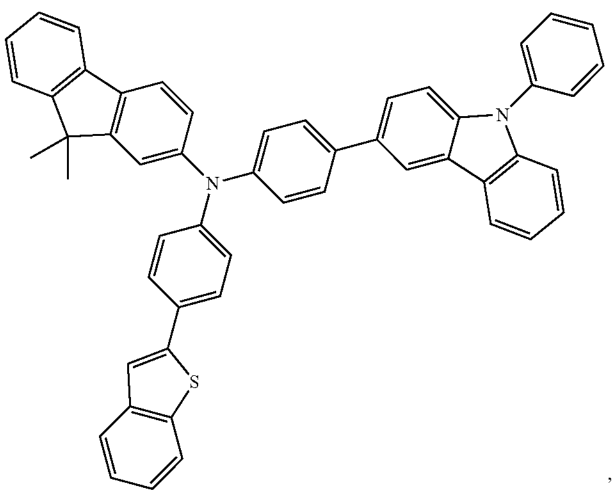
,
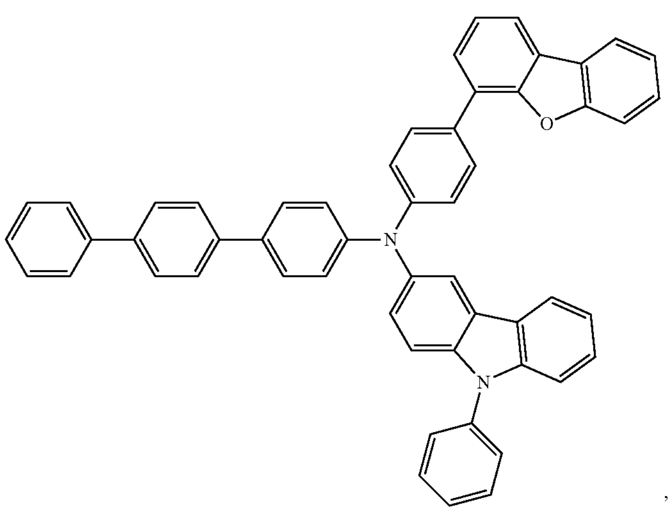
, -continued
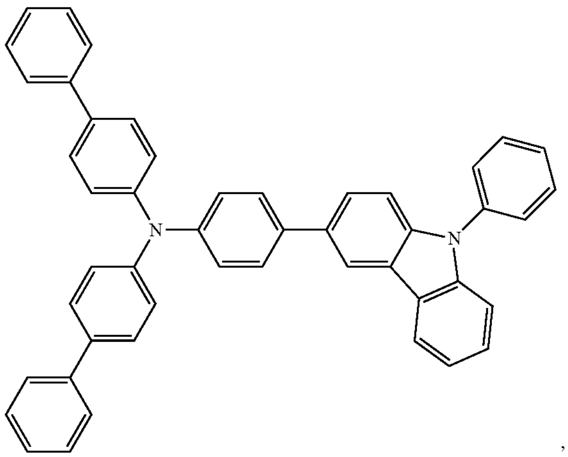
,
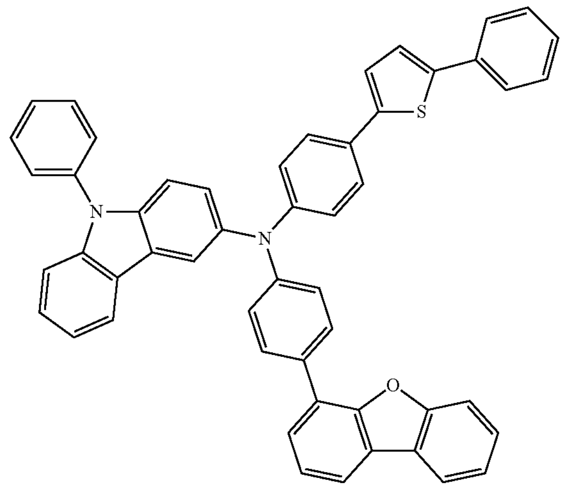
,
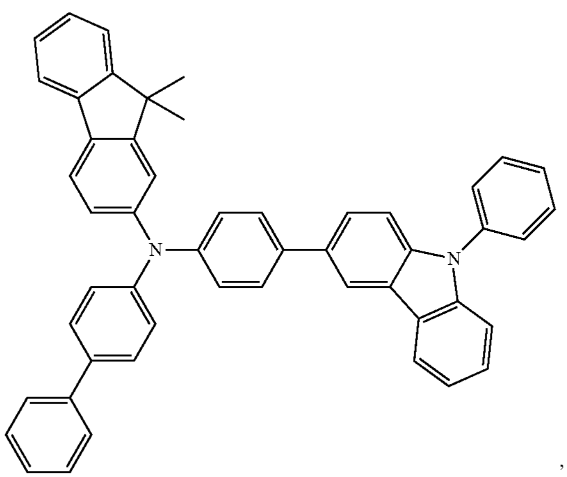
,
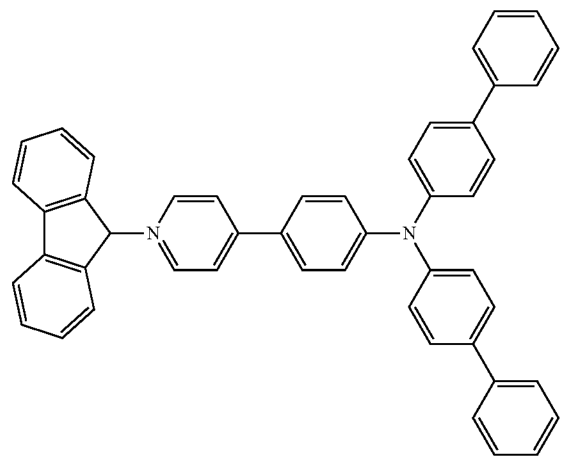
,
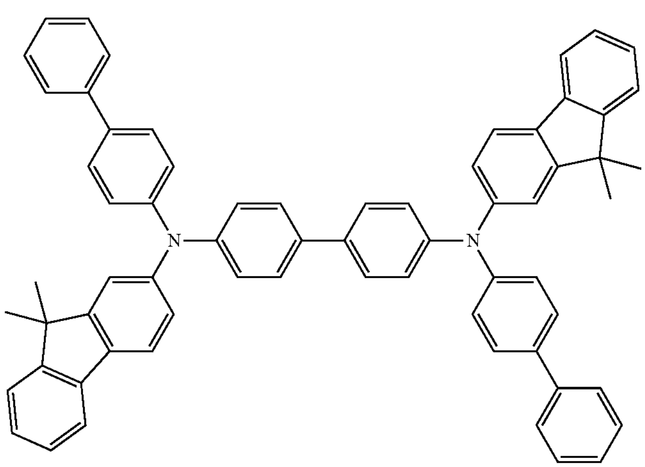
, -continued
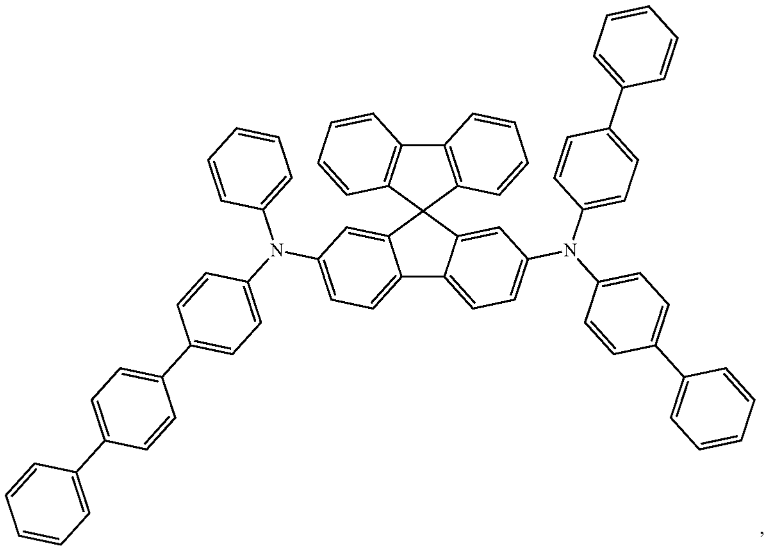
,
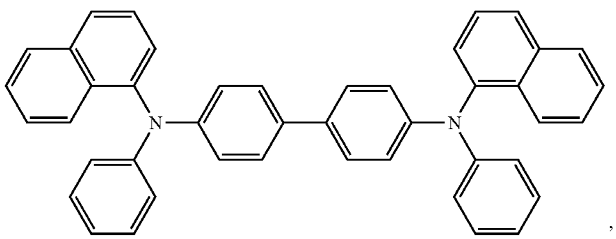
,
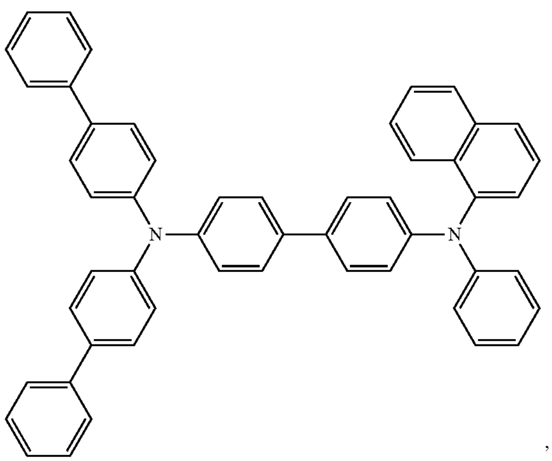
,
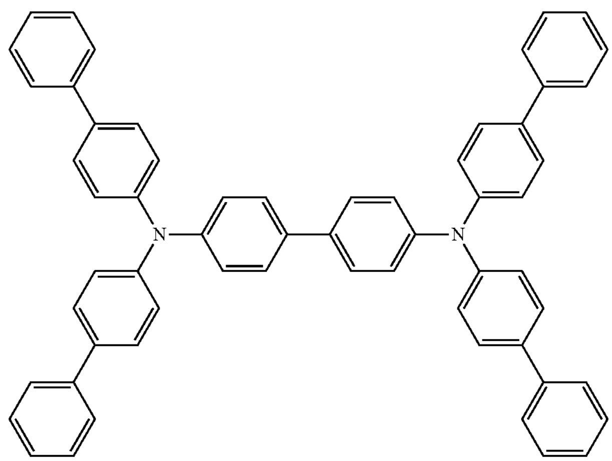
,
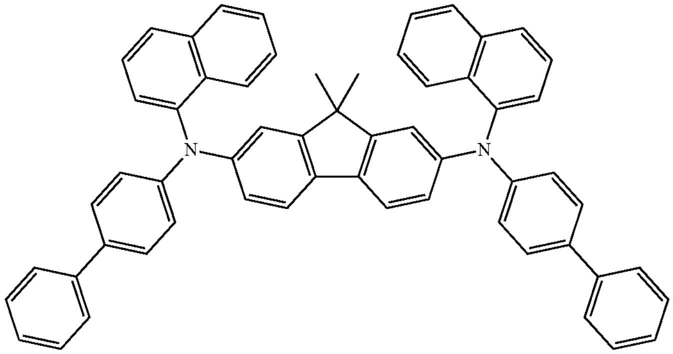
, -continued
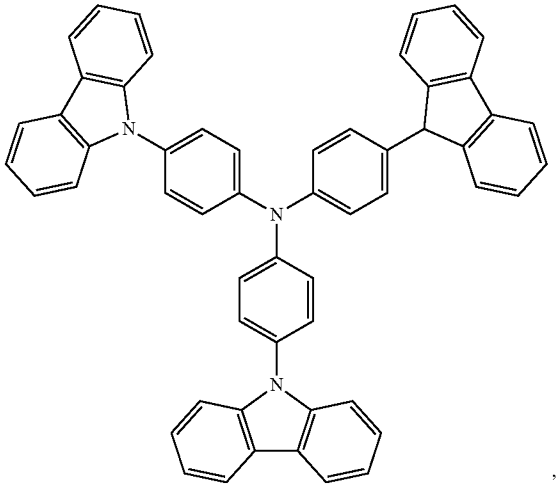
,
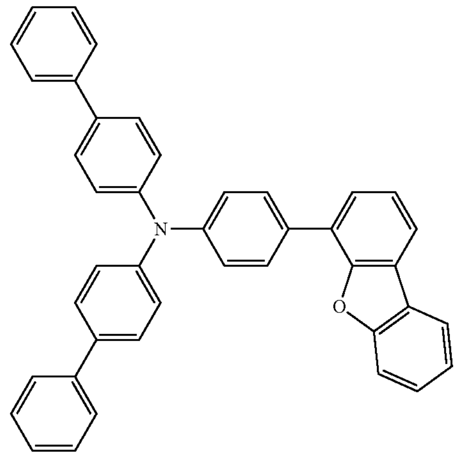
,
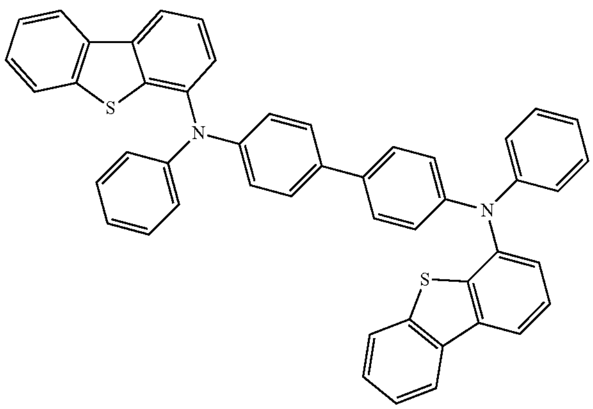
,
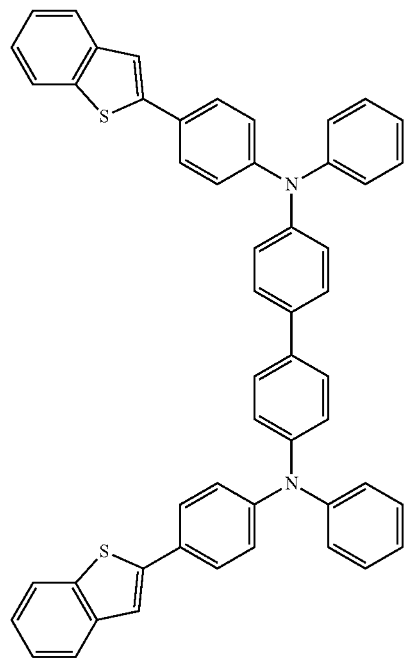
, and
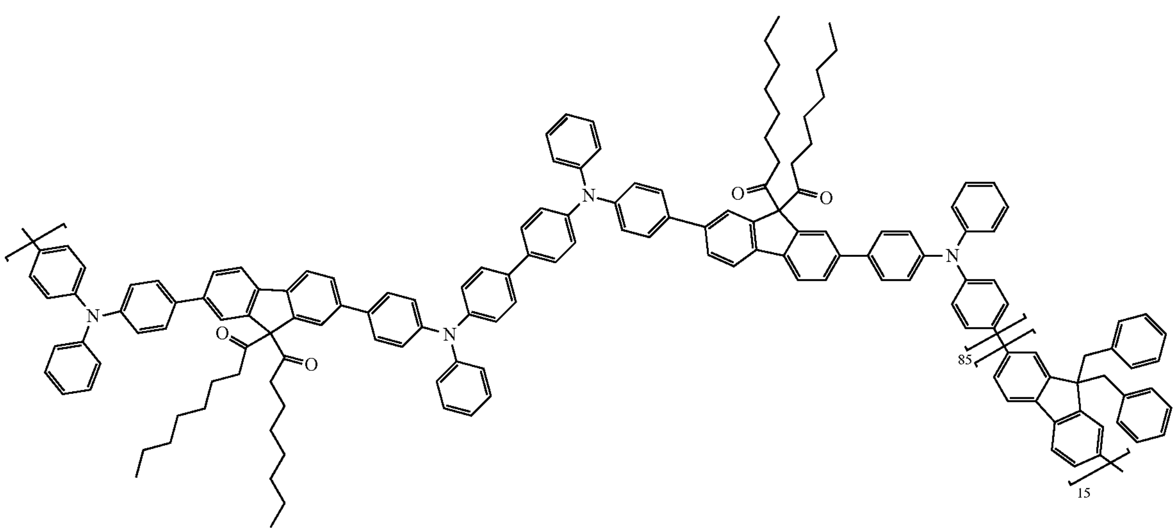

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

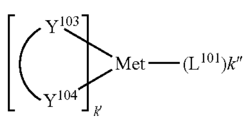

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

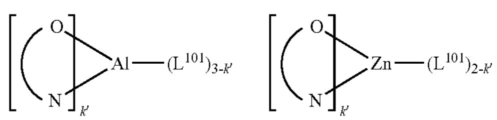

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the host compound contains at least one of the following groups in the molecule:

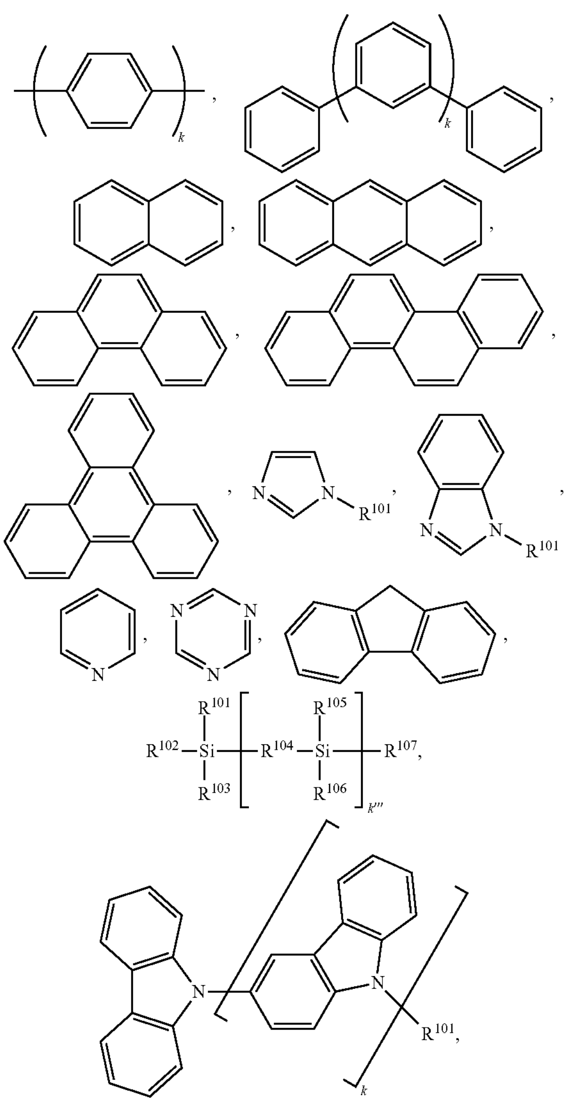

-continued

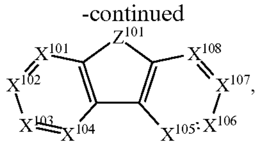

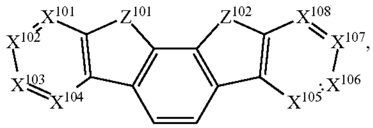

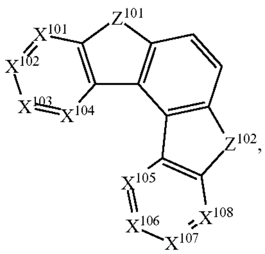

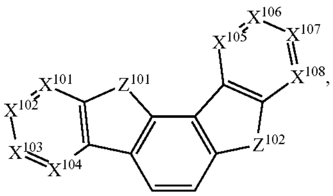

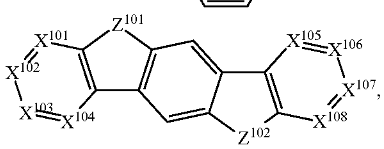

and

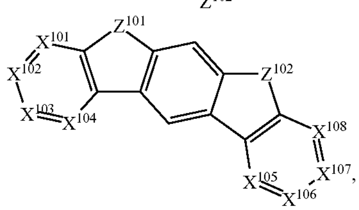

wherein each of $R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20; k''' is an integer from 0 to 20. $X^{101}$ to $X^{108}$ is selected from C (including CH) or N.

$Z^{101}$ and $Z^{102}$ is selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472,

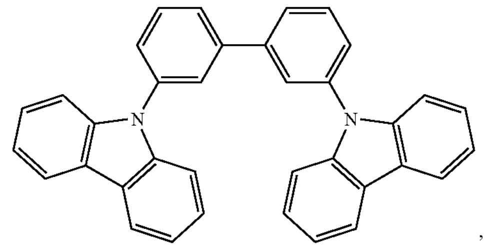

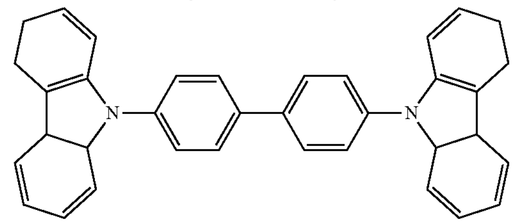

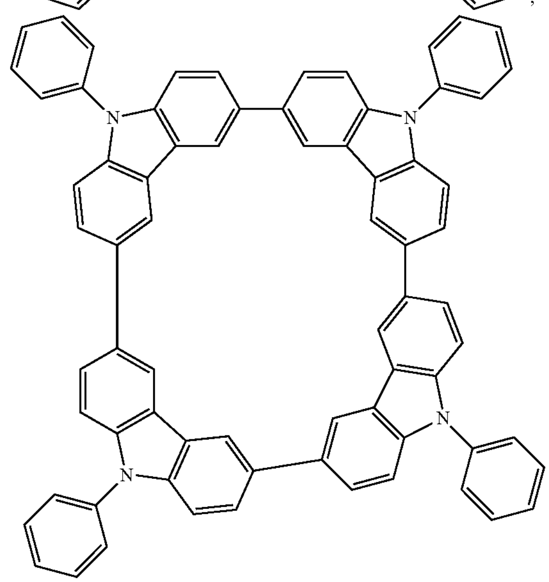

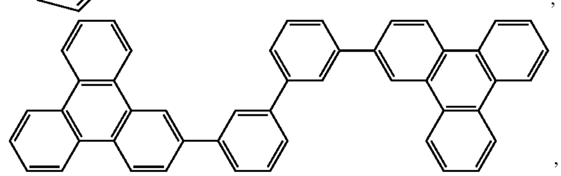

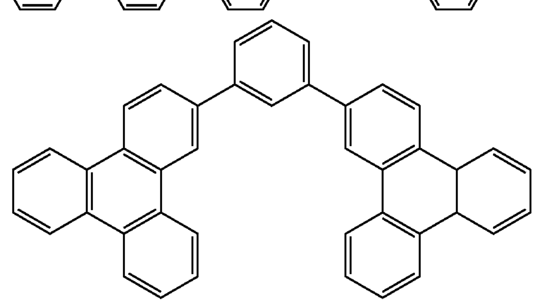

-continued
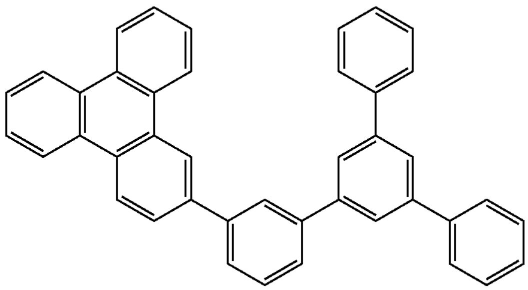
,
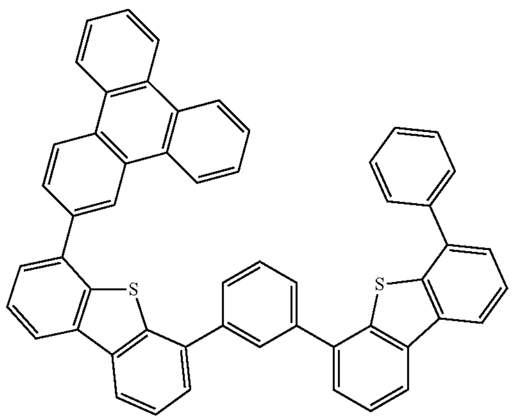
,
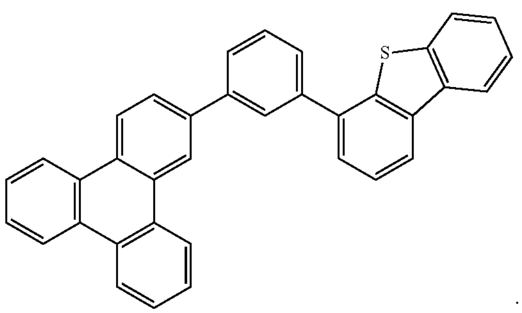
.
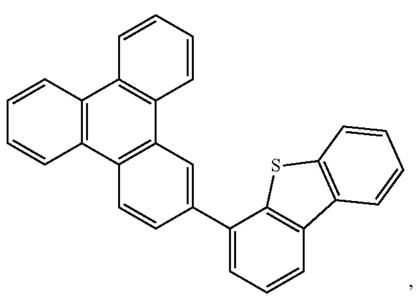
,
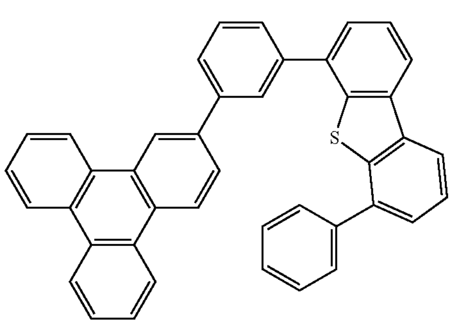
,
-continued
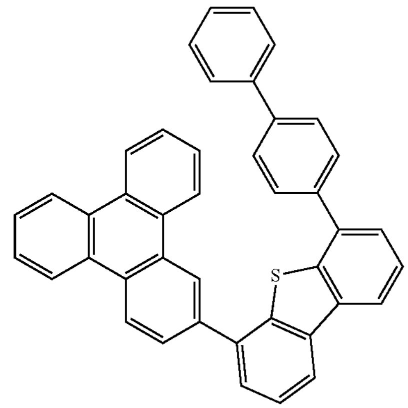
,
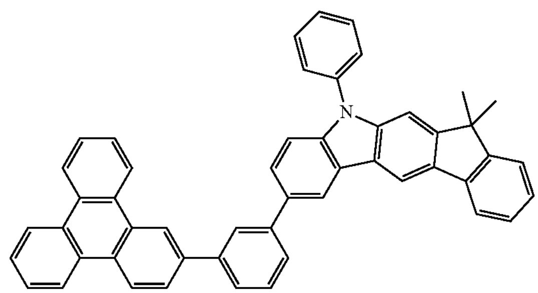
,
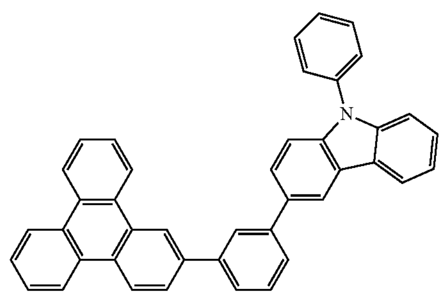
,
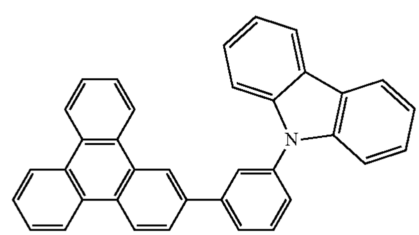
,
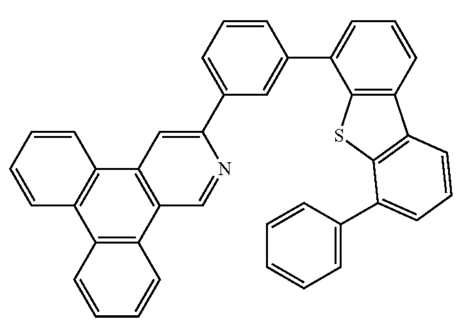
, -continued
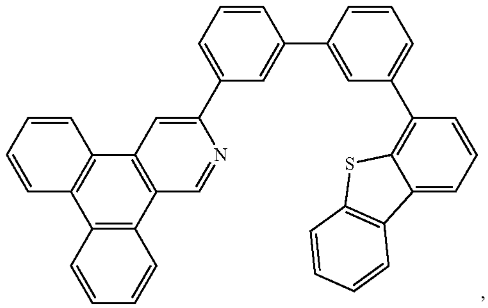
,
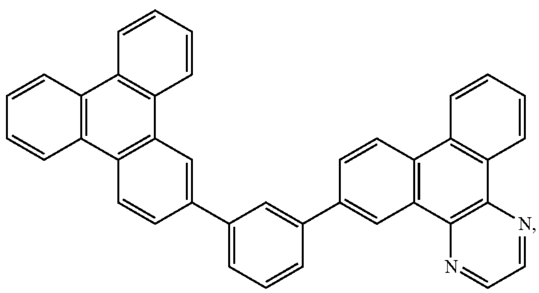
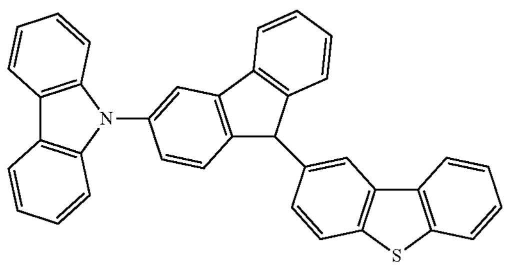
,
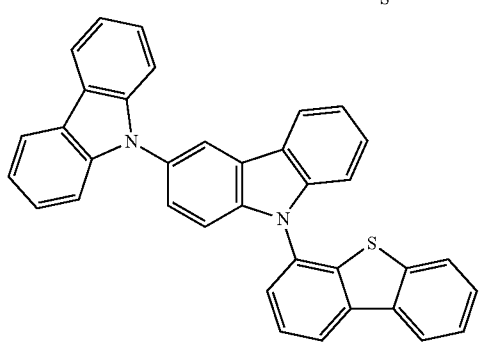
,
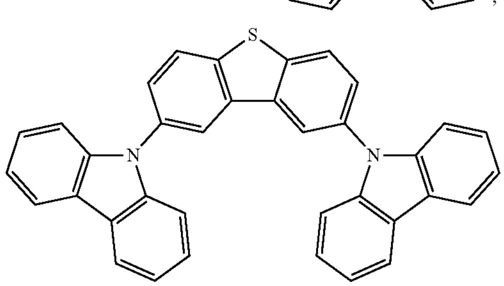
,
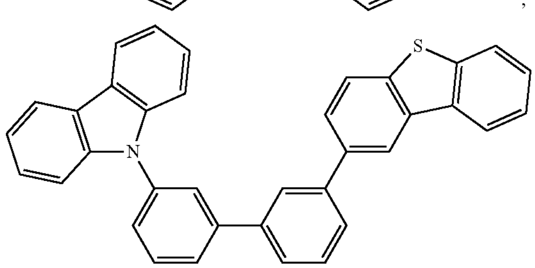
,
-continued
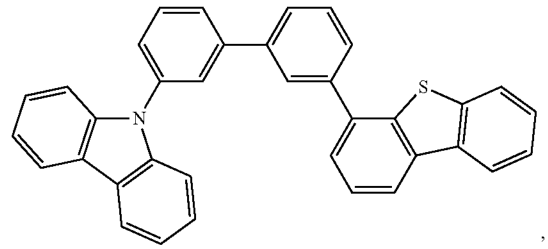
,
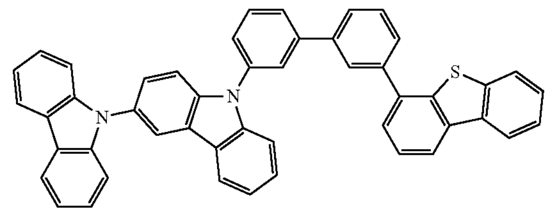
,
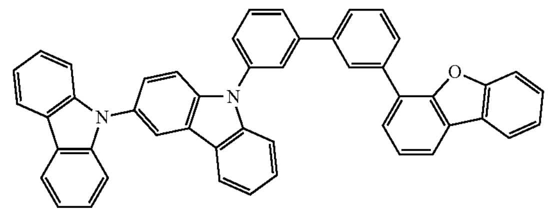
,
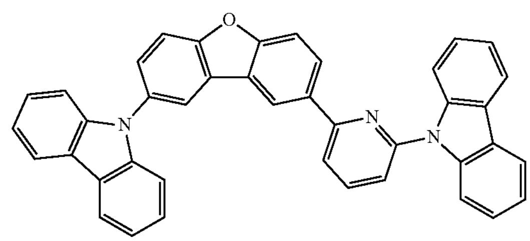
,
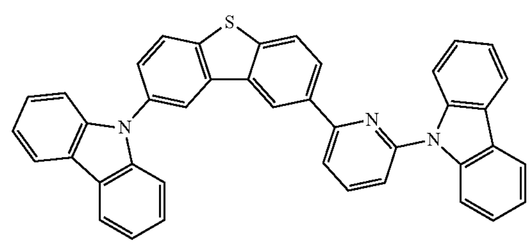
,
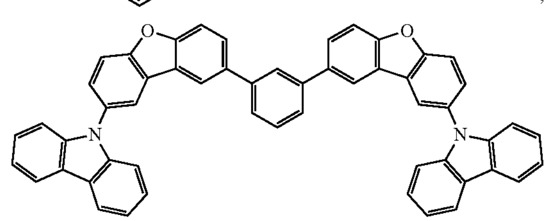
,
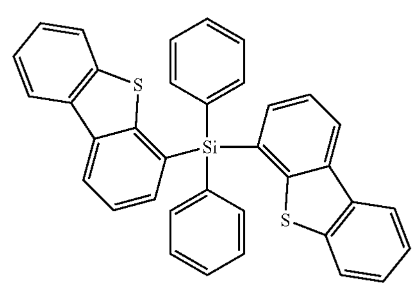
, -continued
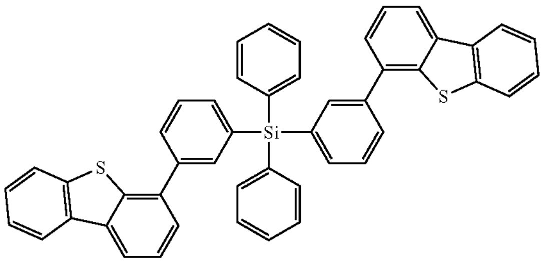
,
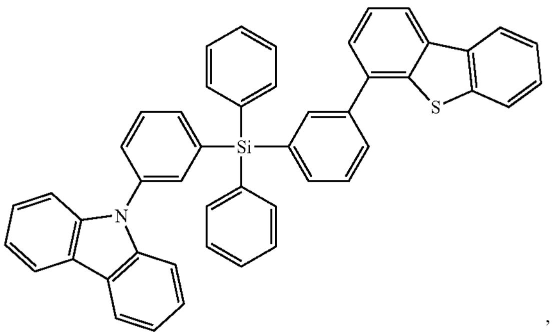
,
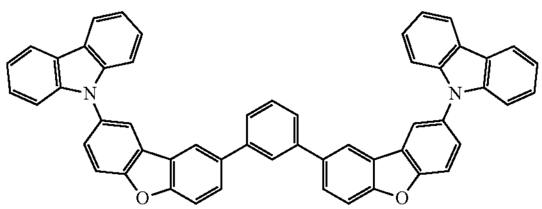
,
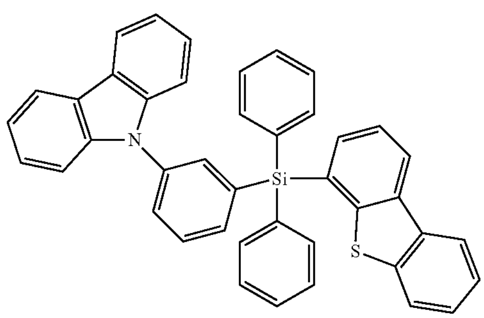
,
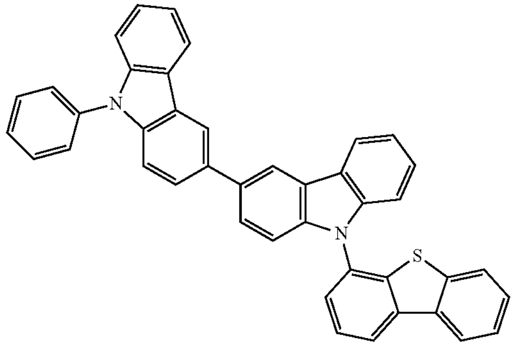
,
-continued
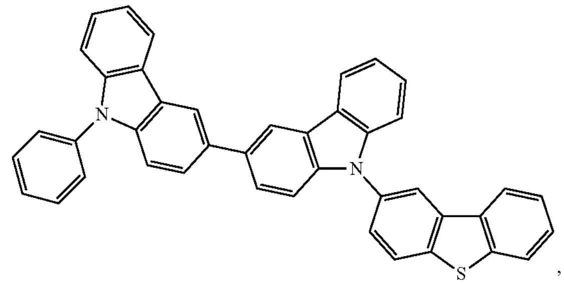
,
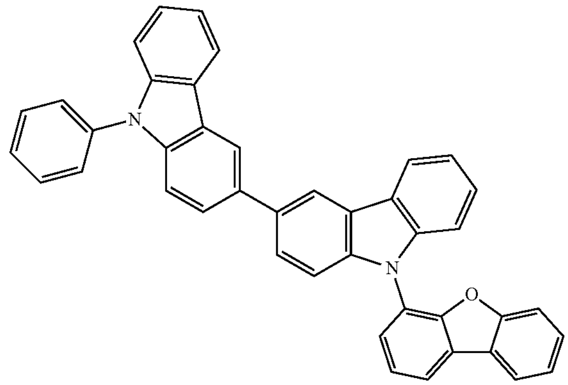
,
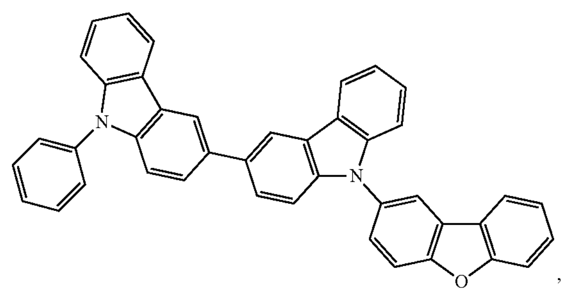
,
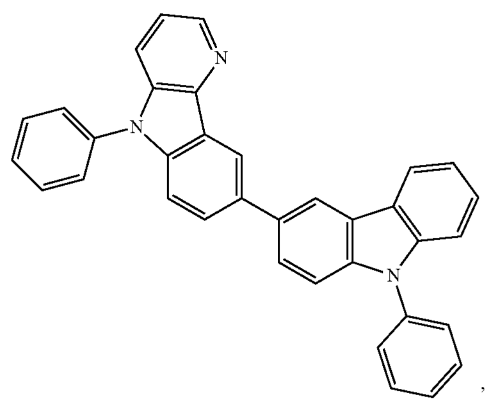
,
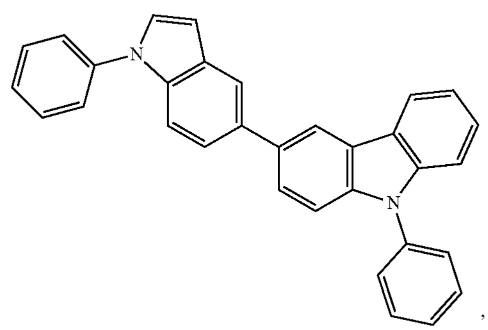
, -continued
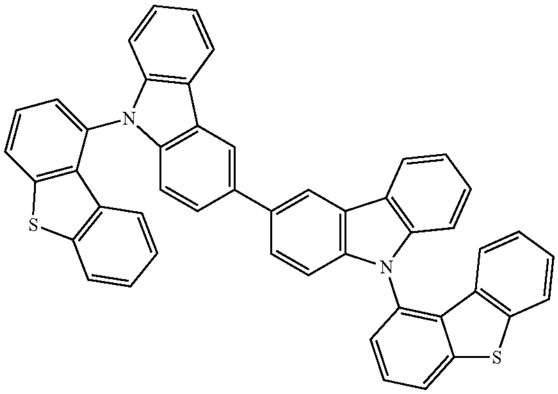
,
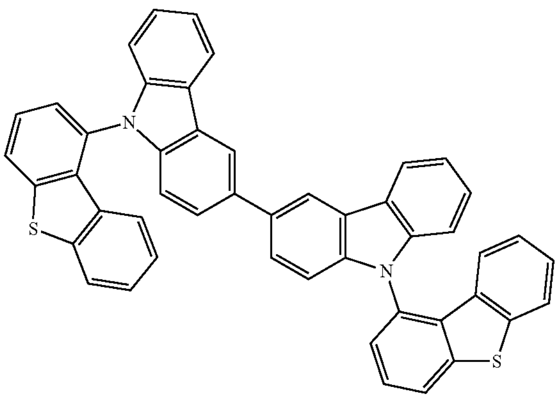
,
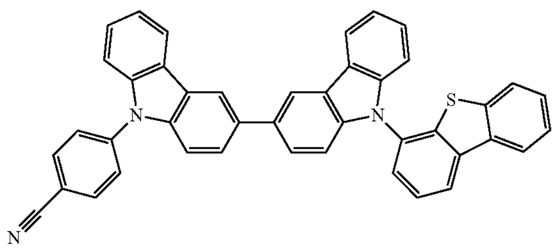
,
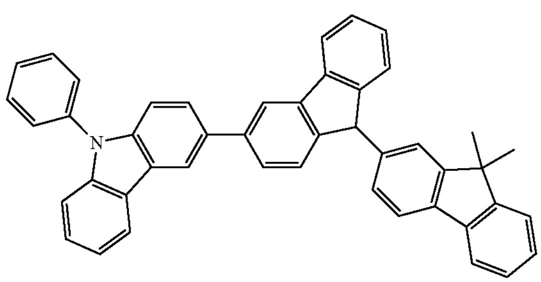
,
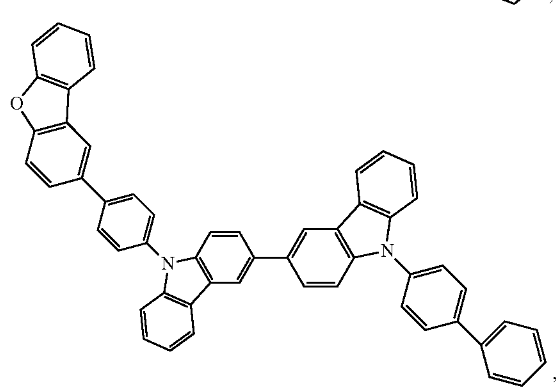
,
-continued
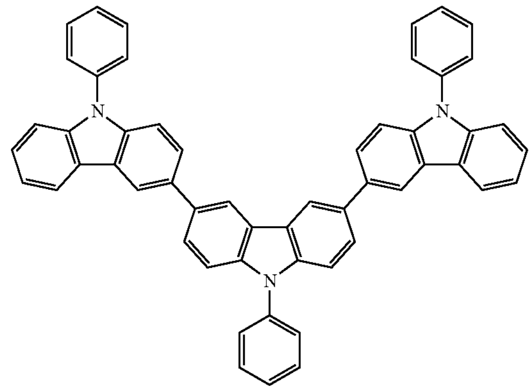
,
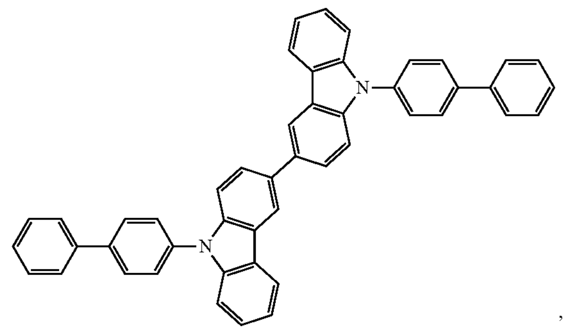
,
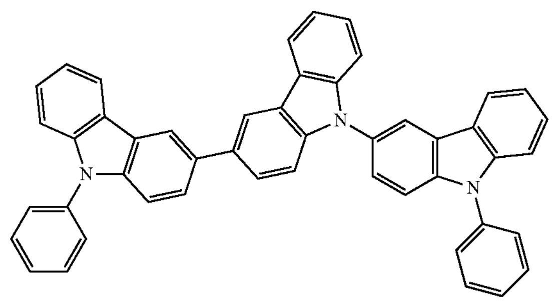
,
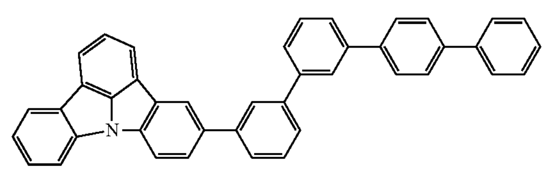
,
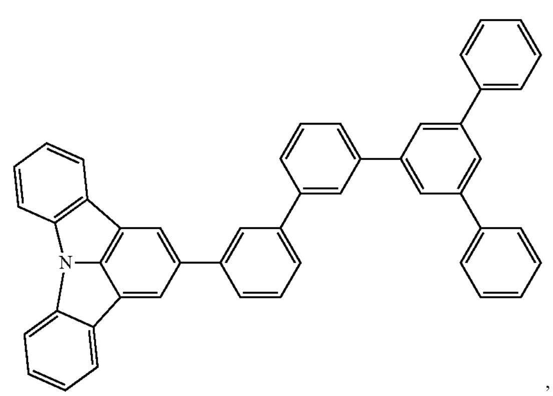
, -continued
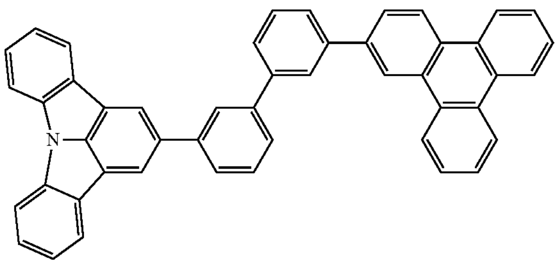
,
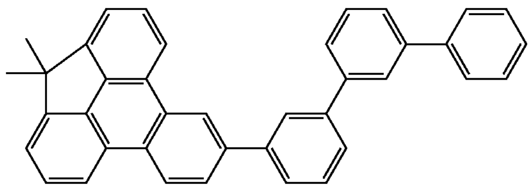
,
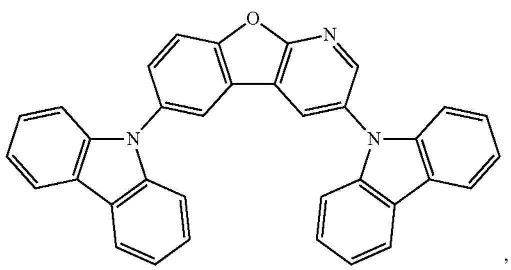
,
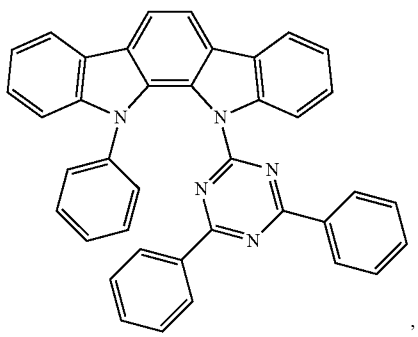
,
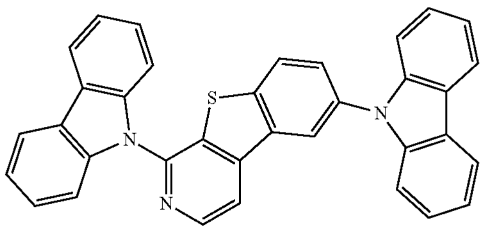
,
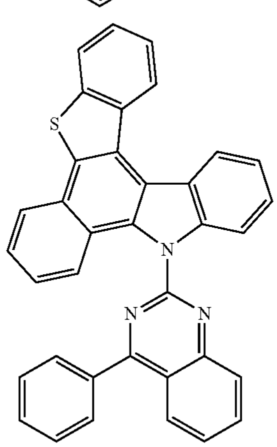
,
-continued
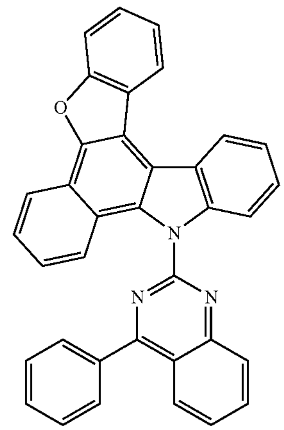
,
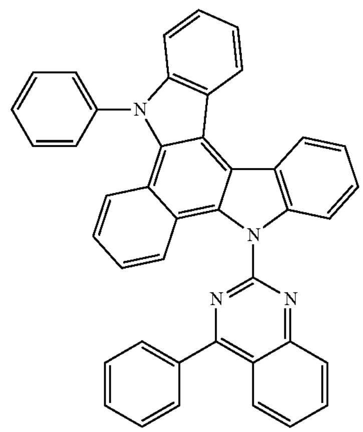
,
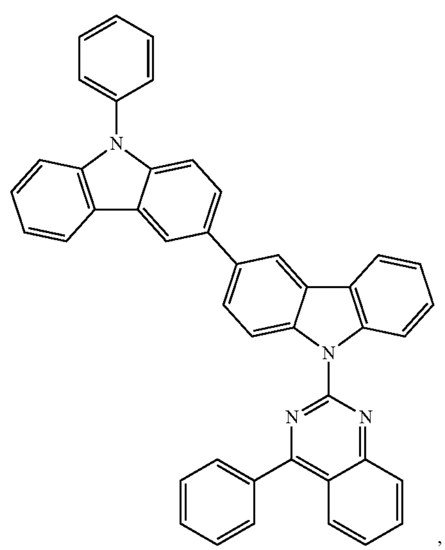
, -continued
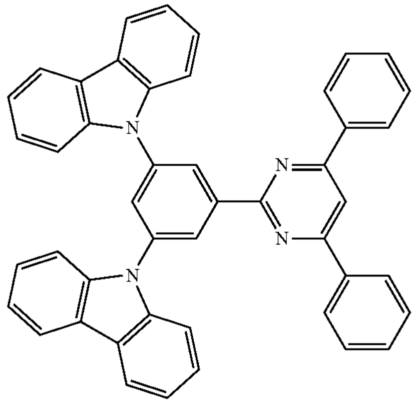
,
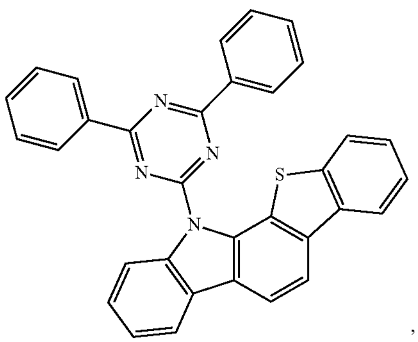
,
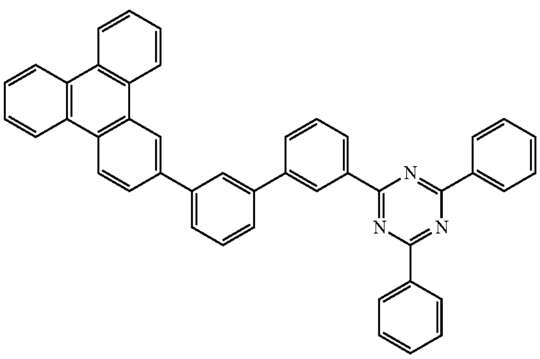
,
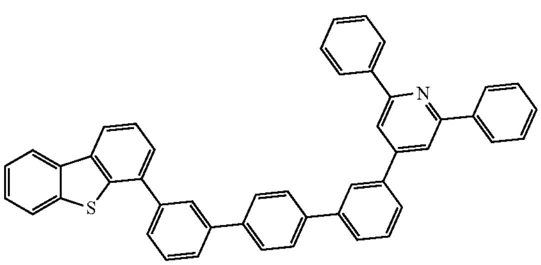
,
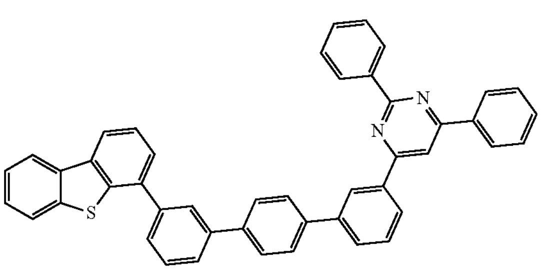
,
-continued
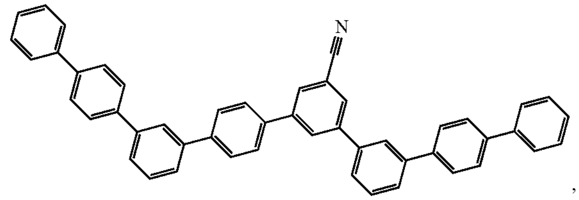
,
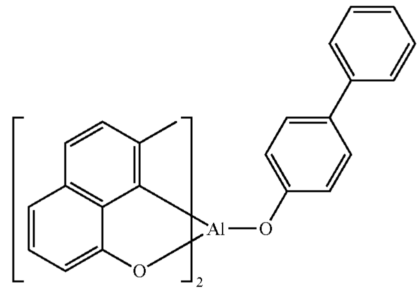
,
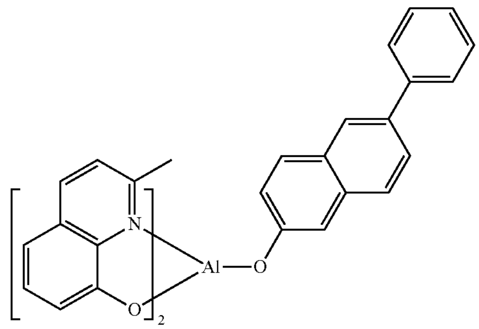
,
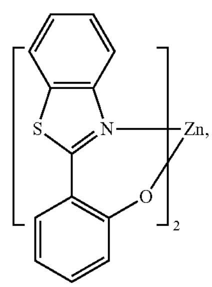
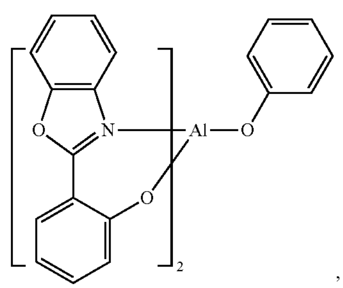
,
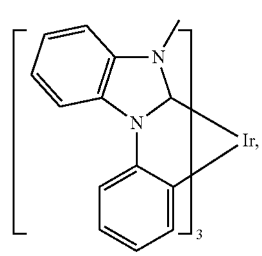

-continued

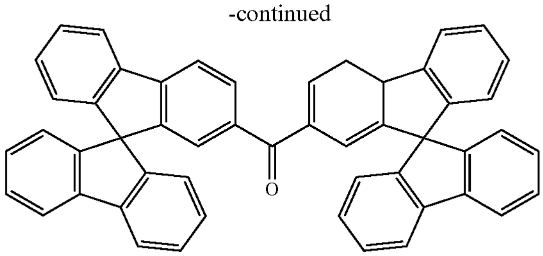

,

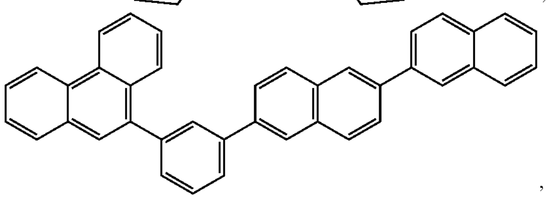

,

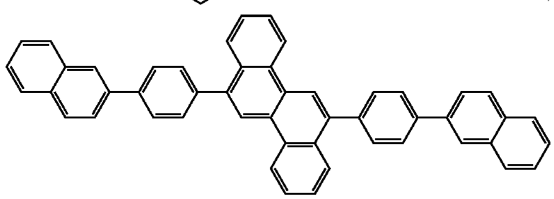

, and

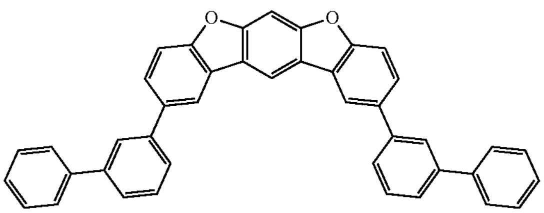

.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

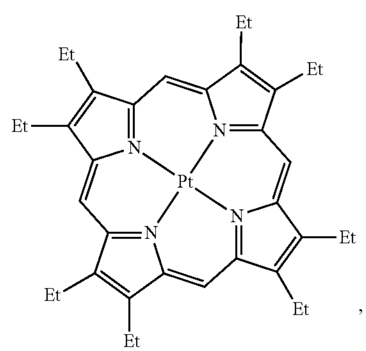

,

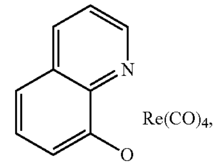

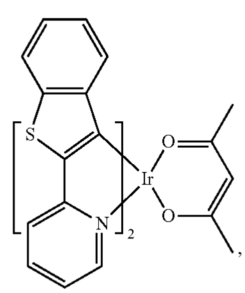

,

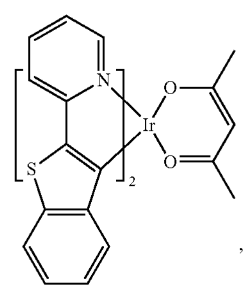

,

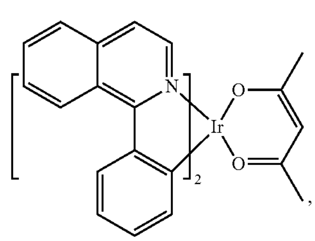

,

-continued
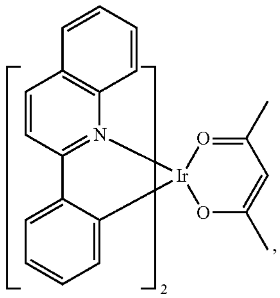
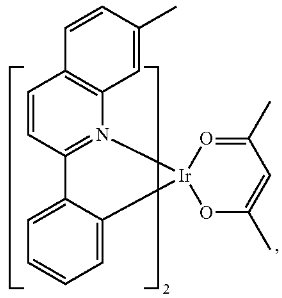
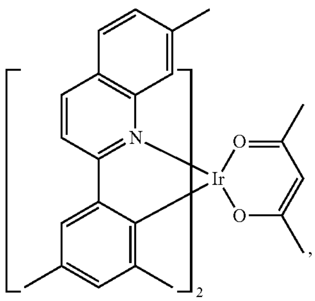
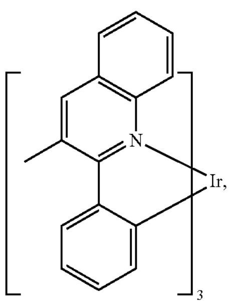
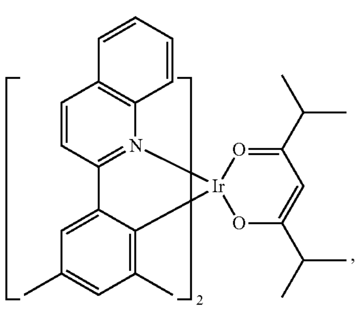
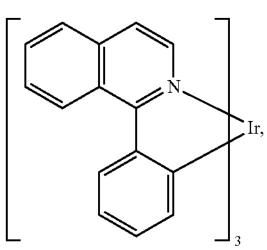
-continued
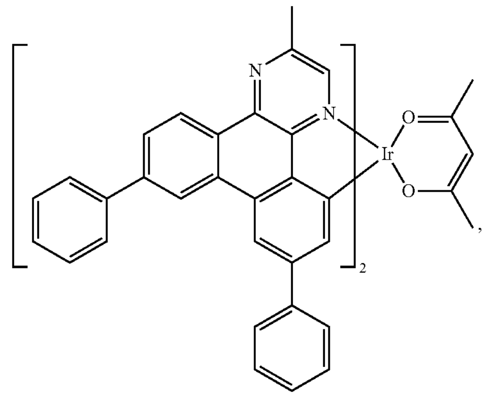
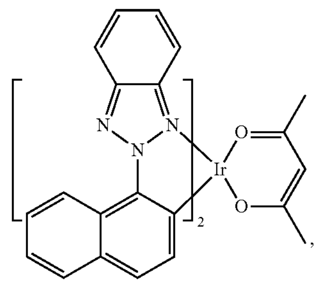
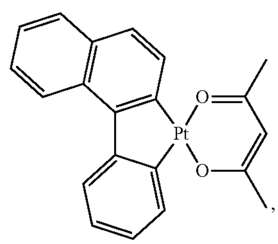
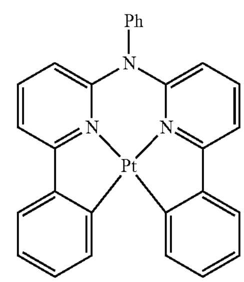
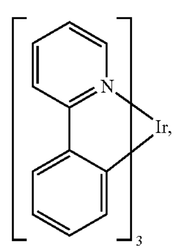
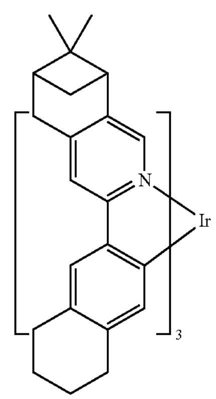
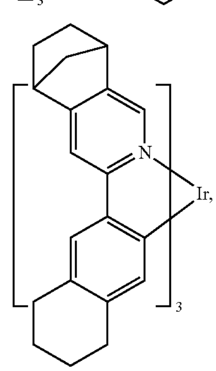

-continued
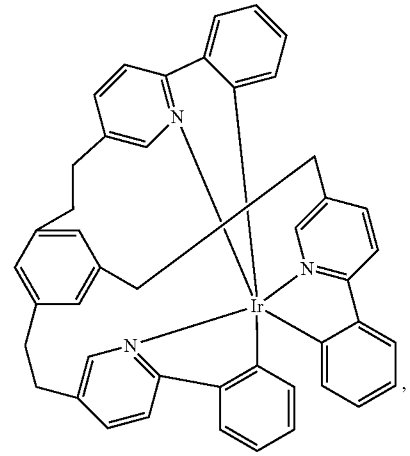
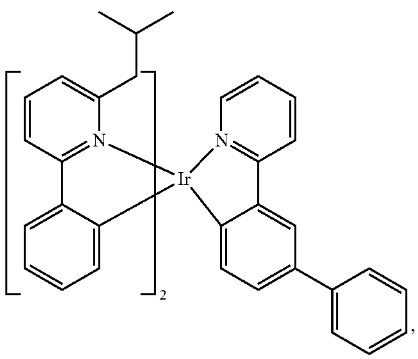
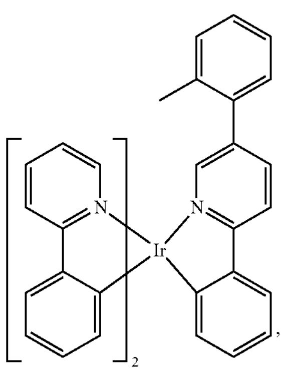
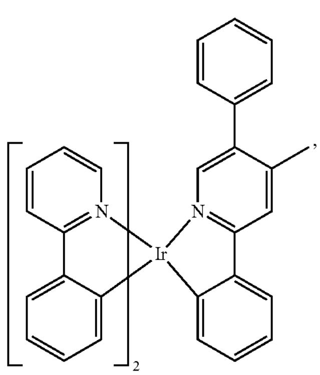
-continued
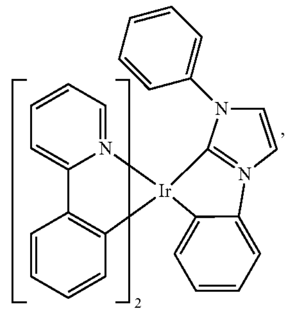
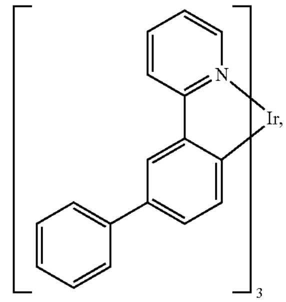
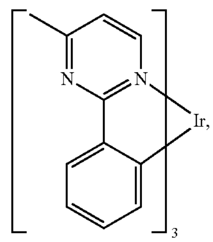
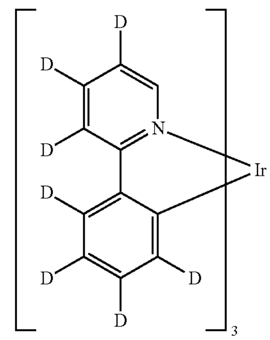
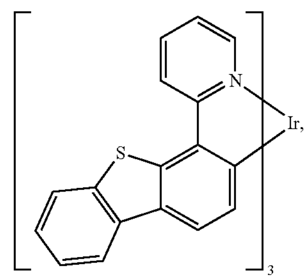
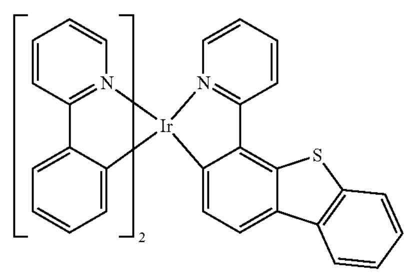
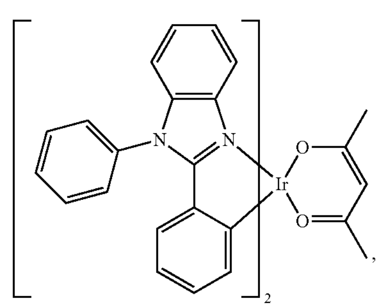

-continued
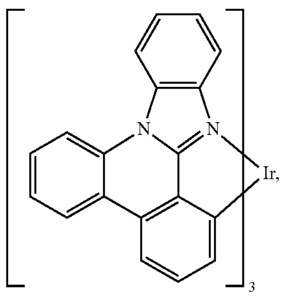
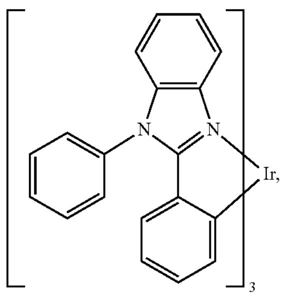
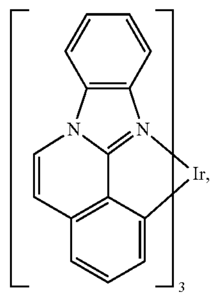
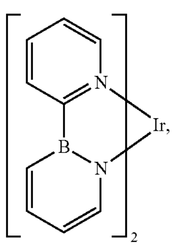
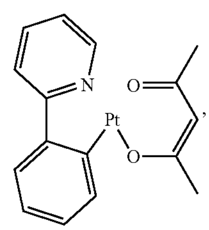
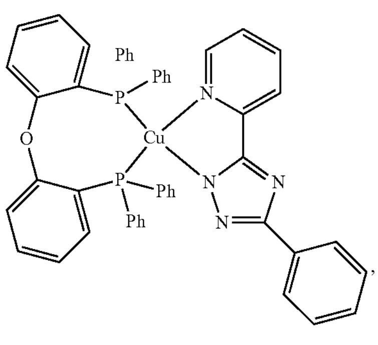
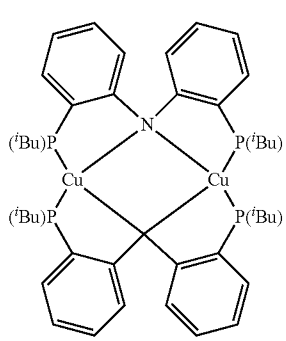
-continued
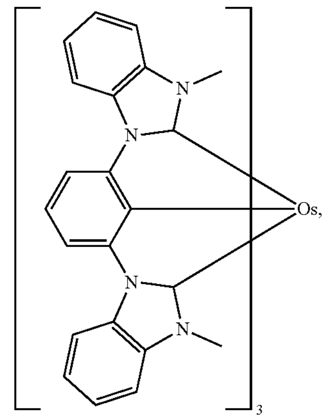
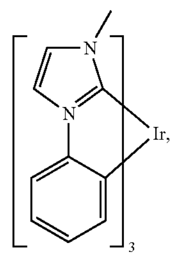
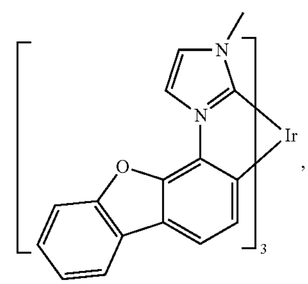
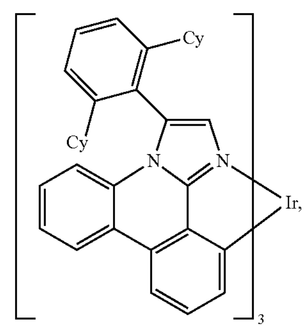
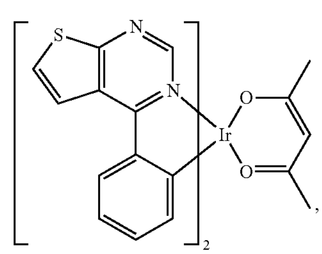
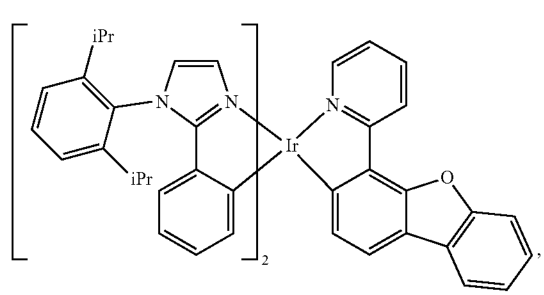

-continued
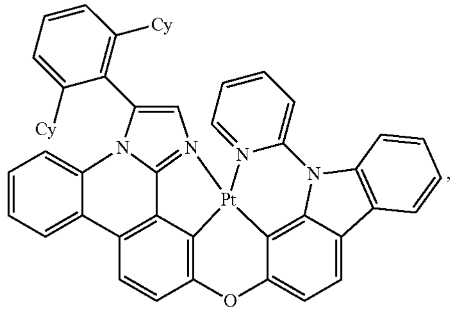
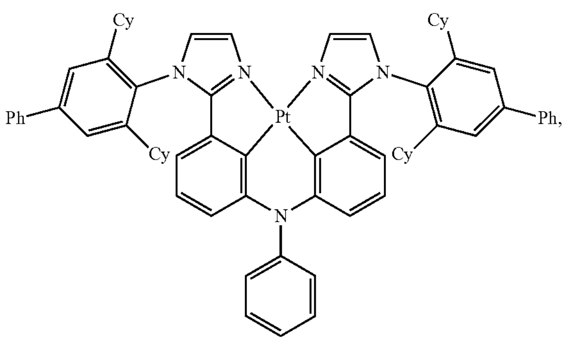
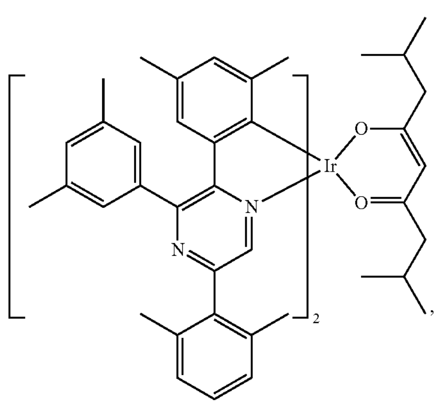
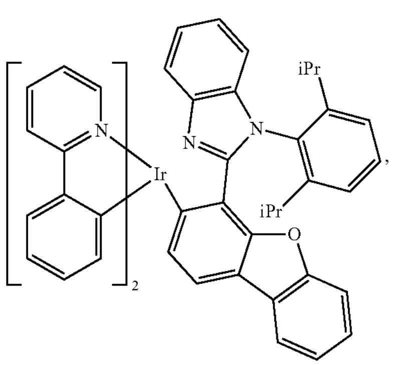
-continued
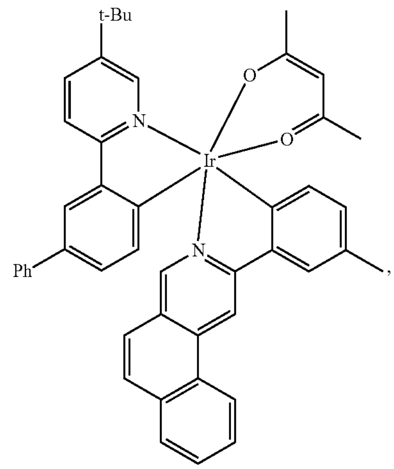
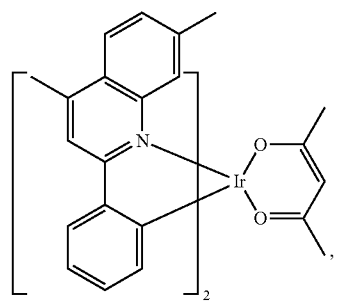
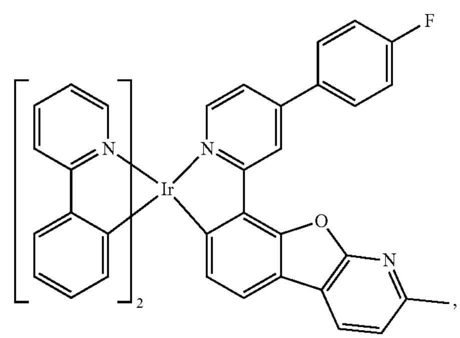
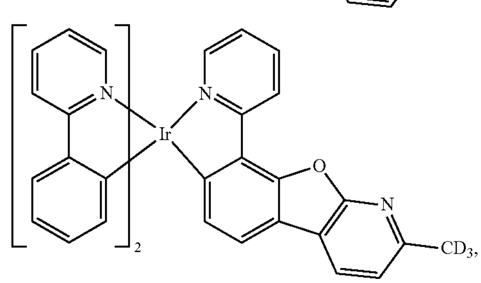
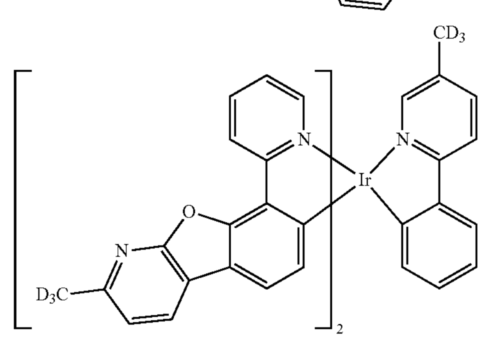

-continued
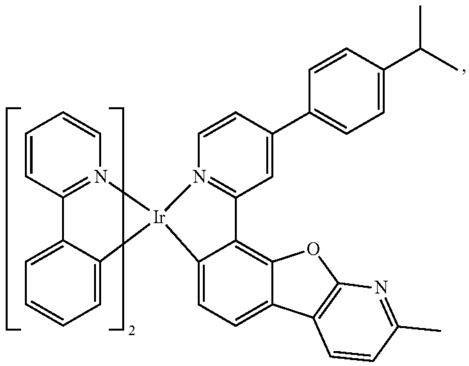
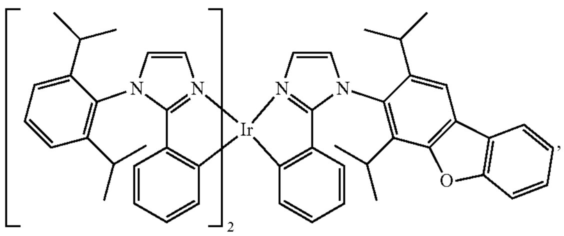
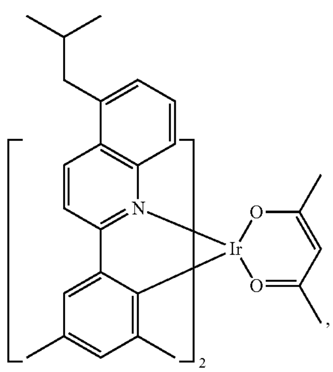
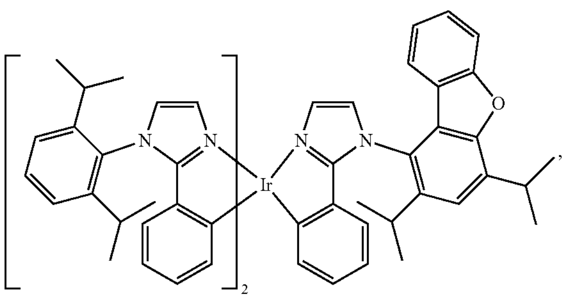
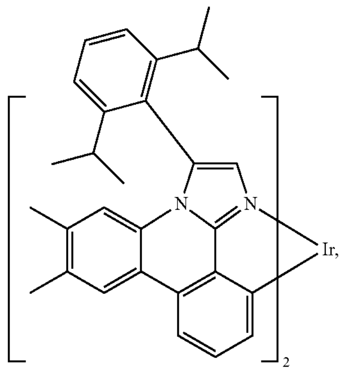
-continued
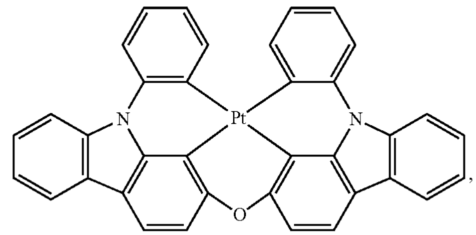
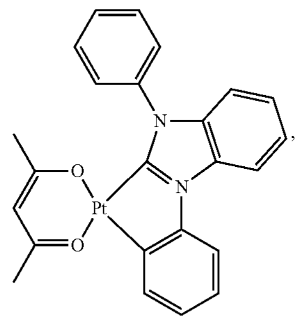
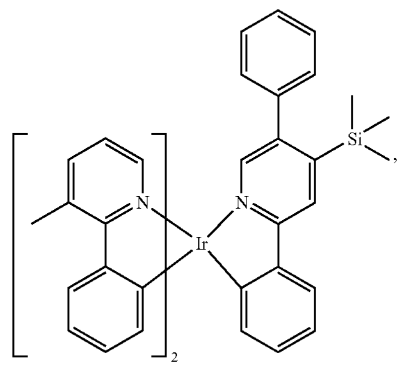
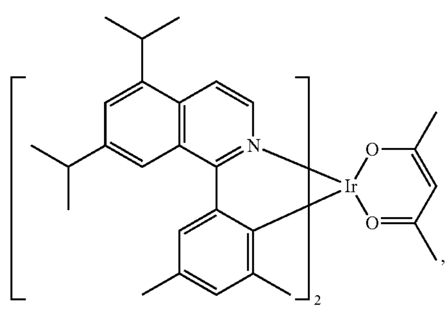
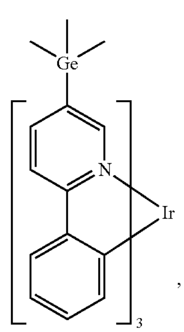
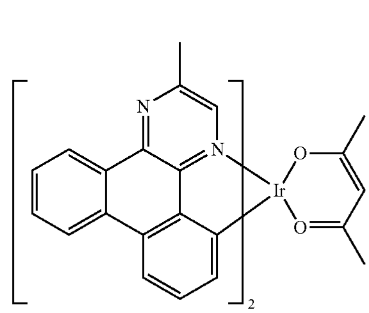

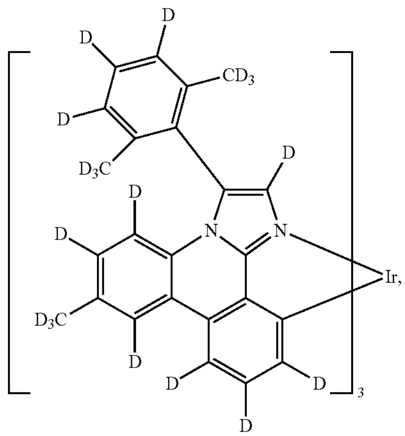
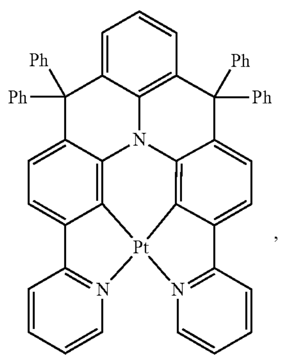
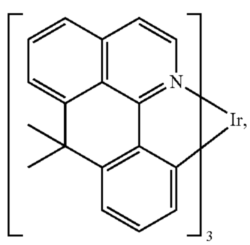
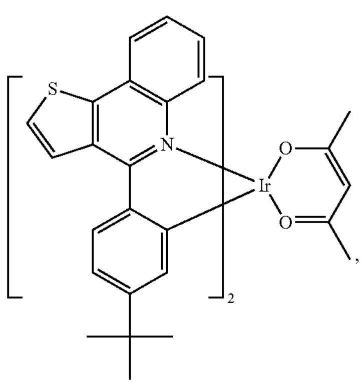
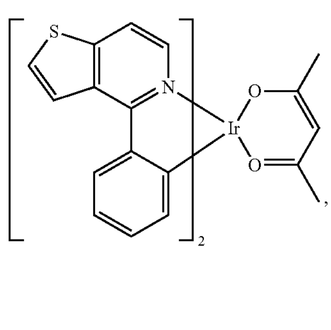
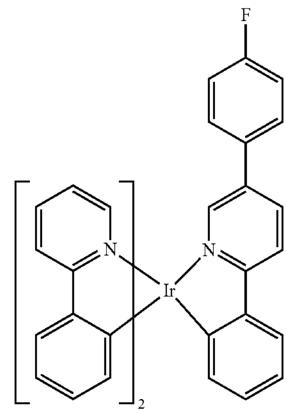
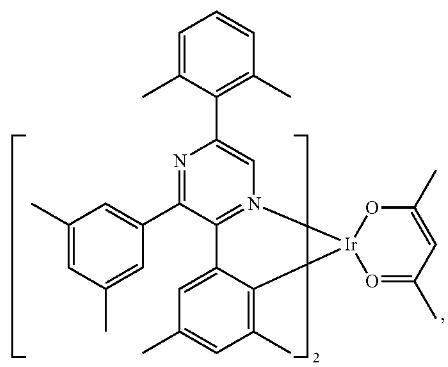
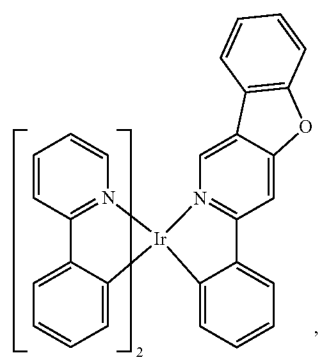
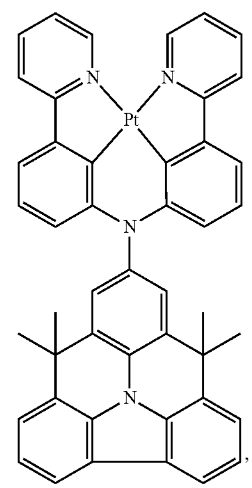
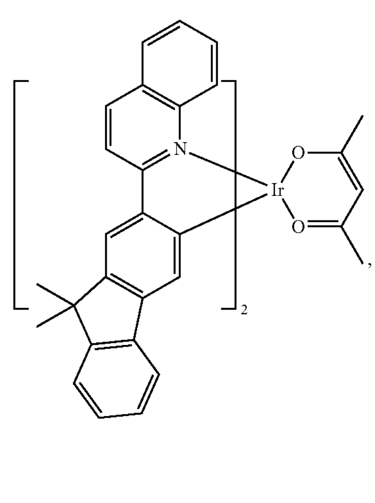

-continued
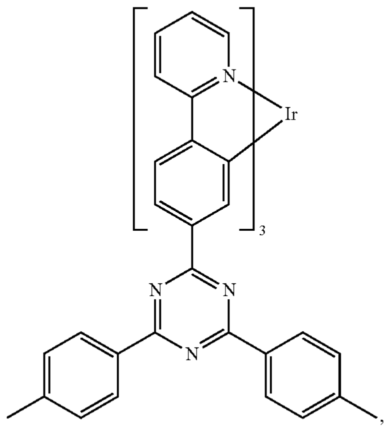
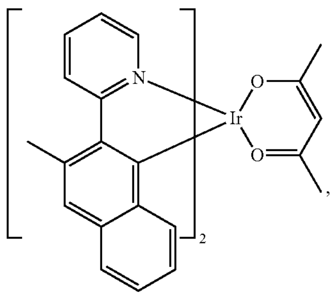
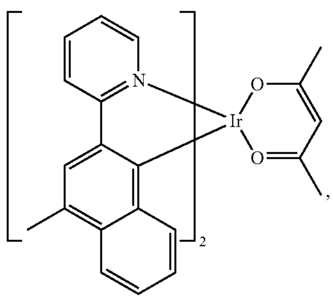
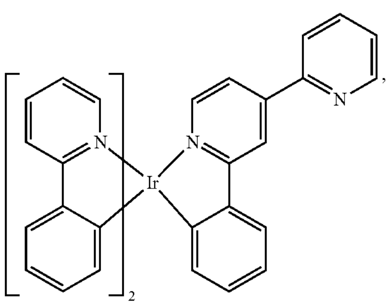
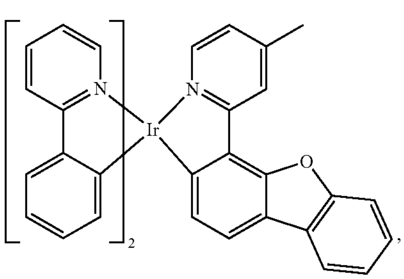
-continued
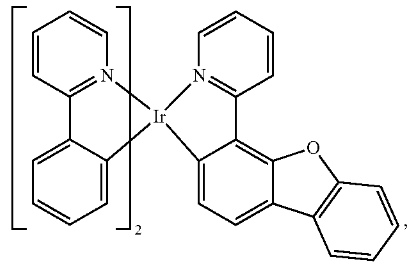
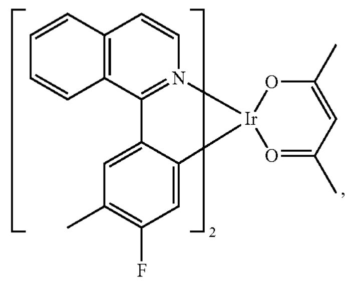
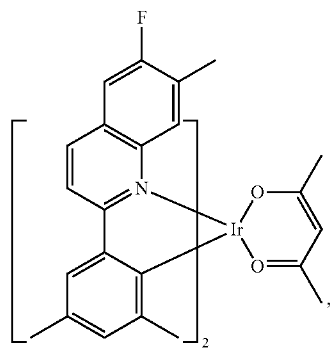
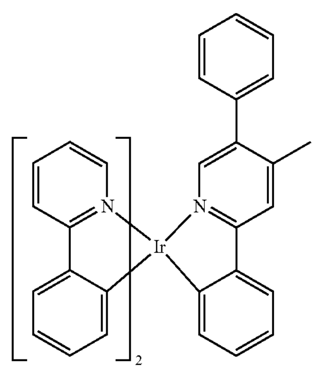
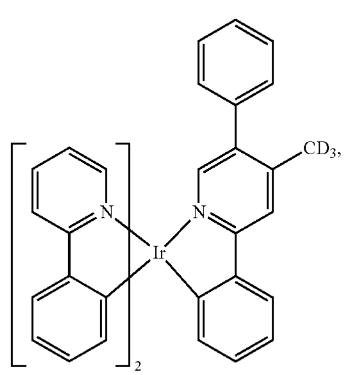

-continued
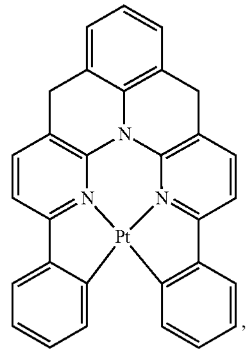
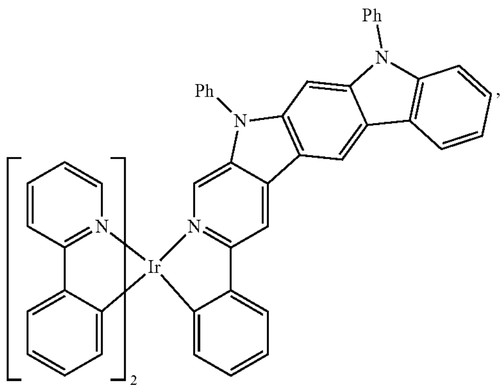
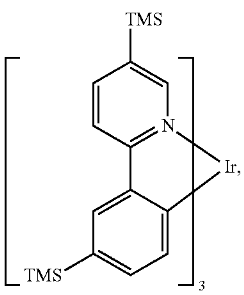
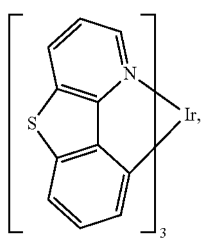
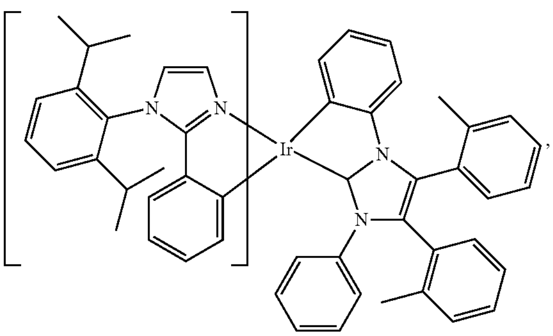
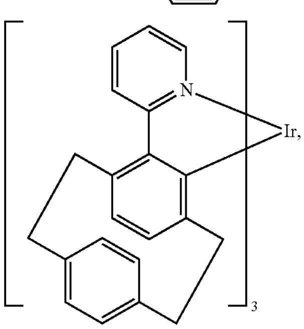
-continued
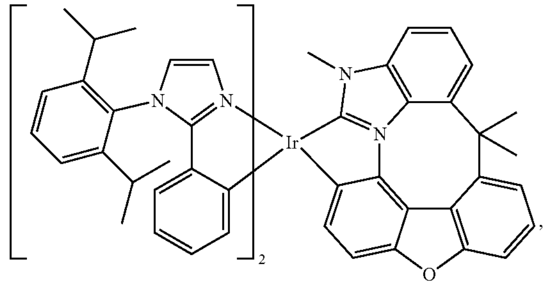
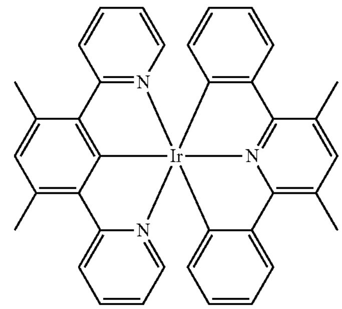
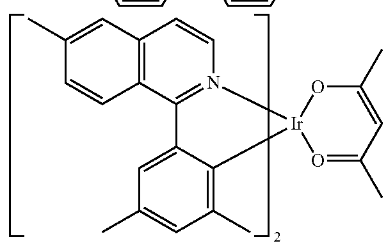
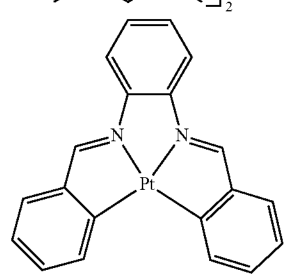
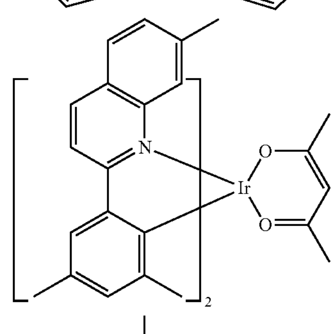
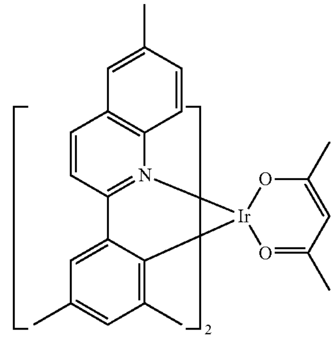

-continued
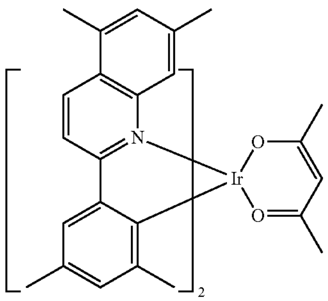
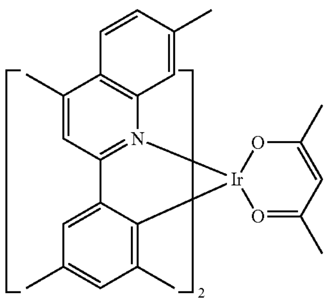
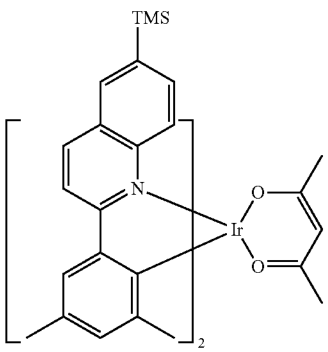
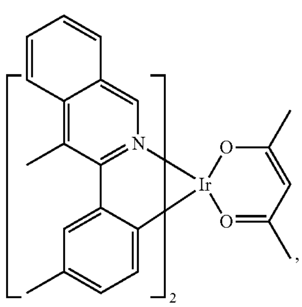
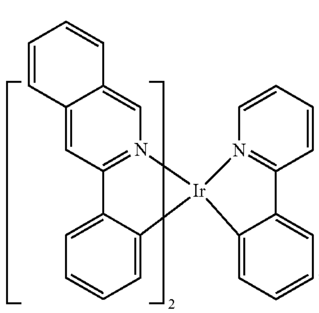
-continued
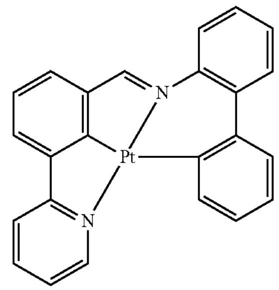
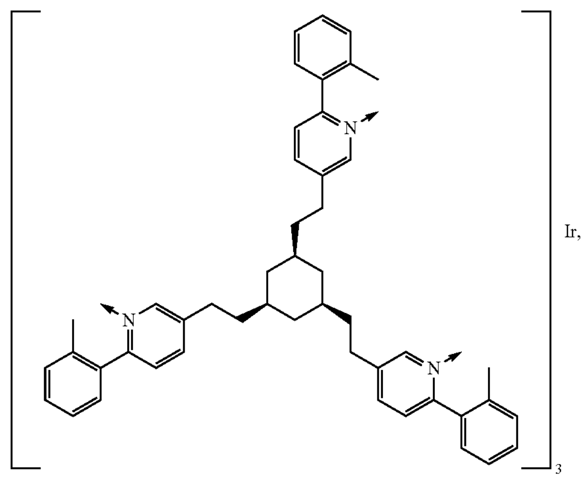
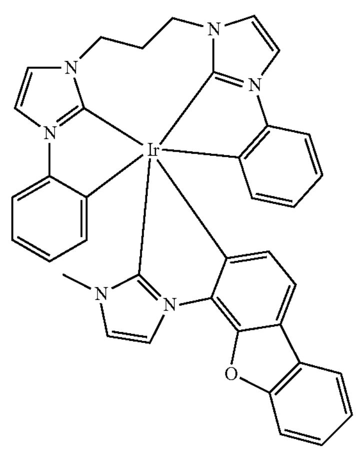
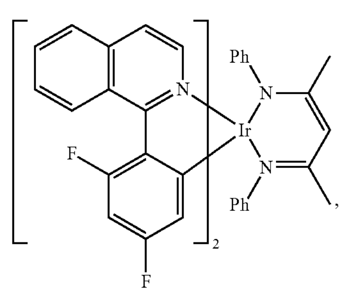

-continued
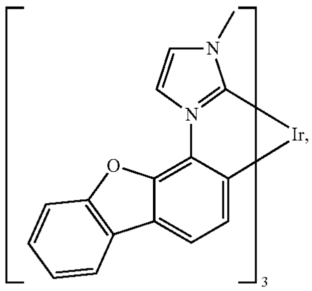
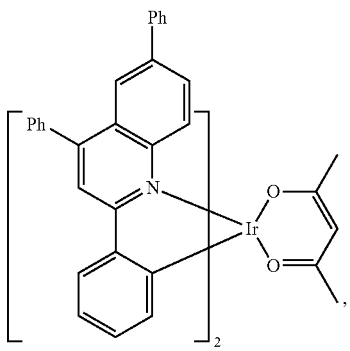
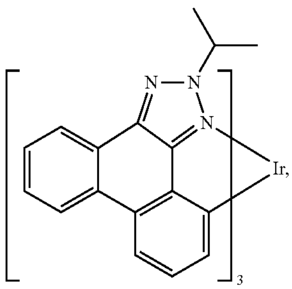
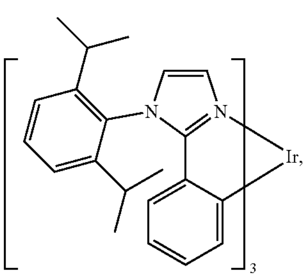
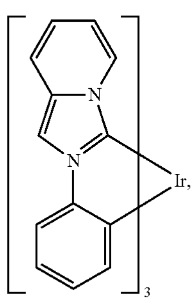
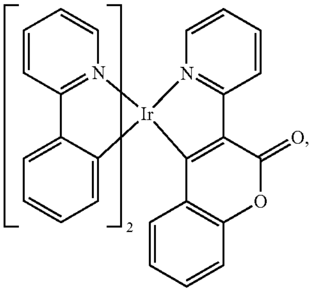
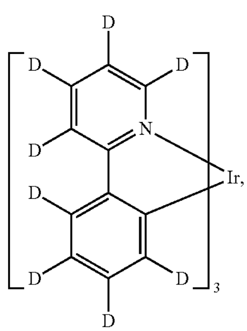
-continued
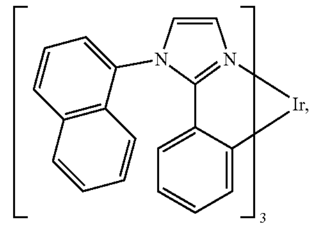
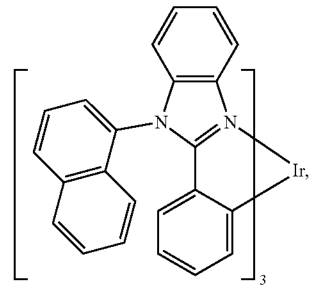
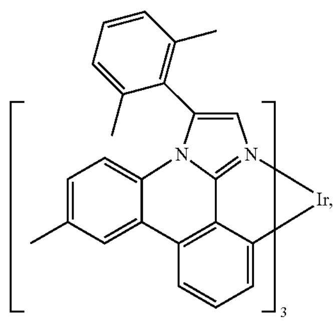
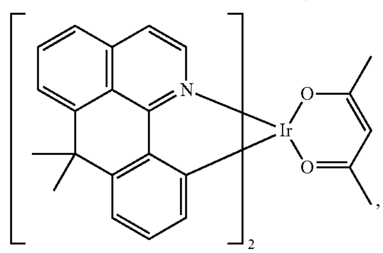
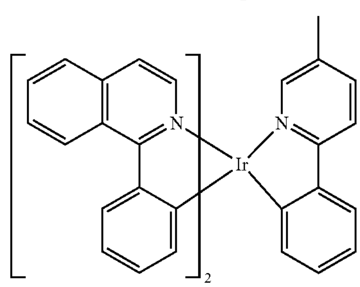
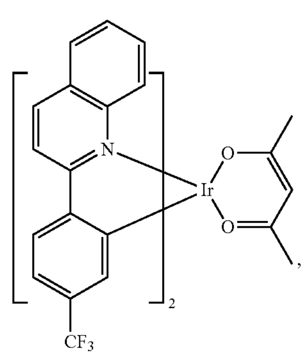

-continued

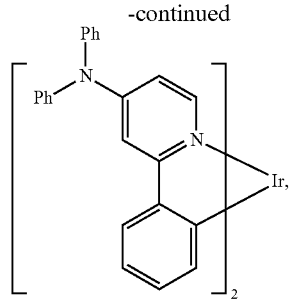

and

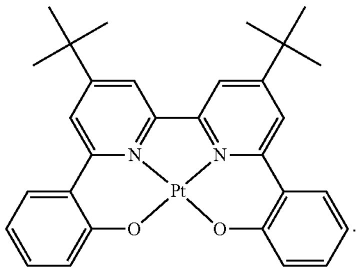

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

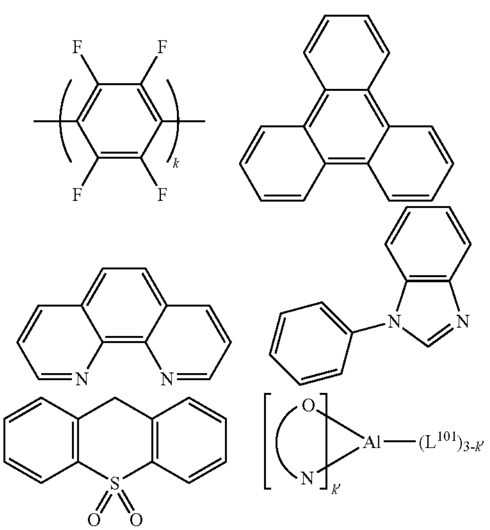

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

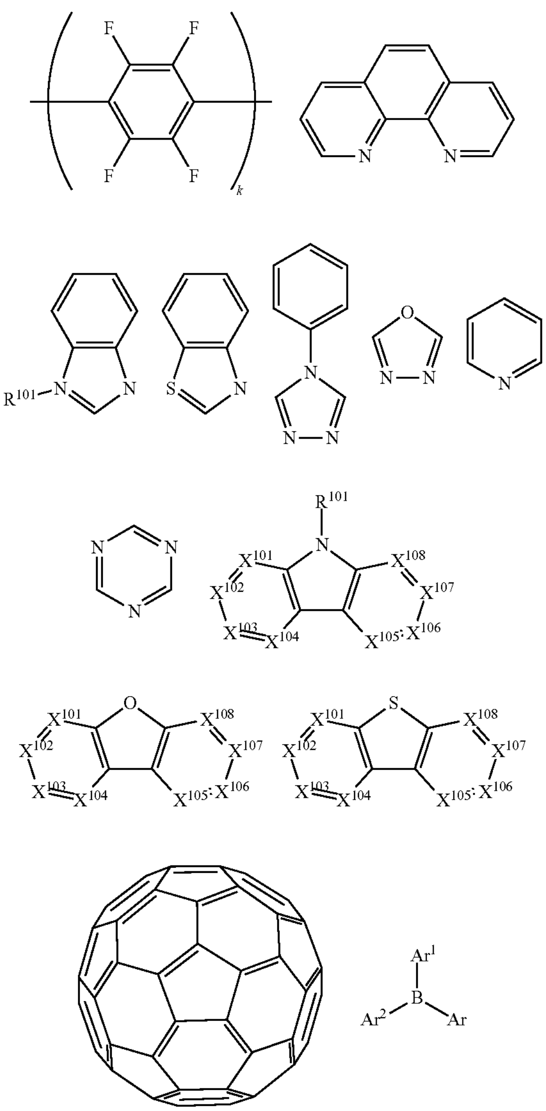

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $Y^{108}$ is selected from C (including CH) or N.

In another aspect, the metal complexes used in ETL contains, but not limit to the following general formula:

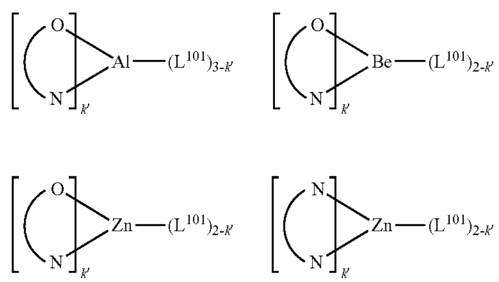

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

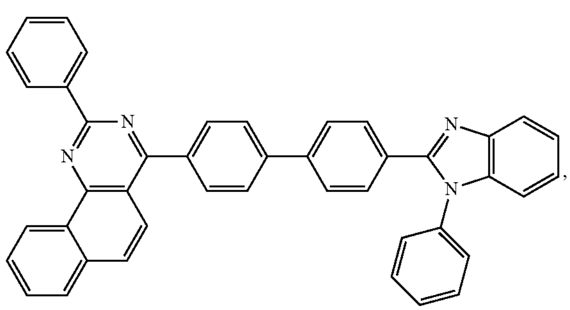

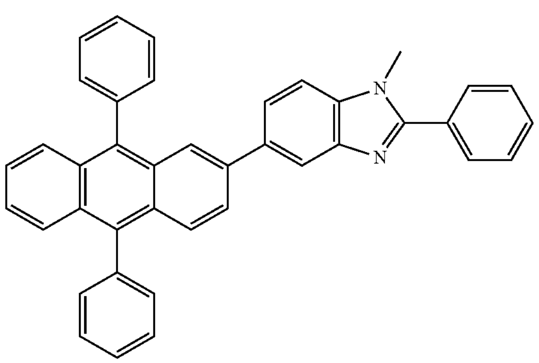

-continued

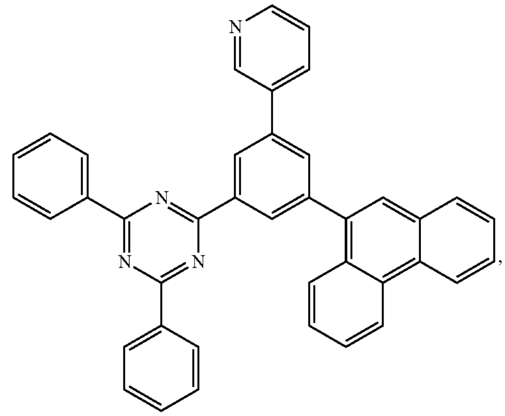

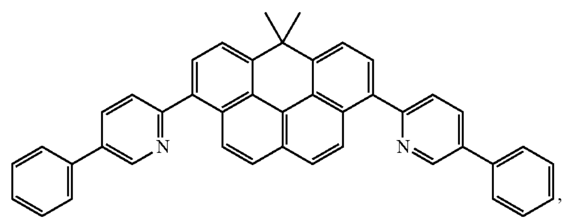

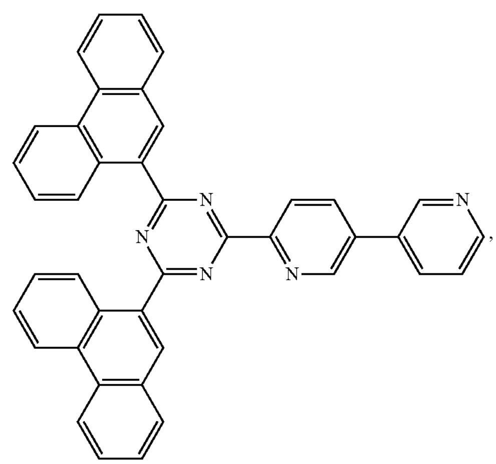

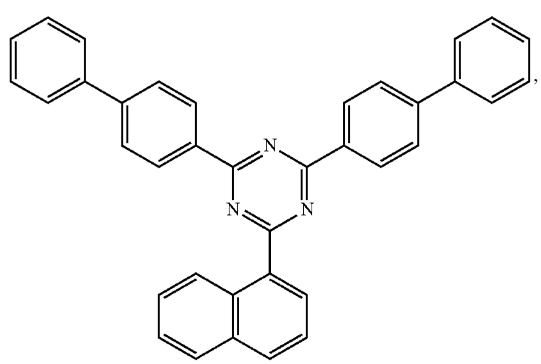

-continued
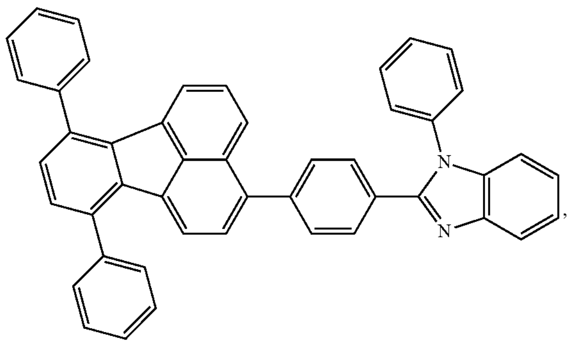
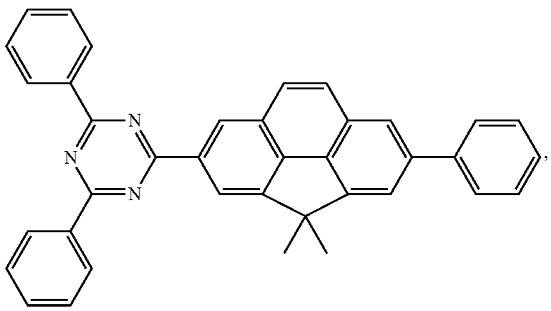
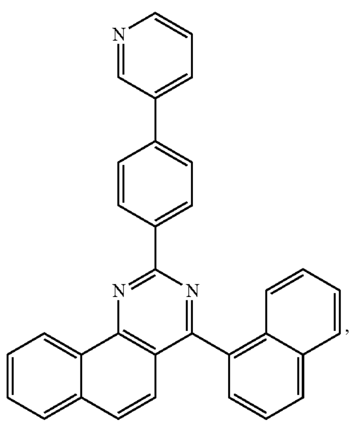
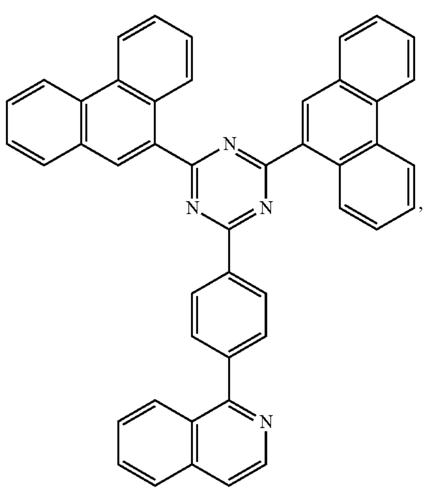
-continued
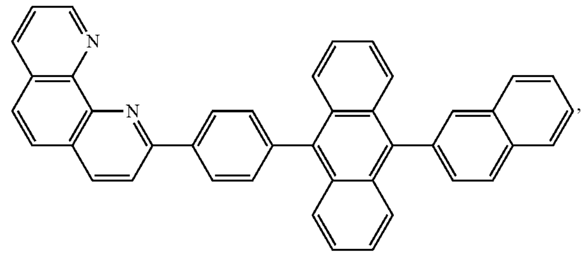
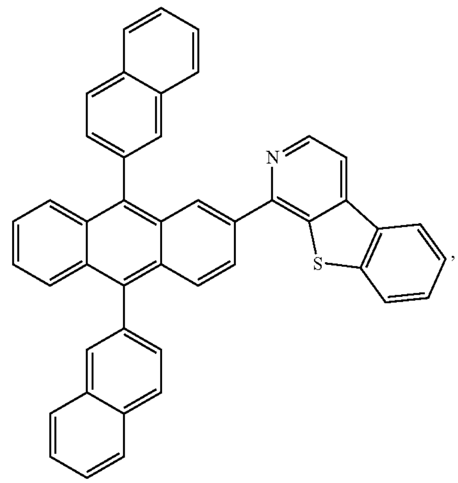
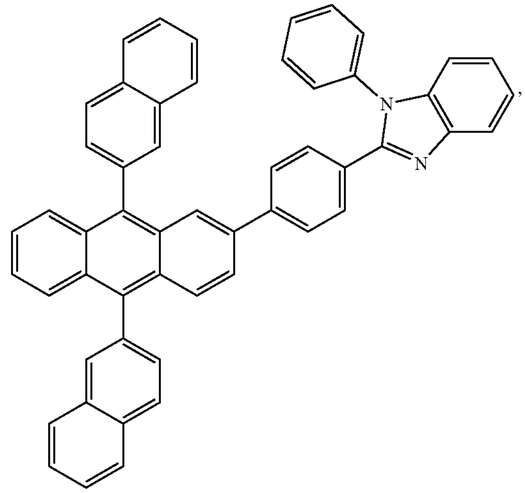
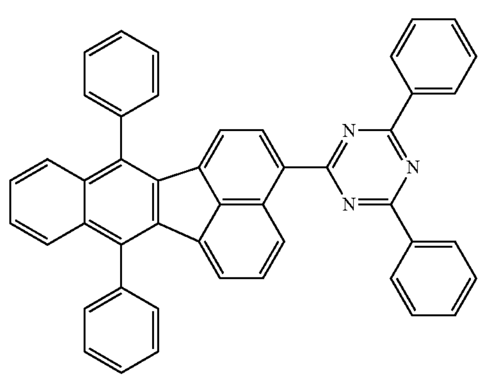

-continued
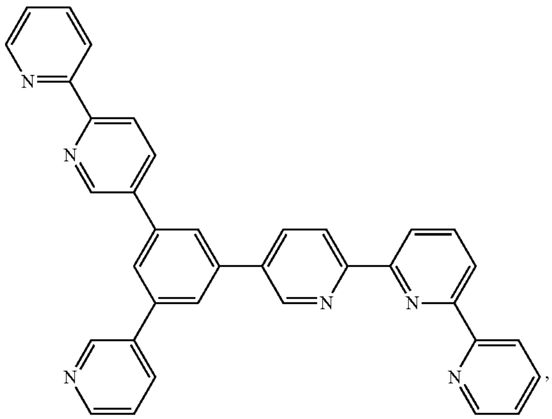
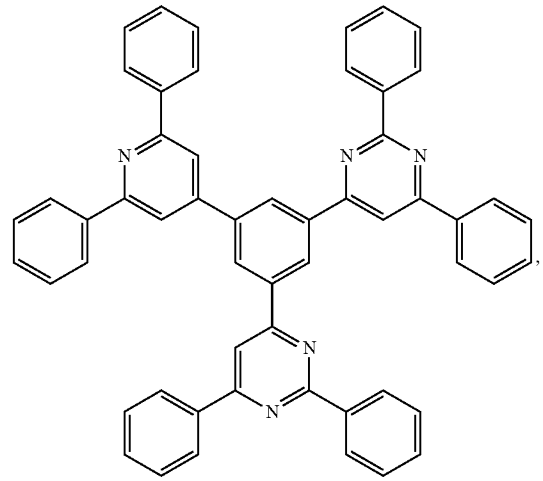
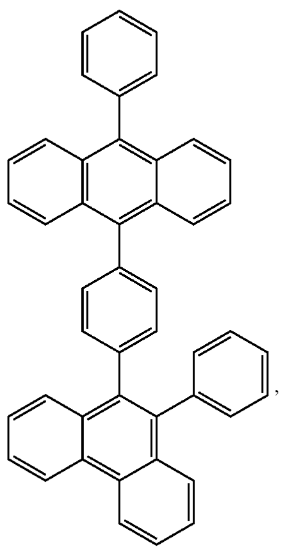
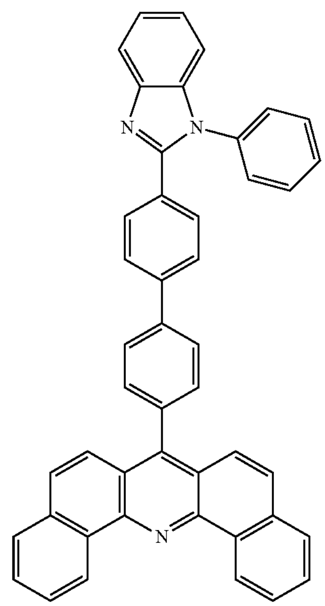
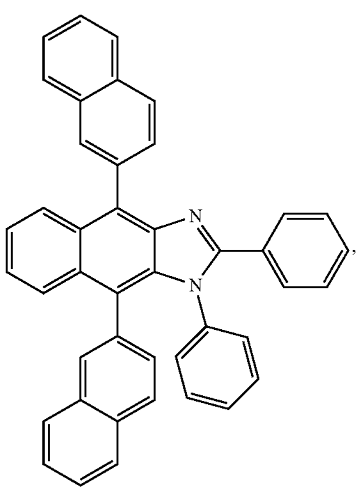 [SMILES: c1ccc(-c2nc3c(-c4ccc5ccccc5c4)c4ccccc4c(-c4ccc5ccccc5c4)c3n2-c2ccccc2)cc1]
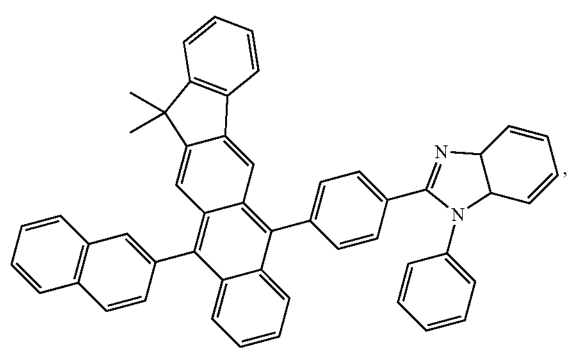
-continued -continued
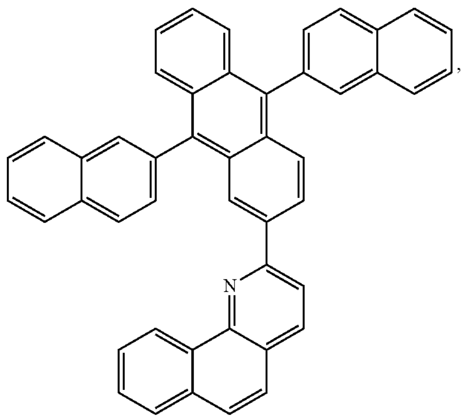
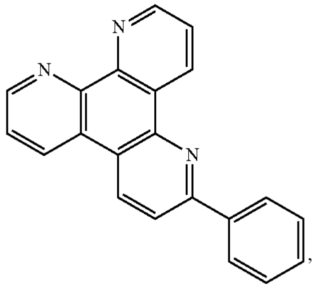
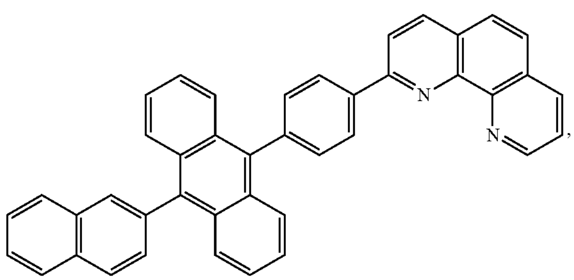
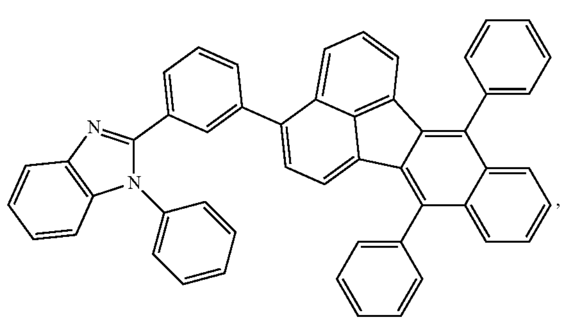
-continued
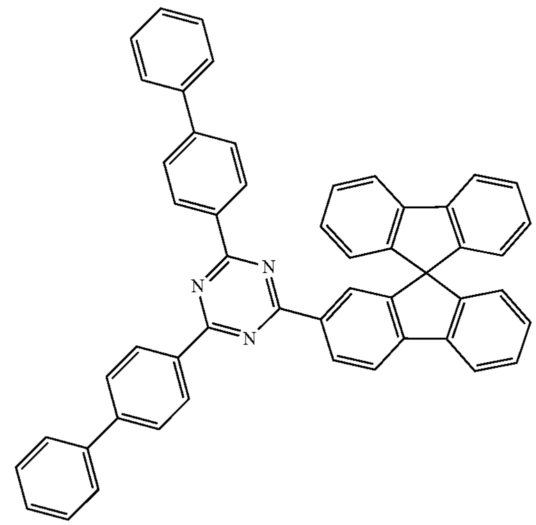
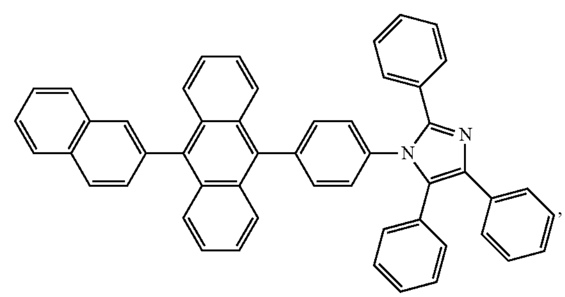
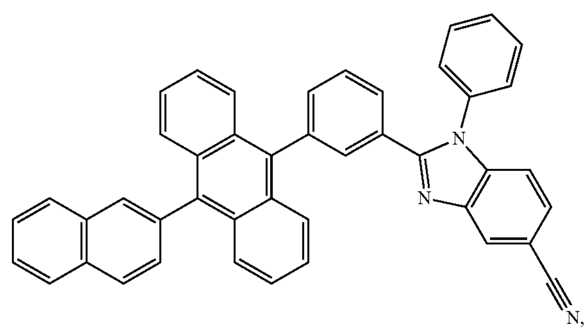
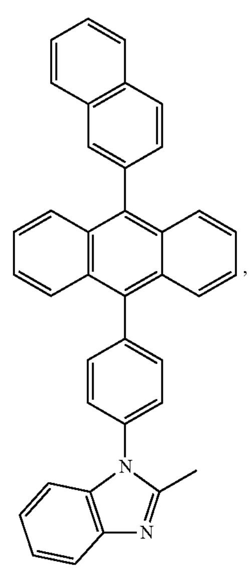

-continued

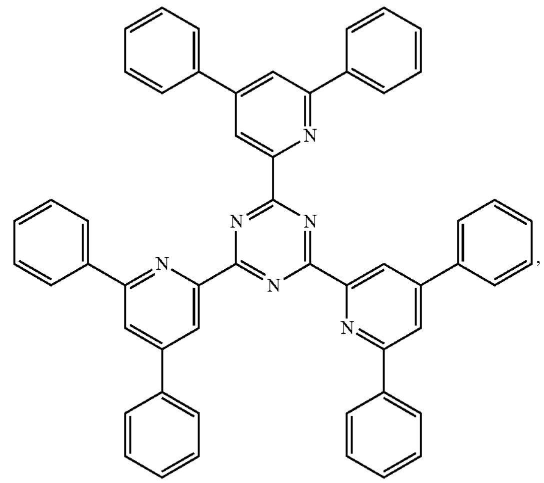

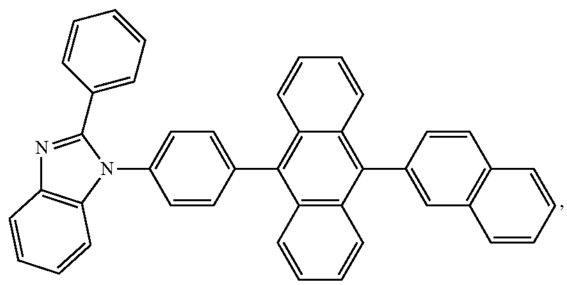

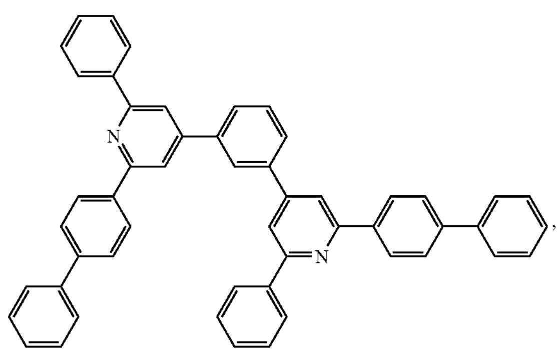

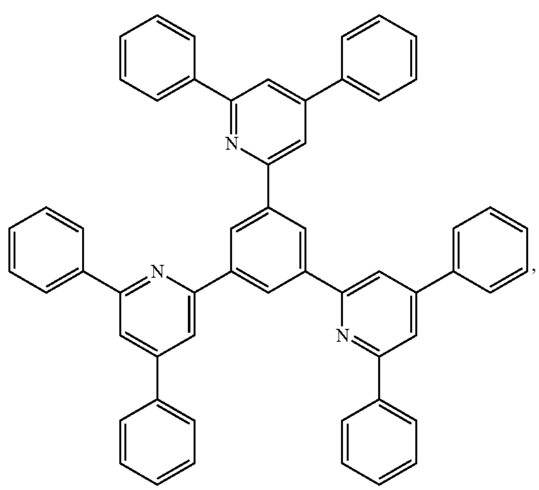

-continued

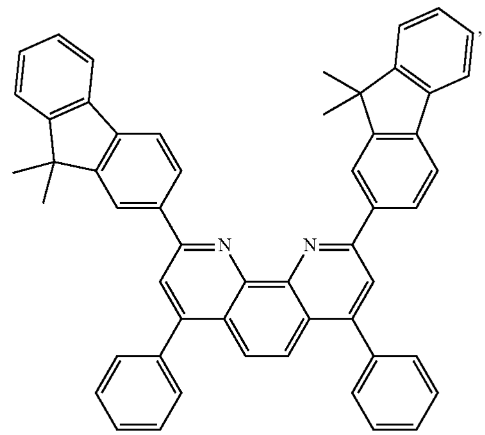

and

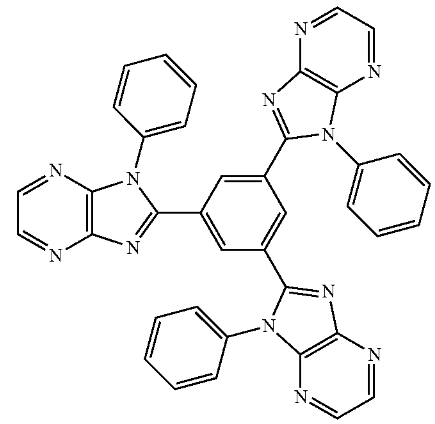

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

Synthesis

Materials Synthesis—All reactions were carried out under nitrogen atmosphere unless specified otherwise. All solvents for reactions are anhydrous and used as received from commercial sources.

Synthesis of Compound [Ir($L_{A17}$)$_2$($L_{B22}$)]

Synthesis of 6-(tert-butyl)-4-chloro-2H-pyran-2-one

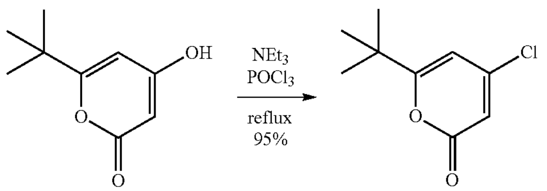

A solution of 6-(tert-butyl)-4-hydroxy-2H-pyran-2-one (9.50 g, 56.50 mmol), $POCl_3$ (31.9 mL, 198 mmol) and $NEt_3$ (7.8 mL, 56.50 mmol) was heated to reflux overnight. The reaction flask was cooled to rt and the reaction mixture was quenched with ice and extracted with EtOAc. The crude product was adsorbed onto Celite and purified via flash chromatography ($CH_2Cl_2$/EtOAc/Heptanes, 1:4:45) to provide 6-(tert-butyl)-4-chloro-2H-pyran-2-one as a golden oil (10.0 g, 95%).

Synthesis of 1-(tert-butyl)-3-chloronaphthalene

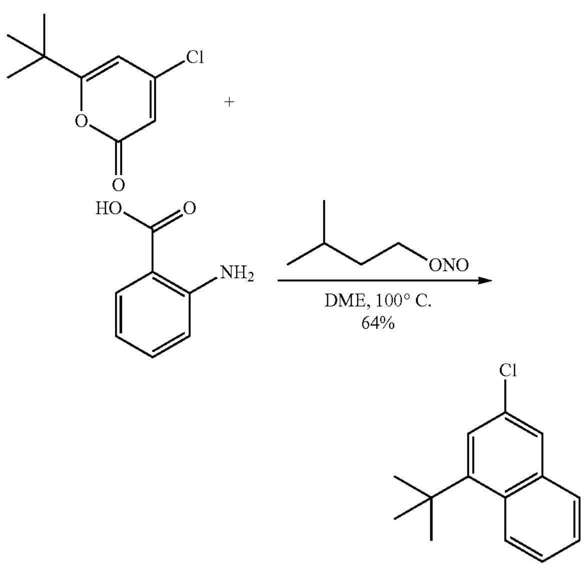

A solution of 6-(tert-butyl)-4-chloro-2H-pyran-2-one (8.90 g, 47.70 mmol) in 1,2-Dimethoxyethane (100 mL) was heated to 100° C. Subsequently, isoamyl nitrite (9.63 mL, 71.50 mmol), previously dissolved in 1,2-Dimethoxyethane (60 mL), and 2-aminobenzoic acid (9.81 g, 71.50 mmol), previously dissolved in 1,2-Dimethoxyethane (60 mL), were added to the reaction mixture simultaneously with the aid of addition funnels in a dropwise fashion. The reaction mixture was left to stir at 100° C. overnight. The reaction flask was cooled to rt and the reaction mixture was concentrated in vacuo. The crude product was adsorbed onto Celite and purified via flash chromatography ($CH_2Cl_2$/EtOAc/Heptanes, 1:2:47) to provide 1-(tert-butyl)-3-chloronaphthalene as a light yellow oil (6.7 g, 64%).

Synthesis of 2-(4-(tert-butyl)naphthalen-2-yl)-4,4,5,5-tetramethyl-1,3,2-dioxaborolane

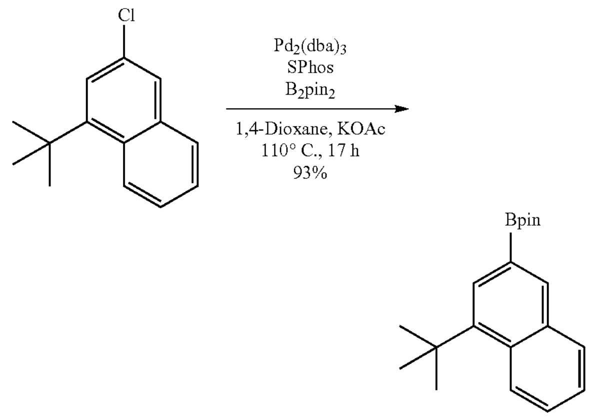

A solution of 1-(tert-butyl)-3-chloronaphthalene (6.20 g, 28.30 mmol), 4,4,4',4',5,5,5',5'-octamethyl-2,2'-bi(1,3,2-dioxaborolane) (9.36 g, 36.90 mmol), $Pd_2(dba)_3$ (0.52 g, 0.57 mmol), SPhos (0.93 g, 2.27 mmol), and KOAc (8.35 g, 85.00 mmol) in 1,4-Dioxane (90 mL) was heated to 110° C. for 17 h. After this time, the reaction flask was cooled to rt and the reaction mixture was filtered through a plug of Celite, eluting with EtOAc, and concentrated in vacuo. The crude product was adsorbed onto Celite and purified via flash chromatography (EtOAc/Heptanes, 1:49 to 1:9) to provide 2-(4-(tert-butyl)naphthalen-2-yl)-4,4,5,5-tetramethyl-1,3,2-dioxaborolane as an off-white solid (8.80 g, 93%).

Synthesis of 2-(4-(tert-butyl)naphthalen-2-yl)-4,5-dichloroquinoline

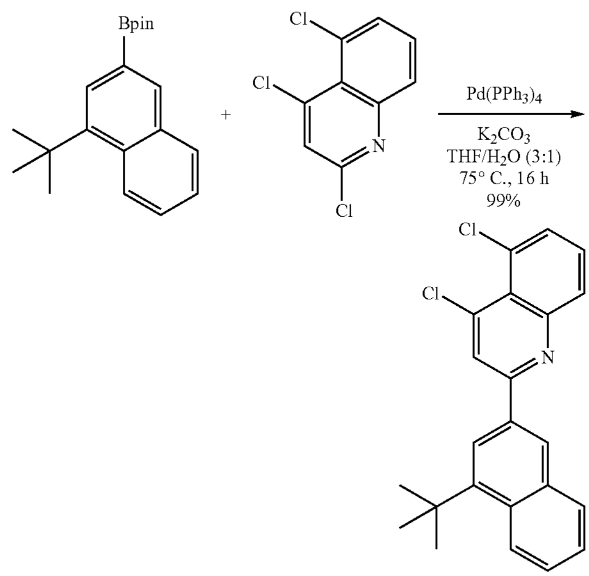

2-(4-(tert-butyl)naphthalen-2-yl)-4,4,5,5-tetramethyl-1,3,2-dioxaborolane (4.31 g, 13.90 mmol), 2,4,5-trichloroquinoline (3.20 g, 13.76 mmol), $K_2CO_3$ (5.71 g, 41.30 mmol)

THF (51 mL) and $H_2O$ (17 mL) were combined in a flask. The reaction mixture was purged with $N_2$ for 15 min followed by the addition of $Pd(PPh_3)_4$ (0.80 g, 0.69 mmol). The reaction mixture was then heated to 75° C. for 16 h. After this time, the reaction flask was cooled to rt and the reaction mixture was extracted with EtOAc. The crude product was adsorbed onto Celite and purified via flash chromatography (EtOAc/Heptanes, 1:49) to provide 2-(4-(tert-butyl)naphthalen-2-yl)-4,5-dichloroquinoline as a yellow solid (5.50 g, 99%).

Synthesis of 2-(4-(tert-butyl)naphthalen-2-yl)-4,5-dimethylquinoline

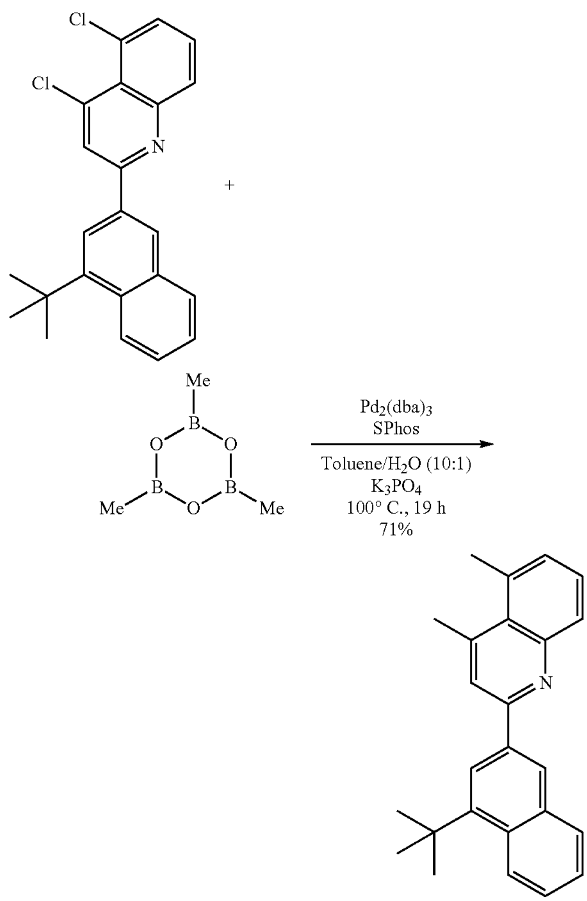

A solution of 2-(4-(tert-butyl)naphthalen-2-yl)-4,5-dichloroquinoline (5.50 g, 14.46 mmol), $Pd_2(dba)_3$ (0.53 g, 0.58 mmol), SPhos (0.95 g, 2.31 mmol), trimethylboroxine (4.85 mL, 34.70 mmol) and $K_3PO_4$ (12.28 g, 57.80 mmol) in Toluene (65 mL) and $H_2O$ (6.5 mL), purged with $N_2$ for 15 min, and was heated to 100° C. for 19 h. After this time, the reaction flask was then cooled to rt and the reaction mixture was extracted with EtOAc. The crude product was adsorbed onto Celite and purified via flash chromatography (EtOAc/Heptanes, 1:99 to 1:49) and then via reverse phase chromatography ($MeCN/H_2O$, 90:10 to 92/8 to 95/5) to provide 2-(4-(tert-butyl)naphthalen-2-yl)-4,5-dimethylquinoline as a white solid (3.50 g, 71%).

Synthesis of Iridium(III) Dimer

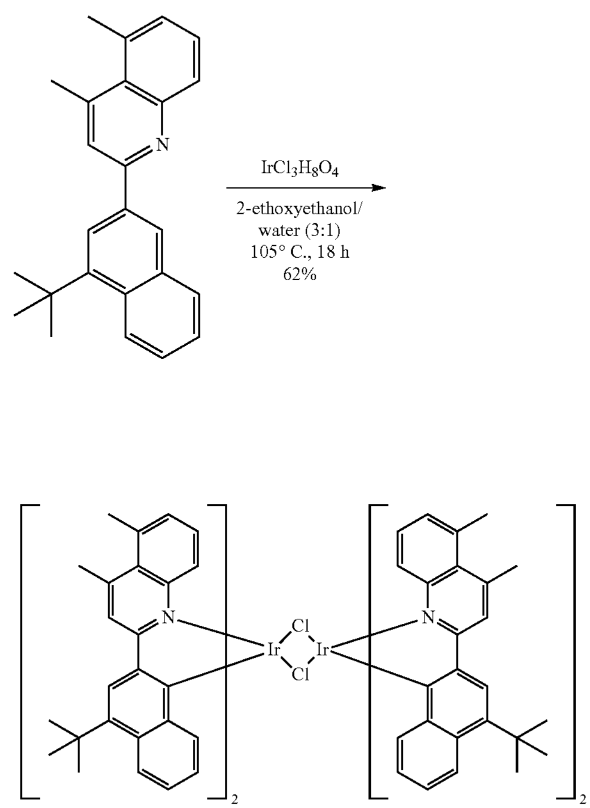

2-(4-(tert-butyl)naphthalen-2-yl)-4,5-dimethylquinoline (3.52 g, 10.36 mmol) was dissolved in 2-ethoxyethanol (42.0 mL) and water (14.0 mL) and the mixture was degassed with $N_2$ for 15 mins. Iridium(III) chloride tetrahydrate (1.28 g, 3.45 mmol) was then added and the reaction mixture was heated to 105° C., under $N_2$, for 16 h. After this time, the reaction flask was cooled to rt. The reaction mixture was diluted with MeOH and filtered to obtain dark brown precipitate, which was dried using a vacuum oven (1.94 g, 62%).

Synthesis of Compound $[Ir(L_{A17})_2(L_{B22})]$

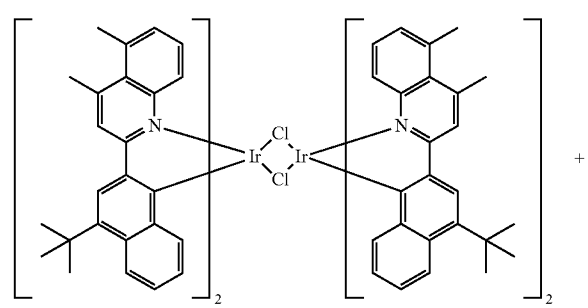

-continued

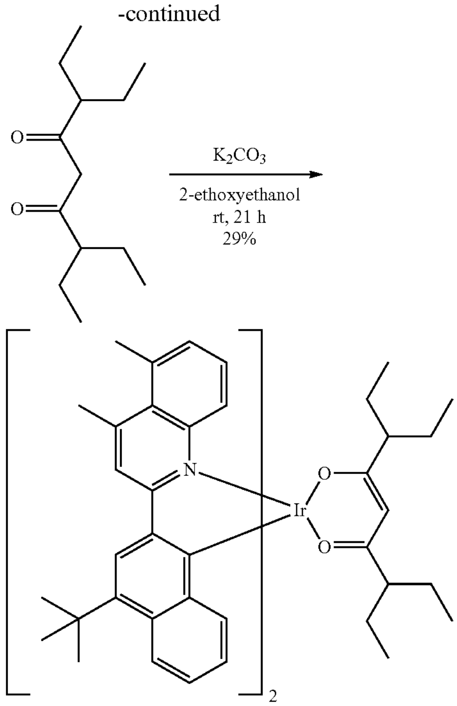

A solution of Iridium(III) dimer (1.00 g, 0.55 mmol) and 3,7-diethylnonane-4,6-dione (1.30 mL, 5.53 mmol) in 2-ethoxyethanol (18 mL) was degassed with $N_2$ for 15 min. $K_2CO_3$ (0.76 g, 5.53 mmol) was next added and the reaction mixture was left to stir at rt, under $N_2$, for 21 h. After this time, the reaction mixture was filtered through a plug of Celite, eluting first with MeOH followed by $CH_2Cl_2$ using a separate filter flask. The filtrate collected was then concentrated in vacuo. The crude product was adsorbed onto Celite and purified via flash chromatography (pretreated with Heptanes/triethylamine, 9:1) using $CH_2Cl_2$/Heptanes (1:99 to 1:49 to 1:9) to provide Compound 3393 [Ir($L_{A17}$)$_2$($L_{B5}$)] as a red solid (0.35 g, 29%).

Synthesis of Compound [Ir($L_{A523}$)$_2$($L_{B22}$)]

Synthesis of 4-(4-(tert-butyl)naphthalen-2-yl)-7-isopropylthieno[3,2-d]pyrimidine

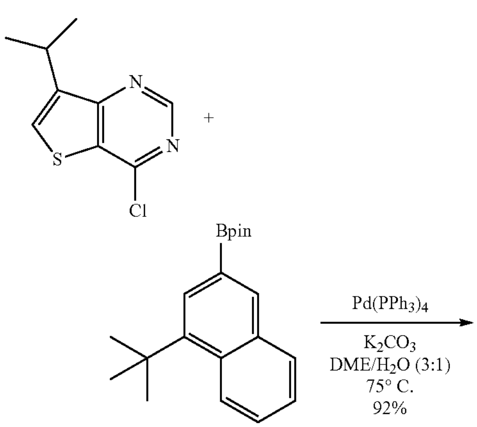

-continued

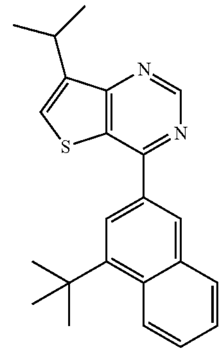

4-chloro-7-isopropylthieno[3,2-d]pyrimidine (2.10 g, 9.87 mmol), 2-(4-(tert-butyl)naphthalen-2-yl)-4,4,5,5-tetramethyl-1,3,2-dioxaborolane (3.22 g, 10.4 mmol), $K_2CO_3$ (3.41 g, 24.7 mmol), DME (53 mL) and $H_2O$ (18 mL) were combined in a flask. The reaction mixture was purged with $N_2$ for 15 min followed by the addition $Pd(PPh_3)_4$ (0.57 g, 0.49 mmol). The reaction mixture was then heated to 75° C., under $N_2$, overnight. Upon completion of the reaction, the reaction flask was cooled to rt and the reaction mixture was extracted with EtOAc. The crude product was purified via flash chromatography Heptanes/EtOAc (9:1 to 4:1) to provide 4-(4-(tert-butyl)naphthalen-2-yl)-7-isopropylthieno[3,2-d]pyrimidine (3.26 g, 92% yield).

Synthesis of the Iridium(III) Dimer

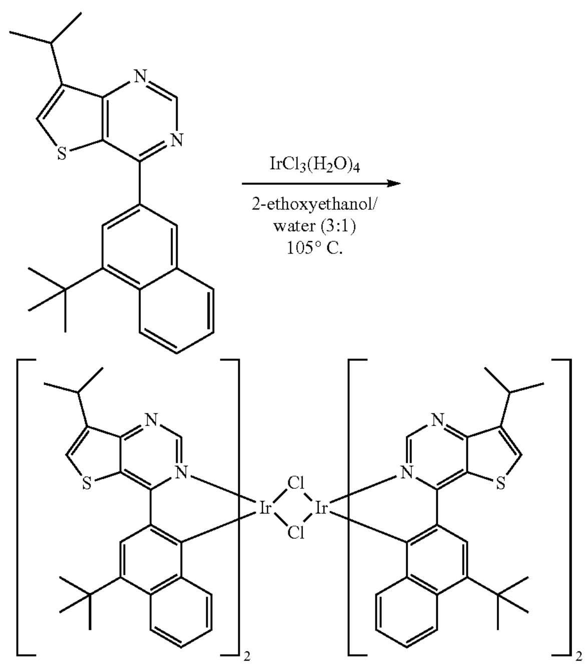

4-(4-(tert-butyl)naphthalen-2-yl)-7-isopropylthieno[3,2-d]pyrimidine (3.16 g, 8.77 mmol) was dissolved in 2-ethoxyethanol (37 mL) and water (12 mL) and the mixture was degassed with $N_2$ for 15 mins. Iridium(III) chloride tetrahydrate (1.00 g, 2.70 mmol) was then added and the reaction mixture was heated to 105° C., under $N_2$, overnight. After this time, the reaction flask was cooled to rt. The reaction mixture was diluted with MeOH and filtered to obtain green precipitate, which was dried using a vacuum oven (quantitative).

Synthesis of Compound [Ir($L_{A523}$)$_2$($L_{B22}$)]

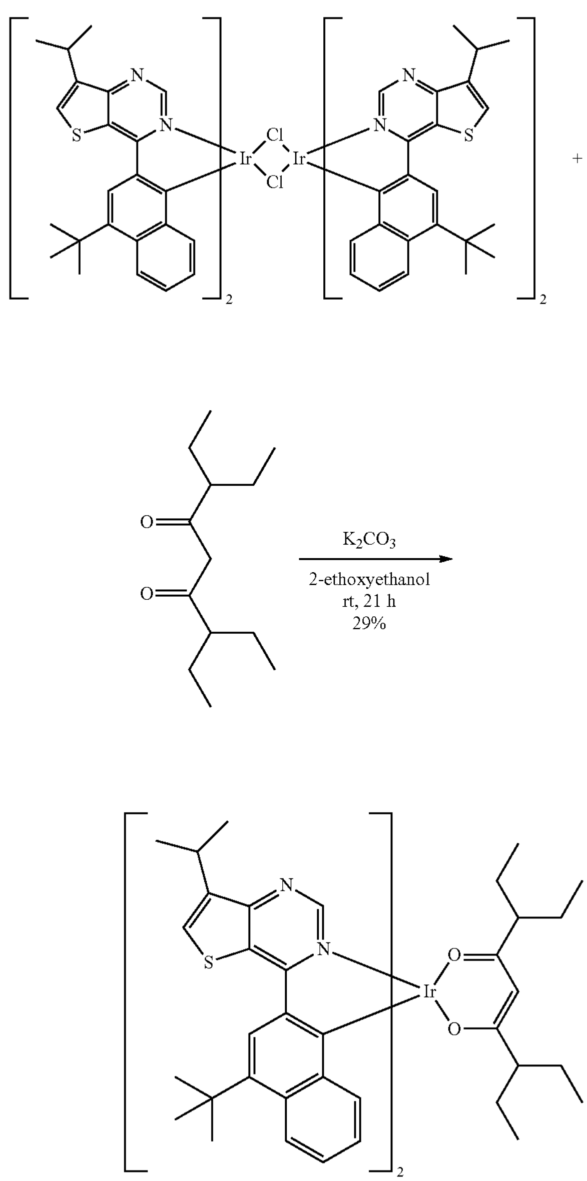

A solution of Iridium(III) dimer (1.50 g, 0.79 mmol) and 3,7-diethylnonane-4,6-dione (1.26 g, 5.94 mmol) in 2-ethoxyethanol (26 mL) was degassed with $N_2$ for 15 min. $K_2CO_3$ (0.82 g, 5.94 mmol) was next added and the reaction mixture was left to stir at rt, under $N_2$, overnight. After this time, the reaction mixture was filtered through a plug of Celite, eluting first with MeOH followed by $CH_2Cl_2$ using a separate filter flask. The filtrate collected was then concentrated in vacuo. The crude product was purified via flash chromatography (pretreated with Heptanes/triethylamine, 9:1) using $CH_2Cl_2$/Heptanes (1:4) to provide Compound 3899 [Ir($L_{A523}$)$_2$($L_{B5}$)] as a red solid (0.70 g, 79%).

Synthesis of Compound [Ir($L_{A783}$)$_2$($L_{B22}$)]

Synthesis of 3-Fluoronaphthalen-2-ol

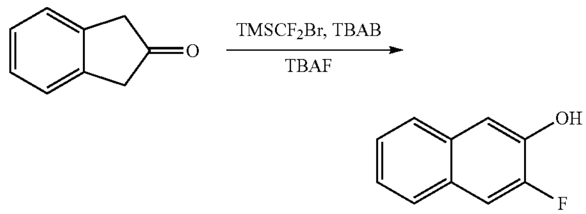

(Bromodifluoromethyl)trimethylsilane (35.3 ml, 227 mmol) was added to a solution of 1,3-dihydro-2H-inden-2-one (20 g, 151 mmol) and tetrabutylammonium bromide (4.88 g, 15.13 mmol) in toluene (500 ml). The reaction was heated to 100° C. and stirred for 2.5 hrs. (Bromodifluoromethyl)trimethylsilane (35.3 ml, 227 mmol) was added and the reaction stirred for a further 3 hrs at 100° C. The reaction was allowed to cool to r.t. and tetra-n-butylammonium fluoride (1M in THF) (30.3 ml, 30.3 mmol) was added. The reaction was allowed to stir at r.t. for ~18 h. The reaction was poured onto 1N HCl (aq) and was extracted with EtOAc. 1N NaOH (aq) was added to the organic phase and the layers separated. The aqueous phase was acidified by the addition of 1N HCl and reextracted with EtOAc. The organic phase was washed with brine, dried ($MgSO_4$) and concentrated under reduced pressure. The crude product was purified via flash chromatography (isohexane to 20% EtOAc in isohexane) to give 3-fluoronaphthalen-2-ol (8.9 g, 54.9 mmol, 36% yield).

Synthesis of 3-Fluoronaphthalen-2-yl trifluoromethanesulfonate

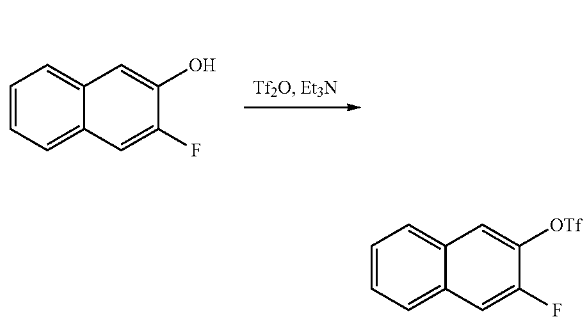

$Tf_2O$ (11.1 ml, 65.9 mmol) was added to a solution of 3-fluoronaphthalen-2-ol (8.90 g, 54.9 mmol) and $Et_3N$ (9.2 ml, 65.9 mmol) in DCM (200 ml) at 0° C. The reaction was stirred at this temperature for 1.5 h. The reaction was quenched via the addition of sat aq. $NaHCO_3$ and the mixture extracted with DCM (×2). The combined organic extracts were dried ($MgSO_4$) and concentrated under reduced pressure. The crude product was purified via flash chromatography (isohexane to 10% EtOAc in isohexane) to give 3-fluoronaphthalen-2-yl trifluoromethanesulfonate (13.3 g, 82% yield) as a colourless oil.

Synthesis of 2-(3-Fluoro-naphthalen-2-yl)-4,4,5,5-tetramethyl-[1,3,2]dioxaborolane

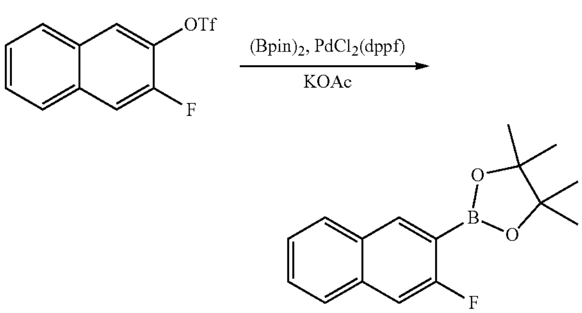

$PdCl_2(dppf)-CH_2Cl_2$ adduct (2.50 g, 3.06 mmol) was added to a degassed solution of 3-fluoronaphthalen-2-yl trifluoromethanesulfonate (18 g, 61.2 mmol), bis(pinacolato)diboron (46.6 g, 184 mmol) and potassium acetate (18 g, 184 mmol) in dioxane (200 ml). The reaction was heated to reflux for 2 h and was then allowed to cool to r.t. The reaction was partitioned between EtOAc and water and the layers separated. The organic phase was dried ($MgSO_4$) and concentrated under reduced pressure to give the crude material. The crude material was filtered through a pad of silica, washing with DCM. The filtrate was concentrated under reduced pressure to give a mixture of 2-(3-fluoro-naphthalen-2-yl)-4,4,5,5-tetramethyl-[1,3,2]dioxaborolane and bis(pinacolato)diboron CH NMR evidence).

Synthesis of (3-Fluoronaphthalen-2-yl)boronic acid

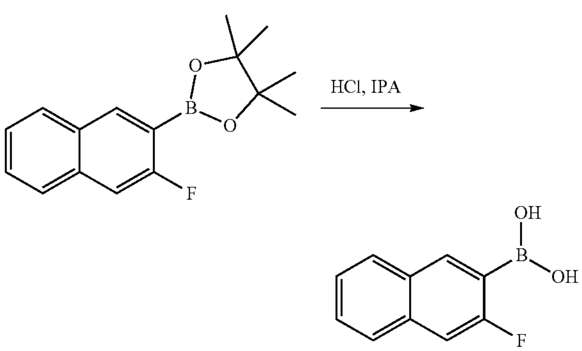

Concentrated HCl (153 ml, 1837 mmol) was added to a solution of crude 2-(3-fluoro-naphthalen-2-yl)-4,4,5,5-tetramethyl-[1,3,2]dioxaborolane and bis(pinacolato)diboron mixture (50 g) in IPA (400 ml). The reaction flask was heated to reflux for ~18 h. The reaction flask was allowed to cool to r.t. and the majority of the IPA was removed under reduced pressure. The resultant precipitate was filtered. The precipitate was purified by flash chromatography (4/1 to 1/1 isohexane/EtOAc) and recrystallisation from IPA/water. The recrystallisation gave 3 batches in total. The filtrate from the first recrystallisation yielded further material on prolonged standing/slow evaporation. Similarly a third batch was obtained from this second recrystallisation. All batches were taken up in MeOH, combined and concentrated under a flow of nitrogen. Drying in the vacuum oven for 3 days gave 7.1 g of (3-fluoronaphthalen-2-yl)boronic acid/2-(1-fluoronaphthalen-2-yl)-4,6-bis(3-fluoronaphthalen-2-yl)-1,3,5,2,4,6-trioxatriborinane for a 50% yield over 2 steps.

Synthesis of 4-(3-fluoronaphthalen-2-yl)-7-isopropylthieno[3,2-d]pyrimidine

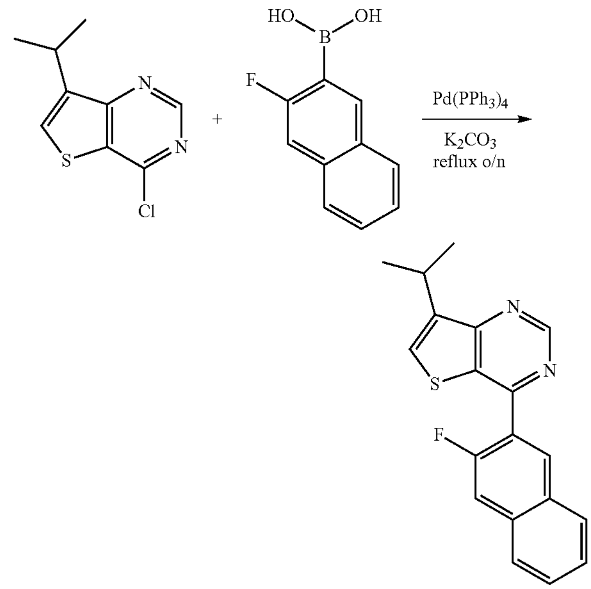

A 250 mL RBF was charged with 4-chloro-7-isopropylthieno[3,2-d]pyrimidine (3.0 g, 14.1 mmol), (3-fluoronaphthalen-2-yl)boronic acid (2.95 g, 15.5 mmol), potassium carbonate (4.87 g, 35.3 mmol), $Pd(PPh_3)_4$ (0.49 g, 0.42 mmol), THF (53 mL), and Water (18 mL), degassed with nitrogen and heated to reflux at 70° C. overnight. The reaction mixture was cooled to room temperature and washed with brine. The organic layer was dried over sodium sulfate, filtered and concentrated. The crude product was purified by flash chromatography (EtOAc/heptanes, 1:19) providing 4-(3-fluoronaphthalen-2-yl)-7-isopropylthieno[3,2-d]pyrimidine (4.20 g, 92% yield) as a viscous oil that crystallizes slowly upon sitting. Further purification was achieved by recrystallization from MeOH.

Synthesis of the Ir(III) Dimer

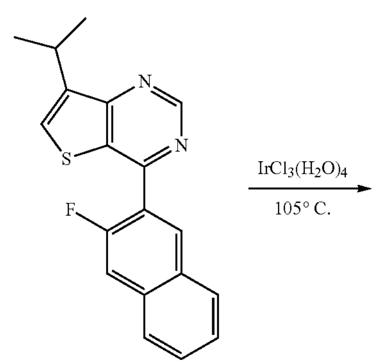

-continued

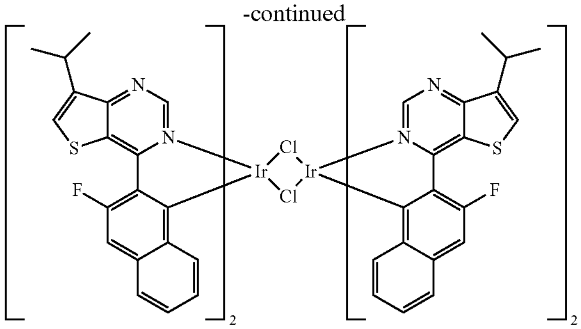

4-(3-fluoronaphthalen-2-yl)-7-isopropylthieno[3,2-d]pyrimidine (2.35 g, 8.77 mmol) was dissolved in 2-ethoxyethanol (30 mL) and water (10 mL) in a flask. The reaction was purged with nitrogen for 15 min, then iridium(III) chloride tetrahydrate (0.90 g, 2.43 mmol) was added. The reaction was heated in an oil bath set at 105° C. overnight under nitrogen. The reaction was allowed to cool, diluted with MeOH, filtered off a precipitate using MeOH, then dried in the vacuum oven for two hours to get 2.1 g of a dark red solid (98% yield). Used as is for next step.

Synthesis of Compound [Ir($L_{A783}$)$_2$($L_{B22}$)]

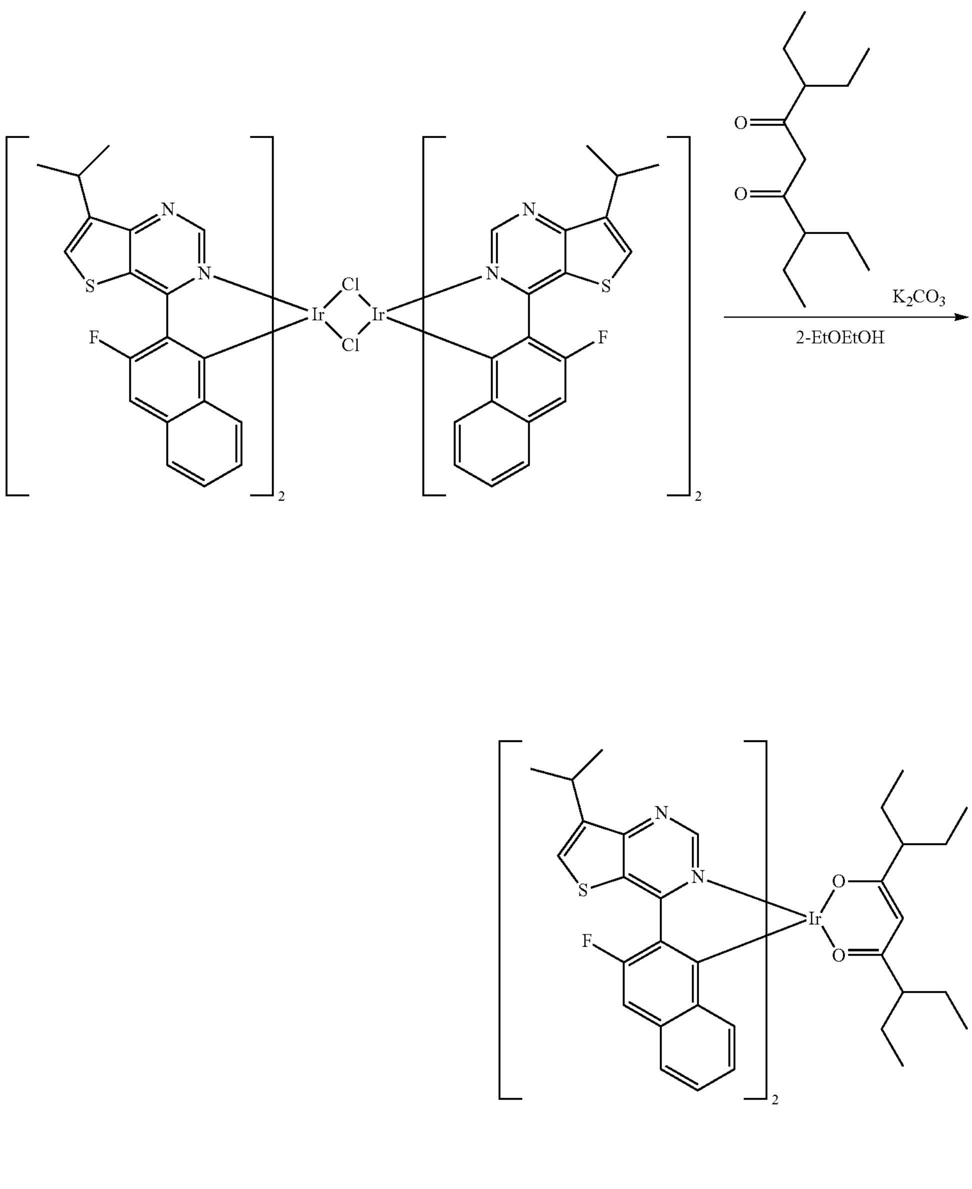

The dimer (1.00 g, 0.57 mmol), 3,7-diethylnonane-4,6-dione (0.92 g, 4.31 mmol), and 2-ethoxyethanol (19 mL) were combined in a flask. The reaction was purged with nitrogen for 15 minutes then potassium carbonate (0.60 g, 4.31 mmol) was added. The reaction was stirred at room temperature overnight under nitrogen. The reaction was diluted with MeOH then filtered off the solid using celite. The precipitate was recovered using DCM. The solid was purified via flash chromatography (heptanes/DCM, 4:1 to 3:1) to afford Compound 5975 [Ir($L_{A783}$)$_2$($L_{B5}$)] (0.70 g, 58% yield) as a red solid.

Synthesis of Compound [Ir($L_{A848}$)$_2$($L_{B22}$)]

Synthesis of 7-isopropyl-4-(3-methylnaphthalen-2-yl)thieno[3,2-d]pyrimidine

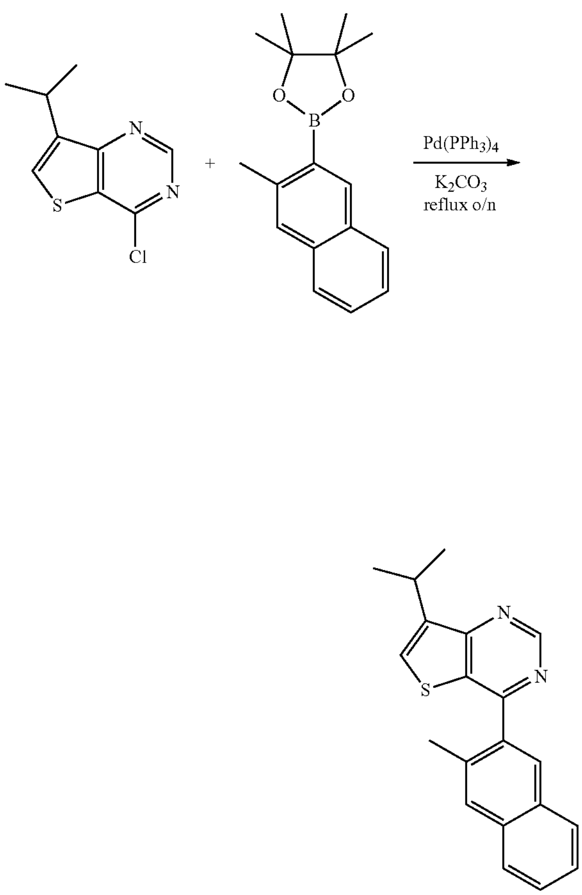

4-chloro-7-isopropylthieno[3,2-d]pyrimidine (3.0 g, 14.1 mmol), (4,4,5,5-tetramethyl-2-(3-methylnaphthalen-2-yl)-1,3,2-dioxaborolane (3.86 g, 14.4 mmol), potassium carbonate (4.87 g, 35.3 mmol), DME (75 mL), and water (25 mL) were combined in a flask. The reaction was purged with nitrogen for 15 minutes then palladium tetrakis (0.489 g, 0.423 mmol) was added. The reaction was heated to reflux in an oil bath overnight under nitrogen. The reaction mixture was extracted with EtOAc. The organic phase was washed with brine twice, dried with sodium sulfate, filtered and concentrated down to a brown solid. The brown solid was purified using flash chromatography (heptanes/EtOAc/DCM, 18:1:1 to 16:3:1) to afford 7-isopropyl-4-(3-methylnaphthalen-2-yl)thieno[3,2-d]pyrimidine (3.50 g, 78% yield) as a white solid.

Synthesis of the Ir(III) Dimer

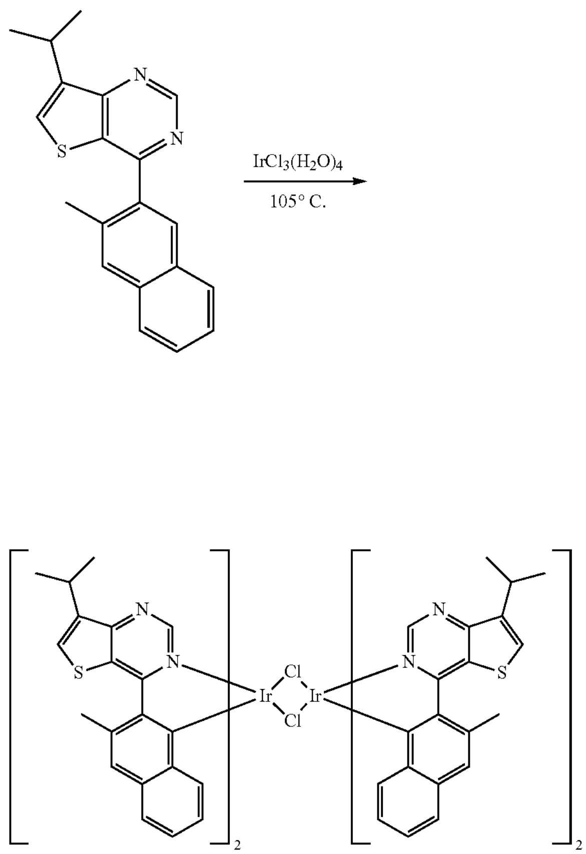

(2.93 g, 9.21 mmol), 2-ethoxyethanol (54 mL) and water (18 mL) were combined in a flask. The reaction was purged with nitrogen for 15 minutes, then iridium(III) chloride tetrahydrate (1.05 g, 2.83 mmol) was added. The reaction was heated in an oil bath set at 105° C. overnight under nitrogen. The reaction was allowed to cool, diluted with MeOH, filtered off a precipitate using MeOH, then dried in the vacuum oven for two hours to get 2.2 g of a dark red solid (90% yield). Used as is for next step.

Synthesis of Compound 6040 [Ir($L_{A848}$)$_2$($L_{B22}$)]

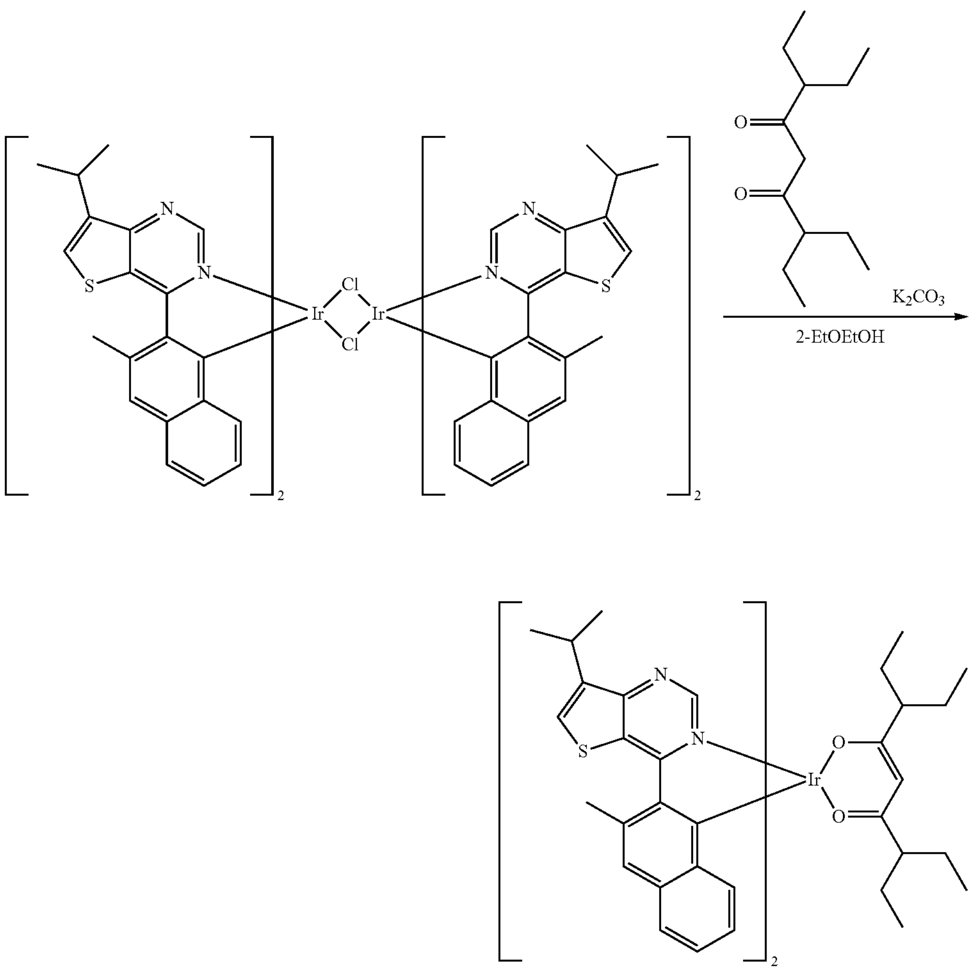

The dimer (2.20 g, 1.28 mmol), 3,7-diethylnonane-4,6-dione (2.71 ml, 12.8 mmol), and 2-ethoxyethanol (30 ml) were combined in a flask. The reaction was purged with nitrogen for 15 min then potassium carbonate (1.76 g, 12.8 mmol) was added. The reaction was stirred at room temperature over the weekend under nitrogen. The reaction was diluted with MeOH then filtered off a dark reddish brown solid using celite. The precipitate was recovered using DCM to get a red-brown solid. The solid was purified via flash chromatography, preconditioned with 75/15/10 heptanes/DCM/$Et_3N$ then heptanes/DCM (19:1 to 17:3) to get 1.10 g of a red solid. The solid was dissolved in DCM and MeOH was added, the mixture was partially concentrated down on the rotovap at 30° C. bath temperature. The precipitate was filtered off and dried in the vacuum oven overnight to afford Compound 6040 [Ir($L_{A848}$)$_2$($L_{B5}$)] (0.94 g, 36%) as a red solid.

Synthesis of Compound [Ir($L_{A1323}$)$_2$($L_{B22}$)]

Synthesis of 2-(4-(tert-butyl)naphthalen-2-yl)-4-chloro-5,7-dimethylquinoline

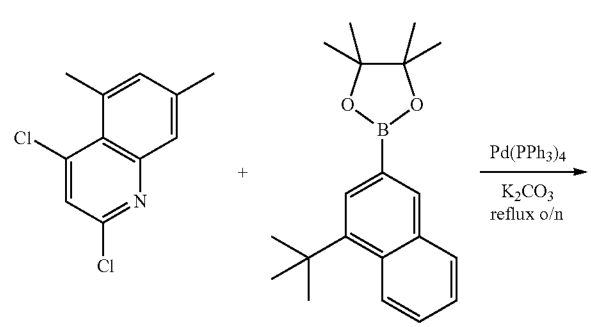

-continued

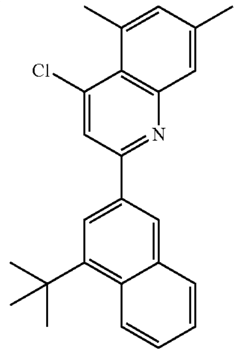

2,4-dichloro-5,7-dimethylquinoline (6.75 g, 29.9 mmol), 2-(4-(tert-butyl)naphthalen-2-yl)-4,4,5,5-tetramethyl-1,3,2-dioxaborolane (9.45 g, 30.5 mmol), potassium carbonate (10.31 g, 74.6 mmol), THF (160 ml), and water (40 ml) were combined in a flask. The solution was purged with nitrogen for 15 min then palladium tetrakis (1.04 g, 0.90 mmol) was added. A condenser was attached then the reaction was heated to reflux in an oil bath overnight. The reaction was transferred to a separatory funnel with ethyl acetate. The aqueous was partitioned off. The organic phase was washed with brine twice, dried with sodium sulfate, filtered and concentrated down to a beige solid. The solid was purified with silica gel using 84/1/15 to 74/1/25 hept/EtOAc/DCM solvent system to get 6.65 g of a white solid for a 60% yield.

Synthesis of 2-(4-(tert-butyl)naphthalen-2-yl)-4,5,7-trimethylquinoline

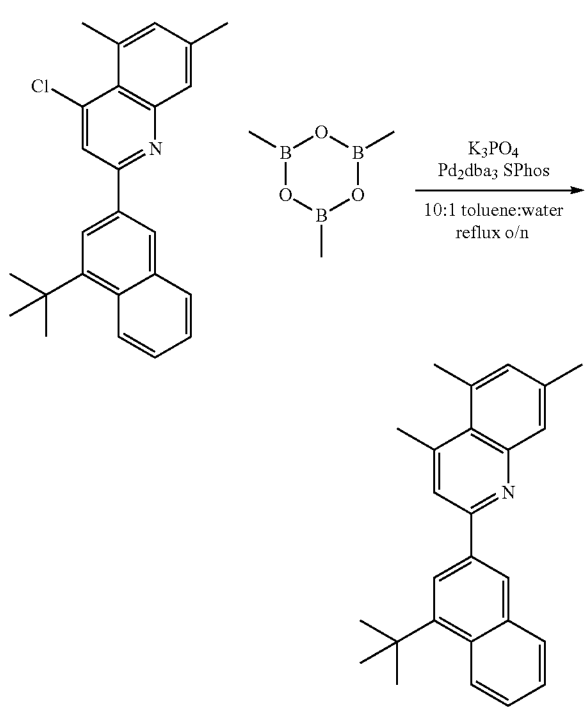

2-(4-(tert-butyl)naphthalen-2-yl)-4-chloro-5,7-dimethylquinoline (3.30 g, 8.83 mmol), potassium phosphate tribasic (5.62 g, 26.5 mmol), toluene (70 ml) and water (7.0 ml) were combined in a flask. The reaction was purged with nitrogen then $Pd_2(dba)_3$ (0.16 g, 0.18 mmol), SPhos (0.29 g, 0.71 mmol), and 2,4,6-trimethyl-1,3,5,2,4,6-trioxatriborinane (1.85 ml, 13.2 mmol) were added. The reaction was placed in an oil bath and heated to reflux overnight under nitrogen. The reaction was filtered through celite with EtOAc to remove the black precipitate. The filtrate was transferred to separatory funnel, washed with brine once, dried with sodium sulfate, filtered and concentrated down to an orange solid. The orange solid was purified with silica gel using 80/5/15 hept/EtOAc/DCM solvent system to get 3.05 g of a white solid for a 98% yield.

Synthesis of the Ir(III) Dimer

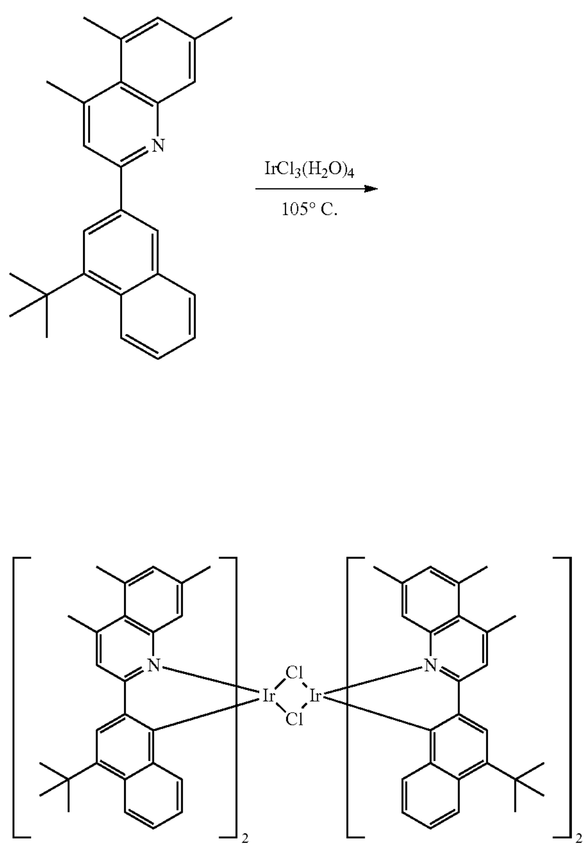

2-(4-(tert-butyl)naphthalen-2-yl)-4,5,7-trimethylquinoline (2.94 g, 8.33 mmol), 2-ethoxyethanol (45 ml) and water (15 ml) were combined in a flask. The reaction was purged with nitrogen for 15 minutes, then Iridium Chloride tetrahydrate (0.95 g, 2.56 mmol) was added. The reaction was heated in an oil bath set at 105° C. overnight. The reaction was diluted with MeOH, filtered off a precipitate using MeOH, then dried the solid in the vacuum oven for two hours to get 1.20 g of a red-brown solid for a 50% yield. Used as is for next step.

Synthesis of Compound [Ir($L_{A1323}$)$_2$($L_{B22}$)]

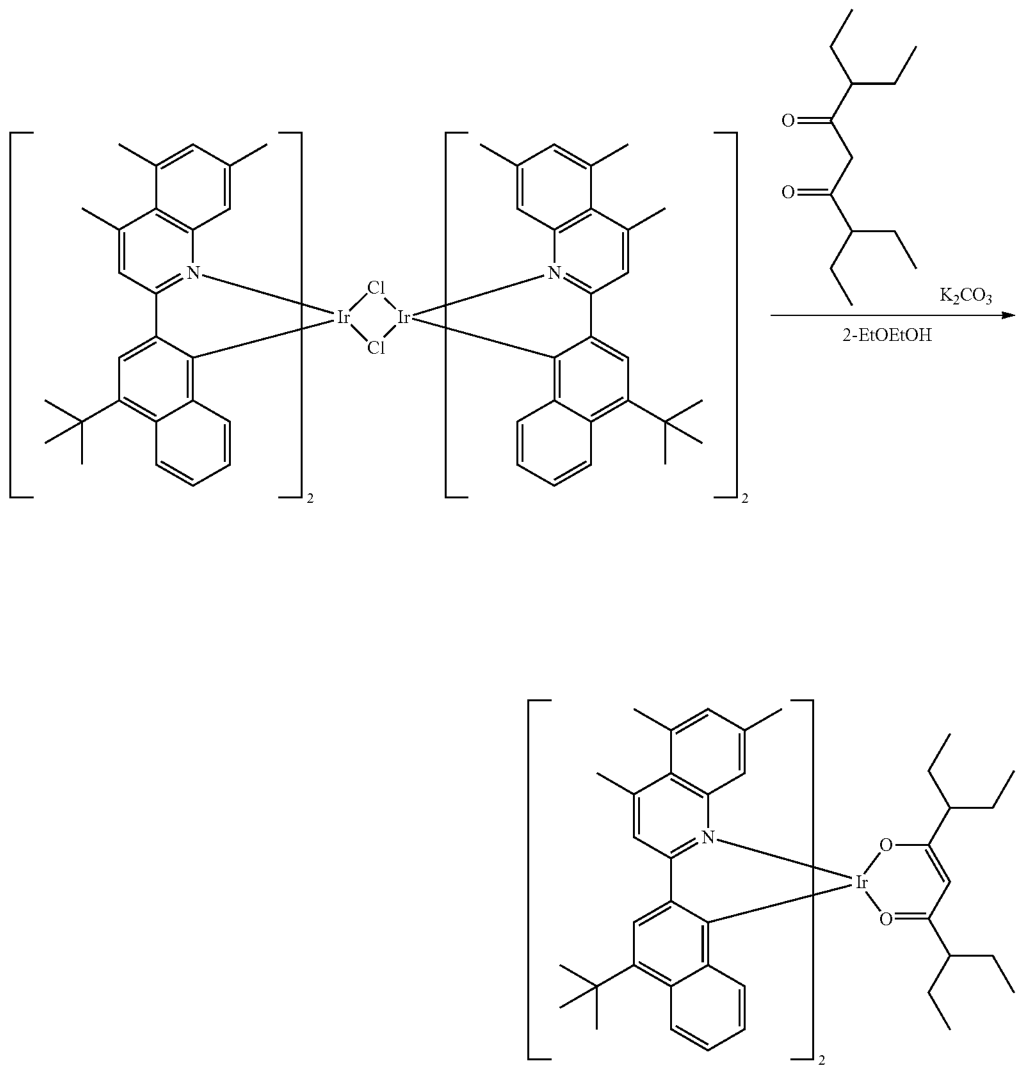

The Ir(III) dimer (1.20 g, 0.64 mmol), 3,7-diethylnonane-4,6-dione (1.5 ml, 6.43 mmol), and 2-ethoxyethanol (15 ml) were combined in a flask. The mixture was purged with nitrogen for 15 minutes then potassium carbonate (0.89 g, 6.43 mmol) was added. The reaction was stirred at room temperature overnight under nitrogen. The reaction was diluted with MeOH then filtered off a dark red solid. The precipitate was recovered using DCM. The sample was purified with silica gel (pretreated with Triethylamine) using 95/5 to 90/10 hept/DCM solvent system to get 0.95 g of a red solid. The solid was solubilized in DCM and MeOH was added to afford the target compound (0.68 g, 48% yield).

Synthesis of Comparative Compound 1

Synthesis of 4,5-dichloro-2-(3-methylnaphthalen-1-yl)quinoline

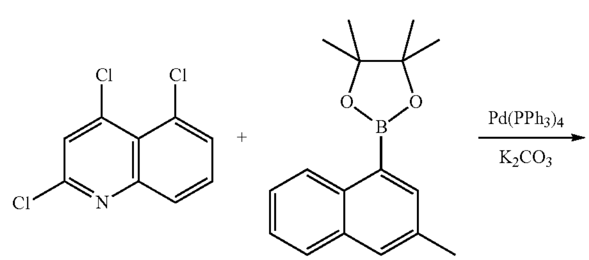

-continued

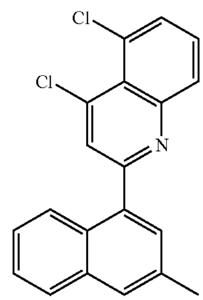

2,4,5-trichloroquinoline (3.05 g, 13.1 mmol), 4,4,5,5-tetramethyl-2-(3-methylnaphthalen-1-yl)-1,3,2-dioxaborolane (3.87 g, 14.4 mmol), and potassium carbonate (5.44 g, 39.4 mmol) were inserted in a flask. THF (98 mL) and Water (33 mL) were then added and the reaction mixture was degassed with nitrogen gas for 15 minutes. Palladium tetrakis (0.60 g, 0.53 mmol) was added and the reaction was heated to reflux overnight. Upon completion, water was added and the mixture was extracted with Ethyl Acetate. The crude material was purified via column chromatography using a mixture of Heptanes/Ethyl Acetate/DCM (90/5/5) as the solvent system. The product was then triturated from Methanol and then from Heptanes to afford 3.30 g (74% yield) of the title compound.

Synthesis of 4,5-dimethyl-2-(3-methylnaphthalen-1-yl)quinoline

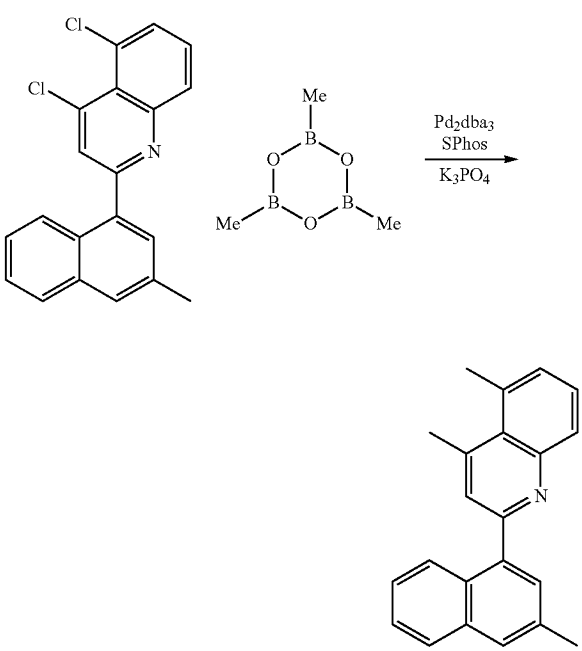

4,5-dichloro-2-(3-methylnaphthalen-1-yl)quinoline (3.10 g, 9.17 mmol), $Pd_2(dba)_3$ (0.17 g, 0.18 mmol), SPhos (0.30 g, 0.73 mmol), and potassium phosphate (5.84 g, 27.5 mmol) were inserted in a flask. Toluene (56 mL) and Water (6 mL) were added, followed by the addition of 2,4,6-trimethyl-1,3,5,2,4,6-trioxatriborinane (3.1 ml, 22.0 mmol) via syringe. The reaction mixture was degassed with nitrogen for 15 minutes and then was heated to reflux overnight. Upon completion, water was added to the mixture and it was extracted with Ethyl Acetate. The crude material was purified via column chromatography using Heptanes/Ethyl Acetate (90/10) as solvent system. The product still contained 0.45% impurity, so it was purified via column chromatography again using Heptanes/Ethyl Acetate (95/5) as solvent system. The title compound was afforded as a white solid (2.35 g, 86% yield).

Synthesis of the Ir(III) Dimer

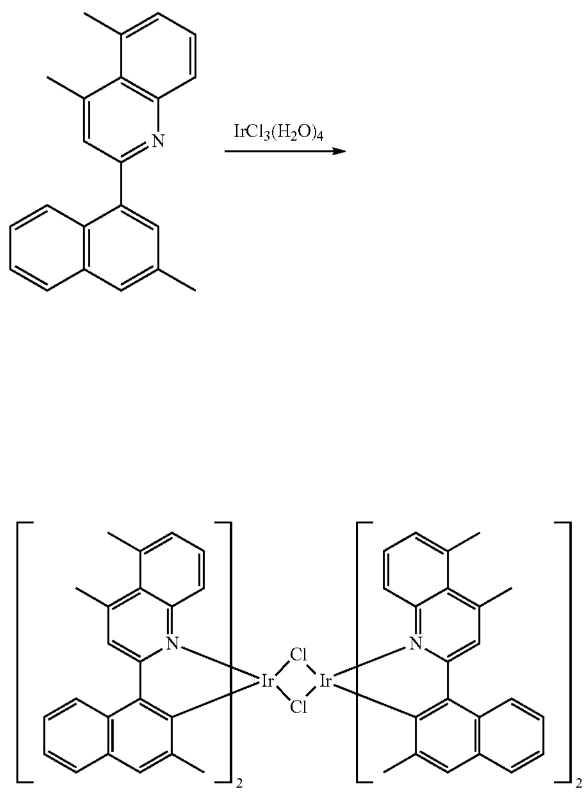

4,5-dimethyl-2-(3-methylnaphthalen-1-yl)quinoline (2.387 g, 8.03 mmol), 2-ethoxyethanol (39 mL) and Water (13 mL) were combined in a flask. The mixture was purged with nitrogen for 15 min, then iridium(III) chloride tetrahydrate (0.85 g, 2.29 mmol) was added and the reaction was heated at 105° C. overnight under nitrogen. The mixture was cooled down to room temperature, diluted with MeOH and filtered off the precipitate to afford 1.00 g (53% yield) of the Dimer.

Synthesis of Comparative Compound 1

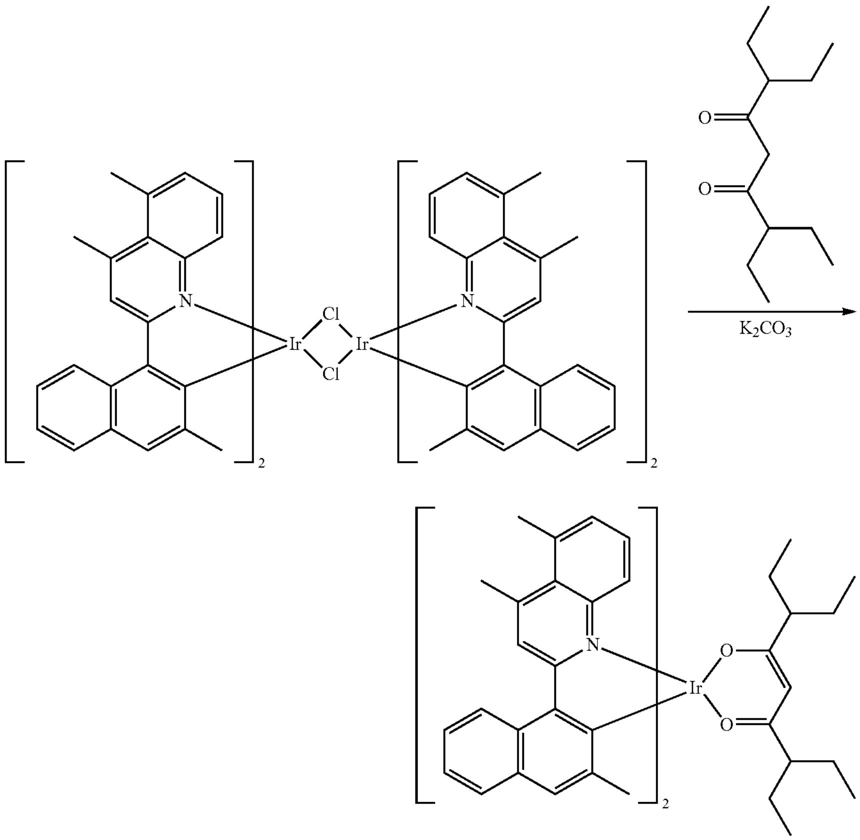

Ir(III) Dimer (1.00 g, 0.61 mmol), 3,7-diethylnonane-4,6-dione (1.44 mL, 6.09 mmol) and 2-ethoxyethanol (20 mL) were combined in a flask. The reaction was purged with nitrogen for 15 min, then potassium carbonate (0.84 g, 6.09 mmol) was added. The reaction was stirred at room temperature overnight. Methanol was added to the mixture and the precipitate was filtered off on a pad of celite. The solids on the Celite were then washed with DCM and the product was collected in a filtering flask. The collected product was solubilized in DCM and filtered on a pad of Silica. The product was then triturated in MeOH and recrystallized from DCM/EtOH to afford 0.85 g (70% yield) of the target.

EXPERIMENTAL

Device Examples

All example devices were fabricated by high vacuum (<$10^{-7}$ Torr) thermal evaporation. The anode electrode was 1150 Å of indium tin oxide (ITO). The cathode consisted of 10 Å of Liq (8-hydroxyquinoline lithium) followed by 1,000 Å of Al. All devices were encapsulated with a glass lid sealed with an epoxy resin in a nitrogen glove box (<1 ppm of $H_2O$ and $O_2$) immediately after fabrication, and a moisture getter was incorporated inside the package. The organic stack of the device examples consisted of sequentially, from the ITO surface, 100 Å of HATCN as the hole injection layer (HIL); 450 Å of HTM as a hole transporting layer (HTL); 400 Å of an emissive layer (EML) containing Compound H as a host, a stability dopant (SD) (18%), and Comparative Compound 1 or Compounds [Ir($L_{A17}$)$_2$($L_{B22}$)], [Ir($L_{A523}$)$_2$($L_{B22}$)], [Ir($L_{A783}$)$_2$($L_{B22}$)], and [Ir($L_{A1323}$)$_2$($L_{B22}$)] as the emitter (3%); and 350 Å of Liq (8-hydroxyquinoline lithium) doped with 40% of ETM as the ETL. The emitter was selected to provide the desired color, efficiency and lifetime. The SD compound was added to the electron-transporting host to help transport positive charge in the emissive layer. The Comparative Example device was fabricated similarly to the device examples except that Comparative Compound 1 was used as the emitter in the EML. FIG. 1 shows the schematic device structure. Table 1 shows the device layer thickness and materials. The chemical structures of the device materials are shown below.

COMPOUND H

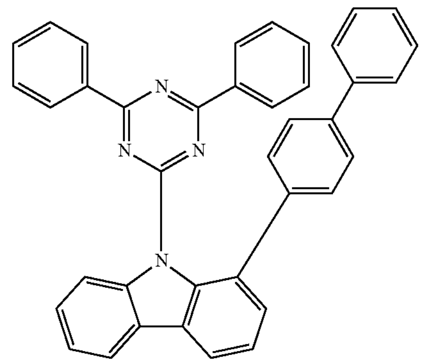

-continued
SD
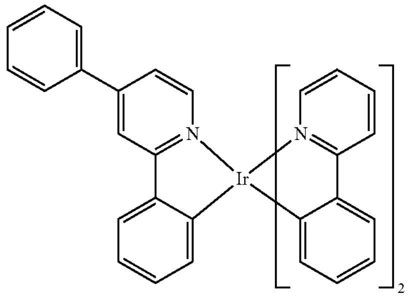
Comparative Compound 1
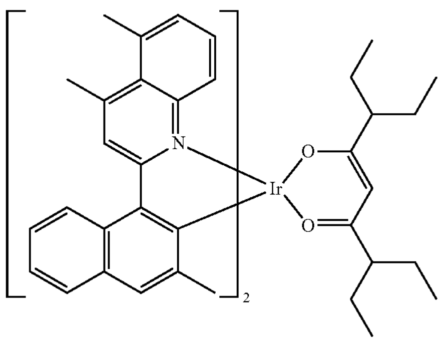
HTM
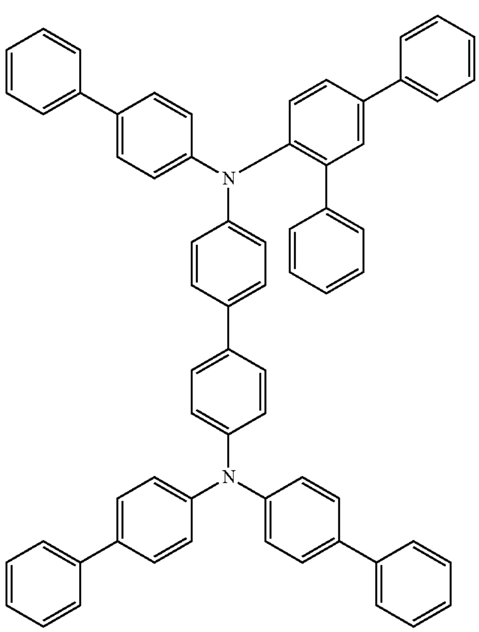
-continued
ETM
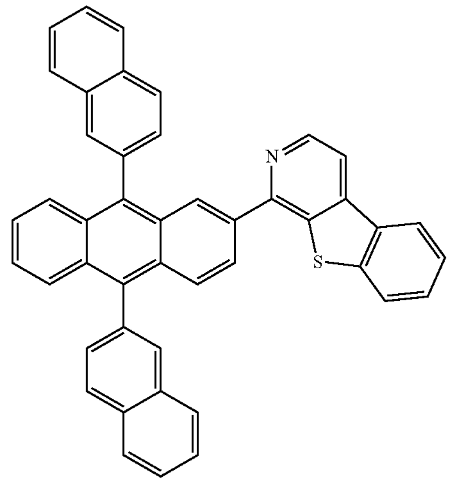
Liq
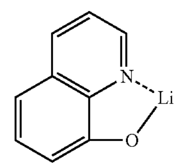
Compound Ir($L_{A17}$)$_2$($L_{B22}$)
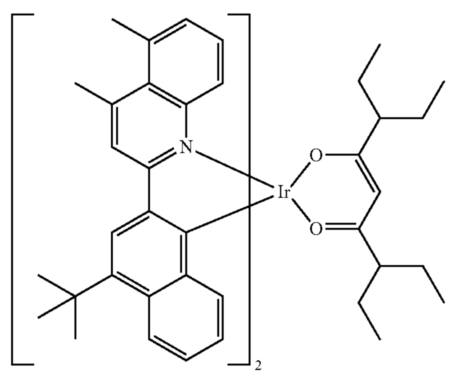
Compound Ir($L_{A523}$)2($L_{B22}$)
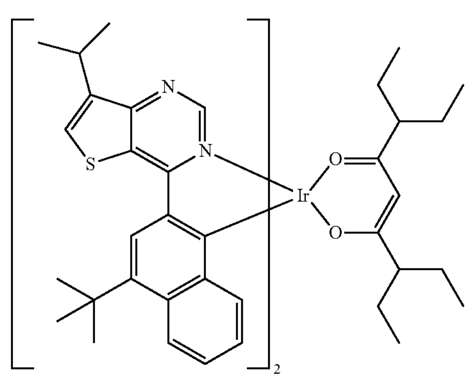

-continued

Compound Ir($L_{A783}$)$_2$($L_{B22}$)

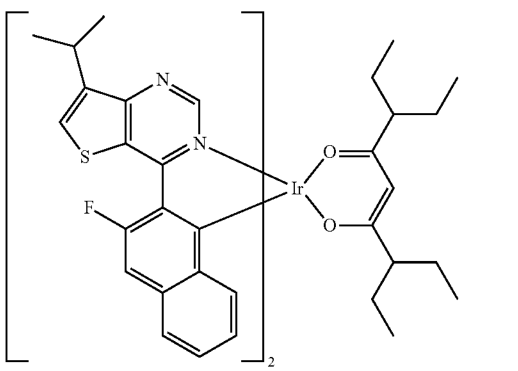

Compound Ir($L_{A1323}$)$_2$($L_{B22}$)

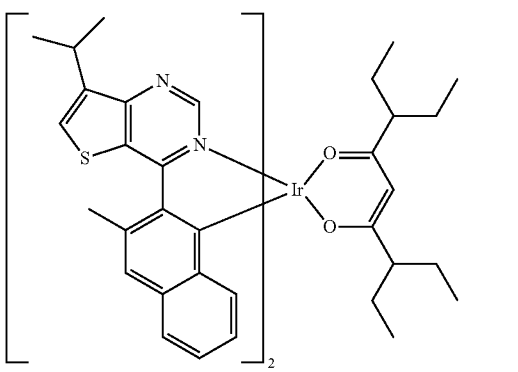

HATCN

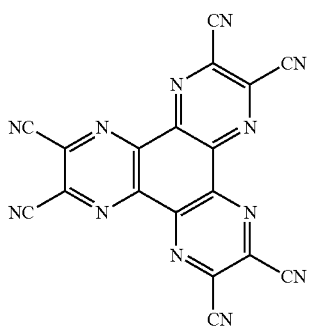

The device performance data are summarized in Table 2. Comparative Compound 1 exhibited a Maximum Wavelength of emission (λ max) of 640 nm. The inventive compounds, namely Compounds [Ir($L_{A17}$)$_2$($L_{B22}$)], [Ir ($L_{A523}$)$_2$($L_{B22}$)], and [Ir($L_{A783}$)$_2$($L_{B22}$)]; were designed to be blue shifted compared to Comparative Compound 1 and to provide better external quantum efficiency (EQE). Compound [Ir($L_{A1323}$)$_2$($L_{B22}$)] was designed to be red shifted. In order to afford better device performance, a different naphthalene regioisomer was used. We obtained a peak wavelength between 604 and 628 nm for the Inventive Compounds. On the other hand, Compound [Ir($L_{A1323}$)$_2$($L_{B22}$)] showed a peak wavelength at 653 nm. The Full Width at Half Maximum (FWHM) was also improved a lot with the inventive configuration wherein the Inventive Compounds showed a FWHM of 0.76 and 0.74 compared to 1.00 for the Comparative Compound 1. Compound [Ir($L_{A1323}$)$_2$($L_{B22}$)] was slightly more broad at 1.10. Furthermore, a bulky side chain (t-butyl, cycloalkyl, etc.) needs to be included at the 4-position or any substitution at the 3-position of the naphthyl moiety in order to lock in the desired naphthalene orientation toward the iridium of the final material. The combination of the naphthyl regioisomer combined with side chain allowed good performances for the inventive compounds. The EQE was much higher for the Inventive Compounds with relative value between 1.20 and 1.51.

TABLE 1

Device layer materials and thicknesses

| Layer | Material | Thickness [Å] |
|---|---|---|
| Anode | ITO | 1150 |
| HIL | HATCN | 100 |
| HTL | HTM | 450 |
| EML | Compound H: SD 18%: Emitter 3% | 400 |
| ETL | Liq: ETM 40% | 350 |
| EIL | Liq | 10 |
| Cathode | Al | 1000 |

TABLE 2

Performance of the devices with examples of red emitters.

| Device | | 1931 CIE | | λ max | FWHM | At 10 mA/cm$^2$ | |
|---|---|---|---|---|---|---|---|
| | | | | | | Voltage | EQE |
| Example | Emitter | x | y | [nm] | [nm] | [V] | [%] |
| Example 1 | Compound [Ir($L_{A17}$)$_2$($L_{B22}$)] | 0.68 | 0.32 | 626 | 0.74 | 1.03 | 1.36 |
| Example 2 | Compound [Ir($L_{A523}$)$_2$($L_{B22}$)] | 0.68 | 0.32 | 628 | 0.74 | 1.03 | 1.51 |
| Example 3 | Compound [Ir($L_{A523}$)$_2$($L_{B22}$)] | 0.63 | 0.37 | 604 | 0.76 | 1.08 | 1.39 |
| Example 4 | Compound [Ir($L_{A783}$)$_2$($L_{B22}$)] | 0.69 | 0.31 | 653 | 1.10 | 1.03 | 1.20 |
| CE1 | Comparative Compound 1 | 0.68 | 0.32 | 640 | 1.00 | 1.00 | 1.00 |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having a ligand $L_A$ having a structure of Formula I:

Formula I

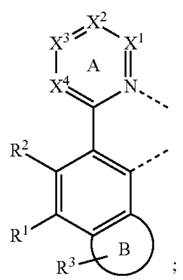

wherein Ring B represents a five- or six-membered aromatic ring;

wherein $R^3$ represents from none to the maximum number of substitutions;

wherein $X^1$, $X^2$, $X^3$, and $X^4$ are each independently a CR or N;

wherein $X^1$ and $X^2$ are CR and the Rs are fused into a benzo ring;

wherein $R^1$ is $CR^{14}R^{15}R^{16}$;

wherein each of $R^{14}$, $R^{15}$, and $R^{16}$ is independently selected from the group consisting of alkyl, cycloalkyl, combinations thereof, partially or fully deuterated variations thereof, and partially or fully fluorinated variations thereof;

wherein R, $R^2$, and $R^3$ are each independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof;

wherein any two substituents among R, $R^2$, and $R^3$ are optionally joined to form into a ring;

wherein any two substituents among $R^{14}$, $R^{15}$ and $R^{16}$ are optionally joined to form into a ring;

wherein $L_A$ is coordinated to a metal M at the positions indicated with dashed lines;

wherein M is coordinated to at least one other ligand that is different than ligand $L_A$;

wherein $L_A$ is optionally linked with other ligands to comprise a tridentate, tetradentate, pentadentate, or hexadentate ligand; and wherein M is optionally coordinated to other ligands.

2. The compound of claim 1, wherein M is selected from the group consisting of Ir, Rh, Re, Ru, Os, Pt, Au, and Cu.

3. The compound of claim 1, wherein M is Ir or Pt.

4. The compound of claim 1, wherein each of $R^{14}$, $R^{15}$ and $R^{16}$ is independently selected from the group consisting of methyl, partially or fully deuterated methyl, and partially or fully fluorinated methyl.

5. The compound of claim 1, wherein $R^2$ is selected from the group consisting of deuterium, fluorine, alkyl, cycloalkyl, and combinations thereof.

6. The compound of claim 1, wherein the compound has formula $(L_A)_nIr(L_B)_{3-n}$;

wherein n is 1 or 2; and wherein $L_B$ is selected from the group consisting of:

$L_{B1}$ through $L_{B1260}$ are based on a structure of Formula XXVII,

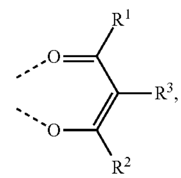

in which $R^1$, $R^2$, and $R^3$ are defined as:

| Ligand | $R^1$ | $R^2$ | $R^3$ |
|---|---|---|---|
| $L_{B1}$ | $R^{D1}$ | $R^{D1}$ | H |
| $L_{B2}$ | $R^{D2}$ | $R^{D2}$ | H |
| $L_{B3}$ | $R^{D3}$ | $R^{D3}$ | H |
| $L_{B4}$ | $R^{D4}$ | $R^{D4}$ | H |
| $L_{B5}$ | $R^{D5}$ | $R^{D5}$ | H |
| $L_{B6}$ | $R^{D6}$ | $R^{D6}$ | H |
| $L_{B7}$ | $R^{D7}$ | $R^{D7}$ | H |
| $L_{B8}$ | $R^{D8}$ | $R^{D8}$ | H |
| $L_{B9}$ | $R^{D9}$ | $R^{D9}$ | H |
| $L_{B10}$ | $R^{D10}$ | $R^{D10}$ | H |
| $L_{B11}$ | $R^{D11}$ | $R^{D11}$ | H |
| $L_{B12}$ | $R^{D12}$ | $R^{D12}$ | H |
| $L_{B13}$ | $R^{D13}$ | $R^{D13}$ | H |
| $L_{B14}$ | $R^{D14}$ | $R^{D14}$ | H |
| $L_{B15}$ | $R^{D15}$ | $R^{D15}$ | H |
| $L_{B16}$ | $R^{D16}$ | $R^{D16}$ | H |
| $L_{B17}$ | $R^{D17}$ | $R^{D17}$ | H |
| $L_{B18}$ | $R^{D18}$ | $R^{D18}$ | H |
| $L_{B19}$ | $R^{D19}$ | $R^{D19}$ | H |
| $L_{B20}$ | $R^{D20}$ | $R^{D20}$ | H |
| $L_{B21}$ | $R^{D21}$ | $R^{D21}$ | H |
| $L_{B22}$ | $R^{D22}$ | $R^{D22}$ | H |
| $L_{B23}$ | $R^{D23}$ | $R^{D23}$ | H |
| $L_{B24}$ | $R^{D24}$ | $R^{D24}$ | H |
| $L_{B25}$ | $R^{D25}$ | $R^{D25}$ | H |
| $L_{B26}$ | $R^{D26}$ | $R^{D26}$ | H |
| $L_{B27}$ | $R^{D27}$ | $R^{D27}$ | H |
| $L_{B28}$ | $R^{D28}$ | $R^{D28}$ | H |
| $L_{B29}$ | $R^{D29}$ | $R^{D29}$ | H |
| $L_{B30}$ | $R^{D30}$ | $R^{D30}$ | H |
| $L_{B31}$ | $R^{D31}$ | $R^{D31}$ | H |
| $L_{B32}$ | $R^{D32}$ | $R^{D32}$ | H |
| $L_{B33}$ | $R^{D33}$ | $R^{D33}$ | H |
| $L_{B34}$ | $R^{D34}$ | $R^{D34}$ | H |
| $L_{B35}$ | $R^{D35}$ | $R^{D35}$ | H |
| $L_{B36}$ | $R^{D40}$ | $R^{D40}$ | H |
| $L_{B37}$ | $R^{D41}$ | $R^{D41}$ | H |
| $L_{B38}$ | $R^{D42}$ | $R^{D42}$ | H |
| $L_{B39}$ | $R^{D64}$ | $R^{D64}$ | H |
| $L_{B40}$ | $R^{D66}$ | $R^{D66}$ | H |
| $L_{B41}$ | $R^{D68}$ | $R^{D68}$ | H |
| $L_{B42}$ | $R^{D76}$ | $R^{D76}$ | H |
| $L_{B43}$ | $R^{D1}$ | $R^{D2}$ | H |
| $L_{B44}$ | $R^{D1}$ | $R^{D3}$ | H |
| $L_{B45}$ | $R^{D1}$ | $R^{D4}$ | H |
| $L_{B46}$ | $R^{D1}$ | $R^{D5}$ | H |

-continued

| Ligand | $R^1$ | $R^2$ | $R^3$ |
|---|---|---|---|
| $L_{B47}$ | $R^{D1}$ | $R^{D6}$ | H |
| $L_{B48}$ | $R^{D1}$ | $R^{D7}$ | H |
| $L_{B49}$ | $R^{D1}$ | $R^{D8}$ | H |
| $L_{B50}$ | $R^{D1}$ | $R^{D9}$ | H |
| $L_{B51}$ | $R^{D1}$ | $R^{D10}$ | H |
| $L_{B52}$ | $R^{D1}$ | $R^{D11}$ | H |
| $L_{B53}$ | $R^{D1}$ | $R^{D12}$ | H |
| $L_{B54}$ | $R^{D1}$ | $R^{D13}$ | H |
| $L_{B55}$ | $R^{D1}$ | $R^{D14}$ | H |
| $L_{B56}$ | $R^{D1}$ | $R^{D15}$ | H |
| $L_{B57}$ | $R^{D1}$ | $R^{D16}$ | H |
| $L_{B58}$ | $R^{D1}$ | $R^{D17}$ | H |
| $L_{B59}$ | $R^{D1}$ | $R^{D18}$ | H |
| $L_{B60}$ | $R^{D1}$ | $R^{D19}$ | H |
| $L_{B61}$ | $R^{D1}$ | $R^{D20}$ | H |
| $L_{B62}$ | $R^{D1}$ | $R^{D21}$ | H |
| $L_{B63}$ | $R^{D1}$ | $R^{D22}$ | H |
| $L_{B64}$ | $R^{D1}$ | $R^{D23}$ | H |
| $L_{B65}$ | $R^{D1}$ | $R^{D24}$ | H |
| $L_{B66}$ | $R^{D1}$ | $R^{D25}$ | H |
| $L_{B67}$ | $R^{D1}$ | $R^{D26}$ | H |
| $L_{B68}$ | $R^{D1}$ | $R^{D27}$ | H |
| $L_{B69}$ | $R^{D1}$ | $R^{D28}$ | H |
| $L_{B70}$ | $R^{D1}$ | $R^{D29}$ | H |
| $L_{B71}$ | $R^{D1}$ | $R^{D30}$ | H |
| $L_{B72}$ | $R^{D1}$ | $R^{D31}$ | H |
| $L_{B73}$ | $R^{D1}$ | $R^{D32}$ | H |
| $L_{B74}$ | $R^{D1}$ | $R^{D33}$ | H |
| $L_{B75}$ | $R^{D1}$ | $R^{D34}$ | H |
| $L_{B76}$ | $R^{D1}$ | $R^{D35}$ | H |
| $L_{B77}$ | $R^{D1}$ | $R^{D40}$ | H |
| $L_{B78}$ | $R^{D1}$ | $R^{D41}$ | H |
| $L_{B79}$ | $R^{D1}$ | $R^{D42}$ | H |
| $L_{B80}$ | $R^{D1}$ | $R^{D64}$ | H |
| $L_{B81}$ | $R^{D1}$ | $R^{D66}$ | H |
| $L_{B82}$ | $R^{D1}$ | $R^{D68}$ | H |
| $L_{B83}$ | $R^{D1}$ | $R^{D76}$ | H |
| $L_{B84}$ | $R^{D2}$ | $R^{D1}$ | H |
| $L_{B85}$ | $R^{D2}$ | $R^{D3}$ | H |
| $L_{B86}$ | $R^{D2}$ | $R^{D4}$ | H |
| $L_{B87}$ | $R^{D2}$ | $R^{D5}$ | H |
| $L_{B88}$ | $R^{D2}$ | $R^{D6}$ | H |
| $L_{B89}$ | $R^{D2}$ | $R^{D7}$ | H |
| $L_{B90}$ | $R^{D2}$ | $R^{D8}$ | H |
| $L_{B91}$ | $R^{D2}$ | $R^{D9}$ | H |
| $L_{B92}$ | $R^{D2}$ | $R^{D10}$ | H |
| $L_{B93}$ | $R^{D2}$ | $R^{D11}$ | H |
| $L_{B94}$ | $R^{D2}$ | $R^{D12}$ | H |
| $L_{B95}$ | $R^{D2}$ | $R^{D13}$ | H |
| $L_{B96}$ | $R^{D2}$ | $R^{D14}$ | H |
| $L_{B97}$ | $R^{D2}$ | $R^{D15}$ | H |
| $L_{B98}$ | $R^{D2}$ | $R^{D16}$ | H |
| $L_{B99}$ | $R^{D2}$ | $R^{D17}$ | H |
| $L_{B100}$ | $R^{D2}$ | $R^{D18}$ | H |
| $L_{B101}$ | $R^{D2}$ | $R^{D19}$ | H |
| $L_{B102}$ | $R^{D2}$ | $R^{D20}$ | H |
| $L_{B103}$ | $R^{D2}$ | $R^{D21}$ | H |
| $L_{B104}$ | $R^{D2}$ | $R^{D22}$ | H |
| $L_{B105}$ | $R^{D2}$ | $R^{D23}$ | H |
| $L_{B106}$ | $R^{D2}$ | $R^{D24}$ | H |
| $L_{B107}$ | $R^{D2}$ | $R^{D25}$ | H |
| $L_{B108}$ | $R^{D2}$ | $R^{D26}$ | H |
| $L_{B109}$ | $R^{D2}$ | $R^{D27}$ | H |
| $L_{B110}$ | $R^{D2}$ | $R^{D28}$ | H |
| $L_{B111}$ | $R^{D2}$ | $R^{D29}$ | H |
| $L_{B112}$ | $R^{D2}$ | $R^{D30}$ | H |
| $L_{B113}$ | $R^{D2}$ | $R^{D31}$ | H |
| $L_{B114}$ | $R^{D2}$ | $R^{D32}$ | H |
| $L_{B115}$ | $R^{D2}$ | $R^{D33}$ | H |
| $L_{B116}$ | $R^{D2}$ | $R^{D34}$ | H |
| $L_{B117}$ | $R^{D2}$ | $R^{D35}$ | H |
| $L_{B118}$ | $R^{D2}$ | $R^{D40}$ | H |
| $L_{B119}$ | $R^{D2}$ | $R^{D41}$ | H |
| $L_{B120}$ | $R^{D2}$ | $R^{D42}$ | H |
| $L_{B121}$ | $R^{D2}$ | $R^{D64}$ | H |
| $L_{B122}$ | $R^{D2}$ | $R^{D66}$ | H |
| $L_{B123}$ | $R^{D2}$ | $R^{D68}$ | H |

-continued

| Ligand | $R^1$ | $R^2$ | $R^3$ |
|---|---|---|---|
| $L_{B124}$ | $R^{D2}$ | $R^{D76}$ | H |
| $L_{B125}$ | $R^{D3}$ | $R^{D4}$ | H |
| $L_{B126}$ | $R^{D3}$ | $R^{D5}$ | H |
| $L_{B127}$ | $R^{D3}$ | $R^{D6}$ | H |
| $L_{B128}$ | $R^{D3}$ | $R^{D7}$ | H |
| $L_{B129}$ | $R^{D3}$ | $R^{D8}$ | H |
| $L_{B130}$ | $R^{D3}$ | $R^{D9}$ | H |
| $L_{B131}$ | $R^{D3}$ | $R^{D10}$ | H |
| $L_{B132}$ | $R^{D3}$ | $R^{D11}$ | H |
| $L_{B133}$ | $R^{D3}$ | $R^{D12}$ | H |
| $L_{B134}$ | $R^{D3}$ | $R^{D13}$ | H |
| $L_{B135}$ | $R^{D3}$ | $R^{D14}$ | H |
| $L_{B136}$ | $R^{D3}$ | $R^{D15}$ | H |
| $L_{B137}$ | $R^{D3}$ | $R^{D16}$ | H |
| $L_{B138}$ | $R^{D3}$ | $R^{D17}$ | H |
| $L_{B139}$ | $R^{D3}$ | $R^{D18}$ | H |
| $L_{B140}$ | $R^{D3}$ | $R^{D19}$ | H |
| $L_{B141}$ | $R^{D3}$ | $R^{D20}$ | H |
| $L_{B142}$ | $R^{D3}$ | $R^{D21}$ | H |
| $L_{B143}$ | $R^{D3}$ | $R^{D22}$ | H |
| $L_{B144}$ | $R^{D3}$ | $R^{D23}$ | H |
| $L_{B145}$ | $R^{D3}$ | $R^{D24}$ | H |
| $L_{B146}$ | $R^{D3}$ | $R^{D25}$ | H |
| $L_{B147}$ | $R^{D3}$ | $R^{D26}$ | H |
| $L_{B148}$ | $R^{D3}$ | $R^{D27}$ | H |
| $L_{B149}$ | $R^{D3}$ | $R^{D28}$ | H |
| $L_{B150}$ | $R^{D3}$ | $R^{D29}$ | H |
| $L_{B151}$ | $R^{D3}$ | $R^{D30}$ | H |
| $L_{B152}$ | $R^{D3}$ | $R^{D31}$ | H |
| $L_{B153}$ | $R^{D3}$ | $R^{D32}$ | H |
| $L_{B154}$ | $R^{D3}$ | $R^{D33}$ | H |
| $L_{B155}$ | $R^{D3}$ | $R^{D34}$ | H |
| $L_{B156}$ | $R^{D3}$ | $R^{D35}$ | H |
| $L_{B157}$ | $R^{D3}$ | $R^{D40}$ | H |
| $L_{B158}$ | $R^{D3}$ | $R^{D41}$ | H |
| $L_{B159}$ | $R^{D3}$ | $R^{D42}$ | H |
| $L_{B160}$ | $R^{D3}$ | $R^{D64}$ | H |
| $L_{B161}$ | $R^{D3}$ | $R^{D66}$ | H |
| $L_{B162}$ | $R^{D3}$ | $R^{D68}$ | H |
| $L_{B163}$ | $R^{D3}$ | $R^{D76}$ | H |
| $L_{B164}$ | $R^{D4}$ | $R^{D5}$ | H |
| $L_{B165}$ | $R^{D4}$ | $R^{D6}$ | H |
| $L_{B166}$ | $R^{D4}$ | $R^{D7}$ | H |
| $L_{B167}$ | $R^{D4}$ | $R^{D8}$ | H |
| $L_{B168}$ | $R^{D4}$ | $R^{D9}$ | H |
| $L_{B169}$ | $R^{D4}$ | $R^{D10}$ | H |
| $L_{B170}$ | $R^{D4}$ | $R^{D11}$ | H |
| $L_{B171}$ | $R^{D4}$ | $R^{D12}$ | H |
| $L_{B172}$ | $R^{D4}$ | $R^{D13}$ | H |
| $L_{B173}$ | $R^{D4}$ | $R^{D14}$ | H |
| $L_{B174}$ | $R^{D4}$ | $R^{D15}$ | H |
| $L_{B175}$ | $R^{D4}$ | $R^{D16}$ | H |
| $L_{B176}$ | $R^{D4}$ | $R^{D17}$ | H |
| $L_{B177}$ | $R^{D4}$ | $R^{D18}$ | H |
| $L_{B178}$ | $R^{D4}$ | $R^{D19}$ | H |
| $L_{B179}$ | $R^{D4}$ | $R^{D20}$ | H |
| $L_{B180}$ | $R^{D4}$ | $R^{D21}$ | H |
| $L_{B181}$ | $R^{D4}$ | $R^{D22}$ | H |
| $L_{B182}$ | $R^{D4}$ | $R^{D23}$ | H |
| $L_{B183}$ | $R^{D4}$ | $R^{D24}$ | H |
| $L_{B184}$ | $R^{D4}$ | $R^{D25}$ | H |
| $L_{B185}$ | $R^{D4}$ | $R^{D26}$ | H |
| $L_{B186}$ | $R^{D4}$ | $R^{D27}$ | H |
| $L_{B187}$ | $R^{D4}$ | $R^{D28}$ | H |
| $L_{B188}$ | $R^{D4}$ | $R^{D29}$ | H |
| $L_{B189}$ | $R^{D4}$ | $R^{D30}$ | H |
| $L_{B190}$ | $R^{D4}$ | $R^{D31}$ | H |
| $L_{B191}$ | $R^{D4}$ | $R^{D32}$ | H |
| $L_{B192}$ | $R^{D4}$ | $R^{D33}$ | H |
| $L_{B193}$ | $R^{D4}$ | $R^{D34}$ | H |
| $L_{B194}$ | $R^{D4}$ | $R^{D35}$ | H |
| $L_{B195}$ | $R^{D4}$ | $R^{D40}$ | H |
| $L_{B196}$ | $R^{D4}$ | $R^{D41}$ | H |
| $L_{B197}$ | $R^{D4}$ | $R^{D42}$ | H |
| $L_{B198}$ | $R^{D4}$ | $R^{D64}$ | H |
| $L_{B199}$ | $R^{D4}$ | $R^{D66}$ | H |
| $L_{B200}$ | $R^{D4}$ | $R^{D68}$ | H |

-continued

| Ligand | $R^1$ | $R^2$ | $R^3$ |
|---|---|---|---|
| $L_{B201}$ | $R^{D4}$ | $R^{D76}$ | H |
| $L_{B202}$ | $R^{D4}$ | $R^{D1}$ | H |
| $L_{B203}$ | $R^{D7}$ | $R^{D5}$ | H |
| $L_{B204}$ | $R^{D7}$ | $R^{D6}$ | H |
| $L_{B205}$ | $R^{D7}$ | $R^{D8}$ | H |
| $L_{B206}$ | $R^{D7}$ | $R^{D9}$ | H |
| $L_{B207}$ | $R^{D7}$ | $R^{D10}$ | H |
| $L_{B208}$ | $R^{D7}$ | $R^{D11}$ | H |
| $L_{B209}$ | $R^{D7}$ | $R^{D12}$ | H |
| $L_{B210}$ | $R^{D7}$ | $R^{D13}$ | H |
| $L_{B211}$ | $R^{D7}$ | $R^{D14}$ | H |
| $L_{B212}$ | $R^{D7}$ | $R^{D15}$ | H |
| $L_{B213}$ | $R^{D7}$ | $R^{D16}$ | H |
| $L_{B214}$ | $R^{D7}$ | $R^{D17}$ | H |
| $L_{B215}$ | $R^{D7}$ | $R^{D18}$ | H |
| $L_{B216}$ | $R^{D7}$ | $R^{D19}$ | H |
| $L_{B217}$ | $R^{D7}$ | $R^{D20}$ | H |
| $L_{B218}$ | $R^{D7}$ | $R^{D21}$ | H |
| $L_{B219}$ | $R^{D7}$ | $R^{D22}$ | H |
| $L_{B220}$ | $R^{D7}$ | $R^{D23}$ | H |
| $L_{B221}$ | $R^{D7}$ | $R^{D24}$ | H |
| $L_{B222}$ | $R^{D7}$ | $R^{D25}$ | H |
| $L_{B223}$ | $R^{D7}$ | $R^{D26}$ | H |
| $L_{B224}$ | $R^{D7}$ | $R^{D27}$ | H |
| $L_{B225}$ | $R^{D7}$ | $R^{D28}$ | H |
| $L_{B226}$ | $R^{D7}$ | $R^{D29}$ | H |
| $L_{B227}$ | $R^{D7}$ | $R^{D30}$ | H |
| $L_{B228}$ | $R^{D7}$ | $R^{D31}$ | H |
| $L_{B229}$ | $R^{D7}$ | $R^{D32}$ | H |
| $L_{B230}$ | $R^{D7}$ | $R^{D33}$ | H |
| $L_{B231}$ | $R^{D7}$ | $R^{D34}$ | H |
| $L_{B232}$ | $R^{D7}$ | $R^{D35}$ | H |
| $L_{B233}$ | $R^{D7}$ | $R^{D40}$ | H |
| $L_{B234}$ | $R^{D7}$ | $R^{D41}$ | H |
| $L_{B235}$ | $R^{D7}$ | $R^{D42}$ | H |
| $L_{B236}$ | $R^{D7}$ | $R^{D64}$ | H |
| $L_{B237}$ | $R^{D7}$ | $R^{D66}$ | H |
| $L_{B238}$ | $R^{D7}$ | $R^{D68}$ | H |
| $L_{B239}$ | $R^{D7}$ | $R^{D76}$ | H |
| $L_{B240}$ | $R^{D8}$ | $R^{D5}$ | H |
| $L_{B241}$ | $R^{D8}$ | $R^{D6}$ | H |
| $L_{B242}$ | $R^{D8}$ | $R^{D9}$ | H |
| $L_{B243}$ | $R^{D8}$ | $R^{D10}$ | H |
| $L_{B244}$ | $R^{D8}$ | $R^{D11}$ | H |
| $L_{B245}$ | $R^{D8}$ | $R^{D12}$ | H |
| $L_{B246}$ | $R^{D8}$ | $R^{D13}$ | H |
| $L_{B247}$ | $R^{D8}$ | $R^{D14}$ | H |
| $L_{B248}$ | $R^{D8}$ | $R^{D15}$ | H |
| $L_{B249}$ | $R^{D8}$ | $R^{D16}$ | H |
| $L_{B250}$ | $R^{D8}$ | $R^{D17}$ | H |
| $L_{B251}$ | $R^{D8}$ | $R^{D18}$ | H |
| $L_{B252}$ | $R^{D8}$ | $R^{D19}$ | H |
| $L_{B253}$ | $R^{D8}$ | $R^{D20}$ | H |
| $L_{B254}$ | $R^{D8}$ | $R^{D21}$ | H |
| $L_{B255}$ | $R^{D8}$ | $R^{D22}$ | H |
| $L_{B256}$ | $R^{D8}$ | $R^{D23}$ | H |
| $L_{B257}$ | $R^{D8}$ | $R^{D24}$ | H |
| $L_{B258}$ | $R^{D8}$ | $R^{D25}$ | H |
| $L_{B259}$ | $R^{D8}$ | $R^{D26}$ | H |
| $L_{B260}$ | $R^{D8}$ | $R^{D27}$ | H |
| $L_{B261}$ | $R^{D8}$ | $R^{D28}$ | H |
| $L_{B262}$ | $R^{D8}$ | $R^{D29}$ | H |
| $L_{B263}$ | $R^{D8}$ | $R^{D30}$ | H |
| $L_{B264}$ | $R^{D8}$ | $R^{D31}$ | H |
| $L_{B265}$ | $R^{D8}$ | $R^{D32}$ | H |
| $L_{B266}$ | $R^{D8}$ | $R^{D33}$ | H |
| $L_{B267}$ | $R^{D8}$ | $R^{D34}$ | H |
| $L_{B268}$ | $R^{D8}$ | $R^{D35}$ | H |
| $L_{B269}$ | $R^{D8}$ | $R^{D40}$ | H |
| $L_{B270}$ | $R^{D8}$ | $R^{D41}$ | H |
| $L_{B271}$ | $R^{D8}$ | $R^{D42}$ | H |
| $L_{B272}$ | $R^{D8}$ | $R^{D64}$ | H |
| $L_{B273}$ | $R^{D8}$ | $R^{D66}$ | H |
| $L_{B274}$ | $R^{D8}$ | $R^{D68}$ | H |
| $L_{B275}$ | $R^{D8}$ | $R^{D76}$ | H |
| $L_{B276}$ | $R^{D11}$ | $R^{D5}$ | H |
| $L_{B277}$ | $R^{D11}$ | $R^{D6}$ | H |

-continued

| Ligand | $R^1$ | $R^2$ | $R^3$ |
|---|---|---|---|
| $L_{B278}$ | $R^{D11}$ | $R^{D9}$ | H |
| $L_{B279}$ | $R^{D11}$ | $R^{D10}$ | H |
| $L_{B280}$ | $R^{D11}$ | $R^{D12}$ | H |
| $L_{B281}$ | $R^{D11}$ | $R^{D13}$ | H |
| $L_{B282}$ | $R^{D11}$ | $R^{D14}$ | H |
| $L_{B283}$ | $R^{D11}$ | $R^{D15}$ | H |
| $L_{B284}$ | $R^{D11}$ | $R^{D16}$ | H |
| $L_{B285}$ | $R^{D11}$ | $R^{D17}$ | H |
| $L_{B286}$ | $R^{D11}$ | $R^{D18}$ | H |
| $L_{B287}$ | $R^{D11}$ | $R^{D19}$ | H |
| $L_{B288}$ | $R^{D11}$ | $R^{D20}$ | H |
| $L_{B289}$ | $R^{D11}$ | $R^{D21}$ | H |
| $L_{B290}$ | $R^{D11}$ | $R^{D22}$ | H |
| $L_{B291}$ | $R^{D11}$ | $R^{D23}$ | H |
| $L_{B292}$ | $R^{D11}$ | $R^{D24}$ | H |
| $L_{B293}$ | $R^{D11}$ | $R^{D25}$ | H |
| $L_{B294}$ | $R^{D11}$ | $R^{D26}$ | H |
| $L_{B295}$ | $R^{D11}$ | $R^{D27}$ | H |
| $L_{B296}$ | $R^{D11}$ | $R^{D28}$ | H |
| $L_{B297}$ | $R^{D11}$ | $R^{D29}$ | H |
| $L_{B298}$ | $R^{D11}$ | $R^{D30}$ | H |
| $L_{B299}$ | $R^{D11}$ | $R^{D31}$ | H |
| $L_{B300}$ | $R^{D11}$ | $R^{D32}$ | H |
| $L_{B301}$ | $R^{D11}$ | $R^{D33}$ | H |
| $L_{B302}$ | $R^{D11}$ | $R^{D34}$ | H |
| $L_{B303}$ | $R^{D11}$ | $R^{D35}$ | H |
| $L_{B304}$ | $R^{D11}$ | $R^{D40}$ | H |
| $L_{B305}$ | $R^{D11}$ | $R^{D41}$ | H |
| $L_{B306}$ | $R^{D11}$ | $R^{D42}$ | H |
| $L_{B307}$ | $R^{D11}$ | $R^{D64}$ | H |
| $L_{B308}$ | $R^{D11}$ | $R^{D66}$ | H |
| $L_{B309}$ | $R^{D11}$ | $R^{D68}$ | H |
| $L_{B310}$ | $R^{D11}$ | $R^{D76}$ | H |
| $L_{B311}$ | $R^{D13}$ | $R^{D5}$ | H |
| $L_{B312}$ | $R^{D13}$ | $R^{D6}$ | H |
| $L_{B313}$ | $R^{D13}$ | $R^{D9}$ | H |
| $L_{B314}$ | $R^{D13}$ | $R^{D10}$ | H |
| $L_{B315}$ | $R^{D13}$ | $R^{D12}$ | H |
| $L_{B316}$ | $R^{D13}$ | $R^{D14}$ | H |
| $L_{B317}$ | $R^{D13}$ | $R^{D15}$ | H |
| $L_{B318}$ | $R^{D13}$ | $R^{D16}$ | H |
| $L_{B319}$ | $R^{D13}$ | $R^{D17}$ | H |
| $L_{B320}$ | $R^{D13}$ | $R^{D18}$ | H |
| $L_{B321}$ | $R^{D13}$ | $R^{D19}$ | H |
| $L_{B322}$ | $R^{D13}$ | $R^{D20}$ | H |
| $L_{B323}$ | $R^{D13}$ | $R^{D21}$ | H |
| $L_{B324}$ | $R^{D13}$ | $R^{D22}$ | H |
| $L_{B325}$ | $R^{D13}$ | $R^{D23}$ | H |
| $L_{B326}$ | $R^{D13}$ | $R^{D24}$ | H |
| $L_{B327}$ | $R^{D13}$ | $R^{D25}$ | H |
| $L_{B328}$ | $R^{D13}$ | $R^{D26}$ | H |
| $L_{B329}$ | $R^{D13}$ | $R^{D27}$ | H |
| $L_{B330}$ | $R^{D13}$ | $R^{D28}$ | H |
| $L_{B331}$ | $R^{D13}$ | $R^{D29}$ | H |
| $L_{B332}$ | $R^{D13}$ | $R^{D30}$ | H |
| $L_{B333}$ | $R^{D13}$ | $R^{D31}$ | H |
| $L_{B334}$ | $R^{D13}$ | $R^{D32}$ | H |
| $L_{B335}$ | $R^{D13}$ | $R^{D33}$ | H |
| $L_{B336}$ | $R^{D13}$ | $R^{D34}$ | H |
| $L_{B337}$ | $R^{D13}$ | $R^{D35}$ | H |
| $L_{B338}$ | $R^{D13}$ | $R^{D40}$ | H |
| $L_{B339}$ | $R^{D13}$ | $R^{D41}$ | H |
| $L_{B340}$ | $R^{D13}$ | $R^{D42}$ | H |
| $L_{B341}$ | $R^{D13}$ | $R^{D64}$ | H |
| $L_{B342}$ | $R^{D13}$ | $R^{D66}$ | H |
| $L_{B343}$ | $R^{D13}$ | $R^{D68}$ | H |
| $L_{B344}$ | $R^{D13}$ | $R^{D76}$ | H |
| $L_{B345}$ | $R^{D14}$ | $R^{D5}$ | H |
| $L_{B346}$ | $R^{D14}$ | $R^{D6}$ | H |
| $L_{B347}$ | $R^{D14}$ | $R^{D9}$ | H |
| $L_{B348}$ | $R^{D14}$ | $R^{D10}$ | H |
| $L_{B349}$ | $R^{D14}$ | $R^{D12}$ | H |
| $L_{B350}$ | $R^{D14}$ | $R^{D15}$ | H |
| $L_{B351}$ | $R^{D14}$ | $R^{D16}$ | H |
| $L_{B352}$ | $R^{D14}$ | $R^{D17}$ | H |
| $L_{B353}$ | $R^{D14}$ | $R^{D18}$ | H |
| $L_{B354}$ | $R^{D14}$ | $R^{D19}$ | H |

-continued

| Ligand | $R^1$ | $R^2$ | $R^3$ |
|---|---|---|---|
| $L_{B355}$ | $R^{D14}$ | $R^{D20}$ | H |
| $L_{B356}$ | $R^{D14}$ | $R^{D21}$ | H |
| $L_{B357}$ | $R^{D14}$ | $R^{D22}$ | H |
| $L_{B358}$ | $R^{D14}$ | $R^{D23}$ | H |
| $L_{B359}$ | $R^{D14}$ | $R^{D24}$ | H |
| $L_{B360}$ | $R^{D14}$ | $R^{D25}$ | H |
| $L_{B361}$ | $R^{D14}$ | $R^{D26}$ | H |
| $L_{B362}$ | $R^{D14}$ | $R^{D27}$ | H |
| $L_{B363}$ | $R^{D14}$ | $R^{D28}$ | H |
| $L_{B364}$ | $R^{D14}$ | $R^{D29}$ | H |
| $L_{B365}$ | $R^{D14}$ | $R^{D30}$ | H |
| $L_{B366}$ | $R^{D14}$ | $R^{D31}$ | H |
| $L_{B367}$ | $R^{D14}$ | $R^{D32}$ | H |
| $L_{B368}$ | $R^{D14}$ | $R^{D33}$ | H |
| $L_{B369}$ | $R^{D14}$ | $R^{D34}$ | H |
| $L_{B370}$ | $R^{D14}$ | $R^{D35}$ | H |
| $L_{B371}$ | $R^{D14}$ | $R^{D40}$ | H |
| $L_{B372}$ | $R^{D14}$ | $R^{D41}$ | H |
| $L_{B373}$ | $R^{D14}$ | $R^{D42}$ | H |
| $L_{B374}$ | $R^{D14}$ | $R^{D64}$ | H |
| $L_{B375}$ | $R^{D14}$ | $R^{D66}$ | H |
| $L_{B376}$ | $R^{D14}$ | $R^{D68}$ | H |
| $L_{B377}$ | $R^{D14}$ | $R^{D76}$ | H |
| $L_{B378}$ | $R^{D22}$ | $R^{D5}$ | H |
| $L_{B379}$ | $R^{D22}$ | $R^{D6}$ | H |
| $L_{B380}$ | $R^{D22}$ | $R^{D9}$ | H |
| $L_{B381}$ | $R^{D22}$ | $R^{D10}$ | H |
| $L_{B382}$ | $R^{D22}$ | $R^{D12}$ | H |
| $L_{B383}$ | $R^{D22}$ | $R^{D15}$ | H |
| $L_{B384}$ | $R^{D22}$ | $R^{D16}$ | H |
| $L_{B385}$ | $R^{D22}$ | $R^{D17}$ | H |
| $L_{B386}$ | $R^{D22}$ | $R^{D18}$ | H |
| $L_{B387}$ | $R^{D22}$ | $R^{D19}$ | H |
| $L_{B388}$ | $R^{D22}$ | $R^{D20}$ | H |
| $L_{B389}$ | $R^{D22}$ | $R^{D21}$ | H |
| $L_{B390}$ | $R^{D22}$ | $R^{D23}$ | H |
| $L_{B391}$ | $R^{D22}$ | $R^{D24}$ | H |
| $L_{B392}$ | $R^{D22}$ | $R^{D25}$ | H |
| $L_{B393}$ | $R^{D22}$ | $R^{D26}$ | H |
| $L_{B394}$ | $R^{D22}$ | $R^{D27}$ | H |
| $L_{B395}$ | $R^{D22}$ | $R^{D28}$ | H |
| $L_{B396}$ | $R^{D22}$ | $R^{D29}$ | H |
| $L_{B397}$ | $R^{D22}$ | $R^{D30}$ | H |
| $L_{B398}$ | $R^{D22}$ | $R^{D31}$ | H |
| $L_{B399}$ | $R^{D22}$ | $R^{D32}$ | H |
| $L_{B400}$ | $R^{D22}$ | $R^{D33}$ | H |
| $L_{B401}$ | $R^{D22}$ | $R^{D34}$ | H |
| $L_{B402}$ | $R^{D22}$ | $R^{D35}$ | H |
| $L_{B403}$ | $R^{D22}$ | $R^{D40}$ | H |
| $L_{B404}$ | $R^{D22}$ | $R^{D41}$ | H |
| $L_{B405}$ | $R^{D22}$ | $R^{D42}$ | H |
| $L_{B406}$ | $R^{D22}$ | $R^{D64}$ | H |
| $L_{B407}$ | $R^{D22}$ | $R^{D66}$ | H |
| $L_{B408}$ | $R^{D22}$ | $R^{D68}$ | H |
| $L_{B409}$ | $R^{D22}$ | $R^{D76}$ | H |
| $L_{B410}$ | $R^{D26}$ | $R^{D5}$ | H |
| $L_{B411}$ | $R^{D26}$ | $R^{D6}$ | H |
| $L_{B412}$ | $R^{D26}$ | $R^{D9}$ | H |
| $L_{B413}$ | $R^{D26}$ | $R^{D10}$ | H |
| $L_{B414}$ | $R^{D26}$ | $R^{D12}$ | H |
| $L_{B415}$ | $R^{D26}$ | $R^{D15}$ | H |
| $L_{B416}$ | $R^{D26}$ | $R^{D16}$ | H |
| $L_{B417}$ | $R^{D26}$ | $R^{D17}$ | H |
| $L_{B418}$ | $R^{D26}$ | $R^{D18}$ | H |
| $L_{B419}$ | $R^{D26}$ | $R^{D19}$ | H |
| $L_{B420}$ | $R^{D26}$ | $R^{D20}$ | H |
| $L_{B421}$ | $R^{D26}$ | $R^{D21}$ | H |
| $L_{B422}$ | $R^{D26}$ | $R^{D23}$ | H |
| $L_{B423}$ | $R^{D26}$ | $R^{D24}$ | H |
| $L_{B424}$ | $R^{D26}$ | $R^{D25}$ | H |
| $L_{B425}$ | $R^{D26}$ | $R^{D27}$ | H |
| $L_{B426}$ | $R^{D26}$ | $R^{D28}$ | H |
| $L_{B427}$ | $R^{D26}$ | $R^{D29}$ | H |
| $L_{B428}$ | $R^{D26}$ | $R^{D30}$ | H |
| $L_{B429}$ | $R^{D26}$ | $R^{D31}$ | H |
| $L_{B430}$ | $R^{D26}$ | $R^{D32}$ | H |
| $L_{B431}$ | $R^{D26}$ | $R^{D33}$ | H |

-continued

| Ligand | $R^1$ | $R^2$ | $R^3$ |
|---|---|---|---|
| $L_{B432}$ | $R^{D26}$ | $R^{D34}$ | H |
| $L_{B433}$ | $R^{D26}$ | $R^{D35}$ | H |
| $L_{B434}$ | $R^{D26}$ | $R^{D40}$ | H |
| $L_{B435}$ | $R^{D26}$ | $R^{D41}$ | H |
| $L_{B436}$ | $R^{D26}$ | $R^{D42}$ | H |
| $L_{B437}$ | $R^{D26}$ | $R^{D64}$ | H |
| $L_{B438}$ | $R^{D26}$ | $R^{D66}$ | H |
| $L_{B439}$ | $R^{D26}$ | $R^{D68}$ | H |
| $L_{B440}$ | $R^{D26}$ | $R^{D76}$ | H |
| $L_{B441}$ | $R^{D35}$ | $R^{D5}$ | H |
| $L_{B442}$ | $R^{D35}$ | $R^{D6}$ | H |
| $L_{B443}$ | $R^{D35}$ | $R^{D9}$ | H |
| $L_{B444}$ | $R^{D35}$ | $R^{D10}$ | H |
| $L_{B445}$ | $R^{D35}$ | $R^{D12}$ | H |
| $L_{B446}$ | $R^{D35}$ | $R^{D15}$ | H |
| $L_{B447}$ | $R^{D35}$ | $R^{D16}$ | H |
| $L_{B448}$ | $R^{D35}$ | $R^{D17}$ | H |
| $L_{B449}$ | $R^{D35}$ | $R^{D18}$ | H |
| $L_{B450}$ | $R^{D35}$ | $R^{D19}$ | H |
| $L_{B451}$ | $R^{D35}$ | $R^{D20}$ | H |
| $L_{B452}$ | $R^{D35}$ | $R^{D21}$ | H |
| $L_{B453}$ | $R^{D35}$ | $R^{D23}$ | H |
| $L_{B454}$ | $R^{D35}$ | $R^{D24}$ | H |
| $L_{B455}$ | $R^{D35}$ | $R^{D25}$ | H |
| $L_{B456}$ | $R^{D35}$ | $R^{D27}$ | H |
| $L_{B457}$ | $R^{D35}$ | $R^{D28}$ | H |
| $L_{B458}$ | $R^{D35}$ | $R^{D29}$ | H |
| $L_{B459}$ | $R^{D35}$ | $R^{D30}$ | H |
| $L_{B460}$ | $R^{D35}$ | $R^{D31}$ | H |
| $L_{B461}$ | $R^{D35}$ | $R^{D32}$ | H |
| $L_{B462}$ | $R^{D35}$ | $R^{D33}$ | H |
| $L_{B463}$ | $R^{D35}$ | $R^{D34}$ | H |
| $L_{B464}$ | $R^{D35}$ | $R^{D40}$ | H |
| $L_{B465}$ | $R^{D35}$ | $R^{D41}$ | H |
| $L_{B466}$ | $R^{D35}$ | $R^{D42}$ | H |
| $L_{B467}$ | $R^{D35}$ | $R^{D64}$ | H |
| $L_{B468}$ | $R^{D35}$ | $R^{D66}$ | H |
| $L_{B469}$ | $R^{D35}$ | $R^{D68}$ | H |
| $L_{B470}$ | $R^{D35}$ | $R^{D76}$ | H |
| $L_{B471}$ | $R^{D40}$ | $R^{D5}$ | H |
| $L_{B472}$ | $R^{D40}$ | $R^{D6}$ | H |
| $L_{B473}$ | $R^{D40}$ | $R^{D9}$ | H |
| $L_{B474}$ | $R^{D40}$ | $R^{D10}$ | H |
| $L_{B475}$ | $R^{D40}$ | $R^{D12}$ | H |
| $L_{B476}$ | $R^{D40}$ | $R^{D15}$ | H |
| $L_{B477}$ | $R^{D40}$ | $R^{D16}$ | H |
| $L_{B478}$ | $R^{D40}$ | $R^{D17}$ | H |
| $L_{B479}$ | $R^{D40}$ | $R^{D18}$ | H |
| $L_{B480}$ | $R^{D40}$ | $R^{D19}$ | H |
| $L_{B481}$ | $R^{D40}$ | $R^{D20}$ | H |
| $L_{B482}$ | $R^{D40}$ | $R^{D21}$ | H |
| $L_{B483}$ | $R^{D40}$ | $R^{D23}$ | H |
| $L_{B484}$ | $R^{D40}$ | $R^{D24}$ | H |
| $L_{B485}$ | $R^{D40}$ | $R^{D25}$ | H |
| $L_{B486}$ | $R^{D40}$ | $R^{D27}$ | H |
| $L_{B487}$ | $R^{D40}$ | $R^{D28}$ | H |
| $L_{B488}$ | $R^{D40}$ | $R^{D29}$ | H |
| $L_{B489}$ | $R^{D40}$ | $R^{D30}$ | H |
| $L_{B490}$ | $R^{D40}$ | $R^{D31}$ | H |
| $L_{B491}$ | $R^{D40}$ | $R^{D32}$ | H |
| $L_{B492}$ | $R^{D40}$ | $R^{D33}$ | H |
| $L_{B493}$ | $R^{D40}$ | $R^{D34}$ | H |
| $L_{B494}$ | $R^{D40}$ | $R^{D41}$ | H |
| $L_{B495}$ | $R^{D40}$ | $R^{D42}$ | H |
| $L_{B496}$ | $R^{D40}$ | $R^{D64}$ | H |
| $L_{B497}$ | $R^{D40}$ | $R^{D66}$ | H |
| $L_{B498}$ | $R^{D40}$ | $R^{D68}$ | H |
| $L_{B499}$ | $R^{D40}$ | $R^{D76}$ | H |
| $L_{B500}$ | $R^{D41}$ | $R^{D5}$ | H |
| $L_{B501}$ | $R^{D41}$ | $R^{D6}$ | H |
| $L_{B502}$ | $R^{D41}$ | $R^{D9}$ | H |
| $L_{B503}$ | $R^{D41}$ | $R^{D10}$ | H |
| $L_{B504}$ | $R^{D41}$ | $R^{D12}$ | H |
| $L_{B505}$ | $R^{D41}$ | $R^{D15}$ | H |
| $L_{B506}$ | $R^{D41}$ | $R^{D16}$ | H |
| $L_{B507}$ | $R^{D41}$ | $R^{D17}$ | H |
| $L_{B508}$ | $R^{D41}$ | $R^{D18}$ | H |

-continued

| Ligand | $R^1$ | $R^2$ | $R^3$ |
|---|---|---|---|
| $L_{B509}$ | $R^{D41}$ | $R^{D19}$ | H |
| $L_{B510}$ | $R^{D41}$ | $R^{D20}$ | H |
| $L_{B511}$ | $R^{D41}$ | $R^{D21}$ | H |
| $L_{B512}$ | $R^{D41}$ | $R^{D23}$ | H |
| $L_{B513}$ | $R^{D41}$ | $R^{D24}$ | H |
| $L_{B514}$ | $R^{D41}$ | $R^{D25}$ | H |
| $L_{B515}$ | $R^{D41}$ | $R^{D27}$ | H |
| $L_{B516}$ | $R^{D41}$ | $R^{D28}$ | H |
| $L_{B517}$ | $R^{D41}$ | $R^{D29}$ | H |
| $L_{B518}$ | $R^{D41}$ | $R^{D30}$ | H |
| $L_{B519}$ | $R^{D41}$ | $R^{D31}$ | H |
| $L_{B520}$ | $R^{D41}$ | $R^{D32}$ | H |
| $L_{B521}$ | $R^{D41}$ | $R^{D33}$ | H |
| $L_{B522}$ | $R^{D41}$ | $R^{D34}$ | H |
| $L_{B523}$ | $R^{D41}$ | $R^{D42}$ | H |
| $L_{B524}$ | $R^{D41}$ | $R^{D64}$ | H |
| $L_{B525}$ | $R^{D41}$ | $R^{D66}$ | H |
| $L_{B526}$ | $R^{D41}$ | $R^{D68}$ | H |
| $L_{B527}$ | $R^{D41}$ | $R^{D76}$ | H |
| $L_{B528}$ | $R^{D64}$ | $R^{D5}$ | H |
| $L_{B529}$ | $R^{D64}$ | $R^{D6}$ | H |
| $L_{B530}$ | $R^{D64}$ | $R^{D9}$ | H |
| $L_{B531}$ | $R^{D64}$ | $R^{D10}$ | H |
| $L_{B532}$ | $R^{D64}$ | $R^{D12}$ | H |
| $L_{B533}$ | $R^{D64}$ | $R^{D15}$ | H |
| $L_{B534}$ | $R^{D64}$ | $R^{D16}$ | H |
| $L_{B535}$ | $R^{D64}$ | $R^{D17}$ | H |
| $L_{B536}$ | $R^{D64}$ | $R^{D18}$ | H |
| $L_{B537}$ | $R^{D64}$ | $R^{D19}$ | H |
| $L_{B538}$ | $R^{D64}$ | $R^{D20}$ | H |
| $L_{B539}$ | $R^{D64}$ | $R^{D21}$ | H |
| $L_{B540}$ | $R^{D64}$ | $R^{D23}$ | H |
| $L_{B541}$ | $R^{D64}$ | $R^{D24}$ | H |
| $L_{B542}$ | $R^{D64}$ | $R^{D25}$ | H |
| $L_{B543}$ | $R^{D64}$ | $R^{D27}$ | H |
| $L_{B544}$ | $R^{D64}$ | $R^{D28}$ | H |
| $L_{B545}$ | $R^{D64}$ | $R^{D29}$ | H |
| $L_{B546}$ | $R^{D64}$ | $R^{D30}$ | H |
| $L_{B547}$ | $R^{D64}$ | $R^{D31}$ | H |
| $L_{B548}$ | $R^{D64}$ | $R^{D32}$ | H |
| $L_{B549}$ | $R^{D64}$ | $R^{D33}$ | H |
| $L_{B550}$ | $R^{D64}$ | $R^{D34}$ | H |
| $L_{B551}$ | $R^{D64}$ | $R^{D42}$ | H |
| $L_{B552}$ | $R^{D64}$ | $R^{D64}$ | H |
| $L_{B553}$ | $R^{D64}$ | $R^{D66}$ | H |
| $L_{B554}$ | $R^{D64}$ | $R^{D68}$ | H |
| $L_{B555}$ | $R^{D64}$ | $R^{D76}$ | H |
| $L_{B556}$ | $R^{D66}$ | $R^{D5}$ | H |
| $L_{B557}$ | $R^{D66}$ | $R^{D6}$ | H |
| $L_{B558}$ | $R^{D66}$ | $R^{D9}$ | H |
| $L_{B559}$ | $R^{D66}$ | $R^{D10}$ | H |
| $L_{B560}$ | $R^{D66}$ | $R^{D12}$ | H |
| $L_{B561}$ | $R^{D66}$ | $R^{D15}$ | H |
| $L_{B562}$ | $R^{D66}$ | $R^{D16}$ | H |
| $L_{B563}$ | $R^{D66}$ | $R^{D17}$ | H |
| $L_{B564}$ | $R^{D66}$ | $R^{D18}$ | H |
| $L_{B565}$ | $R^{D66}$ | $R^{D19}$ | H |
| $L_{B566}$ | $R^{D66}$ | $R^{D20}$ | H |
| $L_{B567}$ | $R^{D66}$ | $R^{D21}$ | H |
| $L_{B568}$ | $R^{D66}$ | $R^{D23}$ | H |
| $L_{B569}$ | $R^{D66}$ | $R^{D24}$ | H |
| $L_{B570}$ | $R^{D66}$ | $R^{D25}$ | H |
| $L_{B571}$ | $R^{D66}$ | $R^{D27}$ | H |
| $L_{B572}$ | $R^{D66}$ | $R^{D28}$ | H |
| $L_{B573}$ | $R^{D66}$ | $R^{D29}$ | H |
| $L_{B574}$ | $R^{D66}$ | $R^{D30}$ | H |
| $L_{B575}$ | $R^{D66}$ | $R^{D31}$ | H |
| $L_{B576}$ | $R^{D66}$ | $R^{D32}$ | H |
| $L_{B577}$ | $R^{D66}$ | $R^{D33}$ | H |
| $L_{B578}$ | $R^{D66}$ | $R^{D34}$ | H |
| $L_{B579}$ | $R^{D66}$ | $R^{D42}$ | H |
| $L_{B580}$ | $R^{D66}$ | $R^{D68}$ | H |
| $L_{B581}$ | $R^{D66}$ | $R^{D76}$ | H |
| $L_{B582}$ | $R^{D68}$ | $R^{D5}$ | H |
| $L_{B583}$ | $R^{D68}$ | $R^{D6}$ | H |
| $L_{B584}$ | $R^{D68}$ | $R^{D9}$ | H |
| $L_{B585}$ | $R^{D68}$ | $R^{D10}$ | H |

-continued

| Ligand | $R^1$ | $R^2$ | $R^3$ |
|---|---|---|---|
| $L_{B586}$ | $R^{D68}$ | $R^{D12}$ | H |
| $L_{B587}$ | $R^{D68}$ | $R^{D15}$ | H |
| $L_{B588}$ | $R^{D68}$ | $R^{D16}$ | H |
| $L_{B589}$ | $R^{D68}$ | $R^{D17}$ | H |
| $L_{B590}$ | $R^{D68}$ | $R^{D18}$ | H |
| $L_{B591}$ | $R^{D68}$ | $R^{D19}$ | H |
| $L_{B592}$ | $R^{D68}$ | $R^{D20}$ | H |
| $L_{B593}$ | $R^{D68}$ | $R^{D21}$ | H |
| $L_{B594}$ | $R^{D68}$ | $R^{D23}$ | H |
| $L_{B595}$ | $R^{D68}$ | $R^{D24}$ | H |
| $L_{B596}$ | $R^{D68}$ | $R^{D25}$ | H |
| $L_{B597}$ | $R^{D68}$ | $R^{D27}$ | H |
| $L_{B598}$ | $R^{D68}$ | $R^{D28}$ | H |
| $L_{B599}$ | $R^{D68}$ | $R^{D29}$ | H |
| $L_{B600}$ | $R^{D68}$ | $R^{D30}$ | H |
| $L_{B601}$ | $R^{D68}$ | $R^{D31}$ | H |
| $L_{B602}$ | $R^{D68}$ | $R^{D32}$ | H |
| $L_{B603}$ | $R^{D68}$ | $R^{D33}$ | H |
| $L_{B604}$ | $R^{D68}$ | $R^{D34}$ | H |
| $L_{B605}$ | $R^{D68}$ | $R^{D42}$ | H |
| $L_{B606}$ | $R^{D68}$ | $R^{D76}$ | H |
| $L_{B607}$ | $R^{D76}$ | $R^{D5}$ | H |
| $L_{B608}$ | $R^{D76}$ | $R^{D6}$ | H |
| $L_{B609}$ | $R^{D76}$ | $R^{D9}$ | H |
| $L_{B610}$ | $R^{D76}$ | $R^{D10}$ | H |
| $L_{B611}$ | $R^{D76}$ | $R^{D12}$ | H |
| $L_{B612}$ | $R^{D76}$ | $R^{D15}$ | H |
| $L_{B613}$ | $R^{D76}$ | $R^{D16}$ | H |
| $L_{B614}$ | $R^{D76}$ | $R^{D17}$ | H |
| $L_{B615}$ | $R^{D76}$ | $R^{D18}$ | H |
| $L_{B616}$ | $R^{D76}$ | $R^{D19}$ | H |
| $L_{B617}$ | $R^{D76}$ | $R^{D20}$ | H |
| $L_{B618}$ | $R^{D76}$ | $R^{D21}$ | H |
| $L_{B619}$ | $R^{D76}$ | $R^{D23}$ | H |
| $L_{B620}$ | $R^{D76}$ | $R^{D24}$ | H |
| $L_{B621}$ | $R^{D76}$ | $R^{D25}$ | H |
| $L_{B622}$ | $R^{D76}$ | $R^{D27}$ | H |
| $L_{B623}$ | $R^{D76}$ | $R^{D28}$ | H |
| $L_{B624}$ | $R^{D76}$ | $R^{D29}$ | H |
| $L_{B625}$ | $R^{D76}$ | $R^{D30}$ | H |
| $L_{B626}$ | $R^{D76}$ | $R^{D31}$ | H |
| $L_{B627}$ | $R^{D76}$ | $R^{D32}$ | H |
| $L_{B628}$ | $R^{D76}$ | $R^{D33}$ | H |
| $L_{B629}$ | $R^{D76}$ | $R^{D34}$ | H |
| $L_{B630}$ | $R^{D76}$ | $R^{D42}$ | H |
| $L_{B631}$ | $R^{D1}$ | $R^{D1}$ | $R^{D1}$ |
| $L_{B632}$ | $R^{D2}$ | $R^{D2}$ | $R^{D1}$ |
| $L_{B633}$ | $R^{D3}$ | $R^{D3}$ | $R^{D1}$ |
| $L_{B634}$ | $R^{D4}$ | $R^{D4}$ | $R^{D1}$ |
| $L_{B635}$ | $R^{D5}$ | $R^{D5}$ | $R^{D1}$ |
| $L_{B636}$ | $R^{D6}$ | $R^{D6}$ | $R^{D1}$ |
| $L_{B637}$ | $R^{D7}$ | $R^{D7}$ | $R^{D1}$ |
| $L_{B638}$ | $R^{D8}$ | $R^{D8}$ | $R^{D1}$ |
| $L_{B639}$ | $R^{D9}$ | $R^{D9}$ | $R^{D1}$ |
| $L_{B640}$ | $R^{D10}$ | $R^{D10}$ | $R^{D1}$ |
| $L_{B641}$ | $R^{D11}$ | $R^{D11}$ | $R^{D1}$ |
| $L_{B642}$ | $R^{D12}$ | $R^{D12}$ | $R^{D1}$ |
| $L_{B643}$ | $R^{D13}$ | $R^{D13}$ | $R^{D1}$ |
| $L_{B644}$ | $R^{D14}$ | $R^{D14}$ | $R^{D1}$ |
| $L_{B645}$ | $R^{D15}$ | $R^{D15}$ | $R^{D1}$ |
| $L_{B646}$ | $R^{D16}$ | $R^{D16}$ | $R^{D1}$ |
| $L_{B647}$ | $R^{D17}$ | $R^{D17}$ | $R^{D1}$ |
| $L_{B648}$ | $R^{D18}$ | $R^{D18}$ | $R^{D1}$ |
| $L_{B649}$ | $R^{D19}$ | $R^{D19}$ | $R^{D1}$ |
| $L_{B650}$ | $R^{D20}$ | $R^{D20}$ | $R^{D1}$ |
| $L_{B651}$ | $R^{D21}$ | $R^{D21}$ | $R^{D1}$ |
| $L_{B652}$ | $R^{D22}$ | $R^{D22}$ | $R^{D1}$ |
| $L_{B653}$ | $R^{D23}$ | $R^{D23}$ | $R^{D1}$ |
| $L_{B654}$ | $R^{D24}$ | $R^{D24}$ | $R^{D1}$ |
| $L_{B655}$ | $R^{D25}$ | $R^{D25}$ | $R^{D1}$ |
| $L_{B656}$ | $R^{D26}$ | $R^{D26}$ | $R^{D1}$ |
| $L_{B657}$ | $R^{D27}$ | $R^{D27}$ | $R^{D1}$ |
| $L_{B658}$ | $R^{D28}$ | $R^{D28}$ | $R^{D1}$ |
| $L_{B659}$ | $R^{D29}$ | $R^{D29}$ | $R^{D1}$ |
| $L_{B660}$ | $R^{D30}$ | $R^{D30}$ | $R^{D1}$ |
| $L_{B661}$ | $R^{D31}$ | $R^{D31}$ | $R^{D1}$ |
| $L_{B662}$ | $R^{D32}$ | $R^{D32}$ | $R^{D1}$ |

-continued

| Ligand | $R^1$ | $R^2$ | $R^3$ |
|---|---|---|---|
| $L_{B663}$ | $R^{D33}$ | $R^{D33}$ | $R^{D1}$ |
| $L_{B664}$ | $R^{D34}$ | $R^{D34}$ | $R^{D1}$ |
| $L_{B665}$ | $R^{D35}$ | $R^{D35}$ | $R^{D1}$ |
| $L_{B666}$ | $R^{D40}$ | $R^{D40}$ | $R^{D1}$ |
| $L_{B667}$ | $R^{D41}$ | $R^{D41}$ | $R^{D1}$ |
| $L_{B668}$ | $R^{D42}$ | $R^{D42}$ | $R^{D1}$ |
| $L_{B669}$ | $R^{D64}$ | $R^{D64}$ | $R^{D1}$ |
| $L_{B670}$ | $R^{D66}$ | $R^{D66}$ | $R^{D1}$ |
| $L_{B671}$ | $R^{D68}$ | $R^{D68}$ | $R^{D1}$ |
| $L_{B672}$ | $R^{D76}$ | $R^{D76}$ | $R^{D1}$ |
| $L_{B673}$ | $R^{D1}$ | $R^{D2}$ | $R^{D1}$ |
| $L_{B674}$ | $R^{D1}$ | $R^{D3}$ | $R^{D1}$ |
| $L_{B675}$ | $R^{D1}$ | $R^{D4}$ | $R^{D1}$ |
| $L_{B676}$ | $R^{D1}$ | $R^{D5}$ | $R^{D1}$ |
| $L_{B677}$ | $R^{D1}$ | $R^{D6}$ | $R^{D1}$ |
| $L_{B678}$ | $R^{D1}$ | $R^{D7}$ | $R^{D1}$ |
| $L_{B679}$ | $R^{D1}$ | $R^{D8}$ | $R^{D1}$ |
| $L_{B680}$ | $R^{D1}$ | $R^{D9}$ | $R^{D1}$ |
| $L_{B681}$ | $R^{D1}$ | $R^{D10}$ | $R^{D1}$ |
| $L_{B682}$ | $R^{D1}$ | $R^{D11}$ | $R^{D1}$ |
| $L_{B683}$ | $R^{D1}$ | $R^{D12}$ | $R^{D1}$ |
| $L_{B684}$ | $R^{D1}$ | $R^{D13}$ | $R^{D1}$ |
| $L_{B685}$ | $R^{D1}$ | $R^{D14}$ | $R^{D1}$ |
| $L_{B686}$ | $R^{D1}$ | $R^{D15}$ | $R^{D1}$ |
| $L_{B687}$ | $R^{D1}$ | $R^{D16}$ | $R^{D1}$ |
| $L_{B688}$ | $R^{D1}$ | $R^{D17}$ | $R^{D1}$ |
| $L_{B689}$ | $R^{D1}$ | $R^{D18}$ | $R^{D1}$ |
| $L_{B690}$ | $R^{D1}$ | $R^{D19}$ | $R^{D1}$ |
| $L_{B691}$ | $R^{D1}$ | $R^{D20}$ | $R^{D1}$ |
| $L_{B692}$ | $R^{D1}$ | $R^{D21}$ | $R^{D1}$ |
| $L_{B693}$ | $R^{D1}$ | $R^{D22}$ | $R^{D1}$ |
| $L_{B694}$ | $R^{D1}$ | $R^{D23}$ | $R^{D1}$ |
| $L_{B695}$ | $R^{D1}$ | $R^{D24}$ | $R^{D1}$ |
| $L_{B696}$ | $R^{D1}$ | $R^{D25}$ | $R^{D1}$ |
| $L_{B697}$ | $R^{D1}$ | $R^{D26}$ | $R^{D1}$ |
| $L_{B698}$ | $R^{D1}$ | $R^{D27}$ | $R^{D1}$ |
| $L_{B699}$ | $R^{D1}$ | $R^{D28}$ | $R^{D1}$ |
| $L_{B700}$ | $R^{D1}$ | $R^{D29}$ | $R^{D1}$ |
| $L_{B701}$ | $R^{D1}$ | $R^{D30}$ | $R^{D1}$ |
| $L_{B702}$ | $R^{D1}$ | $R^{D31}$ | $R^{D1}$ |
| $L_{B703}$ | $R^{D1}$ | $R^{D32}$ | $R^{D1}$ |
| $L_{B704}$ | $R^{D1}$ | $R^{D33}$ | $R^{D1}$ |
| $L_{B705}$ | $R^{D1}$ | $R^{D34}$ | $R^{D1}$ |
| $L_{B706}$ | $R^{D1}$ | $R^{D35}$ | $R^{D1}$ |
| $L_{B707}$ | $R^{D1}$ | $R^{D40}$ | $R^{D1}$ |
| $L_{B708}$ | $R^{D1}$ | $R^{D41}$ | $R^{D1}$ |
| $L_{B709}$ | $R^{D1}$ | $R^{D42}$ | $R^{D1}$ |
| $L_{6710}$ | $R^{D1}$ | $R^{D64}$ | $R^{D1}$ |
| $L_{B711}$ | $R^{D1}$ | $R^{D66}$ | $R^{D1}$ |
| $L_{B712}$ | $R^{D1}$ | $R^{D68}$ | $R^{D1}$ |
| $L_{B713}$ | $R^{D1}$ | $R^{D76}$ | $R^{D1}$ |
| $L_{B714}$ | $R^{D2}$ | $R^{D1}$ | $R^{D1}$ |
| $L_{B715}$ | $R^{D2}$ | $R^{D3}$ | $R^{D1}$ |
| $L_{B716}$ | $R^{D2}$ | $R^{D4}$ | $R^{D1}$ |
| $L_{B717}$ | $R^{D2}$ | $R^{D5}$ | $R^{D1}$ |
| $L_{B718}$ | $R^{D2}$ | $R^{D6}$ | $R^{D1}$ |
| $L_{B719}$ | $R^{D2}$ | $R^{D7}$ | $R^{D1}$ |
| $L_{B720}$ | $R^{D2}$ | $R^{D8}$ | $R^{D1}$ |
| $L_{B721}$ | $R^{D2}$ | $R^{D9}$ | $R^{D1}$ |
| $L_{B722}$ | $R^{D2}$ | $R^{D10}$ | $R^{D1}$ |
| $L_{B723}$ | $R^{D2}$ | $R^{D11}$ | $R^{D1}$ |
| $L_{B724}$ | $R^{D2}$ | $R^{D12}$ | $R^{D1}$ |
| $L_{B725}$ | $R^{D2}$ | $R^{D13}$ | $R^{D1}$ |
| $L_{B726}$ | $R^{D2}$ | $R^{D14}$ | $R^{D1}$ |
| $L_{B727}$ | $R^{D2}$ | $R^{D15}$ | $R^{D1}$ |
| $L_{B728}$ | $R^{D2}$ | $R^{D16}$ | $R^{D1}$ |
| $L_{B729}$ | $R^{D2}$ | $R^{D17}$ | $R^{D1}$ |
| $L_{B730}$ | $R^{D2}$ | $R^{D18}$ | $R^{D1}$ |
| $L_{B731}$ | $R^{D2}$ | $R^{D19}$ | $R^{D1}$ |
| $L_{B732}$ | $R^{D2}$ | $R^{D20}$ | $R^{D1}$ |
| $L_{B733}$ | $R^{D2}$ | $R^{D21}$ | $R^{D1}$ |
| $L_{B734}$ | $R^{D2}$ | $R^{D22}$ | $R^{D1}$ |
| $L_{B735}$ | $R^{D2}$ | $R^{D23}$ | $R^{D1}$ |
| $L_{B736}$ | $R^{D2}$ | $R^{D24}$ | $R^{D1}$ |
| $L_{B737}$ | $R^{D2}$ | $R^{D25}$ | $R^{D1}$ |
| $L_{B738}$ | $R^{D2}$ | $R^{D26}$ | $R^{D1}$ |
| $L_{B739}$ | $R^{D2}$ | $R^{D27}$ | $R^{D1}$ |

-continued

| Ligand | $R^1$ | $R^2$ | $R^3$ |
|---|---|---|---|
| $L_{B740}$ | $R^{D2}$ | $R^{D28}$ | $R^{D1}$ |
| $L_{B741}$ | $R^{D2}$ | $R^{D29}$ | $R^{D1}$ |
| $L_{B742}$ | $R^{D2}$ | $R^{D30}$ | $R^{D1}$ |
| $L_{B743}$ | $R^{D2}$ | $R^{D31}$ | $R^{D1}$ |
| $L_{B744}$ | $R^{D2}$ | $R^{D32}$ | $R^{D1}$ |
| $L_{B745}$ | $R^{D2}$ | $R^{D33}$ | $R^{D1}$ |
| $L_{B746}$ | $R^{D2}$ | $R^{D34}$ | $R^{D1}$ |
| $L_{B747}$ | $R^{D2}$ | $R^{D35}$ | $R^{D1}$ |
| $L_{B748}$ | $R^{D2}$ | $R^{D40}$ | $R^{D1}$ |
| $L_{B749}$ | $R^{D2}$ | $R^{D41}$ | $R^{D1}$ |
| $L_{B750}$ | $R^{D2}$ | $R^{D42}$ | $R^{D1}$ |
| $L_{B751}$ | $R^{D2}$ | $R^{D64}$ | $R^{D1}$ |
| $L_{B752}$ | $R^{D2}$ | $R^{D66}$ | $R^{D1}$ |
| $L_{B753}$ | $R^{D2}$ | $R^{D68}$ | $R^{D1}$ |
| $L_{B754}$ | $R^{D2}$ | $R^{D76}$ | $R^{D1}$ |
| $L_{B755}$ | $R^{D3}$ | $R^{D4}$ | $R^{D1}$ |
| $L_{B756}$ | $R^{D3}$ | $R^{D5}$ | $R^{D1}$ |
| $L_{B757}$ | $R^{D3}$ | $R^{D6}$ | $R^{D1}$ |
| $L_{B758}$ | $R^{D3}$ | $R^{D7}$ | $R^{D1}$ |
| $L_{B759}$ | $R^{D3}$ | $R^{D8}$ | $R^{D1}$ |
| $L_{B760}$ | $R^{D3}$ | $R^{D9}$ | $R^{D1}$ |
| $L_{B761}$ | $R^{D3}$ | $R^{D10}$ | $R^{D1}$ |
| $L_{B762}$ | $R^{D3}$ | $R^{D11}$ | $R^{D1}$ |
| $L_{B763}$ | $R^{D3}$ | $R^{D12}$ | $R^{D1}$ |
| $L_{B764}$ | $R^{D3}$ | $R^{D13}$ | $R^{D1}$ |
| $L_{B765}$ | $R^{D3}$ | $R^{D14}$ | $R^{D1}$ |
| $L_{B766}$ | $R^{D3}$ | $R^{D15}$ | $R^{D1}$ |
| $L_{B767}$ | $R^{D3}$ | $R^{D16}$ | $R^{D1}$ |
| $L_{B768}$ | $R^{D3}$ | $R^{D17}$ | $R^{D1}$ |
| $L_{B769}$ | $R^{D3}$ | $R^{D18}$ | $R^{D1}$ |
| $L_{B770}$ | $R^{D3}$ | $R^{D19}$ | $R^{D1}$ |
| $L_{B771}$ | $R^{D3}$ | $R^{D20}$ | $R^{D1}$ |
| $L_{B772}$ | $R^{D3}$ | $R^{D21}$ | $R^{D1}$ |
| $L_{B773}$ | $R^{D3}$ | $R^{D22}$ | $R^{D1}$ |
| $L_{B774}$ | $R^{D3}$ | $R^{D23}$ | $R^{D1}$ |
| $L_{B775}$ | $R^{D3}$ | $R^{D24}$ | $R^{D1}$ |
| $L_{B776}$ | $R^{D3}$ | $R^{D25}$ | $R^{D1}$ |
| $L_{B777}$ | $R^{D3}$ | $R^{D26}$ | $R^{D1}$ |
| $L_{B778}$ | $R^{D3}$ | $R^{D27}$ | $R^{D1}$ |
| $L_{B779}$ | $R^{D3}$ | $R^{D28}$ | $R^{D1}$ |
| $L_{B780}$ | $R^{D3}$ | $R^{D29}$ | $R^{D1}$ |
| $L_{B781}$ | $R^{D3}$ | $R^{D30}$ | $R^{D1}$ |
| $L_{B782}$ | $R^{D3}$ | $R^{D31}$ | $R^{D1}$ |
| $L_{B783}$ | $R^{D3}$ | $R^{D32}$ | $R^{D1}$ |
| $L_{B784}$ | $R^{D3}$ | $R^{D33}$ | $R^{D1}$ |
| $L_{B785}$ | $R^{D3}$ | $R^{D34}$ | $R^{D1}$ |
| $L_{B786}$ | $R^{D3}$ | $R^{D35}$ | $R^{D1}$ |
| $L_{B787}$ | $R^{D3}$ | $R^{D40}$ | $R^{D1}$ |
| $L_{B788}$ | $R^{D3}$ | $R^{D41}$ | $R^{D1}$ |
| $L_{B789}$ | $R^{D3}$ | $R^{D42}$ | $R^{D1}$ |
| $L_{B790}$ | $R^{D3}$ | $R^{D64}$ | $R^{D1}$ |
| $L_{B791}$ | $R^{D3}$ | $R^{D66}$ | $R^{D1}$ |
| $L_{B792}$ | $R^{D3}$ | $R^{D68}$ | $R^{D1}$ |
| $L_{B793}$ | $R^{D3}$ | $R^{D76}$ | $R^{D1}$ |
| $L_{B794}$ | $R^{D4}$ | $R^{D5}$ | $R^{D1}$ |
| $L_{B795}$ | $R^{D4}$ | $R^{D6}$ | $R^{D1}$ |
| $L_{B796}$ | $R^{D4}$ | $R^{D7}$ | $R^{D1}$ |
| $L_{B797}$ | $R^{D4}$ | $R^{D8}$ | $R^{D1}$ |
| $L_{B798}$ | $R^{D4}$ | $R^{D9}$ | $R^{D1}$ |
| $L_{B799}$ | $R^{D4}$ | $R^{D10}$ | $R^{D1}$ |
| $L_{B800}$ | $R^{D4}$ | $R^{D11}$ | $R^{D1}$ |
| $L_{B801}$ | $R^{D4}$ | $R^{D12}$ | $R^{D1}$ |
| $L_{B802}$ | $R^{D4}$ | $R^{D13}$ | $R^{D1}$ |
| $L_{B803}$ | $R^{D4}$ | $R^{D14}$ | $R^{D1}$ |
| $L_{B804}$ | $R^{D4}$ | $R^{D15}$ | $R^{D1}$ |
| $L_{B805}$ | $R^{D4}$ | $R^{D16}$ | $R^{D1}$ |
| $L_{B806}$ | $R^{D4}$ | $R^{D17}$ | $R^{D1}$ |
| $L_{B807}$ | $R^{D4}$ | $R^{D18}$ | $R^{D1}$ |
| $L_{B808}$ | $R^{D4}$ | $R^{D19}$ | $R^{D1}$ |
| $L_{B809}$ | $R^{D4}$ | $R^{D20}$ | $R^{D1}$ |
| $L_{B810}$ | $R^{D4}$ | $R^{D21}$ | $R^{D1}$ |
| $L_{B811}$ | $R^{D4}$ | $R^{D22}$ | $R^{D1}$ |
| $L_{B812}$ | $R^{D4}$ | $R^{D23}$ | $R^{D1}$ |
| $L_{B813}$ | $R^{D4}$ | $R^{D24}$ | $R^{D1}$ |
| $L_{B814}$ | $R^{D4}$ | $R^{D25}$ | $R^{D1}$ |
| $L_{B815}$ | $R^{D4}$ | $R^{D26}$ | $R^{D1}$ |
| $L_{B816}$ | $R^{D4}$ | $R^{D27}$ | $R^{D1}$ |

-continued

| Ligand | $R^1$ | $R^2$ | $R^3$ |
|---|---|---|---|
| $L_{B817}$ | $R^{D4}$ | $R^{D28}$ | $R^{D1}$ |
| $L_{B818}$ | $R^{D4}$ | $R^{D29}$ | $R^{D1}$ |
| $L_{B819}$ | $R^{D4}$ | $R^{D30}$ | $R^{D1}$ |
| $L_{B820}$ | $R^{D4}$ | $R^{D31}$ | $R^{D1}$ |
| $L_{B821}$ | $R^{D4}$ | $R^{D32}$ | $R^{D1}$ |
| $L_{B822}$ | $R^{D4}$ | $R^{D33}$ | $R^{D1}$ |
| $L_{B823}$ | $R^{D4}$ | $R^{D34}$ | $R^{D1}$ |
| $L_{B824}$ | $R^{D4}$ | $R^{D35}$ | $R^{D1}$ |
| $L_{B825}$ | $R^{D4}$ | $R^{D40}$ | $R^{D1}$ |
| $L_{B826}$ | $R^{D4}$ | $R^{D41}$ | $R^{D1}$ |
| $L_{B827}$ | $R^{D4}$ | $R^{D42}$ | $R^{D1}$ |
| $L_{B828}$ | $R^{D4}$ | $R^{D64}$ | $R^{D1}$ |
| $L_{B829}$ | $R^{D4}$ | $R^{D66}$ | $R^{D1}$ |
| $L_{B830}$ | $R^{D4}$ | $R^{D68}$ | $R^{D1}$ |
| $L_{B831}$ | $R^{D4}$ | $R^{D76}$ | $R^{D1}$ |
| $L_{B832}$ | $R^{D4}$ | $R^{D1}$ | $R^{D1}$ |
| $L_{B833}$ | $R^{D7}$ | $R^{D5}$ | $R^{D1}$ |
| $L_{B834}$ | $R^{D7}$ | $R^{D6}$ | $R^{D1}$ |
| $L_{B835}$ | $R^{D7}$ | $R^{D8}$ | $R^{D1}$ |
| $L_{B836}$ | $R^{D7}$ | $R^{D9}$ | $R^{D1}$ |
| $L_{B837}$ | $R^{D7}$ | $R^{D10}$ | $R^{D1}$ |
| $L_{B838}$ | $R^{D7}$ | $R^{D11}$ | $R^{D1}$ |
| $L_{B839}$ | $R^{D7}$ | $R^{D12}$ | $R^{D1}$ |
| $L_{B840}$ | $R^{D7}$ | $R^{D13}$ | $R^{D1}$ |
| $L_{B841}$ | $R^{D7}$ | $R^{D14}$ | $R^{D1}$ |
| $L_{B842}$ | $R^{D7}$ | $R^{D15}$ | $R^{D1}$ |
| $L_{B843}$ | $R^{D7}$ | $R^{D16}$ | $R^{D1}$ |
| $L_{B844}$ | $R^{D7}$ | $R^{D17}$ | $R^{D1}$ |
| $L_{B845}$ | $R^{D7}$ | $R^{D18}$ | $R^{D1}$ |
| $L_{B846}$ | $R^{D7}$ | $R^{D19}$ | $R^{D1}$ |
| $L_{B847}$ | $R^{D7}$ | $R^{D20}$ | $R^{D1}$ |
| $L_{B848}$ | $R^{D7}$ | $R^{D21}$ | $R^{D1}$ |
| $L_{B849}$ | $R^{D7}$ | $R^{D22}$ | $R^{D1}$ |
| $L_{B850}$ | $R^{D7}$ | $R^{D23}$ | $R^{D1}$ |
| $L_{B851}$ | $R^{D7}$ | $R^{D24}$ | $R^{D1}$ |
| $L_{B852}$ | $R^{D7}$ | $R^{D25}$ | $R^{D1}$ |
| $L_{B853}$ | $R^{D7}$ | $R^{D26}$ | $R^{D1}$ |
| $L_{B854}$ | $R^{D7}$ | $R^{D27}$ | $R^{D1}$ |
| $L_{B855}$ | $R^{D7}$ | $R^{D28}$ | $R^{D1}$ |
| $L_{B856}$ | $R^{D7}$ | $R^{D29}$ | $R^{D1}$ |
| $L_{B857}$ | $R^{D7}$ | $R^{D30}$ | $R^{D1}$ |
| $L_{B858}$ | $R^{D7}$ | $R^{D31}$ | $R^{D1}$ |
| $L_{B859}$ | $R^{D7}$ | $R^{D32}$ | $R^{D1}$ |
| $L_{B860}$ | $R^{D7}$ | $R^{D33}$ | $R^{D1}$ |
| $L_{B861}$ | $R^{D7}$ | $R^{D34}$ | $R^{D1}$ |
| $L_{B862}$ | $R^{D7}$ | $R^{D35}$ | $R^{D1}$ |
| $L_{B863}$ | $R^{D7}$ | $R^{D40}$ | $R^{D1}$ |
| $L_{B864}$ | $R^{D7}$ | $R^{D41}$ | $R^{D1}$ |
| $L_{B865}$ | $R^{D7}$ | $R^{D42}$ | $R^{D1}$ |
| $L_{B866}$ | $R^{D7}$ | $R^{D64}$ | $R^{D1}$ |
| $L_{B867}$ | $R^{D7}$ | $R^{D66}$ | $R^{D1}$ |
| $L_{B868}$ | $R^{D7}$ | $R^{D68}$ | $R^{D1}$ |
| $L_{B869}$ | $R^{D7}$ | $R^{D76}$ | $R^{D1}$ |
| $L_{B870}$ | $R^{D8}$ | $R^{D5}$ | $R^{D1}$ |
| $L_{B871}$ | $R^{D8}$ | $R^{D6}$ | $R^{D1}$ |
| $L_{B872}$ | $R^{D8}$ | $R^{D9}$ | $R^{D1}$ |
| $L_{B873}$ | $R^{D8}$ | $R^{D10}$ | $R^{D1}$ |
| $L_{B874}$ | $R^{D8}$ | $R^{D11}$ | $R^{D1}$ |
| $L_{B875}$ | $R^{D8}$ | $R^{D12}$ | $R^{D1}$ |
| $L_{B876}$ | $R^{D8}$ | $R^{D13}$ | $R^{D1}$ |
| $L_{B877}$ | $R^{D8}$ | $R^{D14}$ | $R^{D1}$ |
| $L_{B878}$ | $R^{D8}$ | $R^{D15}$ | $R^{D1}$ |
| $L_{B879}$ | $R^{D8}$ | $R^{D16}$ | $R^{D1}$ |
| $L_{B880}$ | $R^{D8}$ | $R^{D17}$ | $R^{D1}$ |
| $L_{B881}$ | $R^{D8}$ | $R^{D18}$ | $R^{D1}$ |
| $L_{B882}$ | $R^{D8}$ | $R^{D19}$ | $R^{D1}$ |
| $L_{B883}$ | $R^{D8}$ | $R^{D20}$ | $R^{D1}$ |
| $L_{B884}$ | $R^{D8}$ | $R^{D21}$ | $R^{D1}$ |
| $L_{B885}$ | $R^{D8}$ | $R^{D22}$ | $R^{D1}$ |
| $L_{B886}$ | $R^{D8}$ | $R^{D23}$ | $R^{D1}$ |
| $L_{B887}$ | $R^{D8}$ | $R^{D24}$ | $R^{D1}$ |
| $L_{B888}$ | $R^{D8}$ | $R^{D25}$ | $R^{D1}$ |
| $L_{B889}$ | $R^{D8}$ | $R^{D26}$ | $R^{D1}$ |
| $L_{B890}$ | $R^{D8}$ | $R^{D27}$ | $R^{D1}$ |
| $L_{B891}$ | $R^{D8}$ | $R^{D28}$ | $R^{D1}$ |
| $L_{B892}$ | $R^{D8}$ | $R^{D29}$ | $R^{D1}$ |
| $L_{B893}$ | $R^{D8}$ | $R^{D30}$ | $R^{D1}$ |
| $L_{B894}$ | $R^{D8}$ | $R^{D31}$ | $R^{D1}$ |
| $L_{B895}$ | $R^{D8}$ | $R^{D32}$ | $R^{D1}$ |
| $L_{B896}$ | $R^{D8}$ | $R^{D33}$ | $R^{D1}$ |
| $L_{B897}$ | $R^{D8}$ | $R^{D34}$ | $R^{D1}$ |
| $L_{B898}$ | $R^{D8}$ | $R^{D35}$ | $R^{D1}$ |
| $L_{B899}$ | $R^{D8}$ | $R^{D40}$ | $R^{D1}$ |
| $L_{B900}$ | $R^{D8}$ | $R^{D41}$ | $R^{D1}$ |
| $L_{B901}$ | $R^{D8}$ | $R^{D42}$ | $R^{D1}$ |
| $L_{B902}$ | $R^{D8}$ | $R^{D64}$ | $R^{D1}$ |
| $L_{B903}$ | $R^{D8}$ | $R^{D66}$ | $R^{D1}$ |
| $L_{B904}$ | $R^{D8}$ | $R^{D68}$ | $R^{D1}$ |
| $L_{B905}$ | $R^{D8}$ | $R^{D76}$ | $R^{D1}$ |
| $L_{B906}$ | $R^{D11}$ | $R^{D5}$ | $R^{D1}$ |
| $L_{B907}$ | $R^{D11}$ | $R^{D6}$ | $R^{D1}$ |
| $L_{B908}$ | $R^{D11}$ | $R^{D9}$ | $R^{D1}$ |
| $L_{B909}$ | $R^{D11}$ | $R^{D10}$ | $R^{D1}$ |
| $L_{B910}$ | $R^{D11}$ | $R^{D12}$ | $R^{D1}$ |
| $L_{B911}$ | $R^{D11}$ | $R^{D13}$ | $R^{D1}$ |
| $L_{B912}$ | $R^{D11}$ | $R^{D14}$ | $R^{D1}$ |
| $L_{B913}$ | $R^{D11}$ | $R^{D15}$ | $R^{D1}$ |
| $L_{B914}$ | $R^{D11}$ | $R^{D16}$ | $R^{D1}$ |
| $L_{B915}$ | $R^{D11}$ | $R^{D17}$ | $R^{D1}$ |
| $L_{B916}$ | $R^{D11}$ | $R^{D18}$ | $R^{D1}$ |
| $L_{B917}$ | $R^{D11}$ | $R^{D19}$ | $R^{D1}$ |
| $L_{B918}$ | $R^{D11}$ | $R^{D20}$ | $R^{D1}$ |
| $L_{B919}$ | $R^{D11}$ | $R^{D21}$ | $R^{D1}$ |
| $L_{B920}$ | $R^{D11}$ | $R^{D22}$ | $R^{D1}$ |
| $L_{B921}$ | $R^{D11}$ | $R^{D23}$ | $R^{D1}$ |
| $L_{B922}$ | $R^{D11}$ | $R^{D24}$ | $R^{D1}$ |
| $L_{B923}$ | $R^{D11}$ | $R^{D25}$ | $R^{D1}$ |
| $L_{B924}$ | $R^{D11}$ | $R^{D26}$ | $R^{D1}$ |
| $L_{B925}$ | $R^{D11}$ | $R^{D27}$ | $R^{D1}$ |
| $L_{B926}$ | $R^{D11}$ | $R^{D28}$ | $R^{D1}$ |
| $L_{B927}$ | $R^{D11}$ | $R^{D29}$ | $R^{D1}$ |
| $L_{B928}$ | $R^{D11}$ | $R^{D30}$ | $R^{D1}$ |
| $L_{B929}$ | $R^{D11}$ | $R^{D31}$ | $R^{D1}$ |
| $L_{B930}$ | $R^{D11}$ | $R^{D32}$ | $R^{D1}$ |
| $L_{B931}$ | $R^{D11}$ | $R^{D33}$ | $R^{D1}$ |
| $L_{B932}$ | $R^{D11}$ | $R^{D34}$ | $R^{D1}$ |
| $L_{B933}$ | $R^{D11}$ | $R^{D35}$ | $R^{D1}$ |
| $L_{B934}$ | $R^{D11}$ | $R^{D40}$ | $R^{D1}$ |
| $L_{B935}$ | $R^{D11}$ | $R^{D41}$ | $R^{D1}$ |
| $L_{B936}$ | $R^{D11}$ | $R^{D42}$ | $R^{D1}$ |
| $L_{B937}$ | $R^{D11}$ | $R^{D64}$ | $R^{D1}$ |
| $L_{B938}$ | $R^{D11}$ | $R^{D66}$ | $R^{D1}$ |
| $L_{B939}$ | $R^{D11}$ | $R^{D68}$ | $R^{D1}$ |
| $L_{B940}$ | $R^{D11}$ | $R^{D76}$ | $R^{D1}$ |
| $L_{B941}$ | $R^{D13}$ | $R^{D5}$ | $R^{D1}$ |
| $L_{B942}$ | $R^{D13}$ | $R^{D6}$ | $R^{D1}$ |
| $L_{B943}$ | $R^{D13}$ | $R^{D9}$ | $R^{D1}$ |
| $L_{B944}$ | $R^{D13}$ | $R^{D10}$ | $R^{D1}$ |
| $L_{B945}$ | $R^{D13}$ | $R^{D12}$ | $R^{D1}$ |
| $L_{B946}$ | $R^{D13}$ | $R^{D14}$ | $R^{D1}$ |
| $L_{B947}$ | $R^{D13}$ | $R^{D15}$ | $R^{D1}$ |
| $L_{B948}$ | $R^{D13}$ | $R^{D16}$ | $R^{D1}$ |
| $L_{B949}$ | $R^{D13}$ | $R^{D17}$ | $R^{D1}$ |
| $L_{B950}$ | $R^{D13}$ | $R^{D18}$ | $R^{D1}$ |
| $L_{B951}$ | $R^{D13}$ | $R^{D19}$ | $R^{D1}$ |
| $L_{B952}$ | $R^{D13}$ | $R^{D20}$ | $R^{D1}$ |
| $L_{B953}$ | $R^{D13}$ | $R^{D21}$ | $R^{D1}$ |
| $L_{B954}$ | $R^{D13}$ | $R^{D22}$ | $R^{D1}$ |
| $L_{B955}$ | $R^{D13}$ | $R^{D23}$ | $R^{D1}$ |
| $L_{B956}$ | $R^{D13}$ | $R^{D24}$ | $R^{D1}$ |
| $L_{B957}$ | $R^{D13}$ | $R^{D25}$ | $R^{D1}$ |
| $L_{B958}$ | $R^{D13}$ | $R^{D26}$ | $R^{D1}$ |
| $L_{B959}$ | $R^{D13}$ | $R^{D27}$ | $R^{D1}$ |
| $L_{B960}$ | $R^{D13}$ | $R^{D28}$ | $R^{D1}$ |
| $L_{B961}$ | $R^{D13}$ | $R^{D29}$ | $R^{D1}$ |
| $L_{B962}$ | $R^{D13}$ | $R^{D30}$ | $R^{D1}$ |
| $L_{B963}$ | $R^{D13}$ | $R^{D31}$ | $R^{D1}$ |
| $L_{B964}$ | $R^{D13}$ | $R^{D32}$ | $R^{D1}$ |
| $L_{B965}$ | $R^{D13}$ | $R^{D33}$ | $R^{D1}$ |
| $L_{B966}$ | $R^{D13}$ | $R^{D34}$ | $R^{D1}$ |
| $L_{B967}$ | $R^{D13}$ | $R^{D35}$ | $R^{D1}$ |
| $L_{B968}$ | $R^{D13}$ | $R^{D40}$ | $R^{D1}$ |
| $L_{B969}$ | $R^{D13}$ | $R^{D41}$ | $R^{D1}$ |
| $L_{B970}$ | $R^{D13}$ | $R^{D42}$ | $R^{D1}$ |

-continued

| Ligand | $R^1$ | $R^2$ | $R^3$ |
|---|---|---|---|
| $L_{B971}$ | $R^{D13}$ | $R^{D64}$ | $R^{D1}$ |
| $L_{B972}$ | $R^{D13}$ | $R^{D66}$ | $R^{D1}$ |
| $L_{B973}$ | $R^{D13}$ | $R^{D68}$ | $R^{D1}$ |
| $L_{B974}$ | $R^{D13}$ | $R^{D76}$ | $R^{D1}$ |
| $L_{B975}$ | $R^{D14}$ | $R^{D5}$ | $R^{D1}$ |
| $L_{B976}$ | $R^{D14}$ | $R^{D6}$ | $R^{D1}$ |
| $L_{B977}$ | $R^{D14}$ | $R^{D9}$ | $R^{D1}$ |
| $L_{B978}$ | $R^{D14}$ | $R^{D10}$ | $R^{D1}$ |
| $L_{B979}$ | $R^{D14}$ | $R^{D12}$ | $R^{D1}$ |
| $L_{B980}$ | $R^{D14}$ | $R^{D15}$ | $R^{D1}$ |
| $L_{B981}$ | $R^{D14}$ | $R^{D16}$ | $R^{D1}$ |
| $L_{B982}$ | $R^{D14}$ | $R^{D17}$ | $R^{D1}$ |
| $L_{B983}$ | $R^{D14}$ | $R^{D18}$ | $R^{D1}$ |
| $L_{B984}$ | $R^{D14}$ | $R^{D19}$ | $R^{D1}$ |
| $L_{B985}$ | $R^{D14}$ | $R^{D20}$ | $R^{D1}$ |
| $L_{B986}$ | $R^{D14}$ | $R^{D21}$ | $R^{D1}$ |
| $L_{B987}$ | $R^{D14}$ | $R^{D22}$ | $R^{D1}$ |
| $L_{B988}$ | $R^{D14}$ | $R^{D23}$ | $R^{D1}$ |
| $L_{B989}$ | $R^{D14}$ | $R^{D24}$ | $R^{D1}$ |
| $L_{B990}$ | $R^{D14}$ | $R^{D25}$ | $R^{D1}$ |
| $L_{B991}$ | $R^{D14}$ | $R^{D26}$ | $R^{D1}$ |
| $L_{B992}$ | $R^{D14}$ | $R^{D27}$ | $R^{D1}$ |
| $L_{B993}$ | $R^{D14}$ | $R^{D28}$ | $R^{D1}$ |
| $L_{B994}$ | $R^{D14}$ | $R^{D29}$ | $R^{D1}$ |
| $L_{B995}$ | $R^{D14}$ | $R^{D30}$ | $R^{D1}$ |
| $L_{B996}$ | $R^{D14}$ | $R^{D31}$ | $R^{D1}$ |
| $L_{B997}$ | $R^{D14}$ | $R^{D32}$ | $R^{D1}$ |
| $L_{B998}$ | $R^{D14}$ | $R^{D33}$ | $R^{D1}$ |
| $L_{B999}$ | $R^{D14}$ | $R^{D34}$ | $R^{D1}$ |
| $L_{B1000}$ | $R^{D14}$ | $R^{D35}$ | $R^{D1}$ |
| $L_{B1001}$ | $R^{D14}$ | $R^{D40}$ | $R^{D1}$ |
| $L_{B1002}$ | $R^{D14}$ | $R^{D41}$ | $R^{D1}$ |
| $L_{B1003}$ | $R^{D14}$ | $R^{D42}$ | $R^{D1}$ |
| $L_{B1004}$ | $R^{D14}$ | $R^{D64}$ | $R^{D1}$ |
| $L_{B1005}$ | $R^{D14}$ | $R^{D66}$ | $R^{D1}$ |
| $L_{B1006}$ | $R^{D14}$ | $R^{D68}$ | $R^{D1}$ |
| $L_{B1007}$ | $R^{D14}$ | $R^{D76}$ | $R^{D1}$ |
| $L_{B1008}$ | $R^{D22}$ | $R^{D5}$ | $R^{D1}$ |
| $L_{B1009}$ | $R^{D22}$ | $R^{D6}$ | $R^{D1}$ |
| $L_{B1010}$ | $R^{D22}$ | $R^{D9}$ | $R^{D1}$ |
| $L_{B1011}$ | $R^{D22}$ | $R^{D10}$ | $R^{D1}$ |
| $L_{B1012}$ | $R^{D22}$ | $R^{D12}$ | $R^{D1}$ |
| $L_{B1013}$ | $R^{D22}$ | $R^{D15}$ | $R^{D1}$ |
| $L_{B1014}$ | $R^{D22}$ | $R^{D16}$ | $R^{D1}$ |
| $L_{B1015}$ | $R^{D22}$ | $R^{D17}$ | $R^{D1}$ |
| $L_{B1016}$ | $R^{D22}$ | $R^{D18}$ | $R^{D1}$ |
| $L_{B1017}$ | $R^{D22}$ | $R^{D19}$ | $R^{D1}$ |
| $L_{B1018}$ | $R^{D22}$ | $R^{D20}$ | $R^{D1}$ |
| $L_{B1019}$ | $R^{D22}$ | $R^{D21}$ | $R^{D1}$ |
| $L_{B1020}$ | $R^{D22}$ | $R^{D23}$ | $R^{D1}$ |
| $L_{B1021}$ | $R^{D22}$ | $R^{D24}$ | $R^{D1}$ |
| $L_{B1022}$ | $R^{D22}$ | $R^{D25}$ | $R^{D1}$ |
| $L_{B1023}$ | $R^{D22}$ | $R^{D26}$ | $R^{D1}$ |
| $L_{B1024}$ | $R^{D22}$ | $R^{D27}$ | $R^{D1}$ |
| $L_{B1025}$ | $R^{D22}$ | $R^{D28}$ | $R^{D1}$ |
| $L_{B1026}$ | $R^{D22}$ | $R^{D29}$ | $R^{D1}$ |
| $L_{B1027}$ | $R^{D22}$ | $R^{D30}$ | $R^{D1}$ |
| $L_{B1028}$ | $R^{D22}$ | $R^{D31}$ | $R^{D1}$ |
| $L_{B1029}$ | $R^{D22}$ | $R^{D32}$ | $R^{D1}$ |
| $L_{B1030}$ | $R^{D22}$ | $R^{D33}$ | $R^{D1}$ |
| $L_{B1031}$ | $R^{D22}$ | $R^{D34}$ | $R^{D1}$ |
| $L_{B1032}$ | $R^{D22}$ | $R^{D35}$ | $R^{D1}$ |
| $L_{B1033}$ | $R^{D22}$ | $R^{D40}$ | $R^{D1}$ |
| $L_{B1034}$ | $R^{D22}$ | $R^{D41}$ | $R^{D1}$ |
| $L_{B1035}$ | $R^{D22}$ | $R^{D42}$ | $R^{D1}$ |
| $L_{B1036}$ | $R^{D22}$ | $R^{D64}$ | $R^{D1}$ |
| $L_{B1037}$ | $R^{D22}$ | $R^{D66}$ | $R^{D1}$ |
| $L_{B1038}$ | $R^{D22}$ | $R^{D68}$ | $R^{D1}$ |
| $L_{B1039}$ | $R^{D22}$ | $R^{D76}$ | $R^{D1}$ |
| $L_{B1040}$ | $R^{D26}$ | $R^{D5}$ | $R^{D1}$ |
| $L_{B1041}$ | $R^{D26}$ | $R^{D6}$ | $R^{D1}$ |
| $L_{B1042}$ | $R^{D26}$ | $R^{D9}$ | $R^{D1}$ |
| $L_{B1043}$ | $R^{D26}$ | $R^{D10}$ | $R^{D1}$ |
| $L_{B1044}$ | $R^{D26}$ | $R^{D12}$ | $R^{D1}$ |
| $L_{B1045}$ | $R^{D26}$ | $R^{D15}$ | $R^{D1}$ |
| $L_{B1046}$ | $R^{D26}$ | $R^{D16}$ | $R^{D1}$ |
| $L_{B1047}$ | $R^{D26}$ | $R^{D17}$ | $R^{D1}$ |

-continued

| Ligand | $R^1$ | $R^2$ | $R^3$ |
|---|---|---|---|
| $L_{B1048}$ | $R^{D26}$ | $R^{D18}$ | $R^{D1}$ |
| $L_{B1049}$ | $R^{D26}$ | $R^{D19}$ | $R^{D1}$ |
| $L_{B1050}$ | $R^{D26}$ | $R^{D20}$ | $R^{D1}$ |
| $L_{B1051}$ | $R^{D26}$ | $R^{D21}$ | $R^{D1}$ |
| $L_{B1052}$ | $R^{D26}$ | $R^{D23}$ | $R^{D1}$ |
| $L_{B1053}$ | $R^{D26}$ | $R^{D24}$ | $R^{D1}$ |
| $L_{B1054}$ | $R^{D26}$ | $R^{D25}$ | $R^{D1}$ |
| $L_{B1055}$ | $R^{D26}$ | $R^{D27}$ | $R^{D1}$ |
| $L_{B1056}$ | $R^{D26}$ | $R^{D28}$ | $R^{D1}$ |
| $L_{B1057}$ | $R^{D26}$ | $R^{D29}$ | $R^{D1}$ |
| $L_{B1058}$ | $R^{D26}$ | $R^{D30}$ | $R^{D1}$ |
| $L_{B1059}$ | $R^{D26}$ | $R^{D31}$ | $R^{D1}$ |
| $L_{B1060}$ | $R^{D26}$ | $R^{D32}$ | $R^{D1}$ |
| $L_{B1061}$ | $R^{D26}$ | $R^{D33}$ | $R^{D1}$ |
| $L_{B1062}$ | $R^{D26}$ | $R^{D34}$ | $R^{D1}$ |
| $L_{B1063}$ | $R^{D26}$ | $R^{D35}$ | $R^{D1}$ |
| $L_{B1064}$ | $R^{D26}$ | $R^{D40}$ | $R^{D1}$ |
| $L_{B1065}$ | $R^{D26}$ | $R^{D41}$ | $R^{D1}$ |
| $L_{B1066}$ | $R^{D26}$ | $R^{D42}$ | $R^{D1}$ |
| $L_{B1067}$ | $R^{D26}$ | $R^{D64}$ | $R^{D1}$ |
| $L_{B1068}$ | $R^{D26}$ | $R^{D66}$ | $R^{D1}$ |
| $L_{B1069}$ | $R^{D26}$ | $R^{D68}$ | $R^{D1}$ |
| $L_{B1070}$ | $R^{D26}$ | $R^{D76}$ | $R^{D1}$ |
| $L_{B1071}$ | $R^{D35}$ | $R^{D5}$ | $R^{D1}$ |
| $L_{B1072}$ | $R^{D35}$ | $R^{D6}$ | $R^{D1}$ |
| $L_{B1073}$ | $R^{D35}$ | $R^{D9}$ | $R^{D1}$ |
| $L_{B1074}$ | $R^{D35}$ | $R^{D10}$ | $R^{D1}$ |
| $L_{B1075}$ | $R^{D35}$ | $R^{D12}$ | $R^{D1}$ |
| $L_{B1076}$ | $R^{D35}$ | $R^{D15}$ | $R^{D1}$ |
| $L_{B1077}$ | $R^{D35}$ | $R^{D16}$ | $R^{D1}$ |
| $L_{B1078}$ | $R^{D35}$ | $R^{D17}$ | $R^{D1}$ |
| $L_{B1079}$ | $R^{D35}$ | $R^{D18}$ | $R^{D1}$ |
| $L_{B1080}$ | $R^{D35}$ | $R^{D19}$ | $R^{D1}$ |
| $L_{B1081}$ | $R^{D35}$ | $R^{D20}$ | $R^{D1}$ |
| $L_{B1082}$ | $R^{D35}$ | $R^{D21}$ | $R^{D1}$ |
| $L_{B1083}$ | $R^{D35}$ | $R^{D23}$ | $R^{D1}$ |
| $L_{B1084}$ | $R^{D35}$ | $R^{D24}$ | $R^{D1}$ |
| $L_{B1085}$ | $R^{D35}$ | $R^{D25}$ | $R^{D1}$ |
| $L_{B1086}$ | $R^{D35}$ | $R^{D27}$ | $R^{D1}$ |
| $L_{B1087}$ | $R^{D35}$ | $R^{D28}$ | $R^{D1}$ |
| $L_{B1088}$ | $R^{D35}$ | $R^{D29}$ | $R^{D1}$ |
| $L_{B1089}$ | $R^{D35}$ | $R^{D30}$ | $R^{D1}$ |
| $L_{B1090}$ | $R^{D35}$ | $R^{D31}$ | $R^{D1}$ |
| $L_{B1091}$ | $R^{D35}$ | $R^{D32}$ | $R^{D1}$ |
| $L_{B1092}$ | $R^{D35}$ | $R^{D33}$ | $R^{D1}$ |
| $L_{B1093}$ | $R^{D35}$ | $R^{D34}$ | $R^{D1}$ |
| $L_{B1094}$ | $R^{D35}$ | $R^{D40}$ | $R^{D1}$ |
| $L_{B1095}$ | $R^{D35}$ | $R^{D41}$ | $R^{D1}$ |
| $L_{B1096}$ | $R^{D35}$ | $R^{D42}$ | $R^{D1}$ |
| $L_{B1097}$ | $R^{D35}$ | $R^{D64}$ | $R^{D1}$ |
| $L_{B1098}$ | $R^{D35}$ | $R^{D66}$ | $R^{D1}$ |
| $L_{B1099}$ | $R^{D35}$ | $R^{D68}$ | $R^{D1}$ |
| $L_{B1100}$ | $R^{D35}$ | $R^{D76}$ | $R^{D1}$ |
| $L_{B1101}$ | $R^{D40}$ | $R^{D5}$ | $R^{D1}$ |
| $L_{B1102}$ | $R^{D40}$ | $R^{D6}$ | $R^{D1}$ |
| $L_{B1103}$ | $R^{D40}$ | $R^{D9}$ | $R^{D1}$ |
| $L_{B1104}$ | $R^{D40}$ | $R^{D10}$ | $R^{D1}$ |
| $L_{B1105}$ | $R^{D40}$ | $R^{D12}$ | $R^{D1}$ |
| $L_{B1106}$ | $R^{D40}$ | $R^{D15}$ | $R^{D1}$ |
| $L_{B1107}$ | $R^{D40}$ | $R^{D16}$ | $R^{D1}$ |
| $L_{B1108}$ | $R^{D40}$ | $R^{D17}$ | $R^{D1}$ |
| $L_{B1109}$ | $R^{D40}$ | $R^{D18}$ | $R^{D1}$ |
| $L_{B1110}$ | $R^{D40}$ | $R^{D19}$ | $R^{D1}$ |
| $L_{B1111}$ | $R^{D40}$ | $R^{D20}$ | $R^{D1}$ |
| $L_{B1112}$ | $R^{D40}$ | $R^{D21}$ | $R^{D1}$ |
| $L_{B1113}$ | $R^{D40}$ | $R^{D23}$ | $R^{D1}$ |
| $L_{B1114}$ | $R^{D40}$ | $R^{D24}$ | $R^{D1}$ |
| $L_{B1115}$ | $R^{D40}$ | $R^{D25}$ | $R^{D1}$ |
| $L_{B1116}$ | $R^{D40}$ | $R^{D27}$ | $R^{D1}$ |
| $L_{B1117}$ | $R^{D40}$ | $R^{D28}$ | $R^{D1}$ |
| $L_{B1118}$ | $R^{D40}$ | $R^{D29}$ | $R^{D1}$ |
| $L_{B1119}$ | $R^{D40}$ | $R^{D30}$ | $R^{D1}$ |
| $L_{B1120}$ | $R^{D40}$ | $R^{D31}$ | $R^{D1}$ |
| $L_{B1121}$ | $R^{D40}$ | $R^{D32}$ | $R^{D1}$ |
| $L_{B1122}$ | $R^{D40}$ | $R^{D33}$ | $R^{D1}$ |
| $L_{B1123}$ | $R^{D40}$ | $R^{D34}$ | $R^{D1}$ |
| $L_{B1124}$ | $R^{D40}$ | $R^{D41}$ | $R^{D1}$ |

-continued

| Ligand | $R^1$ | $R^2$ | $R^3$ |
|---|---|---|---|
| $L_{B1125}$ | $R^{D40}$ | $R^{D42}$ | $R^{D1}$ |
| $L_{B1126}$ | $R^{D40}$ | $R^{D64}$ | $R^{D1}$ |
| $L_{B1127}$ | $R^{D40}$ | $R^{D66}$ | $R^{D1}$ |
| $L_{B1128}$ | $R^{D40}$ | $R^{D68}$ | $R^{D1}$ |
| $L_{B1129}$ | $R^{D40}$ | $R^{D76}$ | $R^{D1}$ |
| $L_{B1130}$ | $R^{D41}$ | $R^{D5}$ | $R^{D1}$ |
| $L_{B1131}$ | $R^{D41}$ | $R^{D6}$ | $R^{D1}$ |
| $L_{B1132}$ | $R^{D41}$ | $R^{D9}$ | $R^{D1}$ |
| $L_{B1133}$ | $R^{D41}$ | $R^{D10}$ | $R^{D1}$ |
| $L_{B1134}$ | $R^{D41}$ | $R^{D12}$ | $R^{D1}$ |
| $L_{B1135}$ | $R^{D41}$ | $R^{D15}$ | $R^{D1}$ |
| $L_{B1136}$ | $R^{D41}$ | $R^{D16}$ | $R^{D1}$ |
| $L_{B1137}$ | $R^{D41}$ | $R^{D17}$ | $R^{D1}$ |
| $L_{B1138}$ | $R^{D41}$ | $R^{D18}$ | $R^{D1}$ |
| $L_{B1139}$ | $R^{D41}$ | $R^{D19}$ | $R^{D1}$ |
| $L_{B1140}$ | $R^{D41}$ | $R^{D20}$ | $R^{D1}$ |
| $L_{B1141}$ | $R^{D41}$ | $R^{D21}$ | $R^{D1}$ |
| $L_{B1142}$ | $R^{D41}$ | $R^{D23}$ | $R^{D1}$ |
| $L_{B1143}$ | $R^{D41}$ | $R^{D24}$ | $R^{D1}$ |
| $L_{B1144}$ | $R^{D41}$ | $R^{D25}$ | $R^{D1}$ |
| $L_{B1145}$ | $R^{D41}$ | $R^{D27}$ | $R^{D1}$ |
| $L_{B1146}$ | $R^{D41}$ | $R^{D28}$ | $R^{D1}$ |
| $L_{B1147}$ | $R^{D41}$ | $R^{D29}$ | $R^{D1}$ |
| $L_{B1148}$ | $R^{D41}$ | $R^{D30}$ | $R^{D1}$ |
| $L_{B1149}$ | $R^{D41}$ | $R^{D31}$ | $R^{D1}$ |
| $L_{B1150}$ | $R^{D41}$ | $R^{D32}$ | $R^{D1}$ |
| $L_{B1151}$ | $R^{D41}$ | $R^{D33}$ | $R^{D1}$ |
| $L_{B1152}$ | $R^{D41}$ | $R^{D34}$ | $R^{D1}$ |
| $L_{B1153}$ | $R^{D41}$ | $R^{D42}$ | $R^{D1}$ |
| $L_{B1154}$ | $R^{D41}$ | $R^{D64}$ | $R^{D1}$ |
| $L_{B1155}$ | $R^{D41}$ | $R^{D66}$ | $R^{D1}$ |
| $L_{B1156}$ | $R^{D41}$ | $R^{D68}$ | $R^{D1}$ |
| $L_{B1157}$ | $R^{D41}$ | $R^{D76}$ | $R^{D1}$ |
| $L_{B1158}$ | $R^{D64}$ | $R^{D5}$ | $R^{D1}$ |
| $L_{B1159}$ | $R^{D64}$ | $R^{D6}$ | $R^{D1}$ |
| $L_{B1160}$ | $R^{D64}$ | $R^{D9}$ | $R^{D1}$ |
| $L_{B1161}$ | $R^{D64}$ | $R^{D10}$ | $R^{D1}$ |
| $L_{B1162}$ | $R^{D64}$ | $R^{D12}$ | $R^{D1}$ |
| $L_{B1163}$ | $R^{D64}$ | $R^{D15}$ | $R^{D1}$ |
| $L_{B1164}$ | $R^{D64}$ | $R^{D16}$ | $R^{D1}$ |
| $L_{B1165}$ | $R^{D64}$ | $R^{D17}$ | $R^{D1}$ |
| $L_{B1166}$ | $R^{D64}$ | $R^{D18}$ | $R^{D1}$ |
| $L_{B1167}$ | $R^{D64}$ | $R^{D19}$ | $R^{D1}$ |
| $L_{B1168}$ | $R^{D64}$ | $R^{D20}$ | $R^{D1}$ |
| $L_{B1169}$ | $R^{D64}$ | $R^{D21}$ | $R^{D1}$ |
| $L_{B1170}$ | $R^{D64}$ | $R^{D23}$ | $R^{D1}$ |
| $L_{B1171}$ | $R^{D64}$ | $R^{D24}$ | $R^{D1}$ |
| $L_{B1172}$ | $R^{D64}$ | $R^{D25}$ | $R^{D1}$ |
| $L_{B1173}$ | $R^{D64}$ | $R^{D27}$ | $R^{D1}$ |
| $L_{B1174}$ | $R^{D64}$ | $R^{D28}$ | $R^{D1}$ |
| $L_{B1175}$ | $R^{D64}$ | $R^{D29}$ | $R^{D1}$ |
| $L_{B1176}$ | $R^{D64}$ | $R^{D30}$ | $R^{D1}$ |
| $L_{B1177}$ | $R^{D64}$ | $R^{D31}$ | $R^{D1}$ |
| $L_{B1178}$ | $R^{D64}$ | $R^{D32}$ | $R^{D1}$ |
| $L_{B1179}$ | $R^{D64}$ | $R^{D33}$ | $R^{D1}$ |
| $L_{B1180}$ | $R^{D64}$ | $R^{D34}$ | $R^{D1}$ |
| $L_{B1181}$ | $R^{D64}$ | $R^{D42}$ | $R^{D1}$ |
| $L_{B1182}$ | $R^{D64}$ | $R^{D64}$ | $R^{D1}$ |
| $L_{B1183}$ | $R^{D64}$ | $R^{D66}$ | $R^{D1}$ |
| $L_{B1184}$ | $R^{D64}$ | $R^{D68}$ | $R^{D1}$ |
| $L_{B1185}$ | $R^{D64}$ | $R^{D76}$ | $R^{D1}$ |
| $L_{B1186}$ | $R^{D66}$ | $R^{D5}$ | $R^{D1}$ |
| $L_{B1187}$ | $R^{D66}$ | $R^{D6}$ | $R^{D1}$ |
| $L_{B1188}$ | $R^{D66}$ | $R^{D9}$ | $R^{D1}$ |
| $L_{B1189}$ | $R^{D66}$ | $R^{D10}$ | $R^{D1}$ |
| $L_{B1190}$ | $R^{D66}$ | $R^{D12}$ | $R^{D1}$ |
| $L_{B1191}$ | $R^{D66}$ | $R^{D15}$ | $R^{D1}$ |
| $L_{B1192}$ | $R^{D66}$ | $R^{D16}$ | $R^{D1}$ |
| $L_{B1193}$ | $R^{D66}$ | $R^{D17}$ | $R^{D1}$ |
| $L_{B1194}$ | $R^{D66}$ | $R^{D18}$ | $R^{D1}$ |
| $L_{B1195}$ | $R^{D66}$ | $R^{D19}$ | $R^{D1}$ |
| $L_{B1196}$ | $R^{D66}$ | $R^{D20}$ | $R^{D1}$ |
| $L_{B1197}$ | $R^{D66}$ | $R^{D21}$ | $R^{D1}$ |
| $L_{B1198}$ | $R^{D66}$ | $R^{D23}$ | $R^{D1}$ |
| $L_{B1199}$ | $R^{D66}$ | $R^{D24}$ | $R^{D1}$ |
| $L_{B1200}$ | $R^{D66}$ | $R^{D25}$ | $R^{D1}$ |
| $L_{B1201}$ | $R^{D66}$ | $R^{D27}$ | $R^{D1}$ |

-continued

| Ligand | $R^1$ | $R^2$ | $R^3$ |
|---|---|---|---|
| $L_{B1202}$ | $R^{D66}$ | $R^{D28}$ | $R^{D1}$ |
| $L_{B1203}$ | $R^{D66}$ | $R^{D29}$ | $R^{D1}$ |
| $L_{B1204}$ | $R^{D66}$ | $R^{D30}$ | $R^{D1}$ |
| $L_{B1205}$ | $R^{D66}$ | $R^{D31}$ | $R^{D1}$ |
| $L_{B1206}$ | $R^{D66}$ | $R^{D32}$ | $R^{D1}$ |
| $L_{B1207}$ | $R^{D66}$ | $R^{D33}$ | $R^{D1}$ |
| $L_{B1208}$ | $R^{D66}$ | $R^{D34}$ | $R^{D1}$ |
| $L_{B1209}$ | $R^{D66}$ | $R^{D42}$ | $R^{D1}$ |
| $L_{B1210}$ | $R^{D66}$ | $R^{D68}$ | $R^{D1}$ |
| $L_{B1211}$ | $R^{D66}$ | $R^{D76}$ | $R^{D1}$ |
| $L_{B1212}$ | $R^{D68}$ | $R^{D5}$ | $R^{D1}$ |
| $L_{B1213}$ | $R^{D68}$ | $R^{D6}$ | $R^{D1}$ |
| $L_{B1214}$ | $R^{D68}$ | $R^{D9}$ | $R^{D1}$ |
| $L_{B1215}$ | $R^{D68}$ | $R^{D10}$ | $R^{D1}$ |
| $L_{B1216}$ | $R^{D68}$ | $R^{D12}$ | $R^{D1}$ |
| $L_{B1217}$ | $R^{D68}$ | $R^{D15}$ | $R^{D1}$ |
| $L_{B1218}$ | $R^{D68}$ | $R^{D16}$ | $R^{D1}$ |
| $L_{B1219}$ | $R^{D68}$ | $R^{D17}$ | $R^{D1}$ |
| $L_{B1220}$ | $R^{D68}$ | $R^{D18}$ | $R^{D1}$ |
| $L_{B1221}$ | $R^{D68}$ | $R^{D19}$ | $R^{D1}$ |
| $L_{B1222}$ | $R^{D68}$ | $R^{D20}$ | $R^{D1}$ |
| $L_{B1223}$ | $R^{D68}$ | $R^{D21}$ | $R^{D1}$ |
| $L_{B1224}$ | $R^{D68}$ | $R^{D23}$ | $R^{D1}$ |
| $L_{B1225}$ | $R^{D68}$ | $R^{D24}$ | $R^{D1}$ |
| $L_{B1226}$ | $R^{D68}$ | $R^{D25}$ | $R^{D1}$ |
| $L_{B1227}$ | $R^{D68}$ | $R^{D27}$ | $R^{D1}$ |
| $L_{B1228}$ | $R^{D68}$ | $R^{D28}$ | $R^{D1}$ |
| $L_{B1229}$ | $R^{D68}$ | $R^{D29}$ | $R^{D1}$ |
| $L_{B1230}$ | $R^{D68}$ | $R^{D30}$ | $R^{D1}$ |
| $L_{B1231}$ | $R^{D68}$ | $R^{D31}$ | $R^{D1}$ |
| $L_{B1232}$ | $R^{D68}$ | $R^{D32}$ | $R^{D1}$ |
| $L_{B1233}$ | $R^{D68}$ | $R^{D33}$ | $R^{D1}$ |
| $L_{B1234}$ | $R^{D68}$ | $R^{D34}$ | $R^{D1}$ |
| $L_{B1235}$ | $R^{D68}$ | $R^{D42}$ | $R^{D1}$ |
| $L_{B1236}$ | $R^{D68}$ | $R^{D76}$ | $R^{D1}$ |
| $L_{B1237}$ | $R^{D76}$ | $R^{D5}$ | $R^{D1}$ |
| $L_{B1238}$ | $R^{D76}$ | $R^{D6}$ | $R^{D1}$ |
| $L_{B1239}$ | $R^{D76}$ | $R^{D9}$ | $R^{D1}$ |
| $L_{B1240}$ | $R^{D76}$ | $R^{D10}$ | $R^{D1}$ |
| $L_{B1241}$ | $R^{D76}$ | $R^{D12}$ | $R^{D1}$ |
| $L_{B1242}$ | $R^{D76}$ | $R^{D15}$ | $R^{D1}$ |
| $L_{B1243}$ | $R^{D76}$ | $R^{D16}$ | $R^{D1}$ |
| $L_{B1244}$ | $R^{D76}$ | $R^{D17}$ | $R^{D1}$ |
| $L_{B1245}$ | $R^{D76}$ | $R^{D18}$ | $R^{D1}$ |
| $L_{B1246}$ | $R^{D76}$ | $R^{D19}$ | $R^{D1}$ |
| $L_{B1247}$ | $R^{D76}$ | $R^{D20}$ | $R^{D1}$ |
| $L_{B1248}$ | $R^{D76}$ | $R^{D21}$ | $R^{D1}$ |
| $L_{B1249}$ | $R^{D76}$ | $R^{D23}$ | $R^{D1}$ |
| $L_{B1250}$ | $R^{D76}$ | $R^{D24}$ | $R^{D1}$ |
| $L_{B1251}$ | $R^{D76}$ | $R^{D25}$ | $R^{D1}$ |
| $L_{B1252}$ | $R^{D76}$ | $R^{D27}$ | $R^{D1}$ |
| $L_{B1253}$ | $R^{D76}$ | $R^{D28}$ | $R^{D1}$ |
| $L_{B1254}$ | $R^{D76}$ | $R^{D29}$ | $R^{D1}$ |
| $L_{B1255}$ | $R^{D76}$ | $R^{D30}$ | $R^{D1}$ |
| $L_{B1256}$ | $R^{D76}$ | $R^{D31}$ | $R^{D1}$ |
| $L_{B1257}$ | $R^{D76}$ | $R^{D32}$ | $R^{D1}$ |
| $L_{B1258}$ | $R^{D76}$ | $R^{D33}$ | $R^{D1}$ |
| $L_{B1259}$ | $R^{D76}$ | $R^{D34}$ | $R^{D1}$ |
| $L_{B1260}$ | $R^{D76}$ | $R^{D42}$ | $R^{D1}$ |

wherein $R^{D1}$ to $R^{D81}$ has the following structures:

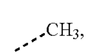

$R^{D1}$

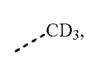

$R^{D2}$

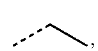

$R^{D3}$

-continued
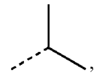
$R^{D4}$
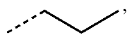
$R^{D5}$
$R^{D6}$
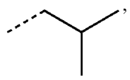
$R^{D7}$
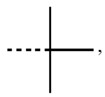
$R^{D8}$
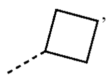
$R^{D9}$
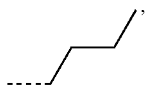
$R^{D10}$
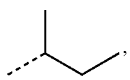
$R^{D11}$
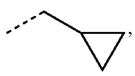
$R^{D12}$
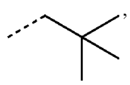
$R^{D13}$
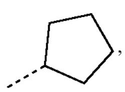
$R^{D14}$
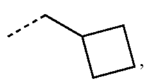
$R^{D15}$
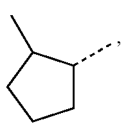
$R^{D16}$
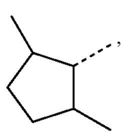
$R^{D17}$
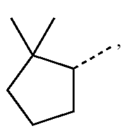
$R^{D18}$
-continued
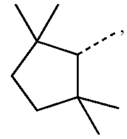
$R^{D19}$
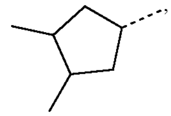
$R^{D20}$
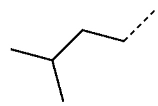
$R^{D21}$
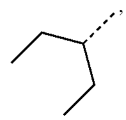
$R^{D22}$
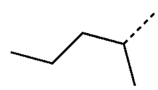
$R^{D23}$
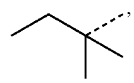
$R^{D24}$
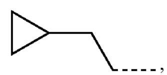
$R^{D25}$
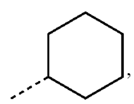
$R^{D26}$
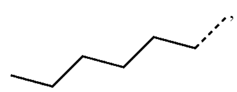
$R^{D27}$
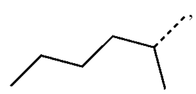
$R^{D28}$
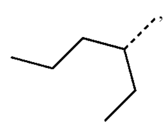
$R^{D29}$
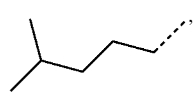
$R^{D30}$
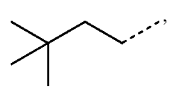
$R^{D31}$ $R^{D32}$
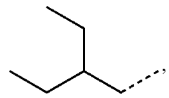
$R^{D33}$
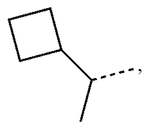
$R^{D34}$
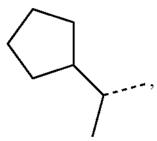
$R^{D35}$
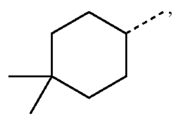
$R^{D36}$
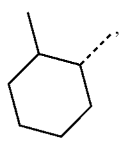
$R^{D37}$
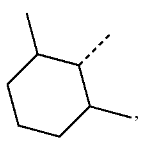
$R^{D38}$
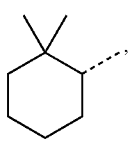
$R^{D39}$
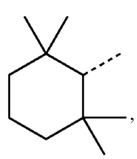
$R^{D40}$
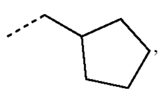
$R^{D41}$
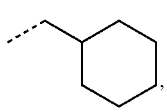
$R^{D42}$
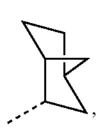
$R^{D43}$
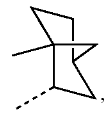
$R^{D44}$
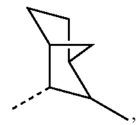
$R^{D45}$
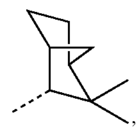
$R^{D46}$
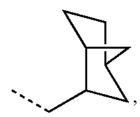
$R^{D47}$
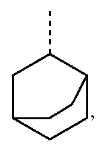
$R^{D48}$
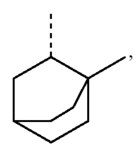
$R^{D49}$
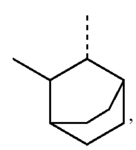
$R^{D50}$
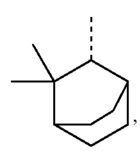
$R^{D51}$
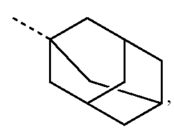
$R^{D52}$
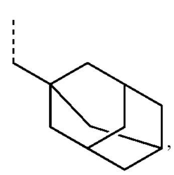

-continued
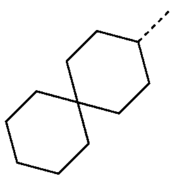
$R^{D53}$
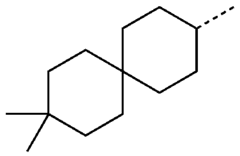
$R^{D54}$
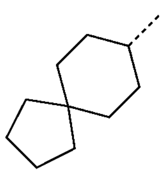
$R^{D55}$
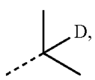
$R^{D56}$
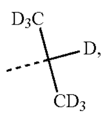
$R^{D57}$
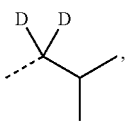
$R^{D58}$
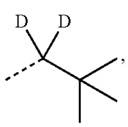
$R^{D59}$
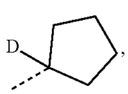
$R^{D60}$
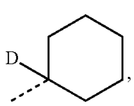
$R^{D61}$
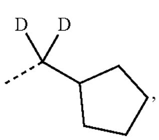
$R^{D62}$
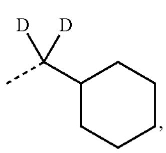
$R^{D63}$
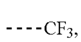
$R^{D64}$
-continued
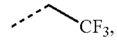
$R^{D65}$
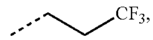
$R^{D66}$
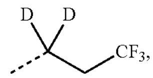
$R^{D67}$
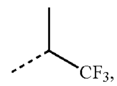
$R^{D68}$
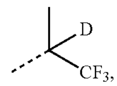
$R^{D69}$
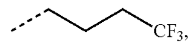
$R^{D70}$
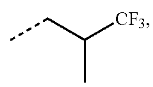
$R^{D71}$
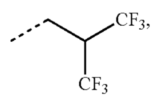
$R^{D72}$
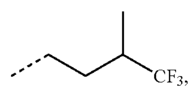
$R^{D73}$
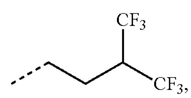
$R^{D74}$
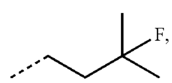
$R^{D75}$
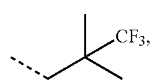
$R^{D76}$
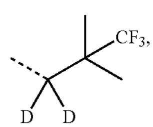
$R^{D77}$
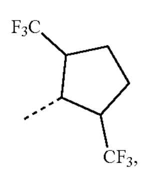
$R^{D78}$
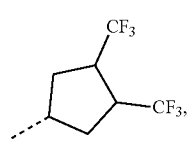
$R^{D79}$ -continued $R^{D80}$

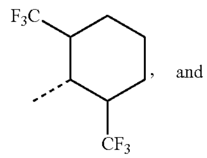

, and $R^{D81}$

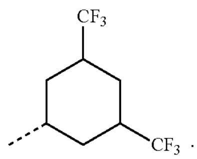

.

7. The compound of claim 1, wherein the ligand $L_A$ is selected from the group consisting of:

$L_{A1}$ through $L_{A130}$ which are based on a structure of Formula II,

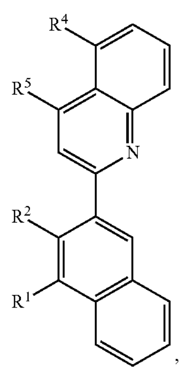

, in which $R^1$, $R^2$, $R^4$, and $R^5$ are defined as provided below:

-continued

| Ligand | $R^1$ | $R^2$ | $R^4$ | $R^5$ |
|---|---|---|---|---|
| $L_{A1}$ | $R_{B6}$ | H | H | H |
| $L_{A2}$ | $R_{B6}$ | H | $R_{B1}$ | H |
| $L_{A3}$ | $R_{B6}$ | H | $R_{B3}$ | H |
| $L_{A4}$ | $R_{B6}$ | H | $R_{B4}$ | H |
| $L_{A5}$ | $R_{B6}$ | H | $R_{B7}$ | H |
| $L_{A6}$ | $R_{B6}$ | H | $R_{B10}$ | H |
| $L_{A7}$ | $R_{B6}$ | H | $R_{A3}$ | H |
| $L_{A8}$ | $R_{B6}$ | H | $R_{A34}$ | H |
| $L_{A9}$ | $R_{B6}$ | H | H | $R_{B1}$ |
| $L_{A10}$ | $R_{B6}$ | H | H | $R_{B2}$ |
| $L_{A11}$ | $R_{B6}$ | H | H | $R_{B3}$ |
| $L_{A12}$ | $R_{B6}$ | H | H | $R_{B4}$ |
| $L_{A13}$ | $R_{B6}$ | H | H | $R_{B7}$ |
| $L_{A14}$ | $R_{B6}$ | H | H | $R_{B10}$ |
| $L_{A15}$ | $R_{B6}$ | H | H | $R_{A3}$ |
| $L_{A16}$ | $R_{B6}$ | H | H | $R_{A34}$ |
| $L_{A17}$ | $R_{B6}$ | H | $R_{B1}$ | $R_{B1}$ |
| $L_{A18}$ | $R_{B6}$ | H | $R_{B3}$ | $R_{B3}$ |
| $L_{A19}$ | $R_{B6}$ | H | $R_{B4}$ | $R_{B4}$ |
| $L_{A20}$ | $R_{B6}$ | H | $R_{B7}$ | $R_{B7}$ |
| $L_{A21}$ | $R_{B6}$ | H | $R_{B10}$ | $R_{B10}$ |
| $L_{A22}$ | $R_{B6}$ | H | $R_{A3}$ | $R_{A3}$ |
| $L_{A23}$ | $R_{B6}$ | H | $R_{A34}$ | $R_{A34}$ |
| $L_{A24}$ | $R_{B6}$ | H | $R_{B1}$ | $R_{B3}$ |
| $L_{A25}$ | $R_{B6}$ | H | $R_{B1}$ | $R_{B4}$ |
| $L_{A26}$ | $R_{B6}$ | H | $R_{B1}$ | $R_{B7}$ |
| $L_{A27}$ | $R_{B6}$ | H | $R_{B1}$ | $R_{B10}$ |
| $L_{A28}$ | $R_{B6}$ | H | $R_{B1}$ | $R_{A3}$ |
| $L_{A29}$ | $R_{B6}$ | H | $R_{B1}$ | $R_{A34}$ |
| $L_{A30}$ | $R_{B6}$ | H | $R_{B3}$ | $R_{B1}$ |
| $L_{A31}$ | $R_{B6}$ | H | $R_{B3}$ | $R_{B4}$ |
| $L_{A32}$ | $R_{B6}$ | H | $R_{B3}$ | $R_{B7}$ |
| $L_{A33}$ | $R_{B6}$ | H | $R_{B3}$ | $R_{B10}$ |
| $L_{A34}$ | $R_{B6}$ | H | $R_{B3}$ | $R_{A3}$ |
| $L_{A35}$ | $R_{B6}$ | H | $R_{B3}$ | $R_{A34}$ |
| $L_{A36}$ | $R_{B6}$ | H | $R_{B4}$ | $R_{B1}$ |
| $L_{A37}$ | $R_{B6}$ | H | $R_{B4}$ | $R_{B3}$ |
| $L_{A38}$ | $R_{B6}$ | H | $R_{B4}$ | $R_{B7}$ |
| $L_{A39}$ | $R_{B6}$ | H | $R_{B4}$ | $R_{B10}$ |
| $L_{A40}$ | $R_{B6}$ | H | $R_{B4}$ | $R_{A3}$ |
| $L_{A41}$ | $R_{B6}$ | H | $R_{B4}$ | $R_{A34}$ |
| $L_{A42}$ | $R_{B6}$ | H | $R_{B7}$ | $R_{B1}$ |
| $L_{A43}$ | $R_{B6}$ | H | $R_{B7}$ | $R_{B3}$ |
| $L_{A44}$ | $R_{B6}$ | H | $R_{B7}$ | $R_{B4}$ |
| $L_{A45}$ | $R_{B6}$ | H | $R_{B7}$ | $R_{B10}$ |
| $L_{A46}$ | $R_{B6}$ | H | $R_{B7}$ | $R_{A3}$ |
| $L_{A47}$ | $R_{B6}$ | H | $R_{B7}$ | $R_{A34}$ |
| $L_{A48}$ | $R_{B6}$ | H | $R_{B10}$ | $R_{B1}$ |
| $L_{A49}$ | $R_{B6}$ | H | $R_{B10}$ | $R_{B3}$ |
| $L_{A50}$ | $R_{B6}$ | H | $R_{B10}$ | $R_{B4}$ |
| $L_{A51}$ | $R_{B6}$ | H | $R_{B10}$ | $R_{B7}$ |
| $L_{A52}$ | $R_{B6}$ | H | $R_{B10}$ | $R_{A3}$ |
| $L_{A53}$ | $R_{B6}$ | H | $R_{B10}$ | $R_{A34}$ |
| $L_{A54}$ | $R_{B6}$ | H | $R_{A3}$ | $R_{B1}$ |
| $L_{A55}$ | $R_{B6}$ | H | $R_{A3}$ | $R_{B3}$ |
| $L_{A56}$ | $R_{B6}$ | H | $R_{A3}$ | $R_{B4}$ |
| $L_{A57}$ | $R_{B6}$ | H | $R_{A3}$ | $R_{B7}$ |
| $L_{A58}$ | $R_{B6}$ | H | $R_{A3}$ | $R_{B10}$ |
| $L_{A59}$ | $R_{B6}$ | H | $R_{A3}$ | $R_{A34}$ |
| $L_{A60}$ | $R_{B6}$ | H | $R_{A34}$ | $R_{B1}$ |
| $L_{A61}$ | $R_{B6}$ | H | $R_{A34}$ | $R_{B3}$ |
| $L_{A62}$ | $R_{B6}$ | H | $R_{A34}$ | $R_{B4}$ |
| $L_{A63}$ | $R_{B6}$ | H | $R_{A34}$ | $R_{B7}$ |
| $L_{A64}$ | $R_{B6}$ | H | $R_{A34}$ | $R_{B10}$ |
| $L_{A65}$ | $R_{B6}$ | H | $R_{A34}$ | $R_{A3}$ |
| $L_{A66}$ | $R_{B8}$ | H | H | H |
| $L_{A67}$ | $R_{B8}$ | H | $R_{B1}$ | H |
| $L_{A68}$ | $R_{B8}$ | H | $R_{B3}$ | H |
| $L_{A69}$ | $R_{B8}$ | H | $R_{B4}$ | H |
| $L_{A70}$ | $R_{B8}$ | H | $R_{B7}$ | H |
| $L_{A71}$ | $R_{B8}$ | H | $R_{B10}$ | H |
| $L_{A72}$ | $R_{B8}$ | H | $R_{A3}$ | H |
| $L_{A73}$ | $R_{B8}$ | H | $R_{A34}$ | H |
| $L_{A74}$ | $R_{B8}$ | H | H | $R_{B1}$ |
| $L_{A75}$ | $R_{B8}$ | H | H | $R_{B2}$ |
| $L_{A76}$ | $R_{B8}$ | H | H | $R_{B3}$ |
| $L_{A77}$ | $R_{B8}$ | H | H | $R_{B4}$ |
| $L_{A78}$ | $R_{B8}$ | H | H | $R_{B7}$ |
| $L_{A79}$ | $R_{B8}$ | H | H | $R_{B10}$ |
| $L_{A80}$ | $R_{B8}$ | H | H | $R_{A3}$ |
| $L_{A81}$ | $R_{B8}$ | H | H | $R_{A34}$ |
| $L_{A82}$ | $R_{B8}$ | H | $R_{B1}$ | $R_{B1}$ |
| $L_{A83}$ | $R_{B8}$ | H | $R_{B3}$ | $R_{B3}$ |
| $L_{A84}$ | $R_{B8}$ | H | $R_{B4}$ | $R_{B4}$ |
| $L_{A85}$ | $R_{B8}$ | H | $R_{B7}$ | $R_{B7}$ |
| $L_{A86}$ | $R_{B8}$ | H | $R_{B10}$ | $R_{B10}$ |
| $L_{A87}$ | $R_{B8}$ | H | $R_{A3}$ | $R_{A3}$ |
| $L_{A88}$ | $R_{B8}$ | H | $R_{A34}$ | $R_{A34}$ |
| $L_{A89}$ | $R_{B8}$ | H | $R_{B1}$ | $R_{B3}$ |
| $L_{A90}$ | $R_{B8}$ | H | $R_{B1}$ | $R_{B4}$ |
| $L_{A91}$ | $R_{B8}$ | H | $R_{B1}$ | $R_{B7}$ |
| $L_{A92}$ | $R_{B8}$ | H | $R_{B1}$ | $R_{B10}$ |
| $L_{A93}$ | $R_{B8}$ | H | $R_{B1}$ | $R_{A3}$ |
| $L_{A94}$ | $R_{B8}$ | H | $R_{B1}$ | $R_{A34}$ |
| $L_{A95}$ | $R_{B8}$ | H | $R_{B3}$ | $R_{B1}$ |
| $L_{A96}$ | $R_{B8}$ | H | $R_{B3}$ | $R_{B4}$ |
| $L_{A97}$ | $R_{B8}$ | H | $R_{B3}$ | $R_{B7}$ |
| $L_{A98}$ | $R_{B8}$ | H | $R_{B3}$ | $R_{B10}$ |
| $L_{A99}$ | $R_{B3}$ | H | $R_{B3}$ | $R_{A3}$ |
| $L_{A100}$ | $R_{B8}$ | H | $R_{B3}$ | $R_{A34}$ |
| $L_{A101}$ | $R_{B8}$ | H | $R_{B4}$ | $R_{B1}$ |
| $L_{A102}$ | $R_{B8}$ | H | $R_{B4}$ | $R_{B3}$ |
| $L_{A103}$ | $R_{B8}$ | H | $R_{B4}$ | $R_{B7}$ |
| $L_{A104}$ | $R_{B8}$ | H | $R_{B4}$ | $R_{B10}$ |
| $L_{A105}$ | $R_{B8}$ | H | $R_{B4}$ | $R_{A3}$ |
| $L_{A106}$ | $R_{B8}$ | H | $R_{B4}$ | $R_{A34}$ |
| $L_{A107}$ | $R_{B8}$ | H | $R_{B7}$ | $R_{B1}$ |
| $L_{A108}$ | $R_{B8}$ | H | $R_{B7}$ | $R_{B3}$ |

-continued

| Ligand | $R^1$ | $R^2$ | $R^4$ | $R^5$ |
|---|---|---|---|---|
| $L_{A109}$ | $R_{B8}$ | H | $R_{B7}$ | $R_{B4}$ |
| $L_{A110}$ | $R_{B8}$ | H | $R_{B7}$ | $R_{B10}$ |
| $L_{A111}$ | $R_{B8}$ | H | $R_{B7}$ | $R_{A3}$ |
| $L_{A112}$ | $R_{B8}$ | H | $R_{B7}$ | $R_{A34}$ |
| $L_{A113}$ | $R_{B8}$ | H | $R_{B10}$ | $R_{B1}$ |
| $L_{A114}$ | $R_{B8}$ | H | $R_{B10}$ | $R_{B3}$ |
| $L_{A115}$ | $R_{B8}$ | H | $R_{B10}$ | $R_{B4}$ |
| $L_{A116}$ | $R_{B8}$ | H | $R_{B10}$ | $R_{B7}$ |
| $L_{A117}$ | $R_{B8}$ | H | $R_{B10}$ | $R_{A3}$ |
| $L_{A118}$ | $R_{B8}$ | H | $R_{B10}$ | $R_{A34}$ |
| $L_{A119}$ | $R_{B8}$ | H | $R_{A3}$ | $R_{B1}$ |
| $L_{A120}$ | $R_{B8}$ | H | $R_{A3}$ | $R_{B3}$ |
| $L_{A121}$ | $R_{B8}$ | H | $R_{A3}$ | $R_{B4}$ |
| $L_{A122}$ | $R_{B8}$ | H | $R_{A3}$ | $R_{B7}$ |
| $L_{A123}$ | $R_{B8}$ | H | $R_{A3}$ | $R_{B10}$ |
| $L_{A124}$ | $R_{B8}$ | H | $R_{A3}$ | $R_{A34}$ |
| $L_{A125}$ | $R_{B8}$ | H | $R_{A34}$ | $R_{B1}$ |
| $L_{A126}$ | $R_{B8}$ | H | $R_{A34}$ | $R_{B3}$ |
| $L_{A127}$ | $R_{B8}$ | H | $R_{A34}$ | $R_{B4}$ |
| $L_{A128}$ | $R_{B8}$ | H | $R_{A34}$ | $R_{B7}$ |
| $L_{A129}$ | $R_{B8}$ | H | $R_{A34}$ | $R_{B10}$ |
| $L_{A130}$ | $R_{B8}$ | H | $R_{A34}$ | $R_{A3}$, |

$L_{A1299}$ through $L_{A1428}$ that are based on a structure of Formula VII,

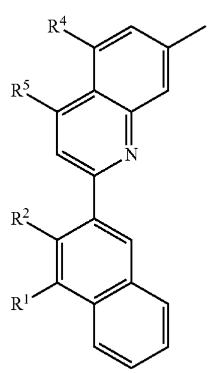

, in which $R^1$, $R^2$, $R^4$, and $R^5$ are defined as provided below:

| Ligand | $R^1$ | $R^2$ | $R^4$ | $R^5$ |
|---|---|---|---|---|
| $L_{A1299}$ | $R_{B6}$ | H | H | H |
| $L_{A1300}$ | $R_{B6}$ | H | $R_{B1}$ | H |
| $L_{A1301}$ | $R_{B6}$ | H | $R_{B3}$ | H |
| $L_{A1302}$ | $R_{B6}$ | H | $R_{B4}$ | H |
| $L_{A1303}$ | $R_{B6}$ | H | $R_{B7}$ | H |
| $L_{A1304}$ | $R_{B6}$ | H | $R_{B10}$ | H |
| $L_{A1305}$ | $R_{B6}$ | H | $R_{A3}$ | H |
| $L_{A1306}$ | $R_{B6}$ | H | $R_{A34}$ | H |
| $L_{A1307}$ | $R_{B6}$ | H | H | $R_{B1}$ |
| $L_{A1308}$ | $R_{B6}$ | H | H | $R_{B2}$ |
| $L_{A1309}$ | $R_{B6}$ | H | H | $R_{B3}$ |
| $L_{A1310}$ | $R_{B6}$ | H | H | $R_{B4}$ |
| $L_{A1311}$ | $R_{B6}$ | H | H | $R_{B7}$ |
| $L_{A1312}$ | $R_{B6}$ | H | H | $R_{B10}$ |
| $L_{A1313}$ | $R_{B6}$ | H | H | $R_{A3}$ |
| $L_{A1314}$ | $R_{B6}$ | H | H | $R_{A34}$ |
| $L_{A1315}$ | $R_{B6}$ | H | $R_{B1}$ | $R_{B1}$ |
| $L_{A1316}$ | $R_{B6}$ | H | $R_{B3}$ | $R_{B3}$ |
| $L_{A1317}$ | $R_{B6}$ | H | $R_{B4}$ | $R_{B4}$ |
| $L_{A1318}$ | $R_{B6}$ | H | $R_{B7}$ | $R_{B7}$ |
| $L_{A1319}$ | $R_{B6}$ | H | $R_{B10}$ | $R_{B10}$ |
| $L_{A1320}$ | $R_{B6}$ | H | $R_{A3}$ | $R_{A3}$ |
| $L_{A1321}$ | $R_{B6}$ | H | $R_{A34}$ | $R_{A34}$ |
| $L_{A1322}$ | $R_{B6}$ | H | $R_{B1}$ | $R_{B3}$ |
| $L_{A1323}$ | $R_{B6}$ | H | $R_{B1}$ | $R_{B4}$ |
| $L_{A1324}$ | $R_{B6}$ | H | $R_{B1}$ | $R_{B7}$ |
| $L_{A1325}$ | $R_{B6}$ | H | $R_{B1}$ | $R_{B10}$ |
| $L_{A1326}$ | $R_{B6}$ | H | $R_{B1}$ | $R_{A3}$ |
| $L_{A1327}$ | $R_{B6}$ | H | $R_{B1}$ | $R_{A34}$ |
| $L_{A1328}$ | $R_{B6}$ | H | $R_{B3}$ | $R_{B1}$ |
| $L_{A1329}$ | $R_{B6}$ | H | $R_{B3}$ | $R_{B4}$ |
| $L_{A1330}$ | $R_{B6}$ | H | $R_{B3}$ | $R_{B7}$ |
| $L_{A1331}$ | $R_{B6}$ | H | $R_{B3}$ | $R_{B10}$ |
| $L_{A1332}$ | $R_{B6}$ | H | $R_{B3}$ | $R_{A3}$ |
| $L_{A1333}$ | $R_{B6}$ | H | $R_{B3}$ | $R_{A34}$ |
| $L_{A1334}$ | $R_{B6}$ | H | $R_{B4}$ | $R_{B1}$ |
| $L_{A1335}$ | $R_{B6}$ | H | $R_{B4}$ | $R_{B3}$ |
| $L_{A1336}$ | $R_{B6}$ | H | $R_{B4}$ | $R_{B7}$ |
| $L_{A1337}$ | $R_{B6}$ | H | $R_{B4}$ | $R_{B10}$ |
| $L_{A1338}$ | $R_{B6}$ | H | $R_{B4}$ | $R_{A3}$ |
| $L_{A1339}$ | $R_{B6}$ | H | $R_{B4}$ | $R_{A34}$ |
| $L_{A1340}$ | $R_{B6}$ | H | $R_{B7}$ | $R_{B1}$ |
| $L_{A1341}$ | $R_{B6}$ | H | $R_{B7}$ | $R_{B3}$ |
| $L_{A1342}$ | $R_{B6}$ | H | $R_{B7}$ | $R_{B4}$ |
| $L_{A1343}$ | $R_{B6}$ | H | $R_{B7}$ | $R_{B10}$ |
| $L_{A1344}$ | $R_{B6}$ | H | $R_{B7}$ | $R_{A3}$ |
| $L_{A1345}$ | $R_{B6}$ | H | $R_{B7}$ | $R_{A34}$ |
| $L_{A1346}$ | $R_{B6}$ | H | $R_{B10}$ | $R_{B1}$ |
| $L_{A1347}$ | $R_{B6}$ | H | $R_{B10}$ | $R_{B3}$ |
| $L_{A1348}$ | $R_{B6}$ | H | $R_{B10}$ | $R_{B4}$ |
| $L_{A1349}$ | $R_{B6}$ | H | $R_{B10}$ | $R_{B7}$ |
| $L_{A1350}$ | $R_{B6}$ | H | $R_{B10}$ | $R_{A3}$ |
| $L_{A1351}$ | $R_{B6}$ | H | $R_{B10}$ | $R_{A34}$ |
| $L_{A1352}$ | $R_{B6}$ | H | $R_{A3}$ | $R_{B1}$ |
| $L_{A1353}$ | $R_{B6}$ | H | $R_{A3}$ | $R_{B3}$ |
| $L_{A1354}$ | $R_{B6}$ | H | $R_{A3}$ | $R_{B4}$ |
| $L_{A1355}$ | $R_{B6}$ | H | $R_{A3}$ | $R_{B7}$ |
| $L_{A1356}$ | $R_{B6}$ | H | $R_{A3}$ | $R_{B10}$ |
| $L_{A1357}$ | $R_{B6}$ | H | $R_{A3}$ | $R_{A34}$ |
| $L_{A1358}$ | $R_{B6}$ | H | $R_{A34}$ | $R_{B1}$ |
| $L_{A1359}$ | $R_{B6}$ | H | $R_{A34}$ | $R_{B3}$ |
| $L_{A1360}$ | $R_{B6}$ | H | $R_{A34}$ | $R_{B4}$ |
| $L_{A1361}$ | $R_{B6}$ | H | $R_{A34}$ | $R_{B7}$ |
| $L_{A1362}$ | $R_{B6}$ | H | $R_{A34}$ | $R_{B10}$ |
| $L_{A1363}$ | $R_{B6}$ | H | $R_{A34}$ | $R_{A3}$ |
| $L_{A1364}$ | $R_{B8}$ | H | H | H |
| $L_{A1365}$ | $R_{B8}$ | H | $R_{B1}$ | H |
| $L_{A1366}$ | $R_{B8}$ | H | $R_{B3}$ | H |
| $L_{A1367}$ | $R_{B8}$ | H | $R_{B4}$ | H |
| $L_{A1368}$ | $R_{B8}$ | H | $R_{B7}$ | H |
| $L_{A1369}$ | $R_{B8}$ | H | $R_{B10}$ | H |
| $L_{A1370}$ | $R_{B8}$ | H | $R_{A3}$ | H |
| $L_{A1371}$ | $R_{B8}$ | H | $R_{A34}$ | H |
| $L_{A1372}$ | $R_{B8}$ | H | H | $R_{B1}$ |
| $L_{A1373}$ | $R_{B8}$ | H | H | $R_{B2}$ |
| $L_{A1374}$ | $R_{B8}$ | H | H | $R_{B3}$ |
| $L_{A1375}$ | $R_{B8}$ | H | H | $R_{B4}$ |
| $L_{A1376}$ | $R_{B8}$ | H | H | $R_{B7}$ |
| $L_{A1377}$ | $R_{B8}$ | H | H | $R_{B10}$ |
| $L_{A1378}$ | $R_{B8}$ | H | H | $R_{A3}$ |
| $L_{A1379}$ | $R_{B8}$ | H | H | $R_{A34}$ |
| $L_{A1380}$ | $R_{B8}$ | H | $R_{B1}$ | $R_{B1}$ |
| $L_{A1381}$ | $R_{B8}$ | H | $R_{B3}$ | $R_{B3}$ |
| $L_{A1382}$ | $R_{B8}$ | H | $R_{B4}$ | $R_{B4}$ |
| $L_{A1383}$ | $R_{B8}$ | H | $R_{B7}$ | $R_{B7}$ |
| $L_{A1384}$ | $R_{B8}$ | H | $R_{B10}$ | $R_{B10}$ |
| $L_{A1385}$ | $R_{B8}$ | H | $R_{A3}$ | $R_{A3}$ |
| $L_{A1386}$ | $R_{B8}$ | H | $R_{A34}$ | $R_{A34}$ |
| $L_{A1387}$ | $R_{B8}$ | H | $R_{B1}$ | $R_{B3}$ |
| $L_{A1388}$ | $R_{B8}$ | H | $R_{B1}$ | $R_{B4}$ |
| $L_{A1389}$ | $R_{B8}$ | H | $R_{B1}$ | $R_{B7}$ |
| $L_{A1390}$ | $R_{B8}$ | H | $R_{B1}$ | $R_{B10}$ |
| $L_{A1391}$ | $R_{B8}$ | H | $R_{B1}$ | $R_{A3}$ |
| $L_{A1392}$ | $R_{B8}$ | H | $R_{B1}$ | $R_{A34}$ |
| $L_{A1393}$ | $R_{B8}$ | H | $R_{B3}$ | $R_{B1}$ |
| $L_{A1394}$ | $R_{B8}$ | H | $R_{B3}$ | $R_{B4}$ |
| $L_{A1395}$ | $R_{B8}$ | H | $R_{B3}$ | $R_{B7}$ |
| $L_{A1396}$ | $R_{B8}$ | H | $R_{B3}$ | $R_{B10}$ |
| $L_{A1397}$ | $R_{B8}$ | H | $R_{B3}$ | $R_{A3}$ |
| $L_{A1398}$ | $R_{B8}$ | H | $R_{B3}$ | $R_{A34}$ |
| $L_{A1399}$ | $R_{B8}$ | H | $R_{B4}$ | $R_{B1}$ |

-continued

| Ligand | $R^1$ | $R^2$ | $R^4$ | $R^5$ |
|---|---|---|---|---|
| $L_{A1400}$ | $R_{B8}$ | H | $R_{B4}$ | $R_{B3}$ |
| $L_{A1401}$ | $R_{B8}$ | H | $R_{B4}$ | $R_{B7}$ |
| $L_{A1402}$ | $R_{B8}$ | H | $R_{B4}$ | $R_{B10}$ |
| $L_{A1403}$ | $R_{B8}$ | H | $R_{B4}$ | $R_{A3}$ |
| $L_{A1404}$ | $R_{B8}$ | H | $R_{B4}$ | $R_{A34}$ |
| $L_{A1405}$ | $R_{B8}$ | H | $R_{B7}$ | $R_{B1}$ |
| $L_{A1406}$ | $R_{B8}$ | H | $R_{B7}$ | $R_{B3}$ |
| $L_{A1407}$ | $R_{B8}$ | H | $R_{B7}$ | $R_{B4}$ |
| $L_{A1408}$ | $R_{B8}$ | H | $R_{B7}$ | $R_{B10}$ |
| $L_{A1409}$ | $R_{B8}$ | H | $R_{B7}$ | $R_{A3}$ |
| $L_{A1410}$ | $R_{B8}$ | H | $R_{B7}$ | $R_{A34}$ |
| $L_{A1411}$ | $R_{B8}$ | H | $R_{B10}$ | $R_{B1}$ |
| $L_{A1412}$ | $R_{B8}$ | H | $R_{B10}$ | $R_{B3}$ |
| $L_{A1413}$ | $R_{B8}$ | H | $R_{B10}$ | $R_{B4}$ |
| $L_{A1414}$ | $R_{B8}$ | H | $R_{B10}$ | $R_{B7}$ |
| $L_{A1415}$ | $R_{B8}$ | H | $R_{B10}$ | $R_{A3}$ |
| $L_{A1416}$ | $R_{B8}$ | H | $R_{B10}$ | $R_{A34}$ |
| $L_{A1417}$ | $R_{B8}$ | H | $R_{A3}$ | $R_{B1}$ |
| $L_{A1418}$ | $R_{B8}$ | H | $R_{A3}$ | $R_{B3}$ |
| $L_{A1419}$ | $R_{B8}$ | H | $R_{A3}$ | $R_{B4}$ |
| $L_{A1420}$ | $R_{B8}$ | H | $R_{A3}$ | $R_{B7}$ |
| $L_{A1421}$ | $R_{B8}$ | H | $R_{A3}$ | $R_{B10}$ |
| $L_{A1422}$ | $R_{B8}$ | H | $R_{A3}$ | $R_{A34}$ |
| $L_{A1423}$ | $R_{B8}$ | H | $R_{A34}$ | $R_{B1}$ |
| $L_{A1424}$ | $R_{B8}$ | H | $R_{A34}$ | $R_{B3}$ |
| $L_{A1425}$ | $R_{B8}$ | H | $R_{A34}$ | $R_{B4}$ |
| $L_{A1426}$ | $R_{B8}$ | H | $R_{A34}$ | $R_{B7}$ |
| $L_{A1427}$ | $R_{B8}$ | H | $R_{A34}$ | $R_{B10}$ |
| $L_{A1428}$ | $R_{B8}$ | H | $R_{A34}$ | $R_{A3}$; |

$L_{A1559}$ through $L_{A1688}$ that are based on a structure of Formula VIII,

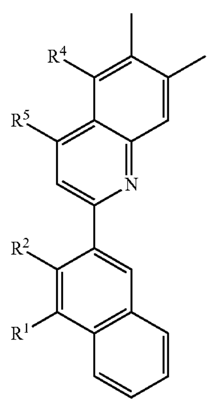

, in which $R^1$, $R^2$, $R^4$, and $R^5$ are defined as provided below:

| Ligand | $R^1$ | $R^2$ | $R^4$ | $R^5$ |
|---|---|---|---|---|
| $L_{A1559}$ | $R_{B6}$ | H | H | H |
| $L_{A1560}$ | $R_{B6}$ | H | $R_{B1}$ | H |
| $L_{A1561}$ | $R_{B6}$ | H | $R_{B3}$ | H |
| $L_{A1562}$ | $R_{B6}$ | H | $R_{B4}$ | H |
| $L_{A1563}$ | $R_{B6}$ | H | $R_{B7}$ | H |
| $L_{A1564}$ | $R_{B6}$ | H | $R_{B10}$ | H |
| $L_{A1565}$ | $R_{B6}$ | H | $R_{A3}$ | H |
| $L_{A1566}$ | $R_{B6}$ | H | $R_{A34}$ | H |
| $L_{A1567}$ | $R_{B6}$ | H | H | $R_{B1}$ |
| $L_{A1568}$ | $R_{B6}$ | H | H | $R_{B2}$ |
| $L_{A1569}$ | $R_{B6}$ | H | H | $R_{B3}$ |
| $L_{A1570}$ | $R_{B6}$ | H | H | $R_{B4}$ |
| $L_{A1571}$ | $R_{B6}$ | H | H | $R_{B7}$ |
| $L_{A1572}$ | $R_{B6}$ | H | H | $R_{B10}$ |
| $L_{A1573}$ | $R_{B6}$ | H | H | $R_{A3}$ |
| $L_{A1574}$ | $R_{B6}$ | H | H | $R_{A34}$ |

-continued

| Ligand | $R^1$ | $R^2$ | $R^4$ | $R^5$ |
|---|---|---|---|---|
| $L_{A1575}$ | $R_{B6}$ | H | $R_{B1}$ | $R_{B1}$ |
| $L_{A1576}$ | $R_{B6}$ | H | $R_{B3}$ | $R_{B3}$ |
| $L_{A1577}$ | $R_{B6}$ | H | $R_{B4}$ | $R_{B4}$ |
| $L_{A1578}$ | $R_{B6}$ | H | $R_{B7}$ | $R_{B7}$ |
| $L_{A1579}$ | $R_{B6}$ | H | $R_{B10}$ | $R_{B10}$ |
| $L_{A1580}$ | $R_{B6}$ | H | $R_{A3}$ | $R_{A3}$ |
| $L_{A1581}$ | $R_{B6}$ | H | $R_{A34}$ | $R_{A34}$ |
| $L_{A1582}$ | $R_{B6}$ | H | $R_{B1}$ | $R_{B3}$ |
| $L_{A1583}$ | $R_{B6}$ | H | $R_{B1}$ | $R_{B4}$ |
| $L_{A1584}$ | $R_{B6}$ | H | $R_{B1}$ | $R_{B7}$ |
| $L_{A1585}$ | $R_{B6}$ | H | $R_{B1}$ | $R_{B10}$ |
| $L_{A1586}$ | $R_{B6}$ | H | $R_{B1}$ | $R_{A3}$ |
| $L_{A1587}$ | $R_{B6}$ | H | $R_{B1}$ | $R_{A34}$ |
| $L_{A1588}$ | $R_{B6}$ | H | $R_{B3}$ | $R_{B1}$ |
| $L_{A1589}$ | $R_{B6}$ | H | $R_{B3}$ | $R_{B4}$ |
| $L_{A1590}$ | $R_{B6}$ | H | $R_{B3}$ | $R_{B7}$ |
| $L_{A1591}$ | $R_{B6}$ | H | $R_{B3}$ | $R_{B10}$ |
| $L_{A1592}$ | $R_{B6}$ | H | $R_{B3}$ | $R_{A3}$ |
| $L_{A1593}$ | $R_{B6}$ | H | $R_{B3}$ | $R_{A34}$ |
| $L_{A1594}$ | $R_{B6}$ | H | $R_{B4}$ | $R_{B1}$ |
| $L_{A1595}$ | $R_{B6}$ | H | $R_{B4}$ | $R_{B3}$ |
| $L_{A1596}$ | $R_{B6}$ | H | $R_{B4}$ | $R_{B7}$ |
| $L_{A1597}$ | $R_{B6}$ | H | $R_{B4}$ | $R_{B10}$ |
| $L_{A1598}$ | $R_{B6}$ | H | $R_{B4}$ | $R_{A3}$ |
| $L_{A1599}$ | $R_{B6}$ | H | $R_{B4}$ | $R_{A34}$ |
| $L_{A1600}$ | $R_{B6}$ | H | $R_{B7}$ | $R_{B1}$ |
| $L_{A1601}$ | $R_{B6}$ | H | $R_{B7}$ | $R_{B3}$ |
| $L_{A1602}$ | $R_{B6}$ | H | $R_{B7}$ | $R_{B4}$ |
| $L_{A1603}$ | $R_{B6}$ | H | $R_{B7}$ | $R_{B10}$ |
| $L_{A1604}$ | $R_{B6}$ | H | $R_{B7}$ | $R_{A3}$ |
| $L_{A1605}$ | $R_{B6}$ | H | $R_{B7}$ | $R_{A34}$ |
| $L_{A1606}$ | $R_{B6}$ | H | $R_{B10}$ | $R_{B1}$ |
| $L_{A1607}$ | $R_{B6}$ | H | $R_{B10}$ | $R_{B3}$ |
| $L_{A1608}$ | $R_{B6}$ | H | $R_{B10}$ | $R_{B4}$ |
| $L_{A1609}$ | $R_{B6}$ | H | $R_{B10}$ | $R_{B7}$ |
| $L_{A1610}$ | $R_{B6}$ | H | $R_{B10}$ | $R_{A3}$ |
| $L_{A1611}$ | $R_{B6}$ | H | $R_{B10}$ | $R_{A34}$ |
| $L_{A1612}$ | $R_{B6}$ | H | $R_{A3}$ | $R_{B1}$ |
| $L_{A1613}$ | $R_{B6}$ | H | $R_{A3}$ | $R_{B3}$ |
| $L_{A1614}$ | $R_{B6}$ | H | $R_{A3}$ | $R_{B4}$ |
| $L_{A1615}$ | $R_{B6}$ | H | $R_{A3}$ | $R_{B7}$ |
| $L_{A1616}$ | $R_{B6}$ | H | $R_{A3}$ | $R_{B10}$ |
| $L_{A1617}$ | $R_{B6}$ | H | $R_{A3}$ | $R_{A34}$ |
| $L_{A1618}$ | $R_{B6}$ | H | $R_{A34}$ | $R_{B1}$ |
| $L_{A1619}$ | $R_{B6}$ | H | $R_{A34}$ | $R_{B3}$ |
| $L_{A1620}$ | $R_{B6}$ | H | $R_{A34}$ | $R_{B4}$ |
| $L_{A1621}$ | $R_{B6}$ | H | $R_{A34}$ | $R_{B7}$ |
| $L_{A1622}$ | $R_{B6}$ | H | $R_{A34}$ | $R_{B10}$ |
| $L_{A1623}$ | $R_{B6}$ | H | $R_{A34}$ | $R_{A3}$ |
| $L_{A1624}$ | $R_{B8}$ | H | H | H |
| $L_{A1625}$ | $R_{B8}$ | H | $R_{B1}$ | H |
| $L_{A1626}$ | $R_{B8}$ | H | $R_{B3}$ | H |
| $L_{A1627}$ | $R_{B8}$ | H | $R_{B4}$ | H |
| $L_{A1628}$ | $R_{B8}$ | H | $R_{B7}$ | H |
| $L_{A1629}$ | $R_{B8}$ | H | $R_{B10}$ | H |
| $L_{A1630}$ | $R_{B8}$ | H | $R_{A3}$ | H |
| $L_{A1631}$ | $R_{B8}$ | H | $R_{A34}$ | H |
| $L_{A1632}$ | $R_{B8}$ | H | H | $R_{B1}$ |
| $L_{A1633}$ | $R_{B8}$ | H | H | $R_{B2}$ |
| $L_{A1634}$ | $R_{B8}$ | H | H | $R_{B3}$ |
| $L_{A1635}$ | $R_{B8}$ | H | H | $R_{B4}$ |
| $L_{A1636}$ | $R_{B8}$ | H | H | $R_{B7}$ |
| $L_{A1637}$ | $R_{B8}$ | H | H | $R_{B10}$ |
| $L_{A1638}$ | $R_{B8}$ | H | H | $R_{A3}$ |
| $L_{A1639}$ | $R_{B8}$ | H | H | $R_{A34}$ |
| $L_{A1640}$ | $R_{B8}$ | H | $R_{B1}$ | $R_{B1}$ |
| $L_{A1641}$ | $R_{B8}$ | H | $R_{B3}$ | $R_{B3}$ |
| $L_{A1642}$ | $R_{B8}$ | H | $R_{B4}$ | $R_{B4}$ |
| $L_{A1643}$ | $R_{B8}$ | H | $R_{B7}$ | $R_{B7}$ |
| $L_{A1644}$ | $R_{B8}$ | H | $R_{B10}$ | $R_{B10}$ |
| $L_{A1645}$ | $R_{B8}$ | H | $R_{A3}$ | $R_{A3}$ |
| $L_{A1646}$ | $R_{B8}$ | H | $R_{A34}$ | $R_{A34}$ |
| $L_{A1647}$ | $R_{B8}$ | H | $R_{B1}$ | $R_{B3}$ |
| $L_{A1648}$ | $R_{B8}$ | H | $R_{B1}$ | $R_{B4}$ |
| $L_{A1649}$ | $R_{B8}$ | H | $R_{B1}$ | $R_{B7}$ |
| $L_{A1650}$ | $R_{B8}$ | H | $R_{B1}$ | $R_{B10}$ |
| $L_{A1651}$ | $R_{B8}$ | H | $R_{B1}$ | $R_{A3}$ |

-continued

| Ligand | $R^1$ | $R^2$ | $R^4$ | $R^5$ |
|---|---|---|---|---|
| $L_{A1652}$ | $R_{B8}$ | H | $R_{B1}$ | $R_{A34}$ |
| $L_{A1653}$ | $R_{B8}$ | H | $R_{B3}$ | $R_{B1}$ |
| $L_{A1654}$ | $R_{B8}$ | H | $R_{B3}$ | $R_{B4}$ |
| $L_{A1655}$ | $R_{B8}$ | H | $R_{B3}$ | $R_{B7}$ |
| $L_{A1656}$ | $R_{B8}$ | H | $R_{B3}$ | $R_{B10}$ |
| $L_{A1657}$ | $R_{B8}$ | H | $R_{B3}$ | $R_{A3}$ |
| $L_{A1658}$ | $R_{B8}$ | H | $R_{B3}$ | $R_{A34}$ |
| $L_{A1659}$ | $R_{B8}$ | H | $R_{B4}$ | $R_{B1}$ |
| $L_{A1660}$ | $R_{B8}$ | H | $R_{B4}$ | $R_{B3}$ |
| $L_{A1661}$ | $R_{B8}$ | H | $R_{B4}$ | $R_{B7}$ |
| $L_{A1662}$ | $R_{B8}$ | H | $R_{B4}$ | $R_{B10}$ |
| $L_{A1663}$ | $R_{B8}$ | H | $R_{B4}$ | $R_{A3}$ |
| $L_{A1664}$ | $R_{B8}$ | H | $R_{B4}$ | $R_{A34}$ |
| $L_{A1665}$ | $R_{B8}$ | H | $R_{B7}$ | $R_{B1}$ |
| $L_{A1666}$ | $R_{B8}$ | H | $R_{B7}$ | $R_{B3}$ |
| $L_{A1667}$ | $R_{B8}$ | H | $R_{B7}$ | $R_{B4}$ |
| $L_{A1668}$ | $R_{B8}$ | H | $R_{B7}$ | $R_{B10}$ |
| $L_{A1669}$ | $R_{B8}$ | H | $R_{B7}$ | $R_{A3}$ |
| $L_{A1670}$ | $R_{B8}$ | H | $R_{B7}$ | $R_{A34}$ |
| $L_{A1671}$ | $R_{B8}$ | H | $R_{B10}$ | $R_{B1}$ |
| $L_{A1672}$ | $R_{B8}$ | H | $R_{B10}$ | $R_{B3}$ |
| $L_{A1673}$ | $R_{B8}$ | H | $R_{B10}$ | $R_{B4}$ |
| $L_{A1674}$ | $R_{B8}$ | H | $R_{B10}$ | $R_{B7}$ |
| $L_{A1675}$ | $R_{B8}$ | H | $R_{B10}$ | $R_{A3}$ |
| $L_{A1676}$ | $R_{B8}$ | H | $R_{B10}$ | $R_{A34}$ |
| $L_{A1677}$ | $R_{B8}$ | H | $R_{A3}$ | $R_{B1}$ |
| $L_{A1678}$ | $R_{B8}$ | H | $R_{A3}$ | $R_{B3}$ |
| $L_{A1679}$ | $R_{B8}$ | H | $R_{A3}$ | $R_{B4}$ |
| $L_{A1680}$ | $R_{B8}$ | H | $R_{A3}$ | $R_{B7}$ |
| $L_{A1681}$ | $R_{B8}$ | H | $R_{A3}$ | $R_{B10}$ |
| $L_{A1682}$ | $R_{B8}$ | H | $R_{A3}$ | $R_{A34}$ |
| $L_{A1683}$ | $R_{B8}$ | H | $R_{A34}$ | $R_{B1}$ |
| $L_{A1684}$ | $R_{B8}$ | H | $R_{A34}$ | $R_{B3}$ |
| $L_{A1685}$ | $R_{B8}$ | H | $R_{A34}$ | $R_{B4}$ |
| $L_{A1686}$ | $R_{B8}$ | H | $R_{A34}$ | $R_{B7}$ |
| $L_{A1687}$ | $R_{B8}$ | H | $R_{A34}$ | $R_{B10}$ |
| $L_{A1688}$ | $R_{B8}$ | H | $R_{A34}$ | $R_{A3}$, |

$L_{A1819}$ through $L_{A2078}$ that are based on a structure of Formula IX,

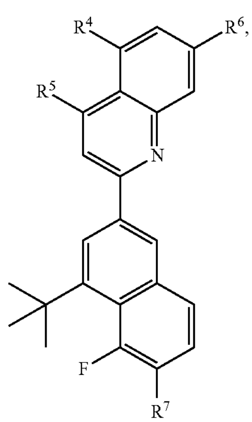

in which $R^4$, $R^5$, $R^6$, and $R^7$ are defined as provided below:

| Ligand | $R^4$ | $R^5$ | $R^6$ | $R^7$ |
|---|---|---|---|---|
| $L_{A1819}$ | H | H | H | H |
| $L_{A1820}$ | $R_{B1}$ | H | H | H |
| $L_{A1821}$ | $R_{B3}$ | H | H | H |
| $L_{A1822}$ | $R_{B4}$ | H | H | H |
| $L_{A1823}$ | $R_{B7}$ | H | H | H |
| $L_{A1824}$ | $R_{B10}$ | H | H | H |
| $L_{A1825}$ | $R_{A3}$ | H | H | H |
| $L_{A1826}$ | $R_{A34}$ | H | H | H |
| $L_{A1827}$ | H | $R_{B1}$ | H | H |
| $L_{A1828}$ | H | $R_{B2}$ | H | H |
| $L_{A1829}$ | H | $R_{B3}$ | H | H |
| $L_{A1830}$ | H | $R_{B4}$ | H | H |
| $L_{A1831}$ | H | $R_{B7}$ | H | H |
| $L_{A1832}$ | H | $R_{B10}$ | H | H |
| $L_{A1833}$ | H | $R_{A3}$ | H | H |
| $L_{A1834}$ | H | $R_{A34}$ | H | H |
| $L_{A1835}$ | $R_{B1}$ | $R_{B1}$ | H | H |
| $L_{A1836}$ | $R_{B3}$ | $R_{B3}$ | H | H |
| $L_{A1837}$ | $R_{B4}$ | $R_{B4}$ | H | H |
| $L_{A1838}$ | $R_{B7}$ | $R_{B7}$ | H | H |
| $L_{A1839}$ | $R_{B10}$ | $R_{B10}$ | H | H |
| $L_{A1840}$ | $R_{A3}$ | $R_{A3}$ | H | H |
| $L_{A1841}$ | $R_{A34}$ | $R_{A34}$ | H | H |
| $L_{A1842}$ | $R_{B1}$ | $R_{B3}$ | H | H |
| $L_{A1843}$ | $R_{B1}$ | $R_{B4}$ | H | H |
| $L_{A1844}$ | $R_{B1}$ | $R_{B7}$ | H | H |
| $L_{A1845}$ | $R_{B1}$ | $R_{B10}$ | H | H |
| $L_{A1846}$ | $R_{B1}$ | $R_{A3}$ | H | H |
| $L_{A1847}$ | $R_{B1}$ | $R_{A34}$ | H | H |
| $L_{A1848}$ | $R_{B3}$ | $R_{B1}$ | H | H |
| $L_{A1849}$ | $R_{B3}$ | $R_{B4}$ | H | H |
| $L_{A1850}$ | $R_{B3}$ | $R_{B7}$ | H | H |
| $L_{A1851}$ | $R_{B3}$ | $R_{B10}$ | H | H |
| $L_{A1852}$ | $R_{B3}$ | $R_{A3}$ | H | H |
| $L_{A1853}$ | $R_{B3}$ | $R_{A34}$ | H | H |
| $L_{A1854}$ | $R_{B4}$ | $R_{B1}$ | H | H |
| $L_{A1855}$ | $R_{B4}$ | $R_{B3}$ | H | H |
| $L_{A1856}$ | $R_{B4}$ | $R_{B7}$ | H | H |
| $L_{A1857}$ | $R_{B4}$ | $R_{B10}$ | H | H |
| $L_{A1858}$ | $R_{B4}$ | $R_{A3}$ | H | H |
| $L_{A1859}$ | $R_{B4}$ | $R_{A34}$ | H | H |
| $L_{A1860}$ | $R_{B7}$ | $R_{B1}$ | H | H |
| $L_{A1861}$ | $R_{B7}$ | $R_{B3}$ | H | H |
| $L_{A1862}$ | $R_{B7}$ | $R_{B4}$ | H | H |
| $L_{A1863}$ | $R_{B7}$ | $R_{B10}$ | H | H |
| $L_{A1864}$ | $R_{B7}$ | $R_{A3}$ | H | H |
| $L_{A1865}$ | $R_{B7}$ | $R_{A34}$ | H | H |
| $L_{A1866}$ | $R_{B10}$ | $R_{B1}$ | H | H |
| $L_{A1867}$ | $R_{B10}$ | $R_{B3}$ | H | H |
| $L_{A1868}$ | $R_{B10}$ | $R_{B4}$ | H | H |
| $L_{A1869}$ | $R_{B10}$ | $R_{B7}$ | H | H |
| $L_{A1870}$ | $R_{B10}$ | $R_{A3}$ | H | H |
| $L_{A1871}$ | $R_{B10}$ | $R_{A34}$ | H | H |
| $L_{A1872}$ | $R_{A3}$ | $R_{B1}$ | H | H |
| $L_{A1873}$ | $R_{A3}$ | $R_{B3}$ | H | H |
| $L_{A1874}$ | $R_{A3}$ | $R_{B4}$ | H | H |
| $L_{A1875}$ | $R_{A3}$ | $R_{B7}$ | H | H |
| $L_{A1876}$ | $R_{A3}$ | $R_{B10}$ | H | H |
| $L_{A1877}$ | $R_{A3}$ | $R_{A34}$ | H | H |
| $L_{A1878}$ | $R_{A34}$ | $R_{B1}$ | H | H |
| $L_{A1879}$ | $R_{A34}$ | $R_{B3}$ | H | H |
| $L_{A1880}$ | $R_{A34}$ | $R_{B4}$ | H | H |
| $L_{A1881}$ | $R_{A34}$ | $R_{B7}$ | H | H |
| $L_{A1882}$ | $R_{A34}$ | $R_{B10}$ | H | H |
| $L_{A1883}$ | $R_{A34}$ | $R_{A3}$ | H | H |
| $L_{A1884}$ | H | H | H | $R_{B1}$ |
| $L_{A1885}$ | $R_{B1}$ | H | H | $R_{B1}$ |
| $L_{A1886}$ | $R_{B3}$ | H | H | $R_{B1}$ |
| $L_{A1887}$ | $R_{B4}$ | H | H | $R_{B1}$ |
| $L_{A1888}$ | $R_{B7}$ | H | H | $R_{B1}$ |
| $L_{A1889}$ | $R_{B10}$ | H | H | $R_{B1}$ |
| $L_{A1890}$ | $R_{A3}$ | H | H | $R_{B1}$ |
| $L_{A1891}$ | $R_{A34}$ | H | H | $R_{B1}$ |
| $L_{A1892}$ | H | $R_{B1}$ | H | $R_{B1}$ |
| $L_{A1893}$ | H | $R_{B2}$ | H | $R_{B1}$ |
| $L_{A1894}$ | H | $R_{B3}$ | H | $R_{B1}$ |
| $L_{A1895}$ | H | $R_{B4}$ | H | $R_{B1}$ |
| $L_{A1896}$ | H | $R_{B7}$ | H | $R_{B1}$ |
| $L_{A1897}$ | H | $R_{B10}$ | H | $R_{B1}$ |
| $L_{A1898}$ | H | $R_{A3}$ | H | $R_{B1}$ |
| $L_{A1899}$ | H | $R_{A34}$ | H | $R_{B1}$ |
| $L_{A1900}$ | $R_{B1}$ | $R_{B1}$ | H | $R_{B1}$ |
| $L_{A1901}$ | $R_{B3}$ | $R_{B3}$ | H | $R_{B1}$ |
| $L_{A1902}$ | $R_{B4}$ | $R_{B4}$ | H | $R_{B1}$ |

-continued

| Ligand | $R^4$ | $R^5$ | $R^6$ | $R^7$ |
|---|---|---|---|---|
| $L_{A1903}$ | $R_{B7}$ | $R_{B7}$ | H | $R_{B1}$ |
| $L_{A1904}$ | $R_{B10}$ | $R_{B10}$ | H | $R_{B1}$ |
| $L_{A1905}$ | $R_{A3}$ | $R_{A3}$ | H | $R_{B1}$ |
| $L_{A1906}$ | $R_{A34}$ | $R_{A34}$ | H | $R_{B1}$ |
| $L_{A1907}$ | $R_{B1}$ | $R_{B3}$ | H | $R_{B1}$ |
| $L_{A1908}$ | $R_{B1}$ | $R_{B4}$ | H | $R_{B1}$ |
| $L_{A1909}$ | $R_{B1}$ | $R_{B7}$ | H | $R_{B1}$ |
| $L_{A1910}$ | $R_{B1}$ | $R_{B10}$ | H | $R_{B1}$ |
| $L_{A1911}$ | $R_{B1}$ | $R_{A3}$ | H | $R_{B1}$ |
| $L_{A1912}$ | $R_{B1}$ | $R_{A34}$ | H | $R_{B1}$ |
| $L_{A1913}$ | $R_{B3}$ | $R_{B1}$ | H | $R_{B1}$ |
| $L_{A1914}$ | $R_{B3}$ | $R_{B4}$ | H | $R_{B1}$ |
| $L_{A1915}$ | $R_{B3}$ | $R_{B7}$ | H | $R_{B1}$ |
| $L_{A1916}$ | $R_{B3}$ | $R_{B10}$ | H | $R_{B1}$ |
| $L_{A1917}$ | $R_{B3}$ | $R_{A3}$ | H | $R_{B1}$ |
| $L_{A1918}$ | $R_{B3}$ | $R_{A34}$ | H | $R_{B1}$ |
| $L_{A1919}$ | $R_{B4}$ | $R_{B1}$ | H | $R_{B1}$ |
| $L_{A1920}$ | $R_{B4}$ | $R_{B3}$ | H | $R_{B1}$ |
| $L_{A1921}$ | $R_{B4}$ | $R_{B7}$ | H | $R_{B1}$ |
| $L_{A1922}$ | $R_{B4}$ | $R_{B10}$ | H | $R_{B1}$ |
| $L_{A1923}$ | $R_{B4}$ | $R_{A3}$ | H | $R_{B1}$ |
| $L_{A1924}$ | $R_{B4}$ | $R_{A34}$ | H | $R_{B1}$ |
| $L_{A1925}$ | $R_{B7}$ | $R_{B1}$ | H | $R_{B1}$ |
| $L_{A1926}$ | $R_{B7}$ | $R_{B3}$ | H | $R_{B1}$ |
| $L_{A1927}$ | $R_{B7}$ | $R_{B4}$ | H | $R_{B1}$ |
| $L_{A1928}$ | $R_{B7}$ | $R_{B10}$ | H | $R_{B1}$ |
| $L_{A1929}$ | $R_{B7}$ | $R_{A3}$ | H | $R_{B1}$ |
| $L_{A1930}$ | $R_{B7}$ | $R_{A34}$ | H | $R_{B1}$ |
| $L_{A1931}$ | $R_{B10}$ | $R_{B1}$ | H | $R_{B1}$ |
| $L_{A1932}$ | $R_{B10}$ | $R_{B3}$ | H | $R_{B1}$ |
| $L_{A1933}$ | $R_{B10}$ | $R_{B4}$ | H | $R_{B1}$ |
| $L_{A1934}$ | $R_{B10}$ | $R_{B7}$ | H | $R_{B1}$ |
| $L_{A1935}$ | $R_{B10}$ | $R_{A3}$ | H | $R_{B1}$ |
| $L_{A1936}$ | $R_{B10}$ | $R_{A34}$ | H | $R_{B1}$ |
| $L_{A1937}$ | $R_{A3}$ | $R_{B1}$ | H | $R_{B1}$ |
| $L_{A1938}$ | $R_{A3}$ | $R_{B3}$ | H | $R_{B1}$ |
| $L_{A1939}$ | $R_{A3}$ | $R_{B4}$ | H | $R_{B1}$ |
| $L_{A1940}$ | $R_{A3}$ | $R_{B7}$ | H | $R_{B1}$ |
| $L_{A1941}$ | $R_{A3}$ | $R_{B10}$ | H | $R_{B1}$ |
| $L_{A1942}$ | $R_{A3}$ | $R_{A34}$ | H | $R_{B1}$ |
| $L_{A1943}$ | $R_{A34}$ | $R_{B1}$ | H | $R_{B1}$ |
| $L_{A1944}$ | $R_{A34}$ | $R_{B3}$ | H | $R_{B1}$ |
| $L_{A1945}$ | $R_{A34}$ | $R_{B4}$ | H | $R_{B1}$ |
| $L_{A1946}$ | $R_{A34}$ | $R_{B7}$ | H | $R_{B1}$ |
| $L_{A1947}$ | $R_{A34}$ | $R_{B10}$ | H | $R_{B1}$ |
| $L_{A1948}$ | $R_{A34}$ | $R_{A3}$ | H | $R_{B1}$ |
| $L_{A1949}$ | H | H | $R_{B1}$ | H |
| $L_{A1950}$ | $R_{B1}$ | H | $R_{B1}$ | H |
| $L_{A1951}$ | $R_{B3}$ | H | $R_{B1}$ | H |
| $L_{A1952}$ | $R_{B4}$ | H | $R_{B1}$ | H |
| $L_{A1953}$ | $R_{B7}$ | H | $R_{B1}$ | H |
| $L_{A1954}$ | $R_{B10}$ | H | $R_{B1}$ | H |
| $L_{A1955}$ | $R_{A3}$ | H | $R_{B1}$ | H |
| $L_{A1956}$ | $R_{A34}$ | H | $R_{B1}$ | H |
| $L_{A1957}$ | H | $R_{B1}$ | $R_{B1}$ | H |
| $L_{A1958}$ | H | $R_{B2}$ | $R_{B1}$ | H |
| $L_{A1959}$ | H | $R_{B3}$ | $R_{B1}$ | H |
| $L_{A1960}$ | H | $R_{B4}$ | $R_{B1}$ | H |
| $L_{A1961}$ | H | $R_{B7}$ | $R_{B1}$ | H |
| $L_{A1962}$ | H | $R_{B10}$ | $R_{B1}$ | H |
| $L_{A1963}$ | H | $R_{A3}$ | $R_{B1}$ | H |
| $L_{A1964}$ | H | $R_{A34}$ | $R_{B1}$ | H |
| $L_{A1965}$ | $R_{B1}$ | $R_{B1}$ | $R_{B1}$ | H |
| $L_{A1966}$ | $R_{B3}$ | $R_{B3}$ | $R_{B1}$ | H |
| $L_{A1967}$ | $R_{B4}$ | $R_{B4}$ | $R_{B1}$ | H |
| $L_{A1968}$ | $R_{B7}$ | $R_{B7}$ | $R_{B1}$ | H |
| $L_{A1969}$ | $R_{B10}$ | $R_{B10}$ | $R_{B1}$ | H |
| $L_{A1970}$ | $R_{A3}$ | $R_{A3}$ | $R_{B1}$ | H |
| $L_{A1971}$ | $R_{A34}$ | $R_{A34}$ | $R_{B1}$ | H |
| $L_{A1972}$ | $R_{B1}$ | $R_{B3}$ | $R_{B1}$ | H |
| $L_{A1973}$ | $R_{B1}$ | $R_{B4}$ | $R_{B1}$ | H |
| $L_{A1974}$ | $R_{B1}$ | $R_{B7}$ | $R_{B1}$ | H |
| $L_{A1975}$ | $R_{B1}$ | $R_{B10}$ | $R_{B1}$ | H |
| $L_{A1976}$ | $R_{B1}$ | $R_{A3}$ | $R_{B1}$ | H |
| $L_{A1977}$ | $R_{B1}$ | $R_{A34}$ | $R_{B1}$ | H |
| $L_{A1978}$ | $R_{B3}$ | $R_{B1}$ | $R_{B1}$ | H |
| $L_{A1979}$ | $R_{B3}$ | $R_{B4}$ | $R_{B1}$ | H |

-continued

| Ligand | $R^4$ | $R^5$ | $R^6$ | $R^7$ |
|---|---|---|---|---|
| $L_{A1980}$ | $R_{B3}$ | $R_{B7}$ | $R_{B1}$ | H |
| $L_{A1981}$ | $R_{B3}$ | $R_{B10}$ | $R_{B1}$ | H |
| $L_{A1982}$ | $R_{B3}$ | $R_{A3}$ | $R_{B1}$ | H |
| $L_{A1983}$ | $R_{B3}$ | $R_{A34}$ | $R_{B1}$ | H |
| $L_{A1984}$ | $R_{B4}$ | $R_{B1}$ | $R_{B1}$ | H |
| $L_{A1985}$ | $R_{B4}$ | $R_{B3}$ | $R_{B1}$ | H |
| $L_{A1986}$ | $R_{B4}$ | $R_{B7}$ | $R_{B1}$ | H |
| $L_{A1987}$ | $R_{B4}$ | $R_{B10}$ | $R_{B1}$ | H |
| $L_{A1988}$ | $R_{B4}$ | $R_{A3}$ | $R_{B1}$ | H |
| $L_{A1989}$ | $R_{B4}$ | $R_{A34}$ | $R_{B1}$ | H |
| $L_{A1990}$ | $R_{B7}$ | $R_{B1}$ | $R_{B1}$ | H |
| $L_{A1991}$ | $R_{B7}$ | $R_{B3}$ | $R_{B1}$ | H |
| $L_{A1992}$ | $R_{B7}$ | $R_{B4}$ | $R_{B1}$ | H |
| $L_{A1993}$ | $R_{B7}$ | $R_{B10}$ | $R_{B1}$ | H |
| $L_{A1994}$ | $R_{B7}$ | $R_{A3}$ | $R_{B1}$ | H |
| $L_{A1995}$ | $R_{B7}$ | $R_{A34}$ | $R_{B1}$ | H |
| $L_{A1996}$ | $R_{B10}$ | $R_{B1}$ | $R_{B1}$ | H |
| $L_{A1997}$ | $R_{B10}$ | $R_{B3}$ | $R_{B1}$ | H |
| $L_{A1998}$ | $R_{B10}$ | $R_{B4}$ | $R_{B1}$ | H |
| $L_{A1999}$ | $R_{B10}$ | $R_{B7}$ | $R_{B1}$ | H |
| $L_{A2000}$ | $R_{B10}$ | $R_{A3}$ | $R_{B1}$ | H |
| $L_{A2001}$ | $R_{B10}$ | $R_{A34}$ | $R_{B1}$ | H |
| $L_{A2002}$ | $R_{A3}$ | $R_{B1}$ | $R_{B1}$ | H |
| $L_{A2003}$ | $R_{A3}$ | $R_{B3}$ | $R_{B1}$ | H |
| $L_{A2004}$ | $R_{A3}$ | $R_{B4}$ | $R_{B1}$ | H |
| $L_{A2005}$ | $R_{A3}$ | $R_{B7}$ | $R_{B1}$ | H |
| $L_{A2006}$ | $R_{A3}$ | $R_{B10}$ | $R_{B1}$ | H |
| $L_{A2007}$ | $R_{A3}$ | $R_{A34}$ | $R_{B1}$ | H |
| $L_{A2008}$ | $R_{A34}$ | $R_{B1}$ | $R_{B1}$ | H |
| $L_{A2009}$ | $R_{A34}$ | $R_{B3}$ | $R_{B1}$ | H |
| $L_{A2010}$ | $R_{A34}$ | $R_{B4}$ | $R_{B1}$ | H |
| $L_{A2011}$ | $R_{A34}$ | $R_{B7}$ | $R_{B1}$ | H |
| $L_{A2012}$ | $R_{A34}$ | $R_{B10}$ | $R_{B1}$ | H |
| $L_{A2013}$ | $R_{A34}$ | $R_{A3}$ | $R_{B1}$ | H |
| $L_{A2014}$ | H | H | $R_{B1}$ | $R_{B1}$ |
| $L_{A2015}$ | $R_{B1}$ | H | $R_{B1}$ | $R_{B1}$ |
| $L_{A2016}$ | $R_{B3}$ | H | $R_{B1}$ | $R_{B1}$ |
| $L_{A2017}$ | $R_{B4}$ | H | $R_{B1}$ | $R_{B1}$ |
| $L_{A2018}$ | $R_{B7}$ | H | $R_{B1}$ | $R_{B1}$ |
| $L_{A2019}$ | $R_{B10}$ | H | $R_{B1}$ | $R_{B1}$ |
| $L_{A2020}$ | $R_{A3}$ | H | $R_{B1}$ | $R_{B1}$ |
| $L_{A2021}$ | $R_{A34}$ | H | $R_{B1}$ | $R_{B1}$ |
| $L_{A2022}$ | H | $R_{B1}$ | $R_{B1}$ | $R_{B1}$ |
| $L_{A2023}$ | H | $R_{B2}$ | $R_{B1}$ | $R_{B1}$ |
| $L_{A2024}$ | H | $R_{B3}$ | $R_{B1}$ | $R_{B1}$ |
| $L_{A2025}$ | H | $R_{B4}$ | $R_{B1}$ | $R_{B1}$ |
| $L_{A2026}$ | H | $R_{B7}$ | $R_{B1}$ | $R_{B1}$ |
| $L_{A2027}$ | H | $R_{B10}$ | $R_{B1}$ | $R_{B1}$ |
| $L_{A2028}$ | H | $R_{A3}$ | $R_{B1}$ | $R_{B1}$ |
| $L_{A2029}$ | H | $R_{A34}$ | $R_{B1}$ | $R_{B1}$ |
| $L_{A2030}$ | $R_{B1}$ | $R_{B1}$ | $R_{B1}$ | $R_{B1}$ |
| $L_{A2031}$ | $R_{B3}$ | $R_{B3}$ | $R_{B1}$ | $R_{B1}$ |
| $L_{A2032}$ | $R_{B4}$ | $R_{B4}$ | $R_{B1}$ | $R_{B1}$ |
| $L_{A2033}$ | $R_{B7}$ | $R_{B7}$ | $R_{B1}$ | $R_{B1}$ |
| $L_{A2034}$ | $R_{B10}$ | $R_{B10}$ | $R_{B1}$ | $R_{B1}$ |
| $L_{A2035}$ | $R_{A3}$ | $R_{A3}$ | $R_{B1}$ | $R_{B1}$ |
| $L_{A2036}$ | $R_{A34}$ | $R_{A34}$ | $R_{B1}$ | $R_{B1}$ |
| $L_{A2037}$ | $R_{B1}$ | $R_{B3}$ | $R_{B1}$ | $R_{B1}$ |
| $L_{A2038}$ | $R_{B1}$ | $R_{B4}$ | $R_{B1}$ | $R_{B1}$ |
| $L_{A2039}$ | $R_{B1}$ | $R_{B7}$ | $R_{B1}$ | $R_{B1}$ |
| $L_{A2040}$ | $R_{B1}$ | $R_{B10}$ | $R_{B1}$ | $R_{B1}$ |
| $L_{A2041}$ | $R_{B1}$ | $R_{A3}$ | $R_{B1}$ | $R_{B1}$ |
| $L_{A2042}$ | $R_{B1}$ | $R_{A34}$ | $R_{B1}$ | $R_{B1}$ |
| $L_{A2043}$ | $R_{B3}$ | $R_{B1}$ | $R_{B1}$ | $R_{B1}$ |
| $L_{A2044}$ | $R_{B3}$ | $R_{B4}$ | $R_{B1}$ | $R_{B1}$ |
| $L_{A2045}$ | $R_{B3}$ | $R_{B7}$ | $R_{B1}$ | $R_{B1}$ |
| $L_{A2046}$ | $R_{B3}$ | $R_{B10}$ | $R_{B1}$ | $R_{B1}$ |
| $L_{A2047}$ | $R_{B3}$ | $R_{A3}$ | $R_{B1}$ | $R_{B1}$ |
| $L_{A2048}$ | $R_{B3}$ | $R_{A34}$ | $R_{B1}$ | $R_{B1}$ |
| $L_{A2049}$ | $R_{B4}$ | $R_{B1}$ | $R_{B1}$ | $R_{B1}$ |
| $L_{A2050}$ | $R_{B4}$ | $R_{B3}$ | $R_{B1}$ | $R_{B1}$ |
| $L_{A2051}$ | $R_{B4}$ | $R_{B7}$ | $R_{B1}$ | $R_{B1}$ |
| $L_{A2052}$ | $R_{B4}$ | $R_{B10}$ | $R_{B1}$ | $R_{B1}$ |
| $L_{A2053}$ | $R_{B4}$ | $R_{A3}$ | $R_{B1}$ | $R_{B1}$ |
| $L_{A2054}$ | $R_{B4}$ | $R_{A34}$ | $R_{B1}$ | $R_{B1}$ |
| $L_{A2055}$ | $R_{B7}$ | $R_{B1}$ | $R_{B1}$ | $R_{B1}$ |
| $L_{A2056}$ | $R_{B7}$ | $R_{B3}$ | $R_{B1}$ | $R_{B1}$ |

-continued

| Ligand | $R^4$ | $R^5$ | $R^6$ | $R^7$ |
|---|---|---|---|---|
| $L_{A2057}$ | $R_{B7}$ | $R_{B4}$ | $R_{B1}$ | $R_{B1}$ |
| $L_{A2058}$ | $R_{B7}$ | $R_{B10}$ | $R_{B1}$ | $R_{B1}$ |
| $L_{A2059}$ | $R_{B7}$ | $R_{A3}$ | $R_{B1}$ | $R_{B1}$ |
| $L_{A2060}$ | $R_{B7}$ | $R_{A34}$ | $R_{B1}$ | $R_{B1}$ |
| $L_{A2061}$ | $R_{B10}$ | $R_{B1}$ | $R_{B1}$ | $R_{B1}$ |
| $L_{A2062}$ | $R_{B10}$ | $R_{B3}$ | $R_{B1}$ | $R_{B1}$ |
| $L_{A2063}$ | $R_{B10}$ | $R_{B4}$ | $R_{B1}$ | $R_{B1}$ |
| $L_{A2064}$ | $R_{B10}$ | $R_{B7}$ | $R_{B1}$ | $R_{B1}$ |
| $L_{A2065}$ | $R_{B10}$ | $R_{A3}$ | $R_{B1}$ | $R_{B1}$ |
| $L_{A2066}$ | $R_{B10}$ | $R_{A34}$ | $R_{B1}$ | $R_{B1}$ |
| $L_{A2067}$ | $R_{A3}$ | $R_{B1}$ | $R_{B1}$ | $R_{B1}$ |
| $L_{A2068}$ | $R_{A3}$ | $R_{B3}$ | $R_{B1}$ | $R_{B1}$ |
| $L_{A2069}$ | $R_{A3}$ | $R_{B4}$ | $R_{B1}$ | $R_{B1}$ |
| $L_{A2070}$ | $R_{A3}$ | $R_{B7}$ | $R_{B1}$ | $R_{B1}$ |
| $L_{A2071}$ | $R_{A3}$ | $R_{B10}$ | $R_{B1}$ | $R_{B1}$ |
| $L_{A2072}$ | $R_{A3}$ | $R_{A34}$ | $R_{B1}$ | $R_{B1}$ |
| $L_{A2073}$ | $R_{A34}$ | $R_{B1}$ | $R_{B1}$ | $R_{B1}$ |
| $L_{A2074}$ | $R_{A34}$ | $R_{B3}$ | $R_{B1}$ | $R_{B1}$ |
| $L_{A2075}$ | $R_{A34}$ | $R_{B4}$ | $R_{B1}$ | $R_{B1}$ |
| $L_{A2076}$ | $R_{A34}$ | $R_{B7}$ | $R_{B1}$ | $R_{B1}$ |
| $L_{A2077}$ | $R_{A34}$ | $R_{B10}$ | $R_{B1}$ | $R_{B1}$ |
| $L_{A2078}$ | $R_{A34}$ | $R_{A3}$ | $R_{B1}$ | $R_{B1}$ |

$L_{A2079}$ through $L_{A2338}$ that are based on a structure of Formula X,

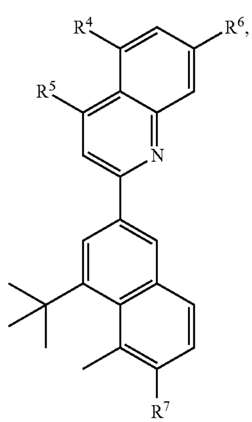

in which $R^4$, $R^5$, $R^6$, and $R^7$ are defined as provided below:

| Ligand | $R^4$ | $R^5$ | $R^6$ | $R^7$ |
|---|---|---|---|---|
| $L_{A2079}$ | H | H | H | H |
| $L_{A2080}$ | $R_{B1}$ | H | H | H |
| $L_{A2081}$ | $R_{B3}$ | H | H | H |
| $L_{A2082}$ | $R_{B4}$ | H | H | H |
| $L_{A2083}$ | $R_{B7}$ | H | H | H |
| $L_{A2084}$ | $R_{B10}$ | H | H | H |
| $L_{A2085}$ | $R_{A3}$ | H | H | H |
| $L_{A2086}$ | $R_{A34}$ | H | H | H |
| $L_{A2087}$ | H | $R_{B1}$ | H | H |
| $L_{A2088}$ | H | $R_{B2}$ | H | H |
| $L_{A2089}$ | H | $R_{B3}$ | H | H |
| $L_{A2090}$ | H | $R_{B4}$ | H | H |
| $L_{A2091}$ | H | $R_{B7}$ | H | H |
| $L_{A2092}$ | H | $R_{B10}$ | H | H |
| $L_{A2093}$ | H | $R_{A3}$ | H | H |
| $L_{A2094}$ | H | $R_{A34}$ | H | H |
| $L_{A2095}$ | $R_{B1}$ | $R_{B1}$ | H | H |
| $L_{A2096}$ | $R_{B3}$ | $R_{B3}$ | H | H |
| $L_{A2097}$ | $R_{B4}$ | $R_{B4}$ | H | H |
| $L_{A2098}$ | $R_{B7}$ | $R_{B7}$ | H | H |
| $L_{A2099}$ | $R_{B10}$ | $R_{B10}$ | H | H |
| $L_{A2100}$ | $R_{A3}$ | $R_{A3}$ | H | H |

-continued

| Ligand | $R^4$ | $R^5$ | $R^6$ | $R^7$ |
|---|---|---|---|---|
| $L_{A2101}$ | $R_{A34}$ | $R_{A34}$ | H | H |
| $L_{A2102}$ | $R_{B1}$ | $R_{B3}$ | H | H |
| $L_{A2103}$ | $R_{B1}$ | $R_{B4}$ | H | H |
| $L_{A2104}$ | $R_{B1}$ | $R_{B7}$ | H | H |
| $L_{A2105}$ | $R_{B1}$ | $R_{B10}$ | H | H |
| $L_{A2106}$ | $R_{B1}$ | $R_{A3}$ | H | H |
| $L_{A2107}$ | $R_{B1}$ | $R_{A34}$ | H | H |
| $L_{A2108}$ | $R_{B3}$ | $R_{B1}$ | H | H |
| $L_{A2109}$ | $R_{B3}$ | $R_{B4}$ | H | H |
| $L_{A2110}$ | $R_{B3}$ | $R_{B7}$ | H | H |
| $L_{A2111}$ | $R_{B3}$ | $R_{B10}$ | H | H |
| $L_{A2112}$ | $R_{B3}$ | $R_{A3}$ | H | H |
| $L_{A2113}$ | $R_{B3}$ | $R_{A34}$ | H | H |
| $L_{A2114}$ | $R_{B4}$ | $R_{B1}$ | H | H |
| $L_{A2115}$ | $R_{B4}$ | $R_{B3}$ | H | H |
| $L_{A2116}$ | $R_{B4}$ | $R_{B7}$ | H | H |
| $L_{A2117}$ | $R_{B4}$ | $R_{B10}$ | H | H |
| $L_{A2118}$ | $R_{B4}$ | $R_{A3}$ | H | H |
| $L_{A2119}$ | $R_{B4}$ | $R_{A34}$ | H | H |
| $L_{A2120}$ | $R_{B7}$ | $R_{B1}$ | H | H |
| $L_{A2121}$ | $R_{B7}$ | $R_{B3}$ | H | H |
| $L_{A2122}$ | $R_{B7}$ | $R_{B4}$ | H | H |
| $L_{A2123}$ | $R_{B7}$ | $R_{B10}$ | H | H |
| $L_{A2124}$ | $R_{B7}$ | $R_{A3}$ | H | H |
| $L_{A2125}$ | $R_{B7}$ | $R_{A34}$ | H | H |
| $L_{A2126}$ | $R_{B10}$ | $R_{B1}$ | H | H |
| $L_{A2127}$ | $R_{B10}$ | $R_{B3}$ | H | H |
| $L_{A2128}$ | $R_{B10}$ | $R_{B4}$ | H | H |
| $L_{A2129}$ | $R_{B10}$ | $R_{B7}$ | H | H |
| $L_{A2130}$ | $R_{B10}$ | $R_{A3}$ | H | H |
| $L_{A2131}$ | $R_{B10}$ | $R_{A34}$ | H | H |
| $L_{A2132}$ | $R_{A3}$ | $R_{B1}$ | H | H |
| $L_{A2133}$ | $R_{A3}$ | $R_{B3}$ | H | H |
| $L_{A2134}$ | $R_{A3}$ | $R_{B4}$ | H | H |
| $L_{A2135}$ | $R_{A3}$ | $R_{B7}$ | H | H |
| $L_{A2136}$ | $R_{A3}$ | $R_{B10}$ | H | H |
| $L_{A2137}$ | $R_{A3}$ | $R_{A34}$ | H | H |
| $L_{A2138}$ | $R_{A34}$ | $R_{B1}$ | H | H |
| $L_{A2139}$ | $R_{A34}$ | $R_{B3}$ | H | H |
| $L_{A2140}$ | $R_{A34}$ | $R_{B4}$ | H | H |
| $L_{A2141}$ | $R_{A34}$ | $R_{B7}$ | H | H |
| $L_{A2142}$ | $R_{A34}$ | $R_{B10}$ | H | H |
| $L_{A2143}$ | $R_{A34}$ | $R_{A3}$ | H | H |
| $L_{A2144}$ | H | H | H | $R_{B1}$ |
| $L_{A2145}$ | $R_{B1}$ | H | H | $R_{B1}$ |
| $L_{A2146}$ | $R_{B3}$ | H | H | $R_{B1}$ |
| $L_{A2147}$ | $R_{B4}$ | H | H | $R_{B1}$ |
| $L_{A2148}$ | $R_{B7}$ | H | H | $R_{B1}$ |
| $L_{A2149}$ | $R_{B10}$ | H | H | $R_{B1}$ |
| $L_{A2150}$ | $R_{A3}$ | H | H | $R_{B1}$ |
| $L_{A2151}$ | $R_{A34}$ | H | H | $R_{B1}$ |
| $L_{A2152}$ | H | $R_{B1}$ | H | $R_{B1}$ |
| $L_{A2153}$ | H | $R_{B2}$ | H | $R_{B1}$ |
| $L_{A2154}$ | H | $R_{B3}$ | H | $R_{B1}$ |
| $L_{A2155}$ | H | $R_{B4}$ | H | $R_{B1}$ |
| $L_{A2156}$ | H | $R_{B7}$ | H | $R_{B1}$ |
| $L_{A2157}$ | H | $R_{B10}$ | H | $R_{B1}$ |
| $L_{A2158}$ | H | $R_{A3}$ | H | $R_{B1}$ |
| $L_{A2159}$ | H | $R_{A34}$ | H | $R_{B1}$ |
| $L_{A2160}$ | $R_{B1}$ | $R_{B1}$ | H | $R_{B1}$ |
| $L_{A2161}$ | $R_{B3}$ | $R_{B3}$ | H | $R_{B1}$ |
| $L_{A2162}$ | $R_{B4}$ | $R_{B4}$ | H | $R_{B1}$ |
| $L_{A2163}$ | $R_{B7}$ | $R_{B7}$ | H | $R_{B1}$ |
| $L_{A2164}$ | $R_{B10}$ | $R_{B10}$ | H | $R_{B1}$ |
| $L_{A2165}$ | $R_{A3}$ | $R_{A3}$ | H | $R_{B1}$ |
| $L_{A2166}$ | $R_{A34}$ | $R_{A34}$ | H | $R_{B1}$ |
| $L_{A2167}$ | $R_{B1}$ | $R_{B3}$ | H | $R_{B1}$ |
| $L_{A2168}$ | $R_{B1}$ | $R_{B4}$ | H | $R_{B1}$ |
| $L_{A2169}$ | $R_{B1}$ | $R_{B7}$ | H | $R_{B1}$ |
| $L_{A2170}$ | $R_{B1}$ | $R_{B10}$ | H | $R_{B1}$ |
| $L_{A2171}$ | $R_{B1}$ | $R_{A3}$ | H | $R_{B1}$ |
| $L_{A2172}$ | $R_{B1}$ | $R_{A34}$ | H | $R_{B1}$ |
| $L_{A2173}$ | $R_{B3}$ | $R_{B1}$ | H | $R_{B1}$ |
| $L_{A2174}$ | $R_{B3}$ | $R_{B4}$ | H | $R_{B1}$ |
| $L_{A2175}$ | $R_{B3}$ | $R_{B7}$ | H | $R_{B1}$ |
| $L_{A2176}$ | $R_{B3}$ | $R_{B10}$ | H | $R_{B1}$ |
| $L_{A2177}$ | $R_{B3}$ | $R_{A3}$ | H | $R_{B1}$ |

-continued

| Ligand | $R^4$ | $R^5$ | $R^6$ | $R^7$ |
|---|---|---|---|---|
| $L_{A2178}$ | $R_{B3}$ | $R_{A34}$ | H | $R_{B1}$ |
| $L_{A2179}$ | $R_{B4}$ | $R_{B1}$ | H | $R_{B1}$ |
| $L_{A2180}$ | $R_{B4}$ | $R_{B3}$ | H | $R_{B1}$ |
| $L_{A2181}$ | $R_{B4}$ | $R_{B7}$ | H | $R_{B1}$ |
| $L_{A2182}$ | $R_{B4}$ | $R_{B10}$ | H | $R_{B1}$ |
| $L_{A2183}$ | $R_{B4}$ | $R_{A3}$ | H | $R_{B1}$ |
| $L_{A2184}$ | $R_{B4}$ | $R_{A34}$ | H | $R_{B1}$ |
| $L_{A2185}$ | $R_{B7}$ | $R_{B1}$ | H | $R_{B1}$ |
| $L_{A2186}$ | $R_{B7}$ | $R_{B3}$ | H | $R_{B1}$ |
| $L_{A2187}$ | $R_{B7}$ | $R_{B4}$ | H | $R_{B1}$ |
| $L_{A2188}$ | $R_{B7}$ | $R_{B10}$ | H | $R_{B1}$ |
| $L_{A2189}$ | $R_{B7}$ | $R_{A3}$ | H | $R_{B1}$ |
| $L_{A2190}$ | $R_{B7}$ | $R_{A34}$ | H | $R_{B1}$ |
| $L_{A2191}$ | $R_{B10}$ | $R_{B1}$ | H | $R_{B1}$ |
| $L_{A2192}$ | $R_{B10}$ | $R_{B3}$ | H | $R_{B1}$ |
| $L_{A2193}$ | $R_{B10}$ | $R_{B4}$ | H | $R_{B1}$ |
| $L_{A2194}$ | $R_{B10}$ | $R_{B7}$ | H | $R_{B1}$ |
| $L_{A2195}$ | $R_{B10}$ | $R_{A3}$ | H | $R_{B1}$ |
| $L_{A2196}$ | $R_{B10}$ | $R_{A34}$ | H | $R_{B1}$ |
| $L_{A2197}$ | $R_{A3}$ | $R_{B1}$ | H | $R_{B1}$ |
| $L_{A2198}$ | $R_{A3}$ | $R_{B3}$ | H | $R_{B1}$ |
| $L_{A2199}$ | $R_{A3}$ | $R_{B4}$ | H | $R_{B1}$ |
| $L_{A2200}$ | $R_{A3}$ | $R_{B7}$ | H | $R_{B1}$ |
| $L_{A2201}$ | $R_{A3}$ | $R_{B10}$ | H | $R_{B1}$ |
| $L_{A2202}$ | $R_{A3}$ | $R_{A34}$ | H | $R_{B1}$ |
| $L_{A2203}$ | $R_{A34}$ | $R_{B1}$ | H | $R_{B1}$ |
| $L_{A2204}$ | $R_{A34}$ | $R_{B3}$ | H | $R_{B1}$ |
| $L_{A2205}$ | $R_{A34}$ | $R_{B4}$ | H | $R_{B1}$ |
| $L_{A2206}$ | $R_{A34}$ | $R_{B7}$ | H | $R_{B1}$ |
| $L_{A2207}$ | $R_{A34}$ | $R_{B10}$ | H | $R_{B1}$ |
| $L_{A2208}$ | $R_{A34}$ | $R_{A3}$ | H | $R_{B1}$ |
| $L_{A2209}$ | H | H | $R_{B1}$ | H |
| $L_{A2210}$ | $R_{B1}$ | H | $R_{B1}$ | H |
| $L_{A2211}$ | $R_{B3}$ | H | $R_{B1}$ | H |
| $L_{A2212}$ | $R_{B4}$ | H | $R_{B1}$ | H |
| $L_{A2213}$ | $R_{B7}$ | H | $R_{B1}$ | H |
| $L_{A2214}$ | $R_{B10}$ | H | $R_{B1}$ | H |
| $L_{A2215}$ | $R_{A3}$ | H | $R_{B1}$ | H |
| $L_{A2216}$ | $R_{A34}$ | H | $R_{B1}$ | H |
| $L_{A2217}$ | H | $R_{B1}$ | $R_{B1}$ | H |
| $L_{A2218}$ | H | $R_{B2}$ | $R_{B1}$ | H |
| $L_{A2219}$ | H | $R_{B3}$ | $R_{B1}$ | H |
| $L_{A2220}$ | H | $R_{B4}$ | $R_{B1}$ | H |
| $L_{A2221}$ | H | $R_{B7}$ | $R_{B1}$ | H |
| $L_{A2222}$ | H | $R_{B10}$ | $R_{B1}$ | H |
| $L_{A2223}$ | H | $R_{A3}$ | $R_{B1}$ | H |
| $L_{A2224}$ | H | $R_{A34}$ | $R_{B1}$ | H |
| $L_{A2225}$ | $R_{B1}$ | $R_{B1}$ | $R_{B1}$ | H |
| $L_{A2226}$ | $R_{B3}$ | $R_{B3}$ | $R_{B1}$ | H |
| $L_{A2227}$ | $R_{B4}$ | $R_{B4}$ | $R_{B1}$ | H |
| $L_{A2228}$ | $R_{B7}$ | $R_{B7}$ | $R_{B1}$ | H |
| $L_{A2229}$ | $R_{B10}$ | $R_{B10}$ | $R_{B1}$ | H |
| $L_{A2230}$ | $R_{A3}$ | $R_{A3}$ | $R_{B1}$ | H |
| $L_{A2231}$ | $R_{A34}$ | $R_{A34}$ | $R_{B1}$ | H |
| $L_{A2232}$ | $R_{B1}$ | $R_{B3}$ | $R_{B1}$ | H |
| $L_{A2233}$ | $R_{B1}$ | $R_{B4}$ | $R_{B1}$ | H |
| $L_{A2234}$ | $R_{B1}$ | $R_{B7}$ | $R_{B1}$ | H |
| $L_{A2235}$ | $R_{B1}$ | $R_{B10}$ | $R_{B1}$ | H |
| $L_{A2236}$ | $R_{B1}$ | $R_{A3}$ | $R_{B1}$ | H |
| $L_{A2237}$ | $R_{B1}$ | $R_{A34}$ | $R_{B1}$ | H |
| $L_{A2238}$ | $R_{B3}$ | $R_{B1}$ | $R_{B1}$ | H |
| $L_{A2239}$ | $R_{B3}$ | $R_{B4}$ | $R_{B1}$ | H |
| $L_{A2240}$ | $R_{B3}$ | $R_{B7}$ | $R_{B1}$ | H |
| $L_{A2241}$ | $R_{B3}$ | $R_{B10}$ | $R_{B1}$ | H |
| $L_{A2242}$ | $R_{B3}$ | $R_{A3}$ | $R_{B1}$ | H |
| $L_{A2243}$ | $R_{B3}$ | $R_{A34}$ | $R_{B1}$ | H |
| $L_{A2244}$ | $R_{B4}$ | $R_{B1}$ | $R_{B1}$ | H |
| $L_{A2245}$ | $R_{B4}$ | $R_{B3}$ | $R_{B1}$ | H |
| $L_{A2246}$ | $R_{B4}$ | $R_{B7}$ | $R_{B1}$ | H |
| $L_{A2247}$ | $R_{B4}$ | $R_{B10}$ | $R_{B1}$ | H |
| $L_{A2248}$ | $R_{B4}$ | $R_{A3}$ | $R_{B1}$ | H |
| $L_{A2249}$ | $R_{B4}$ | $R_{A34}$ | $R_{B1}$ | H |
| $L_{A2250}$ | $R_{B7}$ | $R_{B1}$ | $R_{B1}$ | H |
| $L_{A2251}$ | $R_{B7}$ | $R_{B3}$ | $R_{B1}$ | H |
| $L_{A2252}$ | $R_{B7}$ | $R_{B4}$ | $R_{B1}$ | H |
| $L_{A2253}$ | $R_{B7}$ | $R_{B10}$ | $R_{B1}$ | H |
| $L_{A2254}$ | $R_{B7}$ | $R_{A3}$ | $R_{B1}$ | H |

-continued

| Ligand | $R^4$ | $R^5$ | $R^6$ | $R^7$ |
|---|---|---|---|---|
| $L_{A2255}$ | $R_{B7}$ | $R_{A34}$ | $R_{B1}$ | H |
| $L_{A2256}$ | $R_{B10}$ | $R_{B1}$ | $R_{B1}$ | H |
| $L_{A2257}$ | $R_{B10}$ | $R_{B3}$ | $R_{B1}$ | H |
| $L_{A2258}$ | $R_{B10}$ | $R_{B4}$ | $R_{B1}$ | H |
| $L_{A2259}$ | $R_{B10}$ | $R_{B7}$ | $R_{B1}$ | H |
| $L_{A2260}$ | $R_{B10}$ | $R_{A3}$ | $R_{B1}$ | H |
| $L_{A2261}$ | $R_{B10}$ | $R_{A34}$ | $R_{B1}$ | H |
| $L_{A2262}$ | $R_{A3}$ | $R_{B1}$ | $R_{B1}$ | H |
| $L_{A2263}$ | $R_{A3}$ | $R_{B3}$ | $R_{B1}$ | H |
| $L_{A2264}$ | $R_{A3}$ | $R_{B4}$ | $R_{B1}$ | H |
| $L_{A2265}$ | $R_{A3}$ | $R_{B7}$ | $R_{B1}$ | H |
| $L_{A2266}$ | $R_{A3}$ | $R_{B10}$ | $R_{B1}$ | H |
| $L_{A2267}$ | $R_{A3}$ | $R_{A34}$ | $R_{B1}$ | H |
| $L_{A2268}$ | $R_{A34}$ | $R_{B1}$ | $R_{B1}$ | H |
| $L_{A2269}$ | $R_{A34}$ | $R_{B3}$ | $R_{B1}$ | H |
| $L_{A2270}$ | $R_{A34}$ | $R_{B4}$ | $R_{B1}$ | H |
| $L_{A2271}$ | $R_{A34}$ | $R_{B7}$ | $R_{B1}$ | H |
| $L_{A2272}$ | $R_{A34}$ | $R_{B10}$ | $R_{B1}$ | H |
| $L_{A2273}$ | $R_{A34}$ | $R_{A3}$ | $R_{B1}$ | H |
| $L_{A2274}$ | H | H | $R_{B1}$ | $R_{B1}$ |
| $L_{A2275}$ | $R_{B1}$ | H | $R_{B1}$ | $R_{B1}$ |
| $L_{A2276}$ | $R_{B3}$ | H | $R_{B1}$ | $R_{B1}$ |
| $L_{A2277}$ | $R_{B4}$ | H | $R_{B1}$ | $R_{B1}$ |
| $L_{A2278}$ | $R_{B7}$ | H | $R_{B1}$ | $R_{B1}$ |
| $L_{A2279}$ | $R_{B10}$ | H | $R_{B1}$ | $R_{B1}$ |
| $L_{A2280}$ | $R_{A3}$ | H | $R_{B1}$ | $R_{B1}$ |
| $L_{A2281}$ | $R_{A34}$ | H | $R_{B1}$ | $R_{B1}$ |
| $L_{A2282}$ | H | $R_{B1}$ | $R_{B1}$ | $R_{B1}$ |
| $L_{A2283}$ | H | $R_{B2}$ | $R_{B1}$ | $R_{B1}$ |
| $L_{A2284}$ | H | $R_{B3}$ | $R_{B1}$ | $R_{B1}$ |
| $L_{A2285}$ | H | $R_{B4}$ | $R_{B1}$ | $R_{B1}$ |
| $L_{A2286}$ | H | $R_{B7}$ | $R_{B1}$ | $R_{B1}$ |
| $L_{A2287}$ | H | $R_{B10}$ | $R_{B1}$ | $R_{B1}$ |
| $L_{A2288}$ | H | $R_{A3}$ | $R_{B1}$ | $R_{B1}$ |
| $L_{A2289}$ | H | $R_{A34}$ | $R_{B1}$ | $R_{B1}$ |
| $L_{A2290}$ | $R_{B1}$ | $R_{B1}$ | $R_{B1}$ | $R_{B1}$ |
| $L_{A2291}$ | $R_{B3}$ | $R_{B3}$ | $R_{B1}$ | $R_{B1}$ |
| $L_{A2292}$ | $R_{B4}$ | $R_{B4}$ | $R_{B1}$ | $R_{B1}$ |
| $L_{A2293}$ | $R_{B7}$ | $R_{B7}$ | $R_{B1}$ | $R_{B1}$ |
| $L_{A2294}$ | $R_{B10}$ | $R_{B10}$ | $R_{B1}$ | $R_{B1}$ |
| $L_{A2295}$ | $R_{A3}$ | $R_{A3}$ | $R_{B1}$ | $R_{B1}$ |
| $L_{A2296}$ | $R_{A34}$ | $R_{A34}$ | $R_{B1}$ | $R_{B1}$ |
| $L_{A2297}$ | $R_{B1}$ | $R_{B3}$ | $R_{B1}$ | $R_{B1}$ |
| $L_{A2298}$ | $R_{B1}$ | $R_{B4}$ | $R_{B1}$ | $R_{B1}$ |
| $L_{A2299}$ | $R_{B1}$ | $R_{B7}$ | $R_{B1}$ | $R_{B1}$ |
| $L_{A2300}$ | $R_{B1}$ | $R_{B10}$ | $R_{B1}$ | $R_{B1}$ |
| $L_{A2301}$ | $R_{B1}$ | $R_{A3}$ | $R_{B1}$ | $R_{B1}$ |
| $L_{A2302}$ | $R_{B1}$ | $R_{A34}$ | $R_{B1}$ | $R_{B1}$ |
| $L_{A2303}$ | $R_{B3}$ | $R_{B1}$ | $R_{B1}$ | $R_{B1}$ |
| $L_{A2304}$ | $R_{B3}$ | $R_{B4}$ | $R_{B1}$ | $R_{B1}$ |
| $L_{A2305}$ | $R_{B3}$ | $R_{B7}$ | $R_{B1}$ | $R_{B1}$ |
| $L_{A2306}$ | $R_{B3}$ | $R_{B10}$ | $R_{B1}$ | $R_{B1}$ |
| $L_{A2307}$ | $R_{B3}$ | $R_{A3}$ | $R_{B1}$ | $R_{B1}$ |
| $L_{A2308}$ | $R_{B3}$ | $R_{A34}$ | $R_{B1}$ | $R_{B1}$ |
| $L_{A2309}$ | $R_{B4}$ | $R_{B1}$ | $R_{B1}$ | $R_{B1}$ |
| $L_{A2310}$ | $R_{B4}$ | $R_{B3}$ | $R_{B1}$ | $R_{B1}$ |
| $L_{A2311}$ | $R_{B4}$ | $R_{B7}$ | $R_{B1}$ | $R_{B1}$ |
| $L_{A2312}$ | $R_{B4}$ | $R_{B10}$ | $R_{B1}$ | $R_{B1}$ |
| $L_{A2313}$ | $R_{B4}$ | $R_{A3}$ | $R_{B1}$ | $R_{B1}$ |
| $L_{A2314}$ | $R_{B4}$ | $R_{A34}$ | $R_{B1}$ | $R_{B1}$ |
| $L_{A2315}$ | $R_{B7}$ | $R_{B1}$ | $R_{B1}$ | $R_{B1}$ |
| $L_{A2316}$ | $R_{B7}$ | $R_{B3}$ | $R_{B1}$ | $R_{B1}$ |
| $L_{A2317}$ | $R_{B7}$ | $R_{B4}$ | $R_{B1}$ | $R_{B1}$ |
| $L_{A2318}$ | $R_{B7}$ | $R_{B10}$ | $R_{B1}$ | $R_{B1}$ |
| $L_{A2319}$ | $R_{B7}$ | $R_{A3}$ | $R_{B1}$ | $R_{B1}$ |
| $L_{A2320}$ | $R_{B7}$ | $R_{A34}$ | $R_{B1}$ | $R_{B1}$ |
| $L_{A2321}$ | $R_{B10}$ | $R_{B1}$ | $R_{B1}$ | $R_{B1}$ |
| $L_{A2322}$ | $R_{B10}$ | $R_{B3}$ | $R_{B1}$ | $R_{B1}$ |
| $L_{A2323}$ | $R_{B10}$ | $R_{B4}$ | $R_{B1}$ | $R_{B1}$ |
| $L_{A2324}$ | $R_{B10}$ | $R_{B7}$ | $R_{B1}$ | $R_{B1}$ |
| $L_{A2325}$ | $R_{B10}$ | $R_{A3}$ | $R_{B1}$ | $R_{B1}$ |
| $L_{A2326}$ | $R_{B10}$ | $R_{A34}$ | $R_{B1}$ | $R_{B1}$ |
| $L_{A2327}$ | $R_{A3}$ | $R_{B1}$ | $R_{B1}$ | $R_{B1}$ |
| $L_{A2328}$ | $R_{A3}$ | $R_{B3}$ | $R_{B1}$ | $R_{B1}$ |
| $L_{A2329}$ | $R_{A3}$ | $R_{B4}$ | $R_{B1}$ | $R_{B1}$ |
| $L_{A2330}$ | $R_{A3}$ | $R_{B7}$ | $R_{B1}$ | $R_{B1}$ |
| $L_{A2331}$ | $R_{A3}$ | $R_{B10}$ | $R_{B1}$ | $R_{B1}$ |

-continued

| Ligand | $R^4$ | $R^5$ | $R^6$ | $R^7$ |
|---|---|---|---|---|
| $L_{A2332}$ | $R_{A3}$ | $R_{A34}$ | $R_{B1}$ | $R_{B1}$ |
| $L_{A2333}$ | $R_{A34}$ | $R_{B1}$ | $R_{B1}$ | $R_{B1}$ |
| $L_{A2334}$ | $R_{A34}$ | $R_{B3}$ | $R_{B1}$ | $R_{B1}$ |
| $L_{A2335}$ | $R_{A34}$ | $R_{B4}$ | $R_{B1}$ | $R_{B1}$ |
| $L_{A2336}$ | $R_{A34}$ | $R_{B7}$ | $R_{B1}$ | $R_{B1}$ |
| $L_{A2337}$ | $R_{A34}$ | $R_{B10}$ | $R_{B1}$ | $R_{B1}$ |
| $L_{A2338}$ | $R_{A34}$ | $R_{A3}$ | $R_{B1}$ | $R_{B1}$ |

$L_{A2339}$ through $L_{A2598}$ that are based on a structure of Formula XI,

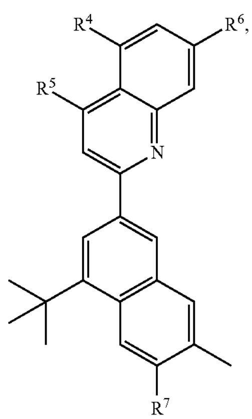

in which $R^4$, $R^5$, $R^6$, and $R^7$ are defined as provided below:

| Ligand | $R^4$ | $R^5$ | $R^6$ | $R^7$ |
|---|---|---|---|---|
| $L_{A2339}$ | H | H | H | H |
| $L_{A2340}$ | $R_{B1}$ | H | H | H |
| $L_{A2341}$ | $R_{B3}$ | H | H | H |
| $L_{A2342}$ | $R_{B4}$ | H | H | H |
| $L_{A2343}$ | $R_{B7}$ | H | H | H |
| $L_{A2344}$ | $R_{B10}$ | H | H | H |
| $L_{A2345}$ | $R_{A3}$ | H | H | H |
| $L_{A2346}$ | $R_{A34}$ | H | H | H |
| $L_{A2347}$ | H | $R_{B1}$ | H | H |
| $L_{A2348}$ | H | $R_{B2}$ | H | H |
| $L_{A2349}$ | H | $R_{B3}$ | H | H |
| $L_{A2350}$ | H | $R_{B4}$ | H | H |
| $L_{A2351}$ | H | $R_{B7}$ | H | H |
| $L_{A2352}$ | H | $R_{B10}$ | H | H |
| $L_{A2353}$ | H | $R_{A3}$ | H | H |
| $L_{A2354}$ | H | $R_{A34}$ | H | H |
| $L_{A2355}$ | $R_{B1}$ | $R_{B1}$ | H | H |
| $L_{A2356}$ | $R_{B3}$ | $R_{B3}$ | H | H |
| $L_{A2357}$ | $R_{B4}$ | $R_{B4}$ | H | H |
| $L_{A2358}$ | $R_{B7}$ | $R_{B7}$ | H | H |
| $L_{A2359}$ | $R_{B10}$ | $R_{B10}$ | H | H |
| $L_{A2360}$ | $R_{A3}$ | $R_{A3}$ | H | H |
| $L_{A2361}$ | $R_{A34}$ | $R_{A34}$ | H | H |
| $L_{A2362}$ | $R_{B1}$ | $R_{B3}$ | H | H |
| $L_{A2363}$ | $R_{B1}$ | $R_{B4}$ | H | H |
| $L_{A2364}$ | $R_{B1}$ | $R_{B7}$ | H | H |
| $L_{A2365}$ | $R_{B1}$ | $R_{B10}$ | H | H |
| $L_{A2366}$ | $R_{B1}$ | $R_{A3}$ | H | H |
| $L_{A2367}$ | $R_{B1}$ | $R_{A34}$ | H | H |
| $L_{A2368}$ | $R_{B3}$ | $R_{B1}$ | H | H |
| $L_{A2369}$ | $R_{B3}$ | $R_{B4}$ | H | H |
| $L_{A2370}$ | $R_{B3}$ | $R_{B7}$ | H | H |
| $L_{A2371}$ | $R_{B3}$ | $R_{B10}$ | H | H |
| $L_{A2372}$ | $R_{B3}$ | $R_{A3}$ | H | H |
| $L_{A2373}$ | $R_{B3}$ | $R_{A34}$ | H | H |
| $L_{A2374}$ | $R_{B4}$ | $R_{B1}$ | H | H |
| $L_{A2375}$ | $R_{B4}$ | $R_{B3}$ | H | H |

-continued

| Ligand | $R^4$ | $R^5$ | $R^6$ | $R^7$ |
|---|---|---|---|---|
| $L_{A2376}$ | $R_{B4}$ | $R_{B7}$ | H | H |
| $L_{A2377}$ | $R_{B4}$ | $R_{B10}$ | H | H |
| $L_{A2378}$ | $R_{B4}$ | $R_{A3}$ | H | H |
| $L_{A2379}$ | $R_{B4}$ | $R_{A34}$ | H | H |
| $L_{A2380}$ | $R_{B7}$ | $R_{B1}$ | H | H |
| $L_{A2381}$ | $R_{B7}$ | $R_{B3}$ | H | H |
| $L_{A2382}$ | $R_{B7}$ | $R_{B4}$ | H | H |
| $L_{A2383}$ | $R_{B7}$ | $R_{B10}$ | H | H |
| $L_{A2384}$ | $R_{B7}$ | $R_{A3}$ | H | H |
| $L_{A2385}$ | $R_{B7}$ | $R_{A34}$ | H | H |
| $L_{A2386}$ | $R_{B10}$ | $R_{B1}$ | H | H |
| $L_{A2387}$ | $R_{B10}$ | $R_{B3}$ | H | H |
| $L_{A2388}$ | $R_{B10}$ | $R_{B4}$ | H | H |
| $L_{A2389}$ | $R_{B10}$ | $R_{B7}$ | H | H |
| $L_{A2390}$ | $R_{B10}$ | $R_{A3}$ | H | H |
| $L_{A2391}$ | $R_{B10}$ | $R_{A34}$ | H | H |
| $L_{A2392}$ | $R_{A3}$ | $R_{B1}$ | H | H |
| $L_{A2393}$ | $R_{A3}$ | $R_{B3}$ | H | H |
| $L_{A2394}$ | $R_{A3}$ | $R_{B4}$ | H | H |
| $L_{A2395}$ | $R_{A3}$ | $R_{B7}$ | H | H |
| $L_{A2396}$ | $R_{A3}$ | $R_{B10}$ | H | H |
| $L_{A2397}$ | $R_{A3}$ | $R_{A34}$ | H | H |
| $L_{A2398}$ | $R_{A34}$ | $R_{B1}$ | H | H |
| $L_{A2399}$ | $R_{A34}$ | $R_{B3}$ | H | H |
| $L_{A2400}$ | $R_{A34}$ | $R_{B4}$ | H | H |
| $L_{A2401}$ | $R_{A34}$ | $R_{B7}$ | H | H |
| $L_{A2402}$ | $R_{A34}$ | $R_{B10}$ | H | H |
| $L_{A2403}$ | $R_{A34}$ | $R_{A3}$ | H | H |
| $L_{A2404}$ | H | H | H | $R_{B1}$ |
| $L_{A2405}$ | $R_{B1}$ | H | H | $R_{B1}$ |
| $L_{A2406}$ | $R_{B3}$ | H | H | $R_{B1}$ |
| $L_{A2407}$ | $R_{B4}$ | H | H | $R_{B1}$ |
| $L_{A2408}$ | $R_{B7}$ | H | H | $R_{B1}$ |
| $L_{A2409}$ | $R_{B10}$ | H | H | $R_{B1}$ |
| $L_{A2410}$ | $R_{A3}$ | H | H | $R_{B1}$ |
| $L_{A2411}$ | $R_{A34}$ | H | H | $R_{B1}$ |
| $L_{A2412}$ | H | $R_{B1}$ | H | $R_{B1}$ |
| $L_{A2413}$ | H | $R_{B2}$ | H | $R_{B1}$ |
| $L_{A2414}$ | H | $R_{B3}$ | H | $R_{B1}$ |
| $L_{A2415}$ | H | $R_{B4}$ | H | $R_{B1}$ |
| $L_{A2416}$ | H | $R_{B7}$ | H | $R_{B1}$ |
| $L_{A2417}$ | H | $R_{B10}$ | H | $R_{B1}$ |
| $L_{A2418}$ | H | $R_{A3}$ | H | $R_{B1}$ |
| $L_{A2419}$ | H | $R_{A34}$ | H | $R_{B1}$ |
| $L_{A2420}$ | $R_{B1}$ | $R_{B1}$ | H | $R_{B1}$ |
| $L_{A2421}$ | $R_{B3}$ | $R_{B3}$ | H | $R_{B1}$ |
| $L_{A2422}$ | $R_{B4}$ | $R_{B4}$ | H | $R_{B1}$ |
| $L_{A2423}$ | $R_{B7}$ | $R_{B7}$ | H | $R_{B1}$ |
| $L_{A2424}$ | $R_{B10}$ | $R_{B10}$ | H | $R_{B1}$ |
| $L_{A2425}$ | $R_{A3}$ | $R_{A3}$ | H | $R_{B1}$ |
| $L_{A2426}$ | $R_{A34}$ | $R_{A34}$ | H | $R_{B1}$ |
| $L_{A2427}$ | $R_{B1}$ | $R_{B3}$ | H | $R_{B1}$ |
| $L_{A2428}$ | $R_{B1}$ | $R_{B4}$ | H | $R_{B1}$ |
| $L_{A2429}$ | $R_{B1}$ | $R_{B7}$ | H | $R_{B1}$ |
| $L_{A2430}$ | $R_{B1}$ | $R_{B10}$ | H | $R_{B1}$ |
| $L_{A2431}$ | $R_{B1}$ | $R_{A3}$ | H | $R_{B1}$ |
| $L_{A2432}$ | $R_{B1}$ | $R_{A34}$ | H | $R_{B1}$ |
| $L_{A2433}$ | $R_{B3}$ | $R_{B1}$ | H | $R_{B1}$ |
| $L_{A2434}$ | $R_{B3}$ | $R_{B4}$ | H | $R_{B1}$ |
| $L_{A2435}$ | $R_{B3}$ | $R_{B7}$ | H | $R_{B1}$ |
| $L_{A2436}$ | $R_{B3}$ | $R_{B10}$ | H | $R_{B1}$ |
| $L_{A2437}$ | $R_{B3}$ | $R_{A3}$ | H | $R_{B1}$ |
| $L_{A2438}$ | $R_{B3}$ | $R_{A34}$ | H | $R_{B1}$ |
| $L_{A2439}$ | $R_{B4}$ | $R_{B1}$ | H | $R_{B1}$ |
| $L_{A2440}$ | $R_{B4}$ | $R_{B3}$ | H | $R_{B1}$ |
| $L_{A2441}$ | $R_{B4}$ | $R_{B7}$ | H | $R_{B1}$ |
| $L_{A2442}$ | $R_{B4}$ | $R_{B10}$ | H | $R_{B1}$ |
| $L_{A2443}$ | $R_{B4}$ | $R_{A3}$ | H | $R_{B1}$ |
| $L_{A2444}$ | $R_{B4}$ | $R_{A34}$ | H | $R_{B1}$ |
| $L_{A2445}$ | $R_{B7}$ | $R_{B1}$ | H | $R_{B1}$ |
| $L_{A2446}$ | $R_{B7}$ | $R_{B3}$ | H | $R_{B1}$ |
| $L_{A2447}$ | $R_{B7}$ | $R_{B4}$ | H | $R_{B1}$ |
| $L_{A2448}$ | $R_{B7}$ | $R_{B10}$ | H | $R_{B1}$ |
| $L_{A2449}$ | $R_{B7}$ | $R_{A3}$ | H | $R_{B1}$ |
| $L_{A2450}$ | $R_{B7}$ | $R_{A34}$ | H | $R_{B1}$ |
| $L_{A2451}$ | $R_{B10}$ | $R_{B1}$ | H | $R_{B1}$ |
| $L_{A2452}$ | $R_{B10}$ | $R_{B3}$ | H | $R_{B1}$ |

-continued

| Ligand | $R^4$ | $R^5$ | $R^6$ | $R^7$ |
|---|---|---|---|---|
| $L_{A2453}$ | $R_{B10}$ | $R_{B4}$ | H | $R_{B1}$ |
| $L_{A2454}$ | $R_{B10}$ | $R_{B7}$ | H | $R_{B1}$ |
| $L_{A2455}$ | $R_{B10}$ | $R_{A3}$ | H | $R_{B1}$ |
| $L_{A2456}$ | $R_{B10}$ | $R_{A34}$ | H | $R_{B1}$ |
| $L_{A2457}$ | $R_{A3}$ | $R_{B1}$ | H | $R_{B1}$ |
| $L_{A2458}$ | $R_{A3}$ | $R_{B3}$ | H | $R_{B1}$ |
| $L_{A2459}$ | $R_{A3}$ | $R_{B4}$ | H | $R_{B1}$ |
| $L_{A2460}$ | $R_{A3}$ | $R_{B7}$ | H | $R_{B1}$ |
| $L_{A2461}$ | $R_{A3}$ | $R_{B10}$ | H | $R_{B1}$ |
| $L_{A2462}$ | $R_{A3}$ | $R_{A34}$ | H | $R_{B1}$ |
| $L_{A2463}$ | $R_{A34}$ | $R_{B1}$ | H | $R_{B1}$ |
| $L_{A2464}$ | $R_{A34}$ | $R_{B3}$ | H | $R_{B1}$ |
| $L_{A2465}$ | $R_{A34}$ | $R_{B4}$ | H | $R_{B1}$ |
| $L_{A2466}$ | $R_{A34}$ | $R_{B7}$ | H | $R_{B1}$ |
| $L_{A2467}$ | $R_{A34}$ | $R_{B10}$ | H | $R_{B1}$ |
| $L_{A2468}$ | $R_{A34}$ | $R_{A3}$ | H | $R_{B1}$ |
| $L_{A2469}$ | H | H | $R_{B1}$ | H |
| $L_{A2470}$ | $R_{B1}$ | H | $R_{B1}$ | H |
| $L_{A2471}$ | $R_{B3}$ | H | $R_{B1}$ | H |
| $L_{A2472}$ | $R_{B4}$ | H | $R_{B1}$ | H |
| $L_{A2473}$ | $R_{B7}$ | H | $R_{B1}$ | H |
| $L_{A2474}$ | $R_{B10}$ | H | $R_{B1}$ | H |
| $L_{A2475}$ | $R_{A3}$ | H | $R_{B1}$ | H |
| $L_{A2476}$ | $R_{A34}$ | H | $R_{B1}$ | H |
| $L_{A2477}$ | H | $R_{B1}$ | $R_{B1}$ | H |
| $L_{A2478}$ | H | $R_{B2}$ | $R_{B1}$ | H |
| $L_{A2479}$ | H | $R_{B3}$ | $R_{B1}$ | H |
| $L_{A2480}$ | H | $R_{B4}$ | $R_{B1}$ | H |
| $L_{A2481}$ | H | $R_{B7}$ | $R_{B1}$ | H |
| $L_{A2482}$ | H | $R_{B10}$ | $R_{B1}$ | H |
| $L_{A2483}$ | H | $R_{A3}$ | $R_{B1}$ | H |
| $L_{A2484}$ | H | $R_{A34}$ | $R_{B1}$ | H |
| $L_{A2485}$ | $R_{B1}$ | $R_{B1}$ | $R_{B1}$ | H |
| $L_{A2486}$ | $R_{B3}$ | $R_{B3}$ | $R_{B1}$ | H |
| $L_{A2487}$ | $R_{B4}$ | $R_{B4}$ | $R_{B1}$ | H |
| $L_{A2488}$ | $R_{B7}$ | $R_{B7}$ | $R_{B1}$ | H |
| $L_{A2489}$ | $R_{B10}$ | $R_{B10}$ | $R_{B1}$ | H |
| $L_{A2490}$ | $R_{A3}$ | $R_{A3}$ | $R_{B1}$ | H |
| $L_{A2491}$ | $R_{A34}$ | $R_{A34}$ | $R_{B1}$ | H |
| $L_{A2492}$ | $R_{B1}$ | $R_{B3}$ | $R_{B1}$ | H |
| $L_{A2493}$ | $R_{B1}$ | $R_{B4}$ | $R_{B1}$ | H |
| $L_{A2494}$ | $R_{B1}$ | $R_{B7}$ | $R_{B1}$ | H |
| $L_{A2495}$ | $R_{B1}$ | $R_{B10}$ | $R_{B1}$ | H |
| $L_{A2496}$ | $R_{B1}$ | $R_{A3}$ | $R_{B1}$ | H |
| $L_{A2497}$ | $R_{B1}$ | $R_{A34}$ | $R_{B1}$ | H |
| $L_{A2498}$ | $R_{B3}$ | $R_{B1}$ | $R_{B1}$ | H |
| $L_{A2499}$ | $R_{B3}$ | $R_{B4}$ | $R_{B1}$ | H |
| $L_{A2500}$ | $R_{B3}$ | $R_{B7}$ | $R_{B1}$ | H |
| $L_{A2501}$ | $R_{B3}$ | $R_{B10}$ | $R_{B1}$ | H |
| $L_{A2502}$ | $R_{B3}$ | $R_{A3}$ | $R_{B1}$ | H |
| $L_{A2503}$ | $R_{B3}$ | $R_{A34}$ | $R_{B1}$ | H |
| $L_{A2504}$ | $R_{B4}$ | $R_{B1}$ | $R_{B1}$ | H |
| $L_{A2505}$ | $R_{B4}$ | $R_{B3}$ | $R_{B1}$ | H |
| $L_{A2506}$ | $R_{B4}$ | $R_{B7}$ | $R_{B1}$ | H |
| $L_{A2507}$ | $R_{B4}$ | $R_{B10}$ | $R_{B1}$ | H |
| $L_{A2508}$ | $R_{B4}$ | $R_{A3}$ | $R_{B1}$ | H |
| $L_{A2509}$ | $R_{B4}$ | $R_{A34}$ | $R_{B1}$ | H |
| $L_{A2510}$ | $R_{B7}$ | $R_{B1}$ | $R_{B1}$ | H |
| $L_{A2511}$ | $R_{B7}$ | $R_{B3}$ | $R_{B1}$ | H |
| $L_{A2512}$ | $R_{B7}$ | $R_{B4}$ | $R_{B1}$ | H |
| $L_{A2513}$ | $R_{B7}$ | $R_{B10}$ | $R_{B1}$ | H |
| $L_{A2514}$ | $R_{B7}$ | $R_{A3}$ | $R_{B1}$ | H |
| $L_{A2515}$ | $R_{B7}$ | $R_{A34}$ | $R_{B1}$ | H |
| $L_{A2516}$ | $R_{B10}$ | $R_{B1}$ | $R_{B1}$ | H |
| $L_{A2517}$ | $R_{B10}$ | $R_{B3}$ | $R_{B1}$ | H |
| $L_{A2518}$ | $R_{B10}$ | $R_{B4}$ | $R_{B1}$ | H |
| $L_{A2519}$ | $R_{B10}$ | $R_{B7}$ | $R_{B1}$ | H |
| $L_{A2520}$ | $R_{B10}$ | $R_{A3}$ | $R_{B1}$ | H |
| $L_{A2521}$ | $R_{B10}$ | $R_{A34}$ | $R_{B1}$ | H |
| $L_{A2522}$ | $R_{A3}$ | $R_{B1}$ | $R_{B1}$ | H |
| $L_{A2523}$ | $R_{A3}$ | $R_{B3}$ | $R_{B1}$ | H |
| $L_{A2524}$ | $R_{A3}$ | $R_{B4}$ | $R_{B1}$ | H |
| $L_{A2525}$ | $R_{A3}$ | $R_{B7}$ | $R_{B1}$ | H |
| $L_{A2526}$ | $R_{A3}$ | $R_{B10}$ | $R_{B1}$ | H |
| $L_{A2527}$ | $R_{A3}$ | $R_{A34}$ | $R_{B1}$ | H |
| $L_{A2528}$ | $R_{A34}$ | $R_{B1}$ | $R_{B1}$ | H |
| $L_{A2529}$ | $R_{A34}$ | $R_{B3}$ | $R_{B1}$ | H |

-continued

| Ligand | $R^4$ | $R^5$ | $R^6$ | $R^7$ |
|---|---|---|---|---|
| $L_{A2530}$ | $R_{A34}$ | $R_{B4}$ | $R_{B1}$ | H |
| $L_{A2531}$ | $R_{A34}$ | $R_{B7}$ | $R_{B1}$ | H |
| $L_{A2532}$ | $R_{A34}$ | $R_{B10}$ | $R_{B1}$ | H |
| $L_{A2533}$ | $R_{A34}$ | $R_{A3}$ | $R_{B1}$ | H |
| $L_{A2534}$ | H | H | $R_{B1}$ | $R_{B1}$ |
| $L_{A2535}$ | $R_{B1}$ | H | $R_{B1}$ | $R_{B1}$ |
| $L_{A2536}$ | $R_{B3}$ | H | $R_{B1}$ | $R_{B1}$ |
| $L_{A2537}$ | $R_{B4}$ | H | $R_{B1}$ | $R_{B1}$ |
| $L_{A2538}$ | $R_{B7}$ | H | $R_{B1}$ | $R_{B1}$ |
| $L_{A2539}$ | $R_{B10}$ | H | $R_{B1}$ | $R_{B1}$ |
| $L_{A2540}$ | $R_{A3}$ | H | $R_{B1}$ | $R_{B1}$ |
| $L_{A2541}$ | $R_{A34}$ | H | $R_{B1}$ | $R_{B1}$ |
| $L_{A2542}$ | H | $R_{B1}$ | $R_{B1}$ | $R_{B1}$ |
| $L_{A2543}$ | H | $R_{B2}$ | $R_{B1}$ | $R_{B1}$ |
| $L_{A2544}$ | H | $R_{B3}$ | $R_{B1}$ | $R_{B1}$ |
| $L_{A2545}$ | H | $R_{B4}$ | $R_{B1}$ | $R_{B1}$ |
| $L_{A2546}$ | H | $R_{B7}$ | $R_{B1}$ | $R_{B1}$ |
| $L_{A2547}$ | H | $R_{B10}$ | $R_{B1}$ | $R_{B1}$ |
| $L_{A2548}$ | H | $R_{A3}$ | $R_{B1}$ | $R_{B1}$ |
| $L_{A2549}$ | H | $R_{A34}$ | $R_{B1}$ | $R_{B1}$ |
| $L_{A2550}$ | $R_{B1}$ | $R_{B1}$ | $R_{B1}$ | $R_{B1}$ |
| $L_{A2551}$ | $R_{B3}$ | $R_{B3}$ | $R_{B1}$ | $R_{B1}$ |
| $L_{A2552}$ | $R_{B4}$ | $R_{B4}$ | $R_{B1}$ | $R_{B1}$ |
| $L_{A2553}$ | $R_{B7}$ | $R_{B7}$ | $R_{B1}$ | $R_{B1}$ |
| $L_{A2554}$ | $R_{B10}$ | $R_{B10}$ | $R_{B1}$ | $R_{B1}$ |
| $L_{A2555}$ | $R_{A3}$ | $R_{A3}$ | $R_{B1}$ | $R_{B1}$ |
| $L_{A2556}$ | $R_{A34}$ | $R_{A34}$ | $R_{B1}$ | $R_{B1}$ |
| $L_{A2557}$ | $R_{B1}$ | $R_{B3}$ | $R_{B1}$ | $R_{B1}$ |
| $L_{A2558}$ | $R_{B1}$ | $R_{B4}$ | $R_{B1}$ | $R_{B1}$ |
| $L_{A2559}$ | $R_{B1}$ | $R_{B7}$ | $R_{B1}$ | $R_{B1}$ |
| $L_{A2560}$ | $R_{B1}$ | $R_{B10}$ | $R_{B1}$ | $R_{B1}$ |
| $L_{A2561}$ | $R_{B1}$ | $R_{A3}$ | $R_{B1}$ | $R_{B1}$ |
| $L_{A2562}$ | $R_{B1}$ | $R_{A34}$ | $R_{B1}$ | $R_{B1}$ |
| $L_{A2563}$ | $R_{B3}$ | $R_{B1}$ | $R_{B1}$ | $R_{B1}$ |
| $L_{A2564}$ | $R_{B3}$ | $R_{B4}$ | $R_{B1}$ | $R_{B1}$ |
| $L_{A2565}$ | $R_{B3}$ | $R_{B7}$ | $R_{B1}$ | $R_{B1}$ |
| $L_{A2566}$ | $R_{B3}$ | $R_{B10}$ | $R_{B1}$ | $R_{B1}$ |
| $L_{A2567}$ | $R_{B3}$ | $R_{A3}$ | $R_{B1}$ | $R_{B1}$ |
| $L_{A2568}$ | $R_{B3}$ | $R_{A34}$ | $R_{B1}$ | $R_{B1}$ |
| $L_{A2569}$ | $R_{B4}$ | $R_{B1}$ | $R_{B1}$ | $R_{B1}$ |
| $L_{A2570}$ | $R_{B4}$ | $R_{B3}$ | $R_{B1}$ | $R_{B1}$ |
| $L_{A2571}$ | $R_{B4}$ | $R_{B7}$ | $R_{B1}$ | $R_{B1}$ |
| $L_{A2572}$ | $R_{B4}$ | $R_{B10}$ | $R_{B1}$ | $R_{B1}$ |
| $L_{A2573}$ | $R_{B4}$ | $R_{A3}$ | $R_{B1}$ | $R_{B1}$ |
| $L_{A2574}$ | $R_{B4}$ | $R_{A34}$ | $R_{B1}$ | $R_{B1}$ |
| $L_{A2575}$ | $R_{B7}$ | $R_{B1}$ | $R_{B1}$ | $R_{B1}$ |
| $L_{A2576}$ | $R_{B7}$ | $R_{B3}$ | $R_{B1}$ | $R_{B1}$ |
| $L_{A2577}$ | $R_{B7}$ | $R_{B4}$ | $R_{B1}$ | $R_{B1}$ |
| $L_{A2578}$ | $R_{B7}$ | $R_{B10}$ | $R_{B1}$ | $R_{B1}$ |
| $L_{A2579}$ | $R_{B7}$ | $R_{A3}$ | $R_{B1}$ | $R_{B1}$ |
| $L_{A2580}$ | $R_{B7}$ | $R_{A34}$ | $R_{B1}$ | $R_{B1}$ |
| $L_{A2581}$ | $R_{B10}$ | $R_{B1}$ | $R_{B1}$ | $R_{B1}$ |
| $L_{A2582}$ | $R_{B10}$ | $R_{B3}$ | $R_{B1}$ | $R_{B1}$ |
| $L_{A2583}$ | $R_{B10}$ | $R_{B4}$ | $R_{B1}$ | $R_{B1}$ |
| $L_{A2584}$ | $R_{B10}$ | $R_{B7}$ | $R_{B1}$ | $R_{B1}$ |
| $L_{A2585}$ | $R_{B10}$ | $R_{A3}$ | $R_{B1}$ | $R_{B1}$ |
| $L_{A2586}$ | $R_{B10}$ | $R_{A34}$ | $R_{B1}$ | $R_{B1}$ |
| $L_{A2587}$ | $R_{A3}$ | $R_{B1}$ | $R_{B1}$ | $R_{B1}$ |
| $L_{A2588}$ | $R_{A3}$ | $R_{B3}$ | $R_{B1}$ | $R_{B1}$ |
| $L_{A2589}$ | $R_{A3}$ | $R_{B4}$ | $R_{B1}$ | $R_{B1}$ |
| $L_{A2590}$ | $R_{A3}$ | $R_{B7}$ | $R_{B1}$ | $R_{B1}$ |
| $L_{A2591}$ | $R_{A3}$ | $R_{B10}$ | $R_{B1}$ | $R_{B1}$ |
| $L_{A2592}$ | $R_{A3}$ | $R_{A34}$ | $R_{B1}$ | $R_{B1}$ |
| $L_{A2593}$ | $R_{A34}$ | $R_{B1}$ | $R_{B1}$ | $R_{B1}$ |
| $L_{A2594}$ | $R_{A34}$ | $R_{B3}$ | $R_{B1}$ | $R_{B1}$ |
| $L_{A2595}$ | $R_{A34}$ | $R_{B4}$ | $R_{B1}$ | $R_{B1}$ |
| $L_{A2596}$ | $R_{A34}$ | $R_{B7}$ | $R_{B1}$ | $R_{B1}$ |
| $L_{A2597}$ | $R_{A34}$ | $R_{B10}$ | $R_{B1}$ | $R_{B1}$ |
| $L_{A2598}$ | $R_{A34}$ | $R_{A3}$ | $R_{B1}$ | $R_{B1}$ |

$L_{A2599}$ through $L_{A2858}$ that are based on a structure of Formula XII,

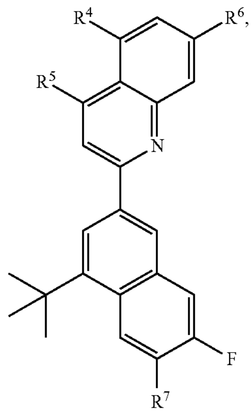

in which $R^4$, $R^5$, $R^6$, and $R^7$ are defined as provided below:

| Ligand | $R^4$ | $R^5$ | $R^6$ | $R^7$ |
|---|---|---|---|---|
| $L_{A2599}$ | H | H | H | H |
| $L_{A2600}$ | $R_{B1}$ | H | H | H |
| $L_{A2601}$ | $R_{B3}$ | H | H | H |
| $L_{A2602}$ | $R_{B4}$ | H | H | H |
| $L_{A2603}$ | $R_{B7}$ | H | H | H |
| $L_{A2604}$ | $R_{B10}$ | H | H | H |
| $L_{A2605}$ | $R_{A3}$ | H | H | H |
| $L_{A2606}$ | $R_{A434}$ | H | H | H |
| $L_{A2607}$ | H | $R_{B1}$ | H | H |
| $L_{A2608}$ | H | $R_{B2}$ | H | H |
| $L_{A2609}$ | H | $R_{B3}$ | H | H |
| $L_{A2610}$ | H | $R_{B4}$ | H | H |
| $L_{A2611}$ | H | $R_{B7}$ | H | H |
| $L_{A2612}$ | H | $R_{B10}$ | H | H |
| $L_{A2613}$ | H | $R_{A3}$ | H | H |
| $L_{A2614}$ | H | $R_{A434}$ | H | H |
| $L_{A2615}$ | $R_{B1}$ | $R_{B1}$ | H | H |
| $L_{A2616}$ | $R_{B3}$ | $R_{B3}$ | H | H |
| $L_{A2617}$ | $R_{B4}$ | $R_{B4}$ | H | H |
| $L_{A2618}$ | $R_{B7}$ | $R_{B7}$ | H | H |
| $L_{A2619}$ | $R_{B10}$ | $R_{B10}$ | H | H |
| $L_{A2620}$ | $R_{A3}$ | $R_{A3}$ | H | H |
| $L_{A2621}$ | $R_{A434}$ | $R_{A434}$ | H | H |
| $L_{A2622}$ | $R_{B1}$ | $R_{B3}$ | H | H |
| $L_{A2623}$ | $R_{B1}$ | $R_{B4}$ | H | H |
| $L_{A2624}$ | $R_{B1}$ | $R_{B7}$ | H | H |
| $L_{A2625}$ | $R_{B1}$ | $R_{B10}$ | H | H |
| $L_{A2626}$ | $R_{B1}$ | $R_{A3}$ | H | H |
| $L_{A2627}$ | $R_{B1}$ | $R_{A434}$ | H | H |
| $L_{A2628}$ | $R_{B3}$ | $R_{B1}$ | H | H |
| $L_{A2629}$ | $R_{B3}$ | $R_{B4}$ | H | H |
| $L_{A2630}$ | $R_{B3}$ | $R_{B7}$ | H | H |
| $L_{A2631}$ | $R_{B3}$ | $R_{B10}$ | H | H |
| $L_{A2632}$ | $R_{B3}$ | $R_{A3}$ | H | H |
| $L_{A2633}$ | $R_{B3}$ | $R_{A434}$ | H | H |
| $L_{A2634}$ | $R_{B4}$ | $R_{B1}$ | H | H |
| $L_{A2635}$ | $R_{B4}$ | $R_{B3}$ | H | H |
| $L_{A2636}$ | $R_{B4}$ | $R_{B7}$ | H | H |
| $L_{A2637}$ | $R_{B4}$ | $R_{B10}$ | H | H |
| $L_{A2638}$ | $R_{B4}$ | $R_{A3}$ | H | H |
| $L_{A2639}$ | $R_{B4}$ | $R_{A434}$ | H | H |
| $L_{A2640}$ | $R_{B7}$ | $R_{B1}$ | H | H |
| $L_{A2641}$ | $R_{B7}$ | $R_{B3}$ | H | H |
| $L_{A2642}$ | $R_{B7}$ | $R_{B4}$ | H | H |
| $L_{A2643}$ | $R_{B7}$ | $R_{B10}$ | H | H |
| $L_{A2644}$ | $R_{B7}$ | $R_{A3}$ | H | H |
| $L_{A2645}$ | $R_{B7}$ | $R_{A434}$ | H | H |
| $L_{A2646}$ | $R_{B10}$ | $R_{B1}$ | H | H |
| $L_{A2647}$ | $R_{B10}$ | $R_{B3}$ | H | H |
| $L_{A2648}$ | $R_{B10}$ | $R_{B4}$ | H | H |
| $L_{A2649}$ | $R_{B10}$ | $R_{B7}$ | H | H |

-continued

| Ligand | $R^4$ | $R^5$ | $R^6$ | $R^7$ |
|---|---|---|---|---|
| $L_{A2650}$ | $R_{B10}$ | $R_{A3}$ | H | H |
| $L_{A2651}$ | $R_{B10}$ | $R_{A434}$ | H | H |
| $L_{A2652}$ | $R_{A3}$ | $R_{B1}$ | H | H |
| $L_{A2653}$ | $R_{A3}$ | $R_{B3}$ | H | H |
| $L_{A2654}$ | $R_{A3}$ | $R_{B4}$ | H | H |
| $L_{A2655}$ | $R_{A3}$ | $R_{B7}$ | H | H |
| $L_{A2656}$ | $R_{A3}$ | $R_{B10}$ | H | H |
| $L_{A2657}$ | $R_{A3}$ | $R_{A434}$ | H | H |
| $L_{A2658}$ | $R_{A434}$ | $R_{B1}$ | H | H |
| $L_{A2659}$ | $R_{A434}$ | $R_{B3}$ | H | H |
| $L_{A2660}$ | $R_{A434}$ | $R_{B4}$ | H | H |
| $L_{A2661}$ | $R_{A434}$ | $R_{B7}$ | H | H |
| $L_{A2662}$ | $R_{A434}$ | $R_{B10}$ | H | H |
| $L_{A2663}$ | $R_{A434}$ | $R_{A3}$ | H | H |
| $L_{A2664}$ | H | H | H | $R_{B1}$ |
| $L_{A2665}$ | $R_{B1}$ | H | H | $R_{B1}$ |
| $L_{A2666}$ | $R_{B3}$ | H | H | $R_{B1}$ |
| $L_{A2667}$ | $R_{B4}$ | H | H | $R_{B1}$ |
| $L_{A2668}$ | $R_{B7}$ | H | H | $R_{B1}$ |
| $L_{A2669}$ | $R_{B10}$ | H | H | $R_{B1}$ |
| $L_{A2670}$ | $R_{A3}$ | H | H | $R_{B1}$ |
| $L_{A2671}$ | $R_{A434}$ | H | H | $R_{B1}$ |
| $L_{A2672}$ | H | $R_{B1}$ | H | $R_{B1}$ |
| $L_{A2673}$ | H | $R_{B2}$ | H | $R_{B1}$ |
| $L_{A2674}$ | H | $R_{B3}$ | H | $R_{B1}$ |
| $L_{A2675}$ | H | $R_{B4}$ | H | $R_{B1}$ |
| $L_{A2676}$ | H | $R_{B7}$ | H | $R_{B1}$ |
| $L_{A2677}$ | H | $R_{B10}$ | H | $R_{B1}$ |
| $L_{A2678}$ | H | $R_{A3}$ | H | $R_{B1}$ |
| $L_{A2679}$ | H | $R_{A434}$ | H | $R_{B1}$ |
| $L_{A2680}$ | $R_{B1}$ | $R_{B1}$ | H | $R_{B1}$ |
| $L_{A2681}$ | $R_{B3}$ | $R_{B3}$ | H | $R_{B1}$ |
| $L_{A2682}$ | $R_{B4}$ | $R_{B4}$ | H | $R_{B1}$ |
| $L_{A2683}$ | $R_{B7}$ | $R_{B7}$ | H | $R_{B1}$ |
| $L_{A2684}$ | $R_{B10}$ | $R_{B10}$ | H | $R_{B1}$ |
| $L_{A2685}$ | $R_{A3}$ | $R_{A3}$ | H | $R_{B1}$ |
| $L_{A2686}$ | $R_{A434}$ | $R_{A434}$ | H | $R_{B1}$ |
| $L_{A2687}$ | $R_{B1}$ | $R_{B3}$ | H | $R_{B1}$ |
| $L_{A2688}$ | $R_{B1}$ | $R_{B4}$ | H | $R_{B1}$ |
| $L_{A2689}$ | $R_{B1}$ | $R_{B7}$ | H | $R_{B1}$ |
| $L_{A2690}$ | $R_{B1}$ | $R_{B10}$ | H | $R_{B1}$ |
| $L_{A2691}$ | $R_{B1}$ | $R_{A3}$ | H | $R_{B1}$ |
| $L_{A2692}$ | $R_{B1}$ | $R_{A434}$ | H | $R_{B1}$ |
| $L_{A2693}$ | $R_{B3}$ | $R_{B1}$ | H | $R_{B1}$ |
| $L_{A2694}$ | $R_{B3}$ | $R_{B4}$ | H | $R_{B1}$ |
| $L_{A2695}$ | $R_{B3}$ | $R_{B7}$ | H | $R_{B1}$ |
| $L_{A2696}$ | $R_{B3}$ | $R_{B10}$ | H | $R_{B1}$ |
| $L_{A2697}$ | $R_{B3}$ | $R_{A3}$ | H | $R_{B1}$ |
| $L_{A2698}$ | $R_{B3}$ | $R_{A434}$ | H | $R_{B1}$ |
| $L_{A2699}$ | $R_{B4}$ | $R_{B1}$ | H | $R_{B1}$ |
| $L_{A2700}$ | $R_{B4}$ | $R_{B3}$ | H | $R_{B1}$ |
| $L_{A2701}$ | $R_{B4}$ | $R_{B7}$ | H | $R_{B1}$ |
| $L_{A2702}$ | $R_{B4}$ | $R_{B10}$ | H | $R_{B1}$ |
| $L_{A2703}$ | $R_{B4}$ | $R_{A3}$ | H | $R_{B1}$ |
| $L_{A2704}$ | $R_{B4}$ | $R_{A434}$ | H | $R_{B1}$ |
| $L_{A2705}$ | $R_{B7}$ | $R_{B1}$ | H | $R_{B1}$ |
| $L_{A2706}$ | $R_{B7}$ | $R_{B3}$ | H | $R_{B1}$ |
| $L_{A2707}$ | $R_{B7}$ | $R_{B4}$ | H | $R_{B1}$ |
| $L_{A2708}$ | $R_{B7}$ | $R_{B10}$ | H | $R_{B1}$ |
| $L_{A2709}$ | $R_{B7}$ | $R_{A3}$ | H | $R_{B1}$ |
| $L_{A2710}$ | $R_{B7}$ | $R_{A434}$ | H | $R_{B1}$ |
| $L_{A2711}$ | $R_{B10}$ | $R_{B1}$ | H | $R_{B1}$ |
| $L_{A2712}$ | $R_{B10}$ | $R_{B3}$ | H | $R_{B1}$ |
| $L_{A2713}$ | $R_{B10}$ | $R_{B4}$ | H | $R_{B1}$ |
| $L_{A2714}$ | $R_{B10}$ | $R_{B7}$ | H | $R_{B1}$ |
| $L_{A2715}$ | $R_{B10}$ | $R_{A3}$ | H | $R_{B1}$ |
| $L_{A2716}$ | $R_{B10}$ | $R_{A434}$ | H | $R_{B1}$ |
| $L_{A2717}$ | $R_{A3}$ | $R_{B1}$ | H | $R_{B1}$ |
| $L_{A2718}$ | $R_{A3}$ | $R_{B3}$ | H | $R_{B1}$ |
| $L_{A2719}$ | $R_{A3}$ | $R_{B4}$ | H | $R_{B1}$ |
| $L_{A2720}$ | $R_{A3}$ | $R_{B7}$ | H | $R_{B1}$ |
| $L_{A2721}$ | $R_{A3}$ | $R_{B10}$ | H | $R_{B1}$ |
| $L_{A2722}$ | $R_{A3}$ | $R_{A434}$ | H | $R_{B1}$ |
| $L_{A2723}$ | $R_{A434}$ | $R_{B1}$ | H | $R_{B1}$ |
| $L_{A2724}$ | $R_{A434}$ | $R_{B3}$ | H | $R_{B1}$ |
| $L_{A2725}$ | $R_{A434}$ | $R_{B4}$ | H | $R_{B1}$ |
| $L_{A2726}$ | $R_{A434}$ | $R_{B7}$ | H | $R_{B1}$ |

-continued

| Ligand | $R^4$ | $R^5$ | $R^6$ | $R^7$ |
|---|---|---|---|---|
| $L_{A2727}$ | $R_{A34}$ | $R_{B10}$ | H | $R_{B1}$ |
| $L_{A2728}$ | $R_{A34}$ | $R_{A3}$ | H | $R_{B1}$ |
| $L_{A2729}$ | H | H | $R_{B1}$ | H |
| $L_{A2730}$ | $R_{B1}$ | H | $R_{B1}$ | H |
| $L_{A2731}$ | $R_{B3}$ | H | $R_{B1}$ | H |
| $L_{A2732}$ | $R_{B4}$ | H | $R_{B1}$ | H |
| $L_{A2733}$ | $R_{B7}$ | H | $R_{B1}$ | H |
| $L_{A2734}$ | $R_{B10}$ | H | $R_{B1}$ | H |
| $L_{A2735}$ | $R_{A3}$ | H | $R_{B1}$ | H |
| $L_{A2736}$ | $R_{A34}$ | H | $R_{B1}$ | H |
| $L_{A2737}$ | H | $R_{B1}$ | $R_{B1}$ | H |
| $L_{A2738}$ | H | $R_{B2}$ | $R_{B1}$ | H |
| $L_{A2739}$ | H | $R_{B3}$ | $R_{B1}$ | H |
| $L_{A2740}$ | H | $R_{B4}$ | $R_{B1}$ | H |
| $L_{A2741}$ | H | $R_{B7}$ | $R_{B1}$ | H |
| $L_{A2742}$ | H | $R_{B10}$ | $R_{B1}$ | H |
| $L_{A2743}$ | H | $R_{A3}$ | $R_{B1}$ | H |
| $L_{A2744}$ | H | $R_{A34}$ | $R_{B1}$ | H |
| $L_{A2745}$ | $R_{B1}$ | $R_{B1}$ | $R_{B1}$ | H |
| $L_{A2746}$ | $R_{B3}$ | $R_{B3}$ | $R_{B1}$ | H |
| $L_{A2747}$ | $R_{B4}$ | $R_{B4}$ | $R_{B1}$ | H |
| $L_{A2748}$ | $R_{B7}$ | $R_{B7}$ | $R_{B1}$ | H |
| $L_{A2749}$ | $R_{B10}$ | $R_{B10}$ | $R_{B1}$ | H |
| $L_{A2750}$ | $R_{A3}$ | $R_{A3}$ | $R_{B1}$ | H |
| $L_{A2751}$ | $R_{A34}$ | $R_{A34}$ | $R_{B1}$ | H |
| $L_{A2752}$ | $R_{B1}$ | $R_{B3}$ | $R_{B1}$ | H |
| $L_{A2753}$ | $R_{B1}$ | $R_{B4}$ | $R_{B1}$ | H |
| $L_{A2754}$ | $R_{B1}$ | $R_{B7}$ | $R_{B1}$ | H |
| $L_{A2755}$ | $R_{B1}$ | $R_{B10}$ | $R_{B1}$ | H |
| $L_{A2756}$ | $R_{B1}$ | $R_{A3}$ | $R_{B1}$ | H |
| $L_{A2757}$ | $R_{B1}$ | $R_{A34}$ | $R_{B1}$ | H |
| $L_{A2758}$ | $R_{B3}$ | $R_{B1}$ | $R_{B1}$ | H |
| $L_{A2759}$ | $R_{B3}$ | $R_{B4}$ | $R_{B1}$ | H |
| $L_{A2760}$ | $R_{B3}$ | $R_{B7}$ | $R_{B1}$ | H |
| $L_{A2761}$ | $R_{B3}$ | $R_{B10}$ | $R_{B1}$ | H |
| $L_{A2762}$ | $R_{B3}$ | $R_{A3}$ | $R_{B1}$ | H |
| $L_{A2763}$ | $R_{B3}$ | $R_{A34}$ | $R_{B1}$ | H |
| $L_{A2764}$ | $R_{B4}$ | $R_{B1}$ | $R_{B1}$ | H |
| $L_{A2765}$ | $R_{B4}$ | $R_{B3}$ | $R_{B1}$ | H |
| $L_{A2766}$ | $R_{B4}$ | $R_{B7}$ | $R_{B1}$ | H |
| $L_{A2767}$ | $R_{B4}$ | $R_{B10}$ | $R_{B1}$ | H |
| $L_{A2768}$ | $R_{B4}$ | $R_{A3}$ | $R_{B1}$ | H |
| $L_{A2769}$ | $R_{B4}$ | $R_{A34}$ | $R_{B1}$ | H |
| $L_{A2770}$ | $R_{B7}$ | $R_{B1}$ | $R_{B1}$ | H |
| $L_{A2771}$ | $R_{B7}$ | $R_{B3}$ | $R_{B1}$ | H |
| $L_{A2772}$ | $R_{B7}$ | $R_{B4}$ | $R_{B1}$ | H |
| $L_{A2773}$ | $R_{B7}$ | $R_{B10}$ | $R_{B1}$ | H |
| $L_{A2774}$ | $R_{B7}$ | $R_{A3}$ | $R_{B1}$ | H |
| $L_{A2775}$ | $R_{B7}$ | $R_{A34}$ | $R_{B1}$ | H |
| $L_{A2776}$ | $R_{B10}$ | $R_{B1}$ | $R_{B1}$ | H |
| $L_{A2777}$ | $R_{B10}$ | $R_{B3}$ | $R_{B1}$ | H |
| $L_{A2778}$ | $R_{B10}$ | $R_{B4}$ | $R_{B1}$ | H |
| $L_{A2779}$ | $R_{B10}$ | $R_{B7}$ | $R_{B1}$ | H |
| $L_{A2780}$ | $R_{B10}$ | $R_{A3}$ | $R_{B1}$ | H |
| $L_{A2781}$ | $R_{B10}$ | $R_{A34}$ | $R_{B1}$ | H |
| $L_{A2782}$ | $R_{A3}$ | $R_{B1}$ | $R_{B1}$ | H |
| $L_{A2783}$ | $R_{A3}$ | $R_{B3}$ | $R_{B1}$ | H |
| $L_{A2784}$ | $R_{A3}$ | $R_{B4}$ | $R_{B1}$ | H |
| $L_{A2785}$ | $R_{A3}$ | $R_{B7}$ | $R_{B1}$ | H |
| $L_{A2786}$ | $R_{A3}$ | $R_{B10}$ | $R_{B1}$ | H |
| $L_{A2787}$ | $R_{A3}$ | $R_{A34}$ | $R_{B1}$ | H |
| $L_{A2788}$ | $R_{A34}$ | $R_{B1}$ | $R_{B1}$ | H |
| $L_{A2789}$ | $R_{A34}$ | $R_{B3}$ | $R_{B1}$ | H |
| $L_{A2790}$ | $R_{A34}$ | $R_{B4}$ | $R_{B1}$ | H |
| $L_{A2791}$ | $R_{A34}$ | $R_{B7}$ | $R_{B1}$ | H |
| $L_{A2792}$ | $R_{A34}$ | $R_{B10}$ | $R_{B1}$ | H |
| $L_{A2793}$ | $R_{A34}$ | $R_{A3}$ | $R_{B1}$ | H |
| $L_{A2794}$ | H | H | $R_{B1}$ | $R_{B1}$ |
| $L_{A2795}$ | $R_{B1}$ | H | $R_{B1}$ | $R_{B1}$ |
| $L_{A2796}$ | $R_{B3}$ | H | $R_{B1}$ | $R_{B1}$ |
| $L_{A2797}$ | $R_{B4}$ | H | $R_{B1}$ | $R_{B1}$ |
| $L_{A2798}$ | $R_{B7}$ | H | $R_{B1}$ | $R_{B1}$ |
| $L_{A2799}$ | $R_{B10}$ | H | $R_{B1}$ | $R_{B1}$ |
| $L_{A2800}$ | $R_{A3}$ | H | $R_{B1}$ | $R_{B1}$ |
| $L_{A2801}$ | $R_{A34}$ | H | $R_{B1}$ | $R_{B1}$ |
| $L_{A2802}$ | H | $R_{B1}$ | $R_{B1}$ | $R_{B1}$ |
| $L_{A2803}$ | H | $R_{B2}$ | $R_{B1}$ | $R_{B1}$ |

-continued

| Ligand | $R^4$ | $R^5$ | $R^6$ | $R^7$ |
|---|---|---|---|---|
| $L_{A2804}$ | H | $R_{B3}$ | $R_{B1}$ | $R_{B1}$ |
| $L_{A2805}$ | H | $R_{B4}$ | $R_{B1}$ | $R_{B1}$ |
| $L_{A2806}$ | H | $R_{B7}$ | $R_{B1}$ | $R_{B1}$ |
| $L_{A2807}$ | H | $R_{B10}$ | $R_{B1}$ | $R_{B1}$ |
| $L_{A2808}$ | H | $R_{A3}$ | $R_{B1}$ | $R_{B1}$ |
| $L_{A2809}$ | H | $R_{A34}$ | $R_{B1}$ | $R_{B1}$ |
| $L_{A2810}$ | $R_{B1}$ | $R_{B1}$ | $R_{B1}$ | $R_{B1}$ |
| $L_{A2811}$ | $R_{B3}$ | $R_{B3}$ | $R_{B1}$ | $R_{B1}$ |
| $L_{A2812}$ | $R_{B4}$ | $R_{B4}$ | $R_{B1}$ | $R_{B1}$ |
| $L_{A2813}$ | $R_{B7}$ | $R_{B7}$ | $R_{B1}$ | $R_{B1}$ |
| $L_{A2814}$ | $R_{B10}$ | $R_{B10}$ | $R_{B1}$ | $R_{B1}$ |
| $L_{A2815}$ | $R_{A3}$ | $R_{A3}$ | $R_{B1}$ | $R_{B1}$ |
| $L_{A2816}$ | $R_{A34}$ | $R_{A34}$ | $R_{B1}$ | $R_{B1}$ |
| $L_{A2817}$ | $R_{B1}$ | $R_{B3}$ | $R_{B1}$ | $R_{B1}$ |
| $L_{A2818}$ | $R_{B1}$ | $R_{B4}$ | $R_{B1}$ | $R_{B1}$ |
| $L_{A2819}$ | $R_{B1}$ | $R_{B7}$ | $R_{B1}$ | $R_{B1}$ |
| $L_{A2820}$ | $R_{B1}$ | $R_{B10}$ | $R_{B1}$ | $R_{B1}$ |
| $L_{A2821}$ | $R_{B1}$ | $R_{A3}$ | $R_{B1}$ | $R_{B1}$ |
| $L_{A2822}$ | $R_{B1}$ | $R_{A34}$ | $R_{B1}$ | $R_{B1}$ |
| $L_{A2823}$ | $R_{B3}$ | $R_{B1}$ | $R_{B1}$ | $R_{B1}$ |
| $L_{A2824}$ | $R_{B3}$ | $R_{B4}$ | $R_{B1}$ | $R_{B1}$ |
| $L_{A2825}$ | $R_{B3}$ | $R_{B7}$ | $R_{B1}$ | $R_{B1}$ |
| $L_{A2826}$ | $R_{B3}$ | $R_{B10}$ | $R_{B1}$ | $R_{B1}$ |
| $L_{A2827}$ | $R_{B3}$ | $R_{A3}$ | $R_{B1}$ | $R_{B1}$ |
| $L_{A2828}$ | $R_{B3}$ | $R_{A34}$ | $R_{B1}$ | $R_{B1}$ |
| $L_{A2829}$ | $R_{B4}$ | $R_{B1}$ | $R_{B1}$ | $R_{B1}$ |
| $L_{A2830}$ | $R_{B4}$ | $R_{B3}$ | $R_{B1}$ | $R_{B1}$ |
| $L_{A2831}$ | $R_{B4}$ | $R_{B7}$ | $R_{B1}$ | $R_{B1}$ |
| $L_{A2832}$ | $R_{B4}$ | $R_{B10}$ | $R_{B1}$ | $R_{B1}$ |
| $L_{A2833}$ | $R_{B4}$ | $R_{A3}$ | $R_{B1}$ | $R_{B1}$ |
| $L_{A2834}$ | $R_{B4}$ | $R_{A34}$ | $R_{B1}$ | $R_{B1}$ |
| $L_{A2835}$ | $R_{B7}$ | $R_{B1}$ | $R_{B1}$ | $R_{B1}$ |
| $L_{A2836}$ | $R_{B7}$ | $R_{B3}$ | $R_{B1}$ | $R_{B1}$ |
| $L_{A2837}$ | $R_{B7}$ | $R_{B4}$ | $R_{B1}$ | $R_{B1}$ |
| $L_{A2838}$ | $R_{B7}$ | $R_{B10}$ | $R_{B1}$ | $R_{B1}$ |
| $L_{A2839}$ | $R_{B7}$ | $R_{A3}$ | $R_{B1}$ | $R_{B1}$ |
| $L_{A2840}$ | $R_{B7}$ | $R_{A34}$ | $R_{B1}$ | $R_{B1}$ |
| $L_{A2841}$ | $R_{B10}$ | $R_{B1}$ | $R_{B1}$ | $R_{B1}$ |
| $L_{A2842}$ | $R_{B10}$ | $R_{B3}$ | $R_{B1}$ | $R_{B1}$ |
| $L_{A2843}$ | $R_{B10}$ | $R_{B4}$ | $R_{B1}$ | $R_{B1}$ |
| $L_{A2844}$ | $R_{B10}$ | $R_{B7}$ | $R_{B1}$ | $R_{B1}$ |
| $L_{A2845}$ | $R_{B10}$ | $R_{A3}$ | $R_{B1}$ | $R_{B1}$ |
| $L_{A2846}$ | $R_{B10}$ | $R_{A34}$ | $R_{B1}$ | $R_{B1}$ |
| $L_{A2847}$ | $R_{A3}$ | $R_{B1}$ | $R_{B1}$ | $R_{B1}$ |
| $L_{A2848}$ | $R_{A3}$ | $R_{B3}$ | $R_{B1}$ | $R_{B1}$ |
| $L_{A2849}$ | $R_{A3}$ | $R_{B4}$ | $R_{B1}$ | $R_{B1}$ |
| $L_{A2850}$ | $R_{A3}$ | $R_{B7}$ | $R_{B1}$ | $R_{B1}$ |
| $L_{A2851}$ | $R_{A3}$ | $R_{B10}$ | $R_{B1}$ | $R_{B1}$ |
| $L_{A2852}$ | $R_{A3}$ | $R_{A34}$ | $R_{B1}$ | $R_{B1}$ |
| $L_{A2853}$ | $R_{A34}$ | $R_{B1}$ | $R_{B1}$ | $R_{B1}$ |
| $L_{A2854}$ | $R_{A34}$ | $R_{B3}$ | $R_{B1}$ | $R_{B1}$ |
| $L_{A2855}$ | $R_{A34}$ | $R_{B4}$ | $R_{B1}$ | $R_{B1}$ |
| $L_{A2856}$ | $R_{A34}$ | $R_{B7}$ | $R_{B1}$ | $R_{B1}$ |
| $L_{A2857}$ | $R_{A34}$ | $R_{B10}$ | $R_{B1}$ | $R_{B1}$ |
| $L_{A2858}$ | $R_{A34}$ | $R_{A3}$ | $R_{B1}$ | $R_{B1}$ |

$L_{A2859}$ through $L_{A3118}$ that are based on a structure of Formula XIII,

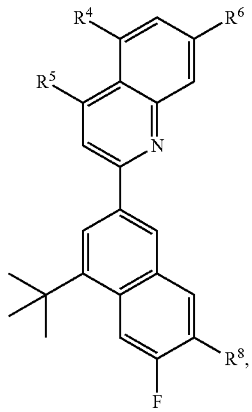

in which $R^4$, $R^5$, $R^6$, and $R^8$ are defined as provided below:

| Ligand | $R^4$ | $R^5$ | $R^6$ | $R^8$ |
|---|---|---|---|---|
| $L_{A2859}$ | H | H | H | H |
| $L_{A2860}$ | $R_{B1}$ | H | H | H |
| $L_{A2861}$ | $R_{B3}$ | H | H | H |
| $L_{A2862}$ | $R_{B4}$ | H | H | H |
| $L_{A2863}$ | $R_{B7}$ | H | H | H |
| $L_{A2864}$ | $R_{B10}$ | H | H | H |
| $L_{A2865}$ | $R_{A3}$ | H | H | H |
| $L_{A2866}$ | $R_{A434}$ | H | H | H |
| $L_{A2867}$ | H | $R_{B1}$ | H | H |
| $L_{A2868}$ | H | $R_{B2}$ | H | H |
| $L_{A2869}$ | H | $R_{B3}$ | H | H |
| $L_{A2870}$ | H | $R_{B4}$ | H | H |
| $L_{A2871}$ | H | $R_{B7}$ | H | H |
| $L_{A2872}$ | H | $R_{B10}$ | H | H |
| $L_{A2873}$ | H | $R_{A3}$ | H | H |
| $L_{A2874}$ | H | $R_{A434}$ | H | H |
| $L_{A2875}$ | $R_{B1}$ | $R_{B1}$ | H | H |
| $L_{A2876}$ | $R_{B3}$ | $R_{B3}$ | H | H |
| $L_{A2877}$ | $R_{B4}$ | $R_{B4}$ | H | H |
| $L_{A2878}$ | $R_{B7}$ | $R_{B7}$ | H | H |
| $L_{A2879}$ | $R_{B10}$ | $R_{B10}$ | H | H |
| $L_{A2880}$ | $R_{A3}$ | $R_{A3}$ | H | H |
| $L_{A2881}$ | $R_{A434}$ | $R_{A434}$ | H | H |
| $L_{A2882}$ | $R_{B1}$ | $R_{B3}$ | H | H |
| $L_{A2883}$ | $R_{B1}$ | $R_{B4}$ | H | H |
| $L_{A2884}$ | $R_{B1}$ | $R_{B7}$ | H | H |
| $L_{A2885}$ | $R_{B1}$ | $R_{B10}$ | H | H |
| $L_{A2886}$ | $R_{B1}$ | $R_{A3}$ | H | H |
| $L_{A2887}$ | $R_{B1}$ | $R_{A434}$ | H | H |
| $L_{A2888}$ | $R_{B3}$ | $R_{B1}$ | H | H |
| $L_{A2889}$ | $R_{B3}$ | $R_{B4}$ | H | H |
| $L_{A2890}$ | $R_{B3}$ | $R_{B7}$ | H | H |
| $L_{A2891}$ | $R_{B3}$ | $R_{B10}$ | H | H |
| $L_{A2892}$ | $R_{B3}$ | $R_{A3}$ | H | H |
| $L_{A2893}$ | $R_{B3}$ | $R_{A434}$ | H | H |
| $L_{A2894}$ | $R_{B4}$ | $R_{B1}$ | H | H |
| $L_{A2895}$ | $R_{B4}$ | $R_{B3}$ | H | H |
| $L_{A2896}$ | $R_{B4}$ | $R_{B7}$ | H | H |
| $L_{A2897}$ | $R_{B4}$ | $R_{B10}$ | H | H |
| $L_{A2898}$ | $R_{B4}$ | $R_{A3}$ | H | H |
| $L_{A2899}$ | $R_{B4}$ | $R_{A434}$ | H | H |
| $L_{A2900}$ | $R_{B7}$ | $R_{B1}$ | H | H |
| $L_{A2901}$ | $R_{B7}$ | $R_{B3}$ | H | H |
| $L_{A2902}$ | $R_{B7}$ | $R_{B4}$ | H | H |
| $L_{A2903}$ | $R_{B7}$ | $R_{B10}$ | H | H |
| $L_{A2904}$ | $R_{B7}$ | $R_{A3}$ | H | H |
| $L_{A2905}$ | $R_{B7}$ | $R_{A434}$ | H | H |
| $L_{A2906}$ | $R_{B10}$ | $R_{B1}$ | H | H |
| $L_{A2907}$ | $R_{B10}$ | $R_{B3}$ | H | H |
| $L_{A2908}$ | $R_{B10}$ | $R_{B4}$ | H | H |
| $L_{A2909}$ | $R_{B10}$ | $R_{B7}$ | H | H |

-continued

| Ligand | $R^4$ | $R^5$ | $R^6$ | $R^8$ |
|---|---|---|---|---|
| $L_{A2910}$ | $R_{B10}$ | $R_{A3}$ | H | H |
| $L_{A2911}$ | $R_{B10}$ | $R_{A434}$ | H | H |
| $L_{A2912}$ | $R_{A3}$ | $R_{B1}$ | H | H |
| $L_{A2913}$ | $R_{A3}$ | $R_{B3}$ | H | H |
| $L_{A2914}$ | $R_{A3}$ | $R_{B4}$ | H | H |
| $L_{A2915}$ | $R_{A3}$ | $R_{B7}$ | H | H |
| $L_{A2916}$ | $R_{A3}$ | $R_{B10}$ | H | H |
| $L_{A2917}$ | $R_{A3}$ | $R_{A434}$ | H | H |
| $L_{A2918}$ | $R_{A434}$ | $R_{B1}$ | H | H |
| $L_{A2919}$ | $R_{A434}$ | $R_{B3}$ | H | H |
| $L_{A2920}$ | $R_{A434}$ | $R_{B4}$ | H | H |
| $L_{A2921}$ | $R_{A434}$ | $R_{B7}$ | H | H |
| $L_{A2922}$ | $R_{A434}$ | $R_{B10}$ | H | H |
| $L_{A2923}$ | $R_{A434}$ | $R_{A3}$ | H | H |
| $L_{A2924}$ | H | H | H | $R_{B1}$ |
| $L_{A2925}$ | $R_{B1}$ | H | H | $R_{B1}$ |
| $L_{A2926}$ | $R_{B3}$ | H | H | $R_{B1}$ |
| $L_{A2927}$ | $R_{B4}$ | H | H | $R_{B1}$ |
| $L_{A2928}$ | $R_{B7}$ | H | H | $R_{B1}$ |
| $L_{A2929}$ | $R_{B10}$ | H | H | $R_{B1}$ |
| $L_{A2930}$ | $R_{A3}$ | H | H | $R_{B1}$ |
| $L_{A2931}$ | $R_{A434}$ | H | H | $R_{B1}$ |
| $L_{A2932}$ | H | $R_{B1}$ | H | $R_{B1}$ |
| $L_{A2933}$ | H | $R_{B2}$ | H | $R_{B1}$ |
| $L_{A2934}$ | H | $R_{B3}$ | H | $R_{B1}$ |
| $L_{A2935}$ | H | $R_{B4}$ | H | $R_{B1}$ |
| $L_{A2936}$ | H | $R_{B7}$ | H | $R_{B1}$ |
| $L_{A2937}$ | H | $R_{B10}$ | H | $R_{B1}$ |
| $L_{A2938}$ | H | $R_{A3}$ | H | $R_{B1}$ |
| $L_{A2939}$ | H | $R_{A434}$ | H | $R_{B1}$ |
| $L_{A2940}$ | $R_{B1}$ | $R_{B1}$ | H | $R_{B1}$ |
| $L_{A2941}$ | $R_{B3}$ | $R_{B3}$ | H | $R_{B1}$ |
| $L_{A2942}$ | $R_{B4}$ | $R_{B4}$ | H | $R_{B1}$ |
| $L_{A2943}$ | $R_{B7}$ | $R_{B7}$ | H | $R_{B1}$ |
| $L_{A2944}$ | $R_{B10}$ | $R_{B10}$ | H | $R_{B1}$ |
| $L_{A2945}$ | $R_{A3}$ | $R_{A3}$ | H | $R_{B1}$ |
| $L_{A2946}$ | $R_{A434}$ | $R_{A434}$ | H | $R_{B1}$ |
| $L_{A2947}$ | $R_{B1}$ | $R_{B3}$ | H | $R_{B1}$ |
| $L_{A2948}$ | $R_{B1}$ | $R_{B4}$ | H | $R_{B1}$ |
| $L_{A2949}$ | $R_{B1}$ | $R_{B7}$ | H | $R_{B1}$ |
| $L_{A2950}$ | $R_{B1}$ | $R_{B10}$ | H | $R_{B1}$ |
| $L_{A2951}$ | $R_{B1}$ | $R_{A3}$ | H | $R_{B1}$ |
| $L_{A2952}$ | $R_{B1}$ | $R_{A434}$ | H | $R_{B1}$ |
| $L_{A2953}$ | $R_{B3}$ | $R_{B1}$ | H | $R_{B1}$ |
| $L_{A2954}$ | $R_{B3}$ | $R_{B4}$ | H | $R_{B1}$ |
| $L_{A2955}$ | $R_{B3}$ | $R_{B7}$ | H | $R_{B1}$ |
| $L_{A2956}$ | $R_{B3}$ | $R_{B10}$ | H | $R_{B1}$ |
| $L_{A2957}$ | $R_{B3}$ | $R_{A3}$ | H | $R_{B1}$ |
| $L_{A2958}$ | $R_{B3}$ | $R_{A434}$ | H | $R_{B1}$ |
| $L_{A2959}$ | $R_{B4}$ | $R_{B1}$ | H | $R_{B1}$ |
| $L_{A2960}$ | $R_{B4}$ | $R_{B3}$ | H | $R_{B1}$ |
| $L_{A2961}$ | $R_{B4}$ | $R_{B7}$ | H | $R_{B1}$ |
| $L_{A2962}$ | $R_{B4}$ | $R_{B10}$ | H | $R_{B1}$ |
| $L_{A2963}$ | $R_{B4}$ | $R_{A3}$ | H | $R_{B1}$ |
| $L_{A2964}$ | $R_{B4}$ | $R_{A434}$ | H | $R_{B1}$ |
| $L_{A2965}$ | $R_{B7}$ | $R_{B1}$ | H | $R_{B1}$ |
| $L_{A2966}$ | $R_{B7}$ | $R_{B3}$ | H | $R_{B1}$ |
| $L_{A2967}$ | $R_{B7}$ | $R_{B4}$ | H | $R_{B1}$ |
| $L_{A2968}$ | $R_{B7}$ | $R_{B10}$ | H | $R_{B1}$ |
| $L_{A2969}$ | $R_{B7}$ | $R_{A3}$ | H | $R_{B1}$ |
| $L_{A2970}$ | $R_{B7}$ | $R_{A434}$ | H | $R_{B1}$ |
| $L_{A2971}$ | $R_{B10}$ | $R_{B1}$ | H | $R_{B1}$ |
| $L_{A2972}$ | $R_{B10}$ | $R_{B3}$ | H | $R_{B1}$ |
| $L_{A2973}$ | $R_{B10}$ | $R_{B4}$ | H | $R_{B1}$ |
| $L_{A2974}$ | $R_{B10}$ | $R_{B7}$ | H | $R_{B1}$ |
| $L_{A2975}$ | $R_{B10}$ | $R_{A3}$ | H | $R_{B1}$ |
| $L_{A2976}$ | $R_{B10}$ | $R_{A434}$ | H | $R_{B1}$ |
| $L_{A2977}$ | $R_{A3}$ | $R_{B1}$ | H | $R_{B1}$ |
| $L_{A2978}$ | $R_{A3}$ | $R_{B3}$ | H | $R_{B1}$ |
| $L_{A2979}$ | $R_{A3}$ | $R_{B4}$ | H | $R_{B1}$ |
| $L_{A2980}$ | $R_{A3}$ | $R_{B7}$ | H | $R_{B1}$ |
| $L_{A2981}$ | $R_{A3}$ | $R_{B10}$ | H | $R_{B1}$ |
| $L_{A2982}$ | $R_{A3}$ | $R_{A434}$ | H | $R_{B1}$ |
| $L_{A2983}$ | $R_{A434}$ | $R_{B1}$ | H | $R_{B1}$ |
| $L_{A2984}$ | $R_{A434}$ | $R_{B3}$ | H | $R_{B1}$ |
| $L_{A2985}$ | $R_{A434}$ | $R_{B4}$ | H | $R_{B1}$ |
| $L_{A2986}$ | $R_{A434}$ | $R_{B7}$ | H | $R_{B1}$ |

-continued

| Ligand | $R^4$ | $R^5$ | $R^6$ | $R^8$ |
|---|---|---|---|---|
| $L_{A2987}$ | $R_{A34}$ | $R_{B10}$ | H | $R_{B1}$ |
| $L_{A2988}$ | $R_{A34}$ | $R_{A3}$ | H | $R_{B1}$ |
| $L_{A2989}$ | H | H | $R_{B1}$ | H |
| $L_{A2990}$ | $R_{B1}$ | H | $R_{B1}$ | H |
| $L_{A2991}$ | $R_{B3}$ | H | $R_{B1}$ | H |
| $L_{A2992}$ | $R_{B4}$ | H | $R_{B1}$ | H |
| $L_{A2993}$ | $R_{B7}$ | H | $R_{B1}$ | H |
| $L_{A2994}$ | $R_{B10}$ | H | $R_{B1}$ | H |
| $L_{A2995}$ | $R_{A3}$ | H | $R_{B1}$ | H |
| $L_{A2996}$ | $R_{A34}$ | H | $R_{B1}$ | H |
| $L_{A2997}$ | H | $R_{B1}$ | $R_{B1}$ | H |
| $L_{A2998}$ | H | $R_{B2}$ | $R_{B1}$ | H |
| $L_{A2999}$ | H | $R_{B3}$ | $R_{B1}$ | H |
| $L_{A3000}$ | H | $R_{B4}$ | $R_{B1}$ | H |
| $L_{A3001}$ | H | $R_{B7}$ | $R_{B1}$ | H |
| $L_{A3002}$ | H | $R_{B10}$ | $R_{B1}$ | H |
| $L_{A3003}$ | H | $R_{A3}$ | $R_{B1}$ | H |
| $L_{A3004}$ | H | $R_{A34}$ | $R_{B1}$ | H |
| $L_{A3005}$ | $R_{B1}$ | $R_{B1}$ | $R_{B1}$ | H |
| $L_{A3006}$ | $R_{B3}$ | $R_{B3}$ | $R_{B1}$ | H |
| $L_{A3007}$ | $R_{B4}$ | $R_{B4}$ | $R_{B1}$ | H |
| $L_{A3008}$ | $R_{B7}$ | $R_{B7}$ | $R_{B1}$ | H |
| $L_{A3009}$ | $R_{B10}$ | $R_{B10}$ | $R_{B1}$ | H |
| $L_{A3010}$ | $R_{A3}$ | $R_{A3}$ | $R_{B1}$ | H |
| $L_{A3011}$ | $R_{A34}$ | $R_{A34}$ | $R_{B1}$ | H |
| $L_{A3012}$ | $R_{B1}$ | $R_{B3}$ | $R_{B1}$ | H |
| $L_{A3013}$ | $R_{B1}$ | $R_{B4}$ | $R_{B1}$ | H |
| $L_{A3014}$ | $R_{B1}$ | $R_{B7}$ | $R_{B1}$ | H |
| $L_{A3015}$ | $R_{B1}$ | $R_{B10}$ | $R_{B1}$ | H |
| $L_{A3016}$ | $R_{B1}$ | $R_{A3}$ | $R_{B1}$ | H |
| $L_{A3017}$ | $R_{B1}$ | $R_{A34}$ | $R_{B1}$ | H |
| $L_{A3018}$ | $R_{B3}$ | $R_{B1}$ | $R_{B1}$ | H |
| $L_{A3019}$ | $R_{B3}$ | $R_{B4}$ | $R_{B1}$ | H |
| $L_{A3020}$ | $R_{B3}$ | $R_{B7}$ | $R_{B1}$ | H |
| $L_{A3021}$ | $R_{B3}$ | $R_{B10}$ | $R_{B1}$ | H |
| $L_{A3022}$ | $R_{B3}$ | $R_{A3}$ | $R_{B1}$ | H |
| $L_{A3023}$ | $R_{B3}$ | $R_{A34}$ | $R_{B1}$ | H |
| $L_{A3024}$ | $R_{B4}$ | $R_{B1}$ | $R_{B1}$ | H |
| $L_{A3025}$ | $R_{B4}$ | $R_{B3}$ | $R_{B1}$ | H |
| $L_{A3026}$ | $R_{B4}$ | $R_{B7}$ | $R_{B1}$ | H |
| $L_{A3027}$ | $R_{B4}$ | $R_{B10}$ | $R_{B1}$ | H |
| $L_{A3028}$ | $R_{B4}$ | $R_{A3}$ | $R_{B1}$ | H |
| $L_{A3029}$ | $R_{B4}$ | $R_{A34}$ | $R_{B1}$ | H |
| $L_{A3030}$ | $R_{B7}$ | $R_{B1}$ | $R_{B1}$ | H |
| $L_{A3031}$ | $R_{B7}$ | $R_{B3}$ | $R_{B1}$ | H |
| $L_{A3032}$ | $R_{B7}$ | $R_{B4}$ | $R_{B1}$ | H |
| $L_{A3033}$ | $R_{B7}$ | $R_{B10}$ | $R_{B1}$ | H |
| $L_{A3034}$ | $R_{B7}$ | $R_{A3}$ | $R_{B1}$ | H |
| $L_{A3035}$ | $R_{B7}$ | $R_{A34}$ | $R_{B1}$ | H |
| $L_{A3036}$ | $R_{B10}$ | $R_{B1}$ | $R_{B1}$ | H |
| $L_{A3037}$ | $R_{B10}$ | $R_{B3}$ | $R_{B1}$ | H |
| $L_{A3038}$ | $R_{B10}$ | $R_{B4}$ | $R_{B1}$ | H |
| $L_{A3039}$ | $R_{B10}$ | $R_{B7}$ | $R_{B1}$ | H |
| $L_{A3040}$ | $R_{B10}$ | $R_{A3}$ | $R_{B1}$ | H |
| $L_{A3041}$ | $R_{B10}$ | $R_{A34}$ | $R_{B1}$ | H |
| $L_{A3042}$ | $R_{A3}$ | $R_{B1}$ | $R_{B1}$ | H |
| $L_{A3043}$ | $R_{A3}$ | $R_{B3}$ | $R_{B1}$ | H |
| $L_{A3044}$ | $R_{A3}$ | $R_{B4}$ | $R_{B1}$ | H |
| $L_{A3045}$ | $R_{A3}$ | $R_{B7}$ | $R_{B1}$ | H |
| $L_{A3046}$ | $R_{A3}$ | $R_{B10}$ | $R_{B1}$ | H |
| $L_{A3047}$ | $R_{A3}$ | $R_{A34}$ | $R_{B1}$ | H |
| $L_{A3048}$ | $R_{A34}$ | $R_{B1}$ | $R_{B1}$ | H |
| $L_{A3049}$ | $R_{A34}$ | $R_{B3}$ | $R_{B1}$ | H |
| $L_{A3050}$ | $R_{A34}$ | $R_{B4}$ | $R_{B1}$ | H |
| $L_{A3051}$ | $R_{A34}$ | $R_{B7}$ | $R_{B1}$ | H |
| $L_{A3052}$ | $R_{A34}$ | $R_{B10}$ | $R_{B1}$ | H |
| $L_{A3053}$ | $R_{A34}$ | $R_{A3}$ | $R_{B1}$ | H |
| $L_{A3054}$ | H | H | $R_{B1}$ | $R_{B1}$ |
| $L_{A3055}$ | $R_{B1}$ | H | $R_{B1}$ | $R_{B1}$ |
| $L_{A3056}$ | $R_{B3}$ | H | $R_{B1}$ | $R_{B1}$ |
| $L_{A3057}$ | $R_{B4}$ | H | $R_{B1}$ | $R_{B1}$ |
| $L_{A3058}$ | $R_{B7}$ | H | $R_{B1}$ | $R_{B1}$ |
| $L_{A3059}$ | $R_{B10}$ | H | $R_{B1}$ | $R_{B1}$ |
| $L_{A3060}$ | $R_{A3}$ | H | $R_{B1}$ | $R_{B1}$ |
| $L_{A3061}$ | $R_{A34}$ | H | $R_{B1}$ | $R_{B1}$ |
| $L_{A3062}$ | H | $R_{B1}$ | $R_{B1}$ | $R_{B1}$ |
| $L_{A3063}$ | H | $R_{B2}$ | $R_{B1}$ | $R_{B1}$ |

-continued

| Ligand | $R^4$ | $R^5$ | $R^6$ | $R^8$ |
|---|---|---|---|---|
| $L_{A3064}$ | H | $R_{B3}$ | $R_{B1}$ | $R_{B1}$ |
| $L_{A3065}$ | H | $R_{B4}$ | $R_{B1}$ | $R_{B1}$ |
| $L_{A3066}$ | H | $R_{B7}$ | $R_{B1}$ | $R_{B1}$ |
| $L_{A3067}$ | H | $R_{B10}$ | $R_{B1}$ | $R_{B1}$ |
| $L_{A3068}$ | H | $R_{A3}$ | $R_{B1}$ | $R_{B1}$ |
| $L_{A3069}$ | H | $R_{A34}$ | $R_{B1}$ | $R_{B1}$ |
| $L_{A3070}$ | $R_{B1}$ | $R_{B1}$ | $R_{B1}$ | $R_{B1}$ |
| $L_{A3071}$ | $R_{B3}$ | $R_{B3}$ | $R_{B1}$ | $R_{B1}$ |
| $L_{A3072}$ | $R_{B4}$ | $R_{B4}$ | $R_{B1}$ | $R_{B1}$ |
| $L_{A3073}$ | $R_{B7}$ | $R_{B7}$ | $R_{B1}$ | $R_{B1}$ |
| $L_{A3074}$ | $R_{B10}$ | $R_{B10}$ | $R_{B1}$ | $R_{B1}$ |
| $L_{A3075}$ | $R_{A3}$ | $R_{A3}$ | $R_{B1}$ | $R_{B1}$ |
| $L_{A3076}$ | $R_{A34}$ | $R_{A34}$ | $R_{B1}$ | $R_{B1}$ |
| $L_{A3077}$ | $R_{B1}$ | $R_{B3}$ | $R_{B1}$ | $R_{B1}$ |
| $L_{A3078}$ | $R_{B1}$ | $R_{B4}$ | $R_{B1}$ | $R_{B1}$ |
| $L_{A3079}$ | $R_{B1}$ | $R_{B7}$ | $R_{B1}$ | $R_{B1}$ |
| $L_{A3080}$ | $R_{B1}$ | $R_{B10}$ | $R_{B1}$ | $R_{B1}$ |
| $L_{A3081}$ | $R_{B1}$ | $R_{A3}$ | $R_{B1}$ | $R_{B1}$ |
| $L_{A3082}$ | $R_{B1}$ | $R_{A34}$ | $R_{B1}$ | $R_{B1}$ |
| $L_{A3083}$ | $R_{B3}$ | $R_{B1}$ | $R_{B1}$ | $R_{B1}$ |
| $L_{A3084}$ | $R_{B3}$ | $R_{B4}$ | $R_{B1}$ | $R_{B1}$ |
| $L_{A3085}$ | $R_{B3}$ | $R_{B7}$ | $R_{B1}$ | $R_{B1}$ |
| $L_{A3086}$ | $R_{B3}$ | $R_{B10}$ | $R_{B1}$ | $R_{B1}$ |
| $L_{A3087}$ | $R_{B3}$ | $R_{A3}$ | $R_{B1}$ | $R_{B1}$ |
| $L_{A3088}$ | $R_{B3}$ | $R_{A34}$ | $R_{B1}$ | $R_{B1}$ |
| $L_{A3089}$ | $R_{B4}$ | $R_{B1}$ | $R_{B1}$ | $R_{B1}$ |
| $L_{A3090}$ | $R_{B4}$ | $R_{B3}$ | $R_{B1}$ | $R_{B1}$ |
| $L_{A3091}$ | $R_{B4}$ | $R_{B7}$ | $R_{B1}$ | $R_{B1}$ |
| $L_{A3092}$ | $R_{B4}$ | $R_{B10}$ | $R_{B1}$ | $R_{B1}$ |
| $L_{A3093}$ | $R_{B4}$ | $R_{A3}$ | $R_{B1}$ | $R_{B1}$ |
| $L_{A3094}$ | $R_{B4}$ | $R_{A34}$ | $R_{B1}$ | $R_{B1}$ |
| $L_{A3095}$ | $R_{B7}$ | $R_{B1}$ | $R_{B1}$ | $R_{B1}$ |
| $L_{A3096}$ | $R_{B7}$ | $R_{B3}$ | $R_{B1}$ | $R_{B1}$ |
| $L_{A3097}$ | $R_{B7}$ | $R_{B4}$ | $R_{B1}$ | $R_{B1}$ |
| $L_{A3098}$ | $R_{B7}$ | $R_{B10}$ | $R_{B1}$ | $R_{B1}$ |
| $L_{A3099}$ | $R_{B7}$ | $R_{A3}$ | $R_{B1}$ | $R_{B1}$ |
| $L_{A3100}$ | $R_{B7}$ | $R_{A34}$ | $R_{B1}$ | $R_{B1}$ |
| $L_{A3101}$ | $R_{B10}$ | $R_{B1}$ | $R_{B1}$ | $R_{B1}$ |
| $L_{A3102}$ | $R_{B10}$ | $R_{B3}$ | $R_{B1}$ | $R_{B1}$ |
| $L_{A3103}$ | $R_{B10}$ | $R_{B4}$ | $R_{B1}$ | $R_{B1}$ |
| $L_{A3104}$ | $R_{B10}$ | $R_{B7}$ | $R_{B1}$ | $R_{B1}$ |
| $L_{A3105}$ | $R_{B10}$ | $R_{A3}$ | $R_{B1}$ | $R_{B1}$ |
| $L_{A3106}$ | $R_{B10}$ | $R_{A34}$ | $R_{B1}$ | $R_{B1}$ |
| $L_{A3107}$ | $R_{A3}$ | $R_{B1}$ | $R_{B1}$ | $R_{B1}$ |
| $L_{A3108}$ | $R_{A3}$ | $R_{B3}$ | $R_{B1}$ | $R_{B1}$ |
| $L_{A3109}$ | $R_{A3}$ | $R_{B4}$ | $R_{B1}$ | $R_{B1}$ |
| $L_{A3110}$ | $R_{A3}$ | $R_{B7}$ | $R_{B1}$ | $R_{B1}$ |
| $L_{A3111}$ | $R_{A3}$ | $R_{B10}$ | $R_{B1}$ | $R_{B1}$ |
| $L_{A3112}$ | $R_{A3}$ | $R_{A34}$ | $R_{B1}$ | $R_{B1}$ |
| $L_{A3113}$ | $R_{A34}$ | $R_{B1}$ | $R_{B1}$ | $R_{B1}$ |
| $L_{A3114}$ | $R_{A34}$ | $R_{B3}$ | $R_{B1}$ | $R_{B1}$ |
| $L_{A3115}$ | $R_{A34}$ | $R_{B4}$ | $R_{B1}$ | $R_{B1}$ |
| $L_{A3116}$ | $R_{A34}$ | $R_{B7}$ | $R_{B1}$ | $R_{B1}$ |
| $L_{A3117}$ | $R_{A34}$ | $R_{B10}$ | $R_{B1}$ | $R_{B1}$ |
| $L_{A3118}$ | $R_{A34}$ | $R_{A3}$ | $R_{B1}$ | $R_{B1}$ |

$L_{A3119}$ through $L_{A3378}$ that are based on a structure of Formula XIV,

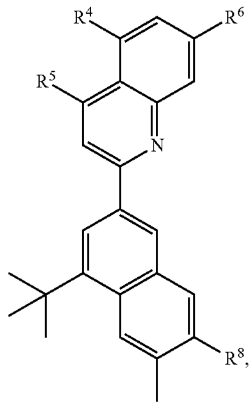

in which $R^4$, $R^5$, $R^6$, and $R^8$ are defined as provided below:

| Ligand | $R^4$ | $R^5$ | $R^6$ | $R^8$ |
|---|---|---|---|---|
| $L_{A3119}$ | H | H | H | H |
| $L_{A3120}$ | $R_{B1}$ | H | H | H |
| $L_{A3121}$ | $R_{B3}$ | H | H | H |
| $L_{A3122}$ | $R_{B4}$ | H | H | H |
| $L_{A3123}$ | $R_{B7}$ | H | H | H |
| $L_{A3124}$ | $R_{B10}$ | H | H | H |
| $L_{A3125}$ | $R_{A3}$ | H | H | H |
| $L_{A3126}$ | $R_{A34}$ | H | H | H |
| $L_{A3127}$ | H | $R_{B1}$ | H | H |
| $L_{A3128}$ | H | $R_{B2}$ | H | H |
| $L_{A3129}$ | H | $R_{B3}$ | H | H |
| $L_{A3130}$ | H | $R_{B4}$ | H | H |
| $L_{A3131}$ | H | $R_{B7}$ | H | H |
| $L_{A3132}$ | H | $R_{B10}$ | H | H |
| $L_{A3133}$ | H | $R_{A3}$ | H | H |
| $L_{A3134}$ | H | $R_{A34}$ | H | H |
| $L_{A3135}$ | $R_{B1}$ | $R_{B1}$ | H | H |
| $L_{A3136}$ | $R_{B3}$ | $R_{B3}$ | H | H |
| $L_{A3137}$ | $R_{B4}$ | $R_{B4}$ | H | H |
| $L_{A3138}$ | $R_{B7}$ | $R_{B7}$ | H | H |
| $L_{A3139}$ | $R_{B10}$ | $R_{B10}$ | H | H |
| $L_{A3140}$ | $R_{A3}$ | $R_{A3}$ | H | H |
| $L_{A3141}$ | $R_{A34}$ | $R_{A34}$ | H | H |
| $L_{A3142}$ | $R_{B1}$ | $R_{B3}$ | H | H |
| $L_{A3143}$ | $R_{B1}$ | $R_{B4}$ | H | H |
| $L_{A3144}$ | $R_{B1}$ | $R_{B7}$ | H | H |
| $L_{A3145}$ | $R_{B1}$ | $R_{B10}$ | H | H |
| $L_{A3146}$ | $R_{B1}$ | $R_{A3}$ | H | H |
| $L_{A3147}$ | $R_{B1}$ | $R_{A34}$ | H | H |
| $L_{A3148}$ | $R_{B3}$ | $R_{B1}$ | H | H |
| $L_{A3149}$ | $R_{B3}$ | $R_{B4}$ | H | H |
| $L_{A3150}$ | $R_{B3}$ | $R_{B7}$ | H | H |
| $L_{A3151}$ | $R_{B3}$ | $R_{B10}$ | H | H |
| $L_{A3152}$ | $R_{B3}$ | $R_{A3}$ | H | H |
| $L_{A3153}$ | $R_{B3}$ | $R_{A34}$ | H | H |
| $L_{A3154}$ | $R_{B4}$ | $R_{B1}$ | H | H |
| $L_{A3155}$ | $R_{B4}$ | $R_{B3}$ | H | H |
| $L_{A3156}$ | $R_{B4}$ | $R_{B7}$ | H | H |
| $L_{A3157}$ | $R_{B4}$ | $R_{B10}$ | H | H |
| $L_{A3158}$ | $R_{B4}$ | $R_{A3}$ | H | H |
| $L_{A3159}$ | $R_{B4}$ | $R_{A34}$ | H | H |
| $L_{A3160}$ | $R_{B7}$ | $R_{B1}$ | H | H |
| $L_{A3161}$ | $R_{B7}$ | $R_{B3}$ | H | H |
| $L_{A3162}$ | $R_{B7}$ | $R_{B4}$ | H | H |
| $L_{A3163}$ | $R_{B7}$ | $R_{B10}$ | H | H |
| $L_{A3164}$ | $R_{B7}$ | $R_{A3}$ | H | H |
| $L_{A3165}$ | $R_{B7}$ | $R_{A34}$ | H | H |
| $L_{A3166}$ | $R_{B10}$ | $R_{B1}$ | H | H |
| $L_{A3167}$ | $R_{B10}$ | $R_{B3}$ | H | H |
| $L_{A3168}$ | $R_{B10}$ | $R_{B4}$ | H | H |
| $L_{A3169}$ | $R_{B10}$ | $R_{B7}$ | H | H |

-continued

| Ligand | $R^4$ | $R^5$ | $R^6$ | $R^8$ |
|---|---|---|---|---|
| $L_{A3170}$ | $R_{B10}$ | $R_{A3}$ | H | H |
| $L_{A3171}$ | $R_{B10}$ | $R_{A34}$ | H | H |
| $L_{A3172}$ | $R_{A3}$ | $R_{B1}$ | H | H |
| $L_{A3173}$ | $R_{A3}$ | $R_{B3}$ | H | H |
| $L_{A3174}$ | $R_{A3}$ | $R_{B4}$ | H | H |
| $L_{A3175}$ | $R_{A3}$ | $R_{B7}$ | H | H |
| $L_{A3176}$ | $R_{A3}$ | $R_{B10}$ | H | H |
| $L_{A3177}$ | $R_{A3}$ | $R_{A34}$ | H | H |
| $L_{A3178}$ | $R_{A34}$ | $R_{B1}$ | H | H |
| $L_{A3179}$ | $R_{A34}$ | $R_{B3}$ | H | H |
| $L_{A3180}$ | $R_{A34}$ | $R_{B4}$ | H | H |
| $L_{A3181}$ | $R_{A34}$ | $R_{B7}$ | H | H |
| $L_{A3182}$ | $R_{A34}$ | $R_{B10}$ | H | H |
| $L_{A3183}$ | $R_{A34}$ | $R_{A3}$ | H | H |
| $L_{A3184}$ | H | H | H | $R_{B1}$ |
| $L_{A3185}$ | $R_{B1}$ | H | H | $R_{B1}$ |
| $L_{A3186}$ | $R_{B3}$ | H | H | $R_{B1}$ |
| $L_{A3187}$ | $R_{B4}$ | H | H | $R_{B1}$ |
| $L_{A3188}$ | $R_{B7}$ | H | H | $R_{B1}$ |
| $L_{A3189}$ | $R_{B10}$ | H | H | $R_{B1}$ |
| $L_{A3190}$ | $R_{A3}$ | H | H | $R_{B1}$ |
| $L_{A3191}$ | $R_{A34}$ | H | H | $R_{B1}$ |
| $L_{A3192}$ | H | $R_{B1}$ | H | $R_{B1}$ |
| $L_{A3193}$ | H | $R_{B2}$ | H | $R_{B1}$ |
| $L_{A3194}$ | H | $R_{B3}$ | H | $R_{B1}$ |
| $L_{A3195}$ | H | $R_{B4}$ | H | $R_{B1}$ |
| $L_{A3196}$ | H | $R_{B7}$ | H | $R_{B1}$ |
| $L_{A3197}$ | H | $R_{B10}$ | H | $R_{B1}$ |
| $L_{A3198}$ | H | $R_{A3}$ | H | $R_{B1}$ |
| $L_{A3199}$ | H | $R_{A34}$ | H | $R_{B1}$ |
| $L_{A3200}$ | $R_{B1}$ | $R_{B1}$ | H | $R_{B1}$ |
| $L_{A3201}$ | $R_{B3}$ | $R_{B3}$ | H | $R_{B1}$ |
| $L_{A3202}$ | $R_{B4}$ | $R_{B4}$ | H | $R_{B1}$ |
| $L_{A3203}$ | $R_{B7}$ | $R_{B7}$ | H | $R_{B1}$ |
| $L_{A3204}$ | $R_{B10}$ | $R_{B10}$ | H | $R_{B1}$ |
| $L_{A3205}$ | $R_{A3}$ | $R_{A3}$ | H | $R_{B1}$ |
| $L_{A3206}$ | $R_{A34}$ | $R_{A34}$ | H | $R_{B1}$ |
| $L_{A3207}$ | $R_{B1}$ | $R_{B3}$ | H | $R_{B1}$ |
| $L_{A3208}$ | $R_{B1}$ | $R_{B4}$ | H | $R_{B1}$ |
| $L_{A3209}$ | $R_{B1}$ | $R_{B7}$ | H | $R_{B1}$ |
| $L_{A3210}$ | $R_{B1}$ | $R_{B10}$ | H | $R_{B1}$ |
| $L_{A3211}$ | $R_{B1}$ | $R_{A3}$ | H | $R_{B1}$ |
| $L_{A3212}$ | $R_{B1}$ | $R_{A34}$ | H | $R_{B1}$ |
| $L_{A3213}$ | $R_{B3}$ | $R_{B1}$ | H | $R_{B1}$ |
| $L_{A3214}$ | $R_{B3}$ | $R_{B4}$ | H | $R_{B1}$ |
| $L_{A3215}$ | $R_{B3}$ | $R_{B7}$ | H | $R_{B1}$ |
| $L_{A3216}$ | $R_{B3}$ | $R_{B10}$ | H | $R_{B1}$ |
| $L_{A3217}$ | $R_{B3}$ | $R_{A3}$ | H | $R_{B1}$ |
| $L_{A3218}$ | $R_{B3}$ | $R_{A34}$ | H | $R_{B1}$ |
| $L_{A3219}$ | $R_{B4}$ | $R_{B1}$ | H | $R_{B1}$ |
| $L_{A3220}$ | $R_{B4}$ | $R_{B3}$ | H | $R_{B1}$ |
| $L_{A3221}$ | $R_{B4}$ | $R_{B7}$ | H | $R_{B1}$ |
| $L_{A3222}$ | $R_{B4}$ | $R_{B10}$ | H | $R_{B1}$ |
| $L_{A3223}$ | $R_{B4}$ | $R_{A3}$ | H | $R_{B1}$ |
| $L_{A3224}$ | $R_{B4}$ | $R_{A34}$ | H | $R_{B1}$ |
| $L_{A3225}$ | $R_{B7}$ | $R_{B1}$ | H | $R_{B1}$ |
| $L_{A3226}$ | $R_{B7}$ | $R_{B3}$ | H | $R_{B1}$ |
| $L_{A3227}$ | $R_{B7}$ | $R_{B4}$ | H | $R_{B1}$ |
| $L_{A3228}$ | $R_{B7}$ | $R_{B10}$ | H | $R_{B1}$ |
| $L_{A3229}$ | $R_{B7}$ | $R_{A3}$ | H | $R_{B1}$ |
| $L_{A3230}$ | $R_{B7}$ | $R_{A34}$ | H | $R_{B1}$ |
| $L_{A3231}$ | $R_{B10}$ | $R_{B1}$ | H | $R_{B1}$ |
| $L_{A3232}$ | $R_{B10}$ | $R_{B3}$ | H | $R_{B1}$ |
| $L_{A3233}$ | $R_{B10}$ | $R_{B4}$ | H | $R_{B1}$ |
| $L_{A3234}$ | $R_{B10}$ | $R_{B7}$ | H | $R_{B1}$ |
| $L_{A3235}$ | $R_{B10}$ | $R_{A3}$ | H | $R_{B1}$ |
| $L_{A3236}$ | $R_{B10}$ | $R_{A34}$ | H | $R_{B1}$ |
| $L_{A3237}$ | $R_{A3}$ | $R_{B1}$ | H | $R_{B1}$ |
| $L_{A3238}$ | $R_{A3}$ | $R_{B3}$ | H | $R_{B1}$ |
| $L_{A3239}$ | $R_{A3}$ | $R_{B4}$ | H | $R_{B1}$ |
| $L_{A3240}$ | $R_{A3}$ | $R_{B7}$ | H | $R_{B1}$ |
| $L_{A3241}$ | $R_{A3}$ | $R_{B10}$ | H | $R_{B1}$ |
| $L_{A3242}$ | $R_{A3}$ | $R_{A34}$ | H | $R_{B1}$ |
| $L_{A3243}$ | $R_{A34}$ | $R_{B1}$ | H | $R_{B1}$ |
| $L_{A3244}$ | $R_{A34}$ | $R_{B3}$ | H | $R_{B1}$ |
| $L_{A3245}$ | $R_{A34}$ | $R_{B4}$ | H | $R_{B1}$ |
| $L_{A3246}$ | $R_{A34}$ | $R_{B7}$ | H | $R_{B1}$ |

-continued

| Ligand | $R^4$ | $R^5$ | $R^6$ | $R^8$ |
|---|---|---|---|---|
| $L_{43247}$ | $R_{A34}$ | $R_{B10}$ | H | $R_{B1}$ |
| $L_{43248}$ | $R_{A34}$ | $R_{A3}$ | H | $R_{B1}$ |
| $L_{43249}$ | H | H | $R_{B1}$ | H |
| $L_{43250}$ | $R_{B1}$ | H | $R_{B1}$ | H |
| $L_{43251}$ | $R_{B3}$ | H | $R_{B1}$ | H |
| $L_{43252}$ | $R_{B4}$ | H | $R_{B1}$ | H |
| $L_{43253}$ | $R_{B7}$ | H | $R_{B1}$ | H |
| $L_{43254}$ | $R_{B10}$ | H | $R_{B1}$ | H |
| $L_{43255}$ | $R_{A3}$ | H | $R_{B1}$ | H |
| $L_{43256}$ | $R_{A34}$ | H | $R_{B1}$ | H |
| $L_{43257}$ | H | $R_{B1}$ | $R_{B1}$ | H |
| $L_{43258}$ | H | $R_{B2}$ | $R_{B1}$ | H |
| $L_{43259}$ | H | $R_{B3}$ | $R_{B1}$ | H |
| $L_{43260}$ | H | $R_{B4}$ | $R_{B1}$ | H |
| $L_{43261}$ | H | $R_{B7}$ | $R_{B1}$ | H |
| $L_{43262}$ | H | $R_{B10}$ | $R_{B1}$ | H |
| $L_{43263}$ | H | $R_{A3}$ | $R_{B1}$ | H |
| $L_{43264}$ | H | $R_{A34}$ | $R_{B1}$ | H |
| $L_{43265}$ | $R_{B1}$ | $R_{B1}$ | $R_{B1}$ | H |
| $L_{43266}$ | $R_{B3}$ | $R_{B3}$ | $R_{B1}$ | H |
| $L_{43267}$ | $R_{B4}$ | $R_{B4}$ | $R_{B1}$ | H |
| $L_{43268}$ | $R_{B7}$ | $R_{B7}$ | $R_{B1}$ | H |
| $L_{43269}$ | $R_{B10}$ | $R_{B10}$ | $R_{B1}$ | H |
| $L_{43270}$ | $R_{A3}$ | $R_{A3}$ | $R_{B1}$ | H |
| $L_{43271}$ | $R_{A34}$ | $R_{A34}$ | $R_{B1}$ | H |
| $L_{43272}$ | $R_{B1}$ | $R_{B3}$ | $R_{B1}$ | H |
| $L_{43273}$ | $R_{B1}$ | $R_{B4}$ | $R_{B1}$ | H |
| $L_{43274}$ | $R_{B1}$ | $R_{B7}$ | $R_{B1}$ | H |
| $L_{43275}$ | $R_{B1}$ | $R_{B10}$ | $R_{B1}$ | H |
| $L_{43276}$ | $R_{B1}$ | $R_{A3}$ | $R_{B1}$ | H |
| $L_{43277}$ | $R_{B1}$ | $R_{A34}$ | $R_{B1}$ | H |
| $L_{43278}$ | $R_{B3}$ | $R_{B1}$ | $R_{B1}$ | H |
| $L_{43279}$ | $R_{B3}$ | $R_{B4}$ | $R_{B1}$ | H |
| $L_{43280}$ | $R_{B3}$ | $R_{B7}$ | $R_{B1}$ | H |
| $L_{43281}$ | $R_{B3}$ | $R_{B10}$ | $R_{B1}$ | H |
| $L_{43282}$ | $R_{B3}$ | $R_{A3}$ | $R_{B1}$ | H |
| $L_{43283}$ | $R_{B3}$ | $R_{A34}$ | $R_{B1}$ | H |
| $L_{43284}$ | $R_{B4}$ | $R_{B1}$ | $R_{B1}$ | H |
| $L_{43285}$ | $R_{B4}$ | $R_{B3}$ | $R_{B1}$ | H |
| $L_{43286}$ | $R_{B4}$ | $R_{B7}$ | $R_{B1}$ | H |
| $L_{43287}$ | $R_{B4}$ | $R_{B10}$ | $R_{B1}$ | H |
| $L_{43288}$ | $R_{B4}$ | $R_{A3}$ | $R_{B1}$ | H |
| $L_{43289}$ | $R_{B4}$ | $R_{A34}$ | $R_{B1}$ | H |
| $L_{43290}$ | $R_{B7}$ | $R_{B1}$ | $R_{B1}$ | H |
| $L_{43291}$ | $R_{B7}$ | $R_{B3}$ | $R_{B1}$ | H |
| $L_{43292}$ | $R_{B7}$ | $R_{B4}$ | $R_{B1}$ | H |
| $L_{43293}$ | $R_{B7}$ | $R_{B10}$ | $R_{B1}$ | H |
| $L_{43294}$ | $R_{B7}$ | $R_{A3}$ | $R_{B1}$ | H |
| $L_{43295}$ | $R_{B7}$ | $R_{A34}$ | $R_{B1}$ | H |
| $L_{43296}$ | $R_{B10}$ | $R_{B1}$ | $R_{B1}$ | H |
| $L_{43297}$ | $R_{B10}$ | $R_{B3}$ | $R_{B1}$ | H |
| $L_{43298}$ | $R_{B10}$ | $R_{B4}$ | $R_{B1}$ | H |
| $L_{43299}$ | $R_{B10}$ | $R_{B7}$ | $R_{B1}$ | H |
| $L_{43300}$ | $R_{B10}$ | $R_{A3}$ | $R_{B1}$ | H |
| $L_{43301}$ | $R_{B10}$ | $R_{A34}$ | $R_{B1}$ | H |
| $L_{43302}$ | $R_{A3}$ | $R_{B1}$ | $R_{B1}$ | H |
| $L_{43303}$ | $R_{A3}$ | $R_{B3}$ | $R_{B1}$ | H |
| $L_{43304}$ | $R_{A3}$ | $R_{B4}$ | $R_{B1}$ | H |
| $L_{43305}$ | $R_{A3}$ | $R_{B7}$ | $R_{B1}$ | H |
| $L_{43306}$ | $R_{A3}$ | $R_{B10}$ | $R_{B1}$ | H |
| $L_{43307}$ | $R_{A3}$ | $R_{A34}$ | $R_{B1}$ | H |
| $L_{43308}$ | $R_{A34}$ | $R_{B1}$ | $R_{B1}$ | H |
| $L_{43309}$ | $R_{A34}$ | $R_{B3}$ | $R_{B1}$ | H |
| $L_{43310}$ | $R_{A34}$ | $R_{B4}$ | $R_{B1}$ | H |
| $L_{43311}$ | $R_{A34}$ | $R_{B7}$ | $R_{B1}$ | H |
| $L_{43312}$ | $R_{A34}$ | $R_{B10}$ | $R_{B1}$ | H |
| $L_{43313}$ | $R_{A34}$ | $R_{A3}$ | $R_{B1}$ | H |
| $L_{43314}$ | H | H | $R_{B1}$ | $R_{B7}$ |
| $L_{43315}$ | $R_{B1}$ | H | $R_{B1}$ | $R_{B7}$ |
| $L_{43316}$ | $R_{B3}$ | H | $R_{B1}$ | $R_{B7}$ |
| $L_{43317}$ | $R_{B4}$ | H | $R_{B1}$ | $R_{B7}$ |
| $L_{43318}$ | $R_{B7}$ | H | $R_{B1}$ | $R_{B7}$ |
| $L_{43319}$ | $R_{B10}$ | H | $R_{B1}$ | $R_{B7}$ |
| $L_{43320}$ | $R_{A3}$ | H | $R_{B1}$ | $R_{B7}$ |
| $L_{43321}$ | $R_{A34}$ | H | $R_{B1}$ | $R_{B7}$ |
| $L_{43322}$ | H | $R_{B1}$ | $R_{B1}$ | $R_{B7}$ |
| $L_{43323}$ | H | $R_{B2}$ | $R_{B1}$ | $R_{B7}$ |

-continued

| Ligand | $R^4$ | $R^5$ | $R^6$ | $R^8$ |
|---|---|---|---|---|
| $L_{43324}$ | H | $R_{B3}$ | $R_{B1}$ | $R_{B7}$ |
| $L_{43325}$ | H | $R_{B4}$ | $R_{B1}$ | $R_{B7}$ |
| $L_{43326}$ | H | $R_{B7}$ | $R_{B1}$ | $R_{B7}$ |
| $L_{43327}$ | H | $R_{B10}$ | $R_{B1}$ | $R_{B7}$ |
| $L_{43328}$ | H | $R_{A3}$ | $R_{B1}$ | $R_{B7}$ |
| $L_{43329}$ | H | $R_{A34}$ | $R_{B1}$ | $R_{B7}$ |
| $L_{43330}$ | $R_{B1}$ | $R_{B1}$ | $R_{B1}$ | $R_{B7}$ |
| $L_{43331}$ | $R_{B3}$ | $R_{B3}$ | $R_{B1}$ | $R_{B7}$ |
| $L_{43332}$ | $R_{B4}$ | $R_{B4}$ | $R_{B1}$ | $R_{B7}$ |
| $L_{43333}$ | $R_{B7}$ | $R_{B7}$ | $R_{B1}$ | $R_{B7}$ |
| $L_{43334}$ | $R_{B10}$ | $R_{B10}$ | $R_{B1}$ | $R_{B7}$ |
| $L_{43335}$ | $R_{A3}$ | $R_{A3}$ | $R_{B1}$ | $R_{B7}$ |
| $L_{43336}$ | $R_{A34}$ | $R_{A34}$ | $R_{B1}$ | $R_{B7}$ |
| $L_{43337}$ | $R_{B1}$ | $R_{B3}$ | $R_{B1}$ | $R_{B7}$ |
| $L_{43338}$ | $R_{B1}$ | $R_{B4}$ | $R_{B1}$ | $R_{B7}$ |
| $L_{43339}$ | $R_{B1}$ | $R_{B7}$ | $R_{B1}$ | $R_{B7}$ |
| $L_{43340}$ | $R_{B1}$ | $R_{B10}$ | $R_{B1}$ | $R_{B7}$ |
| $L_{43341}$ | $R_{B1}$ | $R_{A3}$ | $R_{B1}$ | $R_{B7}$ |
| $L_{43342}$ | $R_{B1}$ | $R_{A34}$ | $R_{B1}$ | $R_{B7}$ |
| $L_{43343}$ | $R_{B3}$ | $R_{B1}$ | $R_{B1}$ | $R_{B7}$ |
| $L_{43344}$ | $R_{B3}$ | $R_{B4}$ | $R_{B1}$ | $R_{B7}$ |
| $L_{43345}$ | $R_{B3}$ | $R_{B7}$ | $R_{B1}$ | $R_{B7}$ |
| $L_{43346}$ | $R_{B3}$ | $R_{B10}$ | $R_{B1}$ | $R_{B7}$ |
| $L_{43347}$ | $R_{B3}$ | $R_{A3}$ | $R_{B1}$ | $R_{B7}$ |
| $L_{43348}$ | $R_{B3}$ | $R_{A34}$ | $R_{B1}$ | $R_{B7}$ |
| $L_{43349}$ | $R_{B4}$ | $R_{B1}$ | $R_{B1}$ | $R_{B7}$ |
| $L_{43350}$ | $R_{B4}$ | $R_{B3}$ | $R_{B1}$ | $R_{B7}$ |
| $L_{43351}$ | $R_{B4}$ | $R_{B7}$ | $R_{B1}$ | $R_{B7}$ |
| $L_{43352}$ | $R_{B4}$ | $R_{B10}$ | $R_{B1}$ | $R_{B7}$ |
| $L_{43353}$ | $R_{B4}$ | $R_{A3}$ | $R_{B1}$ | $R_{B7}$ |
| $L_{43354}$ | $R_{B4}$ | $R_{A34}$ | $R_{B1}$ | $R_{B7}$ |
| $L_{43355}$ | $R_{B7}$ | $R_{B1}$ | $R_{B1}$ | $R_{B7}$ |
| $L_{43356}$ | $R_{B7}$ | $R_{B3}$ | $R_{B1}$ | $R_{B7}$ |
| $L_{43357}$ | $R_{B7}$ | $R_{B4}$ | $R_{B1}$ | $R_{B7}$ |
| $L_{43358}$ | $R_{B7}$ | $R_{B10}$ | $R_{B1}$ | $R_{B7}$ |
| $L_{43359}$ | $R_{B7}$ | $R_{A3}$ | $R_{B1}$ | $R_{B7}$ |
| $L_{43360}$ | $R_{B7}$ | $R_{A34}$ | $R_{B1}$ | $R_{B7}$ |
| $L_{43361}$ | $R_{B10}$ | $R_{B1}$ | $R_{B1}$ | $R_{B7}$ |
| $L_{43362}$ | $R_{B10}$ | $R_{B3}$ | $R_{B1}$ | $R_{B7}$ |
| $L_{43363}$ | $R_{B10}$ | $R_{B4}$ | $R_{B1}$ | $R_{B7}$ |
| $L_{43364}$ | $R_{B10}$ | $R_{B7}$ | $R_{B1}$ | $R_{B7}$ |
| $L_{43365}$ | $R_{B10}$ | $R_{A3}$ | $R_{B1}$ | $R_{B7}$ |
| $L_{43366}$ | $R_{B10}$ | $R_{A34}$ | $R_{B1}$ | $R_{B7}$ |
| $L_{43367}$ | $R_{A3}$ | $R_{B1}$ | $R_{B1}$ | $R_{B7}$ |
| $L_{43368}$ | $R_{A3}$ | $R_{B3}$ | $R_{B1}$ | $R_{B7}$ |
| $L_{43369}$ | $R_{A3}$ | $R_{B4}$ | $R_{B1}$ | $R_{B7}$ |
| $L_{43370}$ | $R_{A3}$ | $R_{B7}$ | $R_{B1}$ | $R_{B7}$ |
| $L_{43371}$ | $R_{A3}$ | $R_{B10}$ | $R_{B1}$ | $R_{B7}$ |
| $L_{43372}$ | $R_{A3}$ | $R_{A34}$ | $R_{B1}$ | $R_{B7}$ |
| $L_{43373}$ | $R_{A34}$ | $R_{B1}$ | $R_{B1}$ | $R_{B7}$ |
| $L_{43374}$ | $R_{A34}$ | $R_{B3}$ | $R_{B1}$ | $R_{B7}$ |
| $L_{43375}$ | $R_{A34}$ | $R_{B4}$ | $R_{B1}$ | $R_{B7}$ |
| $L_{43376}$ | $R_{A34}$ | $R_{B7}$ | $R_{B1}$ | $R_{B7}$ |
| $L_{43377}$ | $R_{A34}$ | $R_{B10}$ | $R_{B1}$ | $R_{B7}$ |
| $L_{43378}$ | $R_{A34}$ | $R_{A3}$ | $R_{B1}$ | $R_{B7}$ |

wherein $R_{B1}$ to $R_{B4}$, $R_{B6}$ to $R_{B8}$, and $R_{B10}$ have the following structures:

$R_{B1}$

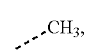

$R_{B2}$

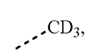

$R_{B3}$

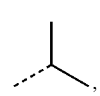

$R_{B4}$

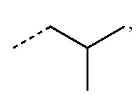

-continued $R_{B6}$

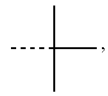

$R_{B7}$

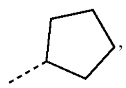

$R_{B8}$

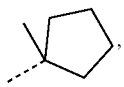 and $R_{B10}$

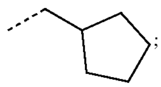

wherein $R_{A3}$ to $R_{A434}$ have the following structures:

$R_{A3}$

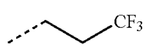 and $R_{A434}$

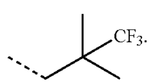

8. The compound of claim 7, having the formula $Ir(L_{Ak})_2(L_{Bj})$;

wherein $L_{B1}$ through $L_{B1260}$ are based on a structure of Formula XXVII,

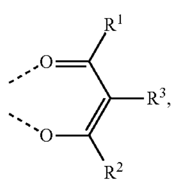

in which $R^1$, $R^2$, and $R^3$ are defined as:

| Ligand | $R^1$ | $R^2$ | $R^3$ |
|---|---|---|---|
| $L_{B1}$ | $R^{D1}$ | $R^{D1}$ | H |
| $L_{B2}$ | $R^{D2}$ | $R^{D2}$ | H |
| $L_{B3}$ | $R^{D3}$ | $R^{D3}$ | H |
| $L_{B4}$ | $R^{D4}$ | $R^{D4}$ | H |
| $L_{B5}$ | $R^{D5}$ | $R^{D5}$ | H |
| $L_{B6}$ | $R^{D6}$ | $R^{D6}$ | H |
| $L_{B7}$ | $R^{D7}$ | $R^{D7}$ | H |
| $L_{B8}$ | $R^{D8}$ | $R^{D8}$ | H |
| $L_{B9}$ | $R^{D9}$ | $R^{D9}$ | H |
| $L_{B10}$ | $R^{D10}$ | $R^{D10}$ | H |
| $L_{B11}$ | $R^{D11}$ | $R^{D11}$ | H |
| $L_{B12}$ | $R^{D12}$ | $R^{D12}$ | H |
| $L_{B13}$ | $R^{D13}$ | $R^{D13}$ | H |
| $L_{B14}$ | $R^{D14}$ | $R^{D14}$ | H |
| $L_{B15}$ | $R^{D15}$ | $R^{D15}$ | H |
| $L_{B16}$ | $R^{D16}$ | $R^{D16}$ | H |
| $L_{B17}$ | $R^{D17}$ | $R^{D17}$ | H |
| $L_{B18}$ | $R^{D18}$ | $R^{D18}$ | H |
| $L_{B19}$ | $R^{D19}$ | $R^{D19}$ | H |
| $L_{B20}$ | $R^{D20}$ | $R^{D20}$ | H |
| $L_{B21}$ | $R^{D21}$ | $R^{D21}$ | H |
| $L_{B22}$ | $R^{D22}$ | $R^{D22}$ | H |
| $L_{B23}$ | $R^{D23}$ | $R^{D23}$ | H |

-continued

| Ligand | $R^1$ | $R^2$ | $R^3$ |
|---|---|---|---|
| $L_{B24}$ | $R^{D24}$ | $R^{D24}$ | H |
| $L_{B25}$ | $R^{D25}$ | $R^{D25}$ | H |
| $L_{B26}$ | $R^{D26}$ | $R^{D26}$ | H |
| $L_{B27}$ | $R^{D27}$ | $R^{D27}$ | H |
| $L_{B28}$ | $R^{D28}$ | $R^{D28}$ | H |
| $L_{B29}$ | $R^{D29}$ | $R^{D29}$ | H |
| $L_{B30}$ | $R^{D30}$ | $R^{D30}$ | H |
| $L_{B31}$ | $R^{D31}$ | $R^{D31}$ | H |
| $L_{B32}$ | $R^{D32}$ | $R^{D32}$ | H |
| $L_{B33}$ | $R^{D33}$ | $R^{D33}$ | H |
| $L_{B34}$ | $R^{D34}$ | $R^{D34}$ | H |
| $L_{B35}$ | $R^{D35}$ | $R^{D35}$ | H |
| $L_{B36}$ | $R^{D40}$ | $R^{D40}$ | H |
| $L_{B37}$ | $R^{D41}$ | $R^{D41}$ | H |
| $L_{B38}$ | $R^{D42}$ | $R^{D42}$ | H |
| $L_{B39}$ | $R^{D64}$ | $R^{D64}$ | H |
| $L_{B40}$ | $R^{D66}$ | $R^{D66}$ | H |
| $L_{B41}$ | $R^{D68}$ | $R^{D68}$ | H |
| $L_{B42}$ | $R^{D76}$ | $R^{D76}$ | H |
| $L_{B43}$ | $R^{D1}$ | $R^{D2}$ | H |
| $L_{B44}$ | $R^{D1}$ | $R^{D3}$ | H |
| $L_{B45}$ | $R^{D1}$ | $R^{D4}$ | H |
| $L_{B46}$ | $R^{D1}$ | $R^{D5}$ | H |
| $L_{B47}$ | $R^{D1}$ | $R^{D6}$ | H |
| $L_{B48}$ | $R^{D1}$ | $R^{D7}$ | H |
| $L_{B49}$ | $R^{D1}$ | $R^{D8}$ | H |
| $L_{B50}$ | $R^{D1}$ | $R^{D9}$ | H |
| $L_{B51}$ | $R^{D1}$ | $R^{D10}$ | H |
| $L_{B52}$ | $R^{D1}$ | $R^{D11}$ | H |
| $L_{B53}$ | $R^{D1}$ | $R^{D12}$ | H |
| $L_{B54}$ | $R^{D1}$ | $R^{D13}$ | H |
| $L_{B55}$ | $R^{D1}$ | $R^{D14}$ | H |
| $L_{B56}$ | $R^{D1}$ | $R^{D15}$ | H |
| $L_{B57}$ | $R^{D1}$ | $R^{D16}$ | H |
| $L_{B58}$ | $R^{D1}$ | $R^{D17}$ | H |
| $L_{B59}$ | $R^{D1}$ | $R^{D18}$ | H |
| $L_{B60}$ | $R^{D1}$ | $R^{D19}$ | H |
| $L_{B61}$ | $R^{D1}$ | $R^{D20}$ | H |
| $L_{B62}$ | $R^{D1}$ | $R^{D21}$ | H |
| $L_{B63}$ | $R^{D1}$ | $R^{D22}$ | H |
| $L_{B64}$ | $R^{D1}$ | $R^{D23}$ | H |
| $L_{B65}$ | $R^{D1}$ | $R^{D24}$ | H |
| $L_{B66}$ | $R^{D1}$ | $R^{D25}$ | H |
| $L_{B67}$ | $R^{D1}$ | $R^{D26}$ | H |
| $L_{B68}$ | $R^{D1}$ | $R^{D27}$ | H |
| $L_{B69}$ | $R^{D1}$ | $R^{D28}$ | H |
| $L_{B70}$ | $R^{D1}$ | $R^{D29}$ | H |
| $L_{B71}$ | $R^{D1}$ | $R^{D30}$ | H |
| $L_{B72}$ | $R^{D1}$ | $R^{D31}$ | H |
| $L_{B73}$ | $R^{D1}$ | $R^{D32}$ | H |
| $L_{B74}$ | $R^{D1}$ | $R^{D33}$ | H |
| $L_{B75}$ | $R^{D1}$ | $R^{D34}$ | H |
| $L_{B76}$ | $R^{D1}$ | $R^{D35}$ | H |
| $L_{B77}$ | $R^{D1}$ | $R^{D40}$ | H |
| $L_{B78}$ | $R^{D1}$ | $R^{D41}$ | H |
| $L_{B79}$ | $R^{D1}$ | $R^{D42}$ | H |
| $L_{B80}$ | $R^{D1}$ | $R^{D64}$ | H |
| $L_{B81}$ | $R^{D1}$ | $R^{D66}$ | H |
| $L_{B82}$ | $R^{D1}$ | $R^{D68}$ | H |
| $L_{B83}$ | $R^{D1}$ | $R^{D76}$ | H |
| $L_{B84}$ | $R^{D2}$ | $R^{D1}$ | H |
| $L_{B85}$ | $R^{D2}$ | $R^{D3}$ | H |
| $L_{B86}$ | $R^{D2}$ | $R^{D4}$ | H |
| $L_{B87}$ | $R^{D2}$ | $R^{D5}$ | H |
| $L_{B88}$ | $R^{D2}$ | $R^{D6}$ | H |
| $L_{B89}$ | $R^{D2}$ | $R^{D7}$ | H |
| $L_{B90}$ | $R^{D2}$ | $R^{D8}$ | H |
| $L_{B91}$ | $R^{D2}$ | $R^{D9}$ | H |
| $L_{B92}$ | $R^{D2}$ | $R^{D10}$ | H |
| $L_{B93}$ | $R^{D2}$ | $R^{D11}$ | H |
| $L_{B94}$ | $R^{D2}$ | $R^{D12}$ | H |
| $L_{B95}$ | $R^{D2}$ | $R^{D13}$ | H |
| $L_{B96}$ | $R^{D2}$ | $R^{D14}$ | H |
| $L_{B97}$ | $R^{D2}$ | $R^{D15}$ | H |
| $L_{B98}$ | $R^{D2}$ | $R^{D16}$ | H |
| $L_{B99}$ | $R^{D2}$ | $R^{D17}$ | H |
| $L_{B100}$ | $R^{D2}$ | $R^{D18}$ | H |

-continued

| Ligand | $R^1$ | $R^2$ | $R^3$ |
|---|---|---|---|
| $L_{B101}$ | $R^{D2}$ | $R^{D19}$ | H |
| $L_{B102}$ | $R^{D2}$ | $R^{D20}$ | H |
| $L_{B103}$ | $R^{D2}$ | $R^{D21}$ | H |
| $L_{B104}$ | $R^{D2}$ | $R^{D22}$ | H |
| $L_{B105}$ | $R^{D2}$ | $R^{D23}$ | H |
| $L_{B106}$ | $R^{D2}$ | $R^{D24}$ | H |
| $L_{B107}$ | $R^{D2}$ | $R^{D25}$ | H |
| $L_{B108}$ | $R^{D2}$ | $R^{D26}$ | H |
| $L_{B109}$ | $R^{D2}$ | $R^{D27}$ | H |
| $L_{B110}$ | $R^{D2}$ | $R^{D28}$ | H |
| $L_{B111}$ | $R^{D2}$ | $R^{D29}$ | H |
| $L_{B112}$ | $R^{D2}$ | $R^{D30}$ | H |
| $L_{B113}$ | $R^{D2}$ | $R^{D31}$ | H |
| $L_{B114}$ | $R^{D2}$ | $R^{D32}$ | H |
| $L_{B115}$ | $R^{D2}$ | $R^{D33}$ | H |
| $L_{B116}$ | $R^{D2}$ | $R^{D34}$ | H |
| $L_{B117}$ | $R^{D2}$ | $R^{D35}$ | H |
| $L_{B118}$ | $R^{D2}$ | $R^{D40}$ | H |
| $L_{B119}$ | $R^{D2}$ | $R^{D41}$ | H |
| $L_{B120}$ | $R^{D2}$ | $R^{D42}$ | H |
| $L_{B121}$ | $R^{D2}$ | $R^{D64}$ | H |
| $L_{B122}$ | $R^{D2}$ | $R^{D66}$ | H |
| $L_{B123}$ | $R^{D2}$ | $R^{D68}$ | H |
| $L_{B124}$ | $R^{D2}$ | $R^{D76}$ | H |
| $L_{B125}$ | $R^{D3}$ | $R^{D4}$ | H |
| $L_{B126}$ | $R^{D3}$ | $R^{D5}$ | H |
| $L_{B127}$ | $R^{D3}$ | $R^{D6}$ | H |
| $L_{B128}$ | $R^{D3}$ | $R^{D7}$ | H |
| $L_{B129}$ | $R^{D3}$ | $R^{D8}$ | H |
| $L_{B130}$ | $R^{D3}$ | $R^{D9}$ | H |
| $L_{B131}$ | $R^{D3}$ | $R^{D10}$ | H |
| $L_{B132}$ | $R^{D3}$ | $R^{D11}$ | H |
| $L_{B133}$ | $R^{D3}$ | $R^{D12}$ | H |
| $L_{B134}$ | $R^{D3}$ | $R^{D13}$ | H |
| $L_{B135}$ | $R^{D3}$ | $R^{D14}$ | H |
| $L_{B136}$ | $R^{D3}$ | $R^{D15}$ | H |
| $L_{B137}$ | $R^{D3}$ | $R^{D16}$ | H |
| $L_{B138}$ | $R^{D3}$ | $R^{D17}$ | H |
| $L_{B139}$ | $R^{D3}$ | $R^{D18}$ | H |
| $L_{B140}$ | $R^{D3}$ | $R^{D19}$ | H |
| $L_{B141}$ | $R^{D3}$ | $R^{D20}$ | H |
| $L_{B142}$ | $R^{D3}$ | $R^{D21}$ | H |
| $L_{B143}$ | $R^{D3}$ | $R^{D22}$ | H |
| $L_{B144}$ | $R^{D3}$ | $R^{D23}$ | H |
| $L_{B145}$ | $R^{D3}$ | $R^{D24}$ | H |
| $L_{B146}$ | $R^{D3}$ | $R^{D25}$ | H |
| $L_{B147}$ | $R^{D3}$ | $R^{D26}$ | H |
| $L_{B148}$ | $R^{D3}$ | $R^{D27}$ | H |
| $L_{B149}$ | $R^{D3}$ | $R^{D28}$ | H |
| $L_{B150}$ | $R^{D3}$ | $R^{D29}$ | H |
| $L_{B151}$ | $R^{D3}$ | $R^{D30}$ | H |
| $L_{B152}$ | $R^{D3}$ | $R^{D31}$ | H |
| $L_{B153}$ | $R^{D3}$ | $R^{D32}$ | H |
| $L_{B154}$ | $R^{D3}$ | $R^{D33}$ | H |
| $L_{B155}$ | $R^{D3}$ | $R^{D34}$ | H |
| $L_{B156}$ | $R^{D3}$ | $R^{D35}$ | H |
| $L_{B157}$ | $R^{D3}$ | $R^{D40}$ | H |
| $L_{B158}$ | $R^{D3}$ | $R^{D41}$ | H |
| $L_{B159}$ | $R^{D3}$ | $R^{D42}$ | H |
| $L_{B160}$ | $R^{D3}$ | $R^{D64}$ | H |
| $L_{B161}$ | $R^{D3}$ | $R^{D66}$ | H |
| $L_{B162}$ | $R^{D3}$ | $R^{D68}$ | H |
| $L_{B163}$ | $R^{D3}$ | $R^{D76}$ | H |
| $L_{B164}$ | $R^{D4}$ | $R^{D5}$ | H |
| $L_{B165}$ | $R^{D4}$ | $R^{D6}$ | H |
| $L_{B166}$ | $R^{D4}$ | $R^{D7}$ | H |
| $L_{B167}$ | $R^{D4}$ | $R^{D8}$ | H |
| $L_{B168}$ | $R^{D4}$ | $R^{D9}$ | H |
| $L_{B169}$ | $R^{D4}$ | $R^{D10}$ | H |
| $L_{B170}$ | $R^{D4}$ | $R^{D11}$ | H |
| $L_{B171}$ | $R^{D4}$ | $R^{D12}$ | H |
| $L_{B172}$ | $R^{D4}$ | $R^{D13}$ | H |
| $L_{B173}$ | $R^{D4}$ | $R^{D14}$ | H |
| $L_{B174}$ | $R^{D4}$ | $R^{D15}$ | H |
| $L_{B175}$ | $R^{D4}$ | $R^{D16}$ | H |
| $L_{B176}$ | $R^{D4}$ | $R^{D17}$ | H |
| $L_{B177}$ | $R^{D4}$ | $R^{D18}$ | H |

-continued

| Ligand | $R^1$ | $R^2$ | $R^3$ |
|---|---|---|---|
| $L_{B178}$ | $R^{D4}$ | $R^{D19}$ | H |
| $L_{B179}$ | $R^{D4}$ | $R^{D20}$ | H |
| $L_{B180}$ | $R^{D4}$ | $R^{D21}$ | H |
| $L_{B181}$ | $R^{D4}$ | $R^{D22}$ | H |
| $L_{B182}$ | $R^{D4}$ | $R^{D23}$ | H |
| $L_{B183}$ | $R^{D4}$ | $R^{D24}$ | H |
| $L_{B184}$ | $R^{D4}$ | $R^{D25}$ | H |
| $L_{B185}$ | $R^{D4}$ | $R^{D26}$ | H |
| $L_{B186}$ | $R^{D4}$ | $R^{D27}$ | H |
| $L_{B187}$ | $R^{D4}$ | $R^{D28}$ | H |
| $L_{B188}$ | $R^{D4}$ | $R^{D29}$ | H |
| $L_{B189}$ | $R^{D4}$ | $R^{D30}$ | H |
| $L_{B190}$ | $R^{D4}$ | $R^{D31}$ | H |
| $L_{B191}$ | $R^{D4}$ | $R^{D32}$ | H |
| $L_{B192}$ | $R^{D4}$ | $R^{D33}$ | H |
| $L_{B193}$ | $R^{D4}$ | $R^{D34}$ | H |
| $L_{B194}$ | $R^{D4}$ | $R^{D35}$ | H |
| $L_{B195}$ | $R^{D4}$ | $R^{D40}$ | H |
| $L_{B196}$ | $R^{D4}$ | $R^{D41}$ | H |
| $L_{B197}$ | $R^{D4}$ | $R^{D42}$ | H |
| $L_{B198}$ | $R^{D4}$ | $R^{D64}$ | H |
| $L_{B199}$ | $R^{D4}$ | $R^{D66}$ | H |
| $L_{B200}$ | $R^{D4}$ | $R^{D68}$ | H |
| $L_{B201}$ | $R^{D4}$ | $R^{D76}$ | H |
| $L_{B202}$ | $R^{D4}$ | $R^{D1}$ | H |
| $L_{B203}$ | $R^{D7}$ | $R^{D5}$ | H |
| $L_{B204}$ | $R^{D7}$ | $R^{D6}$ | H |
| $L_{B205}$ | $R^{D7}$ | $R^{D8}$ | H |
| $L_{B206}$ | $R^{D7}$ | $R^{D9}$ | H |
| $L_{B207}$ | $R^{D7}$ | $R^{D10}$ | H |
| $L_{B208}$ | $R^{D7}$ | $R^{D11}$ | H |
| $L_{B209}$ | $R^{D7}$ | $R^{D12}$ | H |
| $L_{B210}$ | $R^{D7}$ | $R^{D13}$ | H |
| $L_{B211}$ | $R^{D7}$ | $R^{D14}$ | H |
| $L_{B212}$ | $R^{D7}$ | $R^{D15}$ | H |
| $L_{B213}$ | $R^{D7}$ | $R^{D16}$ | H |
| $L_{B214}$ | $R^{D7}$ | $R^{D17}$ | H |
| $L_{B215}$ | $R^{D7}$ | $R^{D18}$ | H |
| $L_{B216}$ | $R^{D7}$ | $R^{D19}$ | H |
| $L_{B217}$ | $R^{D7}$ | $R^{D20}$ | H |
| $L_{B218}$ | $R^{D7}$ | $R^{D21}$ | H |
| $L_{B219}$ | $R^{D7}$ | $R^{D22}$ | H |
| $L_{B220}$ | $R^{D7}$ | $R^{D23}$ | H |
| $L_{B221}$ | $R^{D7}$ | $R^{D24}$ | H |
| $L_{B222}$ | $R^{D7}$ | $R^{D25}$ | H |
| $L_{B223}$ | $R^{D7}$ | $R^{D26}$ | H |
| $L_{B224}$ | $R^{D7}$ | $R^{D27}$ | H |
| $L_{B225}$ | $R^{D7}$ | $R^{D28}$ | H |
| $L_{B226}$ | $R^{D7}$ | $R^{D29}$ | H |
| $L_{B227}$ | $R^{D7}$ | $R^{D30}$ | H |
| $L_{B228}$ | $R^{D7}$ | $R^{D31}$ | H |
| $L_{B229}$ | $R^{D7}$ | $R^{D32}$ | H |
| $L_{B230}$ | $R^{D7}$ | $R^{D33}$ | H |
| $L_{B231}$ | $R^{D7}$ | $R^{D34}$ | H |
| $L_{B232}$ | $R^{D7}$ | $R^{D35}$ | H |
| $L_{B233}$ | $R^{D7}$ | $R^{D40}$ | H |
| $L_{B234}$ | $R^{D7}$ | $R^{D41}$ | H |
| $L_{B235}$ | $R^{D7}$ | $R^{D42}$ | H |
| $L_{B236}$ | $R^{D7}$ | $R^{D64}$ | H |
| $L_{B237}$ | $R^{D7}$ | $R^{D66}$ | H |
| $L_{B238}$ | $R^{D7}$ | $R^{D68}$ | H |
| $L_{B239}$ | $R^{D7}$ | $R^{D76}$ | H |
| $L_{B240}$ | $R^{D8}$ | $R^{D5}$ | H |
| $L_{B241}$ | $R^{D8}$ | $R^{D6}$ | H |
| $L_{B242}$ | $R^{D8}$ | $R^{D9}$ | H |
| $L_{B243}$ | $R^{D8}$ | $R^{D10}$ | H |
| $L_{B244}$ | $R^{D8}$ | $R^{D11}$ | H |
| $L_{B245}$ | $R^{D8}$ | $R^{D12}$ | H |
| $L_{B246}$ | $R^{D8}$ | $R^{D13}$ | H |
| $L_{B247}$ | $R^{D8}$ | $R^{D14}$ | H |
| $L_{B248}$ | $R^{D8}$ | $R^{D15}$ | H |
| $L_{B249}$ | $R^{D8}$ | $R^{D16}$ | H |
| $L_{B250}$ | $R^{D8}$ | $R^{D17}$ | H |
| $L_{B251}$ | $R^{D8}$ | $R^{D18}$ | H |
| $L_{B252}$ | $R^{D8}$ | $R^{D19}$ | H |
| $L_{B253}$ | $R^{D8}$ | $R^{D20}$ | H |
| $L_{B254}$ | $R^{D8}$ | $R^{D21}$ | H |

-continued

| Ligand | $R^1$ | $R^2$ | $R^3$ |
|---|---|---|---|
| $L_{B255}$ | $R^{D8}$ | $R^{D22}$ | H |
| $L_{B256}$ | $R^{D8}$ | $R^{D23}$ | H |
| $L_{B257}$ | $R^{D8}$ | $R^{D24}$ | H |
| $L_{B258}$ | $R^{D8}$ | $R^{D25}$ | H |
| $L_{B259}$ | $R^{D8}$ | $R^{D26}$ | H |
| $L_{B260}$ | $R^{D8}$ | $R^{D27}$ | H |
| $L_{B261}$ | $R^{D8}$ | $R^{D28}$ | H |
| $L_{B262}$ | $R^{D8}$ | $R^{D29}$ | H |
| $L_{B263}$ | $R^{D8}$ | $R^{D30}$ | H |
| $L_{B264}$ | $R^{D8}$ | $R^{D31}$ | H |
| $L_{B265}$ | $R^{D8}$ | $R^{D32}$ | H |
| $L_{B266}$ | $R^{D8}$ | $R^{D33}$ | H |
| $L_{B267}$ | $R^{D8}$ | $R^{D34}$ | H |
| $L_{B268}$ | $R^{D8}$ | $R^{D35}$ | H |
| $L_{B269}$ | $R^{D8}$ | $R^{D40}$ | H |
| $L_{B270}$ | $R^{D8}$ | $R^{D41}$ | H |
| $L_{B271}$ | $R^{D8}$ | $R^{D42}$ | H |
| $L_{B272}$ | $R^{D8}$ | $R^{D64}$ | H |
| $L_{B273}$ | $R^{D8}$ | $R^{D66}$ | H |
| $L_{B274}$ | $R^{D8}$ | $R^{D68}$ | H |
| $L_{B275}$ | $R^{D8}$ | $R^{D76}$ | H |
| $L_{B276}$ | $R^{D11}$ | $R^{D5}$ | H |
| $L_{B277}$ | $R^{D11}$ | $R^{D6}$ | H |
| $L_{B278}$ | $R^{D11}$ | $R^{D9}$ | H |
| $L_{B279}$ | $R^{D11}$ | $R^{D10}$ | H |
| $L_{B280}$ | $R^{D11}$ | $R^{D12}$ | H |
| $L_{B281}$ | $R^{D11}$ | $R^{D13}$ | H |
| $L_{B282}$ | $R^{D11}$ | $R^{D14}$ | H |
| $L_{B283}$ | $R^{D11}$ | $R^{D15}$ | H |
| $L_{B284}$ | $R^{D11}$ | $R^{D16}$ | H |
| $L_{B285}$ | $R^{D11}$ | $R^{D17}$ | H |
| $L_{B286}$ | $R^{D11}$ | $R^{D18}$ | H |
| $L_{B287}$ | $R^{D11}$ | $R^{D19}$ | H |
| $L_{B288}$ | $R^{D11}$ | $R^{D20}$ | H |
| $L_{B289}$ | $R^{D11}$ | $R^{D21}$ | H |
| $L_{B290}$ | $R^{D11}$ | $R^{D22}$ | H |
| $L_{B291}$ | $R^{D11}$ | $R^{D23}$ | H |
| $L_{B292}$ | $R^{D11}$ | $R^{D24}$ | H |
| $L_{B293}$ | $R^{D11}$ | $R^{D25}$ | H |
| $L_{B294}$ | $R^{D11}$ | $R^{D26}$ | H |
| $L_{B295}$ | $R^{D11}$ | $R^{D27}$ | H |
| $L_{B296}$ | $R^{D11}$ | $R^{D28}$ | H |
| $L_{B297}$ | $R^{D11}$ | $R^{D29}$ | H |
| $L_{B298}$ | $R^{D11}$ | $R^{D30}$ | H |
| $L_{B299}$ | $R^{D11}$ | $R^{D31}$ | H |
| $L_{B300}$ | $R^{D11}$ | $R^{D32}$ | H |
| $L_{B301}$ | $R^{D11}$ | $R^{D33}$ | H |
| $L_{B302}$ | $R^{D11}$ | $R^{D34}$ | H |
| $L_{B303}$ | $R^{D11}$ | $R^{D35}$ | H |
| $L_{B304}$ | $R^{D11}$ | $R^{D40}$ | H |
| $L_{B305}$ | $R^{D11}$ | $R^{D41}$ | H |
| $L_{B306}$ | $R^{D11}$ | $R^{D42}$ | H |
| $L_{B307}$ | $R^{D11}$ | $R^{D64}$ | H |
| $L_{B308}$ | $R^{D11}$ | $R^{D66}$ | H |
| $L_{B309}$ | $R^{D11}$ | $R^{D68}$ | H |
| $L_{B310}$ | $R^{D11}$ | $R^{D76}$ | H |
| $L_{B311}$ | $R^{D13}$ | $R^{D5}$ | H |
| $L_{B312}$ | $R^{D13}$ | $R^{D6}$ | H |
| $L_{B313}$ | $R^{D13}$ | $R^{D9}$ | H |
| $L_{B314}$ | $R^{D13}$ | $R^{D10}$ | H |
| $L_{B315}$ | $R^{D13}$ | $R^{D12}$ | H |
| $L_{B316}$ | $R^{D13}$ | $R^{D14}$ | H |
| $L_{B317}$ | $R^{D13}$ | $R^{D15}$ | H |
| $L_{B318}$ | $R^{D13}$ | $R^{D16}$ | H |
| $L_{B319}$ | $R^{D13}$ | $R^{D17}$ | H |
| $L_{B320}$ | $R^{D13}$ | $R^{D18}$ | H |
| $L_{B321}$ | $R^{D13}$ | $R^{D19}$ | H |
| $L_{B322}$ | $R^{D13}$ | $R^{D20}$ | H |
| $L_{B323}$ | $R^{D13}$ | $R^{D21}$ | H |
| $L_{B324}$ | $R^{D13}$ | $R^{D22}$ | H |
| $L_{B325}$ | $R^{D13}$ | $R^{D23}$ | H |
| $L_{B326}$ | $R^{D13}$ | $R^{D24}$ | H |
| $L_{B327}$ | $R^{D13}$ | $R^{D25}$ | H |
| $L_{B328}$ | $R^{D13}$ | $R^{D26}$ | H |
| $L_{B329}$ | $R^{D13}$ | $R^{D27}$ | H |
| $L_{B330}$ | $R^{D13}$ | $R^{D28}$ | H |
| $L_{B331}$ | $R^{D13}$ | $R^{D29}$ | H |

-continued

| Ligand | $R^1$ | $R^2$ | $R^3$ |
|---|---|---|---|
| $L_{B332}$ | $R^{D13}$ | $R^{D30}$ | H |
| $L_{B333}$ | $R^{D13}$ | $R^{D31}$ | H |
| $L_{B334}$ | $R^{D13}$ | $R^{D32}$ | H |
| $L_{B335}$ | $R^{D13}$ | $R^{D33}$ | H |
| $L_{B336}$ | $R^{D13}$ | $R^{D34}$ | H |
| $L_{B337}$ | $R^{D13}$ | $R^{D35}$ | H |
| $L_{B338}$ | $R^{D13}$ | $R^{D40}$ | H |
| $L_{B339}$ | $R^{D13}$ | $R^{D41}$ | H |
| $L_{B340}$ | $R^{D13}$ | $R^{D42}$ | H |
| $L_{B341}$ | $R^{D13}$ | $R^{D64}$ | H |
| $L_{B342}$ | $R^{D13}$ | $R^{D66}$ | H |
| $L_{B343}$ | $R^{D13}$ | $R^{D68}$ | H |
| $L_{B344}$ | $R^{D13}$ | $R^{D76}$ | H |
| $L_{B345}$ | $R^{D14}$ | $R^{D5}$ | H |
| $L_{B346}$ | $R^{D14}$ | $R^{D6}$ | H |
| $L_{B347}$ | $R^{D14}$ | $R^{D9}$ | H |
| $L_{B348}$ | $R^{D14}$ | $R^{D10}$ | H |
| $L_{B349}$ | $R^{D14}$ | $R^{D12}$ | H |
| $L_{B350}$ | $R^{D14}$ | $R^{D15}$ | H |
| $L_{B351}$ | $R^{D14}$ | $R^{D16}$ | H |
| $L_{B352}$ | $R^{D14}$ | $R^{D17}$ | H |
| $L_{B353}$ | $R^{D14}$ | $R^{D18}$ | H |
| $L_{B354}$ | $R^{D14}$ | $R^{D19}$ | H |
| $L_{B355}$ | $R^{D14}$ | $R^{D20}$ | H |
| $L_{B356}$ | $R^{D14}$ | $R^{D21}$ | H |
| $L_{B357}$ | $R^{D14}$ | $R^{D22}$ | H |
| $L_{B358}$ | $R^{D14}$ | $R^{D23}$ | H |
| $L_{B359}$ | $R^{D14}$ | $R^{D24}$ | H |
| $L_{B360}$ | $R^{D14}$ | $R^{D25}$ | H |
| $L_{B361}$ | $R^{D14}$ | $R^{D26}$ | H |
| $L_{B362}$ | $R^{D14}$ | $R^{D27}$ | H |
| $L_{B363}$ | $R^{D14}$ | $R^{D28}$ | H |
| $L_{B364}$ | $R^{D14}$ | $R^{D29}$ | H |
| $L_{B365}$ | $R^{D14}$ | $R^{D30}$ | H |
| $L_{B366}$ | $R^{D14}$ | $R^{D31}$ | H |
| $L_{B367}$ | $R^{D14}$ | $R^{D32}$ | H |
| $L_{B368}$ | $R^{D14}$ | $R^{D33}$ | H |
| $L_{B369}$ | $R^{D14}$ | $R^{D34}$ | H |
| $L_{B370}$ | $R^{D14}$ | $R^{D35}$ | H |
| $L_{B371}$ | $R^{D14}$ | $R^{D40}$ | H |
| $L_{B372}$ | $R^{D14}$ | $R^{D41}$ | H |
| $L_{B373}$ | $R^{D14}$ | $R^{D42}$ | H |
| $L_{B374}$ | $R^{D14}$ | $R^{D64}$ | H |
| $L_{B375}$ | $R^{D14}$ | $R^{D66}$ | H |
| $L_{B376}$ | $R^{D14}$ | $R^{D68}$ | H |
| $L_{B377}$ | $R^{D14}$ | $R^{D76}$ | H |
| $L_{B378}$ | $R^{D22}$ | $R^{D5}$ | H |
| $L_{B379}$ | $R^{D22}$ | $R^{D6}$ | H |
| $L_{B380}$ | $R^{D22}$ | $R^{D9}$ | H |
| $L_{B381}$ | $R^{D22}$ | $R^{D10}$ | H |
| $L_{B382}$ | $R^{D22}$ | $R^{D12}$ | H |
| $L_{B383}$ | $R^{D22}$ | $R^{D15}$ | H |
| $L_{B384}$ | $R^{D22}$ | $R^{D16}$ | H |
| $L_{B385}$ | $R^{D22}$ | $R^{D17}$ | H |
| $L_{B386}$ | $R^{D22}$ | $R^{D18}$ | H |
| $L_{B387}$ | $R^{D22}$ | $R^{D19}$ | H |
| $L_{B388}$ | $R^{D22}$ | $R^{D20}$ | H |
| $L_{B389}$ | $R^{D22}$ | $R^{D21}$ | H |
| $L_{B390}$ | $R^{D22}$ | $R^{D23}$ | H |
| $L_{B391}$ | $R^{D22}$ | $R^{D24}$ | H |
| $L_{B392}$ | $R^{D22}$ | $R^{D25}$ | H |
| $L_{B393}$ | $R^{D22}$ | $R^{D26}$ | H |
| $L_{B394}$ | $R^{D22}$ | $R^{D27}$ | H |
| $L_{B395}$ | $R^{D22}$ | $R^{D28}$ | H |
| $L_{B396}$ | $R^{D22}$ | $R^{D29}$ | H |
| $L_{B397}$ | $R^{D22}$ | $R^{D30}$ | H |
| $L_{B398}$ | $R^{D22}$ | $R^{D31}$ | H |
| $L_{B399}$ | $R^{D22}$ | $R^{D32}$ | H |
| $L_{B400}$ | $R^{D22}$ | $R^{D33}$ | H |
| $L_{B401}$ | $R^{D22}$ | $R^{D34}$ | H |
| $L_{B402}$ | $R^{D22}$ | $R^{D35}$ | H |
| $L_{B403}$ | $R^{D22}$ | $R^{D40}$ | H |
| $L_{B404}$ | $R^{D22}$ | $R^{D41}$ | H |
| $L_{B405}$ | $R^{D22}$ | $R^{D42}$ | H |
| $L_{B406}$ | $R^{D22}$ | $R^{D64}$ | H |
| $L_{B407}$ | $R^{D22}$ | $R^{D66}$ | H |
| $L_{B408}$ | $R^{D22}$ | $R^{D68}$ | H |

-continued

| Ligand | $R^1$ | $R^2$ | $R^3$ |
|---|---|---|---|
| $L_{B409}$ | $R^{D22}$ | $R^{D76}$ | H |
| $L_{B410}$ | $R^{D26}$ | $R^{D5}$ | H |
| $L_{B411}$ | $R^{D26}$ | $R^{D6}$ | H |
| $L_{B412}$ | $R^{D26}$ | $R^{D9}$ | H |
| $L_{B413}$ | $R^{D26}$ | $R^{D10}$ | H |
| $L_{B414}$ | $R^{D26}$ | $R^{D12}$ | H |
| $L_{B415}$ | $R^{D26}$ | $R^{D15}$ | H |
| $L_{B416}$ | $R^{D26}$ | $R^{D16}$ | H |
| $L_{B417}$ | $R^{D26}$ | $R^{D17}$ | H |
| $L_{B418}$ | $R^{D26}$ | $R^{D18}$ | H |
| $L_{B419}$ | $R^{D26}$ | $R^{D19}$ | H |
| $L_{B420}$ | $R^{D26}$ | $R^{D20}$ | H |
| $L_{B421}$ | $R^{D26}$ | $R^{D21}$ | H |
| $L_{B422}$ | $R^{D26}$ | $R^{D23}$ | H |
| $L_{B423}$ | $R^{D26}$ | $R^{D24}$ | H |
| $L_{B424}$ | $R^{D26}$ | $R^{D25}$ | H |
| $L_{B425}$ | $R^{D26}$ | $R^{D27}$ | H |
| $L_{B426}$ | $R^{D26}$ | $R^{D28}$ | H |
| $L_{B427}$ | $R^{D26}$ | $R^{D29}$ | H |
| $L_{B428}$ | $R^{D26}$ | $R^{D30}$ | H |
| $L_{B429}$ | $R^{D26}$ | $R^{D31}$ | H |
| $L_{B430}$ | $R^{D26}$ | $R^{D32}$ | H |
| $L_{B431}$ | $R^{D26}$ | $R^{D33}$ | H |
| $L_{B432}$ | $R^{D26}$ | $R^{D34}$ | H |
| $L_{B433}$ | $R^{D26}$ | $R^{D35}$ | H |
| $L_{B434}$ | $R^{D26}$ | $R^{D40}$ | H |
| $L_{B435}$ | $R^{D26}$ | $R^{D41}$ | H |
| $L_{B436}$ | $R^{D26}$ | $R^{D42}$ | H |
| $L_{B437}$ | $R^{D26}$ | $R^{D64}$ | H |
| $L_{B438}$ | $R^{D26}$ | $R^{D66}$ | H |
| $L_{B439}$ | $R^{D26}$ | $R^{D68}$ | H |
| $L_{B440}$ | $R^{D26}$ | $R^{D76}$ | H |
| $L_{B441}$ | $R^{D35}$ | $R^{D5}$ | H |
| $L_{B442}$ | $R^{D35}$ | $R^{D6}$ | H |
| $L_{B443}$ | $R^{D35}$ | $R^{D9}$ | H |
| $L_{B444}$ | $R^{D35}$ | $R^{D10}$ | H |
| $L_{B445}$ | $R^{D35}$ | $R^{D12}$ | H |
| $L_{B446}$ | $R^{D35}$ | $R^{D15}$ | H |
| $L_{B447}$ | $R^{D35}$ | $R^{D16}$ | H |
| $L_{B448}$ | $R^{D35}$ | $R^{D17}$ | H |
| $L_{B449}$ | $R^{D35}$ | $R^{D18}$ | H |
| $L_{B450}$ | $R^{D35}$ | $R^{D19}$ | H |
| $L_{B451}$ | $R^{D35}$ | $R^{D20}$ | H |
| $L_{B452}$ | $R^{D35}$ | $R^{D21}$ | H |
| $L_{B453}$ | $R^{D35}$ | $R^{D23}$ | H |
| $L_{B454}$ | $R^{D35}$ | $R^{D24}$ | H |
| $L_{B455}$ | $R^{D35}$ | $R^{D25}$ | H |
| $L_{B456}$ | $R^{D35}$ | $R^{D27}$ | H |
| $L_{B457}$ | $R^{D35}$ | $R^{D28}$ | H |
| $L_{B458}$ | $R^{D35}$ | $R^{D29}$ | H |
| $L_{B459}$ | $R^{D35}$ | $R^{D30}$ | H |
| $L_{B460}$ | $R^{D35}$ | $R^{D31}$ | H |
| $L_{B461}$ | $R^{D35}$ | $R^{D32}$ | H |
| $L_{B462}$ | $R^{D35}$ | $R^{D33}$ | H |
| $L_{B463}$ | $R^{D35}$ | $R^{D34}$ | H |
| $L_{B464}$ | $R^{D35}$ | $R^{D40}$ | H |
| $L_{B465}$ | $R^{D35}$ | $R^{D41}$ | H |
| $L_{B466}$ | $R^{D35}$ | $R^{D42}$ | H |
| $L_{B467}$ | $R^{D35}$ | $R^{D64}$ | H |
| $L_{B468}$ | $R^{D35}$ | $R^{D66}$ | H |
| $L_{B469}$ | $R^{D35}$ | $R^{D68}$ | H |
| $L_{B470}$ | $R^{D35}$ | $R^{D76}$ | H |
| $L_{B471}$ | $R^{D40}$ | $R^{D5}$ | H |
| $L_{B472}$ | $R^{D40}$ | $R^{D6}$ | H |
| $L_{B473}$ | $R^{D40}$ | $R^{D9}$ | H |
| $L_{B474}$ | $R^{D40}$ | $R^{D10}$ | H |
| $L_{B475}$ | $R^{D40}$ | $R^{D12}$ | H |
| $L_{B476}$ | $R^{D40}$ | $R^{D15}$ | H |
| $L_{B477}$ | $R^{D40}$ | $R^{D16}$ | H |
| $L_{B478}$ | $R^{D40}$ | $R^{D17}$ | H |
| $L_{B479}$ | $R^{D40}$ | $R^{D18}$ | H |
| $L_{B480}$ | $R^{D40}$ | $R^{D19}$ | H |
| $L_{B481}$ | $R^{D40}$ | $R^{D20}$ | H |
| $L_{B482}$ | $R^{D40}$ | $R^{D21}$ | H |
| $L_{B483}$ | $R^{D40}$ | $R^{D23}$ | H |
| $L_{B484}$ | $R^{D40}$ | $R^{D24}$ | H |
| $L_{B485}$ | $R^{D40}$ | $R^{D25}$ | H |

-continued

| Ligand | $R^1$ | $R^2$ | $R^3$ |
|---|---|---|---|
| $L_{B486}$ | $R^{D40}$ | $R^{D27}$ | H |
| $L_{B487}$ | $R^{D40}$ | $R^{D28}$ | H |
| $L_{B488}$ | $R^{D40}$ | $R^{D29}$ | H |
| $L_{B489}$ | $R^{D40}$ | $R^{D30}$ | H |
| $L_{B490}$ | $R^{D40}$ | $R^{D31}$ | H |
| $L_{B491}$ | $R^{D40}$ | $R^{D32}$ | H |
| $L_{B492}$ | $R^{D40}$ | $R^{D33}$ | H |
| $L_{B493}$ | $R^{D40}$ | $R^{D34}$ | H |
| $L_{B494}$ | $R^{D40}$ | $R^{D41}$ | H |
| $L_{B495}$ | $R^{D40}$ | $R^{D42}$ | H |
| $L_{B496}$ | $R^{D40}$ | $R^{D64}$ | H |
| $L_{B497}$ | $R^{D40}$ | $R^{D66}$ | H |
| $L_{B498}$ | $R^{D40}$ | $R^{D68}$ | H |
| $L_{B499}$ | $R^{D40}$ | $R^{D76}$ | H |
| $L_{B500}$ | $R^{D41}$ | $R^{D5}$ | H |
| $L_{B501}$ | $R^{D41}$ | $R^{D6}$ | H |
| $L_{B502}$ | $R^{D41}$ | $R^{D9}$ | H |
| $L_{B503}$ | $R^{D41}$ | $R^{D10}$ | H |
| $L_{B504}$ | $R^{D41}$ | $R^{D12}$ | H |
| $L_{B505}$ | $R^{D41}$ | $R^{D15}$ | H |
| $L_{B506}$ | $R^{D41}$ | $R^{D16}$ | H |
| $L_{B507}$ | $R^{D41}$ | $R^{D17}$ | H |
| $L_{B508}$ | $R^{D41}$ | $R^{D18}$ | H |
| $L_{B509}$ | $R^{D41}$ | $R^{D19}$ | H |
| $L_{B510}$ | $R^{D41}$ | $R^{D20}$ | H |
| $L_{B511}$ | $R^{D41}$ | $R^{D21}$ | H |
| $L_{B512}$ | $R^{D41}$ | $R^{D23}$ | H |
| $L_{B513}$ | $R^{D41}$ | $R^{D24}$ | H |
| $L_{B514}$ | $R^{D41}$ | $R^{D25}$ | H |
| $L_{B515}$ | $R^{D41}$ | $R^{D27}$ | H |
| $L_{B516}$ | $R^{D41}$ | $R^{D28}$ | H |
| $L_{B517}$ | $R^{D41}$ | $R^{D29}$ | H |
| $L_{B518}$ | $R^{D41}$ | $R^{D30}$ | H |
| $L_{B519}$ | $R^{D41}$ | $R^{D31}$ | H |
| $L_{B520}$ | $R^{D41}$ | $R^{D32}$ | H |
| $L_{B521}$ | $R^{D41}$ | $R^{D33}$ | H |
| $L_{B522}$ | $R^{D41}$ | $R^{D34}$ | H |
| $L_{B523}$ | $R^{D41}$ | $R^{D42}$ | H |
| $L_{B524}$ | $R^{D41}$ | $R^{D64}$ | H |
| $L_{B525}$ | $R^{D41}$ | $R^{D66}$ | H |
| $L_{B526}$ | $R^{D41}$ | $R^{D68}$ | H |
| $L_{B527}$ | $R^{D41}$ | $R^{D76}$ | H |
| $L_{B528}$ | $R^{D64}$ | $R^{D5}$ | H |
| $L_{B529}$ | $R^{D64}$ | $R^{D6}$ | H |
| $L_{B530}$ | $R^{D64}$ | $R^{D9}$ | H |
| $L_{B531}$ | $R^{D64}$ | $R^{D10}$ | H |
| $L_{B532}$ | $R^{D64}$ | $R^{D12}$ | H |
| $L_{B533}$ | $R^{D64}$ | $R^{D15}$ | H |
| $L_{B534}$ | $R^{D64}$ | $R^{D16}$ | H |
| $L_{B535}$ | $R^{D64}$ | $R^{D17}$ | H |
| $L_{B536}$ | $R^{D64}$ | $R^{D18}$ | H |
| $L_{B537}$ | $R^{D64}$ | $R^{D19}$ | H |
| $L_{B538}$ | $R^{D64}$ | $R^{D20}$ | H |
| $L_{B539}$ | $R^{D64}$ | $R^{D21}$ | H |
| $L_{B540}$ | $R^{D64}$ | $R^{D23}$ | H |
| $L_{B541}$ | $R^{D64}$ | $R^{D24}$ | H |
| $L_{B542}$ | $R^{D64}$ | $R^{D25}$ | H |
| $L_{B543}$ | $R^{D64}$ | $R^{D27}$ | H |
| $L_{B544}$ | $R^{D64}$ | $R^{D28}$ | H |
| $L_{B545}$ | $R^{D64}$ | $R^{D29}$ | H |
| $L_{B546}$ | $R^{D64}$ | $R^{D30}$ | H |
| $L_{B547}$ | $R^{D64}$ | $R^{D31}$ | H |
| $L_{B548}$ | $R^{D64}$ | $R^{D32}$ | H |
| $L_{B549}$ | $R^{D64}$ | $R^{D33}$ | H |
| $L_{B550}$ | $R^{D64}$ | $R^{D34}$ | H |
| $L_{B551}$ | $R^{D64}$ | $R^{D42}$ | H |
| $L_{B552}$ | $R^{D64}$ | $R^{D64}$ | H |
| $L_{B553}$ | $R^{D64}$ | $R^{D66}$ | H |
| $L_{B554}$ | $R^{D64}$ | $R^{D68}$ | H |
| $L_{B555}$ | $R^{D64}$ | $R^{D76}$ | H |
| $L_{B556}$ | $R^{D66}$ | $R^{D5}$ | H |
| $L_{B557}$ | $R^{D66}$ | $R^{D6}$ | H |
| $L_{B558}$ | $R^{D66}$ | $R^{D9}$ | H |
| $L_{B559}$ | $R^{D66}$ | $R^{D10}$ | H |
| $L_{B560}$ | $R^{D66}$ | $R^{D12}$ | H |
| $L_{B561}$ | $R^{D66}$ | $R^{D15}$ | H |
| $L_{B562}$ | $R^{D66}$ | $R^{D16}$ | H |

-continued

| Ligand | $R^1$ | $R^2$ | $R^3$ |
|---|---|---|---|
| $L_{B563}$ | $R^{D66}$ | $R^{D17}$ | H |
| $L_{B564}$ | $R^{D66}$ | $R^{D18}$ | H |
| $L_{B565}$ | $R^{D66}$ | $R^{D19}$ | H |
| $L_{B566}$ | $R^{D66}$ | $R^{D20}$ | H |
| $L_{B567}$ | $R^{D66}$ | $R^{D21}$ | H |
| $L_{B568}$ | $R^{D66}$ | $R^{D23}$ | H |
| $L_{B569}$ | $R^{D66}$ | $R^{D24}$ | H |
| $L_{B570}$ | $R^{D66}$ | $R^{D25}$ | H |
| $L_{B571}$ | $R^{D66}$ | $R^{D27}$ | H |
| $L_{B572}$ | $R^{D66}$ | $R^{D28}$ | H |
| $L_{B573}$ | $R^{D66}$ | $R^{D29}$ | H |
| $L_{B574}$ | $R^{D66}$ | $R^{D30}$ | H |
| $L_{B575}$ | $R^{D66}$ | $R^{D31}$ | H |
| $L_{B576}$ | $R^{D66}$ | $R^{D32}$ | H |
| $L_{B577}$ | $R^{D66}$ | $R^{D33}$ | H |
| $L_{B578}$ | $R^{D66}$ | $R^{D34}$ | H |
| $L_{B579}$ | $R^{D66}$ | $R^{D42}$ | H |
| $L_{B580}$ | $R^{D66}$ | $R^{D68}$ | H |
| $L_{B581}$ | $R^{D66}$ | $R^{D76}$ | H |
| $L_{B582}$ | $R^{D68}$ | $R^{D5}$ | H |
| $L_{B583}$ | $R^{D68}$ | $R^{D6}$ | H |
| $L_{B584}$ | $R^{D68}$ | $R^{D9}$ | H |
| $L_{B585}$ | $R^{D68}$ | $R^{D10}$ | H |
| $L_{B586}$ | $R^{D68}$ | $R^{D12}$ | H |
| $L_{B587}$ | $R^{D68}$ | $R^{D15}$ | H |
| $L_{B588}$ | $R^{D68}$ | $R^{D16}$ | H |
| $L_{B589}$ | $R^{D68}$ | $R^{D17}$ | H |
| $L_{B590}$ | $R^{D68}$ | $R^{D18}$ | H |
| $L_{B591}$ | $R^{D68}$ | $R^{D19}$ | H |
| $L_{B592}$ | $R^{D68}$ | $R^{D20}$ | H |
| $L_{B593}$ | $R^{D68}$ | $R^{D21}$ | H |
| $L_{B594}$ | $R^{D68}$ | $R^{D23}$ | H |
| $L_{B595}$ | $R^{D68}$ | $R^{D24}$ | H |
| $L_{B596}$ | $R^{D68}$ | $R^{D25}$ | H |
| $L_{B597}$ | $R^{D68}$ | $R^{D27}$ | H |
| $L_{B598}$ | $R^{D68}$ | $R^{D28}$ | H |
| $L_{B599}$ | $R^{D68}$ | $R^{D29}$ | H |
| $L_{B600}$ | $R^{D68}$ | $R^{D30}$ | H |
| $L_{B601}$ | $R^{D68}$ | $R^{D31}$ | H |
| $L_{B602}$ | $R^{D68}$ | $R^{D32}$ | H |
| $L_{B603}$ | $R^{D68}$ | $R^{D33}$ | H |
| $L_{B604}$ | $R^{D68}$ | $R^{D34}$ | H |
| $L_{B605}$ | $R^{D68}$ | $R^{D42}$ | H |
| $L_{B606}$ | $R^{D68}$ | $R^{D76}$ | H |
| $L_{B607}$ | $R^{D76}$ | $R^{D5}$ | H |
| $L_{B608}$ | $R^{D76}$ | $R^{D6}$ | H |
| $L_{B609}$ | $R^{D76}$ | $R^{D9}$ | H |
| $L_{B610}$ | $R^{D76}$ | $R^{D10}$ | H |
| $L_{B611}$ | $R^{D76}$ | $R^{D12}$ | H |
| $L_{B612}$ | $R^{D76}$ | $R^{D15}$ | H |
| $L_{B613}$ | $R^{D76}$ | $R^{D16}$ | H |
| $L_{B614}$ | $R^{D76}$ | $R^{D17}$ | H |
| $L_{B615}$ | $R^{D76}$ | $R^{D18}$ | H |
| $L_{B616}$ | $R^{D76}$ | $R^{D19}$ | H |
| $L_{B617}$ | $R^{D76}$ | $R^{D20}$ | H |
| $L_{B618}$ | $R^{D76}$ | $R^{D21}$ | H |
| $L_{B619}$ | $R^{D76}$ | $R^{D23}$ | H |
| $L_{B620}$ | $R^{D76}$ | $R^{D24}$ | H |
| $L_{B621}$ | $R^{D76}$ | $R^{D25}$ | H |
| $L_{B622}$ | $R^{D76}$ | $R^{D27}$ | H |
| $L_{B623}$ | $R^{D76}$ | $R^{D28}$ | H |
| $L_{B624}$ | $R^{D76}$ | $R^{D29}$ | H |
| $L_{B625}$ | $R^{D76}$ | $R^{D30}$ | H |
| $L_{B626}$ | $R^{D76}$ | $R^{D31}$ | H |
| $L_{B627}$ | $R^{D76}$ | $R^{D32}$ | H |
| $L_{B628}$ | $R^{D76}$ | $R^{D33}$ | H |
| $L_{B629}$ | $R^{D76}$ | $R^{D34}$ | H |
| $L_{B630}$ | $R^{D76}$ | $R^{D42}$ | H |
| $L_{B631}$ | $R^{D1}$ | $R^{D1}$ | $R^{D1}$ |
| $L_{B632}$ | $R^{D2}$ | $R^{D2}$ | $R^{D1}$ |
| $L_{B633}$ | $R^{D3}$ | $R^{D3}$ | $R^{D1}$ |
| $L_{B634}$ | $R^{D4}$ | $R^{D4}$ | $R^{D1}$ |
| $L_{B635}$ | $R^{D5}$ | $R^{D5}$ | $R^{D1}$ |
| $L_{B636}$ | $R^{D6}$ | $R^{D6}$ | $R^{D1}$ |
| $L_{B637}$ | $R^{D7}$ | $R^{D7}$ | $R^{D1}$ |
| $L_{B638}$ | $R^{D8}$ | $R^{D8}$ | $R^{D1}$ |
| $L_{B639}$ | $R^{D9}$ | $R^{D9}$ | $R^{D1}$ |

-continued

| Ligand | $R^1$ | $R^2$ | $R^3$ |
|---|---|---|---|
| $L_{B640}$ | $R^{D10}$ | $R^{D10}$ | $R^{D1}$ |
| $L_{B641}$ | $R^{D11}$ | $R^{D11}$ | $R^{D1}$ |
| $L_{B642}$ | $R^{D12}$ | $R^{D12}$ | $R^{D1}$ |
| $L_{B643}$ | $R^{D13}$ | $R^{D13}$ | $R^{D1}$ |
| $L_{B644}$ | $R^{D14}$ | $R^{D14}$ | $R^{D1}$ |
| $L_{B645}$ | $R^{D15}$ | $R^{D15}$ | $R^{D1}$ |
| $L_{B646}$ | $R^{D16}$ | $R^{D16}$ | $R^{D1}$ |
| $L_{B647}$ | $R^{D17}$ | $R^{D17}$ | $R^{D1}$ |
| $L_{B648}$ | $R^{D18}$ | $R^{D18}$ | $R^{D1}$ |
| $L_{B649}$ | $R^{D19}$ | $R^{D19}$ | $R^{D1}$ |
| $L_{B650}$ | $R^{D20}$ | $R^{D20}$ | $R^{D1}$ |
| $L_{B651}$ | $R^{D21}$ | $R^{D21}$ | $R^{D1}$ |
| $L_{B652}$ | $R^{D22}$ | $R^{D22}$ | $R^{D1}$ |
| $L_{B653}$ | $R^{D23}$ | $R^{D23}$ | $R^{D1}$ |
| $L_{B654}$ | $R^{D24}$ | $R^{D24}$ | $R^{D1}$ |
| $L_{B655}$ | $R^{D25}$ | $R^{D25}$ | $R^{D1}$ |
| $L_{B656}$ | $R^{D26}$ | $R^{D26}$ | $R^{D1}$ |
| $L_{B657}$ | $R^{D27}$ | $R^{D27}$ | $R^{D1}$ |
| $L_{B658}$ | $R^{D28}$ | $R^{D28}$ | $R^{D1}$ |
| $L_{B659}$ | $R^{D29}$ | $R^{D29}$ | $R^{D1}$ |
| $L_{B660}$ | $R^{D30}$ | $R^{D30}$ | $R^{D1}$ |
| $L_{B661}$ | $R^{D31}$ | $R^{D31}$ | $R^{D1}$ |
| $L_{B662}$ | $R^{D32}$ | $R^{D32}$ | $R^{D1}$ |
| $L_{B663}$ | $R^{D33}$ | $R^{D33}$ | $R^{D1}$ |
| $L_{B664}$ | $R^{D34}$ | $R^{D34}$ | $R^{D1}$ |
| $L_{B665}$ | $R^{D35}$ | $R^{D35}$ | $R^{D1}$ |
| $L_{B666}$ | $R^{D40}$ | $R^{D40}$ | $R^{D1}$ |
| $L_{B667}$ | $R^{D41}$ | $R^{D41}$ | $R^{D1}$ |
| $L_{B668}$ | $R^{D42}$ | $R^{D42}$ | $R^{D1}$ |
| $L_{B669}$ | $R^{D64}$ | $R^{D64}$ | $R^{D1}$ |
| $L_{B670}$ | $R^{D66}$ | $R^{D66}$ | $R^{D1}$ |
| $L_{B671}$ | $R^{D68}$ | $R^{D68}$ | $R^{D1}$ |
| $L_{B672}$ | $R^{D76}$ | $R^{D76}$ | $R^{D1}$ |
| $L_{B673}$ | $R^{D1}$ | $R^{D2}$ | $R^{D1}$ |
| $L_{B674}$ | $R^{D1}$ | $R^{D3}$ | $R^{D1}$ |
| $L_{B675}$ | $R^{D1}$ | $R^{D4}$ | $R^{D1}$ |
| $L_{B676}$ | $R^{D1}$ | $R^{D5}$ | $R^{D1}$ |
| $L_{B677}$ | $R^{D1}$ | $R^{D6}$ | $R^{D1}$ |
| $L_{B678}$ | $R^{D1}$ | $R^{D7}$ | $R^{D1}$ |
| $L_{B679}$ | $R^{D1}$ | $R^{D8}$ | $R^{D1}$ |
| $L_{B680}$ | $R^{D1}$ | $R^{D9}$ | $R^{D1}$ |
| $L_{B681}$ | $R^{D1}$ | $R^{D10}$ | $R^{D1}$ |
| $L_{B682}$ | $R^{D1}$ | $R^{D11}$ | $R^{D1}$ |
| $L_{B683}$ | $R^{D1}$ | $R^{D12}$ | $R^{D1}$ |
| $L_{B684}$ | $R^{D1}$ | $R^{D13}$ | $R^{D1}$ |
| $L_{B685}$ | $R^{D1}$ | $R^{D14}$ | $R^{D1}$ |
| $L_{B686}$ | $R^{D1}$ | $R^{D15}$ | $R^{D1}$ |
| $L_{B687}$ | $R^{D1}$ | $R^{D16}$ | $R^{D1}$ |
| $L_{B688}$ | $R^{D1}$ | $R^{D17}$ | $R^{D1}$ |
| $L_{B689}$ | $R^{D1}$ | $R^{D18}$ | $R^{D1}$ |
| $L_{B690}$ | $R^{D1}$ | $R^{D19}$ | $R^{D1}$ |
| $L_{B691}$ | $R^{D1}$ | $R^{D20}$ | $R^{D1}$ |
| $L_{B692}$ | $R^{D1}$ | $R^{D21}$ | $R^{D1}$ |
| $L_{B693}$ | $R^{D1}$ | $R^{D22}$ | $R^{D1}$ |
| $L_{B694}$ | $R^{D1}$ | $R^{D23}$ | $R^{D1}$ |
| $L_{B695}$ | $R^{D1}$ | $R^{D24}$ | $R^{D1}$ |
| $L_{B696}$ | $R^{D1}$ | $R^{D25}$ | $R^{D1}$ |
| $L_{B697}$ | $R^{D1}$ | $R^{D26}$ | $R^{D1}$ |
| $L_{B698}$ | $R^{D1}$ | $R^{D27}$ | $R^{D1}$ |
| $L_{B699}$ | $R^{D1}$ | $R^{D28}$ | $R^{D1}$ |
| $L_{B700}$ | $R^{D1}$ | $R^{D29}$ | $R^{D1}$ |
| $L_{B701}$ | $R^{D1}$ | $R^{D30}$ | $R^{D1}$ |
| $L_{B702}$ | $R^{D1}$ | $R^{D31}$ | $R^{D1}$ |
| $L_{B703}$ | $R^{D1}$ | $R^{D32}$ | $R^{D1}$ |
| $L_{B704}$ | $R^{D1}$ | $R^{D33}$ | $R^{D1}$ |
| $L_{B705}$ | $R^{D1}$ | $R^{D34}$ | $R^{D1}$ |
| $L_{B706}$ | $R^{D1}$ | $R^{D35}$ | $R^{D1}$ |
| $L_{B707}$ | $R^{D1}$ | $R^{D40}$ | $R^{D1}$ |
| $L_{B708}$ | $R^{D1}$ | $R^{D41}$ | $R^{D1}$ |
| $L_{B709}$ | $R^{D1}$ | $R^{D42}$ | $R^{D1}$ |
| $L_{B710}$ | $R^{D1}$ | $R^{D64}$ | $R^{D1}$ |
| $L_{B711}$ | $R^{D1}$ | $R^{D66}$ | $R^{D1}$ |
| $L_{B712}$ | $R^{D1}$ | $R^{D68}$ | $R^{D1}$ |
| $L_{B713}$ | $R^{D1}$ | $R^{D76}$ | $R^{D1}$ |
| $L_{B714}$ | $R^{D2}$ | $R^{D1}$ | $R^{D1}$ |
| $L_{B715}$ | $R^{D2}$ | $R^{D3}$ | $R^{D1}$ |
| $L_{B716}$ | $R^{D2}$ | $R^{D4}$ | $R^{D1}$ |

| Ligand | $R^1$ | $R^2$ | $R^3$ |
|---|---|---|---|
| $L_{B717}$ | $R^{D2}$ | $R^{D5}$ | $R^{D1}$ |
| $L_{B718}$ | $R^{D2}$ | $R^{D6}$ | $R^{D1}$ |
| $L_{B719}$ | $R^{D2}$ | $R^{D7}$ | $R^{D1}$ |
| $L_{B720}$ | $R^{D2}$ | $R^{D8}$ | $R^{D1}$ |
| $L_{B721}$ | $R^{D2}$ | $R^{D9}$ | $R^{D1}$ |
| $L_{B722}$ | $R^{D2}$ | $R^{D10}$ | $R^{D1}$ |
| $L_{B723}$ | $R^{D2}$ | $R^{D11}$ | $R^{D1}$ |
| $L_{B724}$ | $R^{D2}$ | $R^{D12}$ | $R^{D1}$ |
| $L_{B725}$ | $R^{D2}$ | $R^{D13}$ | $R^{D1}$ |
| $L_{B726}$ | $R^{D2}$ | $R^{D14}$ | $R^{D1}$ |
| $L_{B727}$ | $R^{D2}$ | $R^{D15}$ | $R^{D1}$ |
| $L_{B728}$ | $R^{D2}$ | $R^{D16}$ | $R^{D1}$ |
| $L_{B729}$ | $R^{D2}$ | $R^{D17}$ | $R^{D1}$ |
| $L_{B730}$ | $R^{D2}$ | $R^{D18}$ | $R^{D1}$ |
| $L_{B731}$ | $R^{D2}$ | $R^{D19}$ | $R^{D1}$ |
| $L_{B732}$ | $R^{D2}$ | $R^{D20}$ | $R^{D1}$ |
| $L_{B733}$ | $R^{D2}$ | $R^{D21}$ | $R^{D1}$ |
| $L_{B734}$ | $R^{D2}$ | $R^{D22}$ | $R^{D1}$ |
| $L_{B735}$ | $R^{D2}$ | $R^{D23}$ | $R^{D1}$ |
| $L_{B736}$ | $R^{D2}$ | $R^{D24}$ | $R^{D1}$ |
| $L_{B737}$ | $R^{D2}$ | $R^{D25}$ | $R^{D1}$ |
| $L_{B738}$ | $R^{D2}$ | $R^{D26}$ | $R^{D1}$ |
| $L_{B739}$ | $R^{D2}$ | $R^{D27}$ | $R^{D1}$ |
| $L_{B740}$ | $R^{D2}$ | $R^{D28}$ | $R^{D1}$ |
| $L_{B741}$ | $R^{D2}$ | $R^{D29}$ | $R^{D1}$ |
| $L_{B742}$ | $R^{D2}$ | $R^{D30}$ | $R^{D1}$ |
| $L_{B743}$ | $R^{D2}$ | $R^{D31}$ | $R^{D1}$ |
| $L_{B744}$ | $R^{D2}$ | $R^{D32}$ | $R^{D1}$ |
| $L_{B745}$ | $R^{D2}$ | $R^{D33}$ | $R^{D1}$ |
| $L_{B746}$ | $R^{D2}$ | $R^{D34}$ | $R^{D1}$ |
| $L_{B747}$ | $R^{D2}$ | $R^{D35}$ | $R^{D1}$ |
| $L_{B748}$ | $R^{D2}$ | $R^{D40}$ | $R^{D1}$ |
| $L_{B749}$ | $R^{D2}$ | $R^{D41}$ | $R^{D1}$ |
| $L_{B750}$ | $R^{D2}$ | $R^{D42}$ | $R^{D1}$ |
| $L_{B751}$ | $R^{D2}$ | $R^{D64}$ | $R^{D1}$ |
| $L_{B752}$ | $R^{D2}$ | $R^{D66}$ | $R^{D1}$ |
| $L_{B753}$ | $R^{D2}$ | $R^{D68}$ | $R^{D1}$ |
| $L_{B754}$ | $R^{D2}$ | $R^{D76}$ | $R^{D1}$ |
| $L_{B755}$ | $R^{D3}$ | $R^{D4}$ | $R^{D1}$ |
| $L_{B756}$ | $R^{D3}$ | $R^{D5}$ | $R^{D1}$ |
| $L_{B757}$ | $R^{D3}$ | $R^{D6}$ | $R^{D1}$ |
| $L_{B758}$ | $R^{D3}$ | $R^{D7}$ | $R^{D1}$ |
| $L_{B759}$ | $R^{D3}$ | $R^{D8}$ | $R^{D1}$ |
| $L_{B760}$ | $R^{D3}$ | $R^{D9}$ | $R^{D1}$ |
| $L_{B761}$ | $R^{D3}$ | $R^{D10}$ | $R^{D1}$ |
| $L_{B762}$ | $R^{D3}$ | $R^{D11}$ | $R^{D1}$ |
| $L_{B763}$ | $R^{D3}$ | $R^{D12}$ | $R^{D1}$ |
| $L_{B764}$ | $R^{D3}$ | $R^{D13}$ | $R^{D1}$ |
| $L_{B765}$ | $R^{D3}$ | $R^{D14}$ | $R^{D1}$ |
| $L_{B766}$ | $R^{D3}$ | $R^{D15}$ | $R^{D1}$ |
| $L_{B767}$ | $R^{D3}$ | $R^{D16}$ | $R^{D1}$ |
| $L_{B768}$ | $R^{D3}$ | $R^{D17}$ | $R^{D1}$ |
| $L_{B769}$ | $R^{D3}$ | $R^{D18}$ | $R^{D1}$ |
| $L_{B770}$ | $R^{D3}$ | $R^{D19}$ | $R^{D1}$ |
| $L_{B771}$ | $R^{D3}$ | $R^{D20}$ | $R^{D1}$ |
| $L_{B772}$ | $R^{D3}$ | $R^{D21}$ | $R^{D1}$ |
| $L_{B773}$ | $R^{D3}$ | $R^{D22}$ | $R^{D1}$ |
| $L_{B774}$ | $R^{D3}$ | $R^{D23}$ | $R^{D1}$ |
| $L_{B775}$ | $R^{D3}$ | $R^{D24}$ | $R^{D1}$ |
| $L_{B776}$ | $R^{D3}$ | $R^{D25}$ | $R^{D1}$ |
| $L_{B777}$ | $R^{D3}$ | $R^{D26}$ | $R^{D1}$ |
| $L_{B778}$ | $R^{D3}$ | $R^{D27}$ | $R^{D1}$ |
| $L_{B779}$ | $R^{D3}$ | $R^{D28}$ | $R^{D1}$ |
| $L_{B780}$ | $R^{D3}$ | $R^{D29}$ | $R^{D1}$ |
| $L_{B781}$ | $R^{D3}$ | $R^{D30}$ | $R^{D1}$ |
| $L_{B782}$ | $R^{D3}$ | $R^{D31}$ | $R^{D1}$ |
| $L_{B783}$ | $R^{D3}$ | $R^{D32}$ | $R^{D1}$ |
| $L_{B784}$ | $R^{D3}$ | $R^{D33}$ | $R^{D1}$ |
| $L_{B785}$ | $R^{D3}$ | $R^{D34}$ | $R^{D1}$ |
| $L_{B786}$ | $R^{D3}$ | $R^{D35}$ | $R^{D1}$ |
| $L_{B787}$ | $R^{D3}$ | $R^{D40}$ | $R^{D1}$ |
| $L_{B788}$ | $R^{D3}$ | $R^{D41}$ | $R^{D1}$ |
| $L_{B789}$ | $R^{D3}$ | $R^{D42}$ | $R^{D1}$ |
| $L_{B790}$ | $R^{D3}$ | $R^{D64}$ | $R^{D1}$ |
| $L_{B791}$ | $R^{D3}$ | $R^{D66}$ | $R^{D1}$ |
| $L_{B792}$ | $R^{D3}$ | $R^{D68}$ | $R^{D1}$ |
| $L_{B793}$ | $R^{D3}$ | $R^{D76}$ | $R^{D1}$ |

| Ligand | $R^1$ | $R^2$ | $R^3$ |
|---|---|---|---|
| $L_{B794}$ | $R^{D4}$ | $R^{D5}$ | $R^{D1}$ |
| $L_{B795}$ | $R^{D4}$ | $R^{D6}$ | $R^{D1}$ |
| $L_{B796}$ | $R^{D4}$ | $R^{D7}$ | $R^{D1}$ |
| $L_{B797}$ | $R^{D4}$ | $R^{D8}$ | $R^{D1}$ |
| $L_{B798}$ | $R^{D4}$ | $R^{D9}$ | $R^{D1}$ |
| $L_{B799}$ | $R^{D4}$ | $R^{D10}$ | $R^{D1}$ |
| $L_{B800}$ | $R^{D4}$ | $R^{D11}$ | $R^{D1}$ |
| $L_{B801}$ | $R^{D4}$ | $R^{D12}$ | $R^{D1}$ |
| $L_{B802}$ | $R^{D4}$ | $R^{D13}$ | $R^{D1}$ |
| $L_{B803}$ | $R^{D4}$ | $R^{D14}$ | $R^{D1}$ |
| $L_{B804}$ | $R^{D4}$ | $R^{D15}$ | $R^{D1}$ |
| $L_{B805}$ | $R^{D4}$ | $R^{D16}$ | $R^{D1}$ |
| $L_{B806}$ | $R^{D4}$ | $R^{D17}$ | $R^{D1}$ |
| $L_{B807}$ | $R^{D4}$ | $R^{D18}$ | $R^{D1}$ |
| $L_{B808}$ | $R^{D4}$ | $R^{D19}$ | $R^{D1}$ |
| $L_{B809}$ | $R^{D4}$ | $R^{D20}$ | $R^{D1}$ |
| $L_{B810}$ | $R^{D4}$ | $R^{D21}$ | $R^{D1}$ |
| $L_{B811}$ | $R^{D4}$ | $R^{D22}$ | $R^{D1}$ |
| $L_{B812}$ | $R^{D4}$ | $R^{D23}$ | $R^{D1}$ |
| $L_{B813}$ | $R^{D4}$ | $R^{D24}$ | $R^{D1}$ |
| $L_{B814}$ | $R^{D4}$ | $R^{D25}$ | $R^{D1}$ |
| $L_{B815}$ | $R^{D4}$ | $R^{D26}$ | $R^{D1}$ |
| $L_{B816}$ | $R^{D4}$ | $R^{D27}$ | $R^{D1}$ |
| $L_{B817}$ | $R^{D4}$ | $R^{D28}$ | $R^{D1}$ |
| $L_{B818}$ | $R^{D4}$ | $R^{D29}$ | $R^{D1}$ |
| $L_{B819}$ | $R^{D4}$ | $R^{D30}$ | $R^{D1}$ |
| $L_{B820}$ | $R^{D4}$ | $R^{D31}$ | $R^{D1}$ |
| $L_{B821}$ | $R^{D4}$ | $R^{D32}$ | $R^{D1}$ |
| $L_{B822}$ | $R^{D4}$ | $R^{D33}$ | $R^{D1}$ |
| $L_{B823}$ | $R^{D4}$ | $R^{D34}$ | $R^{D1}$ |
| $L_{B824}$ | $R^{D4}$ | $R^{D35}$ | $R^{D1}$ |
| $L_{B825}$ | $R^{D4}$ | $R^{D40}$ | $R^{D1}$ |
| $L_{B826}$ | $R^{D4}$ | $R^{D41}$ | $R^{D1}$ |
| $L_{B827}$ | $R^{D4}$ | $R^{D42}$ | $R^{D1}$ |
| $L_{B828}$ | $R^{D4}$ | $R^{D64}$ | $R^{D1}$ |
| $L_{B829}$ | $R^{D4}$ | $R^{D66}$ | $R^{D1}$ |
| $L_{B830}$ | $R^{D4}$ | $R^{D68}$ | $R^{D1}$ |
| $L_{B831}$ | $R^{D4}$ | $R^{D76}$ | $R^{D1}$ |
| $L_{B832}$ | $R^{D4}$ | $R^{D1}$ | $R^{D1}$ |
| $L_{B833}$ | $R^{D7}$ | $R^{D5}$ | $R^{D1}$ |
| $L_{B834}$ | $R^{D7}$ | $R^{D6}$ | $R^{D1}$ |
| $L_{B835}$ | $R^{D7}$ | $R^{D8}$ | $R^{D1}$ |
| $L_{B836}$ | $R^{D7}$ | $R^{D9}$ | $R^{D1}$ |
| $L_{B837}$ | $R^{D7}$ | $R^{D10}$ | $R^{D1}$ |
| $L_{B838}$ | $R^{D7}$ | $R^{D11}$ | $R^{D1}$ |
| $L_{B839}$ | $R^{D7}$ | $R^{D12}$ | $R^{D1}$ |
| $L_{B840}$ | $R^{D7}$ | $R^{D13}$ | $R^{D1}$ |
| $L_{B841}$ | $R^{D7}$ | $R^{D14}$ | $R^{D1}$ |
| $L_{B842}$ | $R^{D7}$ | $R^{D15}$ | $R^{D1}$ |
| $L_{B843}$ | $R^{D7}$ | $R^{D16}$ | $R^{D1}$ |
| $L_{B844}$ | $R^{D7}$ | $R^{D17}$ | $R^{D1}$ |
| $L_{B845}$ | $R^{D7}$ | $R^{D18}$ | $R^{D1}$ |
| $L_{B846}$ | $R^{D7}$ | $R^{D19}$ | $R^{D1}$ |
| $L_{B847}$ | $R^{D7}$ | $R^{D20}$ | $R^{D1}$ |
| $L_{B848}$ | $R^{D7}$ | $R^{D21}$ | $R^{D1}$ |
| $L_{B849}$ | $R^{D7}$ | $R^{D22}$ | $R^{D1}$ |
| $L_{B850}$ | $R^{D7}$ | $R^{D23}$ | $R^{D1}$ |
| $L_{B851}$ | $R^{D7}$ | $R^{D24}$ | $R^{D1}$ |
| $L_{B852}$ | $R^{D7}$ | $R^{D25}$ | $R^{D1}$ |
| $L_{B853}$ | $R^{D7}$ | $R^{D26}$ | $R^{D1}$ |
| $L_{B854}$ | $R^{D7}$ | $R^{D27}$ | $R^{D1}$ |
| $L_{B855}$ | $R^{D7}$ | $R^{D28}$ | $R^{D1}$ |
| $L_{B856}$ | $R^{D7}$ | $R^{D29}$ | $R^{D1}$ |
| $L_{B857}$ | $R^{D7}$ | $R^{D30}$ | $R^{D1}$ |
| $L_{B858}$ | $R^{D7}$ | $R^{D31}$ | $R^{D1}$ |
| $L_{B859}$ | $R^{D7}$ | $R^{D32}$ | $R^{D1}$ |
| $L_{B860}$ | $R^{D7}$ | $R^{D33}$ | $R^{D1}$ |
| $L_{B861}$ | $R^{D7}$ | $R^{D34}$ | $R^{D1}$ |
| $L_{B862}$ | $R^{D7}$ | $R^{D35}$ | $R^{D1}$ |
| $L_{B863}$ | $R^{D7}$ | $R^{D40}$ | $R^{D1}$ |
| $L_{B864}$ | $R^{D7}$ | $R^{D41}$ | $R^{D1}$ |
| $L_{B865}$ | $R^{D7}$ | $R^{D42}$ | $R^{D1}$ |
| $L_{B866}$ | $R^{D7}$ | $R^{D64}$ | $R^{D1}$ |
| $L_{B867}$ | $R^{D7}$ | $R^{D66}$ | $R^{D1}$ |
| $L_{B868}$ | $R^{D7}$ | $R^{D68}$ | $R^{D1}$ |
| $L_{B869}$ | $R^{D7}$ | $R^{D76}$ | $R^{D1}$ |
| $L_{B870}$ | $R^{D8}$ | $R^{D5}$ | $R^{D1}$ |

-continued

| Ligand | $R^1$ | $R^2$ | $R^3$ |
|---|---|---|---|
| $L_{B871}$ | $R^{D8}$ | $R^{D6}$ | $R^{D1}$ |
| $L_{B872}$ | $R^{D8}$ | $R^{D9}$ | $R^{D1}$ |
| $L_{B873}$ | $R^{D8}$ | $R^{D10}$ | $R^{D1}$ |
| $L_{B874}$ | $R^{D8}$ | $R^{D11}$ | $R^{D1}$ |
| $L_{B875}$ | $R^{D8}$ | $R^{D12}$ | $R^{D1}$ |
| $L_{B876}$ | $R^{D8}$ | $R^{D13}$ | $R^{D1}$ |
| $L_{B877}$ | $R^{D8}$ | $R^{D14}$ | $R^{D1}$ |
| $L_{B878}$ | $R^{D8}$ | $R^{D15}$ | $R^{D1}$ |
| $L_{B879}$ | $R^{D8}$ | $R^{D16}$ | $R^{D1}$ |
| $L_{B880}$ | $R^{D8}$ | $R^{D17}$ | $R^{D1}$ |
| $L_{B881}$ | $R^{D8}$ | $R^{D18}$ | $R^{D1}$ |
| $L_{B882}$ | $R^{D8}$ | $R^{D19}$ | $R^{D1}$ |
| $L_{B883}$ | $R^{D8}$ | $R^{D20}$ | $R^{D1}$ |
| $L_{B884}$ | $R^{D8}$ | $R^{D21}$ | $R^{D1}$ |
| $L_{B885}$ | $R^{D8}$ | $R^{D22}$ | $R^{D1}$ |
| $L_{B886}$ | $R^{D8}$ | $R^{D23}$ | $R^{D1}$ |
| $L_{B887}$ | $R^{D8}$ | $R^{D24}$ | $R^{D1}$ |
| $L_{B888}$ | $R^{D8}$ | $R^{D25}$ | $R^{D1}$ |
| $L_{B889}$ | $R^{D8}$ | $R^{D26}$ | $R^{D1}$ |
| $L_{B890}$ | $R^{D8}$ | $R^{D27}$ | $R^{D1}$ |
| $L_{B891}$ | $R^{D8}$ | $R^{D28}$ | $R^{D1}$ |
| $L_{B892}$ | $R^{D8}$ | $R^{D29}$ | $R^{D1}$ |
| $L_{B893}$ | $R^{D8}$ | $R^{D30}$ | $R^{D1}$ |
| $L_{B894}$ | $R^{D8}$ | $R^{D31}$ | $R^{D1}$ |
| $L_{B895}$ | $R^{D8}$ | $R^{D32}$ | $R^{D1}$ |
| $L_{B896}$ | $R^{D8}$ | $R^{D33}$ | $R^{D1}$ |
| $L_{B897}$ | $R^{D8}$ | $R^{D34}$ | $R^{D1}$ |
| $L_{B898}$ | $R^{D8}$ | $R^{D35}$ | $R^{D1}$ |
| $L_{B899}$ | $R^{D8}$ | $R^{D40}$ | $R^{D1}$ |
| $L_{B900}$ | $R^{D8}$ | $R^{D41}$ | $R^{D1}$ |
| $L_{B901}$ | $R^{D8}$ | $R^{D42}$ | $R^{D1}$ |
| $L_{B902}$ | $R^{D8}$ | $R^{D64}$ | $R^{D1}$ |
| $L_{B903}$ | $R^{D8}$ | $R^{D66}$ | $R^{D1}$ |
| $L_{B904}$ | $R^{D8}$ | $R^{D68}$ | $R^{D1}$ |
| $L_{B905}$ | $R^{D8}$ | $R^{D76}$ | $R^{D1}$ |
| $L_{B906}$ | $R^{D11}$ | $R^{D5}$ | $R^{D1}$ |
| $L_{B907}$ | $R^{D11}$ | $R^{D6}$ | $R^{D1}$ |
| $L_{B908}$ | $R^{D11}$ | $R^{D9}$ | $R^{D1}$ |
| $L_{B909}$ | $R^{D11}$ | $R^{D10}$ | $R^{D1}$ |
| $L_{B910}$ | $R^{D11}$ | $R^{D12}$ | $R^{D1}$ |
| $L_{B911}$ | $R^{D11}$ | $R^{D13}$ | $R^{D1}$ |
| $L_{B912}$ | $R^{D11}$ | $R^{D14}$ | $R^{D1}$ |
| $L_{B913}$ | $R^{D11}$ | $R^{D15}$ | $R^{D1}$ |
| $L_{B914}$ | $R^{D11}$ | $R^{D16}$ | $R^{D1}$ |
| $L_{B915}$ | $R^{D11}$ | $R^{D17}$ | $R^{D1}$ |
| $L_{B916}$ | $R^{D11}$ | $R^{D18}$ | $R^{D1}$ |
| $L_{B917}$ | $R^{D11}$ | $R^{D19}$ | $R^{D1}$ |
| $L_{B918}$ | $R^{D11}$ | $R^{D20}$ | $R^{D1}$ |
| $L_{B919}$ | $R^{D11}$ | $R^{D21}$ | $R^{D1}$ |
| $L_{B920}$ | $R^{D11}$ | $R^{D22}$ | $R^{D1}$ |
| $L_{B921}$ | $R^{D11}$ | $R^{D23}$ | $R^{D1}$ |
| $L_{B922}$ | $R^{D11}$ | $R^{D24}$ | $R^{D1}$ |
| $L_{B923}$ | $R^{D11}$ | $R^{D25}$ | $R^{D1}$ |
| $L_{B924}$ | $R^{D11}$ | $R^{D26}$ | $R^{D1}$ |
| $L_{B925}$ | $R^{D11}$ | $R^{D27}$ | $R^{D1}$ |
| $L_{B926}$ | $R^{D11}$ | $R^{D28}$ | $R^{D1}$ |
| $L_{B927}$ | $R^{D11}$ | $R^{D29}$ | $R^{D1}$ |
| $L_{B928}$ | $R^{D11}$ | $R^{D30}$ | $R^{D1}$ |
| $L_{B929}$ | $R^{D11}$ | $R^{D31}$ | $R^{D1}$ |
| $L_{B930}$ | $R^{D11}$ | $R^{D32}$ | $R^{D1}$ |
| $L_{B931}$ | $R^{D11}$ | $R^{D33}$ | $R^{D1}$ |
| $L_{B932}$ | $R^{D11}$ | $R^{D34}$ | $R^{D1}$ |
| $L_{B933}$ | $R^{D11}$ | $R^{D35}$ | $R^{D1}$ |
| $L_{B934}$ | $R^{D11}$ | $R^{D40}$ | $R^{D1}$ |
| $L_{B935}$ | $R^{D11}$ | $R^{D41}$ | $R^{D1}$ |
| $L_{B936}$ | $R^{D11}$ | $R^{D42}$ | $R^{D1}$ |
| $L_{B937}$ | $R^{D11}$ | $R^{D64}$ | $R^{D1}$ |
| $L_{B938}$ | $R^{D11}$ | $R^{D66}$ | $R^{D1}$ |
| $L_{B939}$ | $R^{D11}$ | $R^{D68}$ | $R^{D1}$ |
| $L_{B940}$ | $R^{D11}$ | $R^{D76}$ | $R^{D1}$ |
| $L_{B941}$ | $R^{D13}$ | $R^{D5}$ | $R^{D1}$ |
| $L_{B942}$ | $R^{D13}$ | $R^{D6}$ | $R^{D1}$ |
| $L_{B943}$ | $R^{D13}$ | $R^{D9}$ | $R^{D1}$ |
| $L_{B944}$ | $R^{D13}$ | $R^{D10}$ | $R^{D1}$ |
| $L_{B945}$ | $R^{D13}$ | $R^{D12}$ | $R^{D1}$ |
| $L_{B946}$ | $R^{D13}$ | $R^{D14}$ | $R^{D1}$ |
| $L_{B947}$ | $R^{D13}$ | $R^{D15}$ | $R^{D1}$ |

-continued

| Ligand | $R^1$ | $R^2$ | $R^3$ |
|---|---|---|---|
| $L_{B948}$ | $R^{D13}$ | $R^{D16}$ | $R^{D1}$ |
| $L_{B949}$ | $R^{D13}$ | $R^{D17}$ | $R^{D1}$ |
| $L_{B950}$ | $R^{D13}$ | $R^{D18}$ | $R^{D1}$ |
| $L_{B951}$ | $R^{D13}$ | $R^{D19}$ | $R^{D1}$ |
| $L_{B952}$ | $R^{D13}$ | $R^{D20}$ | $R^{D1}$ |
| $L_{B953}$ | $R^{D13}$ | $R^{D21}$ | $R^{D1}$ |
| $L_{B954}$ | $R^{D13}$ | $R^{D22}$ | $R^{D1}$ |
| $L_{B955}$ | $R^{D13}$ | $R^{D23}$ | $R^{D1}$ |
| $L_{B956}$ | $R^{D13}$ | $R^{D24}$ | $R^{D1}$ |
| $L_{B957}$ | $R^{D13}$ | $R^{D25}$ | $R^{D1}$ |
| $L_{B958}$ | $R^{D13}$ | $R^{D26}$ | $R^{D1}$ |
| $L_{B959}$ | $R^{D13}$ | $R^{D27}$ | $R^{D1}$ |
| $L_{B960}$ | $R^{D13}$ | $R^{D28}$ | $R^{D1}$ |
| $L_{B961}$ | $R^{D13}$ | $R^{D29}$ | $R^{D1}$ |
| $L_{B962}$ | $R^{D13}$ | $R^{D30}$ | $R^{D1}$ |
| $L_{B963}$ | $R^{D13}$ | $R^{D31}$ | $R^{D1}$ |
| $L_{B964}$ | $R^{D13}$ | $R^{D32}$ | $R^{D1}$ |
| $L_{B965}$ | $R^{D13}$ | $R^{D33}$ | $R^{D1}$ |
| $L_{B966}$ | $R^{D13}$ | $R^{D34}$ | $R^{D1}$ |
| $L_{B967}$ | $R^{D13}$ | $R^{D35}$ | $R^{D1}$ |
| $L_{B968}$ | $R^{D13}$ | $R^{D40}$ | $R^{D1}$ |
| $L_{B969}$ | $R^{D13}$ | $R^{D41}$ | $R^{D1}$ |
| $L_{B970}$ | $R^{D13}$ | $R^{D42}$ | $R^{D1}$ |
| $L_{B971}$ | $R^{D13}$ | $R^{D64}$ | $R^{D1}$ |
| $L_{B972}$ | $R^{D13}$ | $R^{D66}$ | $R^{D1}$ |
| $L_{B973}$ | $R^{D13}$ | $R^{D68}$ | $R^{D1}$ |
| $L_{B974}$ | $R^{D13}$ | $R^{D76}$ | $R^{D1}$ |
| $L_{B975}$ | $R^{D14}$ | $R^{D5}$ | $R^{D1}$ |
| $L_{B976}$ | $R^{D14}$ | $R^{D6}$ | $R^{D1}$ |
| $L_{B977}$ | $R^{D14}$ | $R^{D9}$ | $R^{D1}$ |
| $L_{B978}$ | $R^{D14}$ | $R^{D10}$ | $R^{D1}$ |
| $L_{B979}$ | $R^{D14}$ | $R^{D12}$ | $R^{D1}$ |
| $L_{B980}$ | $R^{D14}$ | $R^{D15}$ | $R^{D1}$ |
| $L_{B981}$ | $R^{D14}$ | $R^{D16}$ | $R^{D1}$ |
| $L_{B982}$ | $R^{D14}$ | $R^{D17}$ | $R^{D1}$ |
| $L_{B983}$ | $R^{D14}$ | $R^{D18}$ | $R^{D1}$ |
| $L_{B984}$ | $R^{D14}$ | $R^{D19}$ | $R^{D1}$ |
| $L_{B985}$ | $R^{D14}$ | $R^{D20}$ | $R^{D1}$ |
| $L_{B986}$ | $R^{D14}$ | $R^{D21}$ | $R^{D1}$ |
| $L_{B987}$ | $R^{D14}$ | $R^{D22}$ | $R^{D1}$ |
| $L_{B988}$ | $R^{D14}$ | $R^{D23}$ | $R^{D1}$ |
| $L_{B989}$ | $R^{D14}$ | $R^{D24}$ | $R^{D1}$ |
| $L_{B990}$ | $R^{D14}$ | $R^{D25}$ | $R^{D1}$ |
| $L_{B991}$ | $R^{D14}$ | $R^{D26}$ | $R^{D1}$ |
| $L_{B992}$ | $R^{D14}$ | $R^{D27}$ | $R^{D1}$ |
| $L_{B993}$ | $R^{D14}$ | $R^{D28}$ | $R^{D1}$ |
| $L_{B994}$ | $R^{D14}$ | $R^{D29}$ | $R^{D1}$ |
| $L_{B995}$ | $R^{D14}$ | $R^{D30}$ | $R^{D1}$ |
| $L_{B996}$ | $R^{D14}$ | $R^{D31}$ | $R^{D1}$ |
| $L_{B997}$ | $R^{D14}$ | $R^{D32}$ | $R^{D1}$ |
| $L_{B998}$ | $R^{D14}$ | $R^{D33}$ | $R^{D1}$ |
| $L_{B999}$ | $R^{D14}$ | $R^{D34}$ | $R^{D1}$ |
| $L_{B1000}$ | $R^{D14}$ | $R^{D35}$ | $R^{D1}$ |
| $L_{B1001}$ | $R^{D14}$ | $R^{D40}$ | $R^{D1}$ |
| $L_{B1002}$ | $R^{D14}$ | $R^{D41}$ | $R^{D1}$ |
| $L_{B1003}$ | $R^{D14}$ | $R^{D42}$ | $R^{D1}$ |
| $L_{B1004}$ | $R^{D14}$ | $R^{D64}$ | $R^{D1}$ |
| $L_{B1005}$ | $R^{D14}$ | $R^{D66}$ | $R^{D1}$ |
| $L_{B1006}$ | $R^{D14}$ | $R^{D68}$ | $R^{D1}$ |
| $L_{B1007}$ | $R^{D14}$ | $R^{D76}$ | $R^{D1}$ |
| $L_{B1008}$ | $R^{D22}$ | $R^{D5}$ | $R^{D1}$ |
| $L_{B1009}$ | $R^{D22}$ | $R^{D6}$ | $R^{D1}$ |
| $L_{B1010}$ | $R^{D22}$ | $R^{D9}$ | $R^{D1}$ |
| $L_{B1011}$ | $R^{D22}$ | $R^{D10}$ | $R^{D1}$ |
| $L_{B1012}$ | $R^{D22}$ | $R^{D12}$ | $R^{D1}$ |
| $L_{B1013}$ | $R^{D22}$ | $R^{D15}$ | $R^{D1}$ |
| $L_{B1014}$ | $R^{D22}$ | $R^{D16}$ | $R^{D1}$ |
| $L_{B1015}$ | $R^{D22}$ | $R^{D17}$ | $R^{D1}$ |
| $L_{B1016}$ | $R^{D22}$ | $R^{D18}$ | $R^{D1}$ |
| $L_{B1017}$ | $R^{D22}$ | $R^{D19}$ | $R^{D1}$ |
| $L_{B1018}$ | $R^{D22}$ | $R^{D20}$ | $R^{D1}$ |
| $L_{B1019}$ | $R^{D22}$ | $R^{D21}$ | $R^{D1}$ |
| $L_{B1020}$ | $R^{D22}$ | $R^{D23}$ | $R^{D1}$ |
| $L_{B1021}$ | $R^{D22}$ | $R^{D24}$ | $R^{D1}$ |
| $L_{B1022}$ | $R^{D22}$ | $R^{D25}$ | $R^{D1}$ |
| $L_{B1023}$ | $R^{D22}$ | $R^{D26}$ | $R^{D1}$ |
| $L_{B1024}$ | $R^{D22}$ | $R^{D27}$ | $R^{D1}$ |

-continued

| Ligand | $R^1$ | $R^2$ | $R^3$ |
|---|---|---|---|
| $L_{B1025}$ | $R^{D22}$ | $R^{D28}$ | $R^{D1}$ |
| $L_{B1026}$ | $R^{D22}$ | $R^{D29}$ | $R^{D1}$ |
| $L_{B1027}$ | $R^{D22}$ | $R^{D30}$ | $R^{D1}$ |
| $L_{B1028}$ | $R^{D22}$ | $R^{D31}$ | $R^{D1}$ |
| $L_{B1029}$ | $R^{D22}$ | $R^{D32}$ | $R^{D1}$ |
| $L_{B1030}$ | $R^{D22}$ | $R^{D33}$ | $R^{D1}$ |
| $L_{B1031}$ | $R^{D22}$ | $R^{D34}$ | $R^{D1}$ |
| $L_{B1032}$ | $R^{D22}$ | $R^{D35}$ | $R^{D1}$ |
| $L_{B1033}$ | $R^{D22}$ | $R^{D40}$ | $R^{D1}$ |
| $L_{B1034}$ | $R^{D22}$ | $R^{D41}$ | $R^{D1}$ |
| $L_{B1035}$ | $R^{D22}$ | $R^{D42}$ | $R^{D1}$ |
| $L_{B1036}$ | $R^{D22}$ | $R^{D64}$ | $R^{D1}$ |
| $L_{B1037}$ | $R^{D22}$ | $R^{D66}$ | $R^{D1}$ |
| $L_{B1038}$ | $R^{D22}$ | $R^{D68}$ | $R^{D1}$ |
| $L_{B1039}$ | $R^{D22}$ | $R^{D76}$ | $R^{D1}$ |
| $L_{B1040}$ | $R^{D26}$ | $R^{D5}$ | $R^{D1}$ |
| $L_{B1041}$ | $R^{D26}$ | $R^{D6}$ | $R^{D1}$ |
| $L_{B1042}$ | $R^{D26}$ | $R^{D9}$ | $R^{D1}$ |
| $L_{B1043}$ | $R^{D26}$ | $R^{D10}$ | $R^{D1}$ |
| $L_{B1044}$ | $R^{D26}$ | $R^{D12}$ | $R^{D1}$ |
| $L_{B1045}$ | $R^{D26}$ | $R^{D15}$ | $R^{D1}$ |
| $L_{B1046}$ | $R^{D26}$ | $R^{D16}$ | $R^{D1}$ |
| $L_{B1047}$ | $R^{D26}$ | $R^{D17}$ | $R^{D1}$ |
| $L_{B1048}$ | $R^{D26}$ | $R^{D18}$ | $R^{D1}$ |
| $L_{B1049}$ | $R^{D26}$ | $R^{D19}$ | $R^{D1}$ |
| $L_{B1050}$ | $R^{D26}$ | $R^{D20}$ | $R^{D1}$ |
| $L_{B1051}$ | $R^{D26}$ | $R^{D21}$ | $R^{D1}$ |
| $L_{B1052}$ | $R^{D26}$ | $R^{D23}$ | $R^{D1}$ |
| $L_{B1053}$ | $R^{D26}$ | $R^{D24}$ | $R^{D1}$ |
| $L_{B1054}$ | $R^{D26}$ | $R^{D25}$ | $R^{D1}$ |
| $L_{B1055}$ | $R^{D26}$ | $R^{D27}$ | $R^{D1}$ |
| $L_{B1056}$ | $R^{D26}$ | $R^{D28}$ | $R^{D1}$ |
| $L_{B1057}$ | $R^{D26}$ | $R^{D29}$ | $R^{D1}$ |
| $L_{B1058}$ | $R^{D26}$ | $R^{D30}$ | $R^{D1}$ |
| $L_{B1059}$ | $R^{D26}$ | $R^{D31}$ | $R^{D1}$ |
| $L_{B1060}$ | $R^{D26}$ | $R^{D32}$ | $R^{D1}$ |
| $L_{B1061}$ | $R^{D26}$ | $R^{D33}$ | $R^{D1}$ |
| $L_{B1062}$ | $R^{D26}$ | $R^{D34}$ | $R^{D1}$ |
| $L_{B1063}$ | $R^{D26}$ | $R^{D35}$ | $R^{D1}$ |
| $L_{B1064}$ | $R^{D26}$ | $R^{D40}$ | $R^{D1}$ |
| $L_{B1065}$ | $R^{D26}$ | $R^{D41}$ | $R^{D1}$ |
| $L_{B1066}$ | $R^{D26}$ | $R^{D42}$ | $R^{D1}$ |
| $L_{B1067}$ | $R^{D26}$ | $R^{D64}$ | $R^{D1}$ |
| $L_{B1068}$ | $R^{D26}$ | $R^{D66}$ | $R^{D1}$ |
| $L_{B1069}$ | $R^{D26}$ | $R^{D68}$ | $R^{D1}$ |
| $L_{B1070}$ | $R^{D26}$ | $R^{D76}$ | $R^{D1}$ |
| $L_{B1071}$ | $R^{D35}$ | $R^{D5}$ | $R^{D1}$ |
| $L_{B1072}$ | $R^{D35}$ | $R^{D6}$ | $R^{D1}$ |
| $L_{B1073}$ | $R^{D35}$ | $R^{D9}$ | $R^{D1}$ |
| $L_{B1074}$ | $R^{D35}$ | $R^{D10}$ | $R^{D1}$ |
| $L_{B1075}$ | $R^{D35}$ | $R^{D12}$ | $R^{D1}$ |
| $L_{B1076}$ | $R^{D35}$ | $R^{D15}$ | $R^{D1}$ |
| $L_{B1077}$ | $R^{D35}$ | $R^{D16}$ | $R^{D1}$ |
| $L_{B1078}$ | $R^{D35}$ | $R^{D17}$ | $R^{D1}$ |
| $L_{B1079}$ | $R^{D35}$ | $R^{D18}$ | $R^{D1}$ |
| $L_{B1080}$ | $R^{D35}$ | $R^{D19}$ | $R^{D1}$ |
| $L_{B1081}$ | $R^{D35}$ | $R^{D20}$ | $R^{D1}$ |
| $L_{B1082}$ | $R^{D35}$ | $R^{D21}$ | $R^{D1}$ |
| $L_{B1083}$ | $R^{D35}$ | $R^{D23}$ | $R^{D1}$ |
| $L_{B1084}$ | $R^{D35}$ | $R^{D24}$ | $R^{D1}$ |
| $L_{B1085}$ | $R^{D35}$ | $R^{D25}$ | $R^{D1}$ |
| $L_{B1086}$ | $R^{D35}$ | $R^{D27}$ | $R^{D1}$ |
| $L_{B1087}$ | $R^{D35}$ | $R^{D28}$ | $R^{D1}$ |
| $L_{B1088}$ | $R^{D35}$ | $R^{D29}$ | $R^{D1}$ |
| $L_{B1089}$ | $R^{D35}$ | $R^{D30}$ | $R^{D1}$ |
| $L_{B1090}$ | $R^{D35}$ | $R^{D31}$ | $R^{D1}$ |
| $L_{B1091}$ | $R^{D35}$ | $R^{D32}$ | $R^{D1}$ |
| $L_{B1092}$ | $R^{D35}$ | $R^{D33}$ | $R^{D1}$ |
| $L_{B1093}$ | $R^{D35}$ | $R^{D34}$ | $R^{D1}$ |
| $L_{B1094}$ | $R^{D35}$ | $R^{D40}$ | $R^{D1}$ |
| $L_{B1095}$ | $R^{D35}$ | $R^{D41}$ | $R^{D1}$ |
| $L_{B1096}$ | $R^{D35}$ | $R^{D42}$ | $R^{D1}$ |
| $L_{B1097}$ | $R^{D35}$ | $R^{D64}$ | $R^{D1}$ |
| $L_{B1098}$ | $R^{D35}$ | $R^{D66}$ | $R^{D1}$ |
| $L_{B1099}$ | $R^{D35}$ | $R^{D68}$ | $R^{D1}$ |
| $L_{B1100}$ | $R^{D35}$ | $R^{D76}$ | $R^{D1}$ |
| $L_{B1101}$ | $R^{D40}$ | $R^{D5}$ | $R^{D1}$ |

-continued

| Ligand | $R^1$ | $R^2$ | $R^3$ |
|---|---|---|---|
| $L_{B1102}$ | $R^{D40}$ | $R^{D6}$ | $R^{D1}$ |
| $L_{B1103}$ | $R^{D40}$ | $R^{D9}$ | $R^{D1}$ |
| $L_{B1104}$ | $R^{D40}$ | $R^{D10}$ | $R^{D1}$ |
| $L_{B1105}$ | $R^{D40}$ | $R^{D12}$ | $R^{D1}$ |
| $L_{B1106}$ | $R^{D40}$ | $R^{D15}$ | $R^{D1}$ |
| $L_{B1107}$ | $R^{D40}$ | $R^{D16}$ | $R^{D1}$ |
| $L_{B1108}$ | $R^{D40}$ | $R^{D17}$ | $R^{D1}$ |
| $L_{B1109}$ | $R^{D40}$ | $R^{D18}$ | $R^{D1}$ |
| $L_{B1110}$ | $R^{D40}$ | $R^{D19}$ | $R^{D1}$ |
| $L_{B1111}$ | $R^{D40}$ | $R^{D20}$ | $R^{D1}$ |
| $L_{B1112}$ | $R^{D40}$ | $R^{D21}$ | $R^{D1}$ |
| $L_{B1113}$ | $R^{D40}$ | $R^{D23}$ | $R^{D1}$ |
| $L_{B1114}$ | $R^{D40}$ | $R^{D24}$ | $R^{D1}$ |
| $L_{B1115}$ | $R^{D40}$ | $R^{D25}$ | $R^{D1}$ |
| $L_{B1116}$ | $R^{D40}$ | $R^{D27}$ | $R^{D1}$ |
| $L_{B1117}$ | $R^{D40}$ | $R^{D28}$ | $R^{D1}$ |
| $L_{B1118}$ | $R^{D40}$ | $R^{D29}$ | $R^{D1}$ |
| $L_{B1119}$ | $R^{D40}$ | $R^{D30}$ | $R^{D1}$ |
| $L_{B1120}$ | $R^{D40}$ | $R^{D31}$ | $R^{D1}$ |
| $L_{B1121}$ | $R^{D40}$ | $R^{D32}$ | $R^{D1}$ |
| $L_{B1122}$ | $R^{D40}$ | $R^{D33}$ | $R^{D1}$ |
| $L_{B1123}$ | $R^{D40}$ | $R^{D34}$ | $R^{D1}$ |
| $L_{B1124}$ | $R^{D40}$ | $R^{D41}$ | $R^{D1}$ |
| $L_{B1125}$ | $R^{D40}$ | $R^{D42}$ | $R^{D1}$ |
| $L_{B1126}$ | $R^{D40}$ | $R^{D64}$ | $R^{D1}$ |
| $L_{B1127}$ | $R^{D40}$ | $R^{D66}$ | $R^{D1}$ |
| $L_{B1128}$ | $R^{D40}$ | $R^{D68}$ | $R^{D1}$ |
| $L_{B1129}$ | $R^{D40}$ | $R^{D76}$ | $R^{D1}$ |
| $L_{B1130}$ | $R^{D41}$ | $R^{D5}$ | $R^{D1}$ |
| $L_{B1131}$ | $R^{D41}$ | $R^{D6}$ | $R^{D1}$ |
| $L_{B1132}$ | $R^{D41}$ | $R^{D9}$ | $R^{D1}$ |
| $L_{B1133}$ | $R^{D41}$ | $R^{D10}$ | $R^{D1}$ |
| $L_{B1134}$ | $R^{D41}$ | $R^{D12}$ | $R^{D1}$ |
| $L_{B1135}$ | $R^{D41}$ | $R^{D15}$ | $R^{D1}$ |
| $L_{B1136}$ | $R^{D41}$ | $R^{D16}$ | $R^{D1}$ |
| $L_{B1137}$ | $R^{D41}$ | $R^{D17}$ | $R^{D1}$ |
| $L_{B1138}$ | $R^{D41}$ | $R^{D18}$ | $R^{D1}$ |
| $L_{B1139}$ | $R^{D41}$ | $R^{D19}$ | $R^{D1}$ |
| $L_{B1140}$ | $R^{D41}$ | $R^{D20}$ | $R^{D1}$ |
| $L_{B1141}$ | $R^{D41}$ | $R^{D21}$ | $R^{D1}$ |
| $L_{B1142}$ | $R^{D41}$ | $R^{D23}$ | $R^{D1}$ |
| $L_{B1143}$ | $R^{D41}$ | $R^{D24}$ | $R^{D1}$ |
| $L_{B1144}$ | $R^{D41}$ | $R^{D25}$ | $R^{D1}$ |
| $L_{B1145}$ | $R^{D41}$ | $R^{D27}$ | $R^{D1}$ |
| $L_{B1146}$ | $R^{D41}$ | $R^{D28}$ | $R^{D1}$ |
| $L_{B1147}$ | $R^{D41}$ | $R^{D29}$ | $R^{D1}$ |
| $L_{B1148}$ | $R^{D41}$ | $R^{D30}$ | $R^{D1}$ |
| $L_{B1149}$ | $R^{D41}$ | $R^{D31}$ | $R^{D1}$ |
| $L_{B1150}$ | $R^{D41}$ | $R^{D32}$ | $R^{D1}$ |
| $L_{B1151}$ | $R^{D41}$ | $R^{D33}$ | $R^{D1}$ |
| $L_{B1152}$ | $R^{D41}$ | $R^{D34}$ | $R^{D1}$ |
| $L_{B1153}$ | $R^{D41}$ | $R^{D42}$ | $R^{D1}$ |
| $L_{B1154}$ | $R^{D41}$ | $R^{D64}$ | $R^{D1}$ |
| $L_{B1155}$ | $R^{D41}$ | $R^{D66}$ | $R^{D1}$ |
| $L_{B1156}$ | $R^{D41}$ | $R^{D68}$ | $R^{D1}$ |
| $L_{B1157}$ | $R^{D41}$ | $R^{D76}$ | $R^{D1}$ |
| $L_{B1158}$ | $R^{D64}$ | $R^{D5}$ | $R^{D1}$ |
| $L_{B1159}$ | $R^{D64}$ | $R^{D6}$ | $R^{D1}$ |
| $L_{B1160}$ | $R^{D64}$ | $R^{D9}$ | $R^{D1}$ |
| $L_{B1161}$ | $R^{D64}$ | $R^{D10}$ | $R^{D1}$ |
| $L_{B1162}$ | $R^{D64}$ | $R^{D12}$ | $R^{D1}$ |
| $L_{B1163}$ | $R^{D64}$ | $R^{D15}$ | $R^{D1}$ |
| $L_{B1164}$ | $R^{D64}$ | $R^{D16}$ | $R^{D1}$ |
| $L_{B1165}$ | $R^{D64}$ | $R^{D17}$ | $R^{D1}$ |
| $L_{B1166}$ | $R^{D64}$ | $R^{D18}$ | $R^{D1}$ |
| $L_{B1167}$ | $R^{D64}$ | $R^{D19}$ | $R^{D1}$ |
| $L_{B1168}$ | $R^{D64}$ | $R^{D20}$ | $R^{D1}$ |
| $L_{B1169}$ | $R^{D64}$ | $R^{D21}$ | $R^{D1}$ |
| $L_{B1170}$ | $R^{D64}$ | $R^{D23}$ | $R^{D1}$ |
| $L_{B1171}$ | $R^{D64}$ | $R^{D24}$ | $R^{D1}$ |
| $L_{B1172}$ | $R^{D64}$ | $R^{D25}$ | $R^{D1}$ |
| $L_{B1173}$ | $R^{D64}$ | $R^{D27}$ | $R^{D1}$ |
| $L_{B1174}$ | $R^{D64}$ | $R^{D28}$ | $R^{D1}$ |
| $L_{B1175}$ | $R^{D64}$ | $R^{D29}$ | $R^{D1}$ |
| $L_{B1176}$ | $R^{D64}$ | $R^{D30}$ | $R^{D1}$ |
| $L_{B1177}$ | $R^{D64}$ | $R^{D31}$ | $R^{D1}$ |
| $L_{B1178}$ | $R^{D64}$ | $R^{D32}$ | $R^{D1}$ |

-continued

| Ligand | $R^1$ | $R^2$ | $R^3$ |
|---|---|---|---|
| $L_{B1179}$ | $R^{D64}$ | $R^{D33}$ | $R^{D1}$ |
| $L_{B1180}$ | $R^{D64}$ | $R^{D34}$ | $R^{D1}$ |
| $L_{B1181}$ | $R^{D64}$ | $R^{D42}$ | $R^{D1}$ |
| $L_{B1182}$ | $R^{D64}$ | $R^{D64}$ | $R^{D1}$ |
| $L_{B1183}$ | $R^{D64}$ | $R^{D66}$ | $R^{D1}$ |
| $L_{B1184}$ | $R^{D64}$ | $R^{D68}$ | $R^{D1}$ |
| $L_{B1185}$ | $R^{D64}$ | $R^{D76}$ | $R^{D1}$ |
| $L_{B1186}$ | $R^{D66}$ | $R^{D5}$ | $R^{D1}$ |
| $L_{B1187}$ | $R^{D66}$ | $R^{D6}$ | $R^{D1}$ |
| $L_{B1188}$ | $R^{D66}$ | $R^{D9}$ | $R^{D1}$ |
| $L_{B1189}$ | $R^{D66}$ | $R^{D10}$ | $R^{D1}$ |
| $L_{B1190}$ | $R^{D66}$ | $R^{D12}$ | $R^{D1}$ |
| $L_{B1191}$ | $R^{D66}$ | $R^{D15}$ | $R^{D1}$ |
| $L_{B1192}$ | $R^{D66}$ | $R^{D16}$ | $R^{D1}$ |
| $L_{B1193}$ | $R^{D66}$ | $R^{D17}$ | $R^{D1}$ |
| $L_{B1194}$ | $R^{D66}$ | $R^{D18}$ | $R^{D1}$ |
| $L_{B1195}$ | $R^{D66}$ | $R^{D19}$ | $R^{D1}$ |
| $L_{B1196}$ | $R^{D66}$ | $R^{D20}$ | $R^{D1}$ |
| $L_{B1197}$ | $R^{D66}$ | $R^{D21}$ | $R^{D1}$ |
| $L_{B1198}$ | $R^{D66}$ | $R^{D23}$ | $R^{D1}$ |
| $L_{B1199}$ | $R^{D66}$ | $R^{D24}$ | $R^{D1}$ |
| $L_{B1200}$ | $R^{D66}$ | $R^{D25}$ | $R^{D1}$ |
| $L_{B1201}$ | $R^{D66}$ | $R^{D27}$ | $R^{D1}$ |
| $L_{B1202}$ | $R^{D66}$ | $R^{D28}$ | $R^{D1}$ |
| $L_{B1203}$ | $R^{D66}$ | $R^{D29}$ | $R^{D1}$ |
| $L_{B1204}$ | $R^{D66}$ | $R^{D30}$ | $R^{D1}$ |
| $L_{B1205}$ | $R^{D66}$ | $R^{D31}$ | $R^{D1}$ |
| $L_{B1206}$ | $R^{D66}$ | $R^{D32}$ | $R^{D1}$ |
| $L_{B1207}$ | $R^{D66}$ | $R^{D33}$ | $R^{D1}$ |
| $L_{B1208}$ | $R^{D66}$ | $R^{D34}$ | $R^{D1}$ |
| $L_{B1209}$ | $R^{D66}$ | $R^{D42}$ | $R^{D1}$ |
| $L_{B1210}$ | $R^{D66}$ | $R^{D68}$ | $R^{D1}$ |
| $L_{B1211}$ | $R^{D66}$ | $R^{D76}$ | $R^{D1}$ |
| $L_{B1212}$ | $R^{D68}$ | $R^{D5}$ | $R^{D1}$ |
| $L_{B1213}$ | $R^{D68}$ | $R^{D6}$ | $R^{D1}$ |
| $L_{B1214}$ | $R^{D68}$ | $R^{D9}$ | $R^{D1}$ |
| $L_{B1215}$ | $R^{D68}$ | $R^{D10}$ | $R^{D1}$ |
| $L_{B1216}$ | $R^{D68}$ | $R^{D12}$ | $R^{D1}$ |
| $L_{B1217}$ | $R^{D68}$ | $R^{D15}$ | $R^{D1}$ |
| $L_{B1218}$ | $R^{D68}$ | $R^{D16}$ | $R^{D1}$ |
| $L_{B1219}$ | $R^{D68}$ | $R^{D17}$ | $R^{D1}$ |
| $L_{B1220}$ | $R^{D68}$ | $R^{D18}$ | $R^{D1}$ |
| $L_{B1221}$ | $R^{D68}$ | $R^{D19}$ | $R^{D1}$ |
| $L_{B1222}$ | $R^{D68}$ | $R^{D20}$ | $R^{D1}$ |
| $L_{B1223}$ | $R^{D68}$ | $R^{D21}$ | $R^{D1}$ |
| $L_{B1224}$ | $R^{D68}$ | $R^{D23}$ | $R^{D1}$ |
| $L_{B1225}$ | $R^{D68}$ | $R^{D24}$ | $R^{D1}$ |
| $L_{B1226}$ | $R^{D68}$ | $R^{D25}$ | $R^{D1}$ |
| $L_{B1227}$ | $R^{D68}$ | $R^{D27}$ | $R^{D1}$ |
| $L_{B1228}$ | $R^{D68}$ | $R^{D28}$ | $R^{D1}$ |
| $L_{B1229}$ | $R^{D68}$ | $R^{D29}$ | $R^{D1}$ |
| $L_{B1230}$ | $R^{D68}$ | $R^{D30}$ | $R^{D1}$ |
| $L_{B1231}$ | $R^{D68}$ | $R^{D31}$ | $R^{D1}$ |
| $L_{B1232}$ | $R^{D68}$ | $R^{D32}$ | $R^{D1}$ |
| $L_{B1233}$ | $R^{D68}$ | $R^{D33}$ | $R^{D1}$ |
| $L_{B1234}$ | $R^{D68}$ | $R^{D34}$ | $R^{D1}$ |
| $L_{B1235}$ | $R^{D68}$ | $R^{D42}$ | $R^{D1}$ |
| $L_{B1236}$ | $R^{D68}$ | $R^{D76}$ | $R^{D1}$ |
| $L_{B1237}$ | $R^{D76}$ | $R^{D5}$ | $R^{D1}$ |
| $L_{B1238}$ | $R^{D76}$ | $R^{D6}$ | $R^{D1}$ |
| $L_{B1239}$ | $R^{D76}$ | $R^{D9}$ | $R^{D1}$ |
| $L_{B1240}$ | $R^{D76}$ | $R^{D10}$ | $R^{D1}$ |
| $L_{B1241}$ | $R^{D76}$ | $R^{D12}$ | $R^{D1}$ |
| $L_{B1242}$ | $R^{D76}$ | $R^{D15}$ | $R^{D1}$ |
| $L_{B1243}$ | $R^{D76}$ | $R^{D16}$ | $R^{D1}$ |
| $L_{B1244}$ | $R^{D76}$ | $R^{D17}$ | $R^{D1}$ |
| $L_{B1245}$ | $R^{D76}$ | $R^{D18}$ | $R^{D1}$ |
| $L_{B1246}$ | $R^{D76}$ | $R^{D19}$ | $R^{D1}$ |
| $L_{B1247}$ | $R^{D76}$ | $R^{D20}$ | $R^{D1}$ |
| $L_{B1248}$ | $R^{D76}$ | $R^{D21}$ | $R^{D1}$ |
| $L_{B1249}$ | $R^{D76}$ | $R^{D23}$ | $R^{D1}$ |
| $L_{B1250}$ | $R^{D76}$ | $R^{D24}$ | $R^{D1}$ |
| $L_{B1251}$ | $R^{D76}$ | $R^{D25}$ | $R^{D1}$ |
| $L_{B1252}$ | $R^{D76}$ | $R^{D27}$ | $R^{D1}$ |
| $L_{B1253}$ | $R^{D76}$ | $R^{D28}$ | $R^{D1}$ |
| $L_{B1254}$ | $R^{D76}$ | $R^{D29}$ | $R^{D1}$ |
| $L_{B1255}$ | $R^{D76}$ | $R^{D30}$ | $R^{D1}$ |

-continued

| Ligand | $R^1$ | $R^2$ | $R^3$ |
|---|---|---|---|
| $L_{B1256}$ | $R^{D76}$ | $R^{D31}$ | $R^{D1}$ |
| $L_{B1257}$ | $R^{D76}$ | $R^{D32}$ | $R^{D1}$ |
| $L_{B1258}$ | $R^{D76}$ | $R^{D33}$ | $R^{D1}$ |
| $L_{B1259}$ | $R^{D76}$ | $R^{D34}$ | $R^{D1}$ |
| $L_{B1260}$ | $R^{D76}$ | $R^{D42}$ | $R^{D1}$ |

wherein $R^{D1}$ to $R^{D81}$ has the following structures:

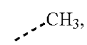

$R^{D1}$

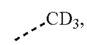

$R^{D2}$

$R^{D3}$

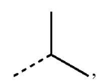

$R^{D4}$

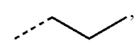

$R^{D5}$

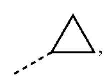

$R^{D6}$

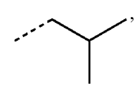

$R^{D7}$

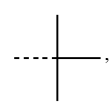

$R^{D8}$

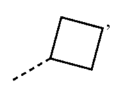

$R^{D9}$

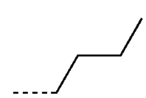

$R^{D10}$

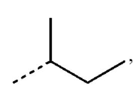

$R^{D11}$

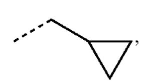

$R^{D12}$

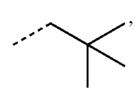

$R^{D13}$

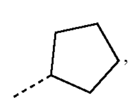

$R^{D14}$

-continued
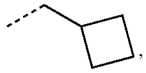
$R^{D15}$
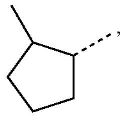
$R^{D16}$
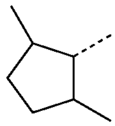
$R^{D17}$
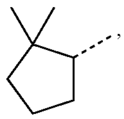
$R^{D18}$
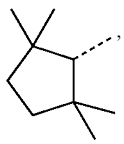
$R^{D19}$
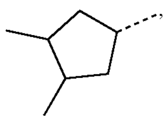
$R^{D20}$
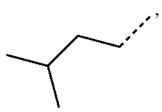
$R^{D21}$
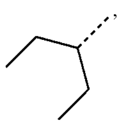
$R^{D22}$
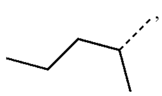
$R^{D23}$
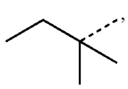
$R^{D24}$
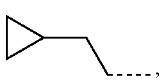
$R^{D25}$
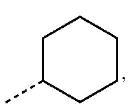
$R^{D26}$
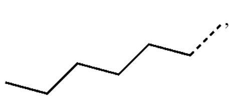
$R^{D27}$
-continued
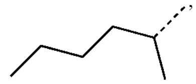
$R^{D28}$
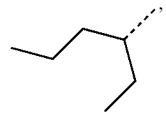
$R^{D29}$
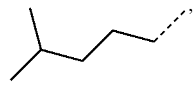
$R^{D30}$
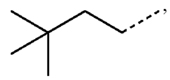
$R^{D31}$
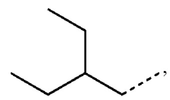
$R^{D32}$
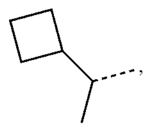
$R^{D33}$
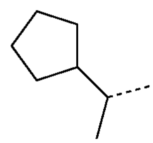
$R^{D34}$
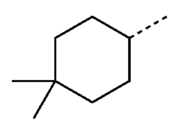
$R^{D35}$
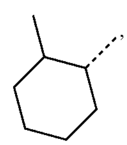
$R^{D36}$
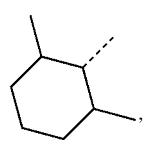
$R^{D37}$
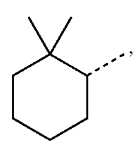
$R^{D38}$ $R^{D39}$
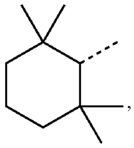
$R^{D40}$
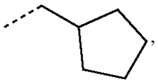
$R^{D41}$
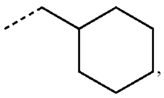
$R^{D42}$
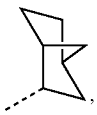
$R^{D43}$
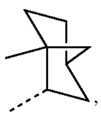
$R^{D44}$
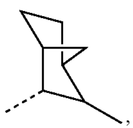
$R^{D45}$
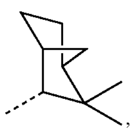
$R^{D46}$
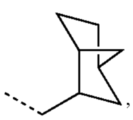
$R^{D47}$
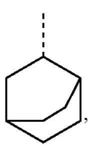
$R^{D48}$
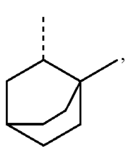
$R^{D49}$
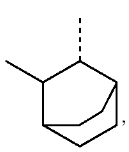
$R^{D50}$
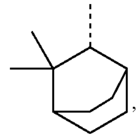
$R^{D51}$
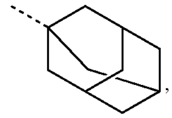
$R^{D52}$
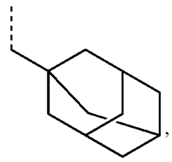
$R^{D53}$
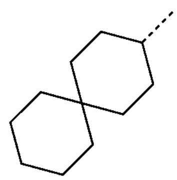
$R^{D54}$
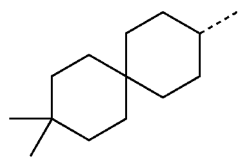
$R^{D55}$
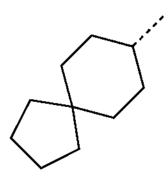
$R^{D56}$
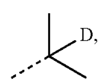
$R^{D57}$
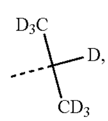
$R^{D58}$
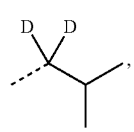
$R^{D59}$
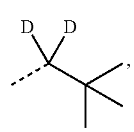
$R^{D60}$
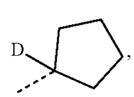

-continued
$R^{D61}$
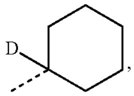
$R^{D62}$
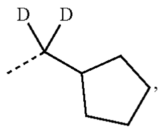
$R^{D63}$
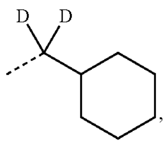
$R^{D64}$
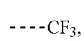
$R^{D65}$
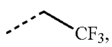
$R^{D66}$
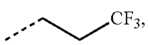
$R^{D67}$
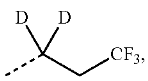
$R^{D68}$
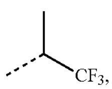
$R^{D69}$
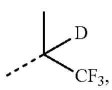
$R^{D70}$
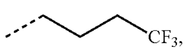
$R^{D71}$
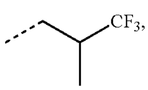
$R^{D72}$
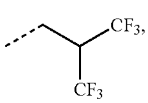
$R^{D73}$
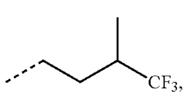
$R^{D74}$
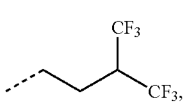
-continued
$R^{D75}$
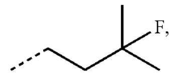
$R^{D76}$
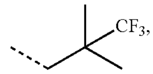
$R^{D77}$
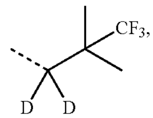
$R^{D78}$
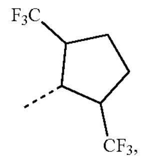
$R^{D79}$
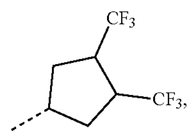
$R^{D80}$
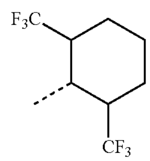
and
$R^{D81}$
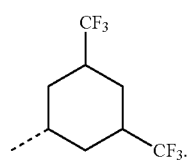
9. The compound of claim 1, wherein the ligand $L_A$ is selected from the group consisting of:
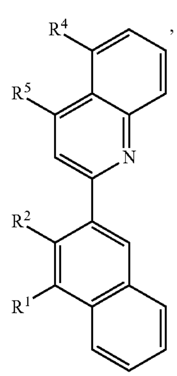
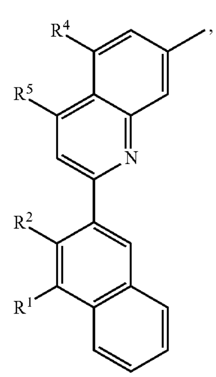

-continued

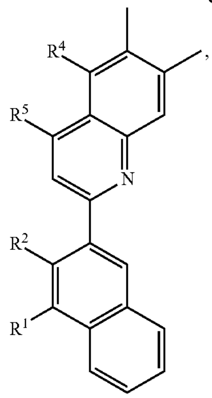

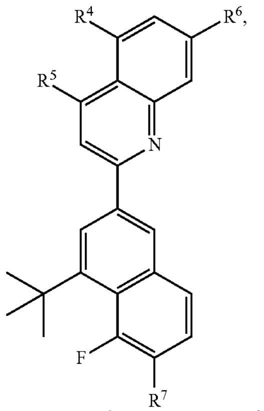

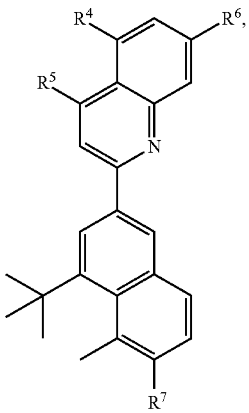

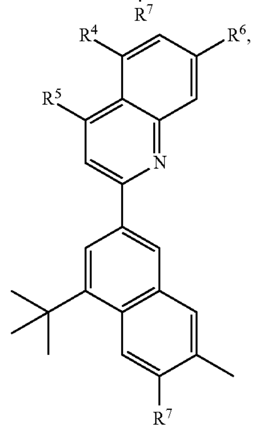

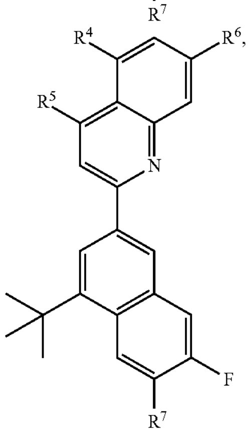

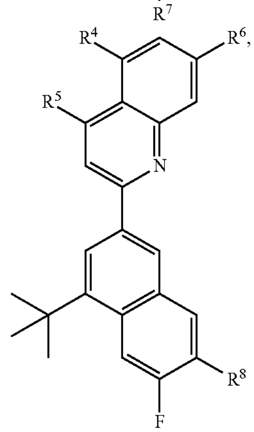

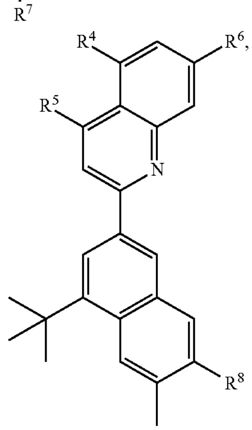

wherein $R^4$, $R^5$, $R^6$, $R^7$, and $R^8$ are each independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof; and wherein any two substituents are optionally joined to form into a ring.

10. The compound of claim 1, having the structure $(L_A)_nIr(L_B)_{3-n}$;

wherein n is 1 or 2;

wherein $L_B$ has the structure

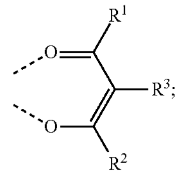

wherein each of $R^1$, $R^2$, and $R^3$ is independently selected from hydrogen and a substituent selected from $R^{D1}$ to $R^{D81}$;

wherein at least two of $R^1$, $R^2$, and $R^3$ are other than hydrogen; and wherein $R^{D1}$ to $R^{D81}$ have the following structures:

$R^{D1}$

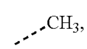

$R^{D2}$

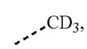

$R^{D3}$

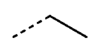

$R^{D4}$

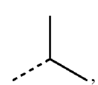

$R^{D5}$

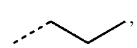

$R^{D6}$

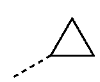

$R^{D7}$

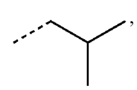

$R^{D8}$

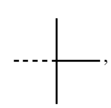

$R^{D9}$

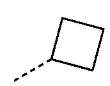

$R^{D10}$

$R^{D11}$

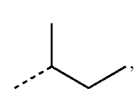

-continued
$R^{D12}$
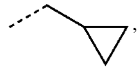
$R^{D13}$
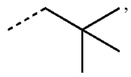
$R^{D14}$
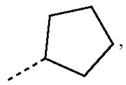
$R^{D15}$
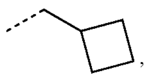
$R^{D16}$
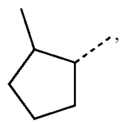
$R^{D17}$
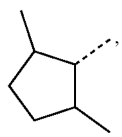
$R^{D18}$
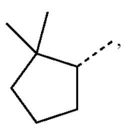
$R^{D19}$
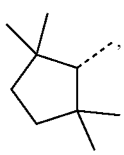
$R^{D20}$
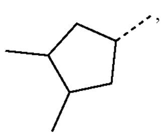
$R^{D21}$
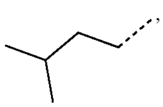
$R^{D22}$
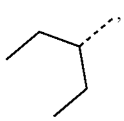
$R^{D23}$
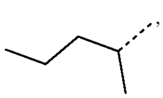
$R^{D24}$
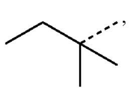
-continued
$R^{D25}$
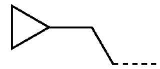
$R^{D26}$
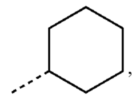
$R^{D27}$
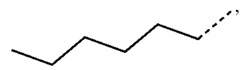
$R^{D28}$
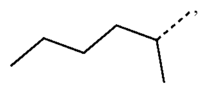
$R^{D29}$
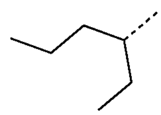
$R^{D30}$
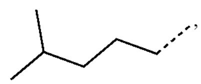
$R^{D31}$
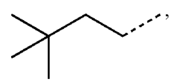
$R^{D32}$
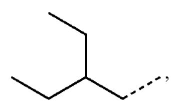
$R^{D33}$
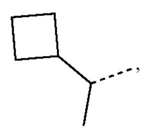
$R^{D34}$
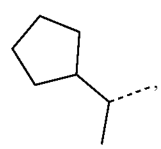
$R^{D35}$
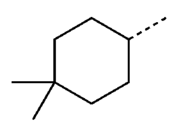
$R^{D36}$
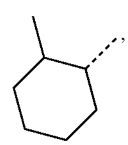
$R^{D37}$
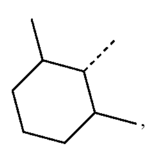

-continued
$R^{D38}$
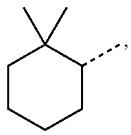
$R^{D39}$
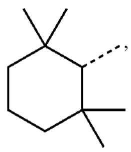
$R^{D40}$
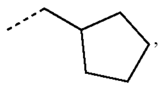
$R^{D41}$
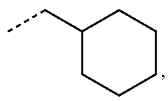
$R^{D42}$
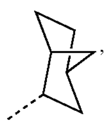
$R^{D43}$
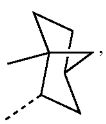
$R^{D44}$
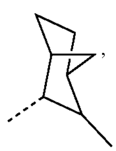
$R^{D45}$
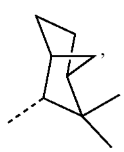
$R^{D46}$
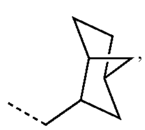
$R^{D47}$
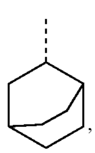
$R^{D48}$
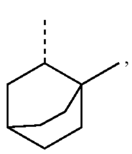
-continued
$R^{D49}$
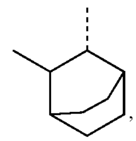
$R^{D50}$
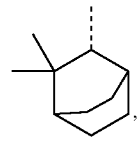
$R^{D51}$
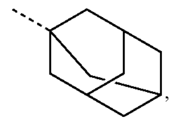
$R^{D52}$
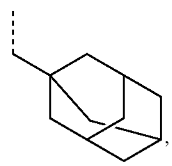
$R^{D53}$
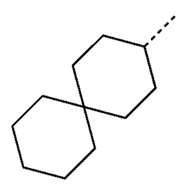
$R^{D54}$
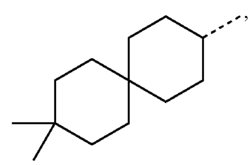
$R^{D55}$
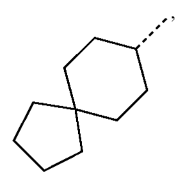
$R^{D56}$
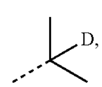
$R^{D57}$
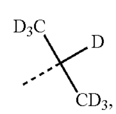
$R^{D58}$
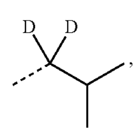

-continued
$R^{D59}$
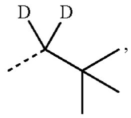
$R^{D60}$
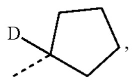
$R^{D61}$
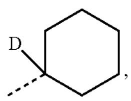
$R^{D62}$
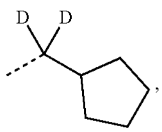
$R^{D63}$
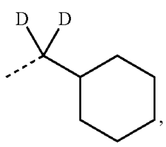
$R^{D64}$
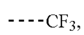
$R^{D65}$
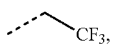
$R^{D66}$
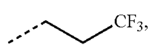
$R^{D67}$
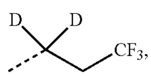
$R^{D68}$
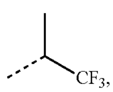
$R^{D69}$
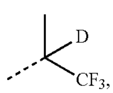
$R^{D70}$
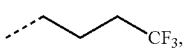
$R^{D71}$
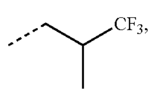
$R^{D72}$
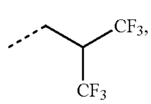
$R^{D73}$
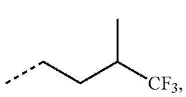
$R^{D74}$
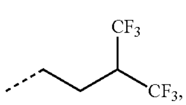
-continued
$R^{D75}$
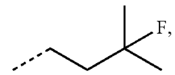
$R^{D76}$
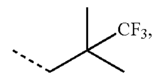
$R^{D77}$
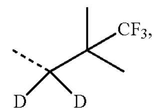
$R^{D78}$
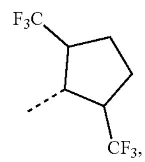
$R^{D79}$
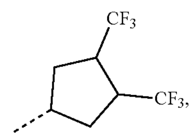
$R^{D80}$
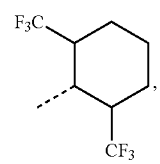
and
$R^{D81}$
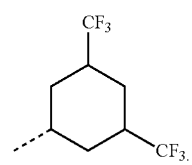
11. The compound of claim 10, wherein $L_B$ is $L_{B22}$,
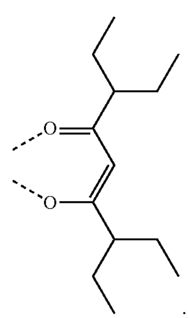

12. A formulation comprising the compound of claim 1.

13. An organic light emitting device (OLED) comprising:

an anode;

a cathode; and an organic layer, disposed between the anode and the cathode, comprising a compound having Ligand $L_A$ having a structure of Formula I:

Formula I

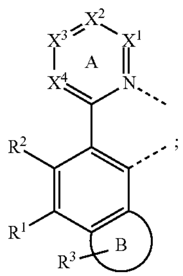

wherein Ring B represents a five- or six-membered aromatic ring;

wherein $R^3$ represents from none to the maximum number of substitutions;

wherein $X^1$, $X^2$, $X^3$, and $X^4$ are each independently a CR or N;

wherein $X^1$ and $X^2$ are CR and the Rs are fused into a benzo ring;

wherein $R^1$ is $CR^{14}R^{15}R^{16}$;

wherein each of $R^{14}$, $R^{15}$ and $R^{16}$ is independently selected from the group consisting of alkyl, cycloalkyl, combinations thereof, partially or fully deuterated variations thereof, and partially or fully fluorinated variations thereof;

wherein R, $R^2$, and $R^3$ are each independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof;

wherein any two substituents among R, $R^2$, and $R^3$ are optionally joined to form into a ring;

wherein any two substituents among $R^{14}$, $R^{15}$, and $R^{16}$ are optionally joined to form into a ring;

wherein $L_A$ is coordinated to a metal M at the positions indicated with dashed lines;

wherein M is coordinated to at least one other ligand that is different than ligand $L_A$;

wherein $L_A$ is optionally linked with other ligands to comprise a tridentate, tetradentate, pentadentate, or hexadentate ligand; and wherein M is optionally coordinated to other ligands.

14. The OLED of claim 13, wherein the organic layer is an emissive layer and the compound is an emissive dopant or a non-emissive dopant.

15. The OLED of claim 13, wherein the organic layer further comprises a host, wherein the host comprises at least one chemical group selected from the group consisting of carbazole, dibenzothiophene, dibenzofuran, dibenzoselenophene, azacarbazole, aza-dibenzothiophene, aza-dibenzofuran, and aza-dibenzoselenophene.

16. The OLED of claim 13, wherein the organic layer further comprises a host, wherein the host is selected from the group consisting of:

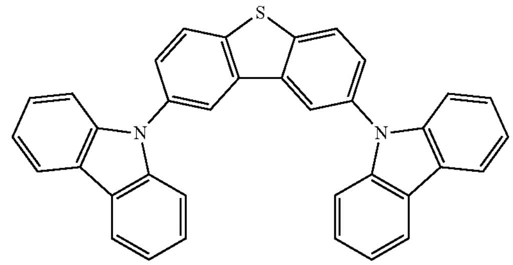

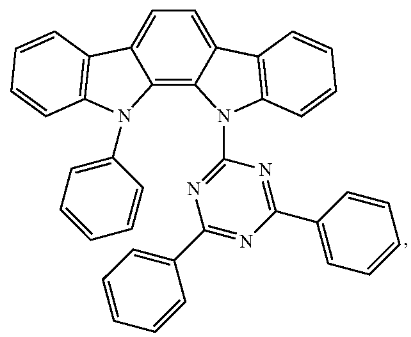

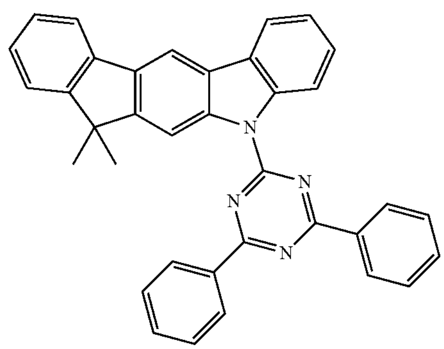

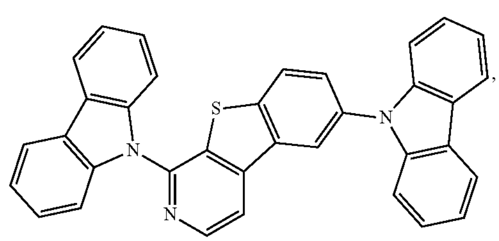

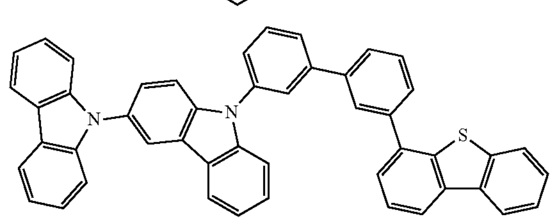

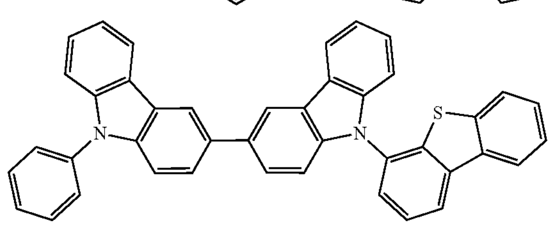

-continued
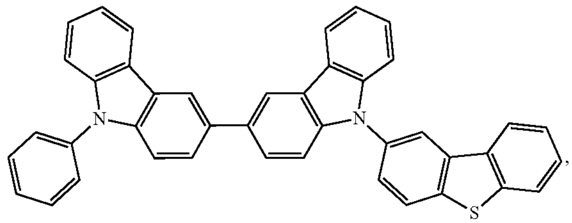
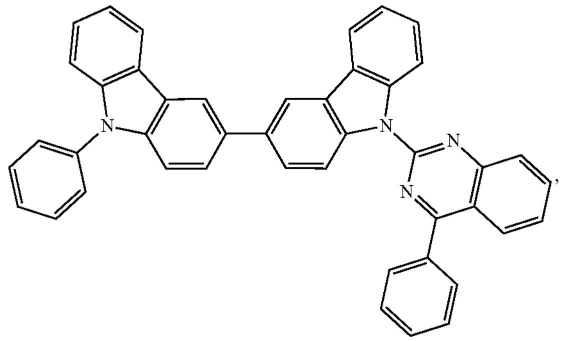
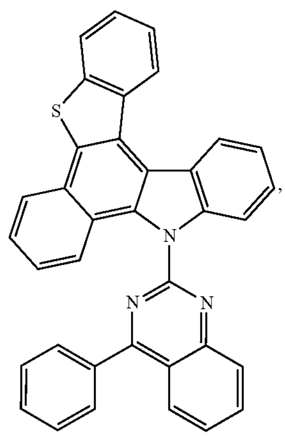
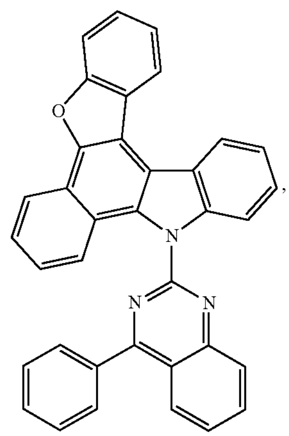
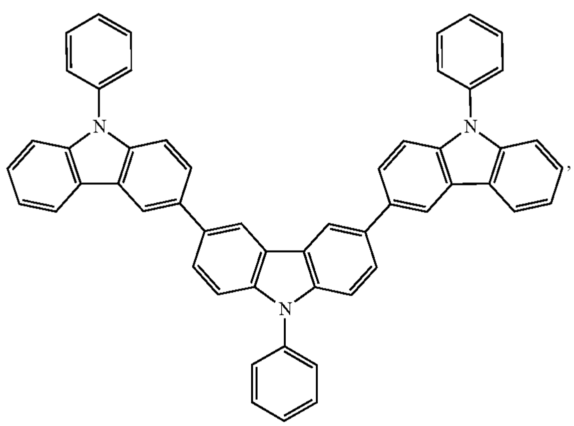
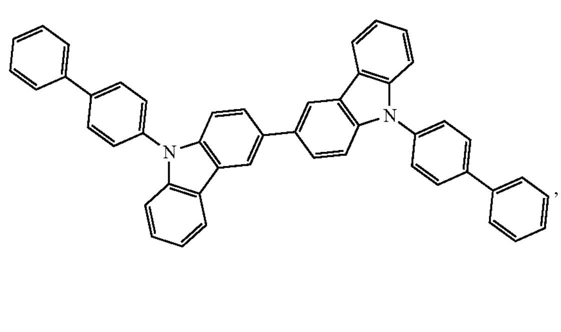
-continued
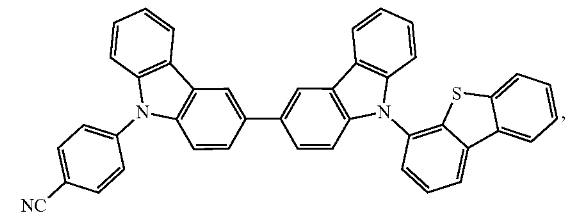
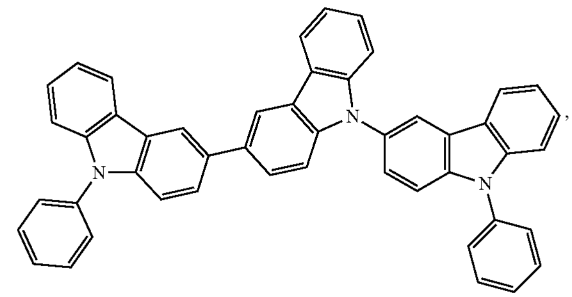
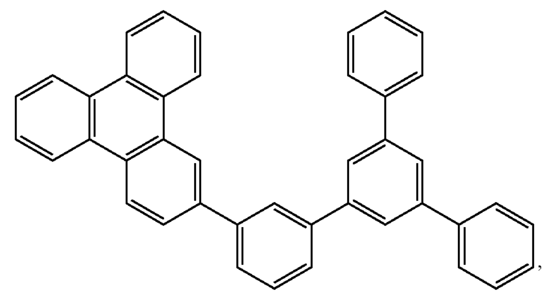
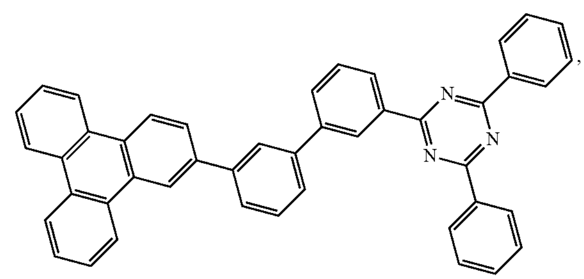
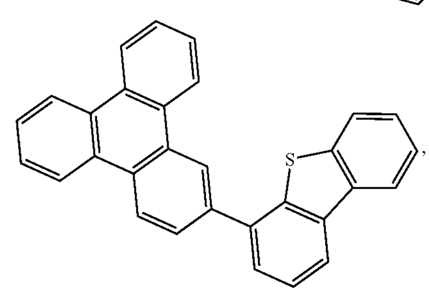
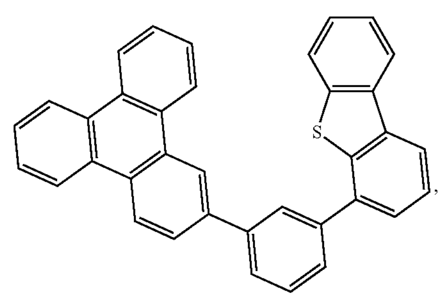

-continued

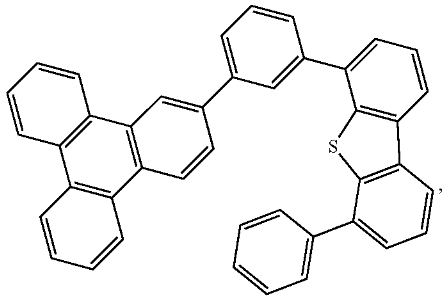

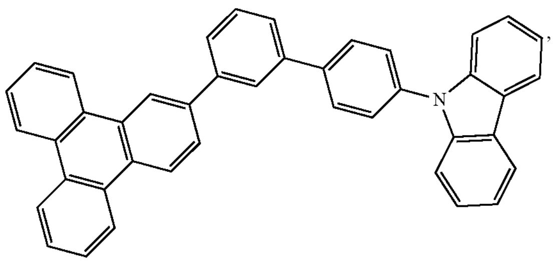

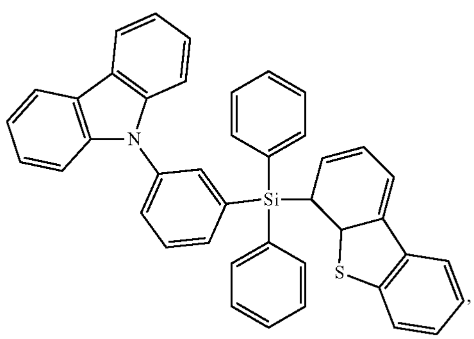

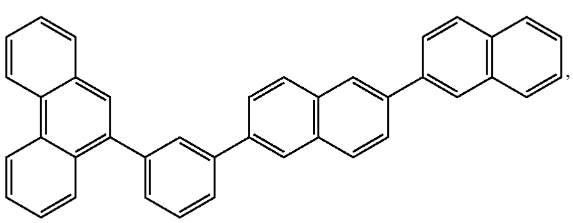

and combinations thereof.

17. A consumer product comprising an organic light emitting device comprising:

an anode;

a cathode; and an organic layer, disposed between the anode and the cathode, comprising a compound having Ligand $L_A$ having a structure of Formula I:

Formula I

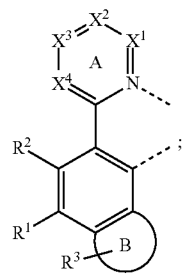

wherein Ring B represents a five- or six-membered aromatic ring;

wherein $R^3$ represents from none to the maximum number of substitutions;

wherein $X^1$, $X^2$, $X^3$, and $X^4$ are each independently a CR or N;

wherein $X^1$ and $X^2$ are CR and the Rs are fused into a benzo ring;

wherein $R^1$ is $CR^{14}R^{15}R^{16}$;

wherein each of $R^{14}$, $R^{15}$, and $R^{16}$ is independently selected from the group consisting of alkyl, cycloalkyl, combinations thereof, partially or fully deuterated variations thereof, and partially or fully fluorinated variations thereof;

wherein R, $R^2$, and $R^3$ are each independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof;

wherein any two substituents among R, $R^2$, and $R^3$ are optionally joined to form into a ring;

wherein any two substituents among $R^{14}$, $R^{15}$, and $R^{16}$ are optionally joined to form into a ring;

wherein $L_A$ is coordinated to a metal M at the positions indicated with dashed lines;

wherein M is coordinated to at least one other ligand that is different than ligand $L_A$;

wherein $L_A$ is optionally linked with other ligands to comprise a tridentate, tetradentate, pentadentate, or hexadentate ligand; and wherein M is optionally coordinated to other ligands.

* * * * *